US009029173B2

(12) United States Patent
Or-Bach et al.

(10) Patent No.: US 9,029,173 B2
(45) Date of Patent: May 12, 2015

(54) METHOD FOR FABRICATION OF A SEMICONDUCTOR DEVICE AND STRUCTURE

(75) Inventors: Zvi Or-Bach, San Jose, CA (US); Deepak C. Sekar, San Jose, CA (US); Brian Cronquist, San Jose, CA (US); Ze'ev Wurman, Palo Alto, CA (US)

(73) Assignee: Monolithic 3D Inc., San Jose, CA (US)

(*) Notice: Subject to any disclaimer, the term of this patent is extended or adjusted under 35 U.S.C. 154(b) by 406 days.

(21) Appl. No.: 13/276,312

(22) Filed: Oct. 18, 2011

(65) Prior Publication Data

US 2013/0095580 A1 Apr. 18, 2013

(51) Int. Cl.
*H01L 21/48* (2006.01)
*H01L 23/48* (2006.01)
(Continued)

(52) U.S. Cl.
CPC .............. *H01L 23/481* (2013.01); *H01L 21/84* (2013.01); *H01L 21/845* (2013.01); *H01L 27/0207* (2013.01); *H01L 27/0688* (2013.01); *H01L 27/0694* (2013.01); *H01L 29/7841* (2013.01); *H01L 29/785* (2013.01); *H01L 27/088* (2013.01); *H01L 27/092* (2013.01); *H01L 27/10802* (2013.01); *H01L 29/78696* (2013.01); *H01L 27/10894* (2013.01); *H01L 27/10897* (2013.01); *H01L 27/1108* (2013.01); *H01L 27/11524* (2013.01); *H01L 27/11526* (2013.01); *H01L 27/11551* (2013.01); *H01L 27/1157* (2013.01); *H01L 27/11573* (2013.01); *H01L 27/11578* (2013.01); *H01L 27/11803* (2013.01); *H01L 27/1203* (2013.01); *H01L 27/1116* (2013.01); *H01L 23/544* (2013.01); *H01L 21/6835* (2013.01); *H01L 2221/6835* (2013.01); *H01L 2223/5442* (2013.01);
(Continued)

(58) Field of Classification Search
CPC ........................ H01L 27/0922; H01L 21/8221
USPC .......... 257/118, 199, 758, E27.074; 438/152, 438/153
See application file for complete search history.

(56) References Cited

U.S. PATENT DOCUMENTS 3,007,090 A 10/1961 Rutz
3,819,959 A 6/1974 Chang et al.
(Continued)

FOREIGN PATENT DOCUMENTS

EP 1267594 A2 12/2002
EP 1909311 A2 4/2008
WO PCT/US2008/063483 5/2008

OTHER PUBLICATIONS

Bakir et al. "Integrated Interconnect Technologies for 3D Nanoelectronic Systems", pp. 407-410. ISBN: 978-1-59693-246-3. Copyright 2009.*
(Continued)

*Primary Examiner* — Allen Parker

(57) ABSTRACT

A method for formation of a semiconductor device, the method including: providing a first mono-crystalline layer including first transistors and first alignment marks; providing an interconnection layer including aluminum or copper on top of the first mono-crystalline layer; and then forming a second mono-crystalline layer on top of the first mono-crystalline layer interconnection layer by using a layer transfer step, and then processing second transistors on the second mono-crystalline layer including a step of forming a gate dielectric, where at least one of the second transistors is a p-type transistor and at least one of the second transistors is an n-type transistor.

13 Claims, 415 Drawing Sheets

(51) Int. Cl.

| | |
|---|---|
| ***H01L 21/84*** | (2006.01) |
| ***H01L 27/02*** | (2006.01) |
| ***H01L 27/06*** | (2006.01) |
| ***H01L 29/78*** | (2006.01) |
| ***H01L 27/088*** | (2006.01) |
| ***H01L 27/092*** | (2006.01) |
| ***H01L 27/108*** | (2006.01) |
| ***H01L 29/786*** | (2006.01) |
| ***H01L 27/11*** | (2006.01) |
| ***H01L 27/115*** | (2006.01) |
| ***H01L 27/118*** | (2006.01) |
| ***H01L 27/12*** | (2006.01) |
| ***H01L 23/544*** | (2006.01) |
| ***H01L 21/683*** | (2006.01) |
| ***H01L 21/66*** | (2006.01) |
| ***H01L 45/00*** | (2006.01) |
| ***H01L 27/24*** | (2006.01) |
| ***H01L 21/762*** | (2006.01) |

(52) U.S. Cl.

CPC ................ *H01L 2223/54426* (2013.01); *H01L 2223/54453* (2013.01); *H01L 22/22* (2013.01); *H01L 45/1616* (2013.01); *H01L 45/1683* (2013.01); *H01L 27/2436* (2013.01); *H01L 27/2463* (2013.01); *H01L 21/76254* (2013.01); *H01L 2224/16145* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/15311* (2013.01); *H01L 2924/3011* (2013.01); *H01L 2924/3025* (2013.01); *H01L 2924/13091* (2013.01); *H01L 2924/1461* (2013.01)

(56) References Cited

U.S. PATENT DOCUMENTS 4,197,555 A 4/1980 Uehara et al.
4,400,715 A 8/1983 Barbee et al.
4,487,635 A 12/1984 Kugimiya et al.
4,522,657 A 6/1985 Rohatgi et al.
4,612,083 A 9/1986 Yasumoto et al.
4,643,950 A 2/1987 Ogura et al.
4,704,785 A 11/1987 Curran
4,711,858 A 12/1987 Harder et al.
4,721,885 A 1/1988 Brodie
4,732,312 A 3/1988 Kennedy et al.
4,733,288 A 3/1988 Sato
4,829,018 A 5/1989 Wahlstrom
4,854,986 A 8/1989 Raby
4,866,304 A 9/1989 Yu
4,939,568 A 7/1990 Kato et al.
4,956,307 A 9/1990 Pollack et al.
5,012,153 A 4/1991 Atkinson et al.
5,032,007 A 7/1991 Silverstein et al.
5,047,979 A 9/1991 Leung
5,087,585 A 2/1992 Hayashi
5,093,704 A 3/1992 Sato et al.
5,106,775 A 4/1992 Kaga et al.
5,152,857 A 10/1992 Ito et al.
5,162,879 A 11/1992 Gill
5,217,916 A 6/1993 Anderson et al.
5,250,460 A 10/1993 Yamagata et al.
5,258,643 A 11/1993 Cohen
5,265,047 A 11/1993 Leung et al.
5,266,511 A 11/1993 Takao
5,277,748 A 1/1994 Sakaguchi et al.
5,286,670 A 2/1994 Kang et al.
5,294,556 A 3/1994 Kawamura
5,308,782 A 5/1994 Mazure et al.
5,312,771 A 5/1994 Yonehara
5,317,236 A 5/1994 Zavracky et al.
5,324,980 A 6/1994 Kusunoki
5,355,022 A 10/1994 Sugahara et al.
5,371,037 A 12/1994 Yonehara
5,374,564 A 12/1994 Bruel
5,374,581 A 12/1994 Ichikawa et al.
5,424,560 A 6/1995 Norman et al.
5,475,280 A 12/1995 Jones et al.
5,478,762 A 12/1995 Chao
5,485,031 A 1/1996 Zhang et al.
5,498,978 A 3/1996 Takahashi et al.
5,527,423 A 6/1996 Neville et al.
5,535,342 A 7/1996 Taylor
5,554,870 A 9/1996 Fitch et al.
5,563,084 A 10/1996 Ramm et al.
5,583,349 A 12/1996 Norman et al.
5,583,350 A 12/1996 Norman et al.
5,594,563 A 1/1997 Larson
5,604,137 A 2/1997 Yamazaki et al.
5,617,991 A 4/1997 Pramanick et al.
5,627,106 A 5/1997 Hsu
5,656,548 A 8/1997 Zavracky et al.
5,656,553 A 8/1997 Leas et al.
5,670,411 A 9/1997 Yonehara
5,681,756 A 10/1997 Norman et al.
5,695,557 A 12/1997 Yamagata et al.
5,701,027 A 12/1997 Gordon et al.
5,707,745 A 1/1998 Forrest et al.
5,714,395 A 2/1998 Bruel
5,721,160 A 2/1998 Forrest et al.
5,737,748 A 4/1998 Shigeeda
5,739,552 A 4/1998 Kimura et al.
5,744,979 A 4/1998 Goetting
5,748,161 A 5/1998 Lebby et al.
5,757,026 A 5/1998 Forrest et al.
5,770,881 A 6/1998 Pelella et al.
5,781,031 A 7/1998 Bertin et al.
5,829,026 A 10/1998 Leung et al.
5,835,396 A 11/1998 Zhang
5,854,123 A 12/1998 Sato et al.
5,861,929 A 1/1999 Spitzer
5,877,070 A 3/1999 Goesele et al.
5,882,987 A 3/1999 Srikrishnan
5,883,525 A 3/1999 Tavana et al.
5,889,903 A 3/1999 Rao
5,893,721 A 4/1999 Huang et al.
5,915,167 A 6/1999 Leedy
5,937,312 A 8/1999 Iyer et al.
5,943,574 A 8/1999 Tehrani et al.
5,952,680 A 9/1999 Strite
5,952,681 A 9/1999 Chen
5,965,875 A 10/1999 Merrill
5,977,579 A 11/1999 Noble
5,977,961 A 11/1999 Rindal
5,980,633 A 11/1999 Yamagata et al.
5,985,742 A 11/1999 Henley et al.
5,998,808 A 12/1999 Matsushita
6,001,693 A 12/1999 Yeouchung et al.
6,009,496 A 12/1999 Tsai
6,020,252 A 2/2000 Aspar et al.
6,020,263 A 2/2000 Shih et al.
6,027,958 A 2/2000 Vu et al.
6,030,700 A 2/2000 Forrest et al.
6,052,498 A 4/2000 Paniccia
6,054,370 A 4/2000 Doyle
6,057,212 A 5/2000 Chan et al.
6,071,795 A 6/2000 Cheung et al.
6,103,597 A 8/2000 Aspar et al.
6,111,260 A 8/2000 Dawson et al.
6,125,217 A 9/2000 Paniccia et al.
6,153,495 A 11/2000 Kub et al.
6,191,007 B1 2/2001 Matsui et al.
6,222,203 B1 4/2001 Ishibashi et al.
6,229,161 B1 5/2001 Nemati et al.
6,242,324 B1 6/2001 Kub et al.
6,242,778 B1 6/2001 Marmillion et al.
6,259,623 B1 7/2001 Takahashi

(56) References Cited

U.S. PATENT DOCUMENTS 6,264,805 B1 7/2001 Forrest et al.
6,281,102 B1 8/2001 Cao et al.
6,294,018 B1 9/2001 Hamm et al.
6,306,705 B1 10/2001 Parekh et al.
6,321,134 B1 11/2001 Henley et al.
6,322,903 B1 11/2001 Siniaguine et al.
6,331,468 B1 12/2001 Aronowitz et al.
6,331,790 B1 12/2001 Or-Bach et al.
6,353,492 B2 3/2002 McClelland et al.
6,355,501 B1 3/2002 Fung et al.
6,358,631 B1 3/2002 Forrest et al.
6,365,270 B2 4/2002 Forrest et al.
6,376,337 B1 4/2002 Wang et al.
6,380,046 B1 4/2002 Yamazaki
6,392,253 B1 5/2002 Saxena
6,417,108 B1 7/2002 Akino et al.
6,420,215 B1 7/2002 Knall et al.
6,423,614 B1 7/2002 Doyle
6,429,481 B1 8/2002 Mo et al.
6,429,484 B1 8/2002 Yu
6,430,734 B1 8/2002 Zahar
6,475,869 B1 11/2002 Yu
6,476,493 B2 11/2002 Or-Bach et al.
6,479,821 B1 11/2002 Hawryluk et al.
6,515,511 B2 2/2003 Sugibayashi et al.
6,526,559 B2 2/2003 Schiefele et al.
6,528,391 B1 3/2003 Henley et al.
6,534,352 B1 3/2003 Kim
6,534,382 B1 3/2003 Sakaguchi et al.
6,544,837 B1 4/2003 Divakauni et al.
6,545,314 B2 4/2003 Forbes et al.
6,555,901 B1 4/2003 Yoshihara et al.
6,563,139 B2 5/2003 Hen
6,580,289 B2 6/2003 Cox
6,600,173 B2 7/2003 Tiwari
6,624,046 B1 9/2003 Zavracky et al.
6,627,518 B1 9/2003 Inoue et al.
6,630,713 B2 10/2003 Geusic
6,635,552 B1 10/2003 Gonzalez
6,635,588 B1 10/2003 Hawryluk et al.
6,638,834 B2 10/2003 Gonzalez
6,642,744 B2 11/2003 Or-Bach et al.
6,653,209 B1 11/2003 Yamagata
6,661,085 B2 12/2003 Kellar et al.
6,677,204 B2 1/2004 Cleeves et al.
6,686,253 B2 2/2004 Or-Bach
6,703,328 B2 3/2004 Tanaka et al.
6,756,633 B2 6/2004 Wang et al.
6,756,811 B2 6/2004 Or-Bach
6,759,282 B2 7/2004 Campbell et al.
6,762,076 B2 7/2004 Kim et al.
6,774,010 B2 8/2004 Chu et al.
6,805,979 B2 10/2004 Ogura et al.
6,806,171 B1 10/2004 Ulyashin et al.
6,809,009 B2 10/2004 Aspar et al.
6,815,781 B2 11/2004 Vyvoda et al.
6,819,136 B2 11/2004 Or-Bach
6,821,826 B1 11/2004 Chan et al.
6,841,813 B2 1/2005 Walker et al.
6,844,243 B1 1/2005 Gonzalez
6,864,534 B2 3/2005 Ipposhi et al.
6,875,671 B2 4/2005 Faris
6,882,572 B2 4/2005 Wang et al.
6,888,375 B2 5/2005 Feng et al.
6,917,219 B2 7/2005 New
6,927,431 B2 * 8/2005 Gonzalez ...................... 257/288
6,930,511 B2 8/2005 Or-Bach
6,943,067 B2 9/2005 Greenlaw
6,943,407 B2 9/2005 Ouyang et al.
6,949,421 B1 9/2005 Padmanabhan et al.
6,953,956 B2 10/2005 Or-Bach et al.
6,967,149 B2 11/2005 Meyer et al.
6,985,012 B2 1/2006 Or-Bach
6,989,687 B2 1/2006 Or-Bach
6,995,430 B2 2/2006 Langdo et al.
6,995,456 B2 2/2006 Nowak
7,015,719 B1 3/2006 Feng et al.
7,016,569 B2 3/2006 Mule et al.
7,018,875 B2 3/2006 Madurawe
7,019,557 B2 3/2006 Madurawe
7,043,106 B2 5/2006 West et al.
7,052,941 B2 5/2006 Lee
7,064,579 B2 6/2006 Madurawe
7,067,396 B2 6/2006 Aspar et al.
7,067,909 B2 6/2006 Reif et al.
7,068,070 B2 6/2006 Or-Bach
7,068,072 B2 6/2006 New et al.
7,078,739 B1 7/2006 Nemati et al.
7,094,667 B1 8/2006 Bower
7,098,691 B2 8/2006 Or-Bach et al.
7,105,390 B2 9/2006 Brask et al.
7,105,871 B2 9/2006 Or-Bach et al.
7,109,092 B2 9/2006 Tong
7,110,629 B2 9/2006 Bjorkman et al.
7,111,149 B2 9/2006 Eilert
7,115,945 B2 10/2006 Lee et al.
7,115,966 B2 10/2006 Ido et al.
7,141,853 B2 11/2006 Campbell et al.
7,148,119 B1 12/2006 Sakaguchi et al.
7,157,787 B2 1/2007 Kim et al.
7,157,937 B2 1/2007 Apostol et al.
7,166,520 B1 1/2007 Henley
7,170,807 B2 1/2007 Fazan et al.
7,173,369 B2 2/2007 Forrest et al.
7,180,091 B2 2/2007 Yamazaki et al.
7,180,379 B1 2/2007 Hopper et al.
7,189,489 B2 3/2007 Kunimoto et al.
7,205,204 B2 4/2007 Ogawa et al.
7,209,384 B1 4/2007 Kim
7,217,636 B1 5/2007 Atanackovic
7,223,612 B2 5/2007 Sarma
7,242,012 B2 7/2007 Leedy
7,245,002 B2 7/2007 Akino et al.
7,256,104 B2 8/2007 Ito et al.
7,259,091 B2 8/2007 Schuehrer et al.
7,265,421 B2 9/2007 Madurawe
7,271,420 B2 9/2007 Cao
7,282,951 B2 10/2007 Huppenthal et al.
7,284,226 B1 10/2007 Kondapalli
7,296,201 B2 11/2007 Abramovici
7,304,355 B2 12/2007 Zhang
7,312,109 B2 12/2007 Madurawe
7,312,487 B2 12/2007 Alam et al.
7,335,573 B2 2/2008 Takayama et al.
7,337,425 B2 2/2008 Kirk
7,338,884 B2 3/2008 Shimoto et al.
7,351,644 B2 4/2008 Henley
7,358,601 B1 4/2008 Plants et al.
7,362,133 B2 4/2008 Madurawe
7,369,435 B2 5/2008 Forbes
7,371,660 B2 5/2008 Henley et al.
7,378,702 B2 5/2008 Lee
7,393,722 B1 7/2008 Issaq et al.
7,419,844 B2 9/2008 Lee et al.
7,436,027 B2 10/2008 Ogawa et al.
7,439,773 B2 10/2008 Or-Bach et al.
7,446,563 B2 11/2008 Madurawe
7,459,752 B2 12/2008 Doris et al.
7,459,763 B1 12/2008 Issaq et al.
7,459,772 B2 12/2008 Speers
7,463,062 B2 12/2008 Or-Bach et al.
7,470,142 B2 12/2008 Lee
7,470,598 B2 12/2008 Lee
7,476,939 B2 1/2009 Okhonin et al.
7,477,540 B2 1/2009 Okhonin et al.
7,485,968 B2 2/2009 Enquist et al.
7,486,563 B2 2/2009 Waller et al.
7,488,980 B2 2/2009 Takafuji et al.
7,492,632 B2 2/2009 Carman
7,495,473 B2 2/2009 McCollum et al.
7,498,675 B2 3/2009 Farnworth et al.
7,499,352 B2 3/2009 Singh
7,499,358 B2 3/2009 Bauser
7,508,034 B2 3/2009 Takafuji et al.

(56) References Cited

U.S. PATENT DOCUMENTS 7,514,748 B2 4/2009 Fazan et al.
7,525,186 B2 4/2009 Kim et al.
7,535,089 B2 5/2009 Fitzgerald
7,541,616 B2 6/2009 Fazan et al.
7,547,589 B2 6/2009 Iriguchi
7,557,367 B2 7/2009 Rogers et al.
7,563,659 B2 7/2009 Kwon et al.
7,566,855 B2 7/2009 Olsen et al.
7,586,778 B2 9/2009 Ho et al.
7,589,375 B2 9/2009 Jang et al.
7,608,848 B2 10/2009 Ho et al.
7,622,367 B1 11/2009 Nuzzo et al.
7,632,738 B2 12/2009 Lee
7,633,162 B2 12/2009 Lee
7,666,723 B2 2/2010 Frank et al.
7,671,371 B2 3/2010 Lee
7,671,460 B2 3/2010 Lauxtermann et al.
7,674,687 B2 3/2010 Henley
7,687,372 B2 3/2010 Jain
7,688,619 B2 3/2010 Lung et al.
7,692,202 B2 4/2010 Bensch
7,692,448 B2 4/2010 Solomon
7,692,944 B2 4/2010 Bernstein et al.
7,697,316 B2 4/2010 Lai et al.
7,709,932 B2 5/2010 Nemoto et al.
7,718,508 B2 5/2010 Lee
7,723,207 B2 5/2010 Alam et al.
7,728,326 B2 6/2010 Yamazaki et al.
7,732,301 B1 6/2010 Pinnington et al.
7,742,331 B2 6/2010 Watanabe
7,749,884 B2 7/2010 Mathew et al.
7,750,669 B2 7/2010 Spangaro
7,759,043 B2 7/2010 Tanabe et al.
7,768,115 B2 8/2010 Lee et al.
7,774,735 B1 8/2010 Sood
7,776,715 B2 8/2010 Wells et al.
7,777,330 B2 8/2010 Pelley et al.
7,786,460 B2 8/2010 Lung et al.
7,786,535 B2 8/2010 Abou-Khalil et al.
7,790,524 B2 9/2010 Abadeer et al.
7,795,619 B2 9/2010 Hara
7,799,675 B2 9/2010 Lee
7,800,099 B2 9/2010 Yamazaki et al.
7,800,199 B2 9/2010 Oh et al.
7,843,718 B2 11/2010 Koh et al.
7,846,814 B2 12/2010 Lee
7,863,095 B2 1/2011 Sasaki et al.
7,867,822 B2 1/2011 Lee
7,888,764 B2 2/2011 Lee
7,915,164 B2 3/2011 Konevecki et al.
8,013,399 B2 9/2011 Thomas et al.
8,014,195 B2 9/2011 Okhonin et al.
8,030,780 B2 10/2011 Kirby et al.
8,031,544 B2 10/2011 Kim et al.
8,044,464 B2 10/2011 Yamazaki et al.
8,107,276 B2 1/2012 Breitwisch et al.
8,129,256 B2 3/2012 Farooq et al.
8,136,071 B2 3/2012 Solomon
8,158,515 B2 4/2012 Farooq et al.
8,183,630 B2 5/2012 Batude et al.
8,184,463 B2 5/2012 Saen et al.
8,203,187 B2 6/2012 Lung et al.
8,208,279 B2 6/2012 Lue
8,264,065 B2 9/2012 Su et al.
8,343,851 B2 1/2013 Kim et al.
8,354,308 B2 1/2013 Kang et al.
2001/0000005 A1 3/2001 Forrest et al.
2001/0014391 A1 8/2001 Forrest et al.
2002/0024140 A1 2/2002 Nakajima et al.
2002/0025604 A1 2/2002 Tiwari
2002/0074668 A1 6/2002 Hofstee et al.
2002/0081823 A1 6/2002 Cheung et al.
2002/0090758 A1 7/2002 Henley et al.
2002/0096681 A1* 7/2002 Yamazaki et al. .............. 257/66
2002/0113289 A1 8/2002 Cordes et al.
2002/0141233 A1 10/2002 Hosotani et al.
2002/0153243 A1 10/2002 Forrest et al.
2002/0180069 A1 12/2002 Houston
2002/0190232 A1 12/2002 Chason
2002/0199110 A1 12/2002 Kean
2003/0015713 A1 1/2003 Yoo
2003/0032262 A1 2/2003 Dennison et al.
2003/0059999 A1* 3/2003 Gonzalez ...................... 438/200
2003/0060034 A1 3/2003 Beyne et al.
2003/0061555 A1* 3/2003 Kamei et al. .................. 714/726
2003/0067043 A1 4/2003 Zhang
2003/0102079 A1 6/2003 Kalvesten et al.
2003/0107117 A1 6/2003 Antonelli et al.
2003/0113963 A1 6/2003 Wurzer
2003/0119279 A1 6/2003 Enquist
2003/0139011 A1 7/2003 Cleeves et al.
2003/0157748 A1 8/2003 Kim et al.
2003/0206036 A1 11/2003 Or-Bach
2003/0213967 A1 11/2003 Forrest et al.
2003/0224582 A1 12/2003 Shimoda et al.
2004/0014299 A1 1/2004 Moriceau et al.
2004/0033676 A1 2/2004 Coronel et al.
2004/0036126 A1 2/2004 Chau et al.
2004/0047539 A1 3/2004 Okubora et al.
2004/0061176 A1 4/2004 Takafuji et al.
2004/0113207 A1 6/2004 Hsu et al.
2004/0150068 A1 8/2004 Leedy
2004/0152272 A1 8/2004 Fladre et al.
2004/0155301 A1 8/2004 Zhang
2004/0156233 A1 8/2004 Bhattacharyya
2004/0166649 A1 8/2004 Bressot et al.
2004/0175902 A1 9/2004 Rayssac et al.
2004/0178819 A1 9/2004 New
2004/0195572 A1 10/2004 Kato et al.
2004/0259312 A1 12/2004 Schlosser et al.
2004/0262635 A1* 12/2004 Lee ............................... 257/199
2004/0262772 A1 12/2004 Ramanathan et al.
2005/0003592 A1 1/2005 Jones
2005/0023656 A1* 2/2005 Leedy ........................... 257/678
2005/0067620 A1 3/2005 Chan et al.
2005/0067625 A1 3/2005 Hata
2005/0073060 A1 4/2005 Datta et al.
2005/0098822 A1 5/2005 Mathew
2005/0110041 A1 5/2005 Boutros et al.
2005/0121676 A1 6/2005 Fried et al.
2005/0121789 A1 6/2005 Madurawe
2005/0130351 A1 6/2005 Leedy
2005/0130429 A1 6/2005 Rayssac et al.
2005/0148137 A1 7/2005 Brask et al.
2005/0176174 A1 8/2005 Leedy
2005/0218521 A1* 10/2005 Lee ............................... 257/758
2005/0225237 A1 10/2005 Winters
2005/0266659 A1 12/2005 Ghyselen et al.
2005/0273749 A1 12/2005 Kirk
2005/0280061 A1 12/2005 Lee
2005/0280090 A1 12/2005 Anderson et al.
2005/0280154 A1 12/2005 Lee
2005/0280155 A1 12/2005 Lee
2005/0280156 A1 12/2005 Lee
2005/0282019 A1 12/2005 Fukushima et al.
2006/0014331 A1 1/2006 Tang et al.
2006/0024923 A1 2/2006 Sarma et al.
2006/0033110 A1 2/2006 Alam et al.
2006/0033124 A1 2/2006 Or-Bach et al.
2006/0043367 A1 3/2006 Chang et al.
2006/0067122 A1 3/2006 Verhoeven
2006/0071322 A1 4/2006 Kitamura
2006/0071332 A1 4/2006 Speers
2006/0083280 A1 4/2006 Tauzin et al.
2006/0113522 A1 6/2006 Lee et al.
2006/0118935 A1 6/2006 Kamiyama et al.
2006/0121690 A1 6/2006 Pogge et al.
2006/0179417 A1 8/2006 Madurawe
2006/0181202 A1 8/2006 Liao et al.
2006/0189095 A1 8/2006 Ghyselen et al.
2006/0194401 A1 8/2006 Hu et al.
2006/0195729 A1 8/2006 Huppenthal et al.
2006/0207087 A1 9/2006 Jafri et al.
2006/0249859 A1 11/2006 Eiles et al.

(56) References Cited

U.S. PATENT DOCUMENTS

2006/0275962 A1 12/2006 Lee
2007/0014508 A1 1/2007 Chen et al.
2007/0035329 A1 2/2007 Madurawe
2007/0063259 A1 3/2007 Derderian et al.
2007/0072391 A1 3/2007 Pocas et al.
2007/0076509 A1 4/2007 Zhang
2007/0077694 A1 4/2007 Lee
2007/0077743 A1 4/2007 Rao et al.
2007/0090416 A1 4/2007 Doyle et al.
2007/0102737 A1 5/2007 Kashiwabara et al.
2007/0108523 A1 5/2007 Ogawa et al.
2007/0111386 A1 5/2007 Kim et al.
2007/0111406 A1 5/2007 Joshi et al.
2007/0132049 A1 6/2007 Stipe
2007/0132369 A1 6/2007 Forrest et al.
2007/0135013 A1 6/2007 Faris
2007/0158659 A1 7/2007 Bensce
2007/0158831 A1 7/2007 Cha et al.
2007/0187775 A1 8/2007 Okhonin et al.
2007/0190746 A1 8/2007 Ito et al.
2007/0194453 A1 8/2007 Chakraborty et al.
2007/0210336 A1 9/2007 Madurawe
2007/0215903 A1 9/2007 Sakamoto et al.
2007/0218622 A1 9/2007 Lee et al.
2007/0228383 A1 10/2007 Bernstein et al.
2007/0252203 A1 11/2007 Zhu et al.
2007/0262457 A1 11/2007 Lin
2007/0275520 A1 11/2007 Suzuki
2007/0281439 A1 12/2007 Bedell et al.
2007/0283298 A1 12/2007 Bernstein et al.
2007/0287224 A1 12/2007 Alam et al.
2008/0032463 A1 2/2008 Lee
2008/0038902 A1 2/2008 Lee
2008/0048327 A1 2/2008 Lee
2008/0067573 A1 3/2008 Jang et al.
2008/0072182 A1 3/2008 He et al.
2008/0099780 A1 5/2008 Tran
2008/0108171 A1 5/2008 Rogers et al.
2008/0124845 A1* 5/2008 Yu et al. ........................ 438/143
2008/0128745 A1 6/2008 Mastro et al.
2008/0136455 A1 6/2008 Diamant et al.
2008/0142959 A1 6/2008 DeMulder et al.
2008/0150579 A1 6/2008 Madurawe
2008/0160431 A1 7/2008 Scott et al.
2008/0160726 A1 7/2008 Lim et al.
2008/0179678 A1 7/2008 Dyer et al.
2008/0191247 A1 8/2008 Yin et al.
2008/0191312 A1* 8/2008 Oh et al. ....................... 257/532
2008/0194068 A1 8/2008 Temmler et al.
2008/0203452 A1 8/2008 Moon et al.
2008/0213982 A1 9/2008 Park et al.
2008/0220558 A1 9/2008 Zehavi et al.
2008/0220565 A1 9/2008 Hsu et al.
2008/0224260 A1 9/2008 Schmit et al.
2008/0237591 A1 10/2008 Leedy
2008/0248618 A1 10/2008 Ahn et al.
2008/0251862 A1 10/2008 Fonash et al.
2008/0254561 A2 10/2008 Yoo
2008/0254572 A1 10/2008 Leedy
2008/0261378 A1 10/2008 Yao et al.
2008/0272492 A1 11/2008 Tsang
2008/0277778 A1 11/2008 Furman et al.
2008/0283875 A1 11/2008 Mukasa et al.
2008/0284611 A1 11/2008 Leedy
2008/0296681 A1 12/2008 Georgakos et al.
2008/0315351 A1 12/2008 Kakehata
2009/0001469 A1 1/2009 Yoshida et al.
2009/0001504 A1 1/2009 Takei et al.
2009/0016716 A1 1/2009 Ishida
2009/0032899 A1 2/2009 Irie
2009/0032951 A1 2/2009 Andry et al.
2009/0039918 A1 2/2009 Madurawe
2009/0052827 A1 2/2009 Durfee et al.
2009/0055789 A1 2/2009 McIlrath
2009/0057879 A1 3/2009 Garrou et al.
2009/0061572 A1 3/2009 Hareland et al.
2009/0064058 A1 3/2009 McIlrath
2009/0066365 A1 3/2009 Solomon
2009/0066366 A1 3/2009 Solomon
2009/0070721 A1 3/2009 Solomon
2009/0070727 A1 3/2009 Solomon
2009/0079000 A1 3/2009 Yamasaki et al.
2009/0081848 A1 3/2009 Erokhin
2009/0087759 A1 4/2009 Matsumoto et al.
2009/0096009 A1 4/2009 Dong et al.
2009/0096024 A1 4/2009 Shingu et al.
2009/0115042 A1 5/2009 Koyanagi
2009/0128189 A1 5/2009 Madurawe et al.
2009/0134397 A1 5/2009 Yokoi et al.
2009/0144669 A1 6/2009 Bose et al.
2009/0144678 A1 6/2009 Bose et al.
2009/0146172 A1 6/2009 Pumyea
2009/0159870 A1 6/2009 Lin et al.
2009/0160482 A1 6/2009 Karp et al.
2009/0161401 A1 6/2009 Bigler et al.
2009/0179268 A1 7/2009 Abou-Khalil et al.
2009/0194152 A1 8/2009 Liu et al.
2009/0194768 A1 8/2009 Leedy
2009/0204933 A1 8/2009 Rezgui
2009/0212317 A1 8/2009 Kolodin et al.
2009/0218627 A1 9/2009 Zhu
2009/0221110 A1 9/2009 Lee et al.
2009/0224364 A1 9/2009 Oh et al.
2009/0234331 A1 9/2009 Langereis et al.
2009/0236749 A1 9/2009 Otemba et al.
2009/0242893 A1 10/2009 Tomiyasu
2009/0250686 A1 10/2009 Sato et al.
2009/0262583 A1 10/2009 Lue
2009/0263942 A1 10/2009 Ohnuma et al.
2009/0267233 A1 10/2009 Lee
2009/0272989 A1 11/2009 Shum et al.
2009/0290434 A1 11/2009 Kurjanowicz
2009/0302387 A1 12/2009 Joshi et al.
2009/0302394 A1 12/2009 Fujita
2009/0309152 A1 12/2009 Knoefler et al.
2009/0317950 A1 12/2009 Okihara
2009/0321830 A1 12/2009 Maly
2009/0321853 A1 12/2009 Cheng
2009/0321948 A1 12/2009 Wang et al.
2009/0325343 A1 12/2009 Lee
2010/0001282 A1 1/2010 Mieno
2010/0025766 A1 2/2010 Nuttinck et al.
2010/0031217 A1 2/2010 Sinha et al.
2010/0038743 A1 2/2010 Lee
2010/0038769 A1* 2/2010 Baek et al. .................... 257/686
2010/0052134 A1 3/2010 Werner et al.
2010/0058580 A1 3/2010 Yazdani
2010/0081232 A1 4/2010 Furman et al.
2010/0112753 A1 5/2010 Lee
2010/0112810 A1 5/2010 Lee et al.
2010/0123202 A1 5/2010 Hofmann
2010/0133695 A1 6/2010 Lee
2010/0133704 A1 6/2010 Marimuthu et al.
2010/0137143 A1 6/2010 Rothberg et al.
2010/0140790 A1 6/2010 Setiadi et al.
2010/0190334 A1 7/2010 Lee
2010/0193884 A1 8/2010 Park et al.
2010/0193964 A1 8/2010 Farooq et al.
2010/0224915 A1 9/2010 Kawashima et al.
2010/0276662 A1 11/2010 Colinge
2010/0289064 A1* 11/2010 Or-Bach et al. ............... 257/209
2010/0291749 A1* 11/2010 Or-Bach et al. ............... 438/401
2010/0307572 A1 12/2010 Bedell et al.
2010/0308211 A1 12/2010 Cho et al.
2010/0308863 A1 12/2010 Gliese et al.
2011/0001172 A1 1/2011 Lee
2011/0003438 A1 1/2011 Lee
2011/0024724 A1 2/2011 Frolov et al.
2011/0026263 A1 2/2011 Xu
2011/0037052 A1 2/2011 Schmidt et al.
2011/0042696 A1 2/2011 Smith et al.
2011/0049336 A1* 3/2011 Matsunuma ............... 250/214.1
2011/0049577 A1* 3/2011 Or-Bach et al. ............... 257/209
2011/0050125 A1 3/2011 Medendorp et al.

(56) References Cited

U.S. PATENT DOCUMENTS

| | | | | |
|---|---|---|---|---|
| 2011/0053332 | A1 | 3/2011 | Lee | |
| 2011/0084314 | A1* | 4/2011 | Or-Bach et al. | 257/209 |
| 2011/0092030 | A1* | 4/2011 | Or-Bach et al. | 438/129 |
| 2011/0101537 | A1 | 5/2011 | Barth et al. | |
| 2011/0102014 | A1 | 5/2011 | Madurawe | |
| 2011/0108888 | A1* | 5/2011 | Or-Bach et al. | 257/204 |
| 2011/0121366 | A1* | 5/2011 | Or-Bach et al. | 257/204 |
| 2011/0143506 | A1 | 6/2011 | Lee | |
| 2011/0147791 | A1 | 6/2011 | Norman et al. | |
| 2011/0221022 | A1 | 9/2011 | Toda | |
| 2011/0227158 | A1 | 9/2011 | Zhu | |
| 2011/0241082 | A1 | 10/2011 | Bernstein et al. | |
| 2011/0284992 | A1 | 11/2011 | Zhu | |
| 2011/0286283 | A1 | 11/2011 | Lung et al. | |
| 2011/0298011 | A1* | 12/2011 | Lee et al. | 257/204 |
| 2012/0001184 | A1 | 1/2012 | Ha et al. | |
| 2012/0003815 | A1 | 1/2012 | Lee | |
| 2012/0013013 | A1 | 1/2012 | Sadaka et al. | |
| 2012/0025388 | A1 | 2/2012 | Law et al. | |
| 2012/0063090 | A1 | 3/2012 | Hsiao et al. | |
| 2012/0074466 | A1 | 3/2012 | Setiadi et al. | |
| 2012/0178211 | A1 | 7/2012 | Hebert | |
| 2012/0181654 | A1 | 7/2012 | Lue | |
| 2012/0182801 | A1 | 7/2012 | Lue | |
| 2012/0241919 | A1 | 9/2012 | Mitani | |
| 2012/0319728 | A1 | 12/2012 | Madurawe | |

OTHER PUBLICATIONS

Huet, K., et al., "Ultra Low Thermal Budget Anneals for 3D Memories: Access Device Formation," Ion Implantation Technology 2012, AIP Conf Proceedings 1496, 135-138 (2012).

Batude, P., et al., "3D Monolithic Integration," ISCAS 2011 pp. 2233-2236.

Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.

Vinet, M., et.al., "Germanium on Insulator and new 3D architectures opportunities for integration", International Journal of Nanotechnology, vol. 7, No. 4, pp. 304-319.

Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.

Tan, C.S., et al., "Wafer Level 3-D ICs Process Technology," ISBN-10: 0387765328, Springer, 1st Ed., Sep. 19, 2008, pp. v-xii, 34, 58, and 59.

Yoon, S.W. et al., "Fabrication and Packaging of Microbump Interconnections for 3D TSV," IEEE International Conference on 3D System Integration (3DIC), Sep. 28-30, 2009, pp. 1-5.

Franzon, P.D., et al., "Design and CAD for 3D Integrated Circuits," 45th ACM/IEEE Design, Automation Conference (DAC), Jun. 8-13, 2008, pp. 668-673.

Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

Dong, C., et al., "Reconfigurable Circuit Design with Nanomaterials," Design, Automation & Test in Europe Conference & Exhibition, Apr. 20-24, 2009, pp. 442-447.

Razavi, S.A., et al., "A Tileable Switch Module Architecture for Homogeneous 3D FPGAs," IEEE International Conference on 3D System Integration (3DIC), Sep. 28-30, 2009, 4 pages.

Bakir M., et al., "3D Device-Stacking Technology for Memory," pp. 407-410.

Weis, M., et al., "Stacked 3-Dimensional 6T SRAM Cell with Independent Double Gate Transistors," IC Design and Technology, May 18-20, 2009.

Doucette, P., "Integrating Photonics: Hitachi, Oki Put LEDs on Silicon," Solid State Technology, Jan. 2007, p. 22, vol. 50, No. 1.

Luo, Z.S., et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.

Zahler, J.M. et al., "Wafer Bonding and Layer Transfer Processes for High Efficiency Solar Cells," NCPV and Solar Program Review Meeting, 2003, pp. 723-726.

Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.

Colinge, J. P., et al., "Nanowire transistors without Junctions", Nature Nanotechnology, Feb. 21, 2010, pp. 1-5.

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T., et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International , pp. 297-300, Dec. 7-9, 2009.

Burr, G. W., et al., "Overview of candidate device technologies for storage-class memory," IBM Journal of Research and Development, vol. 52, No. 4.5, pp. 449-464, Jul. 2008.

Bez, R., et al., "Introduction to Flash memory," Proceedings IEEE, 91(4), 489-502 (2003).

Auth, C., et al., "45nm High-k + Metal Gate Strain-Enhanced Transistors," Symposium on VLSI Technology Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

Sen, P. & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.

Iwai, H., et.al., "NiSi Salicide Technology for Scaled CMOS," Microelectronic Engineering, 60 (2002), pp. 157-169.

Froment, B., et al., "Nickel vs. Cobalt Silicide integration for sub-50nm CMOS", IMEC ESS Circuits, 2003. pp. 215-219.

James, D., "65 and 45-nm Devices—an Overview", Semicon West, Jul. 2008, paper No. ctr_024377.

(56) References Cited

OTHER PUBLICATIONS

Davis, J.A., et.al., "Interconnect Limits on Gigascale Integration(GSI) in the 21st Century", Proc. IEEE, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International , pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M., et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X., et al., "Cascade single-chip phosphor-free white light emitting diodes," Applied Physics Letters, 2008, pp. 013507-1-013507-3, vol. 92.
Takafuji, Y., et al., "Integration of Single Crystal Si TFTs and Circuits on a Large Glass Substrate," IEEE International Electron Devices Meeting (IEDM), Dec. 7-9, 2009, pp. 1-4.
Wierer, J.J., et al., "High-power AlGaInN flip-chip light-emitting diodes," Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al.,"Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P., et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J., et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.N., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.

(56) References Cited

OTHER PUBLICATIONS

Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings Date, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Meindl, J. D., "Beyond Moore's Law: The Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation Of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Perfor-

(56) References Cited

OTHER PUBLICATIONS mance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IEEE International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.
Yang, M., et al., "High Performance CMOS Fabricated on Hybrid Substrate with Different Crystal Orientation," Proceedings IEDM 2003.
Yin, H., et al., "Scalable 3-D finlike poly-Si TFT and its nonvolatile memory application," IEEE Trans. Electron Devices, vol. 55, No. 2, pp. 578-584, Feb. 2008.
Kim, I.-K., et al.,"Advanced Integration Technology for a Highly Scalable SOI DRAM with SOC (Silicon-On-Capacitors)", IEDM 1996, pp. 96-605-96-608, 22.5.4.
Lee, B.H., et al., "A Novel CMP Method for cost-effective Bonded SOI Wafer Fabrication," Proceedings 1995 IEEE International SOI Conference, Oct. 1995, pp. 60-61.
Lee, B.H., et al., "A Novel Pattern Transfer Process for Bonded SOI Giga-bit DRAMs," Proceedings 1996 IEEE International SOI Conference, Oct. 1996, pp. 114-115.
Topol, A.W., et al., "Enabling SOI-Based Assembly Technology for Three-Dimensional (3D) Integrated Circuits (ICs)," IEDM Tech. Digest, Dec. 5, 2005, pp. 363-366.
Demeester, P., et al., "Epitaxial lift-off and its applications," Semicond. Sci. Technol., 1993, pp. 1124-1135, vol. 8.

(56) References Cited

OTHER PUBLICATIONS

Yoon, J., et al., "GaAs Photovoltaics and optoelectronics using releasable multilayer epitaxial assemblies", Nature, vol. 465, May 20, 2010, pp. 329-334.
Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.
Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.
Kim, W., et al., "Multi-layered Vertical Gate NAND Flash overcoming stacking limit for terabit density storage", Symposium on VLSI Technology Digest of Technical Papers, 2009, pp. 188-189.
Dicioccio, L., et. al., "Direct bonding for wafer level 3D integration", ICICDT 2010, pp. 110-113.
Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.
Celler, G.K., et al., "Frontiers of silicon-on-insulator," J. App. Phys., May 1, 2003, pp. 4955-4978, vol. 93, No. 9.
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Hui, K. N., et al., "Design of vertically-stacked polychromatic light-emitting diodes," Optics Express, Jun. 8, 2009, pp. 9873-9878, vol. 17, No. 12.
Chuai, D. X., et al., "A Trichromatic Phosphor-Free White Light-Emitting Diode by Using Adhesive Bonding Scheme," Proc. SPIE, 2009, vol. 7635.
Suntharalingam, V., et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P., et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Flamand, G., et al., "Towards Highly Efficient 4-Terminal Mechanical Photovoltaic Stacks," III-Vs Review, Sep.-Oct. 2006, pp. 24-27, vol. 19, Issue 7.
Zahler, J.M., et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Batude, P., et al., "Advances in 3D CMOS Sequential Integration," 2009 IEEE International Electron Devices Meeting (Baltimore, Maryland), Dec. 7-9, 2009, pp. 345-348.
Kada, M., "Updated results of R&D on functionally innovative 3D-integrated circuit (dream chip) technology in FY2009", (2010) International Microsystems Packaging Assembly and Circuits Technology Conference, Impact 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S., et al., "CELONCEL: Effective Design Technique for 3-D Monolithic Integration targeting High Performance Integrated Circuits", *Asia pacific DAC* 2011, paper 4A-4.
Choudhury, D., "3D Integration Technologies for Emerging Microsystems", IEEE Proceedings of the IMS 2010, pp. 1-4.
Lee, Y.-J., et. al, "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu-Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., "Three Dimensionally Stacked NAND Flash Memory Technology Using Stacking Single Crystal Si Layers on ILD and TANOS Structure for Beyond 30nm Node", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.

(56) References Cited

OTHER PUBLICATIONS

Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10- μm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration", www.electroiq.com , Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional ICs, Having Four Stacked Active Device Layers," IEDM 1989, paper 34.6, pp. 837-840.
Gaillardon, P-E., et al., "Can We Go Towards True 3-D Architectures?," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunities in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.

* cited by examiner

| Part of Transistor | Technology used for Construction | Process Temperatures |
| --- | --- | --- |
| Single Crystal Silicon | Layer transfer with Ion-Cut Process | <400°C |
| Gate Dielectrics and Gate Electrodes | Atomic Layer Deposition (ALD) or Chemical Vapor Deposition (CVD) | <400°C |
| Source and Drain Regions | Ion implantation followed by Anneal | >400°C, typically in 700°C-1200°C range |

Doping does not change between silicon region forming source 608, drain 610 and region under gate 612. Every region contains heavily doped silicon.

Angle Alpha can be between 90° and 180°.

Gate electrode protrudes into p- Si region.

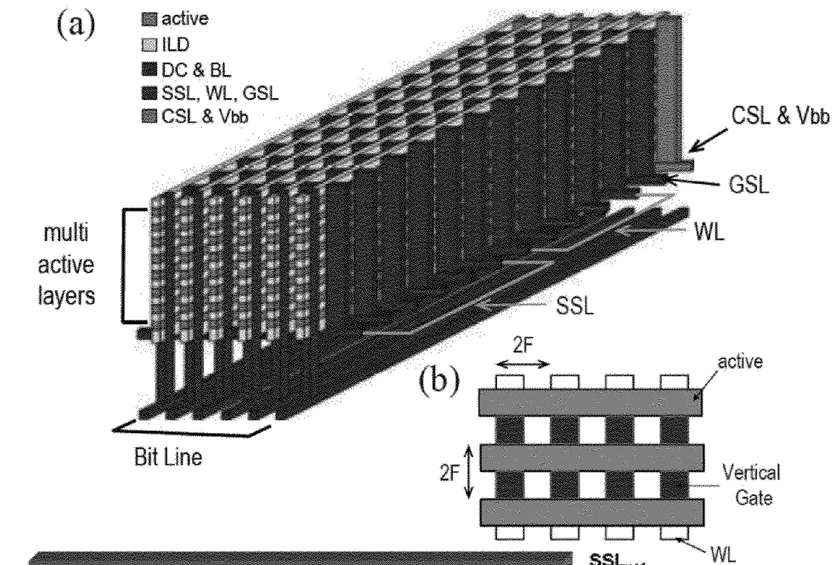
Architecture from "Multi-layered Vertical Gate NAND Flash overcoming stacking limit for terabit density storage", Symposium on VLSI Technology, 2009 by W. Kim, S. Choi, et al.
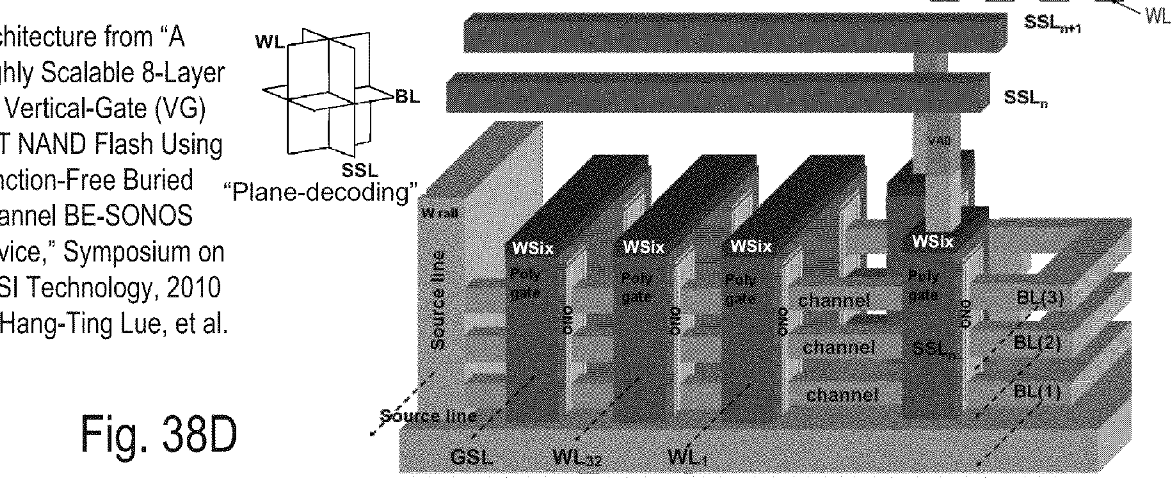
Architecture from "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al.
Fig. 38D

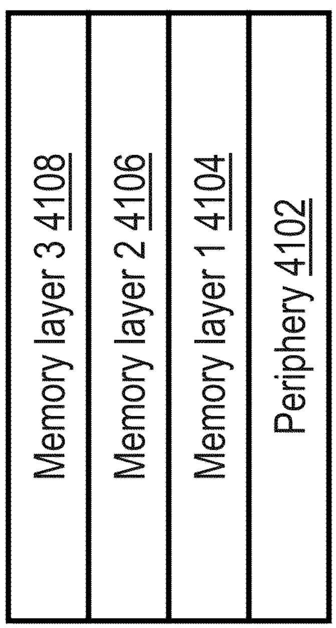
Fig. 41A: Periphery-on-bottom architecture
Used for Fig. 28-40
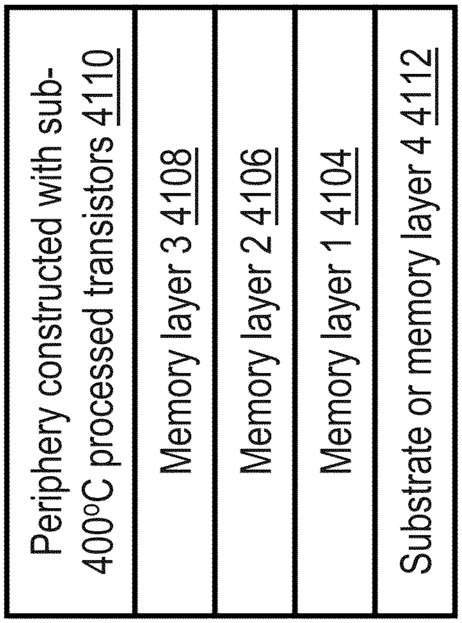
Fig. 41B: Periphery-on-top architecture
An alternative

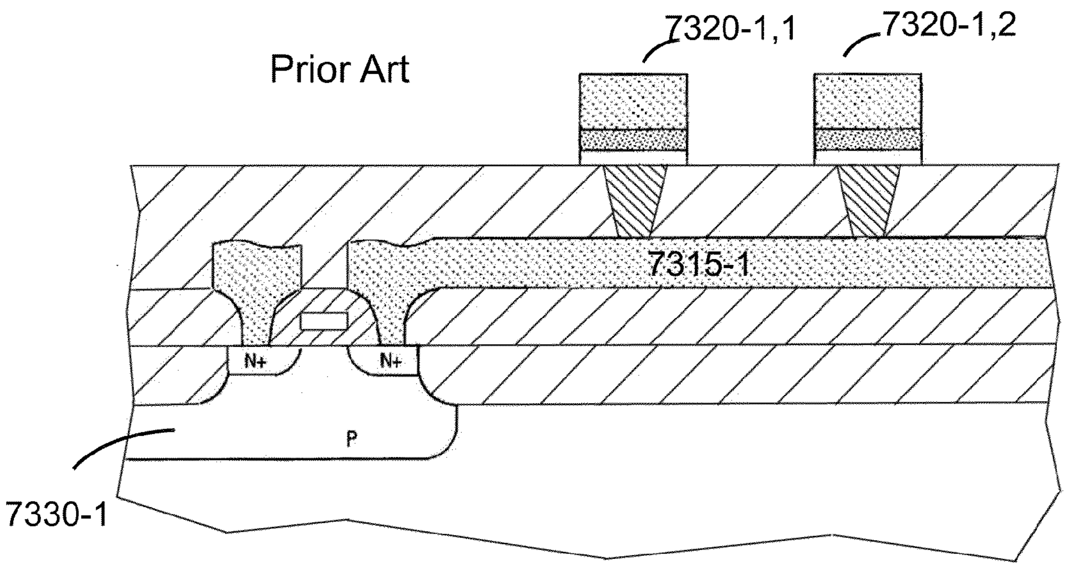
Fig. 74 - prior art

Flow for '3D Partition' (To two dies connected by TSV):

9402

9403

METHOD FOR FABRICATION OF A SEMICONDUCTOR DEVICE AND STRUCTURE

This application claims priority of co-pending U.S. patent application Ser. Nos. 12/792,673, 12/797,493, 12/847,911, 12/849,272, 12/859,665, 12/903,862, 12/900,379, 12/901,890, 12/949,617, 12/970,602, 12,904,119, 12/951,913, 12/894,252, 12/904,108, 12/941,073, 12/941,074, 12/941,075, 12/951,924, 13/041,405, 13/041,406, 13/016,313, 13/016,313, PCT/US2011/042071, 13/099,010, and 13/098,997 the contents of which are incorporated by reference.

BACKGROUND OF THE INVENTION

1. Field of the Invention

The invention relates to the general field of Integrated Circuit (IC) devices and fabrication methods, and more particularly to multilayer or Three Dimensional Integrated Circuit (3D-IC) devices 2. Discussion of Background Art Over the past 40 years, one has seen a dramatic increase in functionality and performance of Integrated Circuits (ICs). This has largely been due to the phenomenon of "scaling" i.e. component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today may be that wires dominate performance, functionality and power consumption of ICs.

3D stacking of semiconductor chips may be one avenue to tackle issues with wires. By arranging transistors in 3 dimensions instead of 2 dimensions (as was the case in the 1990s), one can place transistors in ICs closer to each other. This reduces wire lengths and keeps wiring delay low. However, there are many barriers to practical implementation of 3D stacked chips. These include:

- Constructing transistors in ICs typically require high temperatures (higher than ~700° C.) while wiring levels are constructed at low temperatures (lower than ~400° C.). Copper or Aluminum wiring levels, in fact, can get damaged when exposed to temperatures higher than ~400° C. If one would like to arrange transistors in 3 dimensions along with wires, it has the challenge described below. For example, let us consider a 2 layer stack of transistors and wires i.e. Bottom Transistor Layer, above it Bottom Wiring Layer, above it Top Transistor Layer and above it Top Wiring Layer. When the Top Transistor Layer may be constructed using Temperatures higher than 700° C., it can damage the Bottom Wiring Layer.
- Due to the above mentioned problem with forming transistor layers above wiring layers at temperatures lower than 400° C., the semiconductor industry has largely explored alternative architectures for 3D stacking In these alternative architectures, Bottom Transistor Layers, Bottom Wiring Layers and Contacts to the Top Layer are constructed on one silicon wafer. Top Transistor Layers, Top Wiring Layers and Contacts to the Bottom Layer are constructed on another silicon wafer. These two wafers are bonded to each other and contacts are aligned, bonded and connected to each other as well. Unfortunately, the size of Contacts to the other Layer may be large and the number of these Contacts may be small. In fact, prototypes of 3D stacked chips today utilize as few as 10,000 connections between two layers, compared to billions of connections within a layer. This low connectivity between layers may be because of two reasons: (i) Landing pad size needs to be relatively large due to alignment issues during wafer bonding. These could be due to many reasons, including bowing of wafers to be bonded to each other, thermal expansion differences between the two wafers, and lithographic or placement misalignment. This misalignment between two wafers limits the minimum contact landing pad area for electrical connection between two layers; (ii) The contact size needs to be relatively large. Forming contacts to another stacked wafer typically involves having a Through-Silicon Via (TSV) on a chip. Etching deep holes in silicon with small lateral dimensions and filling them with metal to form TSVs may be not easy. This places a restriction on lateral dimensions of TSVs, which in turn impacts TSV density and contact density to another stacked layer. Therefore, connectivity between two wafers may be limited.

It may be highly desirable to circumvent these issues and build 3D stacked semiconductor chips with a high-density of connections between layers. To achieve this goal, it may be sufficient that one of three requirements must be met: (1) A technology to construct high-performance transistors with processing temperatures below ~400° C.; (2) A technology where standard transistors are fabricated in a pattern, which allows for high density connectivity despite the misalignment between the two bonded wafers; and (3) A chip architecture where process temperature increase beyond 400° C. for the transistors in the top layer does not degrade the characteristics or reliability of the bottom transistors and wiring appreciably. This patent application describes approaches to address options (1), (2) and (3) in the detailed description section. In the rest of this section, background art that has previously tried to address options (1), (2) and (3) will be described.

U.S. Pat. No. 7,052,941 from Sang-Yun Lee ("S-Y Lee") describes methods to construct vertical transistors above wiring layers at less than 400° C. In these single crystal Si transistors, current flow in the transistor's channel region may be in the vertical direction. Unfortunately, however, almost all semiconductor devices in the market today (logic, DRAM, flash memory) utilize horizontal (or planar) transistors due to their many advantages, and it may be difficult to convince the industry to move to vertical transistor technology.

A paper from IBM at the Intl. Electron Devices Meeting in 2005 describes a method to construct transistors for the top stacked layer of a 2 chip 3D stack on a separate wafer. This paper is "Enabling SOI-Based Assembly Technology for Three-Dimensional (3D) Integrated Circuits (ICs)," *IEDM Tech. Digest*, p. 363 (2005) by A. W. Topol, D.C. La Tulipe, L. Shi, et al. ("Topol"). A process flow may be utilized to transfer this top transistor layer atop the bottom wiring and transistor layers at temperatures less than 400° C. Unfortunately, since transistors are fully formed prior to bonding, this scheme suffers from misalignment issues. While Topol describes techniques to reduce misalignment errors in the above paper, the techniques of Topol still suffer from misalignment errors that limit contact dimensions between two chips in the stack to >130 nm.

The textbook "Integrated Interconnect Technologies for 3D Nanoelectronic Systems" by Bakir and Meindl ("Bakir") describes a 3D stacked DRAM concept with horizontal (i.e. planar) transistors. Silicon for stacked transistors may be produced using selective epitaxy technology or laser recrystallization. Unfortunately, however, these technologies have higher defect density compared to standard single crystal silicon. This higher defect density degrades transistor performance.

In the NAND flash memory industry, several organizations have attempted to construct 3D stacked memory. These attempts predominantly use transistors constructed with poly-Si or selective epi technology as well as charge-trap concepts. References that describe these attempts to 3D stacked memory include "Integrated Interconnect Technologies for 3D Nanoelectronic Systems", Artech House, 2009 by Bakir and Meindl ("Bakir"), "Bit Cost Scalable Technology with Punch and Plug Process for Ultra High Density Flash Memory", Symp. VLSI Technology Tech. Dig. pp. 14-15, 2007 by H. Tanaka, M. Kido, K. Yahashi, et al. ("Tanaka"), "A Highly Scalable 8-Layer 3D Vertical-Gate (VG) TFT NAND Flash Using Junction-Free Buried Channel BE-SONOS Device," Symposium on VLSI Technology, 2010 by W. Kim, S. Choi, et al. ("W. Kim"), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. ("Lue") and "Sub-50 nm Dual-Gate Thin-Film Transistors for Monolithic 3-D Flash", IEEE Trans. Elect. Dev., vol. 56, pp. 2703-2710, November 2009 by A. J. Walker ("Walker"). An architecture and technology that utilizes single crystal Silicon using epi growth is described in "A Stacked SONOS Technology, Up to 4 Levels and 6 nm Crystalline Nanowires, with Gate-All-Around or Independent Gates (ΦFlash), Suitable for Full 3D Integration", International Electron Devices Meeting, 2009 by A. Hubert, et al ("Hubert"). However, the approach described by Hubert has some challenges including the use of difficult-to-manufacture nanowire transistors, higher defect densities due to formation of Si and SiGe layers atop each other, high temperature processing for long times, and difficult manufacturing.

It is clear based on the background art mentioned above that invention of novel technologies for 3D stacked chips will be useful.

Three dimensional integrated circuits are known in the art, though the field may be in its infancy with a dearth of commercial products. Many manufacturers sell multiple standard two dimensional integrated circuit (2DIC) devices in a single package known as a Multi-Chip Modules (MCM) or Multi-Chip Packages (MCP). Often these 2DICs are laid out horizontally in a single layer, like the Core 2 Quad microprocessor MCMs available from Intel Corporation of Santa Clara, Calif. In other products, the standard 2DICs are stacked vertically in the same MCP like in many of the moviNAND flash memory devices available from Samsung Electronics of Seoul, South Korea like the illustration shown in FIG. 81C. None of these products are true 3DICs.

Devices where multiple layers of silicon or some other semiconductor (where each layer comprises active devices and local interconnect like a standard 2DIC) are bonded together with Through Silicon Via (TSV) technology to form a true 3D IC have been reported in the literature in the form of abstract analysis of such structures as well as devices constructed doing basic research and development in this area. FIG. 81A illustrates an example in which Through Silicon Vias are constructed continuing vertically through all the layers creating a global interlayer connection. FIG. 81B provides an illustration of a 3D IC system in which a Through Silicon Via 8104 may be placed at the same relative location on the top and bottom of all the 3D IC layers creating a standard vertical interface between the layers.

Constructing future 3DICs may require new architectures and new ways of thinking In particular, yield and reliability of extremely complex three dimensional systems will have to be addressed, particularly given the yield and reliability difficulties encountered in complex Application Specific Integrated Circuits (ASIC) built in recent deep submicron process generations.

Fortunately, current testing techniques will likely prove applicable to 3D IC manufacturing, though they will be applied in very different ways. FIG. 100 illustrates a prior art set scan architecture in a 2D IC ASIC 10000. The ASIC functionality may be present in logic clouds 10020, 10022, 10024 and 10026 which are interspersed with sequential cells like, for example, pluralities of flip flops indicated at 10012, 10014 and 10016. The ASIC 10000 also has input pads 10030 and output pads 10040. The flip flops are typically provided with circuitry to allow them to function as a shift register in a test mode. In FIG. 100 the flip flops form a scan register chain where pluralities of flip flops 10012, 10014 and 10016 are coupled together in series with Scan Test Controller 10010. One scan chain may be shown in FIG. 100, but in a practical design comprising millions of flip flops many sub-chains will be used.

In the test architecture of FIG. 100, test vectors are shifted into the scan chain in a test mode. Then the part may be placed into operating mode for one or more clock cycles, after which the contents of the flip flops are shifted out and compared with the expected results. This provides an excellent way to isolate errors and diagnose problems, though the number of test vectors in a practical design can be very large and an external tester may be often required.

FIG. 101 shows a prior art boundary scan architecture in exemplary ASIC 10100. The part functionality may be shown in logic function block 10110. The part also has a variety of input/output cells 10120, each comprising a bond pad 10122, an input buffer 10124, and a tri-state output buffer 10126. Boundary Scan Register Chains 10132 and 10134 are shown coupled in series with Scan Test Control block 10130. This architecture operates in a similar manner as the set scan architecture of FIG. 100. Test vectors are shifted in, the part may be clocked, and the results are then shifted out to compare with expected results. Typically, set scan and boundary scan are used together in the same ASIC to provide complete test coverage.

FIG. 102 shows a prior art Built-In Self Test (BIST) architecture for testing a logic block 10200 which comprises a core block function 10210 (what is being tested), inputs 10212, outputs 10214, a BIST Controller 10220, an input Linear Feedback Shift Register (LFSR) 10222, and an output Cyclical Redundancy Check (CRC) circuit 10224. Under control of BIST Controller 10220, LFSR 10222 and CRC 10224 are seeded (set to a known starting value), the logic block 10200 may be clocked a predetermined number of times with LFSR 10222 presenting pseudo-random test vectors to the inputs of Block Function 10210 and CRC 10224 monitoring the outputs of Block Function 10210. After the predetermined number of clocks, the contents of CRC 10224 are compared to the expected value (or "signature"). If the signature matches, logic block 10200 passes the test and may be deemed good. This sort of testing may be good for fast "go" or "no go" testing as it may be self-contained to the block being tested and does not require storing a large number of test vectors or use of an external tester. BIST, set scan, and boundary scan techniques are often combined in complementary ways on the same ASIC. A detailed discussion of the theory of LSFRs and CRCs can be found in Digital Systems Testing and Testable Design, by Abramovici, Breuer and Friedman, Computer Science Press, 1990, pp 432-447.

Another prior art technique that may be applicable to the yield and reliability of 3DICs is Triple Modular Redundancy. This may be a technique where the circuitry may be instantiated in a design in triplicate and the results are compared. Because two or three of the circuit outputs are always assumed in agreement (as may be the case assuming single error and binary signals) voting circuitry (or majority-of-three or MAJ3) takes that as the result. While primarily a technique used for noise suppression in high reliability or radiation tolerant systems in military, aerospace and space applications, it also can be used as a way of masking errors in faulty circuits since if any two of three replicated circuits are functional the system will behave as if it may be fully functional. A discussion of the radiation tolerant aspects of Triple Modular Redundancy systems, Single Event Effects (SEE), Single Event Upsets (SEU) and Single Event Transients (SET) can be found in U.S. Patent Application Publication 2009/0204933 to Rezgui ("Rezgui").

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today may be that wires dominate performance, functionality and power consumption of ICs.

3D stacking of semiconductor devices or chips may be one avenue to tackle the issues with wires. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D approaches are described in pending U.S. patent application Ser. No. 12/900,379 and U.S. patent application Ser. No. 12/904,119.

Irrespective of the technique used to construct 3D stacked integrated circuits or chips, heat removal may be a serious issue for this technology. For example, when a layer of circuits with power density P may be stacked atop another layer with power density P, the net power density may be 2 P. Removing the heat produced due to this power density may be a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Many publications have suggested passing liquid coolant through multiple device layers of a 3D-IC to remove heat. This is described in "Microchannel Cooled 3D Integrated Systems", Proc. Intl. Interconnect Technology Conference, 2008 by D.C. Sekar, et al and "Forced Convective Interlayer Cooling in Vertically Integrated Packages," Proc. Intersoc. Conference on Thermal Management (ITHERM), 2008 by T. Brunschweiler, et al.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

Other techniques to remove heat from 3D Integrated Circuits and Chips will be beneficial.

BRIEF DESCRIPTION OF THE DRAWINGS

Various embodiments of the invention will be understood and appreciated more fully from the following detailed description, taken in conjunction with the drawings in which:

FIG. 38A-D show a fewer-masks per layer 3D horizontally-oriented charge-trap memory.

FIG. 41A-B show periphery on top of memory layers.

FIG. 74 illustrates a cross section of a prior art antifuse programming transistor.

FIG. 92A illustrates a repeatable structure suitable for use with the wafer alignment reduction scheme of FIG. 90C.

FIG. 92B illustrates an alternative repeatable structure to the repeatable structure of FIG. 92A.

FIG. 92C illustrates an alternative repeatable structure to the repeatable structure of FIG. 92B.

FIG. 92D illustrates an alternative repeatable gate array structure to the repeatable structure of FIG. 92C.

FIG. 93 illustrates an inter-wafer alignment scheme suitable for use with non-repeating structures.

FIG. 94A illustrates an 8×12 array of the repeatable structure of FIG. 92C.

FIG. 94B illustrates a reticle of the repeatable structure of FIG. 92C.

FIG. 94C illustrates the application of a dicing line mask to a continuous array of the structure of FIG. 94A.

FIG. 95A illustrates a six transistor memory cell suitable for use in a continuous array memory according to the invention.

FIG. 95B illustrates a continuous array of the memory cells of FIG. 95A with an etching pattern defining a 4×4 array.

FIG. 95C illustrates a word decoder on another layer suitable for use with the defined array of FIG. 95B.

FIG. 95D illustrates a column decoder and sense amplifier on another layer suitable for use with the defined array of FIG. 95B.

Figure 96A:
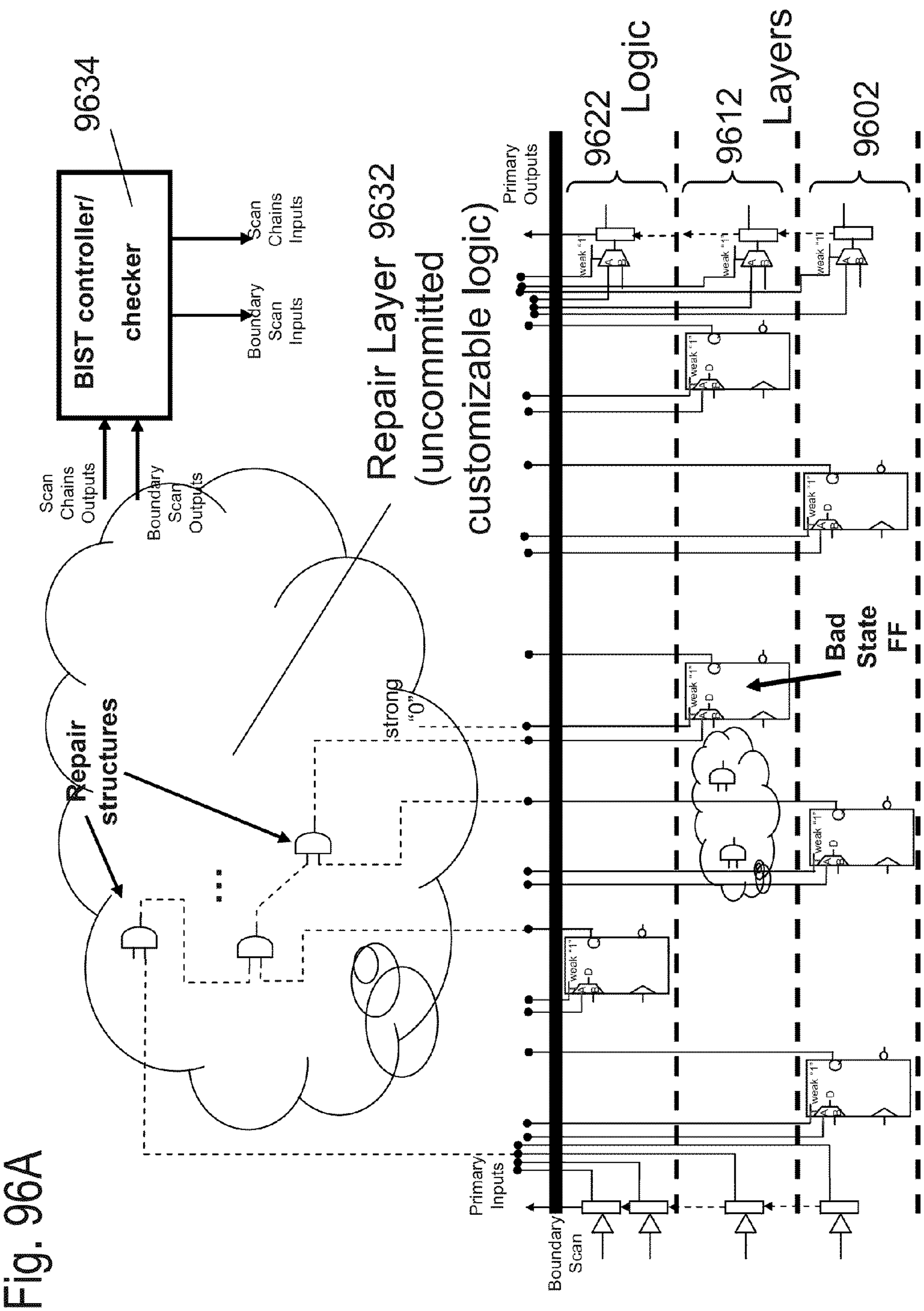

FIG. 96A illustrates a factory repairable 3D IC with three logic layers and a repair layer according to the invention.

Figure 96B:
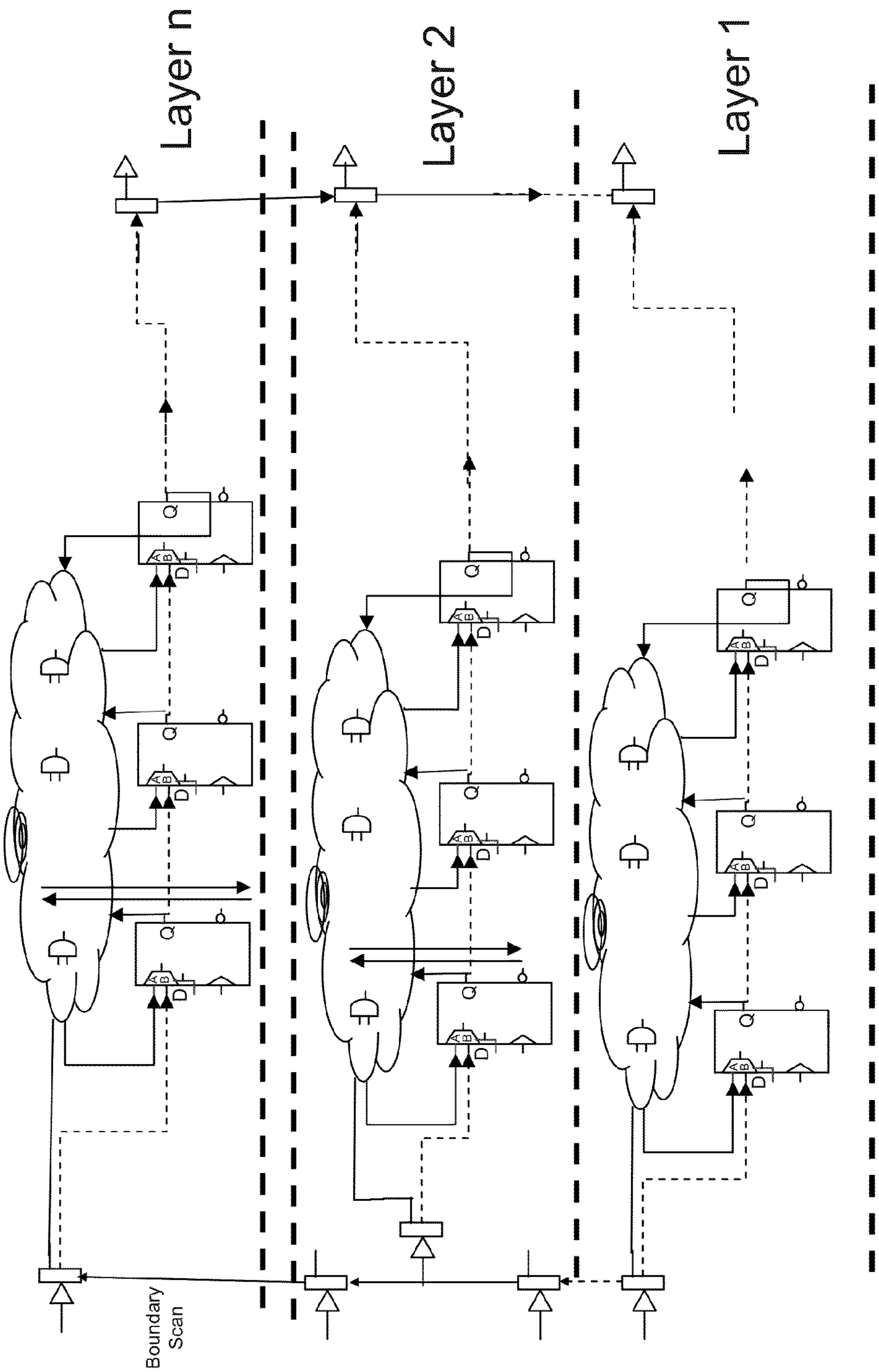

FIG. 96B illustrates boundary scan and set scan chains of the 3D IC of FIG. 96A.

Figure 96C:
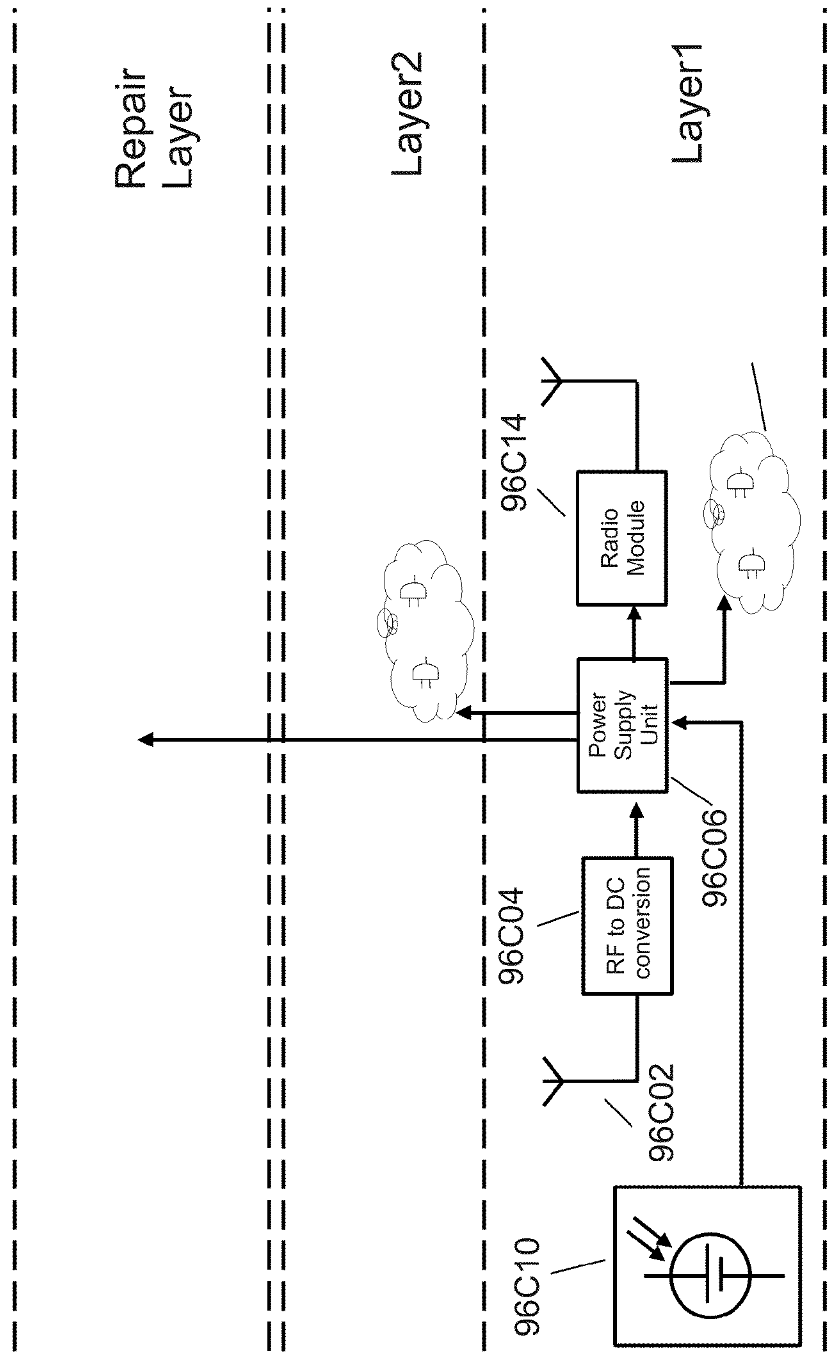

FIG. 96C illustrates methods of contactless testing of the 3D IC of FIG. 96A.

Figure 97:
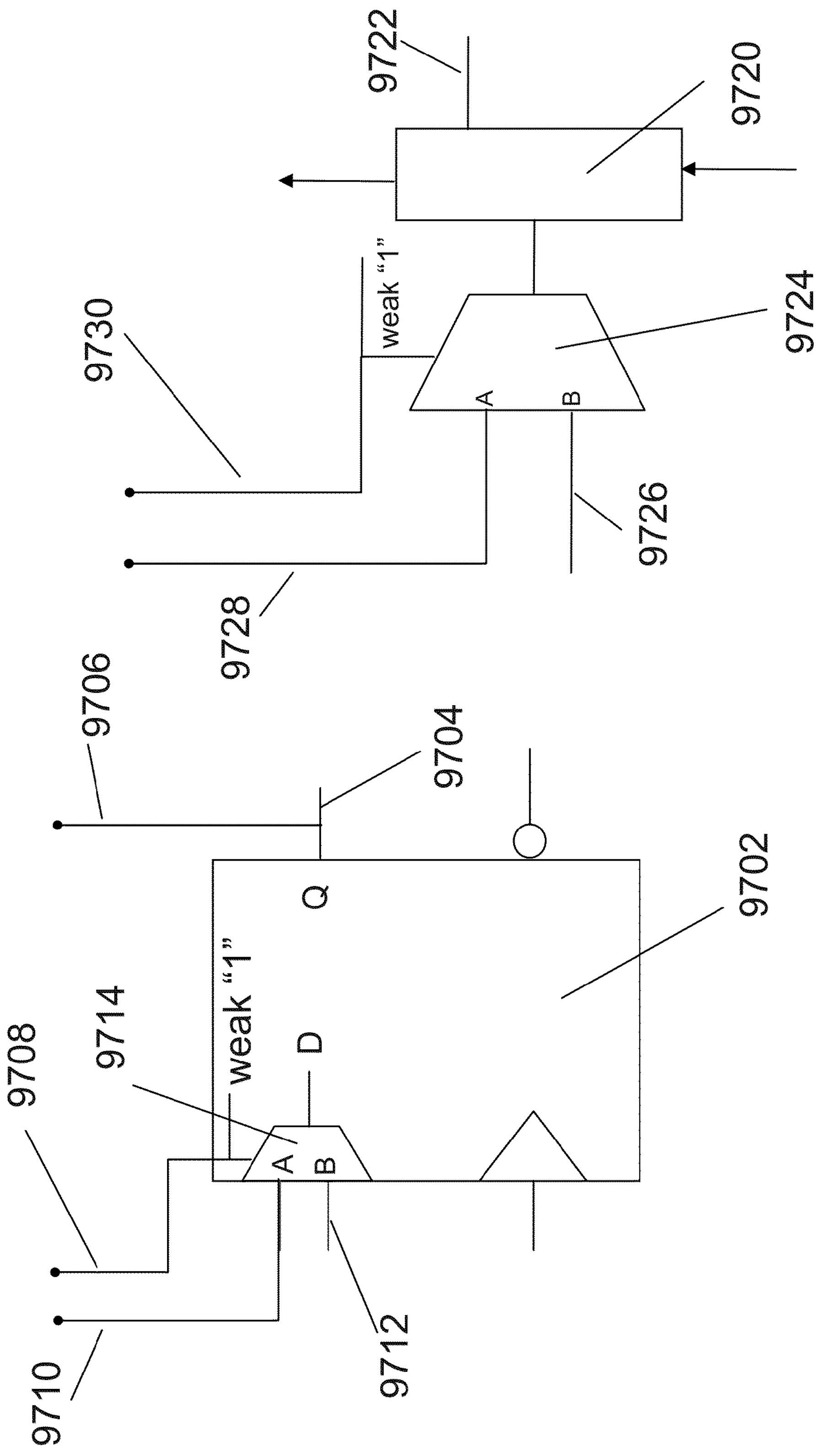

FIG. 97 illustrates a scan flip flop suitable for use with the 3D IC of FIG. 96A.

Figure 98:
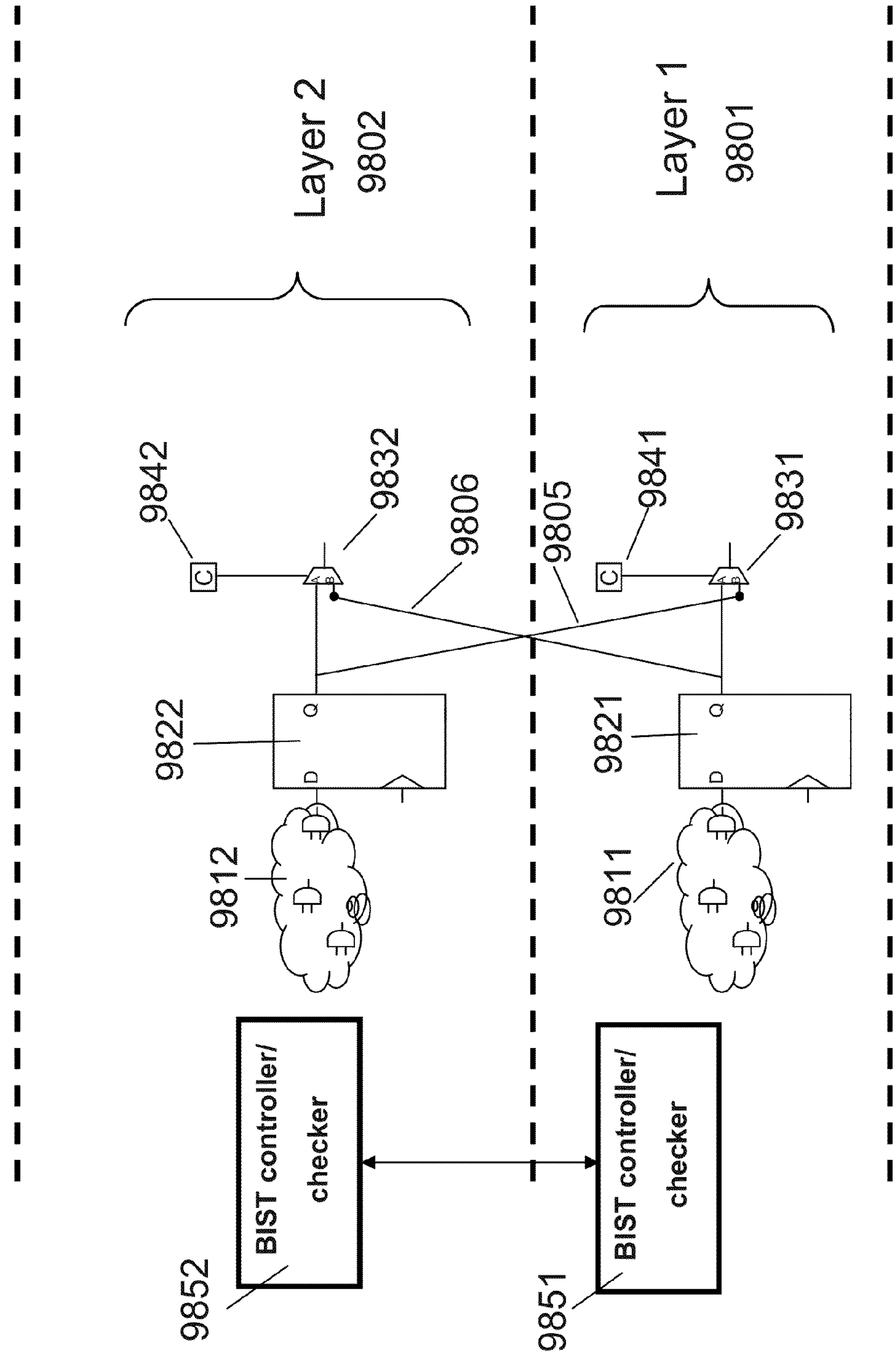

FIG. 98 illustrates a first field repairable 3D IC according to the invention.

Figure 99:
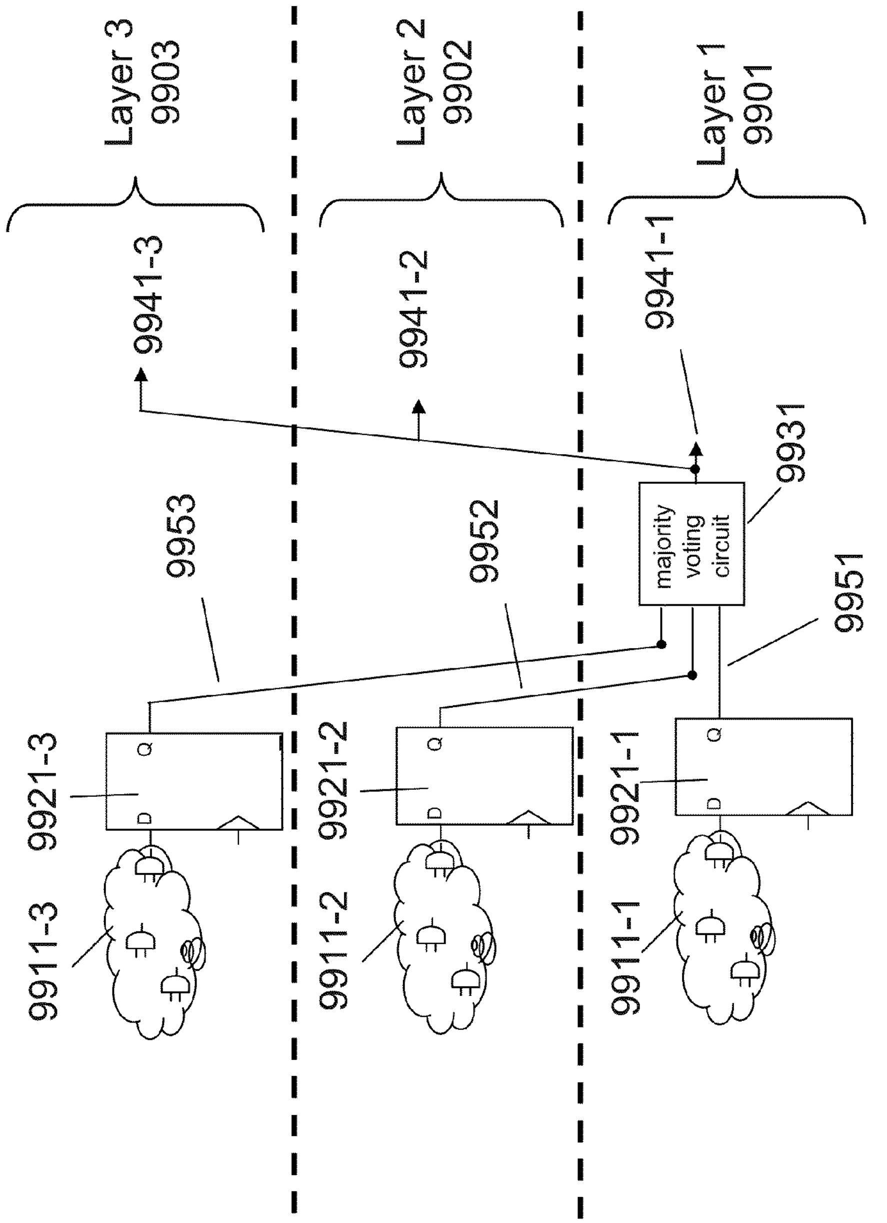

FIG. 99 illustrates a first Triple Modular Redundancy 3D IC according to the invention.

Figure 100:
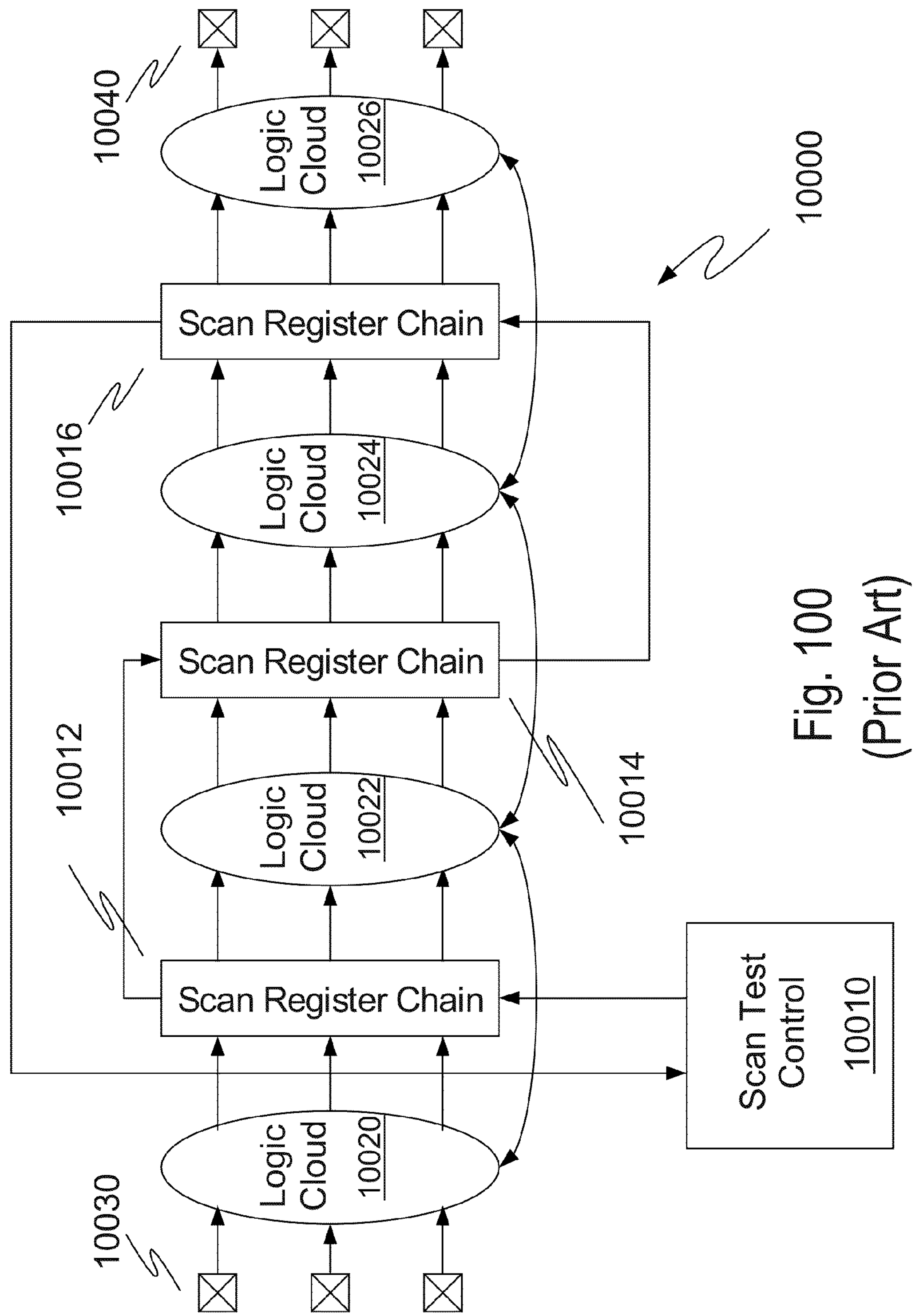

FIG. 100 illustrates a set scan architecture of the prior art.

Figure 101:
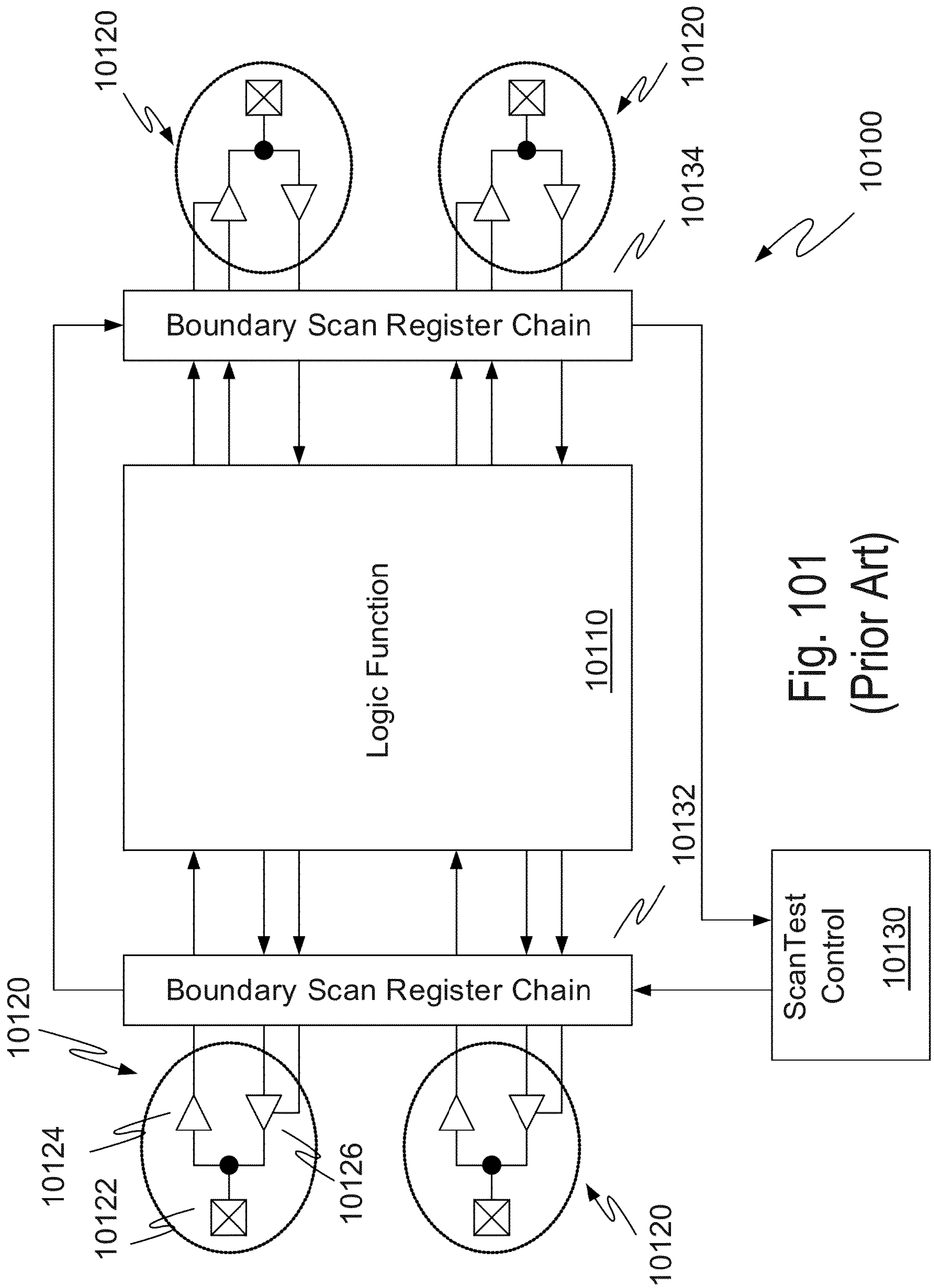

FIG. 101 illustrates a boundary scan architecture of the prior art.

Figure 102:
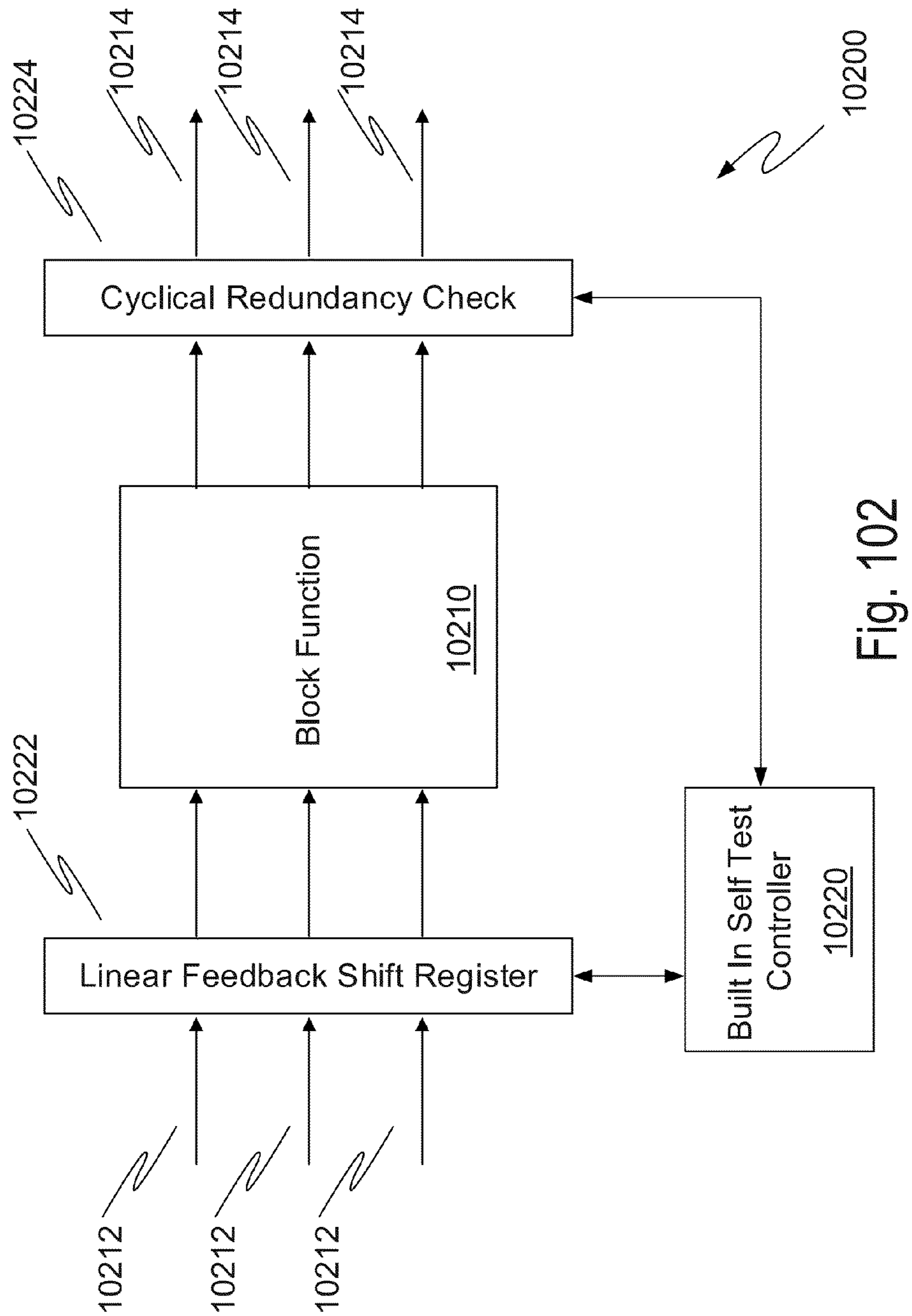

FIG. 102 illustrates a BIST architecture of the prior art.

Figure 103:
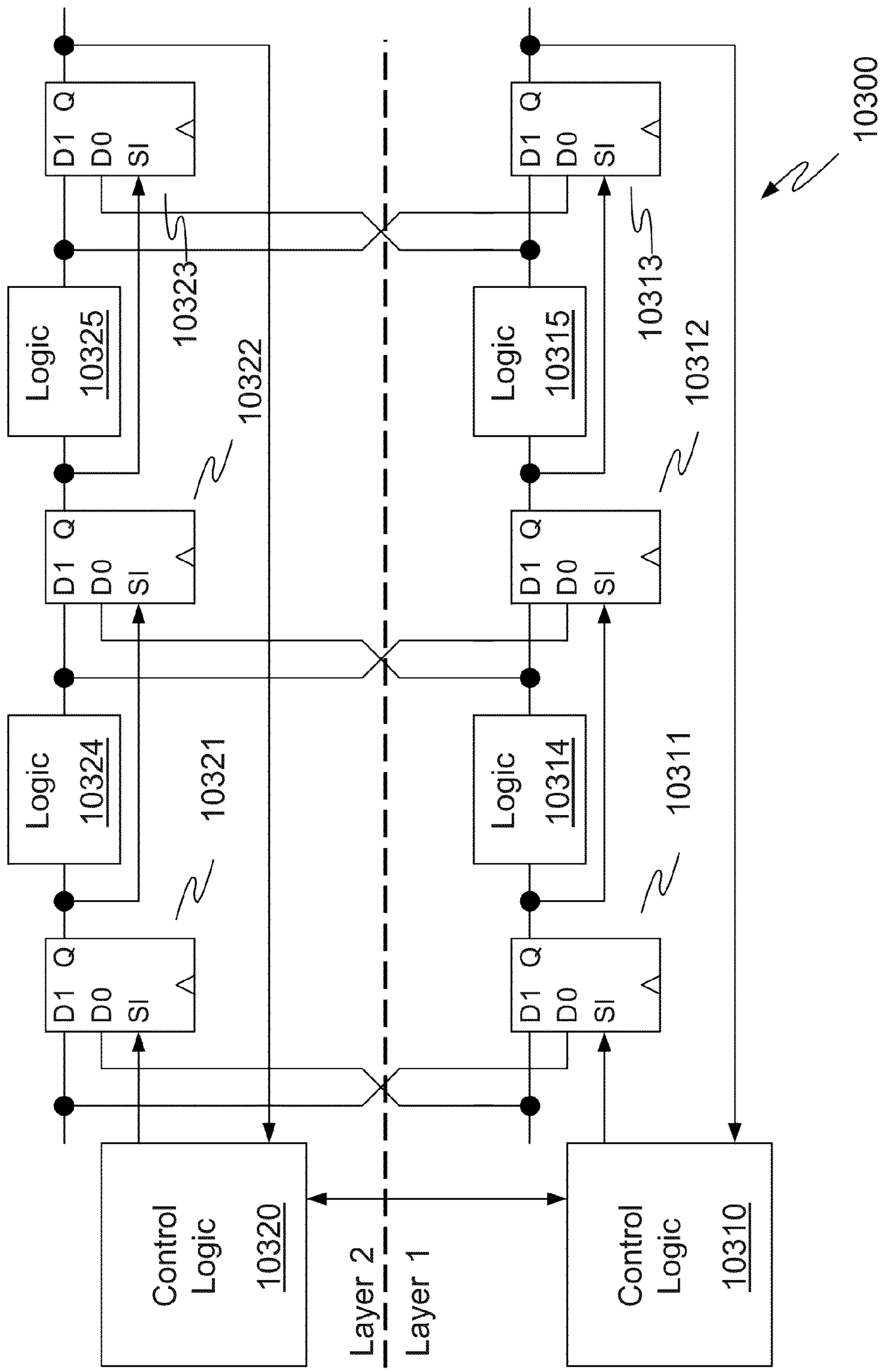

FIG. 103 illustrates a second field repairable 3D IC according to the invention.

Figure 104:
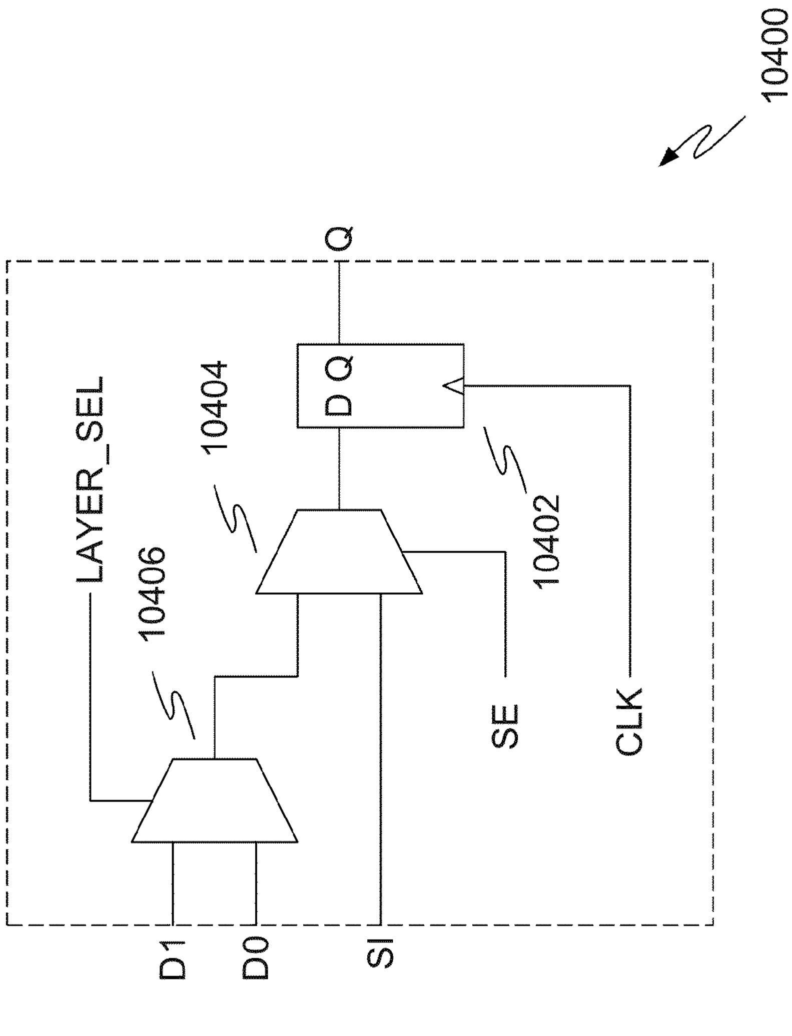

FIG. 104 illustrates a scan flip flop suitable for use with the 3D IC of FIG. 103.

Figure 105A:
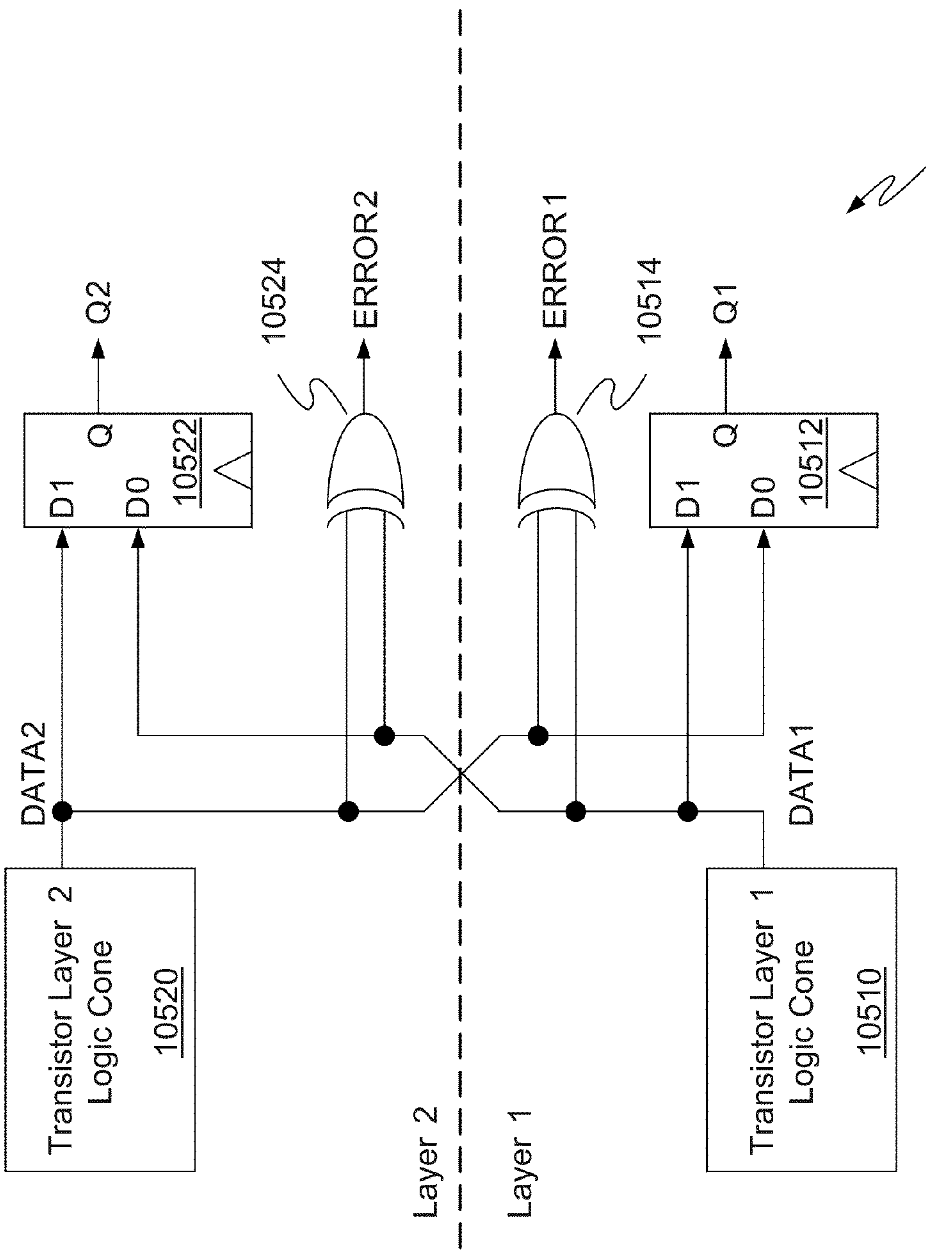

FIG. 105A illustrates a third field repairable 3D IC according to the invention.

Figure 105B:
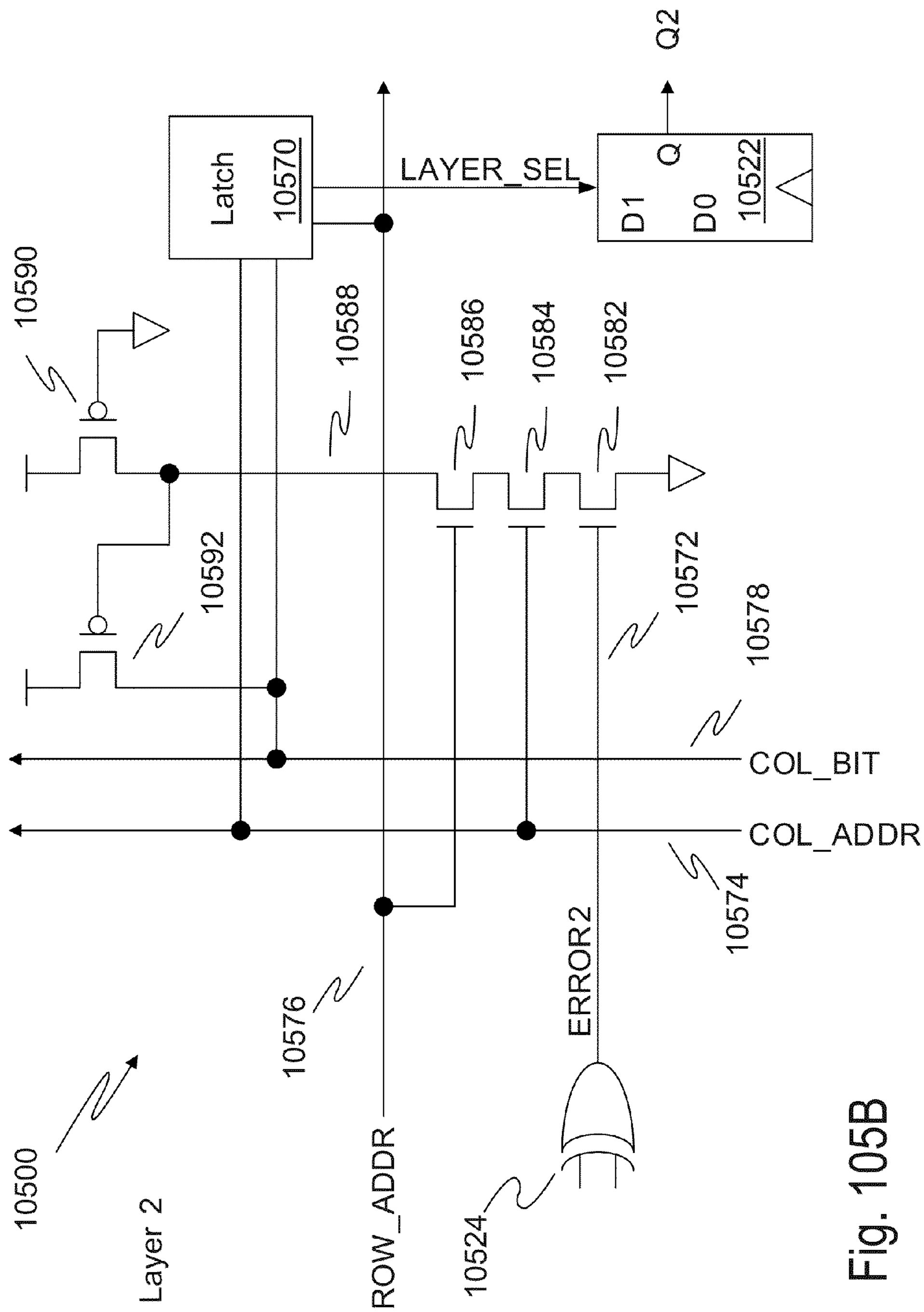

FIG. 105B illustrates additional aspects of the field repairable 3D IC of FIG. 105A.

Figure 106:
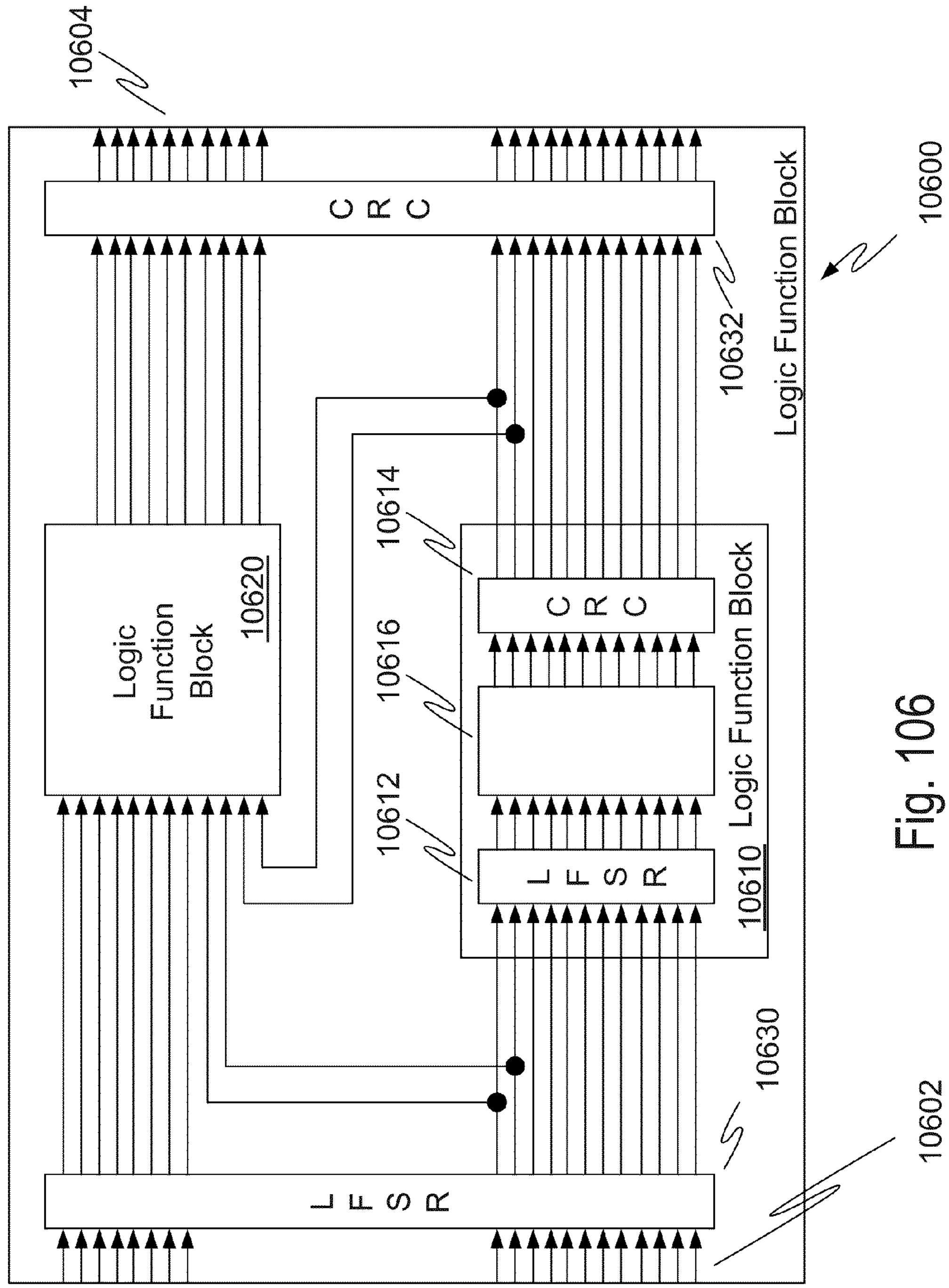

FIG. 106 illustrates a fourth field repairable 3D IC according to the invention.

Figure 107:
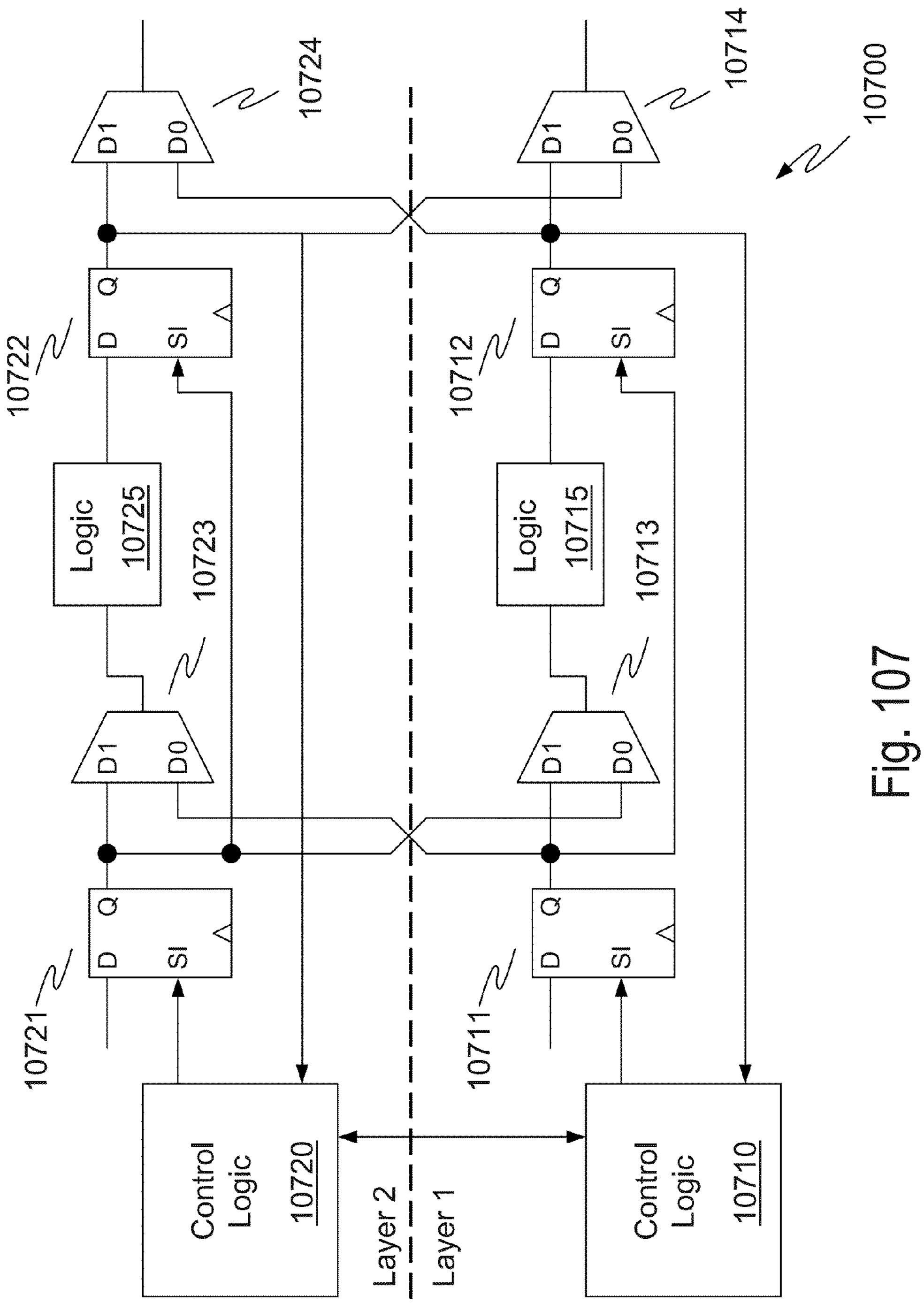

FIG. 107 illustrates a fifth field repairable 3D IC according to the invention.

Figure 108:
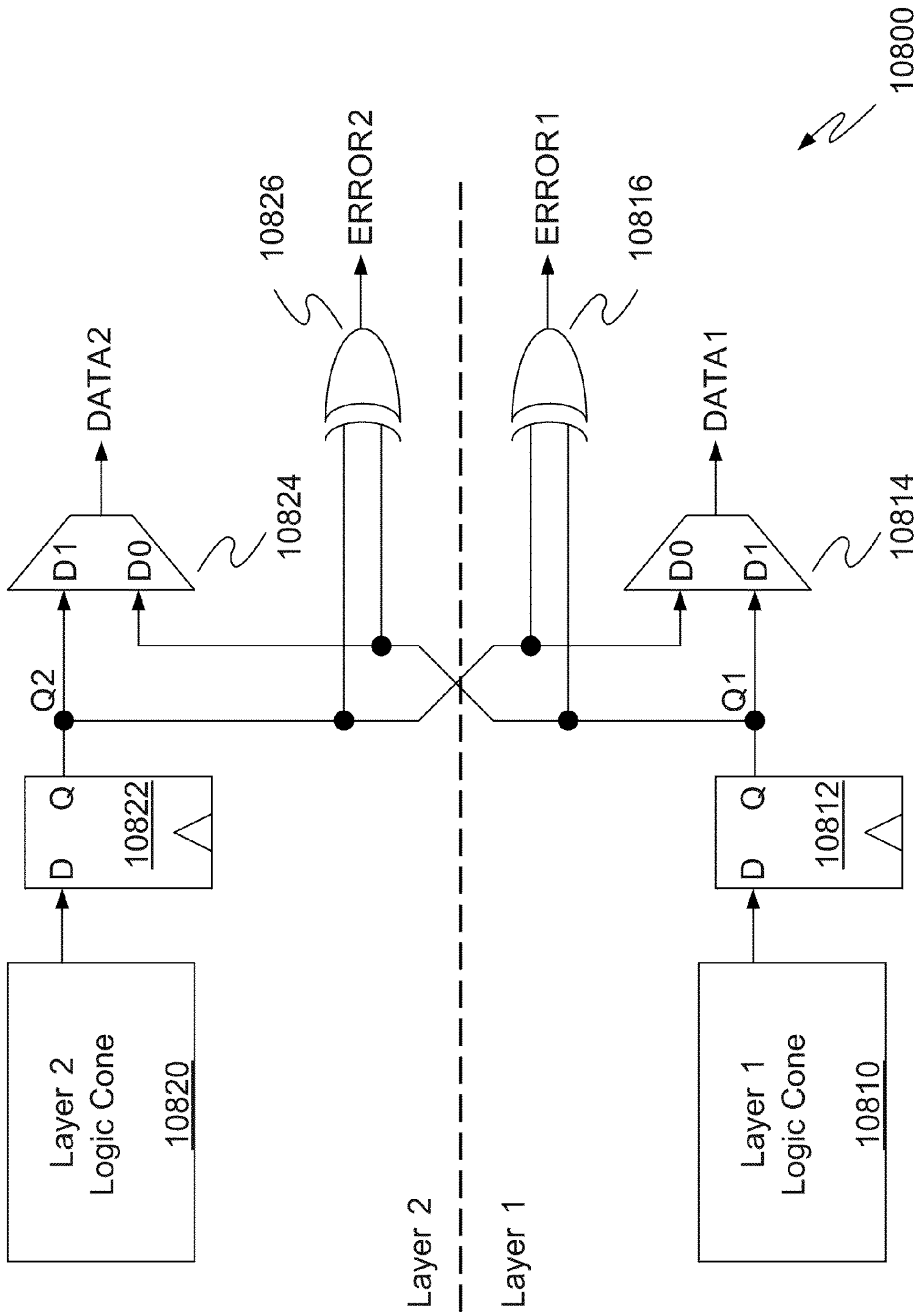

FIG. 108 illustrates a sixth field repairable 3D IC according to the invention.

Figure 109A:
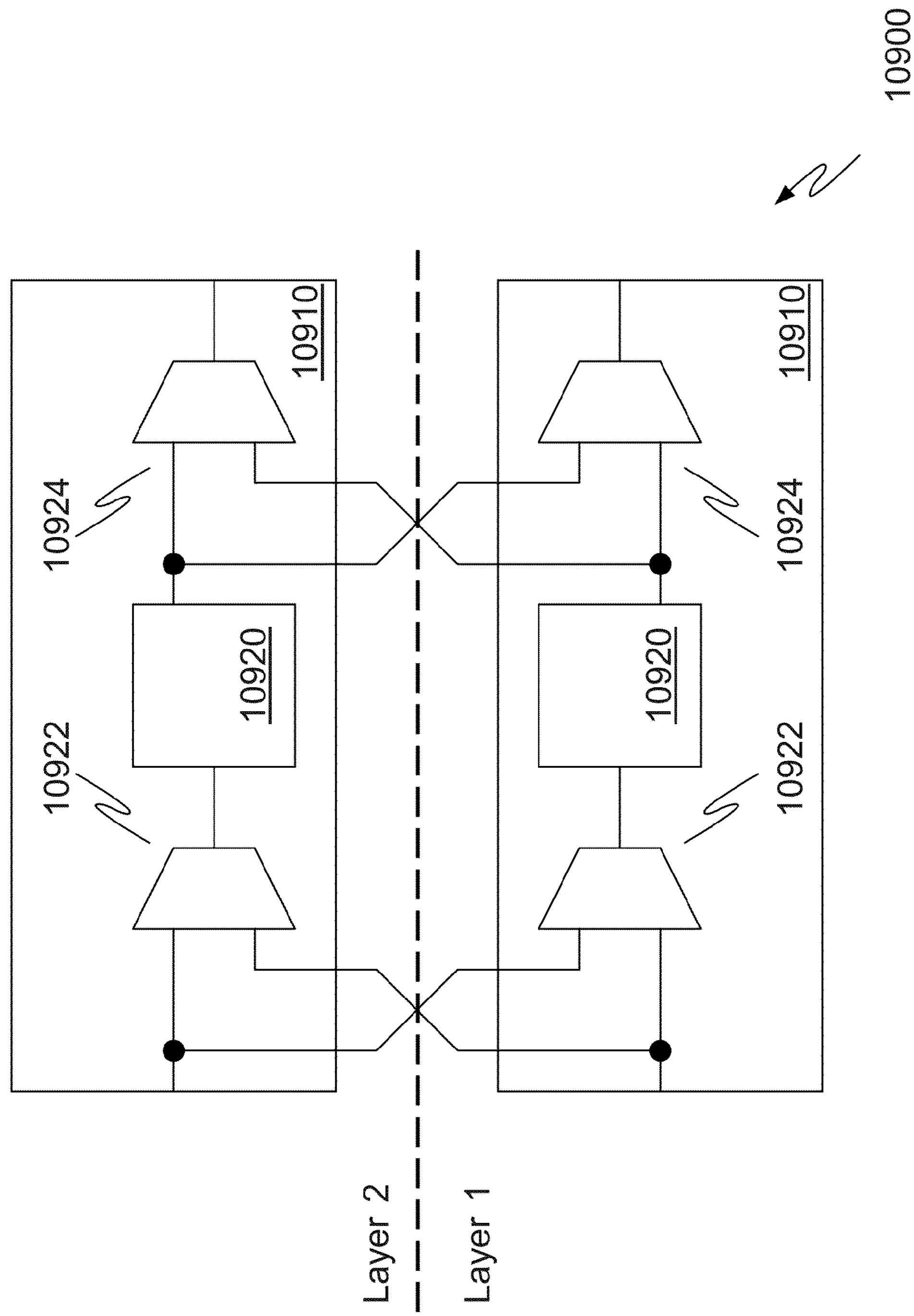

FIG. 109A illustrates a seventh field repairable 3D IC according to the invention.

Figure 109B:
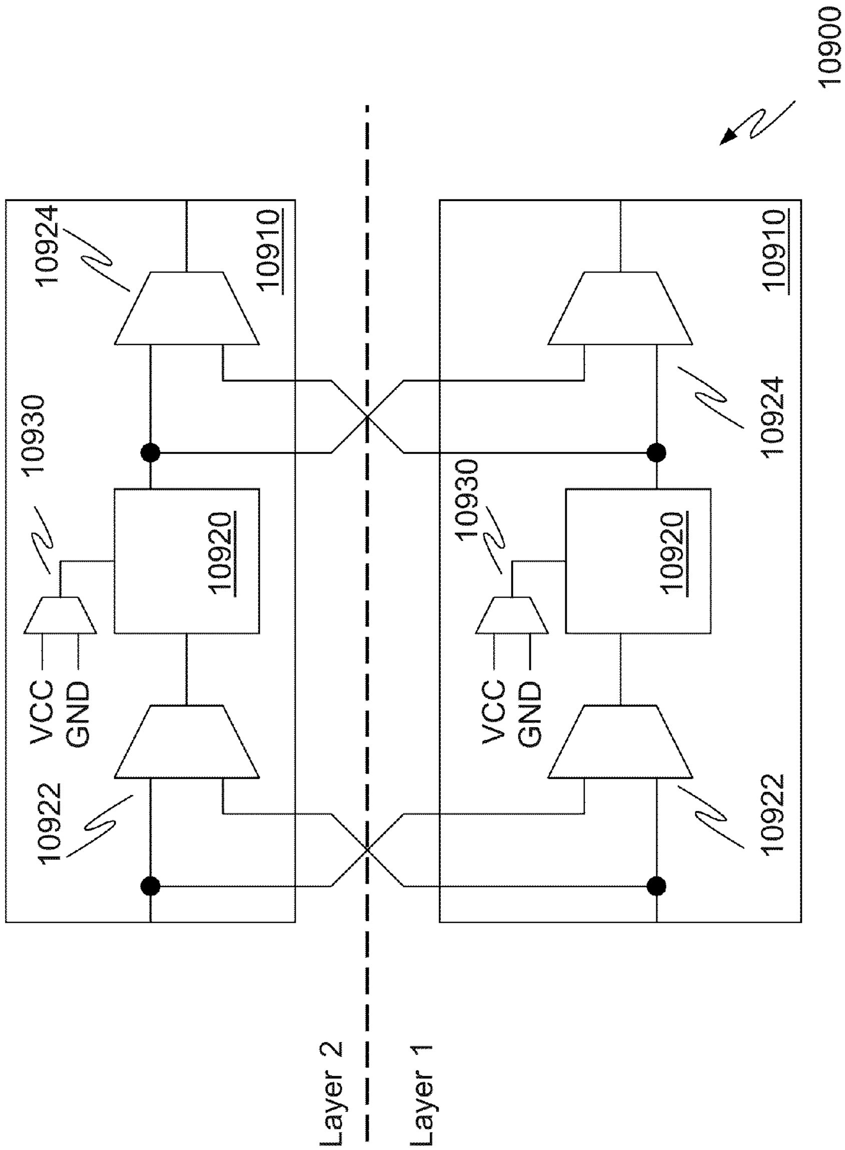

FIG. 109B illustrates additional aspects of the field repairable 3D IC of FIG. 109A.

Figure 110:
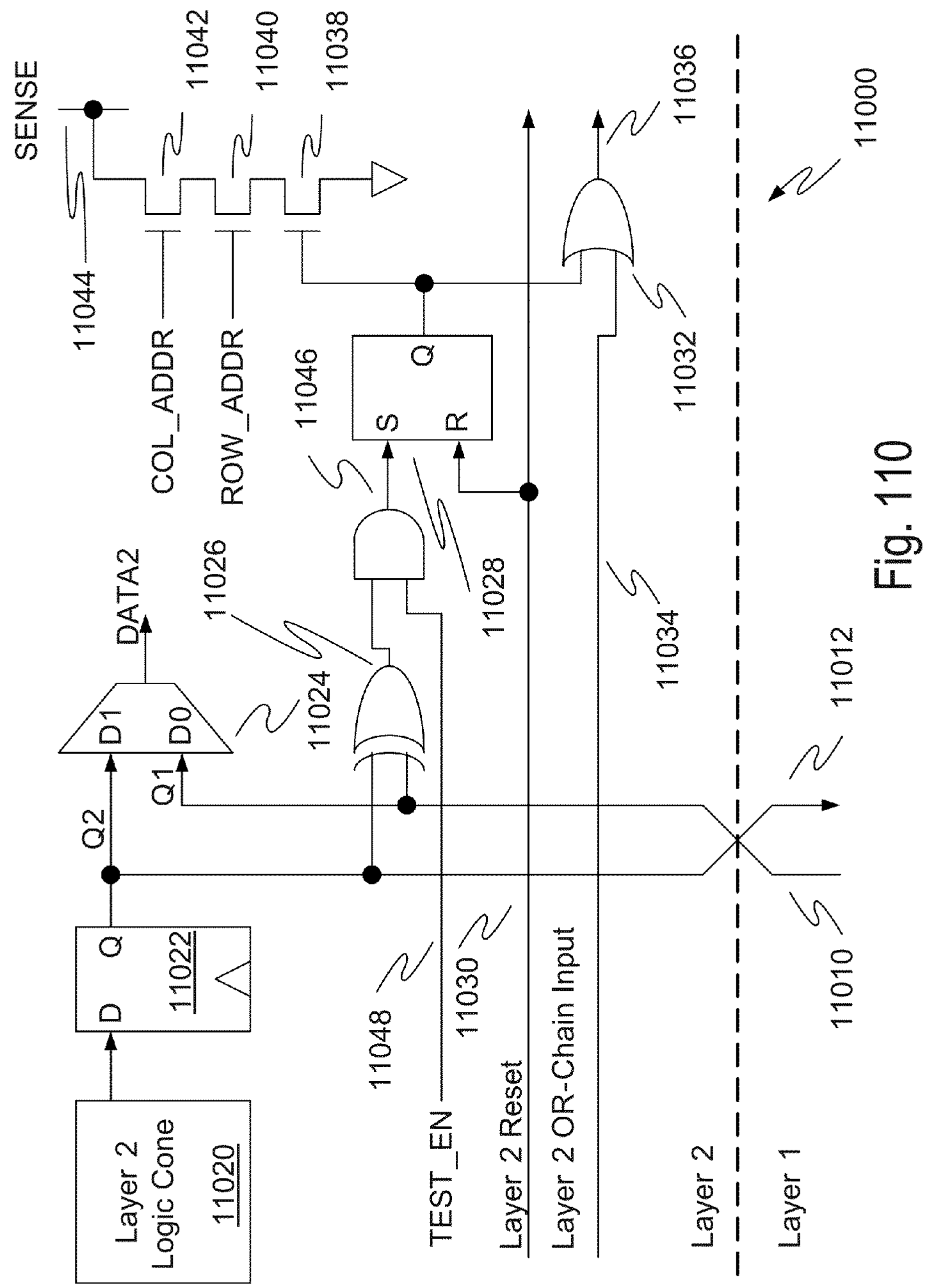

FIG. 110 illustrates an eighth field repairable 3D IC according to the invention.

Figure 111:
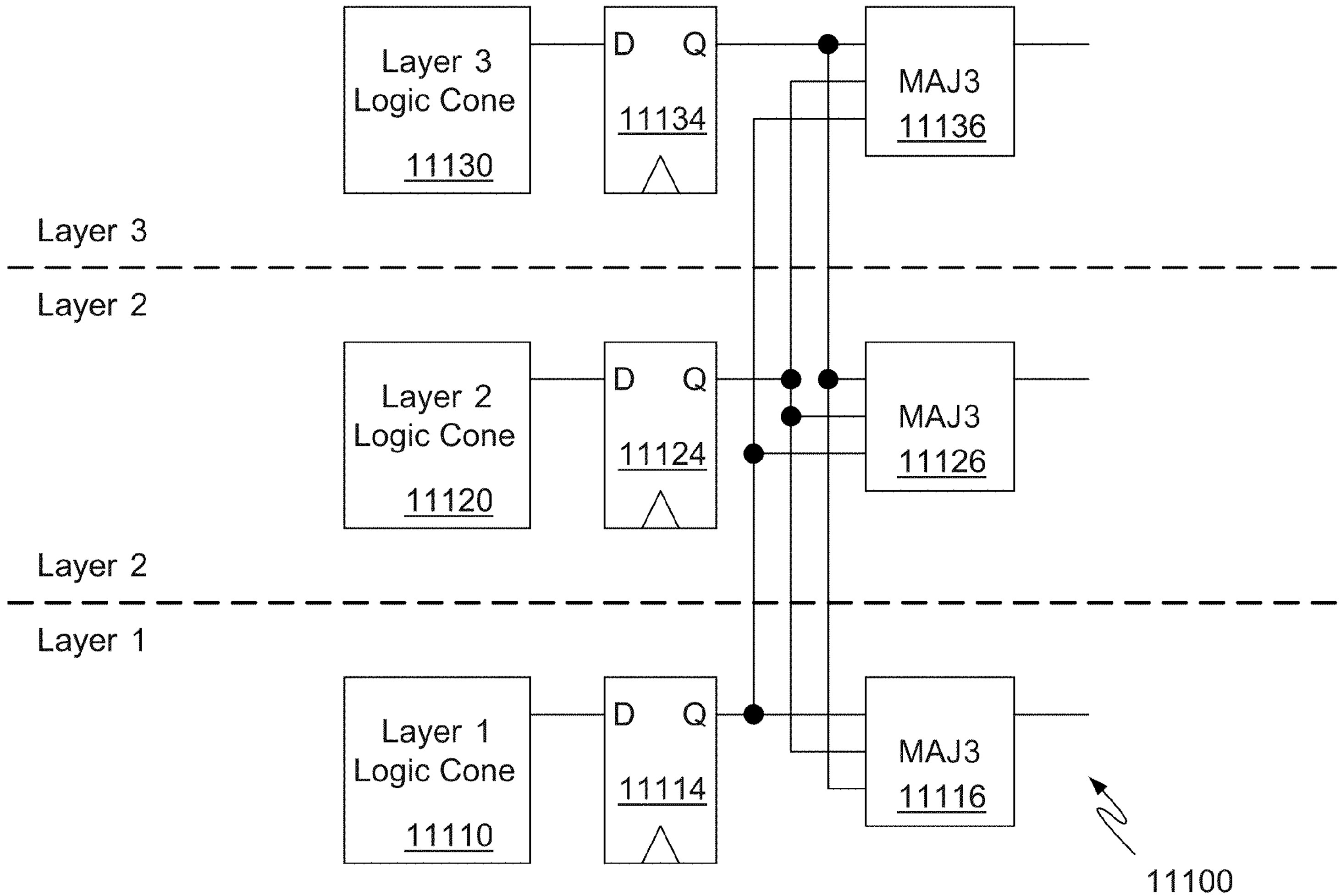

FIG. 111 illustrates a second Triple Modular Redundancy 3D IC according to the invention.

Figure 112:
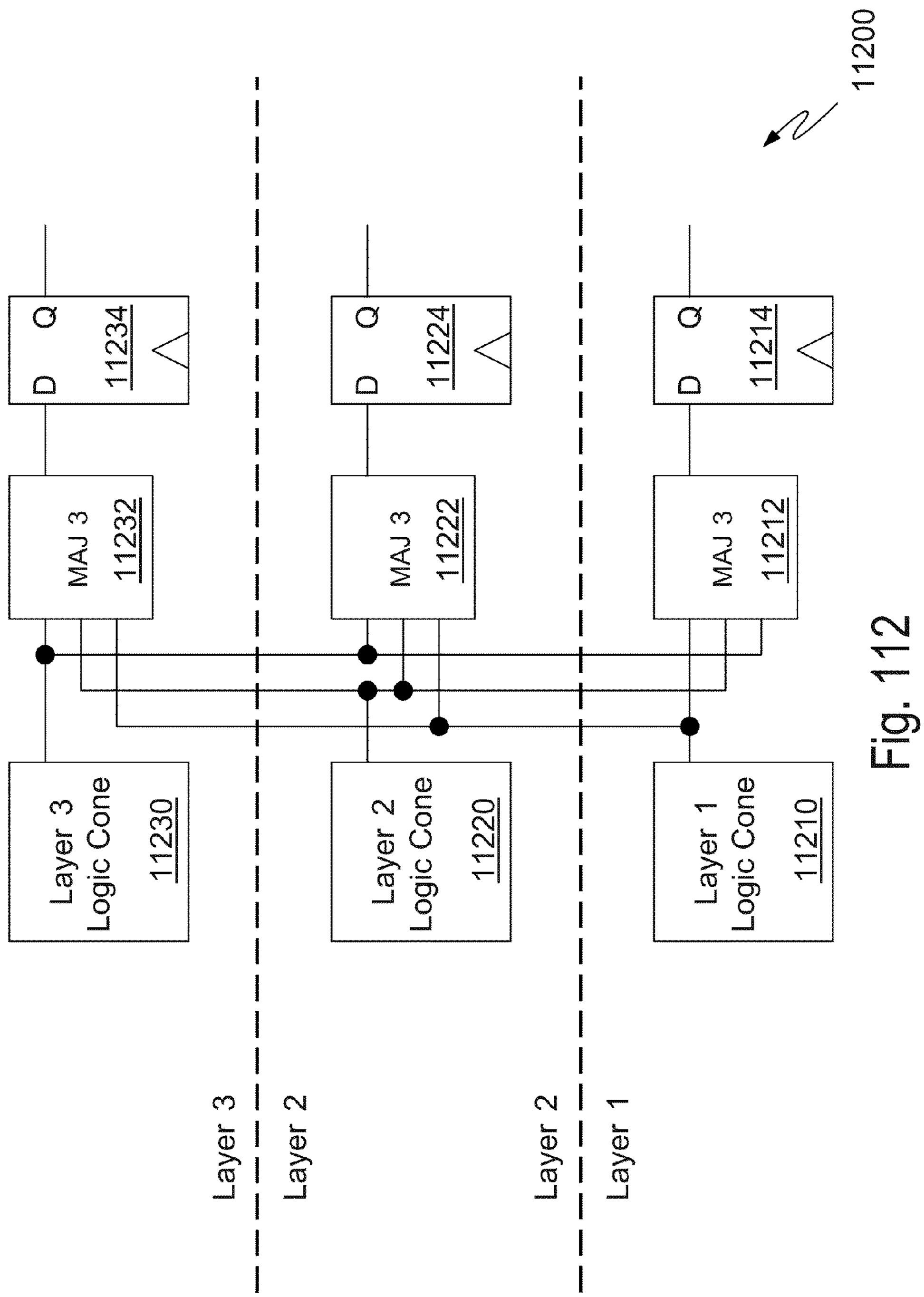

FIG. 112 illustrates a third Triple Modular Redundancy 3D IC according to the invention.

Figure 113:
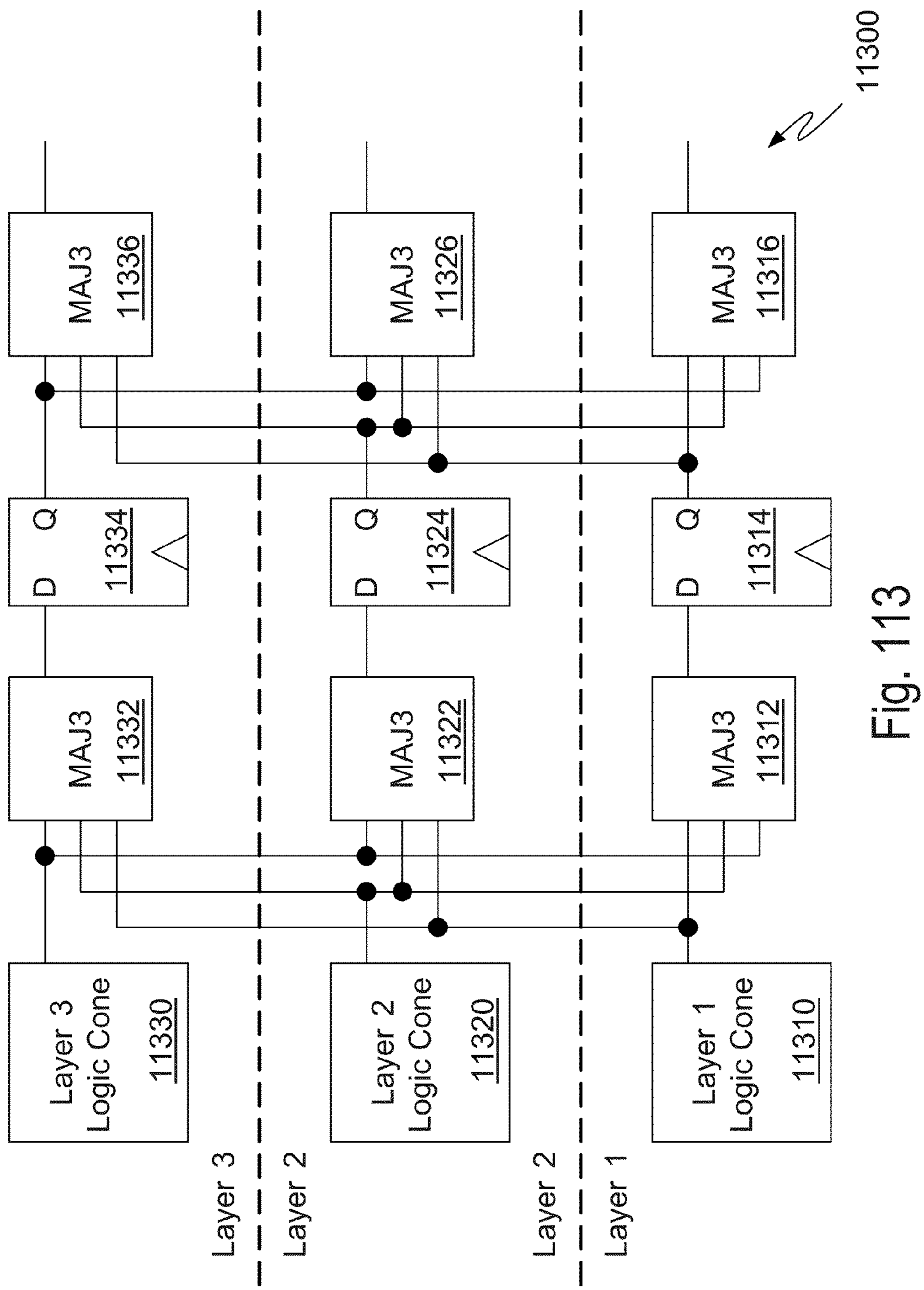

FIG. 113 illustrates a fourth Triple Modular Redundancy 3D IC according to the invention.

Figure 114B:
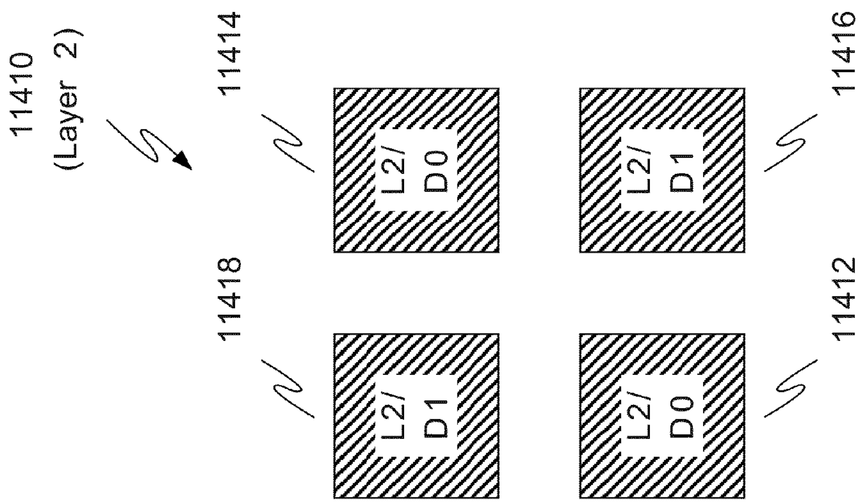
Figure 114A:
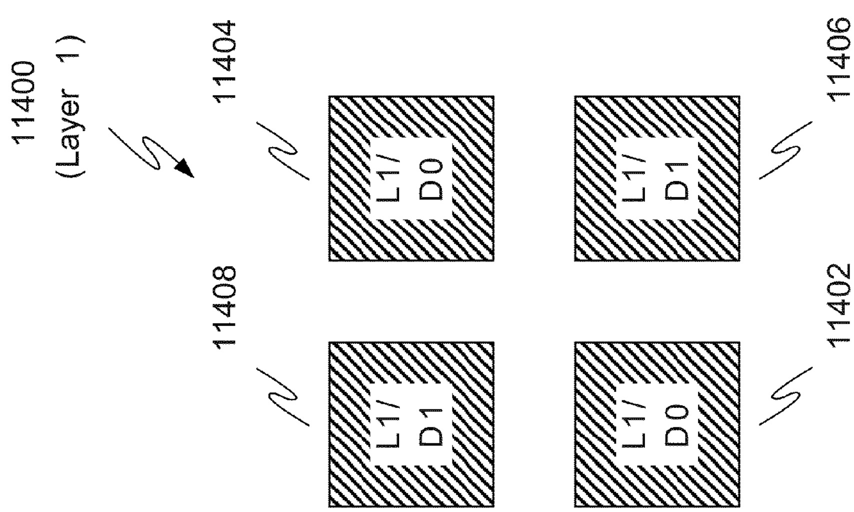

FIG. 114A illustrates a first via metal overlap pattern according to the invention.

FIG. 114B illustrates a second via metal overlap pattern according to the invention.

Figure 114C:
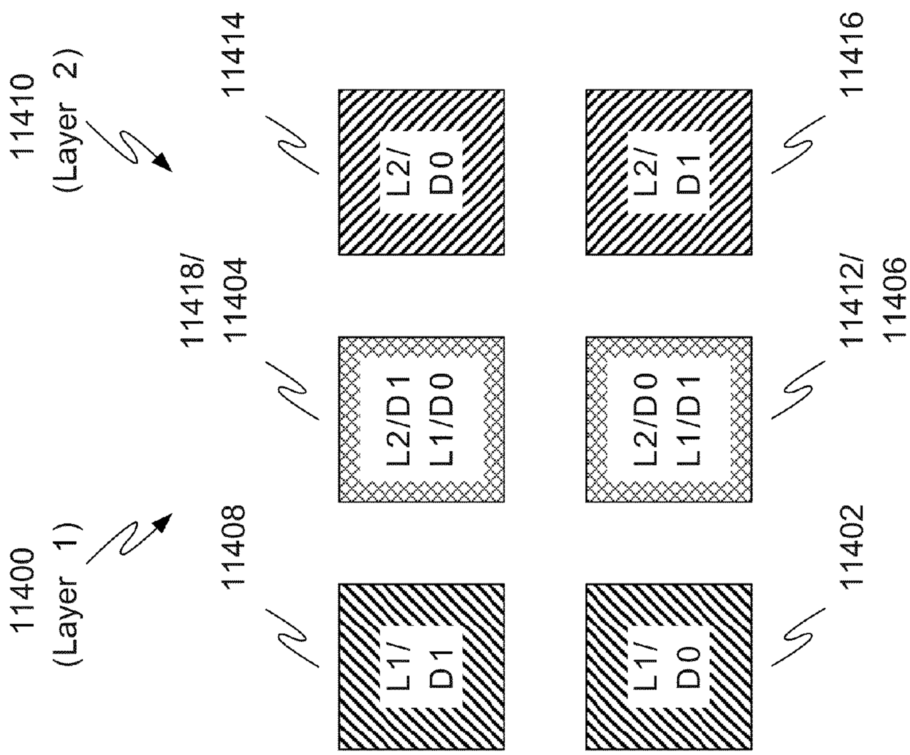

FIG. 114C illustrates the alignment of the via metal overlap patterns of FIGS. 114A and 114B in a 3D IC according to the invention.

Figure 114D:
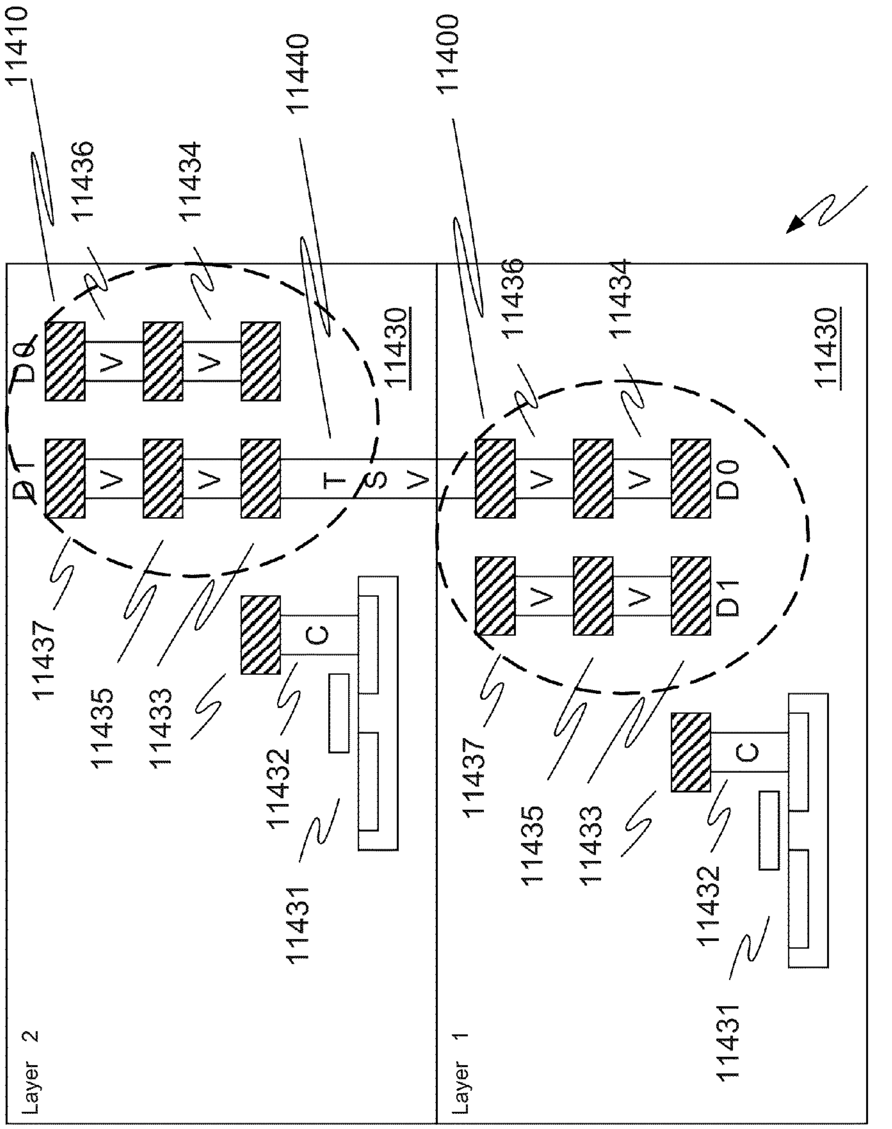

FIG. 114D illustrates a side view of the structure of FIG. 114C.

Figure 115A:
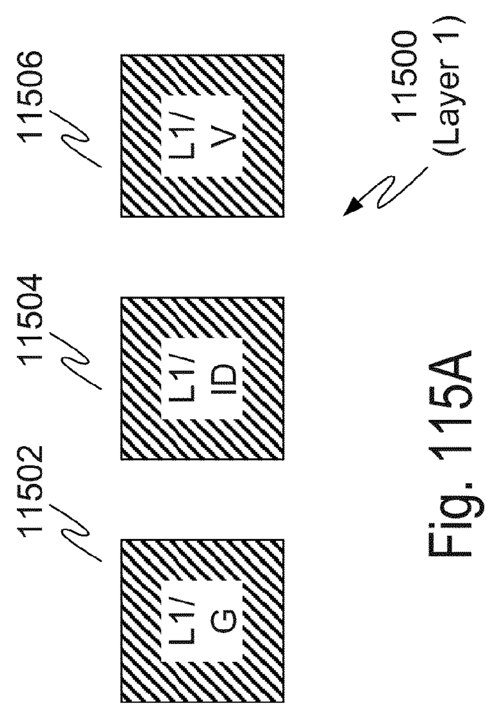

FIG. 115A illustrates a third via metal overlap pattern according to the invention.

Figure 115B:
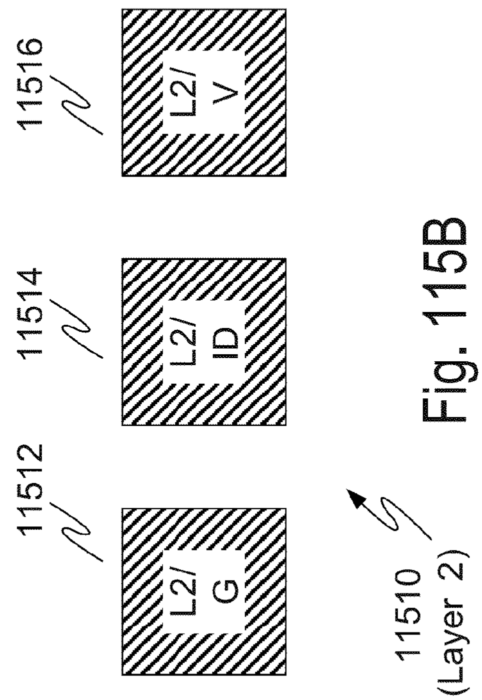

FIG. 115B illustrates a fourth via metal overlap pattern according to the invention.

Figure 115C:
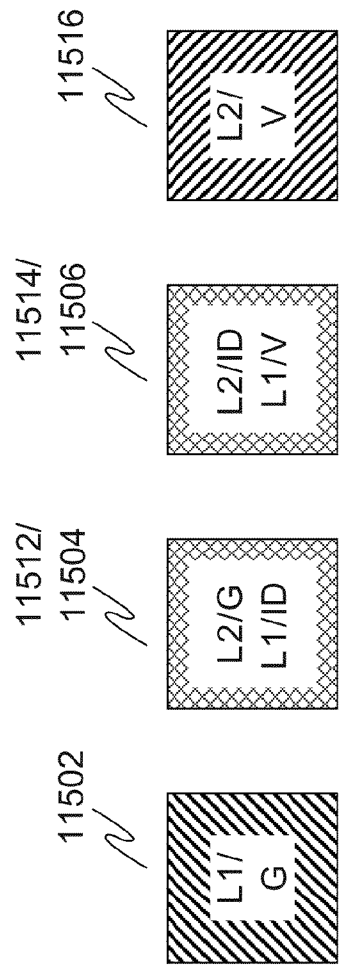

FIG. 115C illustrates the alignment of the via metal overlap patterns of FIGS. 115A and 115B in a 3DIC according to the invention.

Figure 116A:
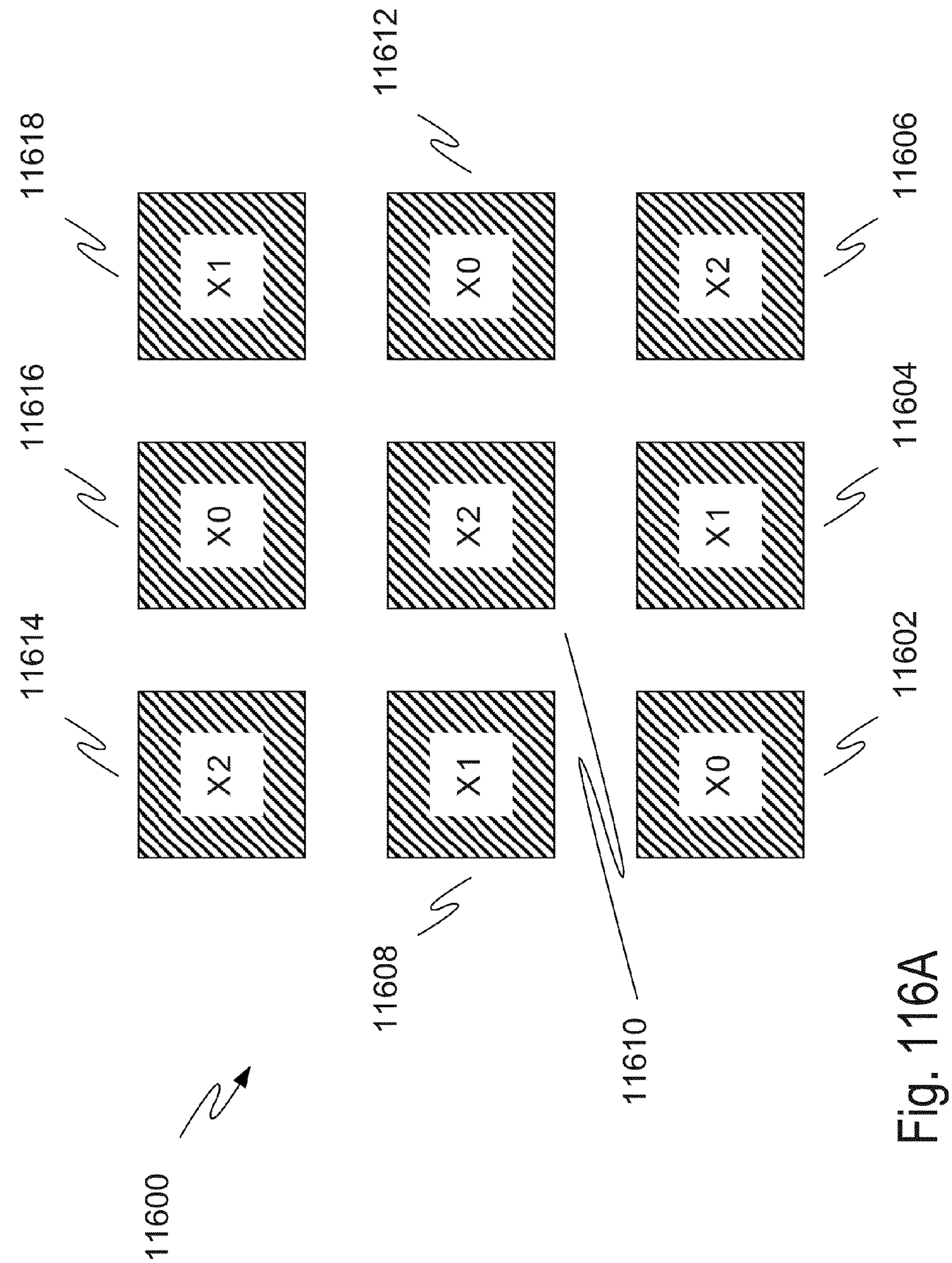

FIG. 116A illustrates a fifth via metal overlap pattern according to the invention.

Figure 116B:
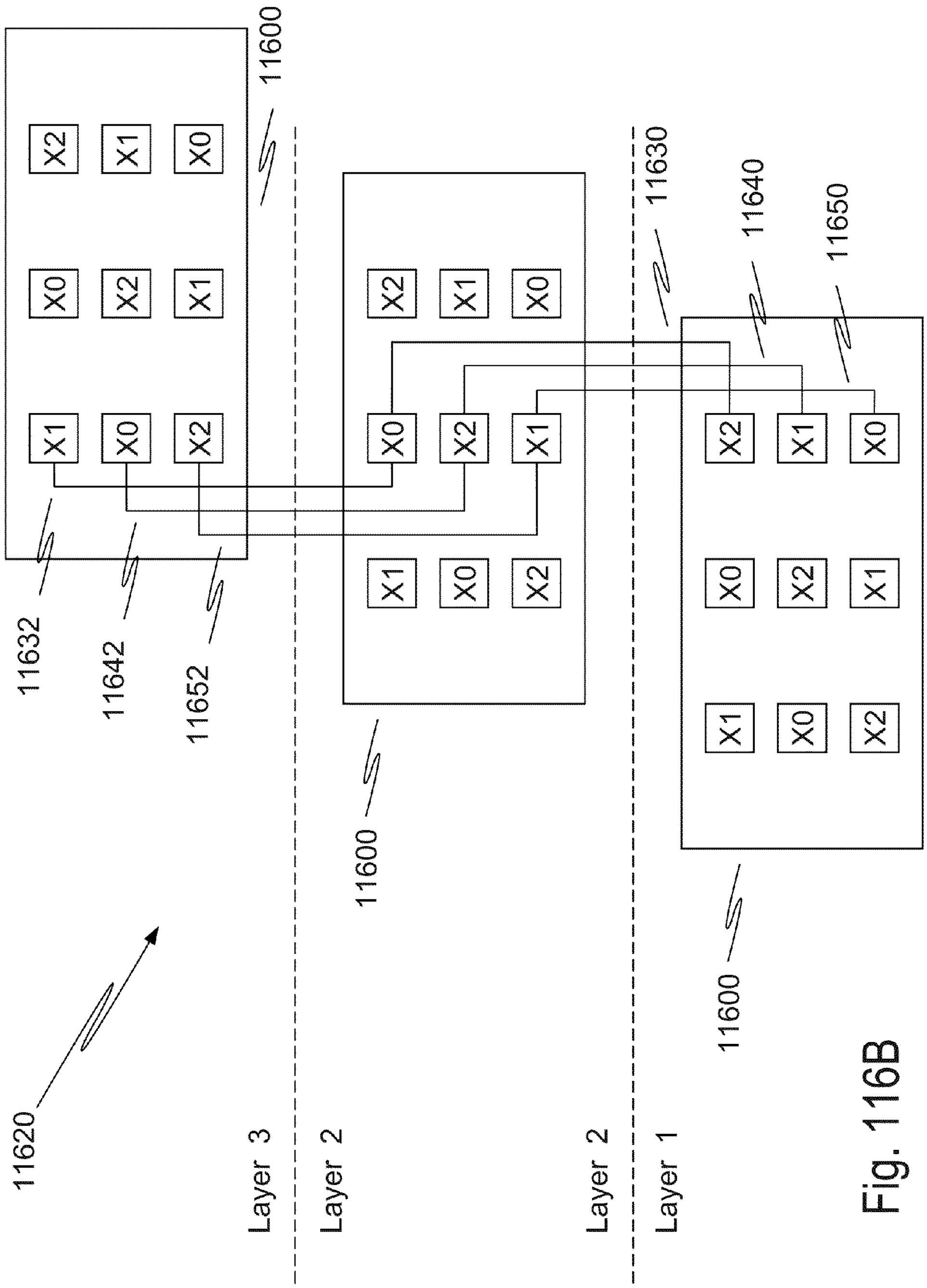

FIG. 116B illustrates the alignment of three instances of the via metal overlap patterns of FIG. 116A in a 3DIC according to the invention.

Figure 117B:
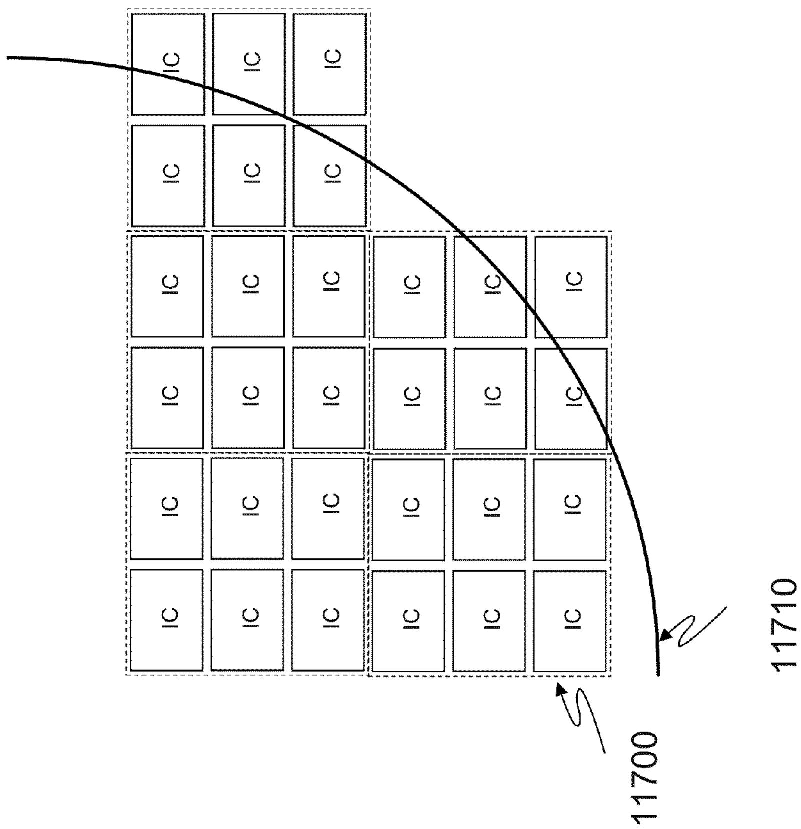
Figure 117A:
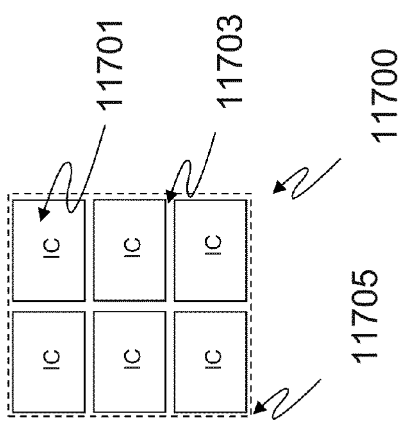

FIG. 117A illustrates a prior art of reticle design.

FIG. 117B illustrates a prior art of how such reticle image from FIG. 117A can be used to pattern the surface of a wafer.

Figure 118A:
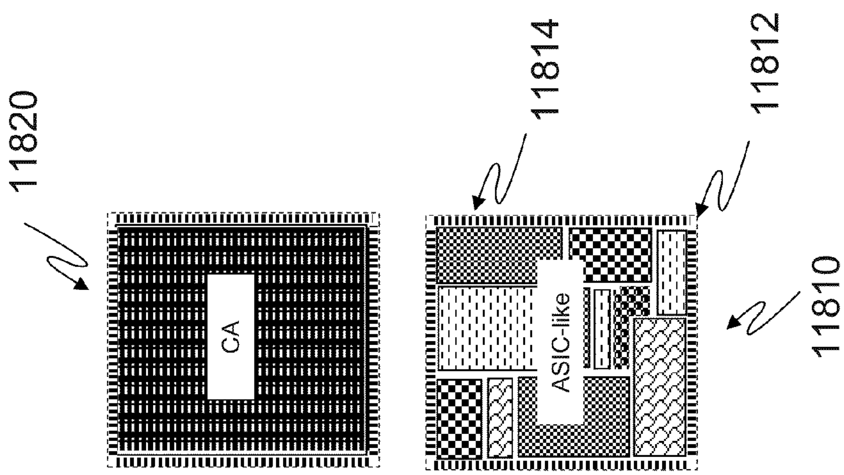

FIG. 118A illustrates a reticle design for a WSI design and process.

Figure 118B:
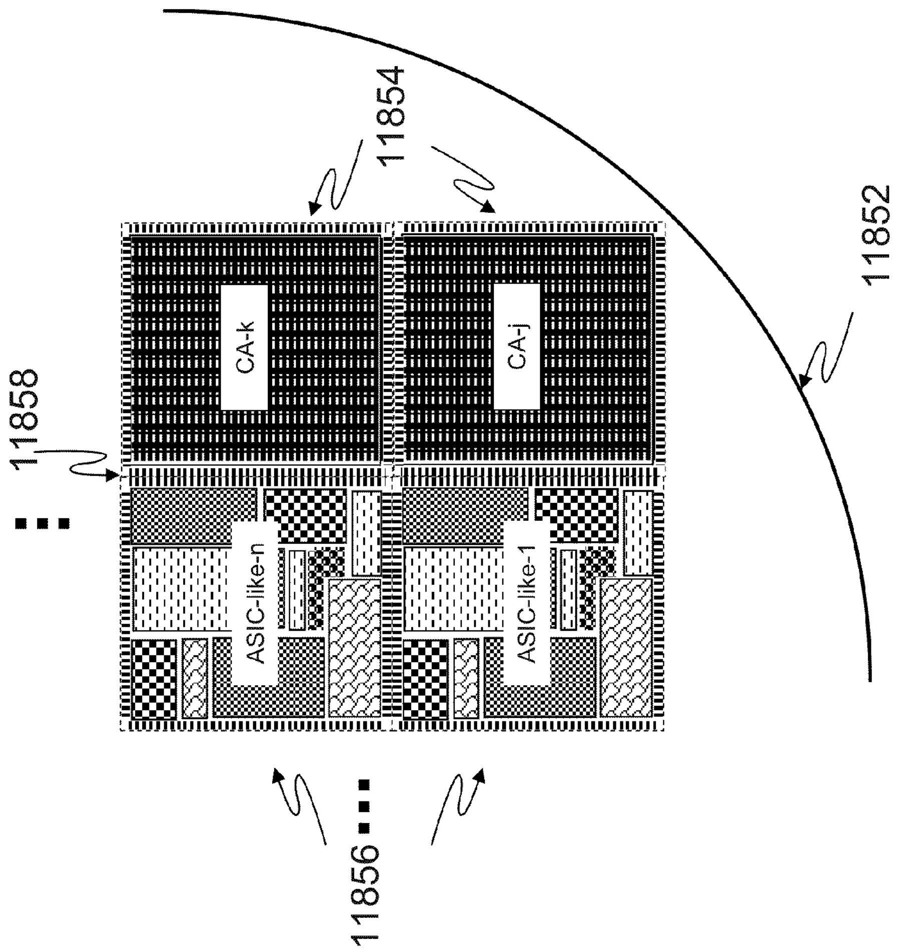

FIG. 118B illustrates how such reticle image from FIG. 118A can be used to pattern the surface of a wafer.

Figure 119:
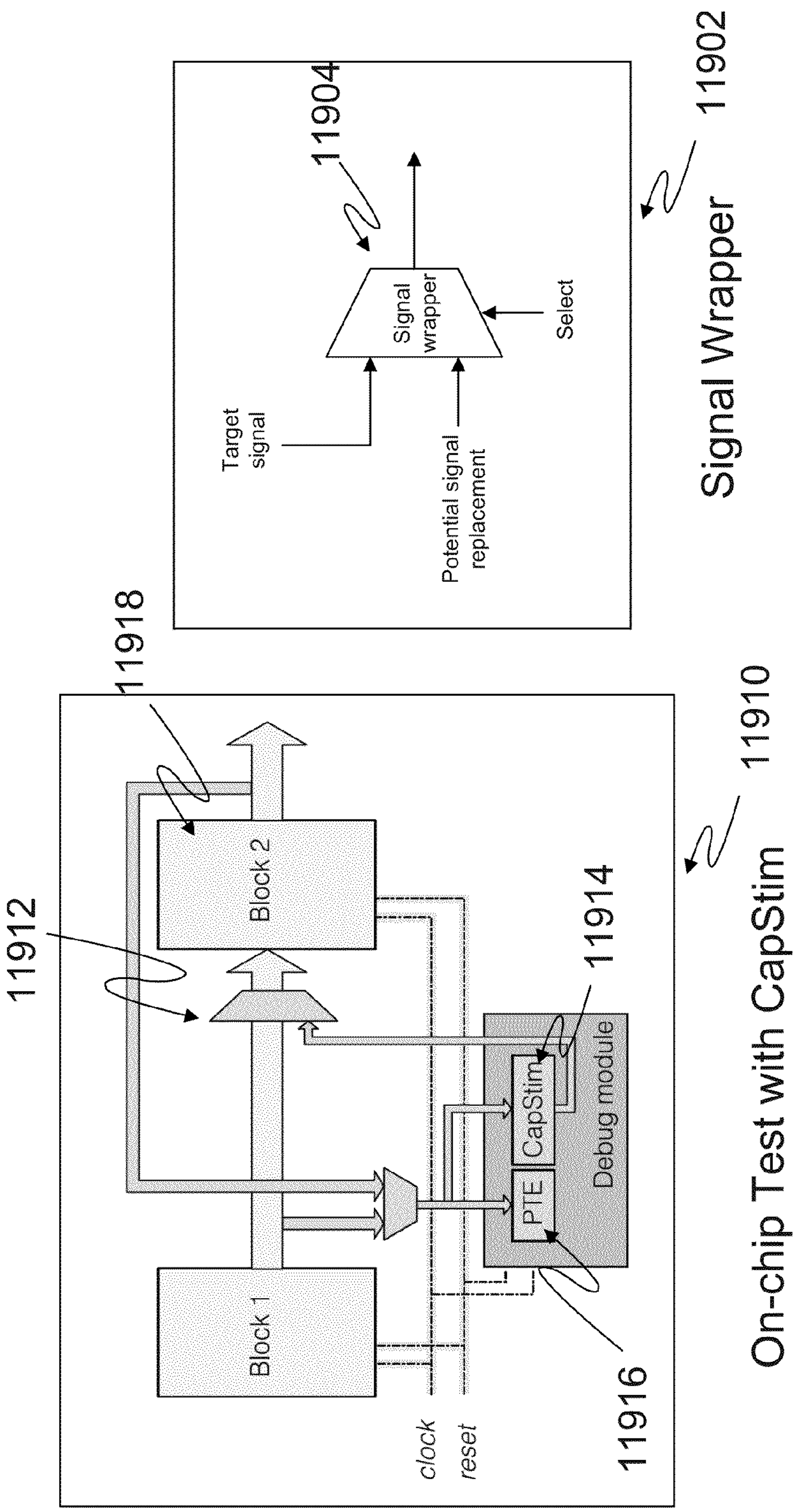

FIG. 119 illustrates prior art of Design for Debug Infrastructure.

Figure 120:
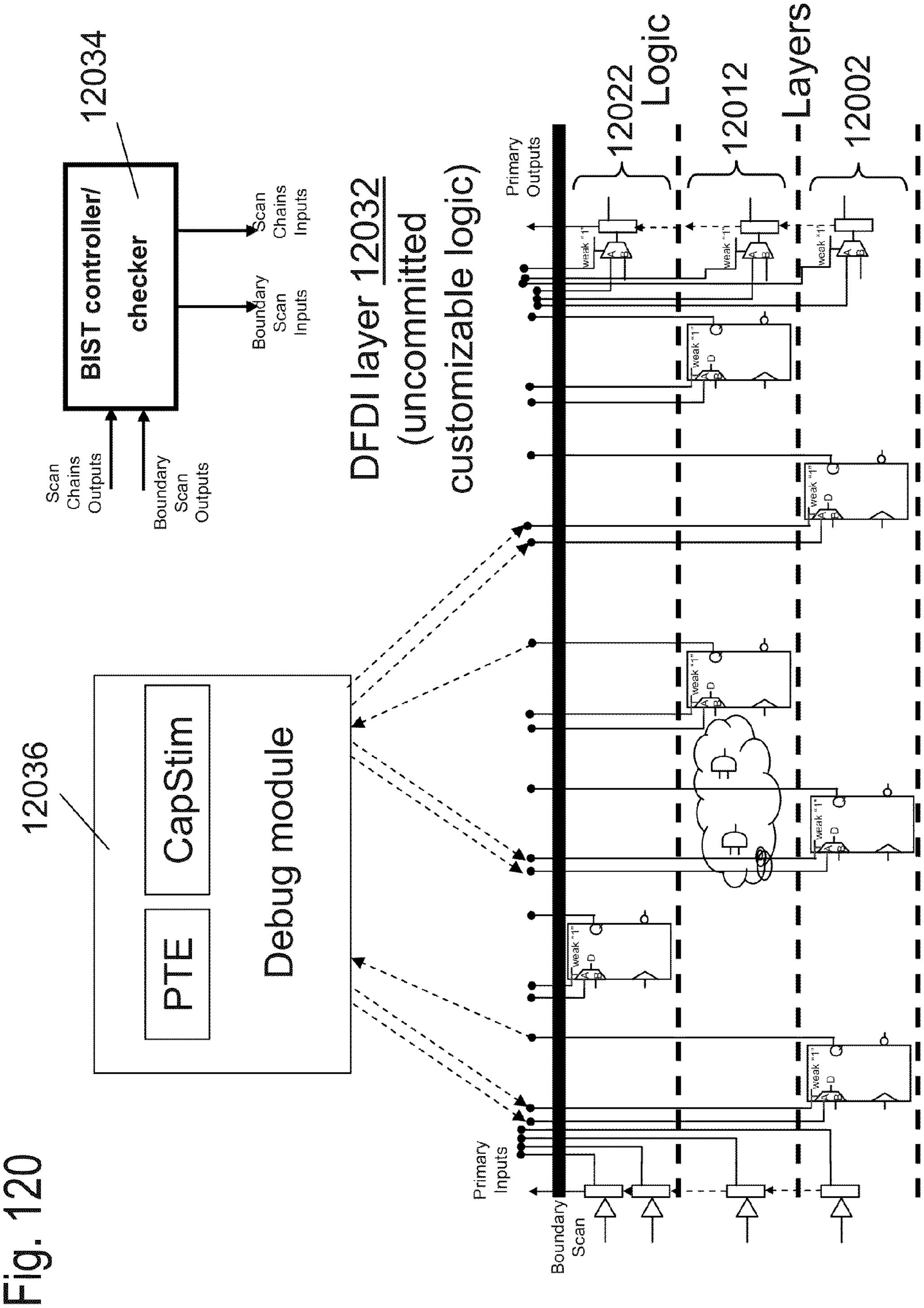

FIG. 120 illustrates implementation of Design for Debug Infrastructure using repair layer's uncommitted logic.

Figure 121:
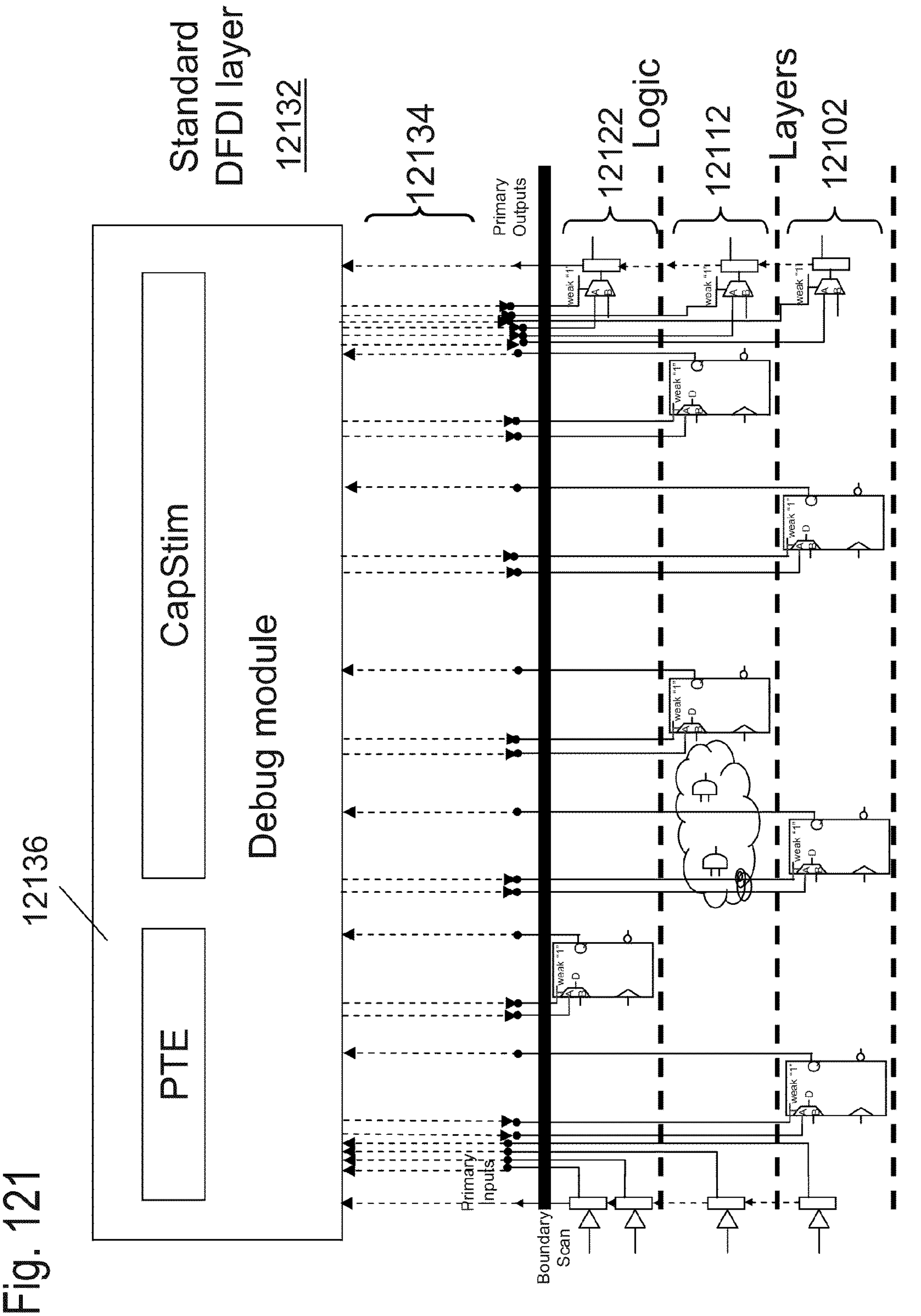

FIG. 121 illustrates customized dedicated Design for Debug Infrastructure layer with connections on a regular grid to connect to flip-flops on other layers with connections on a similar grid.

Figure 122:
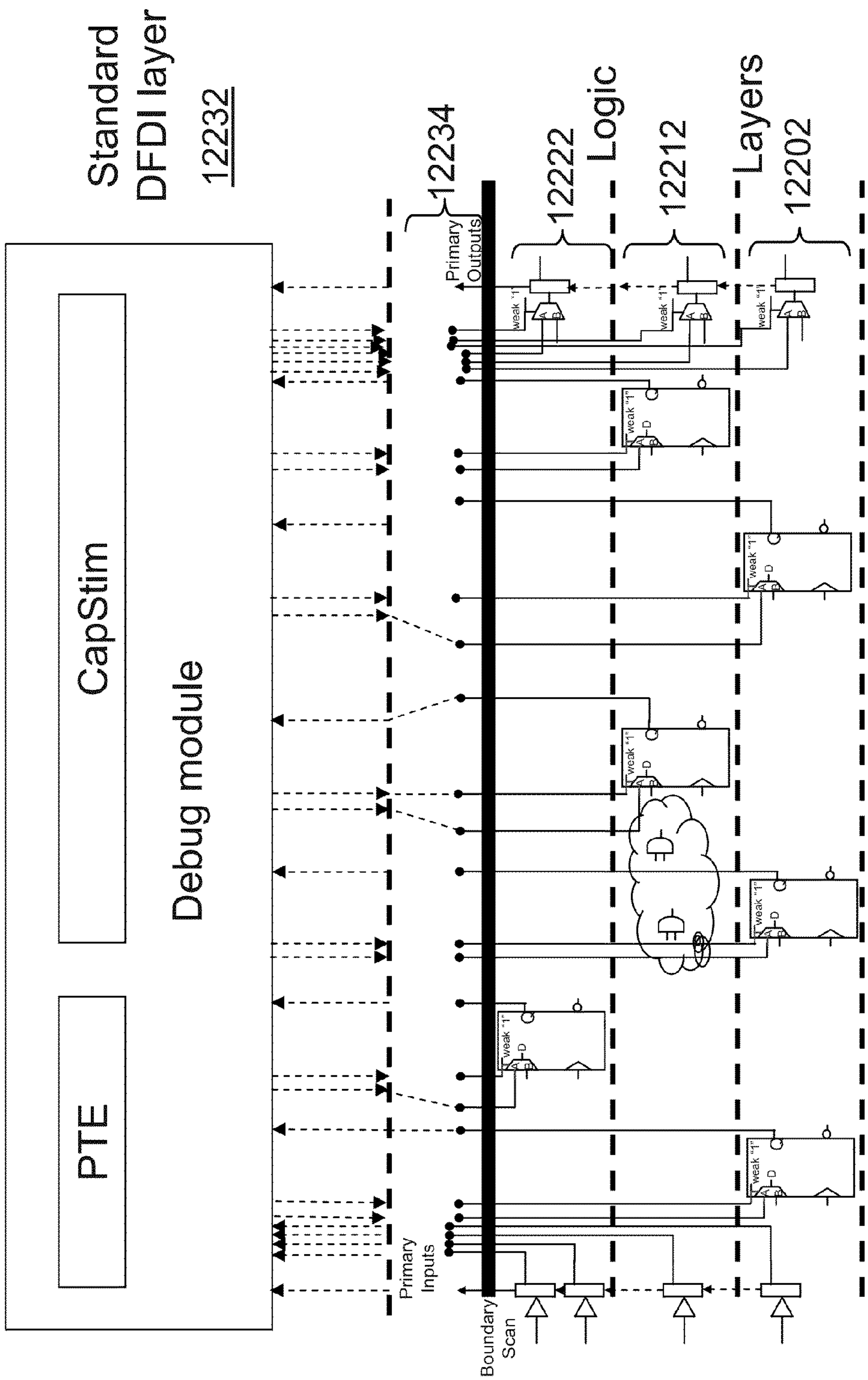

FIG. 122 illustrates customized dedicated Design for Debug Infrastructure layer with connections on a regular grid that uses interposer to connect to flip-flops on other layers with connections not on a similar grid.

Figure 123:
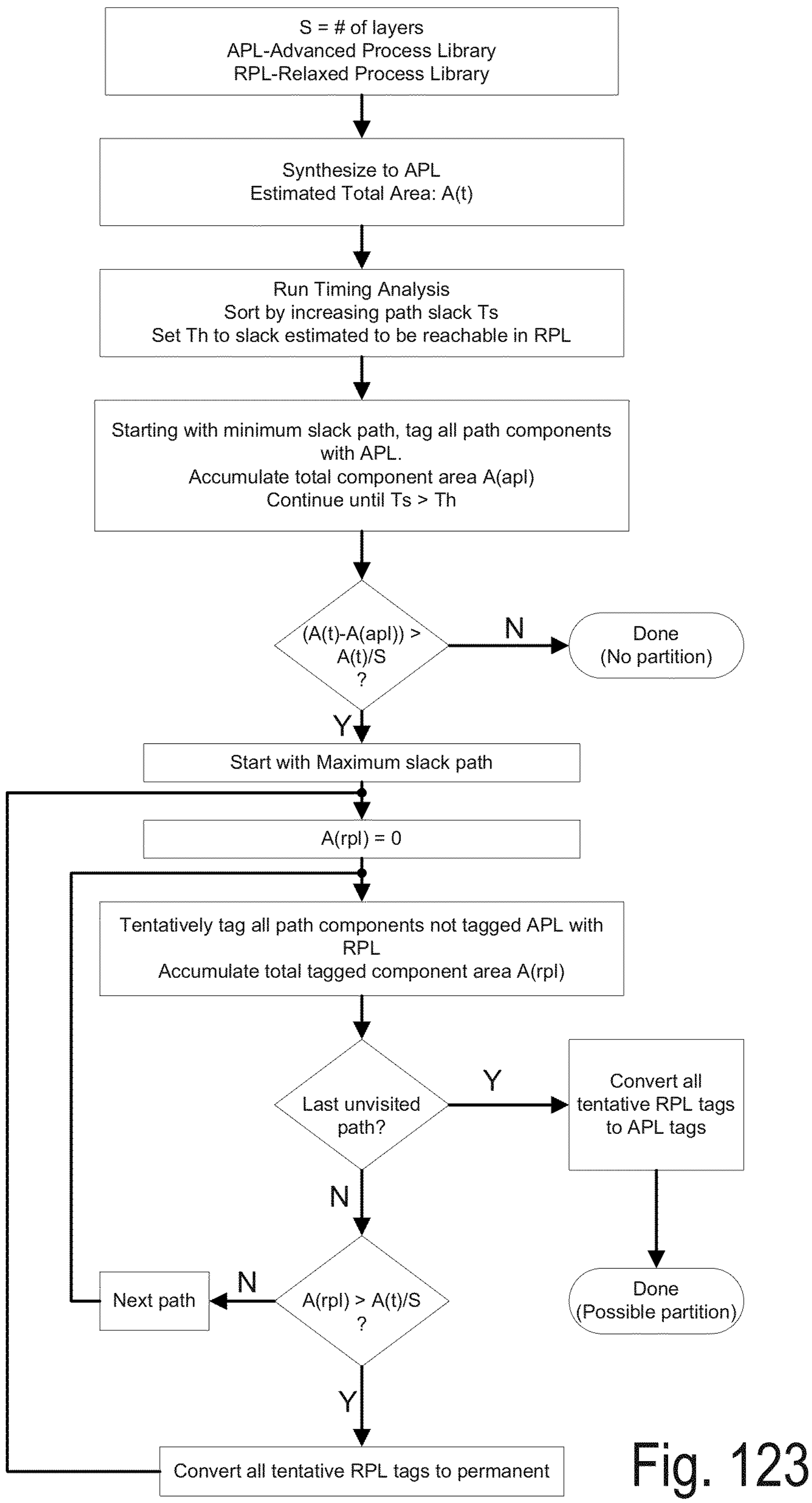

FIG. 123 illustrates a flowchart of partitioning a design into two disparate target technologies based on timing requirements.

Figure 124:
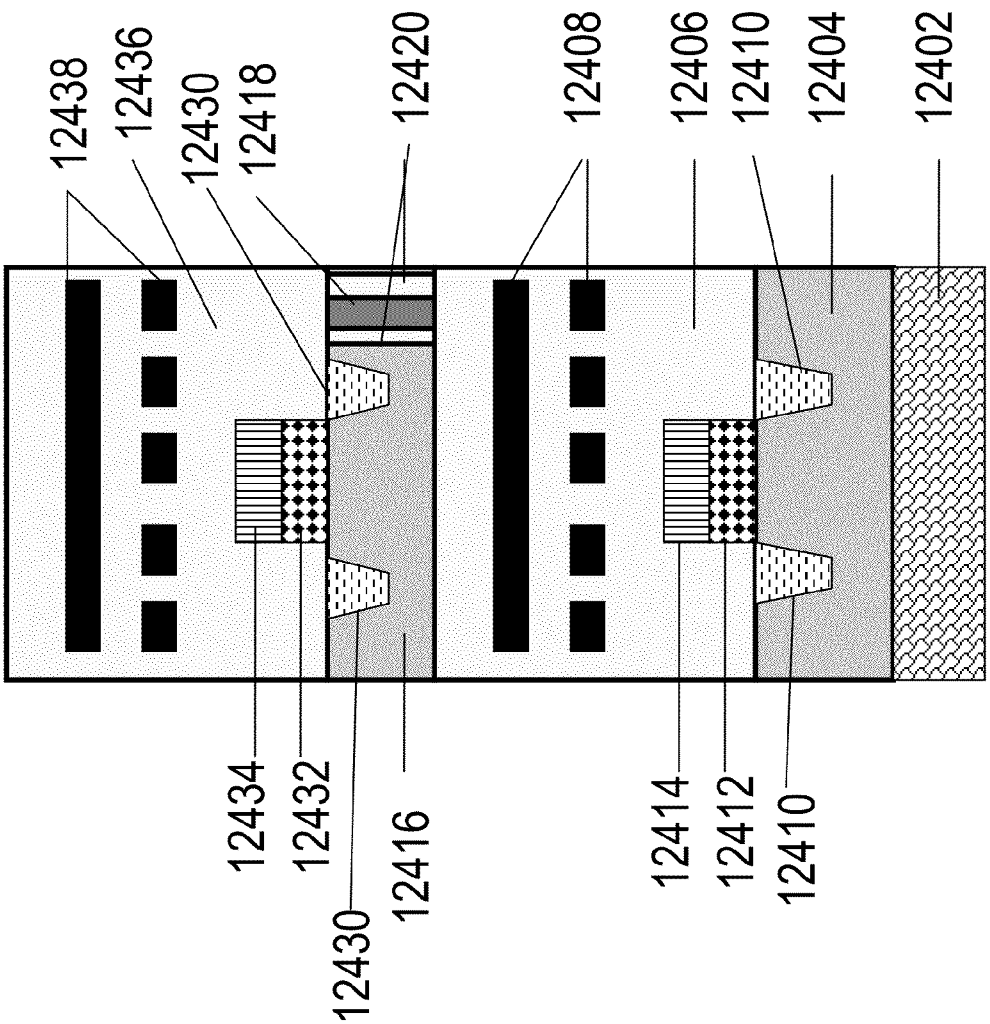
Figure 125:
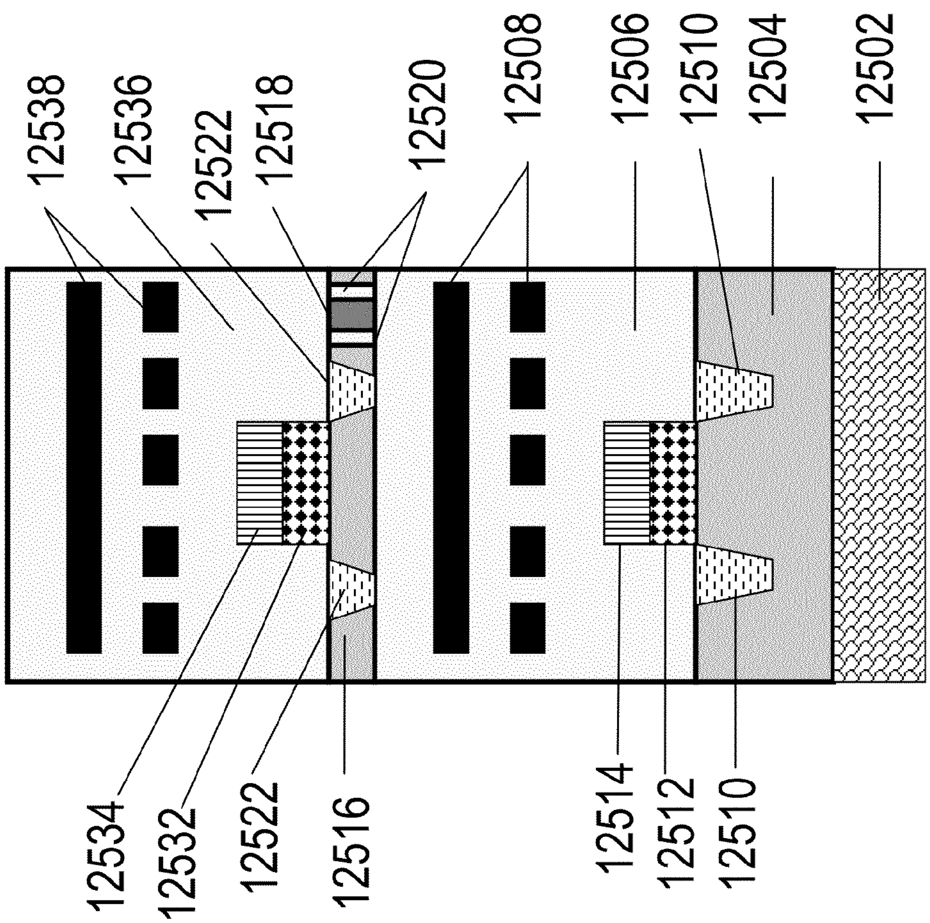
Figure 126:
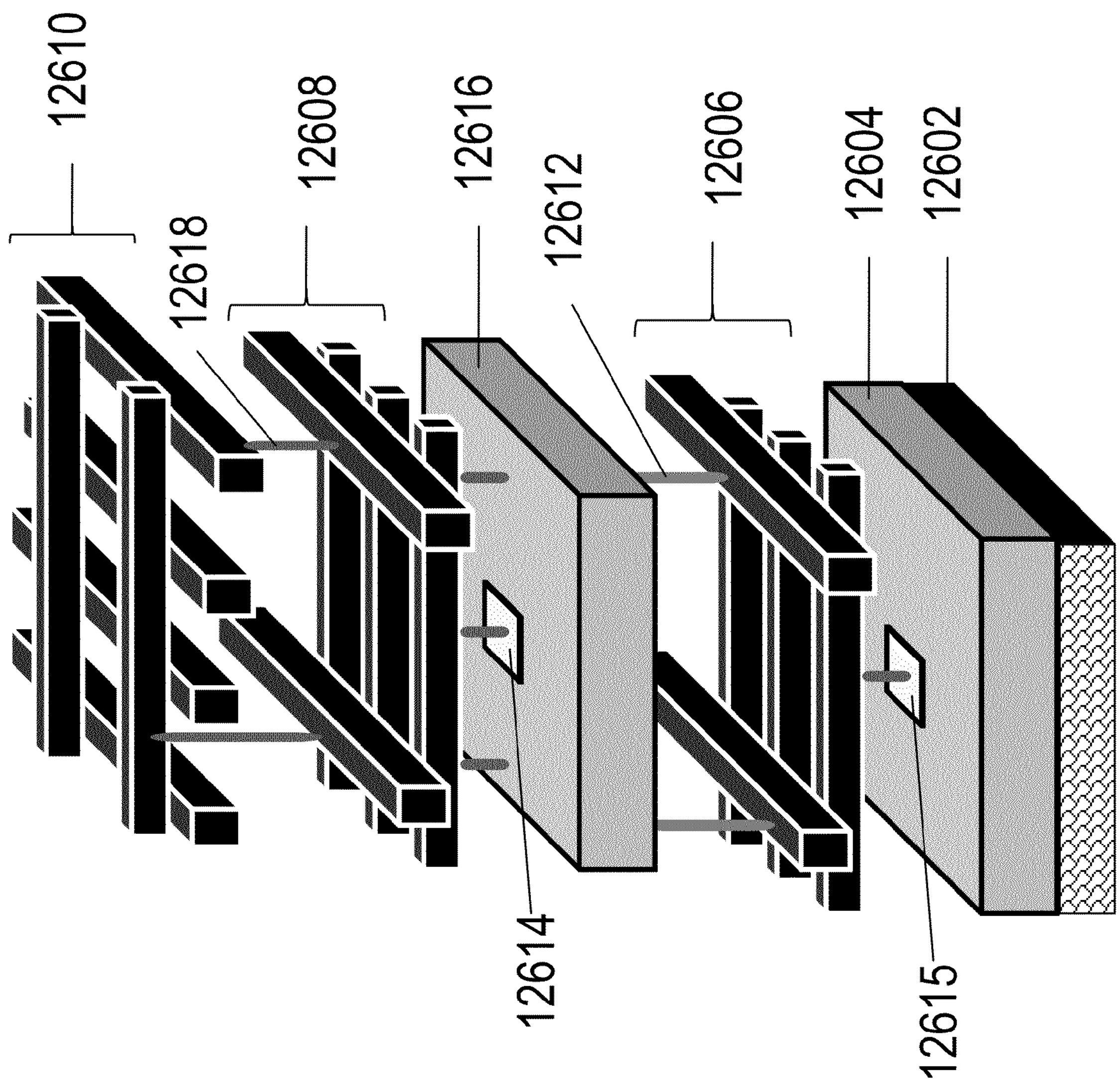
Figure 127:
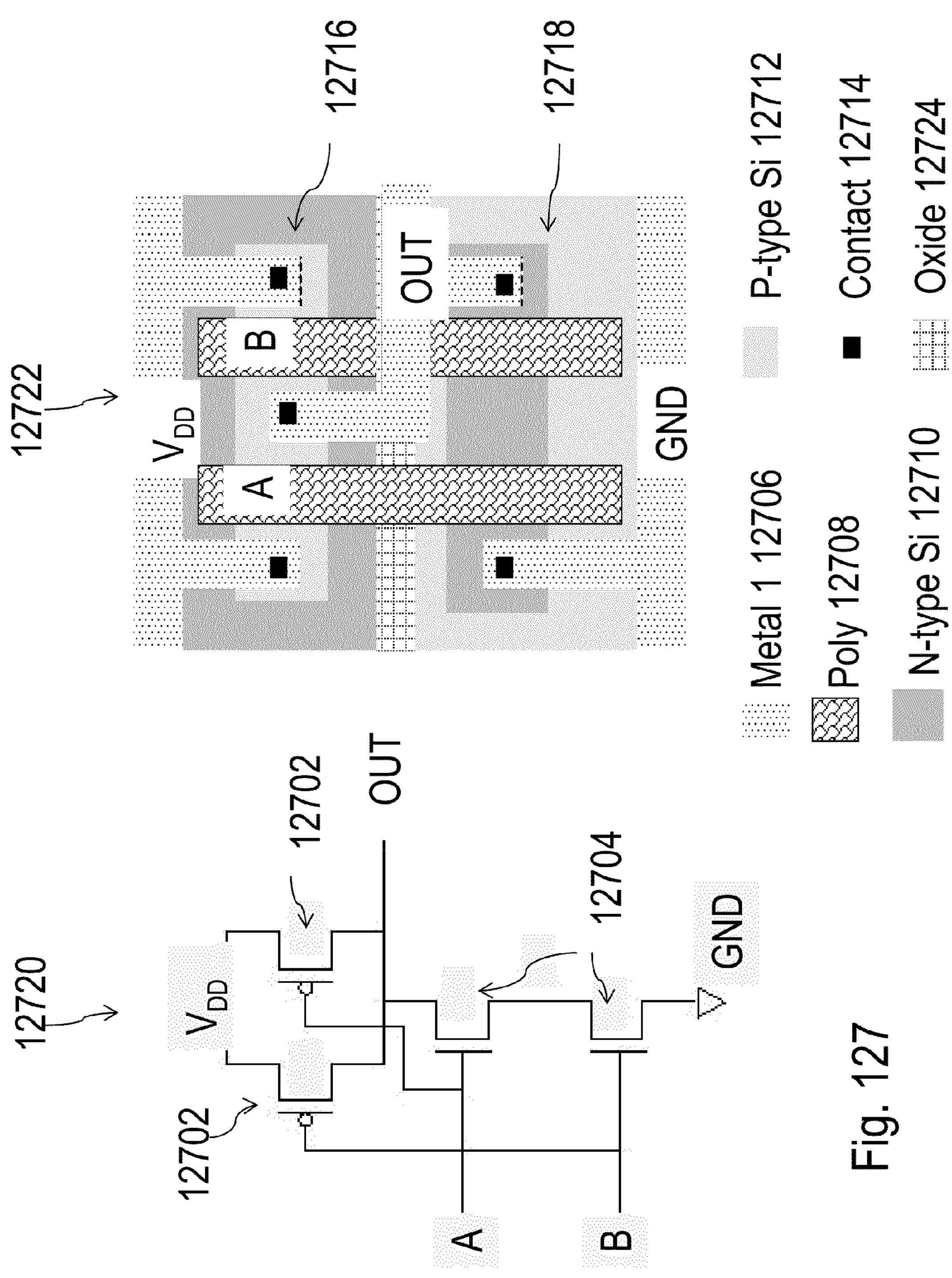
Figure 128:
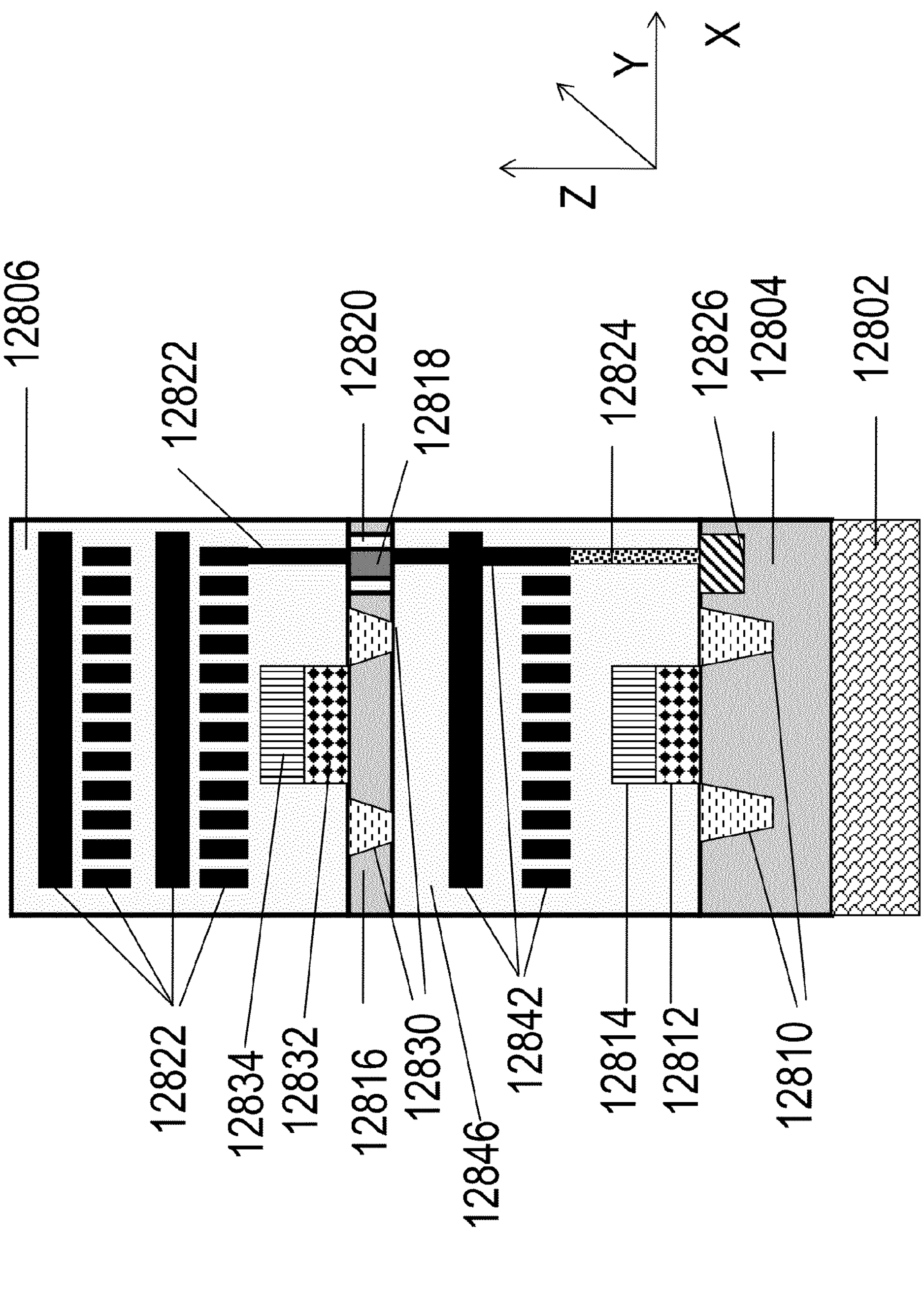
Figure 129:
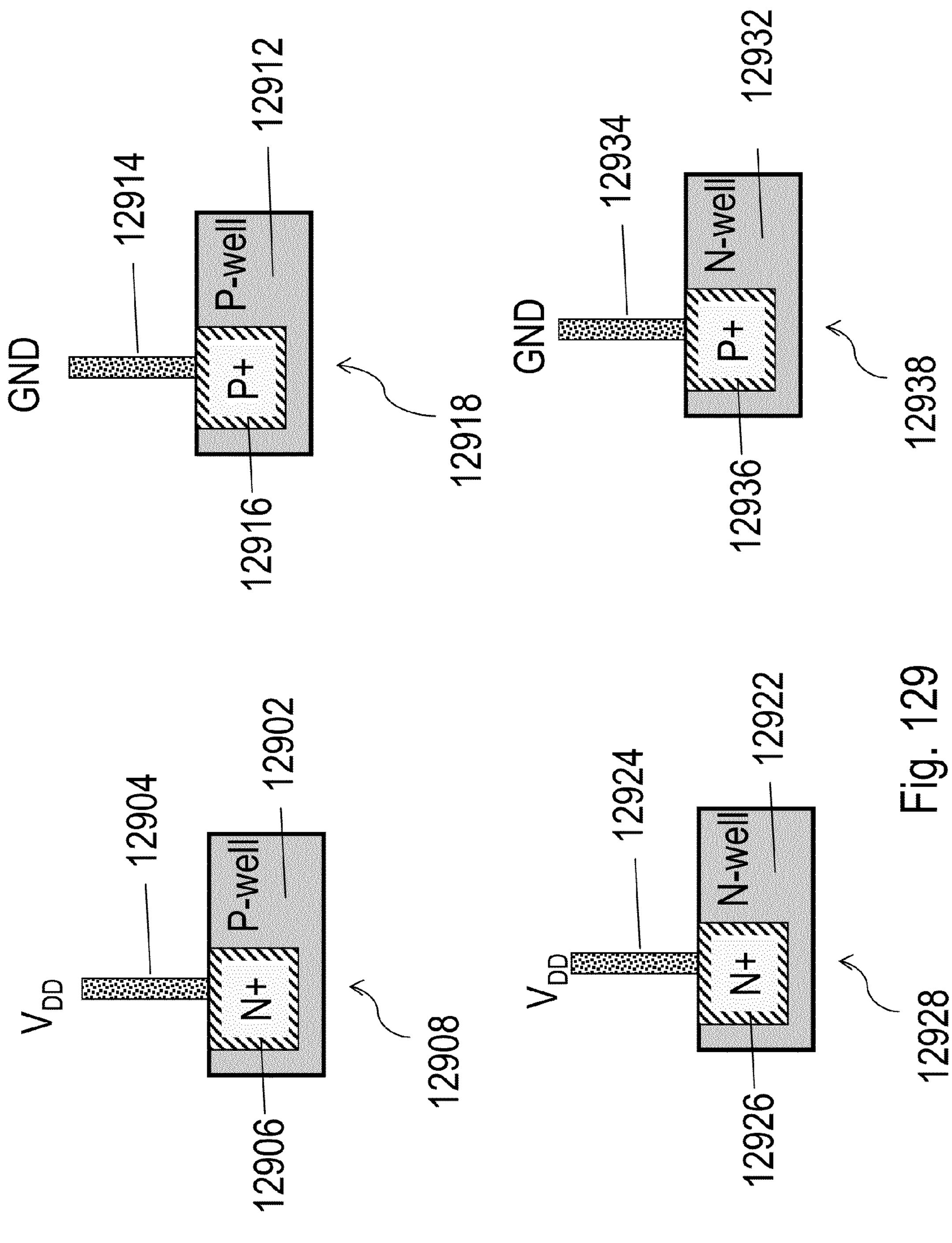
Figure 130:
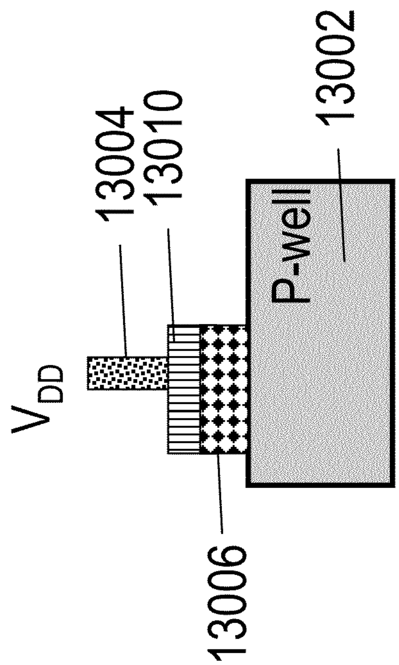
Figure 131:
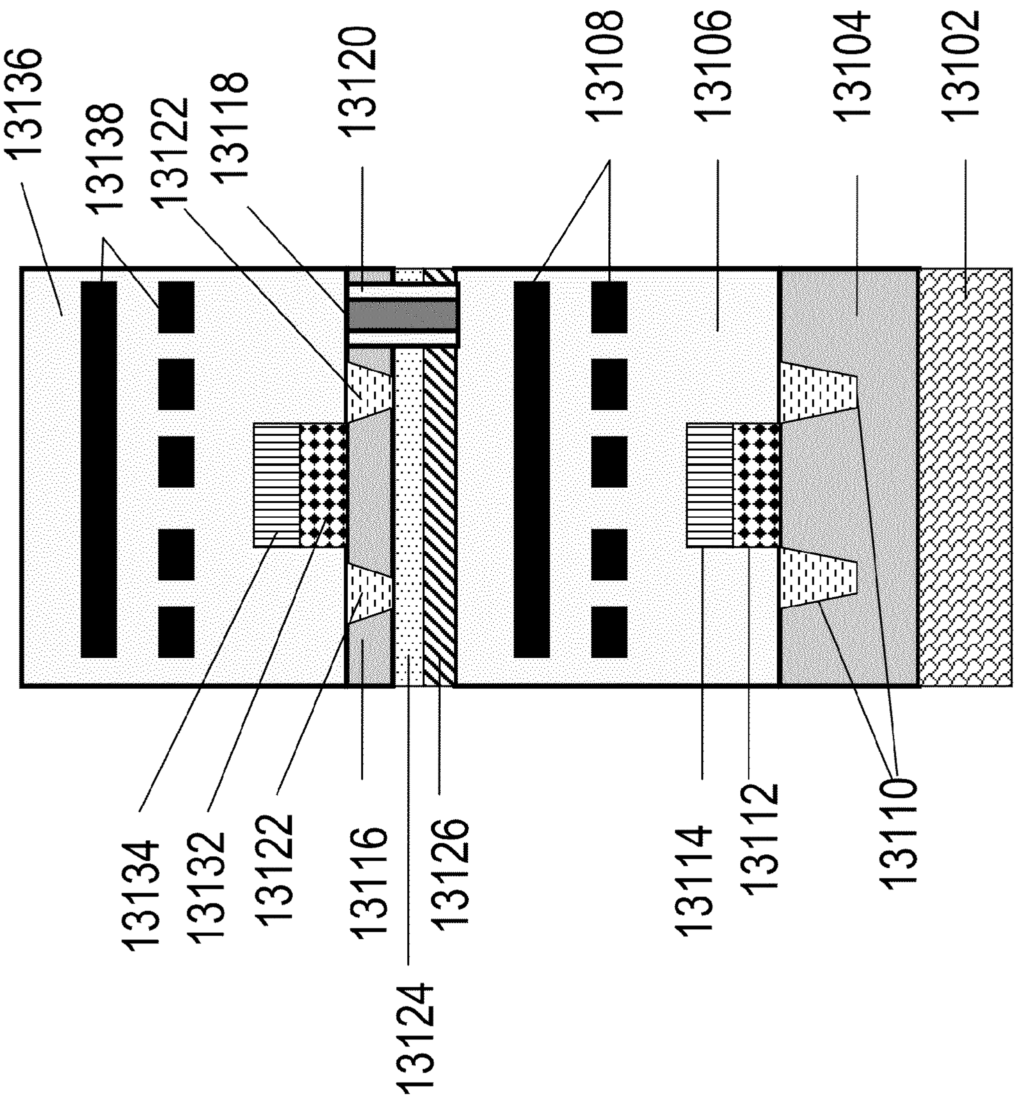
Figure 132:
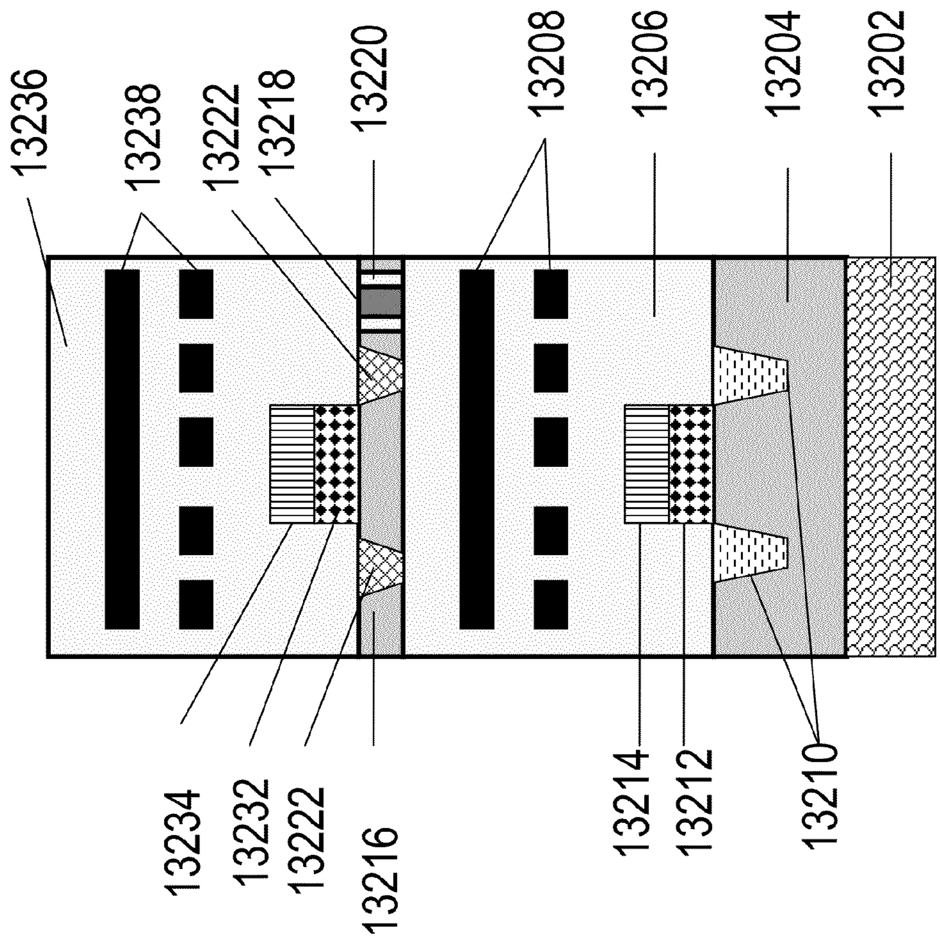
Figure 133:
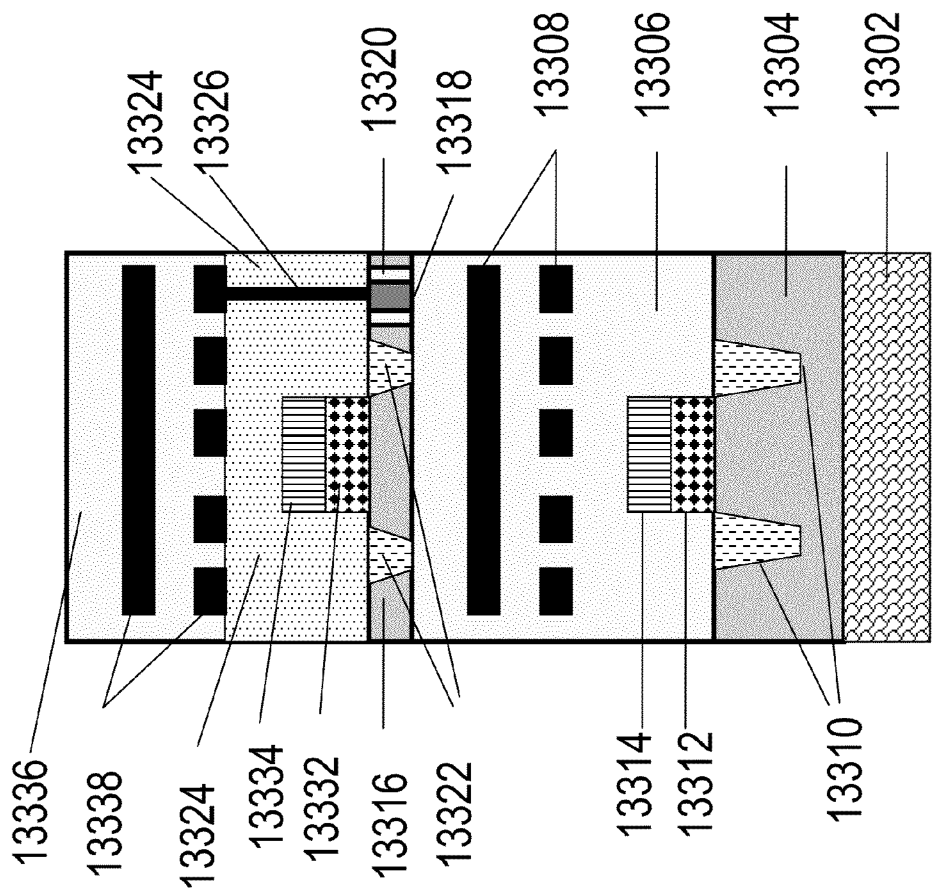
Figure 134:
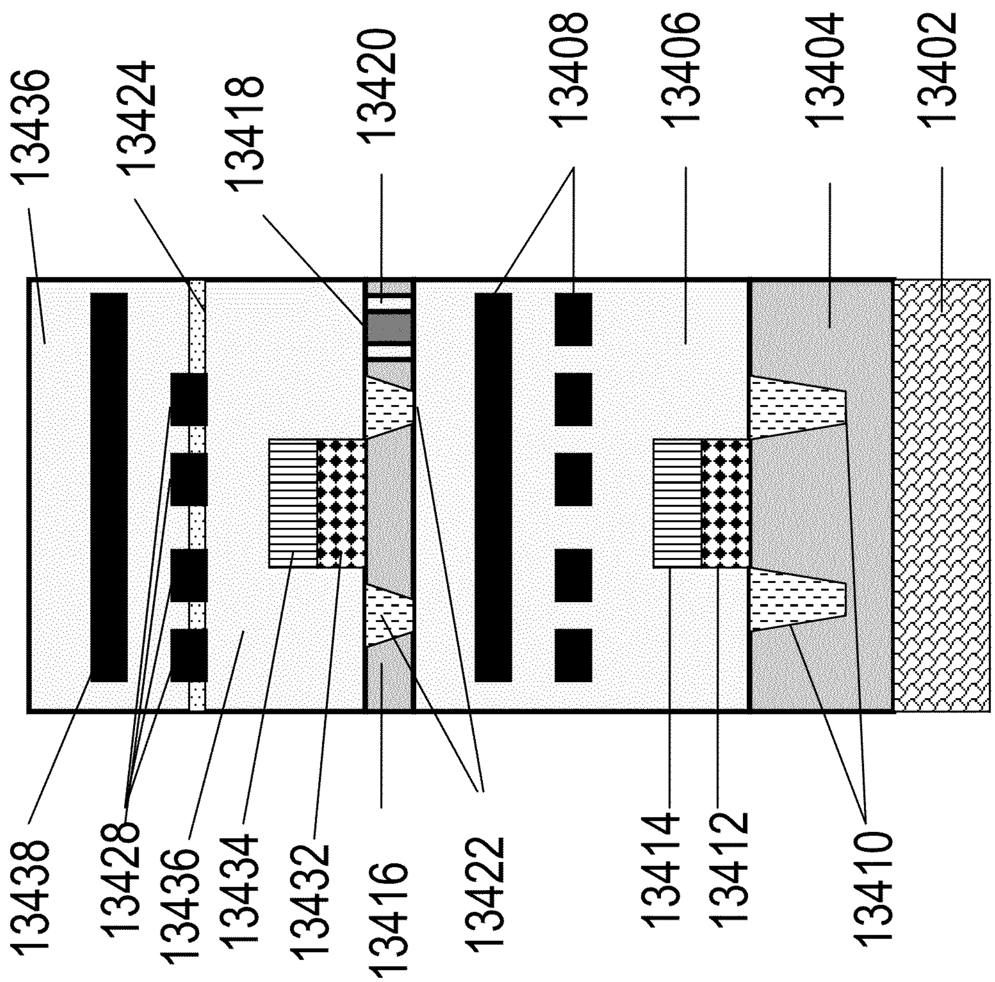
Figure 135A:
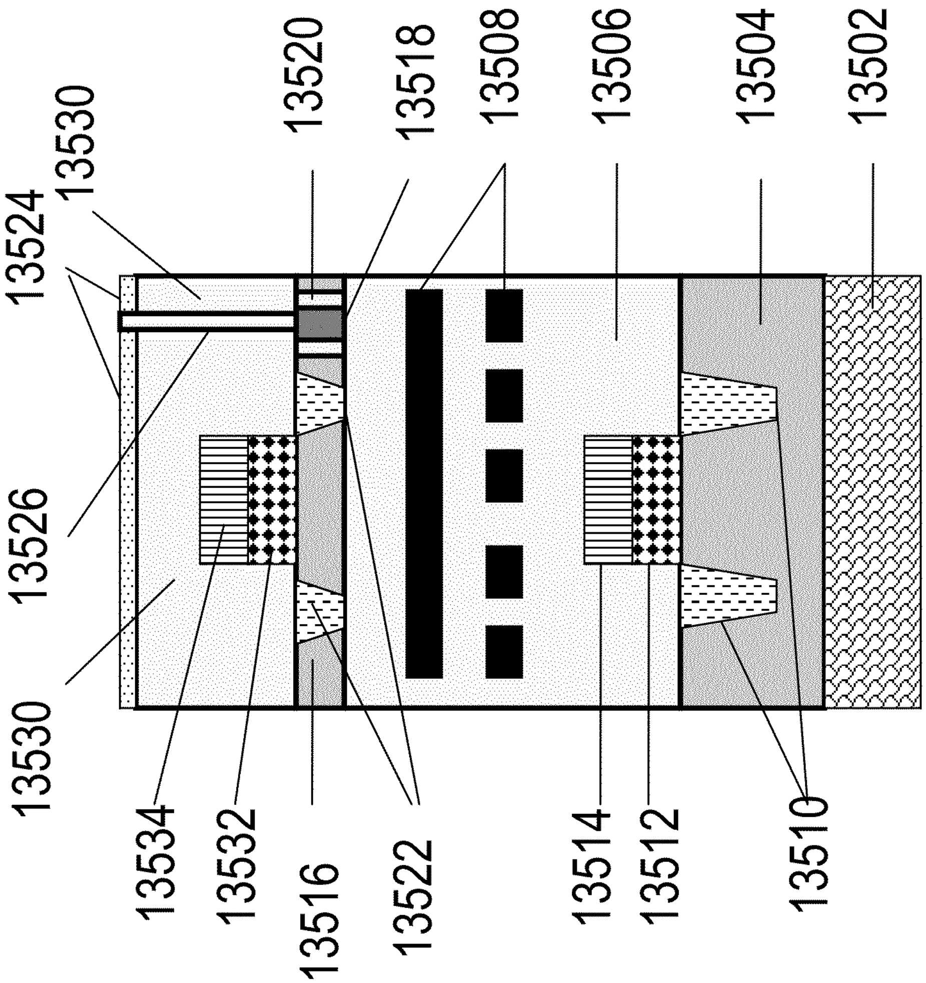
Figure 135B:
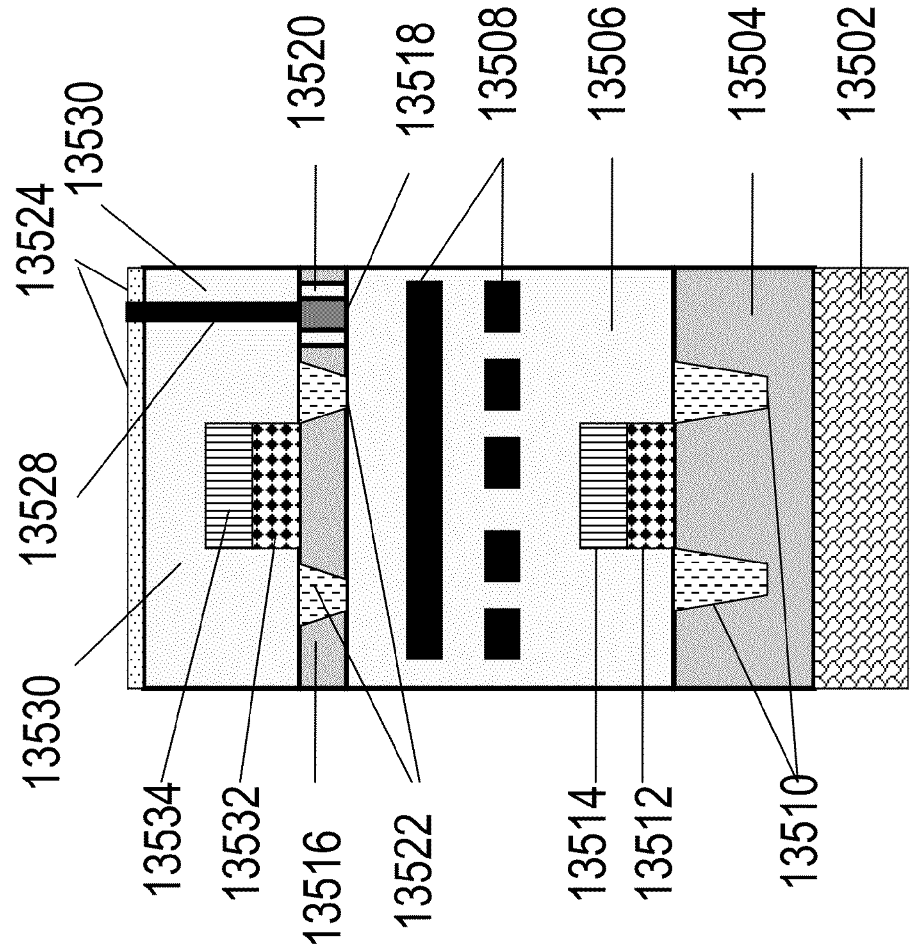
Figure 136:
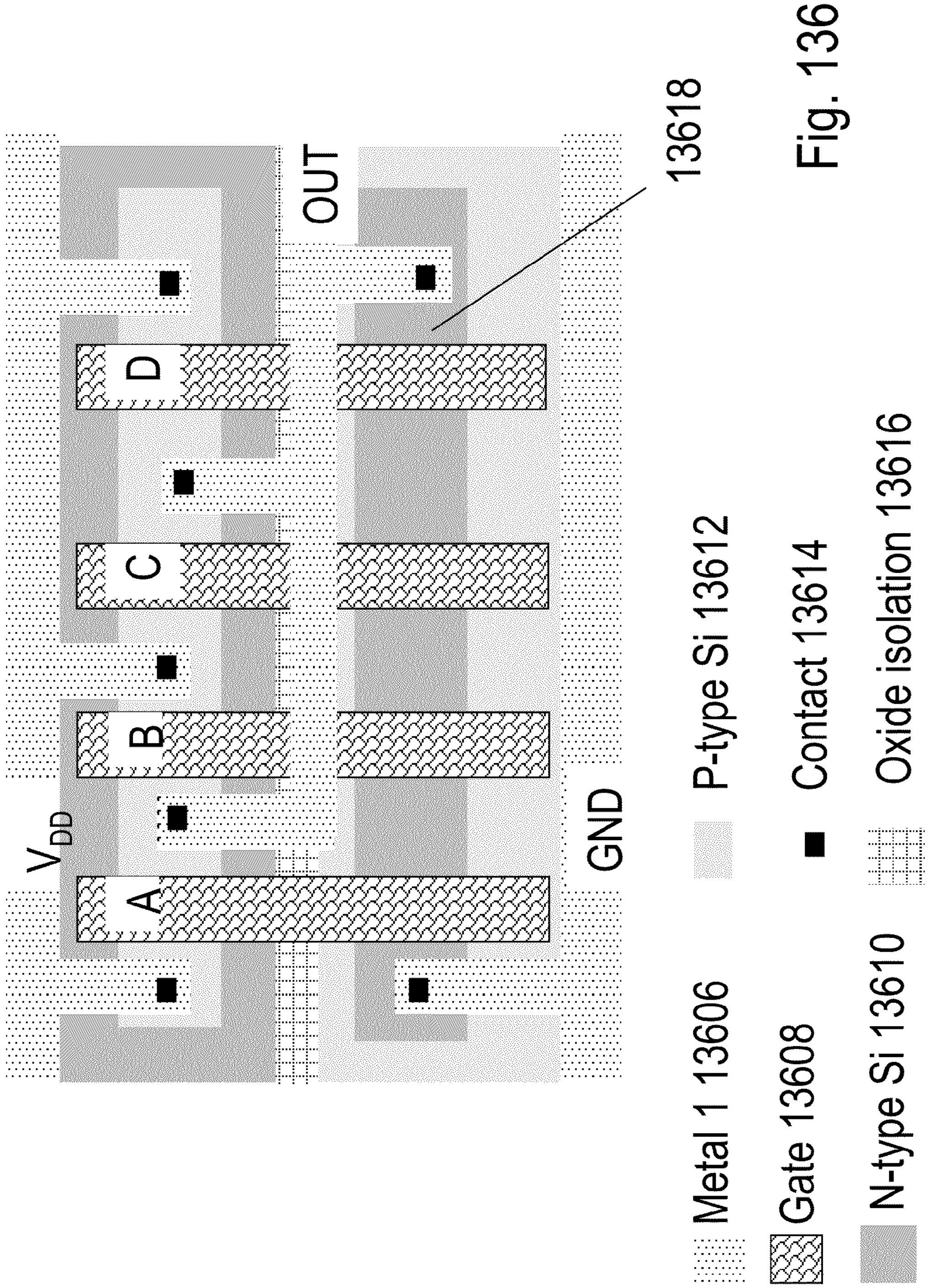
Figure 137:
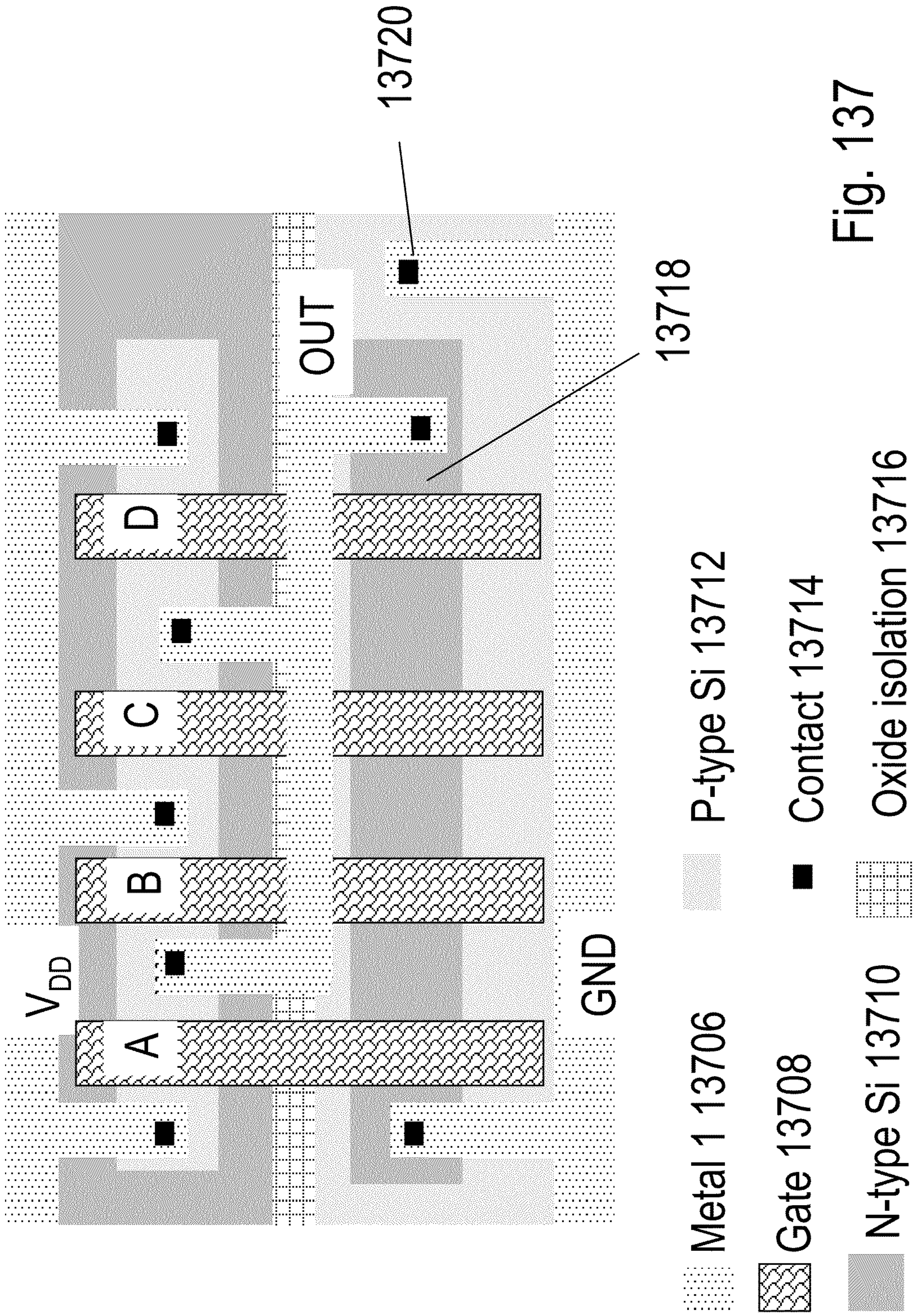
Figure 138:
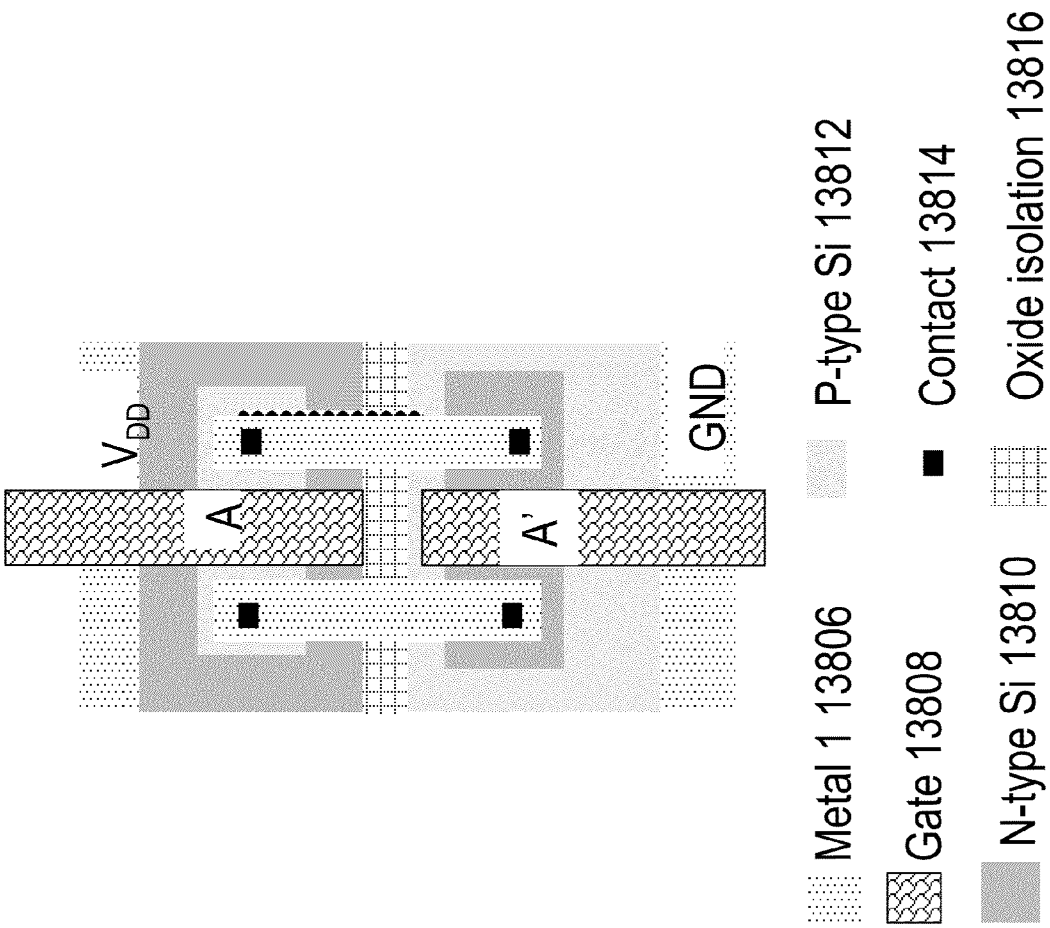

FIG. 124 is a drawing illustration of a 3D integrated circuit;

FIG. 125 is a drawing illustration of another 3D integrated circuit;

FIG. 126 is a drawing illustration of the power distribution network of a 3D integrated circuit;

FIG. 127 is a drawing illustration of a NAND gate;

FIG. 128 is a drawing illustration of the thermal contact concept;

FIG. 129 is a drawing illustration of various types of thermal contacts;

FIG. 130 is a drawing illustration of another type of thermal contact;

FIG. 131 illustrates the use of heat spreaders in 3D stacked device layers;

FIG. 132 illustrates the use of thermally conductive shallow trench isolation (STI) in 3D stacked device layers;

FIG. 133 illustrates the use of thermally conductive pre-metal dielectric regions in 3D stacked device layers;

FIG. 134 illustrates the use of thermally conductive etch stop layers for the first metal layer of 3D stacked device layers;

FIG. 135A-B illustrate the use and retention of thermally conductive hard mask layers for patterning contact layers of 3D stacked device layers;

FIG. 136 is a drawing illustration of a 4 input NAND gate;

FIG. 137 is a drawing illustration of a 4 input NAND gate where all parts of the logic cell can be within desirable temperature limits;

FIG. 138 is a drawing illustration of a transmission gate; and

Figure 139:
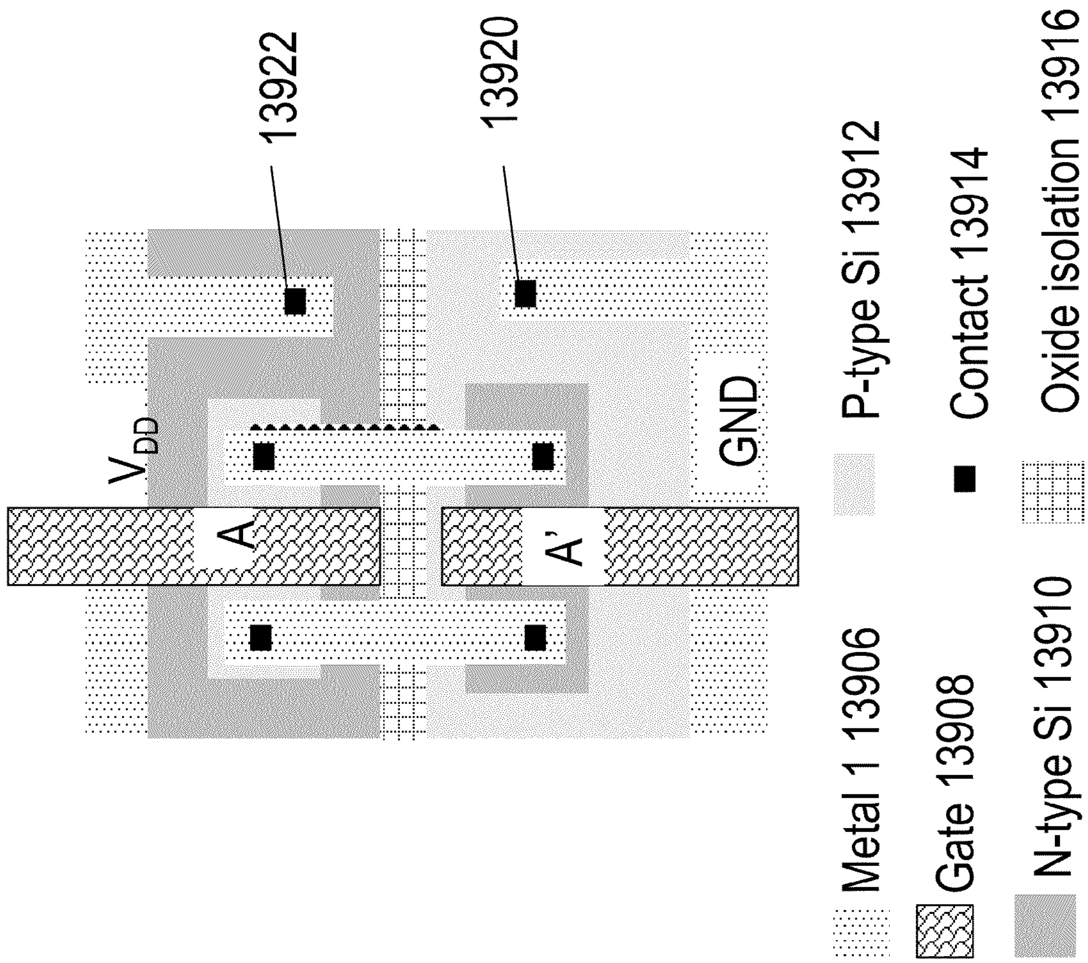
Figure 141:
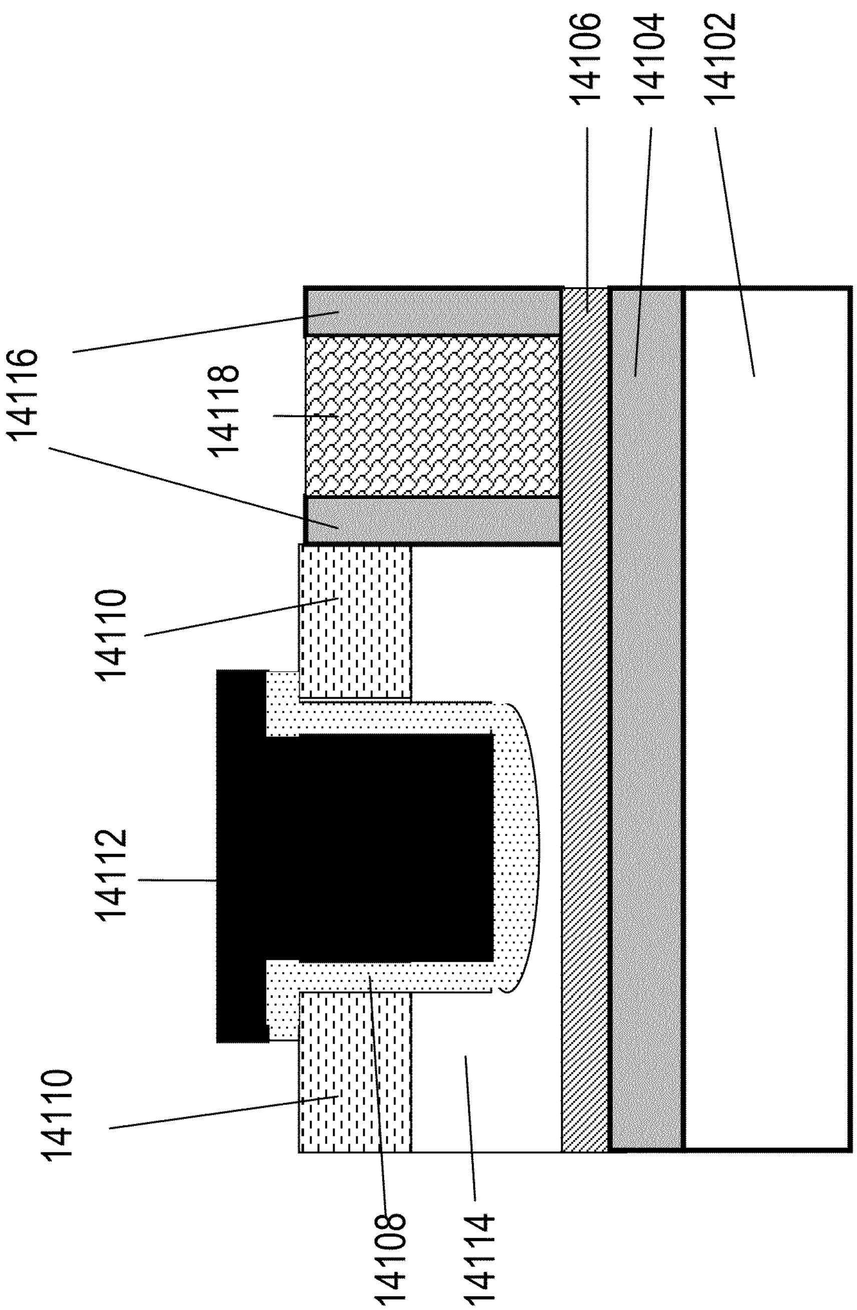
Figure 142:
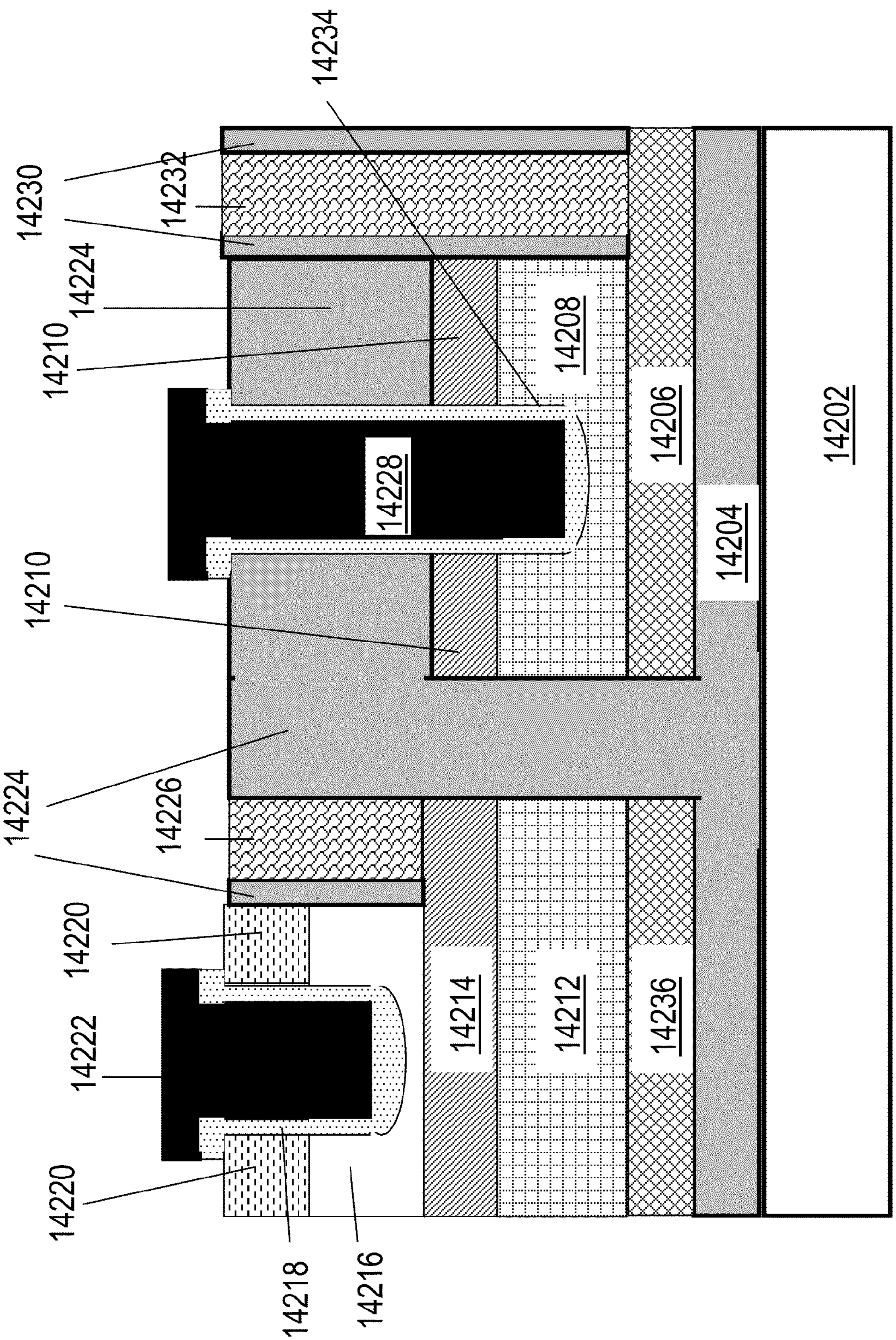
Figure 143:
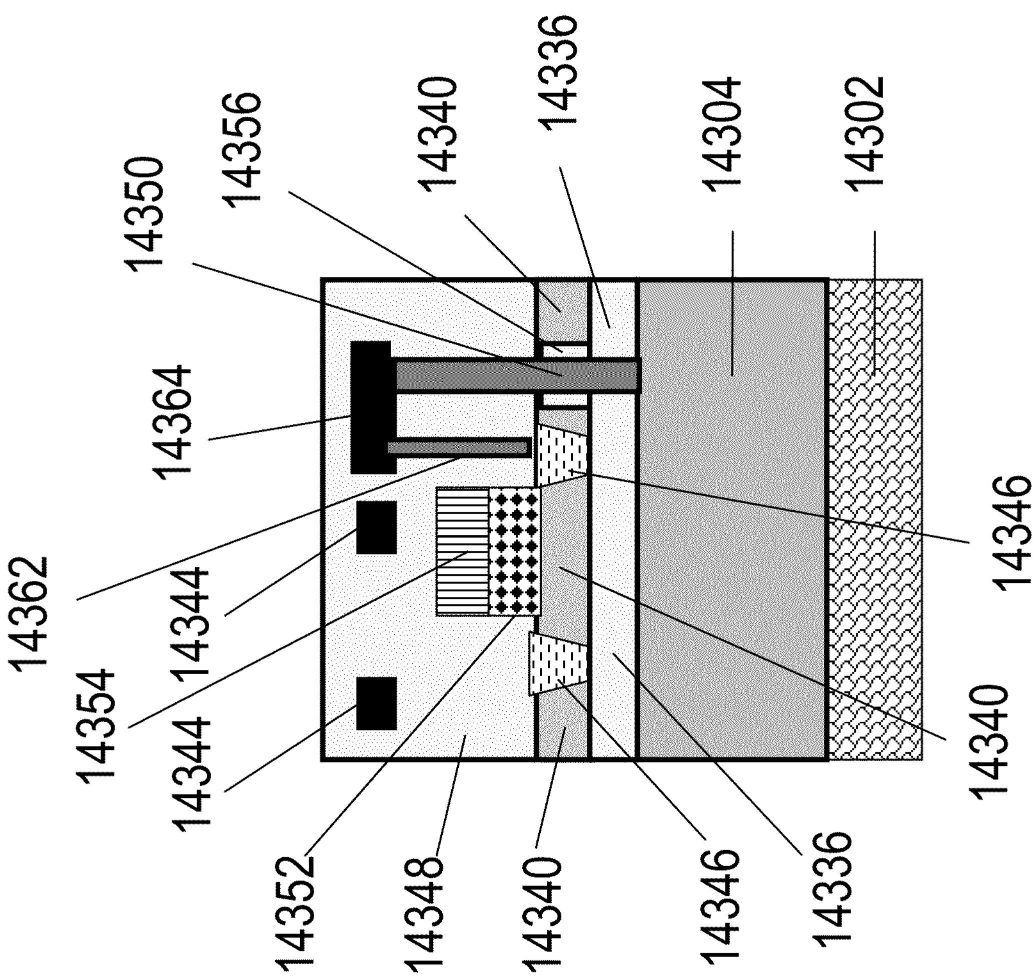
Figure 144:
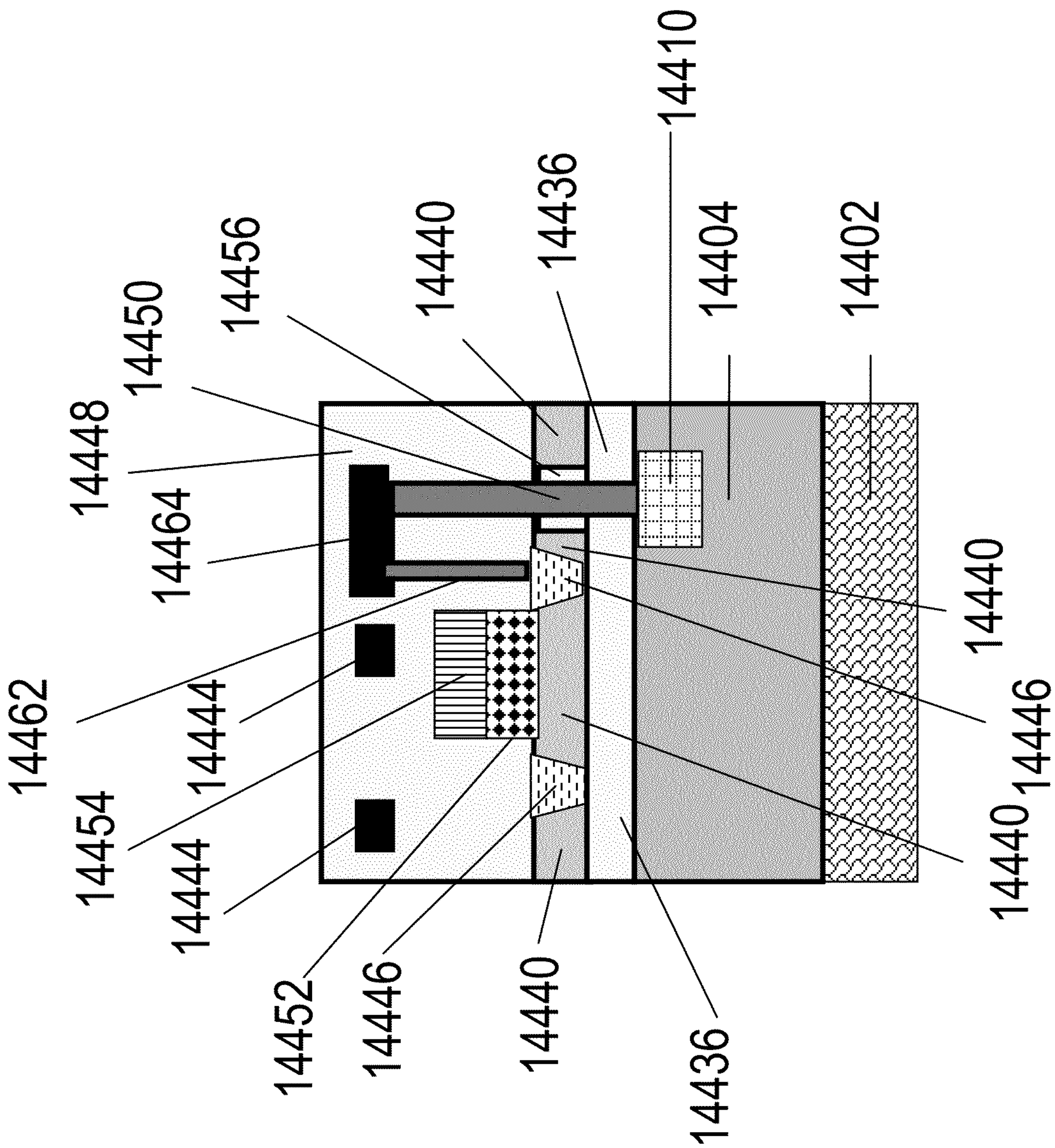
Figure 145:
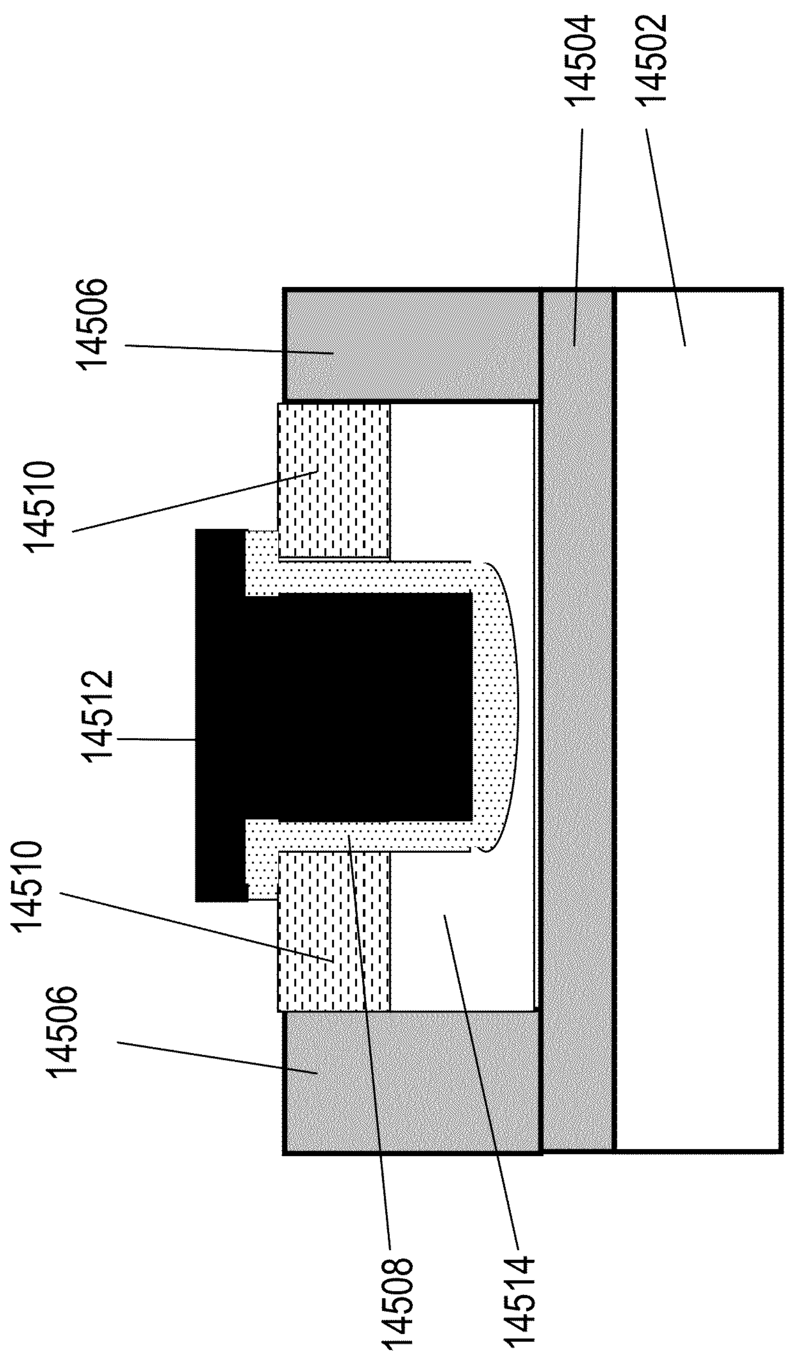
Figure 146:
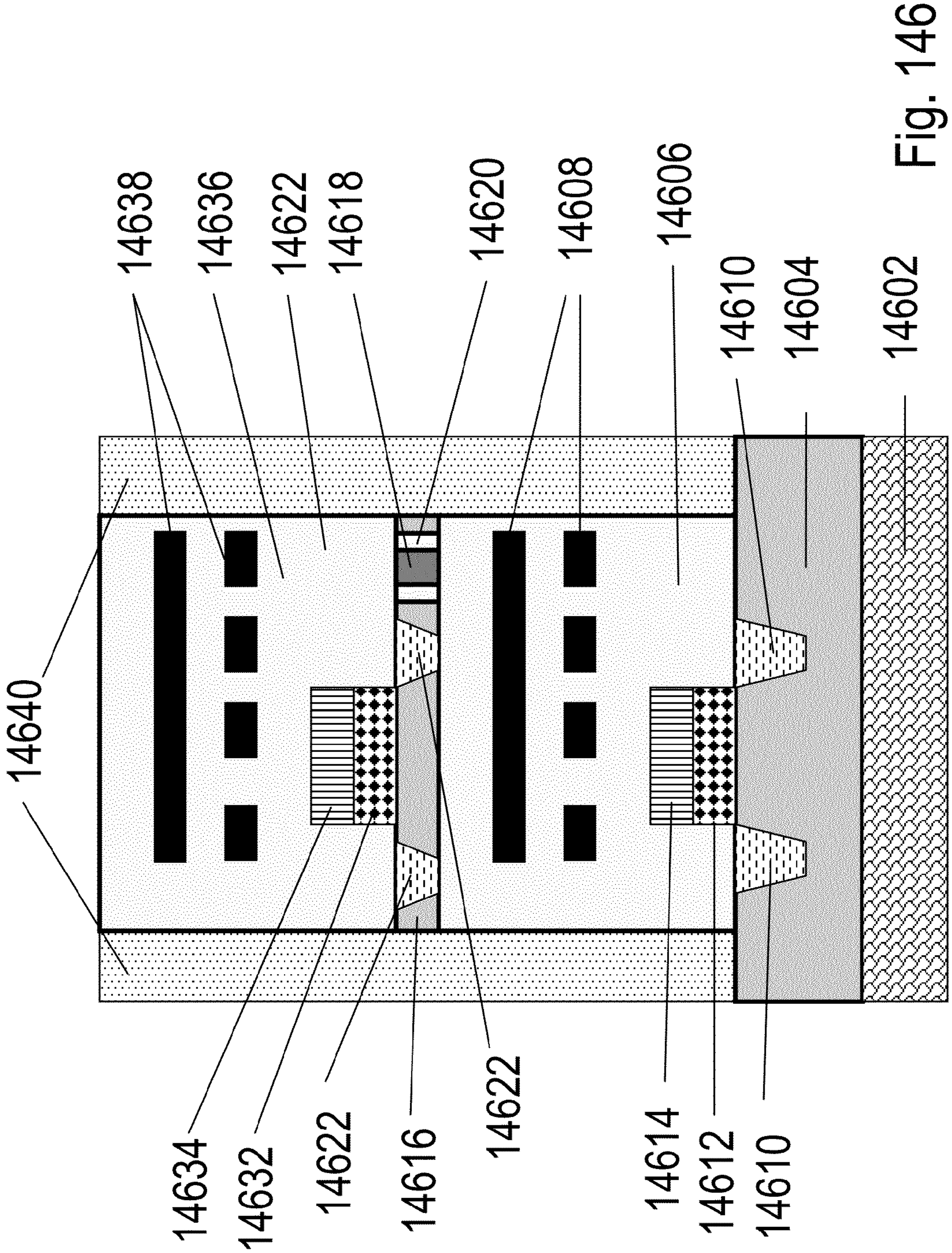
Figure 147A:
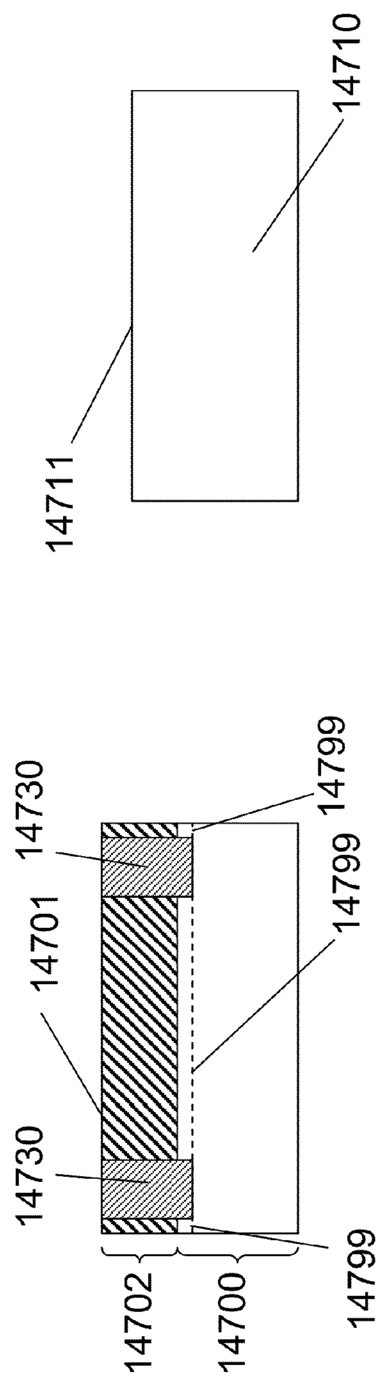
Figure 147C:
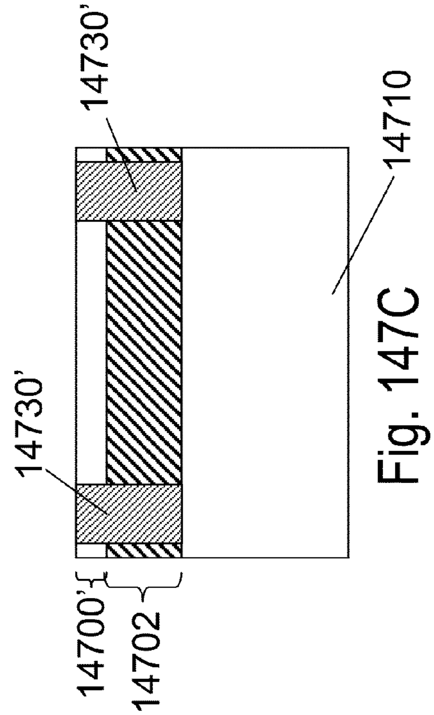
Figure 147B:
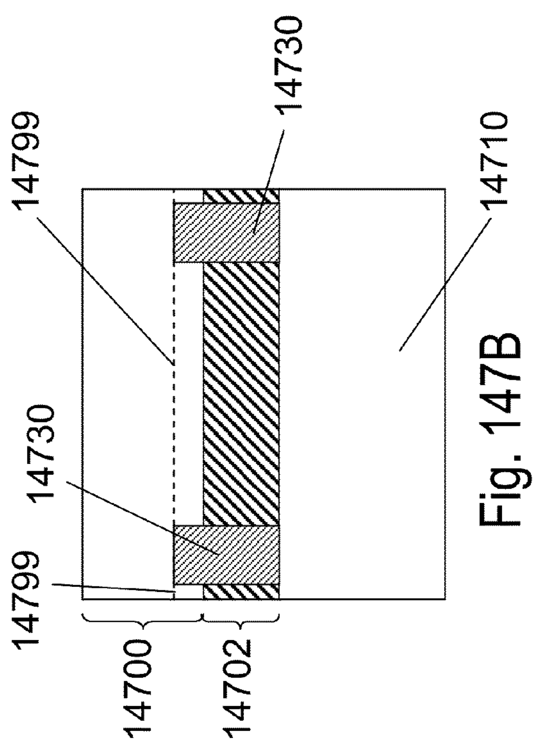
Figure 148B:
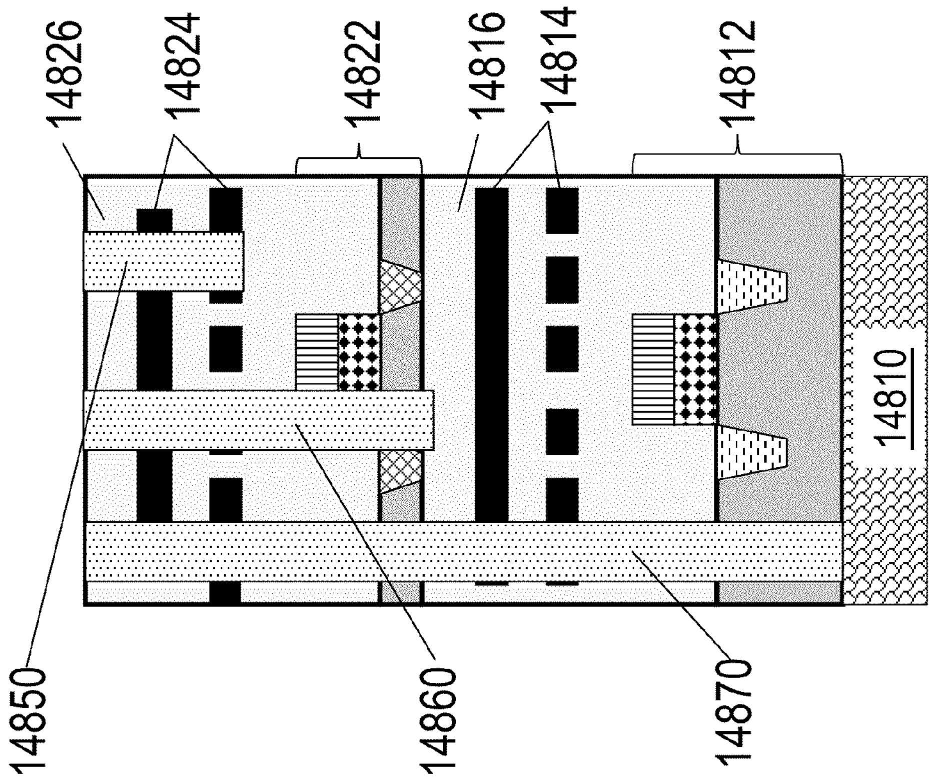
Figure 148A:
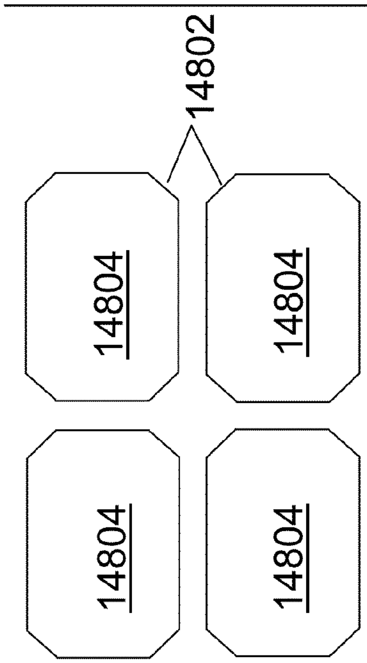
Figure 148C:
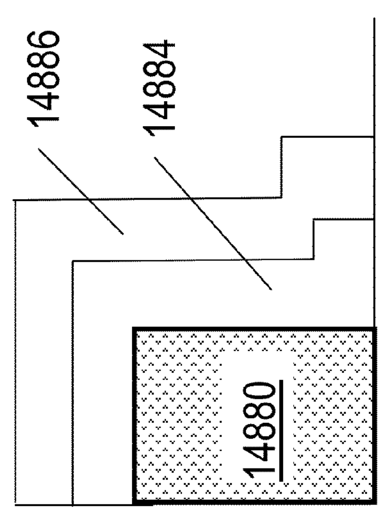

FIG. 139 is a drawing illustration of a transmission gate where all parts of the logic cell can be within desirable temperature limits;

FIG. 140A-D is a process flow for constructing recessed channel transistors with thermal contacts;

FIG. 141 is a drawing illustration of a pMOS recessed channel transistor with thermal contacts;

FIG. 142 is a drawing illustration of a CMOS circuit with recessed channel transistors and thermal contacts;

FIG. 143 is a drawing illustration of a technique to remove heat more effectively from silicon-on-insulator (SOI) circuits;

FIG. 144 is a drawing illustration of an alternative technique to remove heat more effectively from silicon-on-insulator (SOI) circuits;

FIG. 145 is a drawing illustration of a recessed channel transistor (RCAT);

FIG. 146 is a drawing illustration of a 3D-IC with thermally conductive material on the sides;

FIG. 147A-C is a drawing illustration of a process to transfer thin layers;

FIG. 148A is a drawing illustration of chamfering the custom function etching shape for stress relief;

FIG. 148B is a drawing illustration of potential depths of custom function etching a continuous array in 3DIC; and, FIG. 148C is a drawing illustration of a method to passivate the edge of a custom function etch of a continuous array in 3DIC.

DETAILED DESCRIPTION

Embodiments of the invention are now described with reference to FIGS. 1-148, it being appreciated that the figures illustrate the subject matter not to scale or to measure. Many figures describe process flows for building devices. These process flows, which are essentially a sequence of steps for building a device, have many structures, numerals and labels that are common between two or more adjacent steps. In such cases, some labels, numerals and structures used for a certain step's figure may have been described in previous steps' figures.

Embodiments of the invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the spirit of the appended claims.

Section 1: Construction of 3D Stacked Semiconductor Circuits and Chips with Processing Temperatures Below 400° C.

This section of the document describes a technology to construct single-crystal silicon transistors atop wiring layers with less than 400° C. processing temperatures. This allows construction of 3D stacked semiconductor chips with high density of connections between different layers, because the top-level transistors are formed well-aligned to bottom-level wiring and transistor layers. Since the top-level transistor layers are very thin (preferably less than about 200 nm), alignment can be done through these thin silicon and oxide layers to features in the bottom-level.

Figure 1:
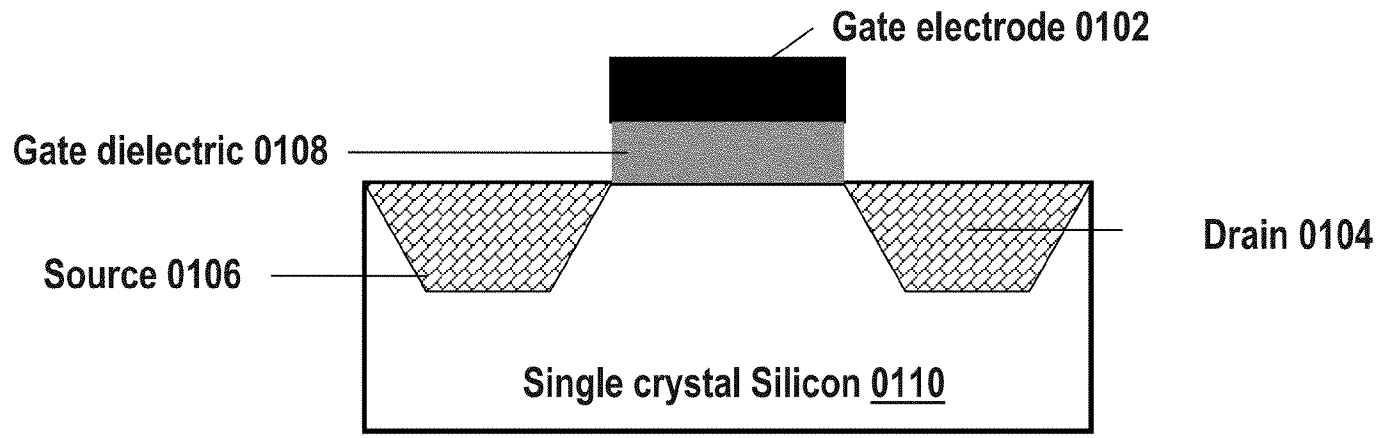
FIG. 1 shows process temperatures required for constructing different parts of a single-crystal silicon transistor.

FIG. 1 shows different parts of a standard transistor used in Complementary Metal Oxide Semiconductor (CMOS) logic and SRAM circuits. The transistor may be constructed out of single crystal silicon material and may include a source 0106, a drain 0104, a gate electrode 0102 and a gate dielectric 0108. Single crystal silicon layers 0110 can be formed atop wiring layers at less than about 400° C. using an "ion-cut process." Further details of the ion-cut process will be described in FIG. 2A-E. Note that the terms smart-cut, smart-cleave and nano-cleave are used interchangeably with the term ion-cut in this document. Gate dielectrics can be grown or deposited above silicon at less than about 400° C. using a Chemical Vapor Deposition (CVD) process, an Atomic Layer Deposition (ALD) process or a plasma-enhanced thermal oxidation process. Gate electrodes can be deposited using CVD or ALD at sub-400° C. temperatures as well. The only part of the transistor that requires temperatures greater than about 400° C. for processing may be the source-drain region, which receives ion implantation which needs to be activated. It may be clear based on FIG. 1 that novel transistors for 3D integrated circuits that do not need high-temperature source-drain region processing will be useful (to get a high density of inter-layer connections).

Figures 2A, 2B, 2C, 2D:
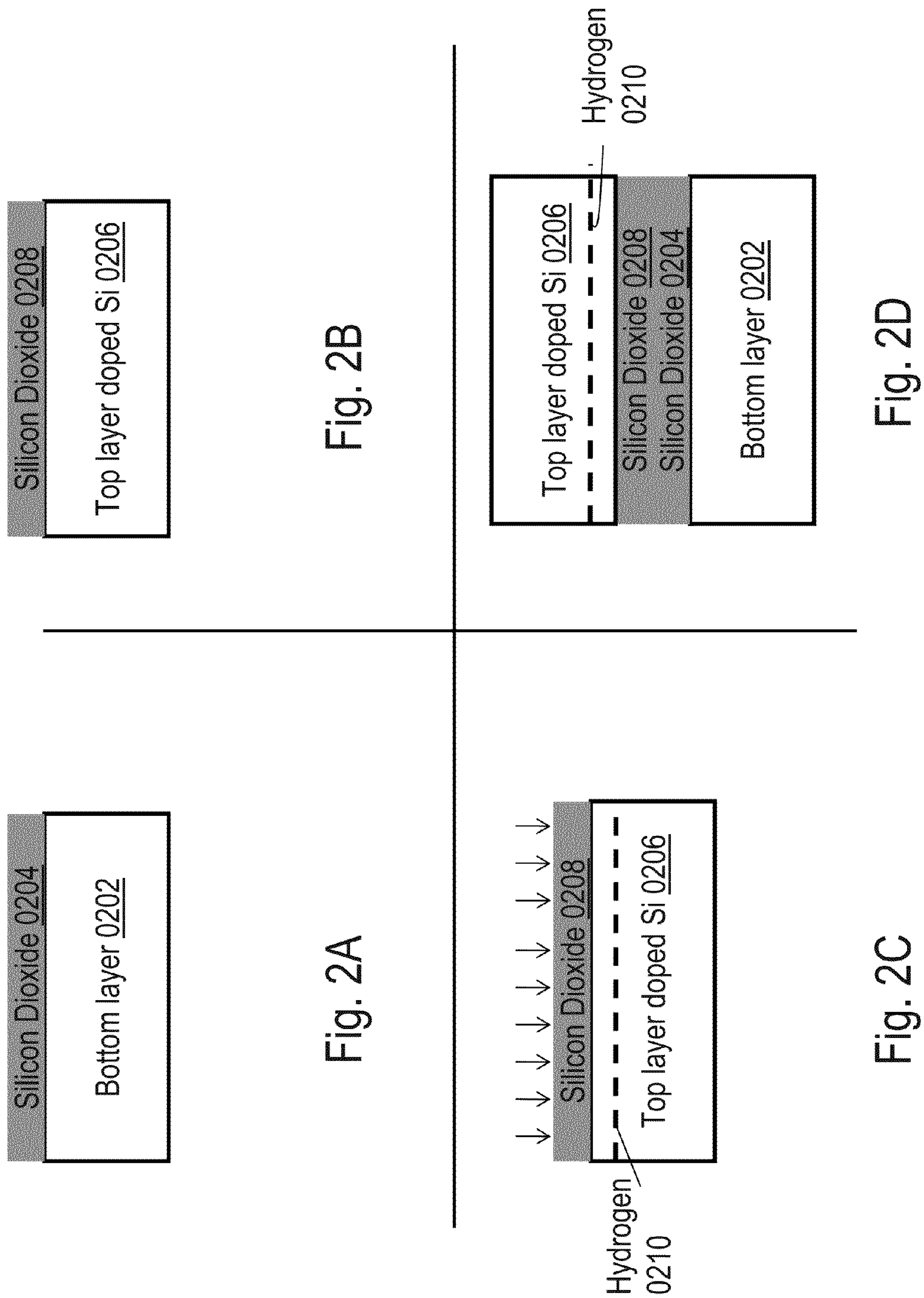
FIG. 2A-E depicts a layer transfer flow using ion-cut in which a top layer of doped Si may be layer transferred atop a generic bottom layer.

FIG. 2A-E describes an ion-cut flow for layer transferring a single crystal silicon layer atop any generic bottom layer 0202. The bottom layer 0202 can be a single crystal silicon layer. Alternatively, it can be a wafer having transistors with wiring layers above it. This process of ion-cut based layer transfer may include several steps, as described in the following sequence:

Step (A): A silicon dioxide layer 0204 may be deposited above the generic bottom layer 0202. FIG. 2A illustrates the structure after Step (A) is completed.

Step (B): The top layer of doped or undoped silicon 0206 to be transferred atop the bottom layer may be processed and an oxide layer 0208 may be deposited or grown above it. FIG. 2B illustrates the structure after Step (B) is completed.

Step (C): Hydrogen may be implanted into the top layer silicon 0206 with the peak at a certain depth to create the hydrogen plane 0210. Alternatively, another atomic species such as helium or boron can be implanted or co-implanted. FIG. 2C illustrates the structure after Step (C) is completed.

Step (D): The top layer wafer shown after Step (C) may be flipped and bonded atop the bottom layer wafer using oxide-to-oxide bonding. FIG. 2D illustrates the structure after Step (D) is completed.

Figure 2E:
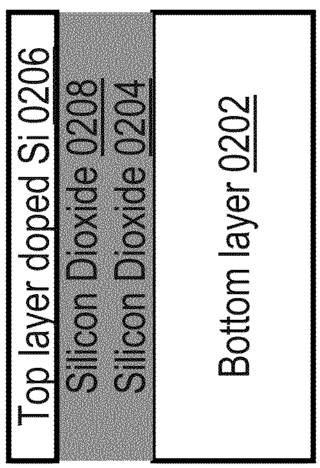

Step (E): A cleave operation may be performed at the hydrogen plane 0210 using an anneal. Alternatively, a sideways mechanical force may be used. Further details of this cleave process are described in "Frontiers of silicon-on-insulator," J. Appl. Phys. 93, 4955-4978 (2003) by G. K. Celler and S. Cristoloveanu ("Celler") and "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen"). Following this, a Chemical-Mechanical-Polish (CMP) may be done. FIG. 2E illustrates the structure after Step (E) is completed.

Figure 3A:
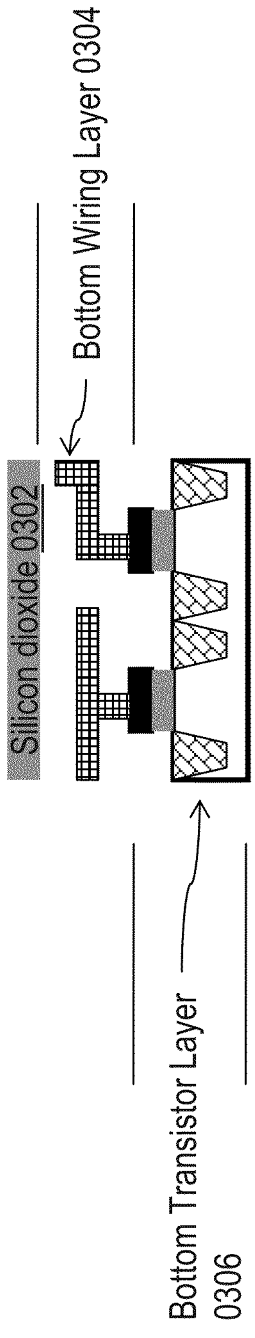
FIG. 3A-E shows a process flow for forming a 3D stacked IC using layer transfer which requires >400° C. processing for source-drain region construction.

A possible flow for constructing 3D stacked semiconductor chips with standard transistors may be shown in FIG. 3A-E. The process flow may comprise several steps in the following sequence:

Step (A): The bottom wafer of the 3D stack may be processed with a bottom transistor layer 0306 and a bottom wiring layer 0304. A silicon dioxide layer 0302 may be deposited above the bottom transistor layer 0306 and the bottom wiring layer 0304. FIG. 3A illustrates the structure after Step (A) is completed.

Figures 3B, 3C, 3D, 3E:
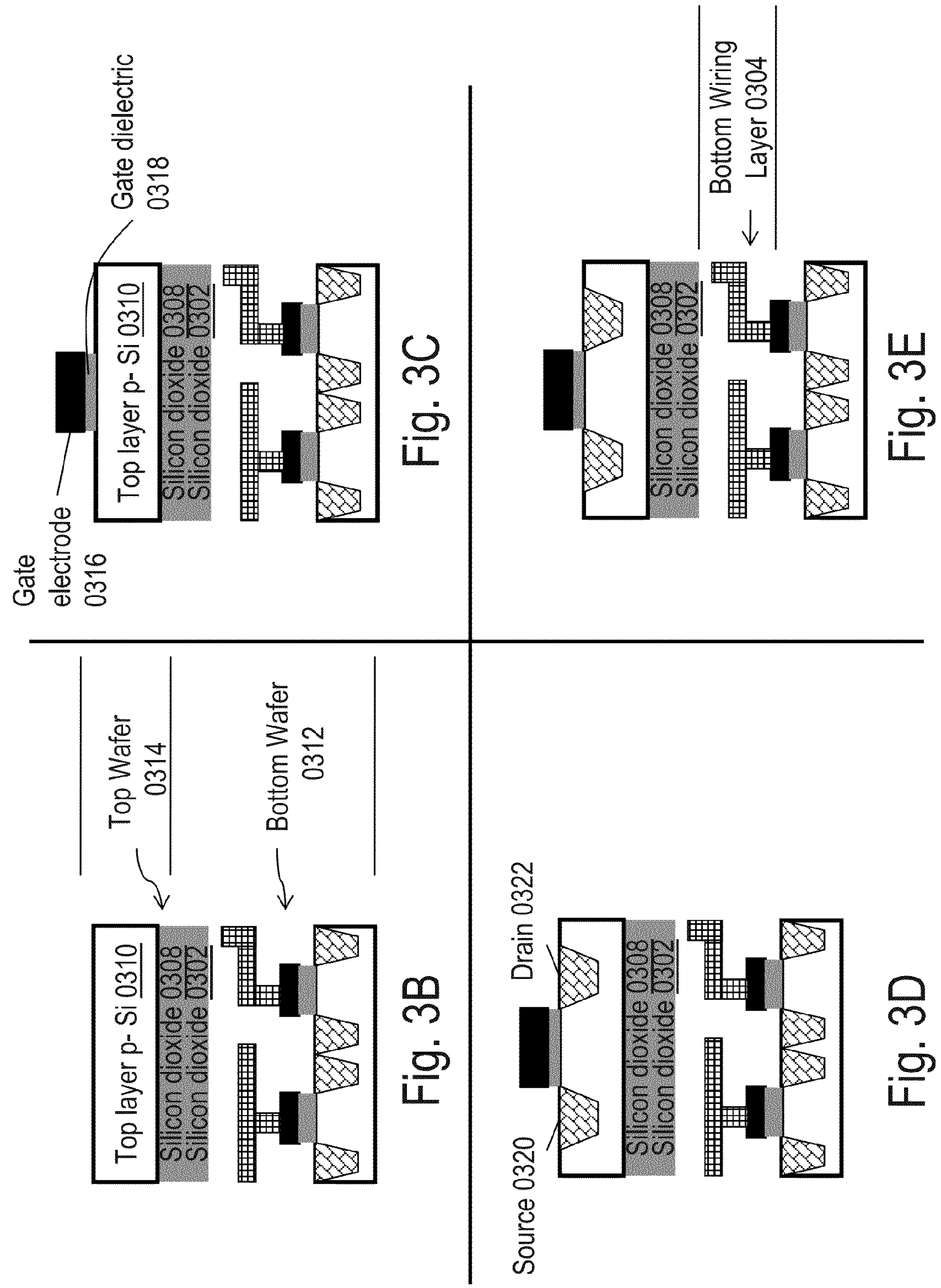

Step (B): Using a procedure similar to FIG. 2A-E, a top layer of p− or n− doped Silicon 0310 and silicon dioxide 0308 may be transferred atop the bottom wafer. FIG. 3B illustrates the structure after Step (B) is completed, including remaining portions of top wafer 0314 p− or n− doped Silicon layer 0310 and silicon dioxide layer 0308, and including bottom wafer 0312, which may include bottom transistor layer 0306, bottom wiring layer 0304, and silicon dioxide layer 0302.

Step (C) Isolation regions (between adjacent transistors) on the top wafer are formed using a standard shallow trench isolation (STI) process. After this, a gate dielectric 0318 and a gate electrode 0316 are deposited, patterned and etched. FIG. 3C illustrates the structure after Step (C) is completed.

Step (D): Source 0320 and drain 0322 regions are ion implanted. FIG. 3D illustrates the structure after Step (D) is completed.

Step (E): The top layer of transistors may be annealed at high temperatures, typically in between about 700° C. and about 1200° C. This may be done to activate dopants in implanted regions. Following this, contacts are made and further processing occurs. FIG. 3E illustrates the structure after Step (E) is completed.

The challenge with following this flow to construct 3D integrated circuits with aluminum or copper wiring may be apparent from FIG. 3A-E. During Step (E), temperatures above about 700° C. are utilized for constructing the top layer of transistors. This can damage copper or aluminum wiring in the bottom wiring layer 0304. It may be therefore apparent from FIG. 3A-E that forming source-drain regions and activating implanted dopants forms the primary concern with fabricating transistors with a low-temperature (sub-400° C.) process.

Section 1.1: Junction-Less Transistors as a Building Block for 3D Stacked Chips

One method to solve the issue of high-temperature source-drain junction processing may be to make transistors without junctions i.e. Junction-Less Transistors (JLTs). An embodiment of this invention uses JLTs as a building block for 3D stacked semiconductor circuits and chips.

Figure 4:
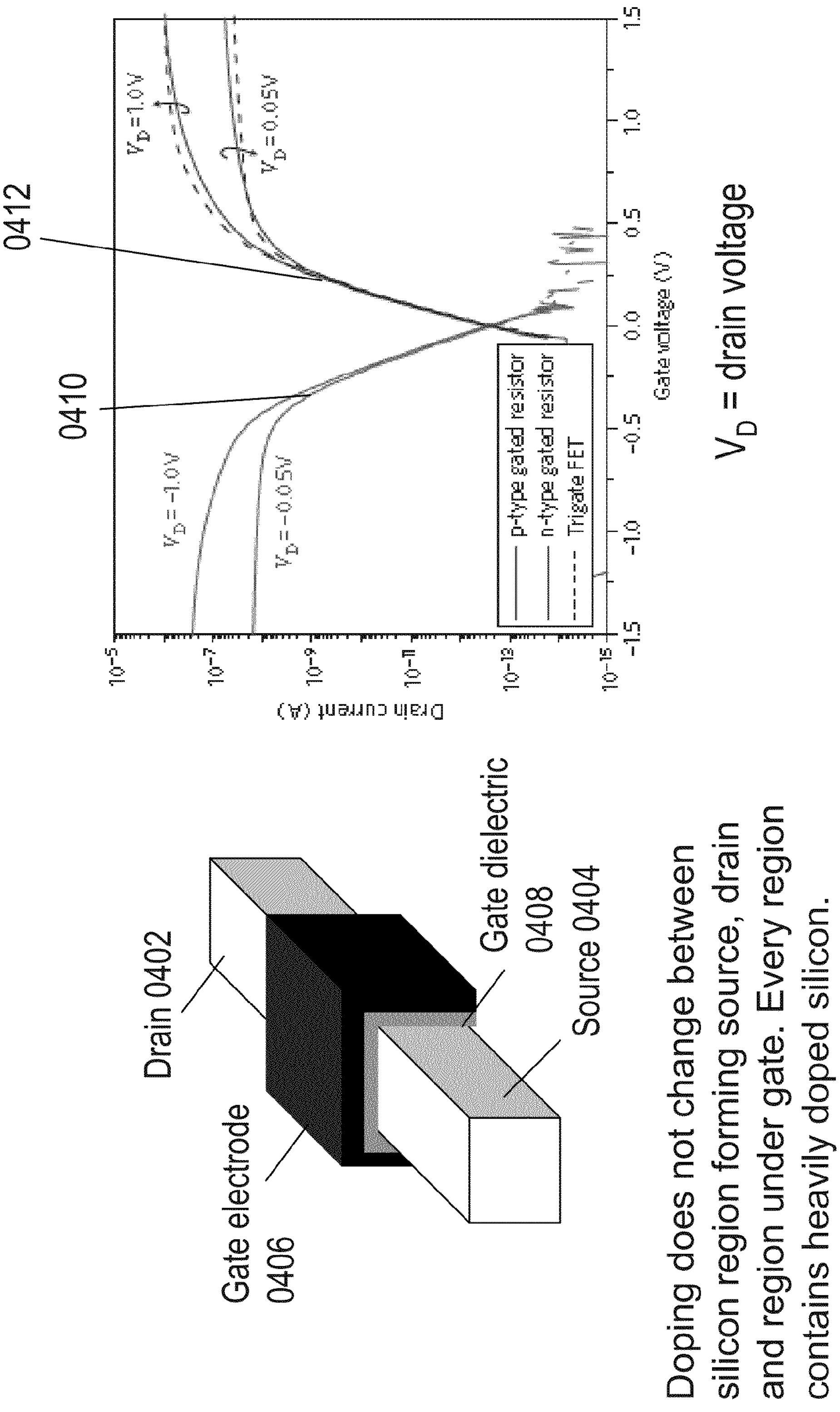
FIG. 4 shows a junction-less transistor as a switch for logic applications (prior art).

FIG. 4 shows a schematic of a junction-less transistor (JLT) also referred to as a gated resistor or nano-wire. A heavily doped silicon layer (typically above $1\times10^{19}/cm^3$, but can be lower as well) forms source 0404, drain 0402 as well as channel region of a JLT. A gate electrode 0406 and a gate dielectric 0408 are present over the channel region of the JLT. The JLT has a very small channel area (typically less than 20 nm on one side), so the gate can deplete the channel of charge carriers at 0V and turn it off I-V curves of n channel 0412 and p channel 0410 junction-less transistors are shown in FIG. 4 as well. These indicate that the JLT can show comparable performance to a tri-gate transistor that may be commonly researched by transistor developers. Further details of the JLT can be found in "Junctionless multigate field-effect transistor," Appl. Phys. Lett., vol. 94, pp. 053511 2009 by C.-W. Lee, A. Afzalian, N. Dehdashti Akhavan, R. Yan, I. Ferain and J. P. Colinge ("C-W. Lee"). Contents of this publication are incorporated herein by reference.

Figure 5A:
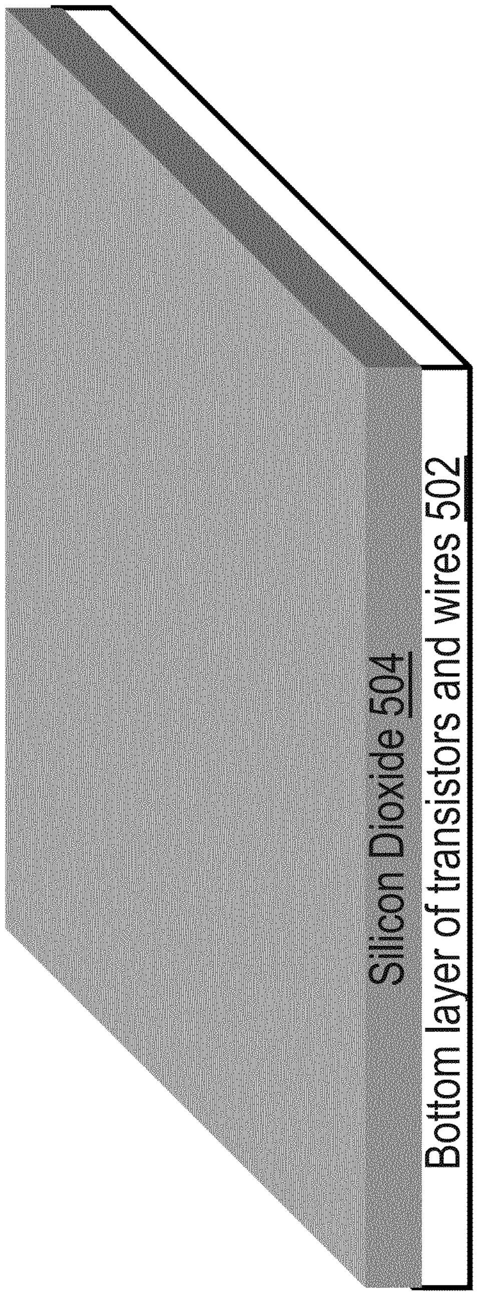
FIG. 5A-F shows a process flow for constructing 3D stacked logic chips using junction-less transistors as switches.

FIG. 5A-F describes a process flow for constructing 3D stacked circuits and chips using JLTs as a building block. The process flow may comprise several steps, as described in the following sequence:

Step (A): The bottom layer of the 3D stack may be processed with transistors and wires. This may be indicated in the figure as bottom layer of transistors and wires 502. Above this, a silicon dioxide layer 504 may be deposited. FIG. 5A shows the structure after Step (A) is completed.

Figure 5B:
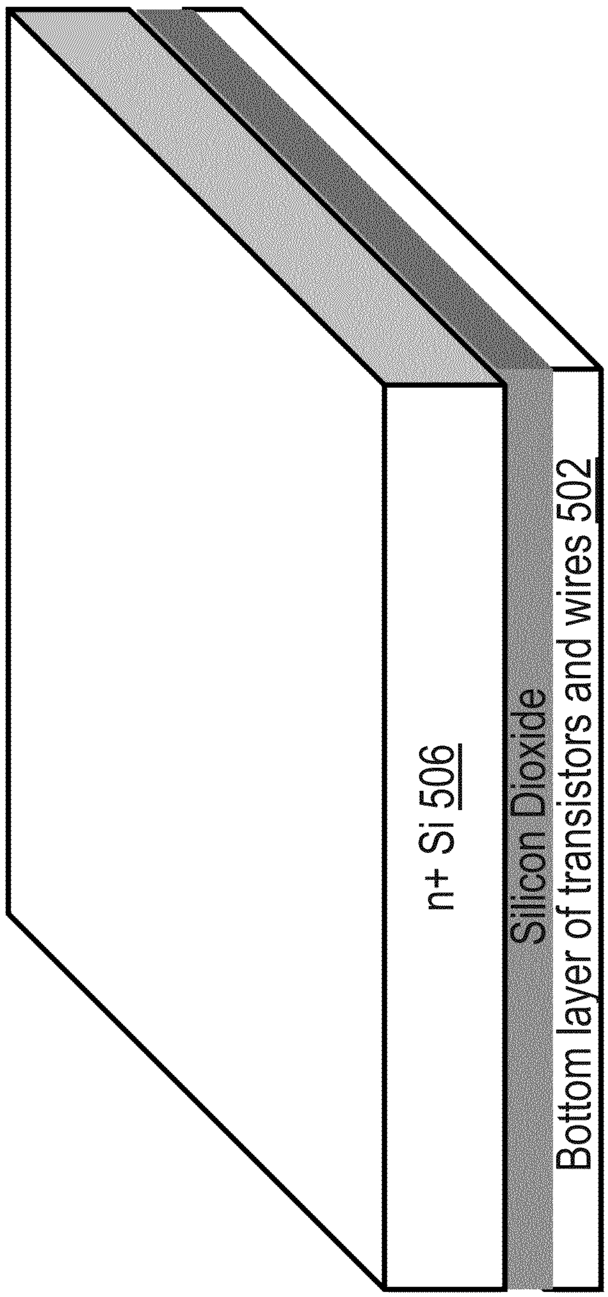

Step (B): A layer of n+ Si 506 may be transferred atop the structure shown after Step (A). It starts by taking a donor wafer which may be already n+ doped and activated. Alternatively, the process can start by implanting a silicon wafer and activating at high temperature forming an n+ activated layer, which may be conductive or semi-conductive. Then, H+ ions are implanted for ion-cut within the n+ layer. Following this, a layer transfer may be performed. The process as shown in FIG. 2A-E may be utilized for transferring and ion-cut of the layer forming the structure of FIG. 5A. FIG. 5B illustrates the structure after Step (B) is completed.

Figure 5C:
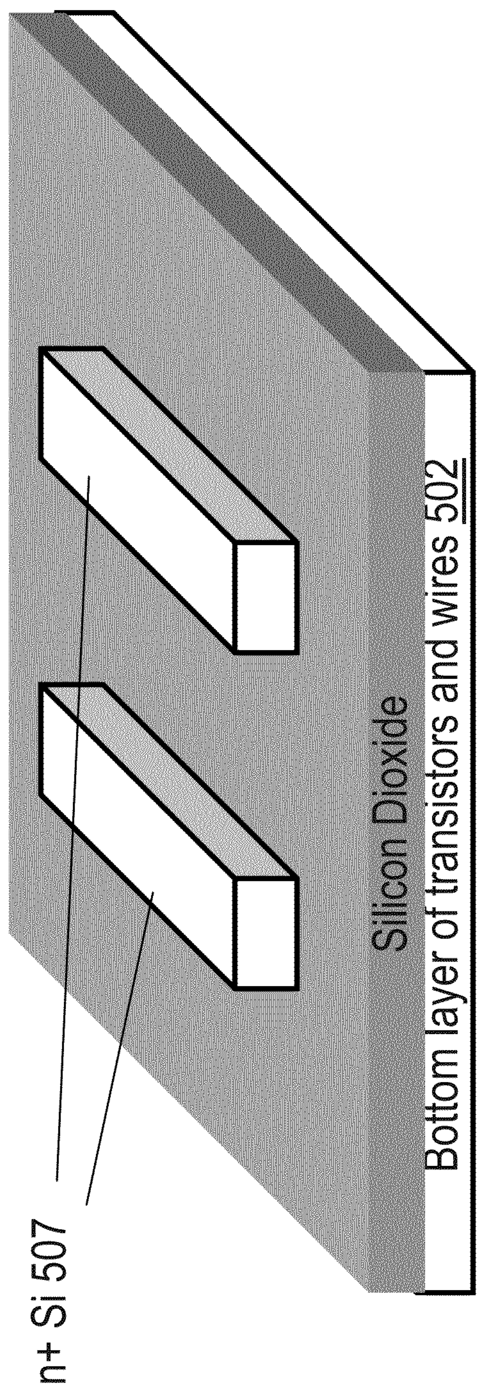

Step (C): Using lithography (litho) and etch, the n+ Si layer may be defined and may be present only in regions where transistors are to be constructed. These transistors are aligned to the underlying alignment marks embedded in bottom layer of transistors and wires 502. FIG. 5C illustrates the structure after Step (C) is completed, showing structures of the gate dielectric material 511 and gate electrode material 509 as well as structures of the n+ silicon region 507 after Step (C).

Figure 5D:
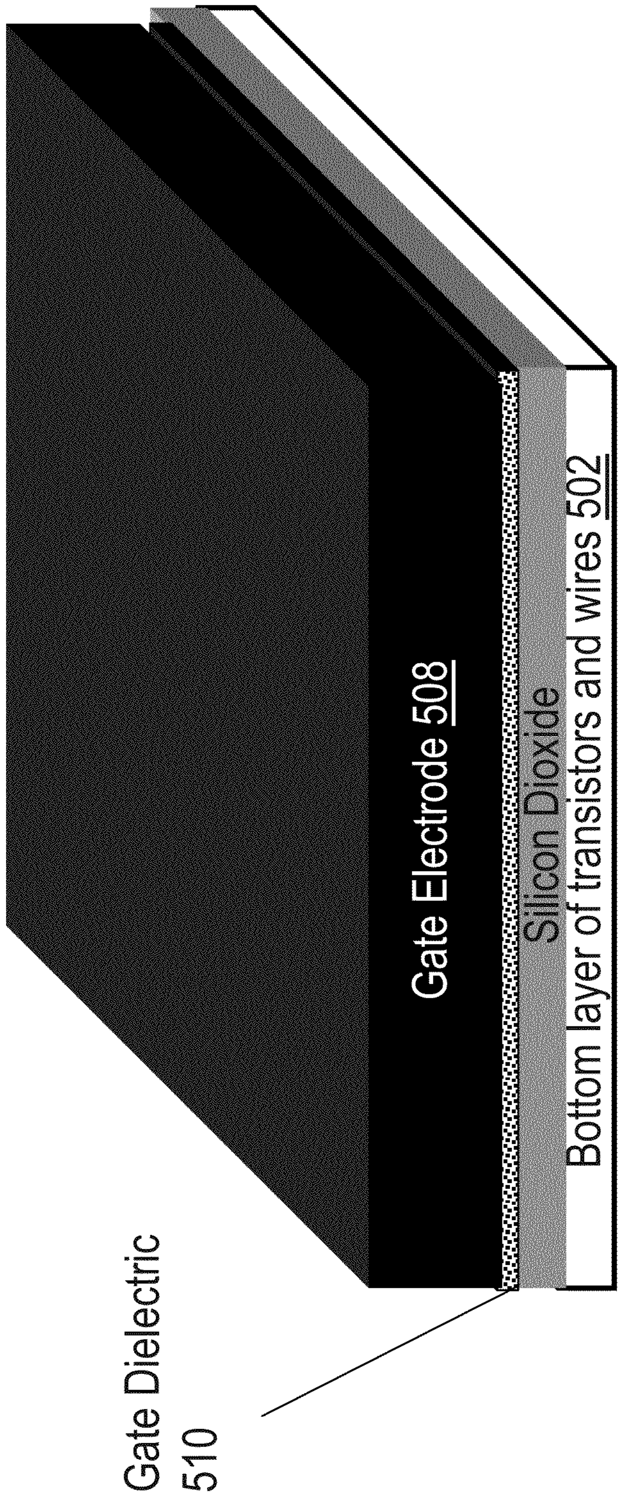

Step (D): The gate dielectric material 510 and the gate electrode material 508 are deposited, following which a CMP process may be utilized for planarization. The gate dielectric material 510 could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. FIG. 5D illustrates the structure after Step (D) is completed.

Figure 5E:
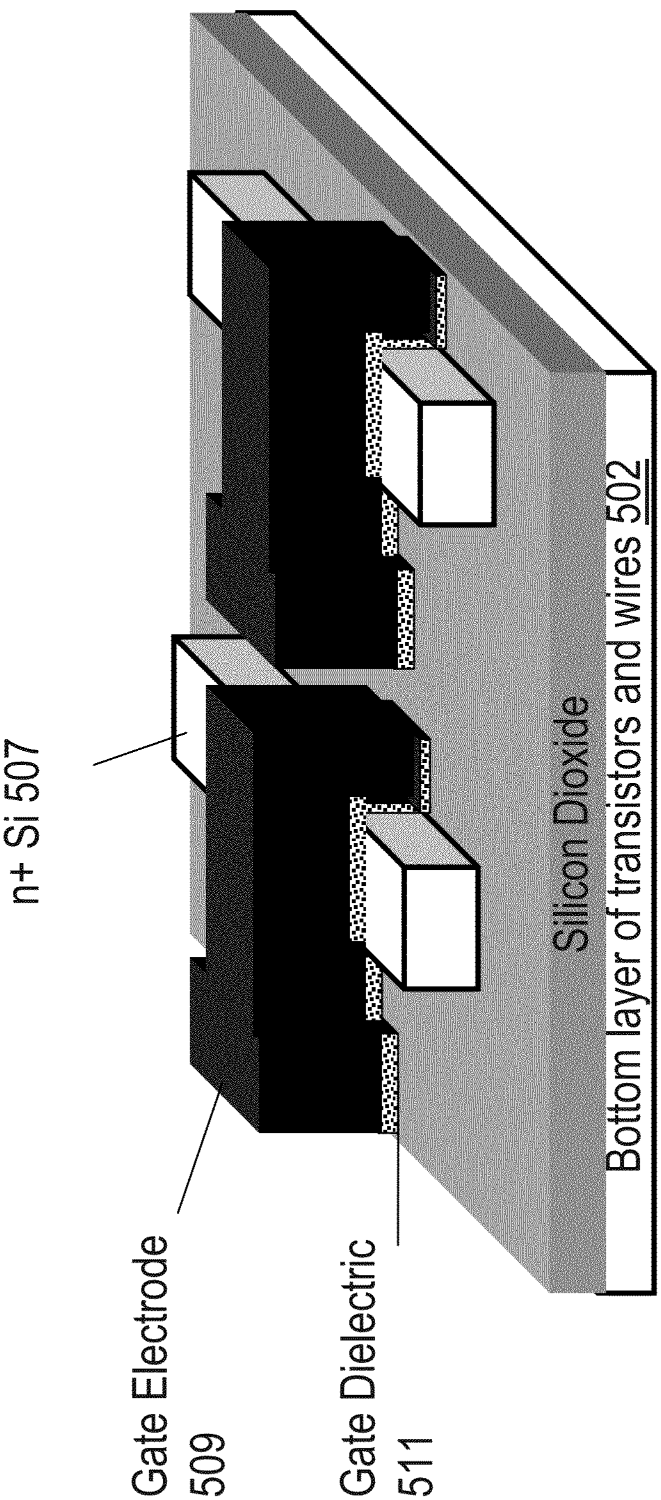

Step (E): Litho and etch are conducted to leave the gate dielectric material and the gate electrode material only in regions where gates are to be formed. FIG. 5E illustrates the structure after Step (E) is completed. Final structures of the gate dielectric material 511 and gate electrode material 509 are shown.

Figure 5F:
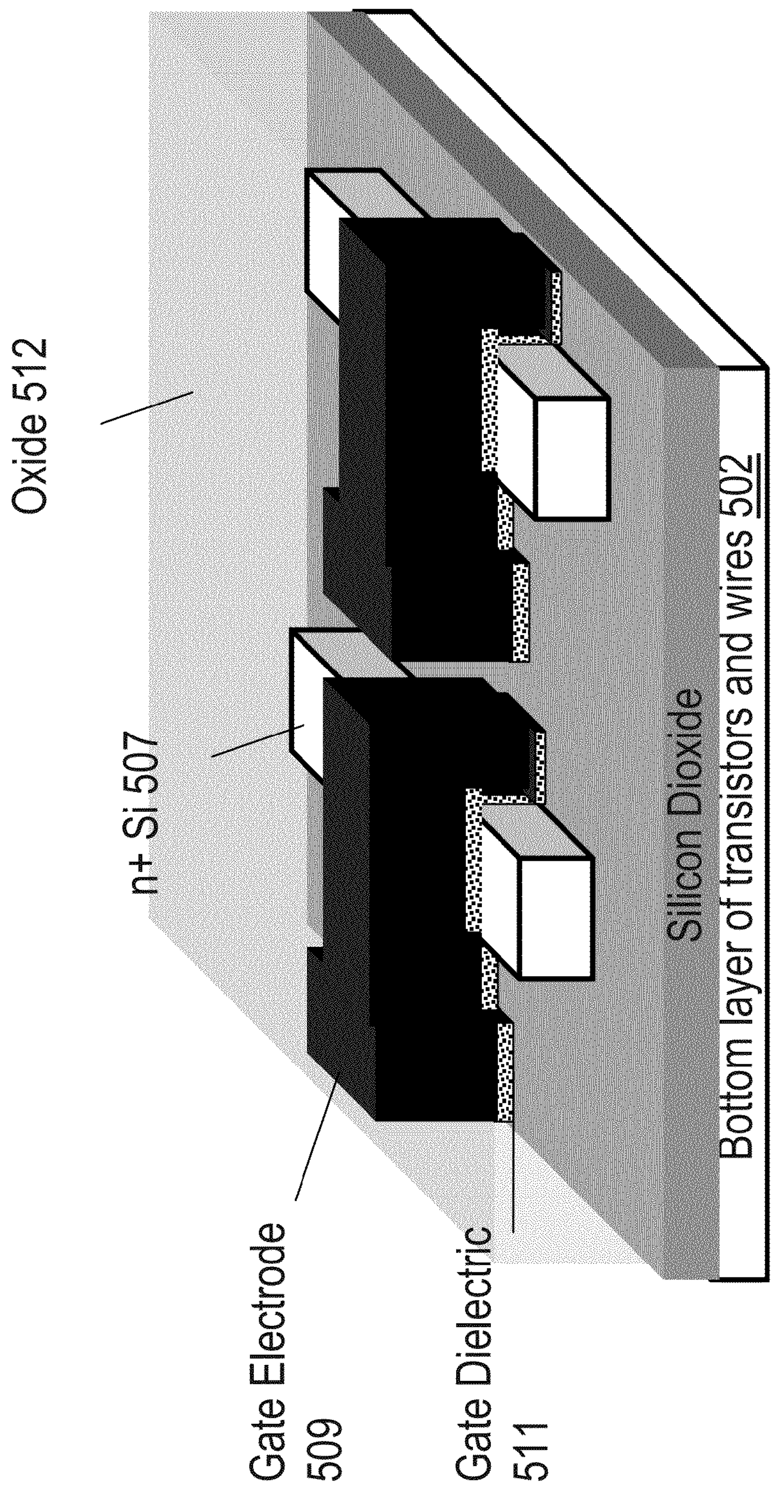

Step (F): An oxide layer 512 (illustrated nearly transparent for drawing clarity) may be deposited and polished with CMP. This oxide region serves to isolate adjacent transistors. Following this, rest of the process flow continues, where contact and wiring layers could be formed. FIG. 5F illustrates the structure after Step (F) is completed.

Note that top-level transistors are formed well-aligned to bottom-level wiring and transistor layers. Since the top-level transistor layers are made very thin (preferably less than 200 nm), the lithography equipment can see through these thin silicon layers and align to features at the bottom-level. While the process flow shown in FIG. 5A-F gives the key steps involved in forming a JLT for 3D stacked circuits and chips, it is conceivable to one skilled in the art that changes to the process can be made. For example, process steps and additional materials/regions to add strain to junction-less transistors can be added or a p+ silicon layer could be used. Furthermore, more than two layers of chips or circuits can be 3D stacked.

Figure 6A:
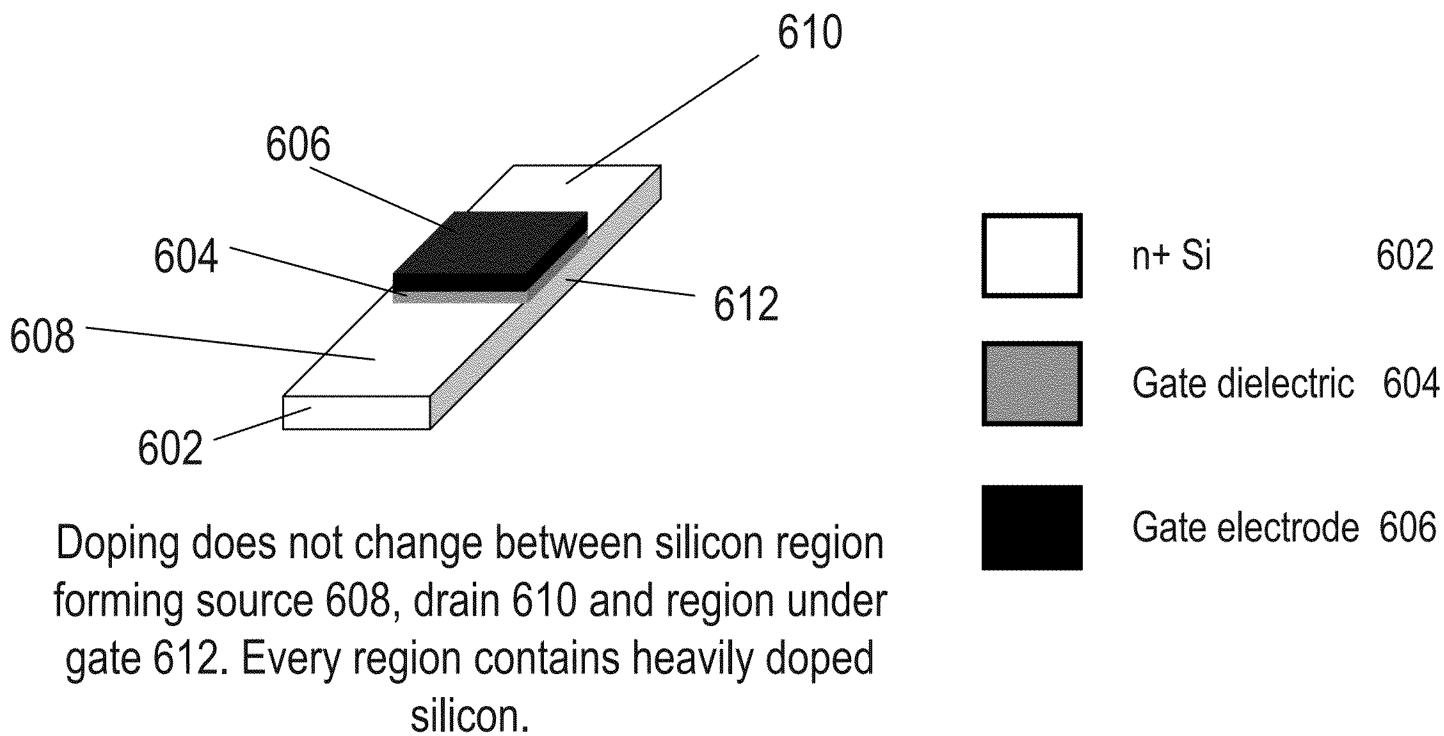
FIG. 6A-D show different types of junction-less transistors (JLT) that could be utilized for 3D stacking applications.
Figure 6B:
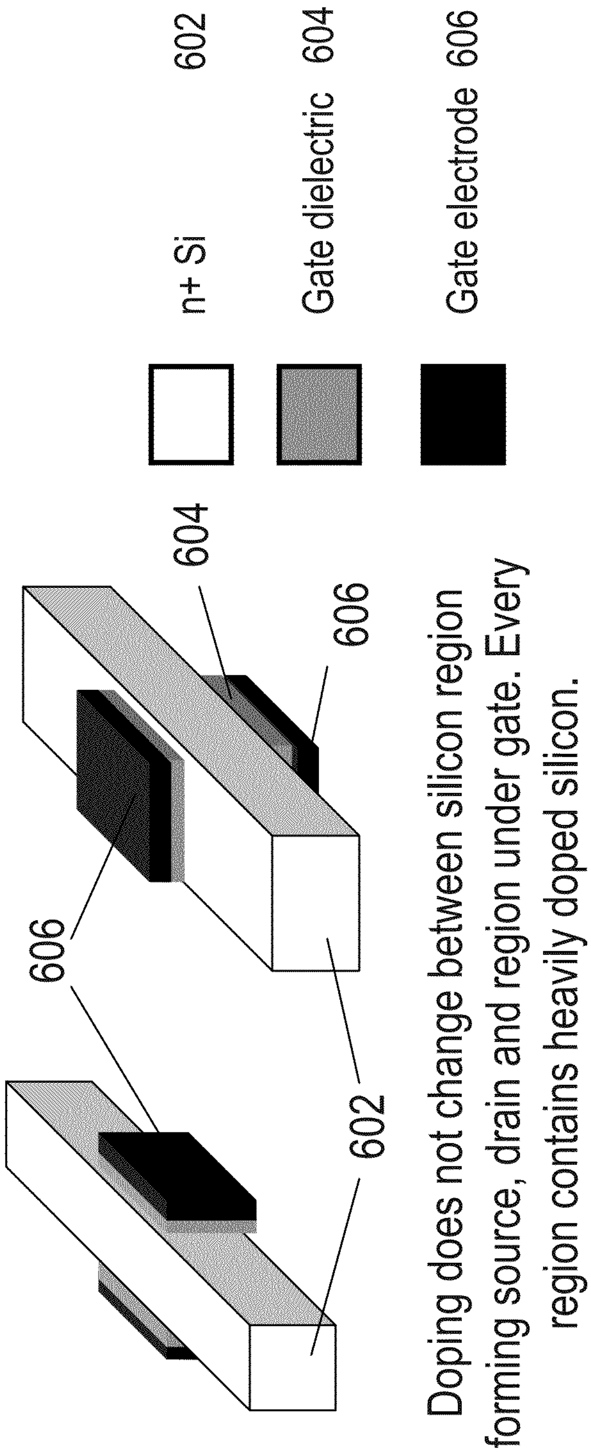
Figure 6C:
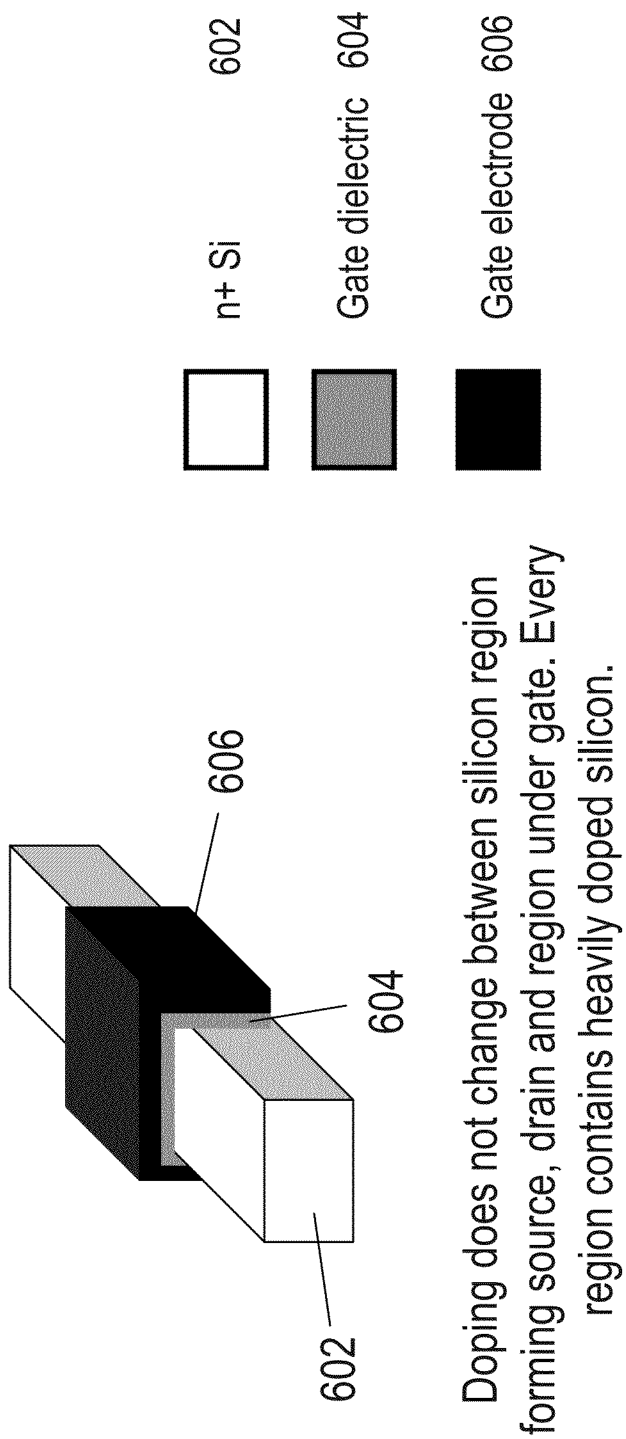
Figure 6D:
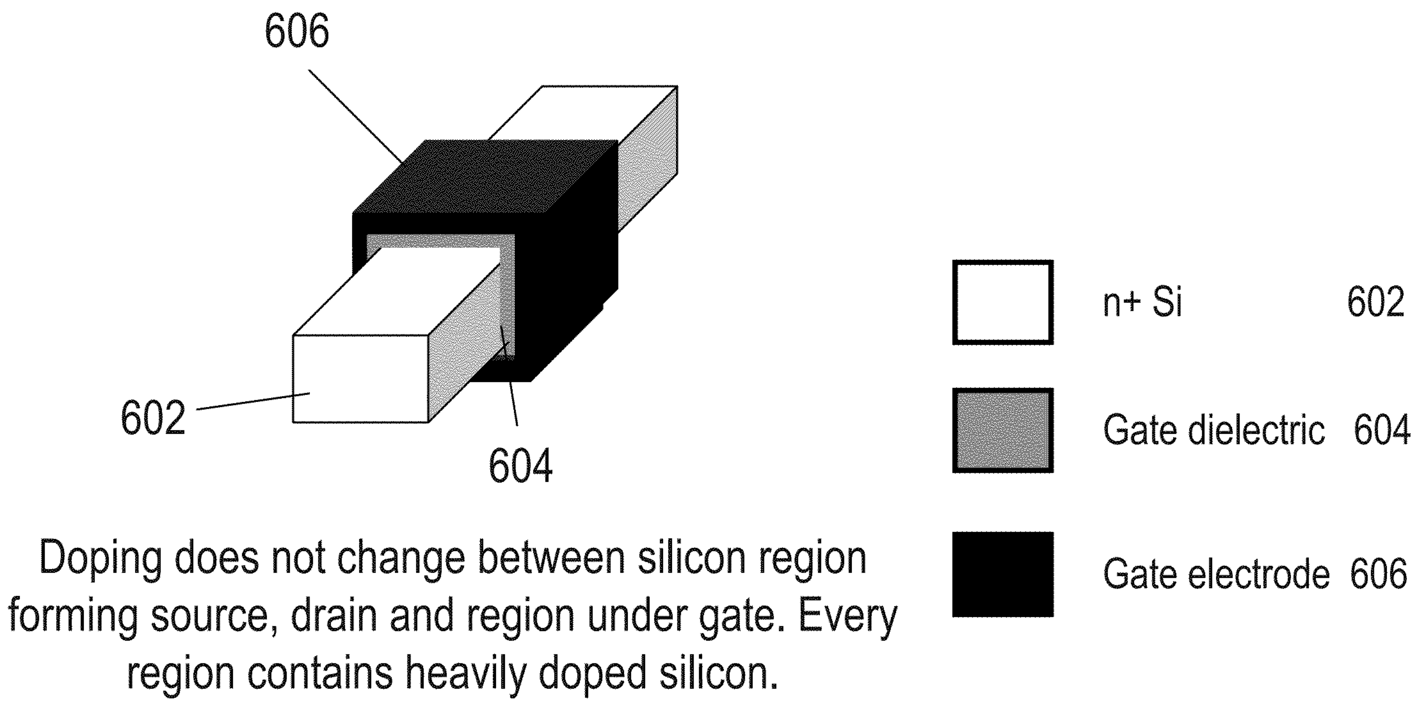

FIG. 6A-D shows that JLTs that can be 3D stacked fall into four categories based on the number of gates they use: One-side gated JLTs as shown in FIG. 6A, two-side gated JLTs as shown in FIG. 6B, three-side gated JLTs as shown in FIG. 6C, and gate-all-around JLTs as shown in FIG. 6D. JLTs may include n+ silicon region 602, gate dielectric 604, gate electrode 606, source region 608, drain region 610, and region under gate 612. The JLT shown in FIG. 5A-F falls into the three-side gated JLT category. As the number of JLT gates increases, the gate gets more control of the channel, thereby reducing leakage of the JLT at 0V. Furthermore, the enhanced gate control can be traded-off for higher doping (which improves contact resistance to source-drain regions) or bigger JLT cross-sectional areas (which may be easier from a process integration standpoint). However, adding more gates typically increases process complexity.

Figure 7A:
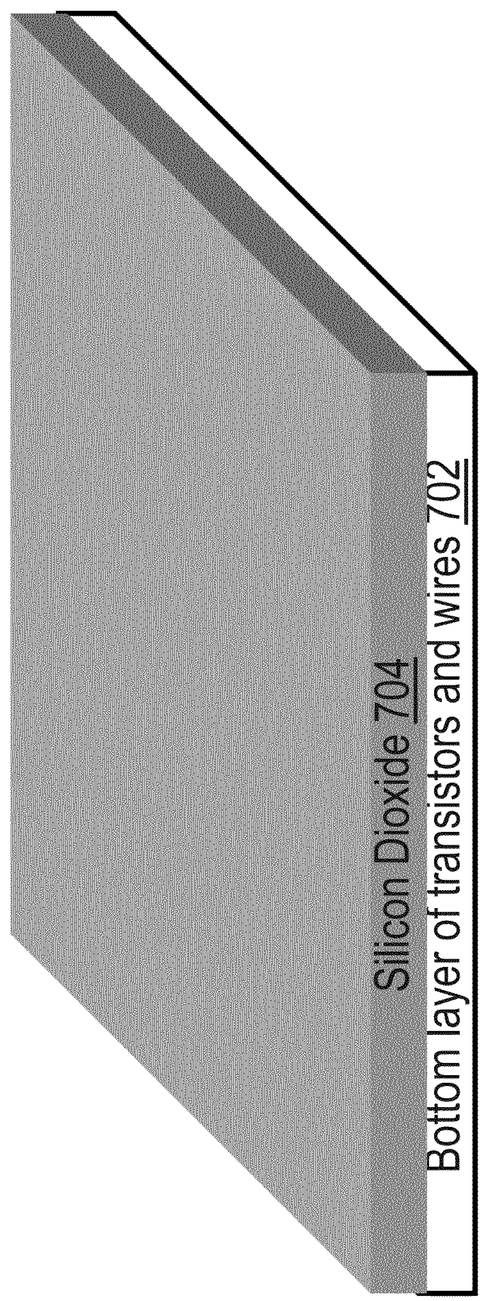
FIG. 7A-F shows a process flow for constructing 3D stacked logic chips using one-side gated junction-less transistors as switches.

FIG. 7A-F describes a process flow for using one-side gated JLTs as building blocks of 3D stacked circuits and chips. The process flow may include several steps as described in the following sequence:

Step (A): The bottom layer of the two chip 3D stack may be processed with transistors and wires. This is indicated in the figure as bottom layer of transistors and wires 702. Above this, a silicon dioxide layer 704 may be deposited. FIG. 7A illustrates the structure after Step (A) is completed.

Figure 7B:
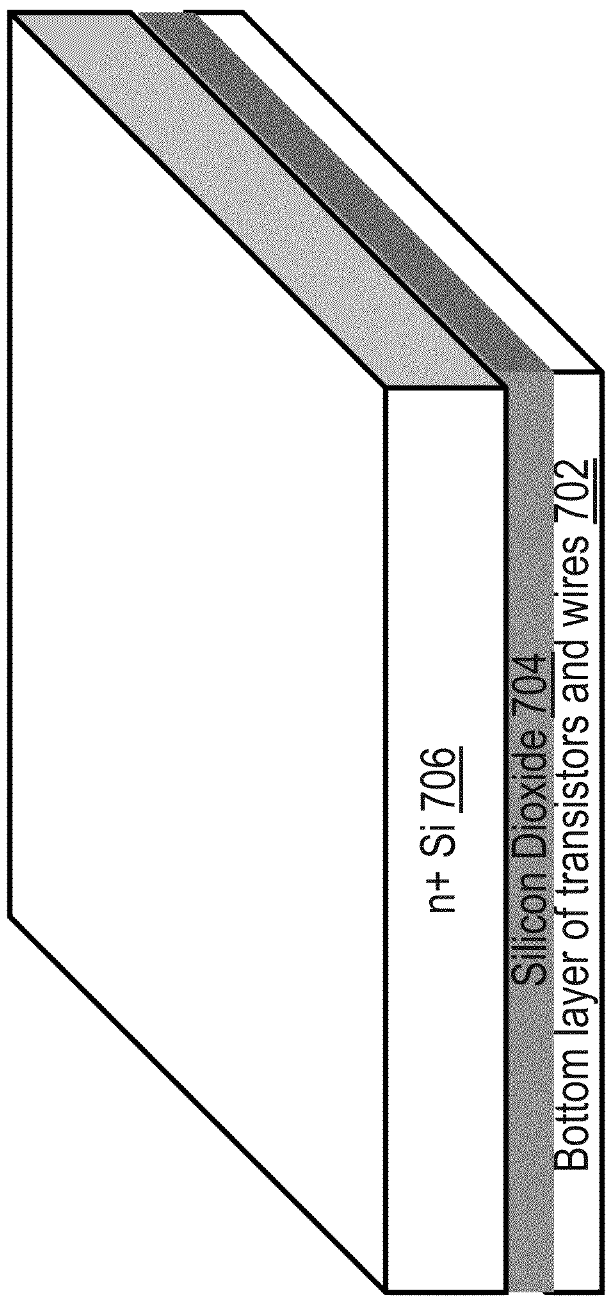

Step (B): A layer of n+ Si 706, which may be a conductive or semi-conductive layer that was implanted and high temperature activated, may be transferred atop the structure shown after Step (A). The process shown in FIG. 2A-E may be utilized for this purpose as was presented with respect to FIG. 5. FIG. 7B illustrates the structure after Step (B) is completed.

Figure 7C:
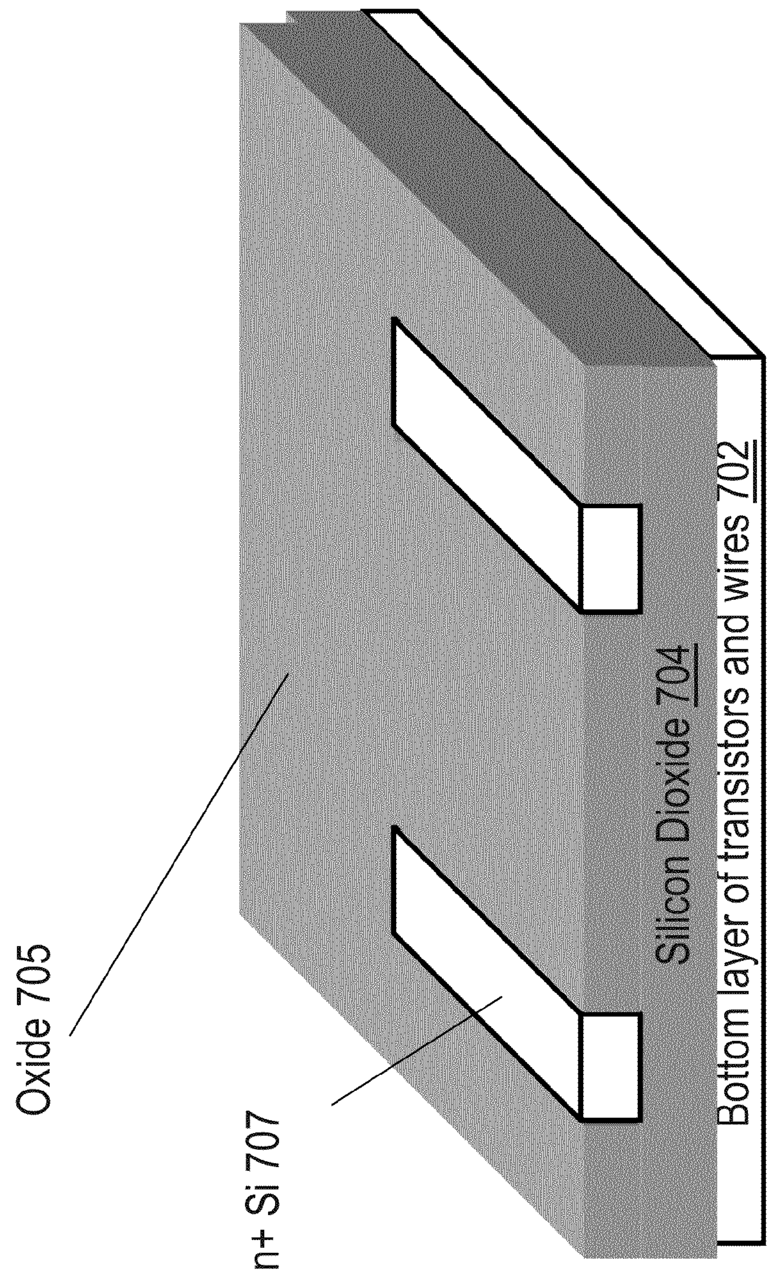

Step (C): Using lithography (litho) and etch, the n+ Si layer 706 may be defined and may be present only in regions where transistors are to be constructed. An oxide 705 may be deposited (for isolation purposes) with a standard shallow-trench-isolation process. The n+ Si structure remaining after Step (C) may be indicated as n+ Si 707. FIG. 7C illustrates the structure after Step (C) is completed.

Figure 7D:
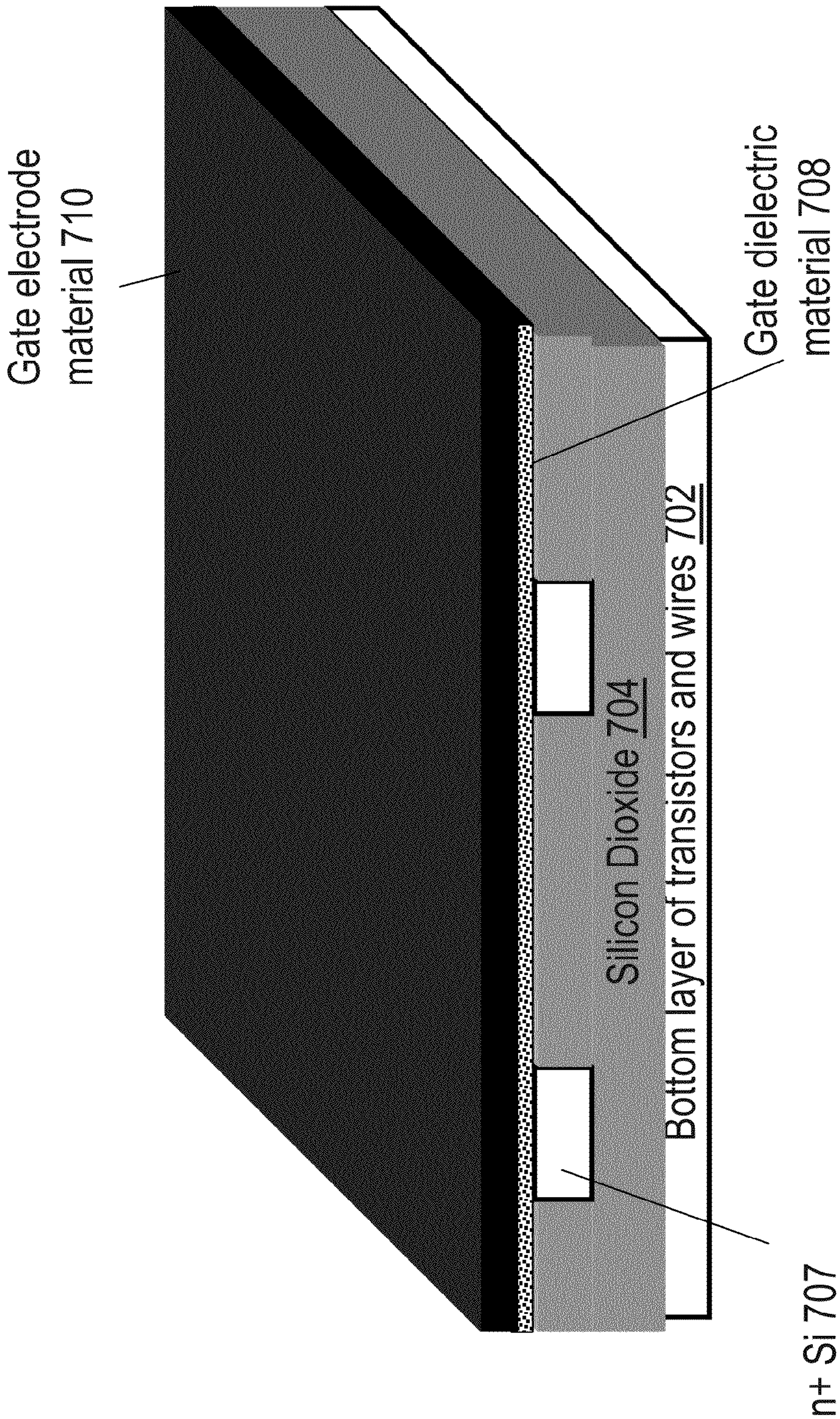

Step (D): The gate dielectric material 708 and the gate electrode material 710 are deposited. The gate dielectric material 708 could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. FIG. 7D illustrates the structure after Step (D) is completed.

Figure 7E:
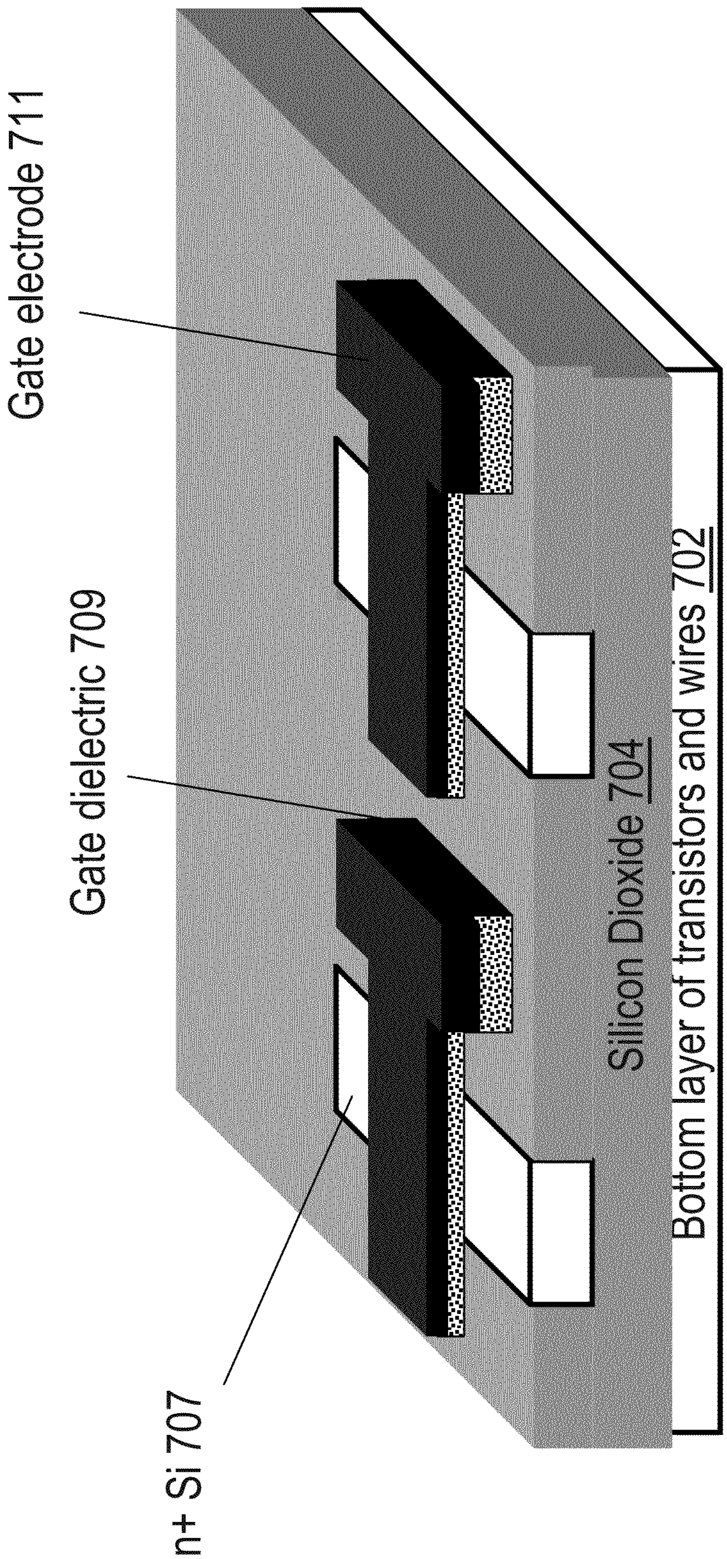

Step (E): Litho and etch are conducted to leave the gate dielectric material 708 and the gate electrode material 710 only in regions where gates are to be formed. It may be clear based on the schematic that the gate may be present on just one side of the JLT. Structures remaining after Step (E) are gate dielectric 709 and gate electrode 711. FIG. 7E illustrates the structure after Step (E) is completed.

Figure 7F:
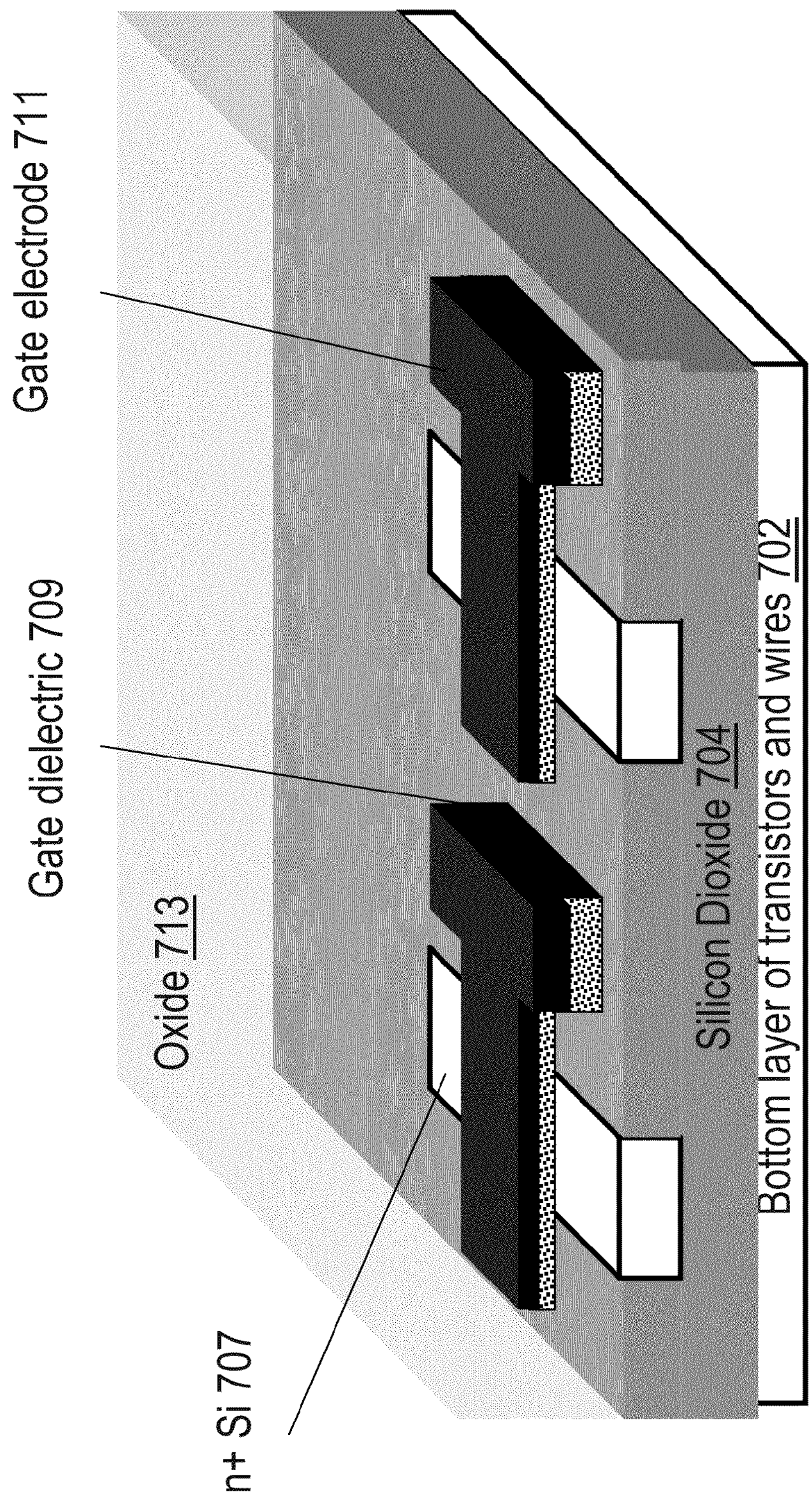

Step (F): An oxide layer 713 may be deposited and polished with CMP. FIG. 7F illustrates the structure after Step (F) is completed. Following this, rest of the process flow continues, with contact and wiring layers being formed.

Note that top-level transistors are formed well-aligned to bottom-level wiring and transistor layers. Since the top-level transistor layers are made very thin (preferably less than 200 nm), the lithography equipment can see through these thin silicon layers and align to features at the bottom-level. While the process flow shown in FIG. 7A-F illustrates several steps involved in forming a one-side gated JLT for 3D stacked circuits and chips, it is conceivable to one skilled in the art that changes to the process can be made. For example, process steps and additional materials/regions to add strain to junction-less transistors can be added. Furthermore, more than two layers of chips or circuits can be 3D stacked.

Figure 8A:
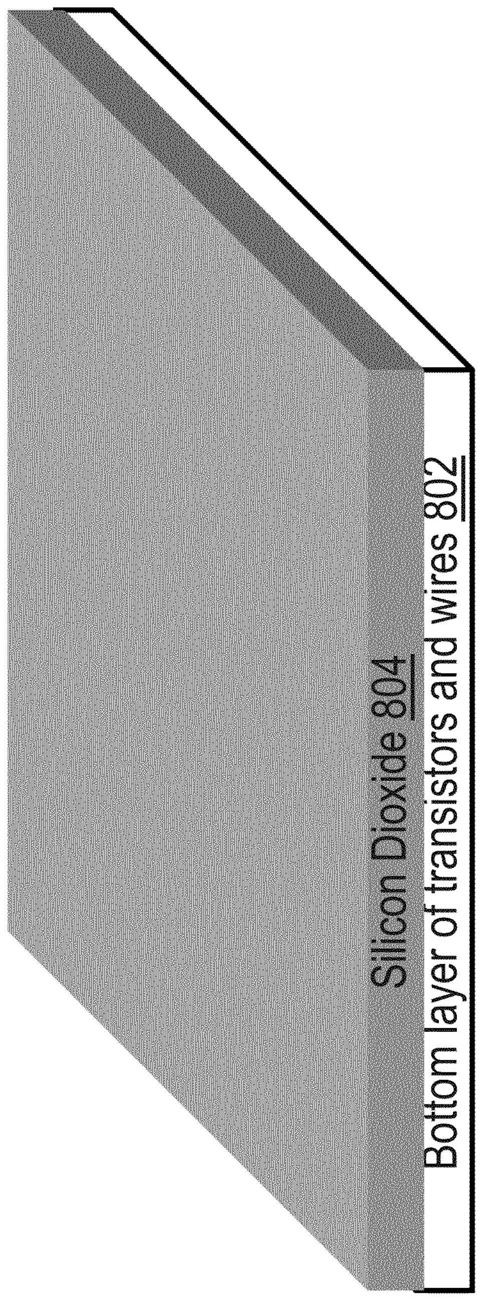
FIG. 8A-E shows a process flow for constructing 3D stacked logic chips using two-side gated junction-less transistors as switches.

FIG. 8A-E describes a process flow for forming 3D stacked circuits and chips using two side gated JLTs. The process flow may include several steps, as described in the following sequence:

Step (A): The bottom layer of the 2 chip 3D stack may be processed with transistors and wires. This may be indicated in the figure as bottom layer of transistors and wires 802. Above this, a silicon dioxide layer 804 may be deposited. FIG. 8A shows the structure after Step (A) is completed.

Figure 8B:
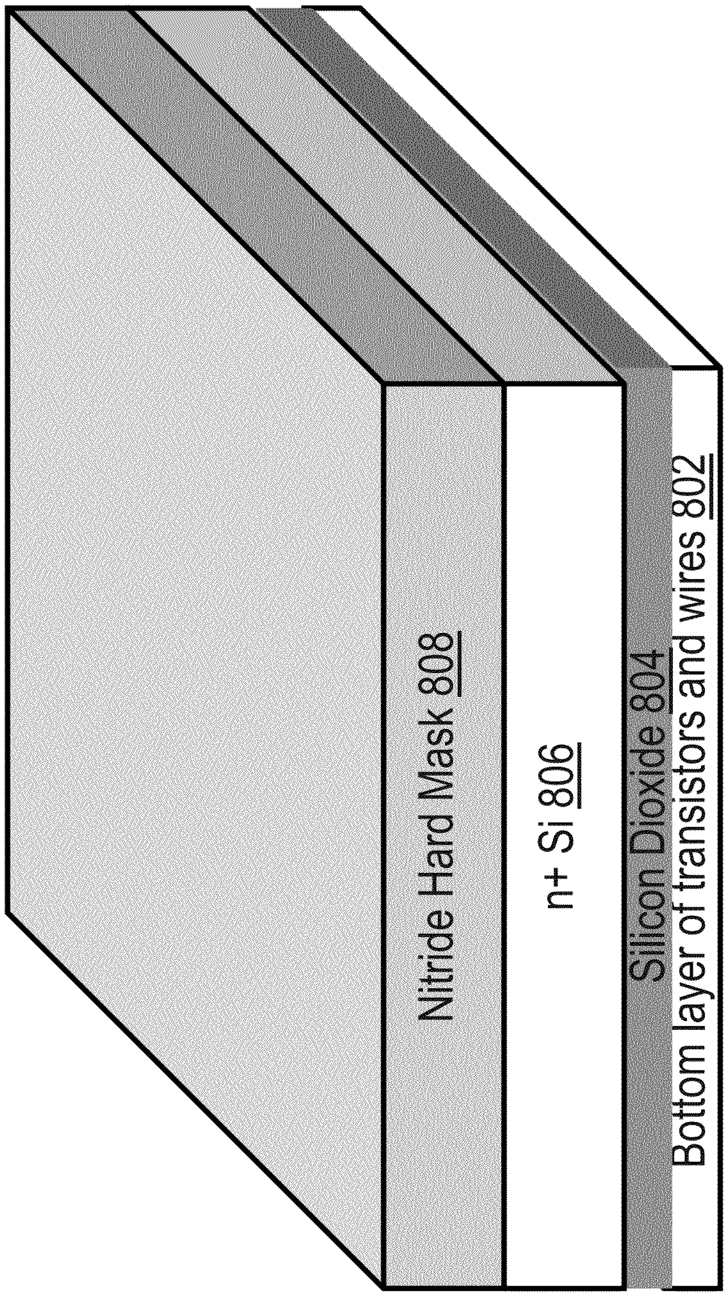

Step (B): A layer of n+ Si 806, which may be a conductive or semi-conductive layer that was implanted and high temperature activated, may be transferred atop the structure shown after Step (A). The process shown in FIG. 2A-E may be utilized for this purpose as was presented with respect to FIG. 5A-F. A nitride (or oxide) layer 808 may be deposited to function as a hard mask for later processing. FIG. 8B illustrates the structure after Step (B) is completed.

Figure 8C:
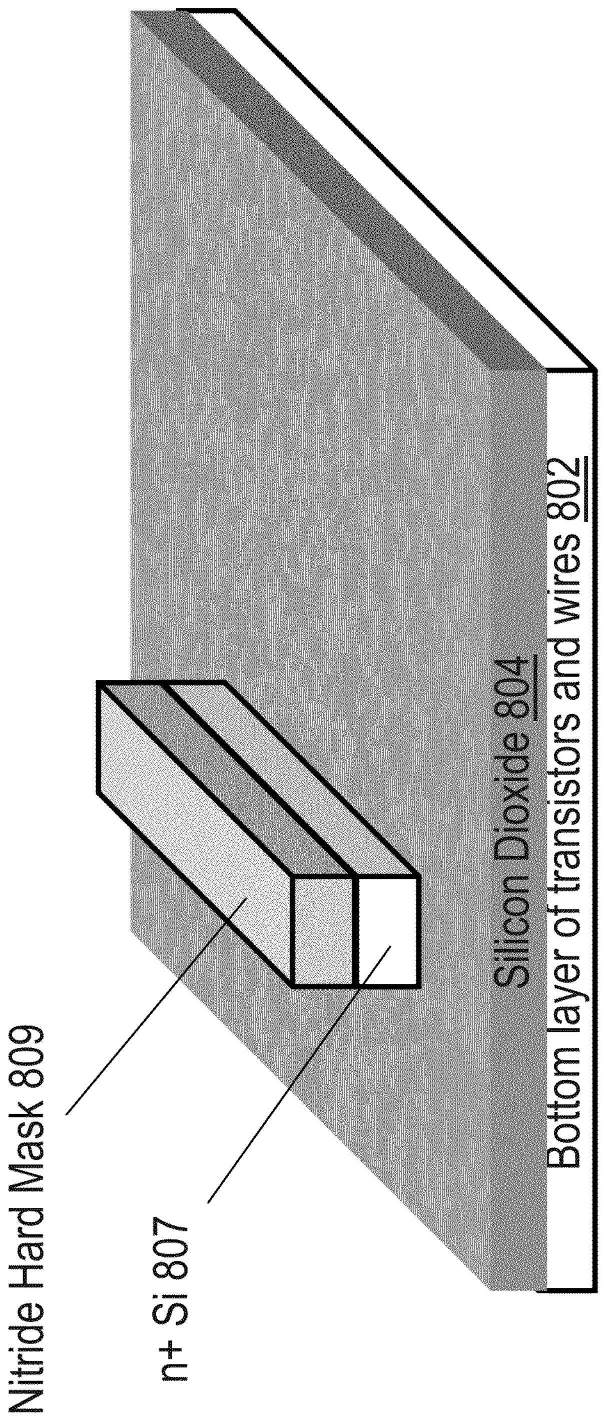

Step (C): Using lithography (litho) and etch, the nitride layer 808 and n+ Si layer 806 are defined and are present only in regions where transistors are to be constructed. The nitride and n+ Si structures remaining after Step (C) are indicated as nitride hard mask 809 and n+ Si 807. FIG. 8C illustrates the structure after Step (C) is completed.

Figure 8D:
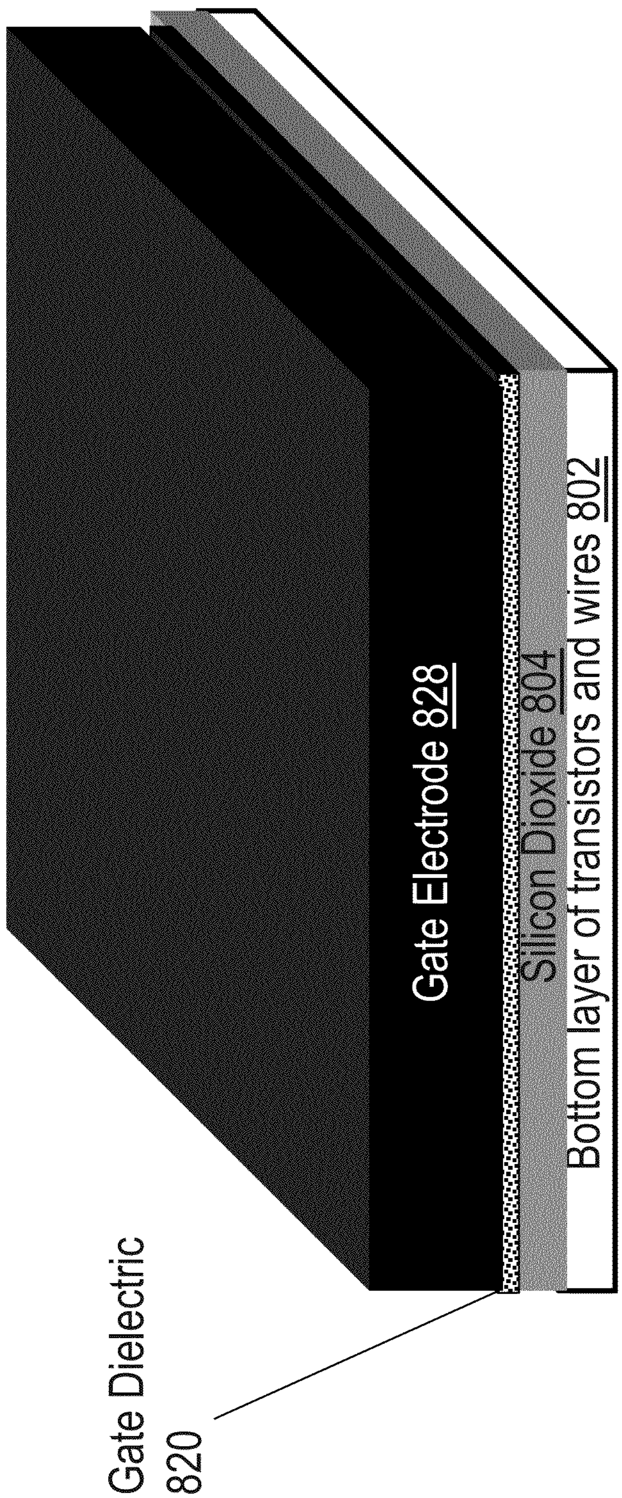

Step (D): The gate dielectric material 820 and the gate electrode material 828 are deposited. The gate dielectric material 820 could be hafnium oxide. Alternatively, silicon dioxide can be used. Other types of gate dielectric materials such as Zirconium oxide can be utilized as well. The gate electrode material 828 could be Titanium Nitride. Alternatively, other materials such as TaN, W, Ru, TiAlN, polysilicon could be used. FIG. 8D illustrates the structure after Step (D) is completed.

Figure 8E:
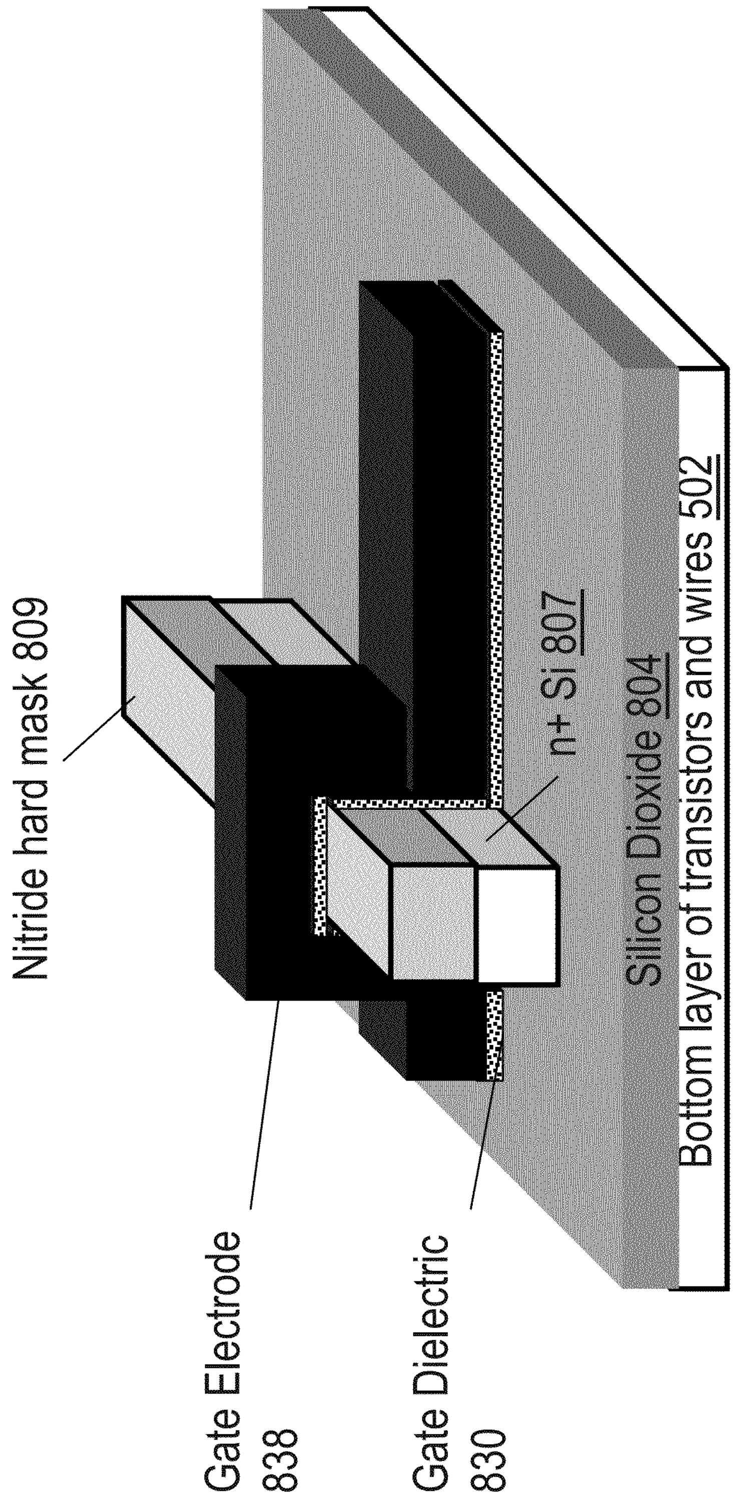

Step (E): Litho and etch are conducted to leave the gate dielectric material 820 and the gate electrode material 828 only in regions where gates are to be formed. Structures remaining after Step (E) are gate dielectric 830 and gate electrode 838. FIG. 8E illustrates the structure after Step (E) is completed.

Note that top-level transistors are formed well-aligned to bottom-level wiring and transistor layers. Since the top-level transistor layers are made very thin (preferably less than 200 nm), the lithography equipment can see through these thin silicon layers and align to features at the bottom-level. While the process flow shown in FIG. 8A-E gives the key steps involved in forming a two side gated JLT for 3D stacked circuits and chips, it is conceivable to one skilled in the art that changes to the process can be made. For example, process steps and additional materials/regions to add strain to junction-less transistors can be added. Furthermore, more than two layers of chips or circuits can be 3D stacked. An important note in respect to the JLT devices been presented may be that the layer transferred used for the construction may a thin layer of less than about 200 nm and in many applications even less than about 40 nm. This may be achieved by the depth of the implant of the H+ layer used for the ion-cut and by following this by thinning using etch and/or CMP.

Figure 9A:
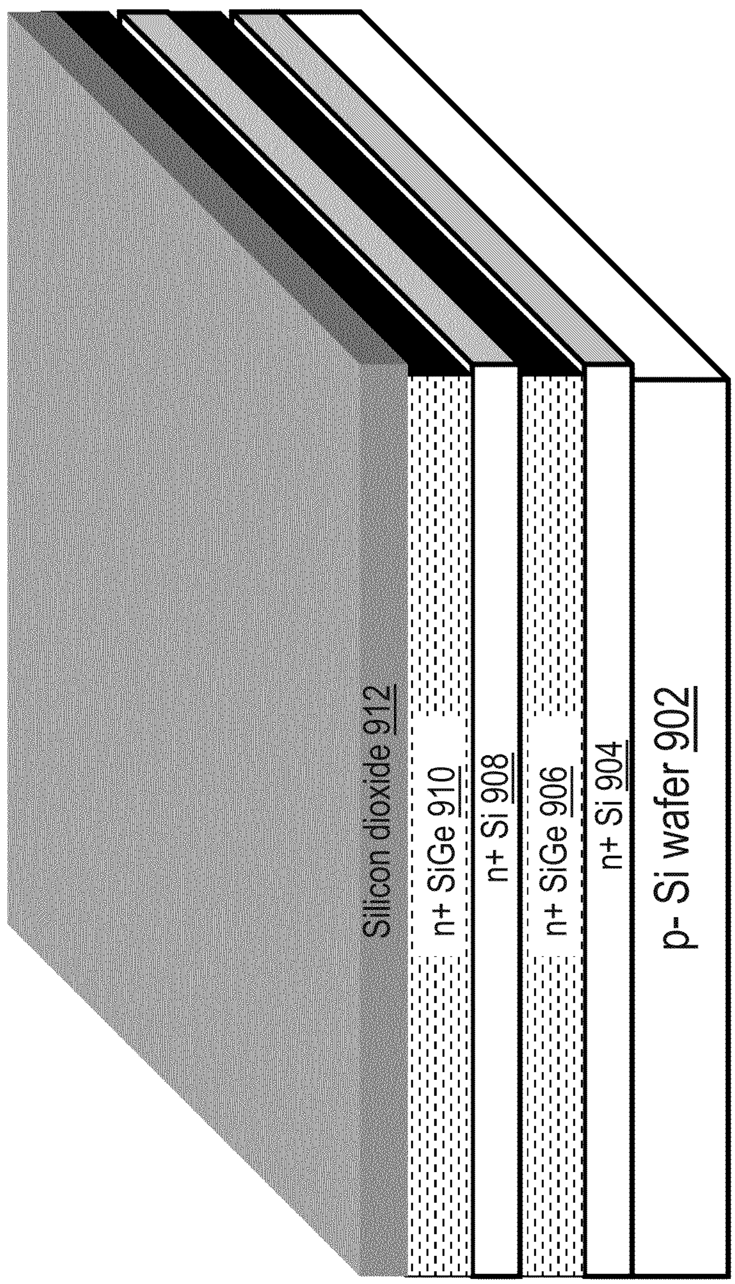
FIG. 9A-V show process flows for constructing 3D stacked logic chips using four-side gated junction-less transistors as switches.

FIG. 9A-J describes a process flow for forming four-side gated JLTs in 3D stacked circuits and chips. Four-side gated JLTs can also be referred to as gate-all around JLTs or silicon nanowire JLTs. They offer excellent electrostatic control of the channel and provide high-quality I-V curves with low leakage and high drive currents. The process flow in FIG. 9A-J may include several steps in the following sequence:

Step (A): On a p− Si wafer 902, multiple n+ Si layers 904 and 908 and multiple n+ SiGe layers 906 and 910 are epitaxially grown. The Si and SiGe layers are carefully engineered in terms of thickness and stoichiometry to keep defect density due to lattice mismatch between Si and SiGe low. Some techniques for achieving this include keeping thickness of SiGe layers below the critical thickness for forming defects. A silicon dioxide layer 912 may be deposited above the stack. FIG. 9A illustrates the structure after Step (A) is completed.

Figure 9B:
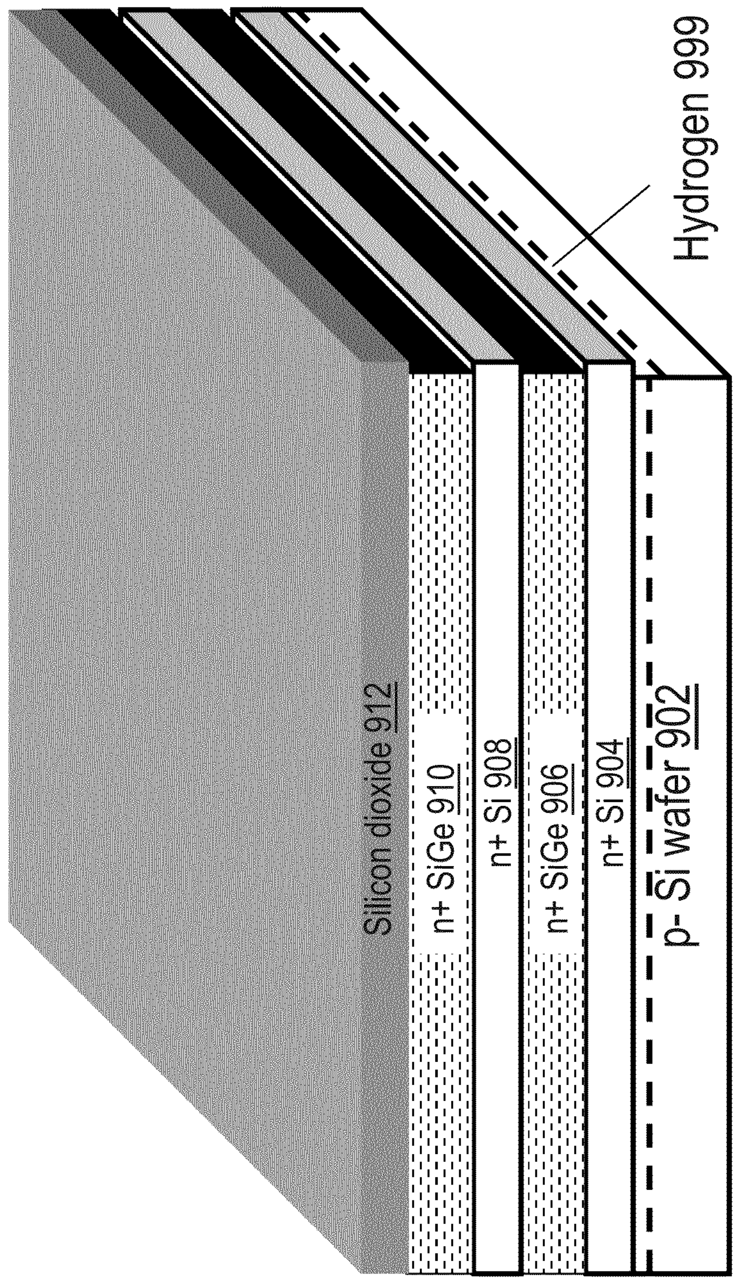

Step (B): Hydrogen may be implanted at a certain depth in the p− wafer, to form a cleave plane 999 after bonding to bottom wafer of the two-chip stack. Alternatively, some other atomic species such as He can be used. FIG. 9B illustrates the structure after Step (B) is completed.

Figure 9C:
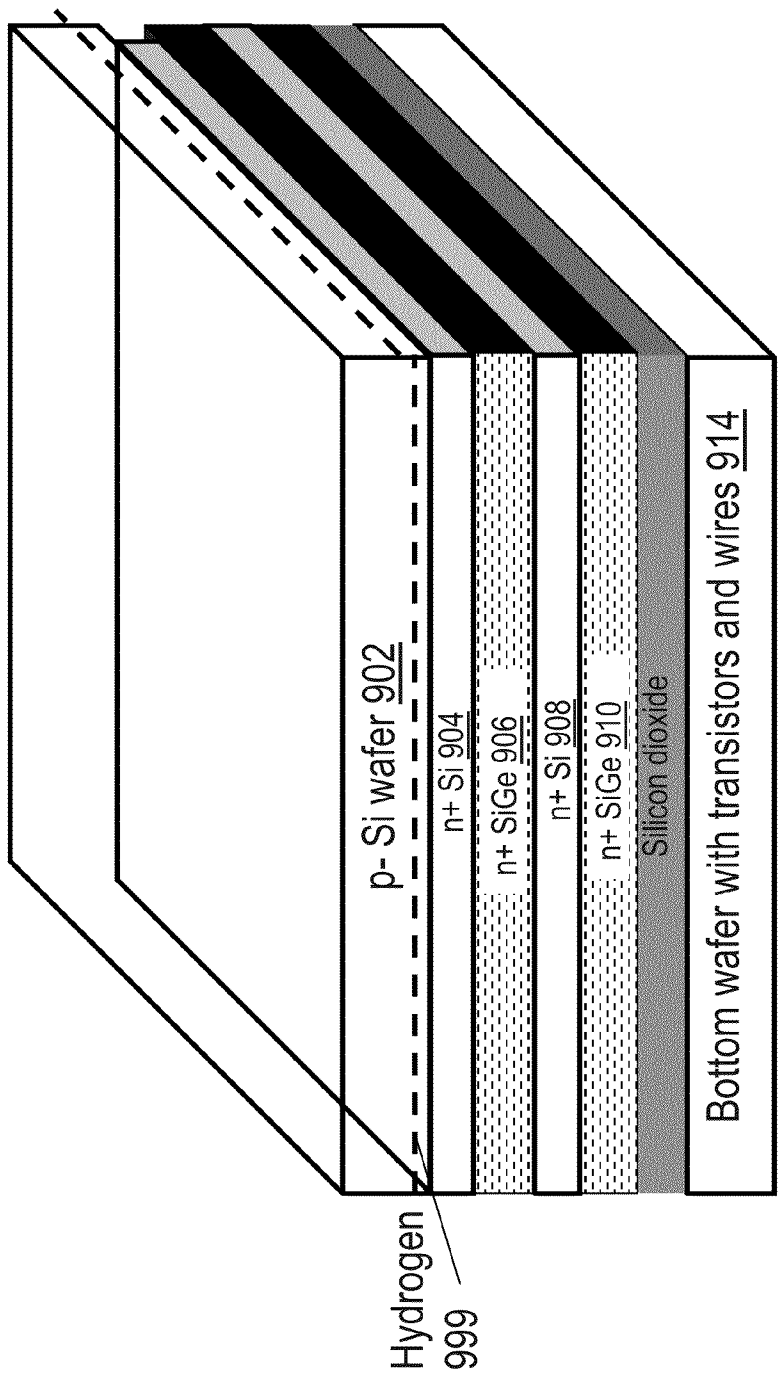

Step (C): The structure after Step (B) may be flipped and bonded to another wafer on which bottom layers of transistors and wires 914 are constructed. Bonding occurs with an oxide-to-oxide bonding process. FIG. 9C illustrates the structure after Step (C) is completed.

Figure 9D:
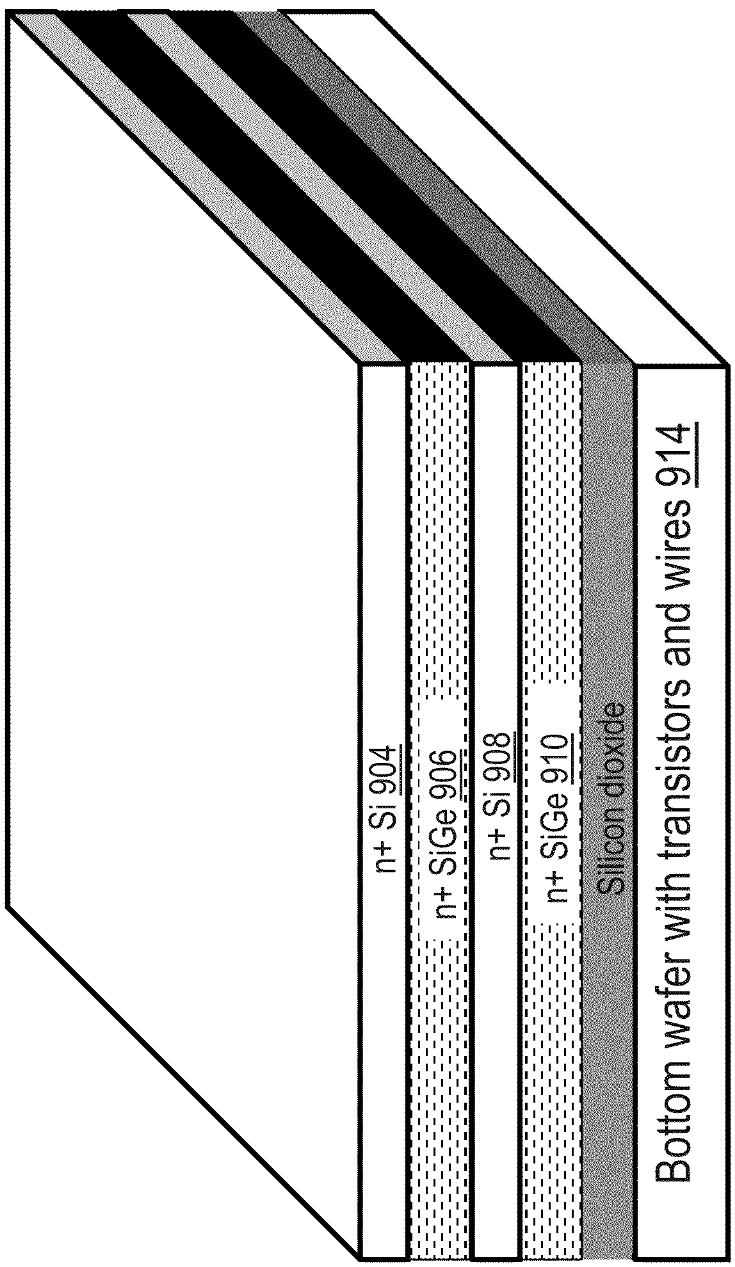

Step (D): A cleave process occurs at the hydrogen plane using a sideways mechanical force. Alternatively, an anneal could be used for cleaving purposes. A CMP process may be conducted till one reaches the n+ Si layer 904. FIG. 9D illustrates the structure after Step (D) is completed.

Figure 9E:
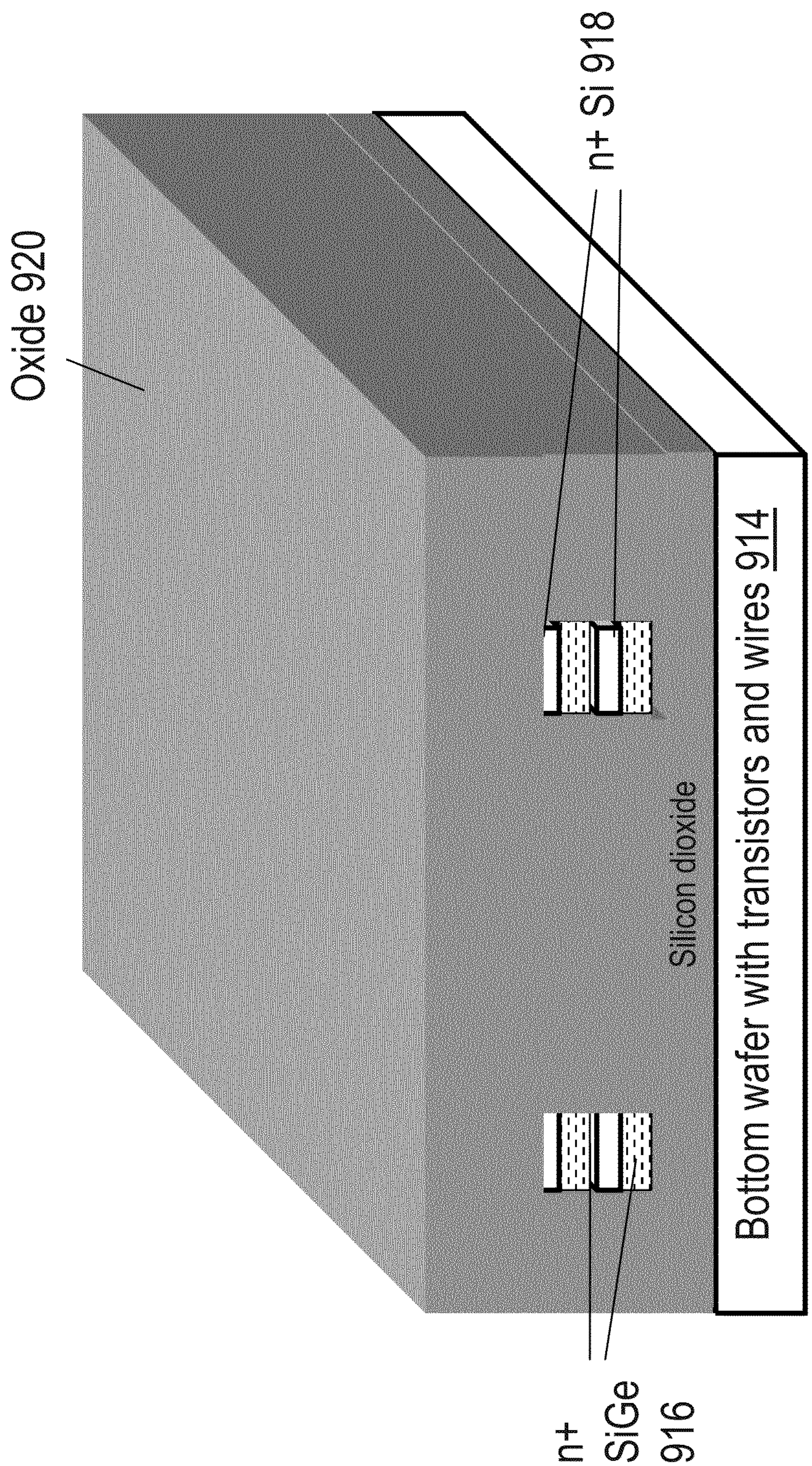

Step (E): Using litho and etch, Si regions 918 and SiGe regions 916 are defined to be in locations where transistors are desired. An isolating material, such as oxide, may be deposited to form isolation regions 920 and to cover the Si regions 918 and SiGe regions 916. A CMP process may be conducted. FIG. 9E illustrates the structure after Step (E) is completed.

Figure 9F:
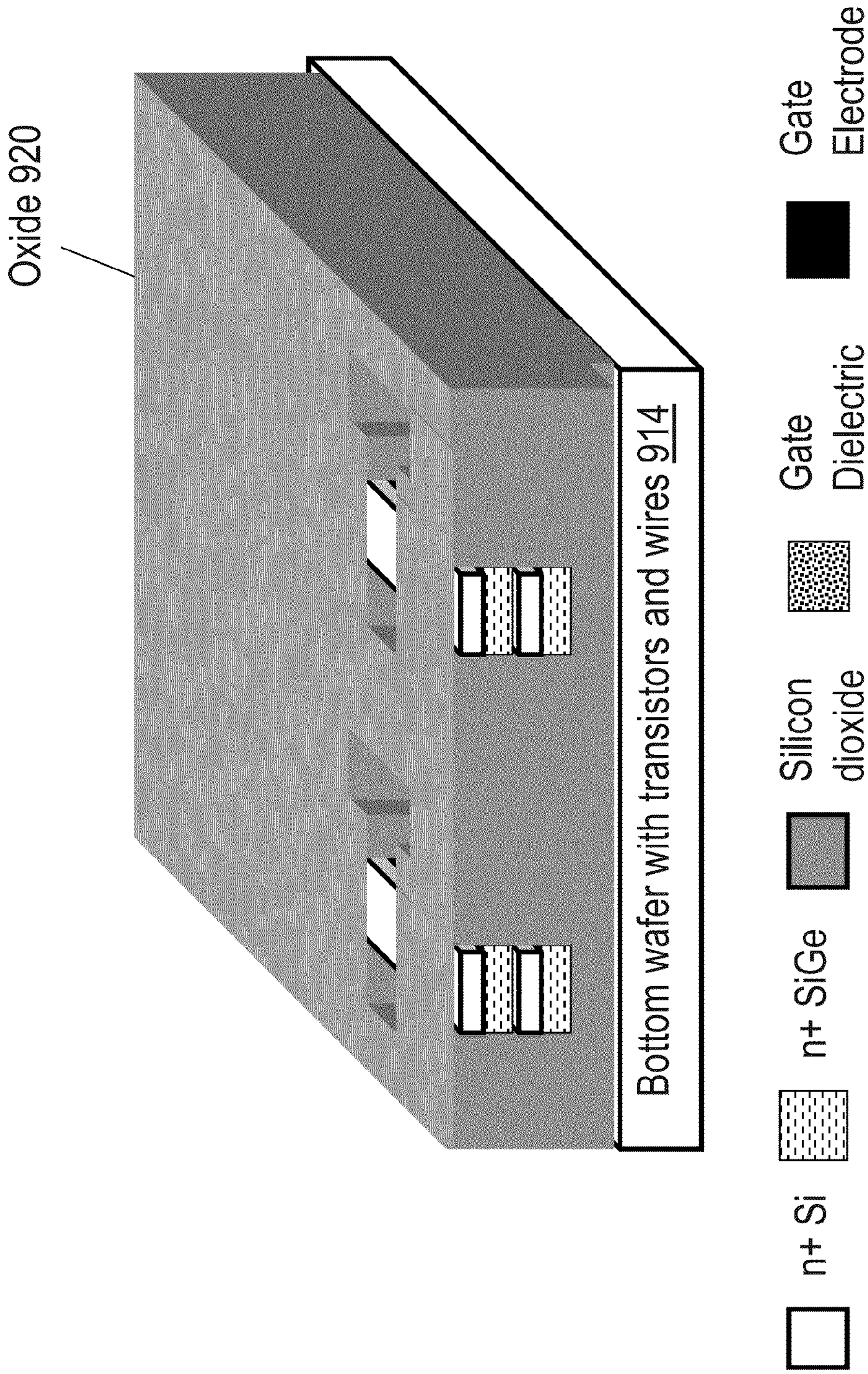

Step (F): Using litho and etch, isolation regions 920 are removed in locations where a gate needs to be present. It may be clear that Si regions 918 and SiGe regions 916 are exposed in the channel region of the MT. FIG. 9F illustrates the structure after Step (F) is completed.

Figure 9G:
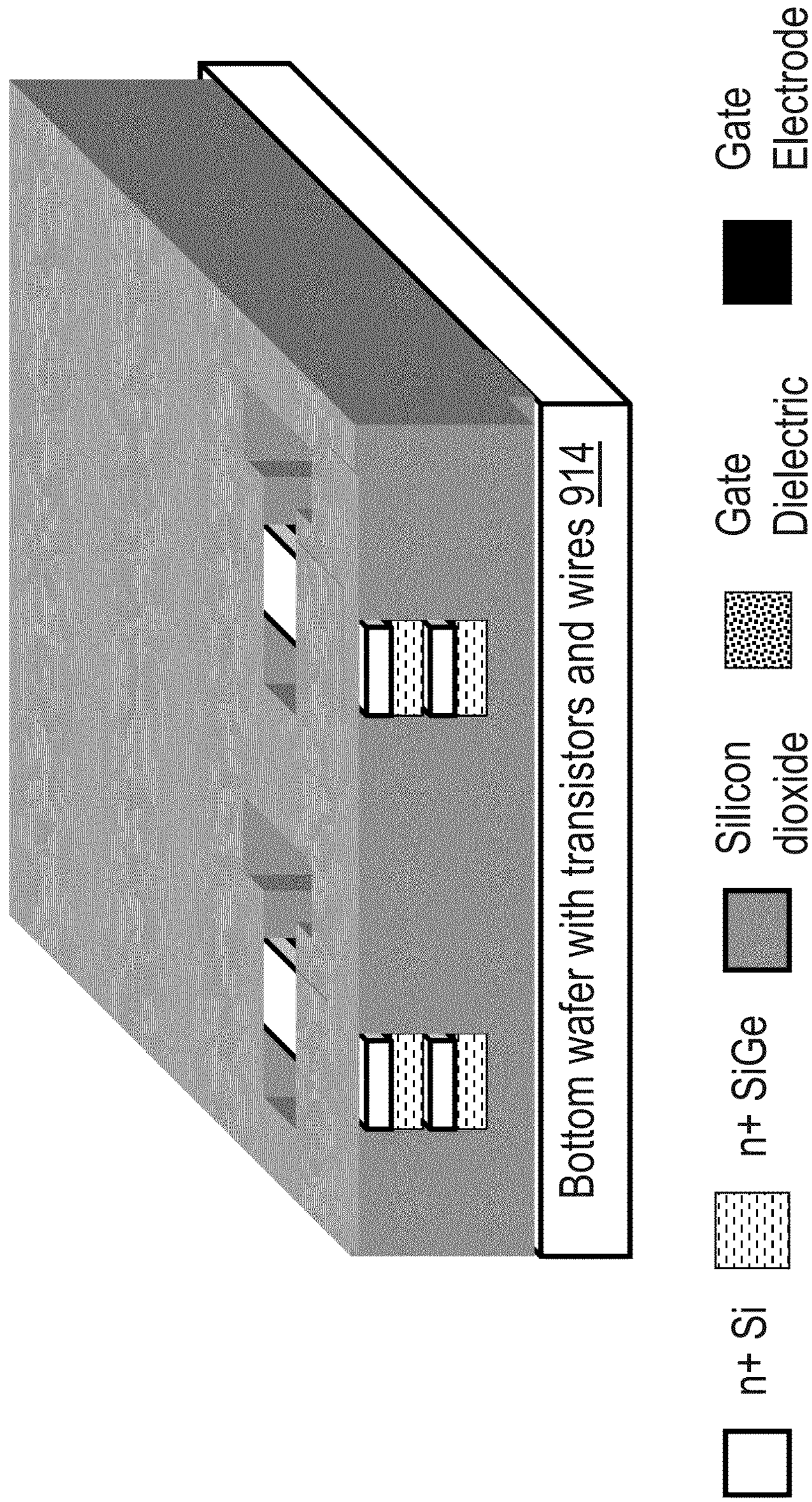

Step (G): SiGe regions 916 in channel of the JLT are etched using an etching recipe that does not attack Si regions 918. Such etching recipes are described in "High performance 5 nm radius twin silicon nanowire MOSFET(TSNWFET): Fabrication on bulk Si wafer, characteristics, and reliability," in *Proc. IEDMTech. Dig.,* 2005, pp. 717-720 by S. D. Suk, S.-Y. Lee, S.-M. Kim, et al. ("Suk"). FIG. 9G illustrates the structure after Step (G) is completed.

Figure 9H:
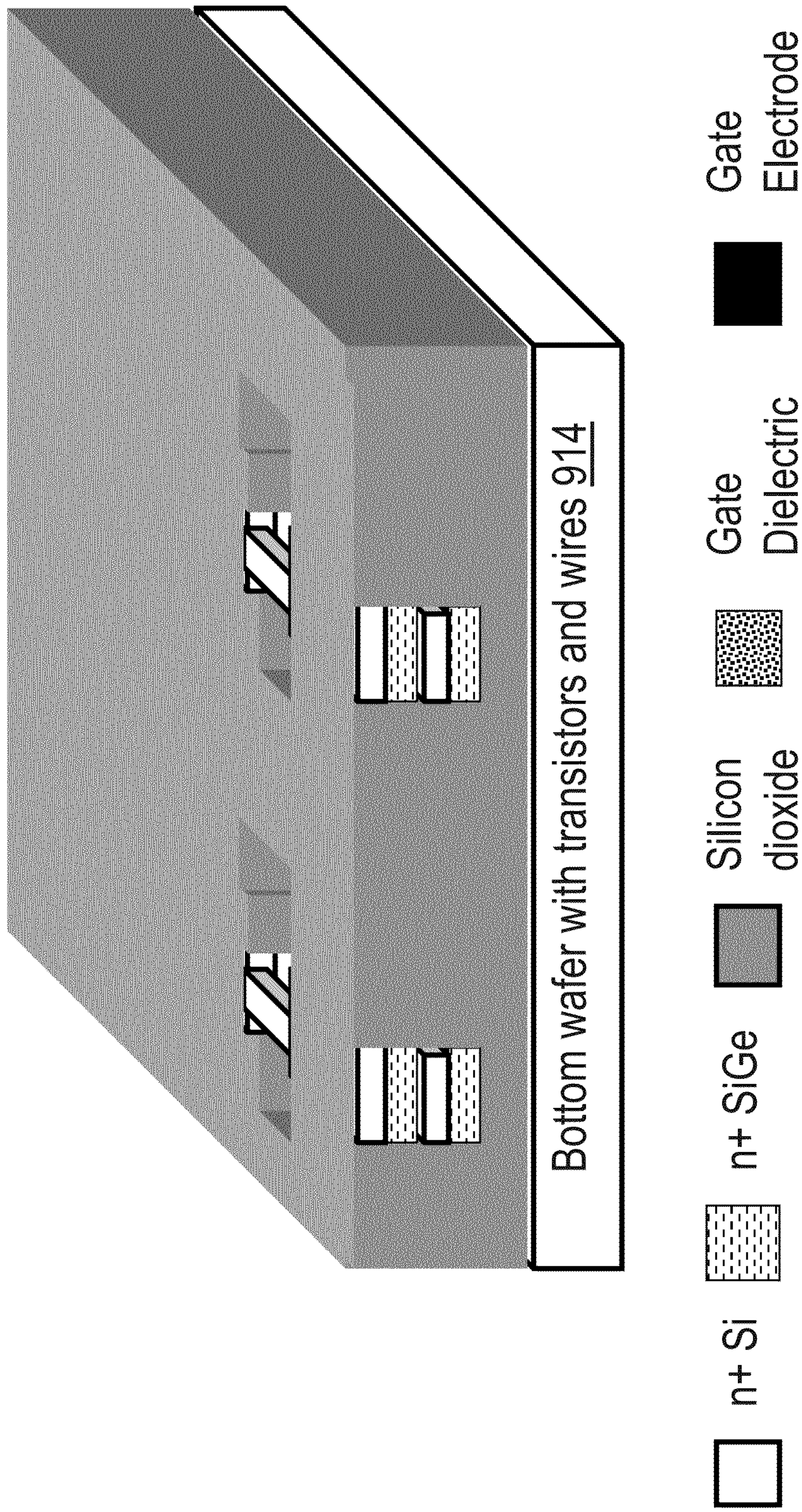

Step (H): For example, a hydrogen anneal can be utilized to reduce surface roughness of fabricated nanowires. The hydrogen anneal can also reduce thickness of nanowires. Following the hydrogen anneal, another optional step of oxidation (using plasma enhanced thermal oxidation) and etch-back of the produced silicon dioxide can be used. This process thins down the silicon nanowire further. FIG. 9H illustrates the structure after Step (H) is completed.

Figure 9I:
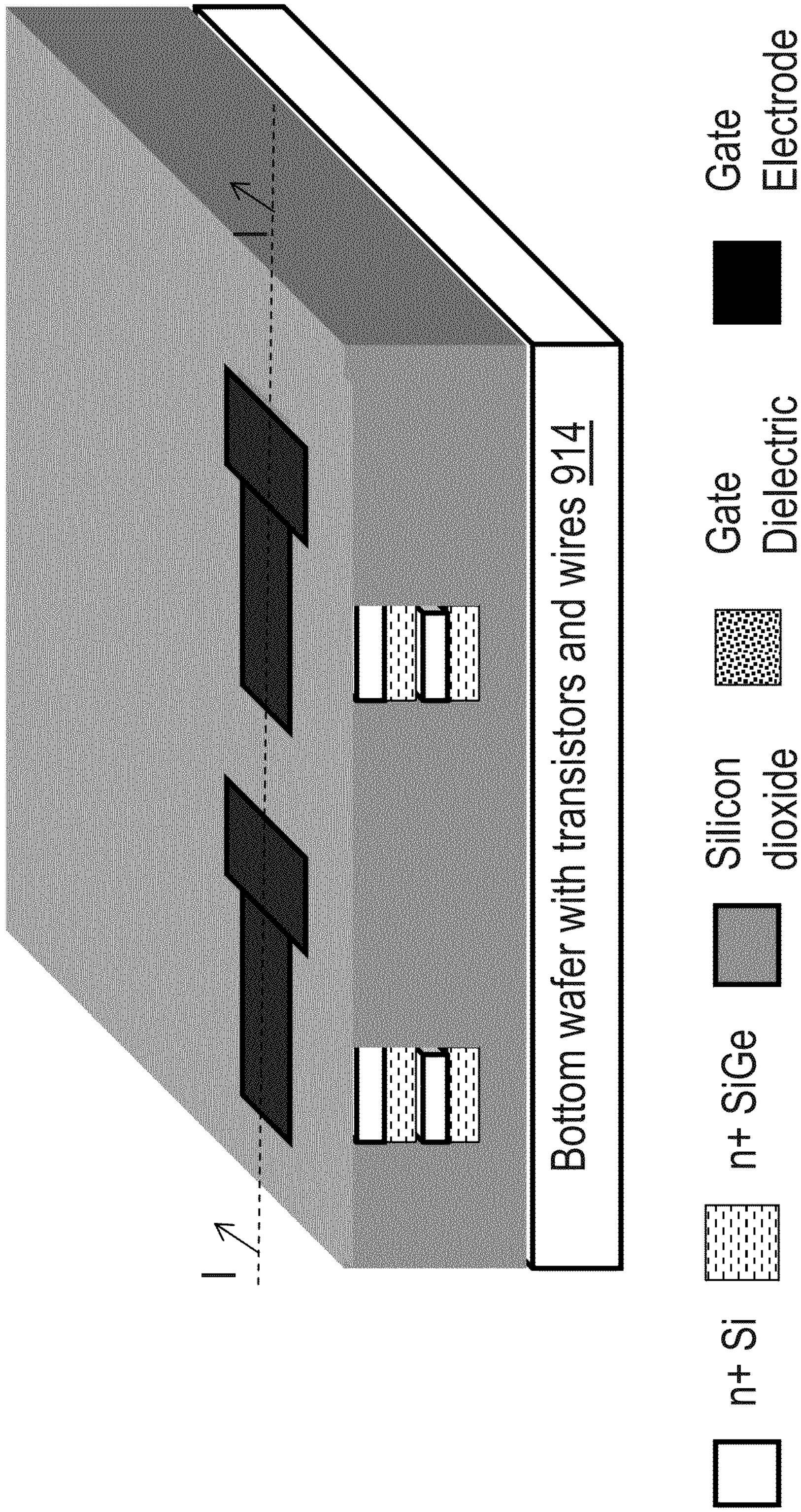

Step (I): Gate dielectric and gate electrode regions are deposited or grown. Examples of gate dielectrics include hafnium oxide, silicon dioxide. Examples of gate electrodes include polysilicon, TiN, TaN, and other materials with a work function that permits acceptable transistor electrical characteristics. A CMP may be conducted after gate electrode deposition. Following this, rest of the process flow for forming transistors, contacts and wires for the top layer continues. FIG. 9I illustrates the structure after Step (I) is completed.

Figure 9J:
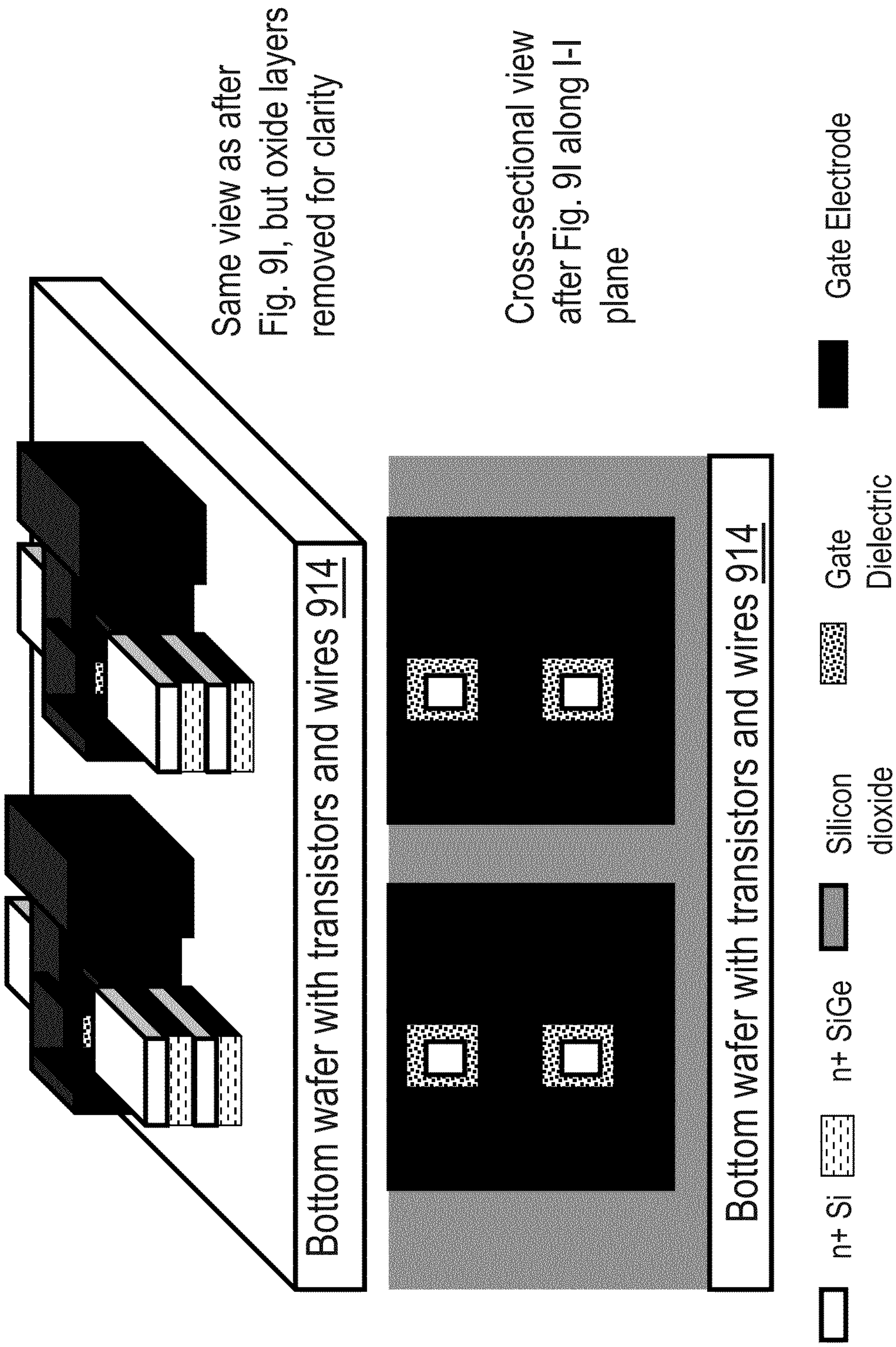

FIG. 9J shows a cross-sectional view of structures after Step (I). It is clear that two nanowires are present for each transistor in the figure. It may be possible to have one nanowire per transistor or more than two nanowires per transistor by changing the number of stacked Si/SiGe layers.

Note that top-level transistors are formed well-aligned to bottom-level wiring and transistor layers. Since the top-level transistor layers are very thin (preferably less than 200 nm), the top transistors can be aligned to features in the bottom-level. While the process flow shown in FIG. 9A-J gives the key steps involved in forming a four-side gated JLT with 3D stacked components, it is conceivable to one skilled in the art that changes to the process can be made. For example, process steps and additional materials/regions to add strain to junction-less transistors can be added. Furthermore, more than two layers of chips or circuits can be 3D stacked. Also, there are many methods to construct silicon nanowire transistors and these are described in "High performance and highly uniform gate-all-around silicon nanowire MOSFETs with wire size dependent scaling," *Electron Devices Meeting* (*IEDM*), 2009 *IEEE International*, vol., no., pp. 1-4, 7-9 Dec. 2009 by Bangsaruntip, S.; Cohen, G. M.; Majumdar, A.; et al. ("Bangsaruntip") and in "High performance 5 nm radius twin silicon nanowire MOSFET(TSNWFET): Fabrication on bulk Si wafer, characteristics, and reliability," in *Proc. IEDMTech. Dig.,* 2005, pp. 717-720 by S. D. Suk, S.-Y. Lee, S.-M. Kim, et al. ("Suk"). Contents of these publications are incorporated herein by reference. Techniques described in these publications can be utilized for fabricating four-side gated JLTs without junctions as well.

FIG. 9K-V describes an alternative process flow for forming four-side gated JLTs in 3D stacked circuits and chips. It may include several steps as described in the following sequence.

Figure 9K:
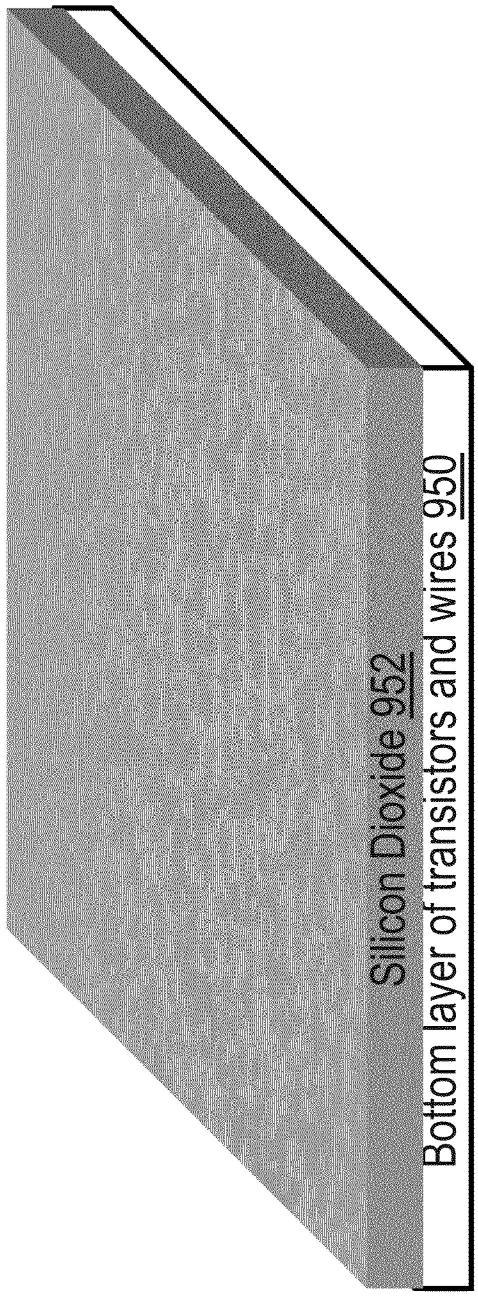

Step (A): The bottom layer of the 2 chip 3D stack may be processed with transistors and wires. This is indicated in the figure as bottom layer of transistors and wires 950. Above this, a silicon dioxide layer 952 may be deposited. FIG. 9K illustrates the structure after Step (A) is completed.

Figure 9L:
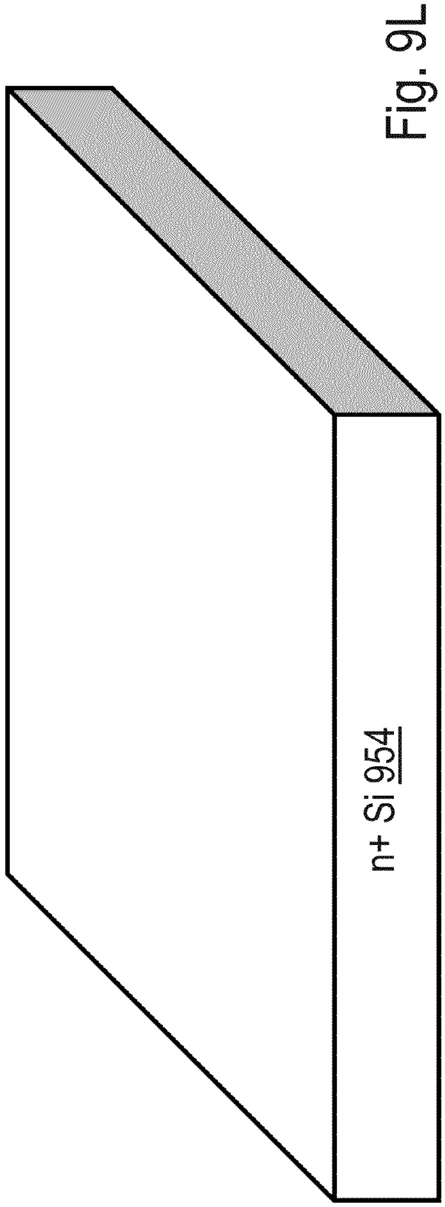

Step (B): A n+ Si wafer 954 that has its dopants activated may be now taken. Alternatively, a p− Si wafer that has n+ dopants implanted and activated, which may be a conductive or semi-conductive layer, can be used. FIG. 9L shows the structure after Step (B) is completed.

Figure 9M:
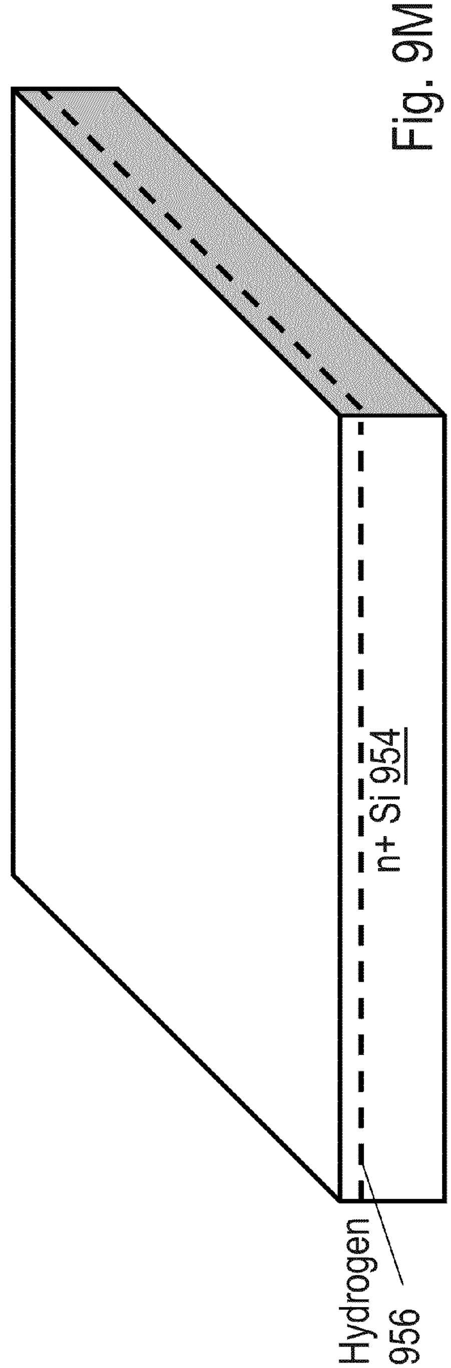

Step (C): Hydrogen ions are implanted into the n+ Si wafer 954 at a certain depth. FIG. 9M shows the structure after Step (C) is completed. The hydrogen plane 956 may be formed and is indicated as dashed lines.

Figure 9N:
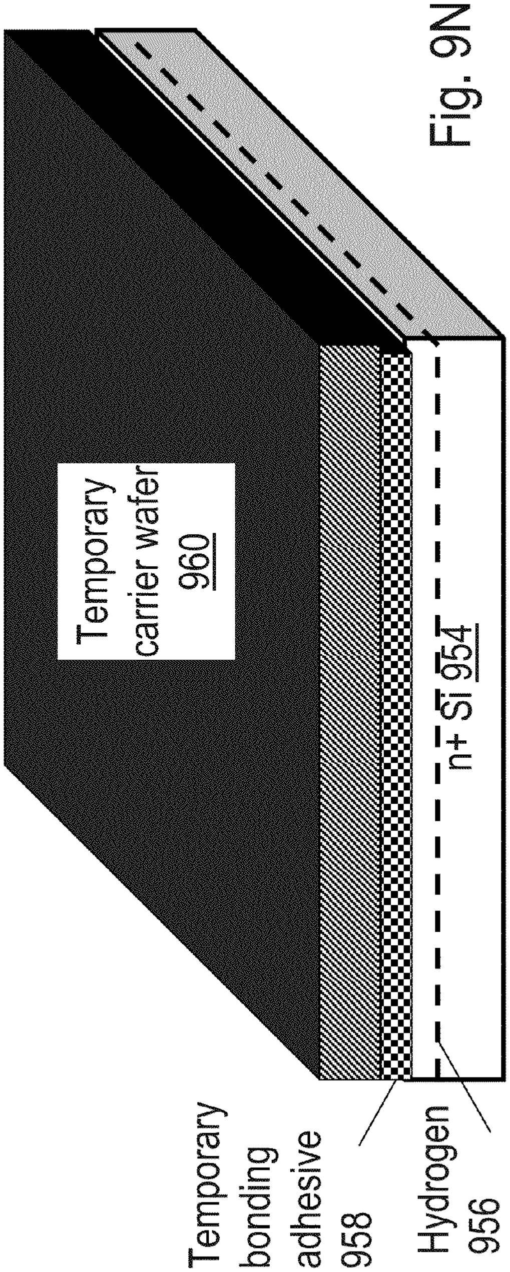

Step (D): The wafer after step (C) may be bonded to a temporary carrier wafer 960 using a temporary bonding adhesive 958. This temporary carrier wafer 960 could be constructed of glass. Alternatively, it could be constructed of silicon. The temporary bonding adhesive 958 could be a polymer material, such as polyimide DuPont HD3007. FIG. 9N illustrates the structure after Step (D) is completed.

Figure 9O:
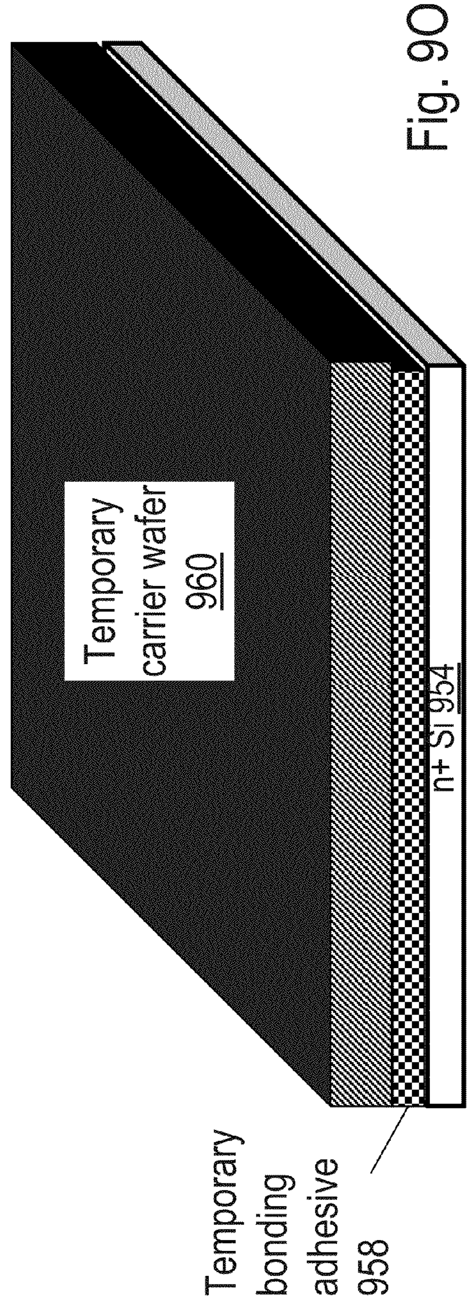

Step (E): A anneal or a sideways mechanical force may be utilized to cleave the wafer at the hydrogen plane 956. A CMP process may be then conducted. FIG. 9O shows the structure after Step (E) is completed.

Figure 9P:
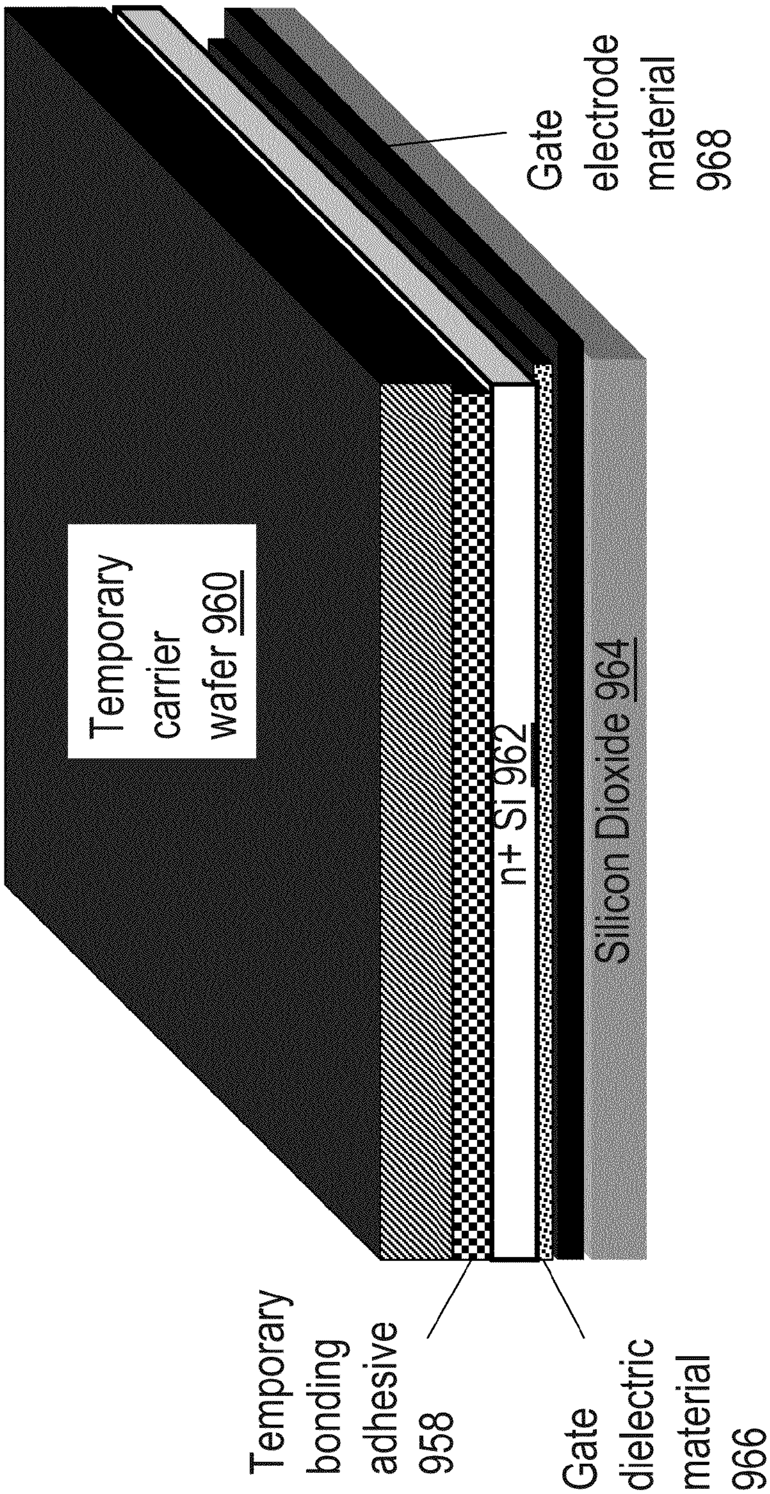

Step (F): Layers of gate dielectric material 966, gate electrode material 968 and silicon oxide 964 are deposited onto the bottom of the wafer shown in Step (E). FIG. 9P illustrates the structure after Step (F) is completed.

Figure 9Q:
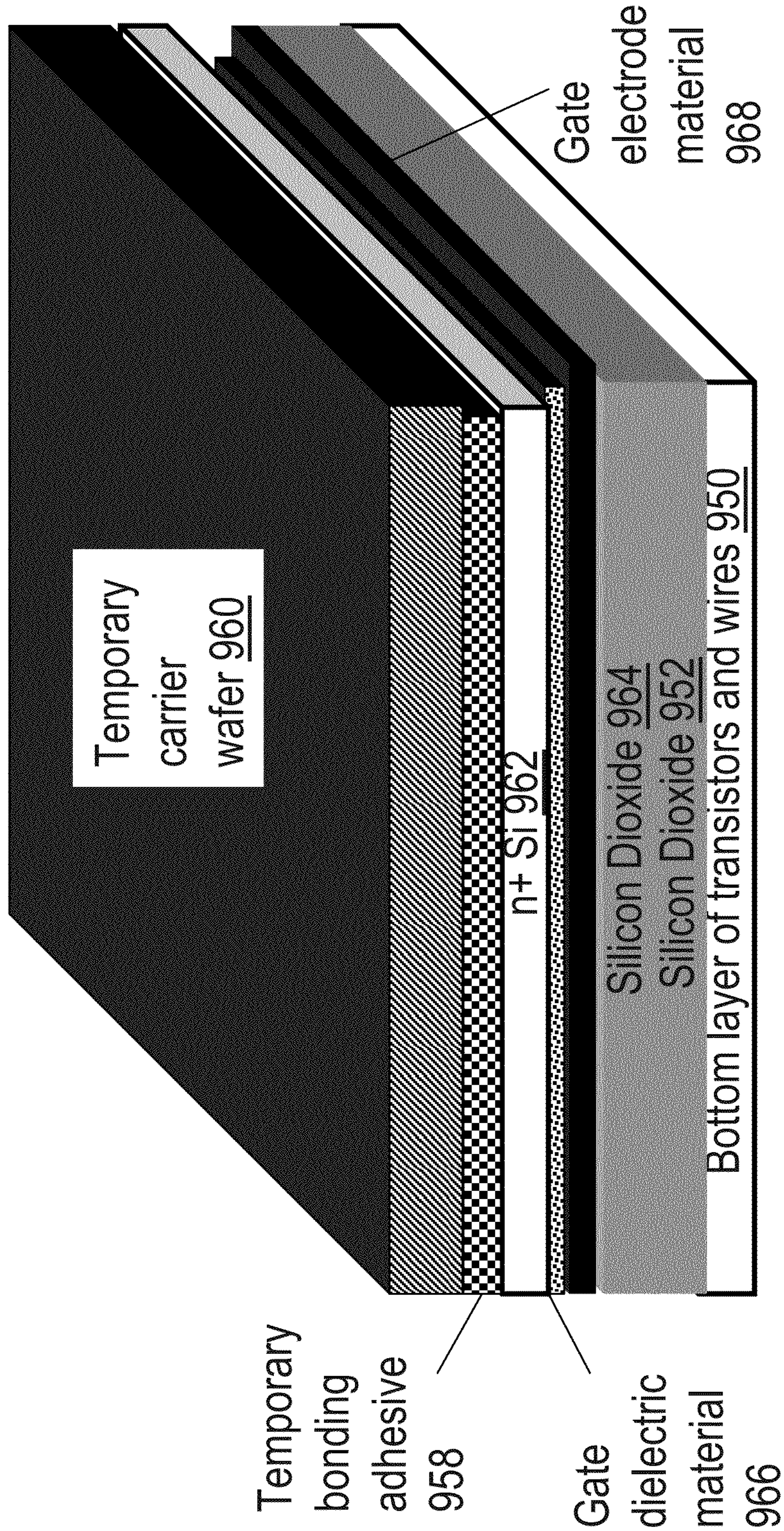

Step (G): The wafer may be then bonded to the bottom layer of transistors and wires 950 using oxide-to-oxide bonding. FIG. 9Q illustrates the structure after Step (G) is completed.

Figure 9R:
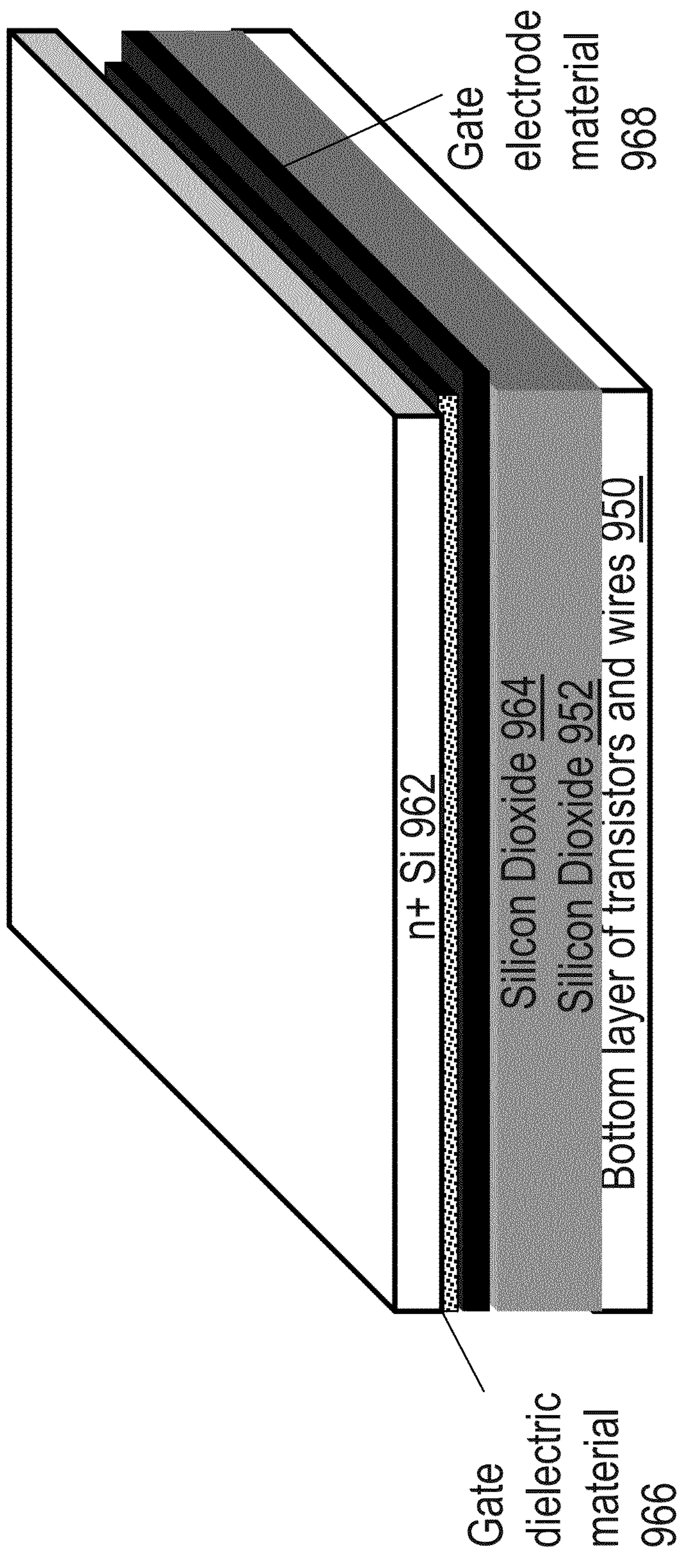

Step (H): The temporary carrier wafer 960 may be then removed by shining a laser onto the temporary bonding adhesive 958 through the temporary carrier wafer 960 (which could be constructed of glass). Alternatively, an anneal could be used to remove the temporary bonding adhesive 958. FIG. 9R illustrates the structure after Step (H) is completed.

Figure 9S:
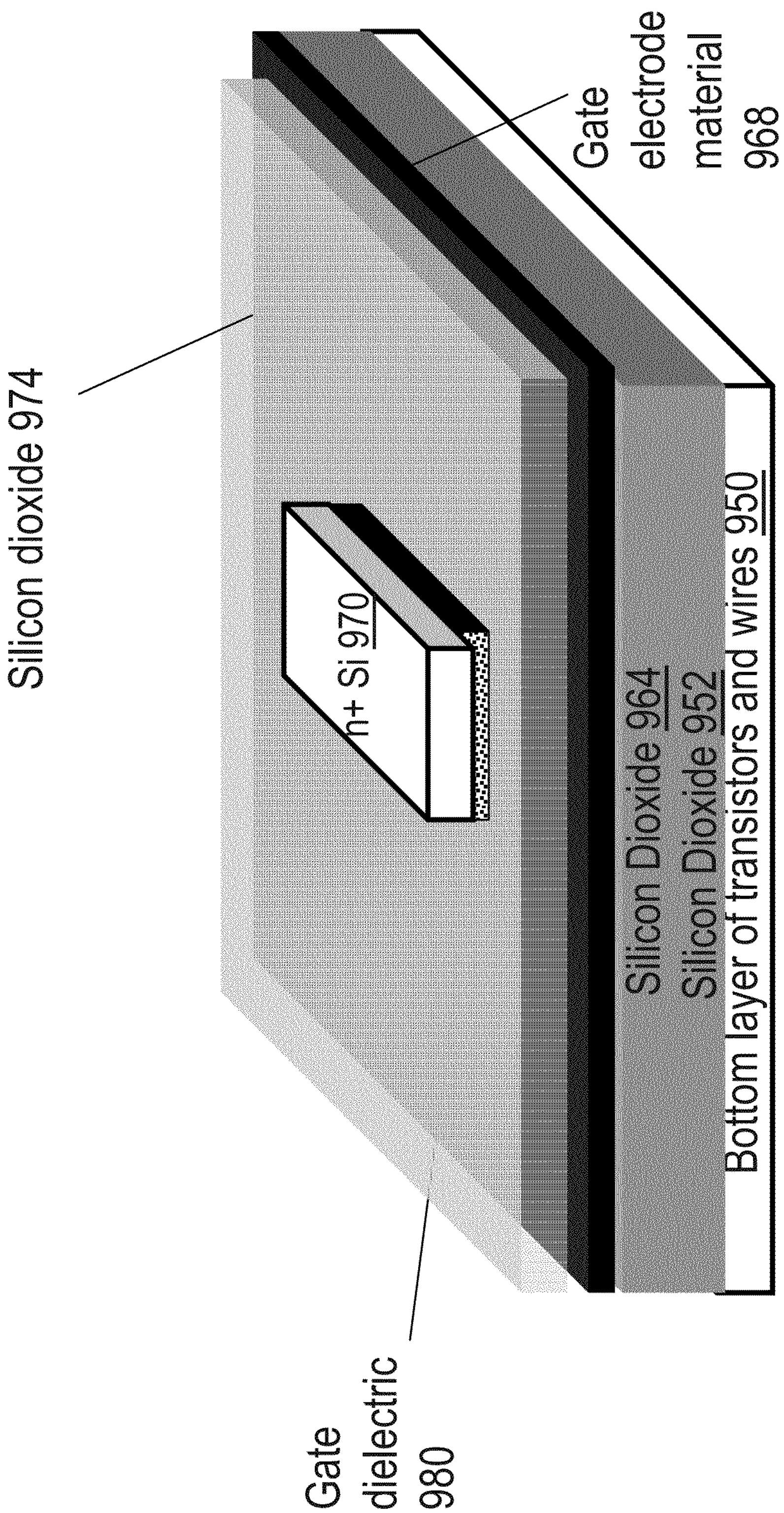

Step (I): The layer of n+ Si 962 and gate dielectric material 966 are patterned and etched using a lithography and etch step. FIG. 9S illustrates the structure after this step. The patterned layer of n+ Si 970 and the patterned gate dielectric for the back gate (gate dielectric 980) are shown. Oxide may be deposited and polished by CMP to planarize the surface and form a region of silicon dioxide oxide region 974.

Figure 9T:
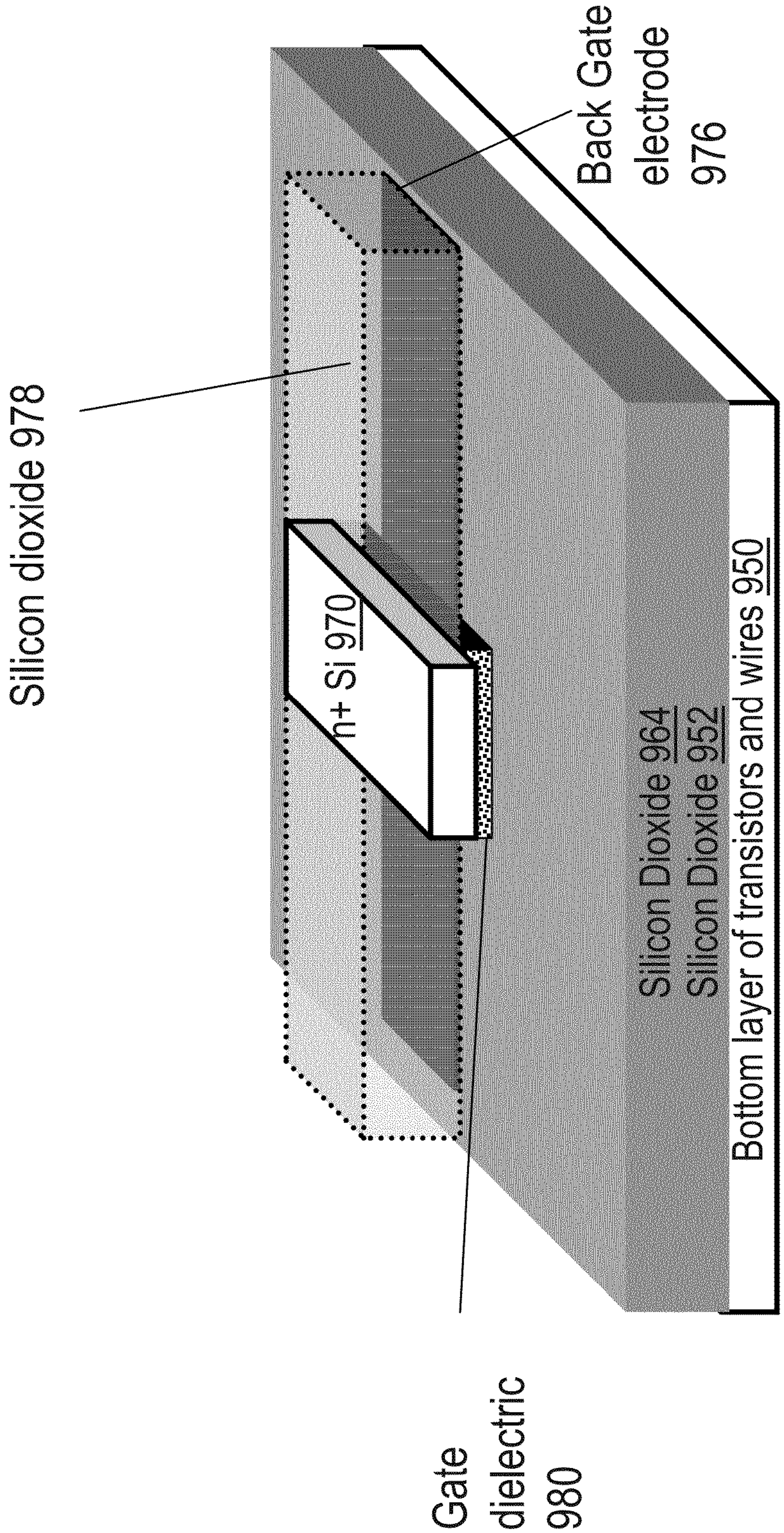

Step (J): The oxide region 974 and gate electrode material 968 are patterned and etched to form a region of silicon dioxide 978 and back gate electrode 976. FIG. 9T illustrates the structure after this step.

Figure 9U:
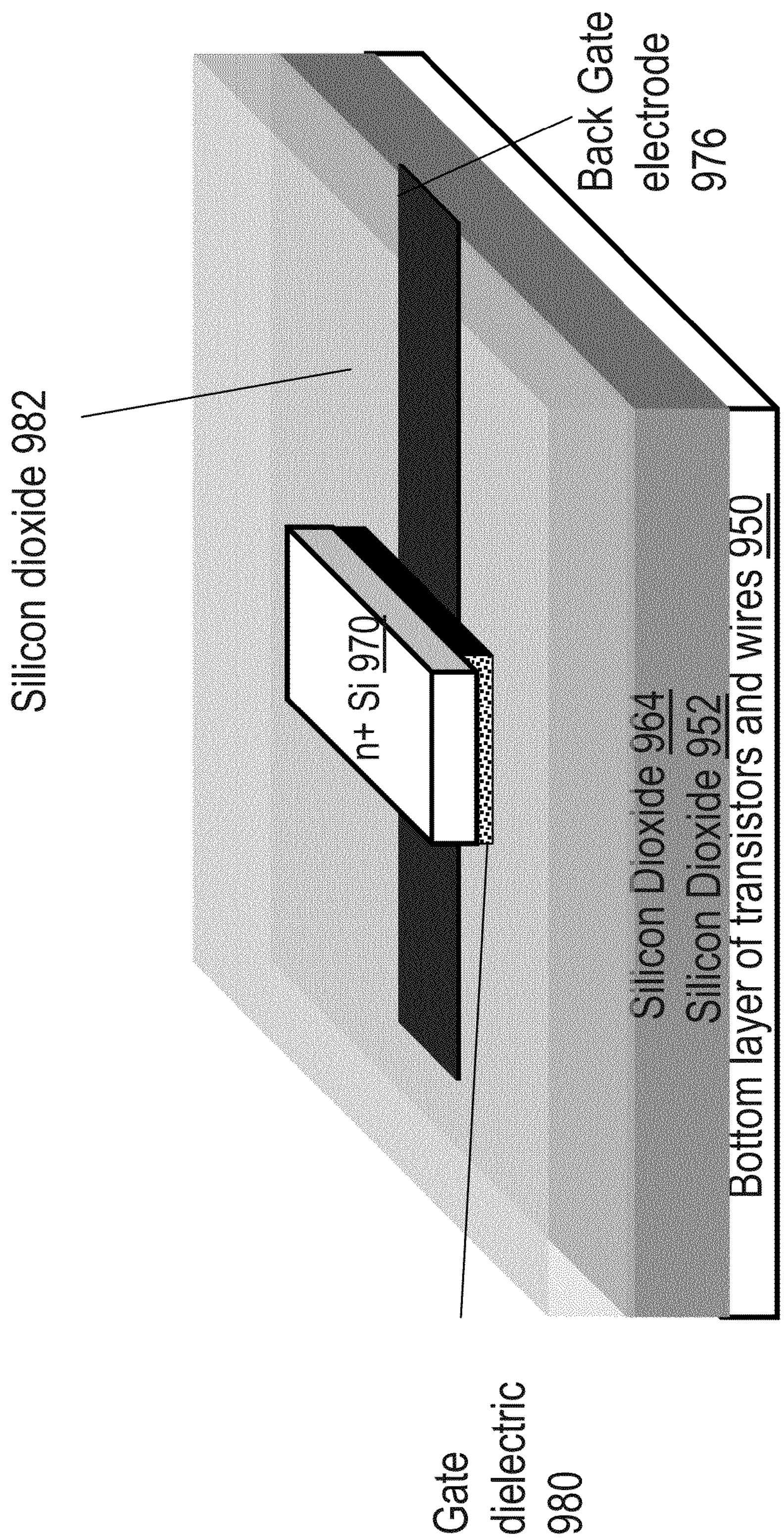

Step (K): A silicon dioxide layer may be deposited. The surface may be then planarized with CMP to form the region of silicon dioxide 982. FIG. 9U illustrates the structure after this step.

Figure 9V:
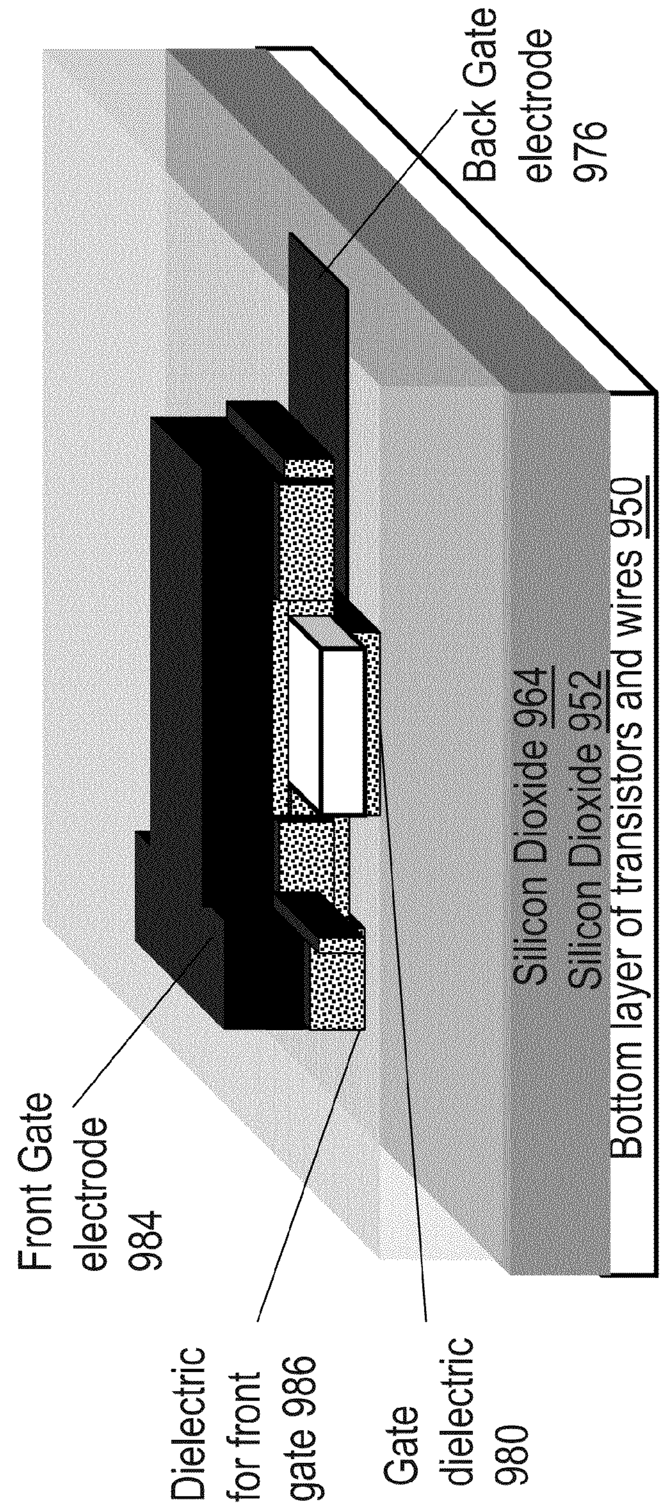

Step (L): Trenches are etched in the region of silicon dioxide 982. A thin layer of gate dielectric and a thicker layer of gate electrode are then deposited and planarized. Following this, a lithography and etch step are performed to etch the gate dielectric and gate electrode. FIG. 9V illustrates the structure after these steps. The device structure after these process steps may include a front gate electrode 984 and a dielectric for the front gate 986. Contacts can be made to the front gate electrode 984 and back gate electrode 976 after oxide deposition and planarization. Note that top-level transistors are formed well-aligned to bottom-level wiring and transistor layers. While the process flow shown in FIG. 9K-V shows several steps involved in forming a four-side gated JLT with 3D stacked components, it is conceivable to one skilled in the art that changes to the process can be made. For example, process steps and additional materials/regions to add strain to junction-less transistors can be added.

Many of the types of embodiments of this invention described in Section 1.1 utilize single crystal silicon or mono-crystalline silicon transistors. These terms may be used interchangeably. Thicknesses of layer transferred regions of silicon are <2 um, and many times can be <1 um or <0.4 um or even <0.2 um. Interconnect (wiring) layers are preferably constructed substantially of copper or aluminum or some other high conductivity material.

Section 1.2: Recessed Channel Transistors as a Building Block for 3D Stacked Circuits and Chips Another method to solve the issue of high-temperature source-drain junction processing may be an innovative use of recessed channel inversion-mode transistors as a building block for 3D stacked semiconductor circuits and chips. The transistor structures herein can be considered horizontally-oriented transistors where current flow occurs between horizontally-oriented source and drain regions, which may be parallel to the largest face of the donor wafer or acceptor wafer, or the transferred mono-crystalline wafer or acceptor first mono-crystalline substrate or wafer. The term planar transistor can also be used for the same horizontally-oriented transistor in this document. The recessed channel transistors in this section are defined by a process including a step of etch to form the transistor channel. 3D stacked semiconductor circuits and chips using recessed channel transistors preferably have interconnect (wiring) layers including copper or aluminum or a material with higher conductivity.

Figure 10A:
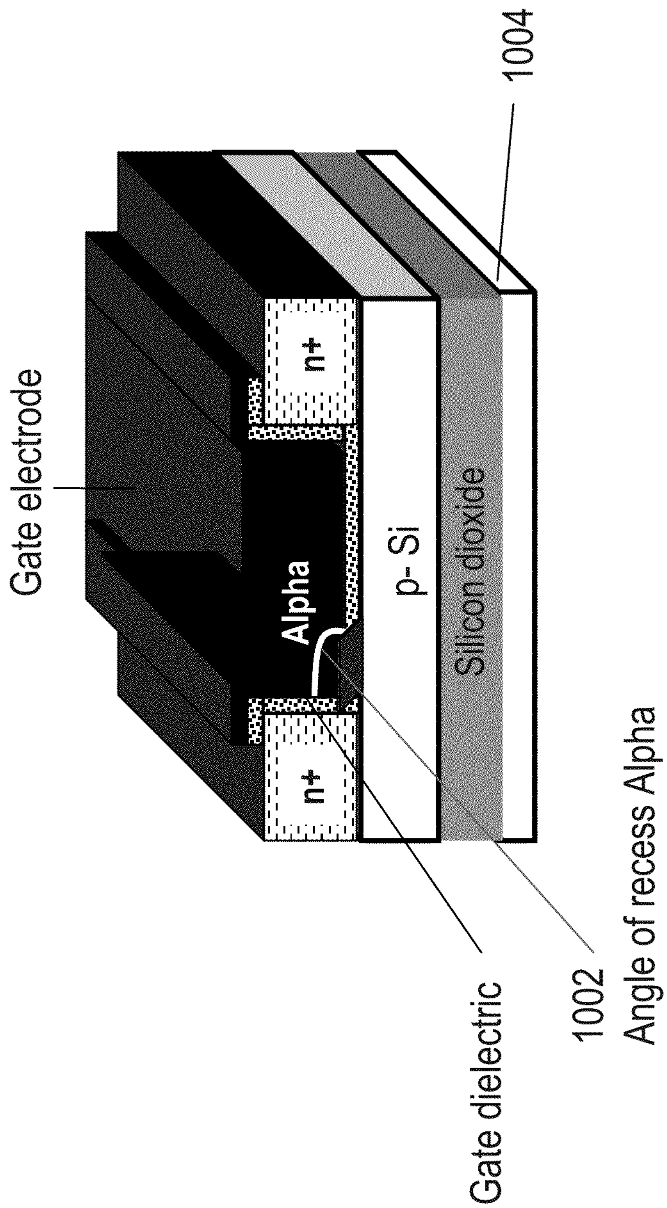
FIG. 10A-D show types of recessed channel transistors.
Figure 10B:
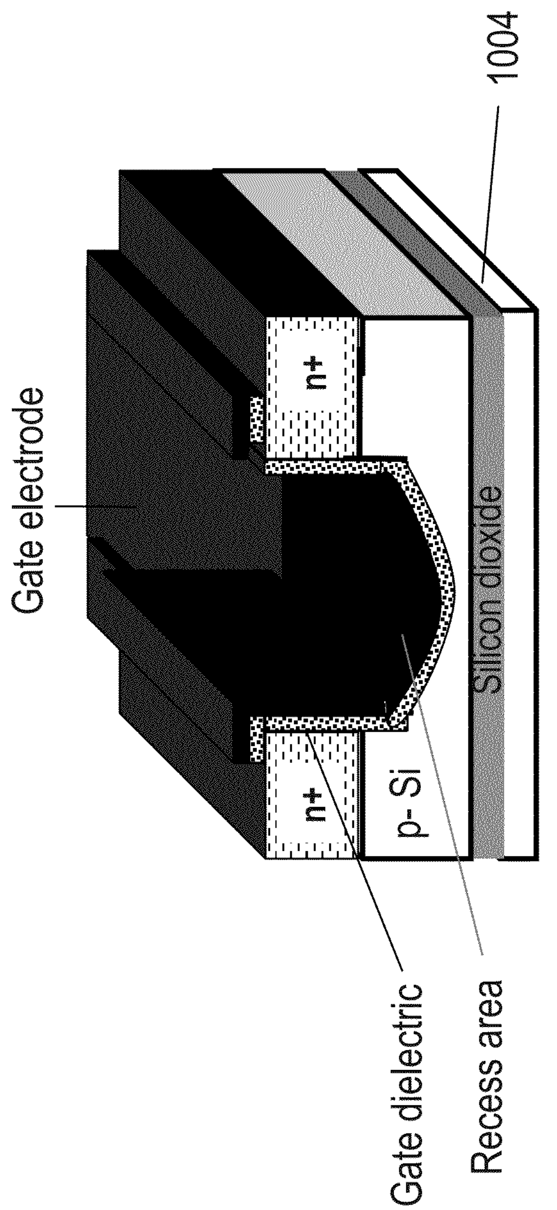
Figure 10C:
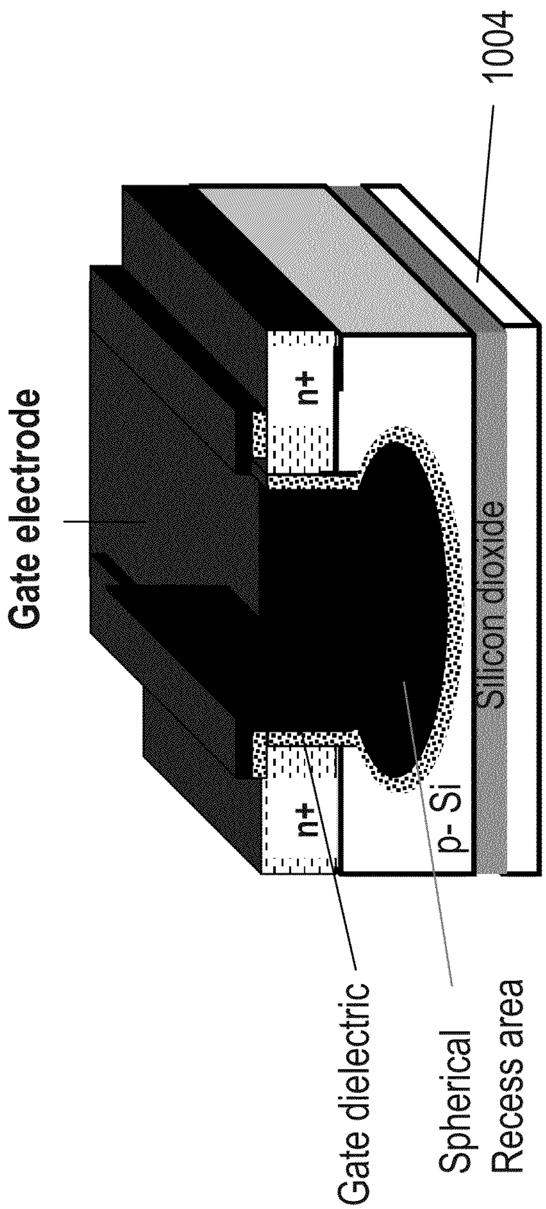
Figure 10D:
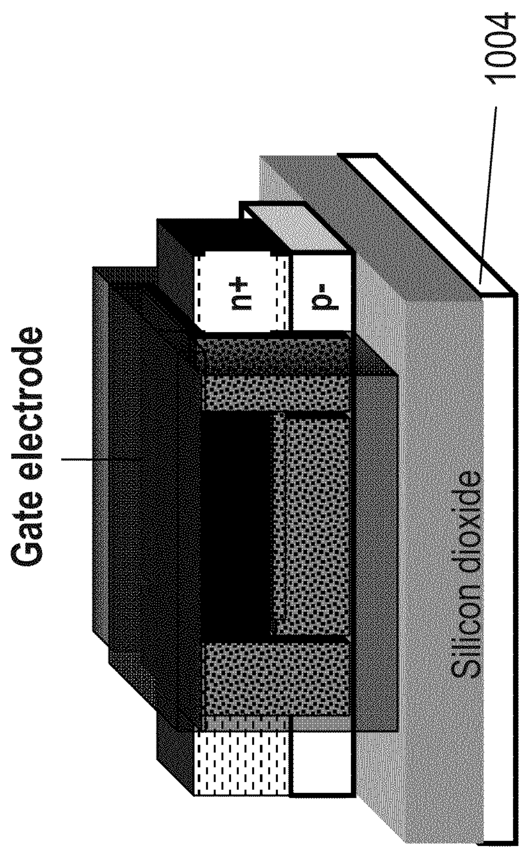

FIG. 10A-D shows different types of recessed channel inversion-mode transistors constructed atop a bottom layer of transistors and wires 1004. FIG. 10A depicts a standard recessed channel transistor where the recess may be made up to the p− region. The angle of the recess, Alpha 1002, can be anywhere in between about 90° and about 180°. A standard recessed channel transistor where angle Alpha >90° can also be referred to as a V-shape transistor or V-groove transistor. FIG. 10B depicts a RCAT (Recessed Channel Transistor) where part of the p− region may be consumed by the recess. FIG. 10C depicts a S-RCAT (Spherical RCAT) where the recess in the p− region may be spherical in shape. FIG. 10D depicts a recessed channel Finfet.

Figures 11A, 11B, 11C, 11D:
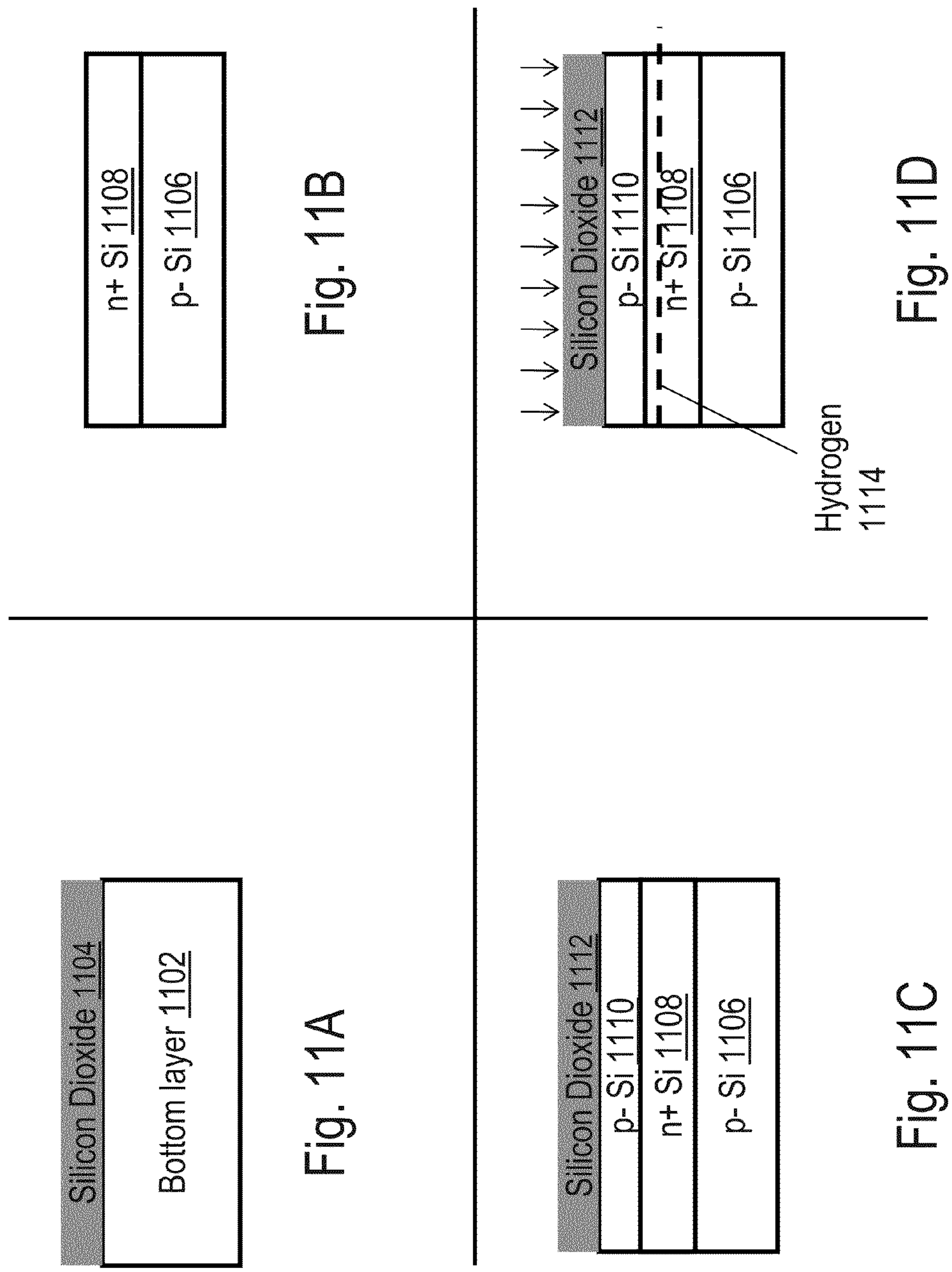
FIG. 11A-F shows a procedure for layer transfer of silicon regions needed for recessed channel transistors.

FIG. 11A-F shows a procedure for layer transfer of silicon regions and other steps to form recessed channel transistors. Silicon regions that are layer transferred are less than about 2 um in thickness, and can be thinner than about 1 um or even about 0.4 um. The process flow in FIG. 11A-F may include several steps as described in the following sequence:

Step (A): A silicon dioxide layer 1104 may be deposited above the generic bottom layer 1102. FIG. 11A illustrates the structure after Step (A).

Step (B): A p− Si wafer 1106 may be implanted with n+ near its surface to form a layer of n+ Si 1108. FIG. 11B illustrates the structure after Step (B).

Step (C): A p− Si layer 1110 may be epitaxially grown atop the layer of n+ Si 1108. A layer of silicon dioxide 1112 may be deposited atop the p− Si layer 1110. An anneal (such as a rapid thermal anneal RTA or spike anneal or laser anneal) may be conducted to activate dopants, which may form a conductive or semi-conductive layer or layers. Note that the terms laser anneal and optical anneal are used interchangeably in this document. FIG. 11C illustrates the structure after Step (C). Alternatively, the n+ Si layer 1108 and p− Si layer 1110 can be formed by a buried layer implant of n+ Si in the p− Si wafer 1106.

Step (D): Hydrogen H+ may be implanted into the n+ Si layer 1108 at a certain depth to form hydrogen plane 1114. Alternatively, another atomic species such as helium can be implanted. FIG. 11D illustrates the structure after Step (D).

Figure 11F:
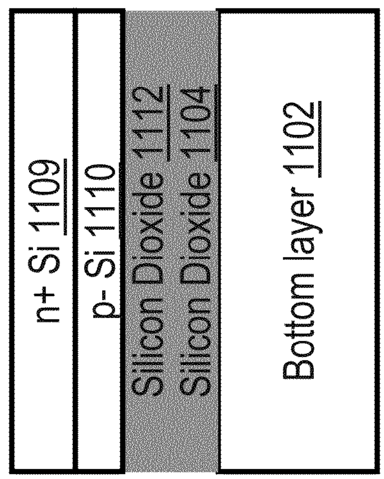
Figure 11E:
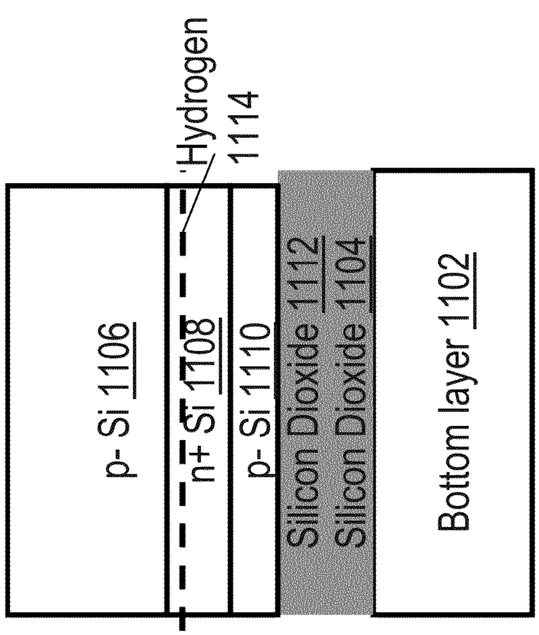

Step (E): The top layer wafer shown after Step (D) may be flipped and bonded atop the bottom layer wafer using oxide-to-oxide bonding. FIG. 11E illustrates the structure after Step (E).

Step (F): A cleave operation may be performed at the hydrogen plane 1114 using an anneal. Alternatively, a sideways mechanical force may be used. Following this, a Chemical-Mechanical-Polish (CMP) may be done. It should be noted that the layer transfer including the bonding and the cleaving could be done without exceeding about 400° C. This may be the case in various alternatives of this invention. FIG. 11F illustrates the structure after Step (F).

Figure 12A:
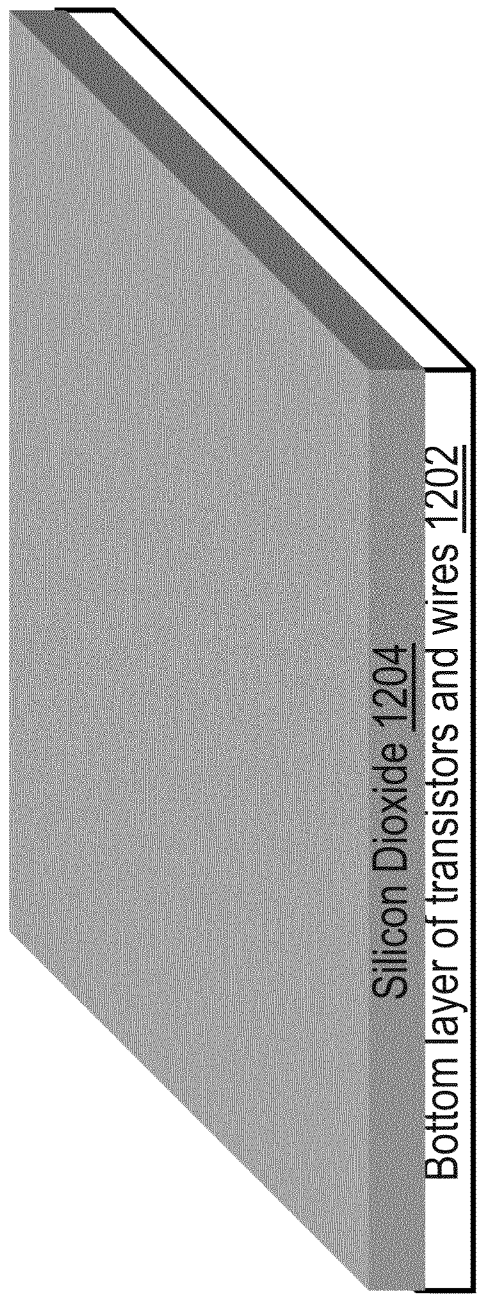
FIG. 12A-F shows a process flow for constructing 3D stacked logic chips using standard recessed channel transistors.

FIG. 12A-F describes a process flow for forming 3D stacked circuits and chips using standard recessed channel inversion-mode transistors. The process flow in FIG. 12A-F may include several steps as described in the following sequence:

Step (A): The bottom layer of the 2 chip 3D stack may be processed with transistors and wires. This is indicated in the figure as bottom layer of transistors and wires 1202. Above this, a silicon dioxide layer 1204 may be deposited. FIG. 12A illustrates the structure after Step (A).

Figure 12B:
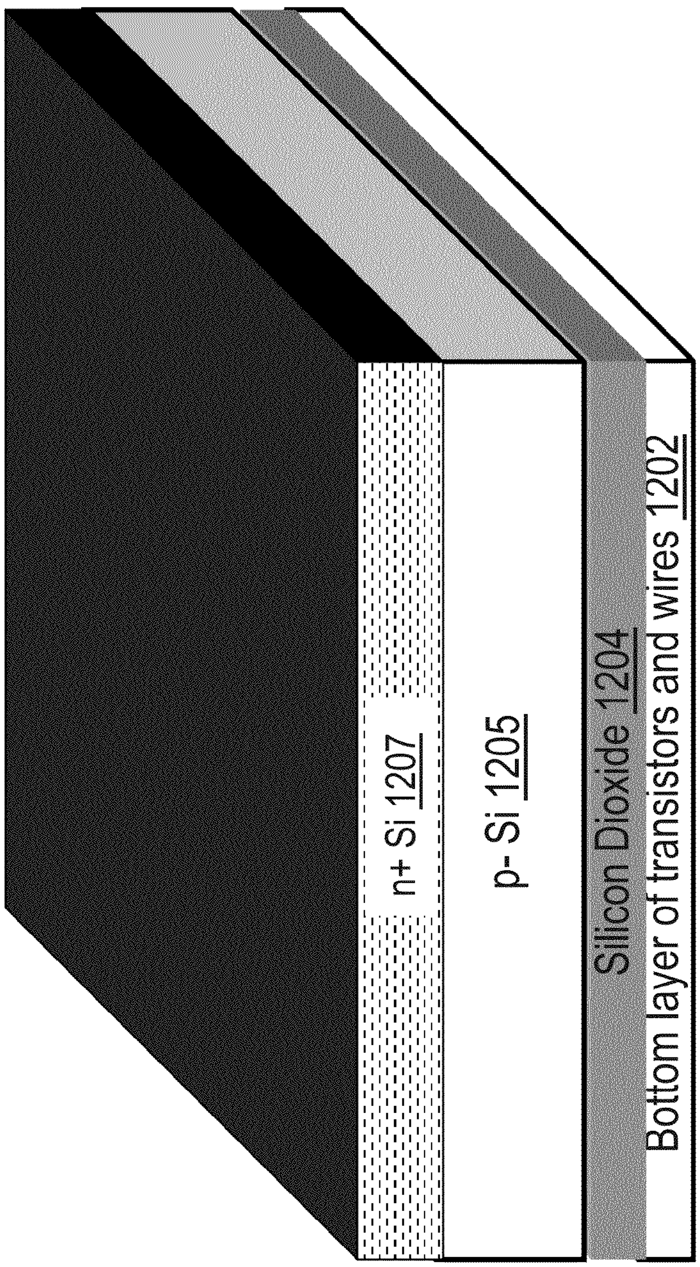

Step (B): Using the procedure shown in FIG. 11A-F, a p− Si layer 1205 and n+ Si layer 1207 are transferred atop the structure shown after Step (A). FIG. 12B illustrates the structure after Step (B).

Figure 12C:
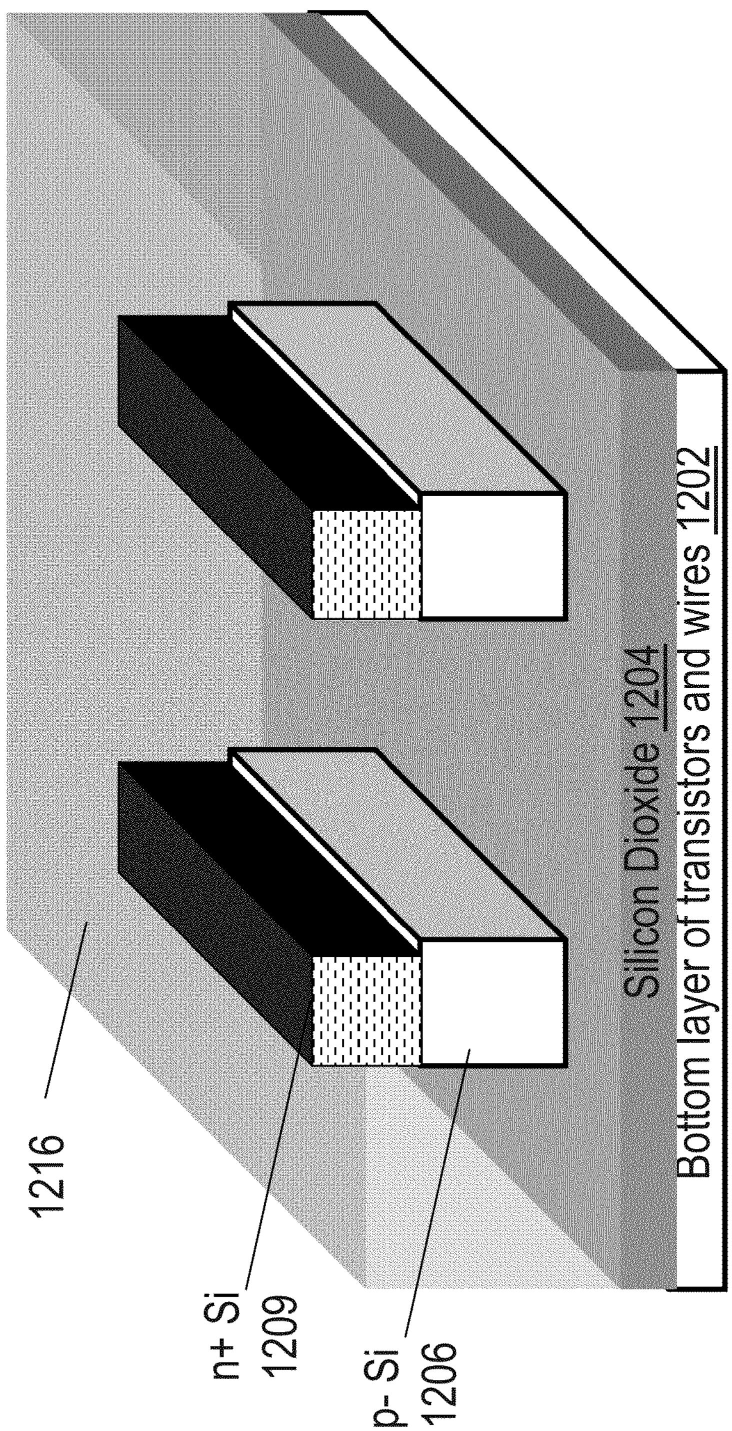

Step (C): The stack shown after Step (A) may be patterned lithographically and etched such that silicon regions are present only in regions where transistors are to be formed. Using a standard shallow trench isolation (STI) process, isolation regions in between transistor regions are formed. These oxide regions are indicated as 1216. FIG. 12C illustrates the structure after Step (C). Thus, n+ Si region 1209 and p− Si region 1206 are left after this step.

Figure 12D:
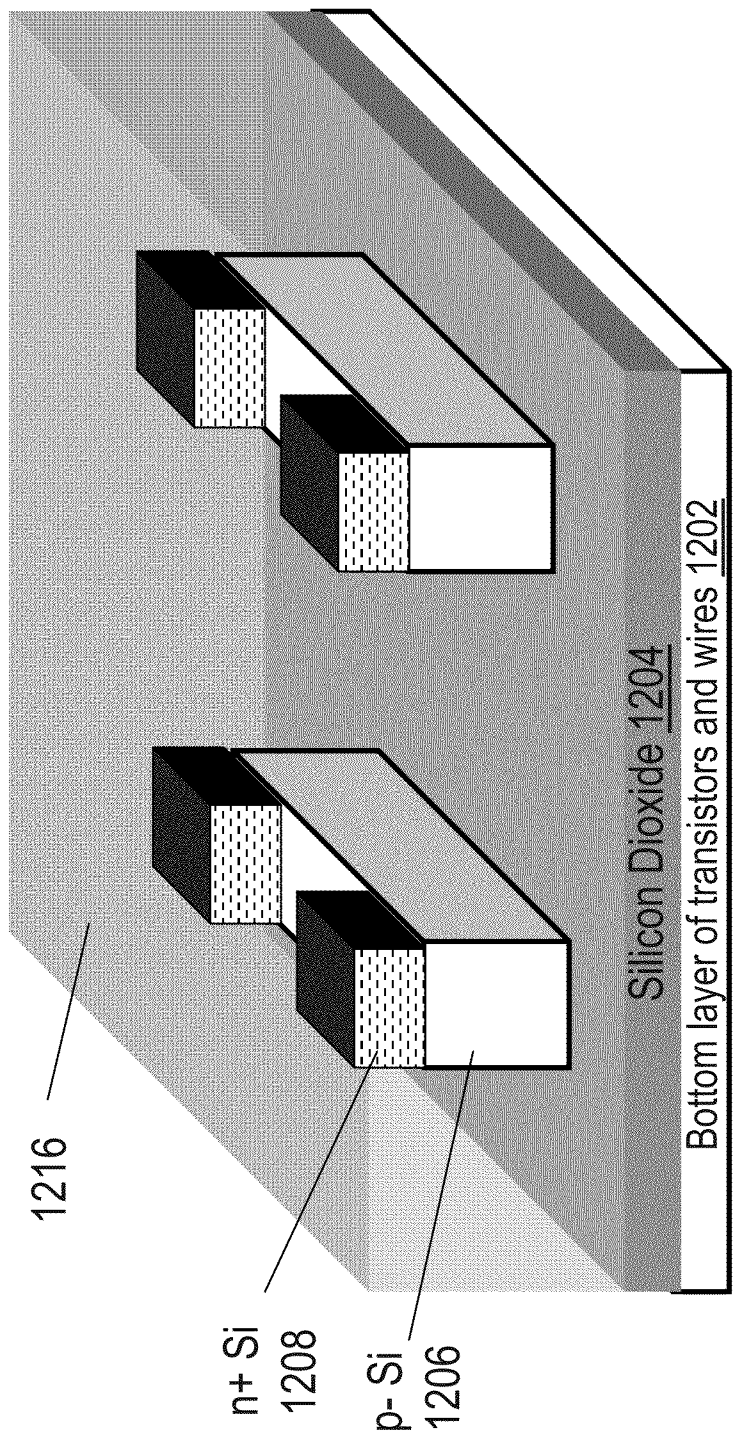

Step (D): Using litho and etch, a recessed channel may be formed by etching away the n+ Si region 1209 where gates need to be formed, thus forming n+ silicon source and drain regions 1208. Little or substantially none of the p− Si region 1206 may be removed. FIG. 12D illustrates the structure after Step (D).

Figure 12E:
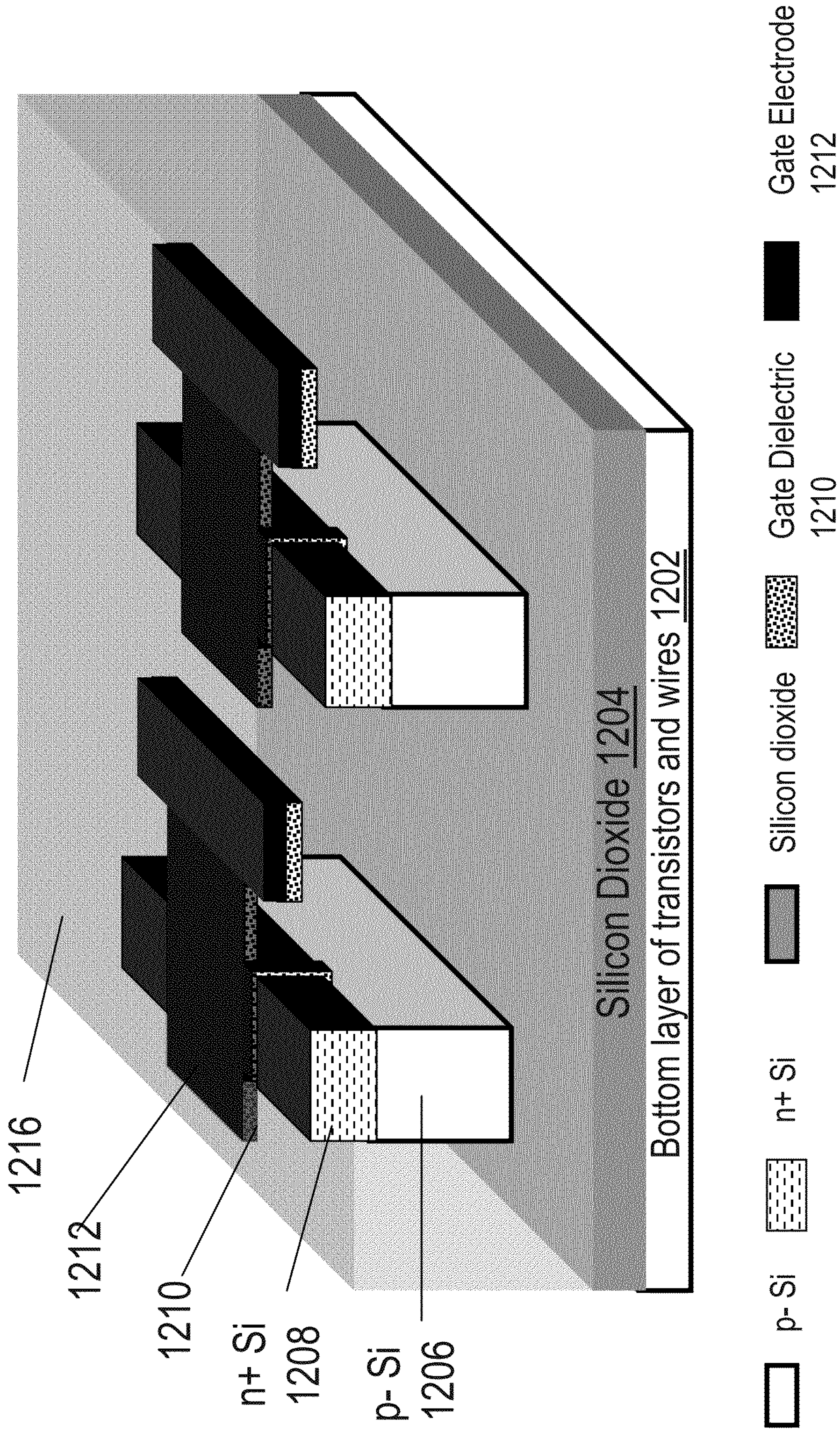

Step (E): The gate dielectric material and the gate electrode material are deposited, following which a CMP process may be utilized for planarization. The gate dielectric material could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. Litho and etch are conducted to leave the gate dielectric material 1210 and the gate electrode material 1212 only in regions where gates are to be formed. FIG. 12E illustrates the structure after Step (E).

Figure 12F:
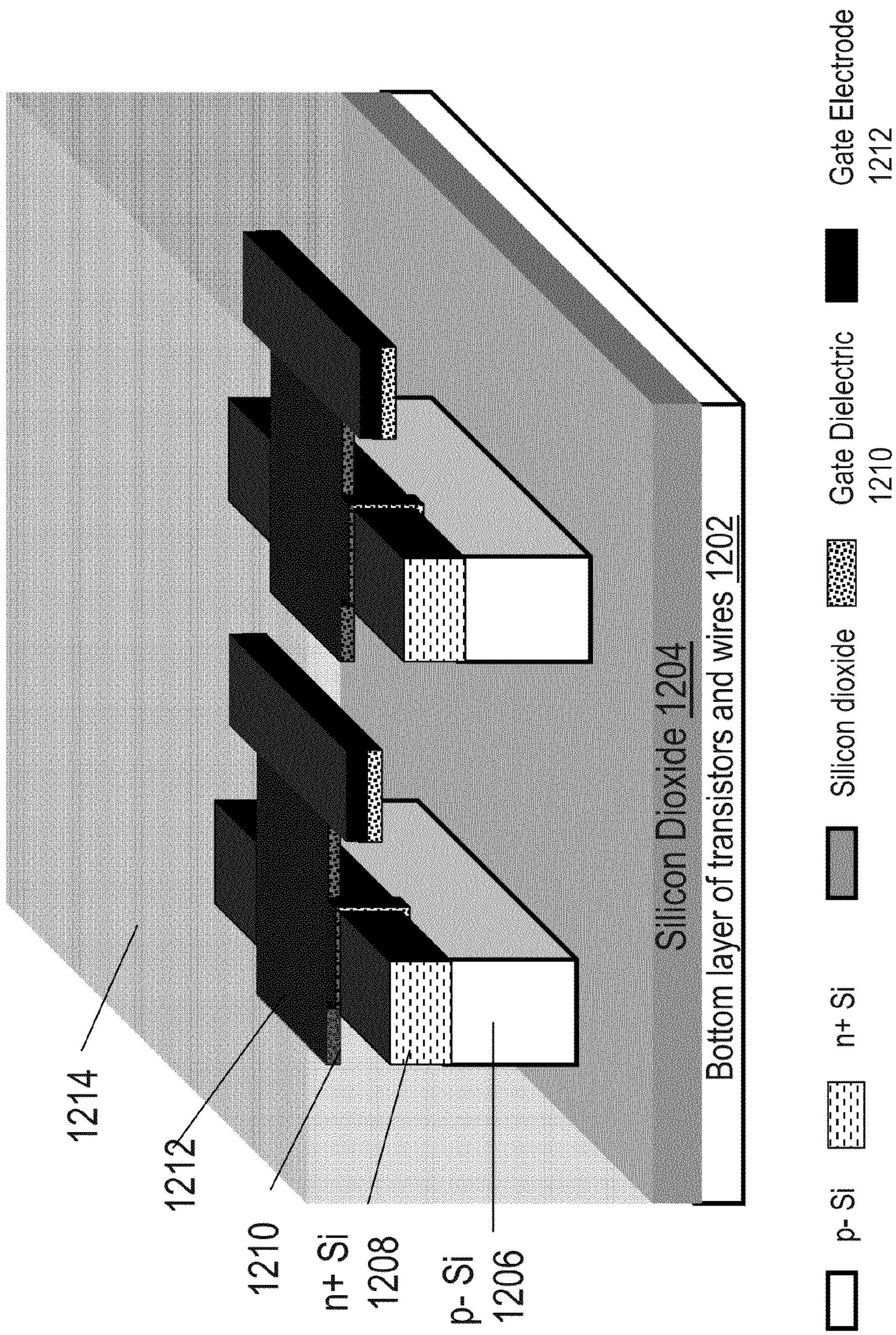

Step (F): An oxide layer 1214 may be deposited and polished with CMP. Following this, rest of the process flow continues, with contact and wiring layers being formed. FIG. 12F illustrates the structure after Step (F).

It is apparent based on the process flow shown in FIG. 12A-F that no process step requiring greater than about 400° C. may be required after stacking the top layer of transistors above the bottom layer of transistors and wires. While the process flow shown in FIG. 12A-F gives the key steps involved in forming a standard recessed channel transistor for 3D stacked circuits and chips, it is conceivable to one skilled in the art that changes to the process can be made. For example, process steps and additional materials/regions to add strain to the standard recessed channel transistors can be added. Furthermore, more than two layers of chips or circuits can be 3D stacked. Note that top-level transistors are formed well-aligned to bottom-level wiring and transistor layers. This, in turn, may be due to top-level transistor layers being very thin (typically less than about 200 nm). One can see through these thin silicon layers and align to features at the bottom-level.

Figure 13A:
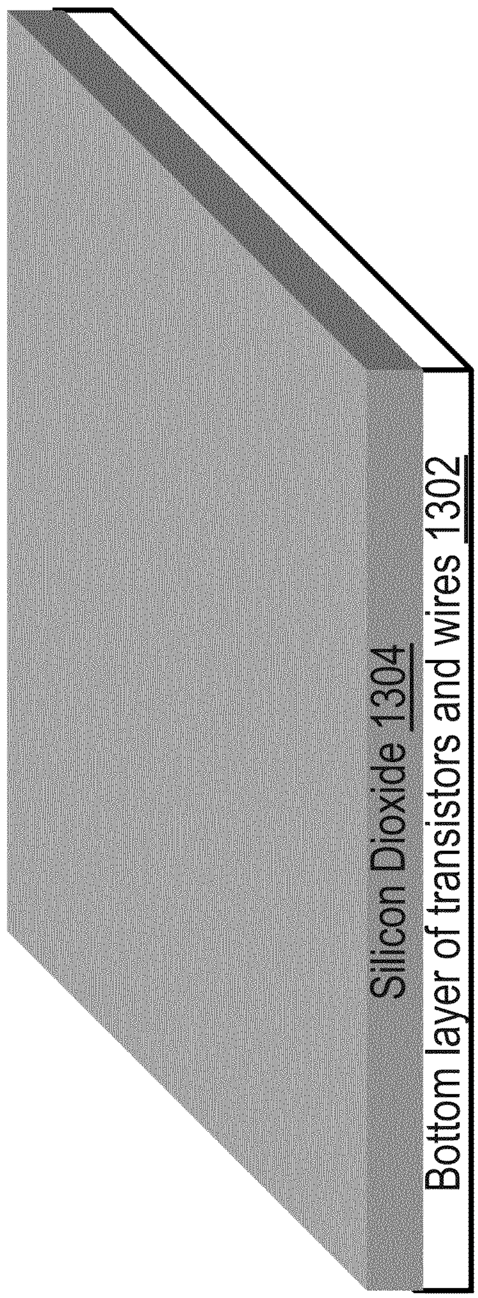
FIG. 13A-F shows a process flow for constructing 3D stacked logic chips using RCATs.

FIG. 13A-F depicts a process flow for constructing 3D stacked logic circuits and chips using RCATs (recessed channel array transistors). These types of devices are typically used for constructing 2D DRAM chips. These devices can also be utilized for forming 3D stacked circuits and chips with no process steps performed at greater than about 400° C. (after wafer to wafer bonding). The process flow in FIG. 13A-F may include several steps in the following sequence:

Step (A): The bottom layer of the 2 chip 3D stack may be processed with transistors and wires. This is indicated in the figure as bottom layer of transistors and wires 1302. Above this, a silicon dioxide layer 1304 may be deposited. FIG. 13A illustrates the structure after Step (A).

Figure 13B:
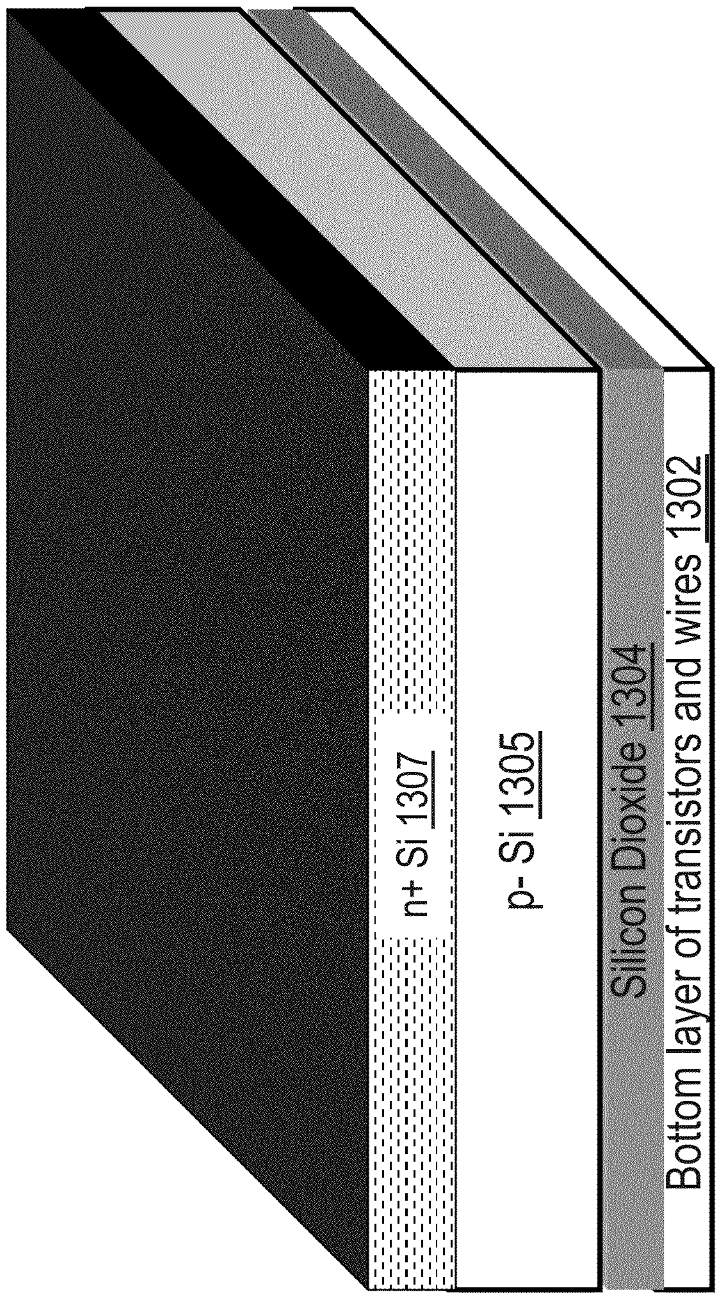

Step (B): Using the procedure shown in FIG. 11A-F, a p− Si layer 1305 and n+ Si layer 1307 are transferred atop the structure shown after Step (A). FIG. 13B illustrates the structure after Step (B).

Figure 13C:
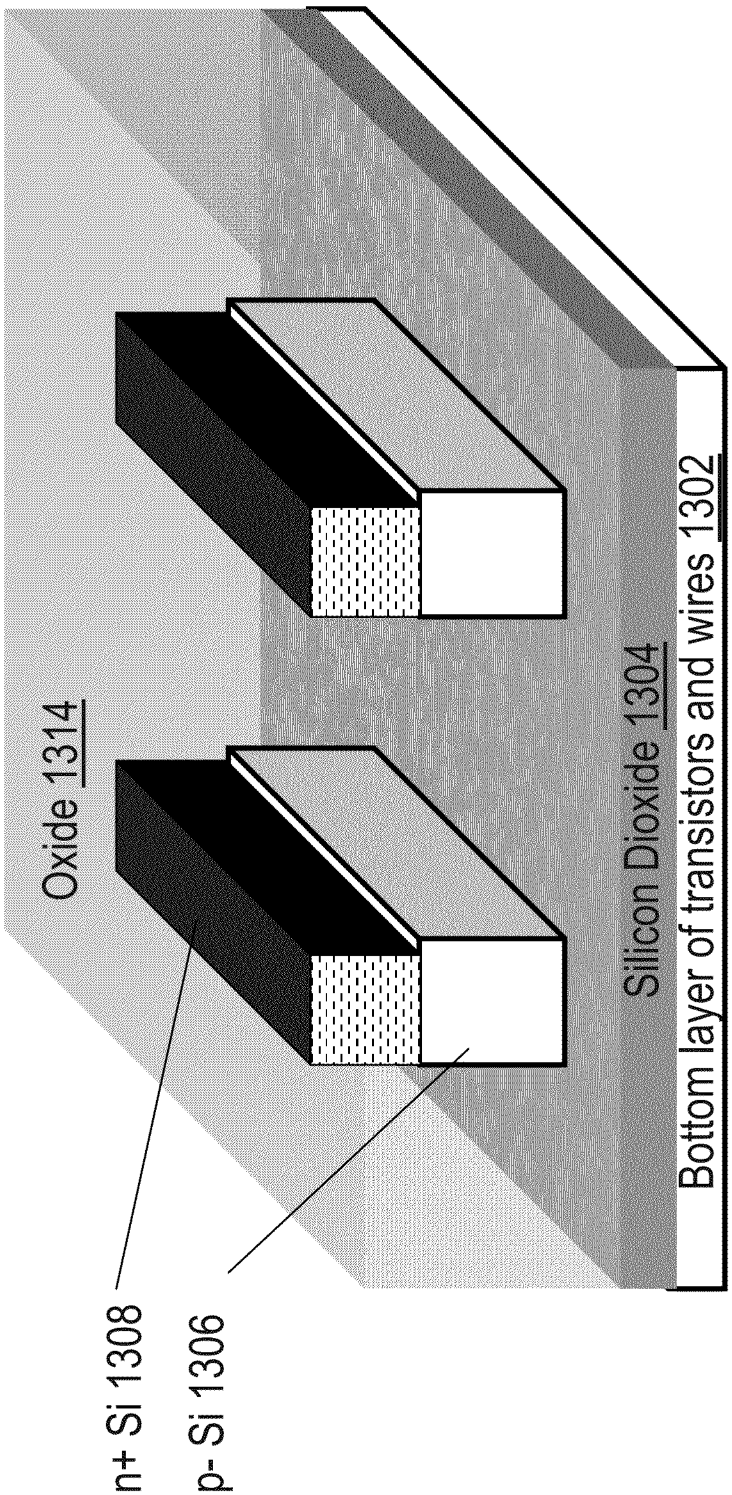

Step (C): The stack shown after Step (A) may be patterned lithographically and etched such that silicon regions are present only in regions where transistors are to be formed. Using a standard shallow trench isolation (STI) process, isolation regions in between transistor regions are formed. FIG. 13C illustrates the structure after Step (C). n+ Si regions after this step are indicated as n+ Si region 1308 and p− Si regions after this step are indicated as p− Si region 1306. Oxide regions are indicated as Oxide 1314.

Figure 13D:
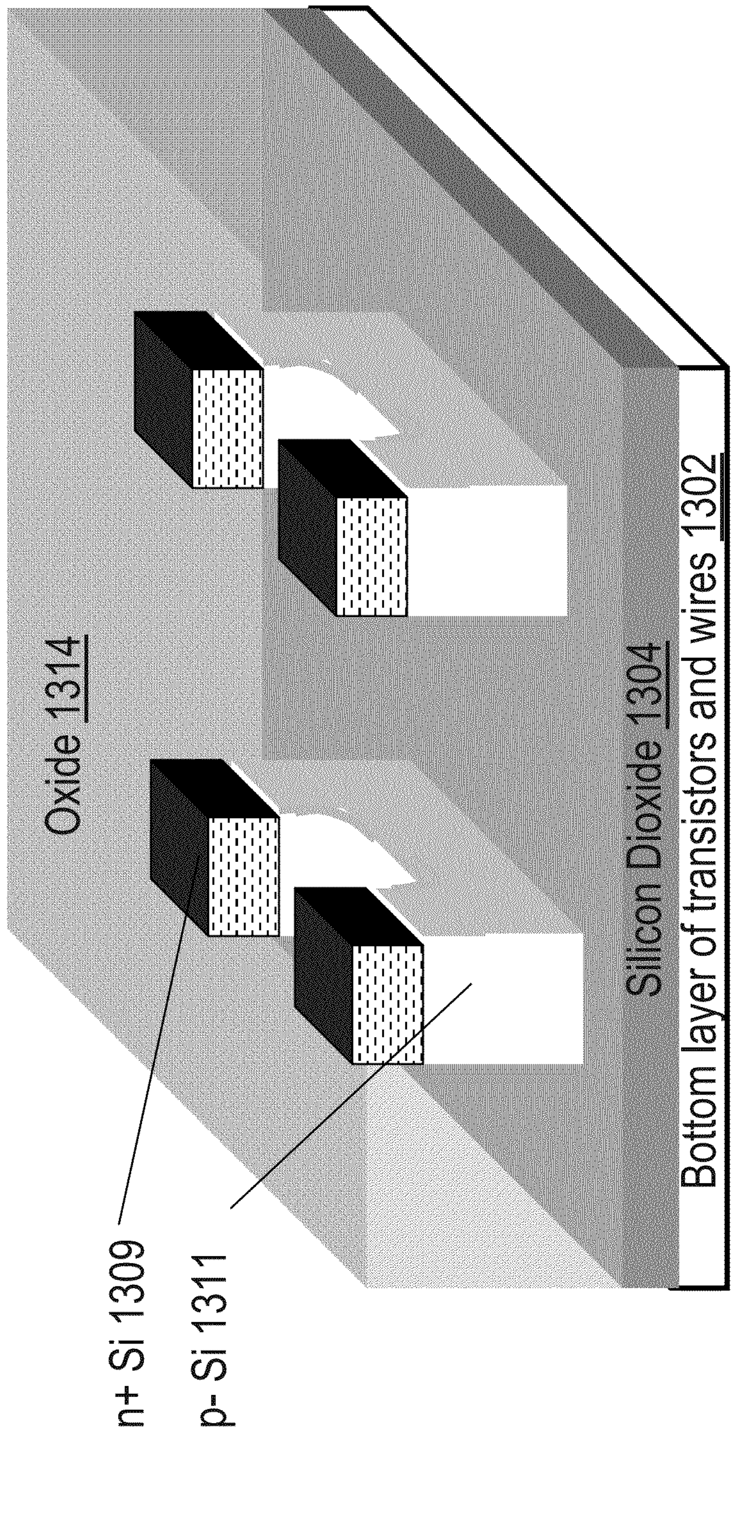
Figure 13E:
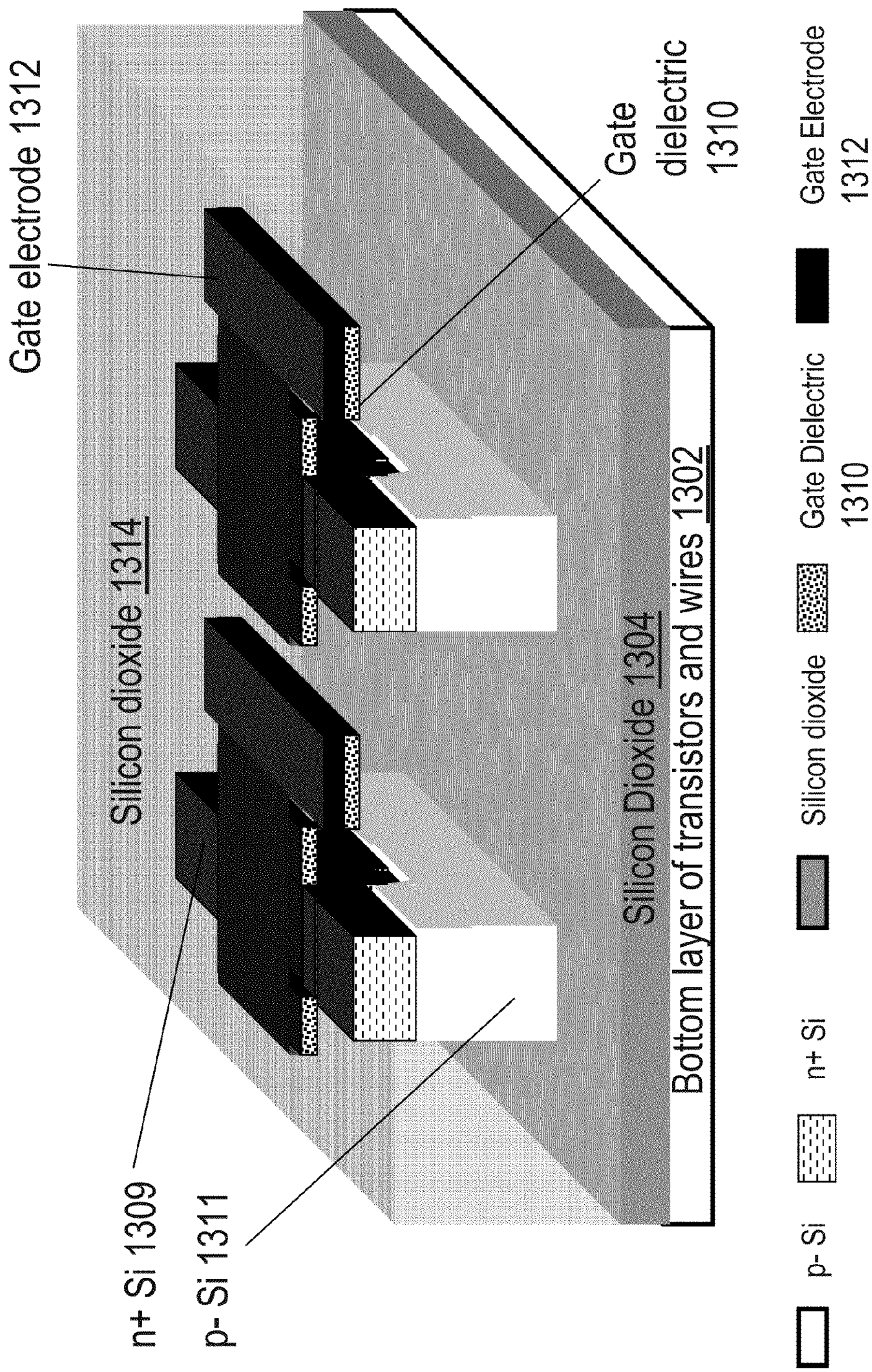

Step (D): Using litho and etch, a recessed channel may be formed by etching away the n+ Si region 1308 and p− Si region 1306 where gates need to be formed. A chemical dry etch process is described in "The breakthrough in data retention time of DRAM using Recess-Channel-Array Transistor(RCAT) for 88 nm feature size and beyond," *VLSI Technology,* 2003. *Digest of Technical Papers.* 2003 *Symposium on,* vol., no., pp. 11-12, 10-12 Jun. 2003 by Kim, J. Y.; Lee, C. S.; Kim, S. E., et al. ("J. Y. Kim"). A variation of this process from J. Y. Kim can be utilized for rounding corners, removing damaged silicon, etc. after the etch. Furthermore, Silicon Dioxide can be formed using a plasma-enhanced thermal oxidation process, this oxide can be etched-back as well to reduce damage from etching silicon. FIG. 13D illustrates the structure after Step (D). n+ Si regions after this step are indicated as n+ Si 1309 and p− Si regions after this step are indicated as p− Si 1311, Step (E): The gate dielectric material and the gate electrode material are deposited, following which a CMP process may be utilized for planarization. The gate dielectric material could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. Litho and etch are conducted to leave the gate dielectric material 1310 and the gate electrode material 1312 only in regions where gates are to be formed. FIG. 13E illustrates the structure after Step (E).

Figure 13F:
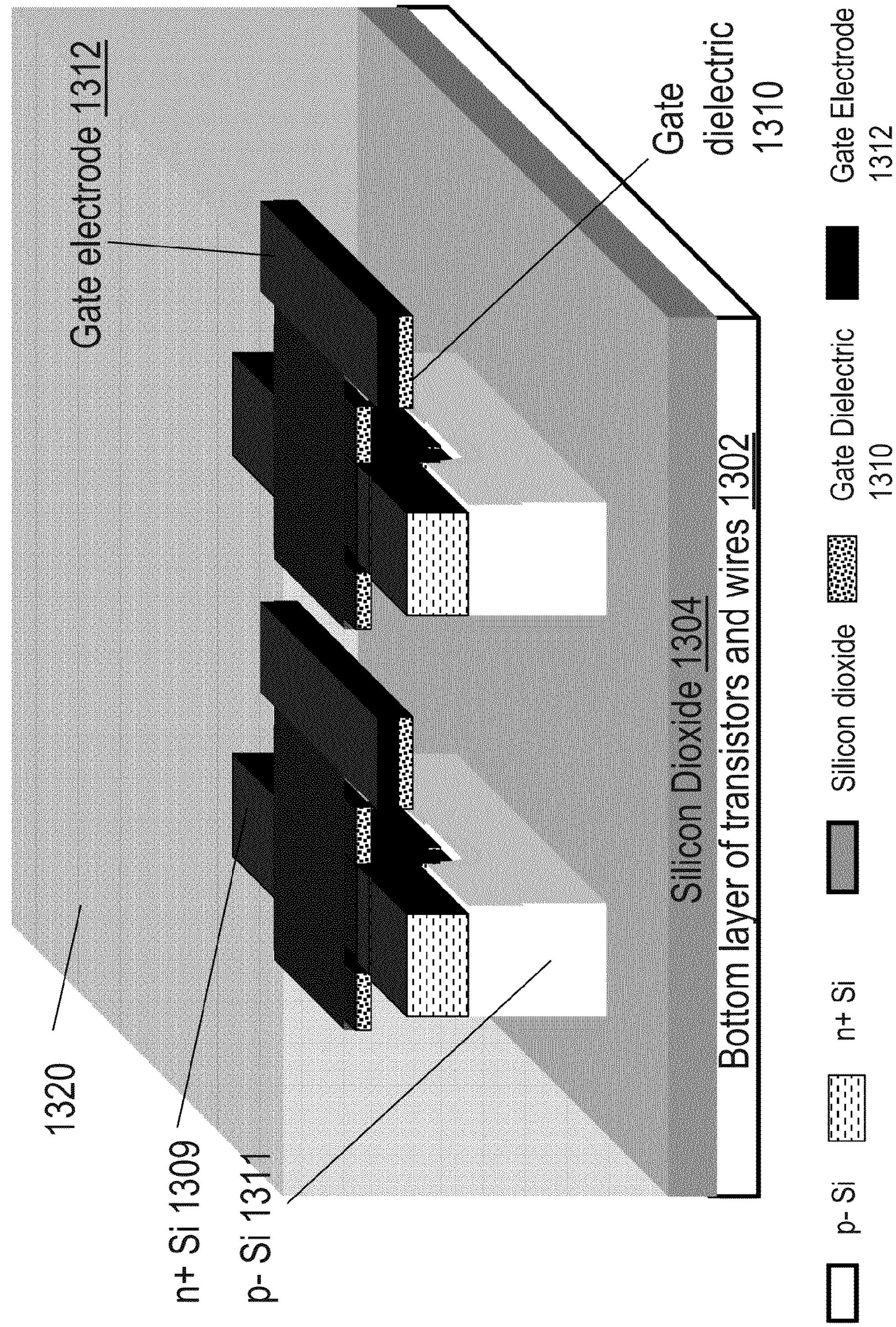

Step (F): An oxide layer 1320 may be deposited and polished with CMP. Following this, rest of the process flow continues, with contact and wiring layers being formed. FIG. 13F illustrates the structure after Step (F).

It may be apparent based on the process flow shown in FIG. 13A-F that no process step at greater than about 400° C. may be required after stacking the top layer of transistors above the bottom layer of transistors and wires. While the process flow shown in FIG. 13A-F gives several steps involved in forming RCATs for 3D stacked circuits and chips, it is conceivable to one skilled in the art that changes to the process can be made. For example, process steps and additional materials/regions to add strain to RCATs can be added. Furthermore, more than two layers of chips or circuits can be 3D stacked. Note that top-level transistors are formed well-aligned to bottom-level wiring and transistor layers. This, in turn, may be due to top-level transistor layers being very thin (typically less than 200 nm). One can look through these thin silicon layers and align to features at the bottom-level. Due to their extensive use in the DRAM industry, several technologies exist to optimize RCAT processes and devices. These are described in "The breakthrough in data retention time of DRAM using Recess-Channel-Array Transistor(RCAT) for 88 nm feature size and beyond," *VLSI Technology,* 2003. *Digest of Technical Papers.* 2003 *Symposium on,* vol., no., pp. 11-12, 10-12 Jun. 2003 by Kim, J. Y.; Lee, C. S.; Kim, S. E., et al. ("J. Y. Kim"), "The excellent scalability of the RCAT (recess-channel-array-transistor) technology for sub-70 nm DRAM feature size and beyond," *VLSI Technology,* 2005. (*VLSI-TSA-Tech*). 2005 *IEEE VLSI-TSA International Symposium on,* vol., no., pp. 33-34, 25-27 Apr. 2005 by Kim, J. Y.; Woo, D. S.; Oh, H. J., et al. ("Kim") and "Implementation of HfSiON gate dielectric for sub-60 nm DRAM dual gate oxide with recess channel array transistor (RCAT) and tungsten gate," *Electron Devices Meeting,* 2004. *IEEE International,* vol., no., pp. 515-518, 13-15 Dec. 2004 by Seong Geon Park; Beom Jun Jin; HyeLan Lee, et al. ("S. G. Park"). It may be conceivable to one skilled in the art that RCAT process and device optimization outlined by J. Y. Kim, Kim, S. G. Park and others can be applied to 3D stacked circuits and chips using RCATs as a building block.

While FIG. 13A-F showed the process flow for constructing RCATs for 3D stacked chips and circuits, the process flow for S-RCATs shown in FIG. 10C may not be very different. The main difference for a S-RCAT process flow may be the silicon etch in Step (D) of FIG. 13A-F. A S-RCAT etch may be more sophisticated, and an oxide spacer may be used on the sidewalls along with an isotropic dry etch process. Further details of a S-RCAT etch and process are given in "S-RCAT (sphere-shaped-recess-channel-array transistor) technology for 70 nm DRAM feature size and beyond," *Digest of Technical Papers.* 2005 *Symposium on VLSI Technology,* 2005 pp. 34-35, 14-16 Jun. 2005 by Kim, J. V.; Oh, H. J.; Woo, D. S., et al. ("J. V. Kim") and "High-density low-power-operating DRAM device adopting 6 $F^2$ cell scheme with novel S-RCAT structure on 80 nm feature size and beyond," *Solid-State Device Research Conference,* 2005. *ESSDERC* 2005. Proceedings of 35*th European,* vol., no., pp. 177-180, 12-16 Sep. 2005 by Oh, H. J.; Kim, J. Y.; Kim, J. H, et al. ("Oh"). The contents of the above publications are incorporated herein by reference.

The recessed channel Finfet shown in FIG. 10D can be constructed using a simple variation of the process flow shown in FIG. 13A-F. A recessed channel Finfet technology and its processing details are described in "Highly Scalable Saddle-Fin (S-Fin) Transistor for Sub-50 nm DRAM Technology," *VLSI Technology,* 2006. *Digest of Technical Papers.* 2006 *Symposium on,* vol., no., pp. 32-33 by Sung-Woong Chung; Sang-Don Lee; Se-Aug Jong, et al. ("S-W Chung") and "A Proposal on an Optimized Device Structure With Experimental Studies on Recent Devices for the DRAM Cell Transistor," *Electron Devices, IEEE Transactions on,* vol. 54, no. 12, pp. 3325-3335, December 2007 by Myoung Jin Lee; Seonghoon Jin; Chang-Ki Baek, et al. ("M. J. Lee"). Contents of these publications are incorporated herein by reference.

Figure 68A:
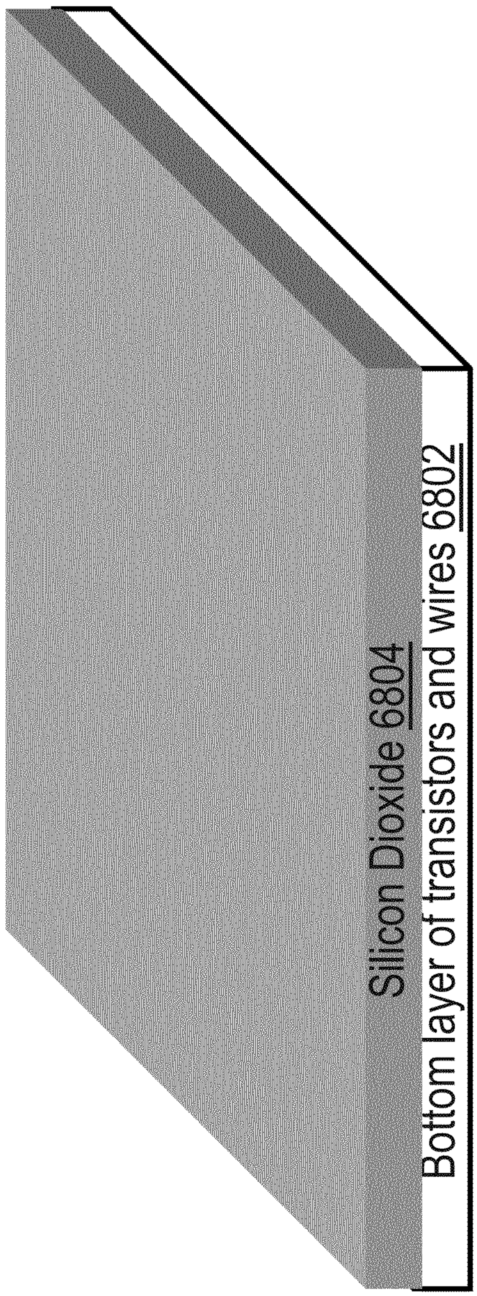
FIG. 68A-E illustrates a technique to construct 3D stacked trench MOSFETs.

FIG. 68A-E depicts a process flow for constructing 3D stacked logic circuits and chips using trench MOSFETs. These types of devices are typically used in power semiconductor applications. These devices can also be utilized for forming 3D stacked circuits and chips with no process steps performed at greater than about 400° C. (after wafer to wafer bonding). The process flow in FIG. 68A-E may include several steps in the following sequence:

Step (A): The bottom layer of the 2 chip 3D stack may be processed with transistors and wires. This is indicated in the figure as bottom layer of transistors and wires 6802. Above this, a silicon dioxide layer 6804 may be deposited. FIG. 68A illustrates the structure after Step (A).

Figure 68B:
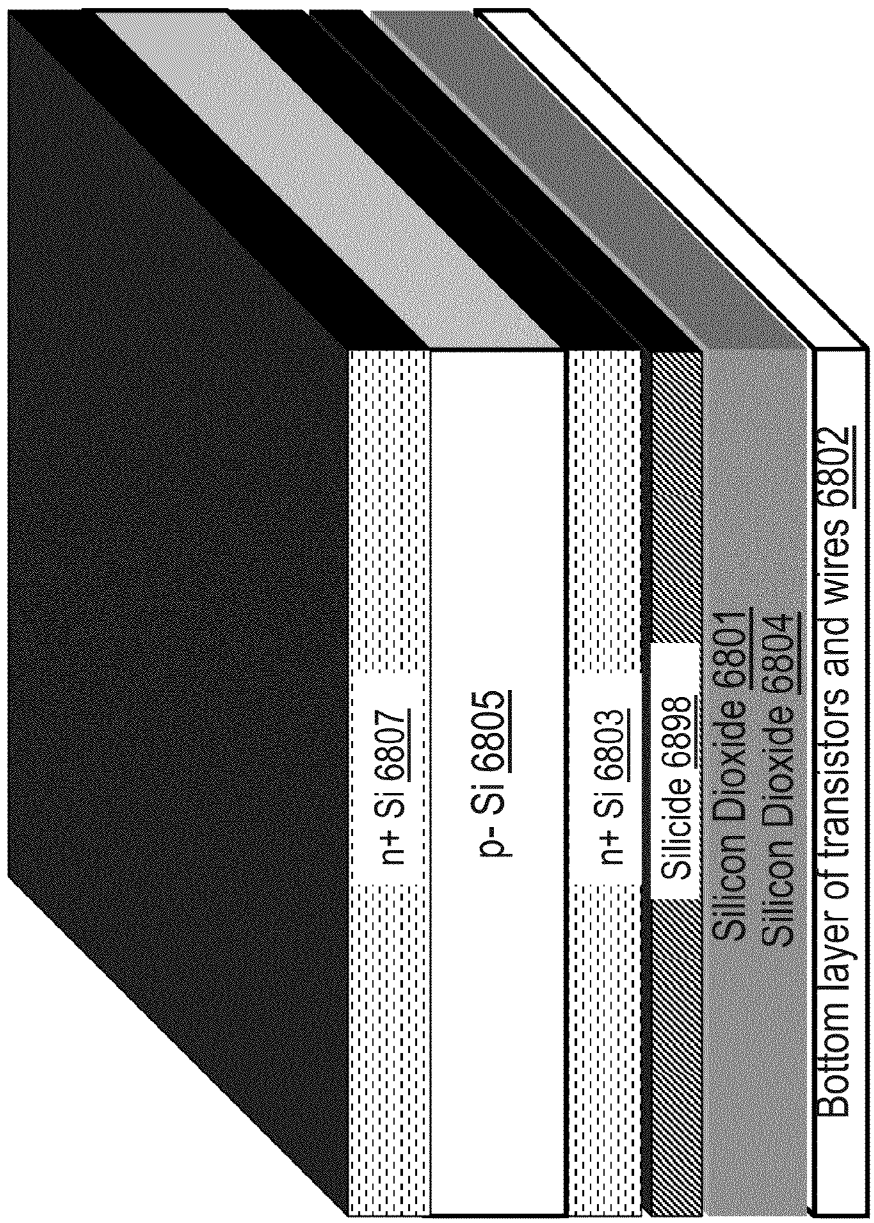

Step (B): Using the procedure similar to the one shown in FIG. 11A-F, a p− Si layer 6805, two n+ Si regions 6803 and 6807 and a silicide region 6898 may be transferred atop the structure shown after Step (A). 6801 represents a silicon oxide region. FIG. 68B illustrates the structure after Step (B).

Figure 68C:
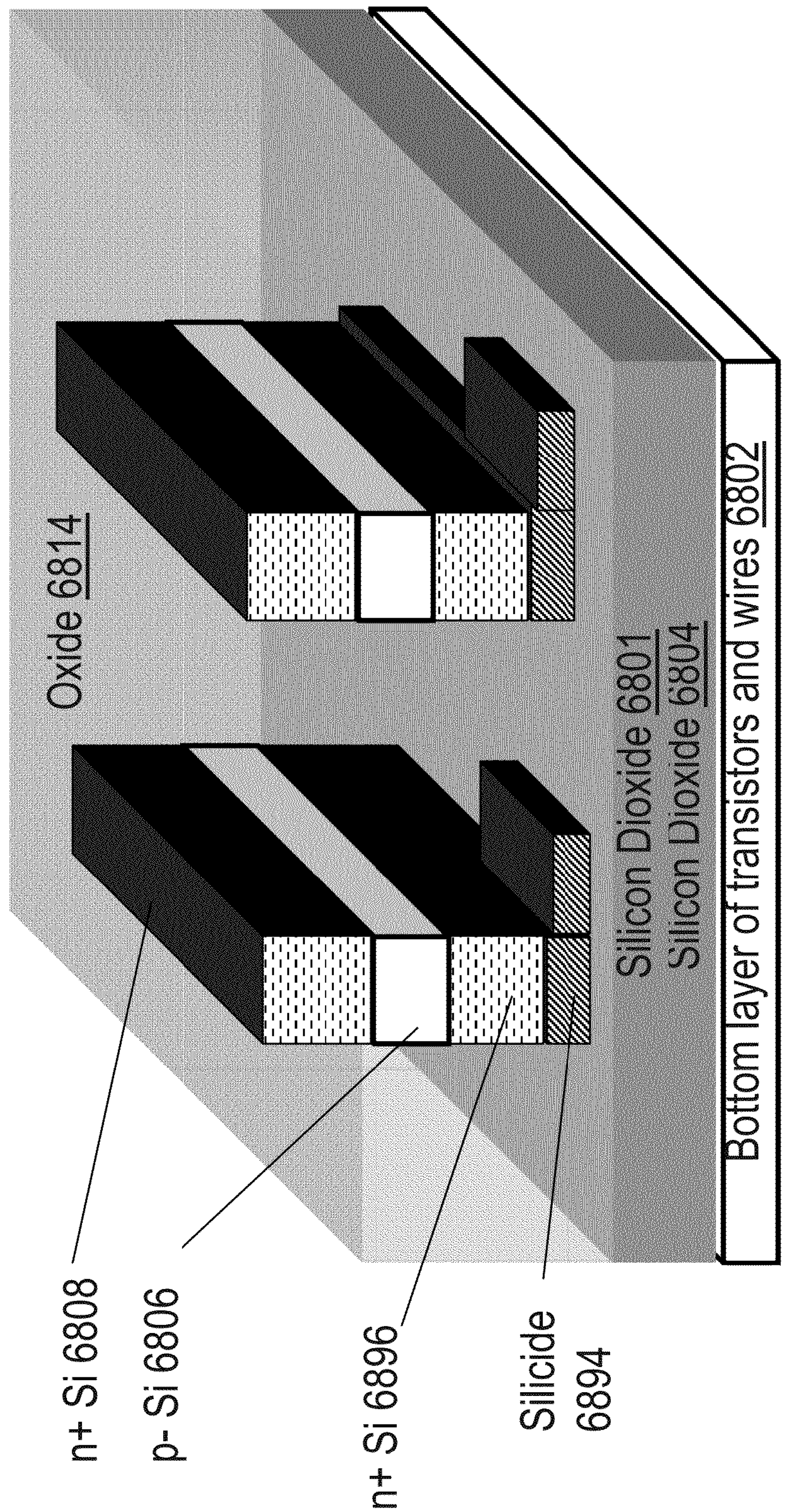

Step (C): The stack shown after Step (B) may be patterned lithographically and etched such that silicon and silicide regions may be present only in regions where transistors and contacts are to be formed. Using a shallow trench isolation (STI) process, isolation regions in between transistor regions may be formed. FIG. 68C illustrates the structure after Step (C). n+ Si regions after this step are indicated as n+ Si 6808 and 6896 and p− Si regions after this step are indicated as p− Si region 6806. Oxide regions are indicated as Oxide 6814. Silicide regions after this step are indicated as 6894.

Figure 68D:
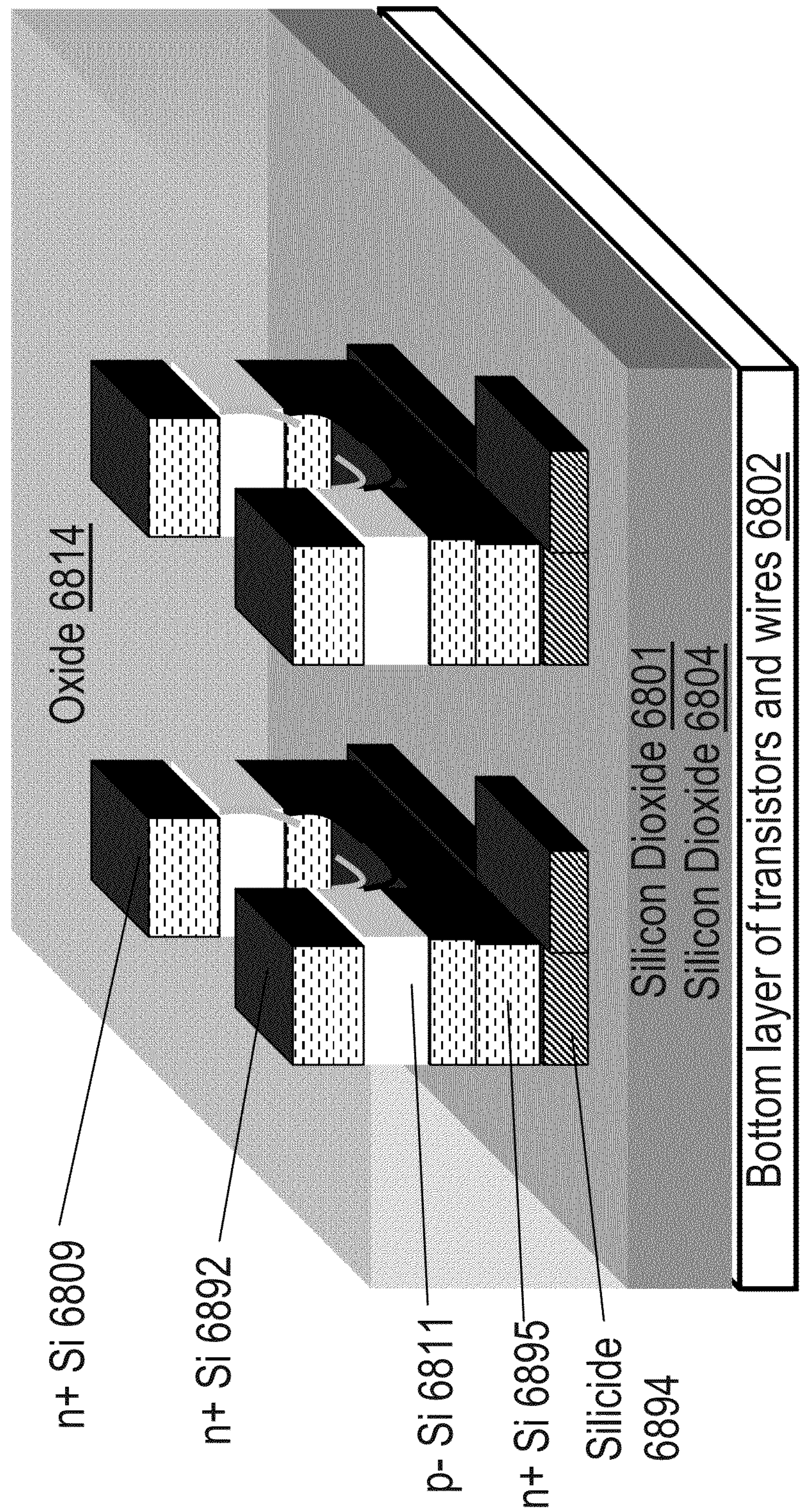

Step (D): Using litho and etch, a trench may be formed by etching away the n+ Si region 6808 and p− Si region 6806 (from FIG. 68C) where gates need to be formed. The angle of the etch may be varied such that either a U shaped trench or a V shaped trench may be formed. A chemical dry etch process is described in "The breakthrough in data retention time of DRAM using Recess-Channel-Array Transistor (RCAT) for 88 nm feature size and beyond," *VLSI Technology*, 2003. *Digest of Technical Papers*. 2003 *Symposium on*, vol., no., pp. 11-12, 10-12 Jun. 2003 by Kim, J. Y.; Lee, C. S.; Kim, S. E., et al. ("J. Y. Kim"). A variation of this process from J. Y. Kim can be utilized for rounding corners, removing damaged silicon, etc. after the etch. Furthermore, Silicon Dioxide can be formed using a plasma-enhanced thermal oxidation process, this oxide can be etched-back as well to reduce damage from etching silicon. FIG. 68D illustrates the structure after Step (D). n+ Si regions after this step are indicated as 6809, 6892 and 6895 and p− Si regions after this step are indicated as p− Si regions 6811.

Figure 68E:
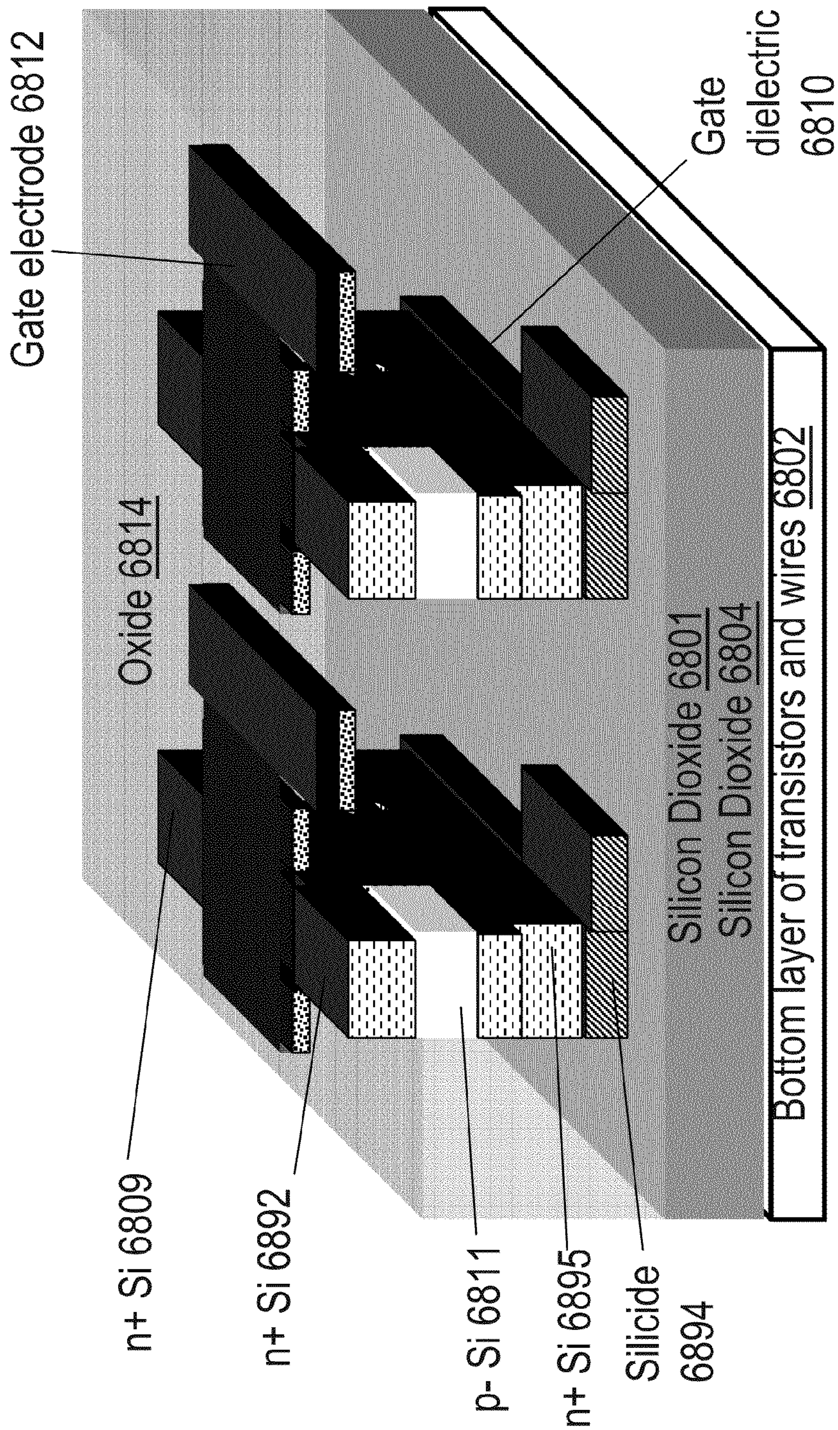

Step (E): The gate dielectric material and the gate electrode material may be deposited, following which a CMP process may be utilized for planarization. The gate dielectric material could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. Litho and etch may be conducted to leave the gate dielectric material 6810 and the gate electrode material 6812 only in regions where gates are to be formed. FIG. 68E illustrates the structure after Step (E). In the transistor shown in FIG. 68E, n+ Si regions 6809 and 6892 may be drain regions of the MOSFET, p− Si regions 6811 may be channel regions and n+ Si region 6895 may be a source region of the MOSFET. Alternatively, n+ Si regions 6809 and 6892 may be source regions of the MOSFET and n+ Si region 6895 may be a drain region of the MOSFET. Following this, rest of the process flow continues, with contact and wiring layers being formed.

It may be apparent based on the process flow shown in FIG. 68A-E that no process step at greater than about 400° C. may be required after stacking the top layer of transistors above the bottom layer of transistors and wires. While the process flow shown in FIG. 68A-E gives several steps involved in forming a trench MOSFET for 3D stacked circuits and chips, it is conceivable to one skilled in the art that changes to the process can be made.

Section 1.3: Improvements and Alternatives Various methods, technologies and procedures to improve devices shown in Section 1.1 and Section 1.2 are given in this section. Single crystal silicon (this term used interchangeably with monocrystalline silicon) may be used for constructing transistors in Section 1.3. Thickness of layer transferred silicon may be typically less than about 2 um or less than about 1 um or could be even less than about 0.2 um, unless stated otherwise. Interconnect (wiring) layers are constructed substantially of copper or aluminum or some other higher conductivity material, such as silver. The term planar transistor or horizontally oriented transistor could be used to describe any constructed transistor where source and drain regions are in the same horizontal plane and current flows between them.

Section 1.3.1: Construction of CMOS Circuits with Sub-400° C. Processed Transistors FIG. 14A-I show procedures for constructing CMOS circuits using sub-400° C. processed transistors (i.e. junction-less transistors and recessed channel transistors) described thus far in this document. When doing layer transfer for junction-less transistors and recessed channel transistors, it may be easy to construct just nMOS transistors in a layer or just pMOS transistors in a layer. However, constructing CMOS circuits requires both nMOS transistors and pMOS transistors, so it requires additional ideas. NMOS transistors may also be called 'p-type' transistors' and PMOS transistors may also be called 'n-type transistors' in this document.

Figure 14A:
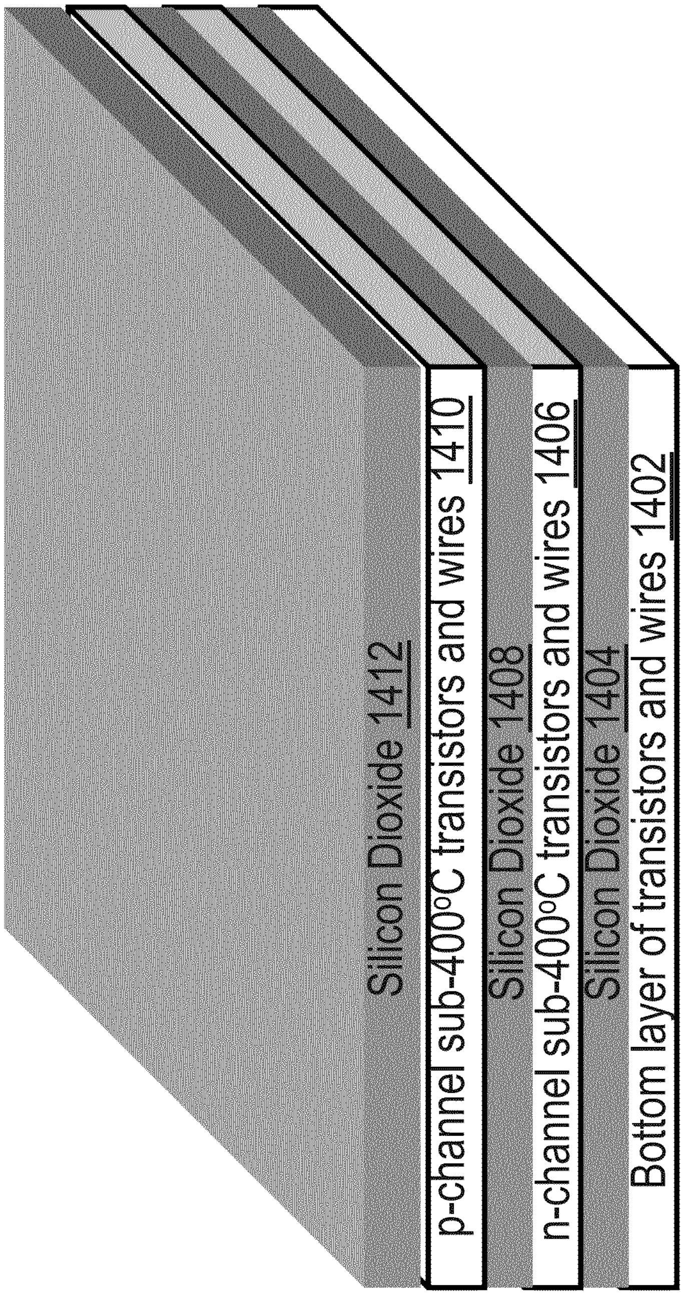
FIG. 14A-I shows construction of CMOS circuits using sub-400° C. transistors (e.g., junction-less transistors or recessed channel transistors).

FIG. 14A shows one procedure for forming CMOS circuits. nMOS and pMOS layers of CMOS circuits are stacked atop each other. A layer of n-channel sub-400° C. transistors (with none or one or more wiring layers) 1406 with associated oxide layer 1404 may be first formed over a bottom layer of transistors and wires 1402. Following this, a layer of p-channel sub-400° C. transistors (with none or one or more wiring layers) 1410 with associated oxide layer 1406 may be formed. Oxide layer 1412 may be deposited over the stack structure. This structure may be important since CMOS circuits typically include both n-channel and p-channel transistors. A high density of connections exists between different layers 1402, 1406 and 1410. The p-channel wafer 1410 could have its own optimized crystal structure that improves mobility of p-channel transistors while the n-channel wafer 1406 could have its own optimized crystal structure that improves mobility of n-channel transistors. For example, it is known that mobility of p-channel transistors may be maximum in the (110) plane while the mobility of n-channel transistors may be maximum in the (100) plane. The wafers 1410 and 1406 could have these optimized crystal structures.

Figure 14B:
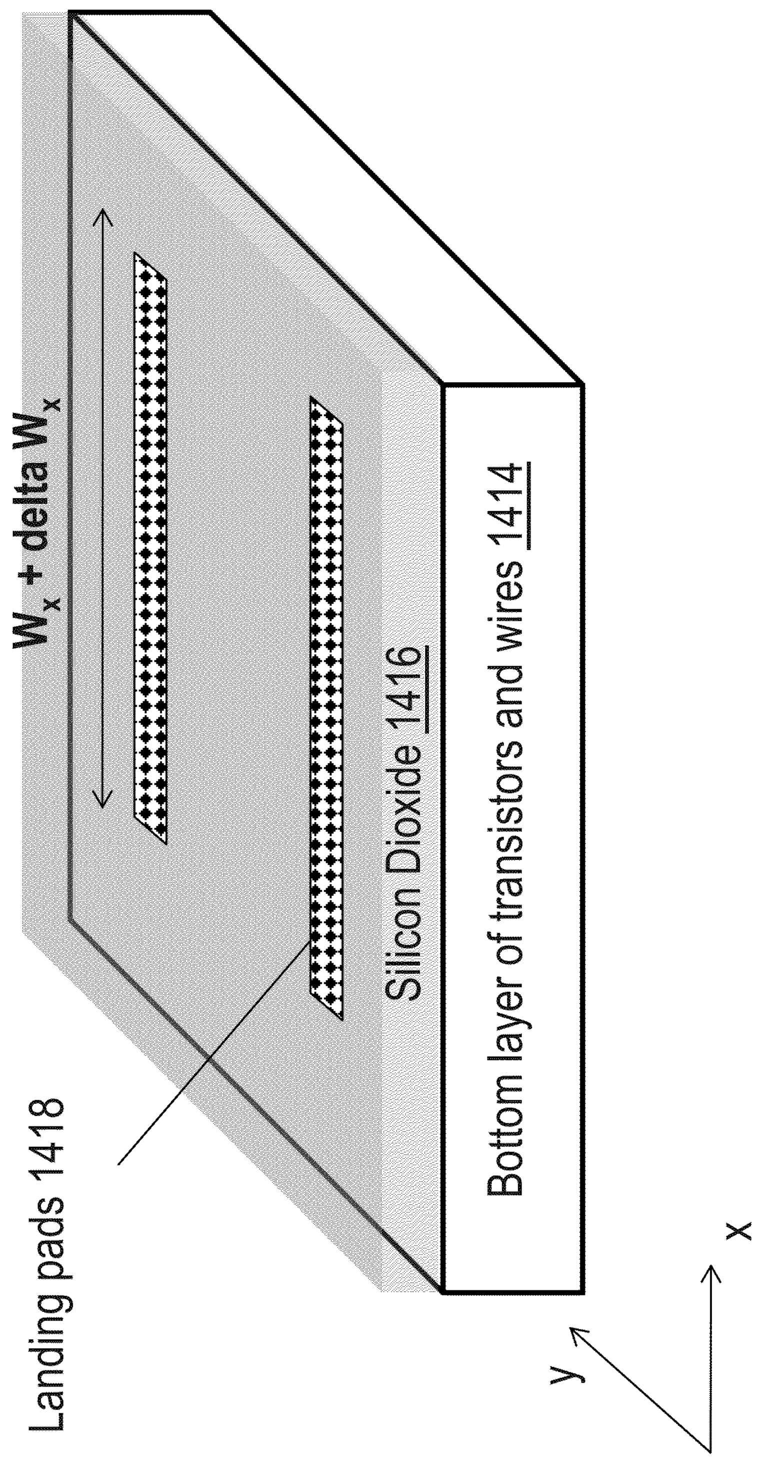

FIG. 14B-F shows another procedure for forming CMOS circuits that utilizes junction-less transistors and repeating layouts in one direction. The procedure may include several steps, in the following sequence:

Step (1): A bottom layer of transistors and wires 1414 may be first constructed above which a layer of landing pads 1418 may be constructed. A layer of silicon dioxide 1416 may be then constructed atop the layer of landing pads 1418. Size of the landing pads 1418 may be $W_x$+delta ($W_x$) in the X direction, where $W_x$ may be the distance of one repeat of the repeating pattern in the (to be constructed) top layer. delta($W_x$) may be an offset added to account for some overlap into the adjacent region of the repeating pattern and some margin for rotational (angular) misalignment within one chip (IC). Size of the landing pads 1418 may be F or 2 F plus a margin for rotational misalignment within one chip (IC) or higher in the Y direction, where F is the minimum feature size. Note that the terms landing pad and metal strip are used interchangeably in this document. FIG. 14B is a drawing illustration after Step (1).

Figure 14C:
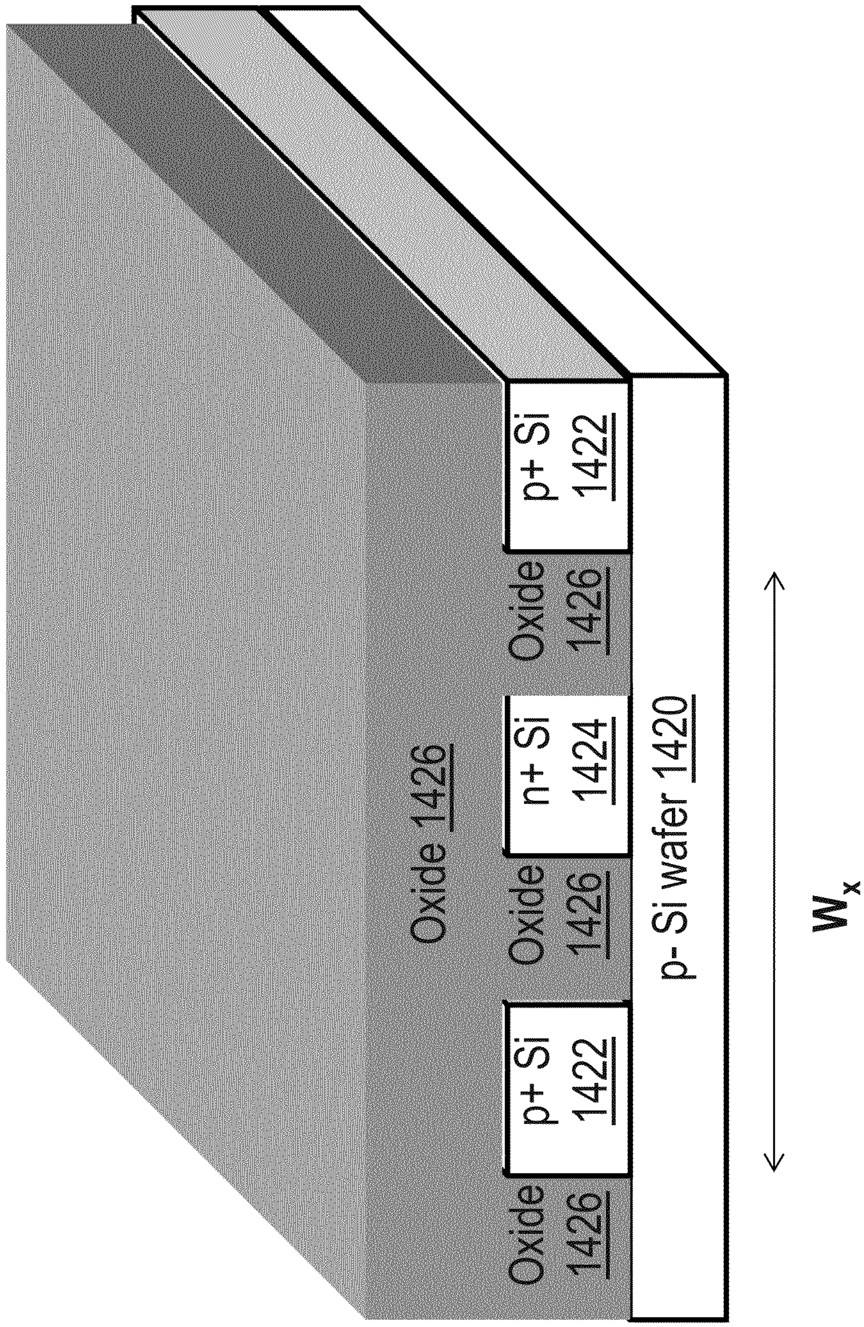

Step (2): A top layer having regions of n+ Si 1424 and p+ Si 1422 repeating over-and-over again may be constructed atop a p− Si wafer 1420 with associated oxide 1426 for isolation. The pattern repeats in the X direction with a repeat distance denoted by $W_x$. In the Y direction, there may be no pattern at all; the wafer may be completely uniform in that direction. This ensures misalignment in the Y direction does not impact device and circuit construction, except for any rotational misalignment causing difference between the left and right side of one IC. A maximum rotational (angular) misalignment of 0.5 um over a 200 mm wafer results in maximum misalignment within one 10 by 10 mm IC of 25 nm in both X and Y direction. Total misalignment in the X direction may be much larger, which is addressed in this invention as shown in the following steps. FIG. 14C shows a drawing illustration after Step (2).

Step (3): The top layer shown in Step (2) receives an H+ implant to create the cleaving plane in the p− silicon region and may be flipped and bonded atop the bottom layer shown in Step (1). A procedure similar to the one shown in FIG. 2A-E may be utilized for this purpose. Note that the top layer shown in Step (2) has had its dopants activated with an anneal before layer transfer. The top layer may be cleaved and the remaining p− region may be etched or polished (CMP) away until only the N+ and P+ stripes remain. During the bonding process, a misalignment can occur in X and Y directions, while the angular alignment may be typically small. This may be because the misalignment may be due to factors like wafer bow, wafer expansion due to thermal differences between bonded wafers, etc.; these issues do not typically cause angular alignment problems, while they impact alignment in X and Y directions.

Figure 14D:
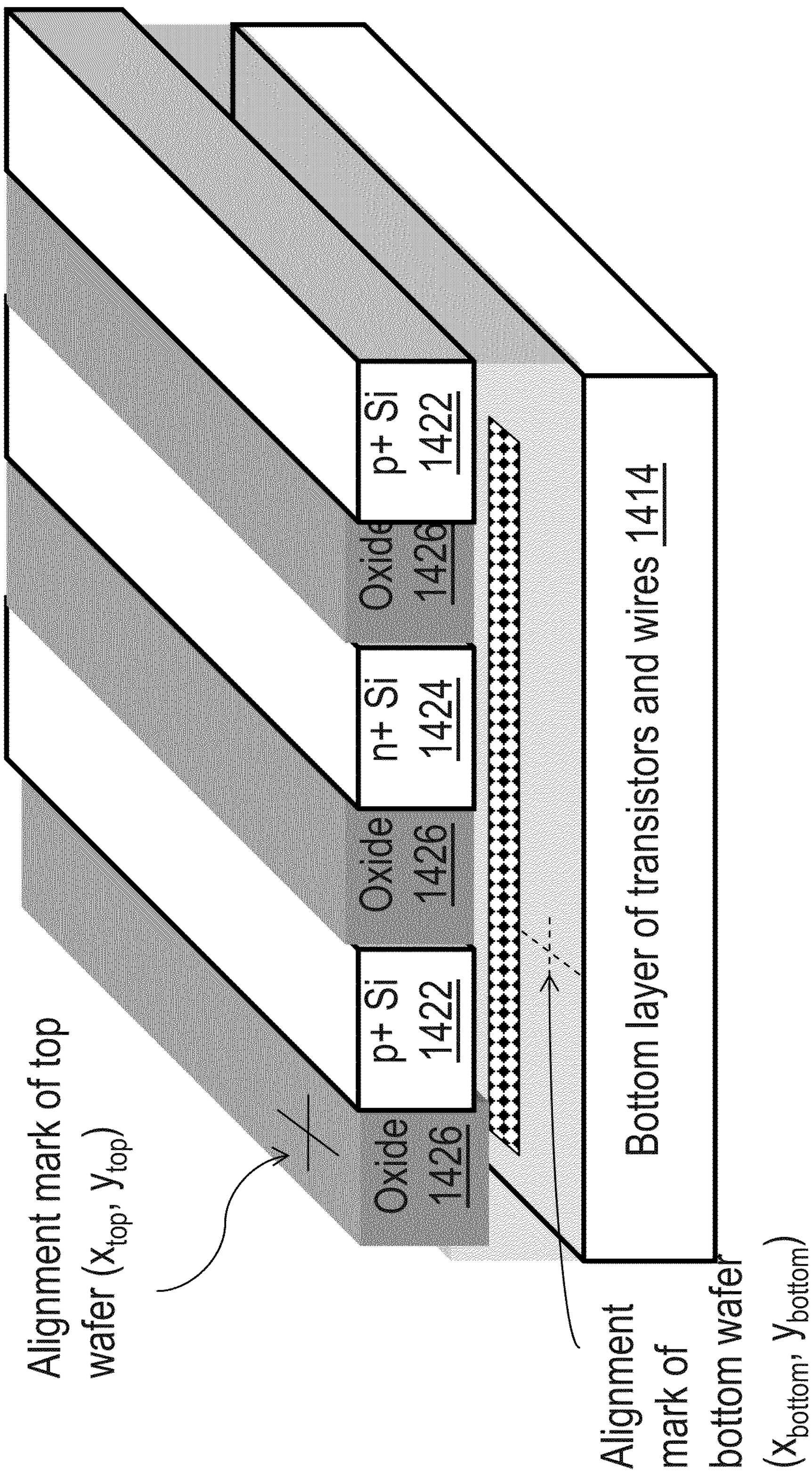

Since the width of the landing pads may be slightly wider than the width of the repeating n and p pattern in the X-direction and there's no pattern in the Y direction, the circuitry in the top layer can shifted left or right and up or down until the layer-to-layer contacts within the top circuitry are placed on top of the appropriate landing pad. This is further explained below:

Let us assume that after the bonding process, co-ordinates of alignment mark of the top wafer are ($x_{top}$, $y_{top}$) while co-ordinates of alignment mark of the bottom wafer are ($x_{bottom}$, $y_{bottom}$). FIG. 14D shows a drawing illustration after Step (3).

Figure 14E:
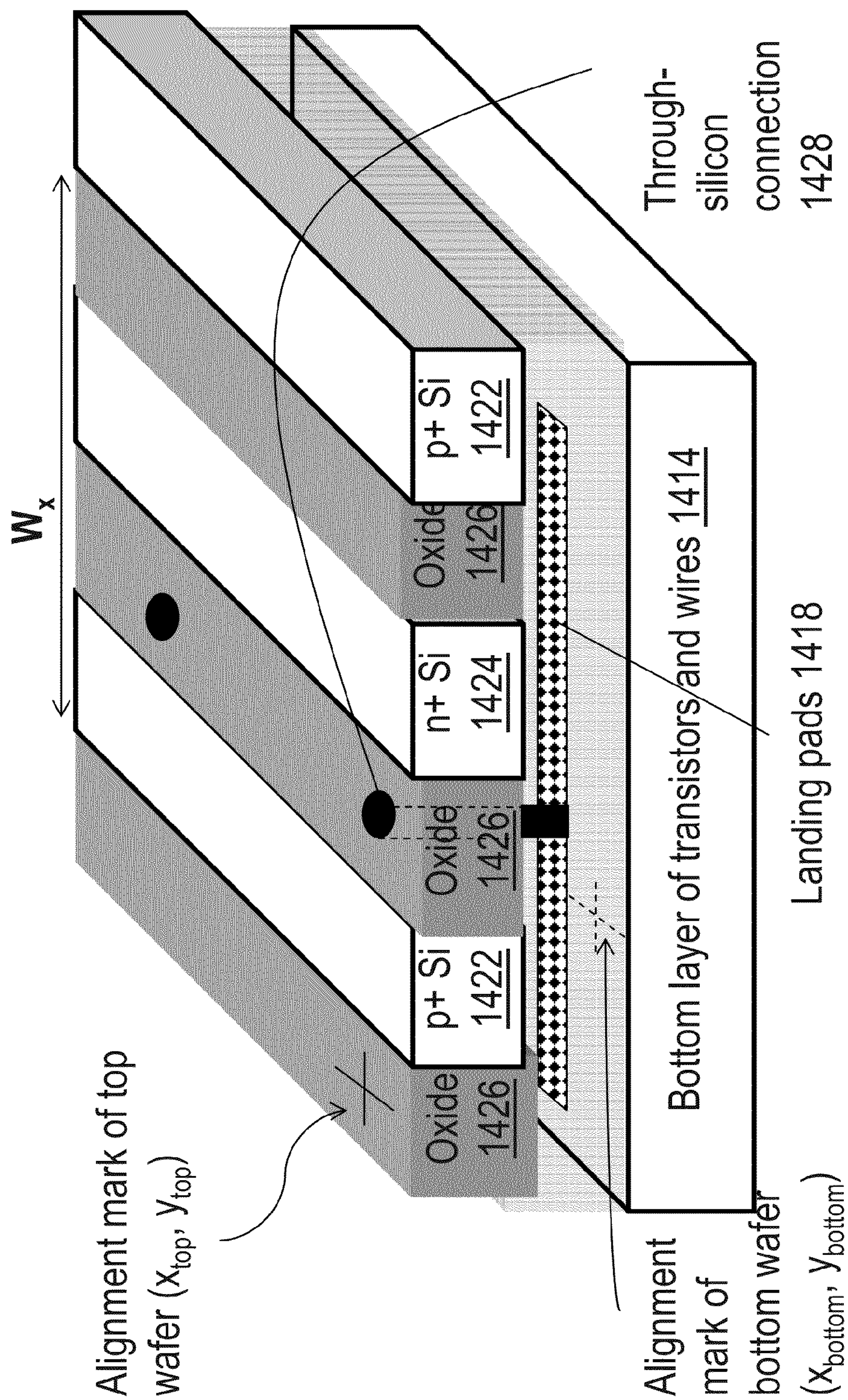

Step (4): A virtual alignment mark may be created by the lithography tool. X co-ordinate of this virtual alignment mark may be at the location ($x_{top}$+(an integer k)*$W_x$). The integer k may be chosen such that modulus or absolute value of ($x_{top}$+(integer k)*$W_x$−$x_{bottom}$)<=$W_x$/2. This guarantees that the X co-ordinate of the virtual alignment mark may be within a repeat distance (or within the same section of width $W_x$) of the X alignment mark of the bottom wafer. Y co-ordinate of this virtual alignment mark may be $y_{bottom}$ (since silicon thickness of the top layer may be thin, the lithography tool can see the alignment mark of the bottom wafer and compute this quantity). Though-silicon connections 1428 are now constructed with alignment mark of this mask aligned to the virtual alignment mark. The terms through via or through silicon vias can be used interchangeably with the term through-silicon connections in this document. Since the X co-ordinate of the virtual alignment mark may be within the same ((p+)-oxide-(n+)-oxide) repeating pattern (of length $W_x$) as the bottom wafer X alignment mark, the through-silicon connection 1428 substantially always falls on the bottom landing pad 1418 (the bottom landing pad length may be $W_x$ added to delta ($W_x$), and this spans the entire length of the repeating pattern in the X direction). FIG. 14E is a drawing illustration after Step (4).

Figure 14F:
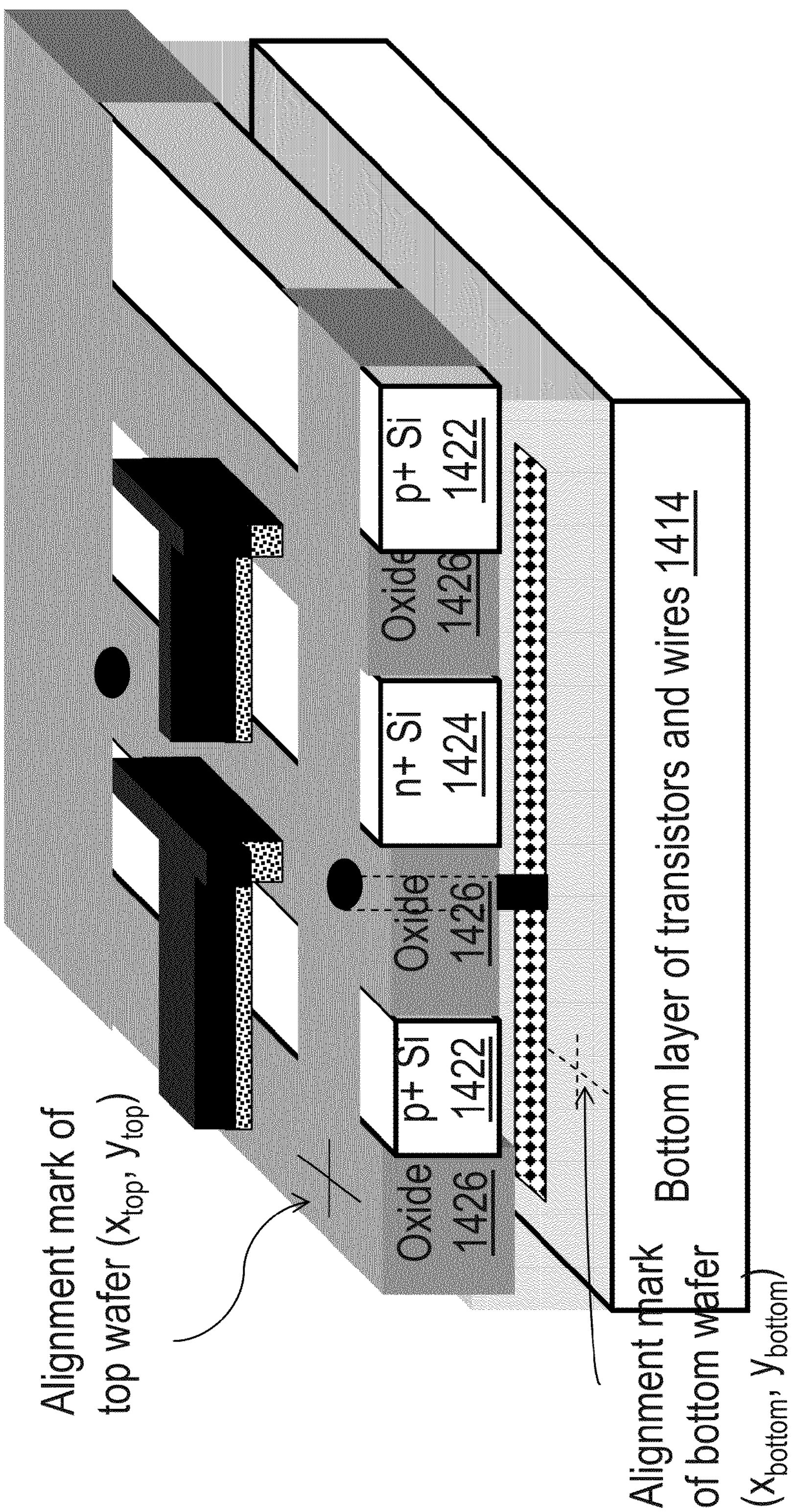

Step (5): n channel and p channel junction-less transistors are constructed aligned to the virtual alignment mark. FIG. 14F is a drawing illustration after Step (5).

From steps (1) to (5), it may be clear that 3D stacked semiconductor circuits and chips can be constructed with misalignment tolerance techniques. Essentially, a combination of 3 key ideas—repeating patterns in one direction of length $W_x$, landing pads of length ($W_x$+delta ($W_x$)) and creation of virtual alignment marks—are used such that even if misalignment occurs, through silicon connections fall on their respective landing pads. While the explanation in FIG. 14B-F is shown for a junction-less transistor, similar procedures can also be used for recessed channel transistors. Thickness of the transferred single crystal silicon or mono-crystalline silicon layer may be less than about 2 um, and can be even lower than about 1 um or about 0.4 um or about 0.2 um.

Figure 14H:
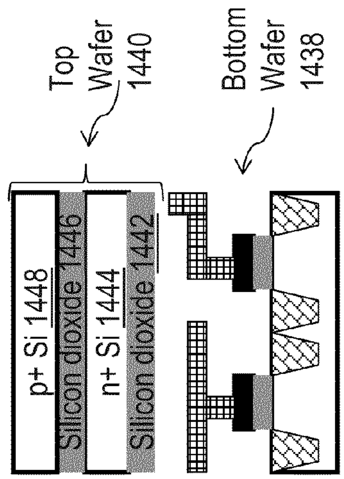
Figure 14G:
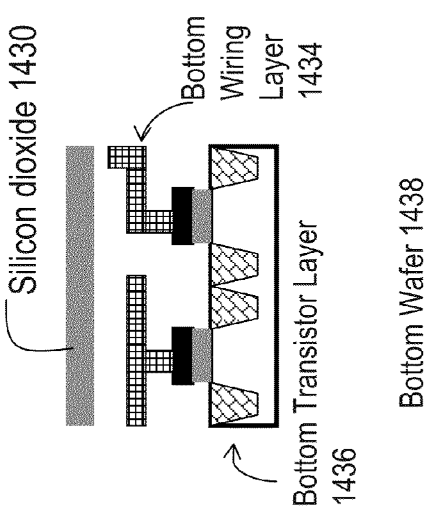
Figure 14I:
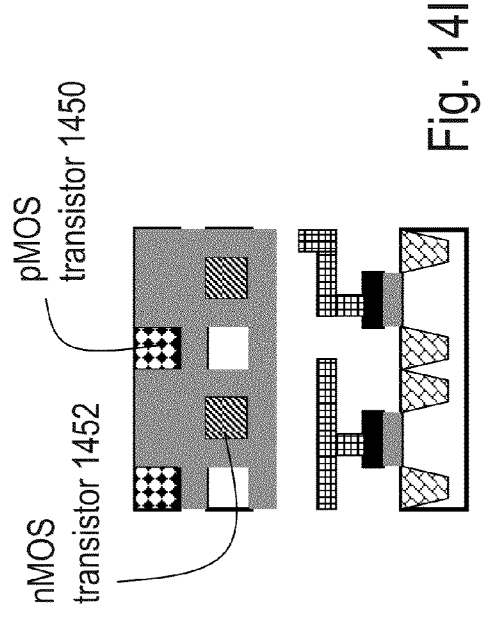

FIG. 14G-I shows yet another procedure for forming CMOS circuits with processing temperatures below about 400° C. such as the junction-less transistor and recessed channel transistors. While the explanation in FIG. 14G-I may be shown for a junction-less transistor, similar procedures can also be used for recessed channel transistors. The procedure may include several steps as described in the following sequence:

Step (A): A bottom wafer 1438 may be processed with a bottom transistor layer 1436 and a bottom wiring layer 1434. A layer of silicon oxide 1430 may be deposited above it. FIG. 14G is a drawing illustration after Step (A).

Step (B): Using a procedure similar to FIG. 2A-E (as was presented in FIG. 5A-F), layers of n+ Si 1444 and p+ Si 1448 with associated oxide layer 1444 and oxide layer 1446 may be transferred above the bottom wafer 1438 one after another. The top wafer 1440 therefore may include a bilayer of n+ and p+ Si with associated oxide layer 1444 and oxide layer 1446. Oxide layer 1430, utilized in the layer transfer process, is not shown for illustration clarity. FIG. 14H is a drawing illustration after Step (B).

Step (C): p-channel junction-less transistors 1450 of the CMOS circuit can be formed on the p+ Si layer 1448 with standard procedures. For n-channel junction-less transistors 1452 of the CMOS circuit, one needs to etch through the p+ layer 1448 to reach the n+ Si layer 1444. Transistors are then constructed on the n+ Si 1444. Depth-of-focus issues associated with lithography may lead to separate lithography steps while constructing different parts of n-channel and p-channel transistors. FIG. 14I is a drawing illustration after Step (C).

Section 1.3.2: Accurate Transfer of Thin Layers of Silicon with Ion-Cut

Figure 15B:
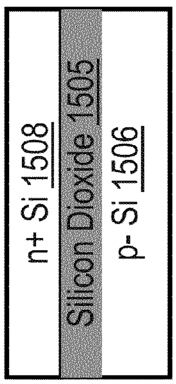
FIG. 15A-F shows a procedure for accurate layer transfer of thin silicon regions.
Figure 15D:
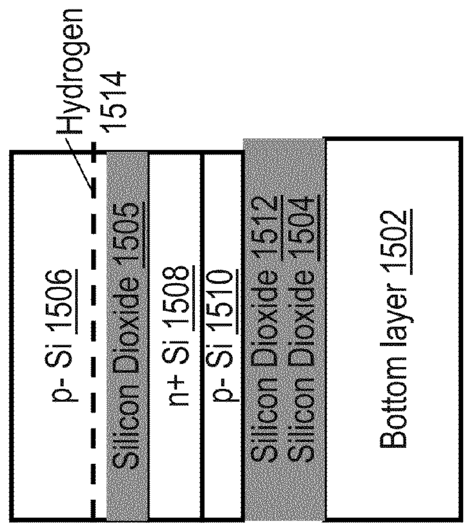
Figure 15A:
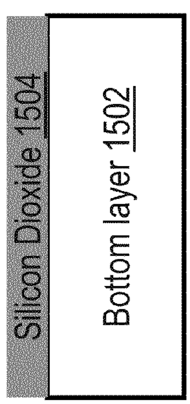

It may be desirable to transfer very thin layers of silicon (less than about 100 nm) atop a bottom layer of transistors and wires using the ion-cut technique. For example, for the process flow in FIG. 11A-F, it may be desirable to have very thin layers (<100 nm) of n+ Si 1109. In that scenario, implanting hydrogen and cleaving the n+ region may not give the exact thickness of n+ Si desirable for device operation. An improved process for addressing this issue is shown in FIG. 15A-F. The process flow in FIG. 15A-F may include several steps as described in the following sequence:

Step (A): A silicon dioxide layer 1504 may be deposited above the generic bottom layer 1502. FIG. 15A illustrates the structure after Step (A).

Step (B): An SOI wafer 1506 may be implanted with n+ near its surface to form a n+ Si layer 1508. The buried oxide (BOX) of the SOI wafer may be silicon dioxide layer 1505. FIG. 15B illustrates the structure after Step (B).

Step (C): A p− Si layer 1510 may be epitaxially grown atop the n+ Si layer 1508. A silicon dioxide layer 1512 may be deposited atop the p− Si layer 1510. An anneal (such as a rapid thermal anneal RTA or spike anneal or laser anneal) may be conducted to activate dopants. Alternatively, the n+ Si layer 1508 and p− Si layer 1510 can be formed by a buried layer implant of n+ Si in a p− SOI wafer.

Figure 15C:
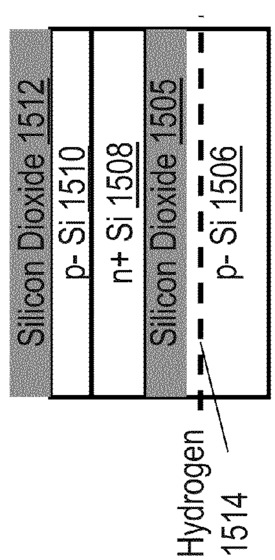

Hydrogen may be then implanted into the SOI wafer 1506 at a certain depth to form hydrogen plane 1514. Alternatively, another atomic species such as helium can be implanted or co-implanted. FIG. 15C illustrates the structure after Step (C).

Step (D): The top layer wafer shown after Step (C) may be flipped and bonded atop the bottom layer wafer using oxide-to-oxide bonding. FIG. 15D illustrates the structure after Step (D).

Figure 15F:
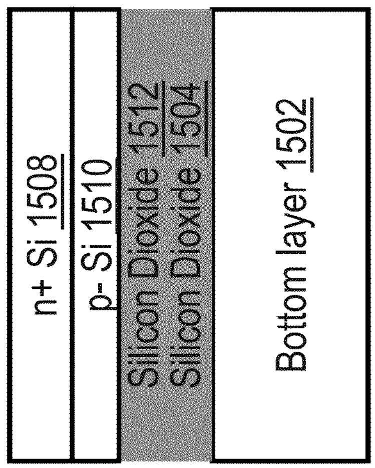
Figure 15E:
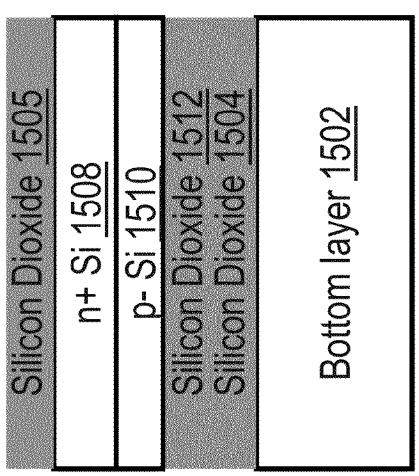

Step (E): A cleave operation may be performed at the hydrogen plane 1514 using an anneal. Alternatively, a sideways mechanical force may be used. Following this, an etching process that etches Si but does not etch silicon dioxide may be utilized to remove the p− Si layer of SOI wafer 1506 remaining after cleave. The buried oxide (BOX) silicon dioxide layer 1505 acts as an etch stop. FIG. 15E illustrates the structure after Step (E).

Step (F): Once the etch stop silicon dioxide layer 1505 may be reached, an etch or CMP process may be utilized to etch the silicon dioxide layer 1505 till the n+ silicon layer 1508 may be reached. The etch process for Step (F) may be preferentially chosen so that it etches silicon dioxide but does not attack Silicon. For example, a dilute hydrofluoric acid solution may be utilized. FIG. 15F illustrates the structure after Step (F).

It is clear from the process shown in FIG. 15A-F that one can get excellent control of the n+ layer 1508's thickness after layer transfer.

Figure 16A:
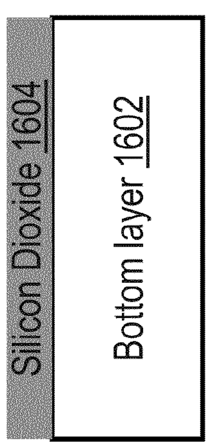
FIG. 16A-F shows an alternative procedure for accurate layer transfer of thin silicon regions.

While the process shown in FIG. 15A-F results in accurate layer transfer of thin regions, it has some drawbacks. SOI wafers are typically quite costly, and utilizing an SOI wafer just for having an etch stop layer may not typically be economically viable. In that case, an alternative process shown in FIG. 16A-F could be utilized. The process flow in FIG. 16A-F may include several steps as described in the following sequence:

Step (A): A silicon dioxide layer 1604 may be deposited above the generic bottom layer 1602. FIG. 16A illustrates the structure after Step (A).

Figure 16B:
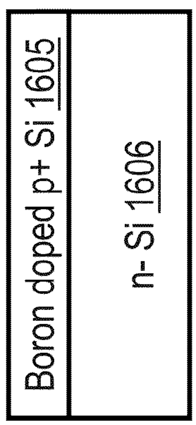

Step (B): A n− Si wafer 1606 may be implanted with boron doped p+ Si near its surface to form a p+ Si layer 1605. The p+ layer may be doped above $1E20/cm^3$, and preferably above $1E21/cm^3$. It may be possible to use a p− Si layer instead of the p+ Si layer 1605 as well, and still achieve similar results. A p− Si wafer can be utilized instead of the n− Si wafer 1606 as well. FIG. 16B illustrates the structure after Step (B).

Step (C): A n+ Si layer 1608 and a p− Si layer 1610 are epitaxially grown atop the p+ Si layer 1605. A silicon dioxide layer 1612 may be deposited atop the p− Si layer 1610. An anneal (such as a rapid thermal anneal RTA or spike anneal or laser anneal) may be conducted to activate dopants.

Alternatively, the p+ Si layer 1605, the n+ Si layer 1608 and the p− Si layer 1610 can be formed by a series of implants on a n− Si wafer 1606.

Figure 16C:
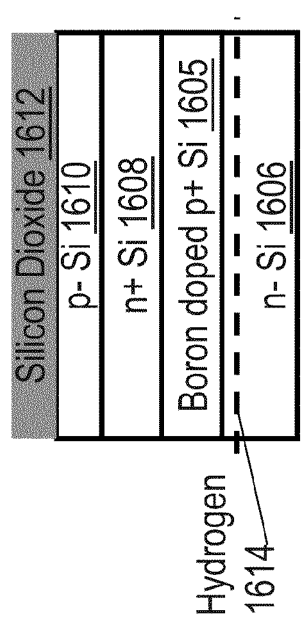

Hydrogen may be then implanted into the n− Si wafer 1606 at a certain depth to form hydrogen plane 1614. Alternatively, another atomic species such as helium can be implanted. FIG. 16C illustrates the structure after Step (C).

Figure 16D:
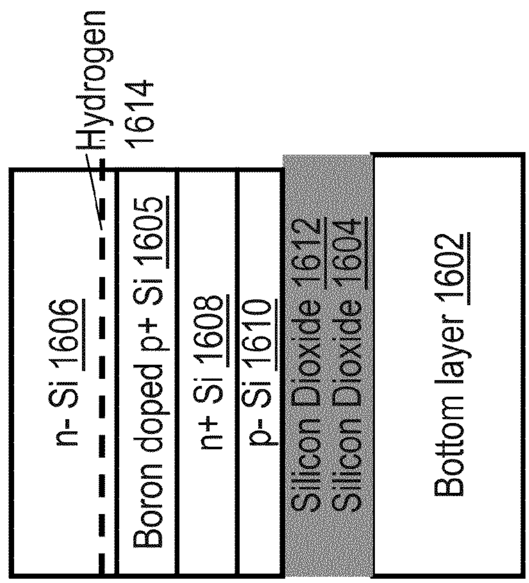

Step (D): The top layer wafer shown after Step (C) may be flipped and bonded atop the bottom layer wafer using oxide-to-oxide bonding. FIG. 16D illustrates the structure after Step (D).

Figure 16F:
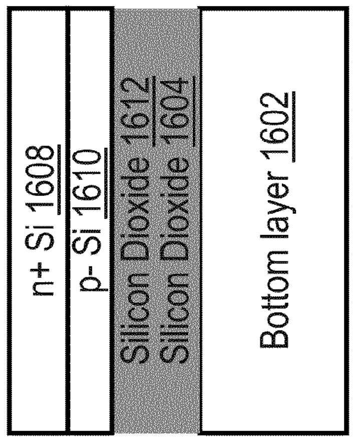
Figure 16E:
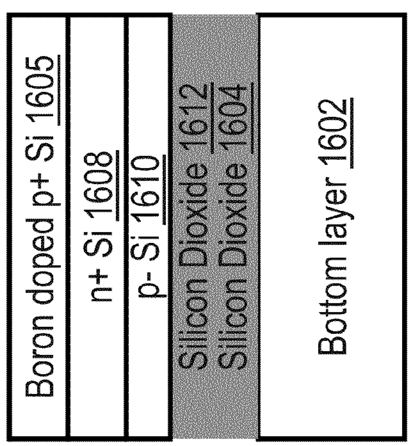

Step (E): A cleave operation may be performed at the hydrogen plane 1614 using an anneal. Alternatively, a sideways mechanical force may be used. Following this, an etching process that etches the remaining n− Si layer of n− Si wafer 1606 but does not etch the p+ Si etch stop layer 1605 may be utilized to etch through the n-Si layer of n− Si wafer 1606 remaining after cleave. Examples of etching agents that etch n− Si or p− Si but do not attack p+ Si doped above $1E20/cm^3$ include KOH, EDP (ethylenediamine/pyrocatechol/water) and hydrazine. FIG. 16E illustrates the structure after Step (E).

Step (F): Once the etch stop 1605 may be reached, an etch or CMP process may be utilized to etch the p+ Si layer 1605 till the n+ silicon layer 1608 may be reached. FIG. 16F illustrates the structure after Step (F).

It is clear from the process shown in FIG. 16A-F that one can get excellent control of the n+ layer 1608's thickness after layer transfer.

While silicon dioxide and p+ Si were utilized as etch stop layers in FIG. 15A-F and FIG. 16A-F respectively, other etch stop layers such as SiGe could be utilized. An etch stop layer of SiGe can be incorporated in the middle of the structure shown in FIG. 16A-F using an epitaxy process.

An additional alternative to the use of an SOI donor wafer or the use of ion-cut methods to enable a layer transfer of a well-controlled thin layer of pre-processed layer or layers of semiconductor material, devices, or transistors to the acceptor wafer or substrate may be illustrated in FIGS. 147A to C. An additional embodiment of the invention is to form and utilize layer transfer demarcation plugs to provide an etch-back stop or marker, or etch stop indicator, for the controlled thinning of the donor wafer.

As illustrated in FIG. 147A, a generalized process flow may begin with a donor wafer 14700 that may be preprocessed with layers 14702 which may include, for example, conducting, semi-conducting or insulating materials that may be formed by deposition, ion implantation and anneal, oxidation, epitaxial growth, combinations of above, or other semiconductor processing steps and methods. Additionally, donor wafer 14700 may be a fully formed CMOS or other device type wafer, wherein layers 14702 may include, for example, transistors and metal interconnect layers, the metal interconnect layers may include, for example, aluminum or copper material. Donor wafer 14700 may be a partially processed CMOS or other device type wafer, wherein layers 14702 may include, for example, transistors and an interlayer dielectric deposited that may be processed just prior to the first contact lithographic step. Layer transfer demarcation plugs (LTDPs) 14730 may be lithographically defined and then plasma/RIE etched to a depth (shown) of approximately the layer transfer demarcation plane 14799. The LTDPs 14730 may also be etched to a depth past the layer transfer demarcation plane 14799 and further into the donor wafer 14700 or to a depth that may be shallower than the layer transfer demarcation plane 14799. The LTDPs 14730 may be filled with an etch-stop material, such as, for example, silicon dioxide, tungsten, heavily doped P+ silicon or polycrystalline silicon, copper, or a combination of etch-stop materials, and planarized with a process such as, for example, chemical mechanical polishing (CMP) or RIE/plasma etching. Donor wafer 14700 may be further thinned by CMP. The placement on donor wafer 14700 of the LTDPs 14730 may include, for example, in the scribelines, white spaces in the preformed circuits, or any pattern and density for use as electrical or thermal coupling between donor and acceptor layers. The term white spaces may be understood as areas on an integrated circuit wherein the density of structures above the silicon layer may be small enough, allowing other structures, such as LTDPs, to be placed with minimal impact to the existing structure's layout position and organization. The size of the LTDPs 14730 formed on donor wafer 14700 may include, for example, diameters of the state of the art process via or contact, or may be larger or smaller than the state of the art. LTDPs 14730 may be processed before or after layers 14702 are formed. Further processing to complete the devices and interconnection of layers 14702 on donor wafer 14700 may take place after the LTDPs 14730 are formed. Acceptor wafer 14710 may be a preprocessed wafer that has fully functional circuitry or may be a wafer with previously transferred layers, or may be a blank carrier or holder wafer, or other kinds of substrates and may be called a target wafer. The acceptor wafer 14710 and the donor wafer 14700 may be, for example, a bulk mono-crystalline silicon wafer or a Silicon On Insulator (SOI) wafer or a Germanium on Insulator (GeOI) wafer. Acceptor wafer 14710 may have metal landing pads and metal landing strips and acceptor wafer alignment marks as described elsewhere in this document.

Both the donor wafer 14700 and the acceptor wafer 14710 bonding surfaces 14701 and 14711 may be prepared for wafer bonding by depositions, polishes, plasma, or wet chemistry treatments to facilitate successful wafer to wafer bonding.

As illustrated in FIG. 147B, the donor wafer 14700 with layers 14702, LTDPs 14730, and layer transfer demarcation plane 14799 may then be flipped over, aligned and bonded to the acceptor wafer 14710 as previously described.

As illustrated in FIG. 147C, the donor wafer 14700 may be thinned to approximately the layer transfer demarcation plane 14799, leaving a portion of the donor wafer 14700', LTDPs 14730' and the pre-processed layers 14702 aligned and bonded to the acceptor wafer 14710. The donor wafer 14700 may be controllably thinned to the layer transfer demarcation plane 14799 by utilizing the LTDPs 14730 as etch stops or etch stopping indicators. For example, the LTDPs 14730 may be substantially composed of heavily doped P+ silicon. The thinning process, such as CMP with pressure force or optical detection, wet etch with optical detection, plasma etching with optical detection, or mist/spray etching with optical detection, may incorporate a selective etch chemistry, such as, for example, etching agents that etch n− Si or p− Si but do not attack p+ Si doped above $1E20/cm^3$ include KOH, EDP (ethylenediamine/pyrocatechol/water) and hydrazine, that etches lightly doped silicon quickly but has a very slow etch rate of heavily doped P+ silicon, and may sense the exposed and un-etched LTDPs 14730 as a pad pressure force change or optical detection of the exposed and un-etched LTDPs, and may stop the etch-back processing.

Additionally, for example, the LTDPs 14730 may be substantially composed of a physically dense and hard material, such as, for example, tungsten or diamond-like carbon (DLC). The thinning process, such as CMP with pressure force detection, may sense the hard material of the LTDPs 14730 by force pressure changes as the LTDPs 14730 are exposed during the etch-back or thinning processing and may stop the etch-back processing. Additionally, for example, the LTDPs 14730 may be substantially composed of an optically reflective or absorptive material, such as, for example, aluminum, copper, polymers, tungsten, or diamond like carbon (DLC). The thinning process, such as CMP with optical detection, wet etch with optical detection, plasma etch with optical detection, or mist/spray etching with optical detection, may sense the material in the LTDPs 14730 by optical detection of color, reflectivity, or wavelength absorption changes as the LTDPs 14730 are exposed during the etch-back or thinning processing and may stop the etch-back processing. Additionally, for example, the LTDPs 14730 may be substantially composed of chemically detectable material, such as silicon oxide, polymers, soft metals such as copper or aluminum. The thinning process, such as CMP with chemical detection, wet etch with chemical detection, RIE/Plasma etching with chemical detection, or mist/spray etching with chemical detection, may sense the dissolution of the LTDPs 14730 material by chemical detection means as the LTDPs 14730 are exposed during the etch-back or thinning processing and may stop the etch-back processing. The chemical detection methods may include, for example, time of flight mass spectrometry, liquid ion chromatography, or spectroscopic methods such as infra-red, ultraviolet/visible, or Raman. The thinned surface may be smoothed or further thinned by processes described herein. The LTDPs 14730 may be replaced, partially or completely, with a conductive material, such as, for example, copper, aluminum, or tungsten, and may be utilized as donor layer to acceptor wafer interconnect.

Persons of ordinary skill in the art will appreciate that the illustrations in FIGS. 147A to 147C are exemplary only and are not drawn to scale. Such skilled persons will further appreciate that many variations are possible such as, for example, the LTDP methods outlined may be applied to a variety of layer transfer and 3DIC process flows in this application. Moreover, the LTDPs 14730 may not only be utilized as donor wafer layers to acceptor wafer layers electrical interconnect, but may also be utilized as heat conducting paths as a portion of a heat removal system for the 3DIC. Such skilled persons will further appreciate that the layer transfer demarcation plane 14799 and associated etch depth of the LTDPs 14730 may lie within the layers 14702, at the transition between layers 14702 and donor wafer 14700, or in the donor wafer 14700 (shown). Many other modifications within the scope of the invention will suggest themselves to such skilled persons after reading this specification. Thus the invention is to be limited only by the appended claims.

Figure 17B:
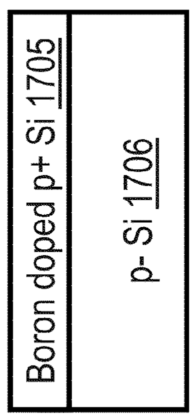
FIG. 17A-E shows an alternative procedure for low-temperature layer transfer with ion-cut.
Figure 17D:
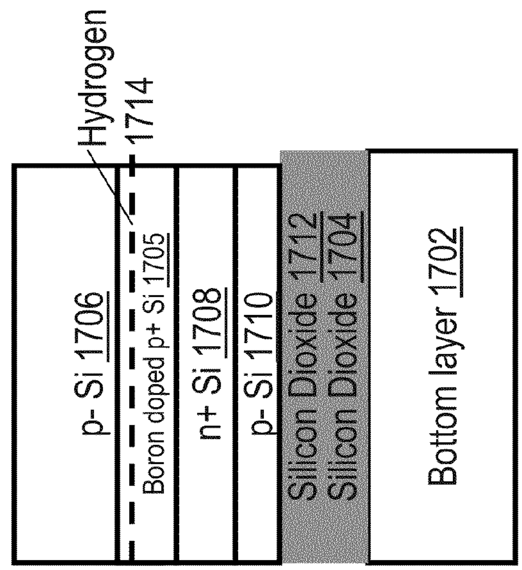
Figure 17A:
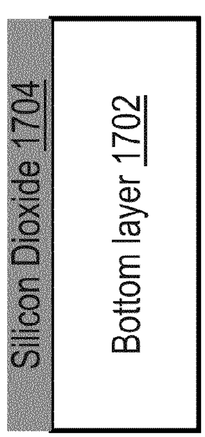

Section 1.3.3: Alternative Low-Temperature (Sub-300° C.) Ion-cut Process for Sub-400° C. Processed Transistors An alternative low-temperature ion-cut process may be described in FIG. 17A-E. The process flow in FIG. 17A-E may include several steps as described in the following sequence:

Step (A): A silicon dioxide layer 1704 may be deposited above the generic bottom layer 1702. FIG. 17A illustrates the structure after Step (A).

Step (B): A p− Si wafer 1706 may be implanted with boron doped p+ Si near its surface to form a p+ Si layer 1705. A n− Si wafer can be utilized instead of the p− Si wafer 1706 as well. FIG. 17B illustrates the structure after Step (B).

Step (C): A n+ Si layer 1708 and a p− Si layer 1710 are epitaxially grown atop the p+ Si layer 1705. A silicon dioxide layer 1712 may be grown or deposited atop the p− Si layer 1710. An anneal (such as a rapid thermal anneal RTA or spike anneal or laser anneal) may be conducted to activate dopants.

Alternatively, the p+ Si layer 1705, the n+ Si layer 1708 and the p− Si layer 1710 can be formed by a series of implants on a p− Si wafer 1706.

Figure 17C:
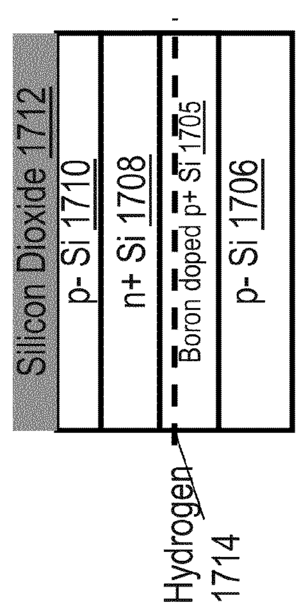

Hydrogen may be then implanted into the p− Si layer of p− Si wafer 1706 at a certain depth to form hydrogen plane 1714. Alternatively, another atomic species such as helium can be (co-) implanted. FIG. 17C illustrates the structure after Step (C).

Step (D): The top layer wafer shown after Step (C) may be flipped and bonded atop the bottom layer wafer using oxide-to-oxide bonding. FIG. 17D illustrates the structure after Step (D).

Figure 17E:
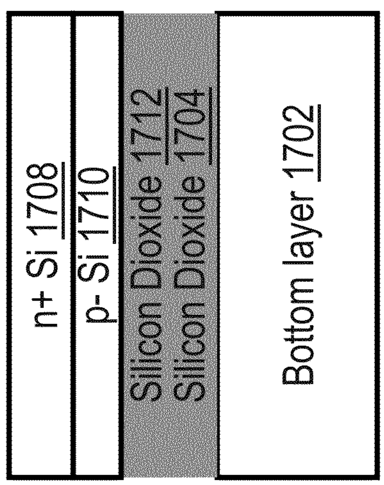

Step (E): A cleave operation may be performed at the hydrogen plane 1714 using a sub-300° C. anneal. Alternatively, a sideways mechanical force may be used. An etch or CMP process may be utilized to etch the p+ Si layer 1705 till the n+ silicon layer 1708 may be reached. FIG. 17E illustrates the structure after Step (E).

The purpose of hydrogen implantation into the p+ Si region 1705 may be because p+ regions heavily doped with boron are known to lead to lower anneal temperatures for ion-cut. Further details of this technology/process are given in "Cold ion-cutting of hydrogen implanted Si, Nuclear Instruments and Methods in Physics Research Section B: Beam Interactions with Materials and Atoms", Volume 190, Issues 1-4, May 2002, Pages 761-766, ISSN 0168-583X by K. Henttinen, T. Suni, A. Nurmela, et al. ("Henttinen and Suni"). The contents of these publications are incorporated herein by reference.

Section 1.3.4: Alternative Procedures for Layer Transfer

While ion-cut has been described in previous sections as the method for layer transfer, several other procedures exist that fulfill the same objective. These include:

Lift-off or laser lift-off: Background information for this technology is given in "Epitaxial lift-off and its applications", 1993 Semicond. Sci. Technol. 8 1124 by P Demeester et al. ("Demeester").

Porous-Si approaches such as ELTRAN: Background information for this technology is given in "Eltran, Novel SOI Wafer Technology", JSAP International, Number 4, July 2001 by T. Yonehara and K. Sakaguchi ("Yonehara") and also in "Frontiers of silicon-on-insulator," J. Appl. Phys. 93, 4955-4978, 2003 by G. K. Celler and S. Cristoloveanu ("Celler").

Time-controlled etch-back to thin an initial substrate, Polishing, Etch-stop layer controlled etch-back to thin an initial substrate: Background information on these technologies is given in Celler and in U.S. Pat. No. 6,806,171.

Rubber-stamp based layer transfer: Background information on this technology is given in "Solar cells sliced and diced", 19 May 2010, Nature News.

The above publications giving background information on various layer transfer procedures are incorporated herein by reference. It is obvious to one skilled in the art that one can form 3D integrated circuits and chips as described in this document with layer transfer schemes described in these publications.

Figure 18A:
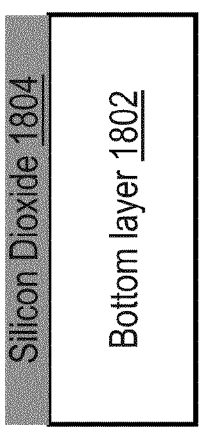
FIG. 18A-F show a procedure for layer transfer using an etch-stop layer controlled etch-back.

FIG. 18A-F shows a procedure using etch-stop layer controlled etch-back for layer transfer. The process flow in FIG. 18A-F may include several steps in the following sequence:

Step (A): A silicon dioxide layer 1804 may be deposited above the generic bottom layer 1802. FIG. 18A illustrates the structure after Step (A).

Figure 18B:
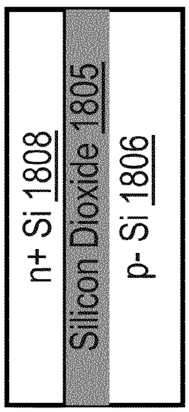

Step (B): SOI wafer 1806 may be implanted with n+ near its surface to form an n+ Si layer 1808. The buried oxide (BOX) of the SOI wafer may be silicon dioxide layer 1805. FIG. 18B illustrates the structure after Step (B).

Figure 18C:
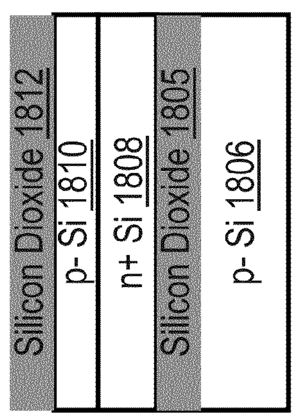

Step (C): A p− Si layer 1810 may be epitaxially grown atop the n+ Si layer 1808. A silicon dioxide layer 1812 may be grown/deposited atop the p− Si layer 1810. An anneal (such as a rapid thermal anneal RTA or spike anneal or laser anneal) may be conducted to activate dopants. FIG. 18C illustrates the structure after Step (C).

Alternatively, the n+ Si layer 1808 and p− Si layer 1810 can be formed by a buried layer implant of n+ Si in a p− SOI wafer.

Figure 18D:
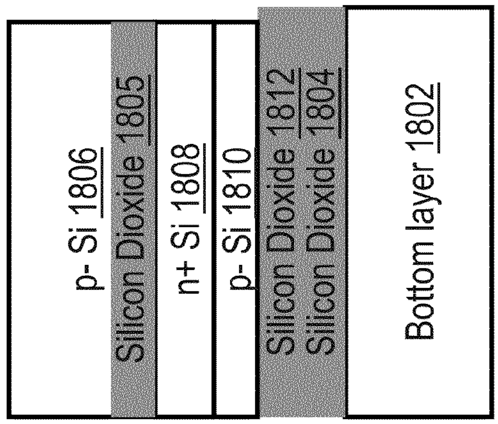

Step (D): The top layer wafer shown after Step (C) may be flipped and bonded atop the bottom layer wafer using oxide-to-oxide bonding. FIG. 18D illustrates the structure after Step (D).

Figure 18F:
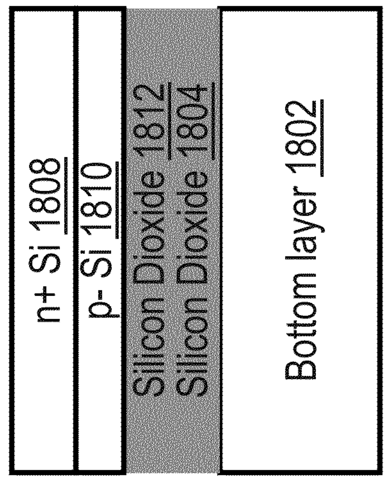
Figure 18E:
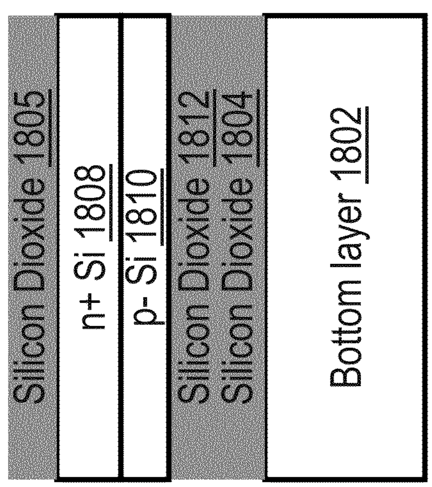

Step (E): An etch process that etches Si but does not etch silicon dioxide may be utilized to etch through the p− Si layer of SOI wafer 1806. The buried oxide (BOX) of silicon dioxide layer 1805 therefore acts as an etch stop. FIG. 18E illustrates the structure after Step (E).

Step (F): Once the etch stop of silicon dioxide layer 1805 is substantially reached, an etch or CMP process may be utilized to etch the silicon dioxide layer 1805 till the n+ silicon layer 1808 may be reached. The etch process for Step (F) may be preferentially chosen so that it etches silicon dioxide but does not attack Silicon. FIG. 18F illustrates the structure after Step (F).

At the end of the process shown in FIG. 18A-F, the desired regions are layer transferred atop the bottom layer 1802. While FIG. 18A-F shows an etch-stop layer controlled etch-back using a silicon dioxide etch stop layer, other etch stop layers such as SiGe or p+ Si can be utilized in alternative process flows.

Figure 19:
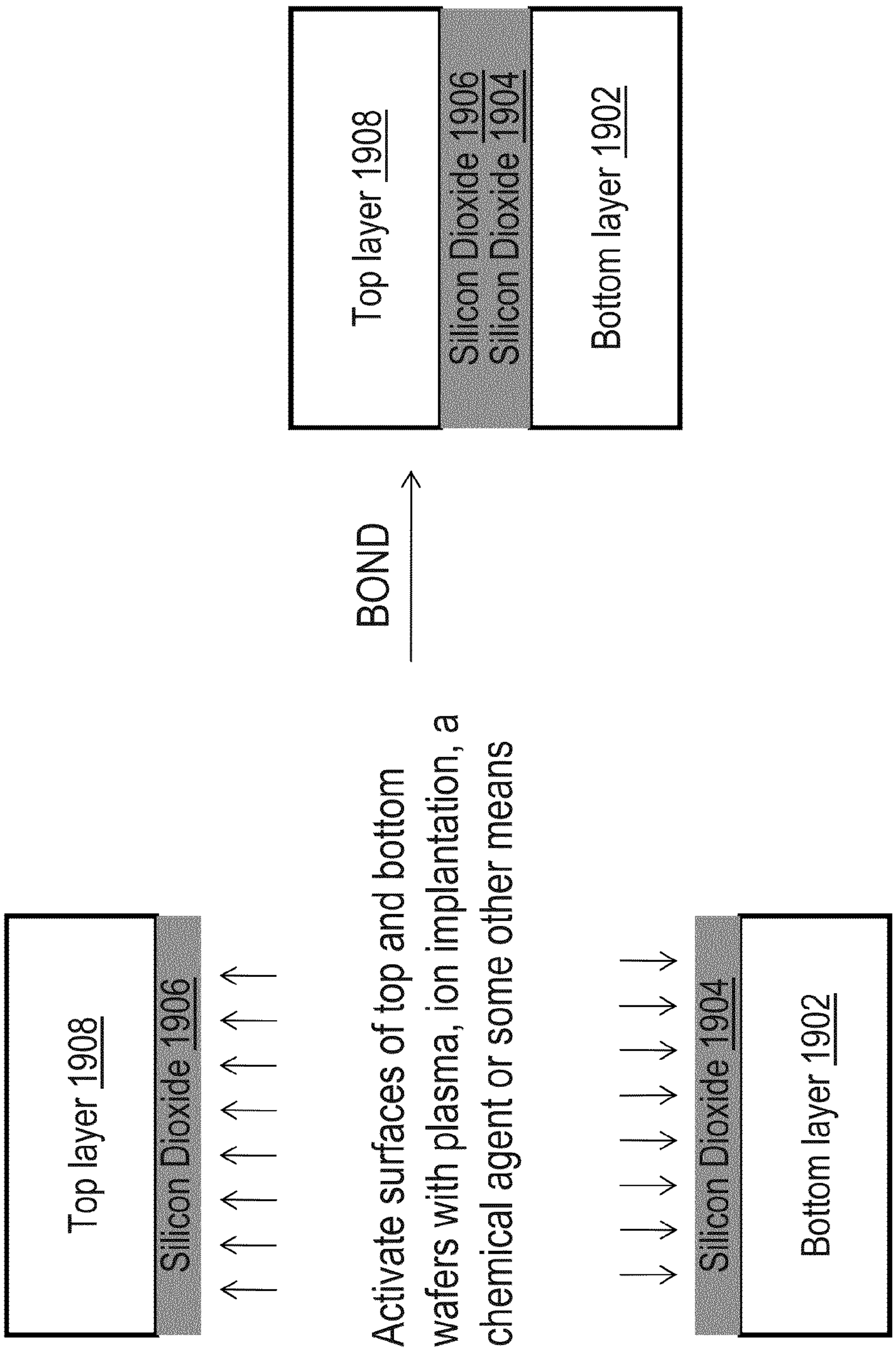
FIG. 19 shows a surface-activated bonding for low-temperature sub-400° C. processing.

FIG. 19 shows various methods one can use to bond a top layer wafer 1908 to a bottom wafer 1902. Oxide-oxide bonding of a layer of silicon dioxide 1906 and a layer of silicon dioxide 1904 may be used. Before bonding, various methods can be utilized to activate surfaces of the layer of silicon dioxide 1906 and the layer of silicon dioxide 1904. A plasma-activated bonding process such as the procedure described in US Patent 20090081848 or the procedure described in "Plasma-activated wafer bonding: the new low-temperature tool for MEMS fabrication", Proc. SPIE 6589, 65890T (2007), DOI:10.1117/12.721937 by V. Dragoi, G. Mittendorfer, C. Thanner, and P. Lindner ("Dragoi") can be used. Alternatively, an ion implantation process such as the one described in US Patent 20090081848 or elsewhere can be used. Alternatively, a wet chemical treatment can be utilized for activation. Other methods to perform oxide-to-oxide bonding can also be utilized. While oxide-to-oxide bonding has been described as a method to bond together different layers of the 3D stack, other methods of bonding such as metal-to-metal bonding can also be utilized.

Figures 20A, 20B, 20C, 20D:
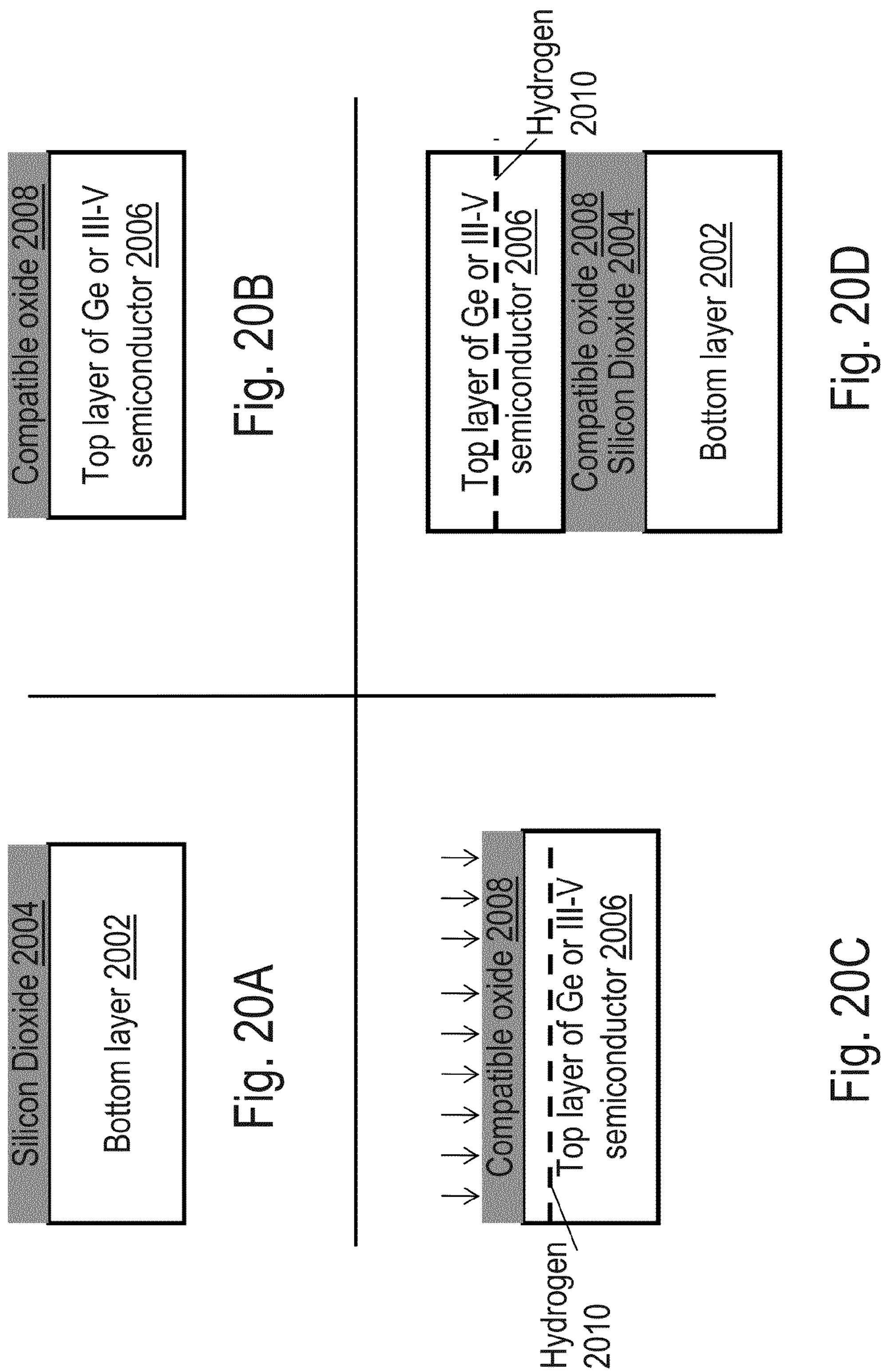
FIG. 20A-E shows a description of Ge or III-V semiconductor Layer Transfer Flow using Ion-Cut.

FIG. 20A-E depict layer transfer of a Germanium or a III-V semiconductor layer to form part of a 3D integrated circuit or chip or system. These layers could be utilized for forming optical components or form forming better quality (higher-performance or lower-power) transistors. FIG. 20A-E describes an ion-cut flow for layer transferring a single crystal Germanium or III-V semiconductor layer 2007 atop any generic bottom layer 2002. The bottom layer 2002 can be a single crystal silicon layer or some other semiconductor layer. Alternatively, it can be a wafer having transistors with wiring layers above it. This process of ion-cut based layer transfer may include several steps as described in the following sequence:

Step (A): A silicon dioxide layer 2004 may be deposited above the generic bottom layer 2002. FIG. 20A illustrates the structure after Step (A).

Step (B): The layer to be transferred atop the bottom layer (top layer of doped germanium or III-V semiconductor 2006) may be processed and a compatible oxide layer 2008 may be deposited above it. FIG. 20B illustrates the structure after Step (B).

Step (C): Hydrogen may be implanted into the Top layer doped Germanium or III-V semiconductor 2006 at a certain depth 2010. Alternatively, another atomic species such as helium can be (co-)implanted. FIG. 20C illustrates the structure after Step (C).

Step (D): The top layer wafer shown after Step (C) may be flipped and bonded atop the bottom layer wafer using oxide-to-oxide bonding. FIG. 20D illustrates the structure after Step (D).

Figure 20E:
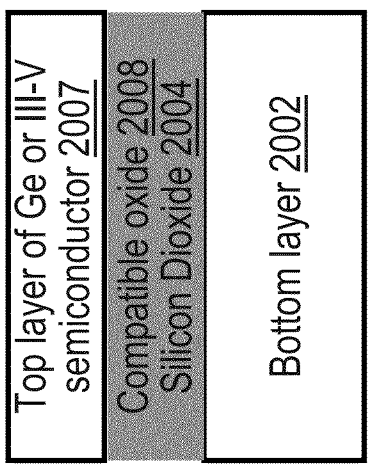

Step (E): A cleave operation may be performed at the hydrogen plane 2010 using an anneal or a mechanical force. Following this, a Chemical-Mechanical-Polish (CMP) may be done. FIG. 20E illustrates the structure after Step (E).

Section 1.3.5: Laser Anneal Procedure for 3D Stacked Components and Chips

Figure 21B:
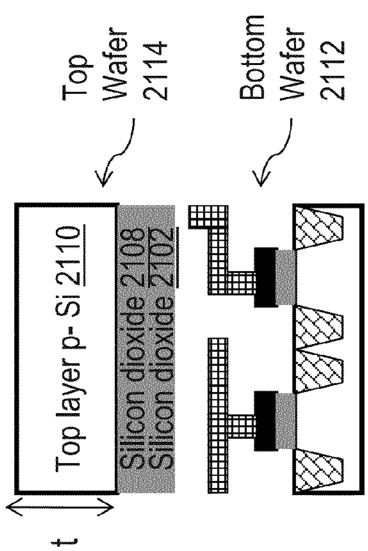
FIG. 21A-C shows laser-anneal based 3D chips (prior art).
Figure 21C:
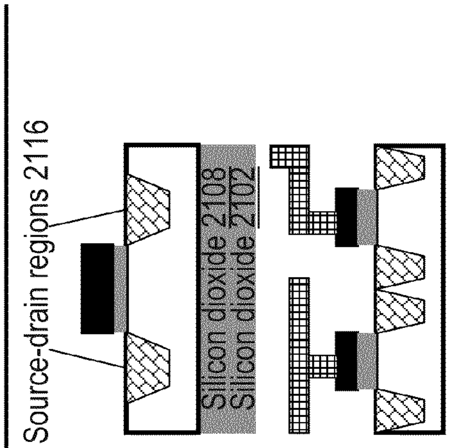
Figure 21A:
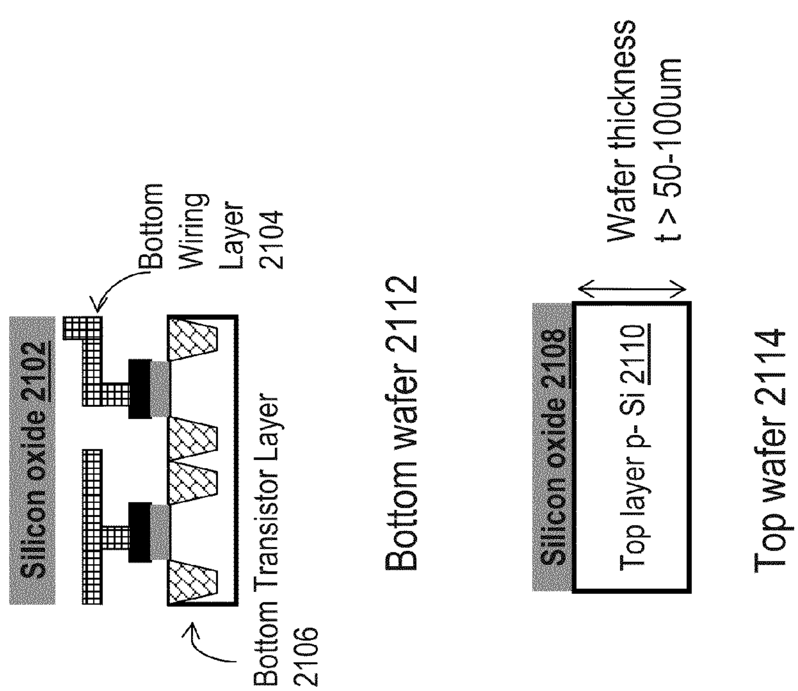

FIG. 21A-C describes a prior art process flow for constructing 3D stacked circuits and chips using laser anneal techniques. Note that the terms laser anneal and optical anneal are utilized interchangeably in this document. This procedure is described in "Electrical Integrity of MOS Devices in Laser Annealed 3D IC Structures" in the proceedings of VMIC 2004 by B. Rajendran, R. S. Shenoy, M. O. Thompson & R. F. W. Pease. The process may include several steps as described in the following sequence:

Step (A): The bottom wafer 2112 may be processed to form bottom transistor layer 2106, bottom wiring layer 2104, and oxide layer 2102. The top wafer 2114 may include silicon layer 2110 with an oxide layer 2108 above it. The thickness of the silicon layer 2110, t, may be typically greater than about 50 um. FIG. 21A illustrates the structure after Step (A).

Step (B): The top wafer 2114 may be flipped and bonded to the bottom wafer 2112. It can be readily seen that the thickness of the top layer may be greater than about 50 um. Due to this high thickness, and due to the fact that the aspect ratio (height to width ratio) of through-silicon connections may be limited to less than about 100:1, it can be seen that the minimum width of through-silicon connections possible with this procedure may be 50 um/100=500 nm. This may be much higher than dimensions of horizontal wiring on a chip. FIG. 21B illustrates the structure after Step (B).

Step (C): Transistors are then built on the top wafer 2114 and a laser anneal may be utilized to activate dopants in the top silicon layer, including source-drain regions 2116. Due to the characteristics of a laser anneal, the temperature in the top layer, top wafer 2114, will be much higher than the temperature in the bottom layer, bottom wafer 2112. FIG. 21C illustrates the structure after Step (C).

An alternative procedure described in prior art is the SOI-based layer transfer (shown in FIG. 18A-F) followed by a laser anneal. This process is described in "Sequential 3D IC Fabrication: Challenges and Prospects", by Bipin Rajendran in VMIC 2006.

An alternative procedure for laser anneal of layer transferred silicon is shown in FIG. 22A-E. The process may include several steps as described in the following sequence.

Figure 22A:
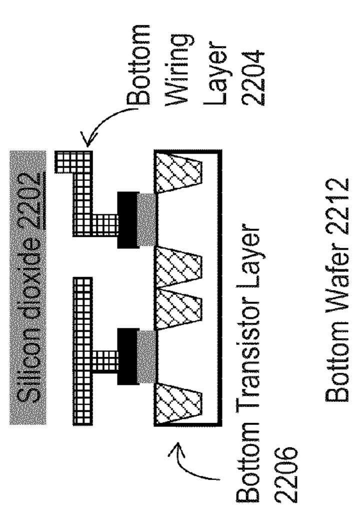
FIG. 22A-E show a laser-anneal based layer transfer process.

Step (A): A bottom wafer 2212 may be processed to form bottom transistor layer 2206, bottom wiring layer 2204, and oxide layer 2202. FIG. 22A illustrates the structure after Step (A).

Figure 22B:
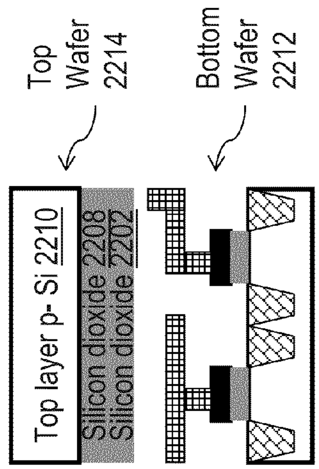

Step (B): A portion of top wafer 2214 such as top layer of p− silicon 2210 including oxide 2208 may be layer transferred atop bottom wafer 2212 using procedures similar to FIG. 2. FIG. 22B illustrates the structure after Step (B).

Figure 22C:
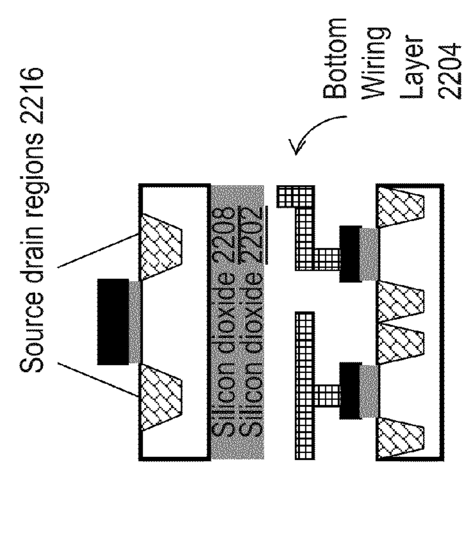

Step (C): Transistors are formed on the top layer of silicon 2210 and a laser anneal may be done to activate dopants in source-drain regions 2216. Fabrication of the rest of the integrated circuit flow including contacts and wiring layers may then proceed. FIG. 22C illustrates the structure after Step (C).

Figure 22D:
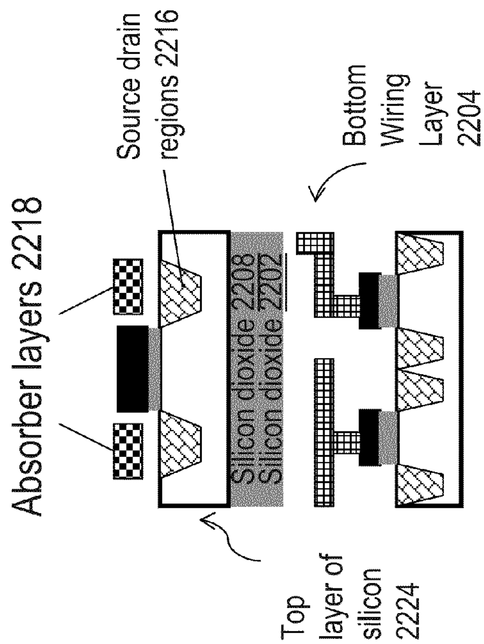
Figure 22E:
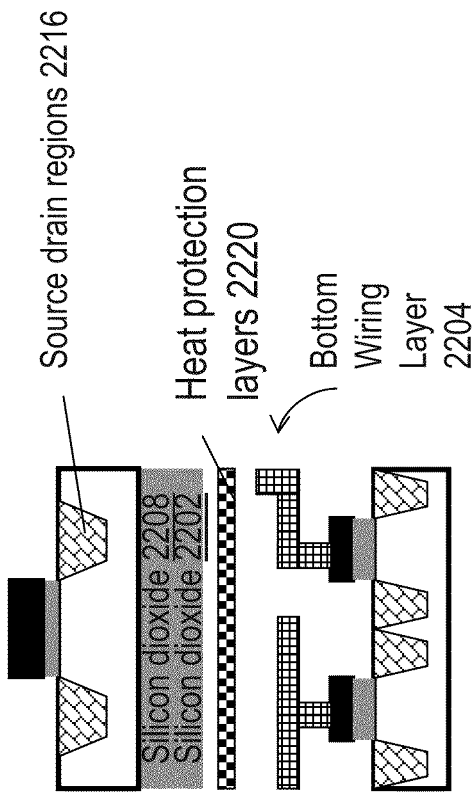

FIG. 22D shows that absorber layers 2218 may be used to efficiently heat the top layer of silicon 2224 while ensuring temperatures at the bottom wiring layer 2204 are low (less than about 500° C.). FIG. 22E shows that one could use heat protection layers 2220 situated in between the top and bottom layers of silicon to keep temperatures at the bottom wiring layer 2204 low (less than about 500° C.). These heat protection layers could be constructed of optimized materials that reflect laser radiation and reduce heat conducted to the bottom wiring layer. The terms heat protection layer and shield can be used interchangeably in this document.

Figure 23B:
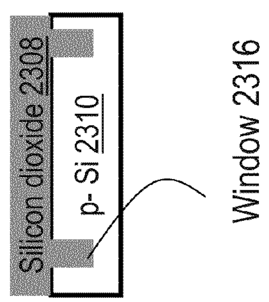
FIG. 23A-C show window for alignment of top wafer to bottom wafer.
Figure 23A:
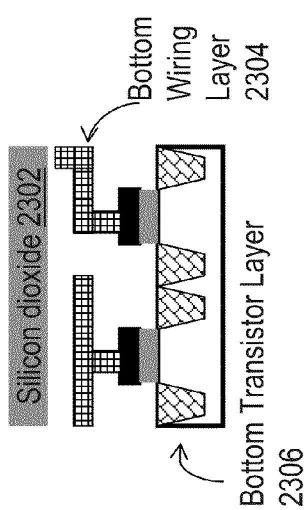
Figure 23C:
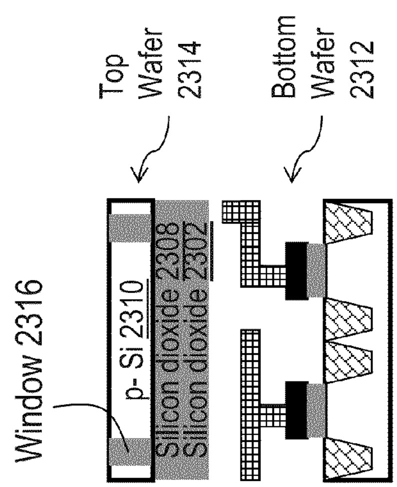

Most of the figures described thus far in this document assumed the transferred top layer of silicon may be very thin (for example, less than about 200 nm). This enables light to penetrate the silicon and allows features on the bottom wafer to be observed. However, that may be not always the case. FIG. 23A-C shows a process flow for constructing 3D stacked chips and circuits when the thickness of the transferred/stacked piece of silicon may be so high that light does not penetrate the transferred piece of silicon to observe the alignment marks on the bottom wafer. The process to allow for alignment to the bottom wafer may include several steps as described in the following sequence.

Step (A): A bottom wafer 2312 may be processed to form a bottom transistor layer 2306 and a bottom wiring layer 2304. A layer of silicon oxide 2302 may be deposited above it. FIG. 23A illustrates the structure after Step (A).

Step (B): A wafer of p− Si 2310 has an oxide layer 2308 deposited or grown above it. Using lithography, a window pattern may be etched into the p− Si 2310 and may be filled with oxide. A step of CMP may be done. This window pattern will be used in Step (C) to allow light to penetrate through the top layer of silicon to align to circuits on the bottom wafer 2312. The window size may be chosen based on misalignment tolerance of the alignment scheme used while bonding the top wafer to the bottom wafer in Step (C). Furthermore, some alignment marks also exist in the wafer of p− Si 2310. FIG. 23B illustrates the structure after Step (B).

Step (C): A portion of the p− Si 2310 from Step (B) may be transferred atop the bottom wafer 2312 using procedures similar to FIG. 2A-E. It can be observed that the window 2316 can be used for aligning features constructed on the top wafer 2314 to features on the bottom wafer 2312. Thus, the thickness of the top wafer 2314 can be chosen without constraints. FIG. 23C illustrates the structure after Step (C).

Figure 24A:
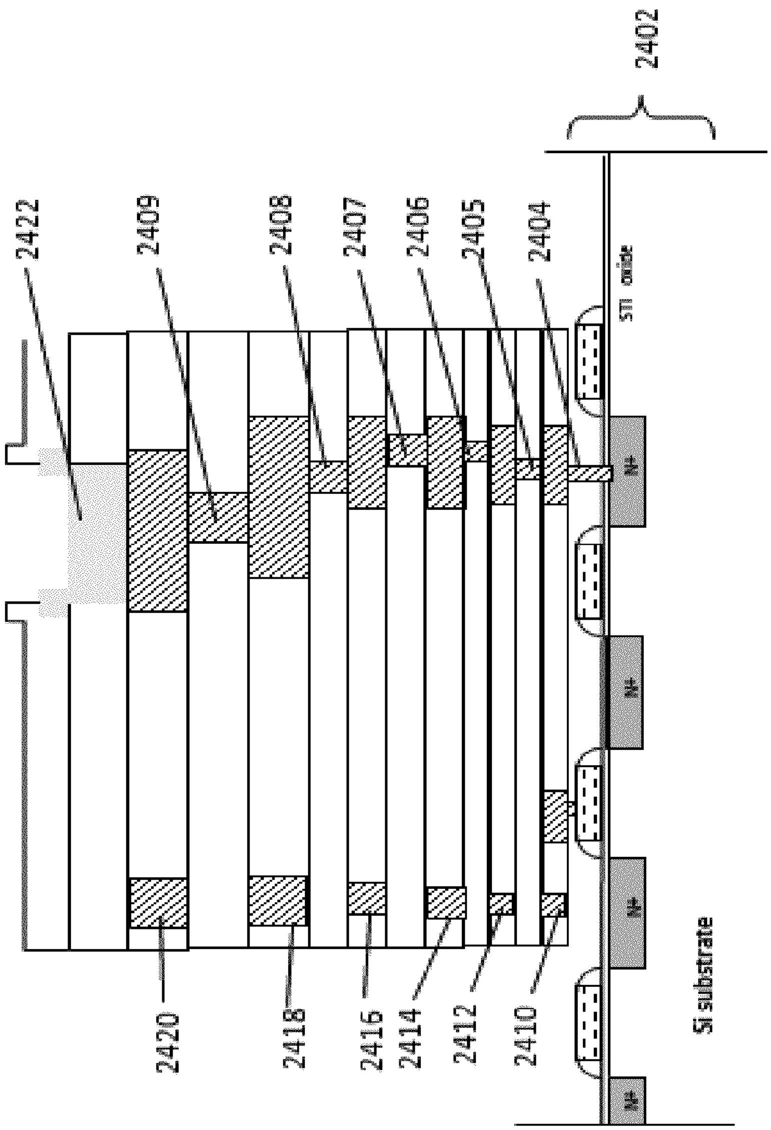
FIG. 24A-B shows a metallization scheme for monolithic 3D integrated circuits and chips.

Additionally, when circuit cells are built on two or more layers of thin silicon, and enjoy the dense vertical through silicon via interconnections, the metallization layer scheme to take advantage of this dense 3D technology may be improved as follows. FIG. 24A illustrates the prior art of silicon integrated circuit metallization schemes. The conventional transistor silicon layer 2402 may be connected to the first metal layer 2410 thru the contact 2404. The dimensions of this interconnect pair of contact and metal lines generally are at the minimum line resolution of the lithography and etch capability for that technology process node. Traditionally, this may be called a '1×' design rule metal layer. Usually, the next metal layer may be also at the '1×' design rule, the metal line 2412 and via below 2405 and via above 2406 that connects metal line 2412 with 2410 or with 2414 where desired. Then the next few layers are often constructed at twice the minimum lithographic and etch capability and called '2×' metal layers, and have thicker metal for current carrying capability. These are illustrated with metal line 2414 paired with via 2407 and metal line 2416 paired with via 2408 in FIG. 24A. Accordingly, the metal via pairs of 2418 with 2409, and 2420 with bond pad opening 2422, represent the '4×' metallization layers where the planar and thickness dimensions are again larger and thicker than the 2× and 1× layers. The precise number of 1× or 2× or 4× layers may vary depending on interconnection needs and other requirements; however, the general flow may be that of increasingly larger metal line, metal space, and via dimensions as the metal layers are farther from the silicon transistors and closer to the bond pads.

Figure 24B:
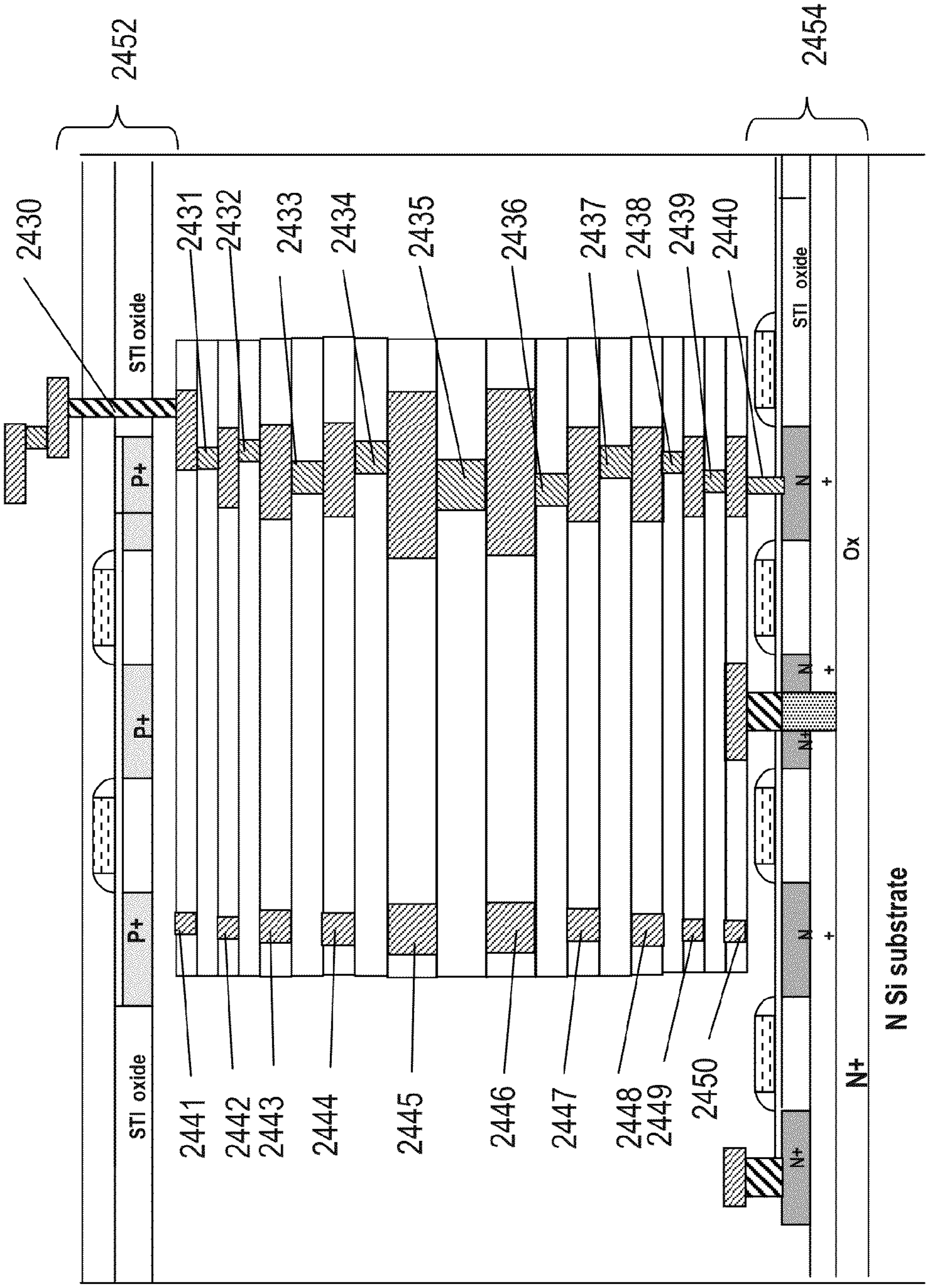

The metallization layer scheme may be improved for 3D circuits as illustrated in FIG. 24B. The first crystallized silicon device layer 2454 may be illustrated as the NMOS silicon transistor layer from the above 3D library cells, but may also be a conventional logic transistor silicon substrate or layer. The '1×' metal layers 2450 and 2449 are connected with contact 2440 to the silicon transistors and vias 2438 and 2439 to each other or metal 2448. The 2× layer pairs metal 2448 with via 2437 and metal 2447 with via 2436. The 4× metal layer 2446 may be paired with via 2435 and metal 2445, also at 4×. However, now via 2434 may be constructed in 2× design rules to enable metal line 2444 to be at 2×. Metal line 2443 and via 2433 are also at 2× design rules and thicknesses. Vias 2432 and 2431 are paired with metal lines 2442 and 2441 at the 1× minimum design rule dimensions and thickness. The thru silicon via 2430 of the illustrated PMOS layer transferred silicon layer 2452 may then be constructed at the 1× minimum design rules and provide for maximum density of the top layer. The precise numbers of 1× or 2× or 4× layers may vary depending on circuit area and current carrying metallization requirements and tradeoffs. However, the pitch, line-space pair, of a 1× layer may be less than the pitch of a 2× layer which may be less than the pitch of the 4× layer. The illustrated PMOS layer transferred silicon layer 2452 may be any of the low temperature devices illustrated herein.

Figure 43A:
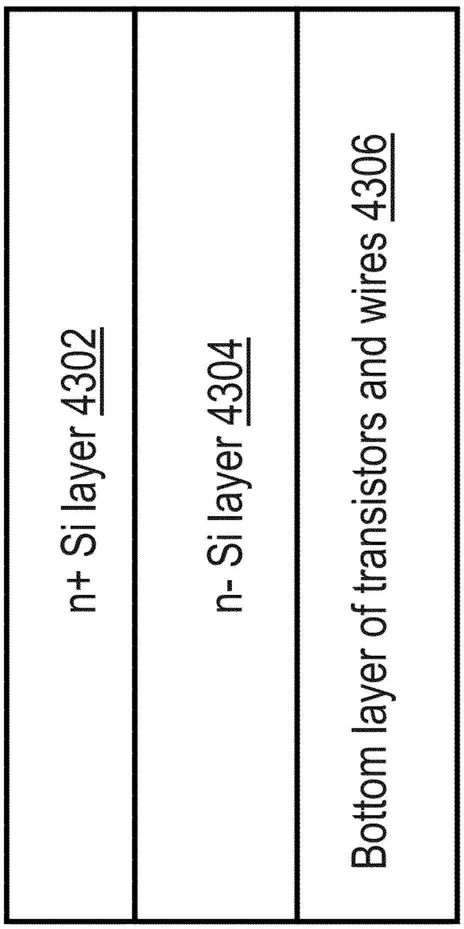
FIG. 43A-F depict an implementation of laser anneals for JFET devices.
Figure 43B:
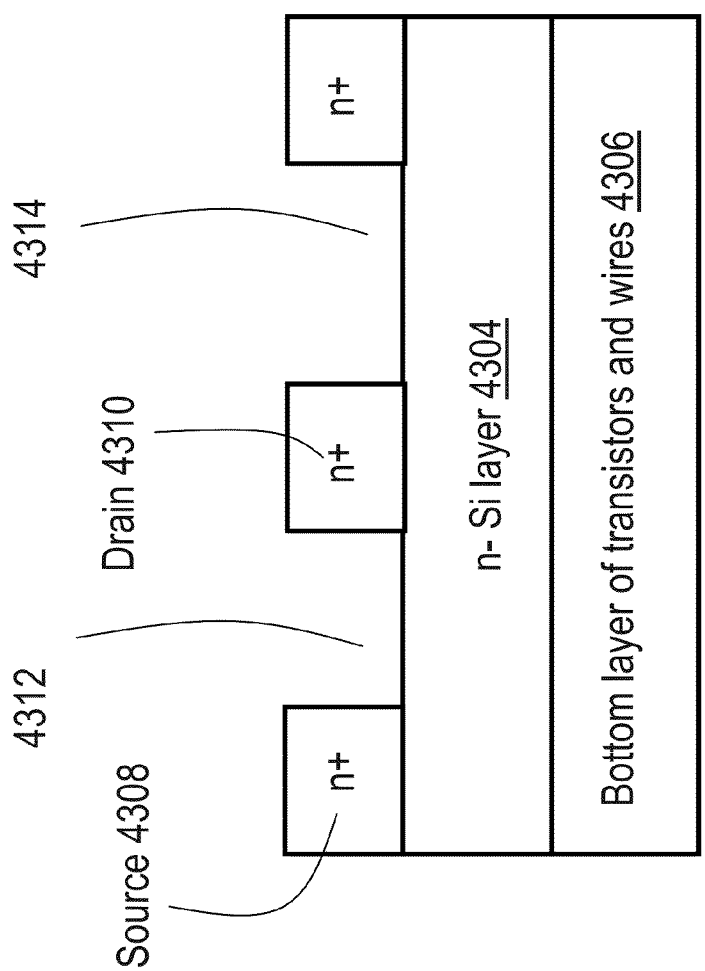
Figure 43C:
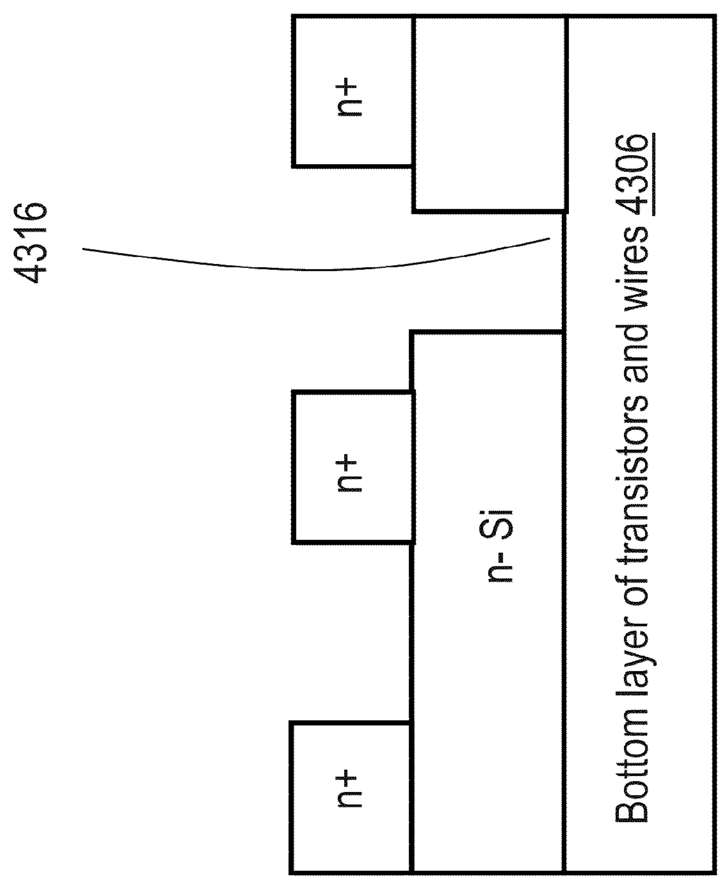
Figure 43D:
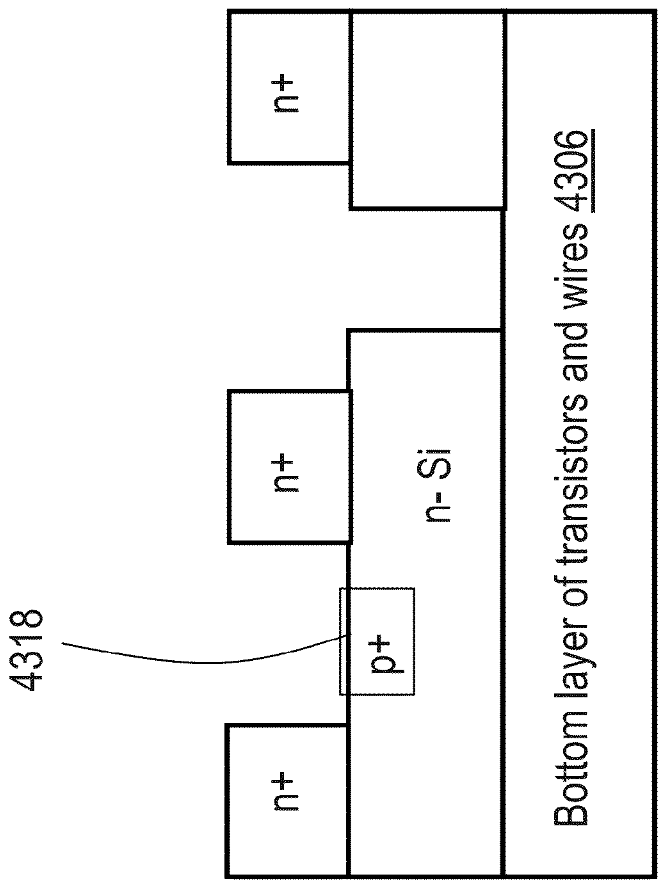
Figure 43E:
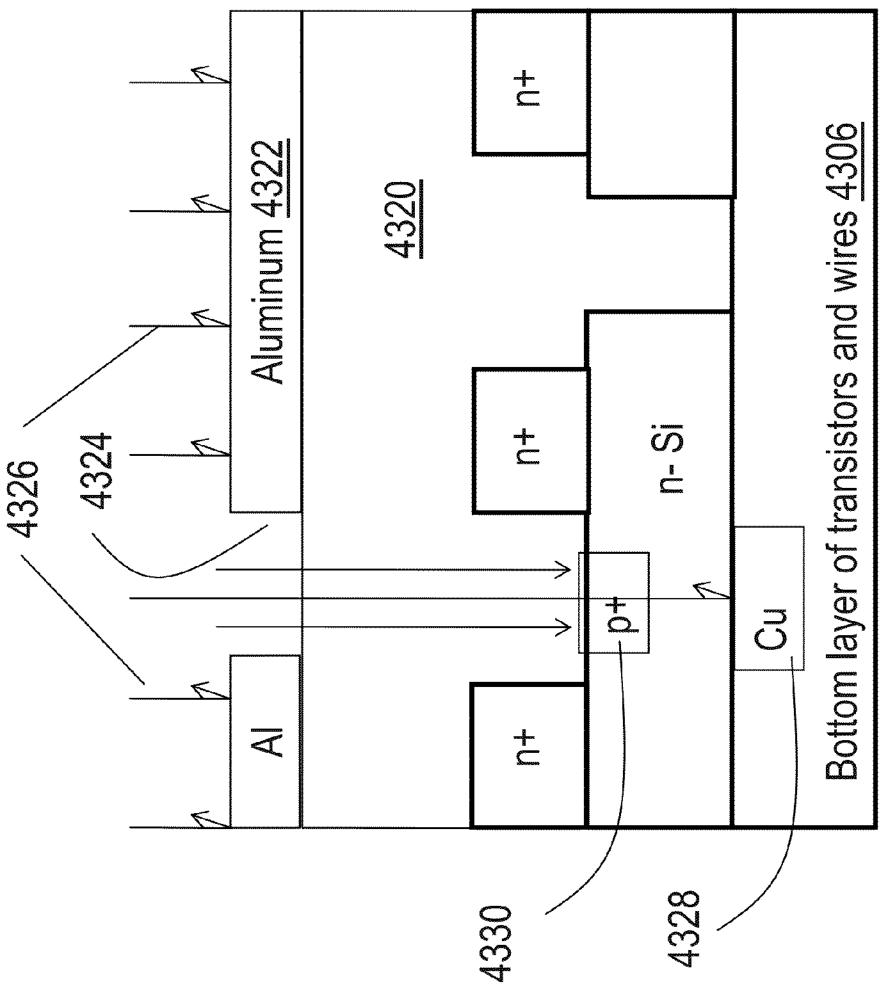
Figure 43F:
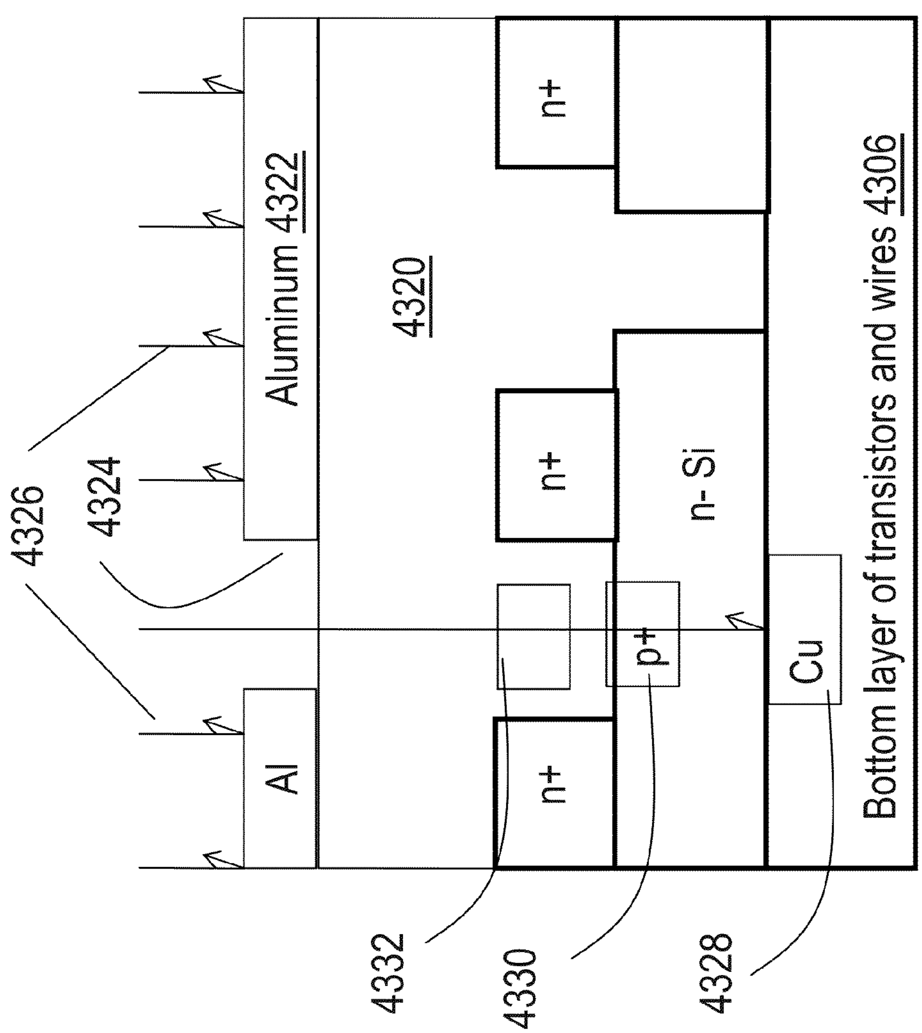

FIGS. 43A-F illustrate the formation of Junction Gate Field Effect Transistor (JFET) top transistors. FIG. 43A illustrates the structure after n− Si layer 4304 and n+ Si layer 4302 are transferred on top of a bottom layer of transistors and wires 4306. This may be done using procedures similar to those shown in FIG. 11A-F. Then the top transistor source 4308 and drain 4310 are defined by etching away the n+ from the region designated for gates 4312 and the isolation region between transistors 4314. This step may be aligned to the bottom layer of transistors and wires 4306 so the formed transistors could be properly connected to the underlying bottom layer of transistors and wires 4306. Then an additional masking and etch step may be performed to remove the n− layer between transistors, shown as 4316, thus providing better transistor isolation as illustrated in FIG. 43C. FIG. 43D illustrates an optional formation of shallow p+ region 4318 for the JFET gate formation. In this option there might be a need for laser or other optical energy transfer anneal to activate the p+. FIG. 43E illustrates how to utilize the laser anneal and minimize the heat transfer to the bottom layer of transistors and wires 4306. After the thick oxide deposition 4320, a layer of a light reflecting material, such as, for example, Aluminum, may be applied as a reflective layer 4322. An opening 4324 in the reflective layer may be masked and etched, allowing the laser light 4326 to heat the p+ implanted area 4330, and reflecting the majority of the laser energy from laser light 4326 away from bottom layer of transistors and wires 4306. Normally, the open area 4324 may be less than 10% of the total wafer area. Additionally, a reflective layer 4328 of copper, or, alternatively, a reflective Aluminum layer or other reflective material, may be formed in the bottom layer of transistors and wires 4306 that will additionally reflect any of the laser energy from laser light 4326 that might travel to bottom layer of transistors and wires 4306. This same reflective & open laser anneal technique might be utilized on any of the other illustrated structures to enable implant activation for transistors in the second layer transfer process flow. In addition, absorptive materials may, alone or in combination with reflective materials, also be utilized in the above laser or other optical energy transfer anneal techniques. A photonic energy absorbing layer 4332, such as amorphous carbon of an appropriate thickness, may be deposited or sputtered at low temperature over the area that needs to be laser heated, and then masked and etched as appropriate, as shown in FIG. 43F. This allows the minimum laser energy to be employed to effectively heat the area to be implant activated, and thereby minimizes the heat stress on the reflective layers 4322 & 4328 and the bottom layer of transistors and wires 4306. The laser or optical energy reflecting layer 4322 can then be etched or polished away and contacts can be made to various terminals of the transistor. This flow enables the formation of fully crystallized top JFET transistors that could be connected to the underlying multi-metal layer semiconductor device without exposing the underlying device to high temperature.

Section 2: Construction of 3D Stacked Semiconductor Circuits and Chips where Replacement Gate High-k/Metal Gate Transistors can be Used. Misalignment-tolerance Techniques are Utilized to Get High Density of Connections.

Section 1 described the formation of 3D stacked semiconductor circuits and chips with sub-400° C. processing temperatures to build transistors and high density of vertical connections. In this section an alternative method may be explained, in which a transistor may be built with any replacement gate (or gate-last) scheme that may be utilized widely in the industry. This method allows for high temperatures (above about 400° C.) to build the transistors.

This method utilizes a combination of three concepts:

- Replacement gate (or gate-last) high k/metal gate fabrication
- Face-up layer transfer using a carrier wafer
- Misalignment tolerance techniques that utilize regular or repeating layouts. In these repeating layouts, transistors could be arranged in substantially parallel bands.

A very high density of vertical connections may be possible with this method. Single crystal silicon (or mono-crystalline silicon) layers that are transferred may be less than about 2 um thick, or could even be thinner than about 0.4 um or about 0.2 um. This replacement gate process may also be called a gate replacement process.

Figure 25B:
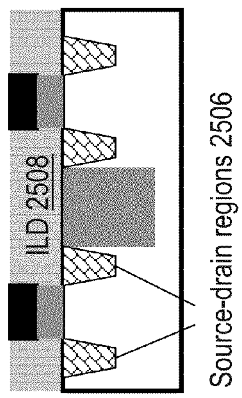
FIG. 25A-F shows a process flow for 3D integrated circuits with gate-last high-k metal gate transistors and face-up layer transfer.
Figure 25D:
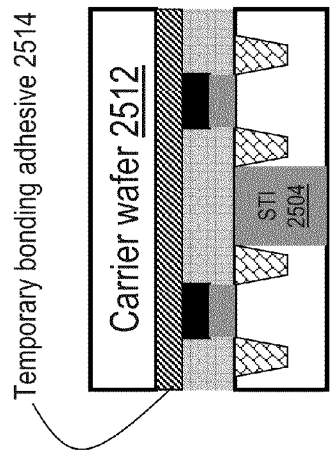
Figure 25A:
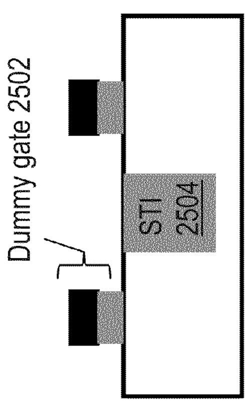

The method mentioned in the previous paragraph is described in FIG. 25A-F. The procedure may include several steps as described in the following sequence:

Step (A): After creating isolation regions using a shallow-trench-isolation (STI) process 2504, dummy gates 2502 are constructed with silicon dioxide and poly silicon. The term "dummy gates" may be used since these gates will be replaced by high k gate dielectrics and metal gates later in the process flow, according to the standard replacement gate (or gate-last) process. Further details of replacement gate processes are described in "A 45 nm Logic Technology with High-k+Metal Gate Transistors, Strained Silicon, 9 Cu Interconnect Layers, 193 nm Dry Patterning, and 100% Pb-free Packaging," IEDM Tech. Dig., pp. 247-250, 2007 by K. Mistry, et al. and "Ultralow-EOT (5 Å) Gate-First and Gate-Last High Performance CMOS Achieved by Gate-Electrode Optimization," IEDM Tech. Dig., pp. 663-666, 2009 by L. Ragnarsson, et al. FIG. 25A illustrates the structure after Step (A).

Step (B): Transistor fabrication flow proceeds with the formation of source-drain regions 2506, strain enhancement layers to improve mobility, a high temperature anneal to activate source-drain regions 2506, formation of inter-layer dielectric (ILD) 2508, and more conventional steps. FIG. 25B illustrates the structure after Step (B).

Figure 25C:
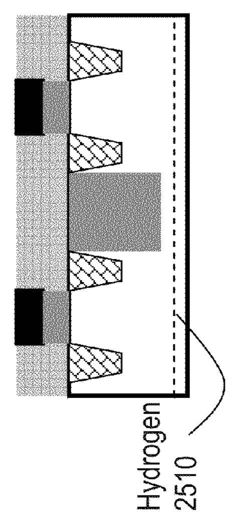

Step (C): Hydrogen may be implanted into the wafer at the dotted line regions indicated by 2510. FIG. 25C illustrates the structure after Step (C).

Step (D): The wafer after step (C) may be bonded to a temporary carrier wafer 2512 using a temporary bonding adhesive 2514. This temporary carrier wafer 2512 could be constructed of glass. Alternatively, it could be constructed of silicon. The temporary bonding adhesive 2514 could be a polymer material, such as polyimide DuPont HD3007. A anneal or a sideways mechanical force may be utilized to cleave the wafer at the hydrogen plane 2510. A CMP process may be then conducted. FIG. 25D illustrates the structure after Step (D).

Figure 25E:
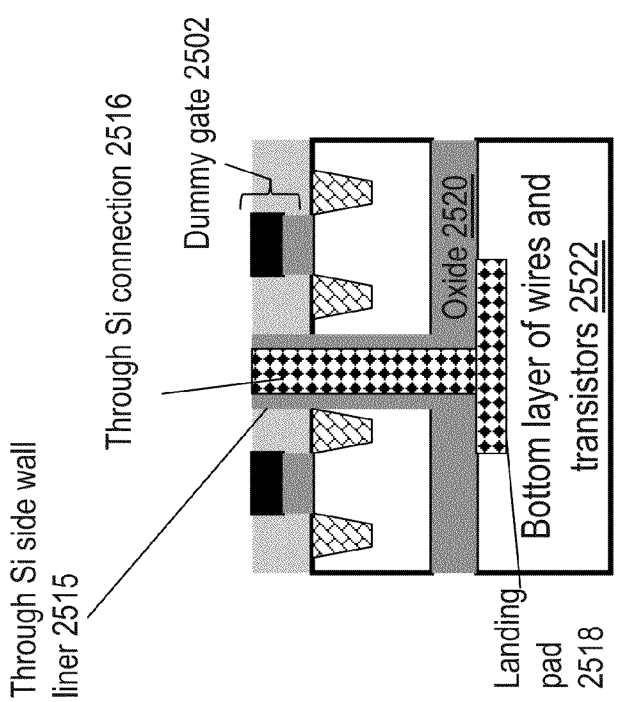

Step (E): An oxide layer 2520 may be deposited onto the bottom of the wafer shown in Step (D). The wafer may be then bonded to the bottom layer of wires and transistors 2522 using oxide-to-oxide bonding. The bottom layer of wires and transistors 2522 could also be called a base wafer. The base wafer may have one or more transistor interconnect metal layers, which may be comprised metals such as copper or aluminum, shown, for example, in FIG. 24B. The temporary carrier wafer 2512 may be then removed by shining a laser onto the temporary bonding adhesive 2514 through the temporary carrier wafer 2512 (which could be constructed of glass). Alternatively, an anneal could be used to remove the temporary bonding adhesive 2514. Through-silicon connections 2516 with a non-conducting (e.g. oxide) liner 2515 to the landing pads 2518 in the base wafer could be constructed at a very high density using special alignment methods to be described in FIG. 26A-D and FIG. 27A-F. FIG. 25E illustrates the structure after Step (E).

Figure 25F:
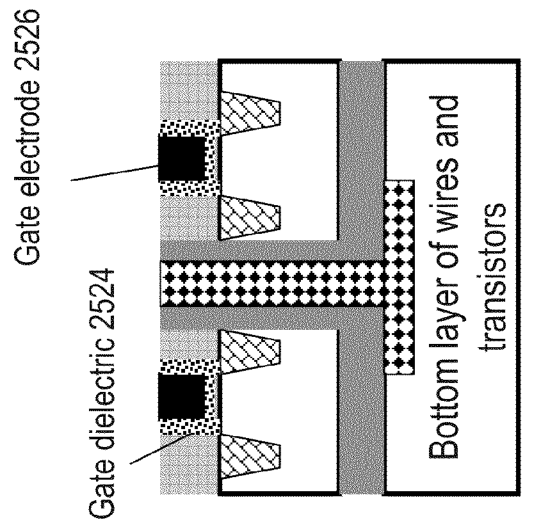

Step (F): Dummy gates 2502 are etched away, followed by the construction of a replacement with high k gate dielectrics 2524 and metal gates 2526. Essentially, partially-formed high performance transistors are layer transferred atop the base wafer (may also be called target wafer) followed by the completion of the transistor processing, e.g., a gate replacement step or steps, with a low (sub 400° C.) process. FIG. 25F illustrates the structure after Step (F). The remainder of the transistor, contact and wiring layers are then constructed. Thus both p-type and n-type transistors may be partially formed, layer transferred, and then completed at low temperature.

It will be obvious to someone skilled in the art that alternative versions of this flow are possible with various methods to attach temporary carriers and with various versions of the gate-last process flow.

Figure 26A:
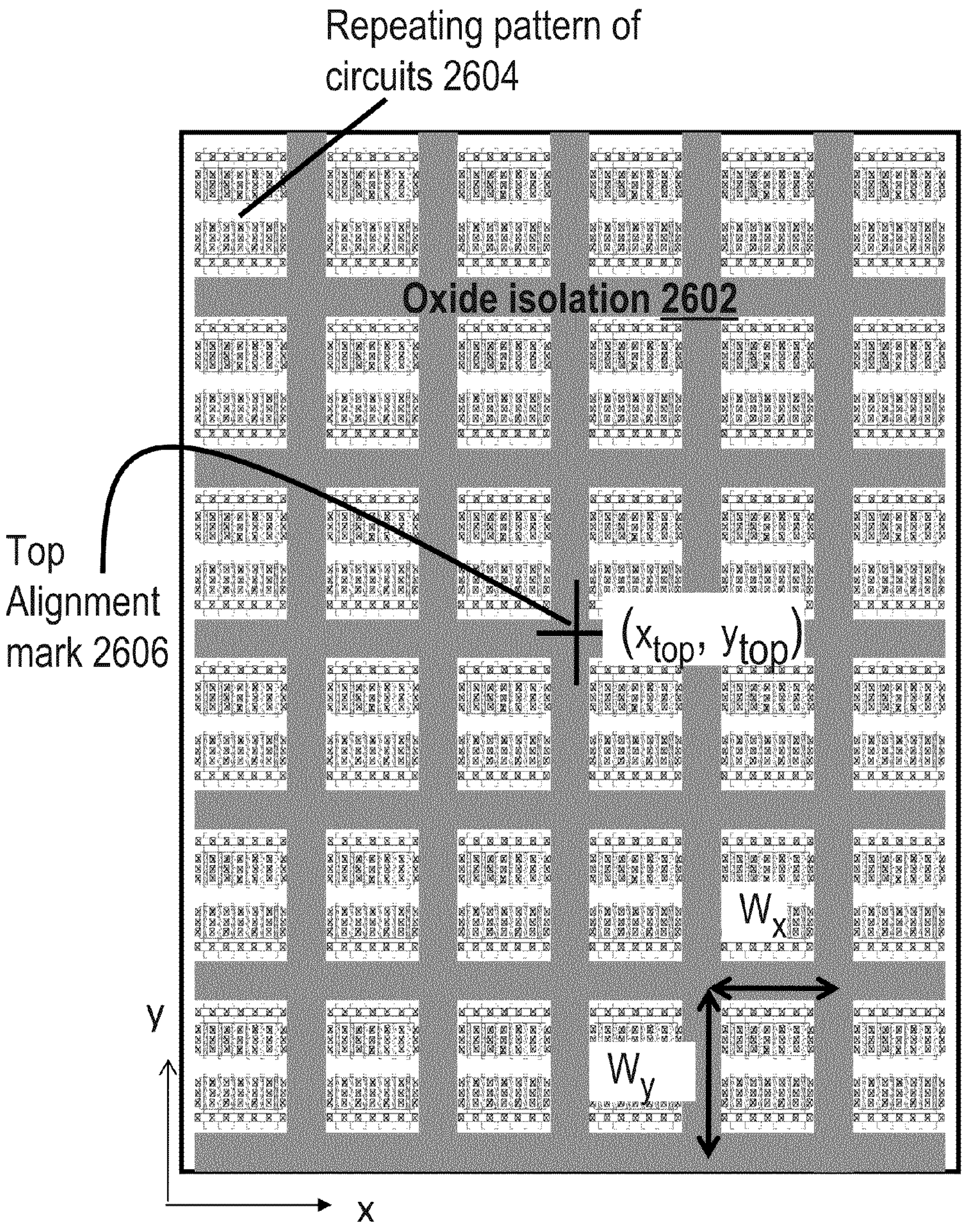
FIG. 26A-D shows an alignment scheme for repeating pattern in X and Y directions.

FIG. 26A-D describes an alignment method for forming CMOS circuits with a high density of connections between 3D stacked layers. The alignment method may include moving the top layer masks left or right and up or down until all the through-layer contacts are on top of their corresponding landing pads. This may be done in several steps and may occur in the following sequence:

FIG. 26A illustrates the top wafer. A repeating pattern of circuit regions 2604 in the top wafer in both X and Y directions may be used. Oxide isolation regions 2602 in between adjacent (identical) repeating structures are used. Each (identical) repeating structure has X dimension=$W_x$ and Y dimension=$W_y$, and this includes oxide isolation region thickness. The top alignment mark 2606 in the top layer may be located at ($x_{top}$, $y_{top}$).

Figure 26B:
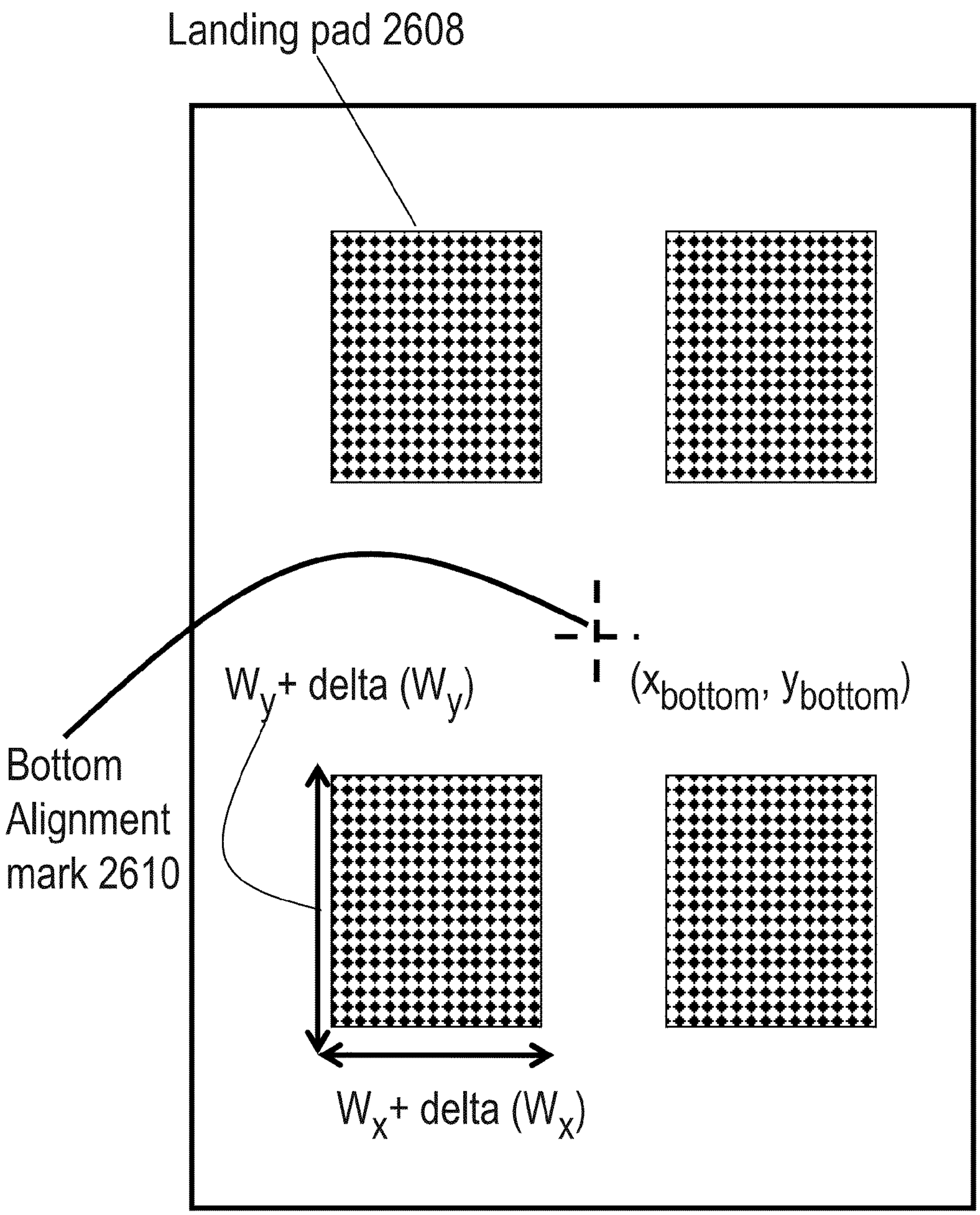

FIG. 26B illustrates the bottom wafer. The bottom wafer has a transistor layer and multiple layers of wiring. The top-most wiring layer has a landing pad structure, where repeating landing pads 2608 of X dimension $W_x$+delta($W_x$) and Y dimension $W_y$+delta($W_y$) are used. delta($W_x$) and delta($W_y$) are quantities that are added to compensate for alignment offsets, and are small compared to $W_x$ and $W_y$ respectively. Alignment mark 2610 for the bottom wafer may be located at ($x_{bottom}$, $y_{bottom}$). Note that the terms landing pad and metal strip are utilized interchangeably in this document.

Figure 26C:
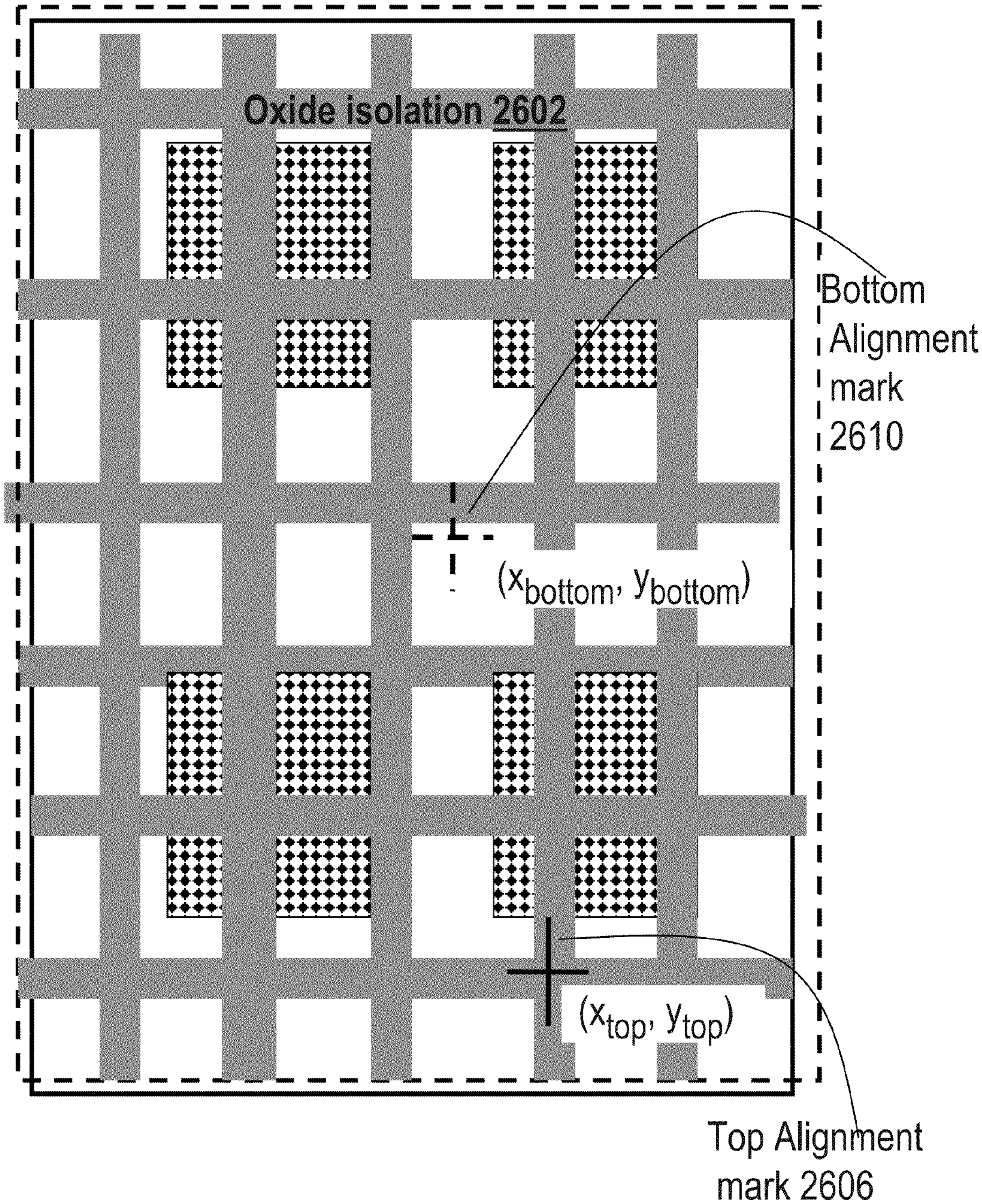

After bonding the top and bottom wafers atop each other as described in FIG. 25A-F, the wafers look as shown in FIG. 26C. Note that the repeating pattern of circuit regions 2604 in between oxide isolation regions 2602 are not shown for easy illustration and understanding. It can be seen the top alignment mark 2606 and bottom alignment mark 2610 are misaligned to each other. As previously described in the description of FIG. 14B, rotational or angular alignment between the top and bottom wafers may be small and margin for this may be provided by the offsets delta($W_x$) and delta($W_y$).

Figure 26D:
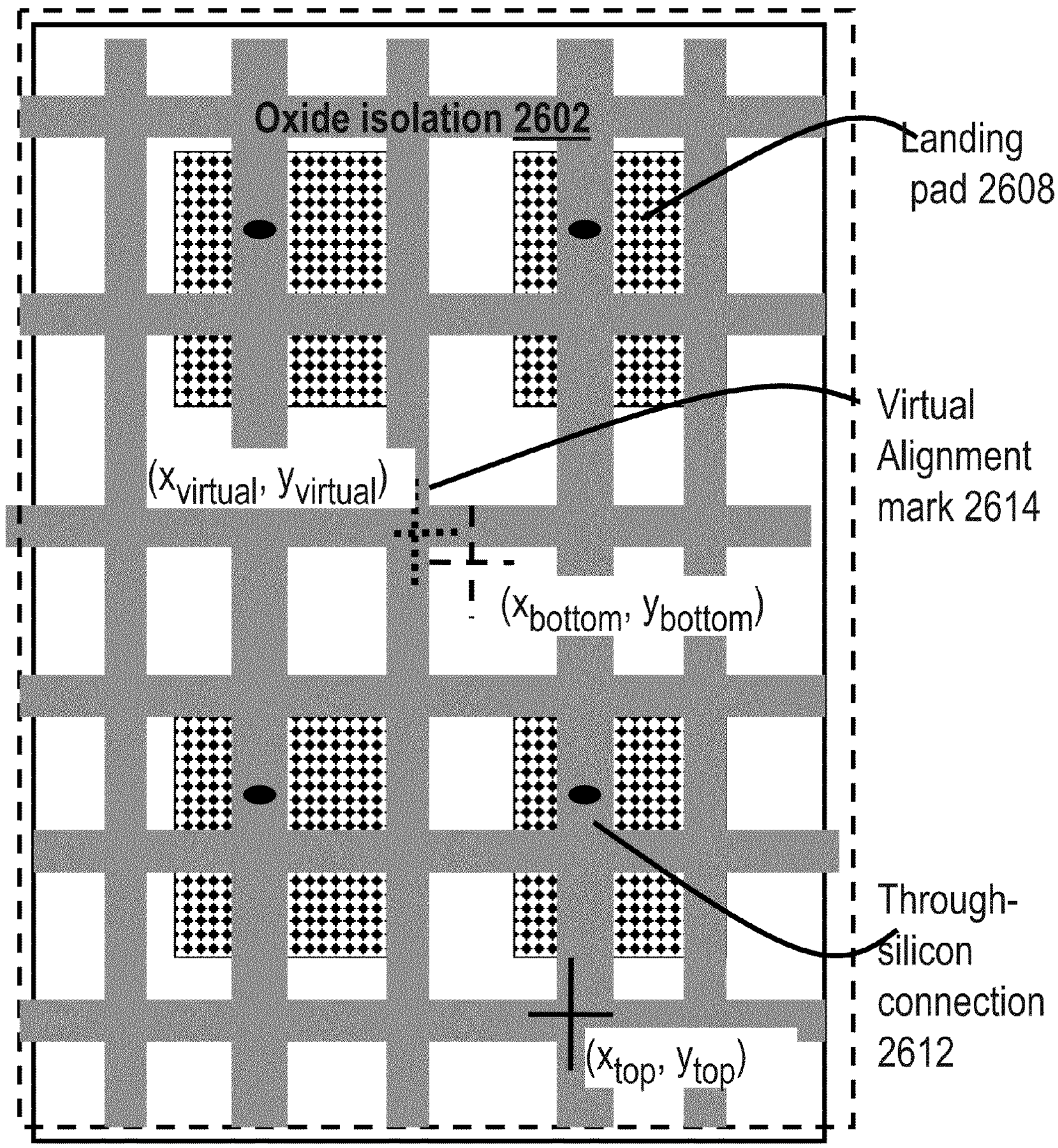

Since the landing pad dimensions are larger than the length of the repeating pattern in both X and Y direction, the top layer-to-layer contact (and other masks) are shifted left or right and up or down until this contact may be on top of the corresponding landing pad. This method may be further described below:

Next step in the process may be described with FIG. 26D. A virtual alignment mark 2614 may be created by the lithography tool. X co-ordinate of this virtual alignment mark 2614 may be at the location ($x_{top}$+(an integer k)*$W_x$). The integer k may be chosen such that modulus or absolute value of ($x_{top}$+(integer k)*$W_x$−$x_{bottom}$)<=$W_x$/2. This guarantees that the X co-ordinate of the virtual alignment mark 2614 may be within a repeat distance of the X alignment mark of the bottom wafer. Y co-ordinate of this virtual alignment mark may be at the location ($y_{top}$+(an integer h)*$W_y$). The integer h may be chosen such that modulus or absolute value of ($y_{top}$+(integer h)*$W_y$−$y_{bottom}$)<=$W_y$/2. This guarantees that the Y co-ordinate of the virtual alignment mark 2614 may be within a repeat distance of the Y alignment mark of the bottom wafer. Since the silicon thickness of the top layer may be thin, the lithography tool can observe the alignment mark of the bottom wafer. Though-silicon connections 2612 are now constructed with alignment mark of this mask aligned to the virtual alignment mark 2614. Since the X and Y co-ordinates of the virtual alignment mark 2614 are within the same area of the layout (of dimensions $W_x$ and $W_y$) as the bottom wafer X and Y alignment marks, the through-silicon connection 2612 always falls on the bottom landing pad 2608 (the bottom landing pad dimensions are $W_x$ added to delta ($W_x$) and $W_y$ added to delta ($W_y$)).

Figure 27A:
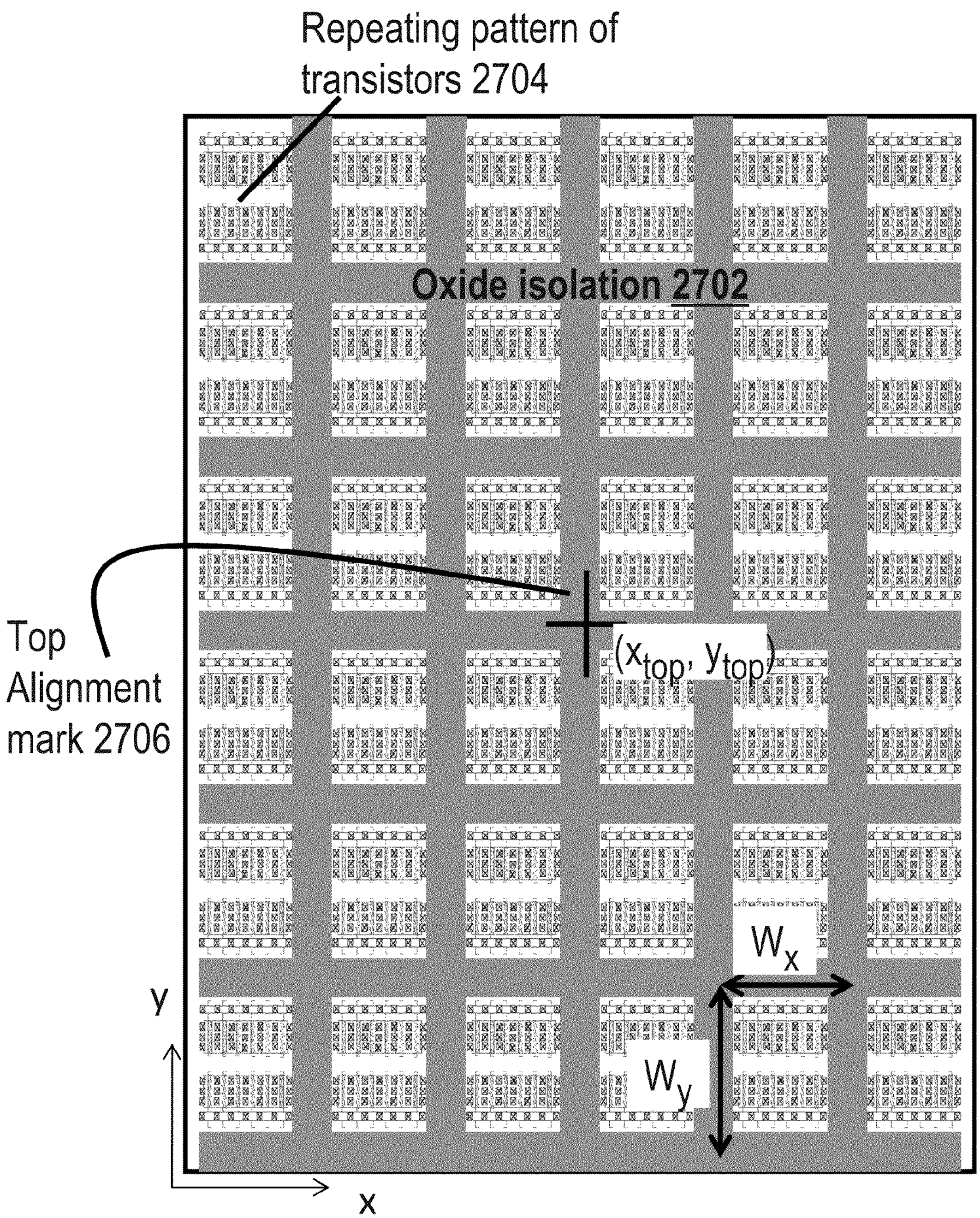
FIG. 27A-F shows an alternative alignment scheme for repeating pattern in X and Y directions.

FIG. 27A-F show an alternative alignment method for forming CMOS circuits with a high density of connections between 3D stacked layers. The alignment method may include several steps in the following sequence:

FIG. 27A describes the top wafer. A repeating pattern of circuit regions 2704 in the top wafer in both X and Y directions may be used. Oxide isolation regions 2702 in between adjacent (identical) repeating structures are used. Each (identical) repeating structure has X dimension=$W_x$ and Y dimension=$W_y$, and this includes oxide isolation region thickness. The top alignment mark 2706 in the top layer may be located at ($x_{top}$, $y_{top}$).

Figure 27B:
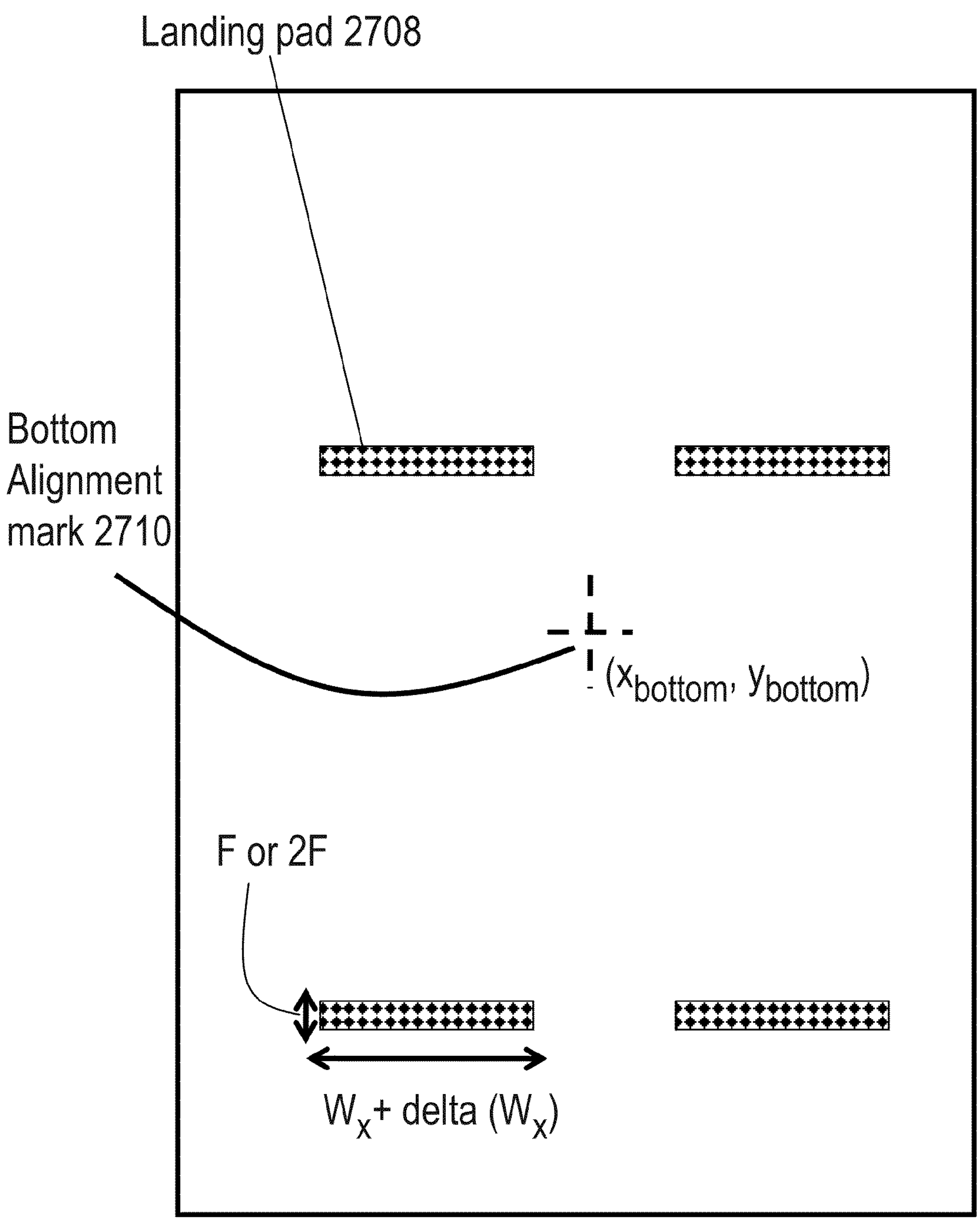

FIG. 27B describes the bottom wafer. The bottom wafer has a transistor layer and multiple layers of wiring. The top-most wiring layer has a landing pad structure, where repeating landing pads 2708 of X dimension $W_x$+delta($W_x$) and Y dimension F or 2 F are used. delta($W_x$) may be a quantity that may be added to compensate for alignment offsets, and are smaller compared to $W_x$. Alignment mark 2710 for the bottom wafer may be located at ($x_{bottom}$, $y_{bottom}$).

Figure 27C:
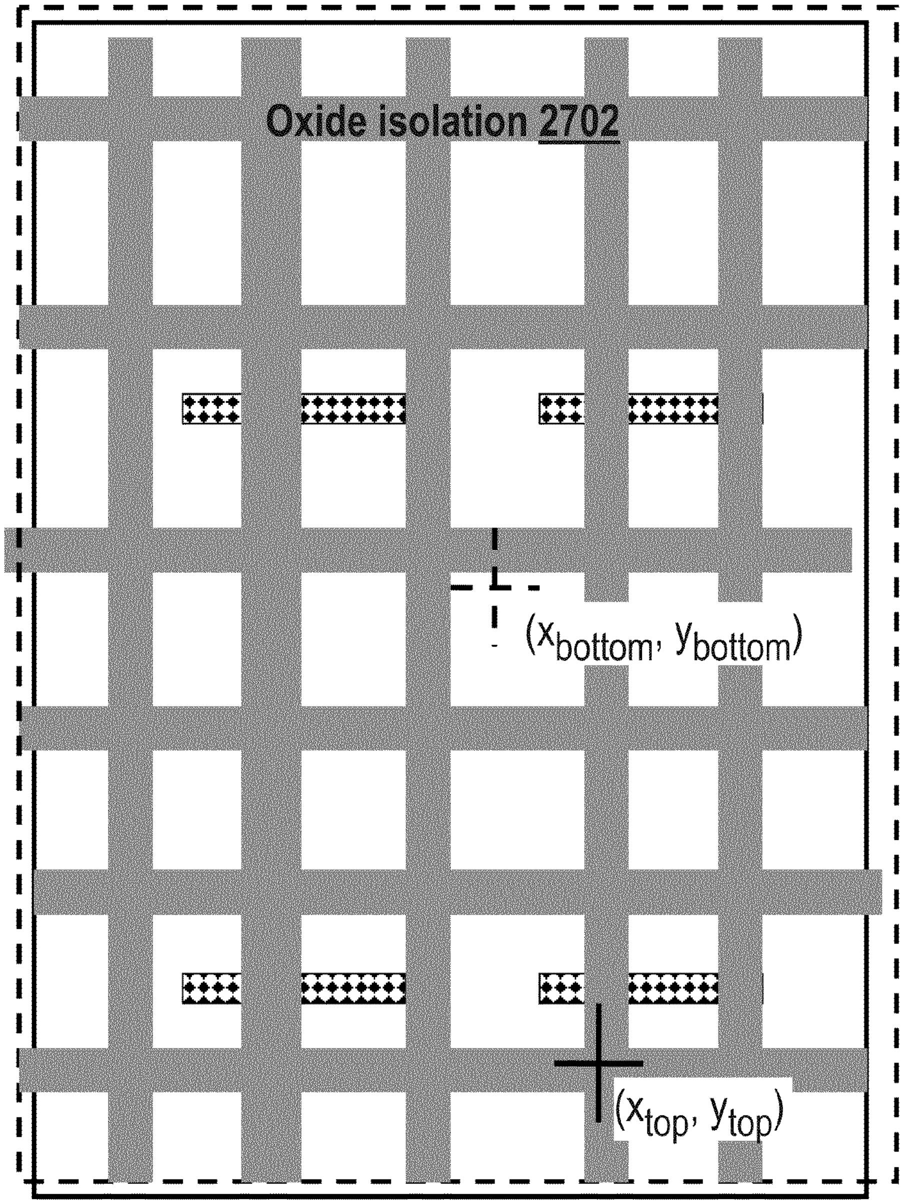

After bonding the top and bottom wafers atop each other as described in FIG. 25A-F, the wafers look as shown in FIG. 27C. Note that the repeating pattern of circuit regions 2704 in between oxide isolation regions 2702 are not shown for easy illustration and understanding. It can be seen the top alignment mark 2706 and bottom alignment mark 2710 are misaligned to each other. As previously described in the description of FIG. 14B, angular alignment between the top and bottom wafers may be small and margin for this may be provided by the offsets delta($W_x$) and delta($W_y$).

Figure 27D:
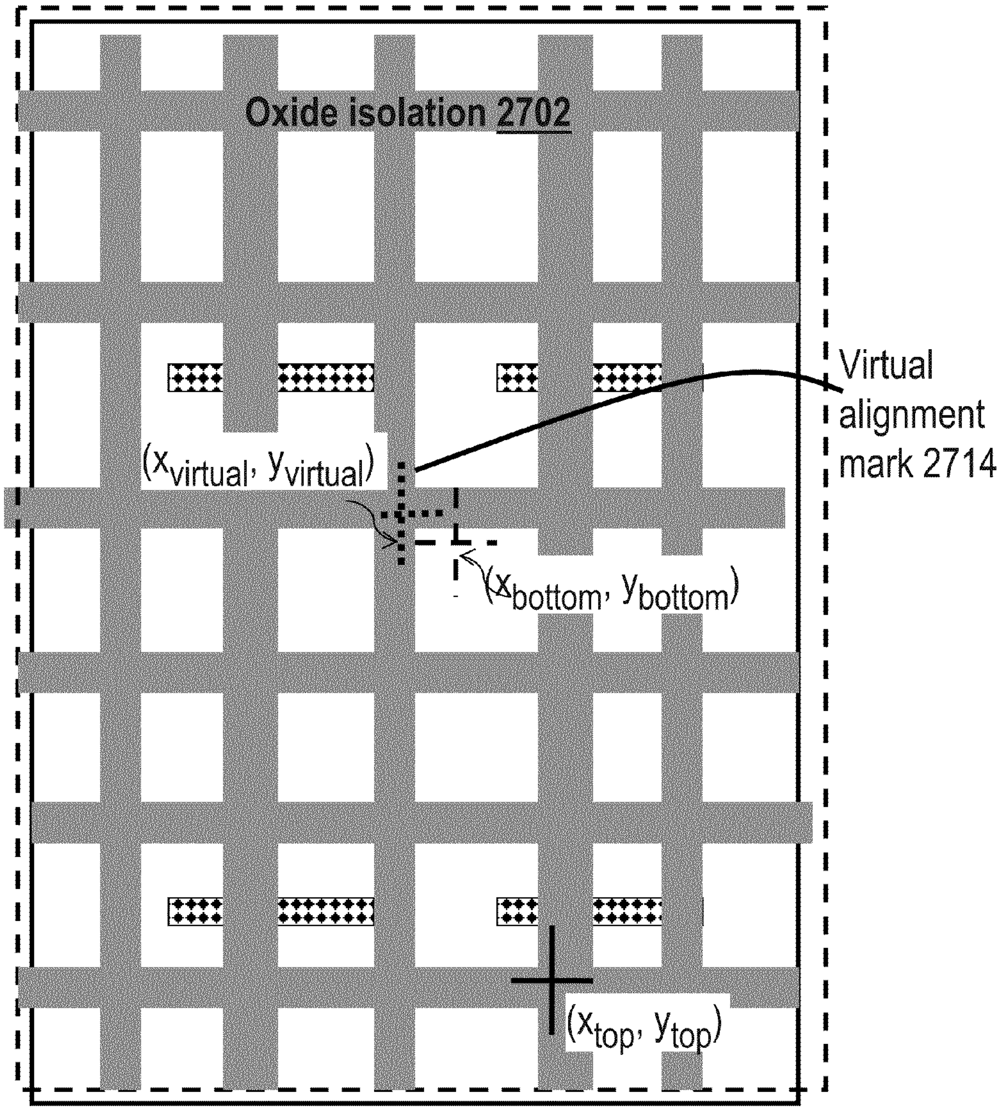

FIG. 27D illustrates the alignment method during/after the next step. A virtual alignment mark 2714 may be created by the lithography tool. X co-ordinate of this virtual alignment mark 2714 may be at the location ($x_{top}$+(an integer k)*$W_x$). The integer k may be chosen such that modulus or absolute value of ($x_{top}$+(integer k)*$W_x$−$x_{bottom}$)<=$W_x$/2. This guarantees that the X co-ordinate of the virtual alignment mark 2714 may be within a repeat distance of the X alignment mark of the bottom wafer. Y co-ordinate of this virtual alignment mark 2714 may be at the location ($y_{top}$+(an integer h)*$W_y$). The integer h may be chosen such that modulus or absolute value of ($y_{top}$+(integer*$W_y$−$y_{bottom}$)<=$W_y$/2. This guarantees that the Y co-ordinate of the virtual alignment mark 2714 may be within a repeat distance of the Y alignment mark of the bottom wafer. Since the silicon thickness of the top layer may be thin, the lithography tool can observe the alignment mark of the bottom wafer. The virtual alignment mark 2714 may be at the location ($x_{virtual}$, $y_{virtual}$) where $x_{virtual}$ and $y_{virtual}$ are obtained as described earlier in this paragraph.

Figure 27E:
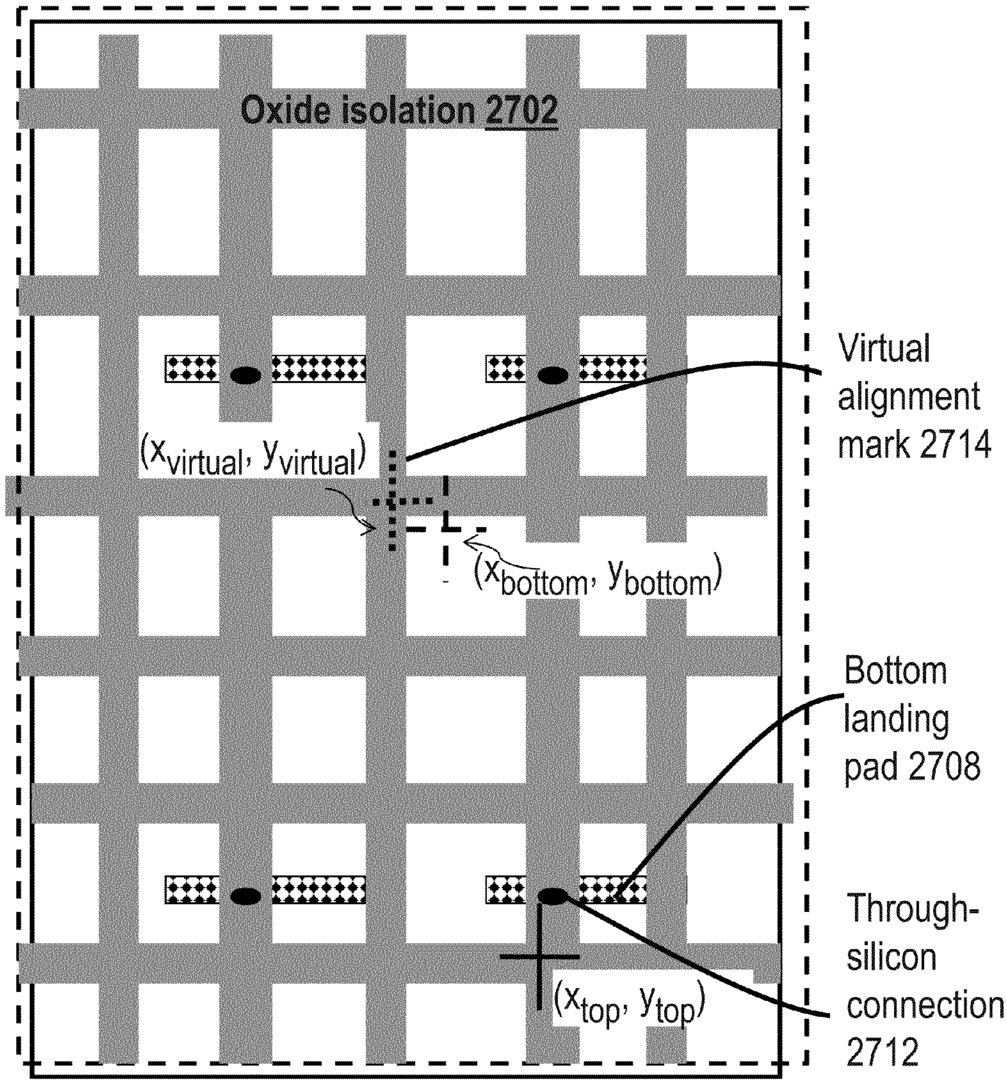

FIG. 27E illustrates the alignment method during/after the next step. Though-silicon connections 2712 are now constructed with alignment mark of this mask aligned to ($x_{virtual}$, $y_{bottom}$). Since the X co-ordinate of the virtual alignment mark 2714 may be within the same section of the layout in the X direction (of dimension $W_x$) as the bottom wafer X alignment mark, the through-silicon connection 2712 always falls on the bottom landing pad 2708 (the bottom landing pad dimension may be $W_x$ added to delta ($W_x$)). The Y co-ordinate of the through silicon connection 2712 may be aligned to $y_{bottom}$, the Y co-ordinate of the bottom wafer alignment mark as described previously.

Figure 27F:
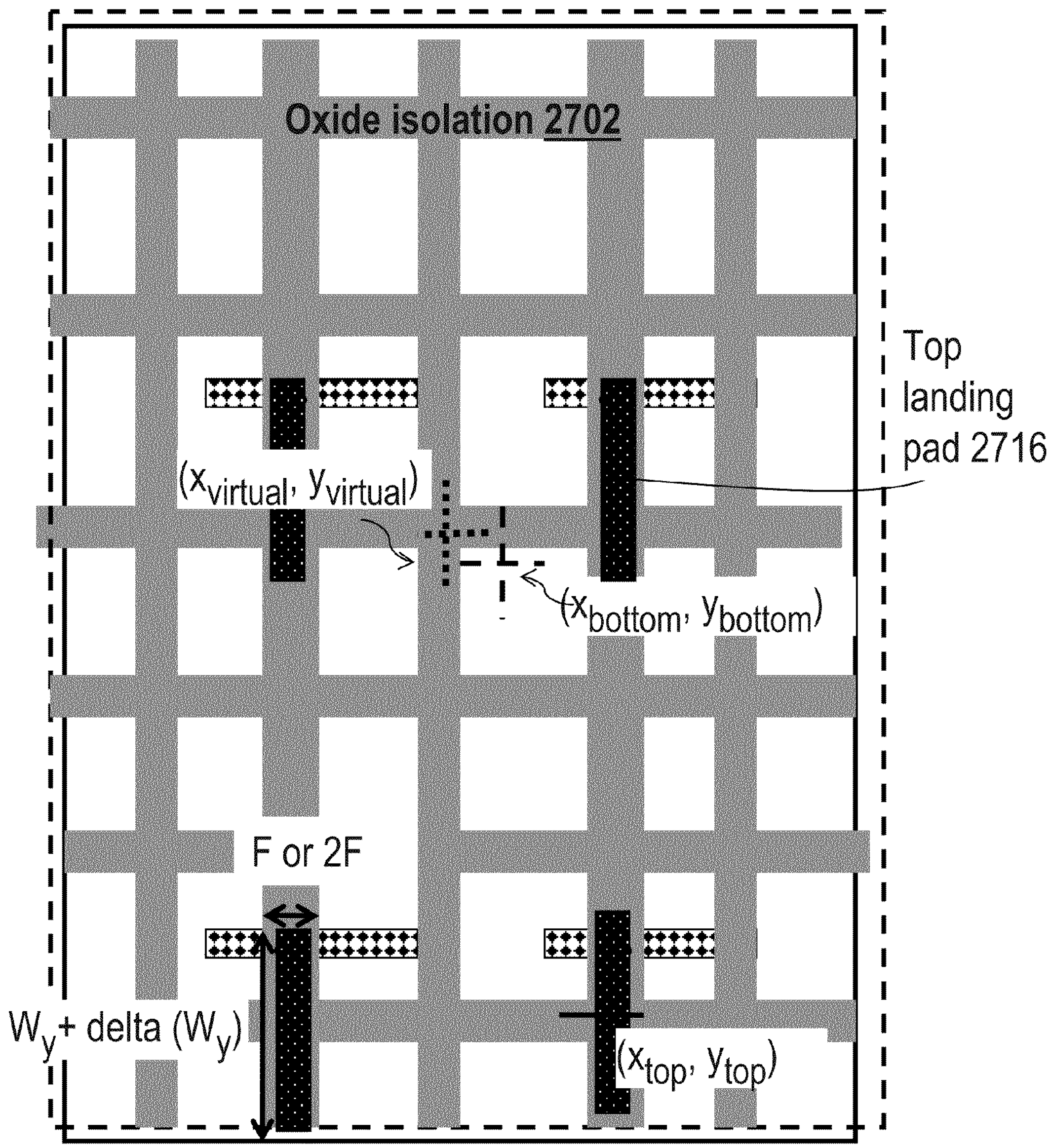

FIG. 27F shows a drawing illustration during/after the next step. A top landing pad 2716 may be then constructed with X dimension F or 2 F and Y dimension $W_y$+delta($W_y$). This mask may be formed with alignment mark aligned to ($x_{bottom}$, $y_{virtual}$). Essentially, it can be seen that the top landing pad 2716 compensates for misalignment in the Y direction, while the bottom landing pad 2708 compensates for misalignment in the X direction.

The alignment scheme shown in FIG. 27A-F can give a higher density of connections between two layers than the alignment scheme shown in FIG. 26A-D. The connection paths between two transistors located on two layers therefore may include: a first landing pad or metal strip substantially parallel to a certain axis, a through via and a second landing pad or metal strip substantially perpendicular to a certain axis. Features are formed using virtual alignment marks whose positions depend on misalignment during bonding. Also, through-silicon connections in FIG. 26A-D have relatively high capacitance due to the size of the landing pads. It will be apparent to one skilled in the art that variations of this process flow are possible (e.g., different versions of regular layouts could be used along with replacement gate processes to get a high density of connections between 3D stacked circuits and chips).

Figure 44A:
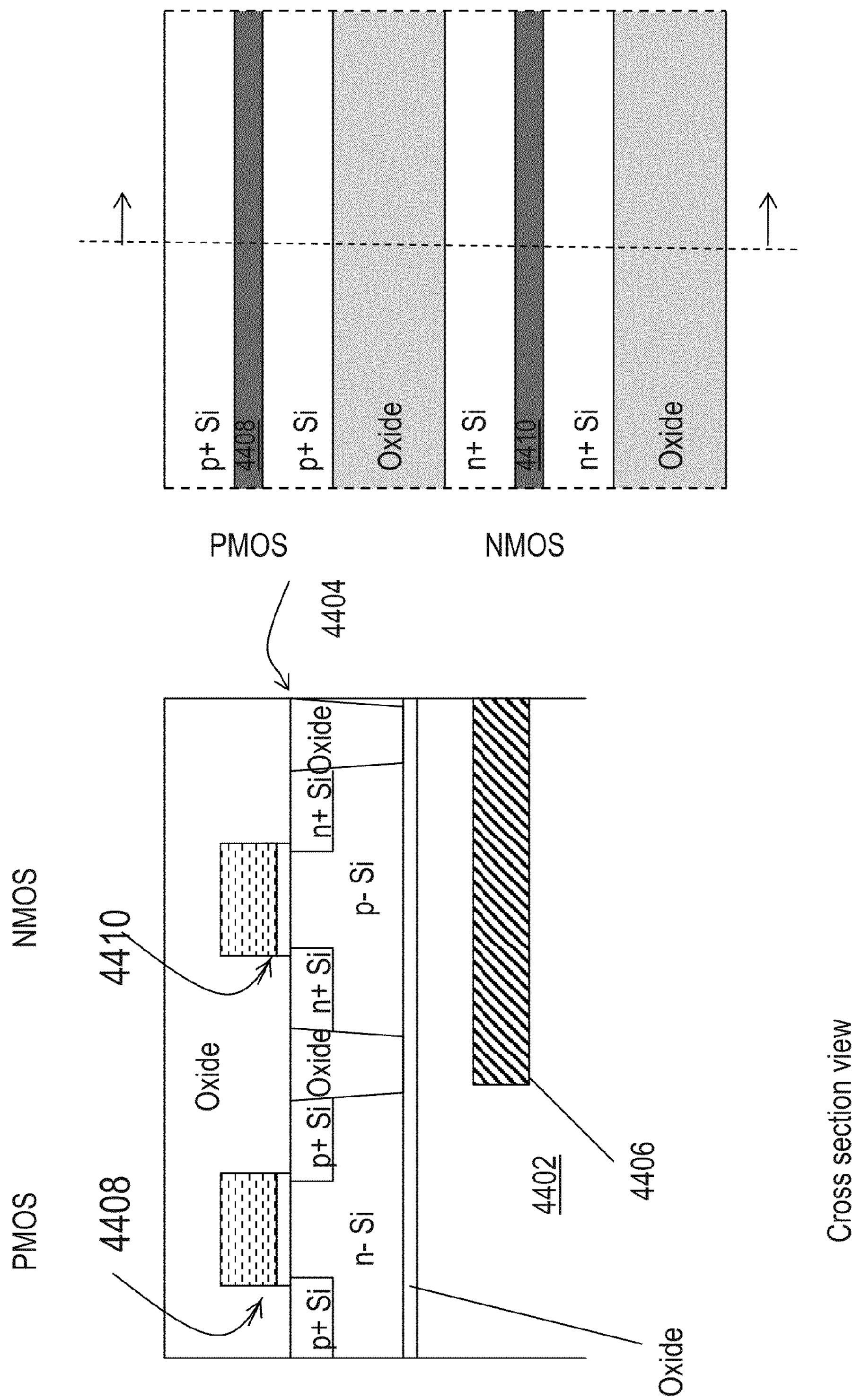
FIG. 44A-D depict a process flow for constructing 3D integrated chips and circuits with misalignment tolerance techniques and repeating pattern in one direction.

FIG. 44A-D and FIG. 45A-D show an alternative procedure for forming CMOS circuits with a high density of connections between stacked layers. The process utilizes a repeating pattern in one direction for the top layer of transistors. The procedure may include several steps in the following sequence:

Step (A): Using procedures similar to FIG. 25A-F, a top layer of transistors 4404 may be transferred atop a bottom layer of transistors and wires 4402. Landing pads 4406 are utilized on the bottom layer of transistors and wires 4402. Dummy gates 4408 and 4410 are utilized for nMOS and pMOS. The key difference between the structures shown in FIG. 25A-F and this structure may be the layout of oxide isolation regions between transistors. FIG. 44A illustrates the structure after Step (A).

Figure 44B:
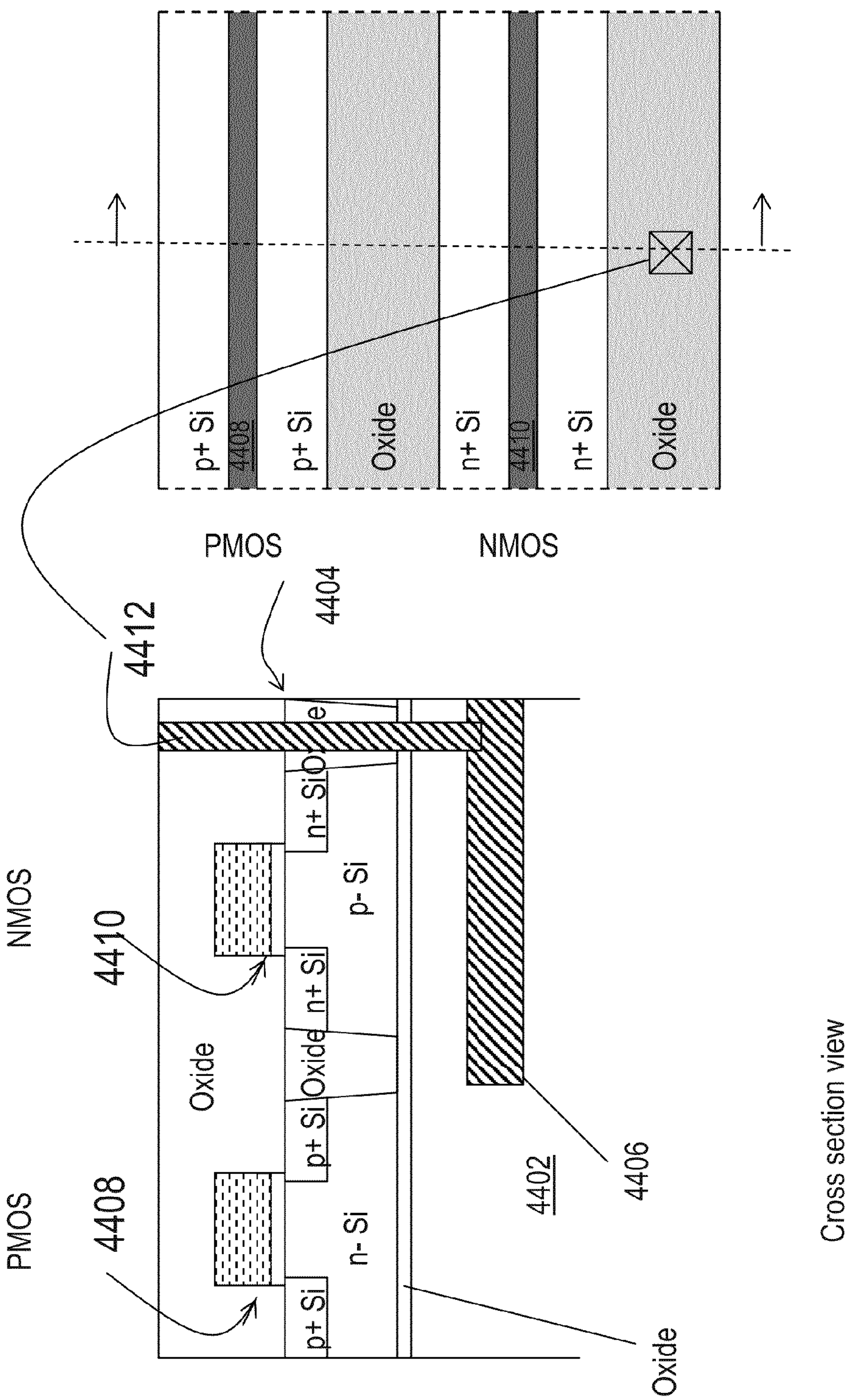

Step (B): Through-silicon connections 4412 are formed well-aligned to the bottom layer of transistors and wires 4402. Alignment schemes to be described in FIG. 45A-D may be utilized for this purpose. All features constructed in future steps may also be formed well-aligned to the bottom layer of transistors and wires 4402. FIG. 44B illustrates the structure after Step (B).

Figure 44C:
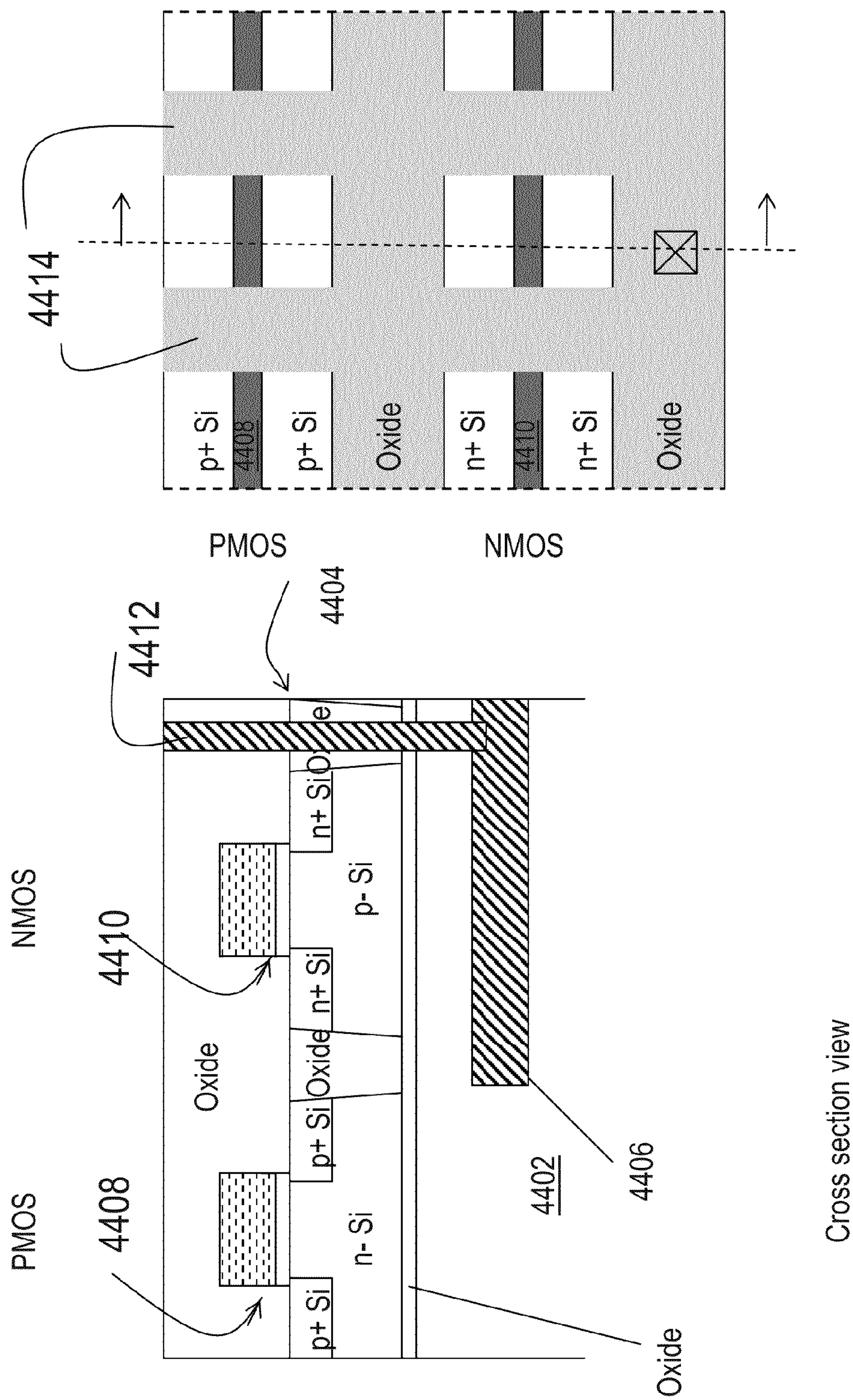

Step (C): Oxide isolation regions 4414 are formed between adjacent transistors to be defined. These isolation regions are formed by lithography and etch of gate and silicon regions and then fill with oxide. FIG. 44C illustrates the structure after Step (C).

Figure 44D:
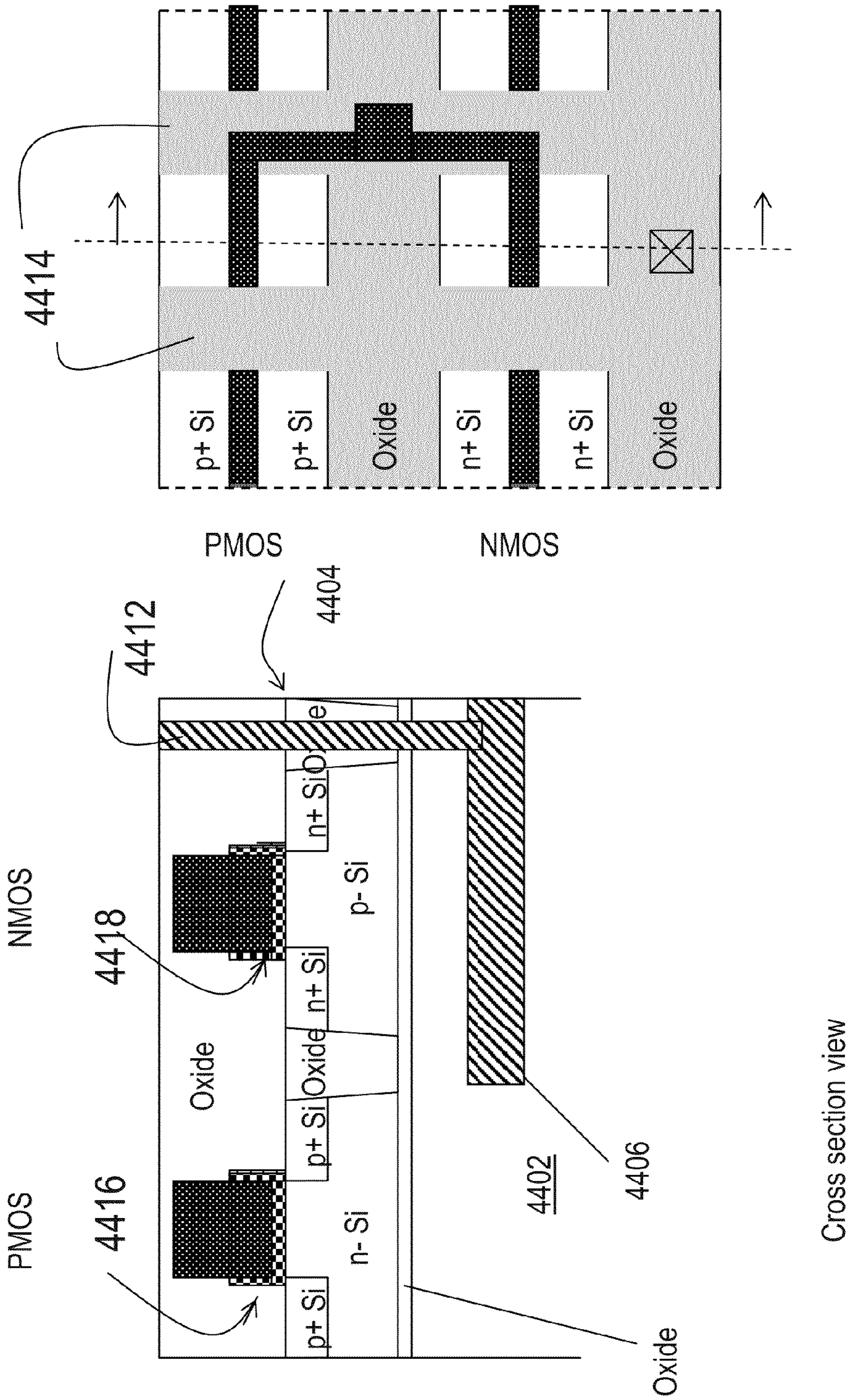

Step (D): The dummy gates 4408 and 4410 are etched away and replaced with replacement gates 4416 and 4418. These replacement gates are patterned and defined to form gate contacts as well. FIG. 44D illustrates the structure after Step (D). Following this, other process steps in the fabrication flow proceed as usual.

Figure 45A:
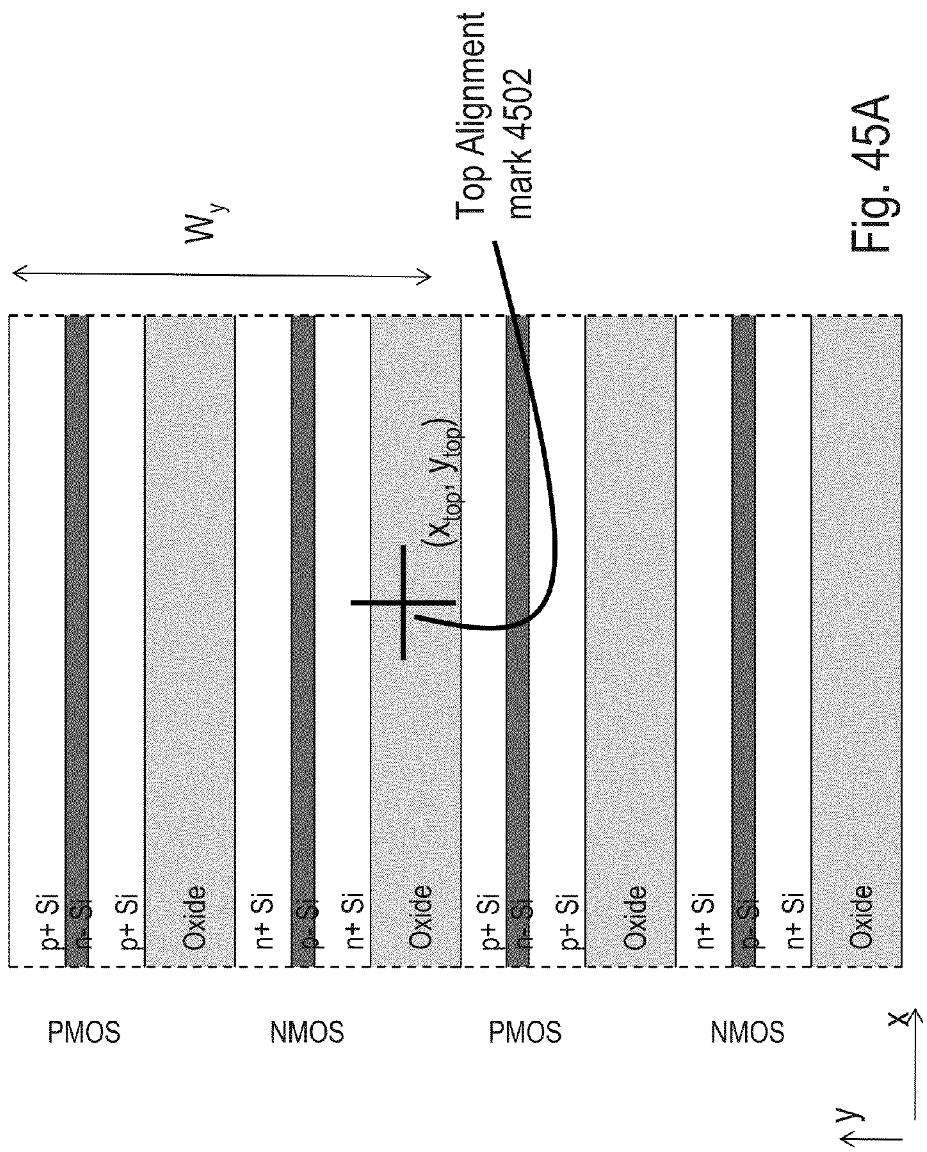
FIG. 45A-D shows a misalignment tolerance technique for constructing 3D integrated chips and circuits with repeating pattern in one direction.
Figure 45B:
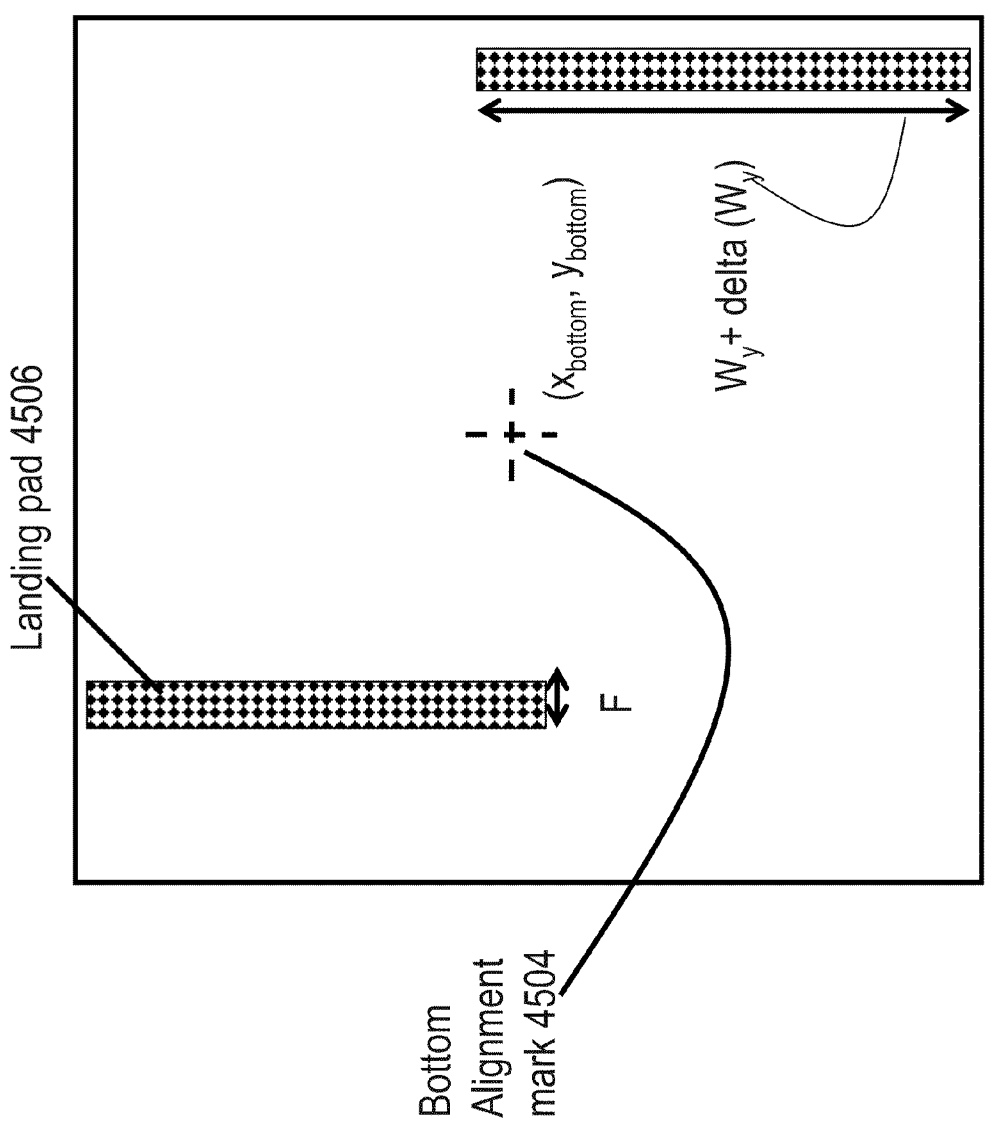

FIG. 45A-D describe alignment schemes for the structures shown in FIG. 44A-D. FIG. 45A describes the top wafer. A repeating pattern of features in the top wafer in Y direction may be used. Each (identical) repeating structure has Y dimension=$W_y$, and this includes oxide isolation region thickness. The alignment mark 4502 in the top layer may be located at ($x_{top}$, $y_{top}$). FIG. 45B describes the bottom wafer. The bottom wafer has a transistor layer and multiple layers of wiring. The top-most wiring layer has a landing pad structure, where repeating landing pads 4506 of X dimension F or 2 F and Y dimension $W_y$+delta($W_y$) are used. delta($W_y$) may be a quantity that may be added to compensate for alignment offsets, and may be smaller compared to $W_y$. Alignment mark 4504 for the bottom wafer may be located at ($x_{bottom}$, $y_{bottom}$).

Figure 45C:
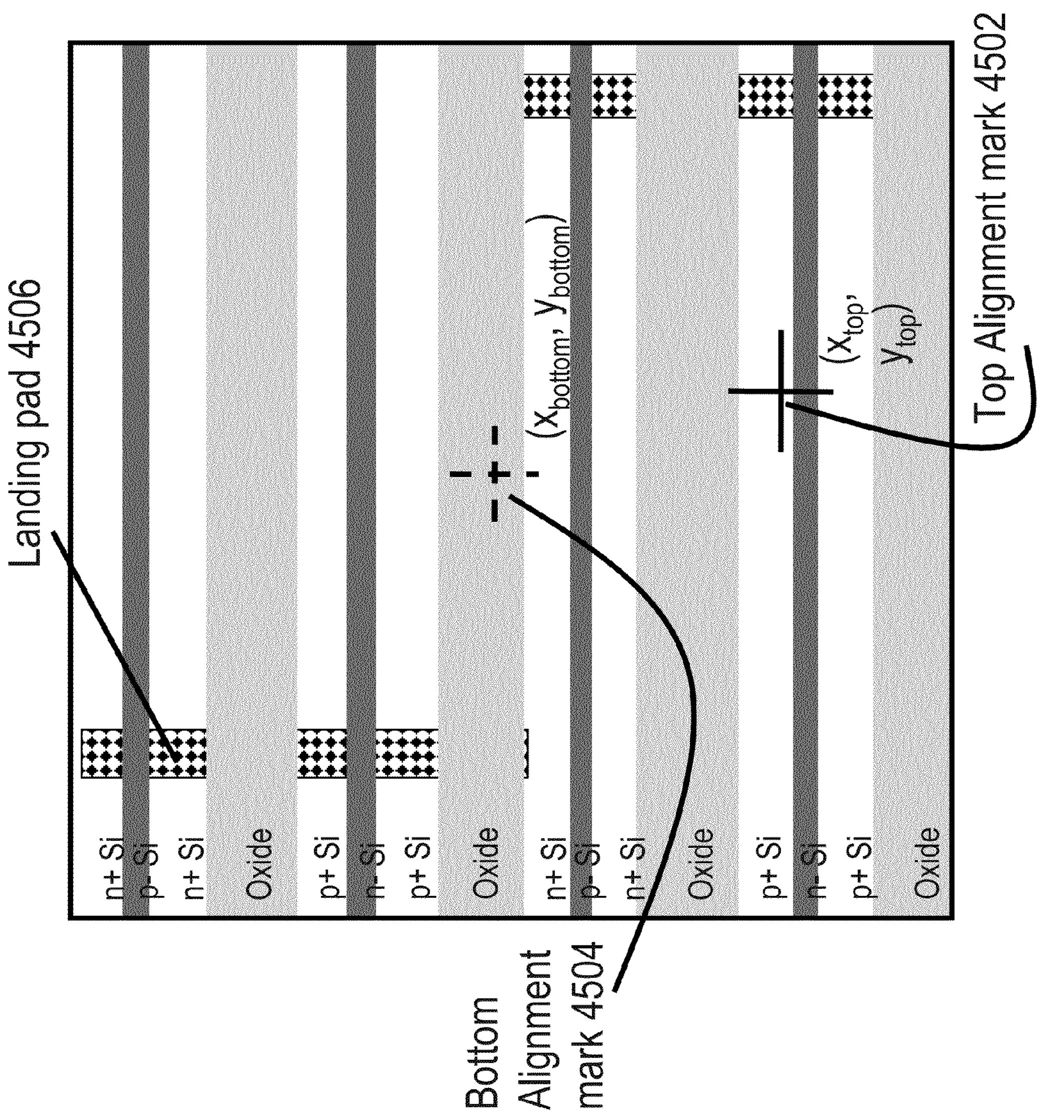

After bonding the top and bottom wafers atop each other as described in FIG. 44A-D, the wafers look as shown in FIG. 45C. It can be seen the top alignment mark 4502 and bottom alignment mark 4504 are misaligned to each other. As previously described in the description of FIG. 14B, angle alignment between the top and bottom wafers may be small or negligible.

Figure 45D:
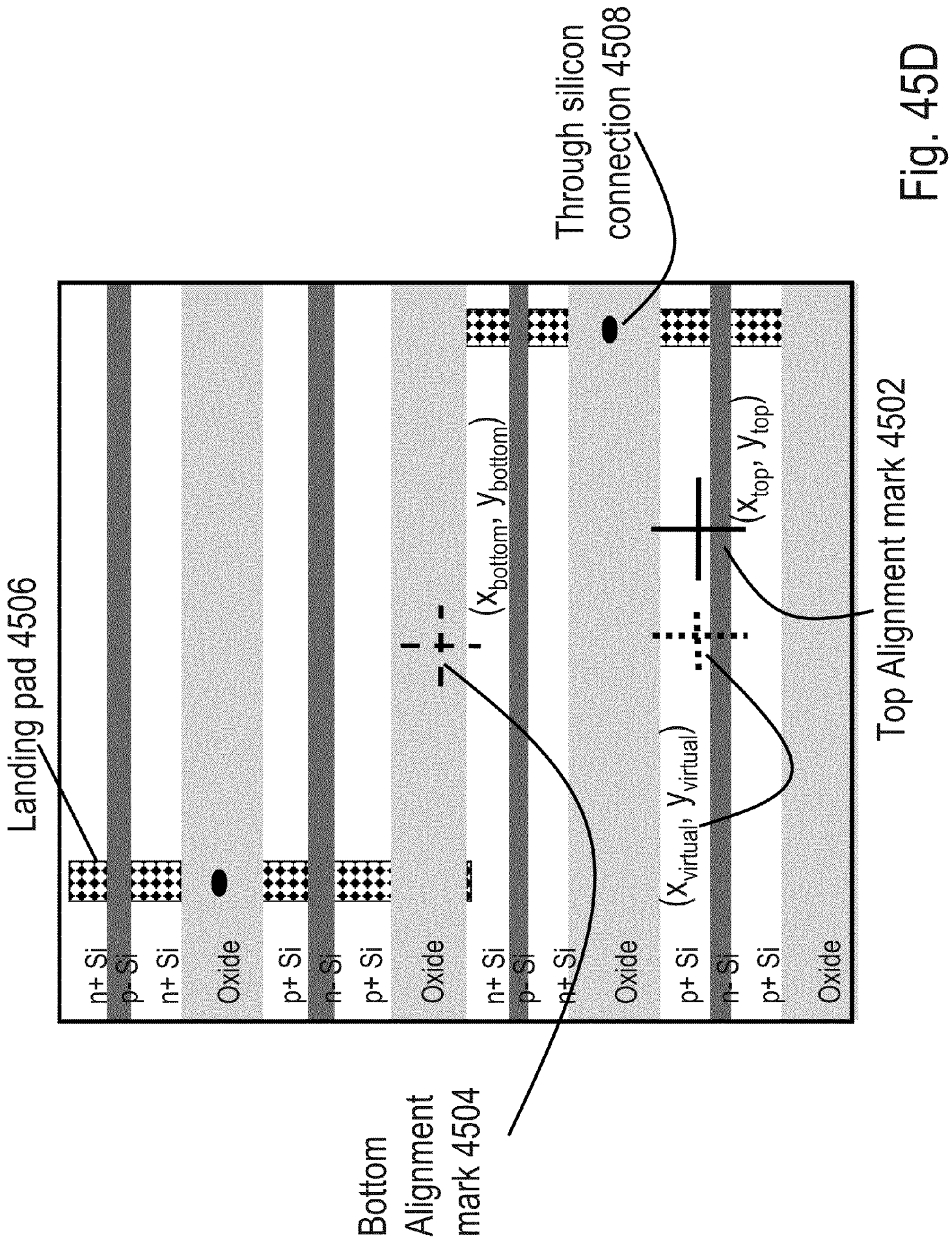

FIG. 45D illustrates the next step of the alignment procedure. A virtual alignment mark may be created by the lithography tool. X co-ordinate of this virtual alignment mark may be at the location ($x_{bottom}$). Y co-ordinate of this virtual alignment mark may be at the location ($y_{top}$+(an integer h)*$W_y$). The integer h may be chosen such that modulus or absolute value of ($y_{top}$+(integer h)*$W_y$−$y_{bottom}$)<=$W_y$/2. This guarantees that the Y co-ordinate of the virtual alignment mark may be within a repeat distance of the Y alignment mark of the bottom wafer. Since silicon thickness of the top layer may be thin, the lithography tool can observe the alignment mark of the bottom wafer. The virtual alignment mark may be at the location ($x_{virtual}$, $y_{virtual}$) where $x_{virtual}$ and $y_{virtual}$ are obtained as described earlier in this paragraph.

FIG. 45E illustrates the next step of the alignment procedure. Though-silicon connections 4508 are now constructed with alignment mark of this mask aligned to ($x_{virtual}$, $y_{virtual}$). Since the X co-ordinate of the virtual alignment mark may be perfectly aligned to the X co-ordinate of the bottom wafer alignment mark and since the Y co-ordinate of the virtual alignment mark may be within the same section of the layout (of distance $W_y$) as the bottom wafer Y alignment mark, the through-silicon connection 4508 always falls on the bottom landing pad (the bottom landing pad dimension in the Y direction may be $W_y$ added to delta ($W_y$)). Thus, the through via may be aligned in one direction according to the bottom alignment marks and in the perpendicular direction to the top alignment marks. And may be based in part on the distance between the bottom alignment marks and the top alignment marks.

Figure 46A:
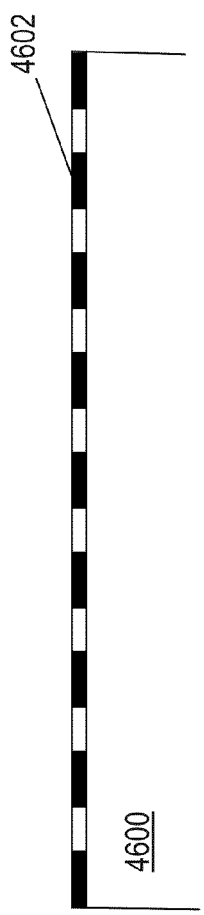
FIG. 46A-G illustrates using a carrier wafer for layer transfer.
Figure 46B:
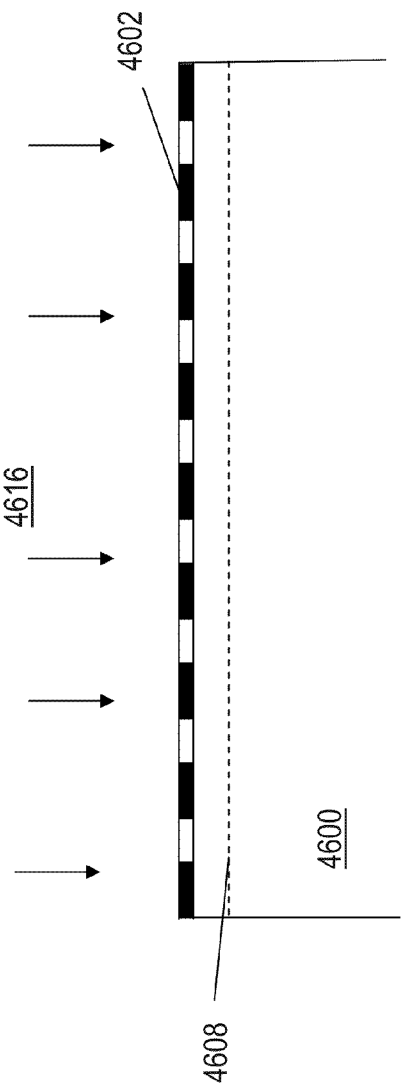
Figure 46C:
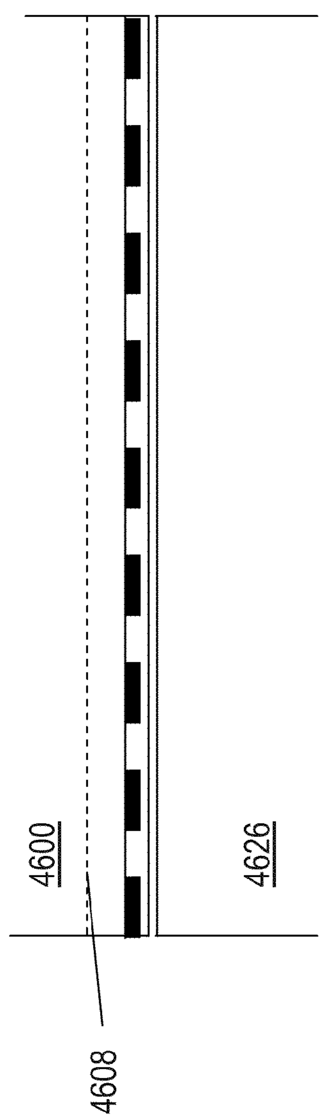
Figure 46D:
Figure 46E:
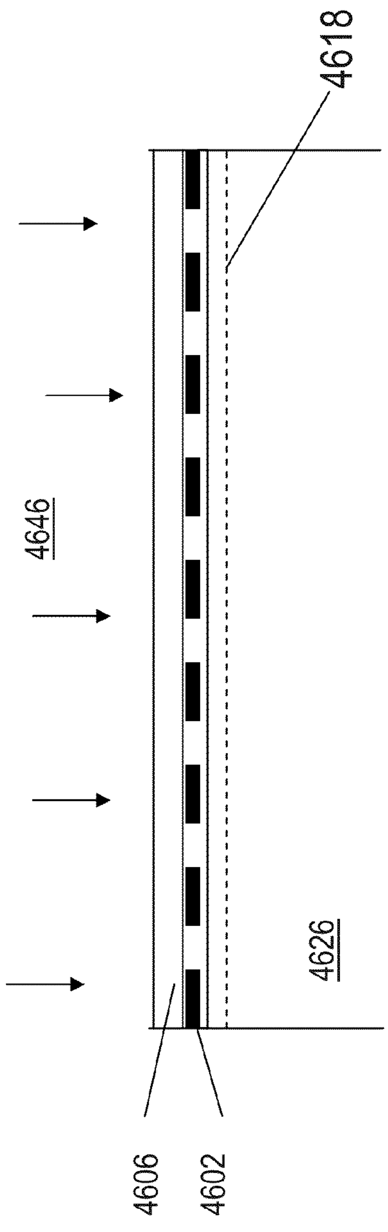
Figure 46F:
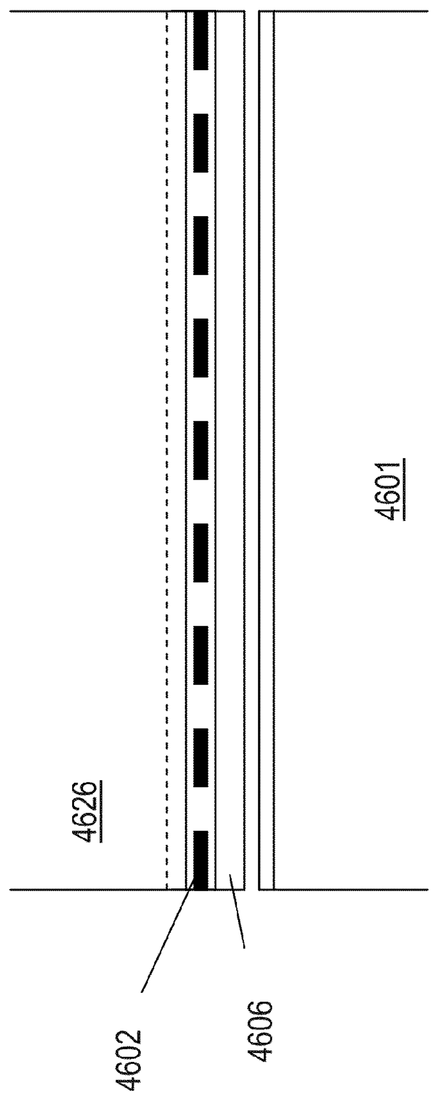
Figure 46G:
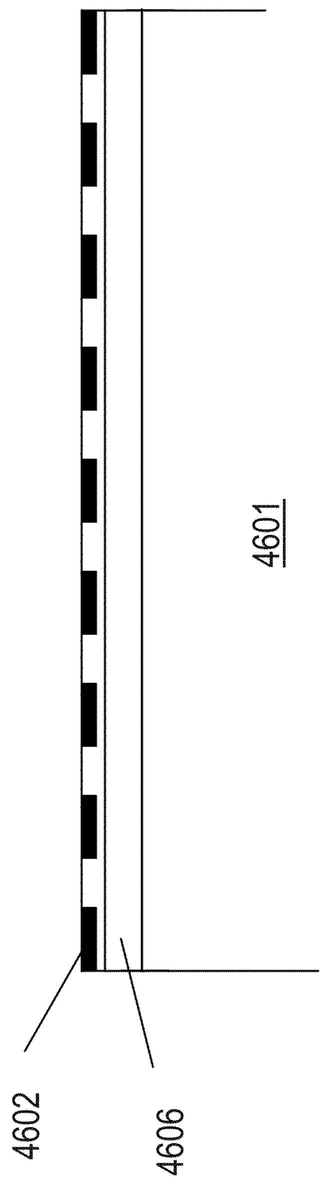

FIG. 46A-G illustrate using a carrier wafer for layer transfer, with reference to the FIG. 25 description and flow. FIG. 46A illustrates the first step of preparing dummy gate transistors 4602 on first donor wafer 4600 (or top wafer). This completes the first phase of transistor formation. FIG. 46B illustrates forming a cleave line 4608 by implant 4616 of atomic particles such as H+. FIG. 46C illustrates permanently bonding the first donor wafer 4600 to a second donor wafer 4626. The permanent bonding may be oxide to oxide wafer bonding as described previously. FIG. 46D illustrates the second donor wafer 4626 acting as a carrier wafer after cleaving the first donor wafer off; leaving a thin layer 4606 with the now buried dummy gate transistors 4602. FIG. 46E illustrates forming a second cleave line 4618 in the second donor wafer 4626 by implant 4646 of atomic species such as H+. FIG. 46F illustrates the second layer transfer step to bring the dummy gate transistors 4602 ready to be permanently bonded on top of the bottom layer of transistors and wires 4601. For the simplicity of the explanation we left out the steps of surface layer preparation done for each of these bonding steps. FIG. 46G illustrates the bottom layer of transistors and wires 4601 with the dummy gate transistors 4602 on top after cleaving off the second donor wafer and removing the layers on top of the dummy gate transistors. Now we can proceed and replace the dummy gates with the final gates, form the metal interconnection layers, and continue the 3D fabrication process.

Figure 47A:
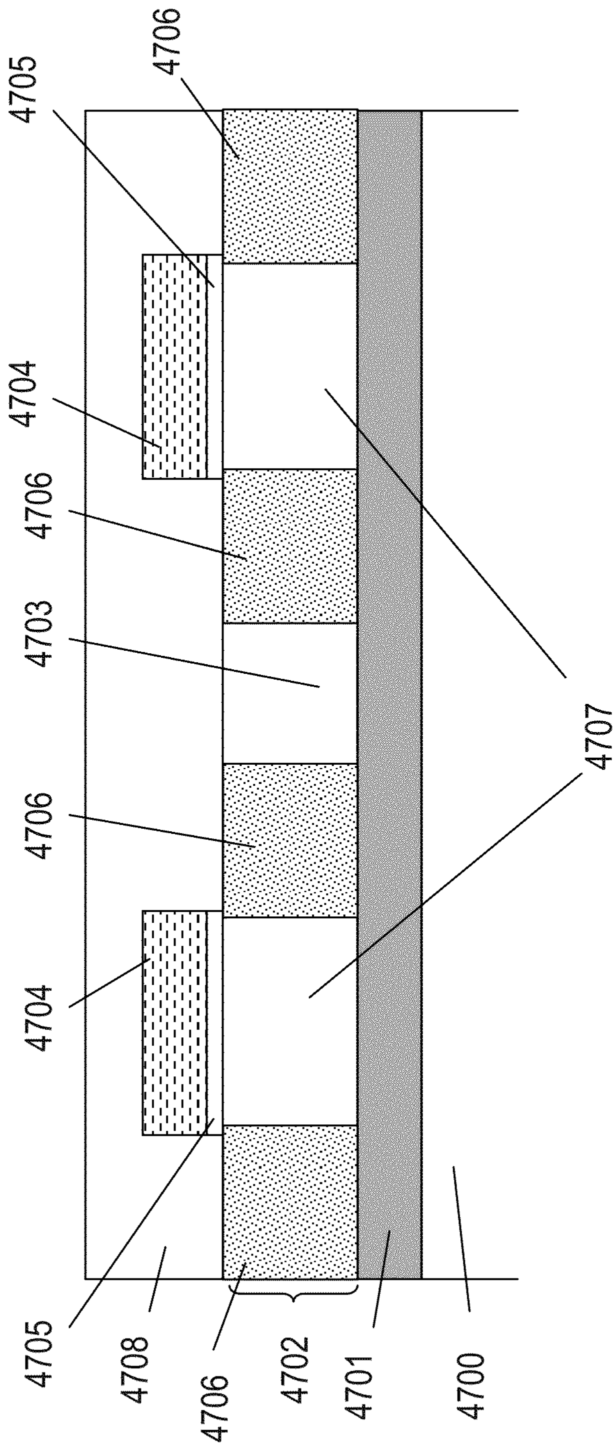
FIG. 47A-K illustrates constructing chips with nMOS and pMOS devices on either side of the wafer.
Figure 47B:
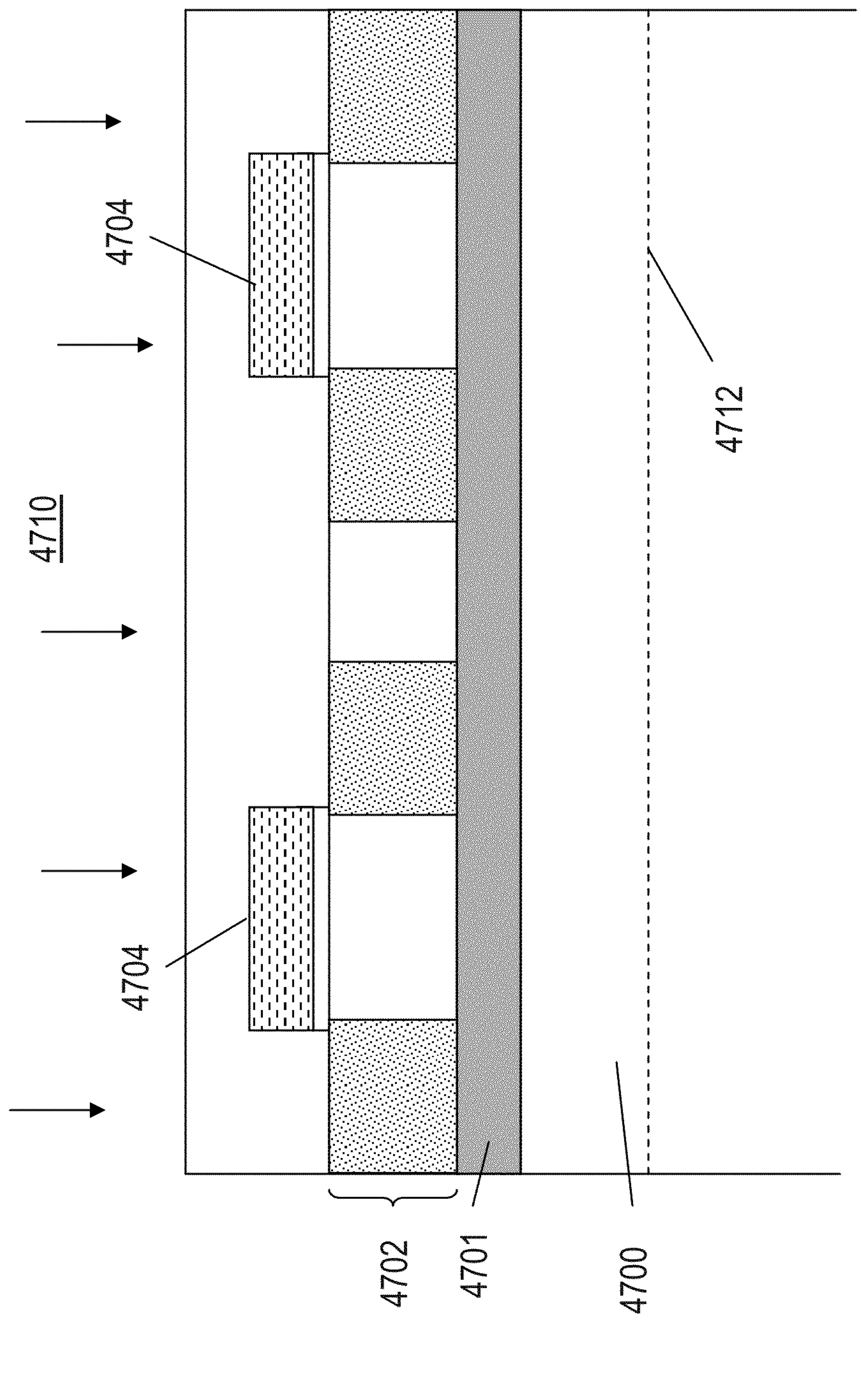
Figure 47C:
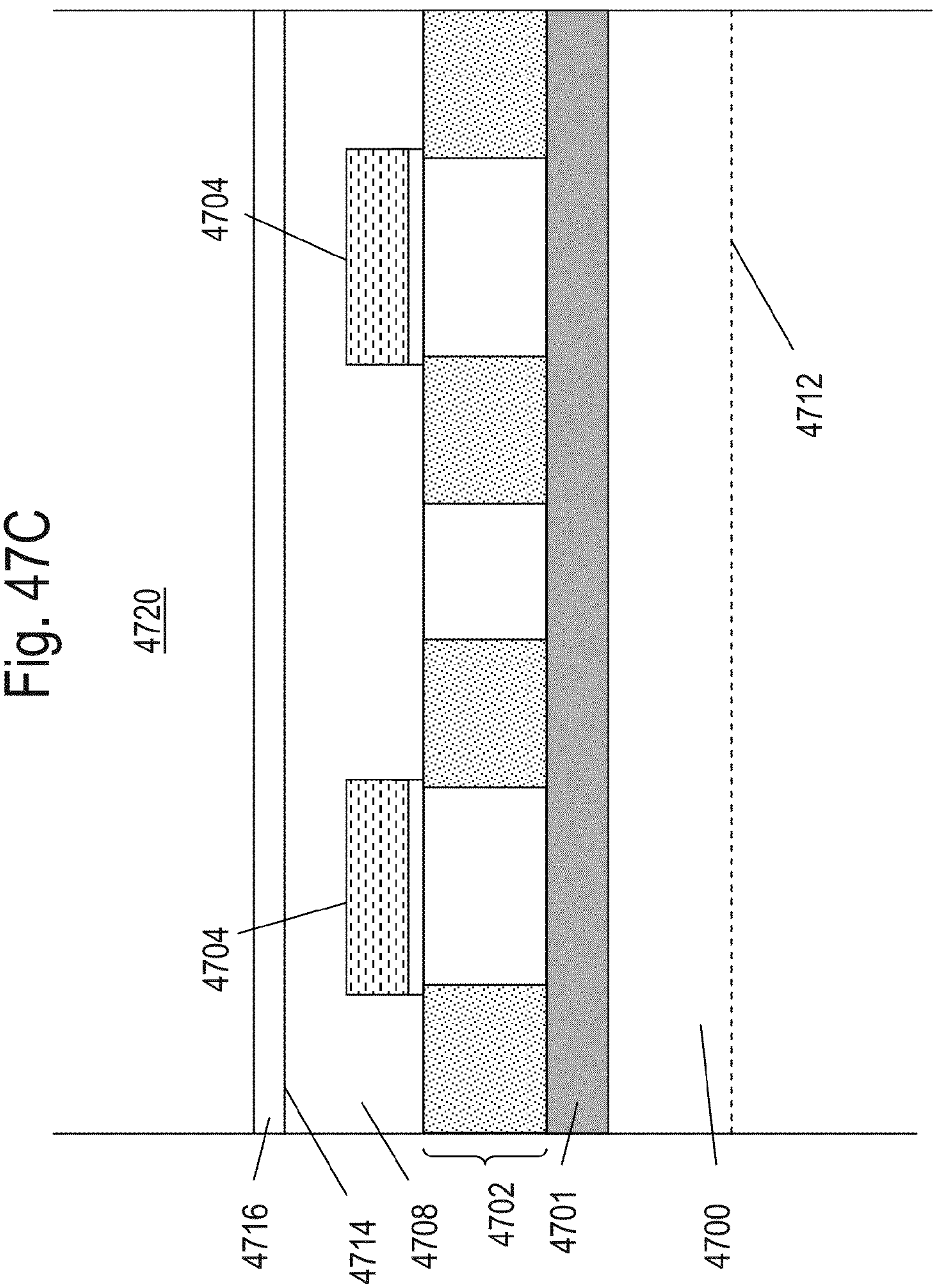
Figure 47D:
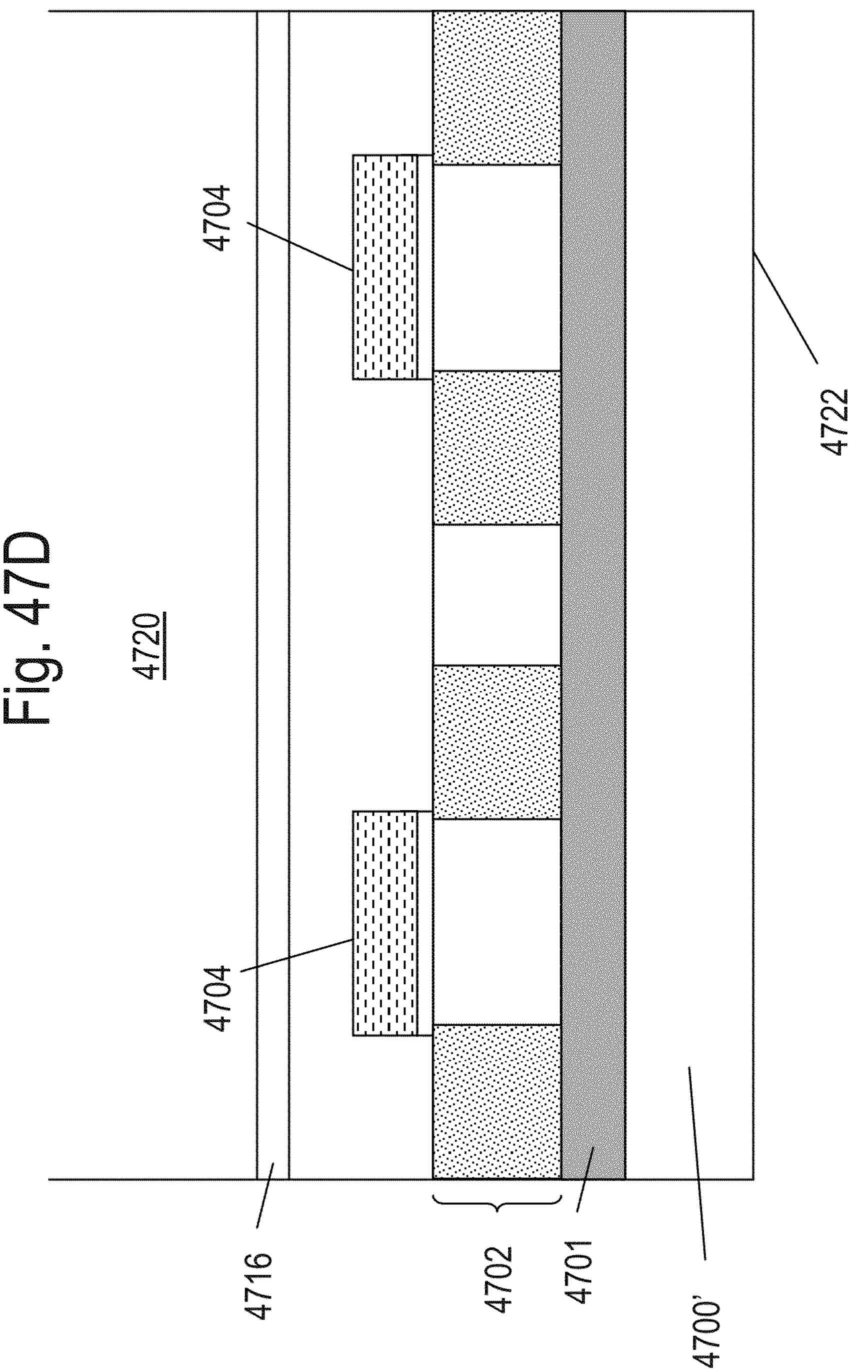
Figure 47E:
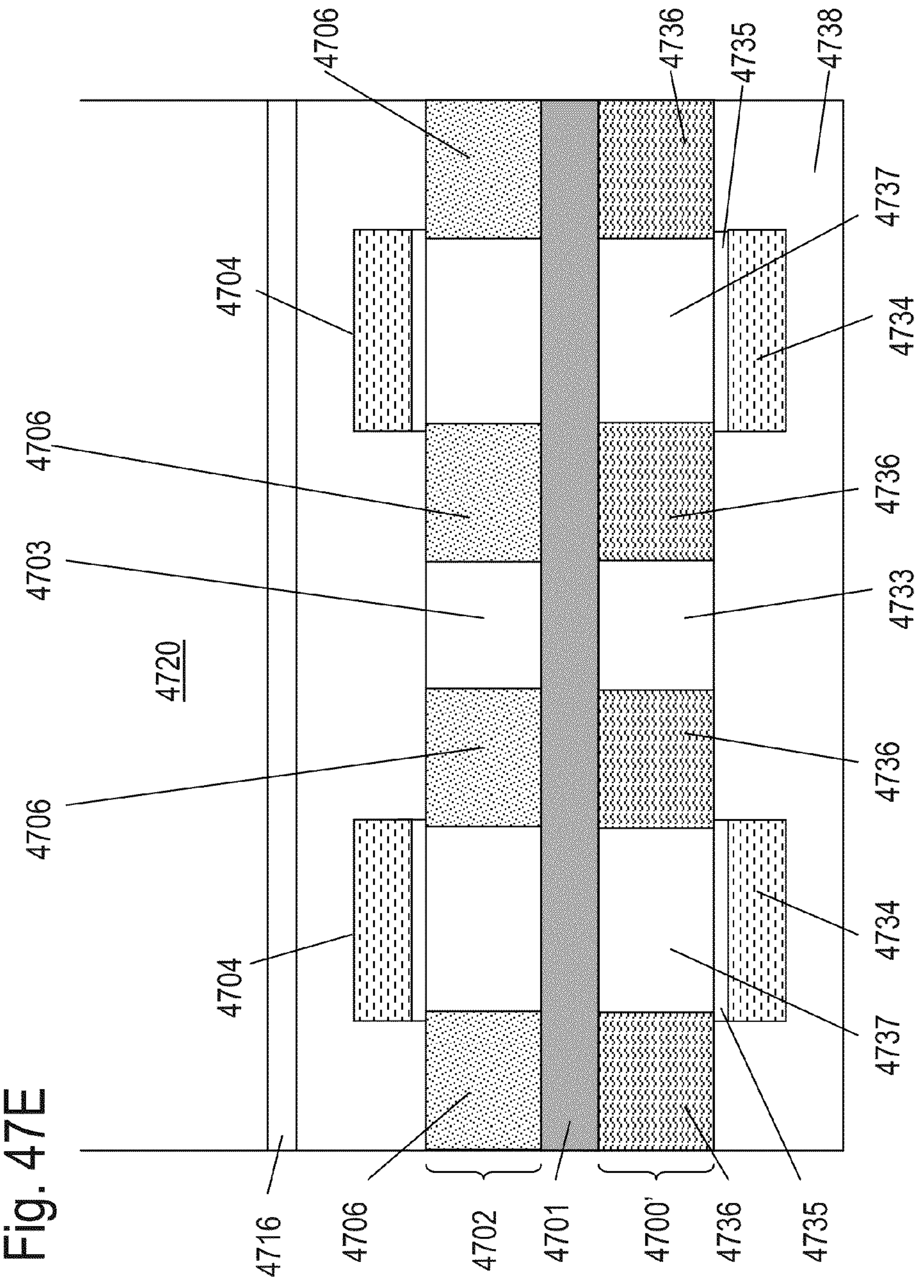
Figure 47F:
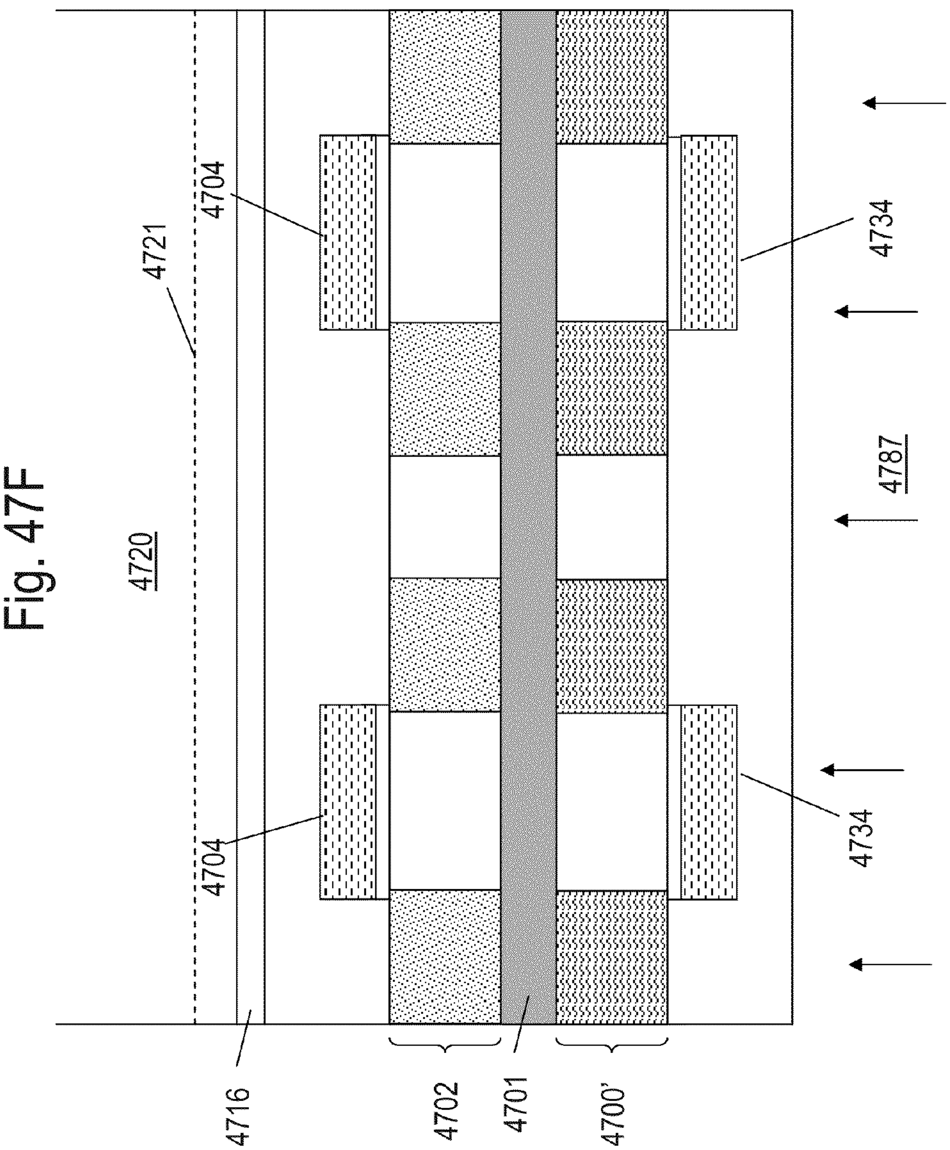
Figure 47G:
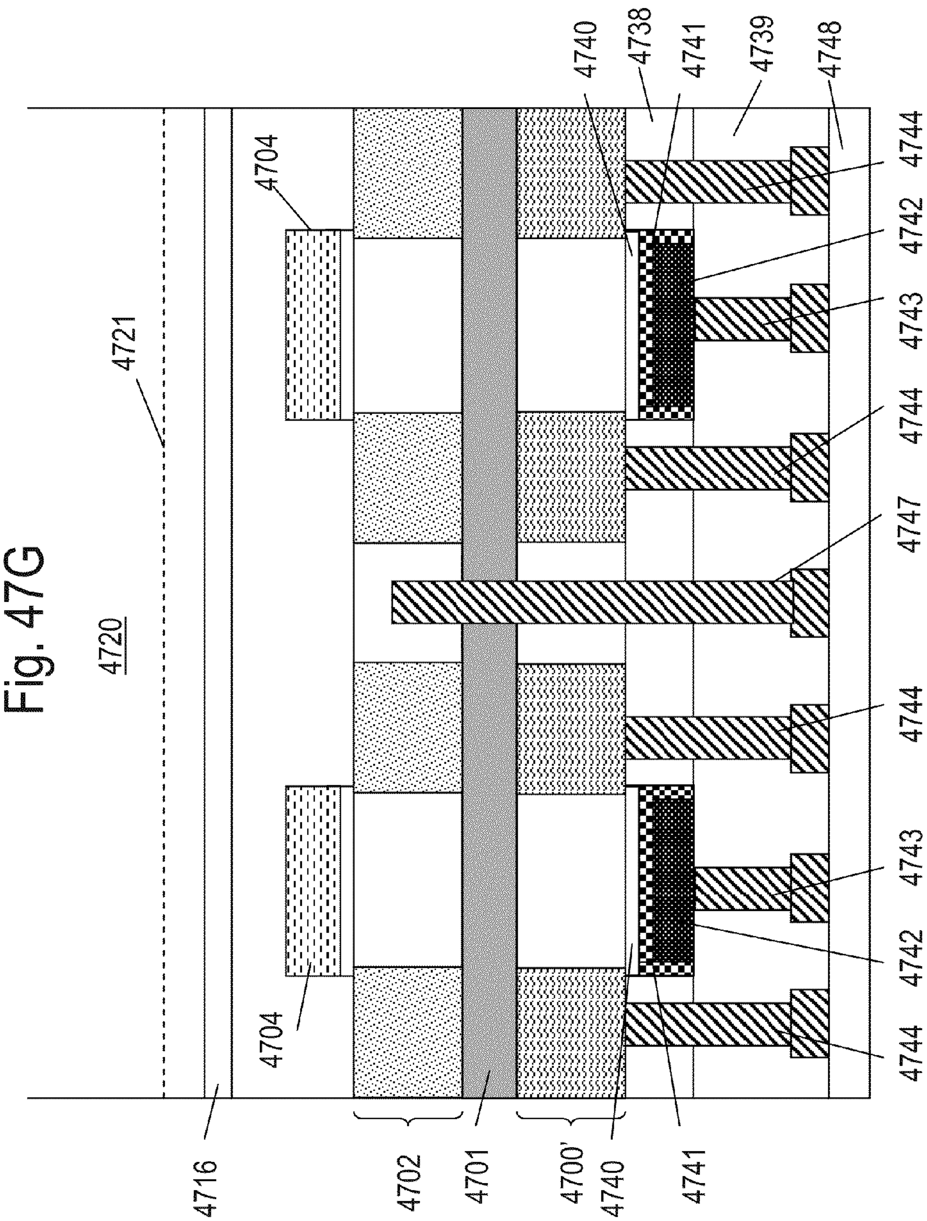

An interesting alternative may be available when using the carrier wafer flow described in FIG. 46A-G. In this flow we can use the two sides of the transferred layer to build NMOS, a ‘p-type transistor’, on one side and PMOS, an ‘n-type transistor’ on the other side. Timing properly the replacement gate step such flow could enable full performance transistors properly aligned to each other. As illustrated in FIG. 47A, an SOI (Silicon On Insulator) donor wafer 4700 may be processed in the normal state of the art high k metal gate gate-last manner with adjusted thermal cycles to compensate for later thermal processing up to the step prior to where CMP exposure of the polysilicon dummy gates 4704 takes place. FIG. 47A illustrates a cross section of the SOI donor wafer 4700, the buried oxide (BOX) 4701, the thin silicon layer 4702 of the SOI wafer, the isolation 4703 between transistors, the polysilicon dummy gates 4704 and gate oxide 4705 of n-type CMOS transistors with dummy gates, their associated source and drains 4706 for NMOS, NMOS channel regions 4707, and the NMOS interlayer dielectric (ILD) 4708. Alternatively, the PMOS device may be constructed at this stage. This completes the first phase of transistor formation. At this step, or alternatively just after a CMP of NMOS ILD 4708 to expose the polysilicon dummy gates 4704 or to planarize the NMOS ILD 4708 and not expose the polysilicon dummy gates 4704, an implant of an atomic species 4710, such as H+, may be done to prepare the cleaving plane 4712 in the bulk of the donor substrate, as illustrated in FIG. 47B. The SOI donor wafer 4700 may be now permanently bonded to a carrier wafer 4720 that has been prepared with an oxide layer 4716 for oxide to oxide bonding to the donor wafer surface 4714 as illustrated in FIG. 47C. The details have been described previously. The SOI donor wafer 4700 may then be cleaved at the cleaving plane 4712 and may be thinned by chemical mechanical polishing (CMP) thus forming donor wafer layer 4700', and surface 4722 may be prepared for transistor formation. The donor wafer layer 4700' at surface 4722 may be processed in the normal state of the art gate last processing to form the PMOS transistors with dummy gates. During processing the wafer may be flipped so that surface 4722 may be on top, but for illustrative purposes this is not shown in the subsequent FIGS. 47E-G. FIG. 47E illustrates the cross section with the buried oxide (BOX) 4701, the now thin silicon donor wafer layer 4700' of the SOI substrate, the isolation 4733 between transistors, the polysilicon dummy gates 4734 and gate oxide 4735 of p-type CMOS dummy gates, their associated source and drains 4736 for PMOS, PMOS channel regions 4737, and the PMOS interlayer dielectric (ILD) 4738. The PMOS transistors may be precisely aligned at state of the art tolerances to the NMOS transistors due to the shared substrate donor wafer layer 4700' possessing the same alignment marks. At this step, or alternatively just after a CMP of PMOS ILD 4738 to expose the PMOS polysilicon dummy gates or to planarize the PMOS ILD 4738 and not expose the dummy gates, the wafer could be put into high temperature cycle to activate both the dopants in the NMOS and the PMOS source drain regions. Then an implant of an atomic species 4787, such as H+, may prepare the cleaving plane 4721 in the bulk of the carrier wafer 4720 for layer transfer suitability, as illustrated in FIG. 47F. The PMOS transistors are now ready for normal state of the art gate-last transistor formation completion. As illustrated in FIG. 47G, the PMOS ILD 4738 may be chemical mechanically polished to expose the top of the polysilicon dummy gates 4734. The polysilicon dummy gates 4734 may then be removed by etch and the PMOS hi-k gate dielectric 4740 and the PMOS specific work function metal gate 4741 may be deposited. An aluminum fill 4742 may be performed on the PMOS gates and the metal CMP’ed. A dielectric layer 4739 may be deposited and the normal gate 4743 and source/drain 4744 contact formation and metallization. The PMOS layer to NMOS layer via 4747 and metallization may be partially formed as illustrated in FIG. 47G and an oxide layer 4748 may be deposited to prepare for bonding.

Figure 47H:
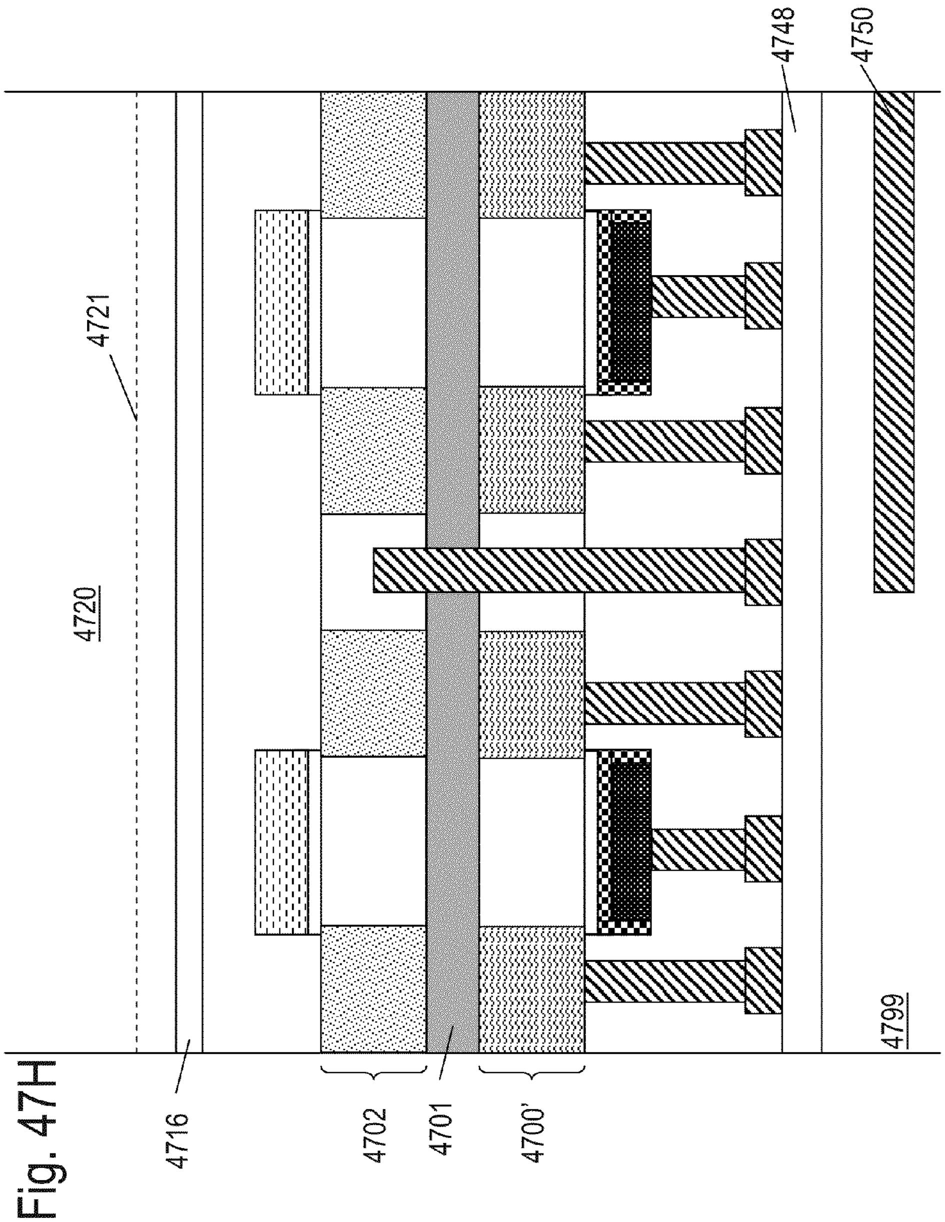
Figure 47I:
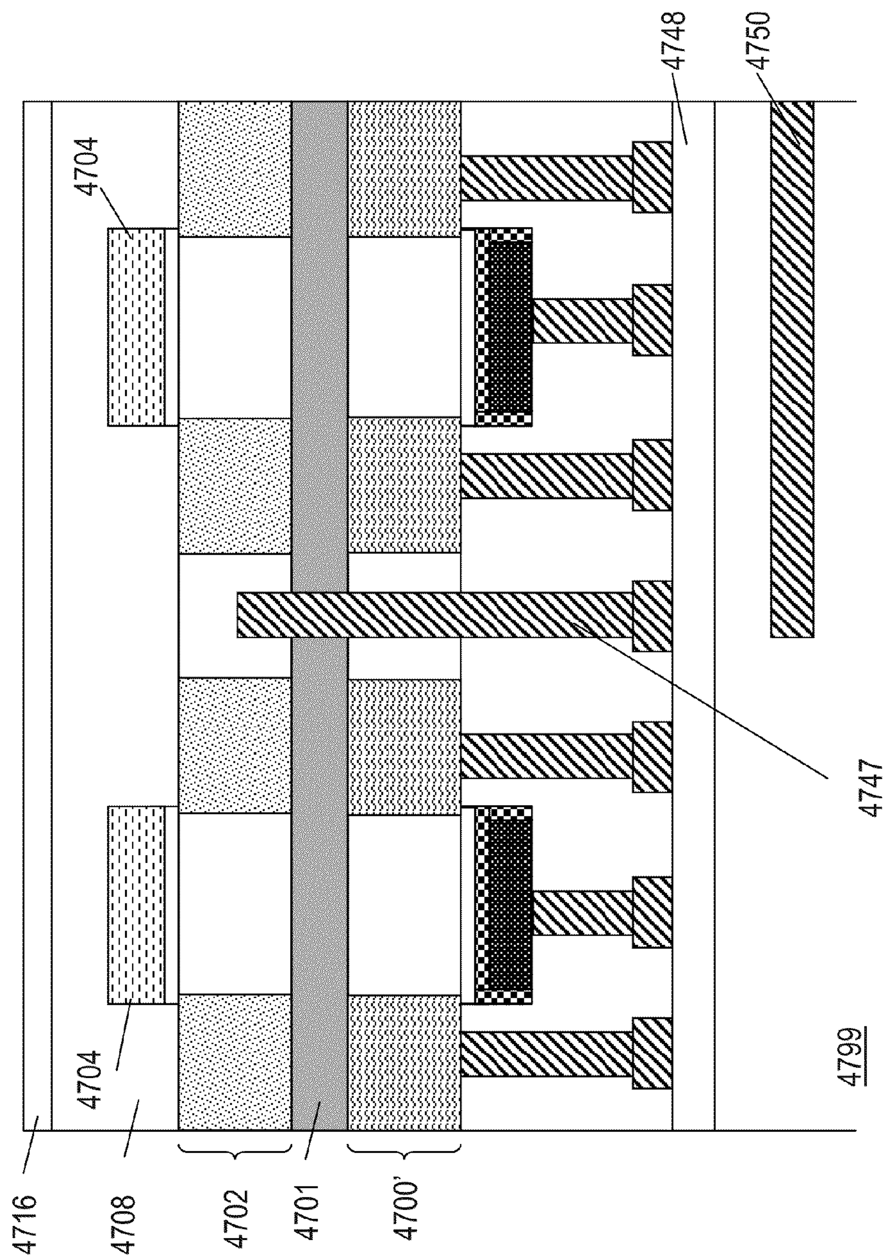
Figure 47J:
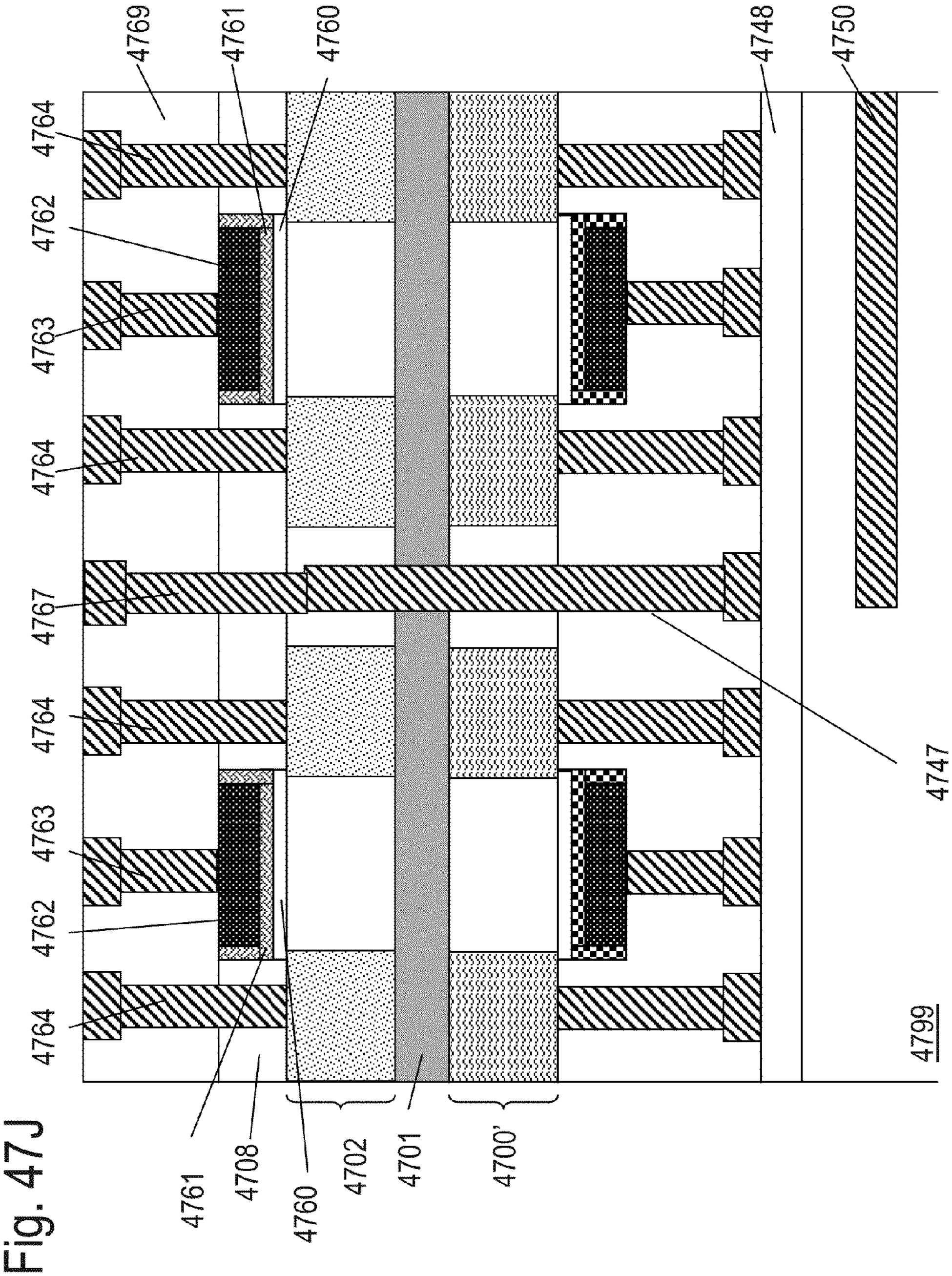
Figure 47K:
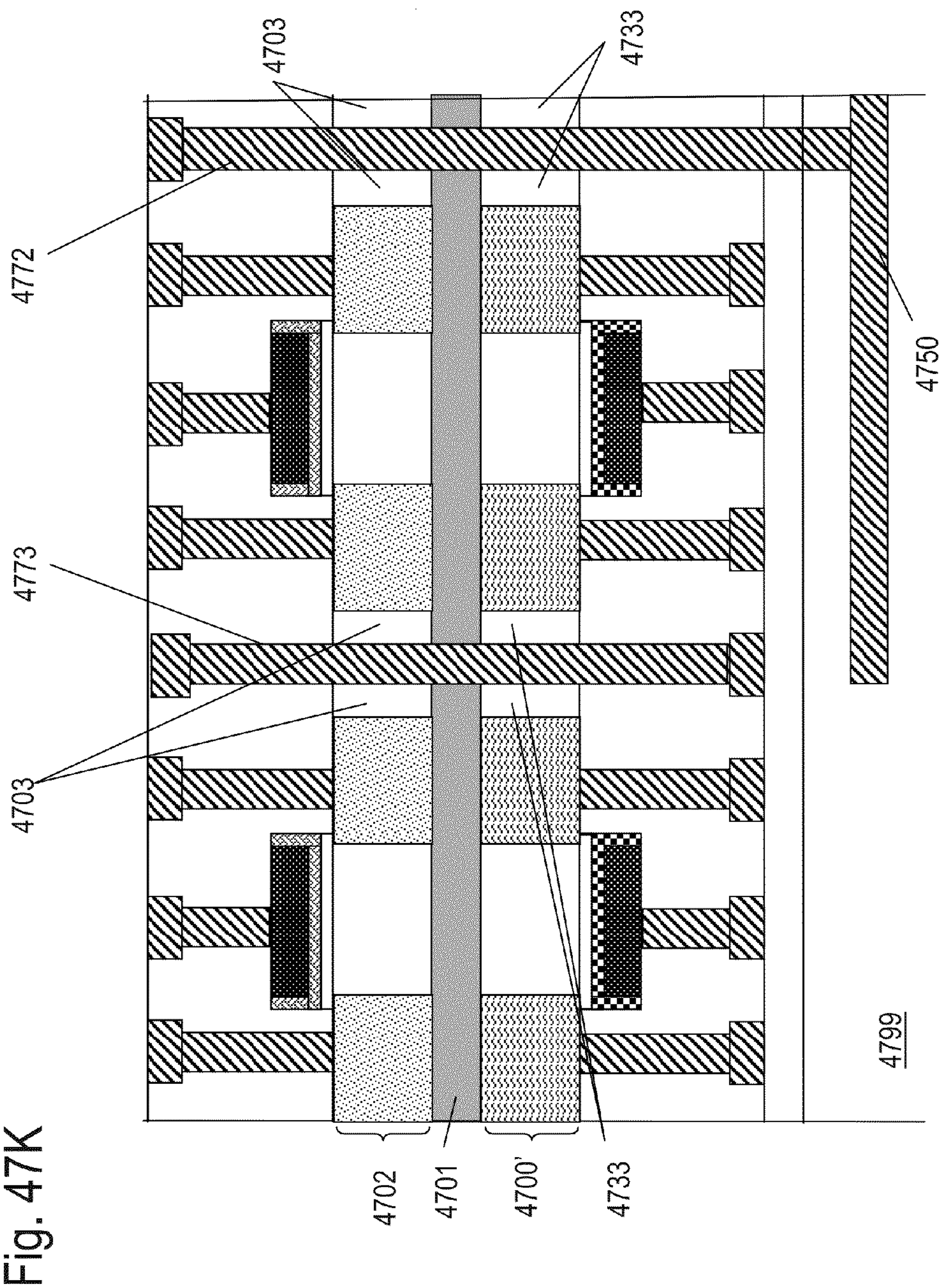

The carrier wafer and two sided n/p layer may be then permanently bonded to bottom wafer having transistors and wires 4799 with associated metal landing strip 4750 as illustrated in FIG. 47H. The wires may be composed of metals, such as, for example, copper or aluminum, and may be utilized to interconnect the transistors of the bottom wafer. The carrier wafer 4720 may then be cleaved at the cleaving plane 4721 and may be thinned by chemical mechanical polishing (CMP) to oxide layer 4716 as illustrated in FIG. 47I. The NMOS transistors are now ready for normal state of the art gate-last transistor formation completion. As illustrated in FIG. 47J, the oxide layer 4716 and the NMOS ILD 4708 may be chemical mechanically polished to expose the top of the NMOS polysilicon dummy gates 4704. The NMOS polysilicon dummy gates 4704 may then be removed by etch and the NMOS hi-k gate dielectric 4760 and the NMOS specific work function metal gate 4761 may be deposited. An aluminum fill 4762 may be performed on the NMOS gates and the metal CMP'ed. A dielectric layer 4769 may be deposited and the normal gate 4763 and source/drain 4764 contact formation and metallization. The NMOS layer to PMOS layer via 4767 to connect to 4747 and metallization may be formed. As illustrated in FIG. 47K, the layer-to-layer contacts 4772 to the landing pads in the base wafer are now made. This same contact etch could be used to make the connections 4773 between the NMOS and PMOS layer as well, instead of using the two step (4747 and 4767) method in FIG. 47H.

Figure 48:
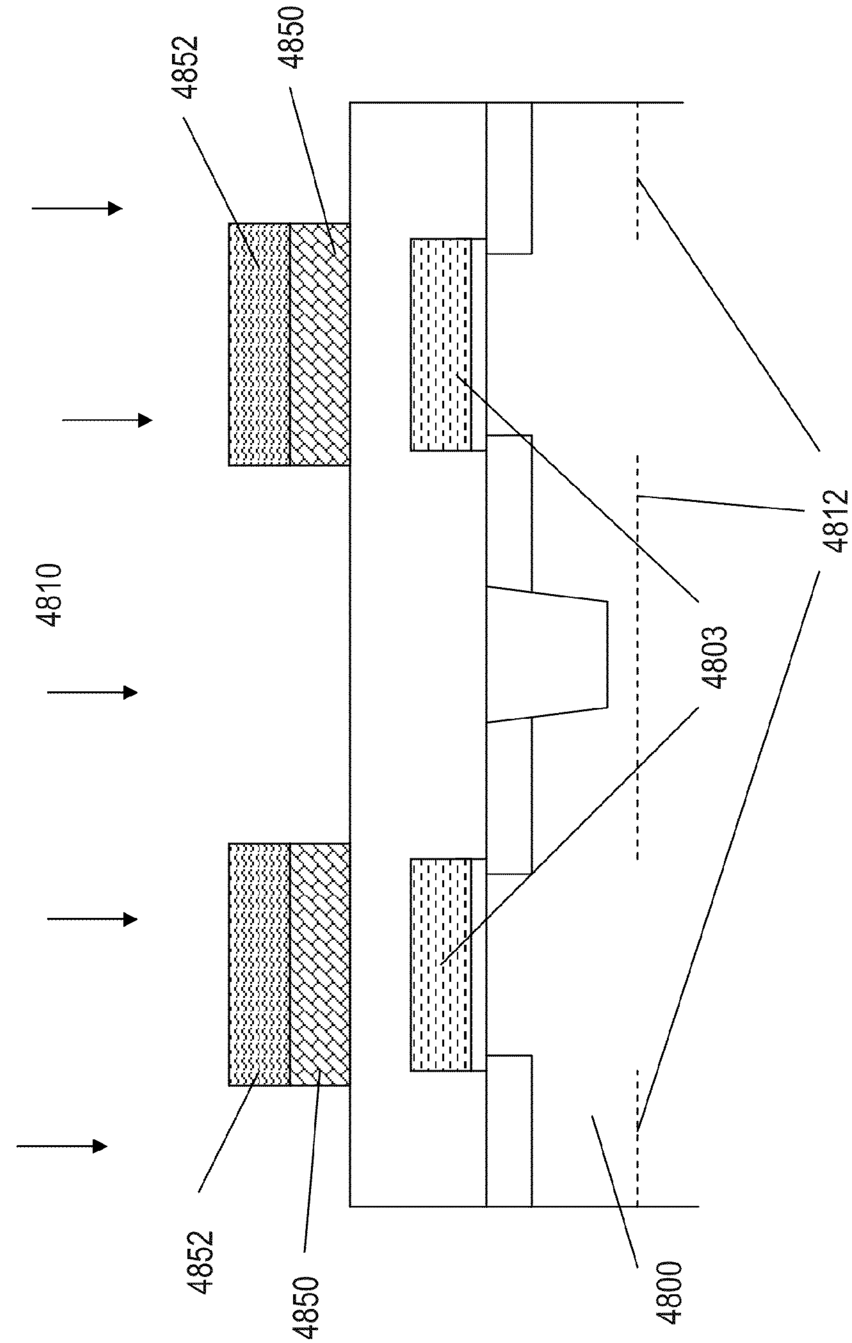
FIG. 48 illustrates using a shield for blocking Hydrogen implants from gate areas.

Another alternative is illustrated in FIG. 48 whereby the implant of an atomic species 4810, such as H+, may be screened from the sensitive gate areas 4803 by first masking and etching a shield implant stopping layer of a dense material 4850, for example 5,000 angstroms of Tantalum, and may be combined with 5,000 angstroms of photoresist 4852. This may create a segmented cleave plane 4812 in the bulk of the donor wafer silicon wafer 4800 and may lead to additional polishing to provide a smooth bonding surface for layer transfer suitability.

Figure 49:
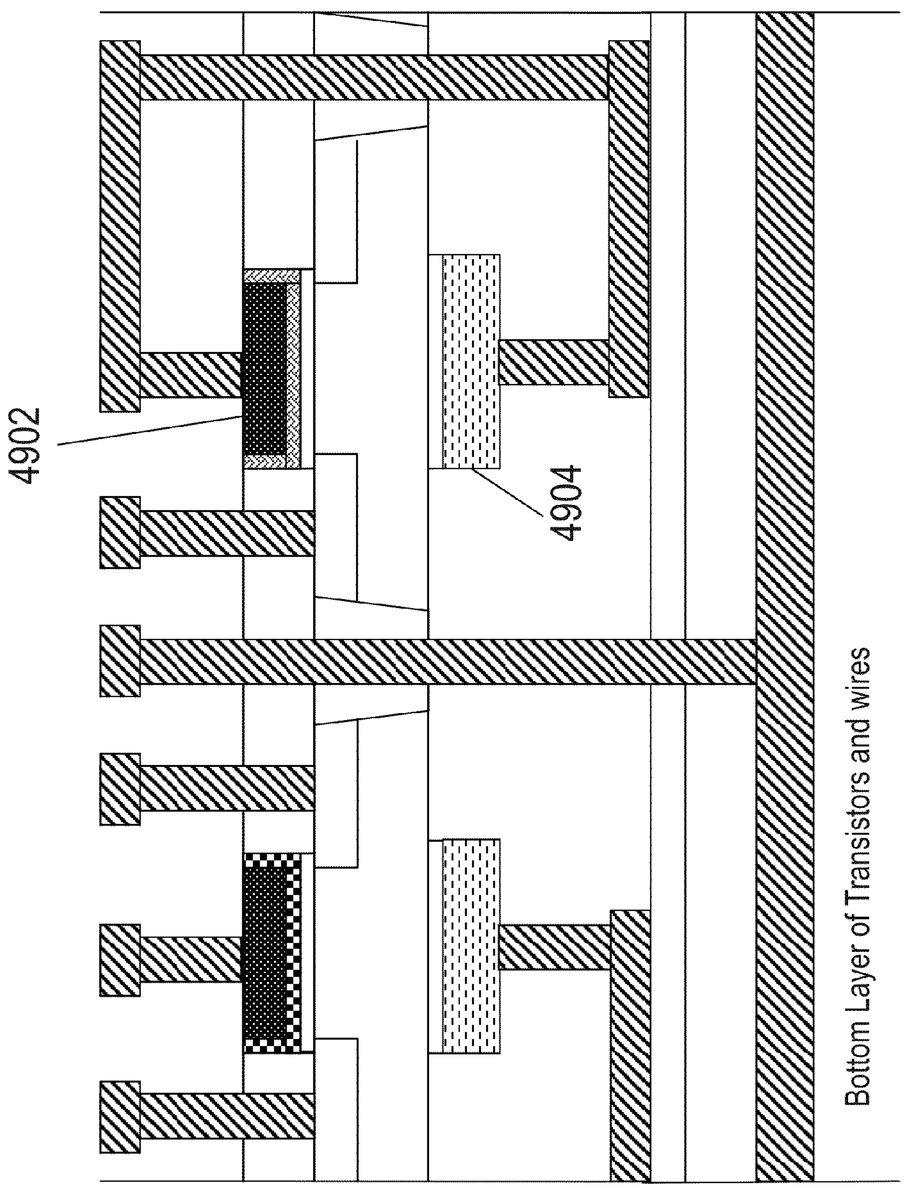
FIG. 49 illustrates constructing transistors with front gates and back gates on either side of the semiconductor layer.

Using procedures similar to FIG. 47A-K, it may be possible to construct structures such as FIG. 49 where a transistor may be constructed with front gate 4902 and back gate 4904. The back gate could be utilized for many purposes such as threshold voltage control, reduction of variability, increase of drive current and other purposes.

Various approaches described in Section 2 could be utilized for constructing a 3D stacked gate-array with a repeating layout, where the repeating component in the layout may be a look-up table (LUT) implementation. For example, a 4 input look-up table could be utilized. This look-up table could be customized with a SRAM-based solution. Alternatively, a via-based solution could be used. Alternatively, a non-volatile memory based solution could be used. The approaches described in Section 1 could alternatively be utilized for constructing the 3D stacked gate array, where the repeating component may be a look-up table implementation.

Figure 64:
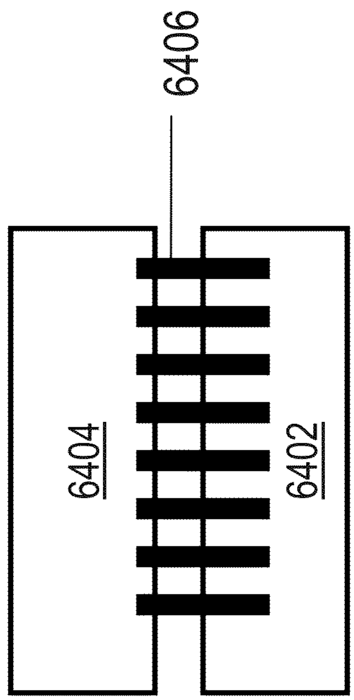
FIG. 64 illustrates 3D stacked peripheral transistors constructed above a memory layer.

FIG. 64 describes an embodiment of this invention, wherein a memory array 6402 may be constructed on a piece of silicon and peripheral transistors 6404 are stacked atop the memory array 6402. The peripheral transistors 6404 may be constructed well-aligned with the underlying memory array 6402 using any of the schemes described in Section 1 and Section 2. For example, the peripheral transistors may be junction-less transistors, recessed channel transistors or they could be formed with one of the repeating layout schemes described in Section 2. Through-silicon connections 6406 could connect the memory array 6402 to the peripheral transistors 6404. The memory array may consist of DRAM memory, SRAM memory, flash memory, some type of resistive memory or in general, could be any memory type that may be commercially available.

Section 3: Monolithic 3D DRAM.

While Section 1 and Section 2 describe applications of monolithic 3D integration to logic circuits and chips, this Section describes novel monolithic 3D Dynamic Random Access Memories (DRAMs). Some embodiments of this invention may involve floating body DRAM. Background information on floating body DRAM and its operation is given in "Floating Body RAM Technology and its Scalability to 32 nm Node and Beyond," *Electron Devices Meeting,* 2006. *IEDM '06. International*, vol., no., pp. 1-4, 11-13 Dec. 2006 by T. Shino, N. Kusunoki, T. Higashi, et al., Overview and future challenges of floating body RAM (FBRAM) technology for 32 nm technology node and beyond, Solid-State Electronics, Volume 53, Issue 7, Papers Selected from the 38th European Solid-State Device Research Conference—ESSDERC'08, July 2009, Pages 676-683, ISSN 0038-1101, DOI: 10.1016/j.sse.2009.03.010 by Takeshi Hamamoto, Takashi Ohsawa, et al., "*New Generation of Z-RAM,*" *Electron Devices Meeting,* 2007. *IEDM* 2007. *IEEE International*, vol., no., pp. 925-928, 10-12 Dec. 2007 by Okhonin, S.; Nagoga, M.; Carman, E, et al. The above publications are incorporated herein by reference.

Figure 28:
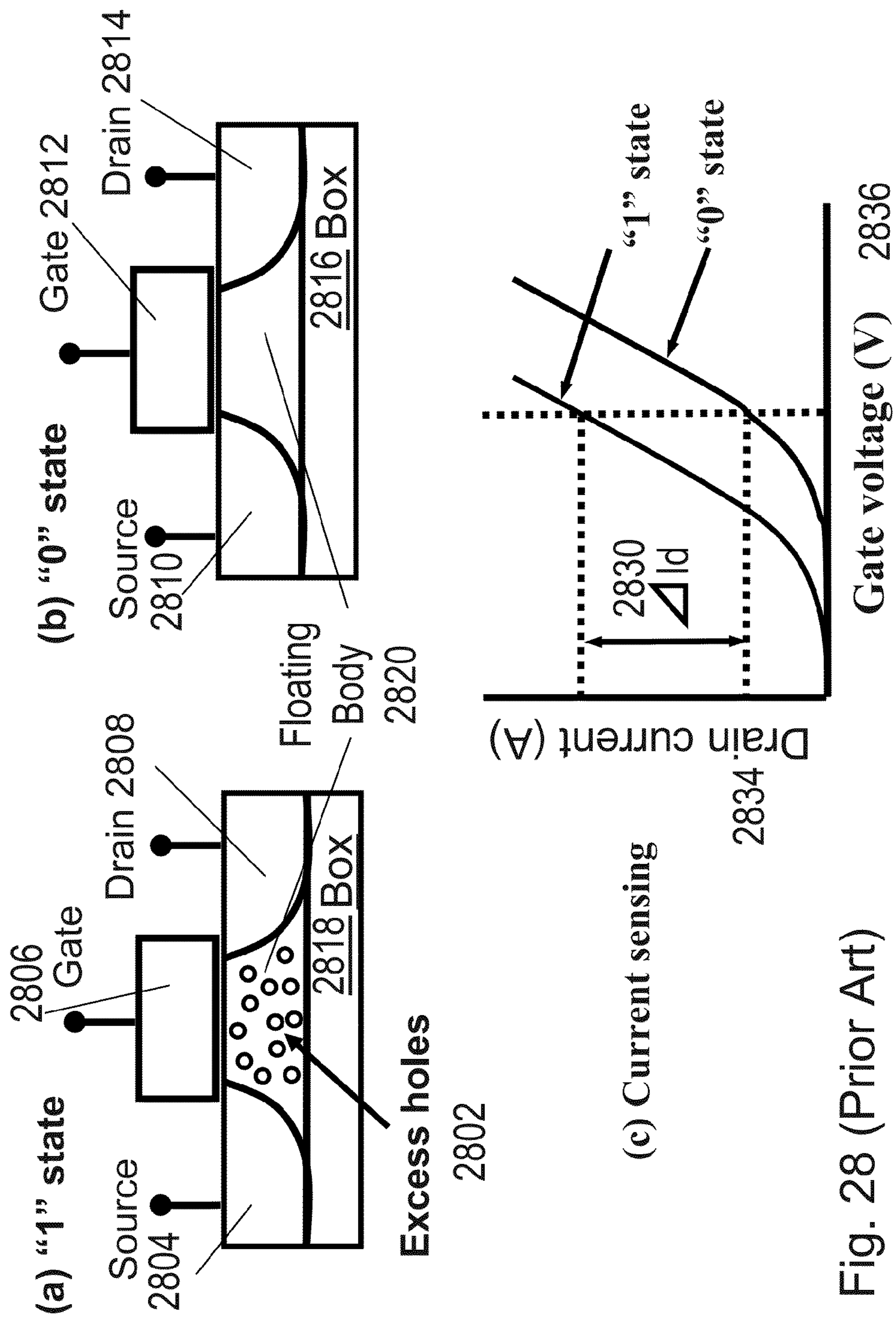
FIG. 28 show floating body DRAM as described in prior art.

As illustrated in FIG. 28 the fundamentals of operating, of a prior art, floating body DRAM are described. For storing a '1' bit, excess holes 2802 may exist in the floating body 2820 and change the threshold voltage of the memory cell transistor including source 2804, gate 2806, drain 2808, floating body 2820, and buried oxide (BOX) 2818, as shown in FIG. 28(*a*). The '0' bit corresponds to no charge being stored in the floating body 2820, 9720 and affects the threshold voltage of the memory cell transistor including source 2810, gate 2812, drain 2814, floating body 2820, and buried oxide (BOX) 2816, as shown in FIG. 28(*b*). The difference in threshold voltage between FIG. 28(*a*) and FIG. 28(*b*) may give rise to a change in drain current 2834 of the transistor at a particular gate voltage 2836, as described in FIG. 28(*c*). This current differential 2830 can be sensed by a sense amplifier circuit to differentiate between '0' and '1' states, and thus may function as a memory bit.

FIG. 29A-H describe a process flow to construct a horizontally-oriented monolithic 3D DRAM. Two masks are utilized on a "per-memory-layer" basis for the monolithic 3D DRAM concept shown in FIG. 29A-H, while other masks are shared between all constructed memory layers. The process flow may include several steps in the following sequence.

Figure 29B:
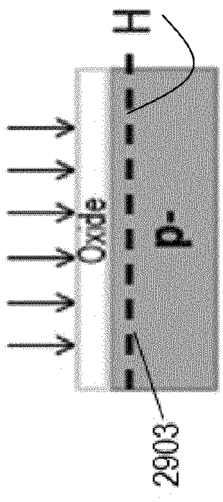
FIG. 29A-H show a two-mask per layer 3D floating body DRAM.
Figure 29D:
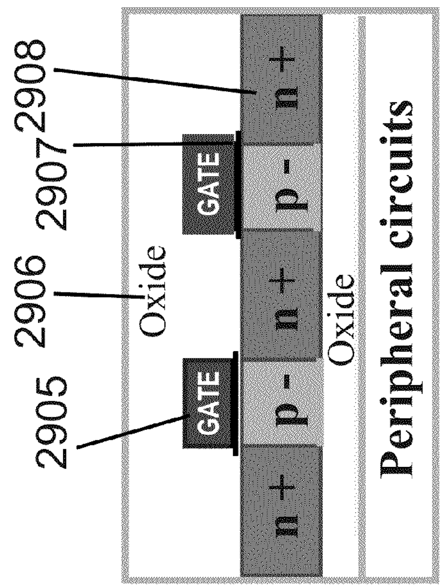
Figure 29A:
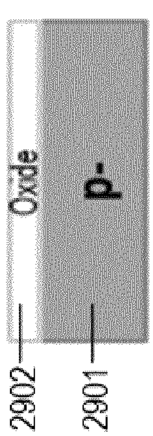

Step (A): A p− Silicon wafer 2901 may be taken and an oxide layer 2902 may be grown or deposited above it. FIG. 29A illustrates the structure after Step (A). A doped and activated layer may be formed in or on p− silicon wafer 2901 by processes such as, for example, implant and RTA or furnace activation, or epitaxial deposition and activation.

Step (B): Hydrogen may be implanted into the p− silicon wafer 2901 at a certain depth denoted by 2903. FIG. 29B illustrates the structure after Step (B).

Figure 29C:
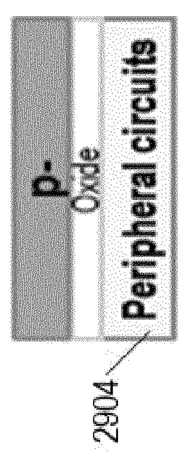

Step (C): The wafer after Step (B) may be flipped and bonded onto a wafer having peripheral circuits 2904 covered with oxide. This bonding process occurs using oxide-to-oxide bonding. The stack may be then cleaved at the hydrogen implant plane 2903 using either an anneal or a sideways mechanical force. A chemical mechanical polish (CMP) process may be then conducted. Note that peripheral circuits 2904 are such that they can withstand an additional rapid-thermal-anneal (RTA) and still remain operational, and preferably retain good performance. For this purpose, the peripheral circuits 2904 may be such that they have not had their RTA for activating dopants or they have had a weak RTA for activating dopants. Also, peripheral circuits 2904 utilize a refractory metal such as tungsten that can withstand temperatures greater than approximately 400° C. FIG. 29C illustrates the structure after Step (C).

Step (D): The transferred layer of p− silicon after Step (C) may be then processed to form isolation regions using a STI process. Following, gate regions 2905 and gate dielectric 2907 may be deposited and patterned, following which source-drain regions 2908 may be implanted using a self-aligned process. An inter-level dielectric (ILD) constructed of oxide (silicon dioxide) 2906 may be then constructed. Note that no RTA may be done to activate dopants in this layer of partially-depleted SOI (PD-SOI) transistors. Alternatively, transistors could be of fully-depleted SOI type. FIG. 29D illustrates the structure after Step (D).

Figure 29F:
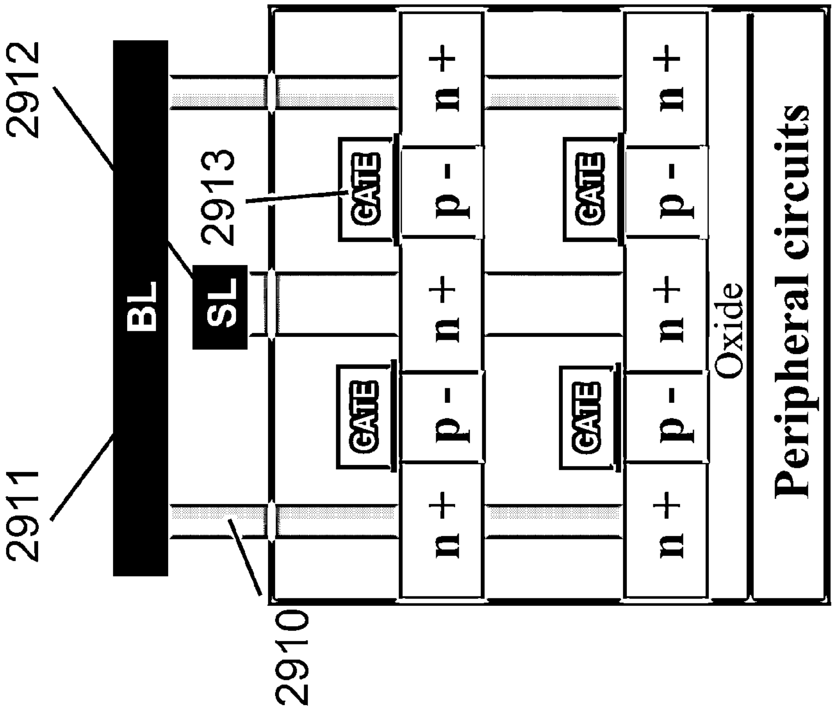
Figure 29E:
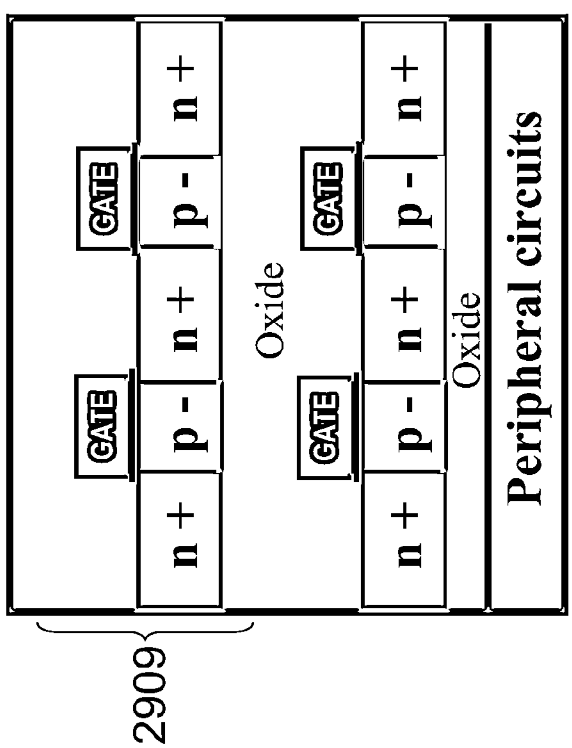

Step (E): Using steps similar to Step (A)-Step (D), another layer of memory 2909 may be constructed. After all the desired memory layers are constructed, a RTA may be conducted to activate dopants in all layers of memory (and potentially also the periphery). FIG. 29E illustrates the structure after Step (E).

Step (F): Contact plugs 2910 are made to source and drain regions of different layers of memory. Bit-line (BL) wiring 2911 and Source-line (SL) wiring 2912 are connected to contact plugs 2910. Gate regions 2913 of memory layers are connected together to form word-line (WL) wiring. FIG. 29F illustrates the structure after Step (F).

Figure 29G:
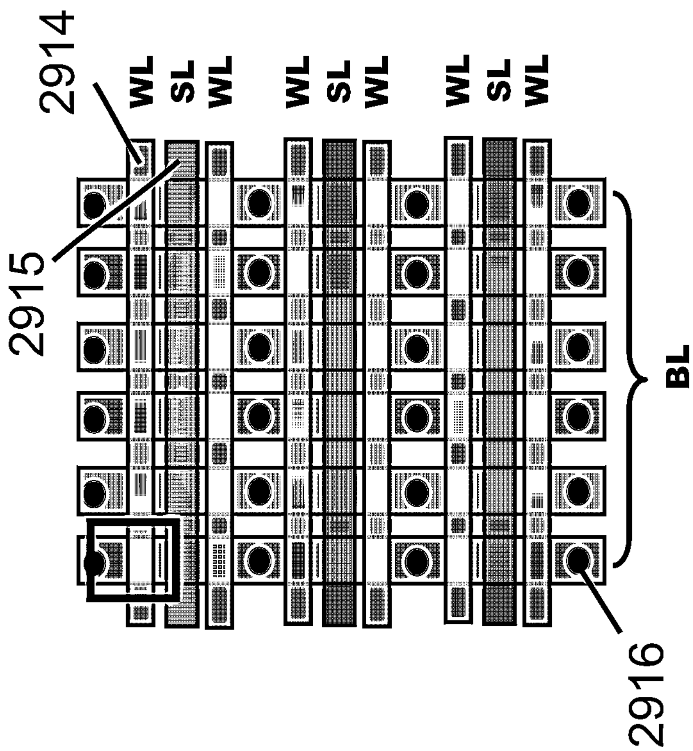
Figure 29H:
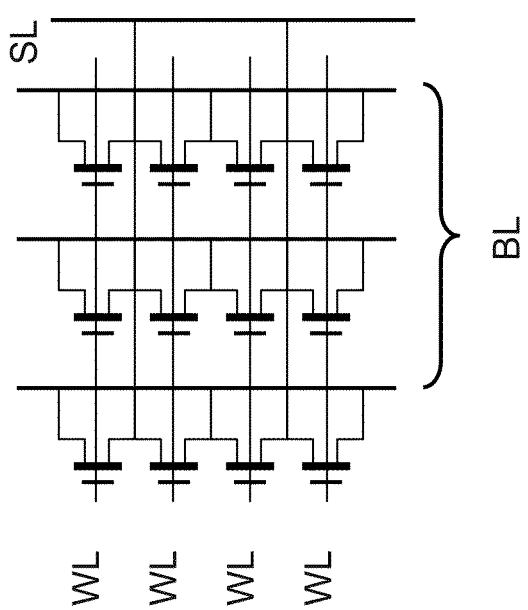

FIG. 29G and FIG. 29H describe array organization of the floating body DRAM. BLs 2916 may be in a direction substantially perpendicular to the directions of SLs 2915 and WLs 2914.

FIG. 30A-M describe an alternative process flow to construct a horizontally-oriented monolithic 3D DRAM. This monolithic 3D DRAM utilizes the floating body effect and double-gate transistors. One mask may be utilized on a "per-memory-layer" basis for the monolithic 3D DRAM concept shown in FIG. 30A-M, while other masks are shared between different layers. The process flow may include several steps that occur in the following sequence.

Figure 30A:
FIG. 30A-M show a one-mask per layer 3D floating body DRAM.

Step (A): Peripheral circuits 3002 with tungsten wiring are first constructed and above this oxide layer 3004 may be deposited. FIG. 30A illustrates the structure after Step (A).

Figure 30B:
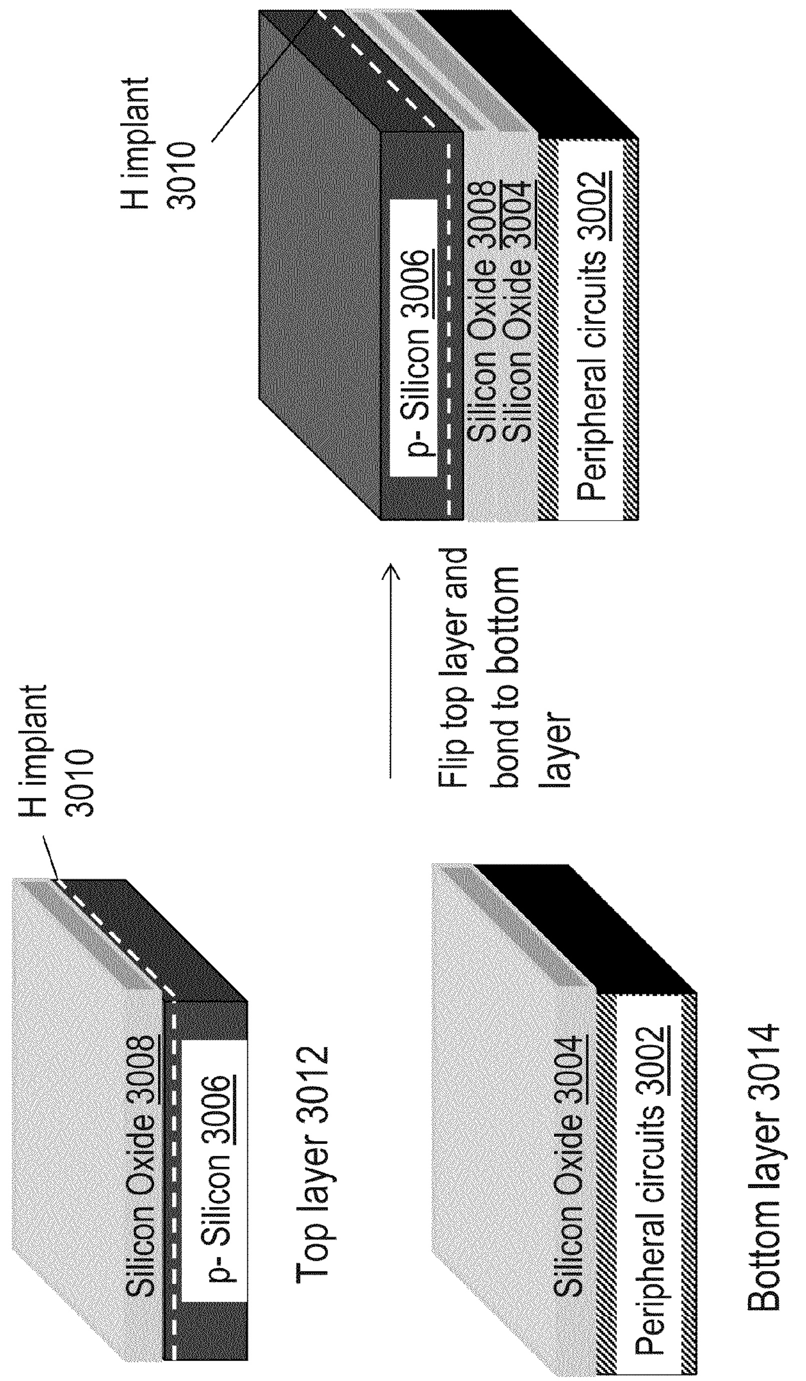

Step (B): FIG. 30B shows a drawing illustration after Step (B). A p− Silicon wafer 3006 has an oxide layer 3008 grown or deposited above it. A doped and activated layer may be formed in or on p− silicon wafer 3006 by processes such as, for example, implant and RTA or furnace activation, or epitaxial deposition and activation. Following this, hydrogen may be implanted into the p− Silicon wafer at a certain depth indicated by 3010. Alternatively, some other atomic species such as Helium could be (co-)implanted. This hydrogen implanted p− Silicon wafer 3006 forms the top layer 3012. The bottom layer 3014 may include the peripheral circuits 3002 with oxide layer 3004. The top layer 3012 may be flipped and bonded to the bottom layer 3014 using oxide-to-oxide bonding.

Figure 30C:
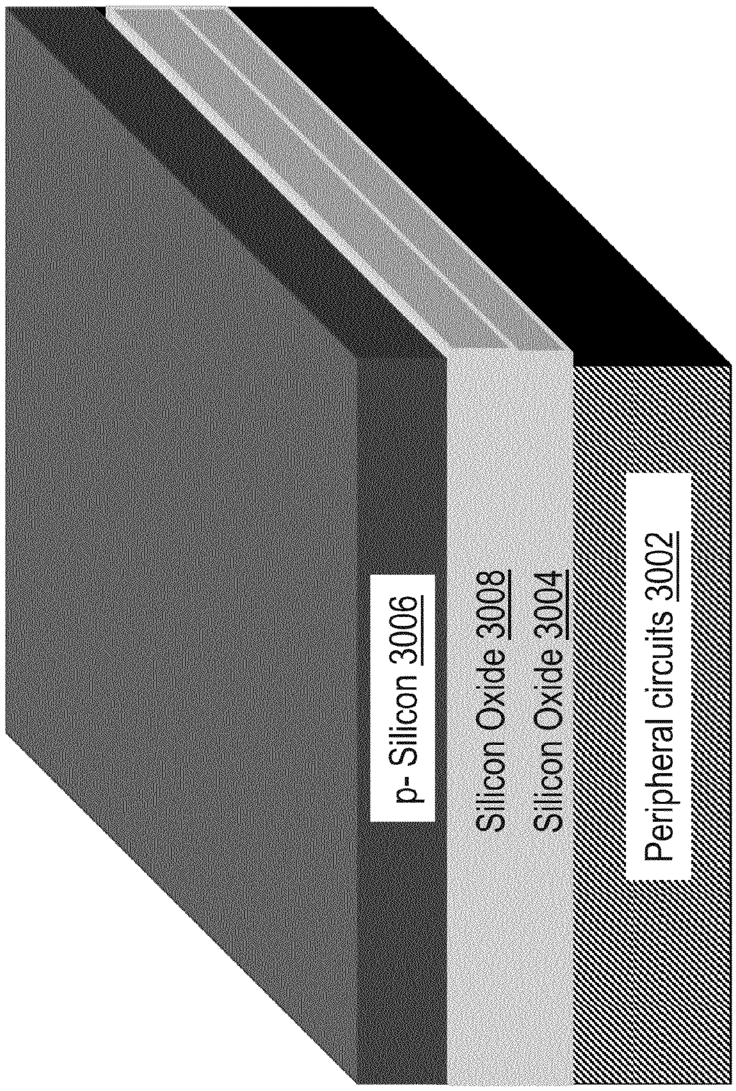

Step (C): FIG. 30C illustrates the structure after Step (C). The stack of top and bottom wafers after Step (B) may be cleaved at the hydrogen plane 3010 using either an anneal or a sideways mechanical force or other means. A CMP process may be then conducted. At the end of this step, a single-crystal p− Si layer exists atop the peripheral circuits, and this has been achieved using layer transfer techniques.

Figure 30D:
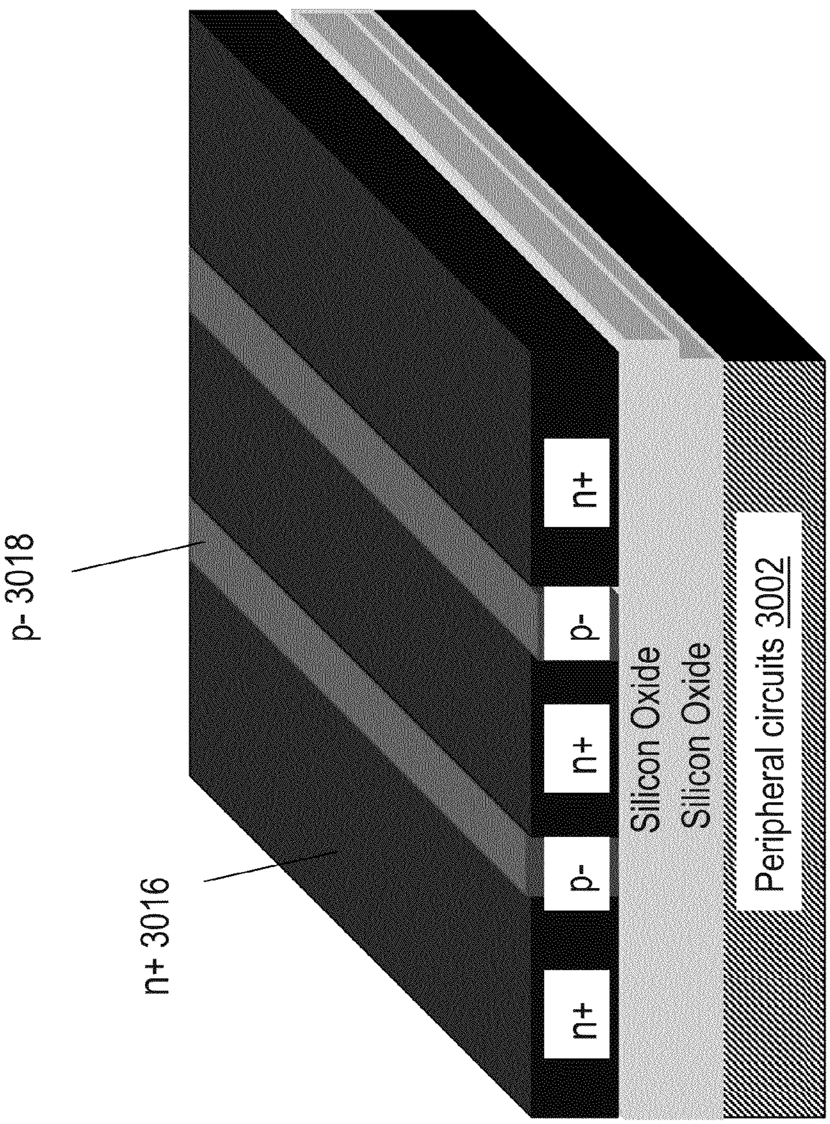

Step (D): FIG. 30D illustrates the structure after Step (D). Using lithography and then implantation, n+ regions 3016 and p− regions 3018 are formed on the transferred layer of p− Si after Step (C).

Figure 30E:
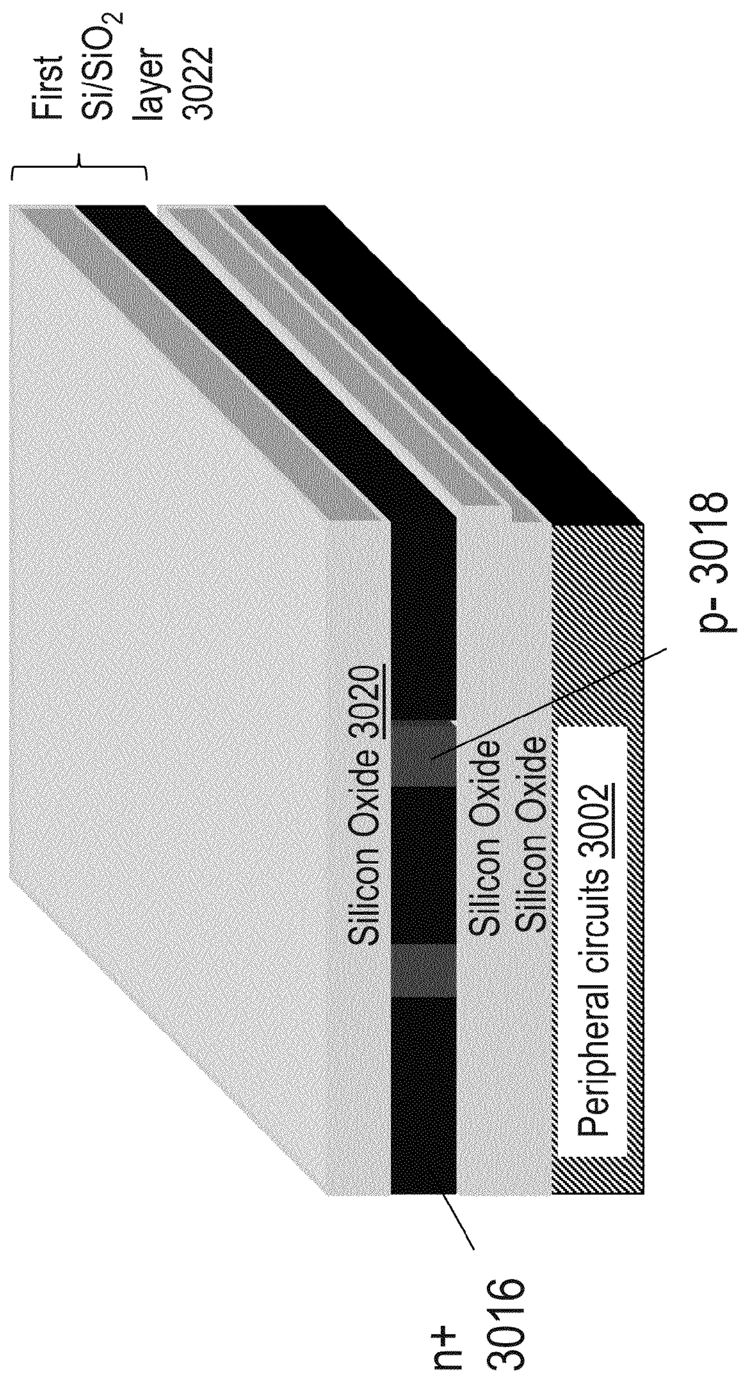

Step (E): FIG. 30E illustrates the structure after Step (E). An oxide layer 3020 may be deposited atop the structure obtained after Step (D). A first layer of $Si/SiO_2$ 3022 may be therefore formed atop the peripheral circuits 3002.

Figure 30F:
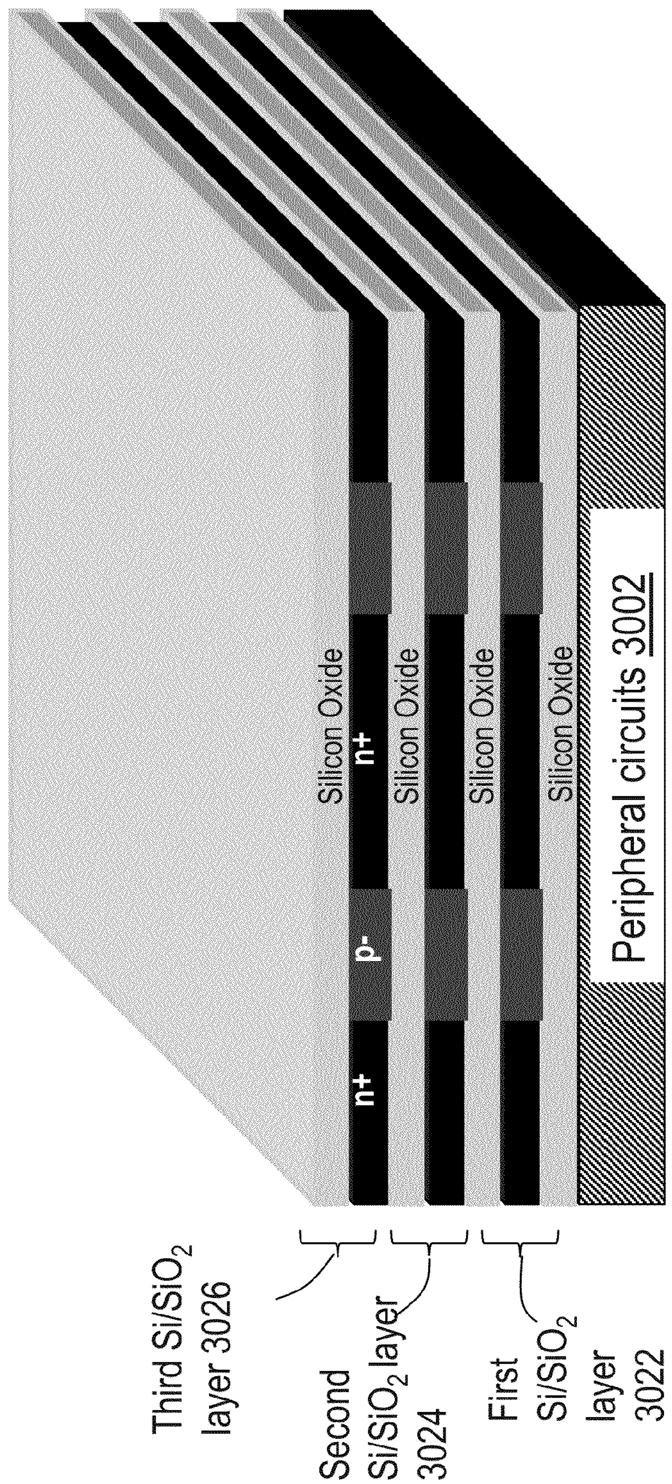

Step (F): FIG. 30F illustrates the structure after Step (F). Using procedures similar to Steps (B)-(E), additional $Si/SiO_2$ layers 3024 and 3026 are formed atop $Si/SiO_2$ layer 3022. A rapid thermal anneal (RTA) or spike anneal or flash anneal or laser anneal may be then done to activate all implanted layers 3022, 3024 and 3026 (and possibly also the peripheral circuits 3002). Alternatively, the layers 3022, 3024 and 3026 are annealed layer-by-layer as soon as their implantations are done using a laser anneal system.

Figure 30G:
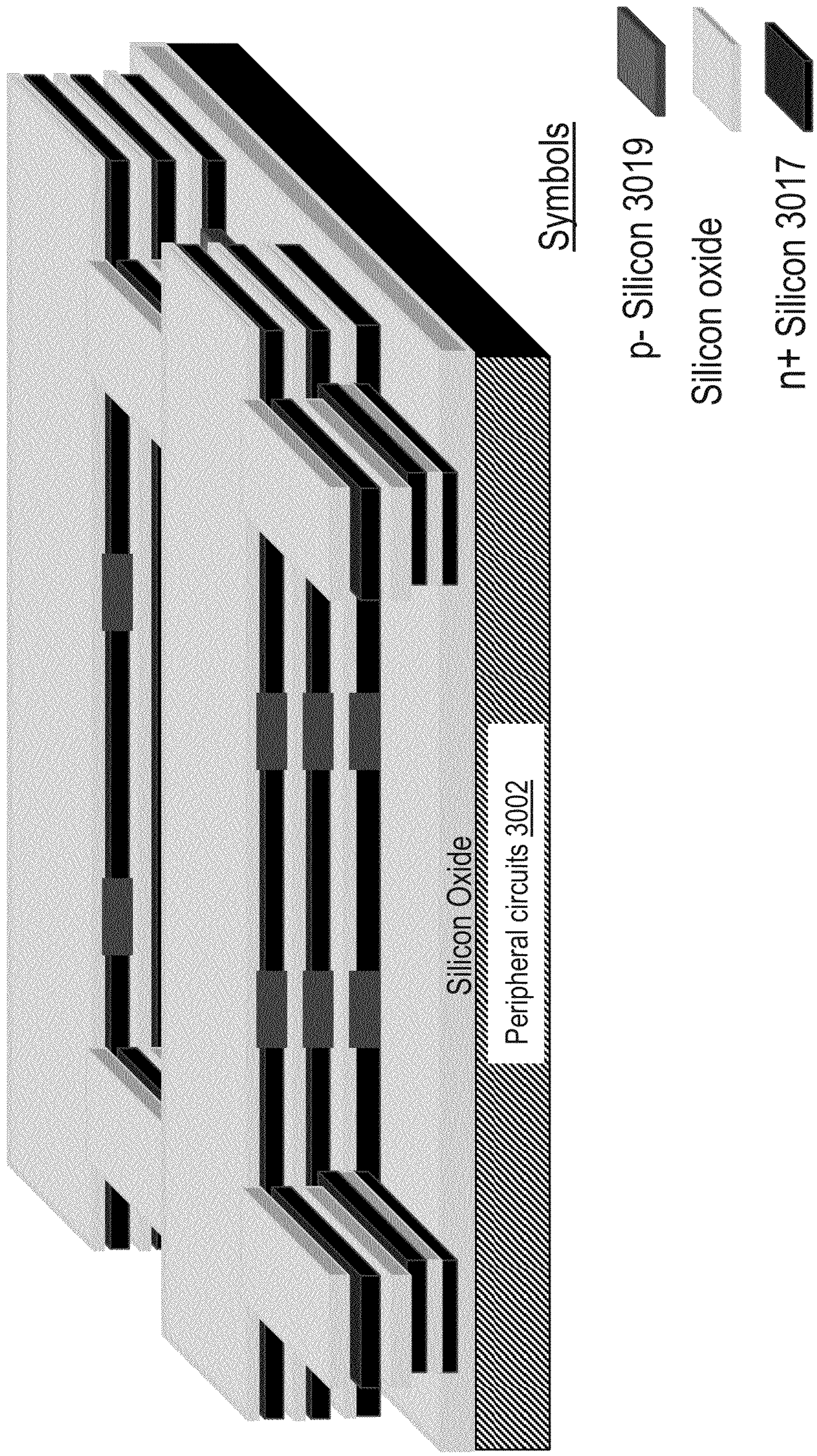

Step (G): FIG. 30G illustrates the structure after Step (G). Lithography and etch processes may be then utilized to make a structure as shown in the figure, including p− silicon regions 3019 and n+ silicon regions 3017.

Figure 30H:
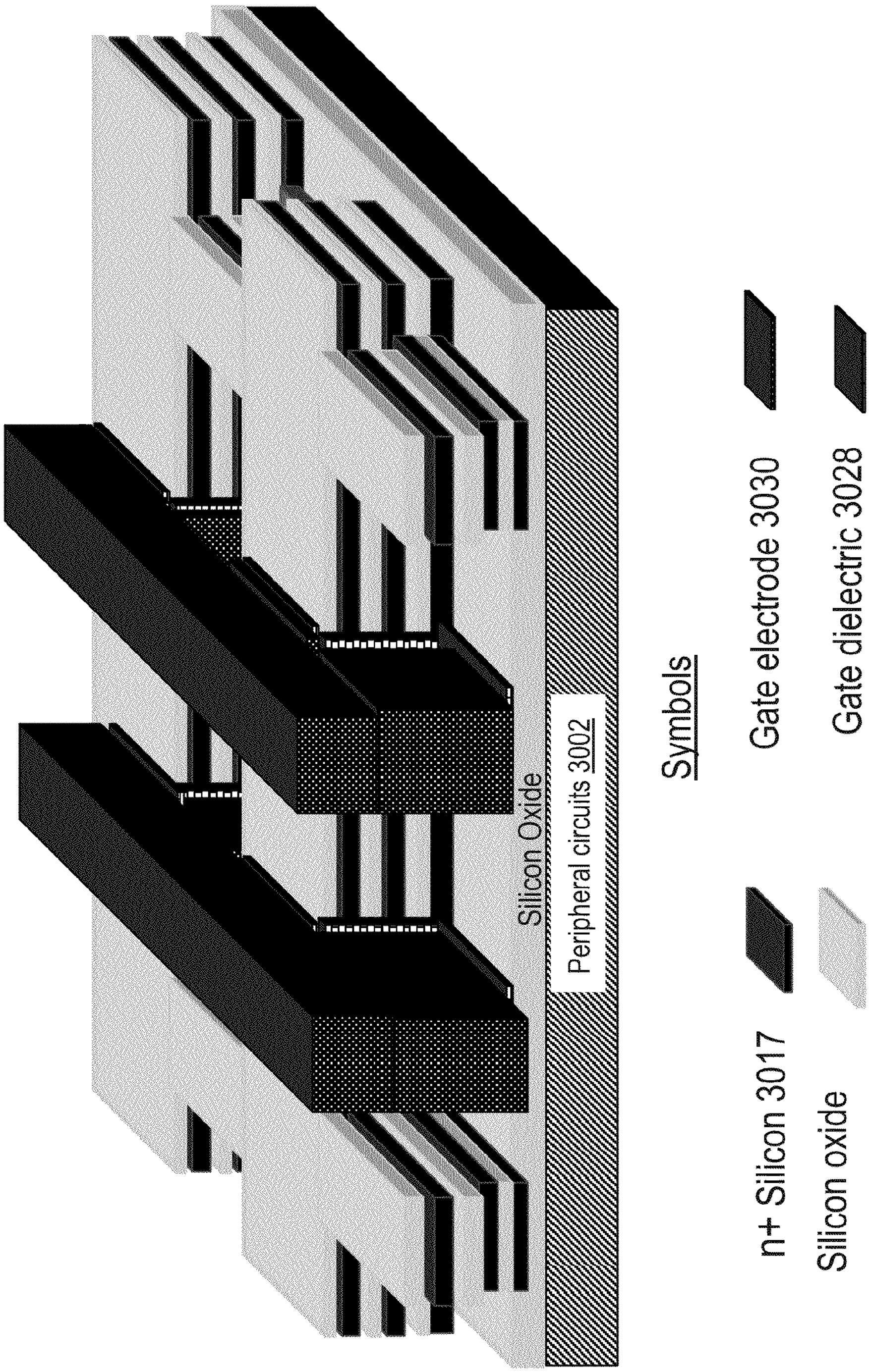

Step (H): FIG. 30H illustrates the structure after Step (H). Gate dielectric 3028 and gate electrode 3030 are then deposited following which a CMP may be done to planarize the gate electrode 3030 regions. Lithography and etch are utilized to define gate regions over the p− silicon regions (eg. p− Si region after Step (D)). Note that gate width could be slightly larger than p− region width to compensate for overlay errors in lithography.

Figure 30I:
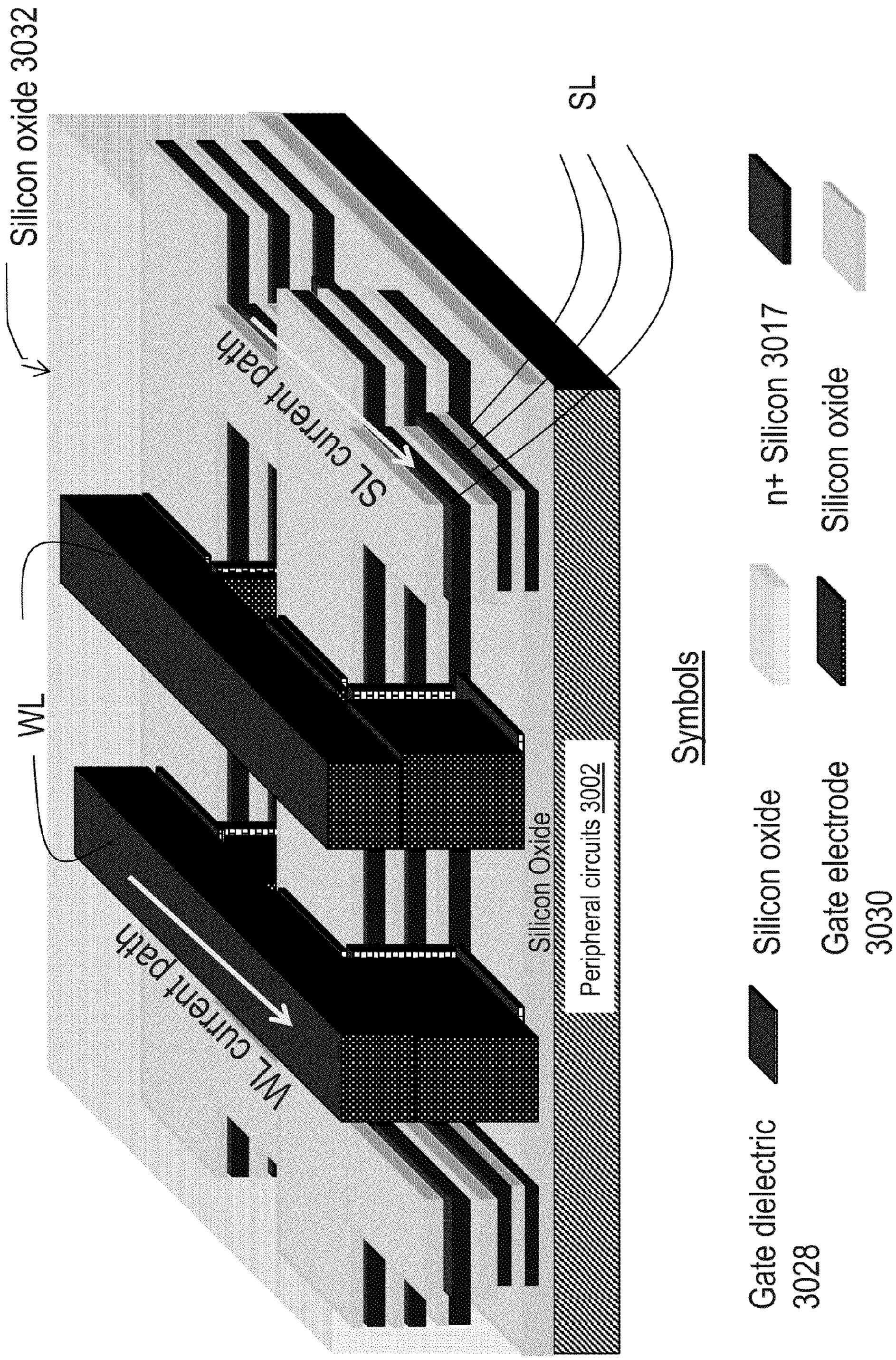

Step (I): FIG. 30I illustrates the structure after Step (I).A silicon oxide layer 3032 may be then deposited and planarized. For clarity, the silicon oxide layer may be shown transparent in the figure, along with word-line (WL) and source-line (SL) regions.

Figure 30J:
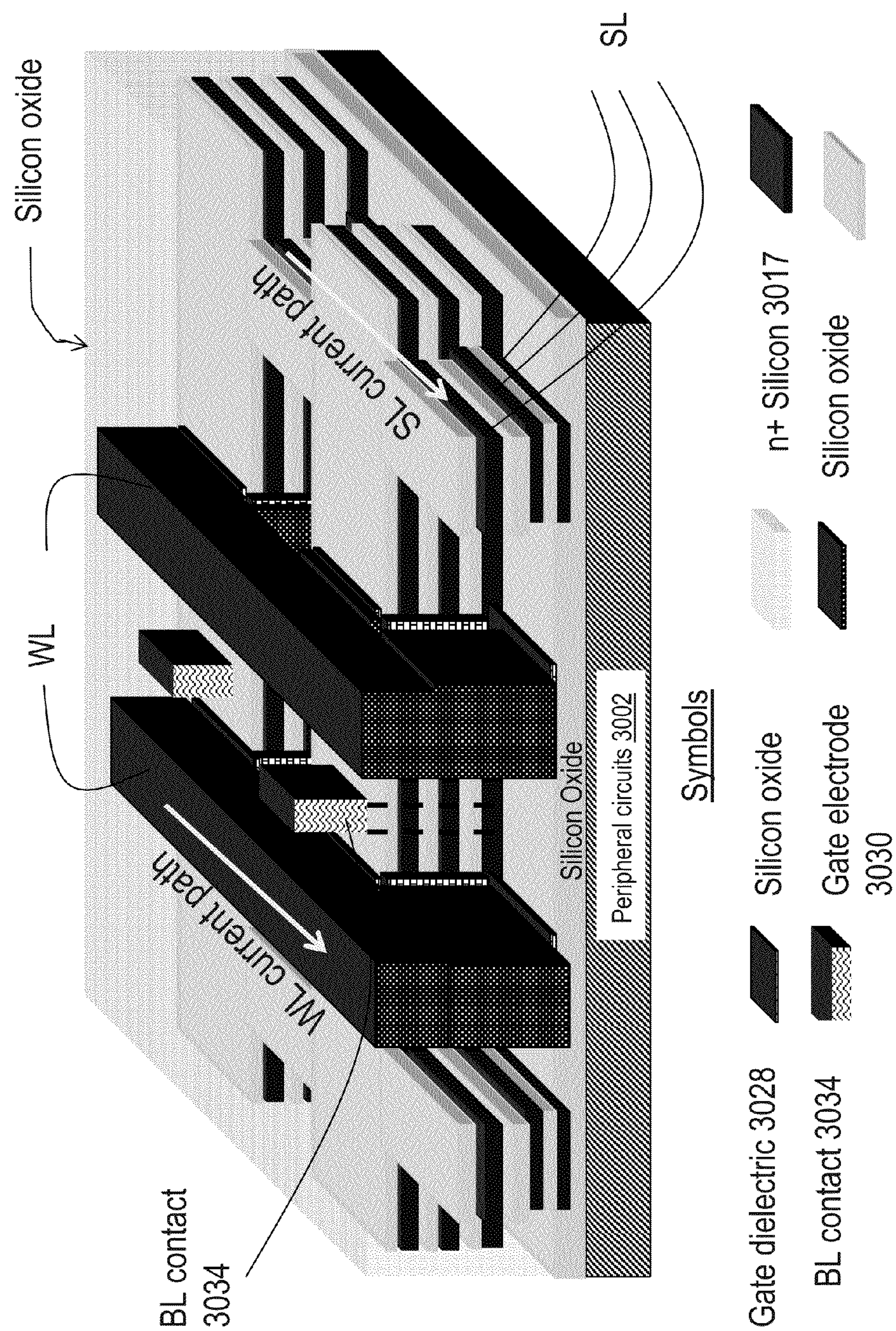

Step (J): FIG. 30J illustrates the structure after Step (J). Bit-line (BL) contacts 3034 are formed by etching and deposition. These BL contacts are shared among all layers of memory.

Figure 30K:
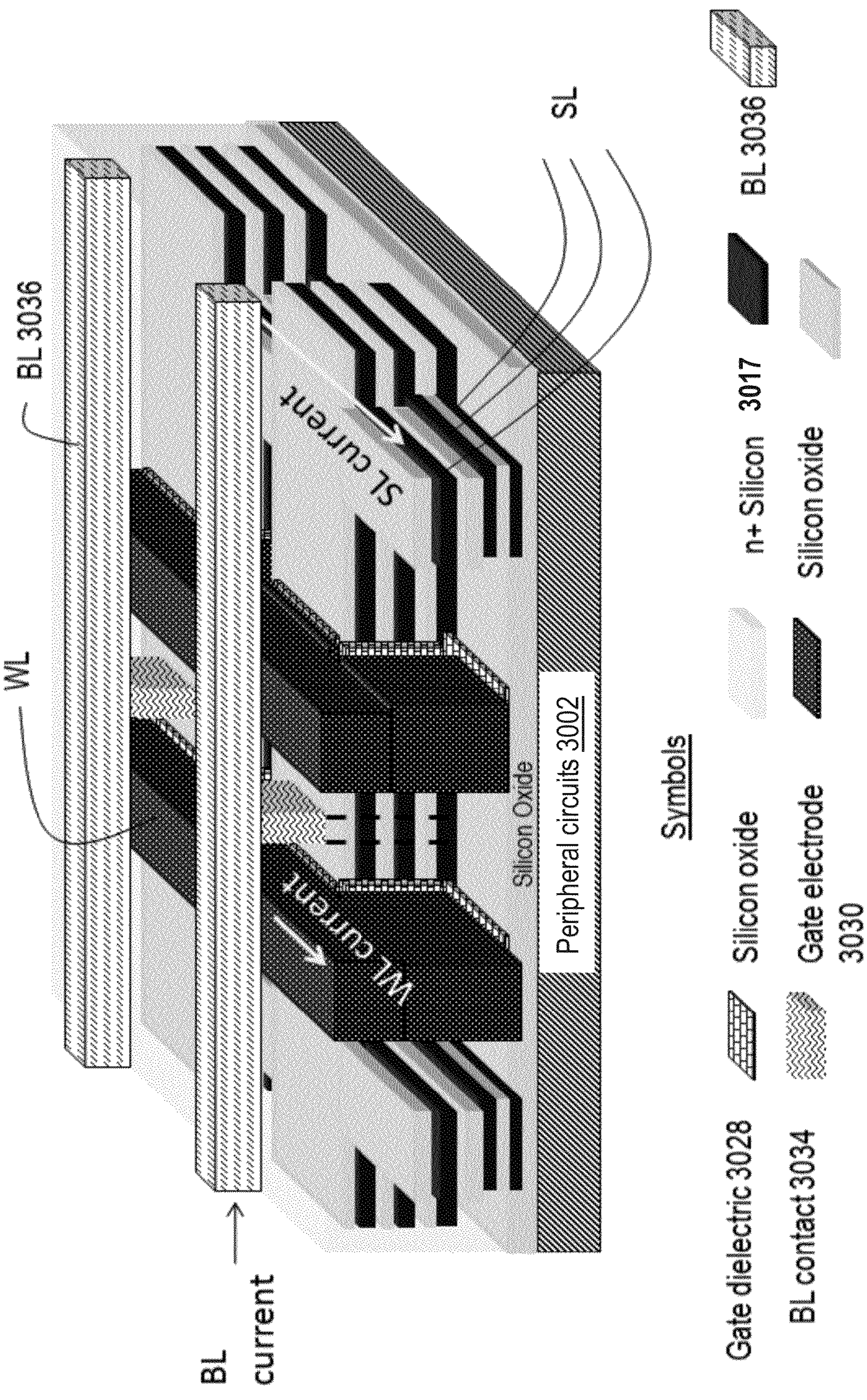

Step (K): FIG. 30K illustrates the structure after Step (K). BLs 3036 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (K) as well.

Figure 30L:
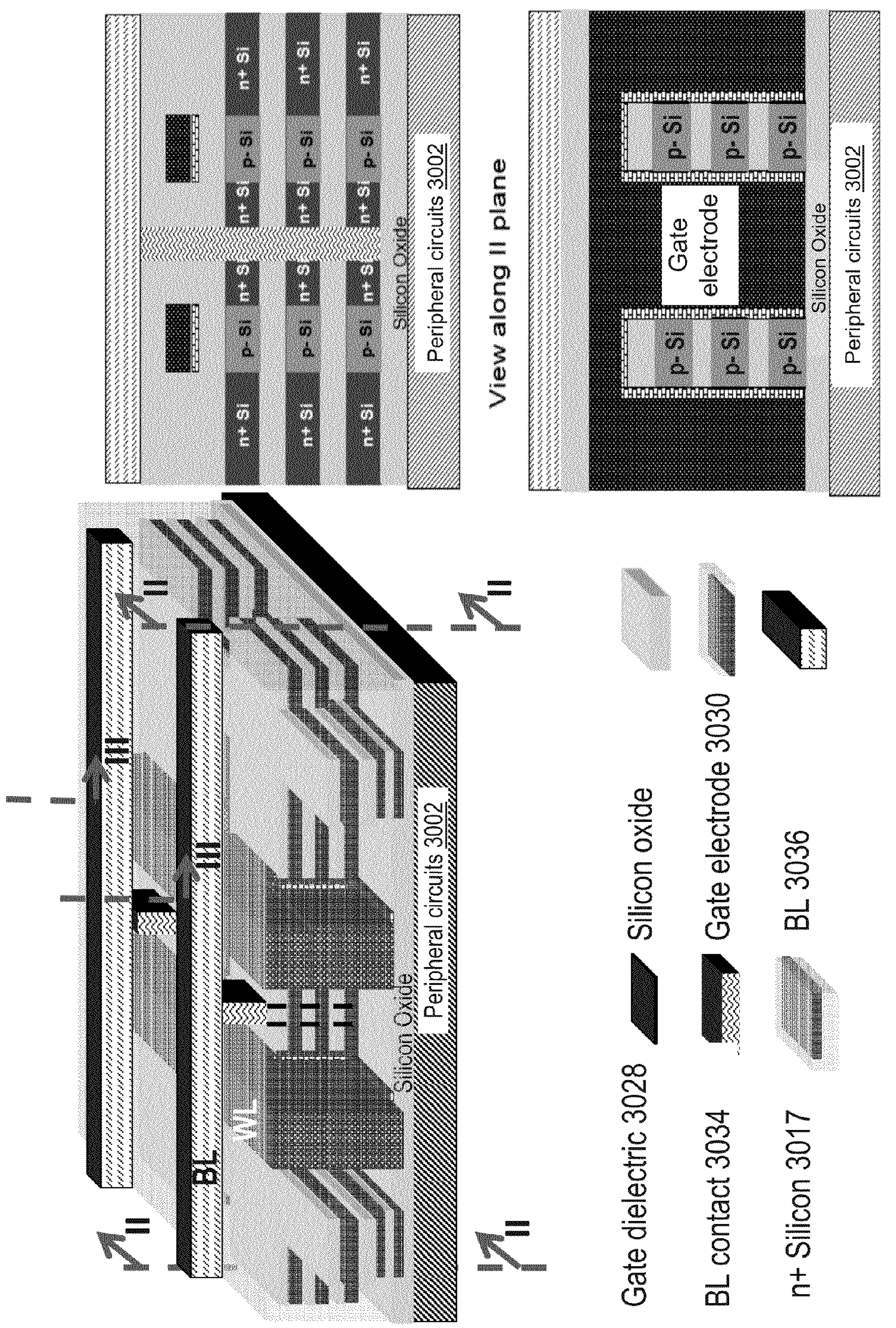

FIG. 30L shows cross-sectional views of the array for clarity. The double-gated transistors in FIG. 30L can be utilized along with the floating body effect for storing information.

Figure 30M:
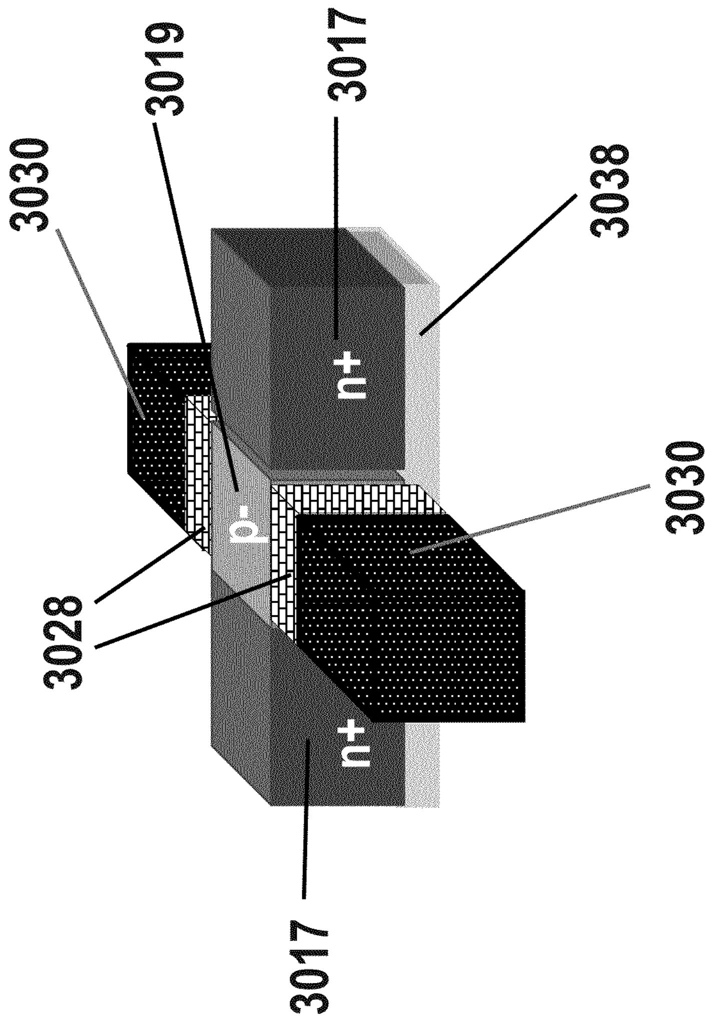

FIG. 30M shows a memory cell of the floating body RAM array with two gates, including gate electrodes 3030 and gate dielectrics 3028, on either side of the p− Si region 3019. The double gated floating body RAM memory cell may also include n+ regions 3017 and may be atop oxide layer/region 3038.

A floating body DRAM has thus been constructed, with (1) horizontally-oriented transistors—i.e., current flowing in substantially the horizontal direction in transistor channels, (2) some of the memory cell control lines, e.g., source-lines SL, constructed of heavily doped silicon and embedded in the memory cell layer, (3) side gates simultaneously deposited over multiple memory layers, and (4) mono-crystalline (or single-crystal) silicon layers obtained by layer transfer techniques such as ion-cut.

FIG. 31A-K describe an alternative process flow to construct a horizontally-oriented monolithic 3D DRAM. This monolithic 3D DRAM utilizes the floating body effect and double-gate transistors. No mask may be utilized on a "per-memory-layer" basis for the monolithic 3D DRAM concept shown in FIG. 31A-K, and all other masks are shared between different layers. The process flow may include several steps in the following sequence.

Figure 31A:
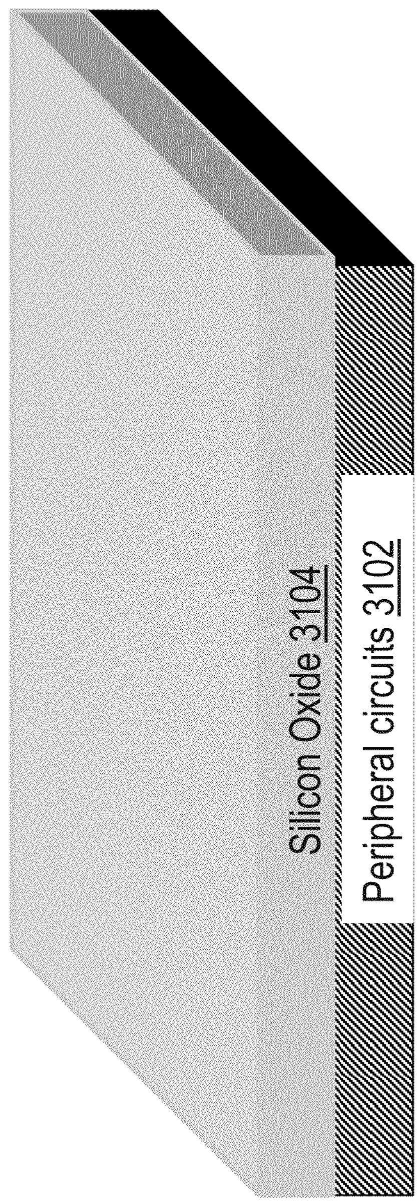
FIG. 31A-K show a zero-mask per layer 3D floating body DRAM.

Step (A): Peripheral circuits with tungsten wiring 3102 are first constructed and above this oxide layer 3104 may be deposited. FIG. 31A shows a drawing illustration after Step (A).

Figure 31B:
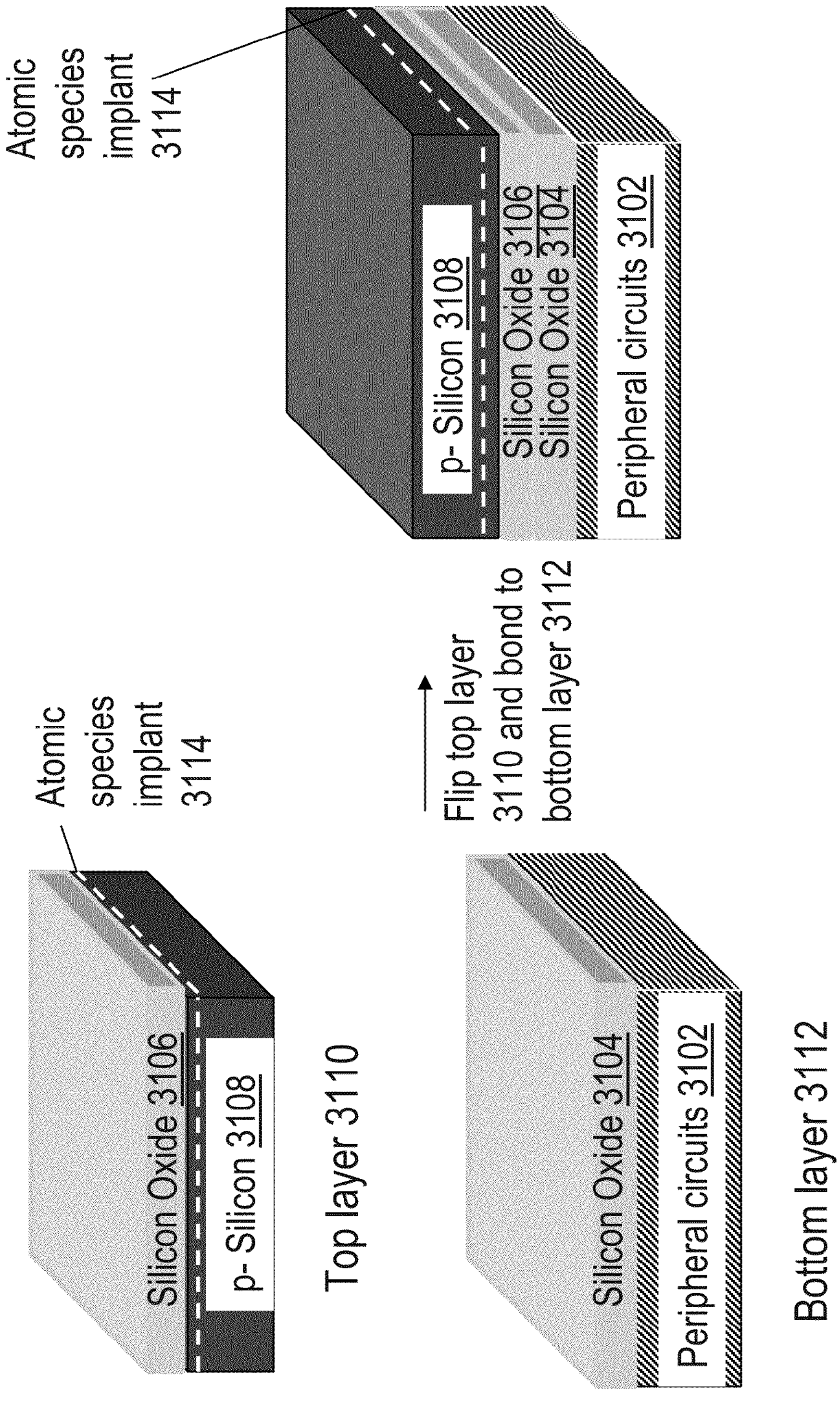

Step (B): FIG. 31B illustrates the structure after Step (B). A p− Silicon wafer 3108 has an oxide layer 3106 grown or deposited above it. A doped and activated layer may be formed in or on p− silicon wafer 3108 by processes such as, for example, implant and RTA or furnace activation, or epitaxial deposition and activation. Following this, hydrogen may be implanted into the p− Silicon wafer at a certain depth indicated by 3114. Alternatively, some other atomic species such as Helium could be (co-)implanted. This hydrogen implanted p− Silicon wafer 3108 forms the top layer 3110. The bottom layer 3112 may include the peripheral circuits 3102 with oxide layer 3104. The top layer 3110 may be flipped and bonded to the bottom layer 3112 using oxide-to-oxide bonding.

Figure 31C:
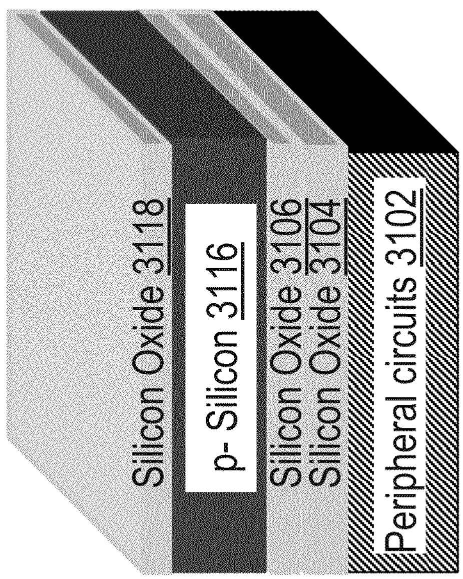

Step (C): FIG. 31C illustrates the structure after Step (C). The stack of top and bottom wafers after Step (B) may be cleaved at the hydrogen plane 3114 using either a anneal or a sideways mechanical force or other means. A CMP process may be then conducted. A layer of silicon oxide 3118 may be then deposited atop the p− Silicon layer 3116. At the end of this step, a single-crystal p− Silicon layer 3116 exists atop the peripheral circuits, and this has been achieved using layer transfer techniques.

Figure 31D:
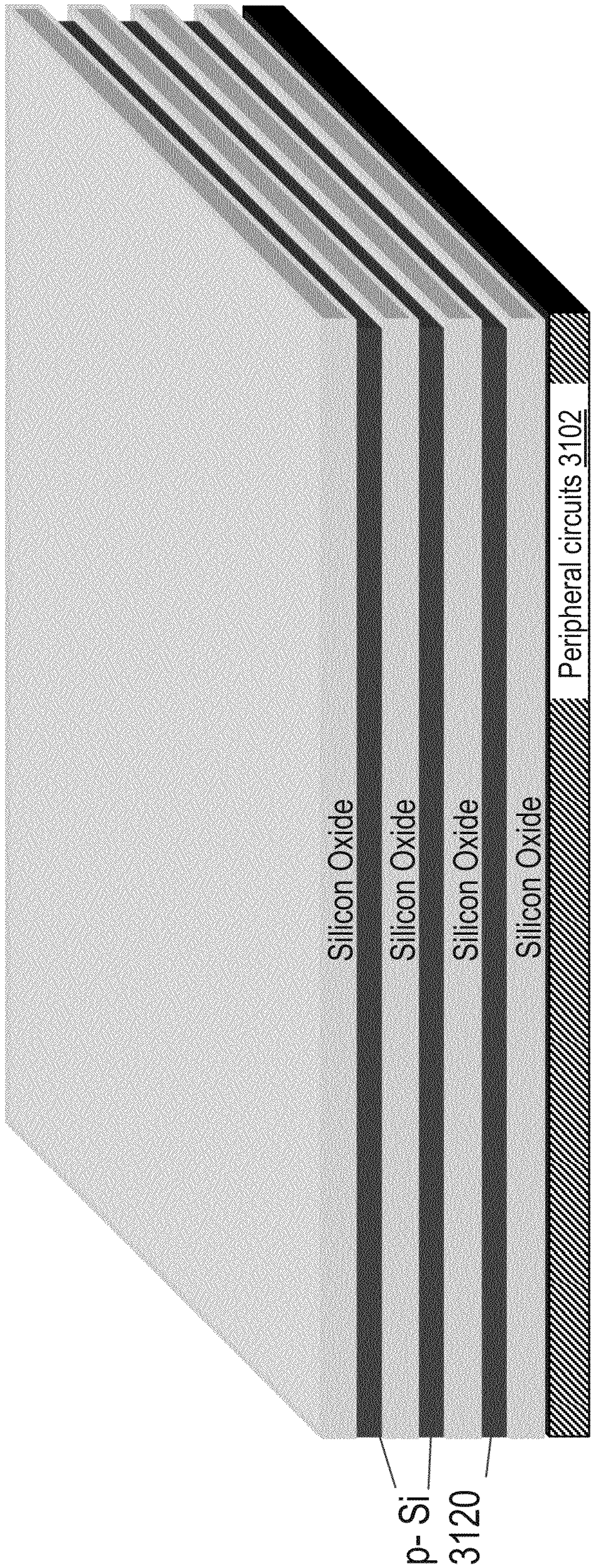

Step (D): FIG. 31D illustrates the structure after Step (D). Using methods similar to Step (B) and (C), multiple p− silicon layers 3120 are formed with silicon oxide layers in between.

Figure 31E:
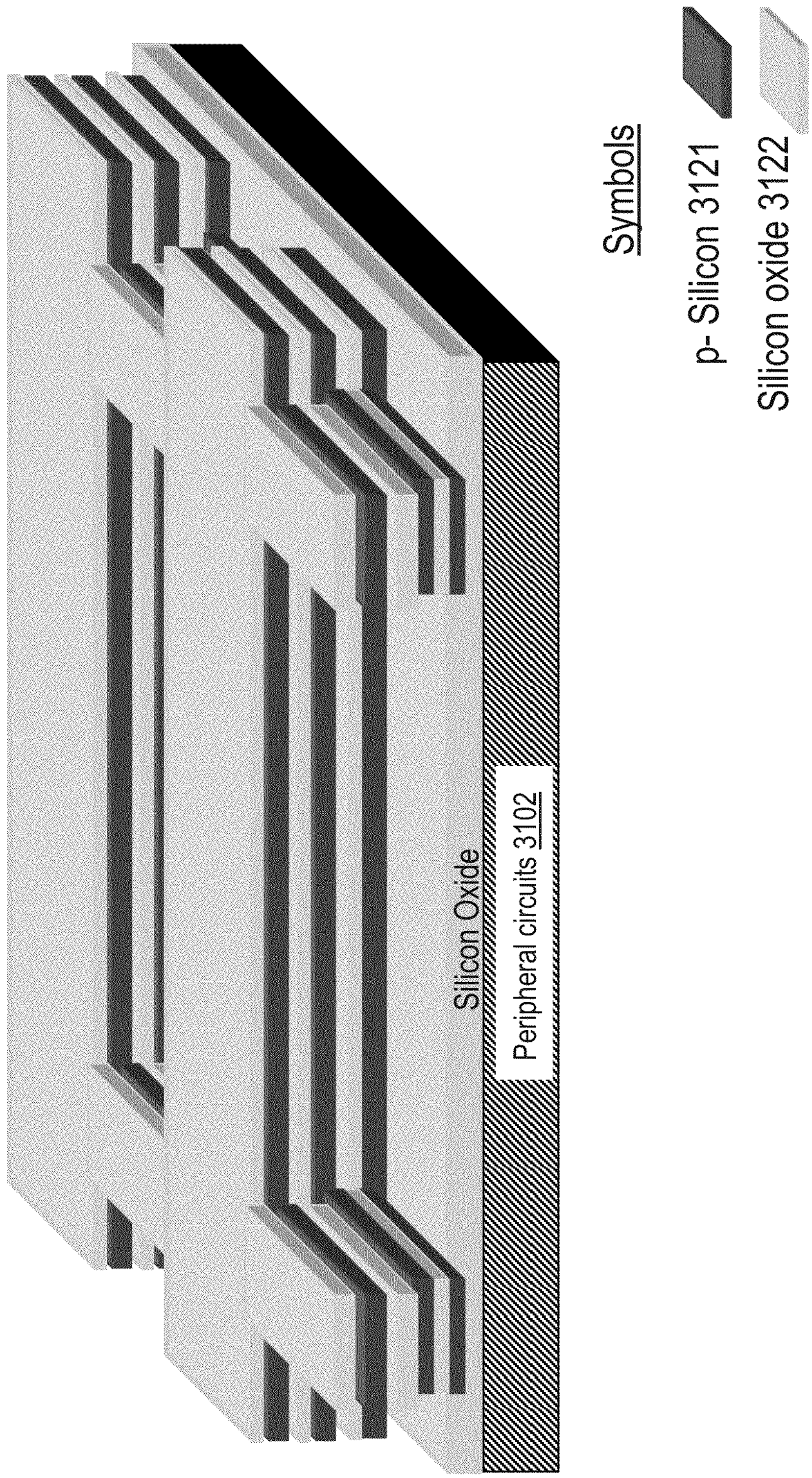

Step (E): FIG. 31E illustrates the structure after Step (E). Lithography and etch processes may then be utilized to make a structure as shown in the figure, including p− silicon layer regions 3121 and silicon oxide layer regions 3122.

Figure 31F:
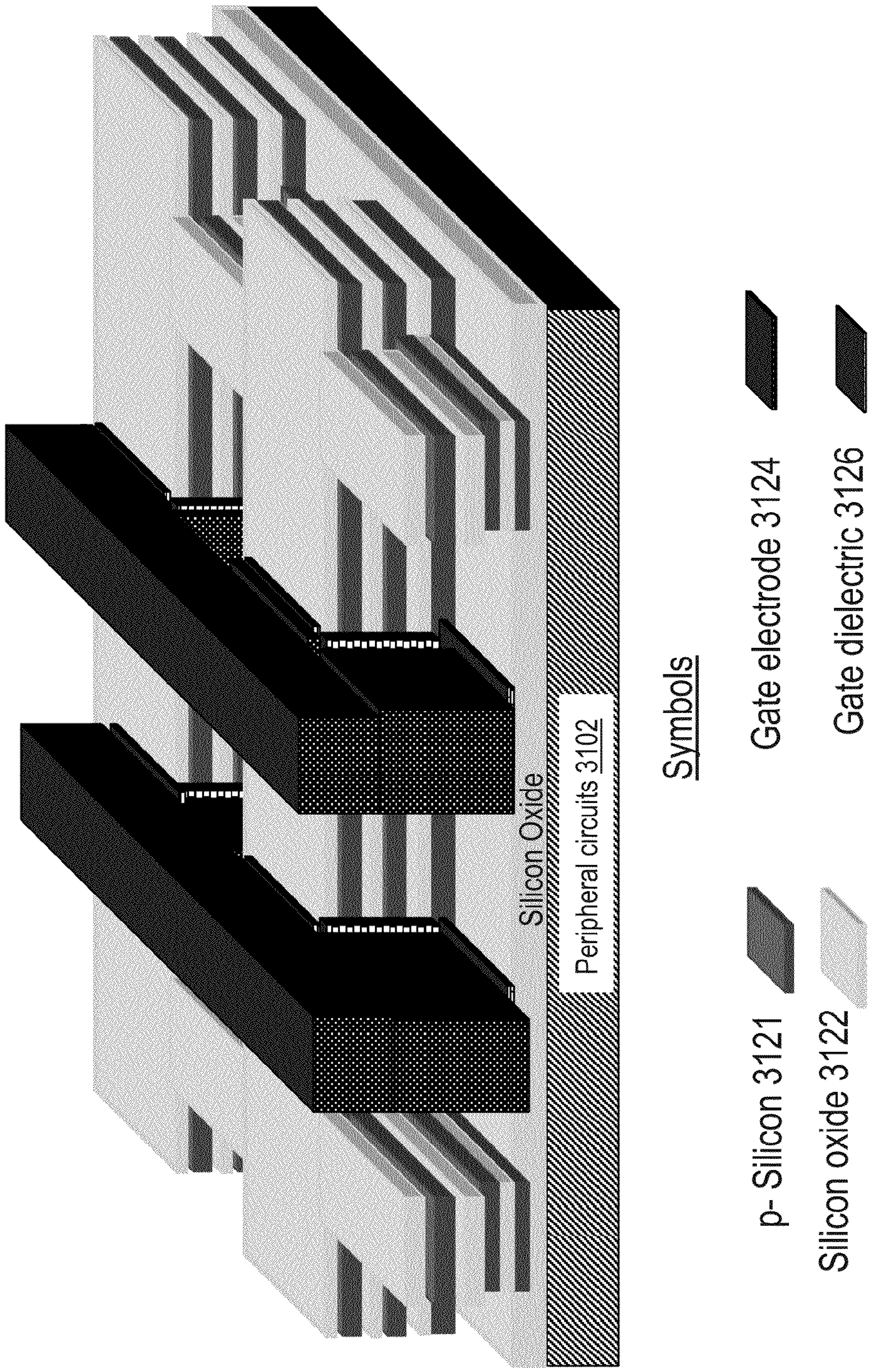

Step (F): FIG. 31F illustrates the structure after Step (F). Gate dielectric 3126 and gate electrode 3124 are then deposited following which a CMP may be done to planarize the gate electrode 3124 regions. Lithography and etch are utilized to define gate regions.

Figure 31G:
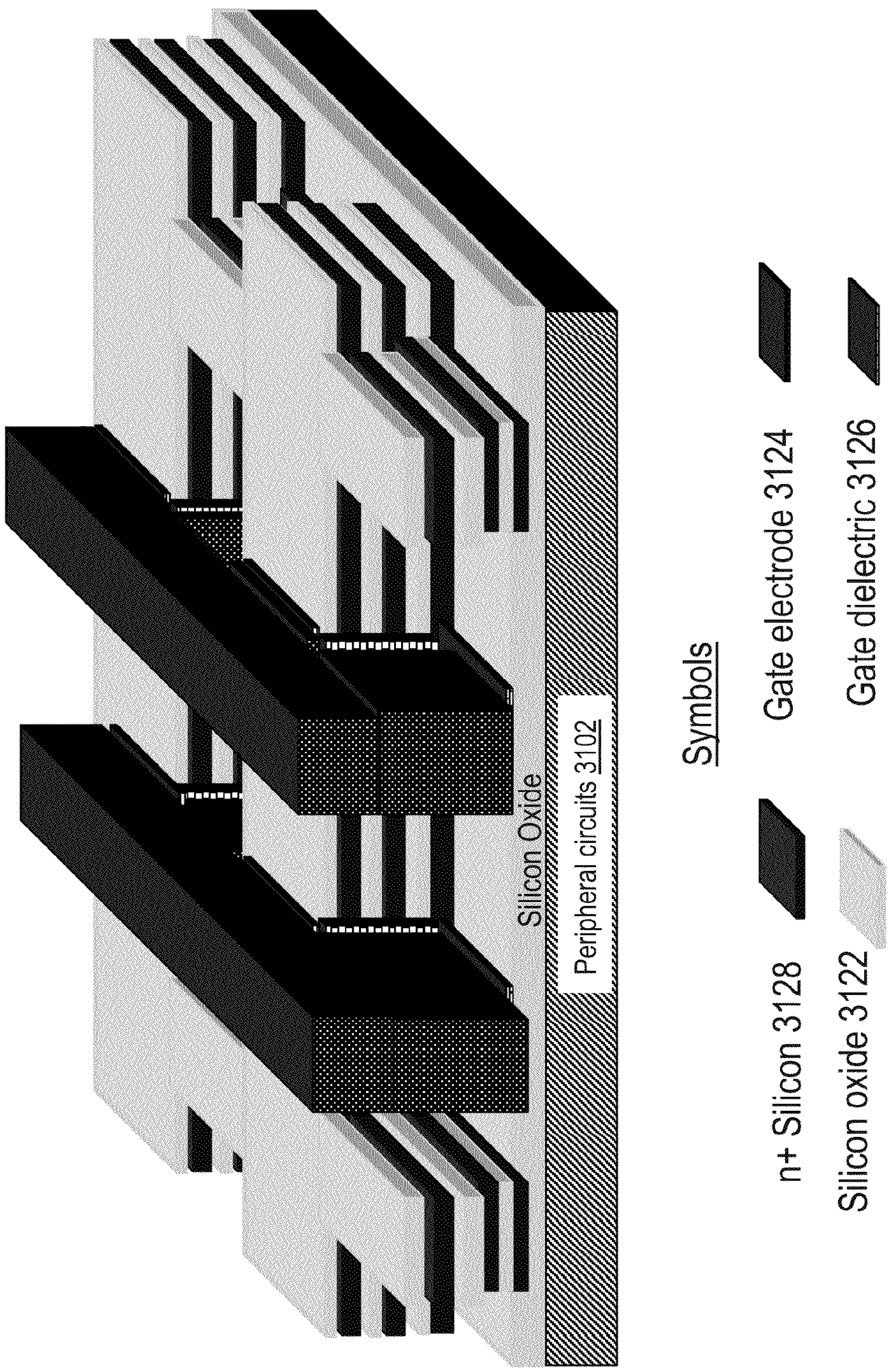

Step (G): FIG. 31G illustrates the structure after Step (G). Using the hard mask defined in Step (F), p− regions not covered by the gate are implanted to form n+ regions 3128. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, may be then conducted to activate n+ doped regions.

Figure 31H:
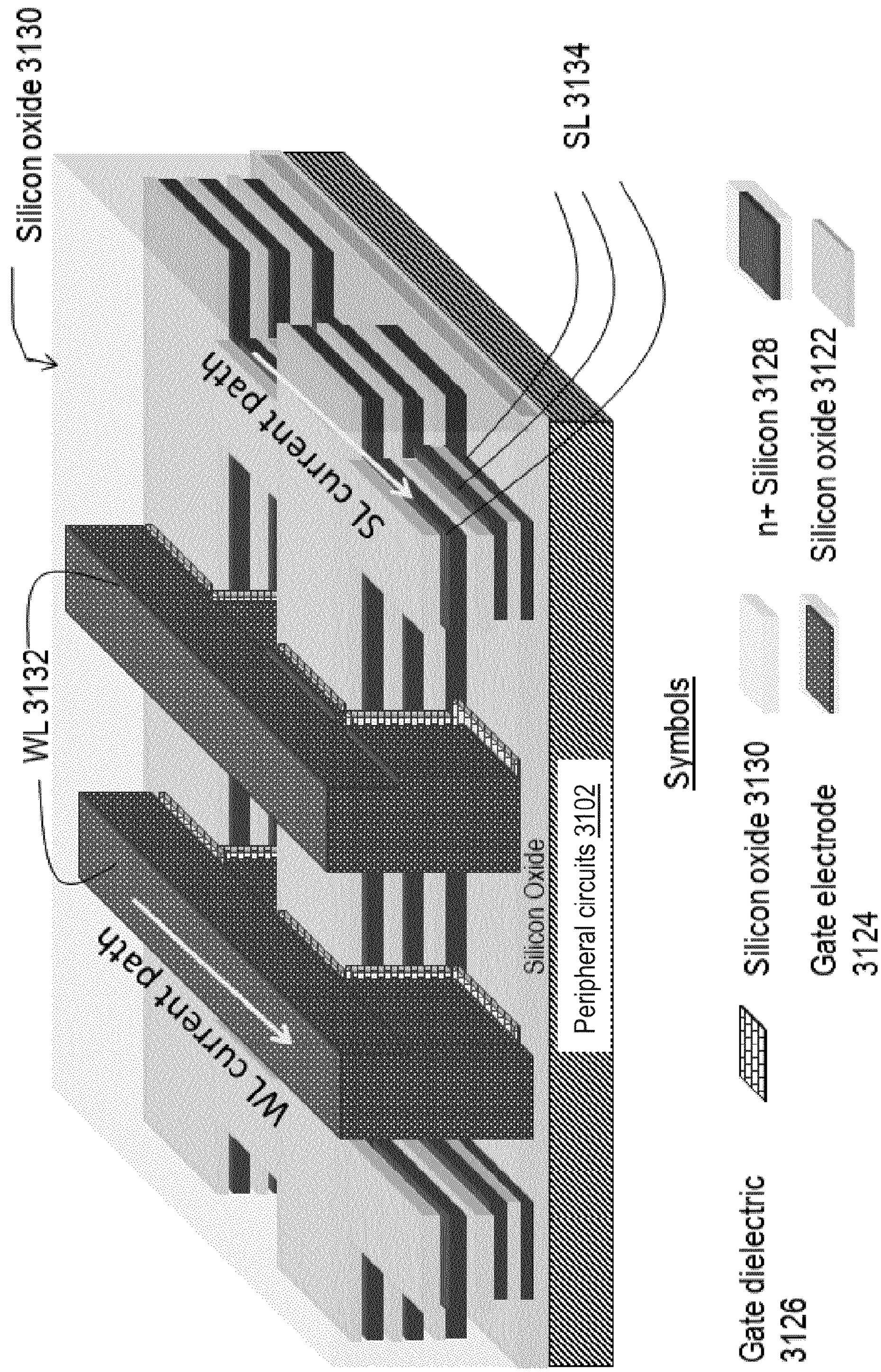

Step (H): FIG. 31H illustrates the structure after Step (H). A silicon oxide layer 3130 may be then deposited and planarized. For clarity, the silicon oxide layer may be shown transparent, along withword-line (WL) 3132 and source-line (SL) 3134 regions.

Figure 31I:
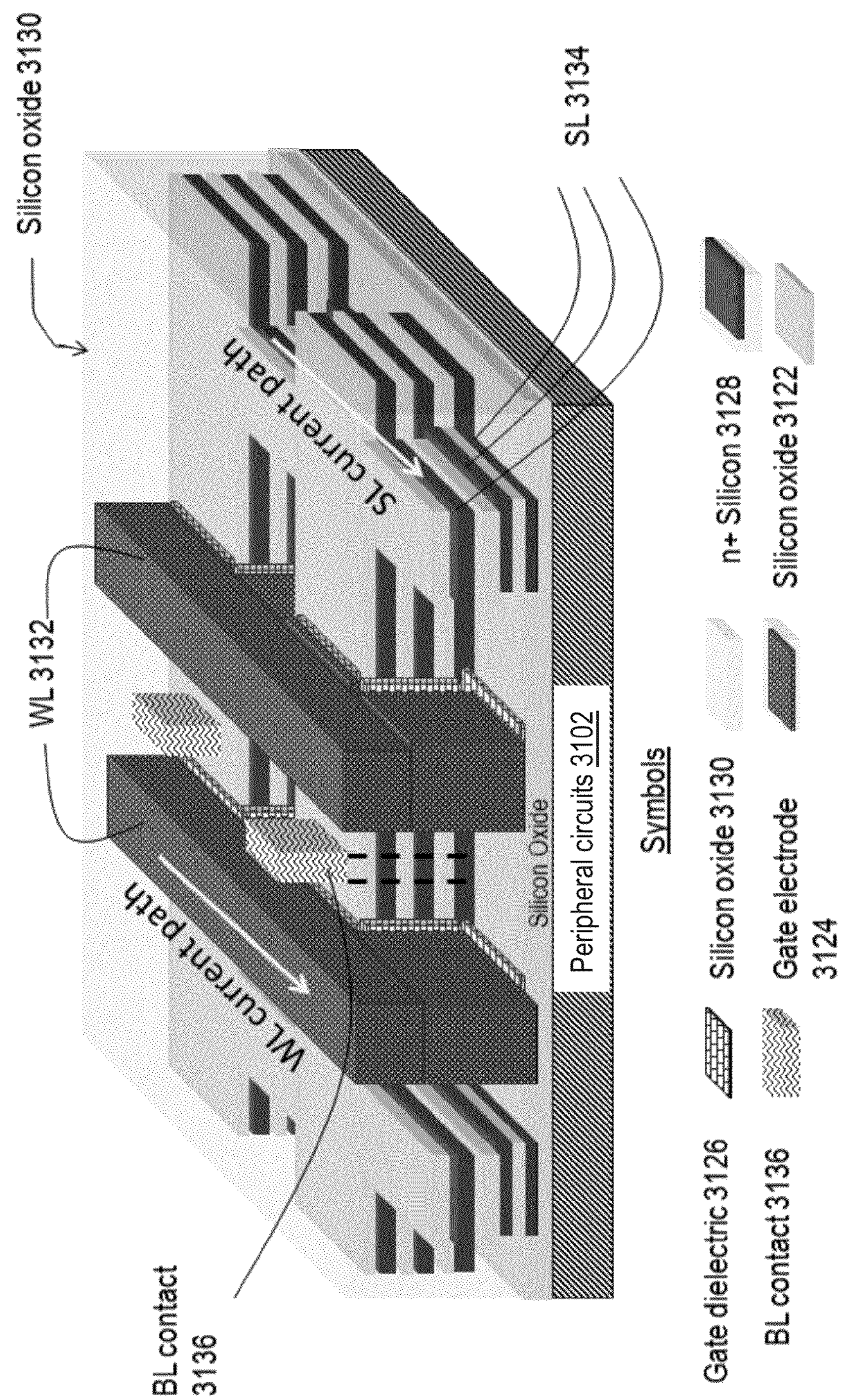

Step (I): FIG. 31I illustrates the structure after Step (I). Bit-line (BL) contacts 3136 are formed by etching and deposition. These BL contacts are shared among all layers of memory.

Figure 31J:
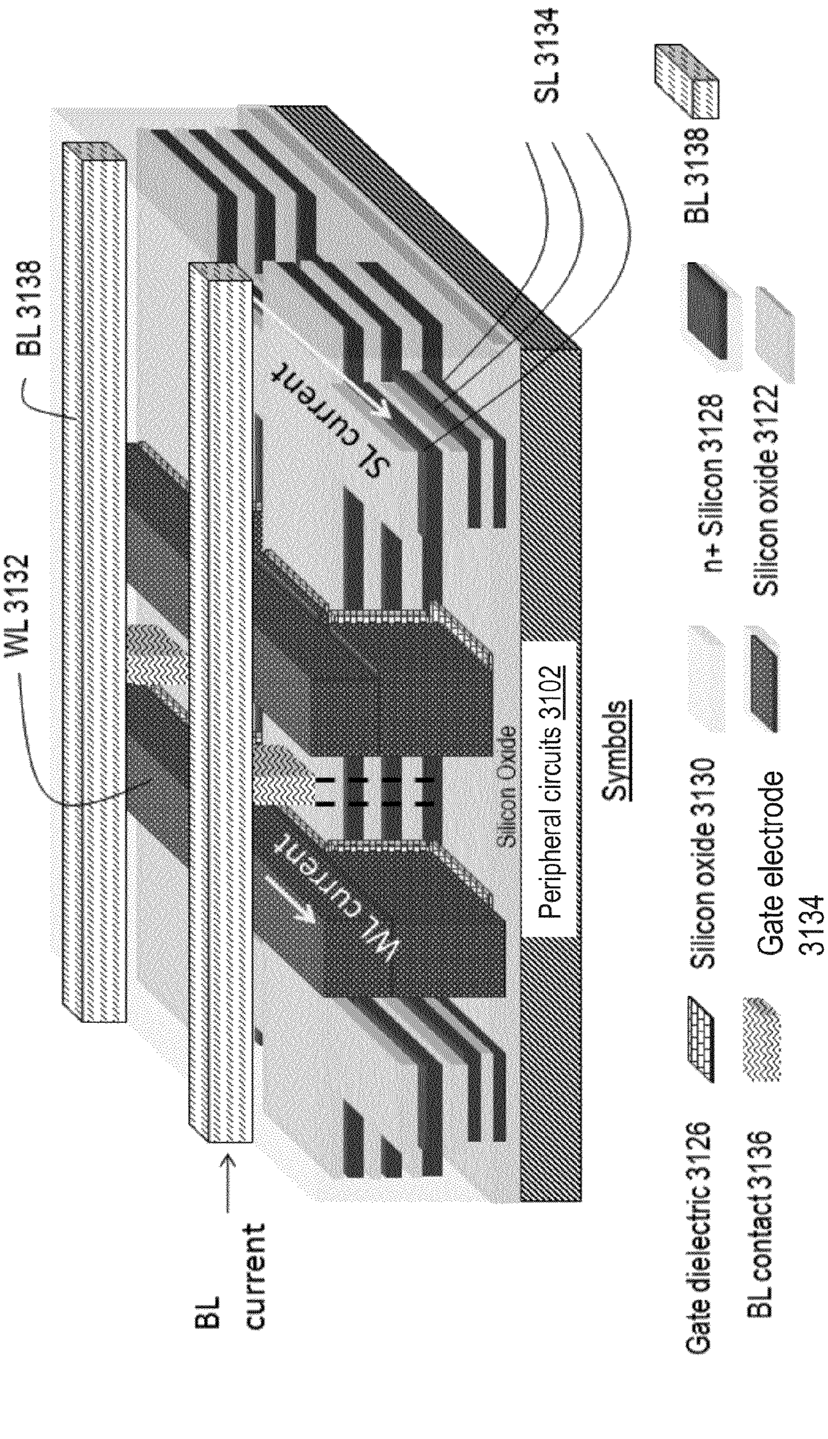

Step (J): FIG. 31J illustrates the structure after Step (J). BLs 3138 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

Figure 31K:
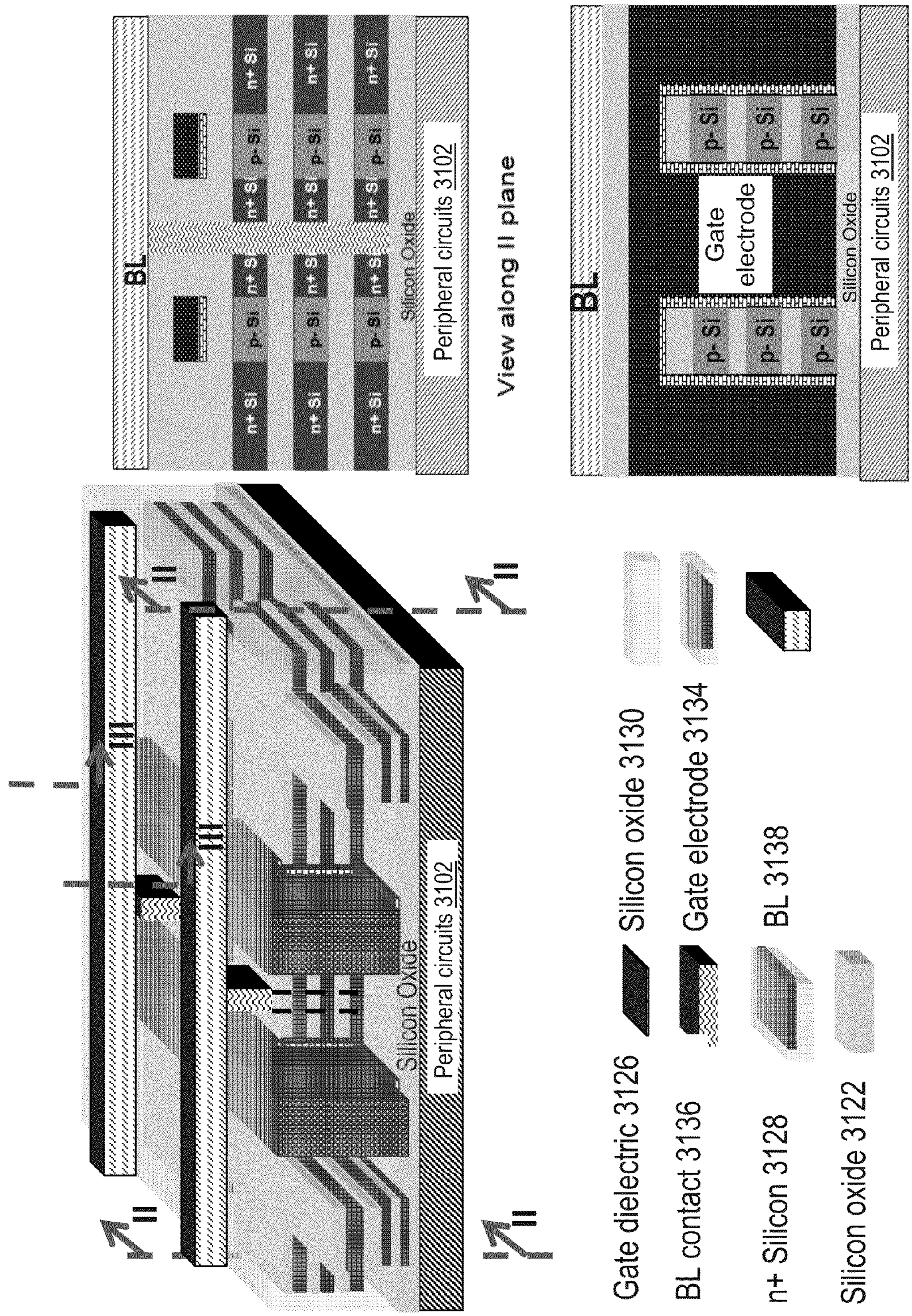

FIG. 31K shows cross-sectional views of the array for clarity. Double-gated transistors may be utilized along with the floating body effect for storing information.

A floating body DRAM has thus been constructed, with (1) horizontally-oriented transistors—i.e. current flowing in substantially the horizontal direction in transistor channels (2) some of the memory cell control lines, e.g., source-lines SL, constructed of heavily doped silicon and embedded in the memory cell layer, (3) side gates simultaneously deposited over multiple memory layers, and (4) mono-crystalline (or single crystal) silicon layers obtained by layer transfer techniques such as ion-cut.

FIG. 71A-J describes an alternative process flow to construct a horizontally-oriented monolithic 3D DRAM. This monolithic 3D DRAM utilizes the floating body effect and independently addressable double-gate transistors. One mask may be utilized on a "per-memory-layer" basis for the monolithic 3D DRAM concept shown in FIG. 71A-J, while other masks are shared between different layers. Independently addressable double-gated transistors provide an increased flexibility in the programming, erasing and operating modes of floating body DRAMs. The process flow may include several steps that occur in the following sequence.

Figure 71A:
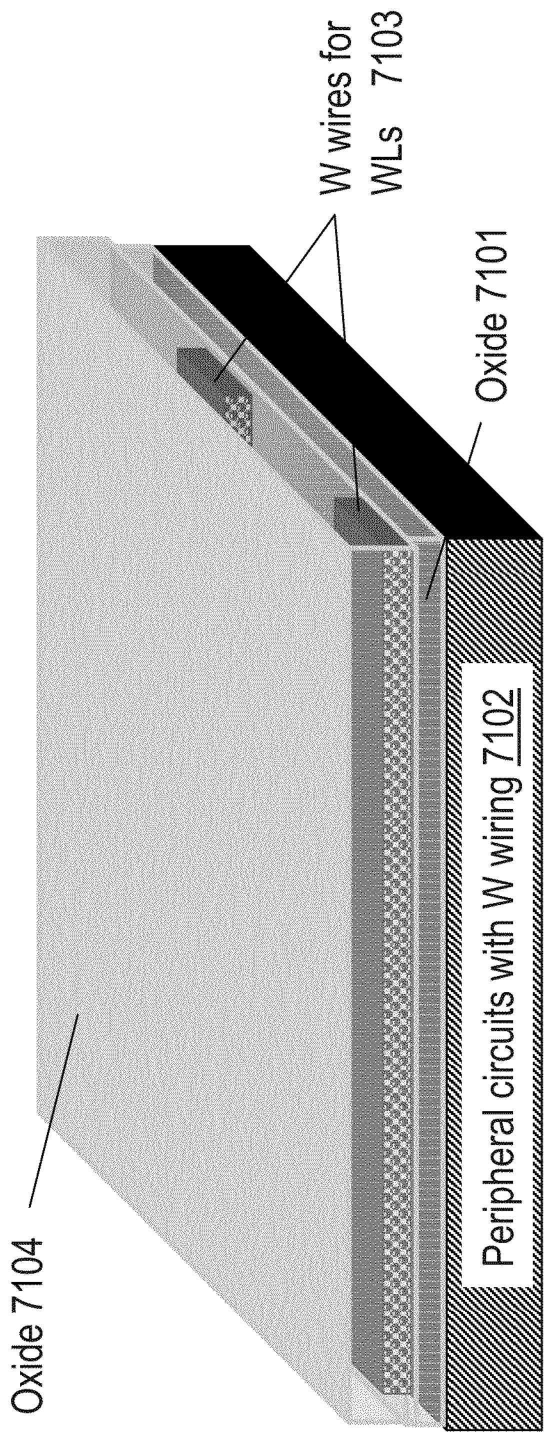
FIG. 71A-J illustrates a technique to construct a horizontally-oriented monolithic 3D DRAM that utilizes the floating body effect and has independently addressable double-gate transistors.

Step (A): Peripheral circuits 7102 with tungsten (W) wiring may be constructed. Isolation, such as oxide 7101, may be deposited on top of peripheral circuits 7102 and tungsten word line (WL) wires 7103 may be constructed on top of oxide 7101. WL wires 7103 may be coupled to the peripheral circuits 7102 through metal vias (not shown). Above WL wires 7103 and filling in the spaces, oxide layer 7104 may be deposited and may be chemically mechanically polished (CMP) in preparation for oxide-oxide bonding. FIG. 71A illustrates the structure after Step (A).

Figure 71B:
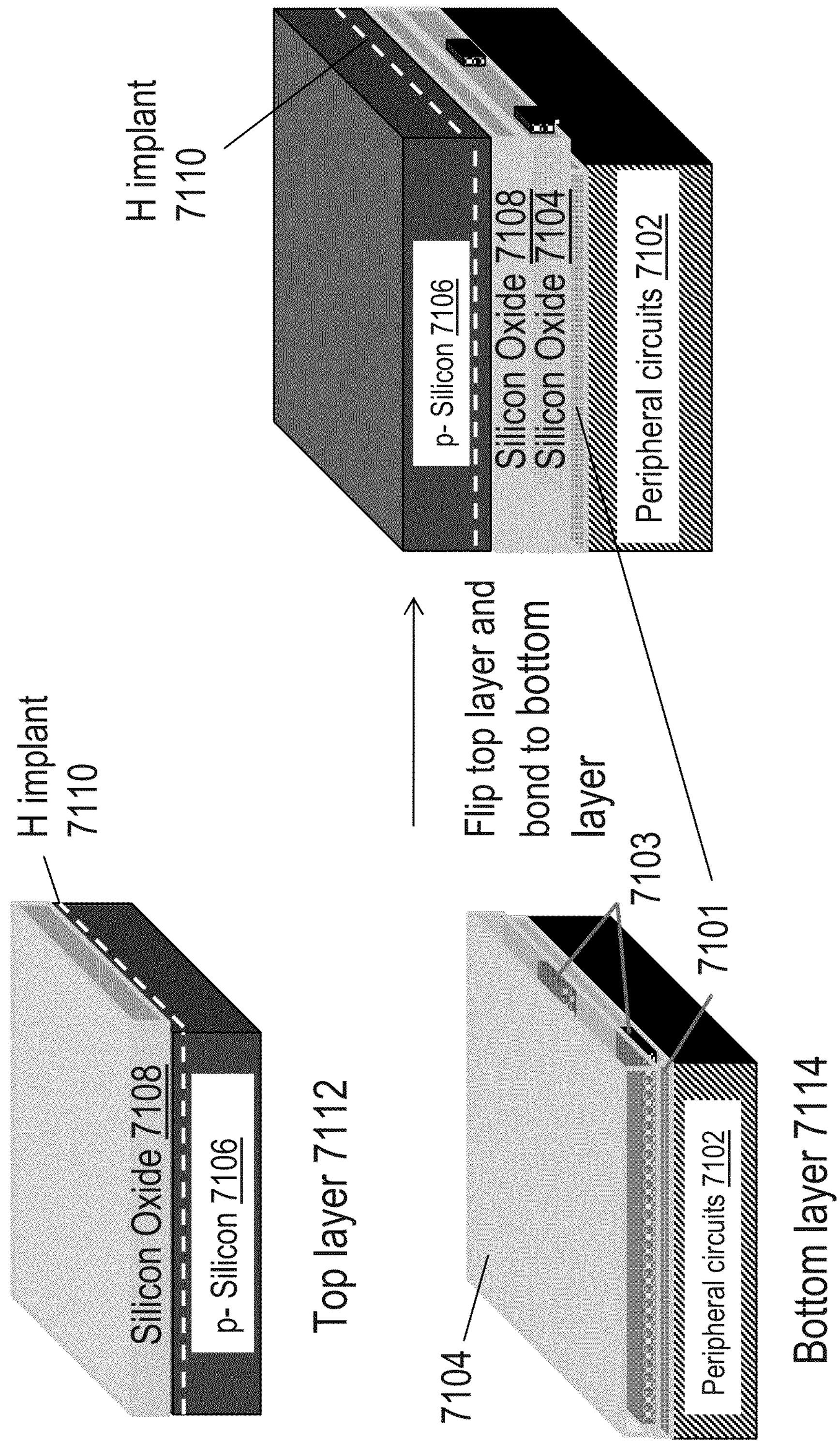

Step (B): FIG. 71B shows a drawing illustration after Step (B). A p− Silicon wafer 7106 has an oxide layer 7108 grown or deposited above it. A doped and activated layer may be formed in or on p− silicon wafer 7106 by processes such as, for example, implant and RTA or furnace activation, or epitaxial deposition and activation. Following this, hydrogen may be implanted into the p− Silicon wafer at a certain depth indicated by dashed lines as hydrogen plane 7110. Alternatively, some other atomic species such as Helium could be (co-)implanted. This hydrogen implanted p− Silicon wafer 7106 forms the top layer 7112. The bottom layer 7114 may include the peripheral circuits 7102 with oxide layer 7104, WL wires 7103 and oxide 7101. The top layer 7112 may be flipped and bonded to the bottom layer 7114 using oxide-to-oxide bonding of oxide layer 7104 to oxide layer 7108.

Figure 71C:
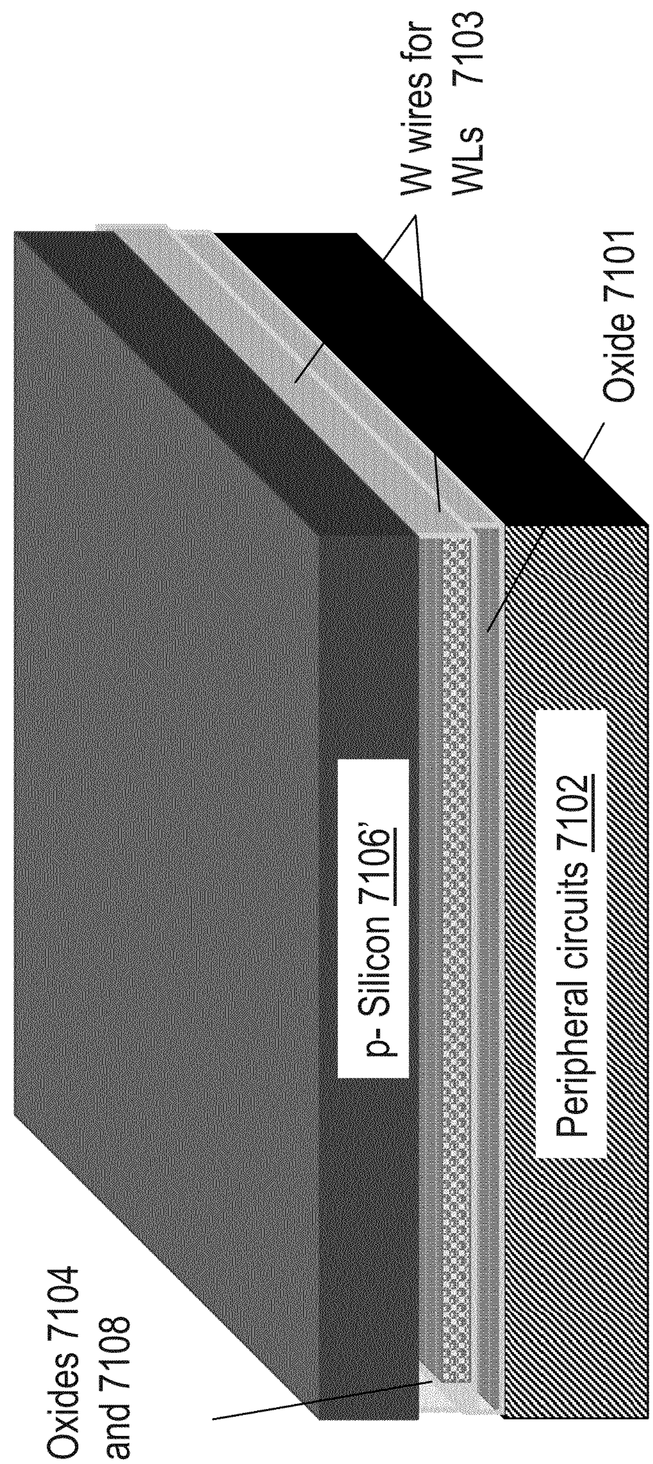

Step (C): FIG. 71C illustrates the structure after Step (C). The stack of top and bottom wafers after Step (B) may be cleaved at the hydrogen plane 7110 using either an anneal, a sideways mechanical force or other means of cleaving or thinning the top layer 7112 described elsewhere in this document. A CMP process may then be conducted. At the end of this step, a single-crystal p− Si layer 7106' exists atop the peripheral circuits, and this has been achieved using layer transfer techniques.

Figure 71D:
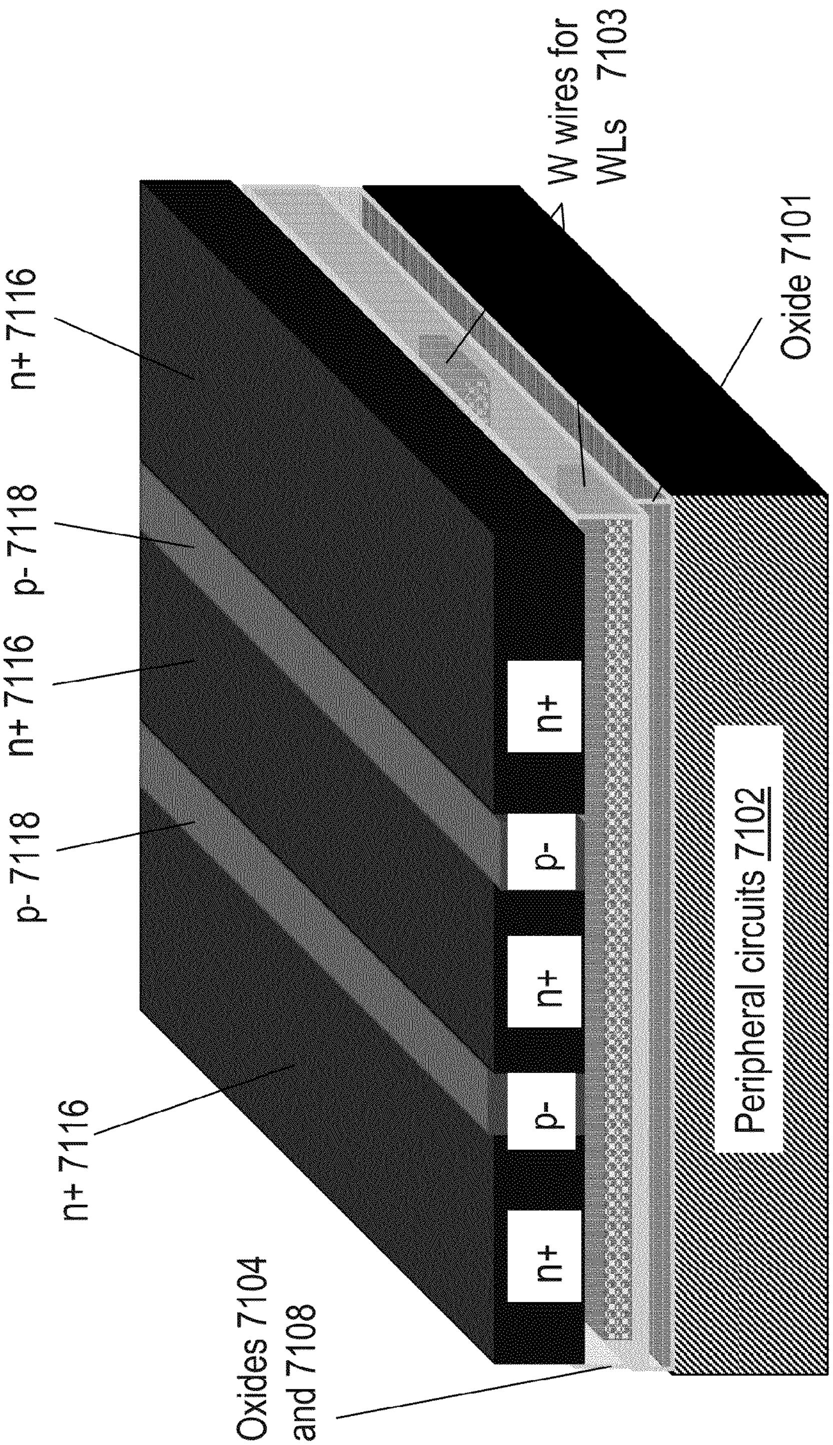

Step (D): FIG. 71D illustrates the structure after Step (D). Using lithography and then ion implantation or other semiconductor doping methods such as plasma assisted doping (PLAD), n+ regions 7116 and p− regions 7118 are formed on the transferred layer of p− Si after Step (C).

Figure 71E:
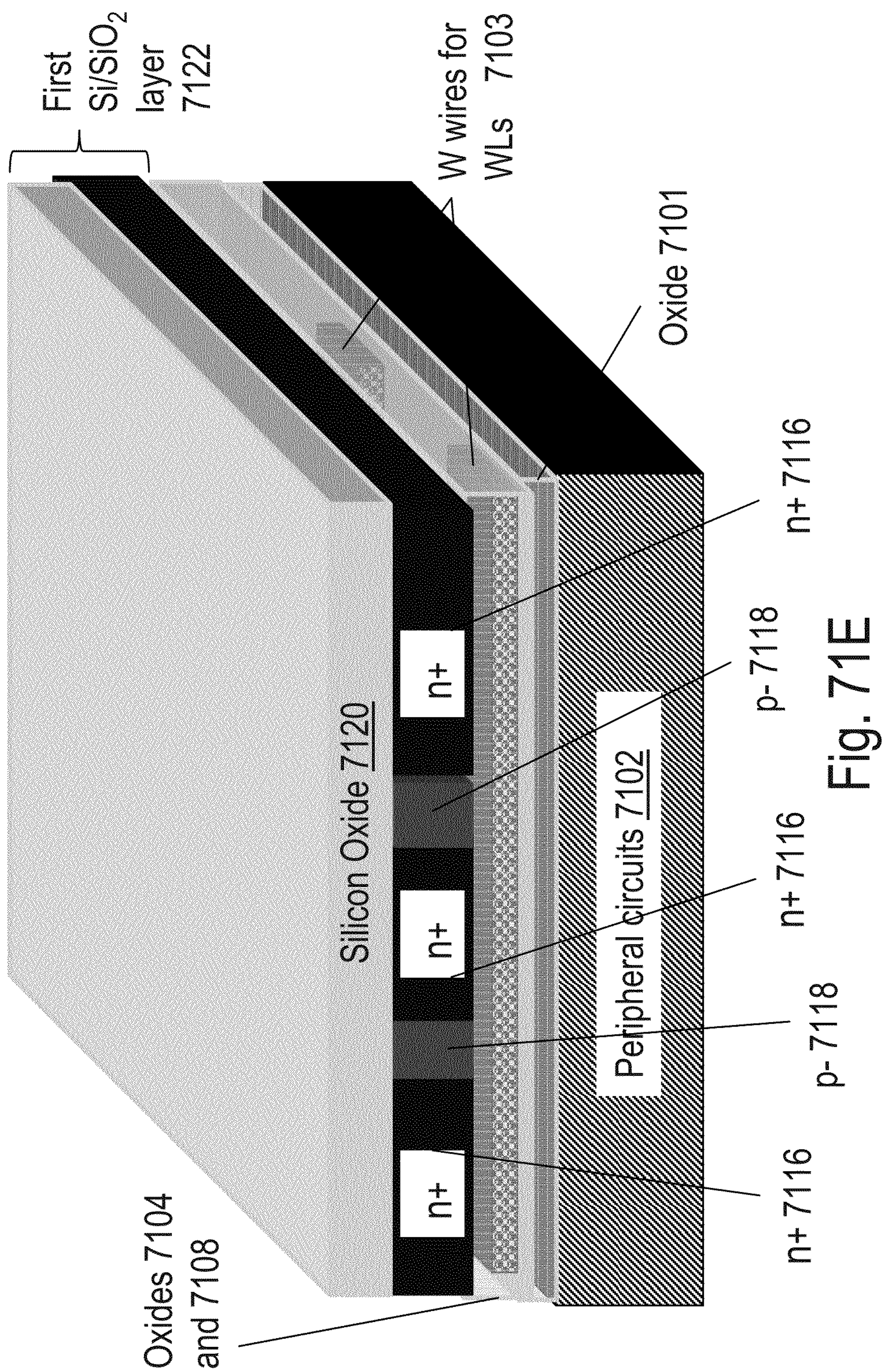

Step (E): FIG. 71E illustrates the structure after Step (E). An oxide layer 7120 may be deposited atop the structure obtained after Step (D). A first layer of Si/$SiO_2$ 7122 may be therefore formed atop the peripheral circuits 7102, oxide 7101, WL wires 7103, oxide layer 7104 and oxide layer 7108.

Figure 71F:
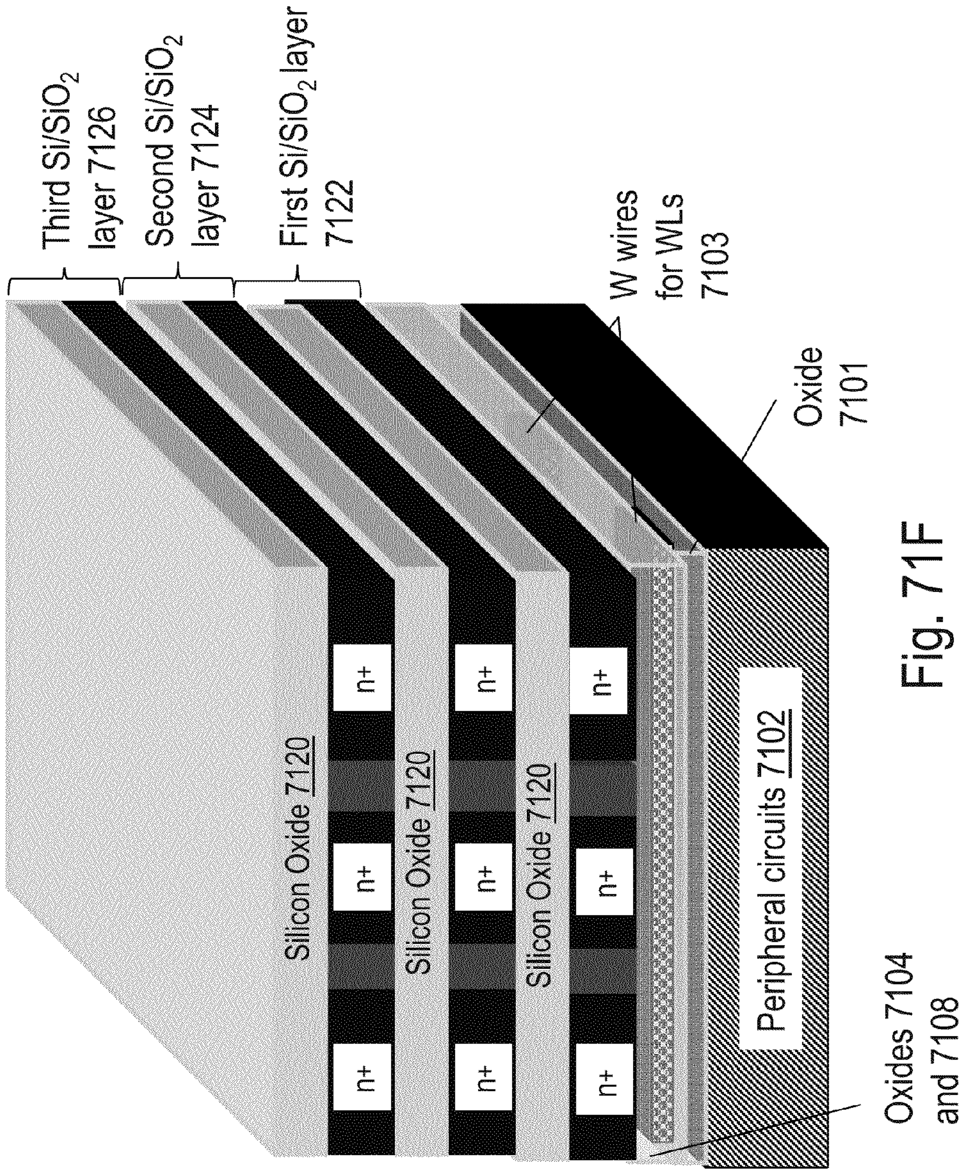

Step (F): FIG. 71F illustrates the structure after Step (F). Using procedures similar to Steps (B)-(E), additional Si/$SiO_2$ layers 7124 and 7126 are formed atop Si/$SiO_2$ layer 7122. A rapid thermal anneal (RTA) or spike anneal or flash anneal or laser anneal may then be done to activate all implanted or doped regions within Si/$SiO_2$layers 7122, 7124 and 7126 (and possibly also the peripheral circuits 7102). Alternatively, the Si/$SiO_2$layers 7122, 7124 and 7126 may be annealed layer-by-layer as soon as their implantations or dopings are done using an optical anneal system such as a laser anneal system. A CMP polish/plasma etch stop layer (not shown), such as silicon nitride, may be deposited on top of the topmost Si/$SiO_2$ layer, for example third Si/$SiO_2$ layer 7126.

Figure 71G:
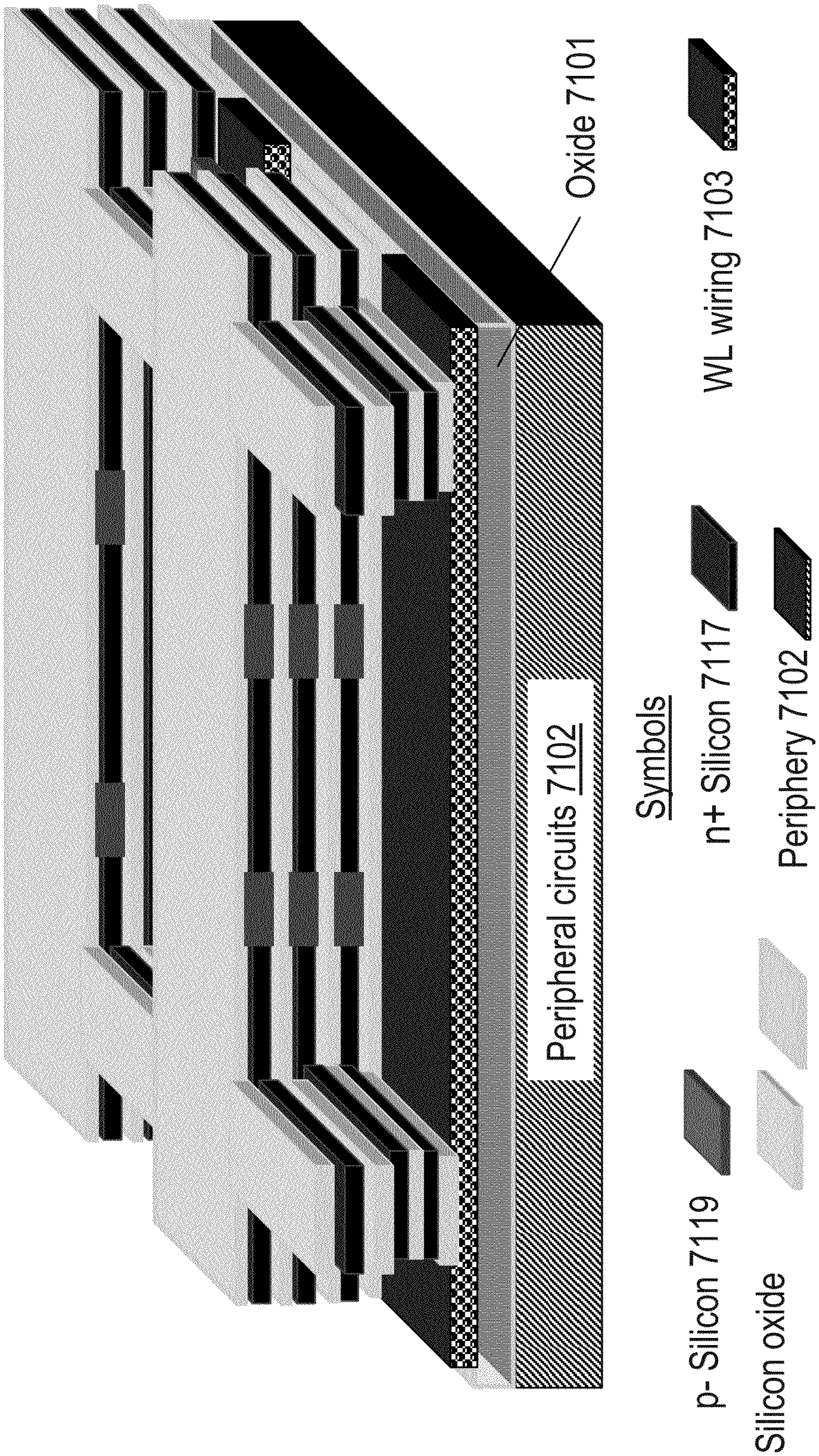

Step (G): FIG. 71G illustrates the structure after Step (G). Lithography and etch processes are then utilized to make an exemplary structure as shown in FIG. 71G, thus forming n+ regions 7117, p− regions 7119, and associated oxide regions.

Figure 71H:
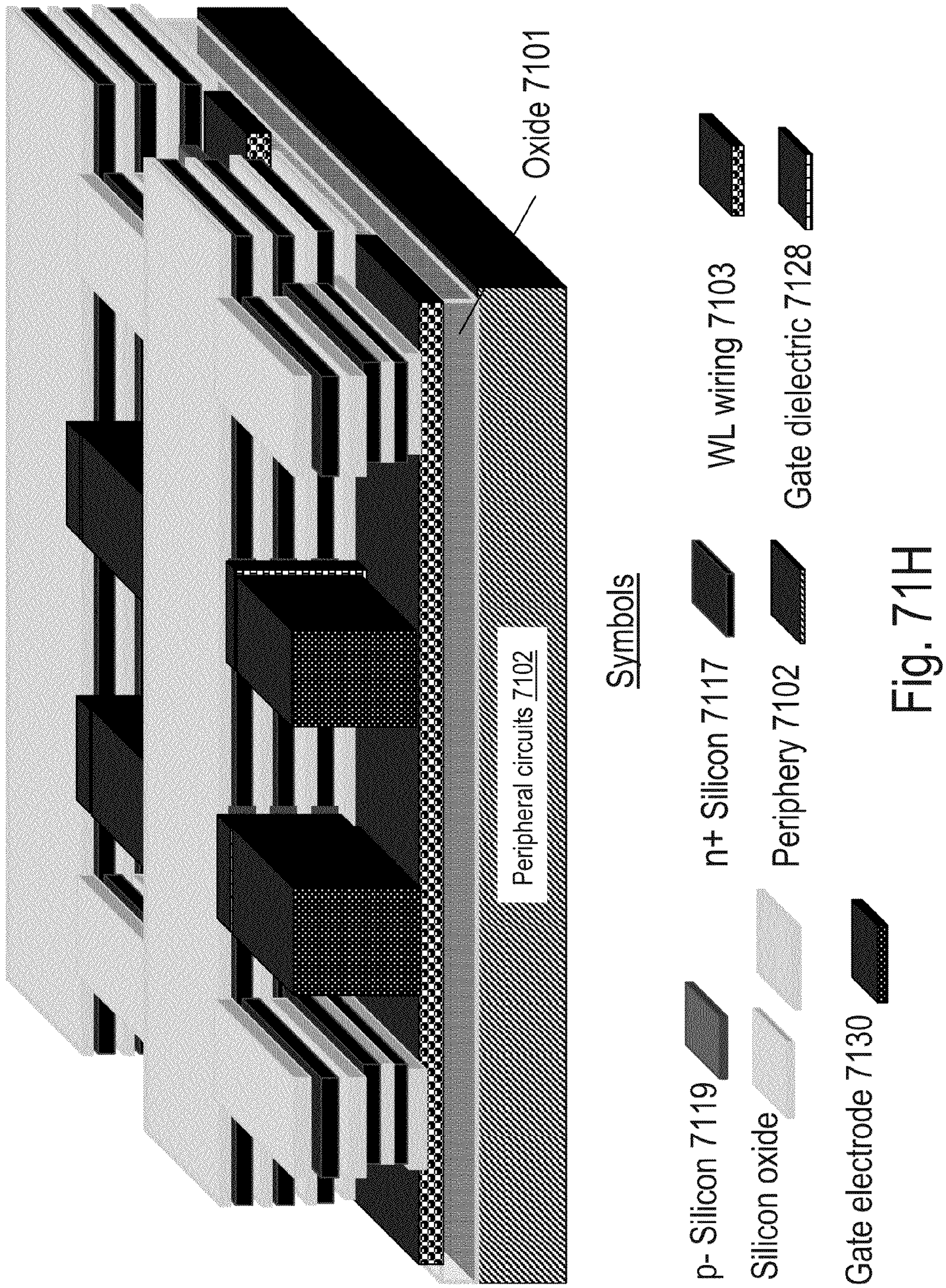

Step (H): FIG. 71H illustrates the structure after Step (H). Gate dielectric 7128 may be deposited and then an etch-back process may be employed to clear the gate dielectric from the top surface of WL wires 7103. Then gate electrode 7130 may be deposited such that an electrical coupling may be made from WL wires 7103 to gate electrode 7130. A CMP may be done to planarize the gate electrode 7130 regions such that the gate electrode 7130 forms many separate and electrically disconnected regions. Lithography and etch are utilized to define gate regions over the p− silicon regions (eg. p− Si regions 7119 after Step (G)). Note that gate width could be slightly larger than p− region width to compensate for overlay errors in lithography. A silicon oxide layer may be then deposited and planarized. For clarity, the silicon oxide layer is shown transparent in the figure.

Figure 71I:
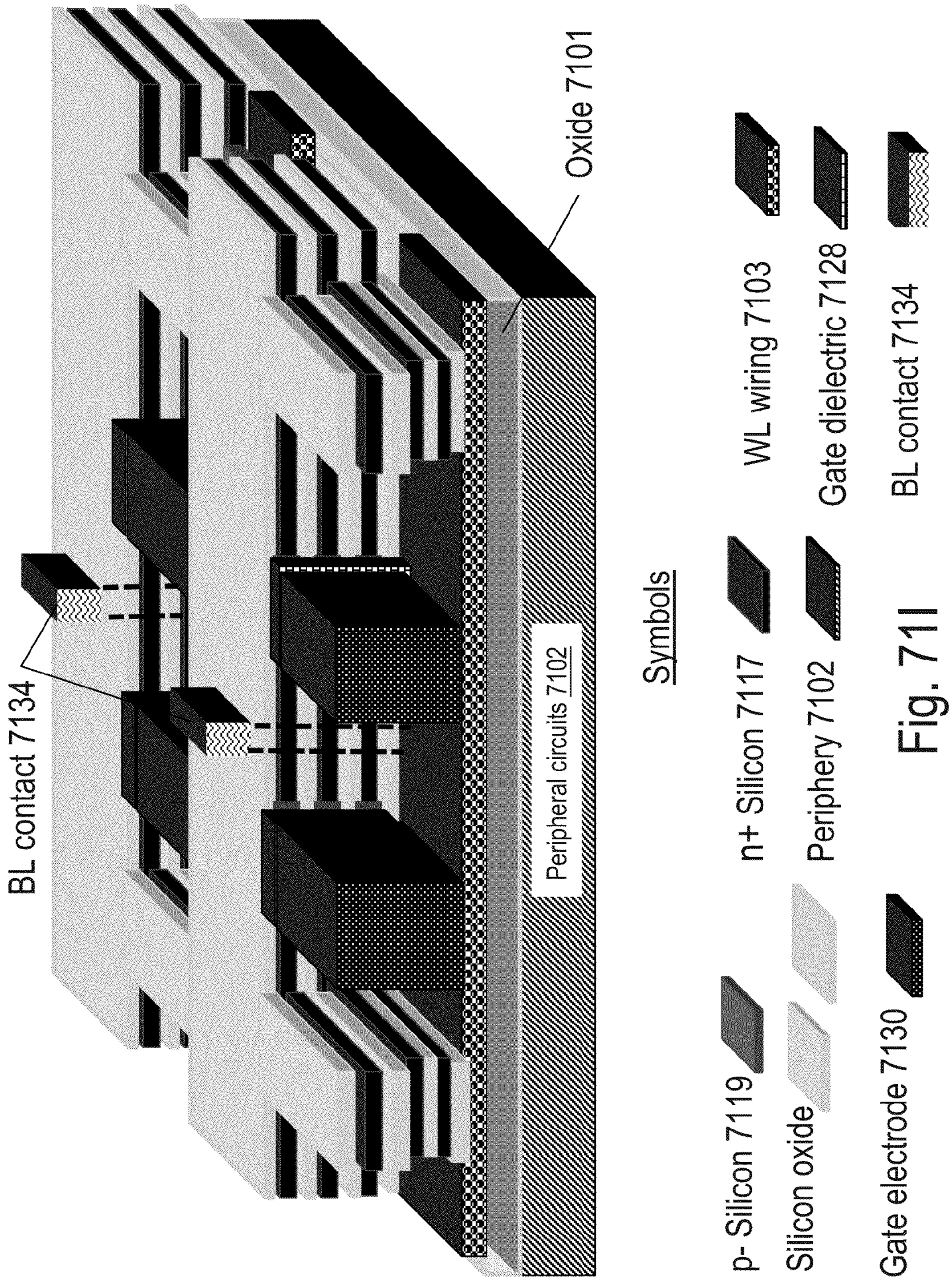

Step (I): FIG. 71I illustrates the structure after Step (I).Bit-line (BL) contacts 7134 are formed by etching and deposition. These BL contacts are shared among all layers of memory.

Figure 71J:
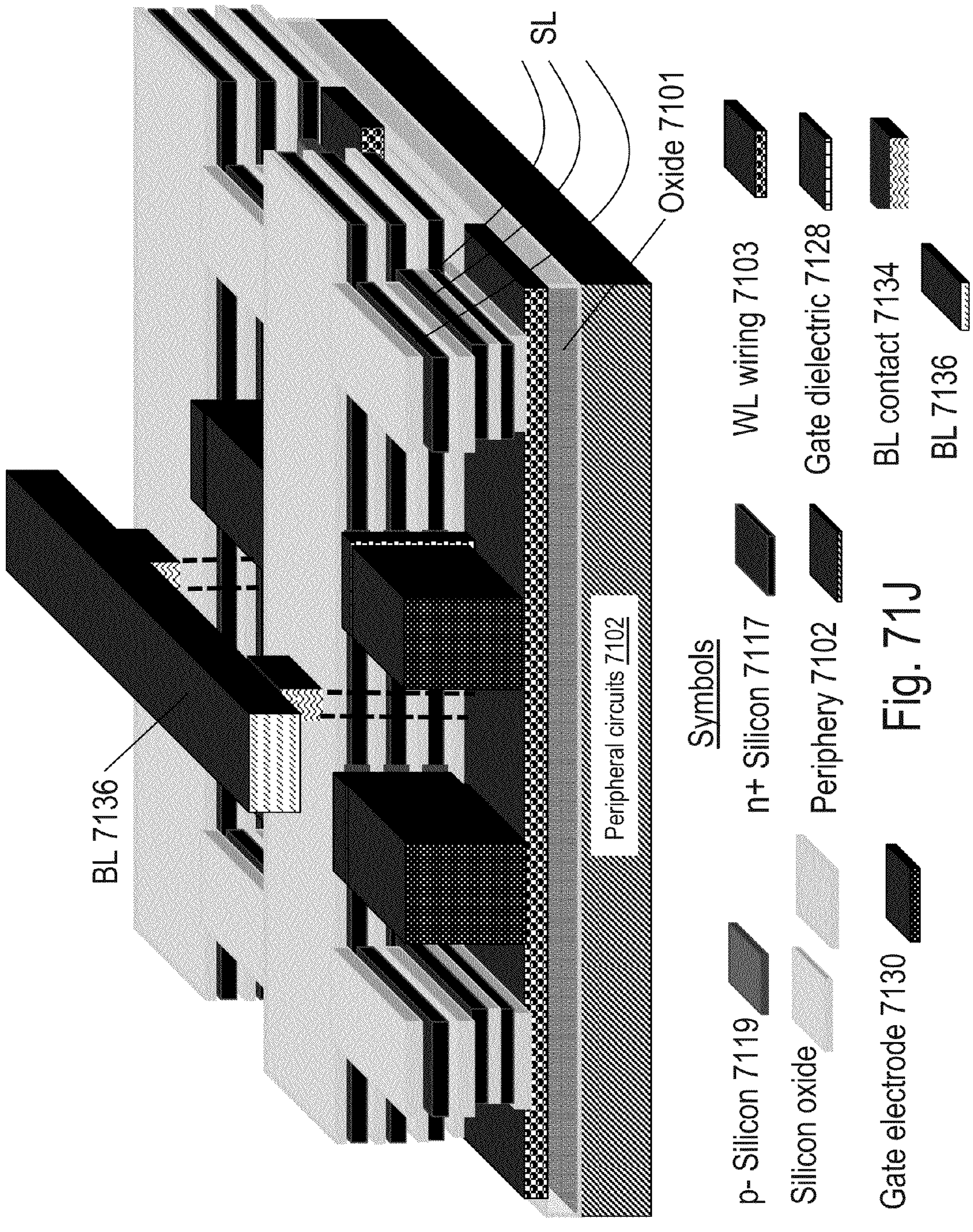

Step (J): FIG. 71J illustrates the structure after Step (J). Bit Lines (BLs) 7136 are then constructed. SL contacts (not shown) can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

A floating body DRAM has thus been constructed, with (1) horizontally-oriented transistors—i.e., current flowing in substantially the horizontal direction in transistor channels, (2) some of the memory cell control lines, e.g., source-lines SL, constructed of heavily doped silicon and embedded in the memory cell layer, (3) side gates simultaneously deposited over multiple memory layers and independently addressable, and (4) mono-crystalline (or single-crystal) silicon layers obtained by layer transfer techniques such as ion-cut. WL wires 7103 need not be on the top layer of the peripheral circuits 7102, they may be integrated. WL wires 7103 may be constructed of another high temperature resistant material, such as NiCr.

With the explanations for the formation of monolithic 3D DRAM with ion-cut in this section, it is clear to one skilled in the art that alternative implementations are possible. BL and SL nomenclature has been used for two terminals of the 3D DRAM array, and this nomenclature can be interchanged. Each gate of the double gate 3D DRAM can be independently controlled for better control of the memory cell. To implement these changes, the process steps in FIG. 30A-M and 31 may be modified. FIG. 71A-J is one example of how process modification may be made to achieve independently addressable double gates. Moreover, selective epi technology or laser recrystallization technology could be utilized for implementing structures shown in FIG. 30A-M, FIG. 31A-K, and FIG. 71A-J. Various other types of layer transfer schemes that have been described in Section 1.3.4 can be utilized for construction of various 3D DRAM structures. Furthermore, buried wiring, i.e. where wiring for memory arrays may be below the memory layers but above the periphery, may also be used. This may permit the use of low melting point metals, such as aluminum or copper, for some of the memory wiring. Moreover, a heterostructure bipolar transistor (HBT) may be utilized in the floating body structure by using silicon for the emitter region and SiGe for the base and collector regions, thus giving a higher beta than a regular bipolar junction transistor (BJT). Additionally, the HBT has most of its band alignment offset in the valence band, thereby providing favorable conditions for collecting and retaining holes.

Section 4: Monolithic 3D Resistance-Based Memory

While many of today's memory technologies rely on charge storage, several companies are developing non-volatile memory technologies based on resistance of a material changing. Examples of these resistance-based memories include phase change memory, Metal Oxide memory, resistive RAM (RRAM), memristors, solid-electrolyte memory, ferroelectric RAM, conductive bridge RAM, and MRAM. Background information on these resistive-memory types is given in "Overview of candidate device technologies for storage-class memory," *IBM Journal of Research and Development*, vol. 52, no. 4.5, pp. 449-464, July 2008 by Burr, G. W.; Kurdi, B. N.; Scott, J. C.; Lam, C. H.; Gopalakrishnan, K.; Shenoy, R. S.

FIG. 32A-J describe a novel memory architecture for resistance-based memories, and a procedure for its construction. The memory architecture utilizes junction-less transistors and has a resistance-based memory element in series with a transistor selector. No mask may be utilized on a "per-memory-layer" basis for the monolithic 3D resistance change memory (or resistive memory) concept shown in FIG. 32A-J, and all other masks are shared between different layers. The process flow may include several steps that occur in the following sequence.

Figure 32A:
FIG. 32A-J show a zero-mask per layer 3D resistive memory with a junction-less transistor.

Step (A): Peripheral circuits 3202 are first constructed and above this oxide layer 3204 may be deposited. FIG. 32A shows a drawing illustration after Step (A).

Figure 32B:
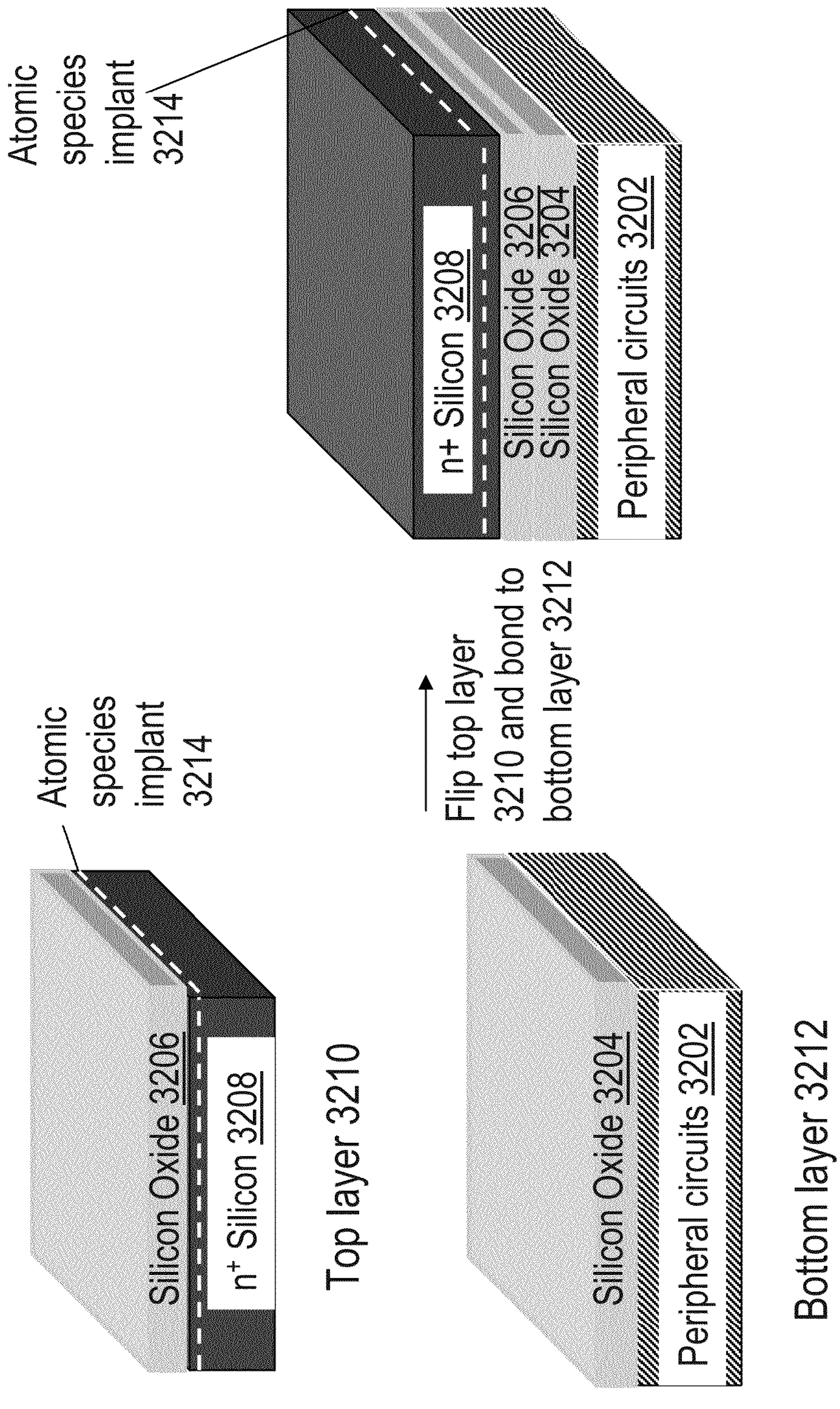

Step (B): FIG. 32B illustrates the structure after Step (B). N+ Silicon wafer 3208 has an oxide layer 3206 grown or deposited above it. A doped and activated layer may be formed in or on N+ silicon wafer 3208 by processes such as, for example, implant and RTA or furnace activation, or epitaxial deposition and activation. Following this, hydrogen may be implanted into the n+ Silicon wafer at a certain depth indicated by 3214. Alternatively, some other atomic species such as Helium could be (co-)implanted. This hydrogen implanted n+ Silicon wafer 3208 forms the top layer 3210. The bottom layer 3212 may include the peripheral circuits 3202 with oxide layer 3204. The top layer 3210 may be flipped and bonded to the bottom layer 3212 using oxide-to-oxide bonding.

Figure 32C:
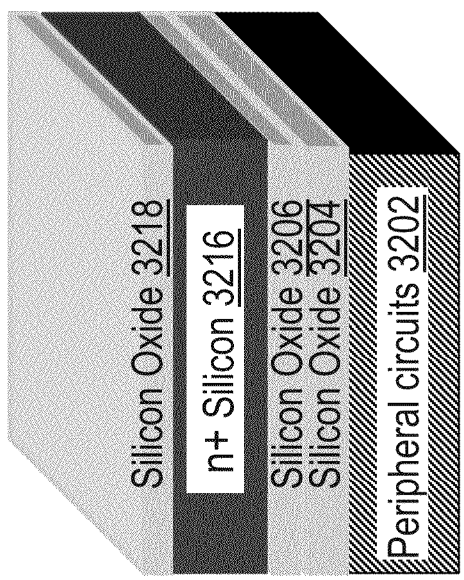

Step (C): FIG. 32C illustrates the structure after Step (C). The stack of top and bottom wafers after Step (B) may be cleaved at the hydrogen plane 3214 using either a anneal or a sideways mechanical force or other means. A CMP process may be then conducted. A layer of silicon oxide 3218 may be then deposited atop the n+ Silicon layer 3216. At the end of this step, a single-crystal n+ Si layer 3216 exists atop the peripheral circuits, and this has been achieved using layer transfer techniques.

Figure 32D:
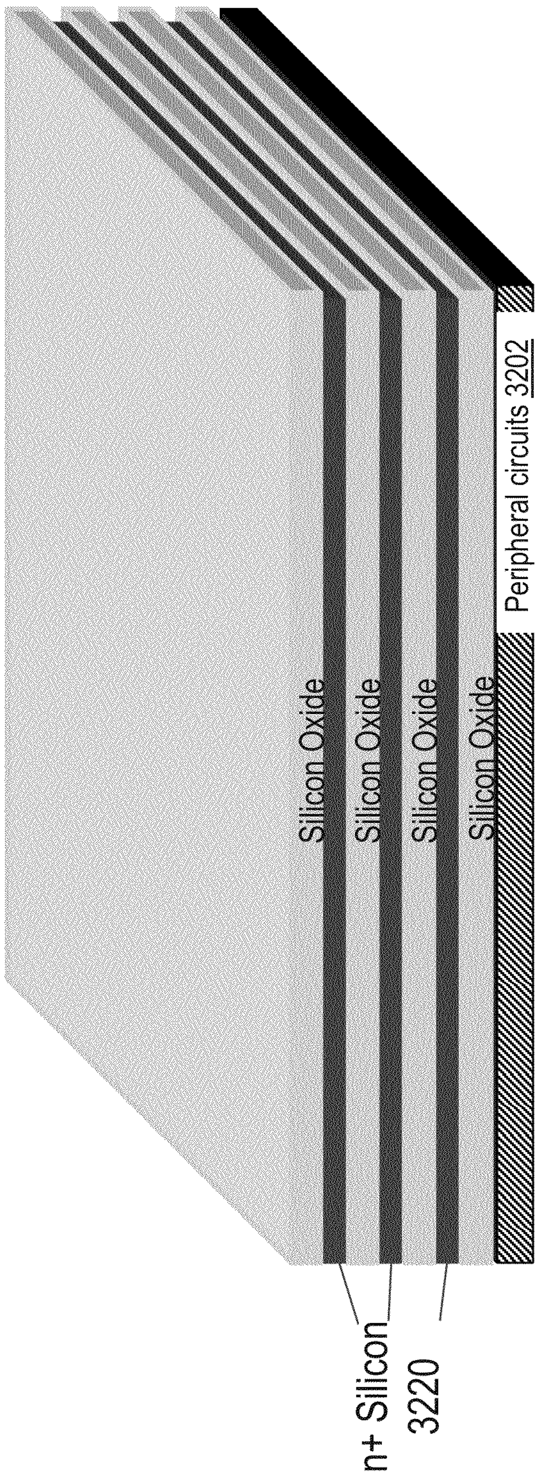

Step (D): FIG. 32D illustrates the structure after Step (D). Using methods similar to Step (B) and (C), multiple n+ silicon layers 3220 are formed with silicon oxide layers in between.

Figure 32E:
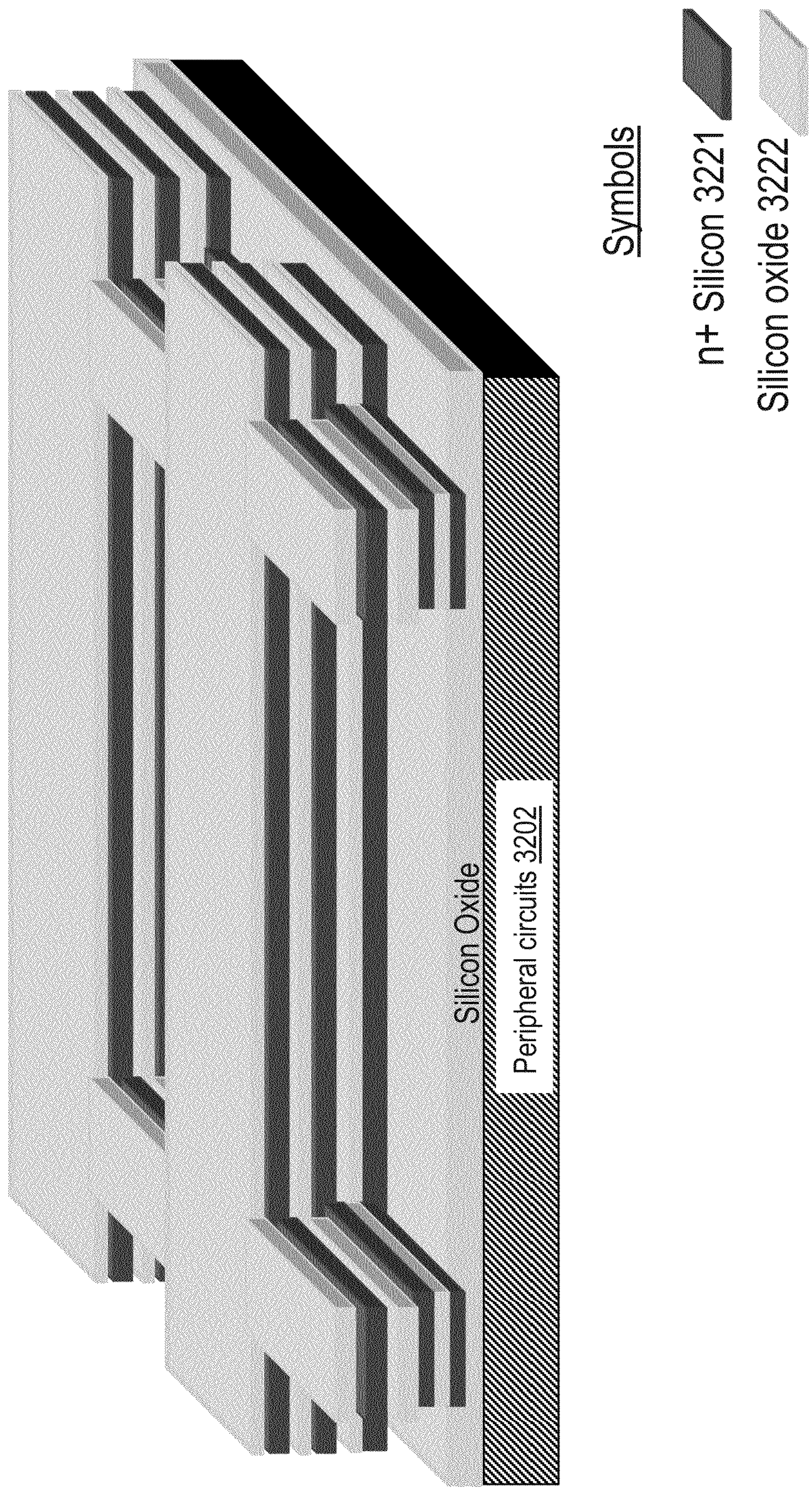

Step (E): FIG. 32E illustrates the structure after Step (E). Lithography and etch processes may then be utilized to make a structure as shown in the figure, including n+ silicon layer regions 3221 and silicon oxide layer regions 3222.

Figure 32F:
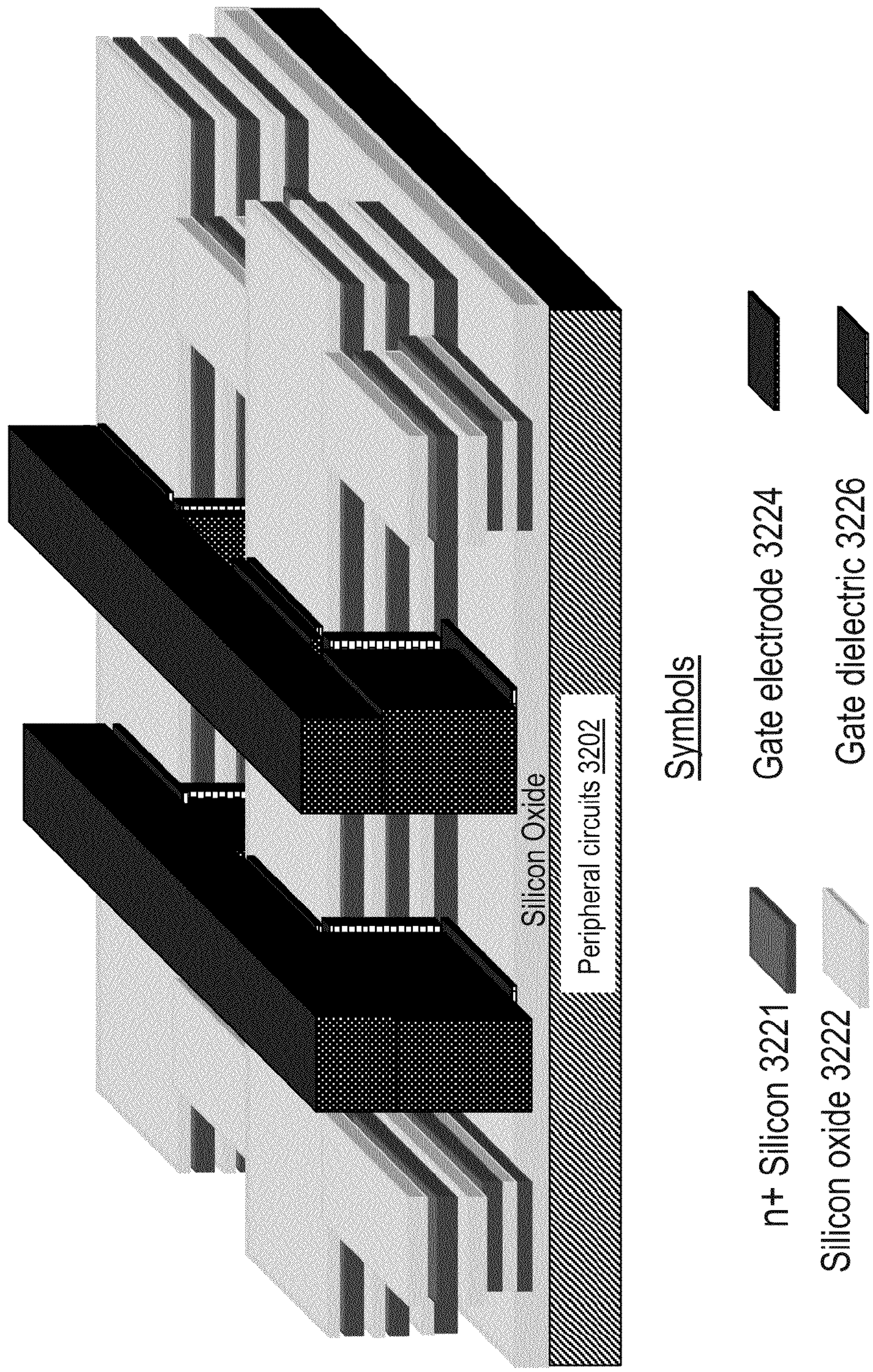

Step (F): FIG. 32F illustrates the structure after Step (F). Gate dielectric 3226 and gate electrode 3224 are then deposited following which a CMP may be performed to planarize the gate electrode 3224 regions. Lithography and etch are utilized to define gate regions.

Figure 32G:
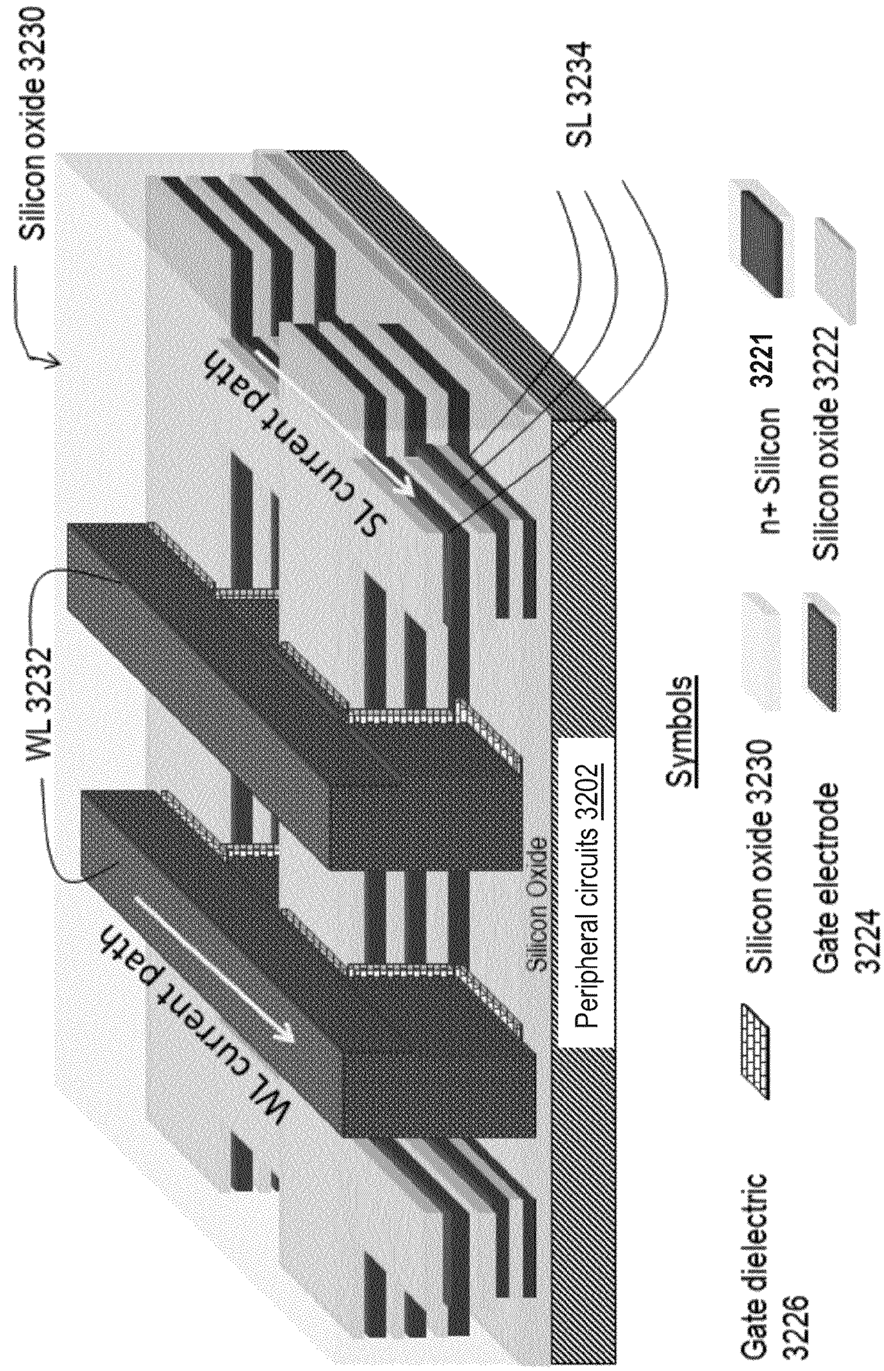

Step (G): FIG. 32G illustrates the structure after Step (G). A silicon oxide layer 3230 may be then deposited and planarized. The silicon oxide layer is shown transparent in the figure for clarity, along with word-line (WL) 3232 and source-line (SL) 3234 regions.

Figure 32H:
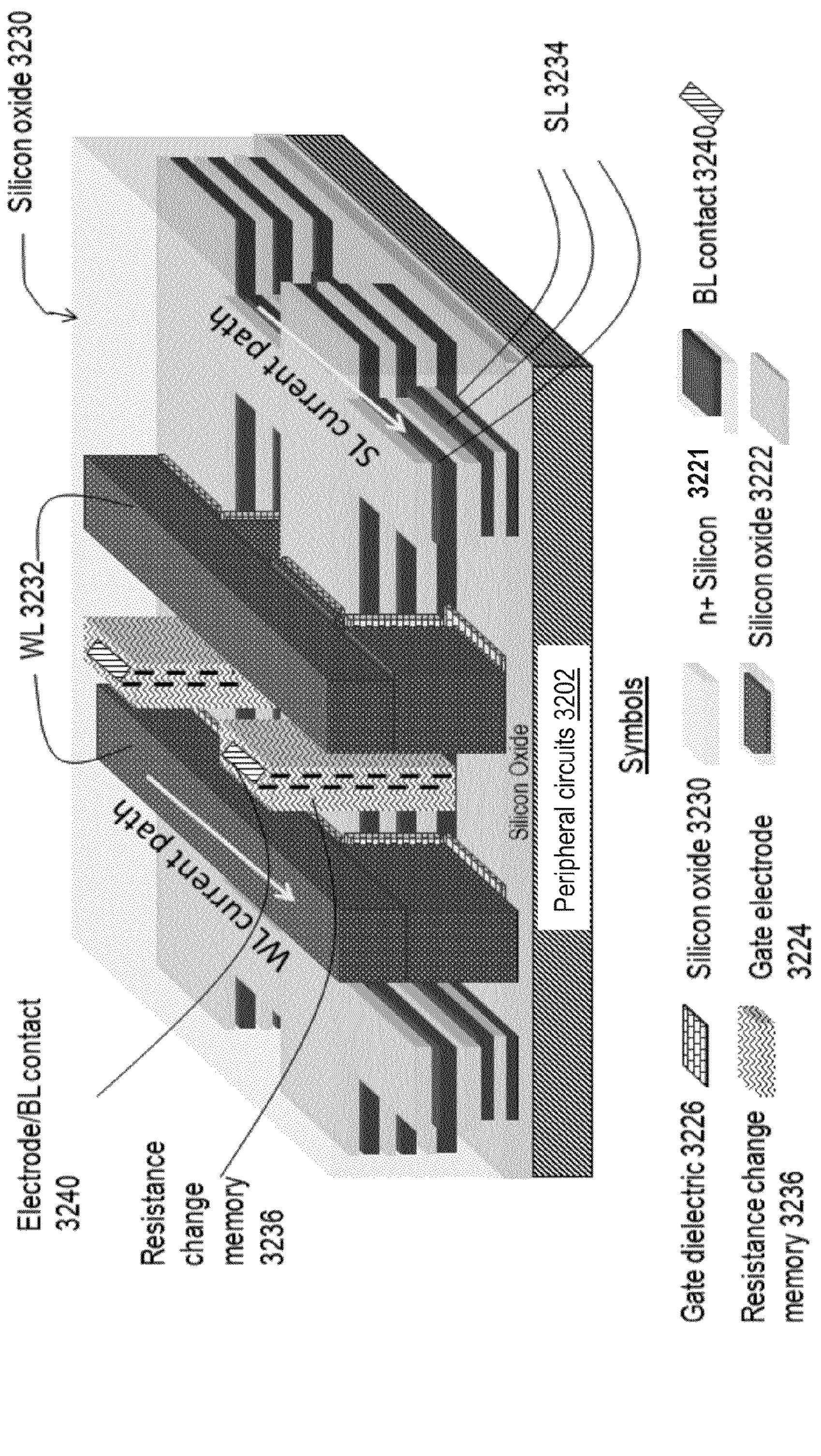

Step (H): FIG. 32H illustrates the structure after Step (H). Vias are etched through multiple layers of silicon and silicon dioxide as shown in the figure. A resistance change memory material 3236 may be then deposited (preferably with atomic layer deposition (ALD)). Examples of such a material include hafnium oxide, well known to change resistance by applying voltage. An electrode for the resistance change memory element may be then deposited (preferably using ALD) and is shown as electrode/BL contact 3240. A CMP process may be then conducted to planarize the surface. It can be observed that multiple resistance change memory elements in series with junction-less transistors are created after this step.

Figure 32I:
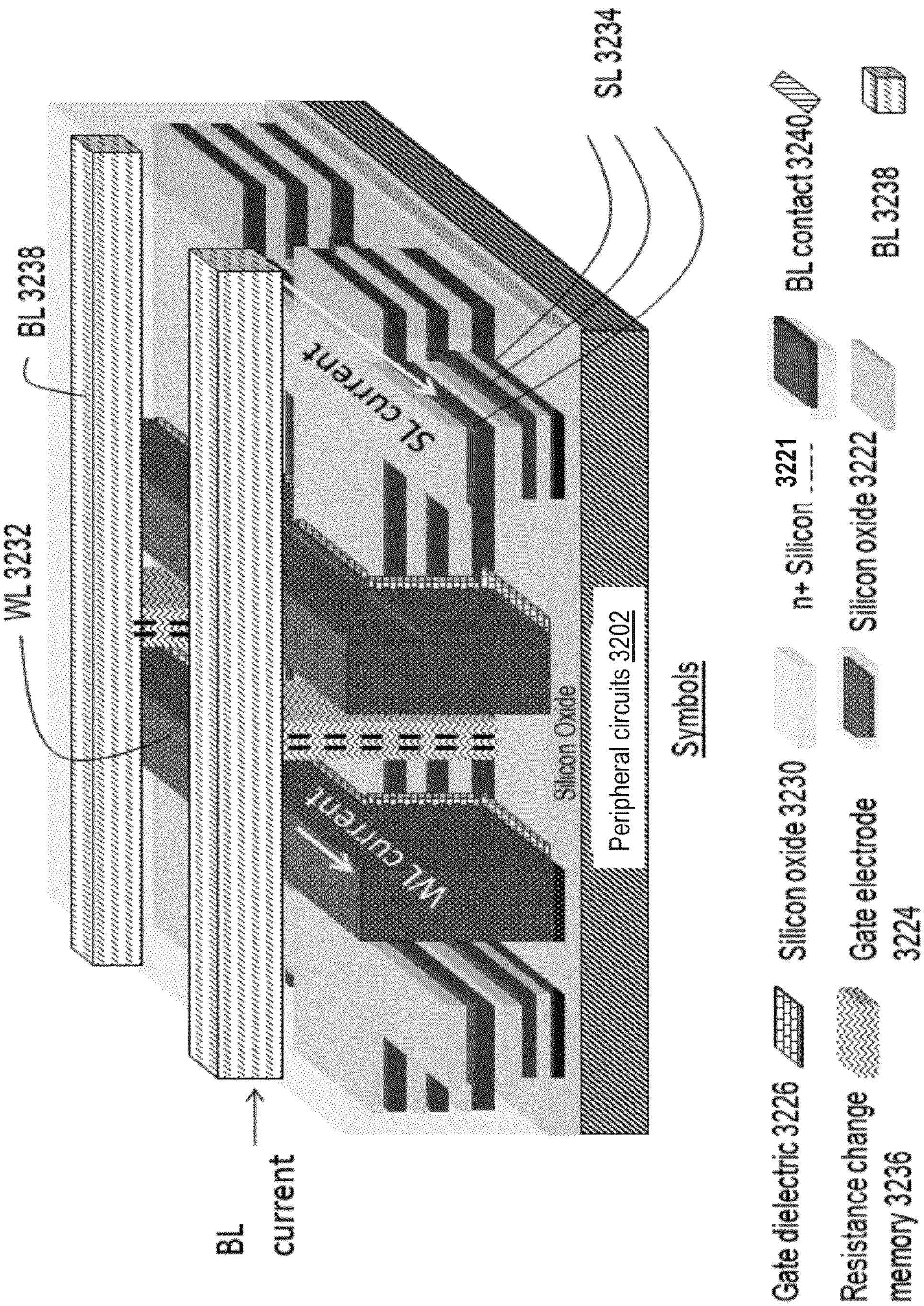

Step (I): FIG. 32I illustrates the structure after Step (I). BLs 3238 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (I) as well.

Figure 32J:
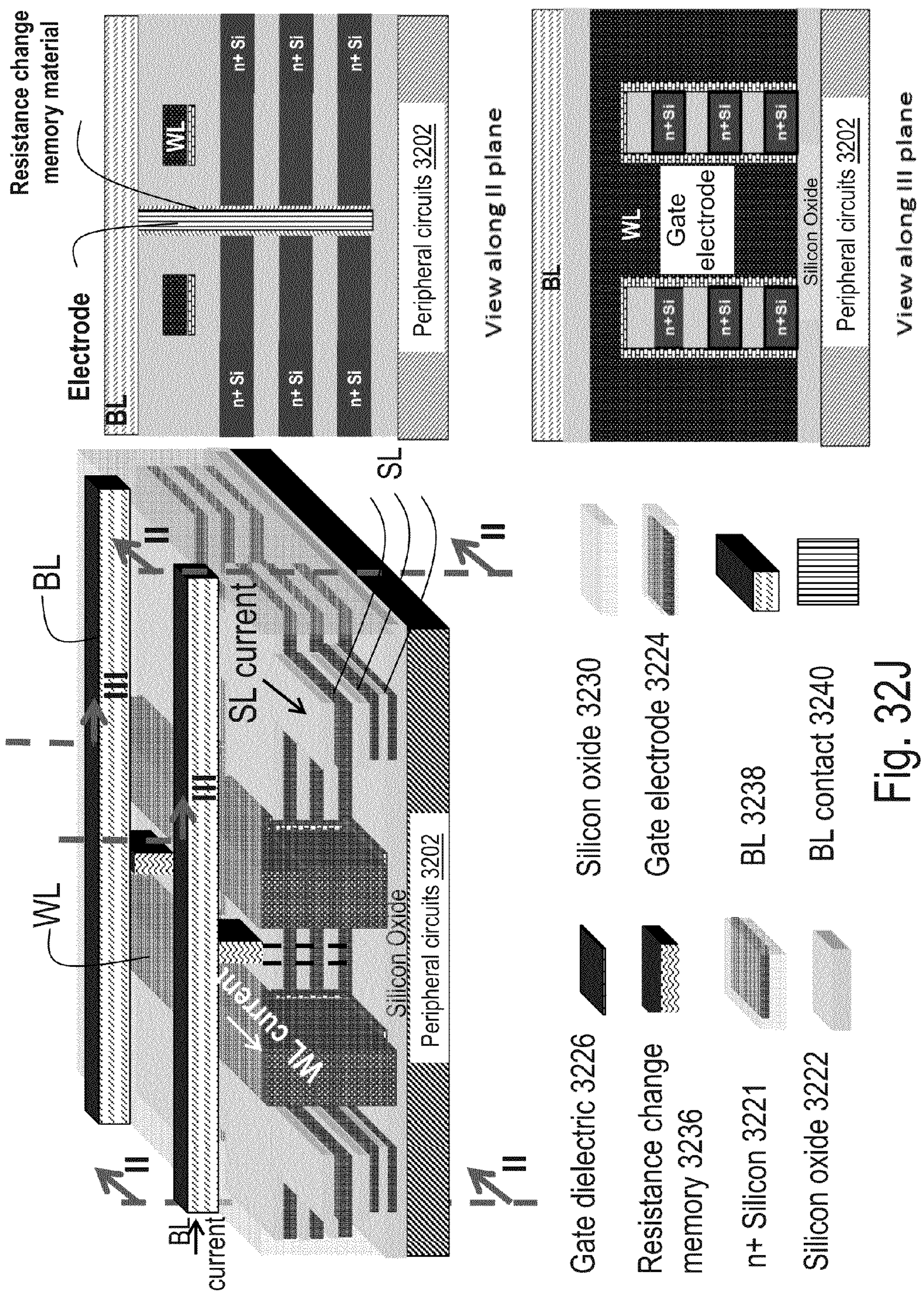

FIG. 32J shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates that are simultaneously deposited over multiple memory layers for transistors, and (4) mono-crystalline (or single-crystal) silicon layers obtained by layer transfer techniques such as ion-cut.

FIG. 33A-K describe an alternative process flow to construct a horizontally-oriented monolithic 3D resistive memory array. This embodiment has a resistance-based memory element in series with a transistor selector. No mask may be utilized on a "per-memory-layer" basis for the monolithic 3D resistance change memory (or resistive memory) concept shown in FIG. 33A-K, and all other masks are shared between different layers. The process flow may include several steps as described in the following sequence.

Figure 33A:
FIG. 33A-K show an alternative zero-mask per layer 3D resistive memory.

Step (A): Peripheral circuits with tungsten wiring 3302 are first constructed and above this oxide layer 3304 may be deposited. FIG. 33A shows a drawing illustration after Step (A).

Figure 33B:
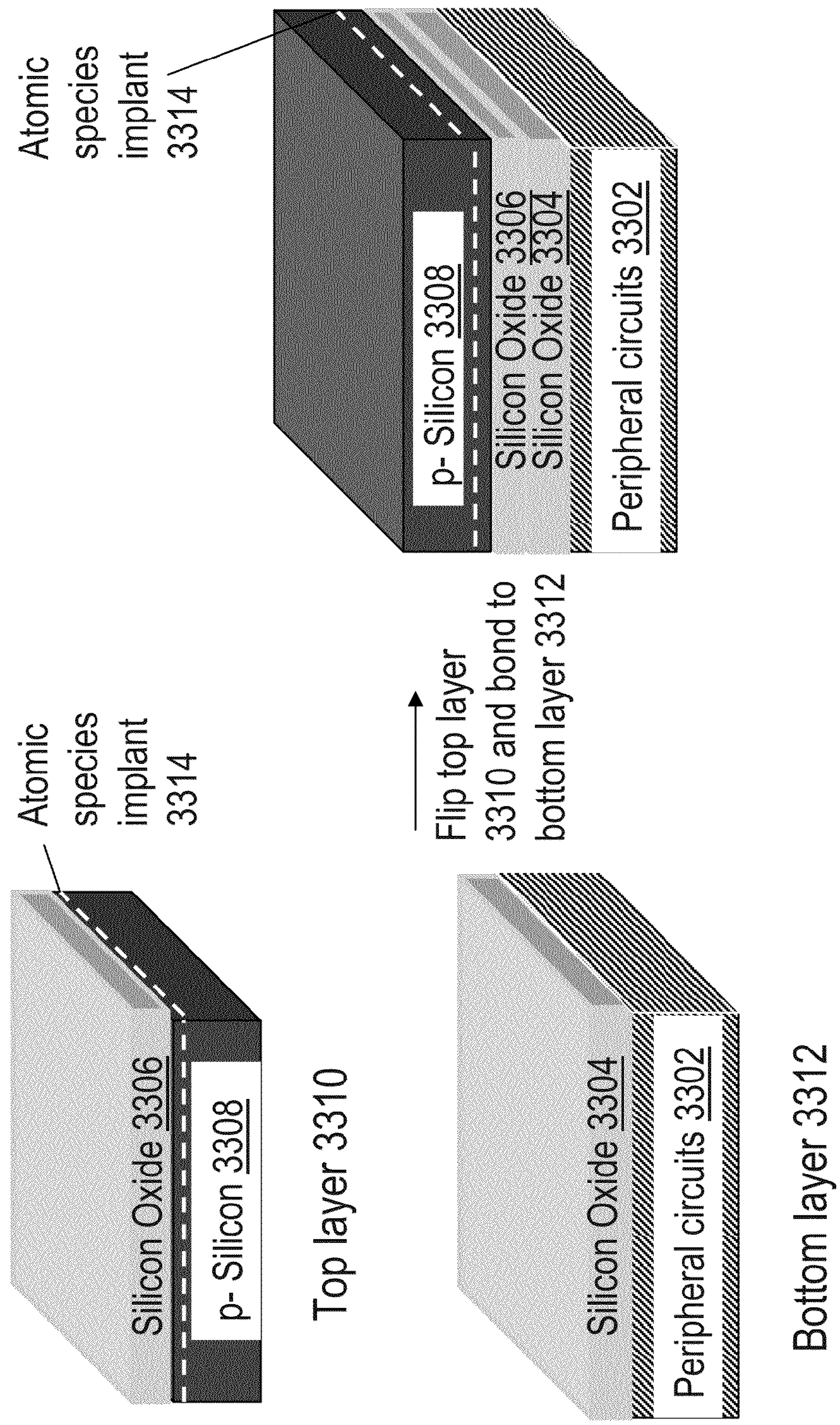

Step (B): FIG. 33B illustrates the structure after Step (B). A p− Silicon wafer 3308 has an oxide layer 3306 grown or deposited above it. A doped and activated layer may be formed in or on p− silicon wafer 3308 by processes such as, for example, implant and RTA or furnace activation, or epitaxial deposition and activation. Following this, hydrogen may be implanted into the p− Silicon wafer at a certain depth indicated by 3314. Alternatively, some other atomic species such as Helium could be (co-)implanted. This hydrogen implanted p− Silicon wafer 3308 forms the top layer 3310. The bottom layer 3312 may include the peripheral circuits 3302 with oxide layer 3304. The top layer 3310 may be flipped and bonded to the bottom layer 3312 using oxide-to-oxide bonding.

Figure 33C:
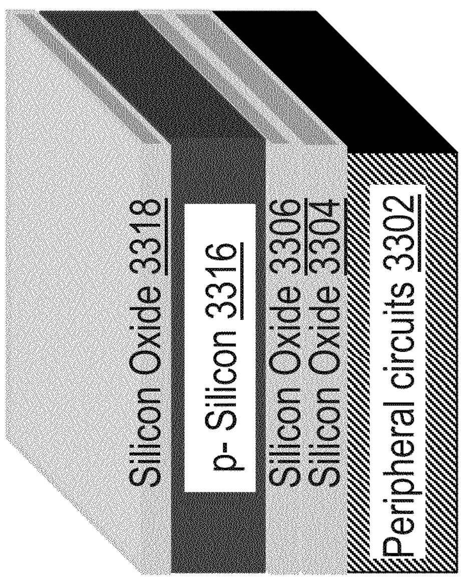

Step (C): FIG. 33C illustrates the structure after Step (C). The stack of top and bottom wafers after Step (B) may be cleaved at the hydrogen plane 3314 using either a anneal or a sideways mechanical force or other means. A CMP process may be then conducted. A layer of silicon oxide 3318 may be then deposited atop the p− Silicon layer 3316. At the end of this step, a single-crystal p− Silicon layer 3316 exists atop the peripheral circuits, and this has been achieved using layer transfer techniques.

Figure 33D:
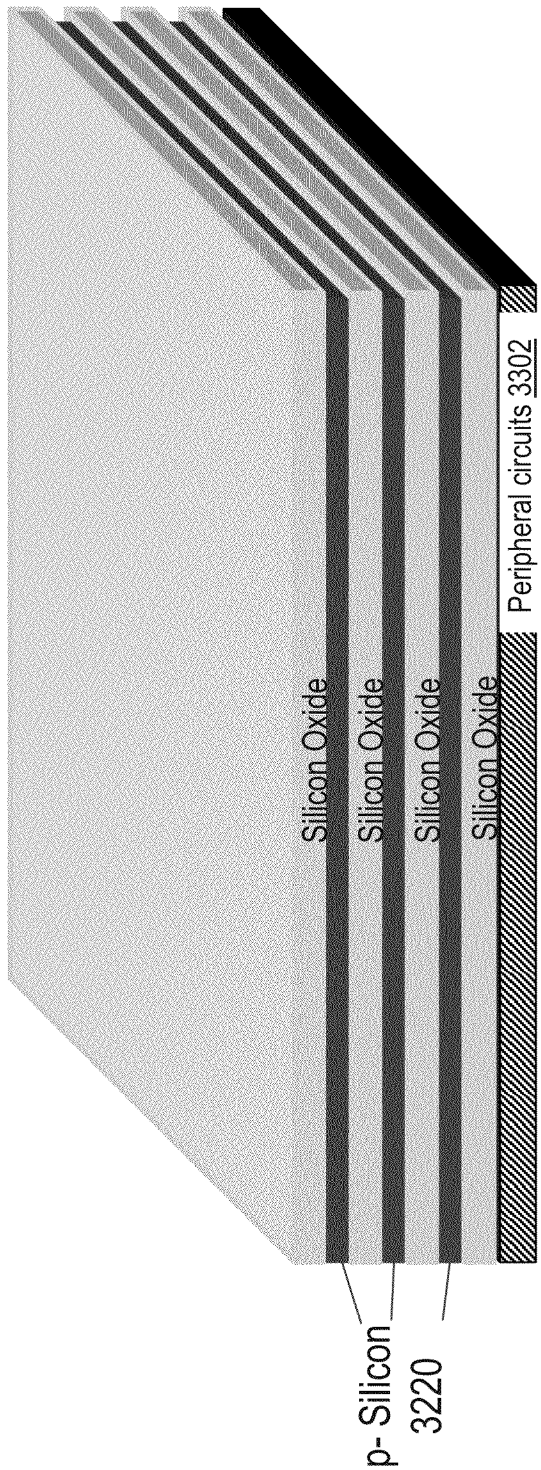

Step (D): FIG. 33D illustrates the structure after Step (D). Using methods similar to Step (B) and (C), multiple p− silicon layers 3320 are formed with silicon oxide layers in between.

Figure 33E:
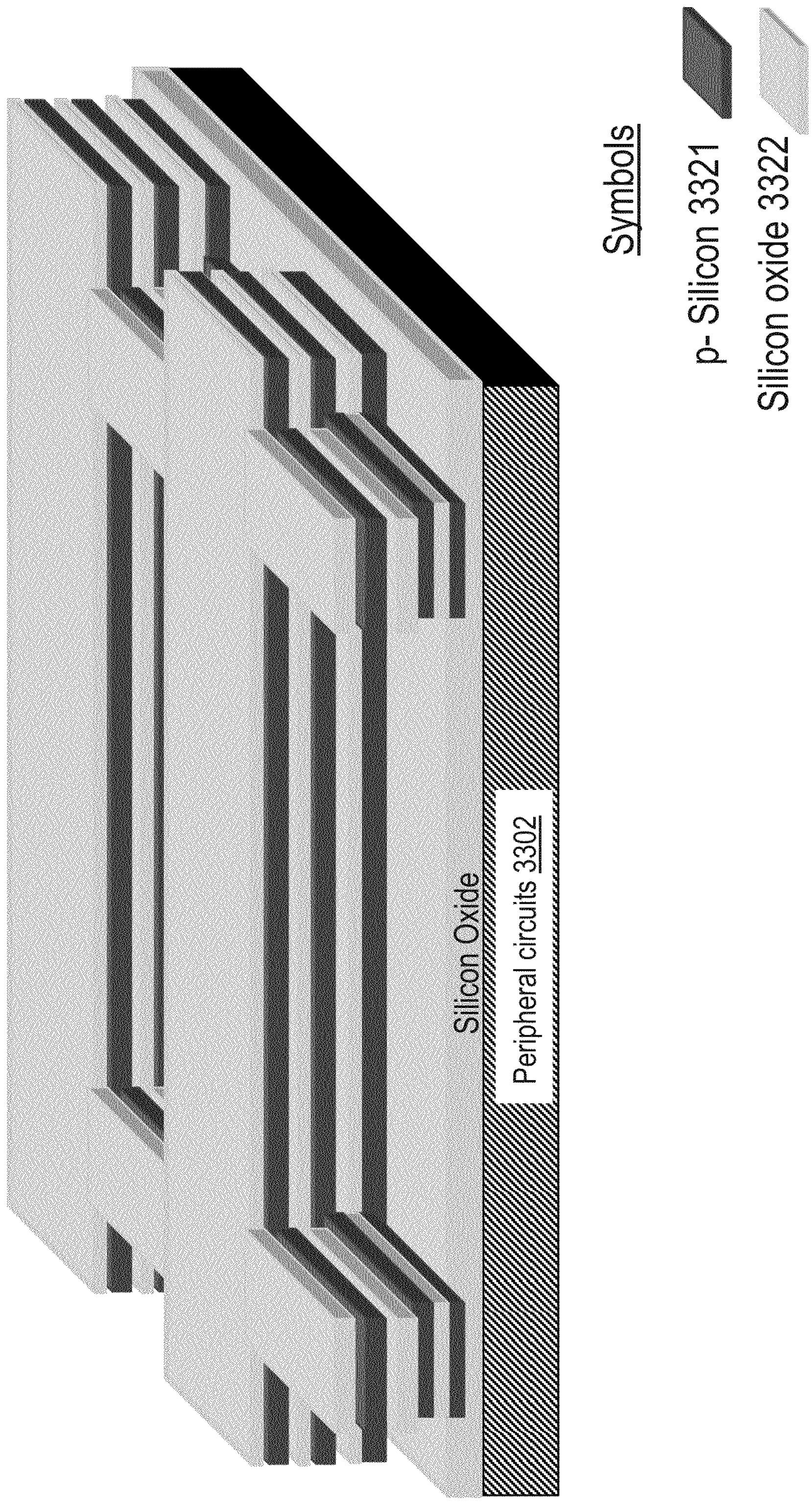

Step (E): FIG. 33E illustrates the structure after Step (E). Lithography and etch processes may then be utilized to make a structure as shown in the figure, including p− silicon layer regions 3321 and silicon oxide layer regions 3322.

Figure 33F:
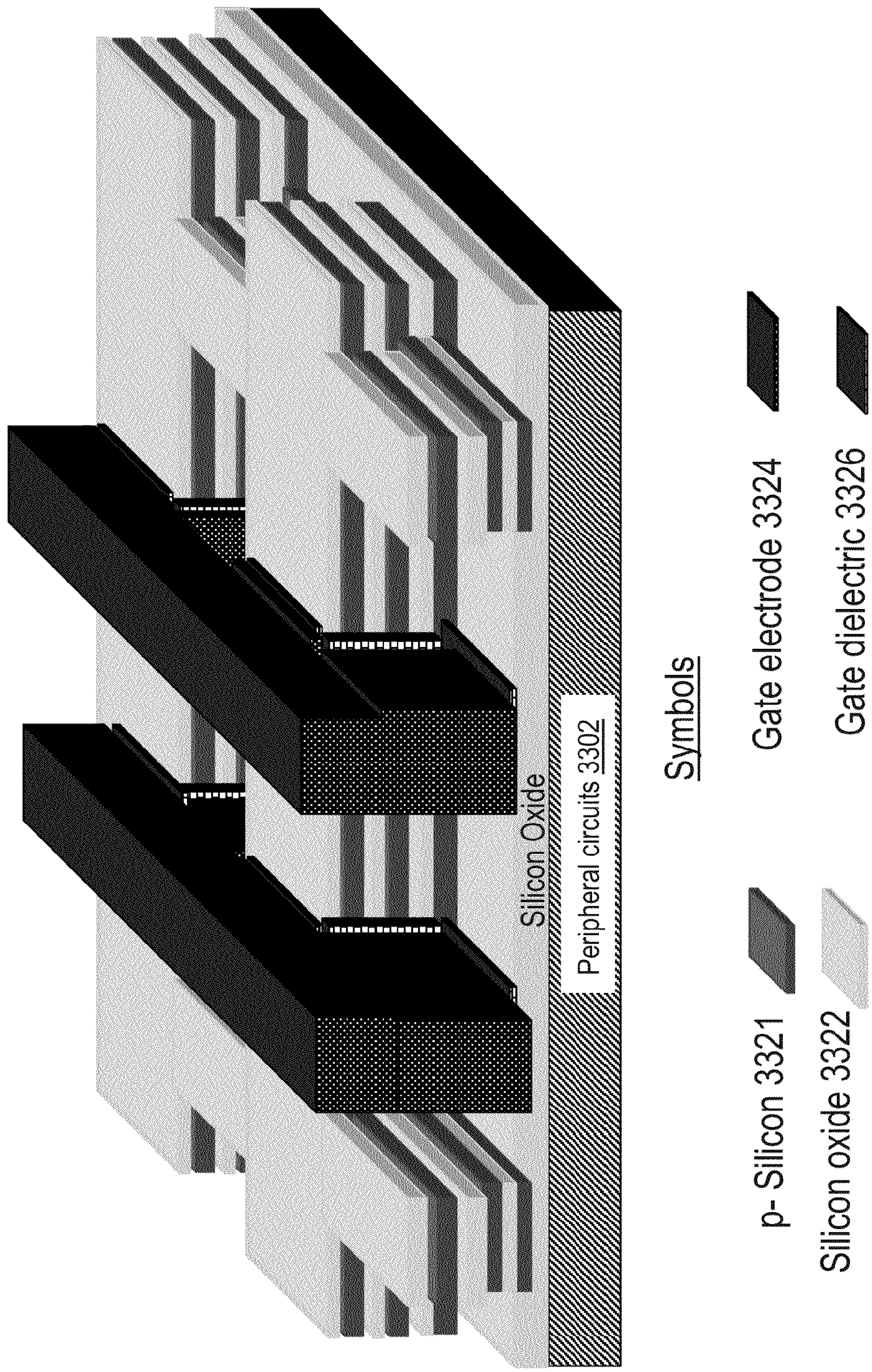

Step (F): FIG. 33F illustrates the structure on after Step (F). Gate dielectric 3326 and gate electrode 3324 are then deposited following which a CMP may be done to planarize the gate electrode 3324 regions. Lithography and etch are utilized to define gate regions.

Figure 33G:
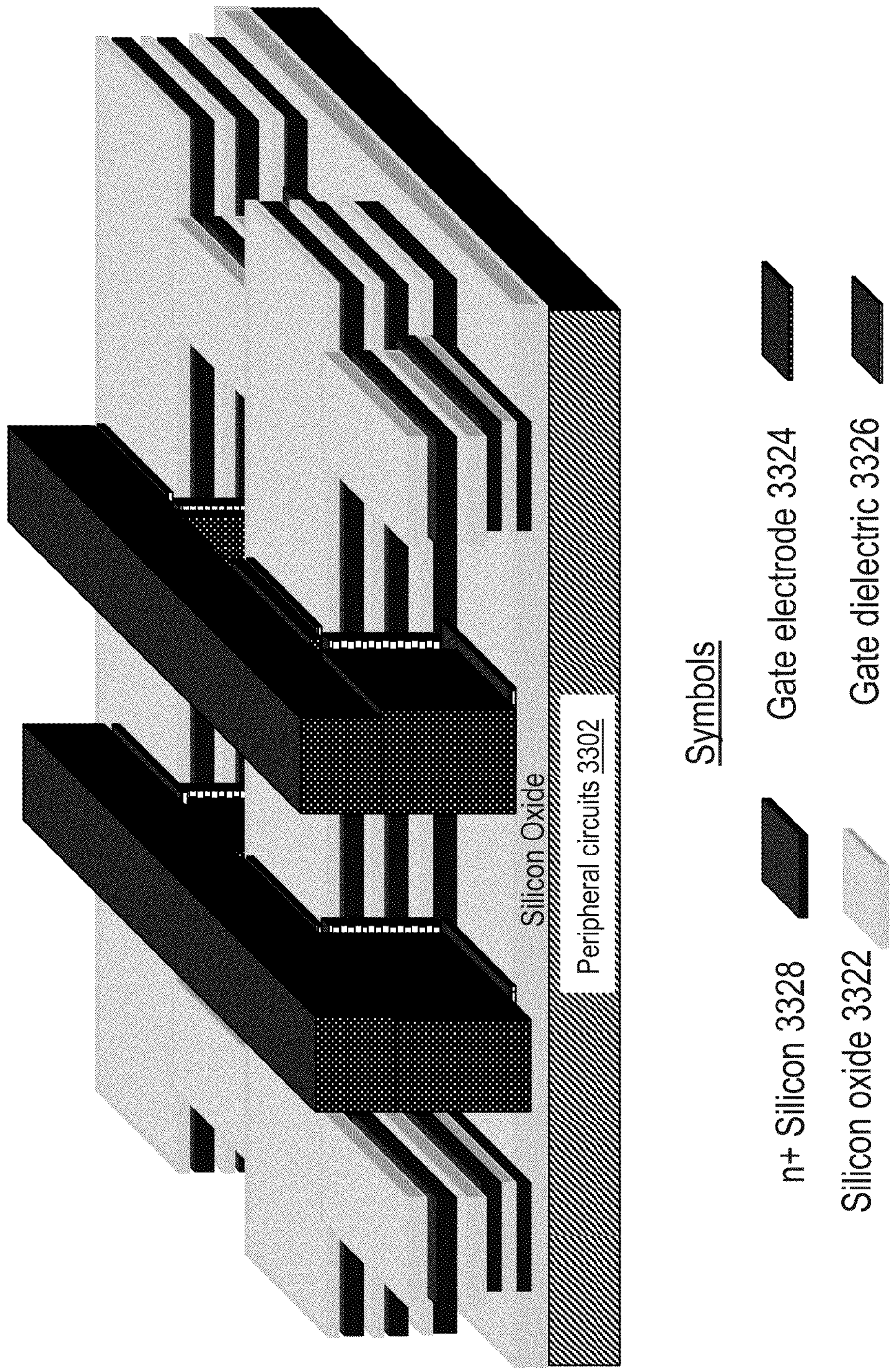

Step (G): FIG. 33G illustrates the structure after Step (G). Using the hard mask defined in Step (F), p− regions not covered by the gate are implanted to form n+ regions. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, may be then conducted to activate n+ doped regions.

Figure 33H:
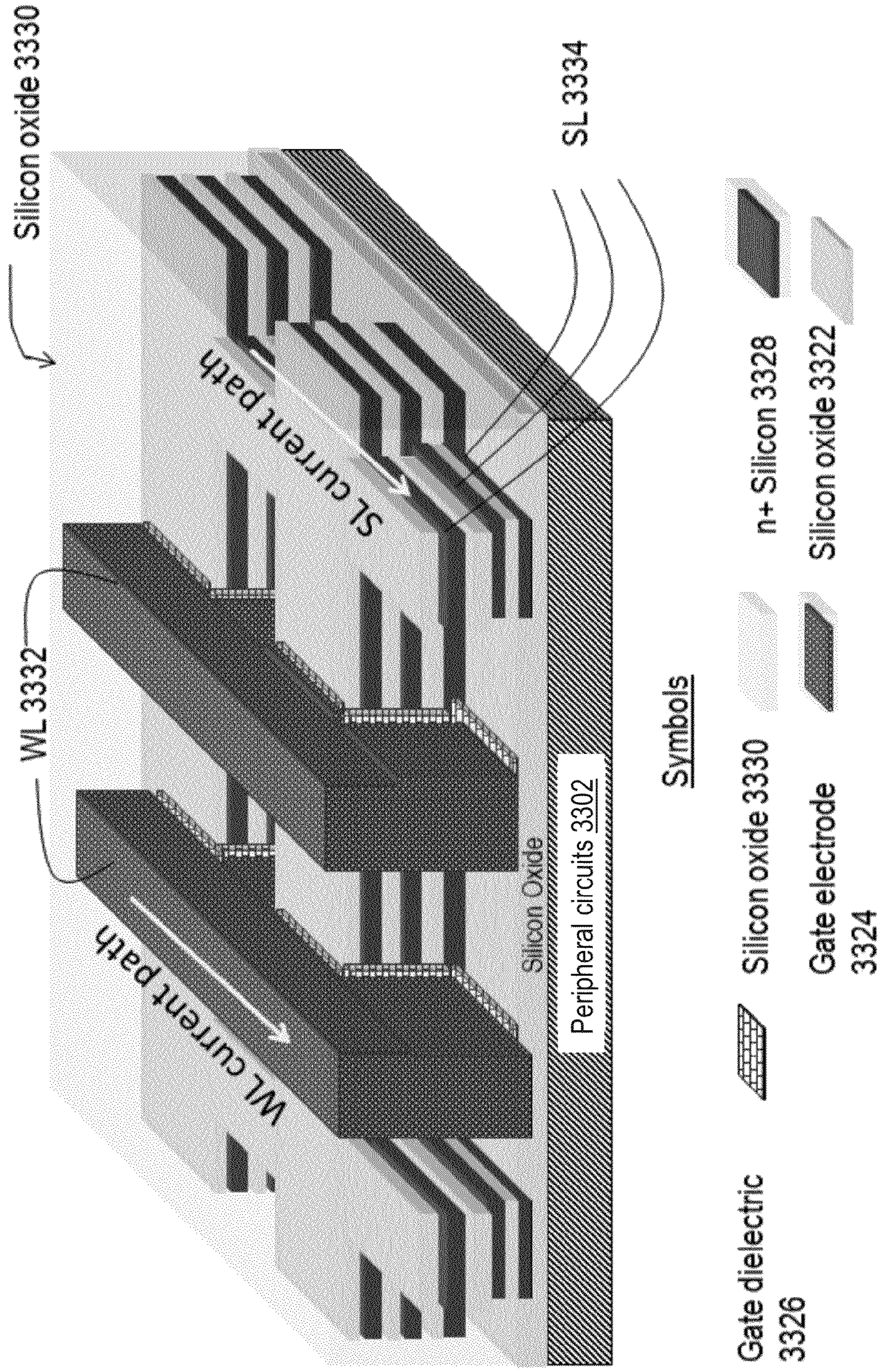

Step (H): FIG. 33H illustrates the structure after Step (H). A silicon oxide layer 3330 may be then deposited and planarized. The silicon oxide layer is shown transparent in the figure for clarity, along with word-line (WL) 3332 and source-line (SL) 3334 regions.

Figure 33I:
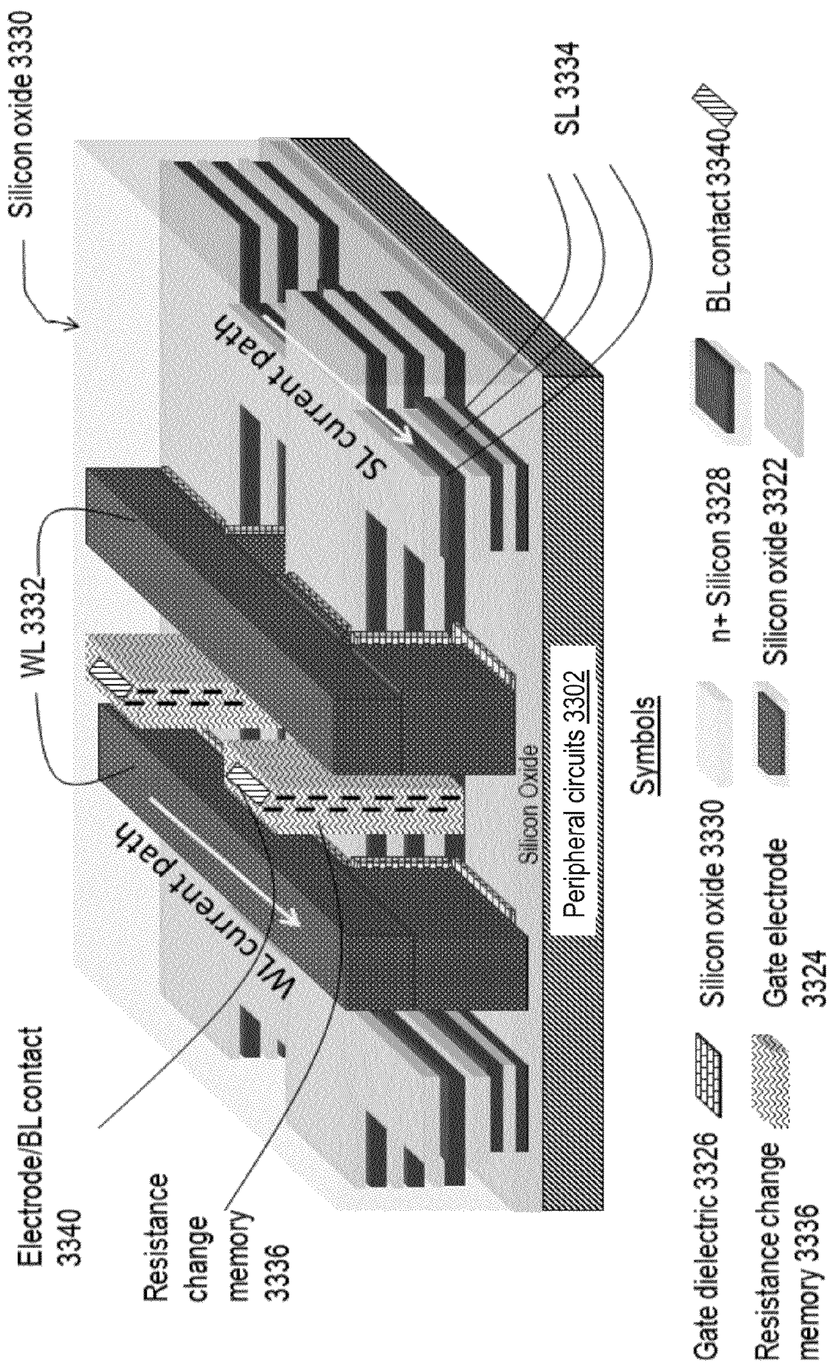

Step (I): FIG. 33I illustrates the structure after Step (I). Vias are etched through multiple layers of silicon and silicon dioxide as shown in the figure. A resistance change memory material 3336 may be then deposited (preferably with atomic layer deposition (ALD)). Examples of such a material include hafnium oxide, which may be well known to change resistance by applying voltage. An electrode for the resistance change memory element may be then deposited (preferably using ALD) and is shown as electrode/BL contact 3340. A CMP process may be then conducted to planarize the surface. It can be observed that multiple resistance change memory elements in series with transistors are created after this step.

Figure 33J:
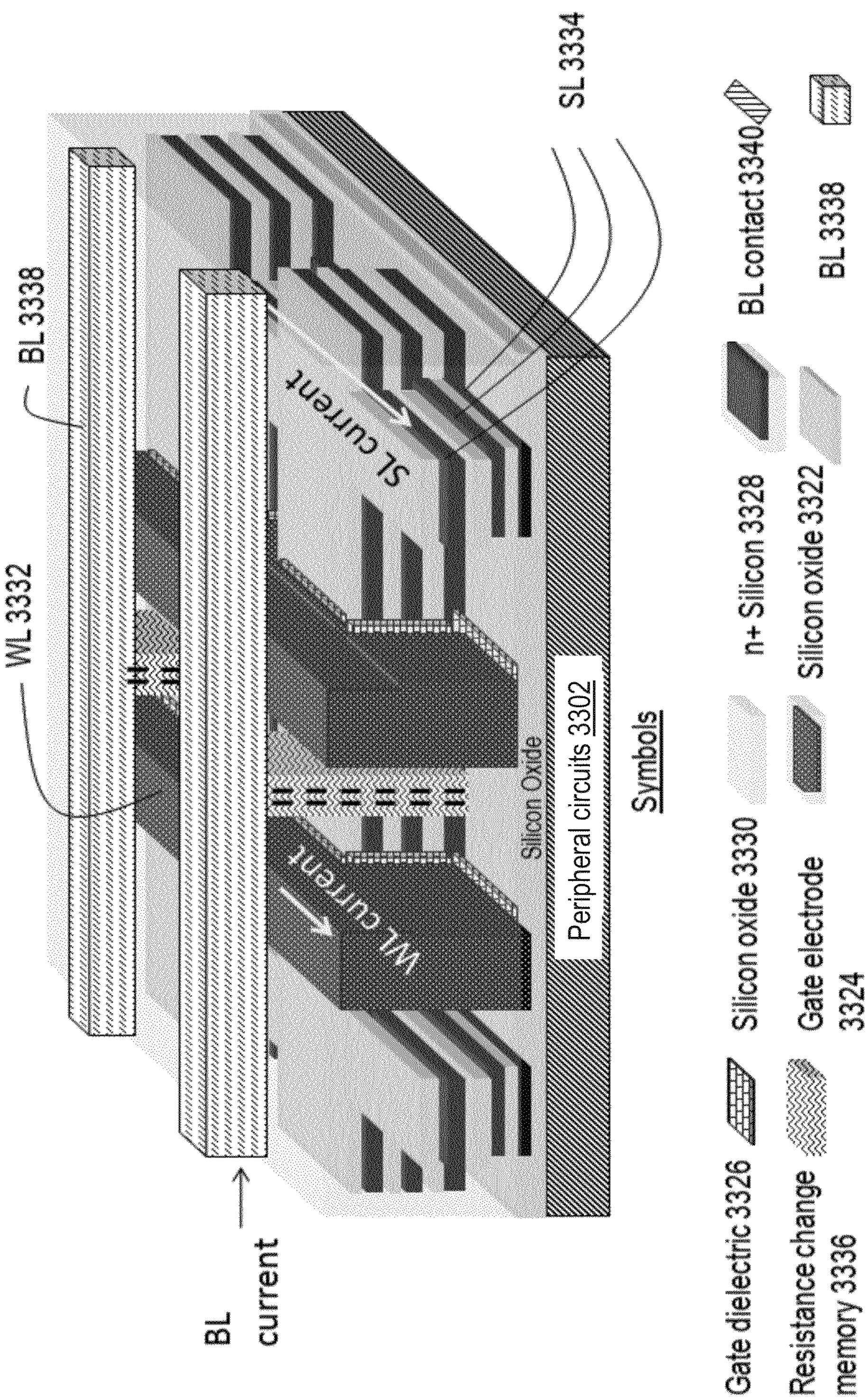

Step (J): FIG. 33J illustrates the structure after Step (J). BLs 3338 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (I) as well.

Figure 33K:
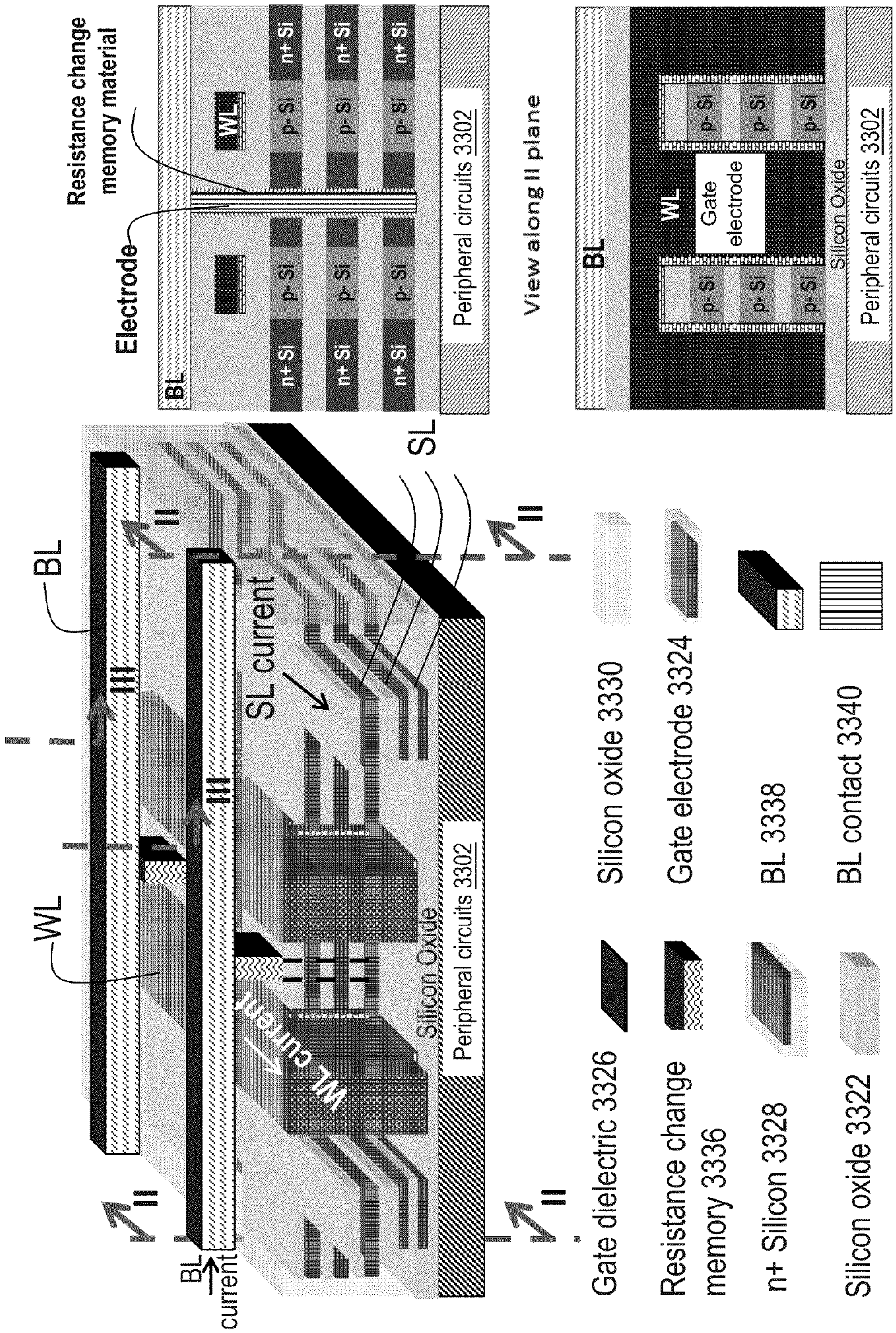

FIG. 33K shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) mono-crystalline (or single-crystal) silicon layers obtained by layer transfer techniques such as ion-cut.

FIG. 34A-L describes an alternative process flow to construct a horizontally-oriented monolithic 3D resistive memory array. This embodiment has a resistance-based memory element in series with a transistor selector. One mask may be utilized on a "per-memory-layer" basis for the monolithic 3D resistance change memory (or resistive memory) concept shown in FIG. 34A-L, and all other masks are shared between different layers. The process flow may include several steps as described in the following sequence.

Figure 34A:
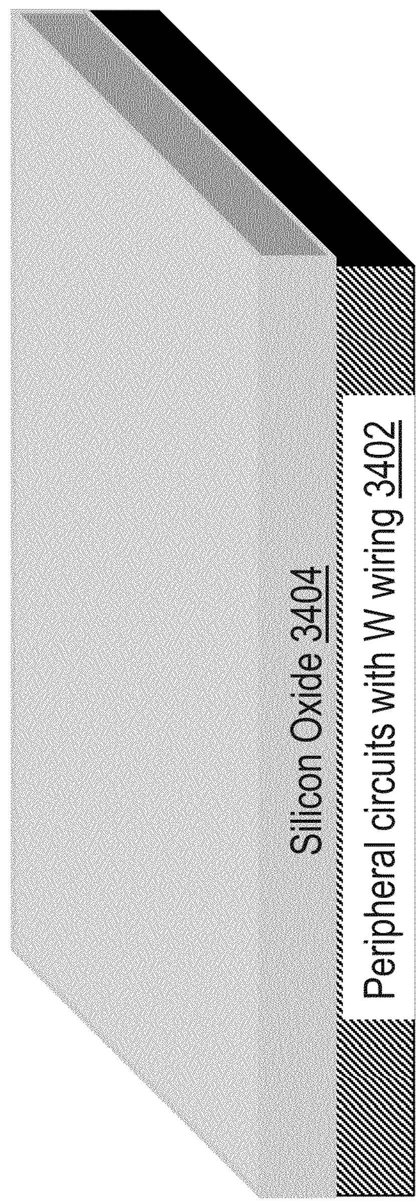
FIG. 34A-L show a one-mask per layer 3D resistive memory.

Step (A): Peripheral circuit layer 3402 with tungsten wiring may be first constructed and above this oxide layer 3404 may be deposited. FIG. 34A illustrates the structure after Step (A).

Figure 34B:
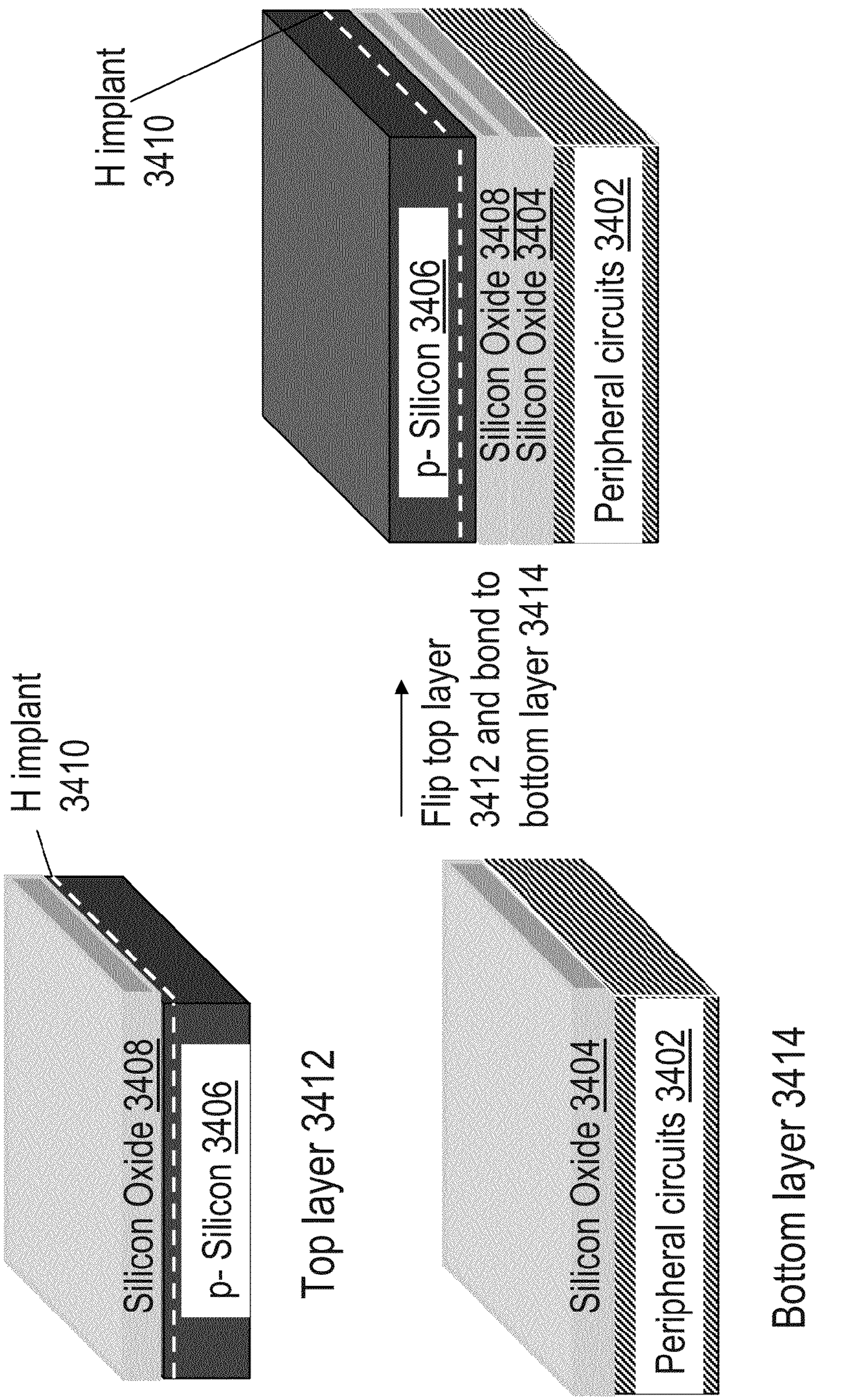

Step (B): FIG. 34B illustrates the structure after Step (B). A p− Silicon wafer 3406 has an oxide layer 3408 grown or deposited above it. A doped and activated layer may be formed in or on p− silicon wafer 3406 by processes such as, for example, implant and RTA or furnace activation, or epitaxial deposition and activation. Following this, hydrogen may be implanted into the p− Silicon wafer at a certain depth indicated by 3410. Alternatively, some other atomic species such as Helium could be (co-)implanted. This hydrogen implanted p− Silicon wafer 3406 forms the top layer 3412. The bottom layer 3414 may include the peripheral circuit layer 3402 with oxide layer 3404. The top layer 3412 may be flipped and bonded to the bottom layer 3414 using oxide-to-oxide bonding.

Figure 34C:
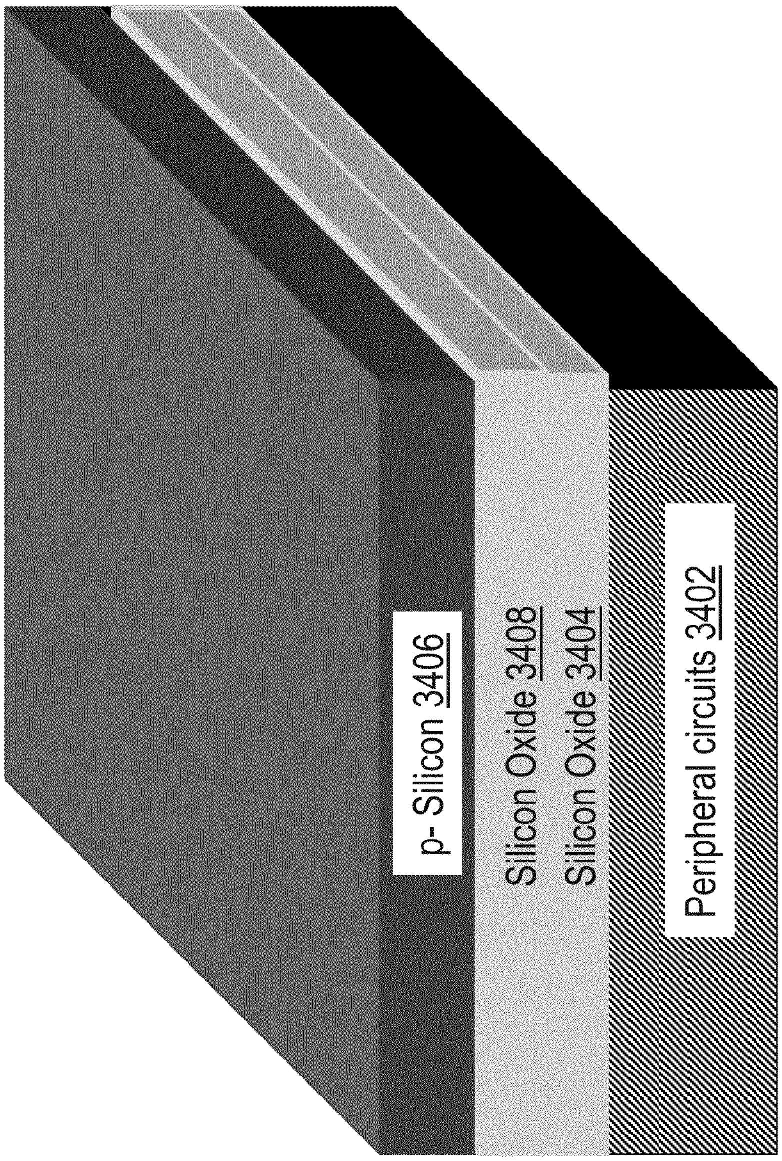

Step (C): FIG. 34C illustrates the structure after Step (C). The stack of top and bottom wafers after Step (B) may be cleaved at the hydrogen plane 3410 using either a anneal or a sideways mechanical force or other means. A CMP process may be then conducted. At the end of this step, a single-crystal p− Si layer exists atop the peripheral circuits, and this has been achieved using layer transfer techniques.

Figure 34D:
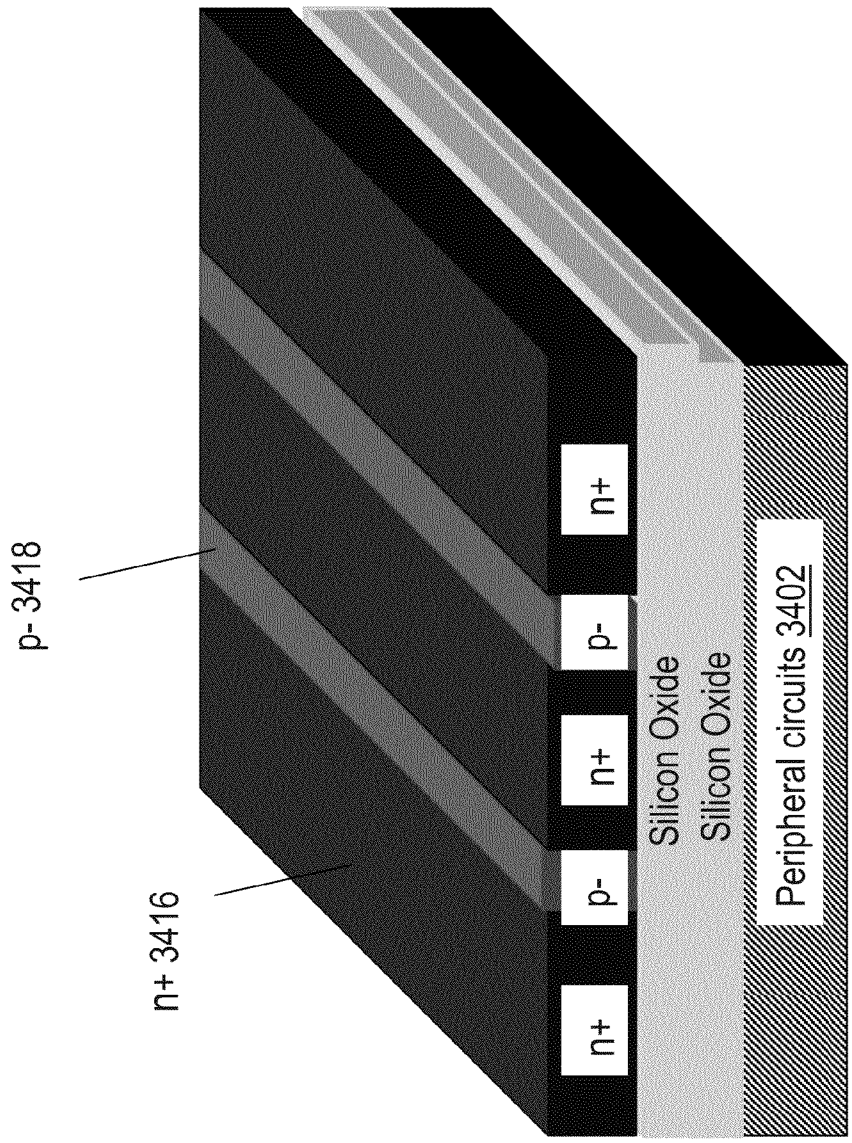

Step (D): FIG. 34D illustrates the structure after Step (D). Using lithography and then implantation, n+ regions 3416 and p− regions 3418 are formed on the transferred layer of p− Si after Step (C).

Figure 34E:
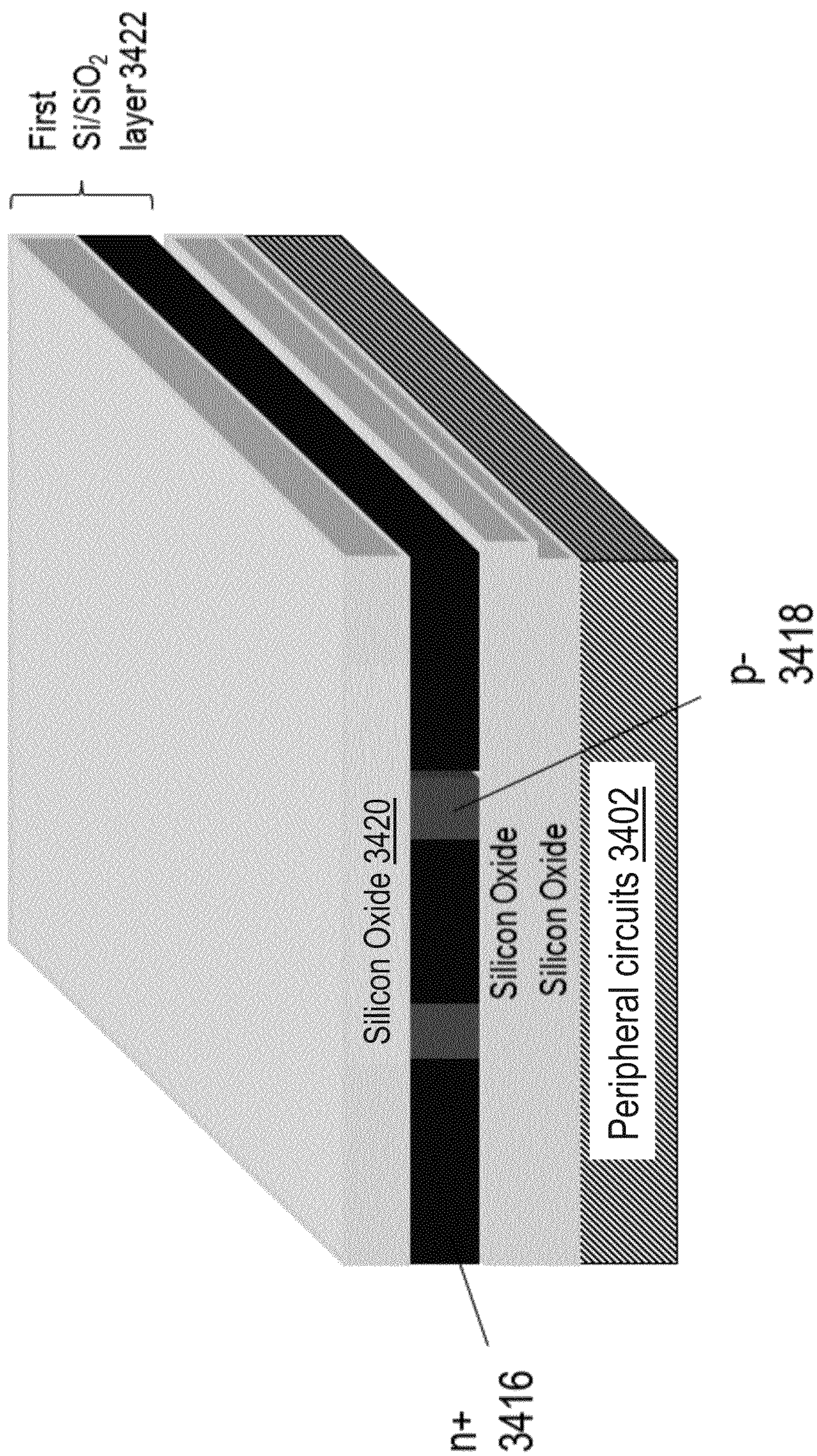

Step (E): FIG. 34E illustrates the structure after Step (E). An oxide layer 3420 may be deposited atop the structure obtained after Step (D). A first layer of $Si/SiO_2$ 3422 may be therefore formed atop the peripheral circuit layer 3402.

Figure 34F:
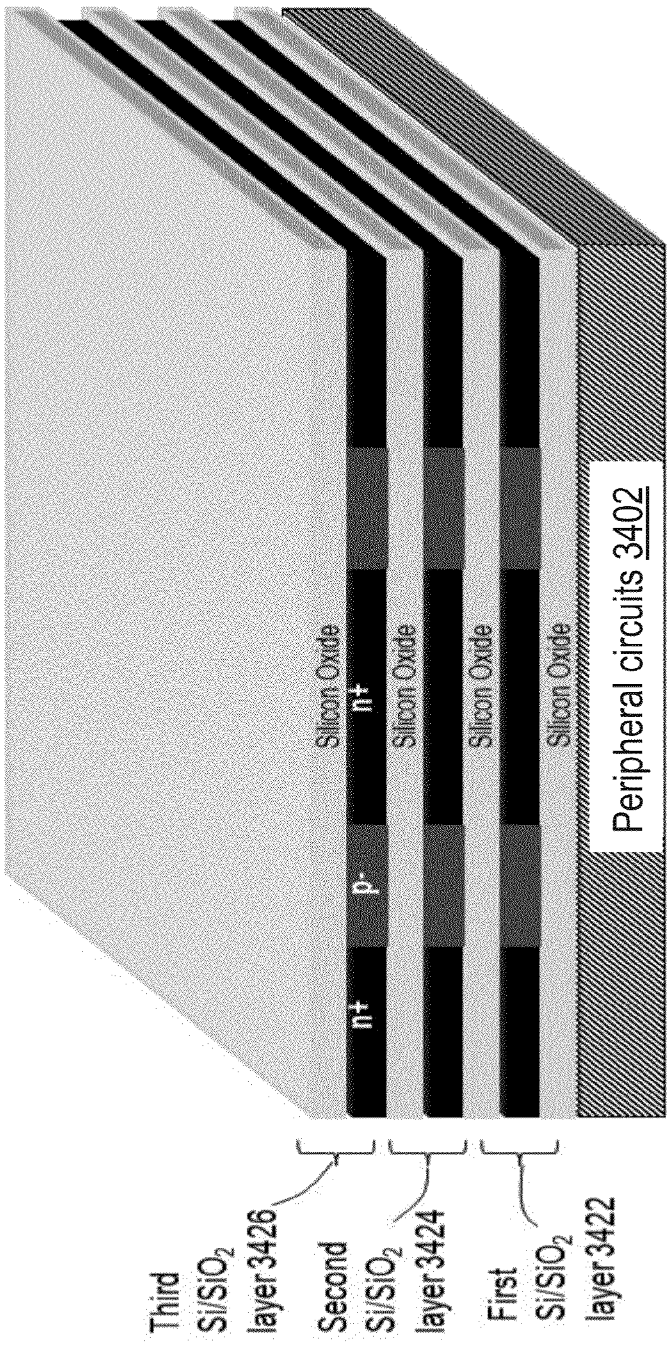

Step (F): FIG. 34F illustrates the structure after Step (F). Using procedures similar to Steps (B)-(E), additional $Si/SiO_2$ layers 3424 and 3426 are formed atop $Si/SiO_2$ layer 3422. A rapid thermal anneal (RTA) or spike anneal or flash anneal or laser anneal may be then done to activate all implanted layers 3422, 3424 and 3426 (and possibly also the peripheral circuit layer 3402). Alternatively, the layers 3422, 3424 and 3426 are annealed layer-by-layer as soon as their implantations are done using a laser anneal system.

Figure 34G:
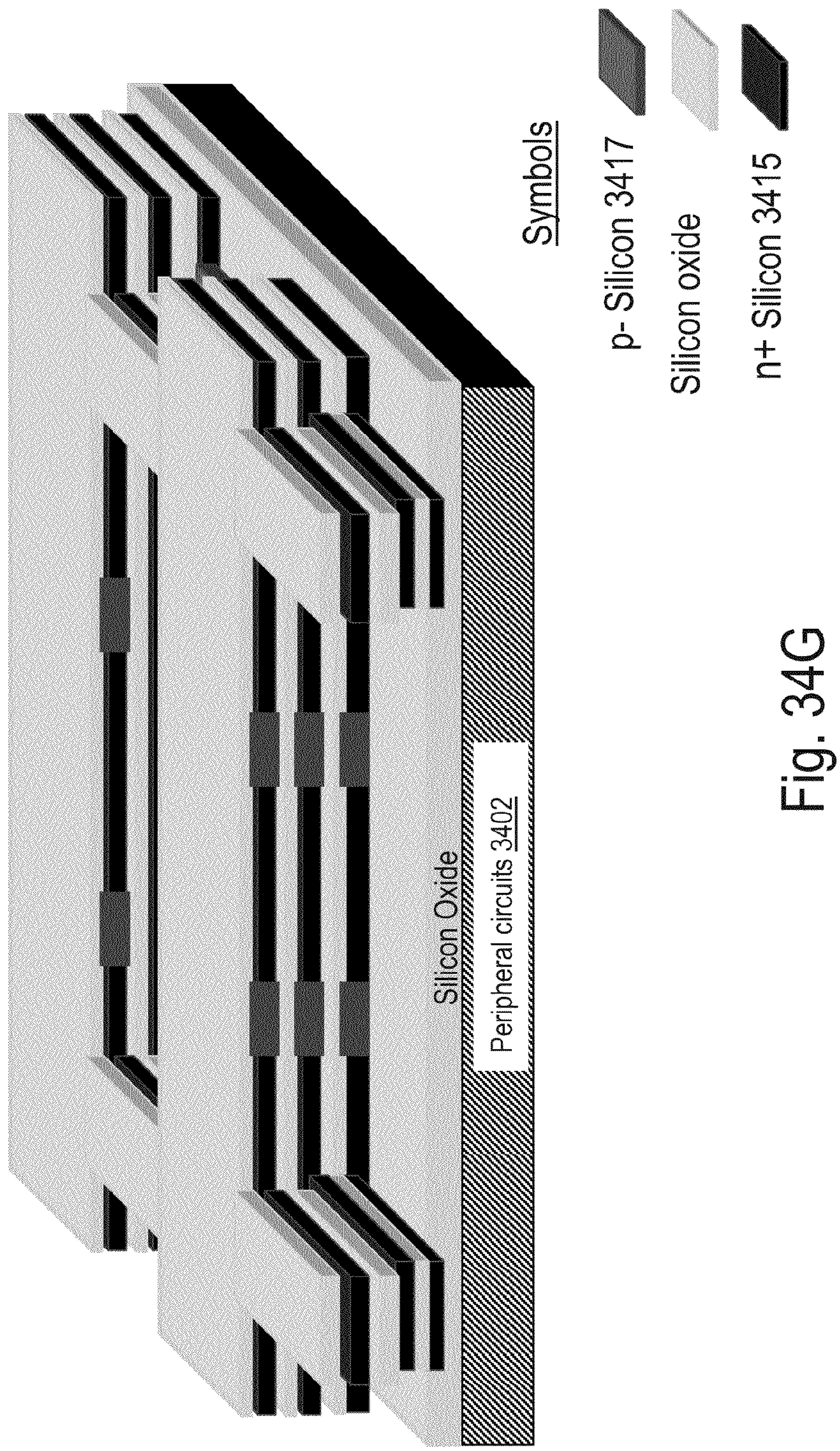

Step (G): FIG. 34G illustrates the structure after Step (G). Lithography and etch processes may then be utilized to make a structure as shown in the figure, including p− silicon regions 3417 and N+ regions 3415.

Figure 34H:
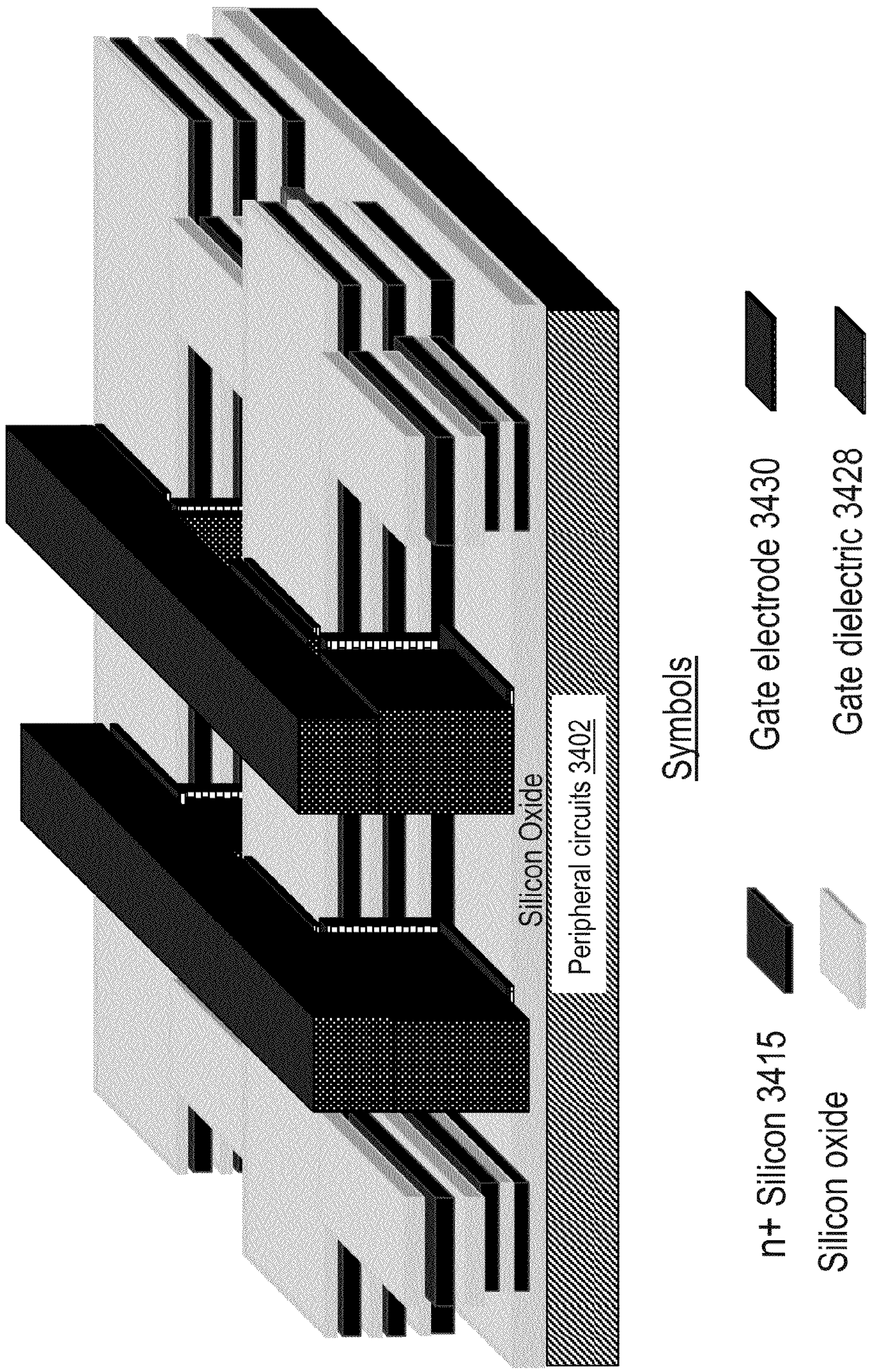

Step (H): FIG. 34H illustrates the structure after Step (H). Gate dielectric 3428 and gate electrode 3430 are then deposited following which a CMP may be done to planarize the gate electrode 3430 regions. Lithography and etch are utilized to define gate regions over the p− silicon regions (eg. p− Si region 3418 after Step (D)). Note that gate width could be slightly larger than p− region width to compensate for overlay errors in lithography.

Figure 34I:
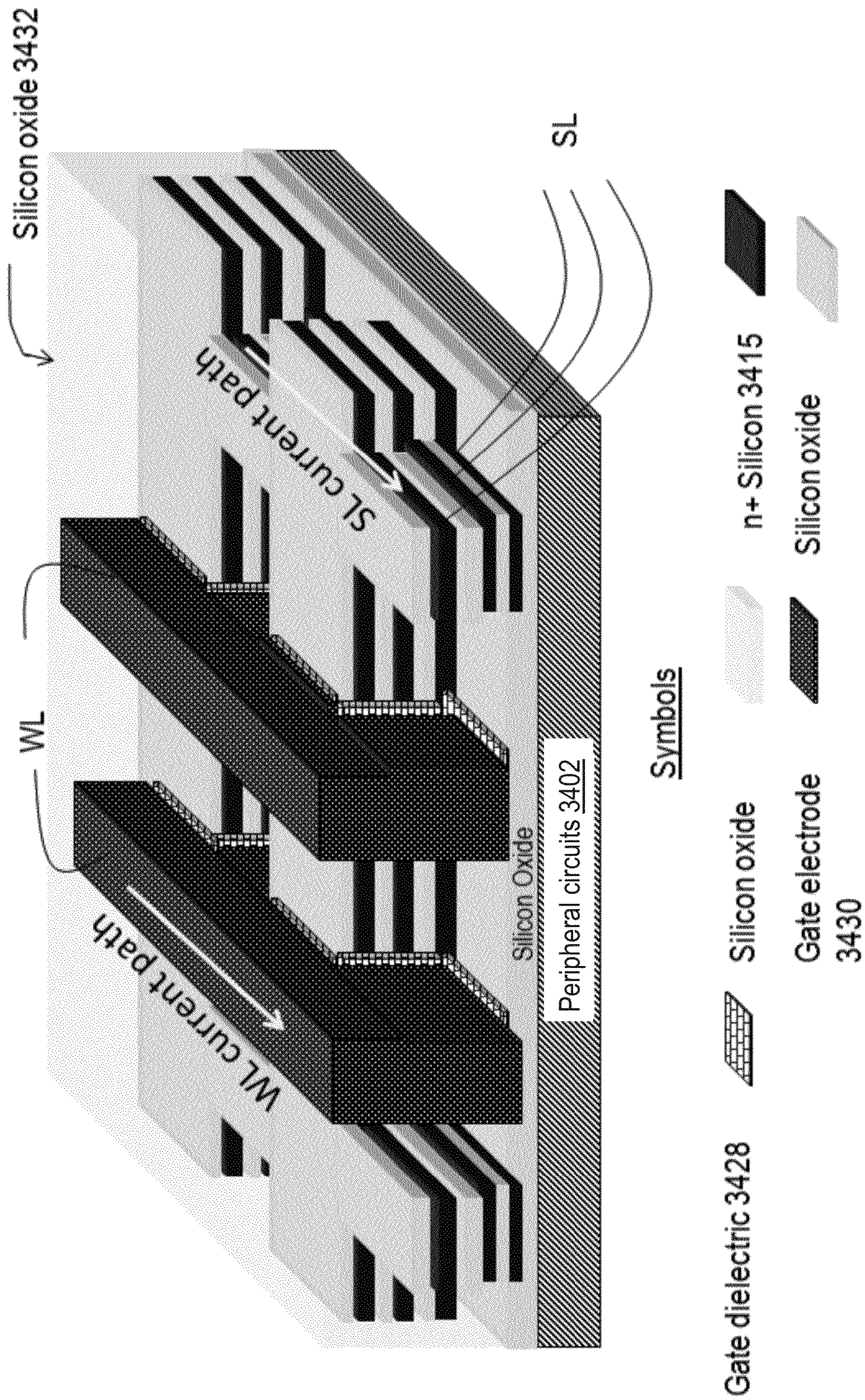

Step (I): FIG. 34I illustrates the structure after Step (I). A silicon oxide layer 3432 may be then deposited and planarized. It is shown transparent in the figure for clarity. Word-line (WL) and Source-line (SL) regions are shown in the figure.

Figure 34J:
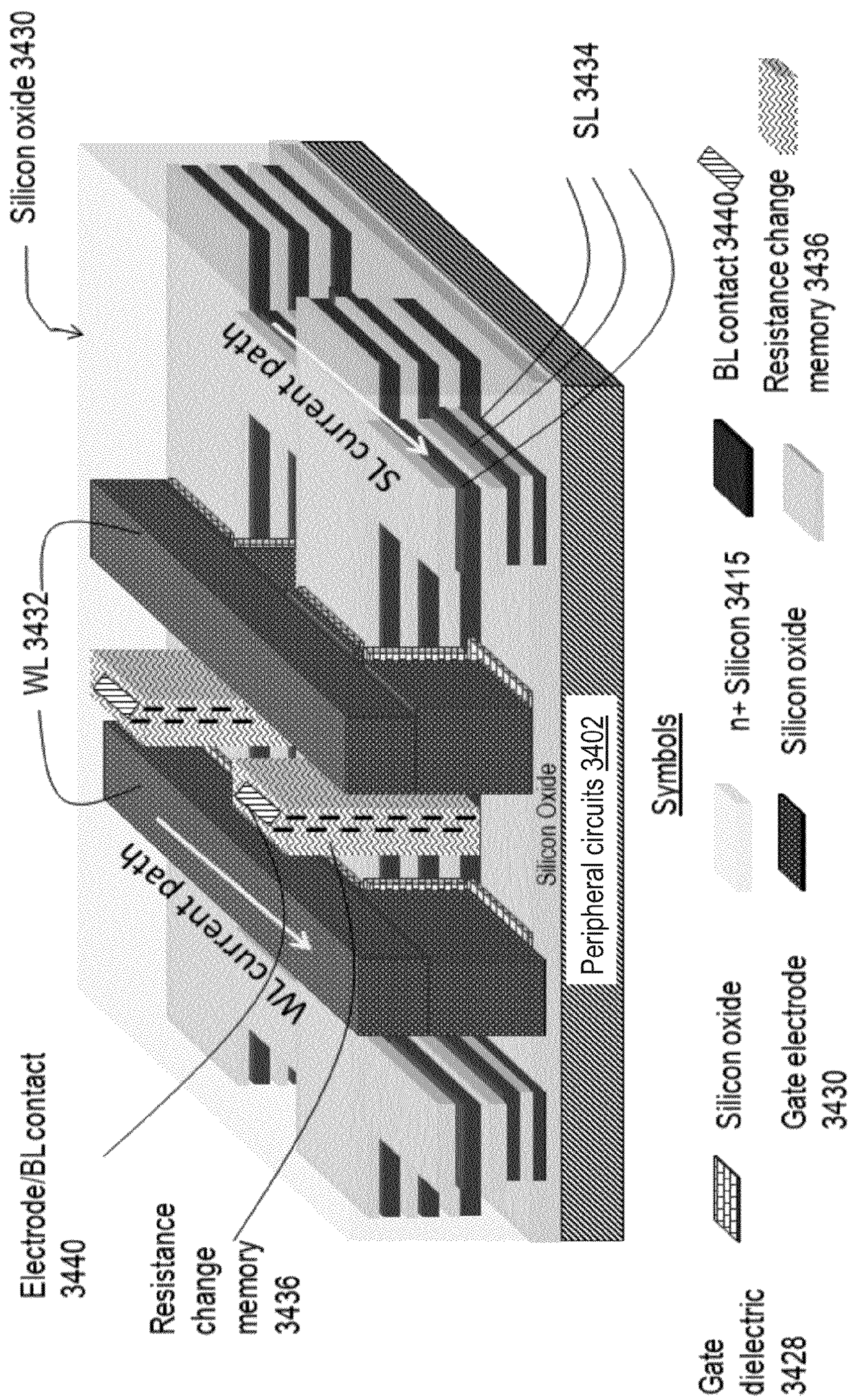

Step (J): FIG. 34J illustrates the structure after Step (J). Vias are etched through multiple layers of silicon and silicon dioxide as shown in the figure. A resistance change memory material 3436 may be then deposited (preferably with atomic layer deposition (ALD)). Examples of such a material include hafnium oxide, which is well known to change resistance by applying voltage. An electrode for the resistance change memory element may be then deposited (preferably using ALD) and is shown as electrode/BL contact 3440. A CMP process may be then conducted to planarize the surface. It can be observed that multiple resistance change memory elements in series with transistors are created after this step.

Figure 34K:
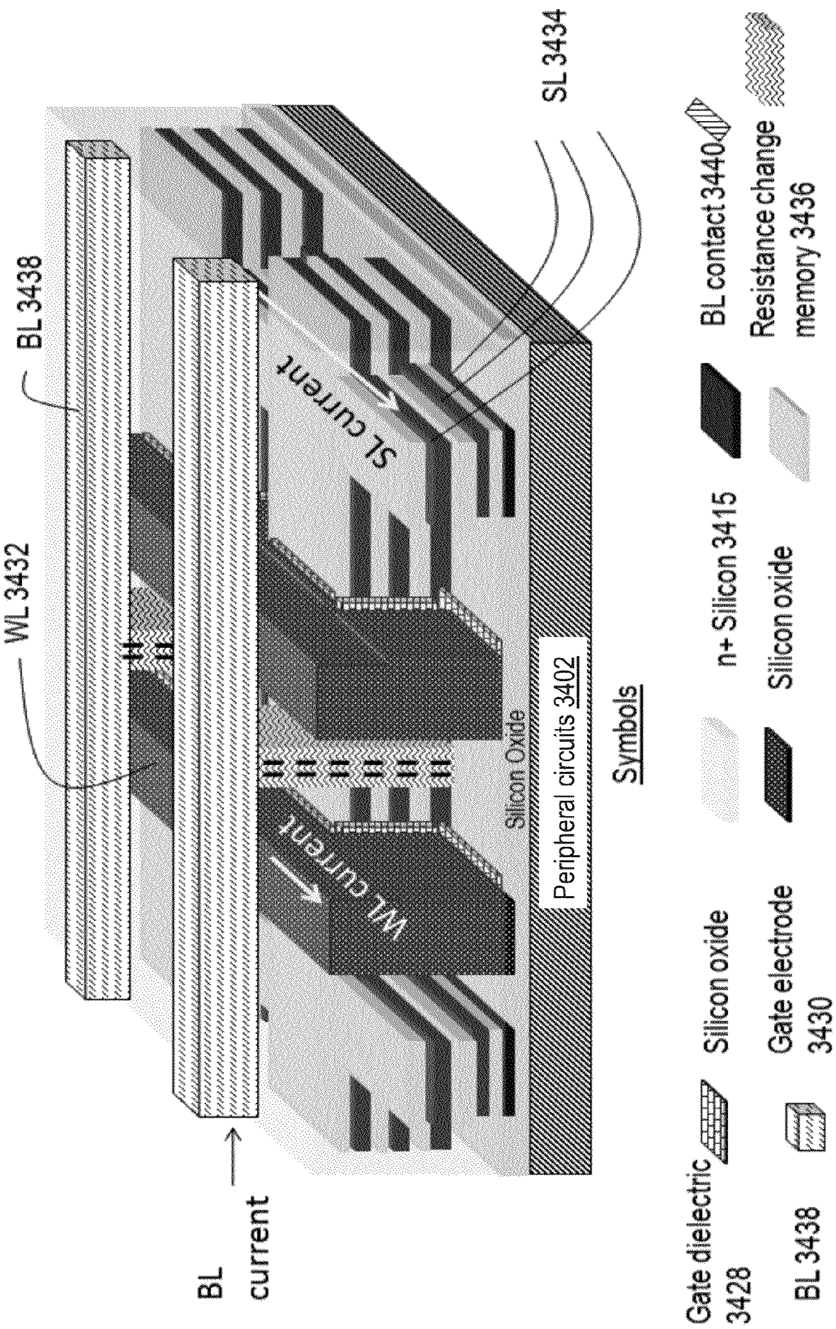

Step (K): FIG. 34K illustrates the structure after Step (K). BLs 3438 may be constructed. Contacts may be made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (J) as well.

Figure 34L:
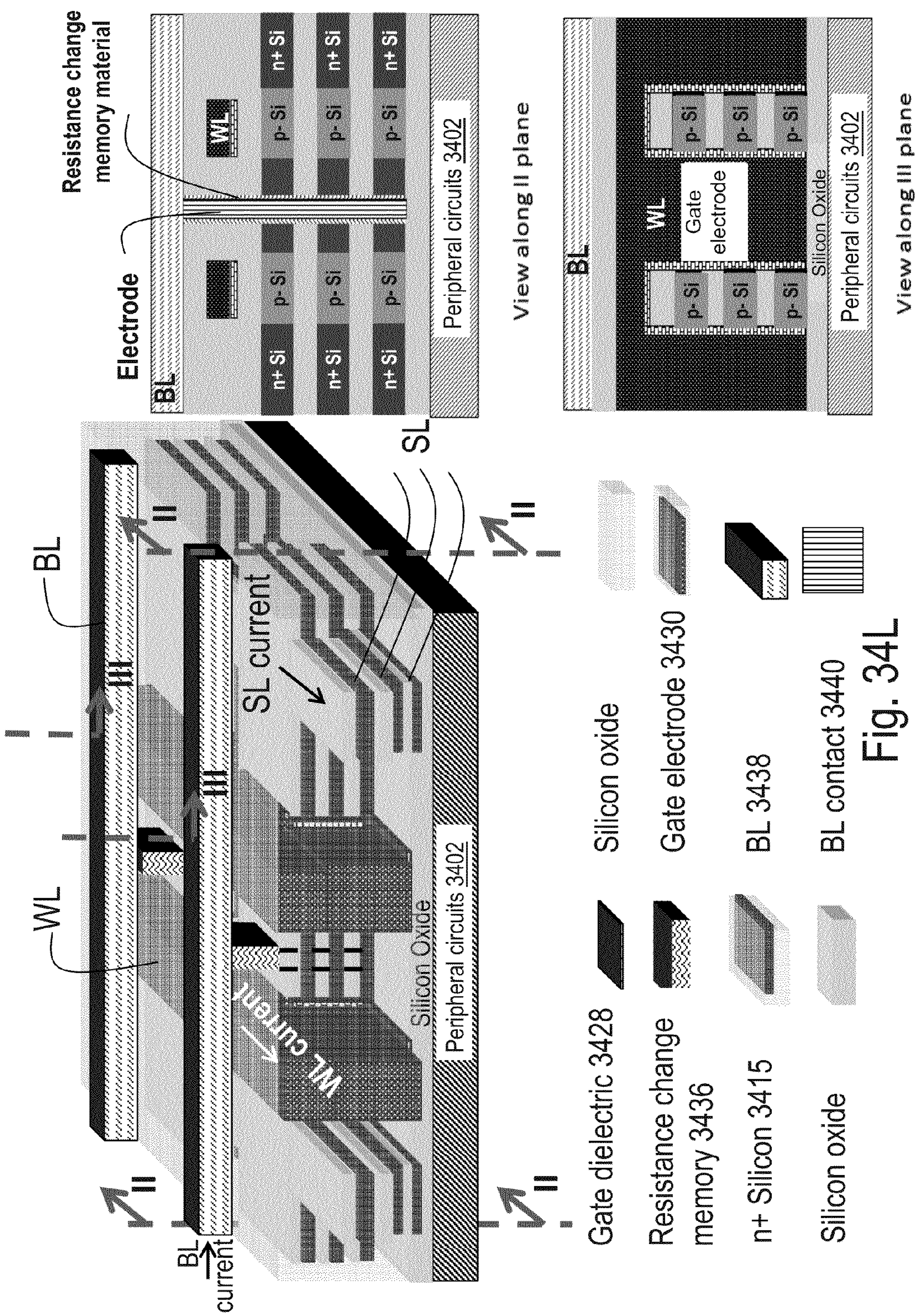

FIG. 34L shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates simultaneously deposited over multiple memory layers for transistors, and (4) mono-crystalline (or single-crystal) silicon layers obtained by layer transfer techniques such as ion-cut.

FIG. 35A-F describes an alternative process flow to construct a horizontally-oriented monolithic 3D resistive memory array. This embodiment has a resistance-based memory element in series with a transistor selector. Two masks are utilized on a "per-memory-layer" basis for the monolithic 3D resistance change memory (or resistive memory) concept shown in FIG. 35A-F, and all other masks are shared between different layers. The process flow may include several steps as described in the following sequence.

Figure 35A:
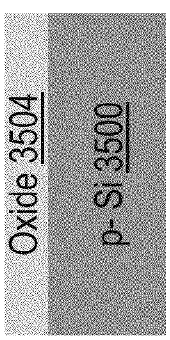
FIG. 35A-F show a two-mask per layer 3D resistive memory.

Step (A): The process flow starts with a p− silicon wafer 3500 with an oxide coating 3504. A doped and activated layer may be formed in or on p− silicon wafer 3500 by processes such as, for example, implant and RTA or furnace activation, or epitaxial deposition and activation. FIG. 35A illustrates the structure after Step (A).

Figure 35B:
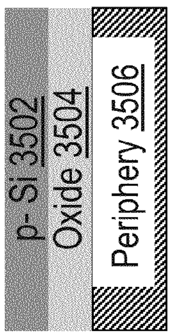

Step (B): FIG. 35B illustrates the structure after Step (B). Using a process flow similar to FIG. 2, portion of p− silicon wafer 3500, p− silicon layer 3502, may be transferred atop a layer of peripheral circuits 3506. The peripheral circuits 3506 preferably use tungsten wiring.

Figure 35C:
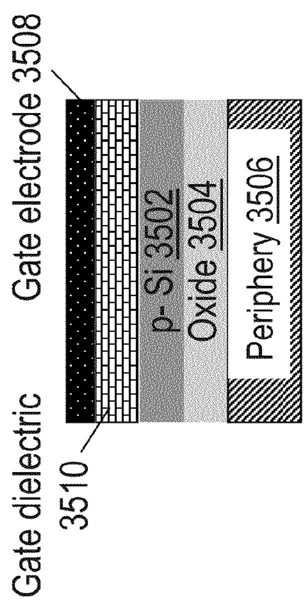

Step (C): FIG. 35C illustrates the structure after Step (C). Isolation regions for transistors are formed using a shallow-trench-isolation (STI) process. Following this, a gate dielectric 3510 and a gate electrode 3508 are deposited.

Figure 35D:
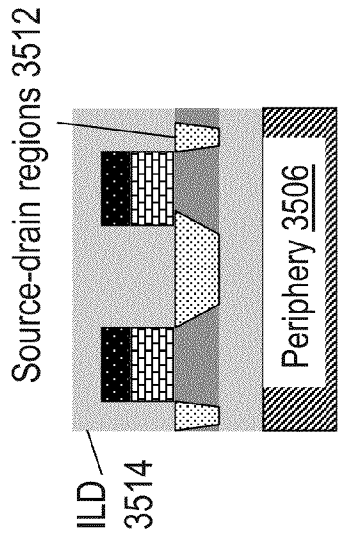

Step (D): FIG. 35D illustrates the structure after Step (D). The gate may be patterned, and source-drain regions 3512 are formed by implantation. An inter-layer dielectric (ILD) 3514 may be also formed.

Figure 35E:
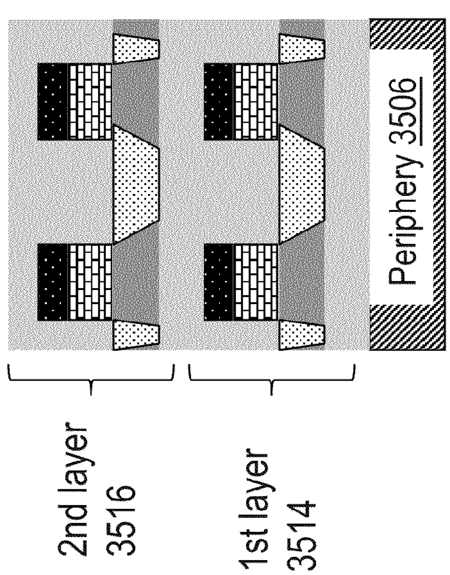

Step (E): FIG. 35E illustrates the structure after Step (E). Using steps similar to Step (A) to Step (D), a second layer of transistors 3516 may be formed above the first layer of transistors 3514. A RTA or some other type of anneal may be performed to activate dopants in the memory layers (and potentially also the peripheral transistors).

Figure 35F:
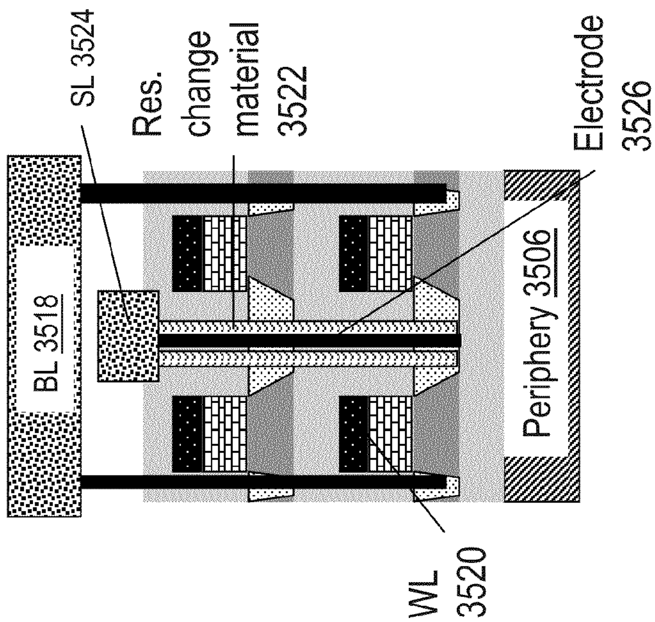

Step (F): FIG. 35F illustrates the structure after Step (F). Vias are etched through multiple layers of silicon and silicon dioxide as shown in the figure. A resistance change memory material 3522 may be then deposited (preferably with atomic layer deposition (ALD)). Examples of such a material include hafnium oxide, which is well known to change resistance by applying voltage. An electrode for the resistance change memory element may be then deposited (preferably using ALD) and is shown as electrode 3526. A CMP process may be then conducted to planarize the surface. Contacts are made to drain terminals of transistors in different memory layer as well. Note that gates of transistors in each memory layer are connected together perpendicular to the plane of the figure to form word-lines 3520 (WL). Wiring for bit-lines 3518 (BLs) and source-lines 3514 (SLs) may be constructed. Contacts are made between BLs, WLs and SLs with the periphery at edges of the memory array. Multiple resistance change memory elements in series with transistors may be created after this step.

A 3D resistance change memory has thus been constructed, with (1) horizontally-oriented transistors—i.e. current flowing in substantially the horizontal direction in the transistor channels, and (2) mono-crystalline (or single-crystal) silicon layers obtained by layer transfer techniques such as ion-cut.

While explanations have been given for formation of monolithic 3D resistive memories with ion-cut in this section, it is clear to one skilled in the art that alternative implementations are possible. BL and SL nomenclature has been used for two terminals of the 3D resistive memory array, and this nomenclature can be interchanged. Moreover, selective epi technology or laser recrystallization technology could be utilized for implementing structures shown in FIG. 32A-J, FIG. 33A-K, FIG. 34A-L and FIG. 35A-F. Various other types of layer transfer schemes that have been described in Section 1.3.4 can be utilized for construction of various 3D resistive memory structures. One could also use buried wiring, i.e. where wiring for memory arrays may be below the memory layers but above the periphery. Other variations of the monolithic 3D resistive memory concepts are possible.

Section 5: Monolithic 3D Charge-Trap Memory

While resistive memories described previously form a class of non-volatile memory, others classes of non-volatile memory exist. NAND flash memory forms one of the most common non-volatile memory types. It can be constructed of two main types of devices: floating-gate devices where charge is stored in a floating gate and charge-trap devices where charge is stored in a charge-trap layer such as Silicon Nitride. Background information on charge-trap memory can be found in "*Integrated Interconnect Technologies for 3D Nanoelectronic Systems*", Artech House, 2009 by Bakir and Meindl ("Bakir") and "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. The architectures shown in FIG. 36A-F, FIG. 37A-G and FIG. 38A-D are relevant for any type of charge-trap memory.

FIG. 36A-F describes a process flow to construct a horizontally-oriented monolithic 3D charge trap memory. Two masks are utilized on a "per-memory-layer" basis for the monolithic 3D charge trap memory concept shown in FIG. 36A-F, while other masks are shared between all constructed memory layers. The process flow may include several steps, that occur in the following sequence.

Figure 36A:
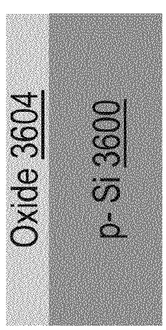
FIG. 36A-F show a two-mask per layer 3D charge-trap memory.

Step (A): A p− Silicon wafer 3600 may be taken and an oxide layer 3604 may be grown or deposited above it. FIG. 36A illustrates the structure after Step (A). Alternatively, p− silicon wafer 3600 may be doped differently, such as, for example, with elemental species that form a p+, or n+, or n− silicon wafer, or substantially absent of semiconductor dopants to form an undoped silicon wafer. Additionally, a doped and activated layer may be formed in or on p− silicon wafer 3600 by processes such as, for example, implant and RTA or furnace activation, or epitaxial deposition and activation.

Figure 36B:
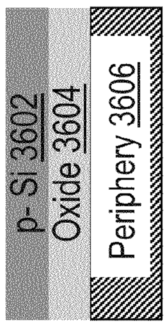

Step (B): FIG. 36B illustrates the structure after Step (B). Using a procedure similar to the one shown in FIG. 2, a portion of the p− Silicon wafer 3600, p− Si region 3602, may be transferred atop a peripheral circuit layer 3606. The periphery may be designed such that it can withstand the RTA for activating dopants in memory layers formed atop it.

Figure 36C:
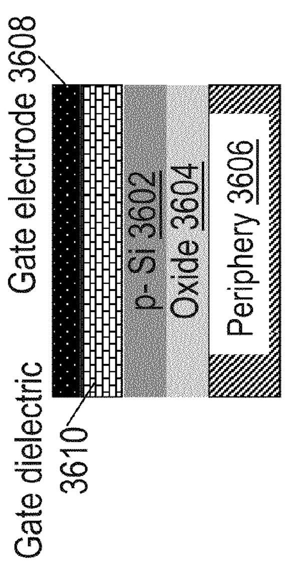

Step (C): FIG. 36C illustrates the structure after Step (C). Isolation regions are formed in the p− Si region 3602 atop the peripheral circuit layer 3606. This lithography step and all future lithography steps are formed with good alignment to features on the peripheral circuit layer 3606 since the p− Si region 3602 may be thin and reasonably transparent to the lithography tool. A dielectric layer 3610 (eg. Oxide-nitride-oxide ONO layer) may be deposited following which a gate electrode layer 3608 (eg. polysilicon) are then deposited.

Figure 36D:
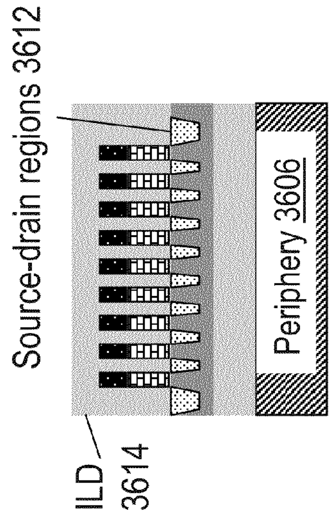

Step (D): FIG. 36D illustrates the structure after Step (D). The gate regions deposited in Step (C) are patterned and etched. Following this, source-drain regions 3612 are implanted. An inter-layer dielectric 3614 may be then deposited and planarized.

Figure 36F:
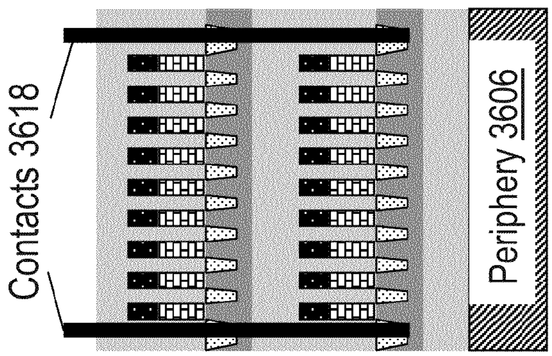
Figure 36E:
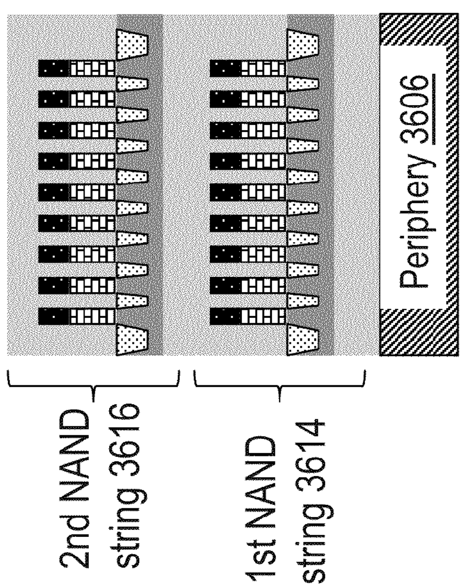

Step (E): FIG. 36E illustrates the structure after Step (E). Using procedures similar to Step (A) to Step (D), another layer of memory, a second NAND string 3616, may be formed atop the first NAND string 3614.

Step (F): FIG. 36F illustrates the structure after Step (F). Contacts 3618 may be made to connect bit-lines (BL) (not shown) and source-lines (SL) (not shown) to the NAND string. Contacts (not shown) to the well of the NAND string may also be made. All these contacts could be constructed of heavily doped polysilicon or some other material. An anneal to activate dopants in source-drain regions of transistors in the NAND string (and potentially also the periphery) may be conducted. Following this, wiring layers for the memory array may be conducted.

A 3D charge-trap memory has thus been constructed, with (1) horizontally-oriented transistors—i.e. current flowing in substantially the horizontal direction in transistor channels, and (2) mono-crystalline (or single-crystal) silicon layers obtained by layer transfer techniques such as ion-cut. This use of mono-crystalline silicon (or single crystal silicon) using ion-cut can be a key differentiator for some embodiments of the current invention vis-à-vis prior work. Past work described by Bakir in his textbook used selective epi technology or laser recrystallization or polysilicon.

FIG. 37A-G describes a memory architecture for single-crystal 3D charge-trap memories, and a procedure for its construction. It utilizes junction-less transistors. No mask may be utilized on a "per-memory-layer" basis for the monolithic 3D charge-trap memory concept shown in FIG. 37A-G, and all other masks are shared between different layers. The process flow may include several steps as described in the following sequence.

Figure 37A:
FIG. 37A-G show a zero-mask per layer 3D charge-trap memory.

Step (A): Peripheral circuits 3702 are first constructed and above this oxide layer 3704 may be deposited. FIG. 37A shows a drawing illustration after Step (A).

Figure 37B:
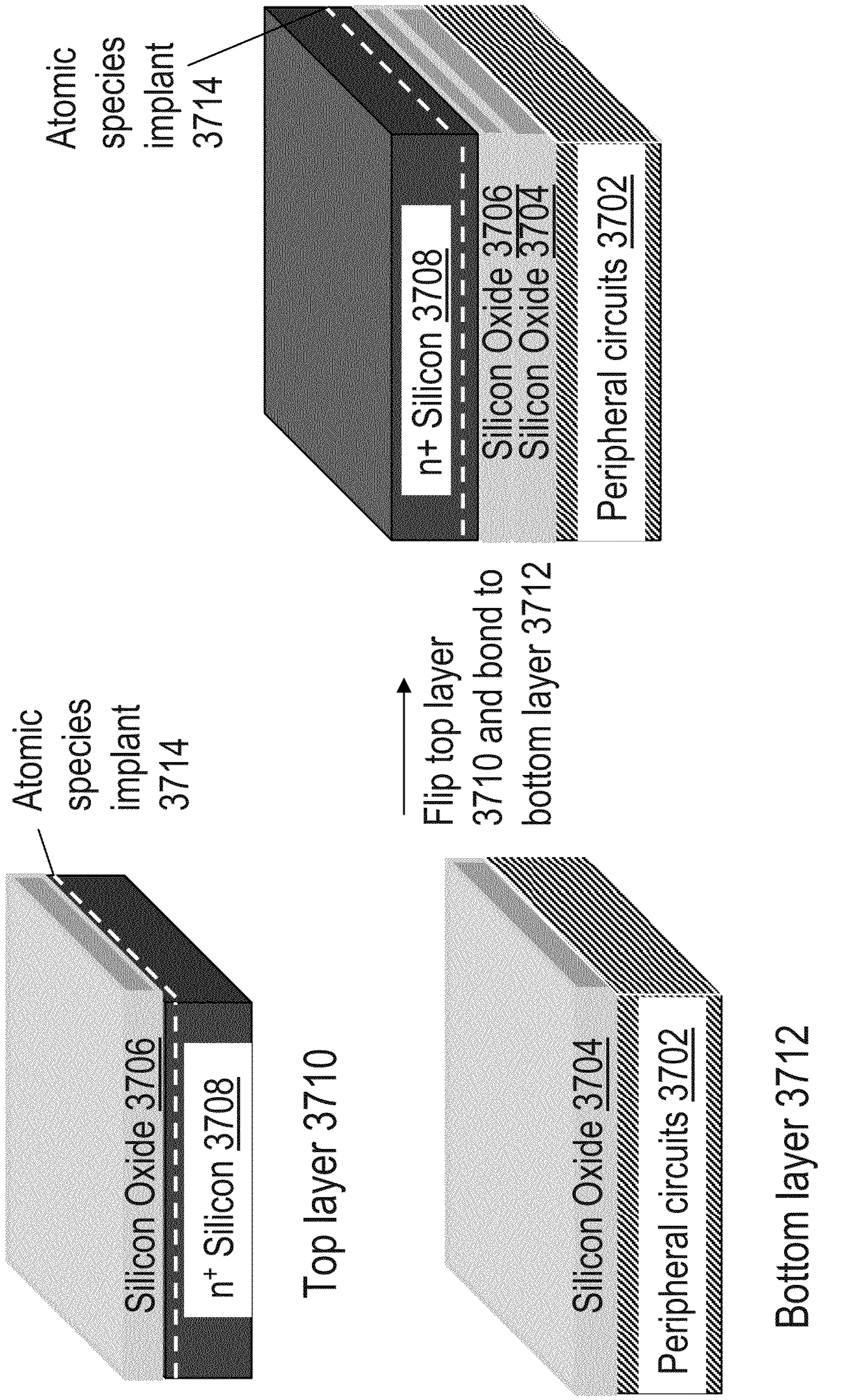

Step (B): FIG. 37B illustrates the structure after Step (B). A wafer of n+ Silicon 3708 has an oxide layer 3706 grown or deposited above it. A doped and activated layer may be formed in or on n+ silicon wafer 3708 by processes such as, for example, implant and RTA or furnace activation, or epitaxial deposition and activation. Following this, hydrogen may be implanted into the n+ Silicon wafer at a certain depth indicated by 3714. Alternatively, some other atomic species such as Helium could be implanted. This hydrogen implanted n+ Silicon wafer 3708 forms the top layer 3710. The bottom layer 3712 may include the peripheral circuits 3702 with oxide layer 3704. The top layer 3710 may be flipped and bonded to the bottom layer 3712 using oxide-to-oxide bonding. Alternatively, n+ silicon wafer 3708 may be doped differently, such as, for example, with elemental species that form a p+, or p−, or n− silicon wafer, or substantially absent of semiconductor dopants to form an undoped silicon wafer.

Figure 37C:
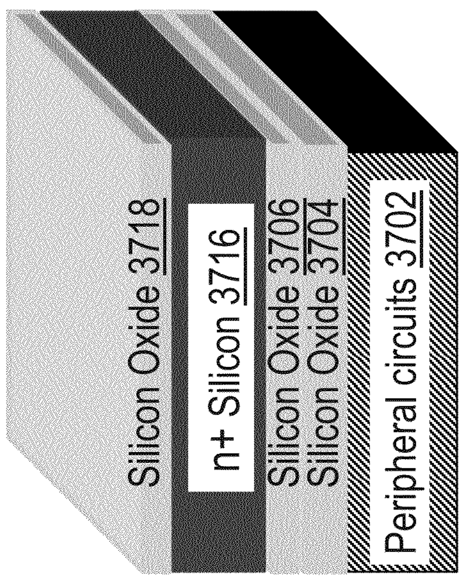

Step (C): FIG. 37C illustrates the structure after Step (C). The stack of top and bottom wafers after Step (B) may be cleaved at the hydrogen plane 3714 using either a anneal or a sideways mechanical force or other means. A CMP process may be then conducted. A layer of silicon oxide 3718 may be then deposited atop the n+ Silicon layer 3716. At the end of this step, a single-crystal n+ Si layer 3716 exists atop the peripheral circuits, and this has been achieved using layer transfer techniques.

Figure 37D:
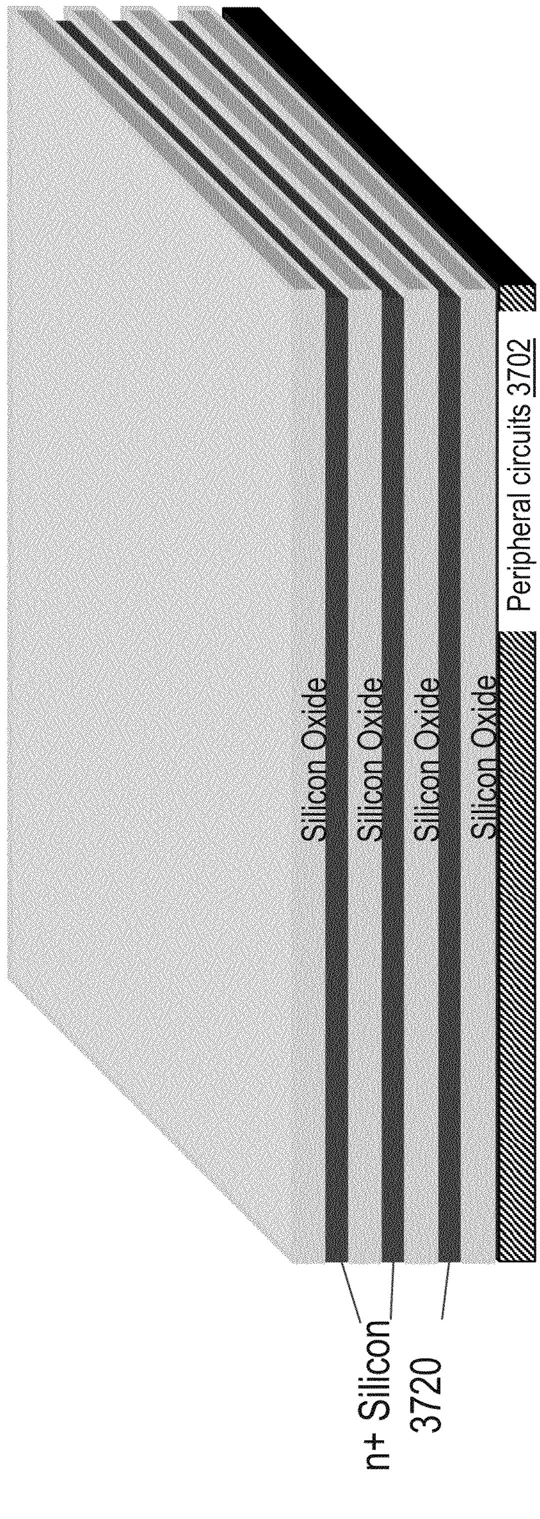

Step (D): FIG. 37D illustrates the structure after Step (D). Using methods similar to Step (B) and (C), multiple n+ silicon layers 3720 are formed with silicon oxide layers in between.

Figure 37E:
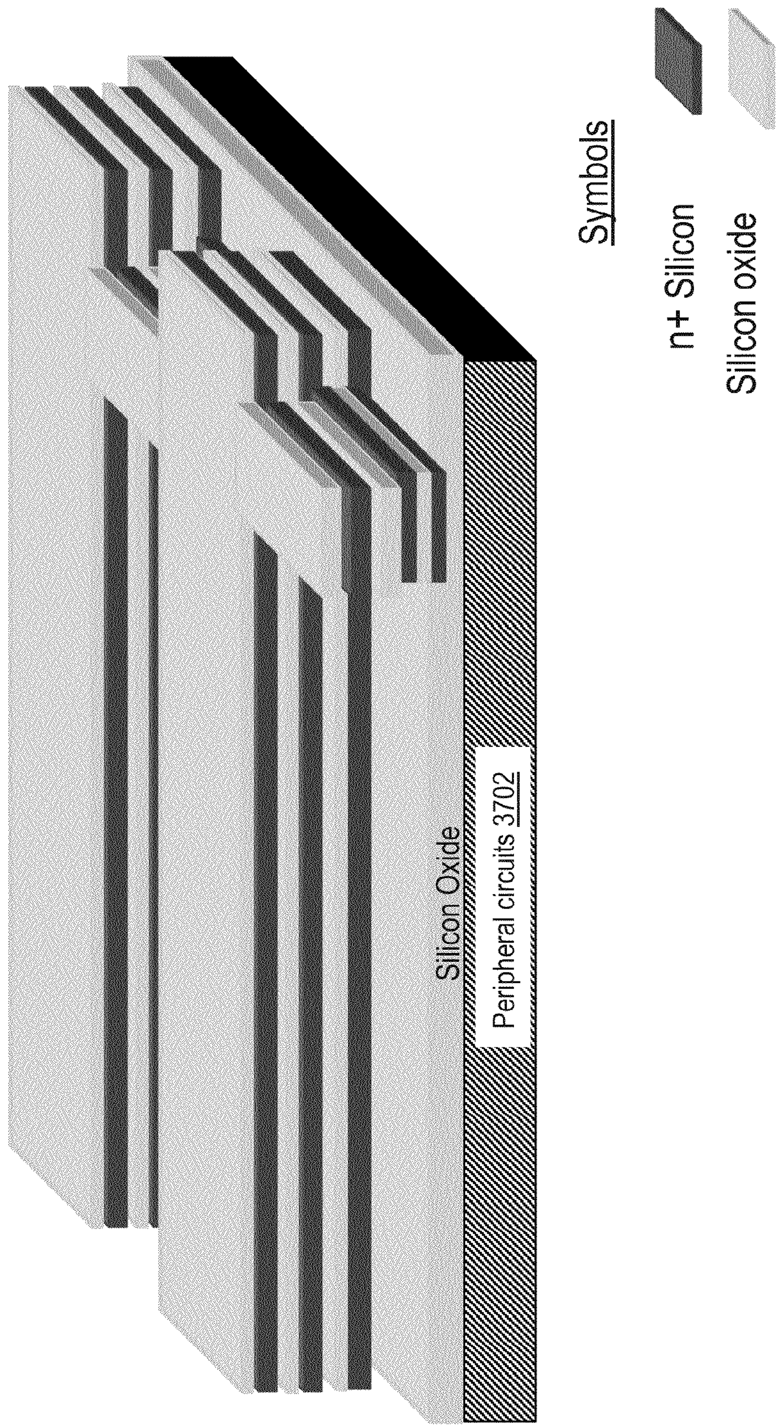

Step (E): FIG. 37E illustrates the structure after Step (E). Lithography and etch processes are then utilized to make a structure as shown in the figure.

Figure 37F:
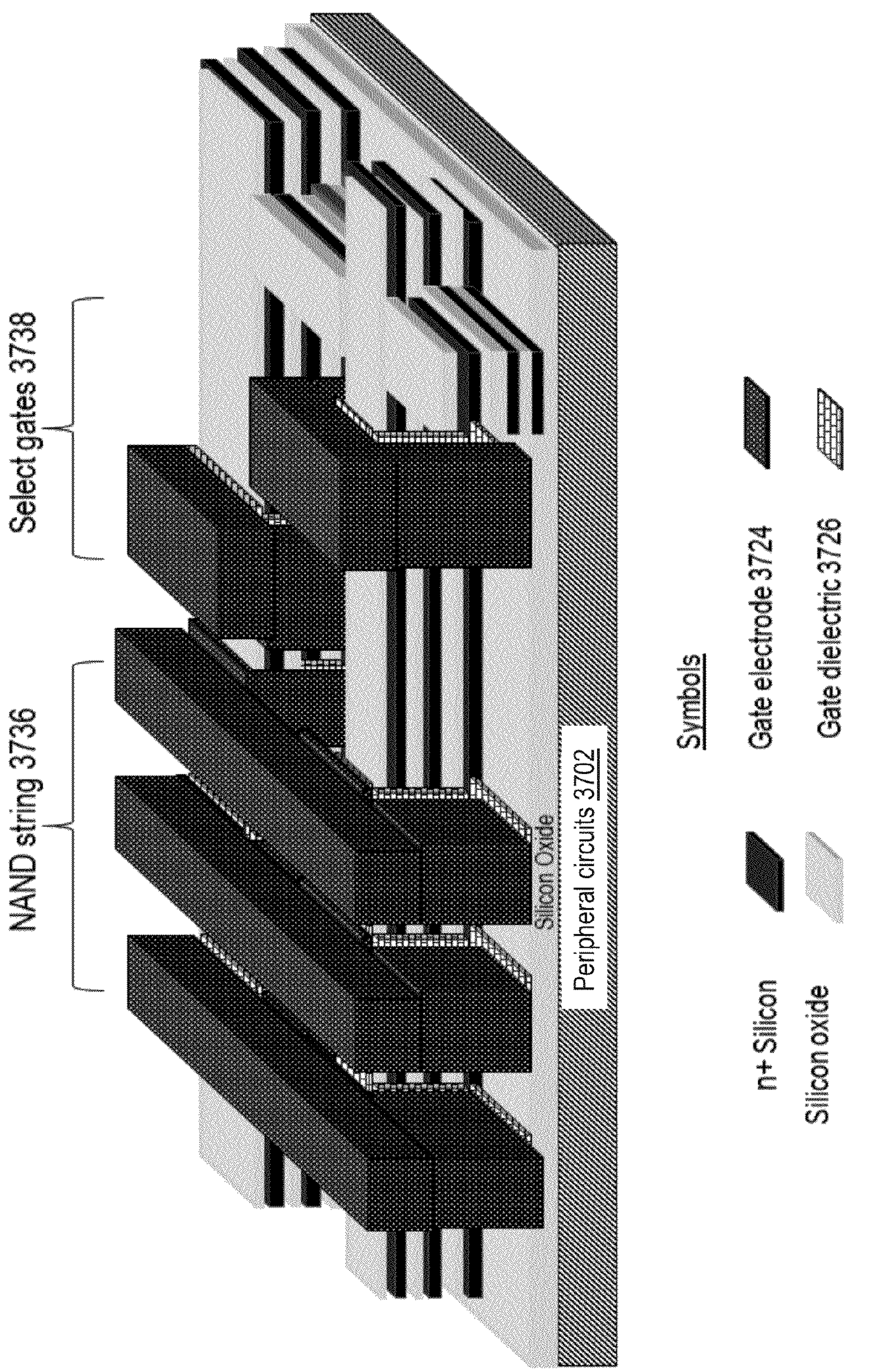

Step (F): FIG. 37F illustrates the structure after Step (F). Gate dielectric 3726 and gate electrode 3724 are then deposited following which a CMP may be done to planarize the gate electrode 3724 regions. Lithography and etch are utilized to define gate regions. Gates of the NAND string 3736 as well gates of select gates of the NAND string 3738 are defined.

Figure 37G:
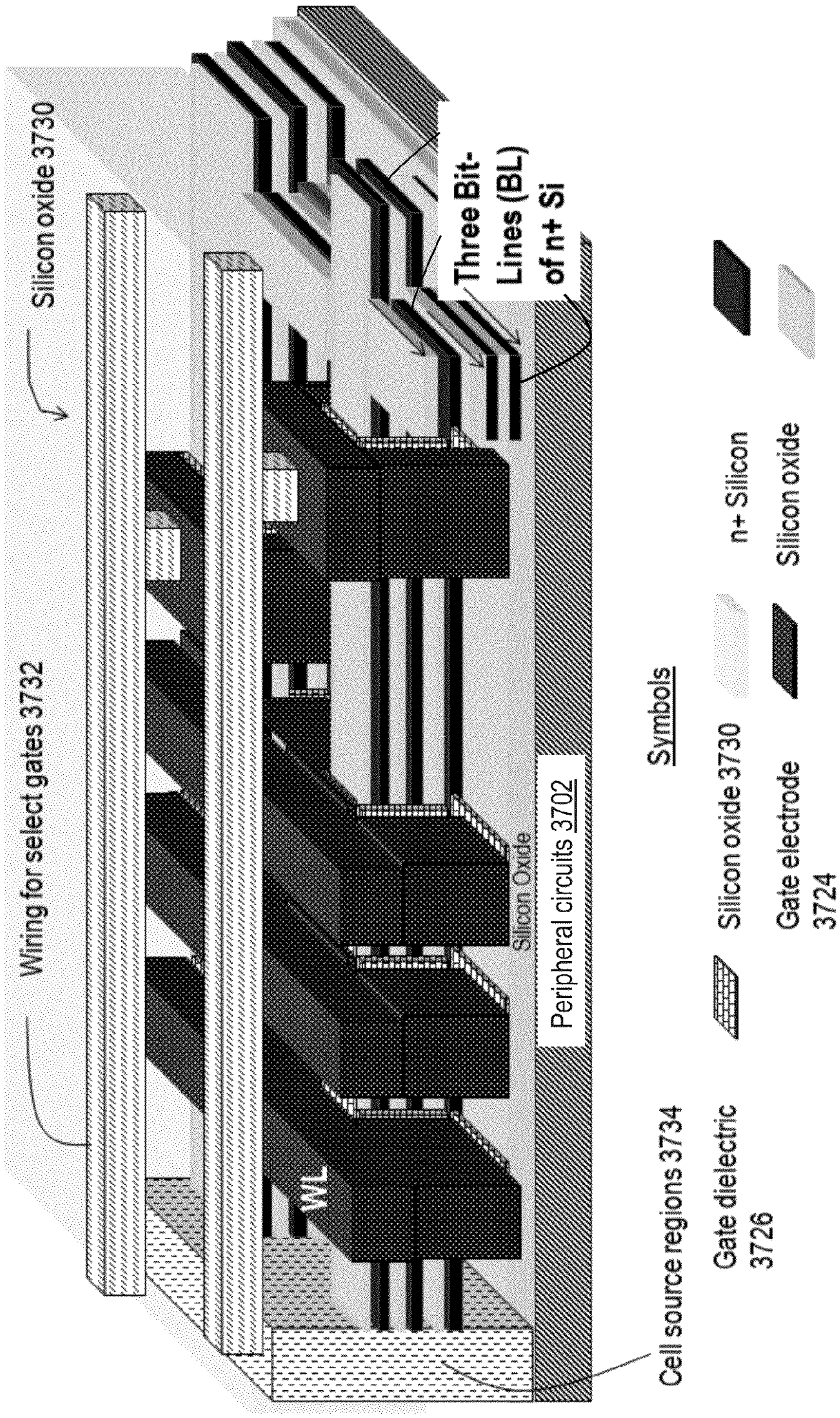

Step (G): FIG. 37G illustrates the structure after Step (G). A silicon oxide layer 3730 may be then deposited and planarized. It is shown transparent in the figure for clarity. Word-lines, bit-lines and source-lines are defined as shown in the figure. Contacts are formed to various regions/wires at the edges of the array as well. SL contacts can be made into stair-like structures using techniques described in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be performed in steps prior to Step (G) as well.

A 3D charge-trap memory has thus been constructed, with (1) horizontally-oriented transistors—i.e. current flowing in substantially the horizontal direction in transistor channels, (2) some of the memory cell control lines—e.g., bit lines BL, constructed of heavily doped silicon and embedded in the memory cell layer, (3) side gates simultaneously deposited over multiple memory layers for transistors, and (4) mono-crystalline (or single-crystal) silicon layers obtained by layer transfer techniques such as ion-cut. This use of single-crystal silicon obtained with ion-cut is a key differentiator from past work on 3D charge-trap memories such as "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. that used polysilicon.

Figure 38A:
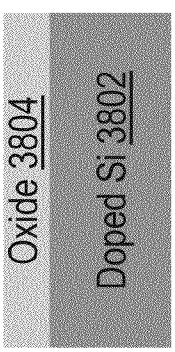
Figure 38B:
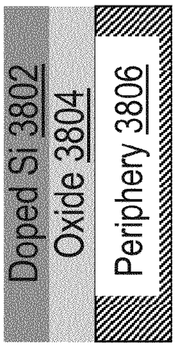
Figure 38C:
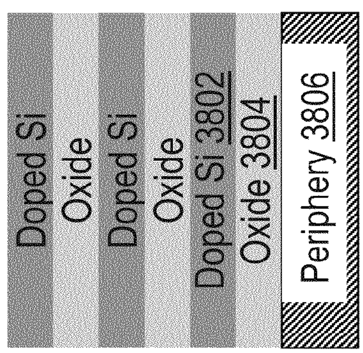

While FIG. 36A-F and FIG. 37A-G give two examples of how single-crystal silicon layers with ion-cut can be used to produce 3D charge-trap memories, the ion-cut technique for 3D charge-trap memory may be fairly general. It could be utilized to produce any horizontally-oriented 3D mono-crystalline silicon charge-trap memory. FIG. 38A-D further illustrates how general the process can be. One or more doped silicon layers 3802, including oxide layer 3804, can be layer transferred atop any peripheral circuit layer 3806 using procedures shown in FIG. 2. These are indicated in FIG. 38A, FIG. 38B and FIG. 38C. Following this, different procedures can be utilized to form different types of 3D charge-trap memories. For example, procedures shown in "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. and "Multi-layered Vertical Gate NAND Flash overcoming stacking limit for terabit density storage", Symposium on VLSI Technology, 2009 by W. Kim, S. Choi, et al. can be used to produce the two different types of horizontally oriented single crystal silicon 3D charge trap memory shown in FIG. 38D.

Section 6: Monolithic 3D Floating-Gate Memory

While charge-trap memory forms one type of non-volatile memory, floating-gate memory may be another type. Background information on floating-gate flash memory can be found in "Introduction to Flash memory", Proc. IEEE91, 489-502 (2003) by R. Bez, et al. There are different types of floating-gate memory based on different materials and device structures. The architectures shown in FIG. 39A-F and FIG. 40A-H are relevant for any type of floating-gate memory.

FIG. 39A-F describe a process flow to construct a horizontally-oriented monolithic 3D floating-gate memory. Two masks are utilized on a "per-memory-layer" basis for the monolithic 3D floating-gate memory concept shown in FIG. 39A-F, while other masks are shared between all constructed memory layers. The process flow may include several steps as described in the following sequence.

Figures 39A, 39B, 39C, 39D:
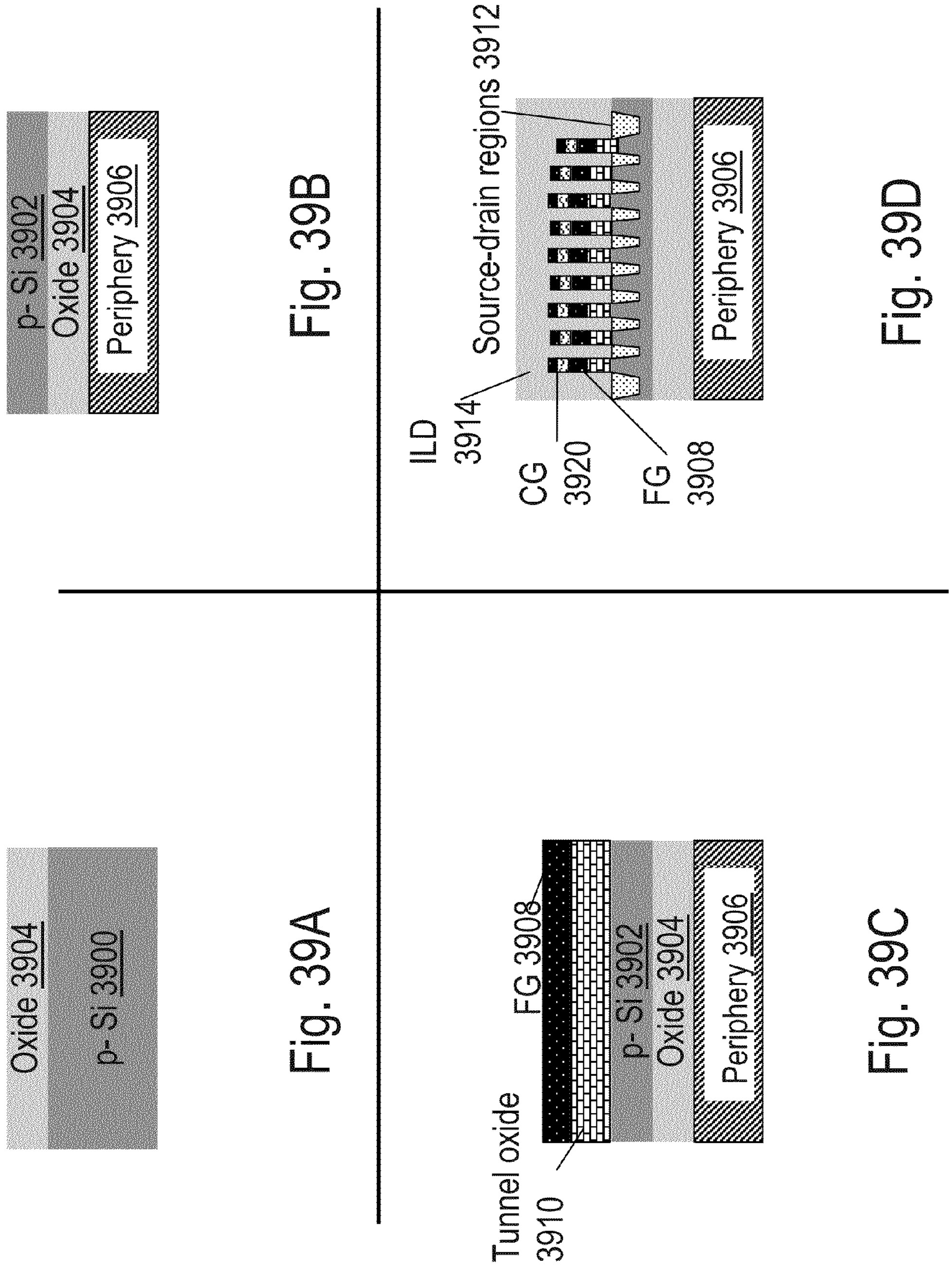
FIG. 39A-F show a two-mask per layer 3D horizontally-oriented floating-gate memory.

Step (A): A p− Silicon wafer 3900 may be taken and an oxide layer 3904 may be grown or deposited above it. FIG. 39A illustrates the structure after Step (A). Alternatively, p− silicon wafer 3900 may be doped differently, such as, for example, with elemental species that form a p+, or n+, or n− silicon wafer, or substantially absent of semiconductor dopants to form an undoped silicon wafer. Furthermore, a doped and activated layer may be formed in or on p− silicon wafer 3900 by processes such as, for example, implant and RTA or furnace activation, or epitaxial deposition and activation.

Step (B): FIG. 39B illustrates the structure after Step (B). Using a procedure similar to the one shown in FIG. 2, a portion of p− Silicon wafer 3900, p− Si region 3902, may be transferred atop a peripheral circuit layer 3906. The periphery may be designed such that it can withstand the RTA for activating dopants in memory layers formed atop it.

Step (C): FIG. 39C illustrates the structure after Step (C). After deposition of the tunnel oxide 3910 and floating gate 3908, isolation regions are formed in the p− Si region 3902 atop the peripheral circuit layer 3906. This lithography step and all future lithography steps are formed with good alignment to features on the peripheral circuit layer 3906 since the p− Si region 3902 may be thin and reasonably transparent to the lithography tool.

Step (D): FIG. 39D illustrates the structure after Step (D). A inter-poly-dielectric (IPD) layer (eg. Oxide-nitride-oxide ONO layer) may be deposited following which a control gate electrode 3920 (eg. polysilicon) may be then deposited. The gate regions deposited in Step (C) are patterned and etched. Following this, source-drain regions 3912 are implanted. An inter-layer dielectric 3914 may be then deposited and planarized.

Figure 39F:
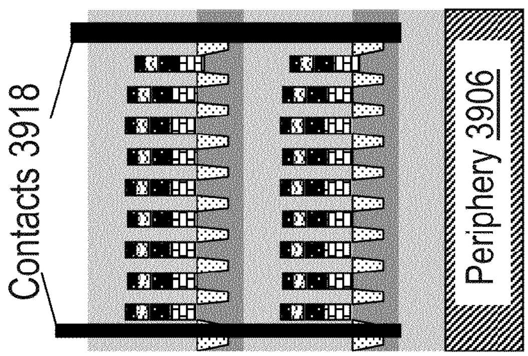
Figure 39E:
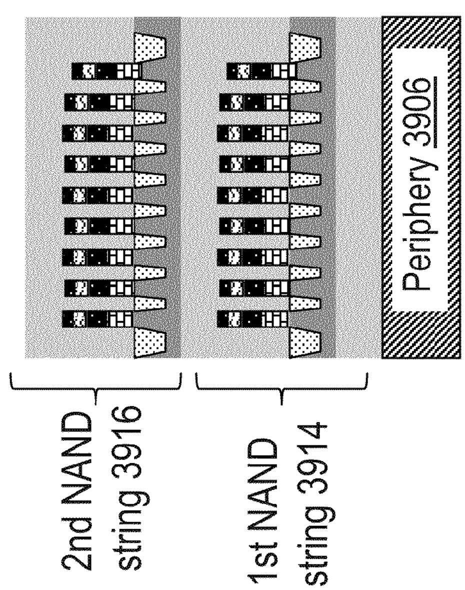

Step (E): FIG. 39E illustrates the structure after Step (E). Using procedures similar to Step (A) to Step (D), another layer of memory, a second NAND string 3916, may be formed atop the first NAND string 3914.

Step (F): FIG. 39F illustrates the structure after Step (F). Contacts 3918 may be made to connect bit-lines (BL) (not shown) and source-lines (SL) (not shown) to the NAND string. Contacts to the well (not shown) of the NAND string may also be made. All these contacts could be constructed of heavily doped polysilicon or some other material. An anneal to activate dopants in source-drain regions of transistors in the NAND string (and potentially also the periphery) may be conducted. Following this, wiring layers for the memory array may be conducted.

A 3D floating-gate memory has thus been constructed, with (1) horizontally-oriented transistors—i.e. current flow in substantially the horizontal direction in transistor channels, (2) mono-crystalline (or single-crystal) silicon layers obtained by layer transfer techniques such as ion-cut. This use of mono-crystalline silicon (or single crystal silicon) using ion-cut is a key differentiator for some embodiments of the current invention vis-à-vis prior work. Past work used selective epi technology or laser recrystallization or polysilicon.

FIG. 40A-H show a novel memory architecture for 3D floating-gate memories, and a procedure for its construction. The memory architecture utilizes junction-less transistors. One mask may be utilized on a "per-memory-layer" basis for the monolithic 3D floating-gate memory concept shown in FIG. 40A-H, and all other masks are shared between different layers. The process flow may include several steps that as described in the following sequence.

Figure 40A:
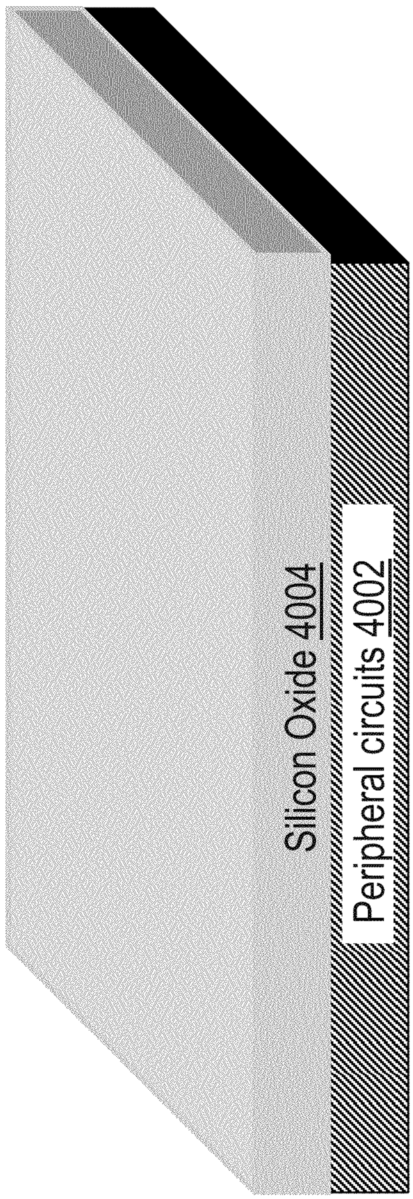
FIG. 40A-H show a one-mask per layer 3D horizontally-oriented floating-gate memory.

Step (A): Peripheral circuits 4002 are first constructed and above this oxide layer 4004 may be deposited. FIG. 40A illustrates the structure after Step (A).

Figure 40B:
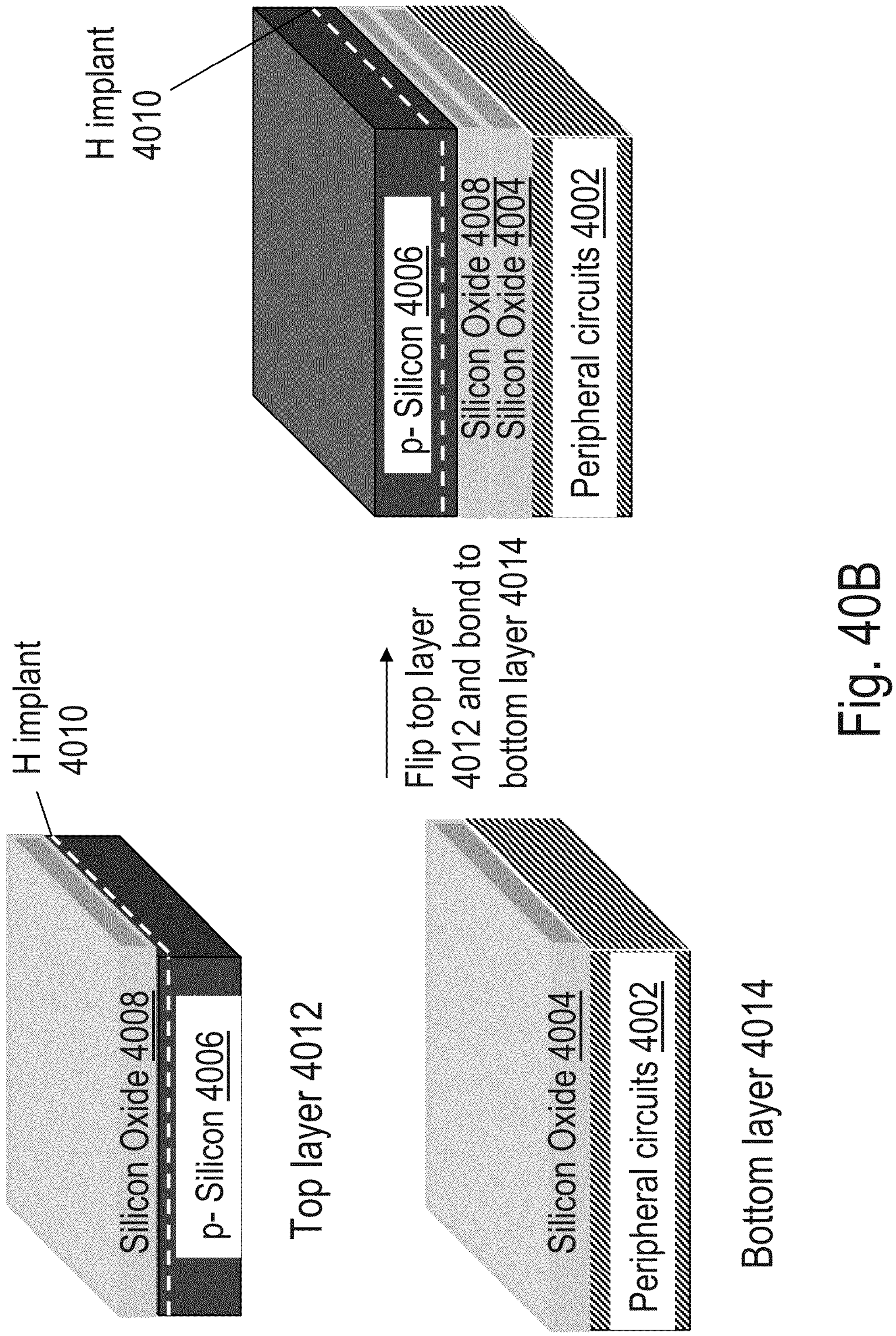

Step (B): FIG. 40B illustrates the structure after Step (B). A wafer of n+ Silicon 4008 has an oxide layer 4006 grown or deposited above it. Following this, hydrogen may be implanted into the n+ Silicon wafer at a certain depth indicated by 4010. Alternatively, some other atomic species such as Helium could be implanted. This hydrogen implanted n+ Silicon wafer 4008 forms the top layer 4012. The bottom layer 4014 may include the peripheral circuits 4002 with oxide layer 4004. The top layer 4012 may be flipped and bonded to the bottom layer 4014 using oxide-to-oxide bonding. Alternatively, n+ silicon wafer 4008 may be doped differently, such as, for example, with elemental species that form a p+, or p−, or n− silicon wafer, or substantially absent of semiconductor dopants to form an undoped silicon wafer. Moreover, a doped and activated layer may be formed in or on n+ silicon wafer 4008 by processes such as, for example, implant and RTA or furnace activation, or epitaxial deposition and activation.

Figure 40C:
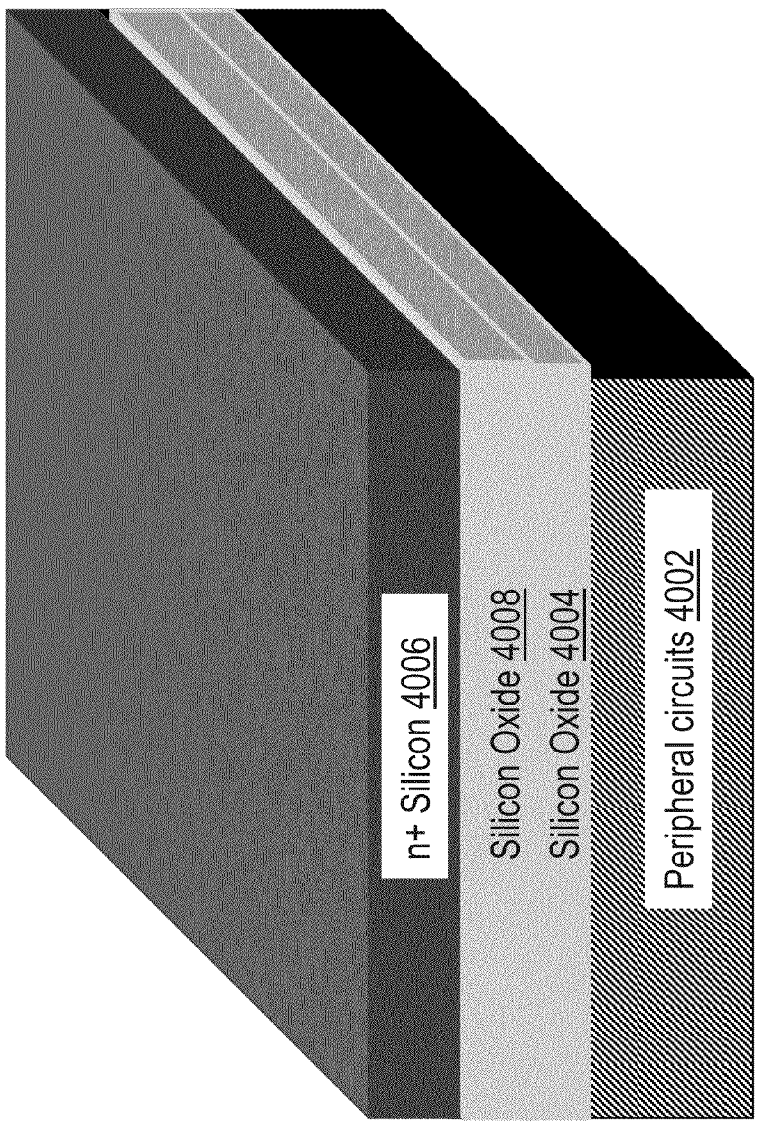

Step (C): FIG. 40C illustrates the structure after Step (C). The stack of top and bottom wafers after Step (B) may be cleaved at the hydrogen plane 4010 using either an anneal or a sideways mechanical force or other means. A CMP process may be then conducted. A layer of silicon oxide (not shown) may be then deposited atop the n+ Silicon layer 4006. At the end of this step, a single-crystal n+ Si layer 4016 exists atop the peripheral circuits, and this has been achieved using layer transfer techniques.

Figure 40D:
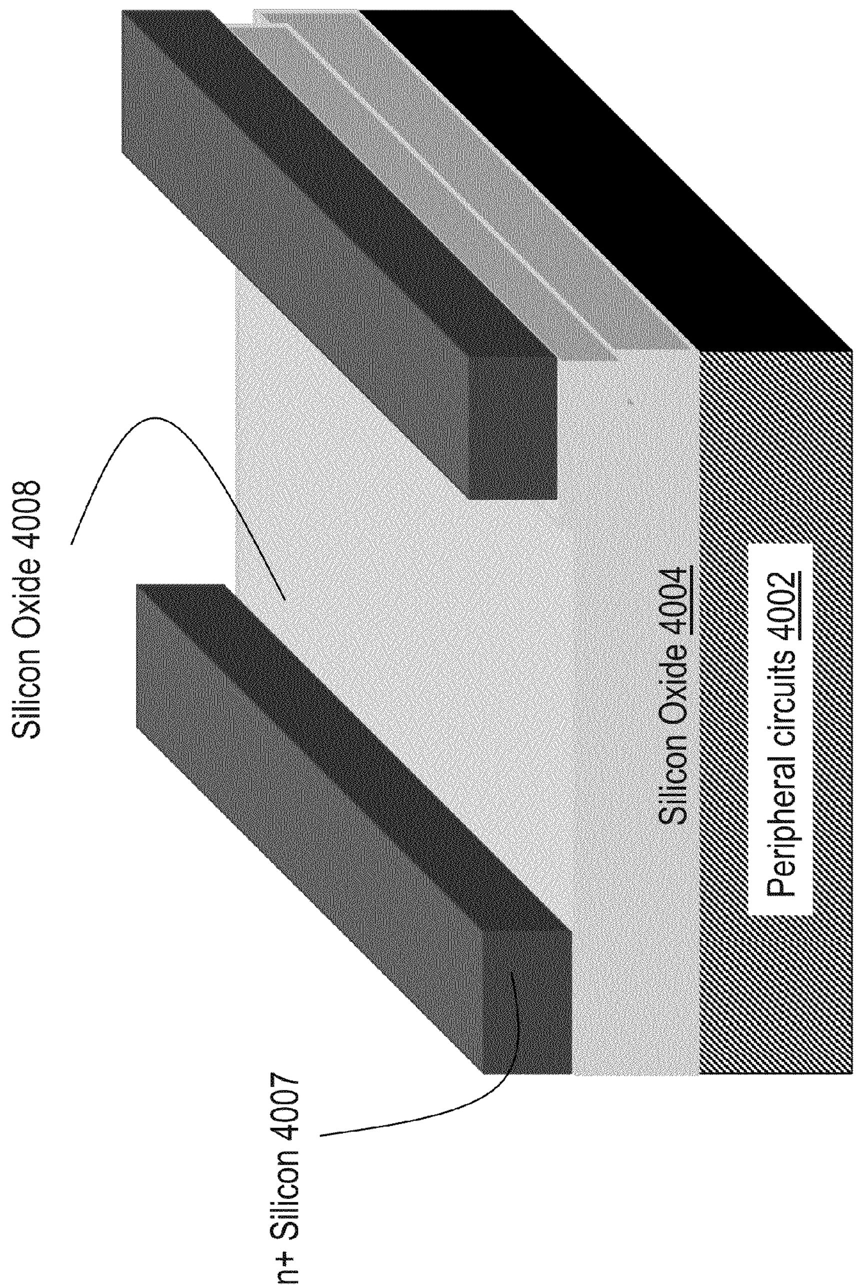

Step (D): FIG. 40D illustrates the structure after Step (D). Using lithography and etch, the n+ silicon layer 4007 may be defined.

Figure 40E:
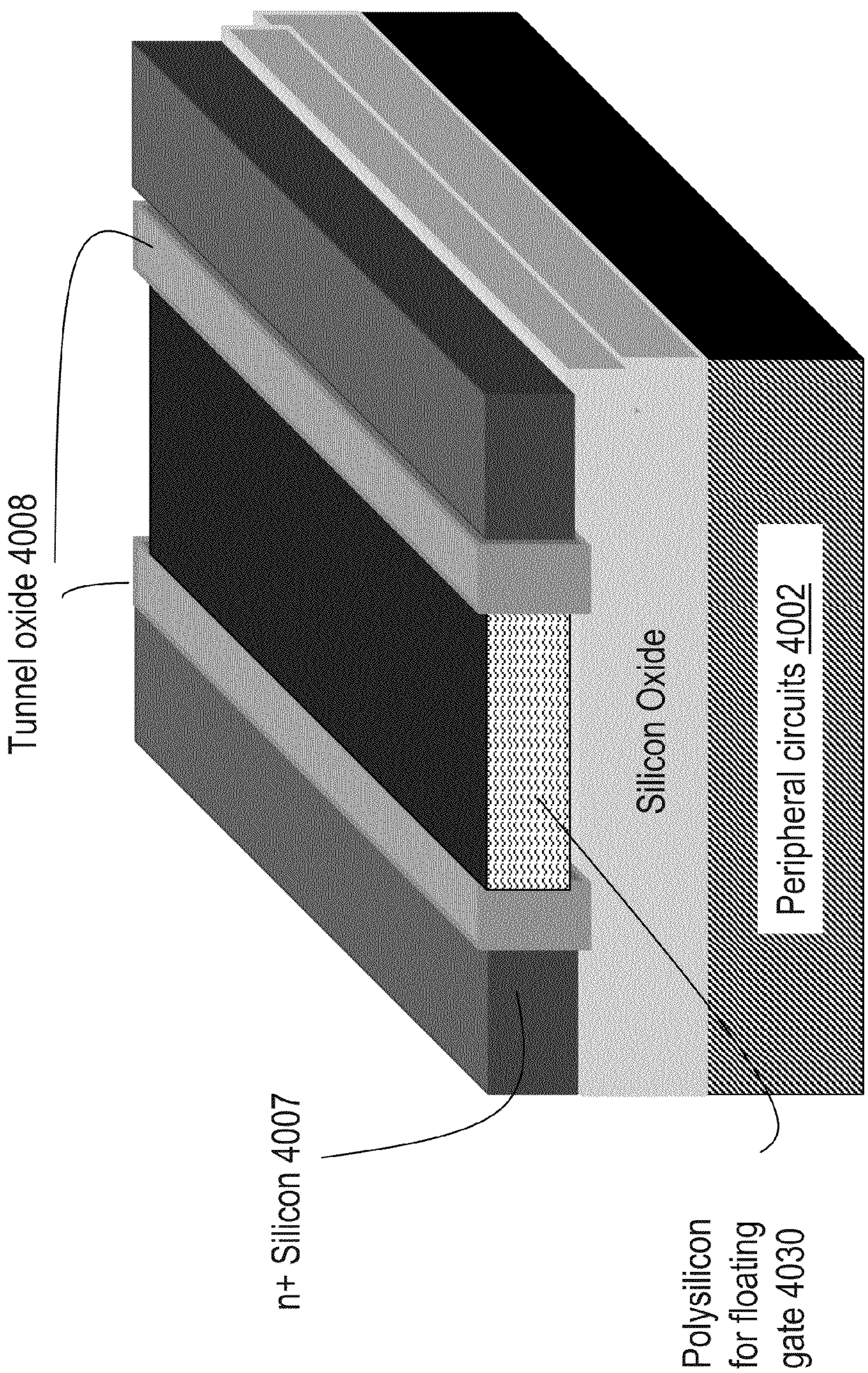

Step (E): FIG. 40E illustrates the structure after Step (E). A tunnel oxide layer 4008 may be grown or deposited following which a polysilicon layer for forming future floating gates may be deposited. A CMP process may be conducted, thus forming polysilicon region for floating gates 4030.

Figure 40F:
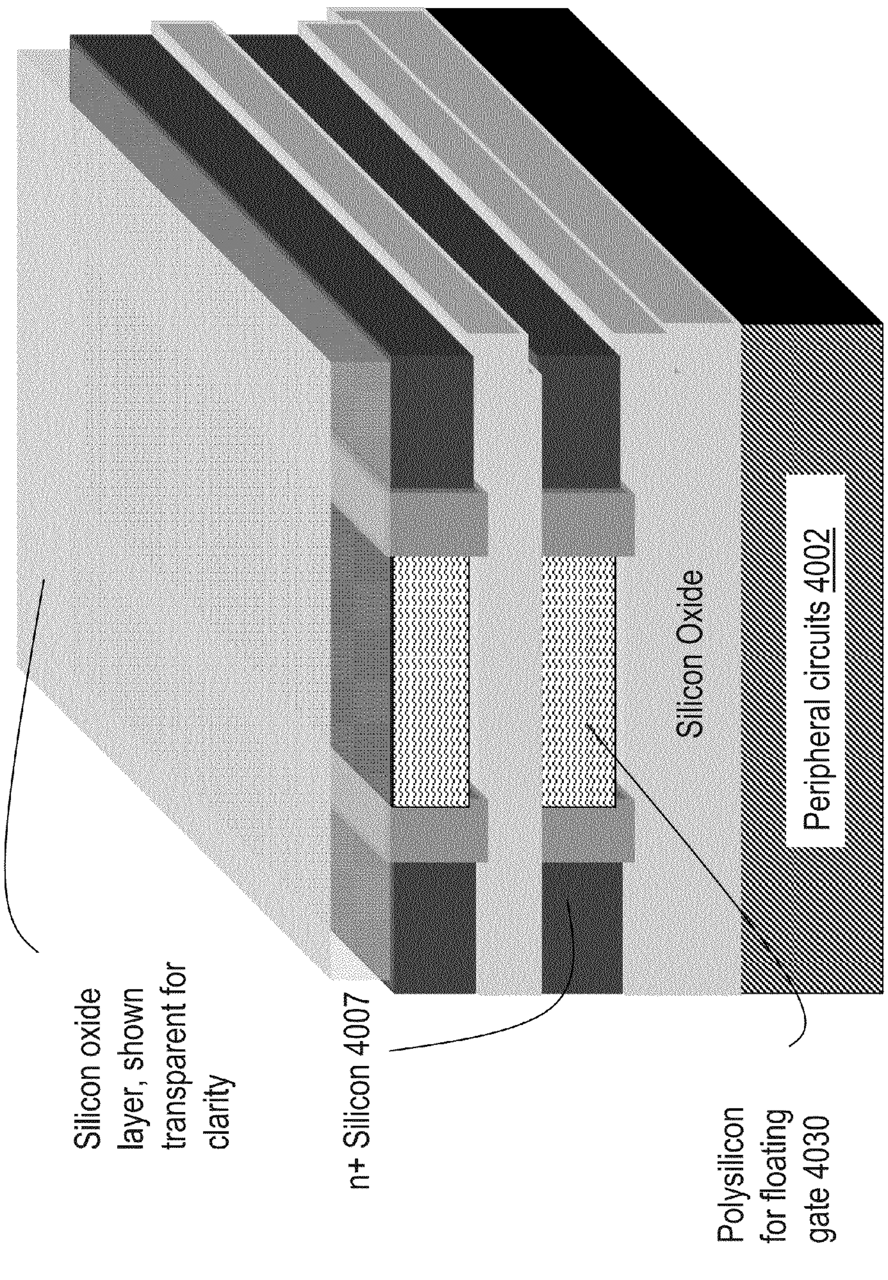

Step (F): FIG. 40F illustrates the structure after Step (F). Using similar procedures, multiple levels of memory are formed with oxide layers in between.

Figure 40G:
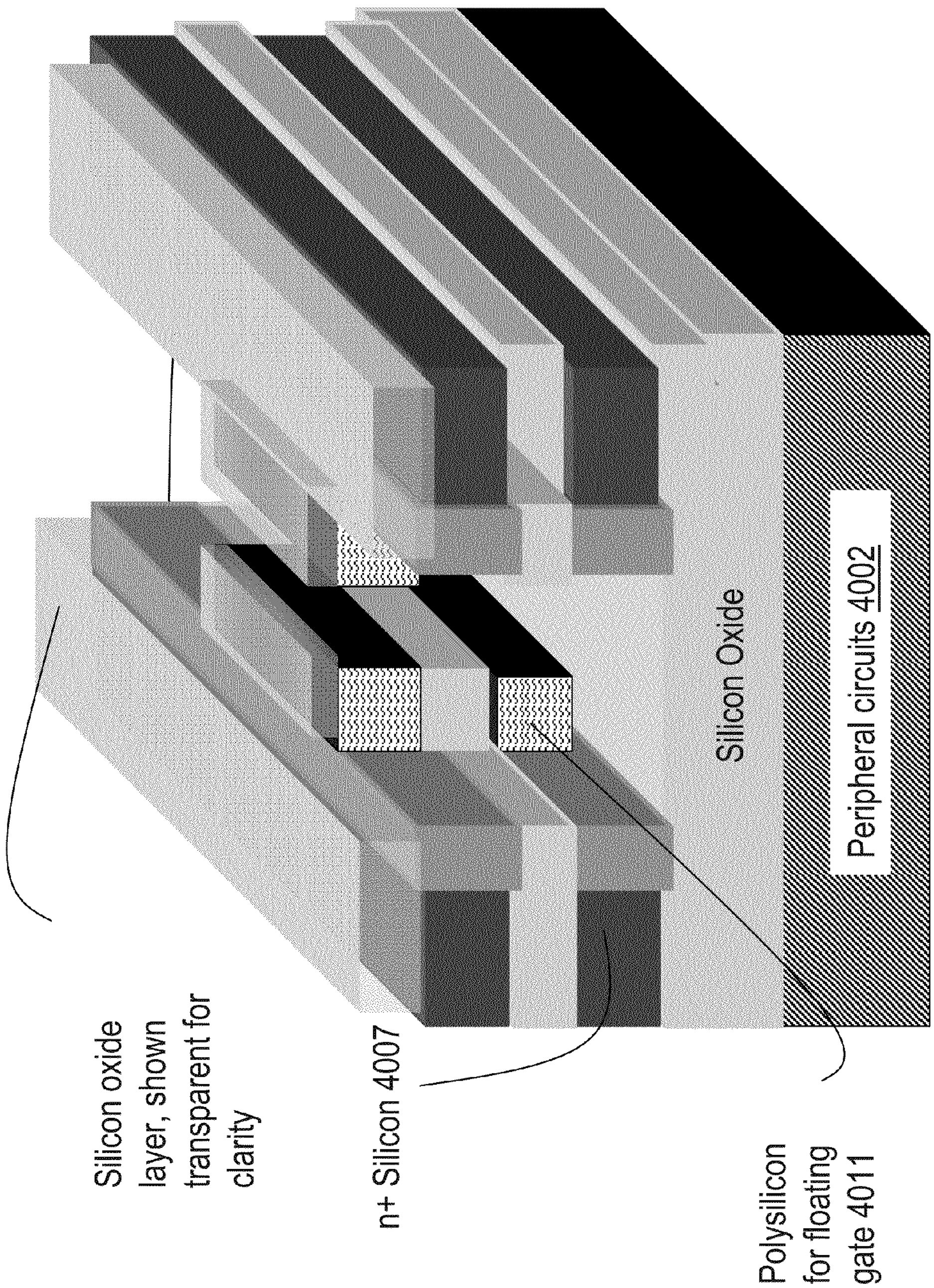

Step (G): FIG. 40G illustrates the structure after Step (G). The polysilicon region for floating gates 4030 may be etched to form the polysilicon region 4011.

Figure 40H:
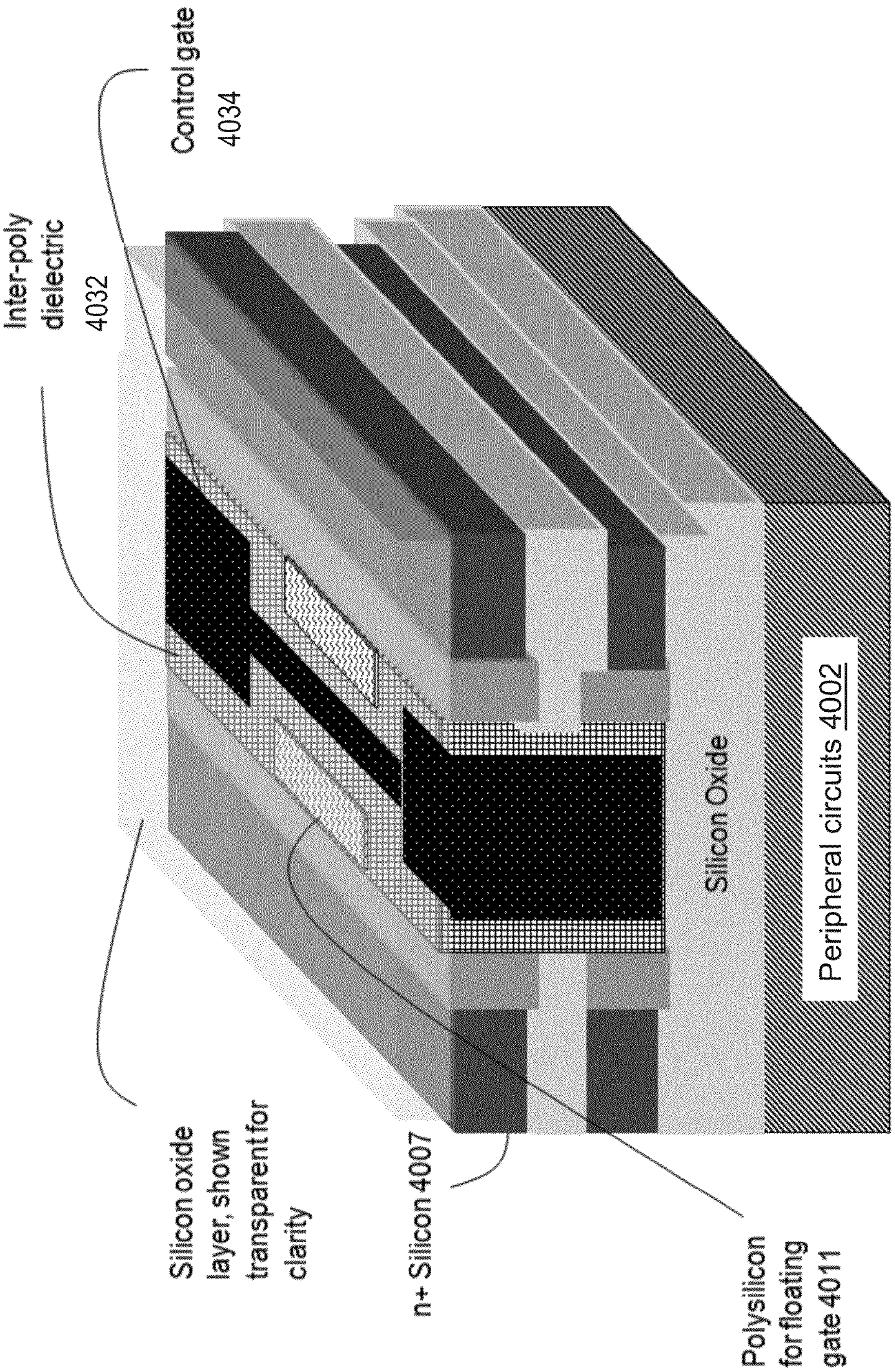

Step (H): FIG. 40H illustrates the structure after Step (H). Inter-poly dielectrics (IPD) 4032 and control gates 4034 are deposited and polished.

While the steps shown in FIG. 40A-H describe formation of a few floating gate transistors, it will be obvious to one skilled in the art that an array of floating-gate transistors can be constructed using similar techniques and well-known memory access/decoding schemes.

A 3D floating-gate memory has thus been constructed, with (1) horizontally-oriented transistors—i.e. current flowing in substantially the horizontal direction in transistor channels, (2) mono-crystalline (or single-crystal) silicon layers obtained by layer transfer techniques such as ion-cut, (3) side gates that are simultaneously deposited over multiple memory layers for transistors, and (4) some of the memory cell control lines are in the same memory layer as the devices. The use of mono-crystalline silicon (or single crystal silicon) layer obtained by ion-cut in (2) may be a key differentiator for some embodiments of the current invention vis-à-vis prior work. Past work used selective epi technology or laser recrystallization or polysilicon.

It may be desirable to place the peripheral circuits for functions such as, for example, memory control, on the same mono-crystalline silicon or polysilicon layer as the memory elements or string rather than reside on a mono-crystalline silicon or polysilicon layer above or below the memory elements or string on a 3D IC memory chip. However, that memory layer substrate thickness or doping may preclude proper operation of the peripheral circuits as the memory layer substrate thickness or doping provides a fully depleted transistor channel and junction structure, such as, for example, FD-SOI. Moreover, for a 2D IC memory chip constructed on, for example, an FD-SOI substrate, wherein the peripheral circuits for functions such as, for example, memory control, must reside and properly function in the same semiconductor layer as the memory element, a fully depleted transistor channel and junction structure may preclude proper operation of the periphery circuitry, but may provide many benefits to the memory element operation and reliability. Some embodiments of the invention which solves these issues are described in FIGS. 70A to 70D.

FIGS. 70A-D describe a process flow to construct a monolithic 2D floating-gate flash memory on a fully depleted Silicon on Insulator (FD-SOI) substrate which utilizes partially depleted silicon-on-insulator transistors for the periphery. A 3D horizontally-oriented floating-gate memory may also be constructed with the use of this process flow in combination with some of the embodiments of this invention described in this document. The 2D process flow may include several steps as described in the following sequence.

Figure 70B:
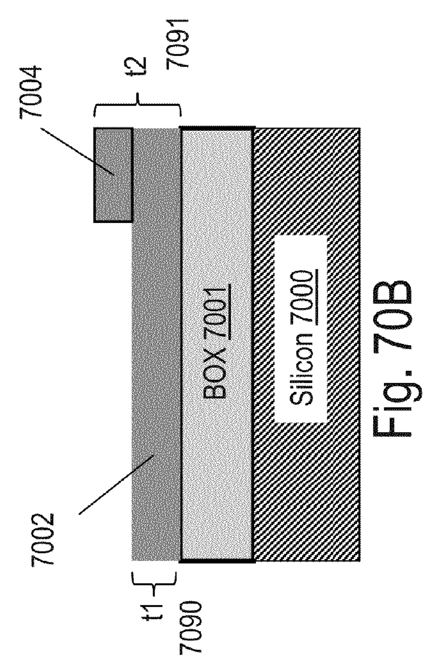
FIG. 70A-H illustrates a technique to construct a floating-gate memory on a fully depleted Silicon on Insulator (FD-SOI) substrate.
Figure 70D:
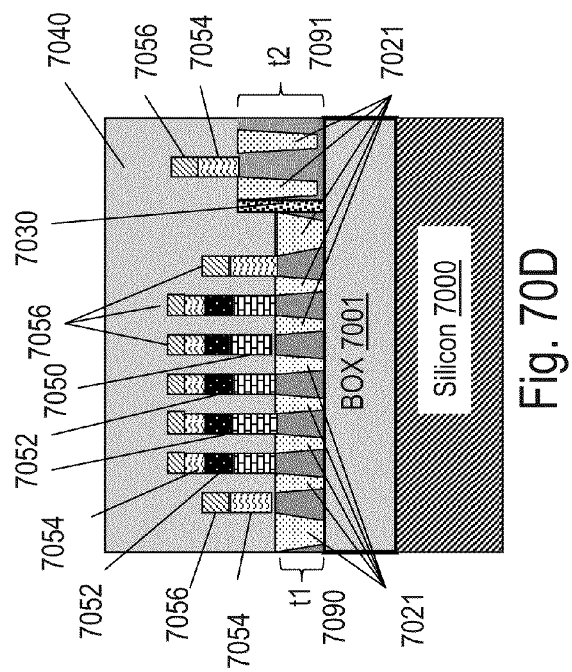
Figure 70A:
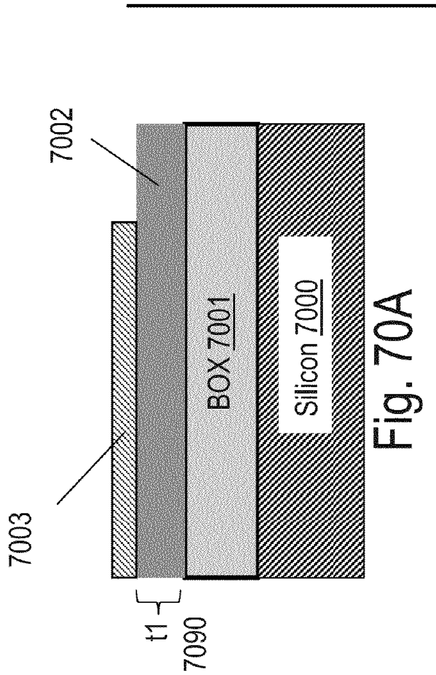

Step (A): An FD-SOI wafer, which may include silicon substrate 7000, buried oxide (BOX) 7001, and thin silicon mono-crystalline layer 7002, may have an oxide layer grown or deposited substantially on top of the thin silicon mono-crystalline layer 7002. Thin silicon mono-crystalline layer 7002 may be of thickness t1 7090 ranging from approximately 2 nm to approximately 100 nm, typically 5 nm to 15 nm. Thin silicon mono-crystalline layer 7002 may be substantially absent of semiconductor dopants to form an undoped silicon layer, or doped, such as, for example, with elemental or compound species that form a p+, or p−, or p, or n+, or n−, or n silicon layer. The oxide layer may be lithographically defined and etched substantially to removal such that oxide region 7003 may be formed. A plasma etch or an oxide etchant, such as, for example, a dilute solution of hydrofluoric acid, may be utilized. Thus thin silicon mono-crystalline layer 7002 may not covered by oxide region 7003 in desired areas where transistors and other devices that form the desired peripheral circuits may substantially and eventually reside. Oxide region 7003 may include multiple materials, such as silicon oxide and silicon nitride, and may act as a chemical mechanical polish (CMP) polish stop in subsequent steps. FIG. 70A illustrates the exemplary structure after Step (A).

Step (B): FIG. 70B illustrates the exemplary structure after Step (B). A selective expitaxy process may be utilized to grow crystalline silicon on the uncovered by oxide region 7003 surface of thin silicon mono-crystalline layer 7002, thus forming silicon mono-crystalline region 7004. The total thickness of crystalline silicon in this region that may be above BOX 7001 is t2 7091, which may be a combination of thickness t2 7090 of thin silicon mono-crystalline layer 7002 and silicon mono-crystalline region 7004. T2 7091 may be greater than t1 7090, and may be of thickness ranging from approximately 4 nm to approximately 1000 nm, typically 50 nm to 500 nm. Silicon mono-crystalline region 7004 may be may be substantially absent of semiconductor dopants to form an undoped silicon region, or doped, such as, for example, with elemental or compound species that form a p+, or p, or p−, or n+, or n, or n− silicon layer. Silicon mono-crystalline region 7004 may be substantially equivalent in concentration and type to thin silicon mono-crystalline layer 7002, or may have a higher or lower different dopant concentration and may have a differing dopant type. Silicon mono-crystalline region 7004 may be CMP'd for thickness control, utilizing oxide region 7003 as a polish stop, or for asperity control. Oxide region 7003 may be removed. Thus, there are silicon regions of thickness t1 7090 and regions of thickness t2 7091 on top of BOX 7001. The silicon regions of thickness t1 7090 may be utilized to construct fully depleted silicon-on-insulator transistors and memory cells, and regions of thickness t2 7091 may be utilized to construct partially depleted silicon-on-insulator transistors for the periphery circuits and memory control.

Figure 70C:
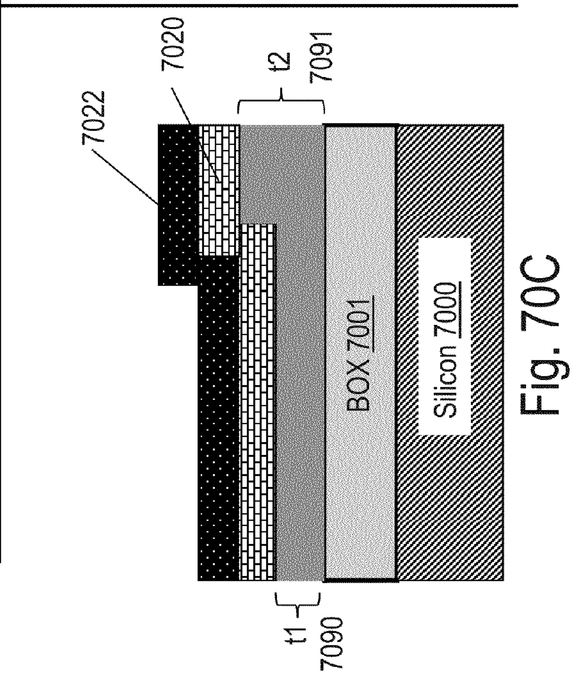

Step (C): FIG. 70C illustrates the exemplary structure after Step (C). Tunnel oxide layer 7020 may a grown or deposited and floating gate layer 7022 may be deposited.

Step (D): FIG. 70D illustrates the exemplary structure after Step (D). Isolation regions 7030 and others (not shown for clarity) may be formed in silicon mono-crystalline regions of thickness t1 7090 and may be formed in silicon mono-crystalline regions of thickness t2 7091. Floating gate layer 7022 and a portion or substantially all of tunnel oxide layer 7020 may be removed in the eventual periphery circuitry regions and the NAND string select gate regions. An inter-poly-dielectric (IPD) layer, such as, for example, an oxide-nitride-oxide ONO layer, may be deposited following which a control gate electrode, such as, for example, doped polysilicon, may then be deposited. The gate regions may be patterned and etched. Thus, tunnel oxide regions 7050, floating gate regions 7052, IPD regions 7054, and control gate regions 7056 may be formed. Not all regions are tag-lined for illustration clarity. Following this, source-drain regions 7021 may be implanted and activated by thermal or optical anneals. An inter-layer dielectric 7040 may then deposited and planarized. Contacts (not shown) may be made to connect bit-lines (BL) and source-lines (SL) to the NAND string. Contacts to the well of the NAND string (not shown) may also be made. All these contacts could be constructed of heavily doped polysilicon or some other material. Following this, wiring layers (not shown) for the memory array may be constructed. An exemplary 2D floating-gate memory on FD-SOI with functional periphery circuitry has thus been constructed.

Alternatively, as illustrated in FIGS. 70E-H, a monolithic 2D floating-gate flash memory on a fully depleted Silicon on Insulator (FD-SOI) substrate which utilizes partially depleted silicon-on-insulator transistors for the periphery may be constructed by first constructing the memory array and then constructing the periphery after a selective epitaxial deposition.

Figure 70F:
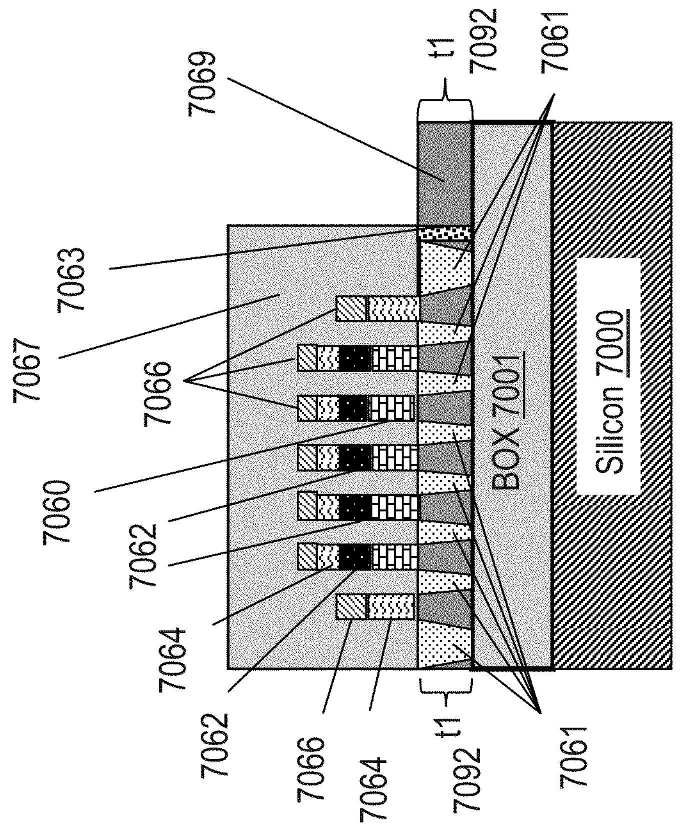
Figure 70E:
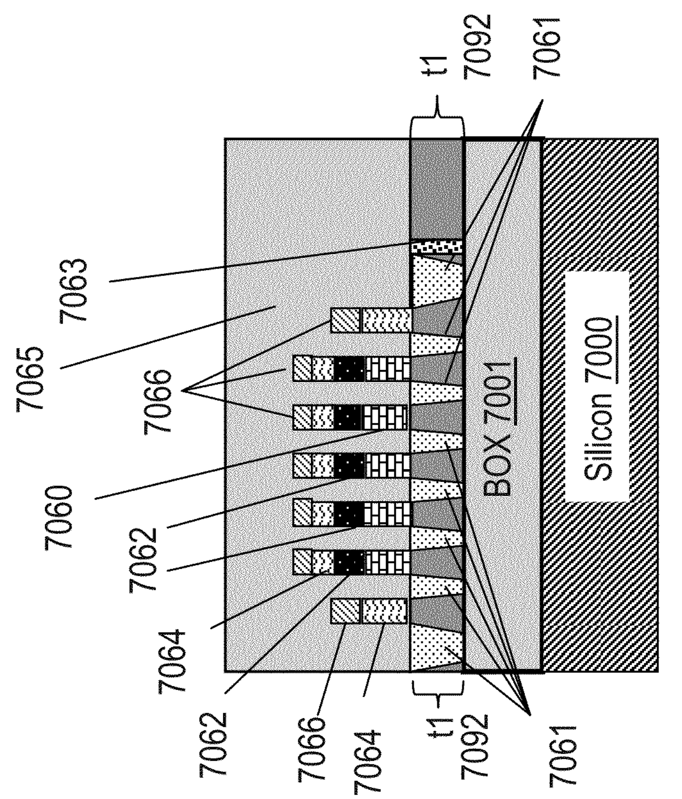

As illustrated in FIG. 70E, an FD-SOI wafer, which may include silicon substrate 7000, buried oxide (BOX) 7001, and thin silicon mono-crystalline layer 7002 of thickness t1 7092 ranging from approximately 2 nm to approximately 100 nm, typically 5 nm to 15 nm, may have a NAND string array constructed on regions of thin silicon mono-crystalline layer 7002 of thickness t1 7092. Thus forming tunnel oxide regions 7060, floating gate regions 7062, IPD regions 7064, control gate regions 7066, isolation regions 7063, memory source-drain regions 7061, and inter-layer dielectric 7065. Not all regions are tag-lined for illustration clarity. Thin silicon mono-crystalline layer of thickness t1 7092 may be substantially absent of semiconductor dopants to form an undoped silicon layer, or doped, such as, for example, with elemental or compound species that form a p+, or p−, or p, or n+, or n−, or n silicon layer.

As illustrated in FIG. 70F, the intended peripheral regions may be lithographically defined and the inter-layer dielectric 7065 etched in the exposed regions, thus exposing the surface of mono-crystalline silicon region 7069 and forming inter-layer dielectric region 7067.

Figure 70G:
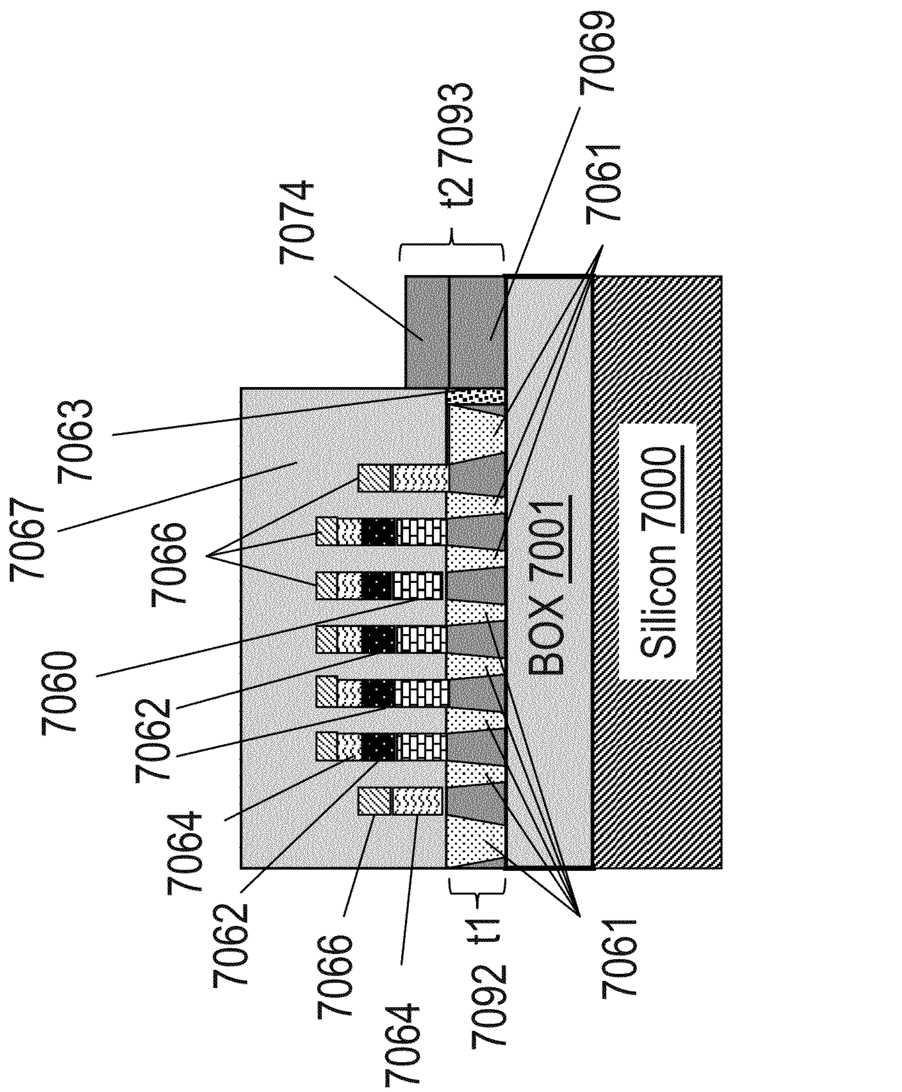

As illustrated in FIG. 70G, a selective epitaxial process may be utilized to grow crystalline silicon on the uncovered by inter-layer dielectric region 7067 surface of mono-crystalline silicon region 7069, thus forming silicon mono-crystalline region 7074. The total thickness of crystalline silicon in this region that may be above BOX 7001 is t2 7093, which may be a combination of thickness t1 7092 and silicon mono-crystalline region 7074. T2 7093 may be greater than t1 7092, and may be of thickness ranging from approximately 4 nm to approximately 1000 nm, typically 50 nm to 500 nm. Silicon mono-crystalline region 7074 may be may be substantially absent of semiconductor dopants to form an undoped silicon region, or doped, such as, for example, with elemental or compound species that form a p+, or p, or p−, or n+, or n, or n− silicon layer. Silicon mono-crystalline region 7074 may be substantially equivalent in concentration and type to thin silicon mono-crystalline layer of thickness t1 7092, or may have a higher or lower different dopant concentration and may have a differing dopant type.

Figure 70H:
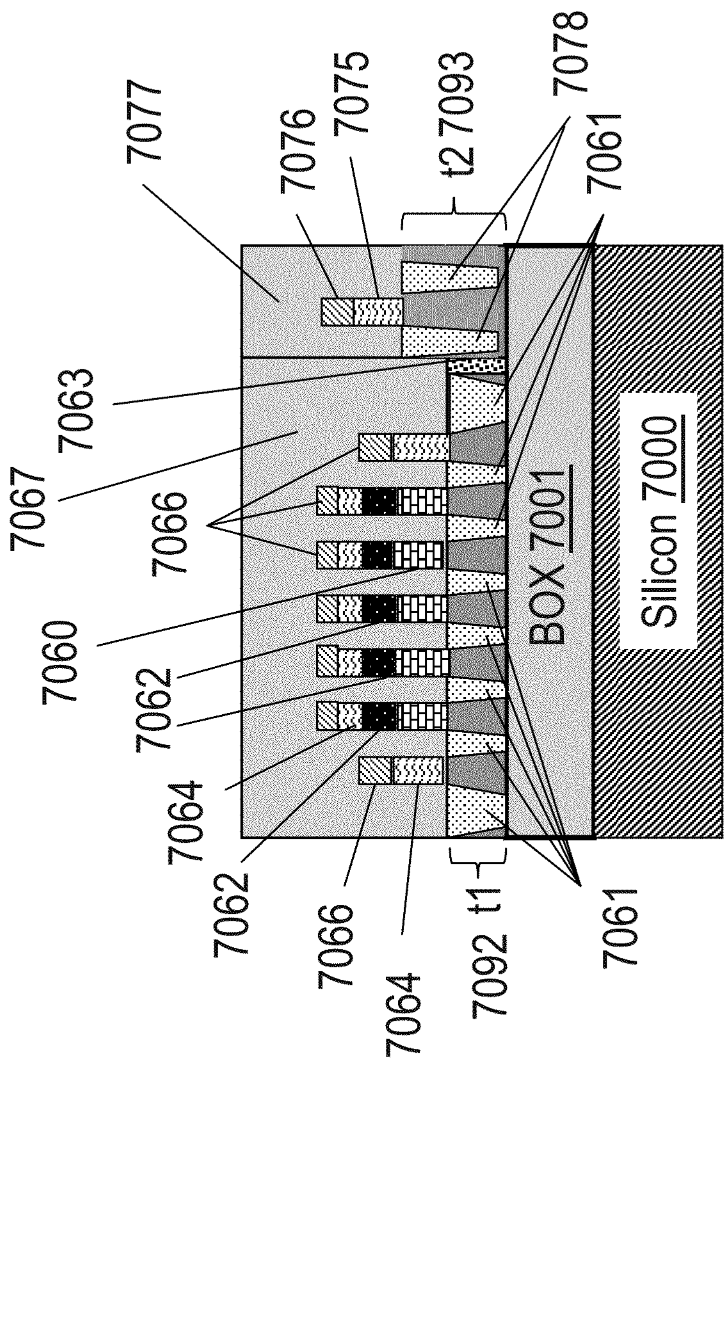

As illustrated in FIG. 70H, periphery transistors and devices may be constructed on regions of mono-crystalline silicon with thickness t2 7093, thus forming gate dielectric regions 7075, gate electrode regions 7076, source-drain regions 7078. The periphery devices may be covered with oxide 7077. Source-drain regions 7061 and source-drain regions 7078 may be activated by thermal or optical anneals, or may have been previously activated. An additional inter-layer dielectric (not shown) may then be deposited and planarized. Contacts (not shown) may be made to connect bit-lines (BL) and source-lines (SL) to the NAND string. Contacts to the well of the NAND string (not shown) and to the periphery devices may also be made. All these contacts could be constructed of heavily doped polysilicon or some other material. Following this, wiring layers (not shown) for the memory array may be constructed.

An exemplary 2D floating-gate memory on FD-SOI with functional periphery circuitry has thus been constructed.

Persons of ordinary skill in the art will appreciate that thin silicon mono-crystalline layer 7002 may be formed by other processes including a polycrystalline or amorphous silicon deposition and optical or thermal crystallization techniques. Moreover, thin silicon mono-crystalline layer 7002 may not be mono-crystalline, but may be polysilicon or partially crystallized silicon. Further, silicon mono-crystalline region 7004 or 7074 may be formed by other processes including a polycrystalline or amorphous silicon deposition and optical or thermal crystallization techniques. Additionally, thin silicon mono-crystalline layer 7002 and silicon mono-crystalline region 7004 or 7074 may be composed of more than one type of semiconductor doping or concentration of doping and may possess doping gradients. Moreover, while the exemplary process flow described with FIG. 70A-D showed the NAND string and the periphery sharing components such as the control gate and the IPD, a process flow may include separate lithography steps, dielectrics, and gate electrodes to form the NAND string than those utilized to form the periphery. Further, source-drain regions 7021 may be formed separately for the periphery transistors in silicon mono-crystalline regions of thickness t2 and those transistors in silicon mono-crystalline regions of thickness t1. Also, the NAND string source-drain regions may be formed separately from the select and periphery transistors. Furthermore, persons of ordinary skill in the art will appreciate that the process steps and concepts of forming regions of thicker silicon for the memory periphery circuits may be applied to many memory types, such as, for example, charge trap, resistive change, DRAM, SRAM, and floating body DRAM.

Section 7: Alternative Implementations of Various Monolithic 3D Memory Concepts

While the 3D DRAM and 3D resistive memory implementations in Section 3 and Section 4 have been described with single crystal silicon constructed with ion-cut technology, other options exist. One could construct them with selective epi technology. Procedures for doing these will be clear to those skilled in the art.

Various layer transfer schemes described in Section 1.3.4 can be utilized for constructing single-crystal silicon layers for memory architectures described in Section 3, Section 4, Section 5 and Section 6.

FIG. 41A-B may not be the only option for the architecture, as depicted in, for example, FIG. 28 through FIG. 40A-H, and FIGS. 70-71. Peripheral transistors within periphery layer 4102 may be constructed below the memory layers, for example, memory layer 1 4104, memory layer 2 4106, and/or memory layer 3 4108. Peripheral transistors within periphery layer 4110 could also be constructed above the memory layers, for example, memory layer 1 4104, memory layer 2 4106, and/or memory layer 3 4108, which may be atop substrate or memory layer 4 4112, as shown in FIG. 41B. For example, peripheral transistors within periphery layer 4110, would utilize sub-400° C. technologies including those described in Section 1 and Section 2, and could utilize transistors including, such as, junction-less transistors or recessed channel transistors.

The double gate devices shown in FIG. 28 through FIG. 40A-H have both gates connected to each other. Each gate terminal may be controlled independently, which may lead to design advantages for memory chips.

One of the concerns with using n+ Silicon as a control line for 3D memory arrays may be its high resistance. Using lithography and (single-step or multi-step) ion-implantation, one could dope heavily the n+ silicon control lines while not doping transistor gates, sources and drains in the 3D memory array. This preferential doping may mitigate the concern of high resistance.

Figure 42A:
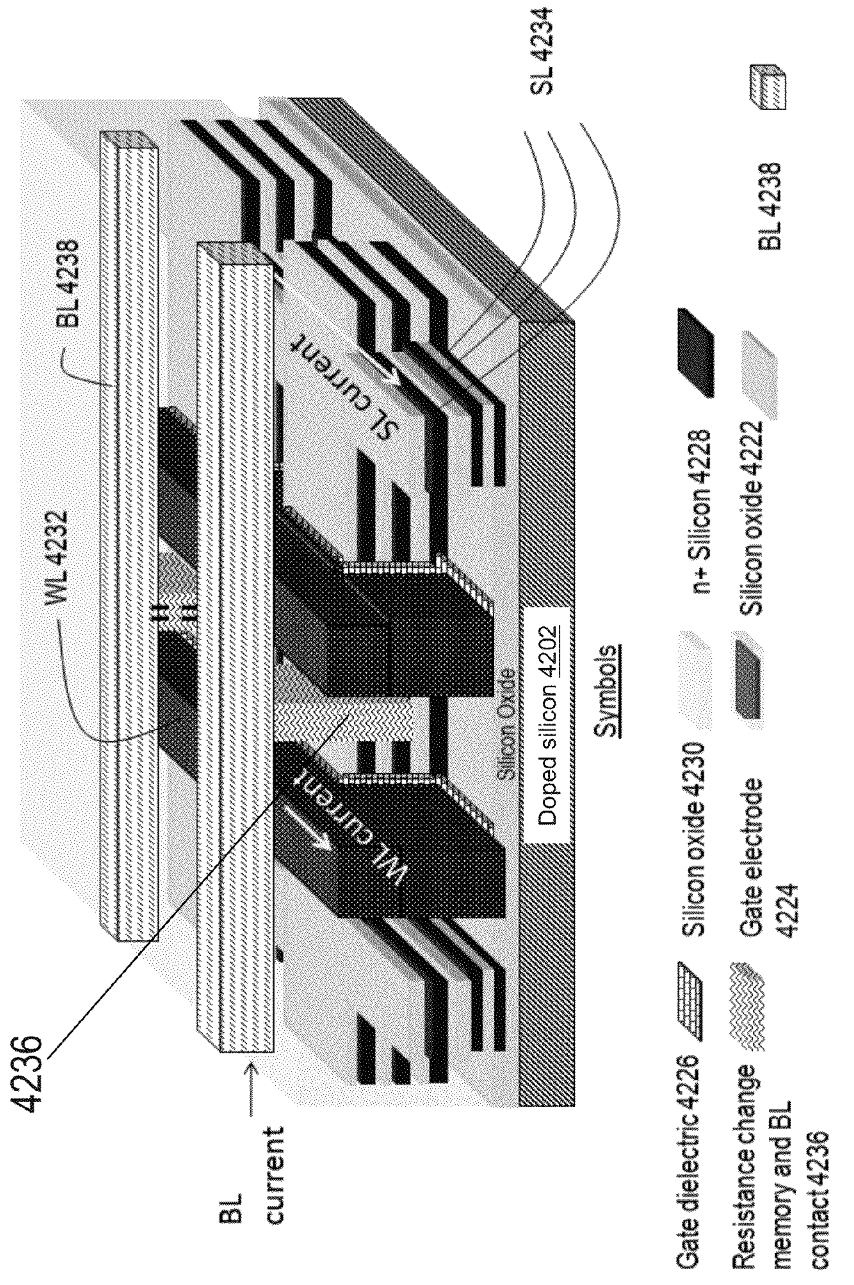
FIG. 42A-E show a method to make high-aspect ratio vias in 3D memory architectures.

In many of the described 3D memory approaches, etching and filling high aspect ratio vias may form a serious difficulty. One way to circumvent this obstacle may be by etching and filling vias from two sides of a wafer. A procedure for doing this may be shown in FIG. 42A-E. Although FIG. 42A-E describe the process flow for a resistive memory implementation, similar processes can be used for DRAM, charge-trap memories and floating-gate memories as well. The process may include several steps that proceed in the following sequence:

Step (A): 3D resistive memories are constructed as shown in FIG. 34A-K but with a bare silicon wafer 4202 instead of a wafer with peripheral circuits on it. Due to aspect ratio limitations, the resistance change memory and BL contact 4236 can only be formed to the top layers of the memory, as illustrated in FIG. 42A.

Figure 42B:
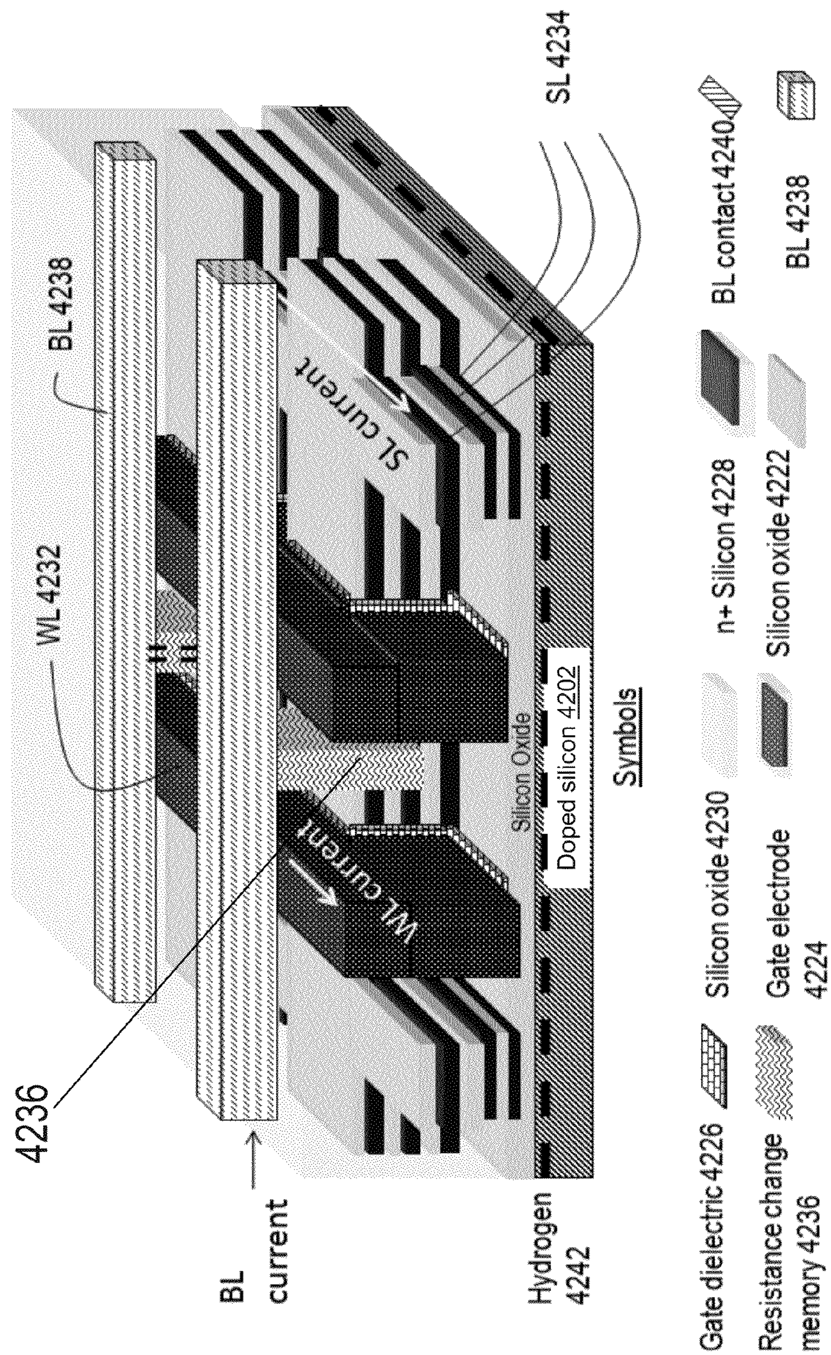

Step (B): Hydrogen may be implanted into the silicon wafer 4202 at a certain depth to form hydrogen implant plane 4242. FIG. 42B illustrates the structure after Step B.

Figure 42C:
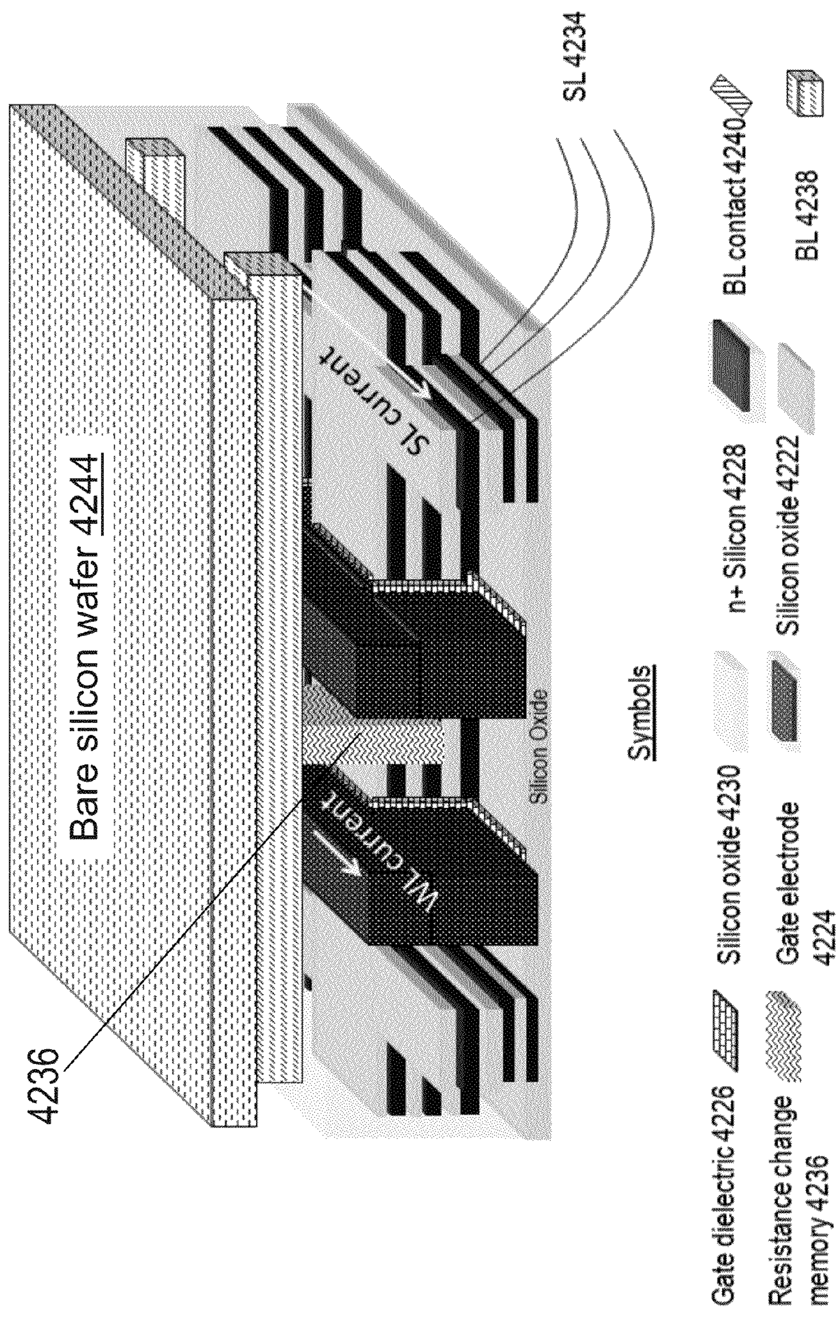

Step (C): The wafer with the structure after Step (B) may be bonded to a bare silicon wafer 4244. Cleaving may be then performed at the hydrogen implant plane 4242. A CMP process may be conducted to polish off the silicon wafer. FIG. 42C illustrates the structure after Step C.

Figure 42D:
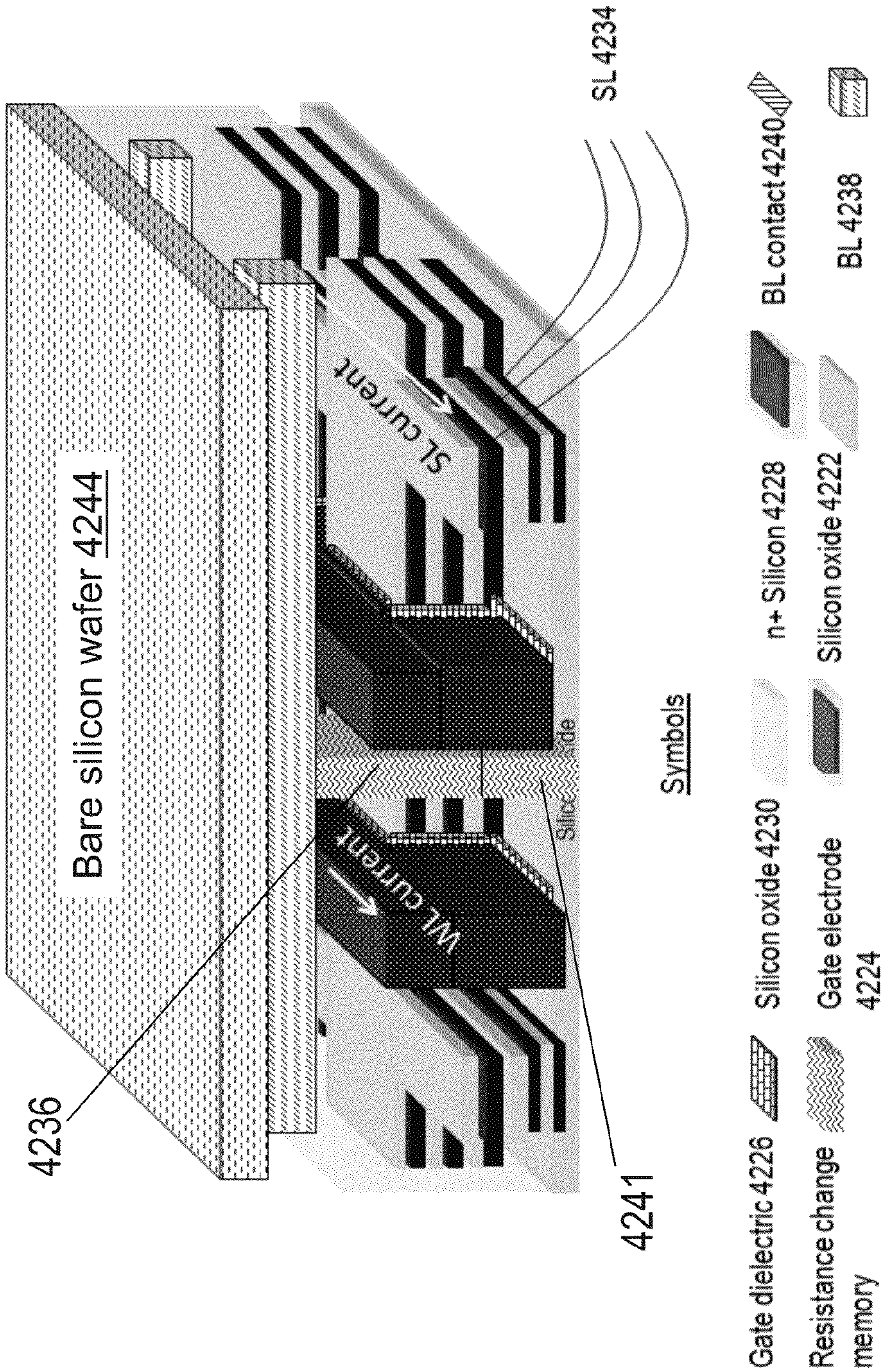

Step (D): Resistance change memory material and BL contact layers 4241 are constructed for the bottom memory layers. They connect to the partially made top resistance change memory and BL contacts 4236 with state-of-the-art alignment. FIG. 42D illustrates the structure after Step D.

Figure 42E:
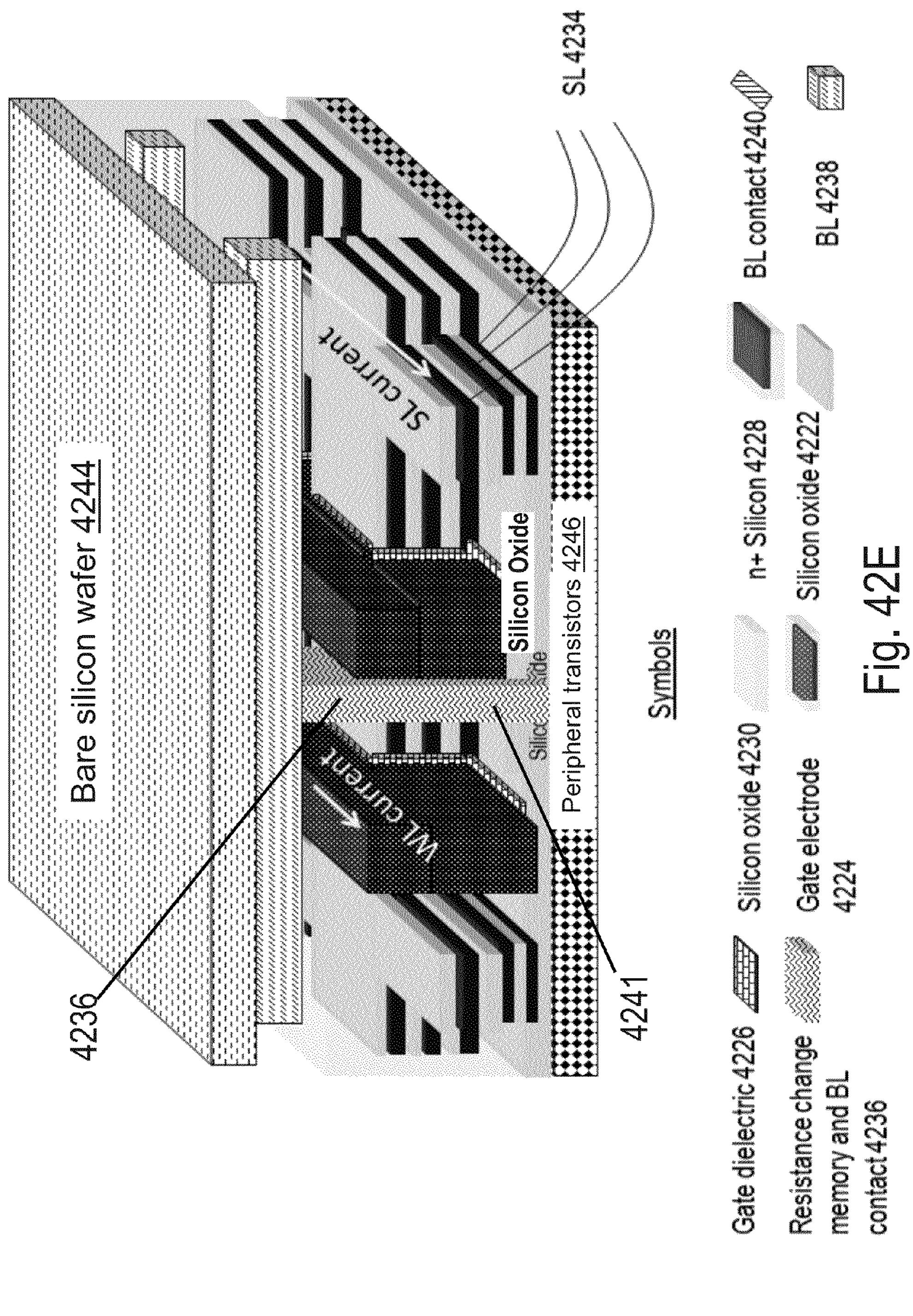

Step (E): Peripheral transistors 4246 are constructed using procedures shown previously in this document. FIG. 42E illustrates the structure after Step E. Connections are made to various wiring layers.

The charge-trap and floating-gate architectures shown in FIG. 36A-F through FIG. 40A-H are based on NAND flash memory. It will be obvious to one skilled in the art that these architectures can be modified into a NOR flash memory style as well.

Section 8: Poly-Silicon-Based Implementation of Various Memory Concepts

The monolithic 3D integration concepts described in this patent application can lead to novel embodiments of poly-silicon-based memory architectures as well. Poly silicon based architectures could potentially be cheaper than single crystal silicon based architectures when a large number of memory layers need to be constructed. While the below concepts are explained by using resistive memory architectures as an example, it will be clear to one skilled in the art that similar concepts can be applied to NAND flash memory and DRAM architectures described previously in this patent application.

Figure 50A:
FIG. 50A-E show polysilicon select devices for 3D memory and peripheral circuits at the bottom according to some embodiments of the current invention.

FIG. 50A-E shows one embodiment of the current invention, where polysilicon junction-less transistors are used to form a 3D resistance-based memory. The utilized junction-less transistors can have either positive or negative threshold voltages. The process may include the following steps as described in the following sequence:

Step (A): As illustrated in FIG. 50A, peripheral circuits 5002 are constructed above which oxide layer 5004 may be made.

Figure 50B:
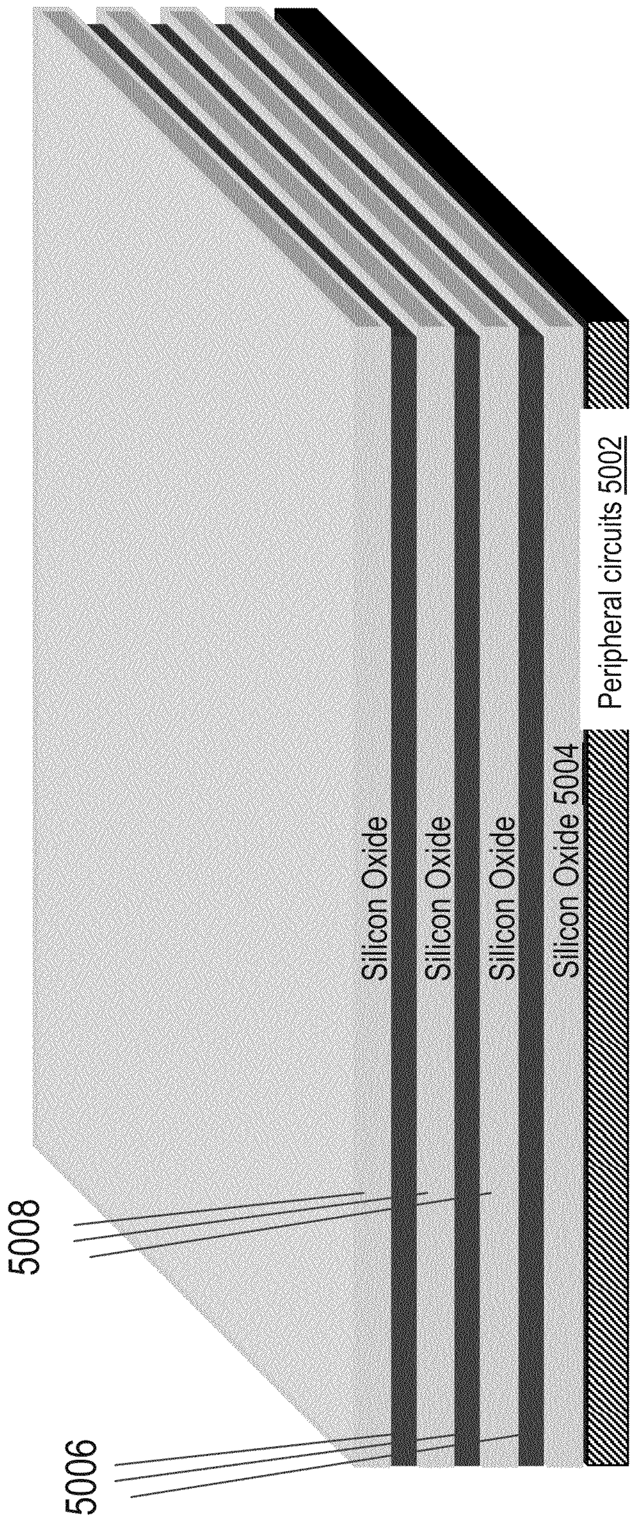

Step (B): As illustrated in FIG. 50B, multiple layers of n+ doped amorphous silicon or polysilicon 5006 are deposited with layers of silicon dioxide 5008 in between. The amorphous silicon or polysilicon layers 5006 could be deposited using a chemical vapor deposition process, such as Low Pressure Chemical Vapor Deposition (LPCVD) or Plasma Enhanced Chemical Vapor Deposition (PECVD).

Figure 50C:
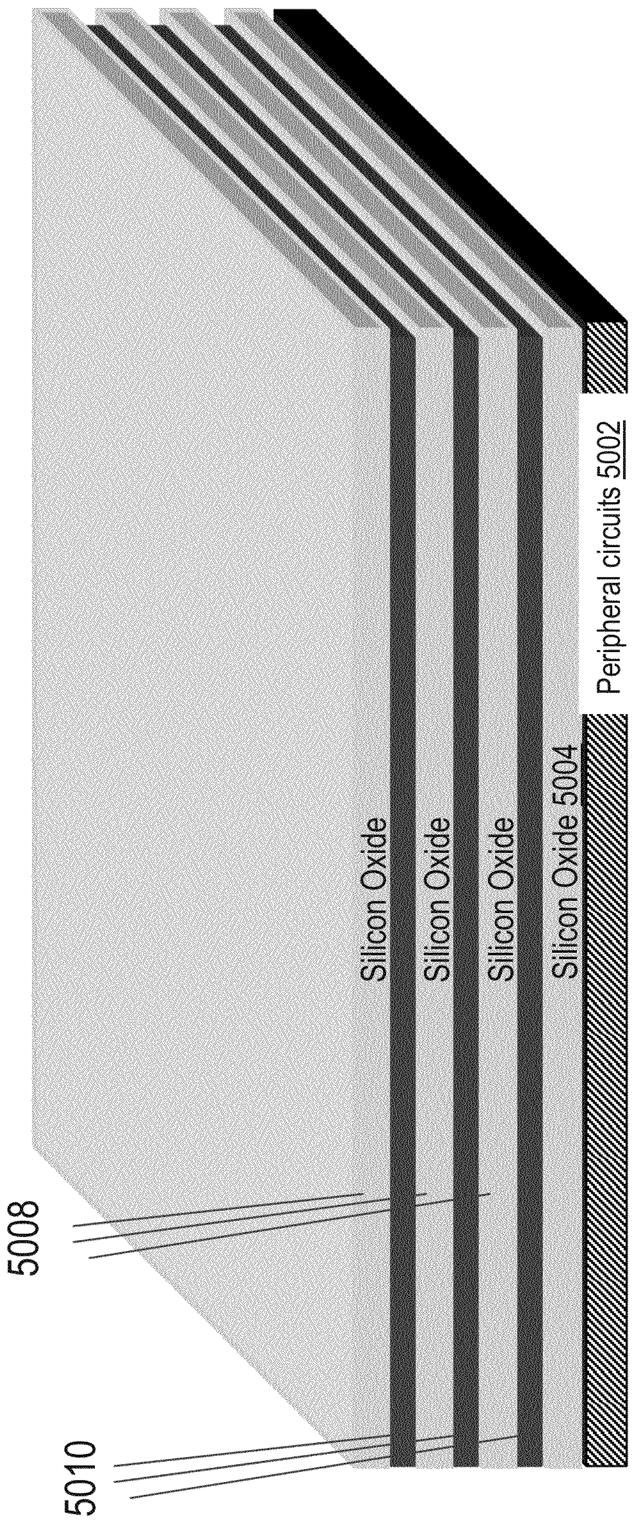

Step (C): As illustrated in FIG. 50C, a Rapid Thermal Anneal (RTA) may be conducted to crystallize the layers of polysilicon or amorphous silicon deposited in Step (B). Temperatures during this RTA could be as high as about 500° C. or more, and could even be as high as about 800° C. The polysilicon region obtained after Step (C) may be indicated as 5010. Alternatively, a laser anneal could be conducted, either for all amorphous silicon or polysilicon layers 5006 at the same time or layer by layer. The thickness of the oxide layer 5004 would need to be optimized if that process were conducted.

Figure 50D:
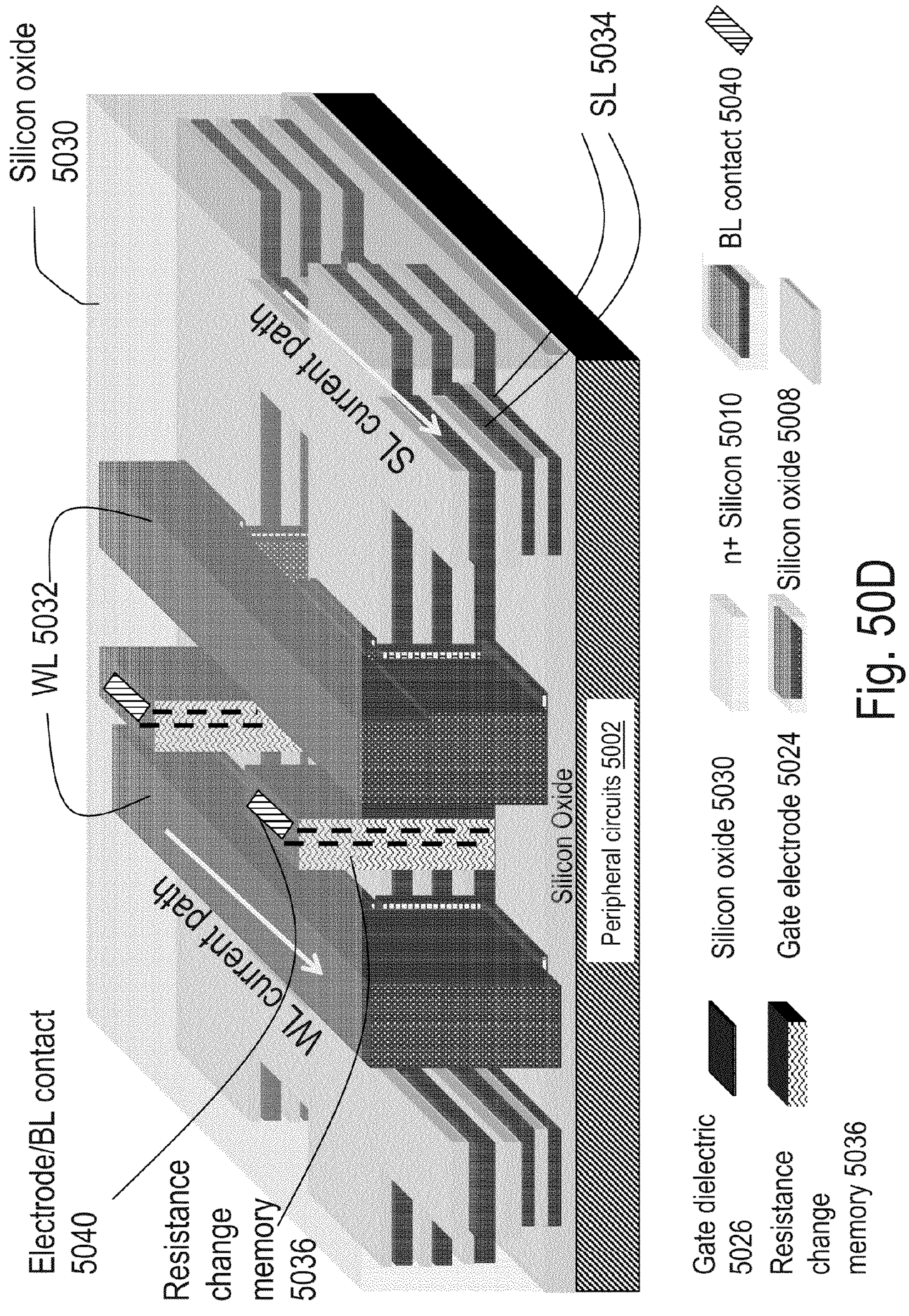

Step (D): As illustrated in FIG. 50D, procedures similar to those described in FIG. 32E-H are utilized to construct the structure shown. The structure in FIG. 50D has multiple levels of junction-less transistor selectors for resistive memory devices. The resistance change memory may be indicated as 5036 while its electrode and contact to the BL may be indicated as 5040. The WL may be indicated as 5032, while the SL may be indicated as 5034. Gate dielectric of the junction-less transistor may be indicated as 5026 while the gate electrode of the junction-less transistor may be indicated as 5024, this gate electrode also serves as part of the WL 5032. Silicon oxides may be indicated by 5030.

Figure 50E:
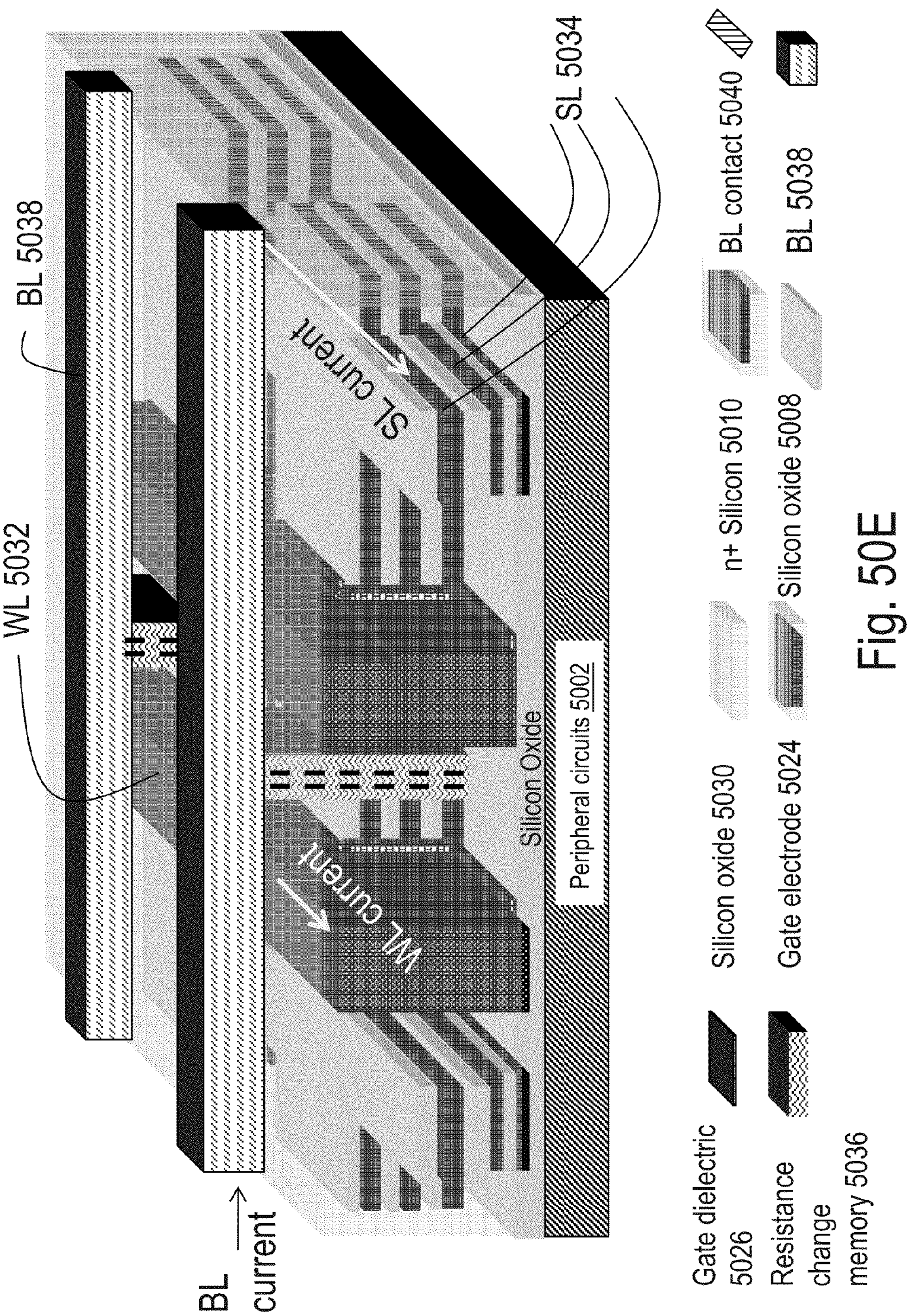

Step (E): As illustrated in FIG. 50E, bit lines (indicated as BL 5038) may be constructed. Contacts may then be made to peripheral circuits and various parts of the memory array as described in embodiments described previously.

Figure 51A:
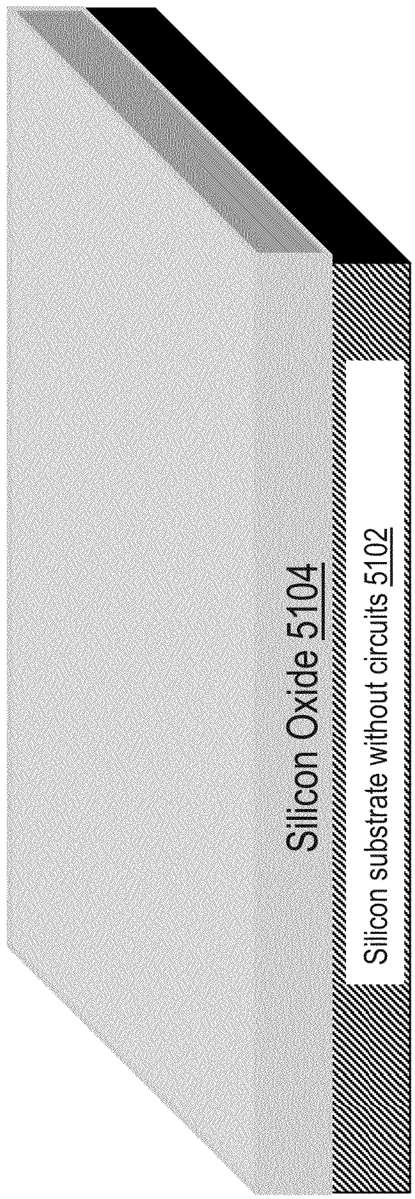
FIG. 51A-F show polysilicon select devices for 3D memory and peripheral circuits at the top according to some embodiments of the current invention.

FIG. 51A-F show another embodiment of the current invention, where polysilicon junction-less transistors are used to form a 3D resistance-based memory. The utilized junction-less transistors can have either positive or negative threshold voltages. The process may include the following steps occurring in sequence:

Step (A): As illustrated in FIG. 51A, a layer of silicon dioxide 5104 may be deposited or grown above a silicon substrate without circuits 5102.

Figure 51B:
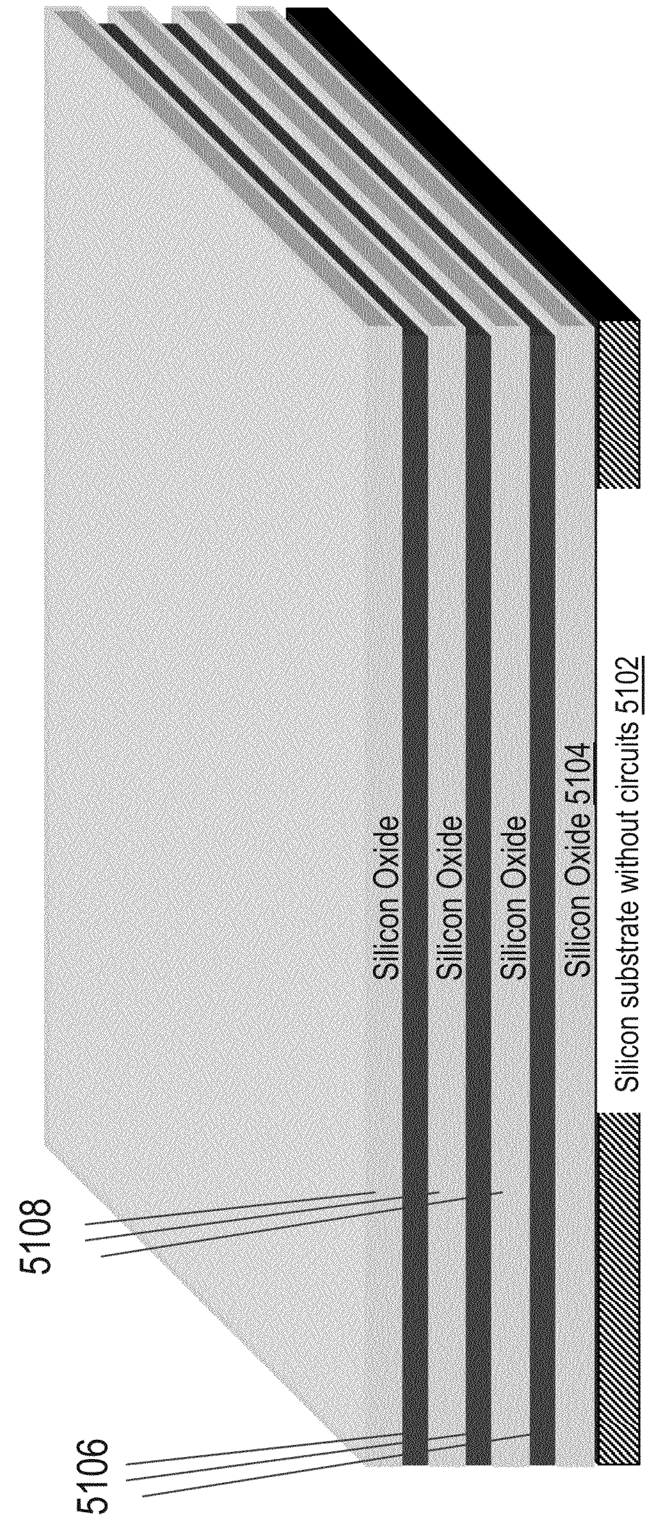

Step (B): As illustrated in FIG. 51B, multiple layers of n+ doped amorphous silicon or polysilicon 5106 are deposited with layers of silicon dioxide 5108 in between. The amorphous silicon or polysilicon layers 5106 could be deposited using a chemical vapor deposition process, such as LPCVD or PECVD.

Figure 51C:
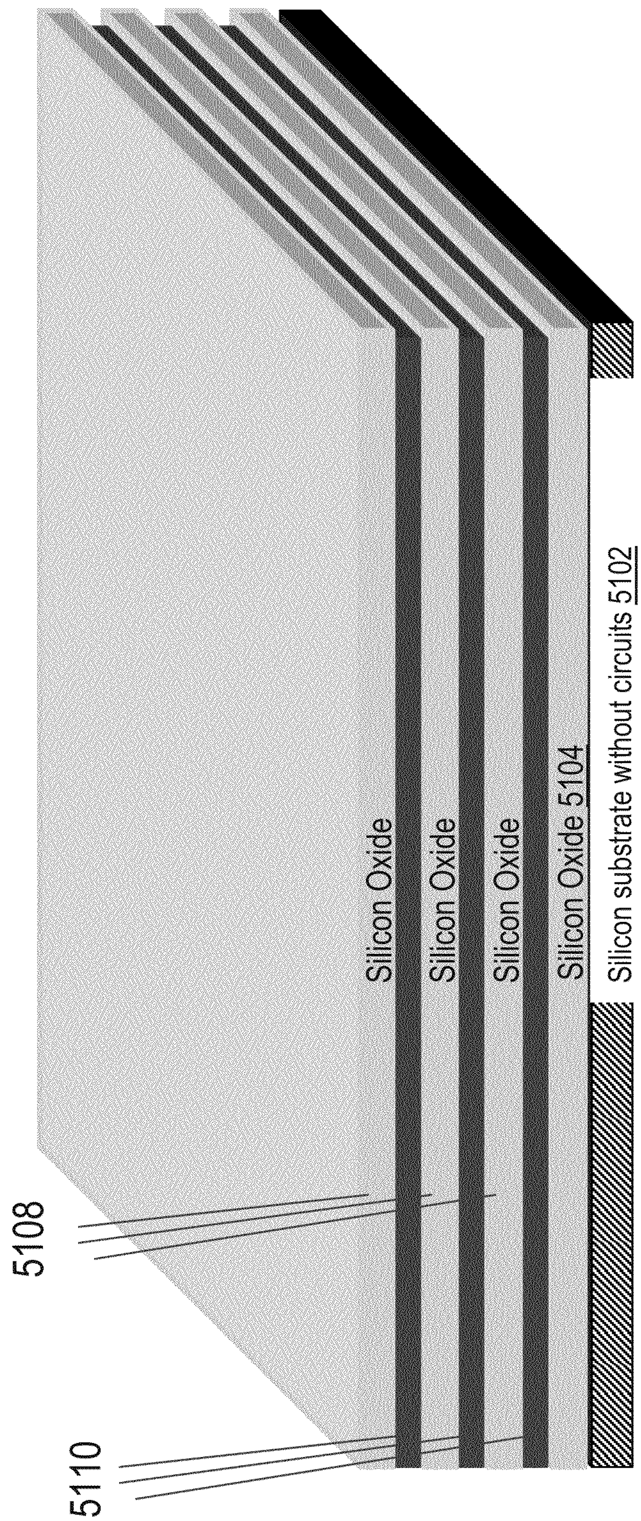
Figure 51D:
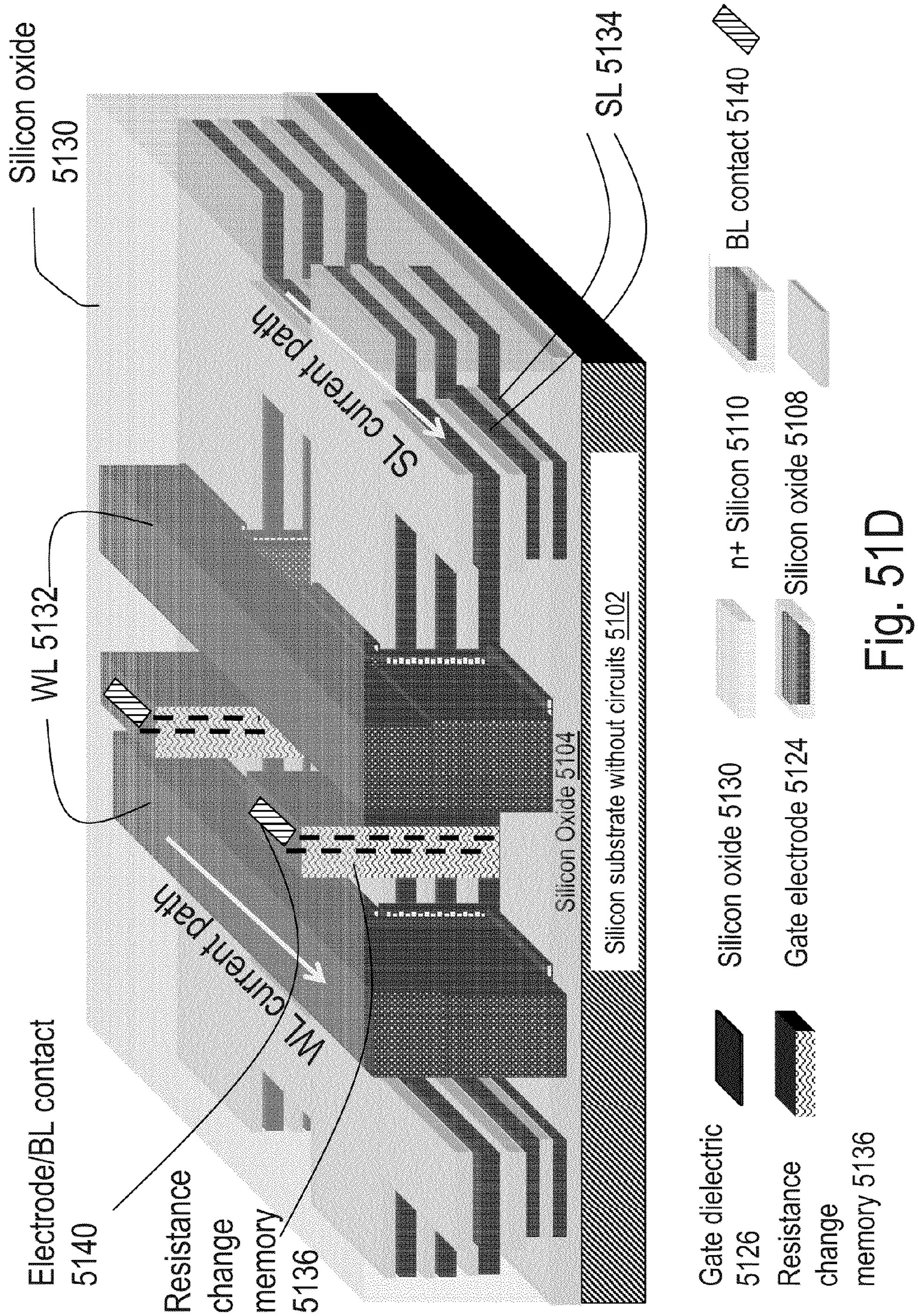

Step (C): As illustrated in FIG. 51C, a Rapid Thermal Anneal (RTA) or standard anneal may be conducted to crystallize the layers of polysilicon or amorphous silicon deposited in Step (B). Temperatures during this RTA could be as high as about 700° C. or more, and could even be as high as about 1400° C. The polysilicon region obtained after Step (C) may be indicated as 5110. Since there are no circuits under these layers of polysilicon, very high temperatures (such as, for example, about 1400° C.) can be used for the anneal process, leading to very good quality polysilicon with few grain boundaries and very high mobilities approaching those of single crystal silicon. Alternatively, a laser anneal could be conducted, either for all amorphous silicon or polysilicon layers 5106 at the same time or layer by layer at different times.

Step (D): This may be illustrated in FIG. 51D. Procedures similar to those described in FIG. 32E-H are utilized to get the structure shown in FIG. 51D that has multiple levels of junction-less transistor selectors for resistive memory devices. The resistance change memory may be indicated as 5136 while its electrode and contact to the BL may be indicated as 5140. The WL may be indicated as 5132, while the SL may be indicated as 5134. Gate dielectric of the junction-less transistor may be indicated as 5126 while the gate electrode of the junction-less transistor may be indicated as 5124, this gate electrode also serves as part of the WL 5132. Silicon oxides may be indicated by 5130.

Figure 51E:
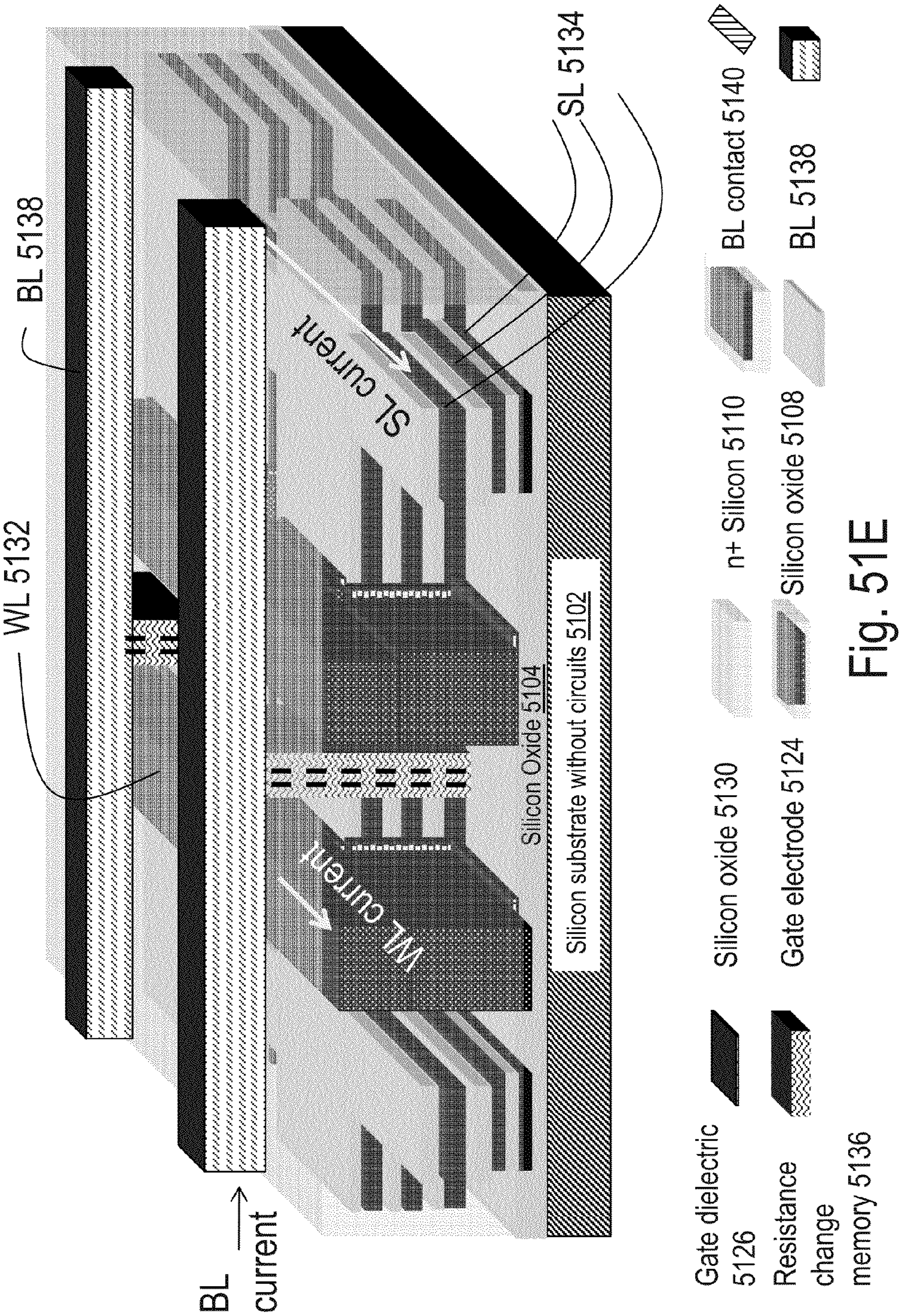
Figure 51F:
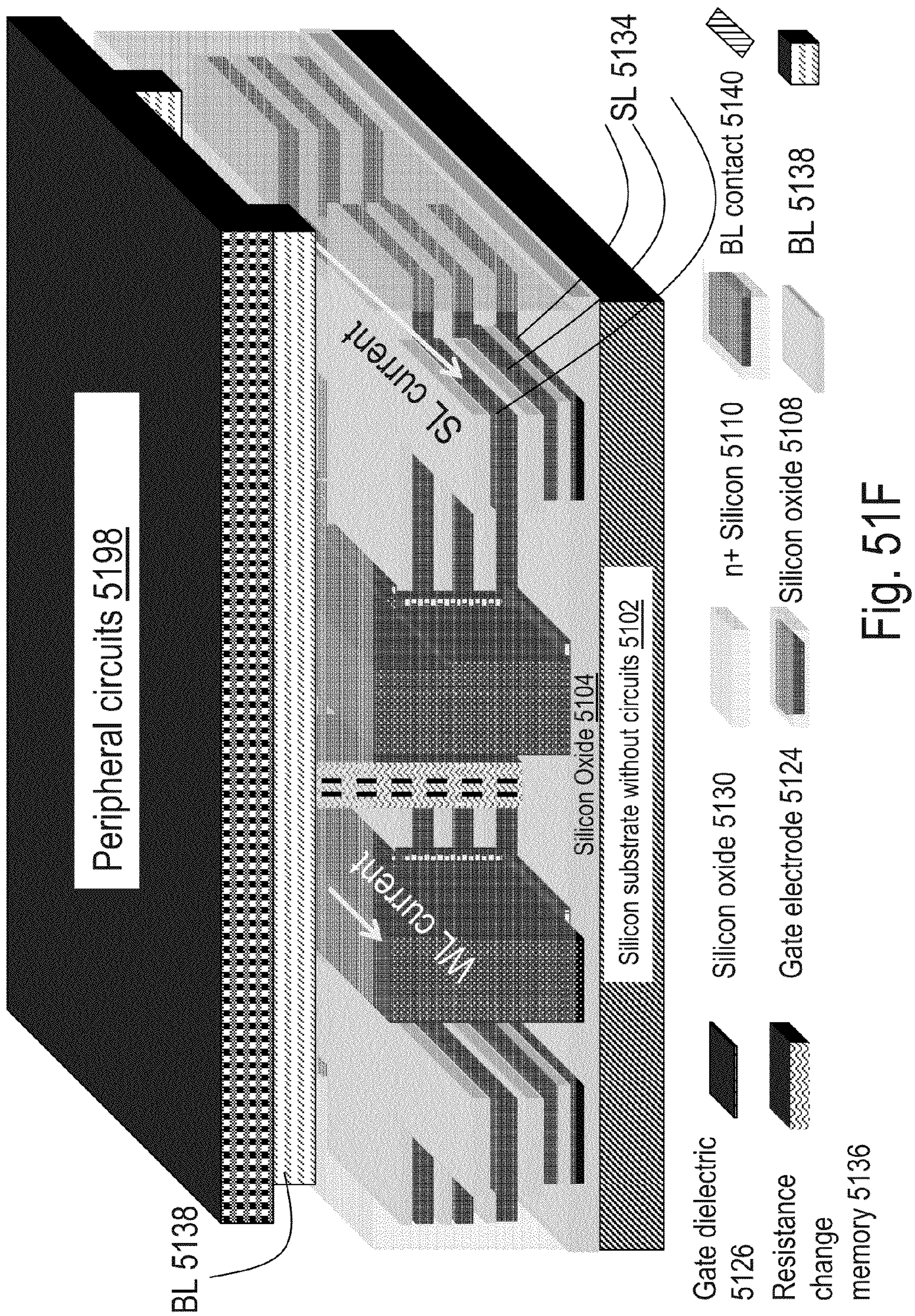

Step (E): This is illustrated in FIG. 51E. Bit lines (indicated as BL 5138) are constructed. Contacts are then made to peripheral circuits and various parts of the memory array as described in embodiments described previously.

Step (F): Using procedures described in Section 1 and Section 2 of this patent application, peripheral circuits 5198 (with transistors and wires) could be formed well aligned to the multiple memory layers shown in Step (E). For the periphery, one could use the process flow shown in Section 2 where replacement gate processing may be used, or one could use sub-400° C. processed transistors such as junction-less transistors or recessed channel transistors. Alternatively, one could use laser anneals for peripheral transistors' source-drain processing. Various other procedures described in Section 1 and Section 2 could also be used. Connections can then be formed between the multiple memory layers and peripheral circuits. By proper choice of materials for memory layer transistors and memory layer wires (e.g., by using tungsten and other materials that withstand high temperature processing for wiring), even standard transistors processed at high temperatures (greater than about 1000° C.) for the periphery could be used.

Section 9: Monolithic 3D SRAM

The techniques described in this patent application can be used for constructing monolithic 3D SRAMs as well.

FIG. 52A-D represent SRAM embodiment of the current invention, where ion-cut may be utilized for constructing a monolithic 3D SRAM. Peripheral circuits are first constructed on a silicon substrate, and above this, two layers of nMOS transistors and one layer of pMOS transistors are formed using ion-cut and procedures described earlier in this patent application. Implants for each of these layers are performed when the layers are being constructed, and finally, after all layers have been constructed, a RTA may be conducted to activate dopants. If high k dielectrics are utilized for this process, a gate-first approach may be preferred.

Figure 52A:
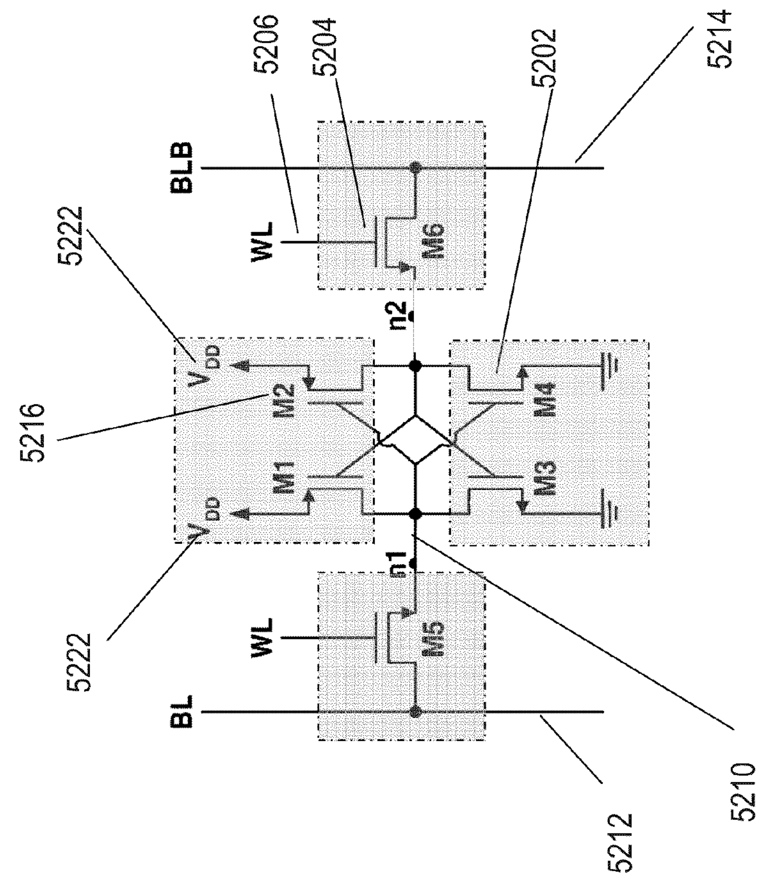
FIG. 52A-D show a monolithic 3D SRAM according to some embodiments of the current invention.

FIG. 52A shows a standard six-transistor SRAM cell according to one embodiment of the current invention. There are two pull-down nMOS transistors 5202 in FIG. 52A-D. There are also two pull-up pMOS transistors, each of which may be represented by 5216. There are two nMOS pass transistors 5204 connecting bit-line wiring 5212 and bit line complement wiring 5214 to the pull-up transistors 5216 and pull-down nMOS transistors 5202, and these are represented by 5214. Gates of nMOS pass transistors 5214 are represented by 5206 and are connected to word-lines (WL) using WL contacts 5208. Supply voltage VDD may be denoted as 5222 while ground voltage GND may be denoted as 5224. Nodes n1 and n2 within the SRAM cell are represented as 5210.

Figure 52B:
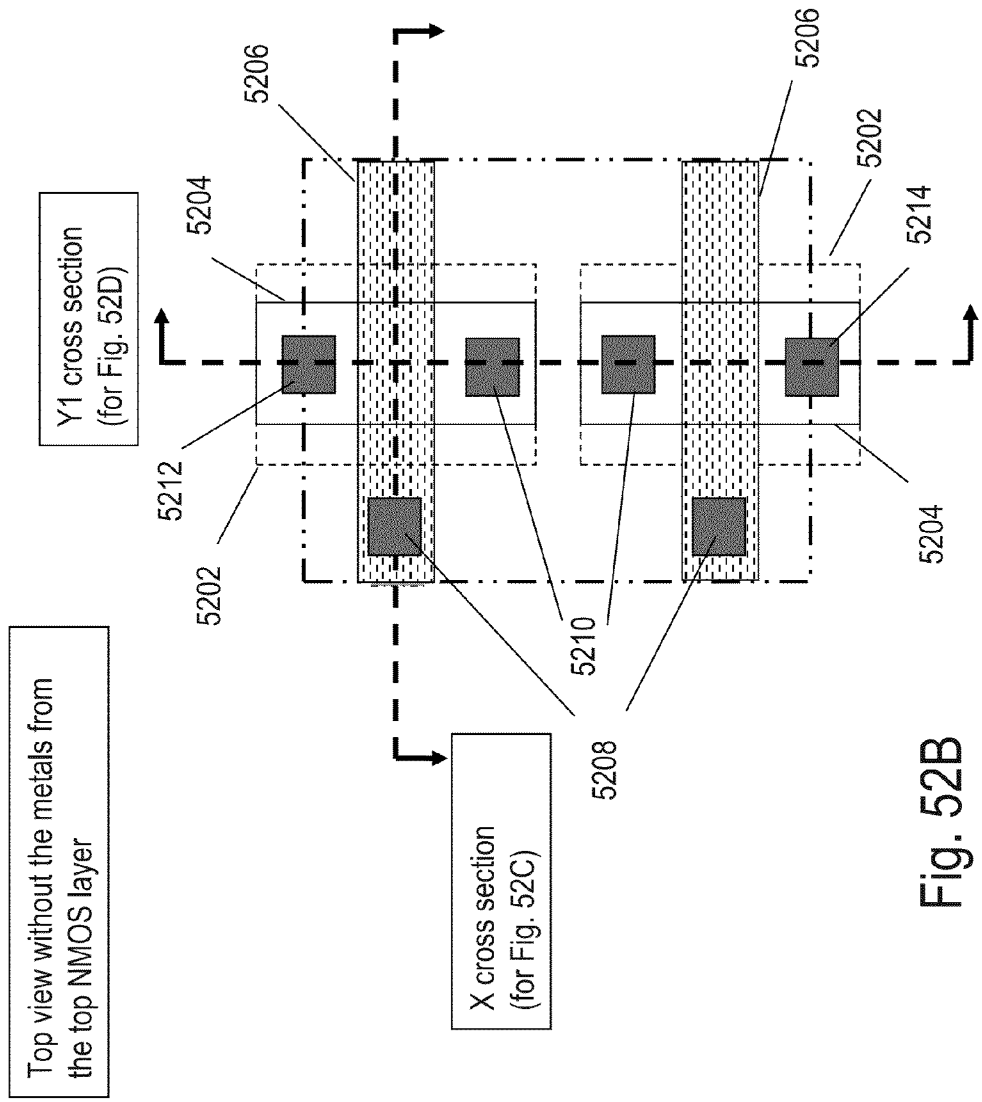

FIG. 52B shows a top view of the SRAM according to one embodiment of the current invention. For the SRAM described in FIG. 52A-D, the bottom layer may be the periphery. The nMOS pull-down transistors are above the bottom layer. The pMOS pull-up transistors are above the nMOS pull-down transistors. The nMOS pass transistors are above the pMOS pull-up transistors. The nMOS pass transistors 5204 on the topmost layer are displayed in FIG. 52B. Gates 5206 for nMOS pass transistors 5204 are also shown in FIG. 52B. All other numerals have been described previously in respect of FIG. 52A.

Figure 52C:
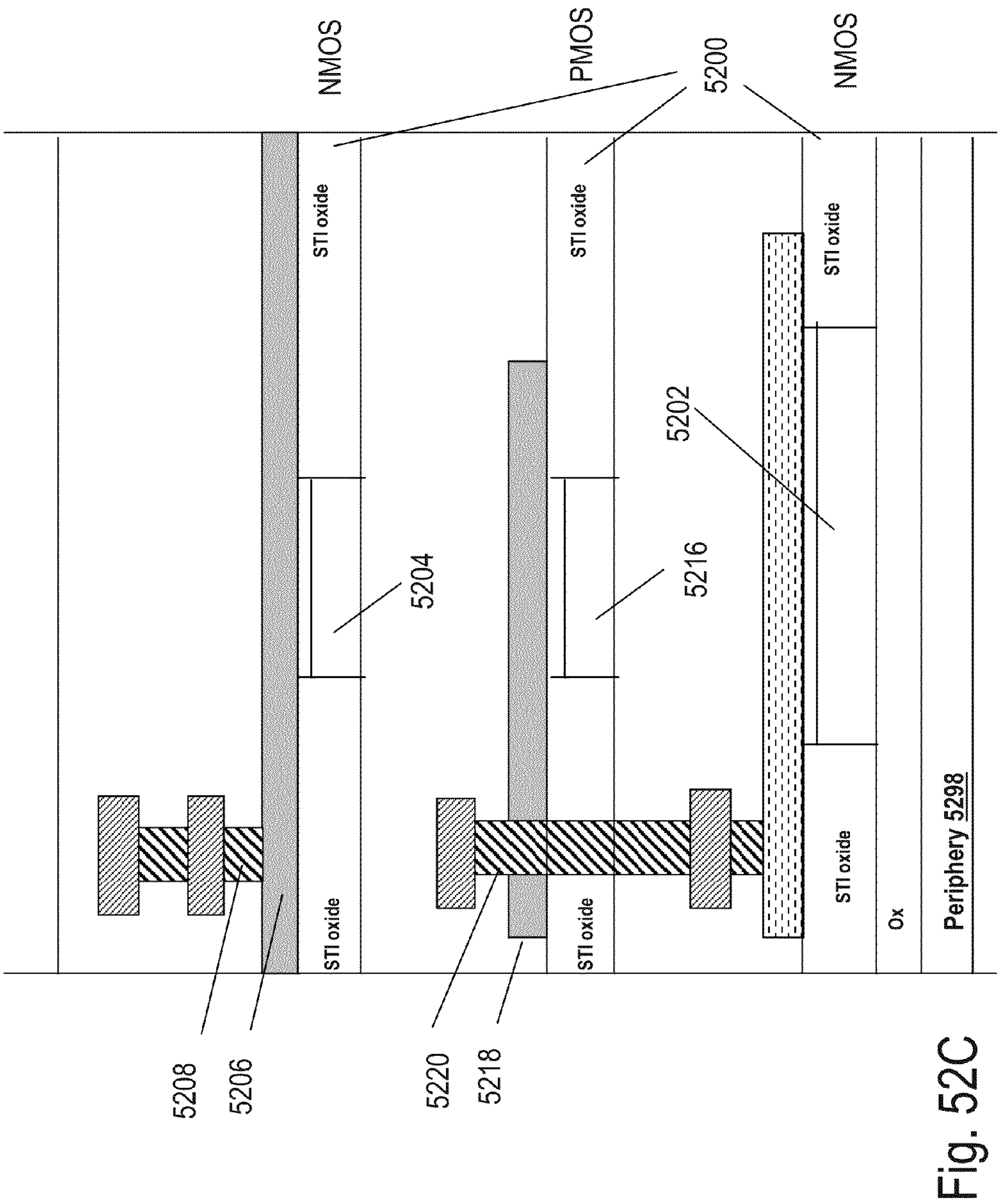

FIG. 52C shows a cross-sectional view of the SRAM according one embodiment of the current invention. Oxide isolation using a STI process may be indicated as 5200. Gates for pull-up pMOS transistors are indicated as 5218 while the vertical contact to the gate of the pull-up pMOS and nMOS transistors may be indicated as 5220. The periphery layer may be indicated as 5298. All other numerals have been described in respect of FIG. 52A and FIG. 52B.

Figure 52D:
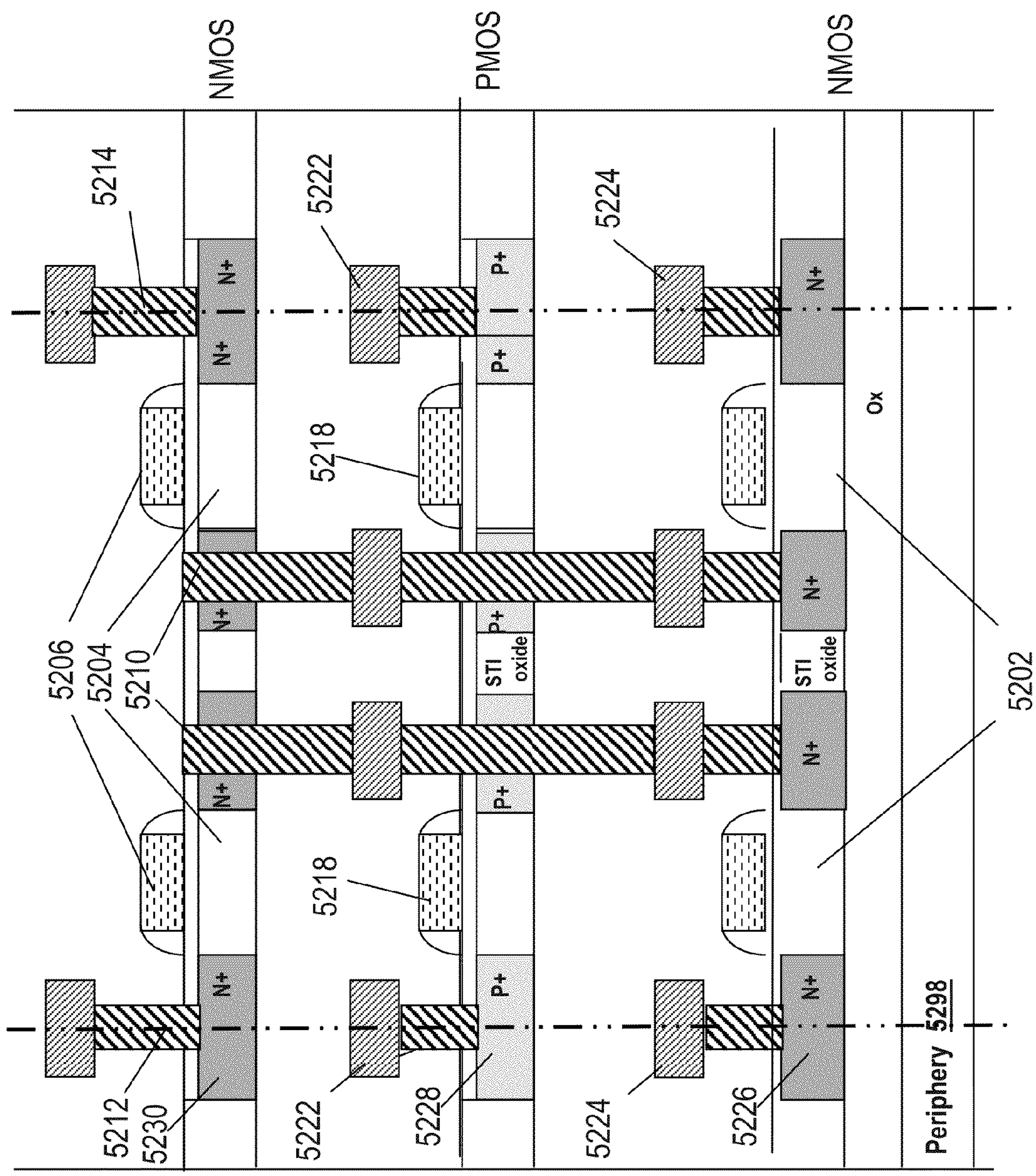

FIG. 52D shows another cross-sectional view of the SRAM according one embodiment of the current invention. The nodes n1 and n2 are connected to pull-up, pull-down and pass transistors by using a vertical via 5210. 5226 may be a heavily doped n+ Si region of the pull-down transistor, 5228 may be a heavily doped p+ Si region of the pull-up transistor and 5230 may be a heavily doped n+ region of a pass transistor. All other symbols have been described previously in respect of FIG. 52A, FIG. 52B and FIG. 52C. Wiring connects together different elements of the SRAM as shown in FIG. 52A.

It can be seen that the SRAM cell shown in FIG. 52A-D may be small in terms of footprint compared to a standard 6 transistor SRAM cell. Previous work has suggested building six-transistor SRAMs with nMOS and pMOS devices on different layers with layouts similar to the ones described in FIG. 52A-D. These are described in "The revolutionary and truly 3-dimensional 25 $F^2$ SRAM technology with the smallest $S^3$ (stacked single-crystal Si) cell, 0.16 $um^2$, and SSTFT (stacked single-crystal thin film transistor) for ultra-high density SRAM," VLSI Technology, 2004. Digest of Technical Papers. 2004 Symposium on, vol., no., pp. 228-229, 15-17 Jun. 2004 by Soon-Moon Jung; Jaehoon Jong; Wonseok Cho; Jaehwan Moon; KunhoKwak; Bonghyun Choi; Byungjun Hwang; Hoon Lim; JaehunJeong; Jonghyuk Kim; Kinam Kim. However, these devices are constructed using selective epi technology, which suffers from defect issues. These defects severely impact SRAM operation. The embodiment of this invention described in FIG. 52A-D may be constructed with ion-cut technology and may be thus far less prone to defect issues compared to selective epi technology.

It is clear to one skilled in the art that other techniques described in this patent application, such as use of junction-less transistors or recessed channel transistors, could be utilized to form the structures shown in FIG. 52A-D. Alternative layouts for 3D stacked SRAM cells are possible as well, where heavily doped silicon regions could be utilized as GND, VDD, bit line wiring and bit line complement wiring. For example, the region 5226 (in FIG. 52D), instead of serving just as a source or drain of the pull-down transistor, could also run all along the length of the memory array and serve as a GND wiring line. Similarly, the heavily doped p+ Si region of the pull-up transistor 5228 (in FIG. 52D), instead of serving just as a source or drain of the pull-up transistor, could run all along the length of the memory array and serve as a VDD wiring line. The heavily doped n+ region of a pass transistor 5230 could run all along the length of the memory array and serve as a bit line.

Section 10: NuPackaging Technology

Figure 53A:
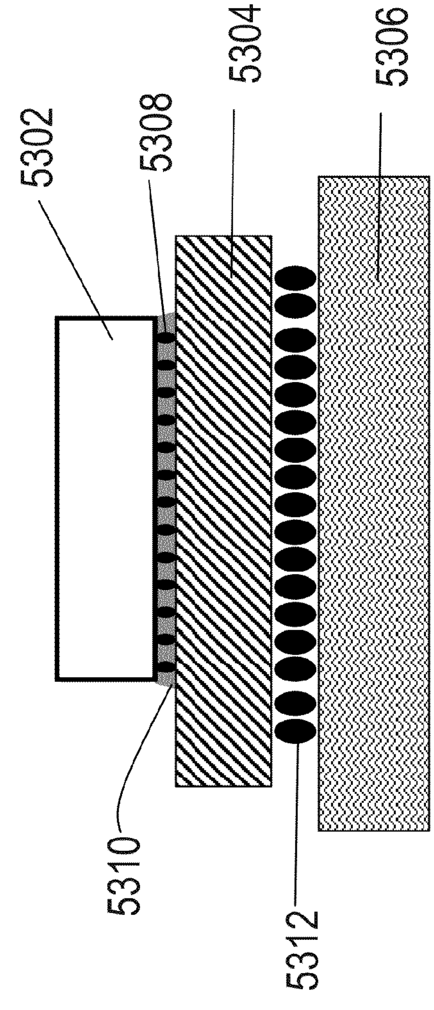
FIG. 53A-B show prior-art packaging schemes used in commercial products.
Figure 53B:
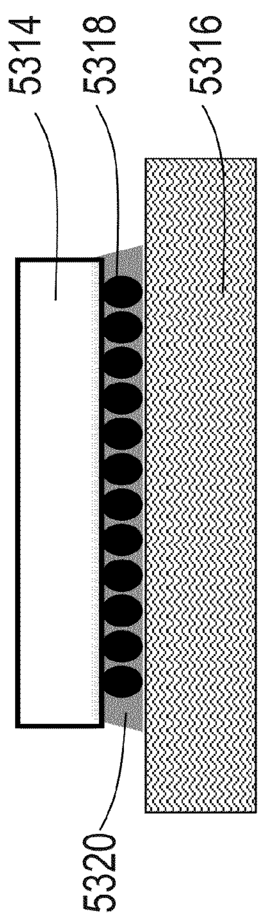

FIG. 53A illustrates a packaging scheme used for several high-performance microchips. A silicon chip 5302 may be attached to an organic substrate 5304 using solder bumps

5308. The organic substrate 5304, in turn, may be connected to an FR4 printed wiring board (also called board) 5306 using solder bumps 5312. The co-efficient of thermal expansion (CTE) of silicon may be about 3.2 ppm/K, the CTE of organic substrates may be typically about 17 ppm/K and the CTE of FR4 material may be typically about 17 ppm/K. Due to this large mismatch between CTE of the silicon chip 5302 and the organic substrate 5304, the solder bumps 5308 are subjected to stresses, which can cause defects and cracking in solder bumps 5308. To avoid this, underfill material 5310 may be dispensed between solder bumps. While underfill material 5310 can prevent defects and cracking, it can cause other challenges. Firstly, when solder bump sizes are reduced or when high density of solder bumps may be required, dispensing underfill material becomes difficult or even impossible, since underfill cannot flow in little spaces. Secondly, underfill may be hard to remove once dispensed. Due to this, if a chip on a substrate may be found to have defects and needs to be removed and replaced by another chip, it may be difficult. This makes production of multi-chip substrates difficult. Thirdly, underfill can cause the stress due to the mismatch of CTE between the silicon chip 5302 and the organic substrate 5304 to be more efficiently communicated to the low k dielectric layers present between on-chip interconnects.

Figure 54B:
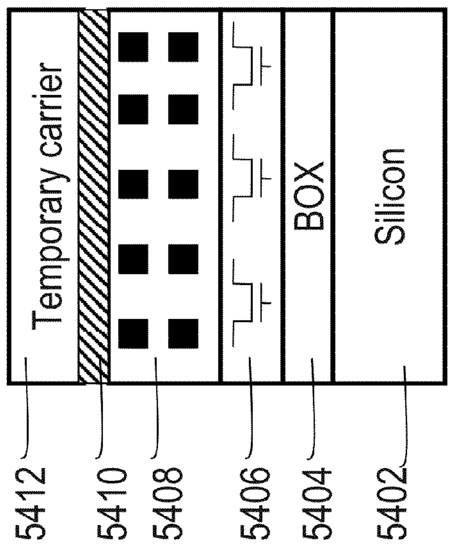
FIG. 54A-F illustrate a process flow to construct packages without underfill for Silicon-on-Insulator technologies.

FIG. 54B illustrates a packaging scheme used for many low-power microchips. A silicon chip 5314 may be directly connected to an FR4 substrate 5316 using solder bumps 5318. Due to the large difference in CTE between the silicon chip 5314 and the FR4 substrate 5316, underfill 5320 may be dispensed many times between solder bumps. As mentioned previously, underfill brings with it challenges related to difficulty of removal and stress communicated to the chip low k dielectric layers.

Figure 54D:
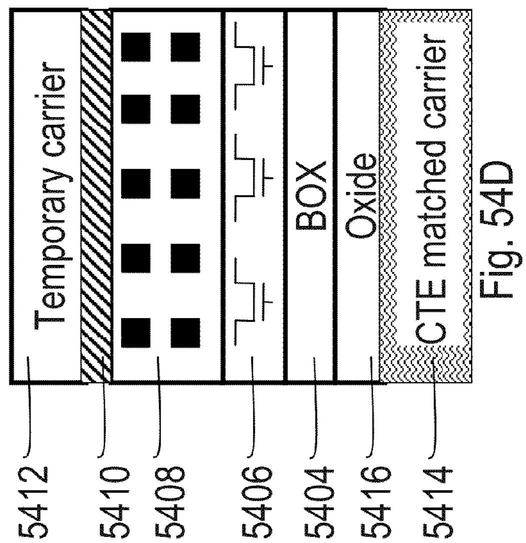
Figure 54A:
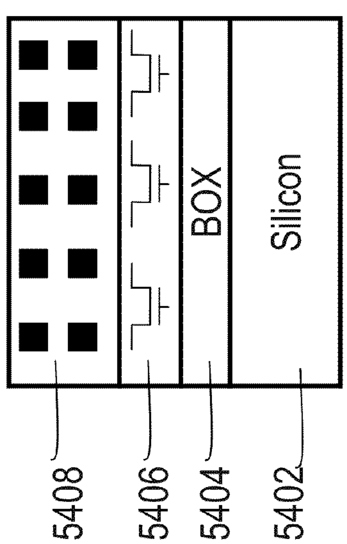

In both of the packaging types described in FIG. 54A and FIG. 54B and also many other packaging methods available in the literature, the mismatch of co-efficient of thermal expansion (CTE) between a silicon chip and a substrate, or between a silicon chip and a printed wiring board, may be a serious issue in the packaging industry. A technique to solve this problem without the use of underfill may be advantageous.

FIG. 54A-F describes an embodiment of this invention, where use of underfill may be avoided in the packaging process of a chip constructed on a silicon-on-insulator (SOI) wafer. Although this invention is described with respect to one type of packaging scheme, it will be clear to one skilled in the art that the invention may be applied to other types of packaging. The process flow for the SOI chip could include the following steps that occur in sequence from Step (A) to Step (F). When the same reference numbers are used in different drawing figures (among FIG. 54A-F), they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 54A. An SOI wafer with transistors constructed on silicon layer 5406 has a buried oxide layer 5404 atop silicon layer 5402. Interconnect layers 5408, which may include metals such as aluminum or copper and insulators such as silicon oxide or low k dielectrics, are constructed as well.

Step (B) is illustrated in FIG. 54B. A temporary carrier wafer 5412 can be attached to the structure shown in FIG. 54A using a temporary bonding adhesive 5410. The temporary carrier wafer 5412 may be constructed with a material, such as, for example, glass or silicon. The temporary bonding adhesive 5410 may include, for example, a polyimide such as DuPont HD3007.

Figure 54C:
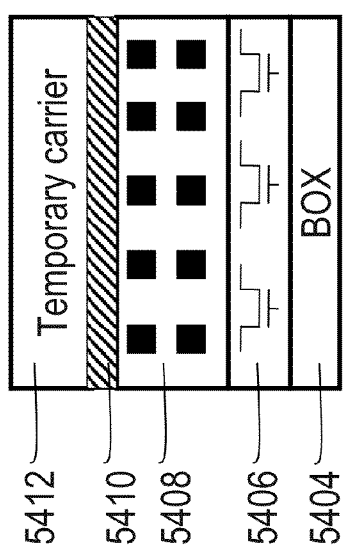

Step (C) is illustrated using FIG. 54C. The structure shown in FIG. 54B may be subjected to a selective etch process, such as, for example, a Potassium Hydroxide etch, (potentially combined with a back-grinding process) where silicon layer 5402 is removed using the buried oxide layer 5404 as an etch stop. Once the buried oxide layer 5404 is reached during the etch step, the etch process is stopped. The etch chemistry is selected such that it etches silicon but does not etch the buried oxide layer 5404 appreciably. The buried oxide layer 5404 may be polished with CMP to ensure a planar and smooth surface.

Step (D) is illustrated using FIG. 54D. The structure shown in FIG. 54C may be bonded to an oxide-coated carrier wafer having a co-efficient of thermal expansion (CTE) similar to that of the organic substrate used for packaging. The carrier wafer described in the previous sentence will be called a CTE matched carrier wafer henceforth in this document. The bonding step may be conducted using oxide-to-oxide bonding of buried oxide layer 5404 to the oxide coating 5416 of the CTE matched carrier wafer 5414. The CTE matched carrier wafer 5414 may include materials, such as, for example, copper, aluminum, organic materials, copper alloys and other materials that provides a matched CTE.

Figure 54F:
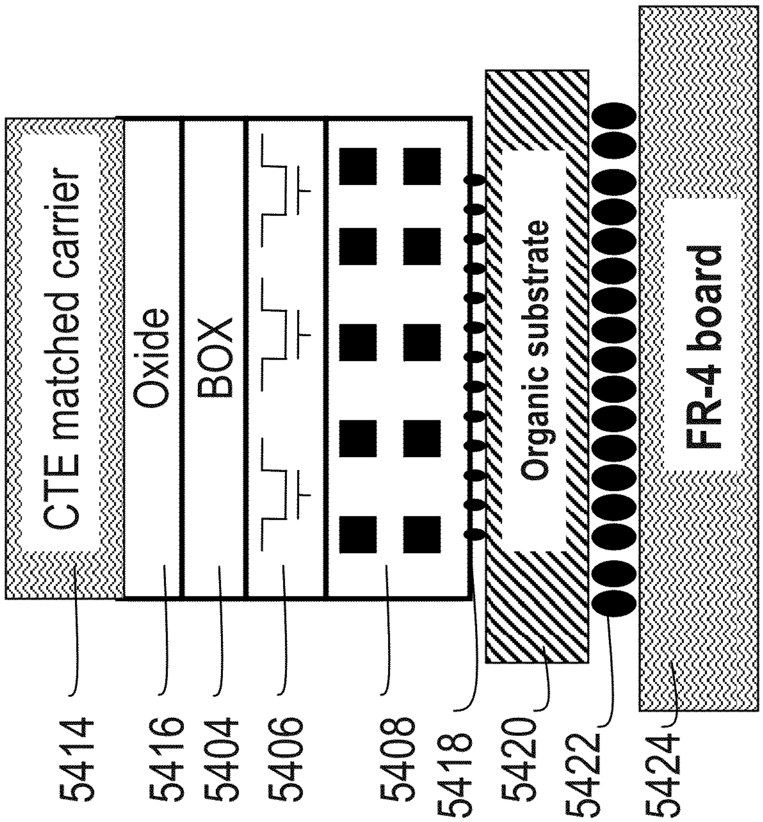
Figure 54E:
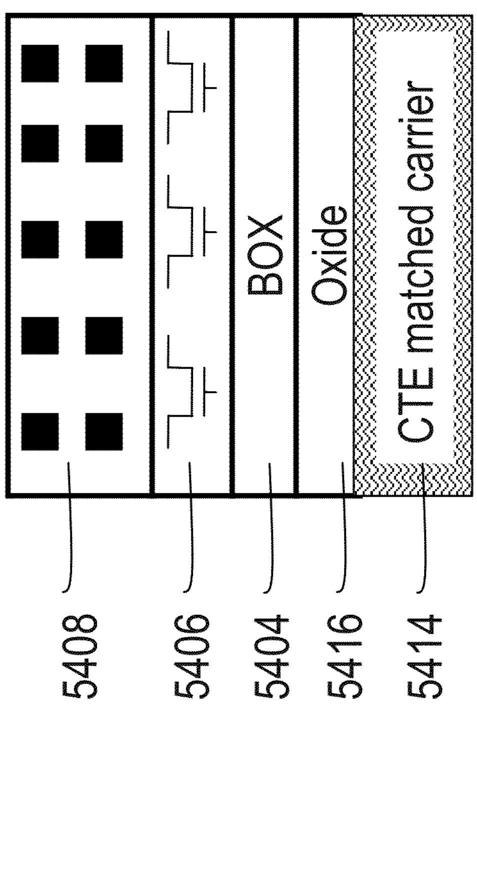

Step (E) is illustrated using FIG. 54E. The temporary carrier wafer 5412 may be detached from the structure at the surface of the interconnect layers 5408 by removing the temporary bonding adhesive 5410. This detachment may be done, for example, by shining laser light through the glass temporary carrier wafer 5412 to ablate or heat the temporary bonding adhesive 5410.

Step (F) is illustrated using FIG. 54F. Solder bumps 5418 may be constructed for the structure shown in FIG. 54E. After dicing, this structure may be attached to organic substrate 5420. This organic substrate may then be attached to a printed wiring board 5424, such as, for example, an FR4 substrate, using solder bumps 5422.

There are two key conditions while choosing the CTE matched carrier wafer 5414 for this embodiment of the invention. Firstly, the CTE matched carrier wafer 5414 should have a CTE close to that of the organic substrate 5420. Preferably, the CTE of the CTE matched carrier wafer 5414 should be within approximately 10 ppm/K of the CTE of the organic substrate 5420. Secondly, the volume of the CTE matched carrier wafer 5414 should be much higher than the silicon layer 5406. Preferably, the volume of the CTE matched carrier wafer 5414 may be, for example, greater than approximately 5 times the volume of the silicon layer 5406. When this happens, the CTE of the combination of the silicon layer 5406 and the CTE matched carrier wafer 5414 may be close to that of the CTE matched carrier wafer 5414. If these two conditions are met, the issues of co-efficient of thermal expansion mismatch described previously are ameliorated, and a reliable packaging process may be obtained without underfill being used.

The organic substrate 5420 typically has a CTE of approximately 17 ppm/K and the printed wiring board 5424 typically is constructed of FR4 which has a CTE of approximately 18 ppm/K. If the CTE matched carrier wafer is constructed of an organic material having a CTE of approximately 17 ppm/K, it can be observed that issues of co-efficient of thermal expansion mismatch described previously are ameliorated, and a reliable packaging process may be obtained without underfill being used. If the CTE matched carrier wafer is constructed of a copper alloy having a CTE of approximately 17 ppm/K, it can be observed that issues of co-efficient of thermal expansion mismatch described previously are ameliorated, and a reliable packaging process may be obtained without underfill being used. If the CTE matched carrier wafer is constructed of an aluminum alloy material having a CTE of approximately 24 ppm/K, it can be observed that issues of co-efficient of thermal expansion mismatch described previously are ameliorated, and a reliable packaging process may be obtained without underfill being used.

FIG. 55A-F describes an embodiment of this invention, where use of underfill may be avoided in the packaging process of a chip constructed on a bulk-silicon wafer. Although this invention is described with respect to one type of packaging scheme, it will be clear to one skilled in the art that the invention may be applied to other types of packaging. The process flow for the silicon chip could include the following steps that occur in sequence from Step (A) to Step (F). When the same reference numbers are used in different drawing figures (among FIG. 55A-F), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 55A:
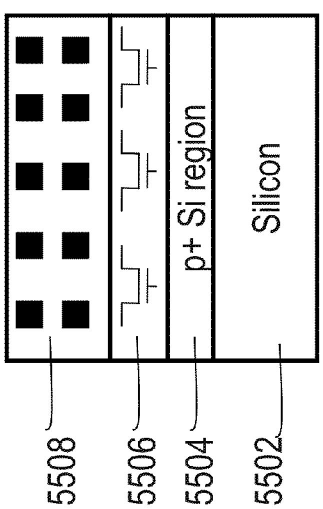
FIG. 55A-F illustrate a process flow to construct packages without underfill for bulk-silicon technologies.

Step (A) is illustrated in FIG. 55A. A bulk-silicon wafer with transistors constructed on a silicon layer 5506 may have a buried p+ silicon layer 5504 atop silicon layer 5502. Interconnect layers 5508, which may include metals such as aluminum or copper and insulators such as silicon oxide or low k dielectrics, may be constructed. The buried p+ silicon layer 5504 may be constructed with a process, such as, for example, an ion-implantation and thermal anneal, or an epitaxial doped silicon deposition.

Figure 55B:
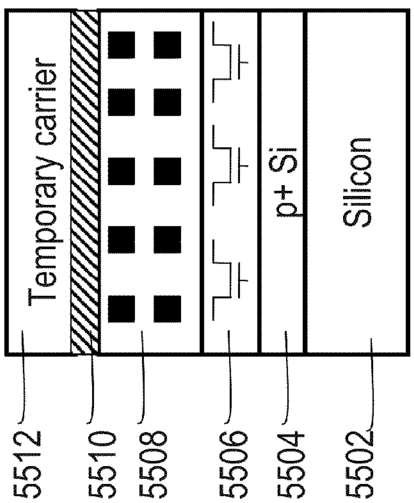

Step (B) is illustrated in FIG. 55B. A temporary carrier wafer 5512 may be attached to the structure shown in FIG. 55A using a temporary bonding adhesive 5510. The temporary carrier wafer 5512 may be constructed with a material, such as, for example, glass or silicon. The temporary bonding adhesive 5510 may include, for example, a polyimide such as DuPont HD3007.

Figure 55C:
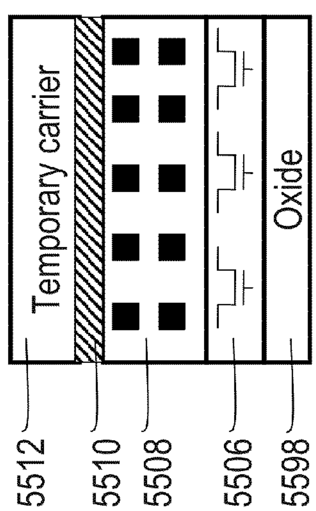

Step (C) is illustrated using FIG. 55C. The structure shown in FIG. 55B may be subjected to a selective etch process, such as, for example, ethylenediaminepyrocatechol (EDP) (potentially combined with a back-grinding process) where silicon layer 5502 is removed using the buried p+ silicon layer 5504 as an etch stop. Once the buried p+ silicon layer 5504 is reached during the etch step, the etch process is stopped. The etch chemistry is selected such that the etch process stops at the p+ silicon buried layer. The buried p+ silicon layer 5504 may then be polished away with CMP and planarized. Following this, an oxide layer 5598 may be deposited.

Figure 55D:
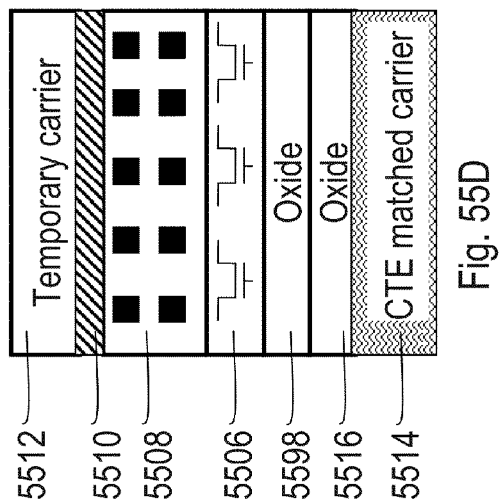

Step (D) is illustrated using FIG. 55D. The structure shown in FIG. 55C may be bonded to an oxide-coated carrier wafer having a co-efficient of thermal expansion (CTE) similar to that of the organic substrate used for packaging. The carrier wafer described in the previous sentence will be called a CTE matched carrier wafer henceforth in this document. The bonding step may be conducted using oxide-to-oxide bonding of oxide layer 5598 to the oxide coating 5516 of the CTE matched carrier wafer 5514. The CTE matched carrier wafer 5514 may include materials, such as, for example, copper, aluminum, organic materials, copper alloys and other materials.

Figure 55F:
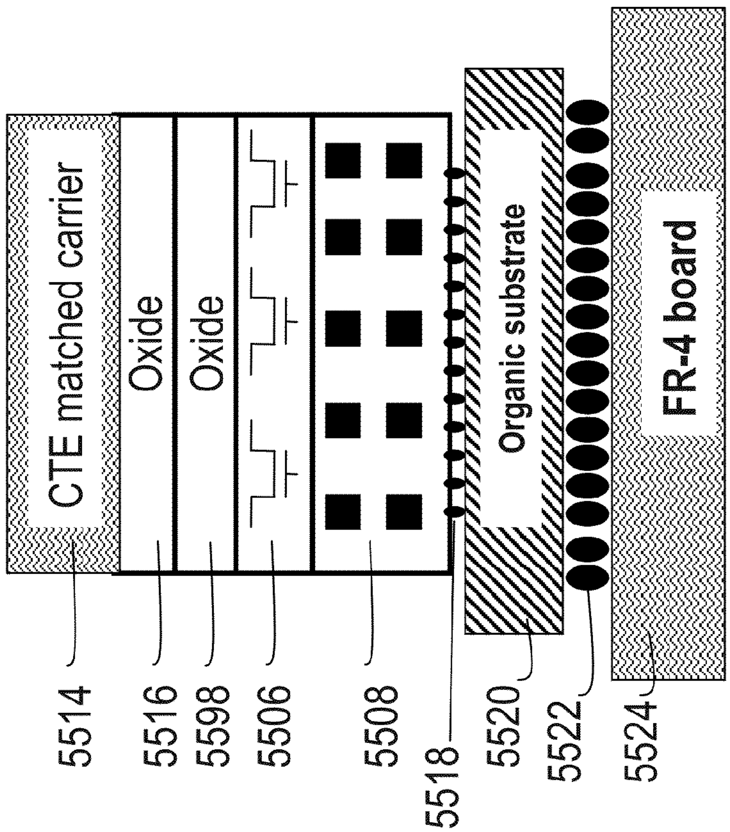
Figure 55E:
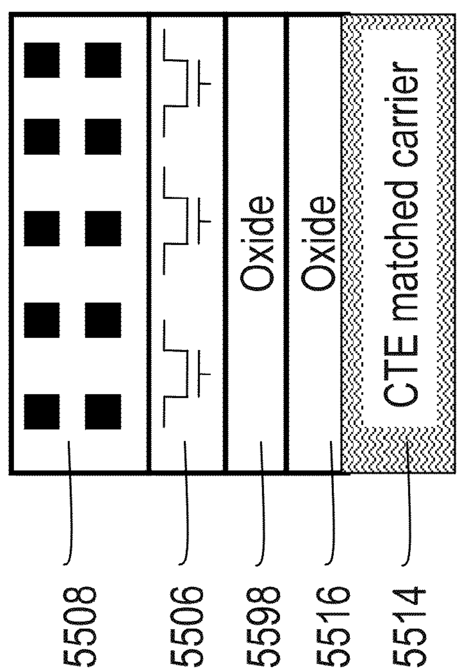

Step (E) is illustrated using FIG. 55E. The temporary carrier wafer 5512 may be detached from the structure at the surface of the interconnect layers 5508 by removing the temporary bonding adhesive 5510. This detachment may be done, for example, by shining laser light through the glass temporary carrier wafer 5512 to ablate or heat the temporary bonding adhesive 5510.

Step (F) is illustrated using FIG. 55F. Solder bumps 5518 may be constructed for the structure shown in FIG. 55E. After dicing, this structure may be attached to organic substrate 5520. This organic substrate may then be attached to a printed wiring board 5524, such as, for example, an FR4 substrate, using solder bumps 5522.

There are two key conditions while choosing the CTE matched carrier wafer 5514 for this embodiment of the invention. Firstly, the CTE matched carrier wafer 5514 should have a CTE close to that of the organic substrate 5520. Preferably, the CTE of the CTE matched carrier wafer 5514 should be within approximately 10 ppm/K of the CTE of the organic substrate 5520. Secondly, the volume of the CTE matched carrier wafer 5514 should be much higher than the silicon layer 5506. Preferably, the volume of the CTE matched carrier wafer 5514 may be, for example, greater than approximately 5 times the volume of the silicon layer 5506. When this happens, the CTE of the combination of the silicon layer 5506 and the CTE matched carrier wafer 5514 may be close to that of the CTE matched carrier wafer 5514. If these two conditions are met, the issues of co-efficient of thermal expansion mismatch described previously are ameliorated, and a reliable packaging process may be obtained without underfill being used.

The organic substrate 5520 typically has a CTE of approximately 17 ppm/K and the printed wiring board 5524 typically is constructed of FR4 which has a CTE of approximately 18 ppm/K. If the CTE matched carrier wafer is constructed of an organic material having a CTE of 17 ppm/K, it can be observed that issues of co-efficient of thermal expansion mismatch described previously are ameliorated, and a reliable packaging process may be obtained without underfill being used. If the CTE matched carrier wafer is constructed of a copper alloy having a CTE of approximately 17 ppm/K, it can be observed that issues of co-efficient of thermal expansion mismatch described previously are ameliorated, and a reliable packaging process may be obtained without underfill being used. If the CTE matched carrier wafer is constructed of an aluminum alloy material having a CTE of approximately 24 ppm/K, it can be observed that issues of co-efficient of thermal expansion mismatch described previously are ameliorated, and a reliable packaging process may be obtained without underfill being used.

While FIG. 54A-F and FIG. 55A-F describe methods of obtaining thinned wafers using buried oxide and buried p+ silicon etch stop layers respectively, it will be clear to one skilled in the art that other methods of obtaining thinned wafers exist. Hydrogen may be implanted through the backside of a bulk-silicon wafer (attached to a temporary carrier wafer) at a certain depth and the wafer may be cleaved using a mechanical force. Alternatively, a thermal or optical anneal may be used for the cleave process. An ion-cut process through the back side of a bulk-silicon wafer could therefore be used to thin a wafer accurately, following which a CTE matched carrier wafer may be bonded to the original wafer.

It will be clear to one skilled in the art that other methods to thin a wafer and attach a CTE matched carrier wafer exist. Other methods to thin a wafer include, not are not limited to, CMP, plasma etch, wet chemical etch, or a combination of these processes. These processes may be supplemented with various metrology schemes to monitor wafer thickness during thinning Carefully timed thinning processes may also be used.

Figure 65:
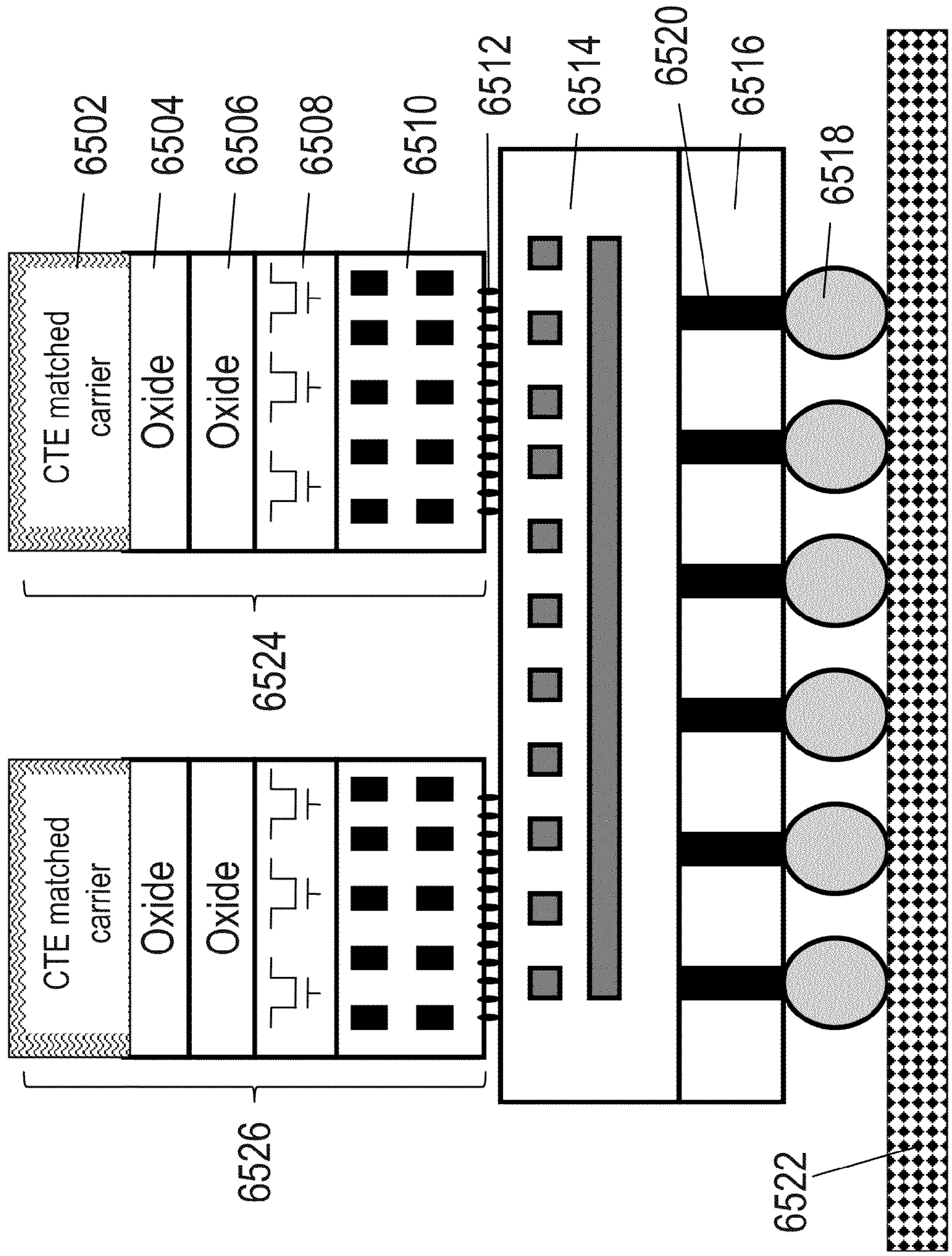
FIG. 65 illustrates a technique to provide high density of connections between different chips on the same packaging substrate.

FIG. 65 describes an embodiment of this invention, where multiple dice, such as, for example, dice 6524 and 6526 are placed and attached atop packaging substrate 6516. Packaging substrate 6516 may include packaging substrate high density wiring levels 6514, packaging substrate vias 6520, packaging substrate-to-printed-wiring-board connections 6518, and printed wiring board 6522. Die-to-substrate connections 6512 may be utilized to electrically couple dice 6524 and 6526 to the packaging substrate high density wiring levels 6514 of packaging substrate 6516. The dice 6524 and 6526 may be constructed using techniques described with FIG. 54A-F and FIG. 55A-F but are attached to packaging substrate 6516 rather than organic substrate 5420 or 5520. Due to the techniques of construction described in FIG. 54A-F and FIG. 55A-F being used, a high density of connections may be obtained from each die, such as 6524 and 6526, to the packaging substrate 6516. By using a packaging substrate 6516 with packaging substrate high density wiring levels 6514, a large density of connections between multiple dice 6524 and 6526 may be realized. This opens up several opportunities for system design. In one embodiment of this invention, unique circuit blocks may be placed on different dice assembled on the packaging substrate 6516. In another embodiment, contents of a large die may be split among many smaller dice to reduce yield issues. In yet another embodiment, analog and digital blocks could be placed on separate dice. It will be obvious to one skilled in the art that several variations of these concepts are possible. The key enabler for all these ideas is the fact that the CTEs of the dice are similar to the CTE of the packaging substrate, so that a high density of connections from the die to the packaging substrate may be obtained, and provide for a high density of connection between dice. 6502 denotes a CTE matched carrier wafer, 6504 and 6506 are oxide layers, 6508 represents transistor regions, 6510 represents a multilevel wiring stack, 6512 represents die-to-substrate connections, 6516 represents the packaging substrate, 6514 represents the packaging substrate high density wiring levels, 6520 represents vias on the packaging substrate, 6518 denotes packaging substrate-to-printed-wiring-board connections and 6522 denotes a printed wiring board.

Section 11: Some Process Modules for Sub-400° C. Transistors and Contacts

Section 1 discussed various methods to create junction-less transistors and recessed channel transistors with temperatures of less than 400° C.-450° C. after stacking. For these transistor types and other technologies described in this disclosure, process modules such as bonding, cleave, planarization after cleave, isolation, contact formation and strain incorporation would benefit from being conducted at temperatures below about 400° C. Techniques to conduct these process modules at less than about 400° C. are described in Section 11.

Section 11.1: Sub-400° C. Bonding Process Module

Bonding of layers for transfer (as shown, for example, in FIG. 11E which has been described previously herein) can be performed advantageously at less than about 400° C. using an oxide-to-oxide bonding process with activated surface layers. This is described in FIG. 19. FIG. 19 shows various methods one can use to bond a top layer wafer 1908 to a bottom wafer 1902. Oxide-oxide bonding of a layer of silicon dioxide 1906 and a layer of silicon dioxide 1904 is used. Before bonding, various methods can be utilized to activate surfaces of the layer of silicon dioxide 1906 and the layer of silicon dioxide 1904. A plasma-activated bonding process such as the procedure described in US Patent 20090081848 or the procedure described in "Plasma-activated wafer bonding: the new low-temperature tool for MEMS fabrication", Proc. SPIE 6589, 65890T (2007), DOI:10.1117/12.721937 by V. Dragoi, G. Mittendorfer, C. Thanner, and P. Lindner ("Dragoi") can be used. Alternatively, an ion implantation process such as the one described in US Patent 20090081848 or elsewhere can be used. Alternatively, a wet chemical treatment can be utilized for activation. Other methods to perform oxide-to-oxide bonding can also be utilized.

Section 11.2: Sub-400° C. Cleave Process Module

As described previously in this disclosure, a cleave process can be performed advantageously at less than about 400° C. by implantation with hydrogen, helium or a combination of the two species followed by a sideways mechanical force. Alternatively, the cleave process can be performed advantageously at less than about 400° C. by implantation with hydrogen, helium or a combination of the two species followed by an anneal. These approaches are described in detail in Section 1 through the description for FIG. 2A-E.

The temperature required for hydrogen implantation followed by an anneal-based cleave can be reduced substantially by implanting the hydrogen species in a buried p+ silicon layer where the dopant is boron. This approach has been described previously in this disclosure in Section 1.3.3 through the description of FIG. 17A-E.

Section 11.3: Planarization and Surface Smoothening after Cleave at Less than 400° C.

Figure 56A:
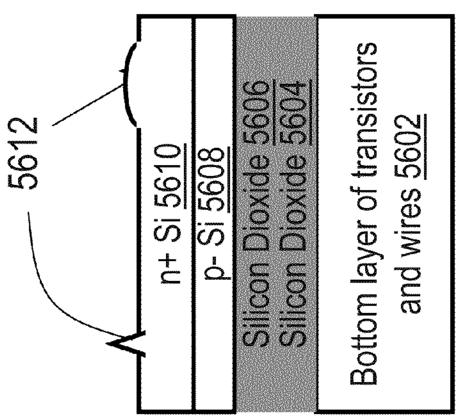
FIG. 56A-C illustrate a sub-400° C. process to reduce surface roughness after a hydrogen-implant based cleave.

FIG. 56A shows an exemplary surface of a wafer or substrate structure after a layer transfer and after a hydrogen, or other atomic species, implant plane has been cleaved. The wafer consists of a bottom layer of transistors and wires 5602 with an oxide layer 5604 atop it. These in turn have been bonded using oxide-to-oxide bonding and cleaved to a structure such that a silicon dioxide layer 5606, p− Silicon layer 5608 and n+ Silicon layer 5610 are formed atop the bottom layer of transistors and wires 5602 and the oxide layer 5604. The surface of the wafer or substrate structure shown in FIG. 56A can often be non-planar after cleaving along a hydrogen plane, with irregular features 5612 formed atop it.

The irregular features 5612 may be removed using a chemical mechanical polish (CMP) that planarizes the surface.

Figure 56B:
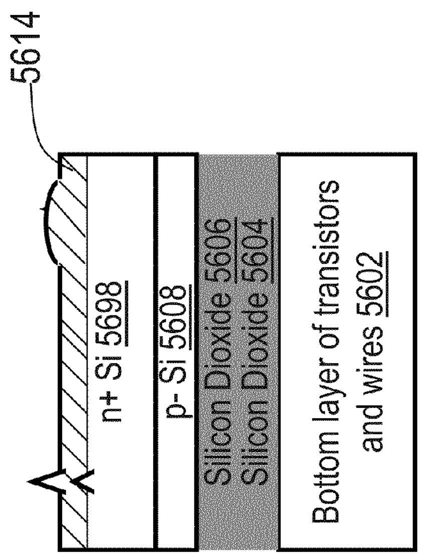
Figure 56C:
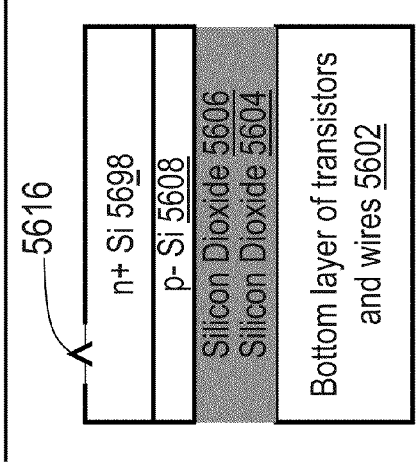

Alternatively, a process shown in FIG. 56B-C may be utilized to remove or reduce the extent of irregular features 5612 of FIG. 56A. Various elements in FIG. 56B such as 5602, 5604, 5606 and 5608 are as described in the description for FIG. 56A. The surface of n+ Silicon layer 5610 and the irregular features 5612 may be subjected to a radical oxidation process that produces thermal oxide layer 5614 at less than about 400° C. by using a plasma technique. The thermal oxide layer 5614 consumes a portion of the n+ Silicon region 5610 shown in FIG. 56A to produce the n+ Si region 5698 of FIG. 56B. The thermal oxide layer 5614 may then be etched away, utilizing an etchant such as, for example, a dilute Hydrofluoric acid solution, to form the structure shown in FIG. 56C. Various elements in FIG. 56C such as 5602, 5604, 5606, 5608 and 5698 are as described with respect to FIG. 56B. It can be observed that the extent of non-planarities 5616 in FIG. 56C is less than in FIG. 56A. The radical oxidation and etch-back process essentially smoothens the surface and reduces non-planarities.

Alternatively, according to an embodiment of this invention, surface non-planarities may be removed or reduced by treating the cleaved surface of the wafer or substrate in a hydrogen plasma at less than approximately 400° C. The hydrogen plasma source gases may include, for example, hydrogen, argon, nitrogen, hydrogen chloride, water vapor, methane, and so on. Hydrogen anneals at about 1100° C. are known to reduce surface roughness in silicon. By utilizing a plasma, the temperature can be reduced to less than approximately 400° C.

Alternatively, according to another embodiment of this invention, a thin film, such as, for example, a Silicon oxide or photosensitive resist may be deposited atop the cleaved surface of the wafer or substrate and etched back. The typical etchant for this etch-back process is one that has approximately equal etch rates for both silicon and the deposited thin film. This could reduce non-planarities on the wafer surface.

Alternatively, Gas Cluster Ion Beam technology may be utilized for smoothing surfaces after cleaving along an implanted plane of hydrogen or other atomic species.

A combination of various techniques described in Section 11.3 can also be used. The hydrogen implant plane may also be formed by co-implantation of multiple species, such as, for example, hydrogen and helium.

Section 11.4: Sub-400° C. Isolation Module

FIG. 57A-D shows a description of a prior art shallow trench isolation process. The process flow for the silicon chip could include the following steps that occur in sequence from Step (A) to Step (D). When the same reference numbers are used in different drawing figures (among FIG. 57A-D), they are used to indicate analogous, similar or identical structures to enhance the understanding of the present invention by clarifying the relationships between the structures and embodiments presented in the various diagrams—particularly in relating analogous, similar or identical functionality to different physical structures.

Figures 57A, 57B, 57C, 57D:
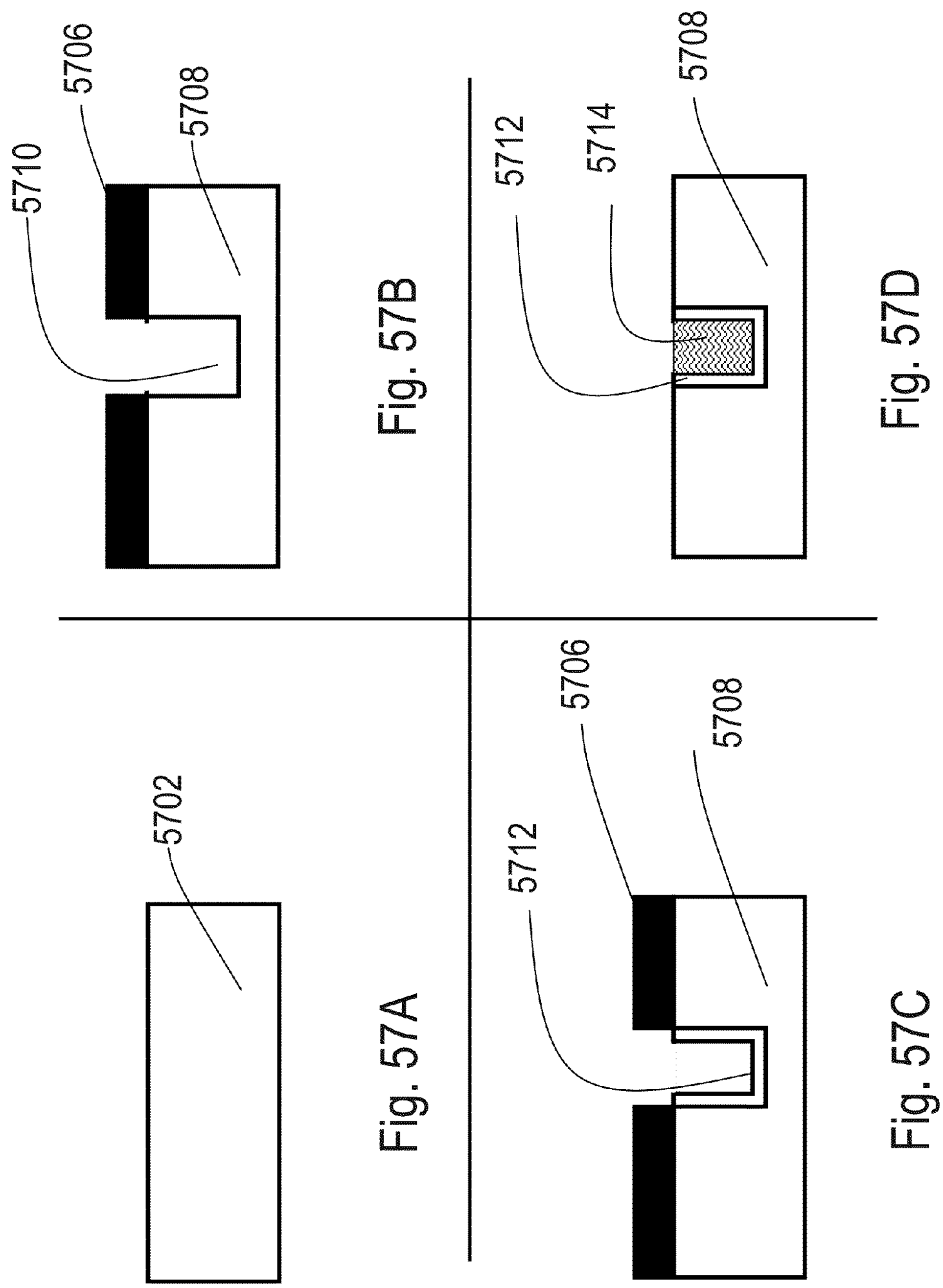
FIG. 57A-D illustrate a prior art process to construct shallow trench isolation regions.

Step (A) is illustrated using FIG. 57A. A silicon wafer 5702 may be constructed.

Step (B) is illustrated using FIG. 57B. Silicon nitride layer 5706 may be formed using a process such as chemical vapor deposition (CVD) and may then be lithographically patterned. Following this, an etch process may be conducted to form trench 5710. The silicon region remaining after these process steps is indicated as 5708. A silicon oxide (not shown) may be utilized as a stress relief layer between the silicon nitride layer 5706 and silicon wafer 5702.

Step (C) is illustrated using FIG. 57C. A thermal oxidation process at less than about 700° C. may be conducted to form oxide region 5712. The silicon nitride layer 5706 prevents the silicon nitride covered surfaces of silicon region 5708 from becoming oxidized during this process.

Step (D) is illustrated using FIG. 57D. An oxide fill may be deposited, following which an anneal may be preferably done to densify the deposited oxide. A chemical mechanical polish (CMP) may be conducted to planarize the surface. Silicon nitride layer 5706 may be removed either with a CMP process or with a selective etch, such as hot phosphoric acid. The oxide fill layer after the CMP process is indicated as 5714.

The prior art process described in FIG. 57A-D suffers from the use of high temperature (greater than about 400° C.) processing which is not suitable for some embodiments of this invention that involve 3D stacking of components such as junction-less transistors (JLT) and recessed channel transistors (RCAT). Steps that involve temperatures greater than about 400° C. may include the thermal oxidation conducted to form oxide region 5712 and the densification anneal conducted in Step (D) above.

FIG. 58A-D describes an embodiment of this invention, where sub-400° C. process steps may be utilized to form the shallow trench isolation regions. The process flow for the silicon chip may include the following steps that occur in sequence from Step (A) to Step (D). When the same reference numbers are used in different drawing figures (among FIG. 58A-D), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 58A:
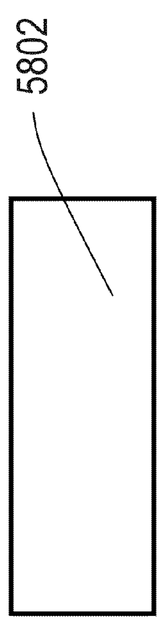
FIG. 58A-D illustrate a sub-400° C. process to construct shallow trench isolation regions for 3D stacked structures.

Step (A) is illustrated using FIG. 58A. A silicon wafer 5802 may be constructed.

Figure 58B:
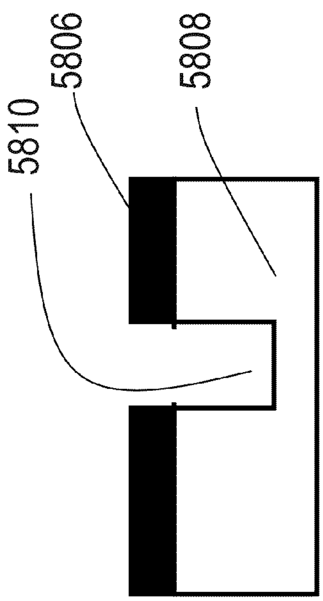
Figure 58C:
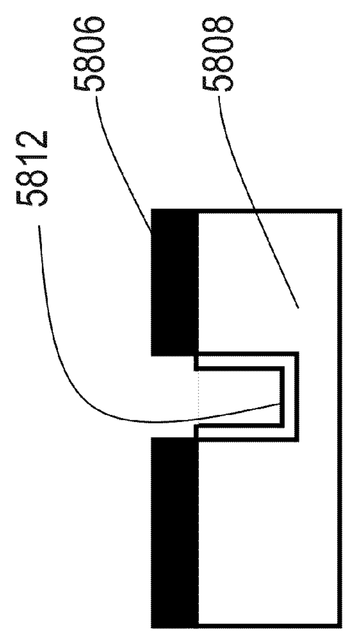

Step (B) is illustrated using FIG. 58B. Silicon nitride layer 5806 may be formed using a process, such as, for example, plasma-enhanced chemical vapor deposition (PECVD) or physical vapor deposition (PVD), and may then be lithographically patterned. Following this, an etch process may be conducted to form trench 5810. The silicon region remaining after these process steps is indicated as 5808. A silicon oxide (not shown) may be utilized as a stress relief layer between the silicon nitride layer 5806 and silicon wafer 5802. Step (C) is illustrated using FIG. 58C. A plasma-assisted radical thermal oxidation process, which has a process temperature typically less than approximately 400° C., may be conducted to form the oxide region 5812. The silicon nitride layer 5806 prevents the silicon nitride covered surfaces of silicon region 5708 from becoming oxidized during this process.

Figure 58D:
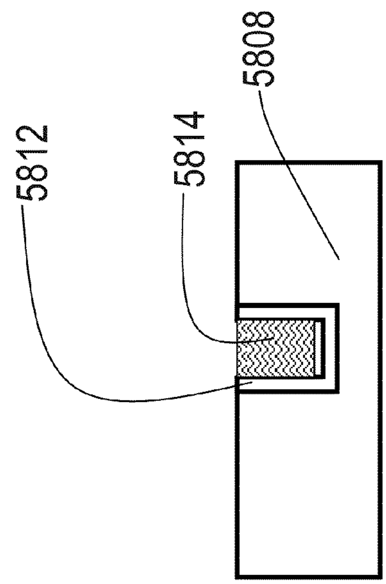

Step (D) is illustrated using FIG. 58D. An oxide fill may be deposited, preferably using a process such as, for example, a high-density plasma (HDP) process that produces dense oxide layers at low temperatures, less than approximately 400° C. Depositing a dense oxide avoids the need for a densification anneal that would need to be conducted at a temperature greater than about 400° C. A chemical mechanical polish (CMP) may be conducted to planarize the surface. Silicon nitride layer 5806 may be removed either with a CMP process or with a selective etch, such as hot phosphoric acid. The oxide fill layer after the CMP process is indicated as 5814.

The process described using FIG. 58A-D can be conducted at less than about 400° C., and this may be advantageous for many 3D stacked architectures.

Section 11.5: Sub-400° C. Silicide Contact Module

To improve the contact resistance of very small scaled contacts, the semiconductor industry employs various metal silicides, such as, for example, cobalt silicide, titanium silicide, tantalum silicide, and nickel silicide. The current advanced CMOS processes, such as, for example, 45 nm, 32 nm, and 22 nm nodes, employ nickel silicides to improve deep submicron source and drain contact resistances. Background information on silicides utilized for contact resistance reduction can be found in "NiSi Salicide Technology for Scaled CMOS," H. Iwai, et. al., Microelectronic Engineering, 60 (2002), pp 157-169; "Nickel vs. Cobalt Silicide integration for sub-50 nm CMOS", B. Froment, et.al., IMEC ESS Circuits, 2003; and "65 and 45-nm Devices—an Overview", D. James, Semicon West, July 2008, ctr_024377. To achieve the lowest nickel silicide contact and source/drain resistances, the nickel on silicon could lead to heating up to about 450° C.

Thus it may be desirable to enable low resistances for process flows in this document where the post layer transfer temperature exposures must remain under approximately 400° C. due to metallization, such as, for example, copper and aluminum, and low-k dielectrics present. The example process flow forms a Recessed Channel Array Transistor (RCAT), but this or similar flows may be applied to other process flows and devices, such as, for example, S-RCAT, JLT, V-groove, JFET, bipolar, and replacement gate flows.

Figure 59A:
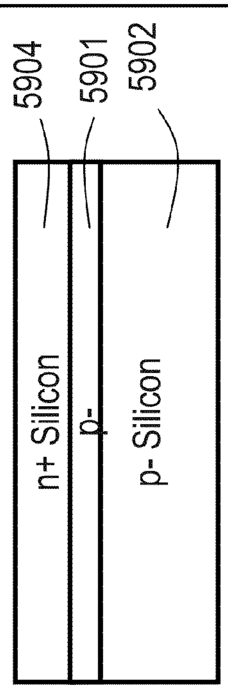
FIG. 59A-I illustrate a process flow that forms silicide regions before layer transfer.

A planar n-channel Recessed Channel Array Transistor (RCAT) with metal silicide source & drain contacts suitable for a 3D IC may be constructed. As illustrated in FIG. 59A, a P− substrate donor wafer 5902 may be processed to include wafer sized layers of N+ doping 5904, and P− doping 5901 across the wafer. The N+ doped layer 5904 may be formed by ion implantation and thermal anneal. In addition, P− doped layer 5901 may have additional ion implantation and anneal processing to provide a different dopant level than P− substrate donor wafer 5902. P− doped layer 5901 may also have graded P− doping to mitigate transistor performance issues, such as, for example, short channel effects, after the RCAT is formed. The layer stack may alternatively be formed by successive epitaxially deposited doped silicon layers of P− doping 5901 and N+ doping 5904, or by a combination of epitaxy and implantation. Annealing of implants and doping may utilize optical annealing techniques or types of Rapid Thermal Anneal (RTA or spike).

Figure 59B:
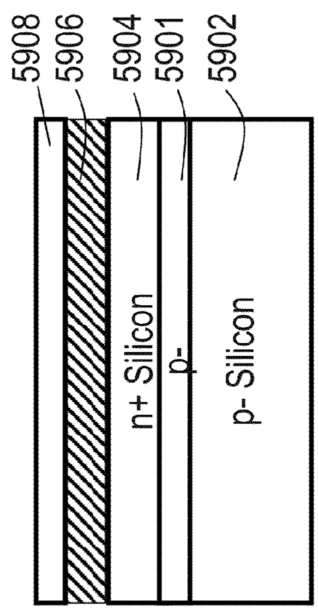

As illustrated in FIG. 59B, a silicon reactive metal, such as, for example, Nickel or Cobalt, may be deposited onto N+ doped layer 5904 and annealed, utilizing anneal techniques such as, for example, RTA, thermal, or optical, thus forming metal silicide layer 5906. The top surface of P− doped layer 5901 may be prepared for oxide wafer bonding with a deposition of an oxide to form oxide layer 5908.

Figure 59C:
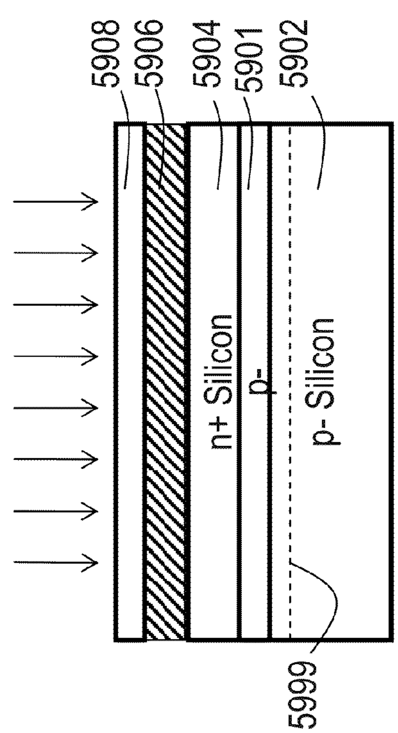

As illustrated in FIG. 59C, a layer transfer demarcation plane (shown as dashed line) 5999 may be formed by hydrogen implantation or other methods as previously described.

Figure 59D:
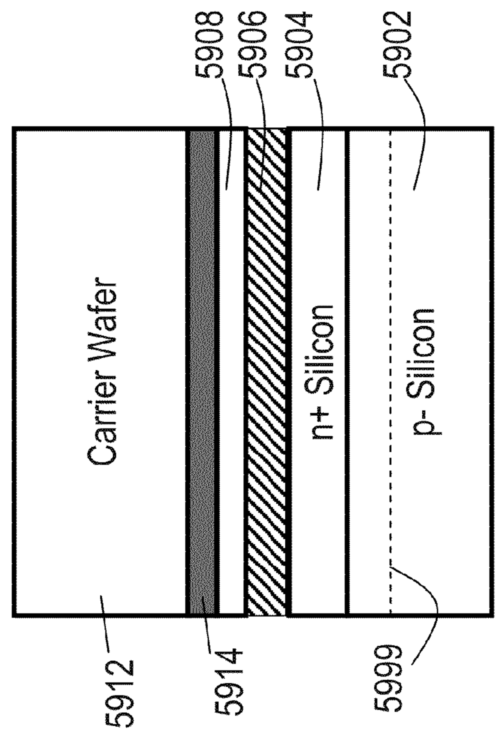

As illustrated in FIG. 59D donor wafer 5902 with layer transfer demarcation plane 5999, P− doped layer 5901, N+ doped layer 5904, metal silicide layer 5906, and oxide layer 5908 may be temporarily bonded to carrier or holder substrate 5912 with a low temperature process that may facilitate a low temperature release. The carrier or holder substrate 5912 may be a glass substrate to enable state of the art optical alignment with the acceptor wafer. A temporary bond between the carrier or holder substrate 5912 and the donor wafer 5902 may be made with a polymeric material, such as, for example, polyimide DuPont HD3007, which can be released at a later step by laser ablation, Ultra-Violet radiation exposure, or thermal decomposition, shown as adhesive layer 5914. Alternatively, a temporary bond may be made with uni-polar or bi-polar electrostatic technology such as, for example, the Apache tool from Beam Services Inc.

Figure 59F:
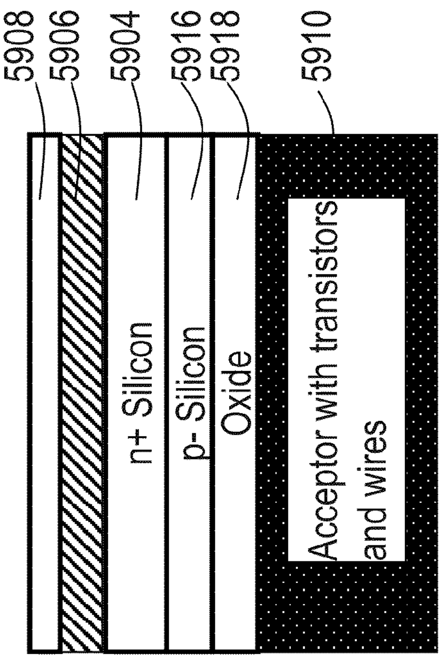
Figure 59E:
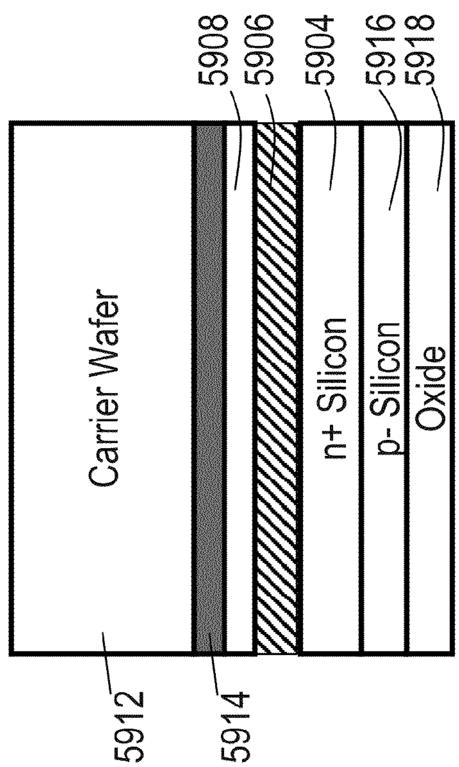

As illustrated in FIG. 59E, the portion of the donor wafer 5902 that is below the layer transfer demarcation plane 5999 may be removed by cleaving or other processes as previously described, such as, for example, ion-cut or other methods may controllably remove portions up to approximately the layer transfer demarcation plane 5999. The remaining donor wafer P− doped layer 5901 may be thinned by chemical mechanical polishing (CMP) so that the P− layer 5916 may be formed to the desired thickness. Oxide layer 5918 may be deposited on the exposed surface of P− layer 5916.

As illustrated in FIG. 59F, both the donor wafer 5902 and acceptor wafer 5910 may be prepared for wafer bonding as previously described and then low temperature (less than approximately 400° C.) aligned and oxide to oxide bonded. Acceptor wafer 5910, as described previously, may compromise, for example, transistors, circuitry, metal, such as, for example, aluminum or copper, interconnect wiring, and thru layer via metal interconnect strips or pads. The carrier or holder substrate 5912 may then be released using a low temperature process such as, for example, laser ablation. Oxide layer 5918, P− layer 5916, N+ doped layer 5904, metal silicide layer 5906, and oxide layer 5908 have been layer transferred to acceptor wafer 5910. The top surface of oxide layer 5908 may be chemically or mechanically polished. Now RCAT transistors are formed with low temperature (less than approximately 400° C.) processing and aligned to the acceptor wafer 5910 alignment marks (not shown).

Figure 59G:
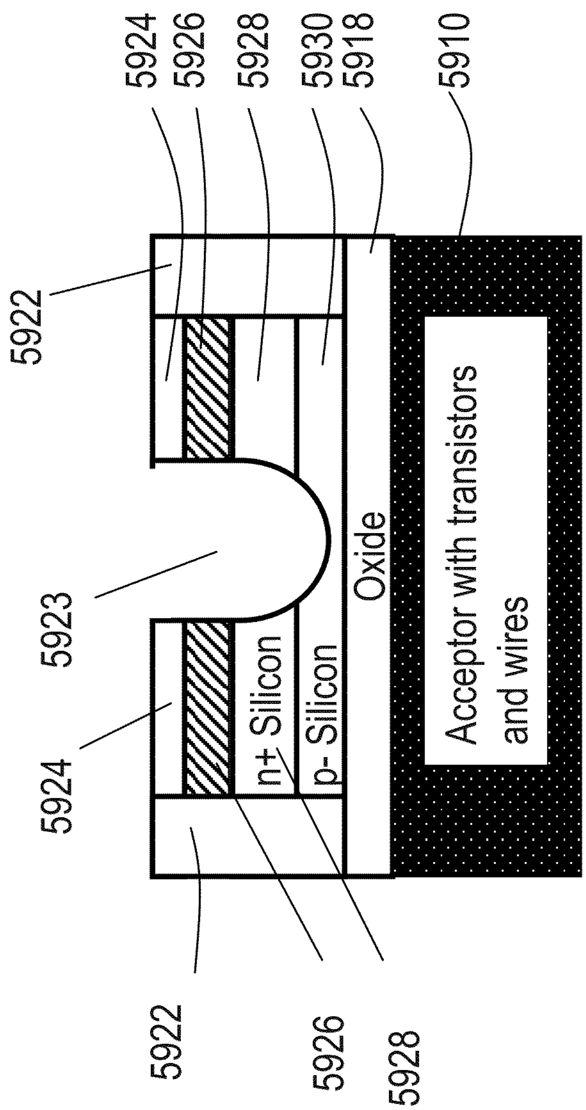

As illustrated in FIG. 59G, the transistor isolation regions 5922 may be formed by mask defining and then plasma/RIE etching oxide layer 5908, metal silicide layer 5906, N+ doped layer 5904, and P− layer 5916 to the top of oxide layer 5918. Then a low-temperature gap fill oxide may be deposited and chemically mechanically polished, with the oxide remaining in isolation regions 5922. Then the recessed channel 5923 may be mask defined and etched. The recessed channel surfaces and edges may be smoothed by wet chemical or plasma/RIE etching techniques to mitigate high field effects. These process steps form oxide regions 5924, metal silicide source and drain regions 5926, N+ source and drain regions 5928 and P-channel region 5930.

Figure 59H:
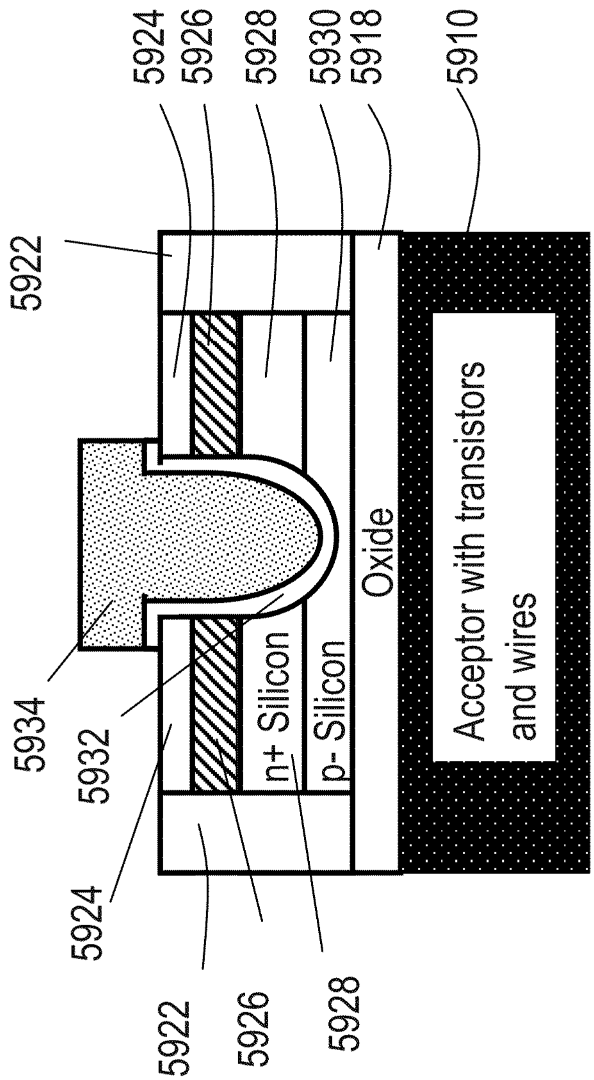

As illustrated in FIG. 59H, a gate dielectric 5932 may be formed and a gate metal material may be deposited. The gate dielectric 5932 may be an atomic layer deposited (ALD) gate dielectric that is paired with a work function specific gate metal in the industry standard high k metal gate process schemes described previously. Or the gate dielectric 5932 may be formed with a low temperature oxide deposition or low temperature microwave plasma oxidation of the silicon surfaces and then a gate material such as, for example, tungsten or aluminum may be deposited. Then the gate material may be chemically mechanically polished, and the gate area defined by masking and etching, thus forming gate electrode 5934.

Figure 59I:
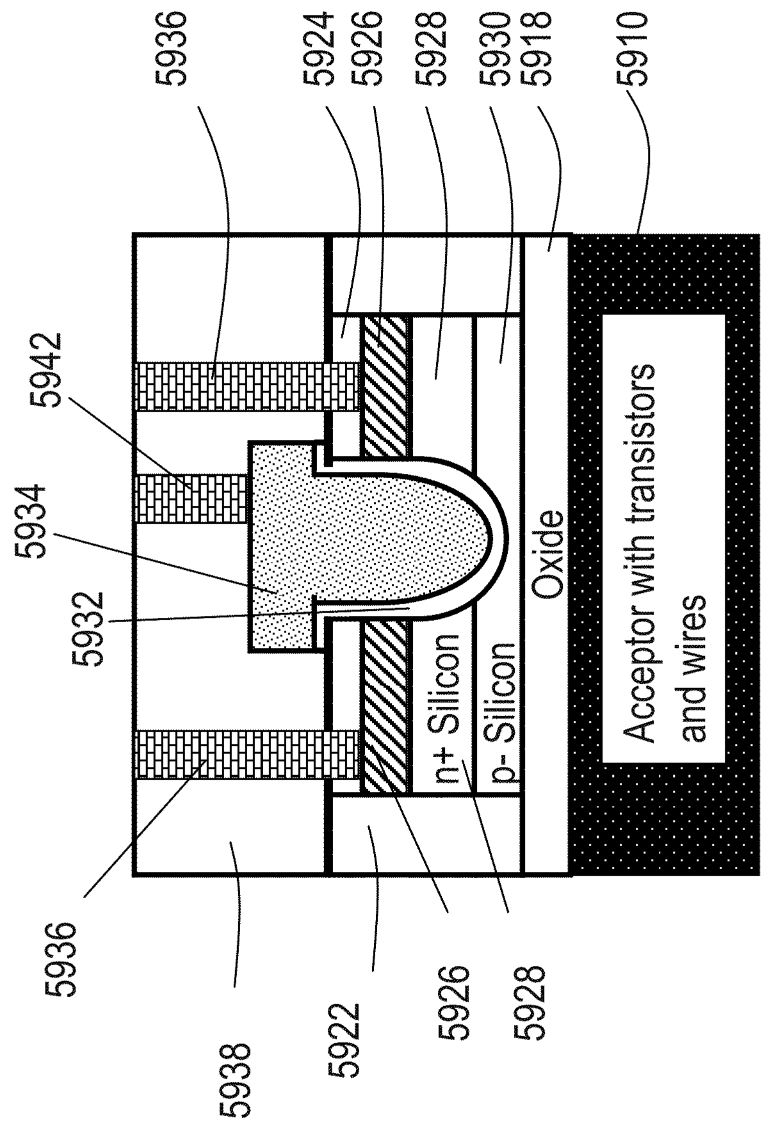

As illustrated in FIG. 59I, a low temperature thick oxide 5938 is deposited and source, gate, and drain contacts, and thru layer via (not shown) openings are masked and etched preparing the transistors to be connected via metallization. Thus gate contact 5942 connects to gate electrode 5934, and source & drain contacts 5936 connect to metal silicide source and drain regions 5926.

Persons of ordinary skill in the art will appreciate that the illustrations in FIGS. 59A through 59I are exemplary only and are not drawn to scale. Such skilled persons will further appreciate that many variations are possible such as, for example, the temporary carrier substrate may be replaced by a carrier wafer and a permanently bonded carrier wafer flow may be employed. Many other modifications within the scope of the invention will suggest themselves to such skilled persons after reading this specification. Thus the invention is to be limited only by the appended claims.

While the "silicide-before-layer-transfer" process flow described in FIG. 59A-I can be used for many sub-400° C. 3D stacking applications, alternative approaches exist. Silicon forms silicides with many materials such as nickel, cobalt, platinum, titanium, manganese, and other materials that form silicides with silicon. By alloying two materials, one of which has a silicidation temperature greater than about 400° C. and one of which has a silicidation temperature less than about 400° C., in a certain ratio, the silicidation temperature of the alloy can be reduced to below about 400° C. For example, nickel silicide has a silicidation temperature of 400-450° C., while platinum silicide has a silicidation temperature of about 300° C. By depositing an alloy of Nickel and Platinum (in a certain ratio) on a silicon region and then annealing to form a silicide, one could lower the silicidation temperature to less than about 400° C. Another example could be deposition of an alloy of Nickel and Palladium (in a certain ratio) on a silicon region and then annealing to form a silicide, one could lower the silicidation temperature to less than about 400° C. As mentioned below, Nickel Silicide forms at about 400-450° C., while Palladium Silicide forms at around 250° C. By forming a mixture of these two silicides, silicidation temperature may be lowered to less than about 400° C.

Strained silicon regions may be formed at less than about 400° C. by depositing dielectric strain-inducing layers around recessed channel devices and junction-less transistors in STI regions, in pre-metal dielectric regions, in contact etch stop layers and also in other regions around these transistors.

Section 12: A Logic Technology with Shared Lithography Steps

Lithography costs for semiconductor manufacturing today form a dominant percentage of the total cost of a processed wafer. In fact, some estimates describe lithography cost as being more than 50% of the total cost of a processed wafer. In this scenario, reduction of lithography cost is very important.

FIG. 60A-J describes an embodiment of this invention, where a process flow is described in which a single lithography step is shared among many wafers. Although the process flow is described with respect to a side gated mono-crystalline junction-less transistor, it will be obvious to one with ordinary skill in the art that it can be modified and applied to other types of transistors, such as, for example, FINFETs and planar CMOS MOSFETs. The process flow for the silicon chip may include the following steps that occur in sequence from Step (A) to Step (I). When the same reference numbers are used in different drawing figures (among FIG. 60A-J), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 60A:
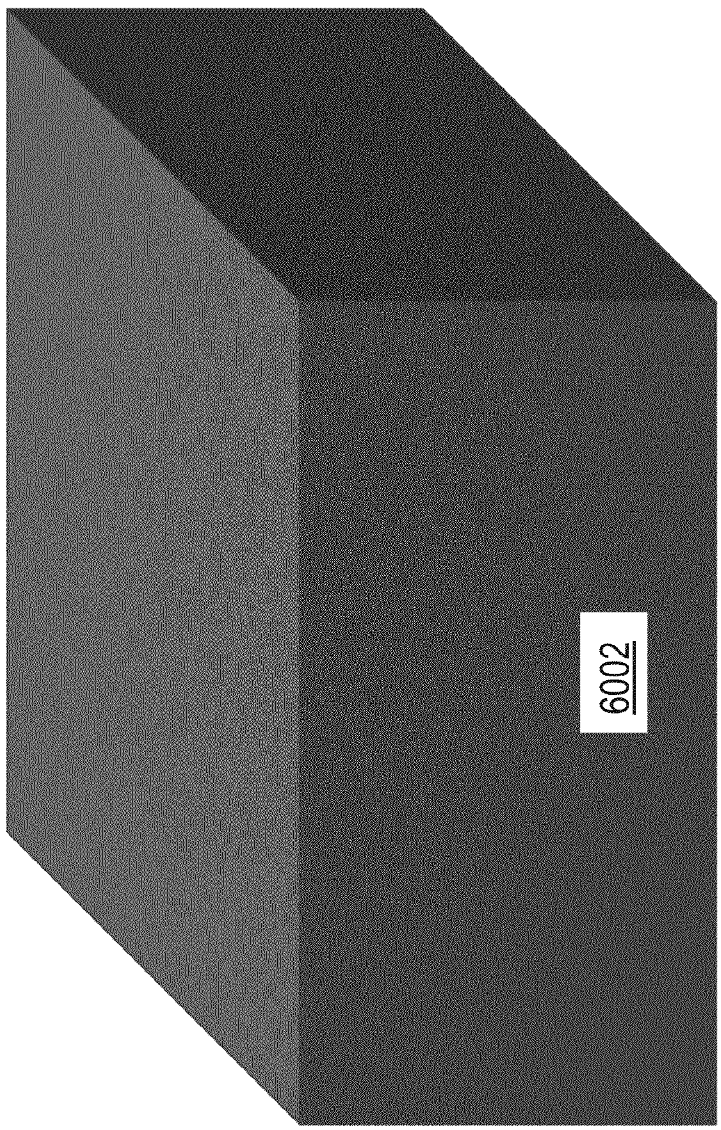
FIG. 60A-J illustrate a process flow for manufacturing junction-less transistors with reduced lithography steps.

Step (A) is illustrated with FIG. 60A. A p− Silicon wafer 6002 is taken.

Figure 60B:
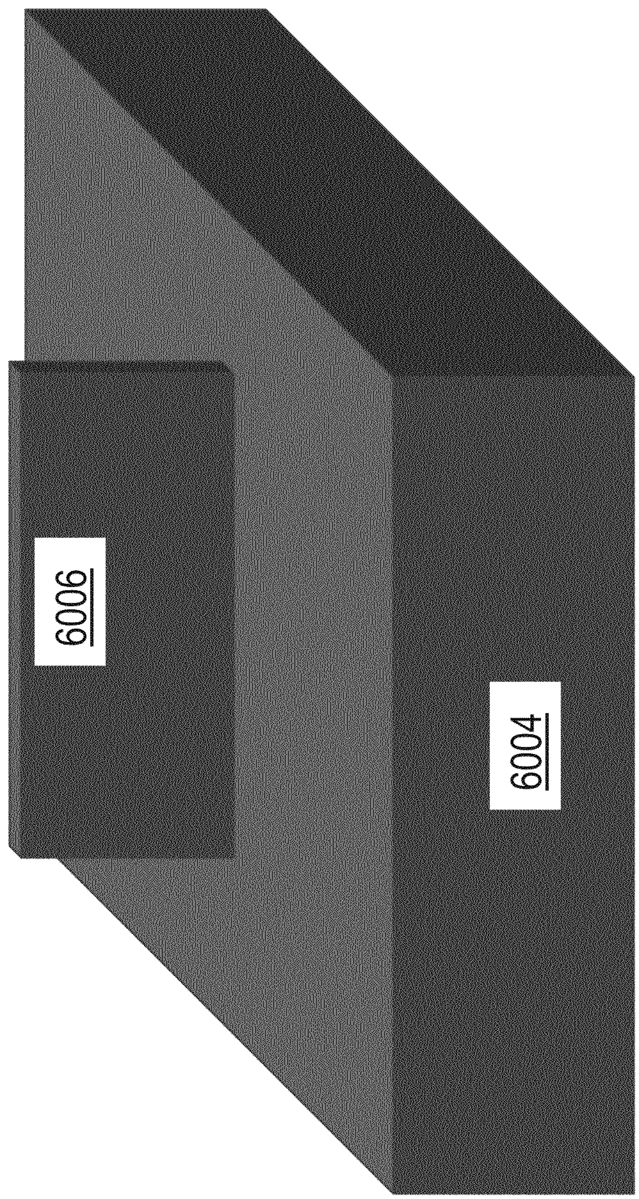

Step (B) is illustrated with FIG. 60B. N+ and p+ dopant regions may be implanted into the p− Silicon wafer 6002 of FIG. 60A. A thermal anneal, such as, for example, rapid, furnace, spike, or laser may then be done to activate dopants. Following this, a lithography and etch process may be conducted to define p− silicon substrate region 6004 and n+ silicon region 6006. Regions with p+ silicon where p-JLTs are fabricated are not shown.

Figure 60C:
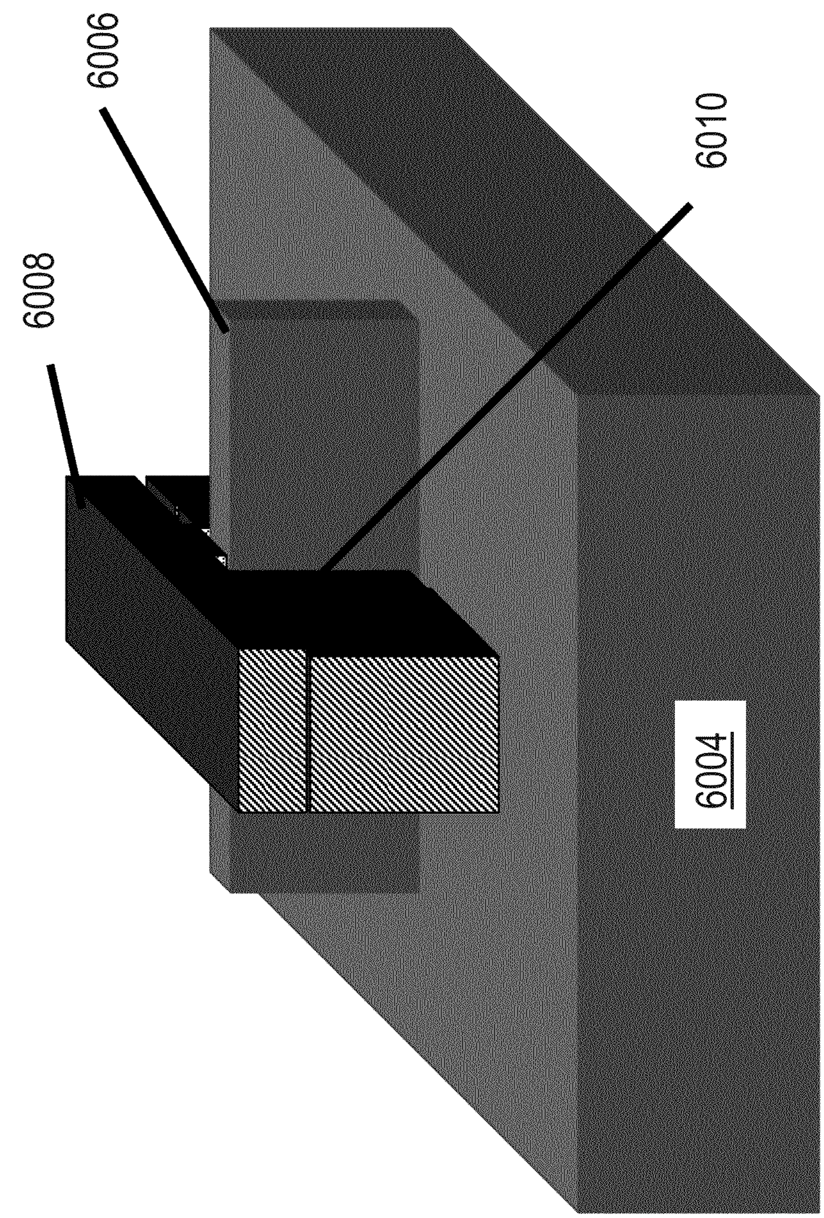

Step (C) is illustrated with FIG. 60C. Gate dielectric regions 6010 and gate electrode regions 6008 may be formed by oxidation or deposition of a gate dielectric, then deposition of a gate electrode, polishing with CMP and then lithography and etch. The gate electrode regions 6008 are preferably doped polysilicon. Alternatively, various hi-k metal gate (HKMG) materials could be utilized for gate dielectric and gate electrode as described previously.

Figure 60D:
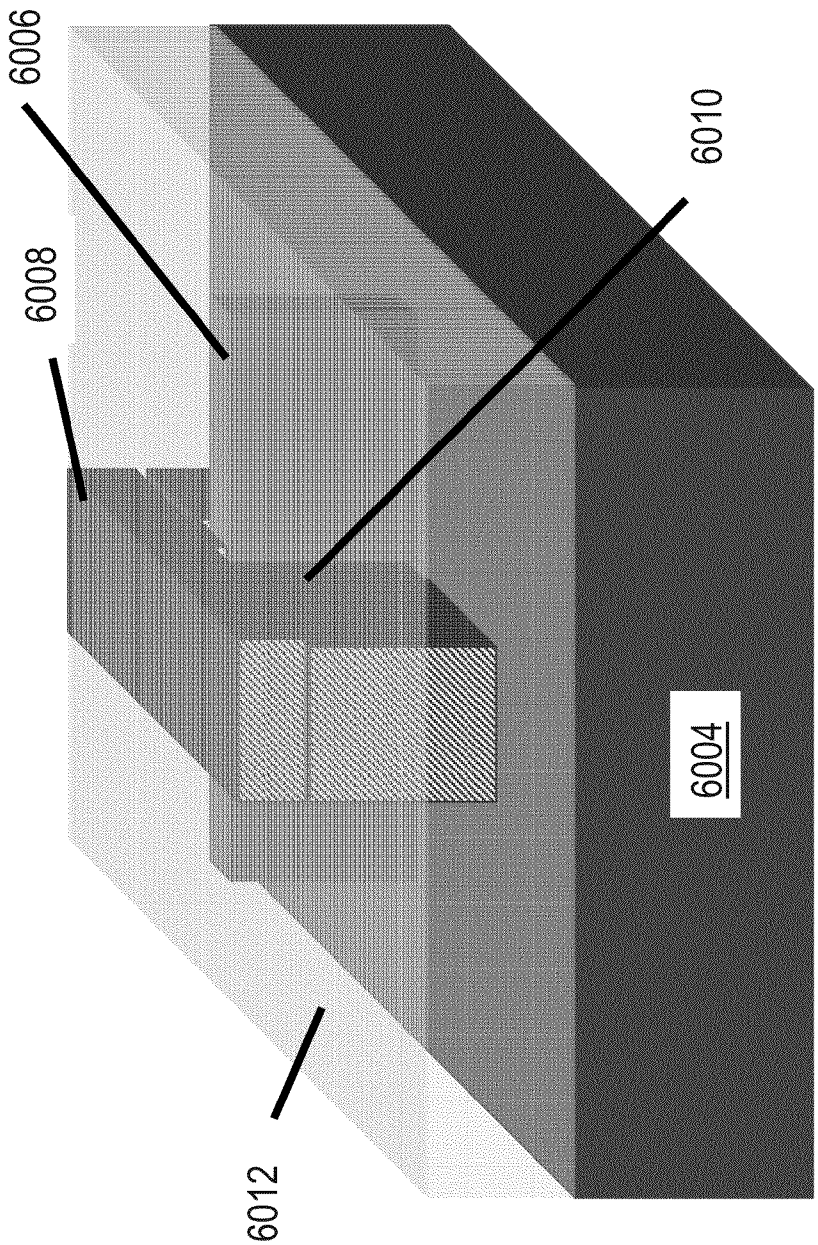

Step (D) is illustrated with FIG. 60D. Silicon dioxide regions 6012 may be formed by deposition and may then be planarized and polished with CMP such that the silicon dioxide regions 6012 cover p− silicon substrate region 6004, n+ silicon regions 6006, gate electrode regions 6008 and gate dielectric regions 6010.

Figure 60E:
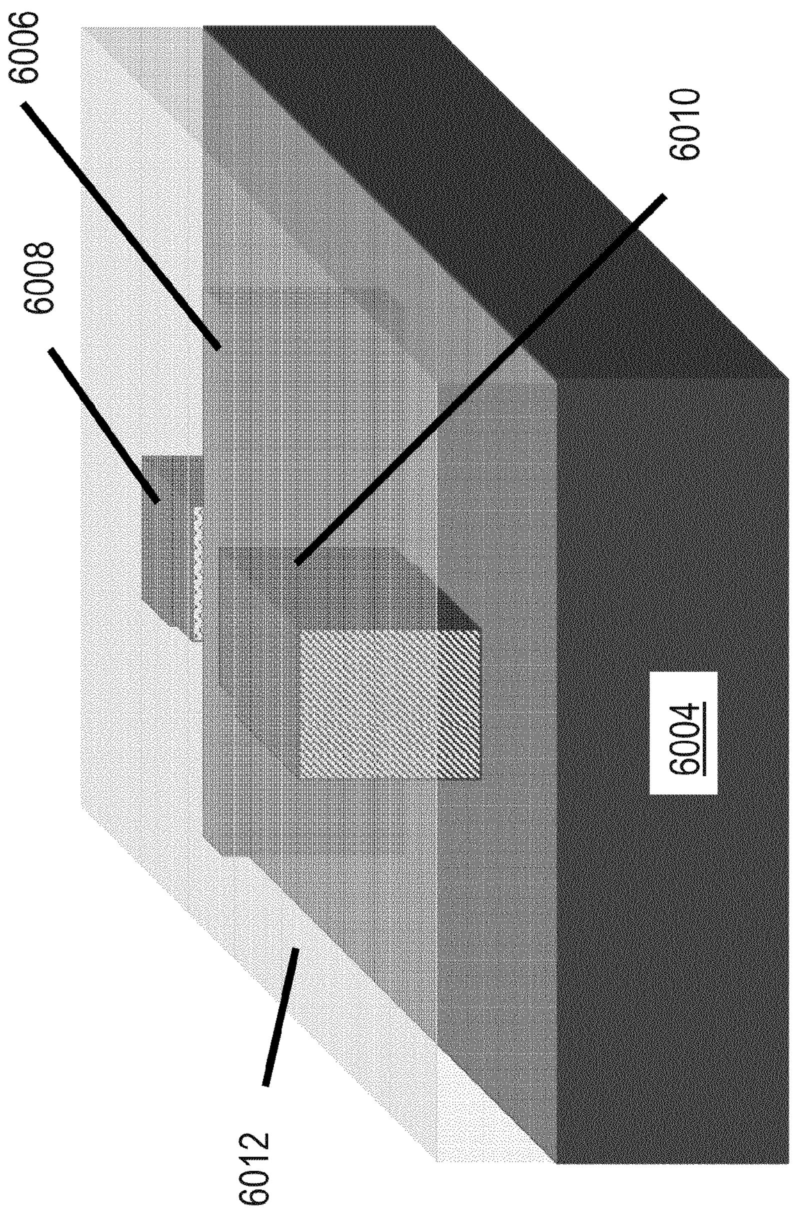

Step (E) is illustrated with FIG. 60E. The structure shown in FIG. 60D may be further polished with CMP such that portions of silicon dioxide regions 6012, gate electrode regions 6008, gate dielectric regions 6010 and n+ silicon regions 6006 are polished. Following this, a silicon dioxide layer may be deposited over the structure.

Figure 60F:
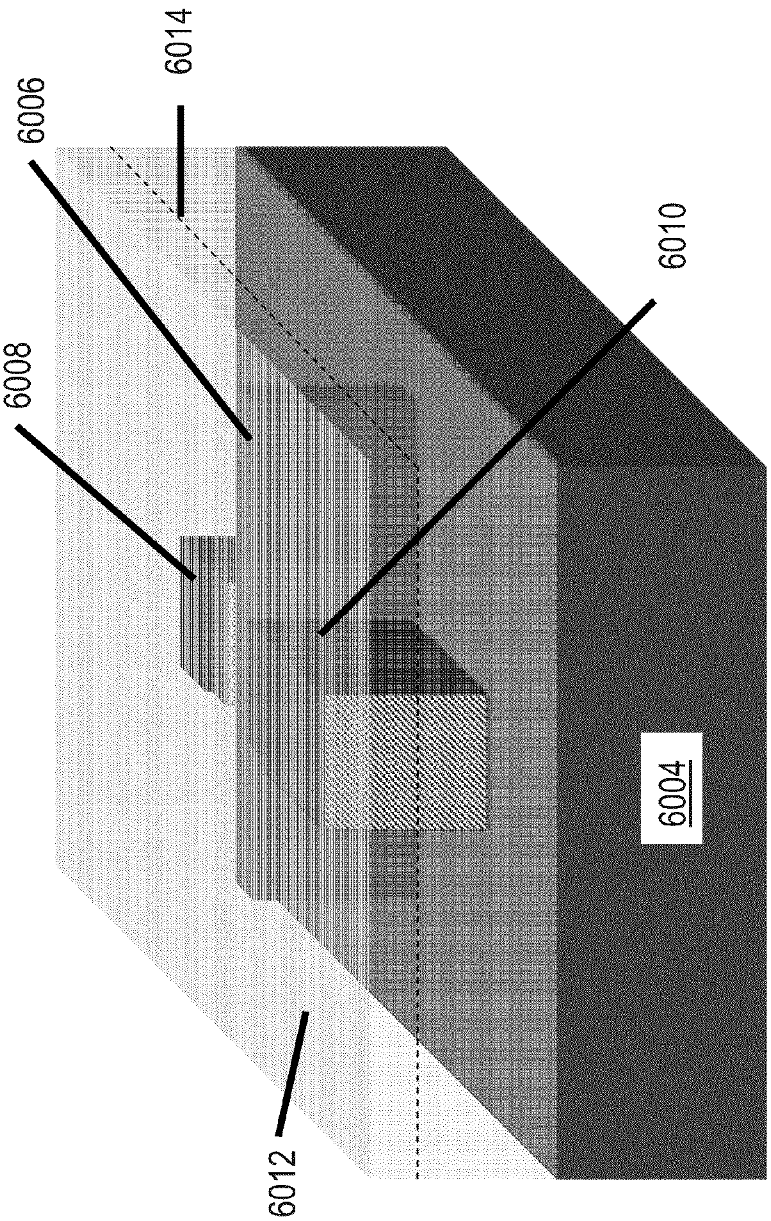

Step (F) is illustrated with FIG. 60F. Hydrogen H+ may be implanted into the structure at a certain depth creating hydrogen plane 6014 indicated by dotted lines.

Figure 60G:
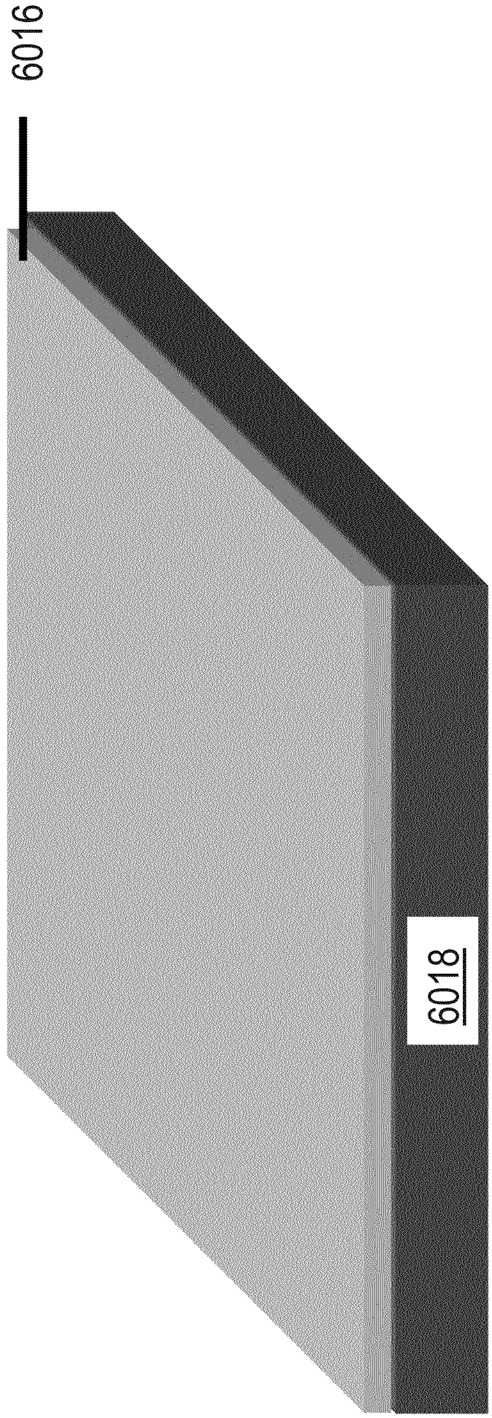
Figure 60H:
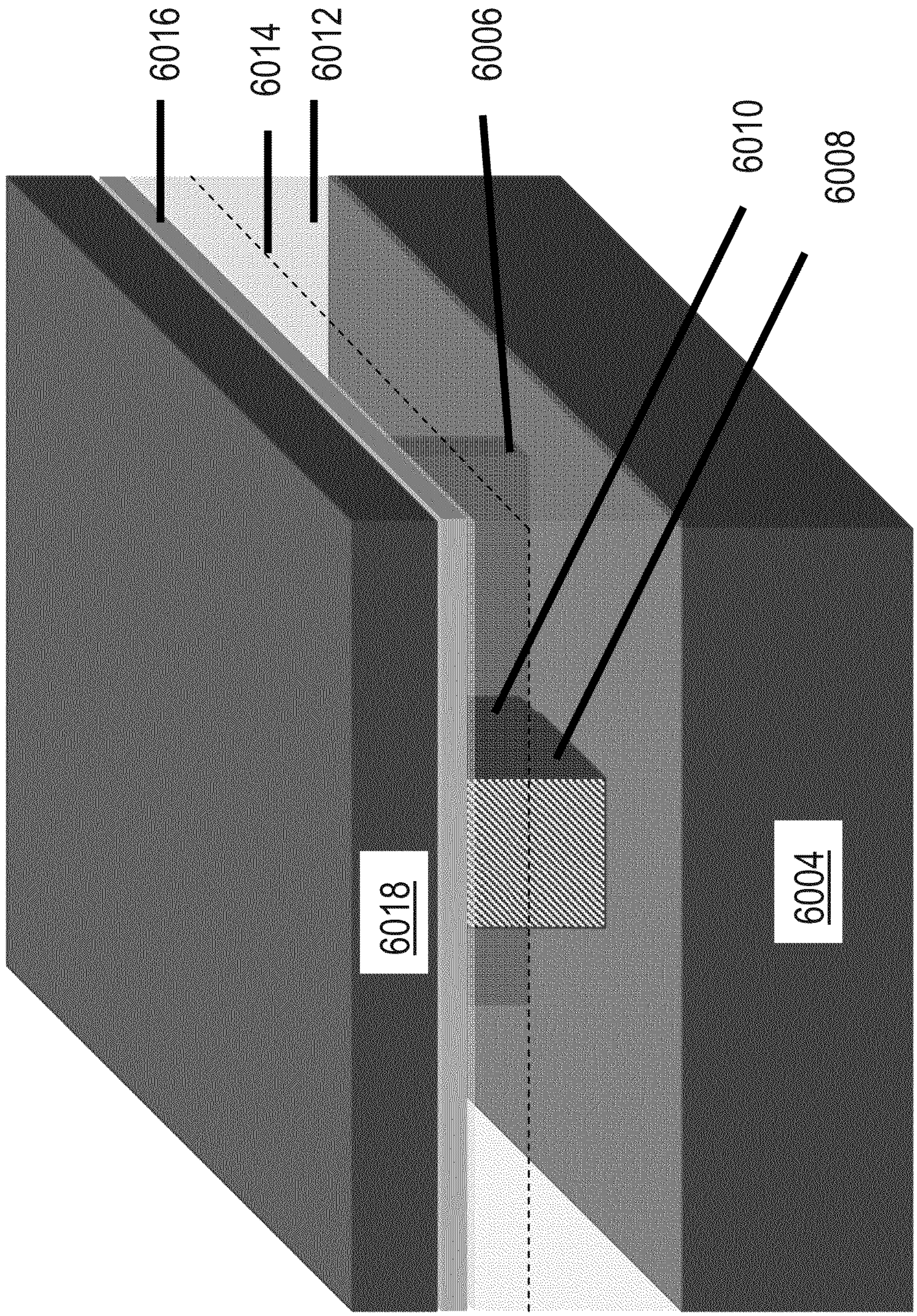

Step (G) is illustrated with FIG. 60G. A silicon wafer 6018 may have an oxide layer 6016 deposited atop it. Step (H) is illustrated with FIG. 60H. The structure shown in FIG. 60G may be flipped and bonded atop the structure shown in FIG. 60F using oxide-to-oxide bonding.

Figure 60I:
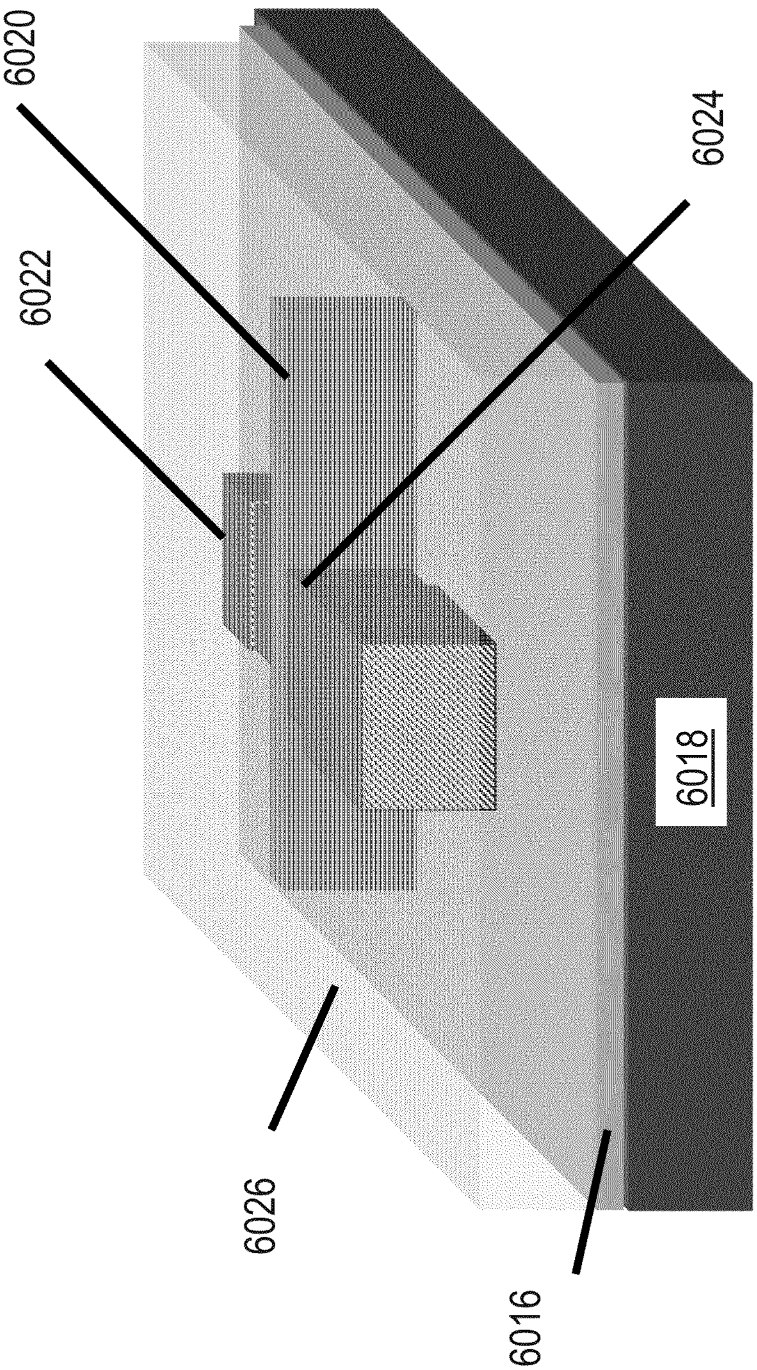
Figure 60J:
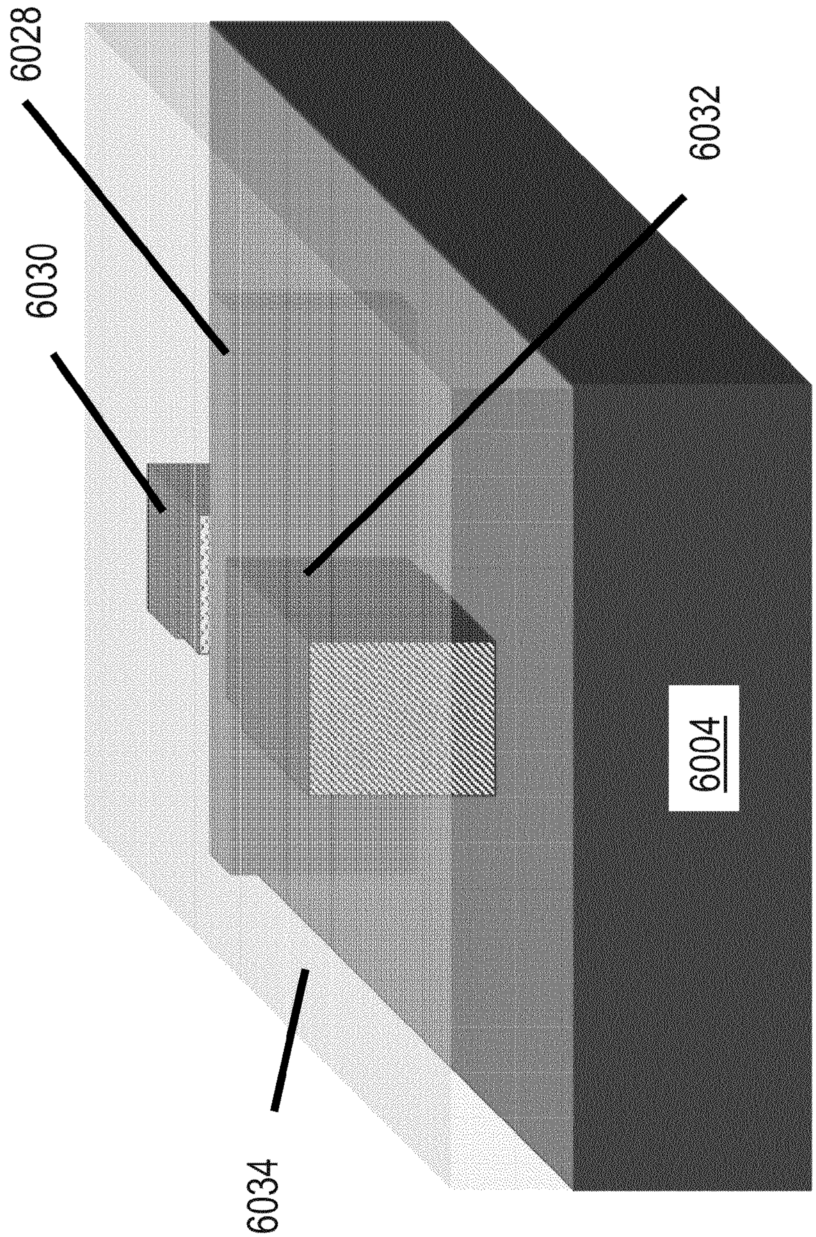

Step (I) is illustrated with FIG. 60I and FIG. 60J. The structure shown in FIG. 60H may be cleaved at hydrogen plane 6014 using a sideways mechanical force. Alternatively, a thermal anneal, such as, for example, furnace or spike, could be used for the cleave process. Following the cleave process, CMP steps may be done to planarize surfaces. FIG. 60I shows silicon wafer 6018 having an oxide layer 6016 and patterned features transferred atop it. These patterned features may include gate dielectric regions 6024, gate electrode regions 6022, n+ silicon channel 6020 and silicon dioxide regions 6026. These patterned features may be used for further fabrication, with contacts, interconnect levels and other steps of the fabrication flow being completed. FIG. 60J shows the p− silicon substrate region 6004 having patterned transistor layers. These patterned transistor layers include gate dielectric regions 6032, gate electrode regions 6030, n+ silicon regions 6028 and silicon dioxide regions 6034. The structure in FIG. 60J may be used for transferring patterned layers to other substrates similar to the one shown in FIG. 60G using processes similar to those described in FIG. 60E-J. Essentially, a set of patterned features created with lithography steps once (such as the one shown in FIG. 60E) may be layer transferred to many wafers, thereby removing the requirement for separate lithography steps for each wafer. Lithography cost can be reduced significantly using this approach.

Implanting hydrogen through the gate dielectric regions 6010 in FIG. 60F may not degrade the dielectric quality, since the area exposed to implant species is small (a gate dielectric is typically about 2 nm thick, and the channel length is typically less than about 20 nm, so the exposed area to the implant species is just about 40 sq. nm). Additionally, a thermal anneal or oxidation after the cleave may repair the potential implant damage. Also, a post-cleave CMP polish to remove the hydrogen rich plane within the gate dielectric may be performed.

An alternative embodiment of the invention may involve forming a dummy gate transistor structure, for example, as previously described for the replacement gate process, for the structure shown in FIG. 60I. Post cleave, the gate electrode regions 6022 and the gate dielectric regions 6024 material may be etched away and then the trench may be filled with a replacement gate dielectric and a replacement gate electrode.

In an alternative embodiment of the invention described in FIG. 60A-J, the silicon wafer 6018 in FIG. 60A-J may be a wafer with one or more pre-fabricated transistor and interconnect layers. Low temperature (less than approximately 400° C.) bonding and cleave techniques as previously described may be employed. In that scenario, 3D stacked logic chips may be formed with fewer lithography steps. Alignment schemes similar to those described in Section 2 may be used.

FIG. 61A-K describes an alternative embodiment of this invention, wherein a process flow is described in which a side gated mono crystalline Finfet may be formed with lithography steps shared among many wafers. The process flow for the silicon chip may include the following steps that occur in sequence from Step (A) to Step (J). When the same reference numbers are used in different drawing figures (among FIG. 61A-K), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 61A:
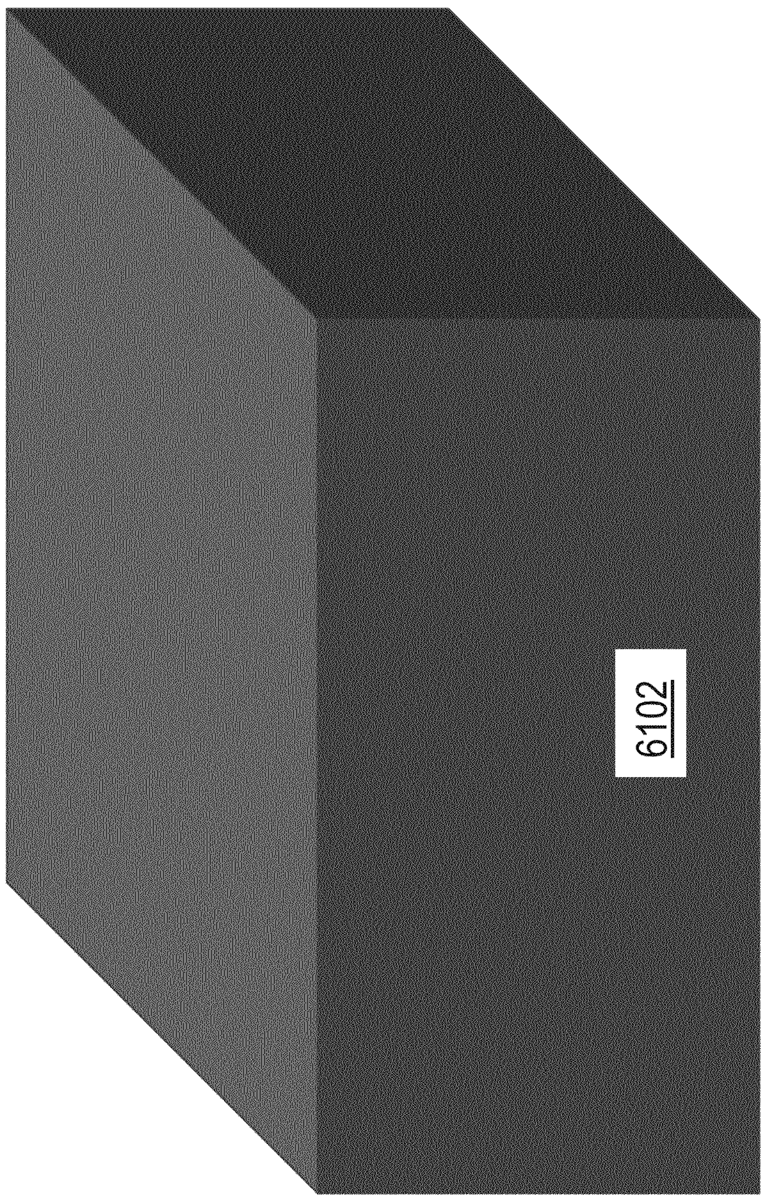
FIG. 61A-K illustrate a process flow for manufacturing Finfets with reduced lithography steps.

Step (A) is illustrated with FIG. 61A. An n− Silicon wafer 6102 is taken.

Figure 61B:
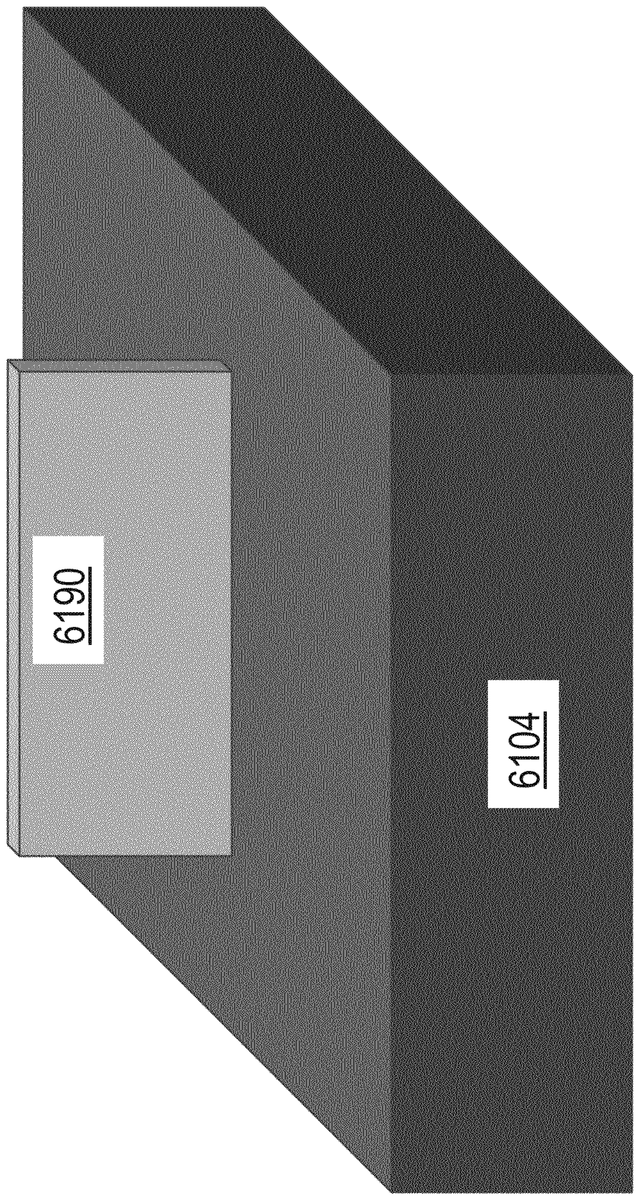

Step (B) is illustrated with FIG. 61B. P type dopant, such as, for example, Boron ions, may be implanted into the n− Silicon wafer 6102 of FIG. 61A. A thermal anneal, such as, for example, rapid, furnace, spike, or laser may then be done to activate dopants. Following this, a lithography and etch process may be conducted to define n− silicon region 6104 and p− silicon region 6190. Regions with n− silicon, similar in structure and formation to p− silicon region 6190, where p− Finfets are fabricated, are not shown.

Figure 61C:
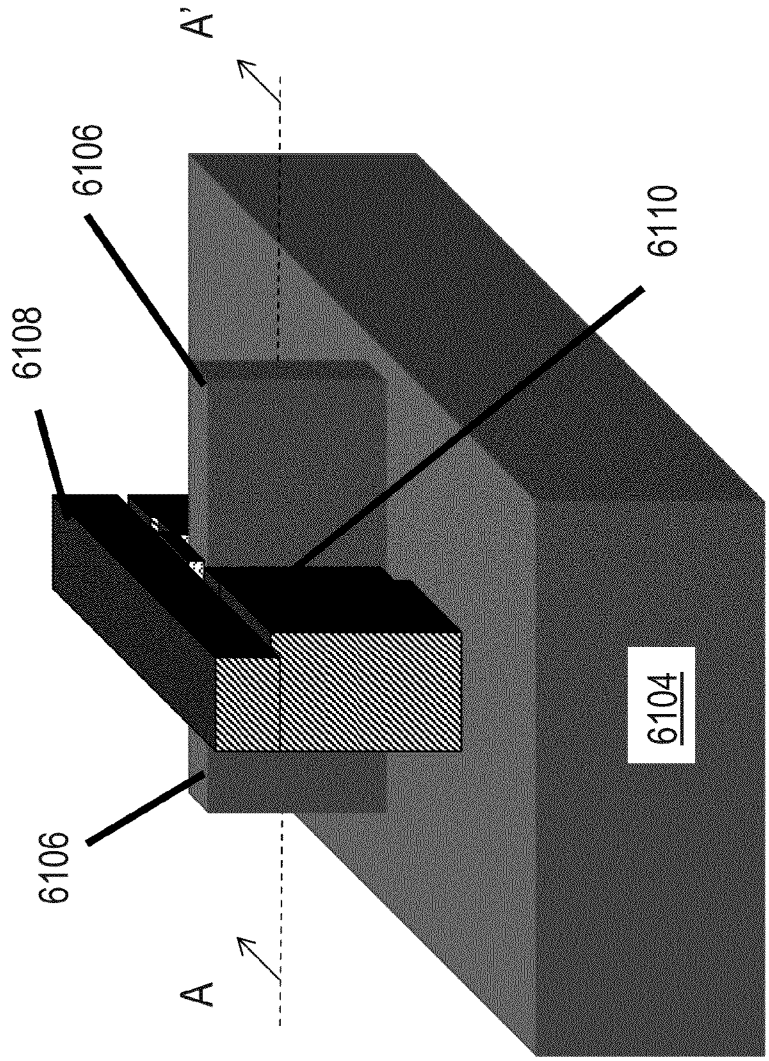
Figure 61D:
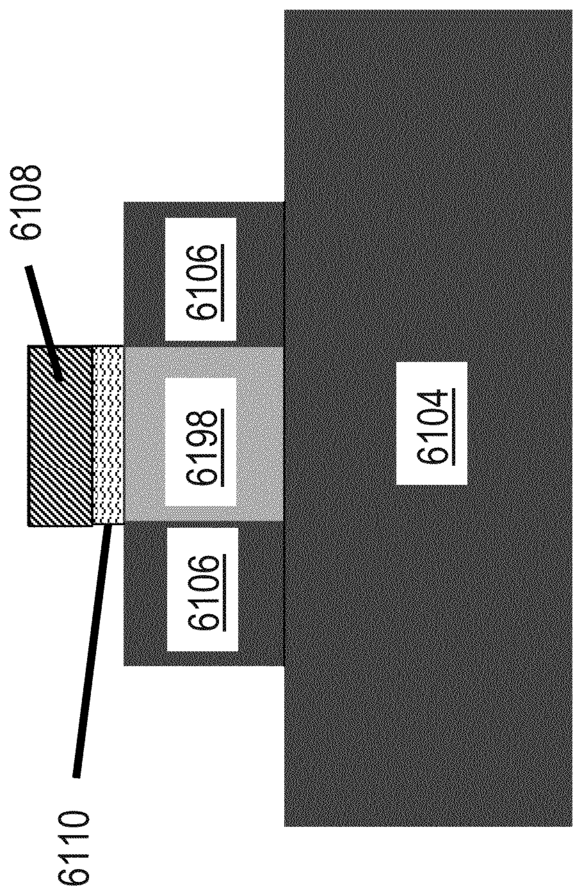

Step (C) is illustrated with FIG. 61C. Gate dielectric regions 6110 and gate electrode regions 6108 may be formed by oxidation or deposition of a gate dielectric, then deposition of a gate electrode, polishing with CMP, and then lithography and etch. The gate electrode regions 6108 are preferably doped polysilicon. Alternatively, various hi-k metal gate (HKMG) materials could be utilized for gate dielectric and gate electrode as described previously. N+ dopants, such as, for example, Arsenic, Antimony or Phosphorus, may then be implanted to form source and drain regions of the Finfet. The n+ doped source and drain regions are indicated as 6106. FIG. 61D shows a cross-section of FIG. 61C along the AA' direction. P− doped region 6198 can be observed, as well as n+ doped source and drain regions 6106, gate dielectric regions 6110, gate electrode regions 6108, and n− silicon region 6104.

Figure 61E:
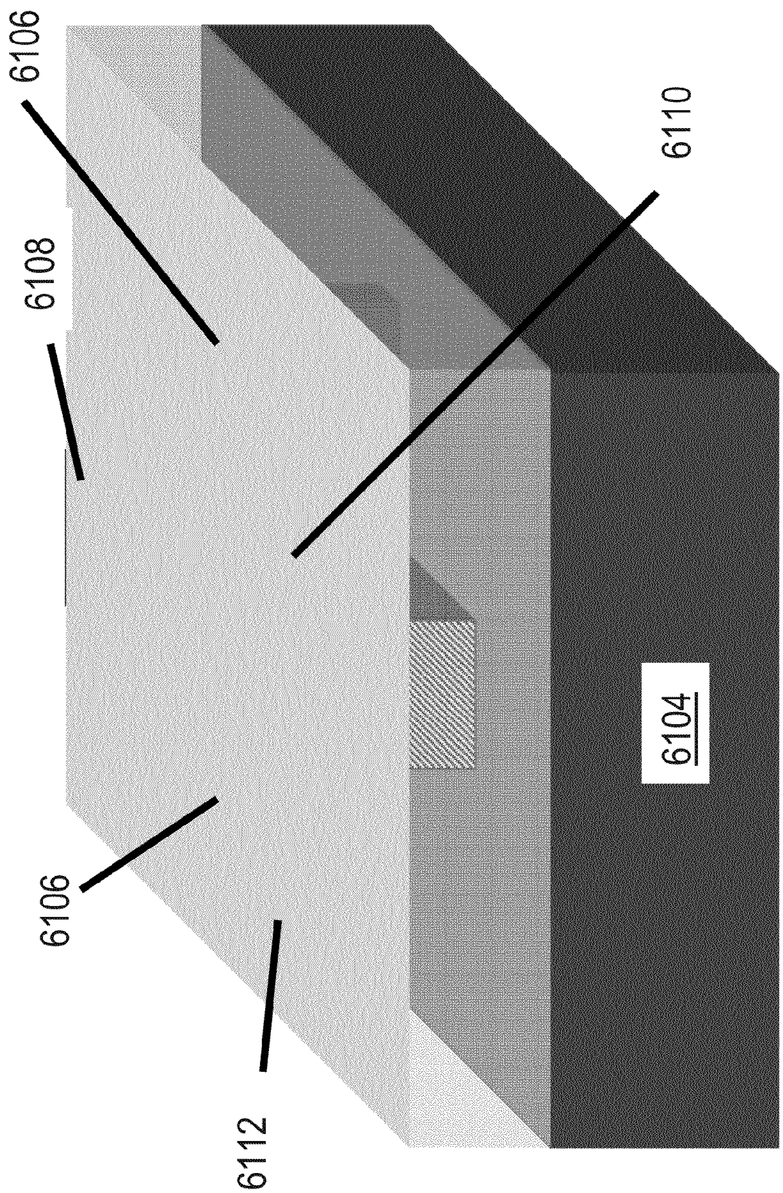

Step (D) is illustrated with FIG. 61E. Silicon dioxide regions 6112 may be formed by deposition and may then be planarized and polished with CMP such that the silicon dioxide regions 6112 cover n− silicon region 6104, n+ doped source and drain regions 6106, gate electrode regions 6108, p− doped region 6198, and gate dielectric regions 6110.

Figure 61F:
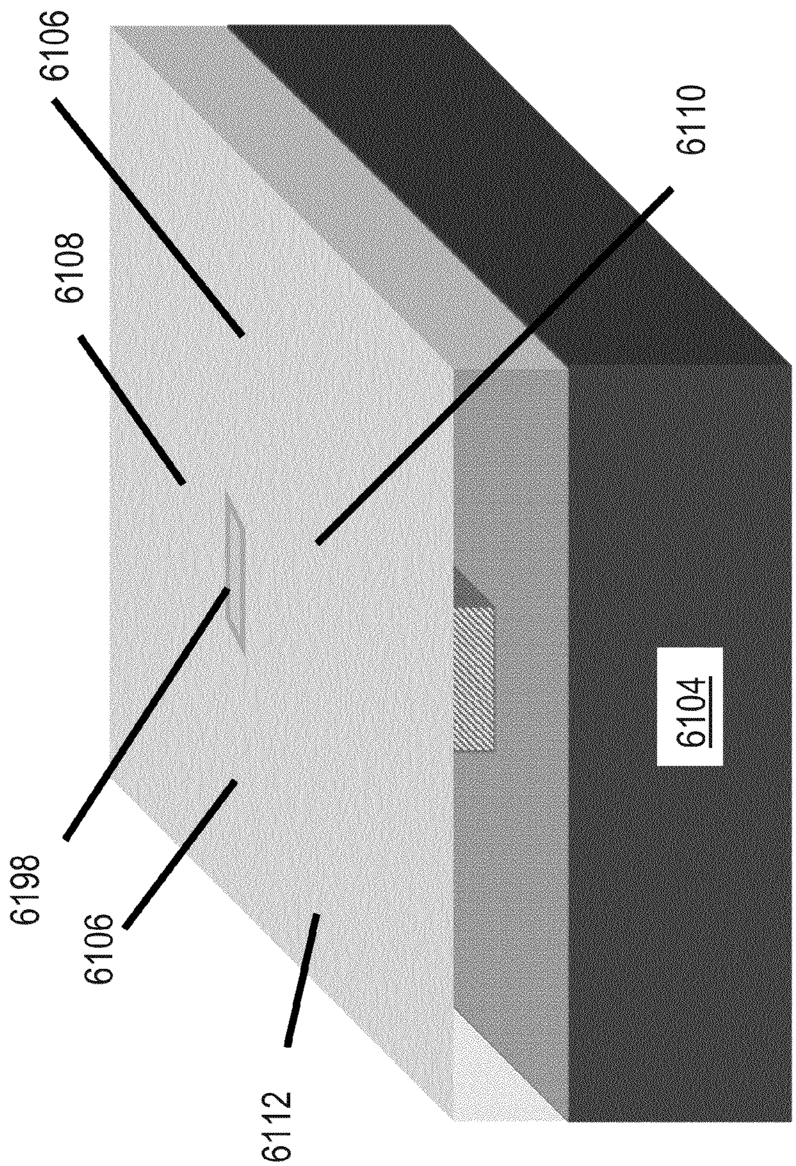

Step (E) is illustrated with FIG. 61F. The structure shown in FIG. 61E may be further polished with CMP such that portions of silicon dioxide regions 6112, gate electrode regions 6108, gate dielectric regions 6110, p− doped region 6198, and n+ doped source and drain regions 6106 are polished. Following this, a silicon dioxide layer may be deposited over the structure.

Figure 61G:
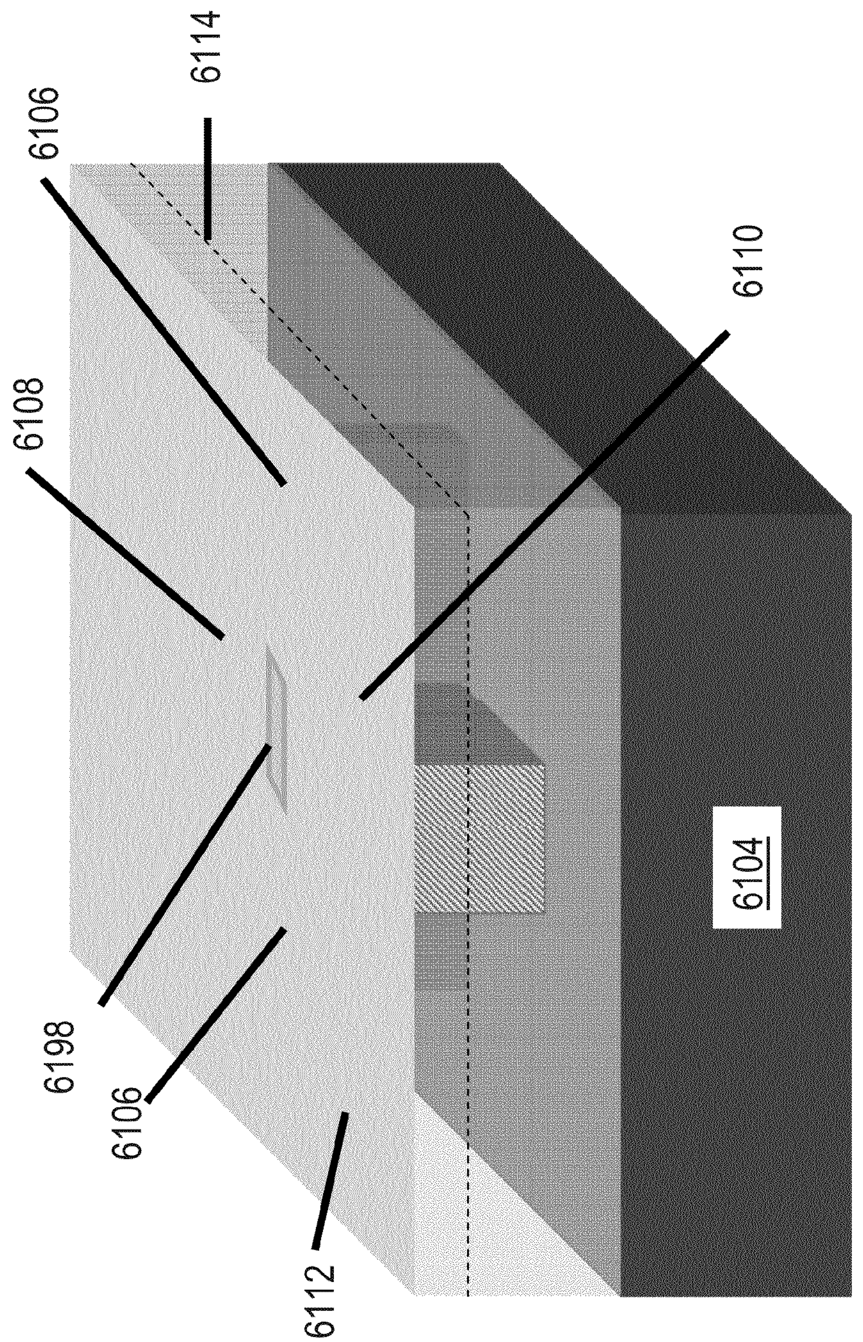

Step (F) is illustrated with FIG. 61G. Hydrogen H+ may be implanted into the structure at a certain depth creating hydrogen plane 6114 indicated by dotted lines.

Figure 61H:
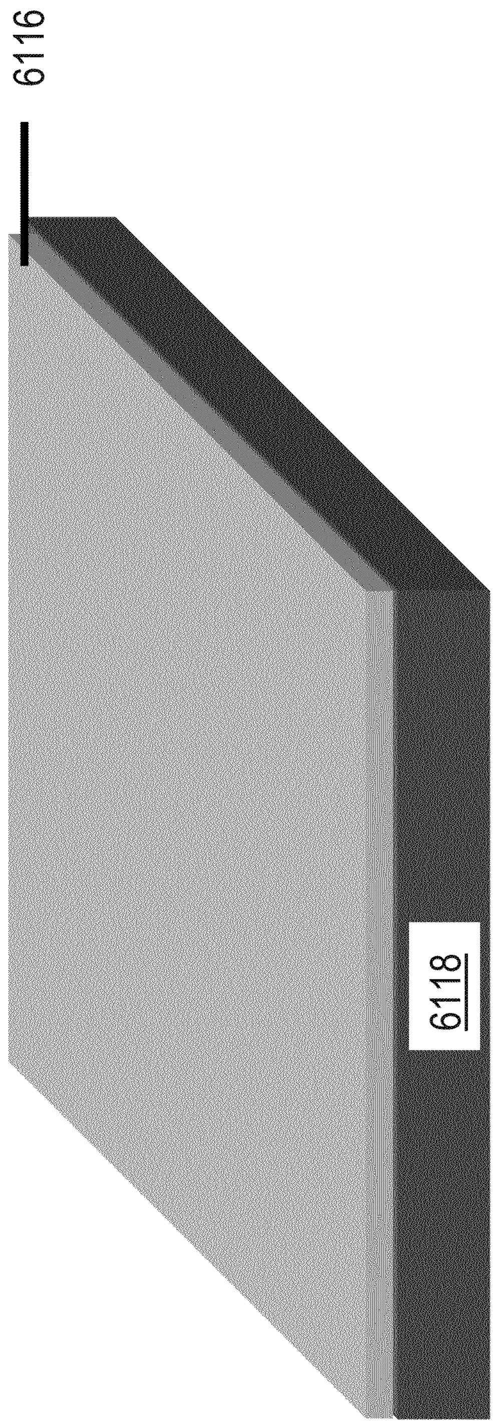

Step (G) is illustrated with FIG. 61H. A silicon wafer 6118 may have a silicon dioxide layer 6116 deposited atop it.

Figure 61I:
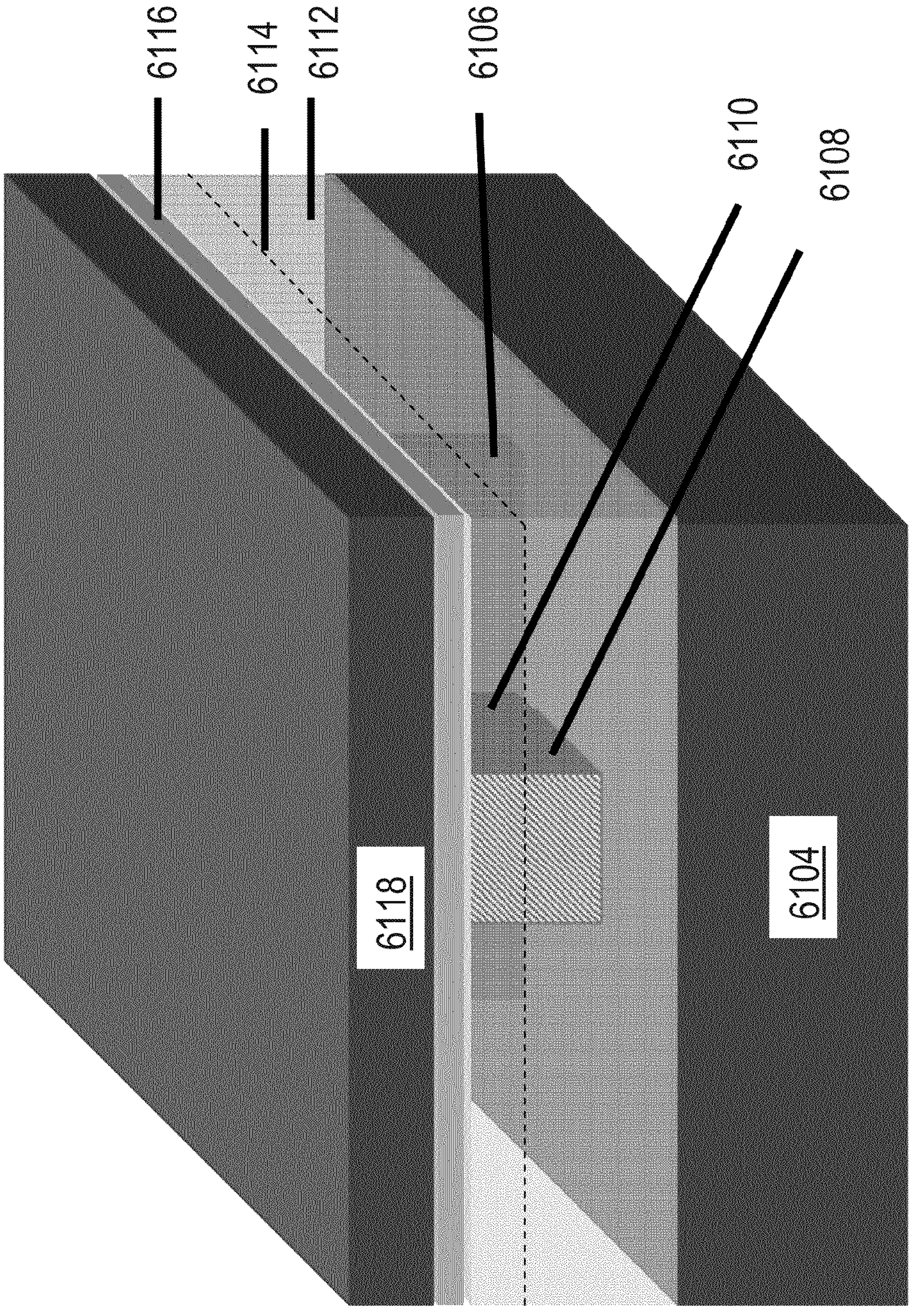

Step (H) is illustrated with FIG. 61I. The structure shown in FIG. 61H may be flipped and bonded atop the structure shown in FIG. 60G using oxide-to-oxide bonding.

Figure 61J:
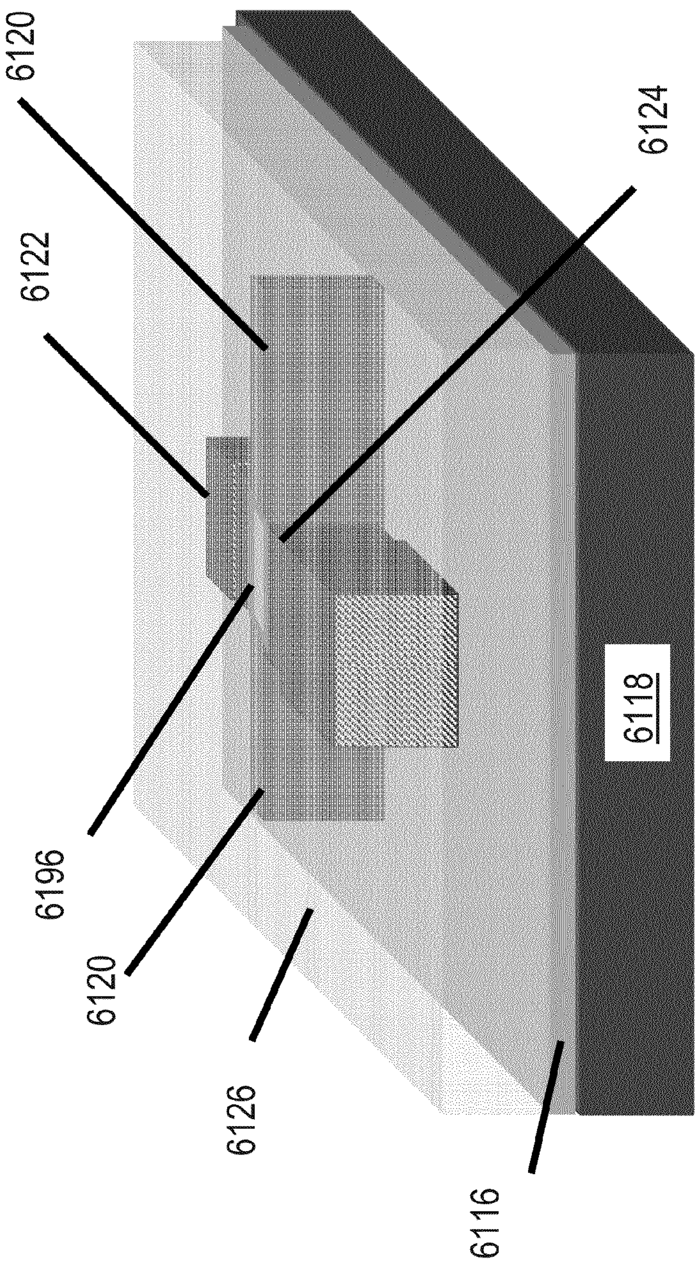
Figure 61K:
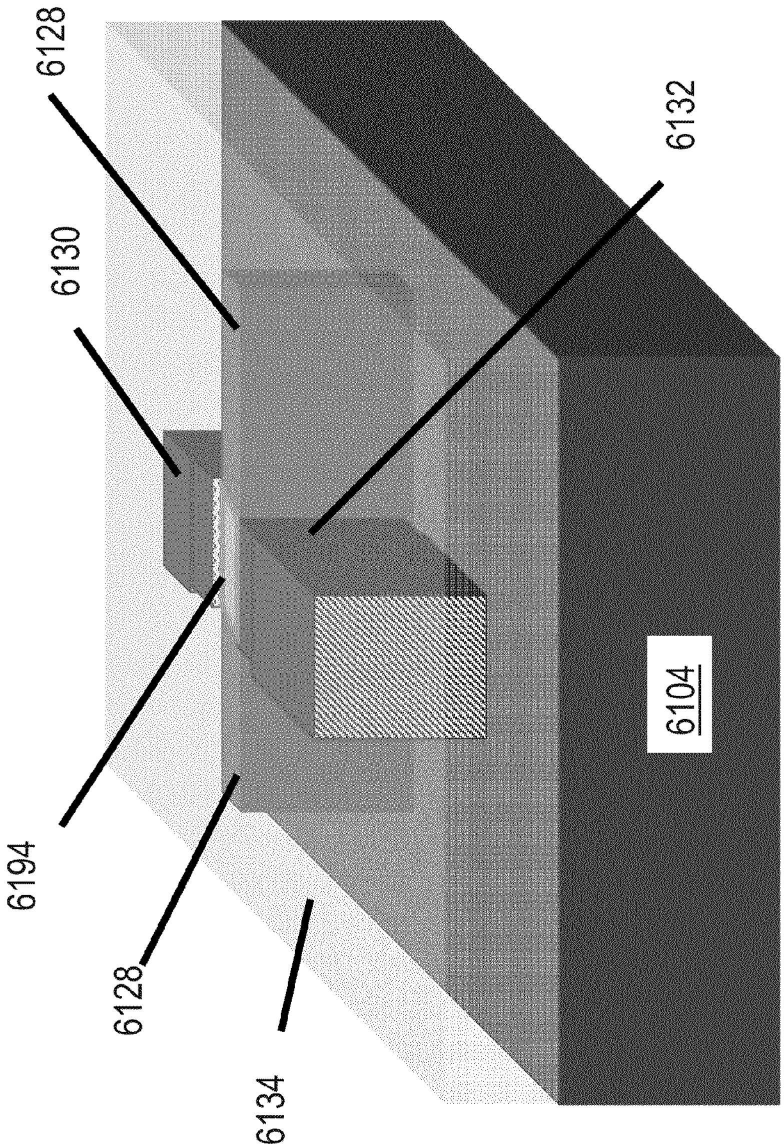

Step (I) is illustrated with FIG. 61J and FIG. 61K. The structure shown in FIG. 61J may be cleaved at hydrogen plane 6114 using a sideways mechanical force. Alternatively, a thermal anneal, such as, for example, furnace or spike, could be used for the cleave process. Following the cleave process, CMP processes may be done to planarize surfaces. FIG. 61J shows silicon wafer 6118 having a silicon dioxide layer 6116 and patterned features transferred atop it. These patterned features may include gate dielectric regions 6124, gate electrode regions 6122, n+ silicon region 6120, p− silicon region 6196 and silicon dioxide regions 6126. These patterned features may be used for further fabrication, with contacts, interconnect levels and other steps of the fabrication flow being completed. FIG. 61K shows the substrate n− silicon region 6104 having patterned transistor layers. These patterned transistor layers include gate dielectric regions 6132, gate electrode regions 6130, n+ silicon regions 6128, channel region 6194, and silicon dioxide regions 6134. The structure in FIG. 61K may be used for transferring patterned layers to other substrates similar to the one shown in FIG. 61H using processes similar to those described in FIG. 61G-K. Essentially, a set of patterned features created with lithography steps once (such as the one shown in FIG. 61F) may be layer transferred to many wafers, thereby removing the requirement for separate lithography steps for each wafer. Lithography cost can be reduced significantly using this approach.

Implanting hydrogen through the gate dielectric regions 6110 in FIG. 61G may not degrade the dielectric quality, since the area exposed to implant species is small (a gate dielectric is typically about 2 nm thick, and the channel length is typically less than about 20 nm, so the exposed area to the implant species is about 40 sq. nm). Additionally, a thermal anneal or oxidation after the cleave may repair the potential implant damage. Also, a post-cleave CMP polish to remove the hydrogen rich plane within the gate dielectric may be performed.

An alternative embodiment of this invention may involve forming a dummy gate transistor structure, as previously described for the replacement gate process, for the structure shown in FIG. 61J. Post cleave, the gate electrode regions 6122 and the gate dielectric regions 6124 material may be etched away and then the trench may be filled with a replacement gate dielectric and a replacement gate electrode.

In an alternative embodiment of the invention described in FIG. 61A-K, the silicon wafer 6118 in FIG. 61A-K may be a wafer with one or more pre-fabricated transistor and interconnect layers. Low temperature (less than approximately 400° C.) bonding and cleave techniques as previously described may be employed. In that scenario, 3D stacked logic chips may be formed with fewer lithography steps. Alignment schemes similar to those described in Section 2 may be used.

FIG. 62A-G describes another embodiment of this invention, wherein a process flow is described in which a planar mono-crystalline transistor is formed with lithography steps shared among many wafers. The process flow for the silicon chip may include the following steps that occur in sequence from Step (A) to Step (F). When the same reference numbers are used in different drawing figures (among FIG. 62A-G), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 62A:
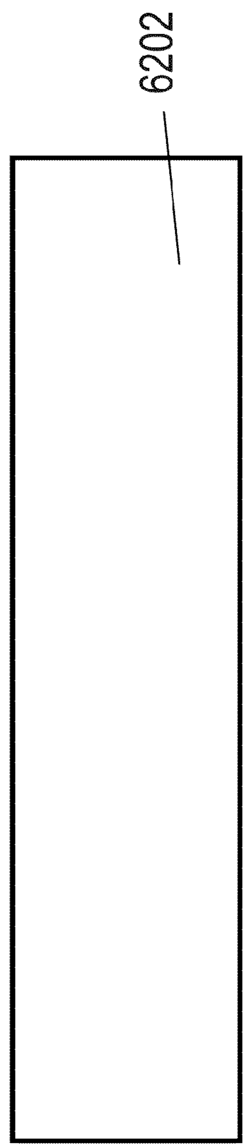
FIG. 62A-G illustrate a process flow for manufacturing planar transistors with reduced lithography steps.

Step (A) is illustrated using FIG. 62A. A p− silicon wafer 6202 is taken.

Figure 62B:
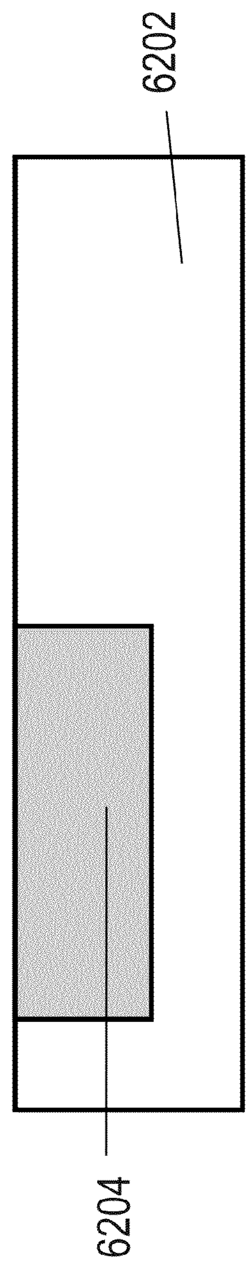

Step (B) is illustrated using FIG. 62B. An n well implant opening may be lithographically defined and n type dopants, such as, for example, Arsenic or Phosphorous, may be ion implanted into the p− silicon wafer 6202. A thermal anneal, such as, for example, rapid, furnace, spike, or laser may be done to activate the implanted dopants. Thus, n-well region 6204 may be formed.

Figure 62C:
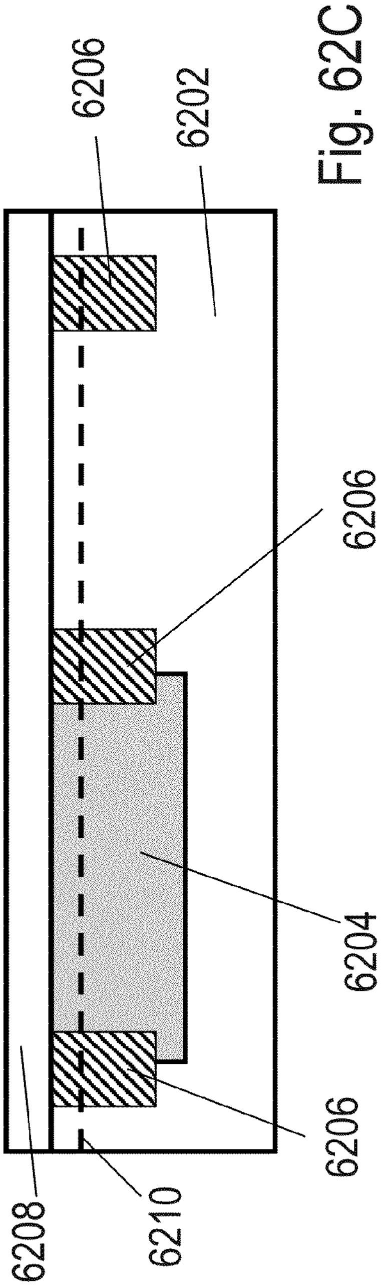

Step (C) is illustrated using FIG. 62C. Shallow trench isolation regions 6206 may be formed, after which an oxide layer 6208 may be grown or deposited. Following this, hydrogen H+ ions may be implanted into the wafer at a certain depth creating hydrogen plane 6210 indicated by dotted lines.

Figure 62D:
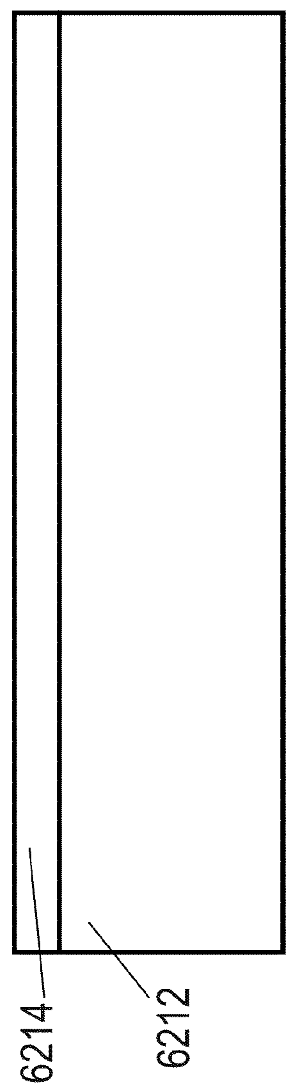

Step (D) is illustrated using FIG. 62D. A silicon wafer 6212 is taken and an oxide layer 6214 may be deposited or grown atop it.

Figure 62E:
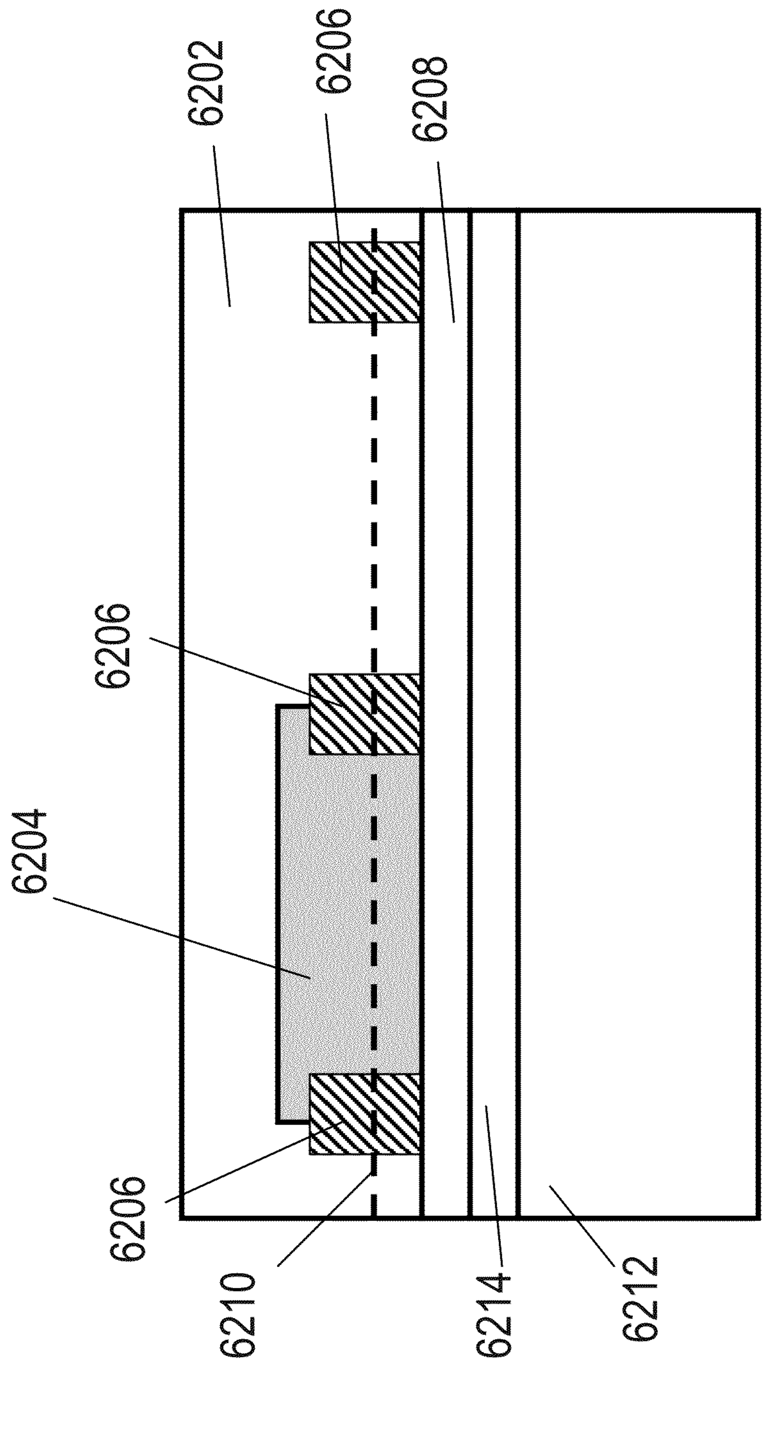

Step (E) is illustrated using FIG. 62E. The structure shown in FIG. 62C may be flipped and bonded atop the structure shown in FIG. 62D using oxide-to-oxide bonding of layers 6214 and 6208.

Figure 62F:
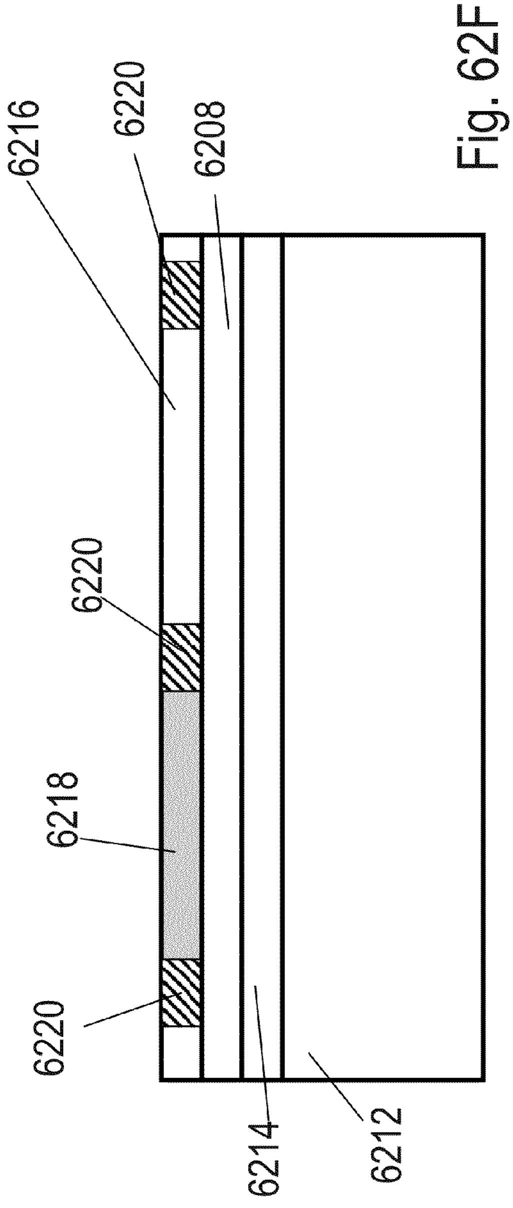
Figure 62G:
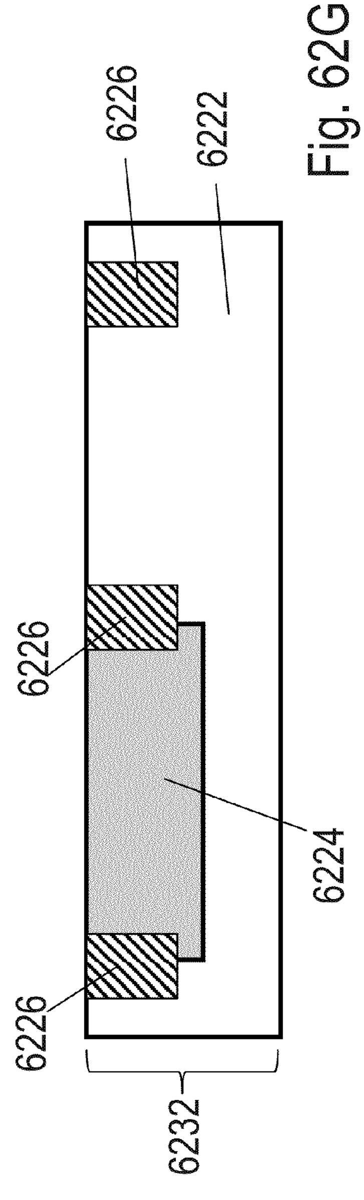

Step (F) is illustrated using FIG. 62F and FIG. 62G. The structure shown in FIG. 62E may be cleaved at hydrogen plane 6210 using a sideways mechanical force. Alternatively, a thermal anneal, such as, for example, furnace or spike, could be used for the cleave process. Following the cleave process, CMP processes may be used to planarize and polish surfaces of both silicon wafer 6212 and silicon wafer 6232. FIG. 62F shows a silicon-on-insulator wafer formed after the cleave and CMP process where p type regions 6216, n type regions 6218 and shallow trench isolation regions 6220 are formed atop oxide regions 6208 and 6214 and silicon wafer 6212. Transistor fabrication may then be completed on the structure shown in FIG. 62F, following which metal interconnects may be formed. FIG. 62G shows silicon wafer 6232 formed after the cleave and CMP process which includes p− silicon regions 6222, n well region 6224 and shallow trench isolation regions 6226. These features may be layer transferred to other wafers similar to the one shown in FIG. 62D using processes similar to those shown in FIG. 62E-G. Essentially, a single set of patterned features created with lithography steps once may be layer transferred onto many wafers thereby saving lithography cost.

In an alternative embodiment of the invention described in FIG. 62A-G, the silicon wafer 6212 in FIG. 62A-G may be a wafer with one or more pre-fabricated transistor and metal interconnect layers. Low temperature (less than approximately 400° C.) bonding and cleave techniques as previously described may be employed. In that scenario, 3D stacked logic chips may be formed with fewer lithography steps. Alignment schemes similar to those described in Section 2 may be used.

FIG. 63A-H describes another embodiment of this invention, wherein 3D integrated circuits are formed with fewer lithography steps. The process flow for the silicon chip may include the following steps that occur in sequence from Step (A) to Step (G). When the same reference numbers are used in different drawing figures (among FIG. 63A-H), they are used to indicate analogous, similar or identical structures to enhance the understanding of the present invention by clarifying the relationships between the structures and embodiments presented in the various diagrams—particularly in relating analogous, similar or identical functionality to different physical structures.

Figures 63A, 63B, 63C, 63D:
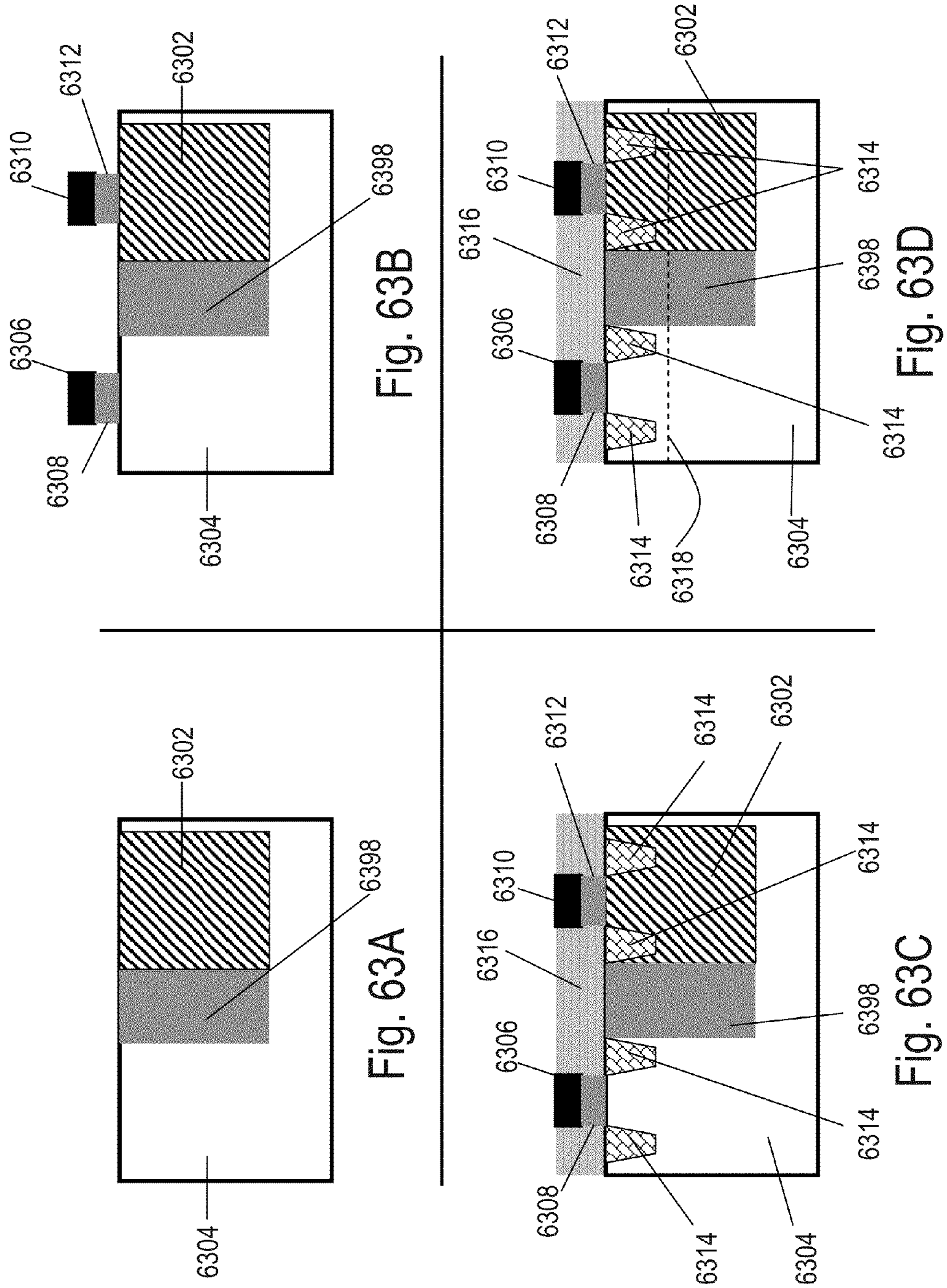
FIG. 63A-H illustrate a process flow for manufacturing 3D stacked planar transistors with reduced lithography steps.

Step (A) is illustrated with FIG. 63A a p silicon wafer may have n type silicon wells formed in it using standard procedures following which a shallow trench isolation may be formed. 6304 denotes p silicon regions, 6302 denotes n silicon regions and 6398 denotes shallow trench isolation regions.

Step (B) is illustrated with FIG. 63B. Dummy gates may be constructed with silicon dioxide and polycrystalline silicon (polysilicon). The term "dummy gates" is used since these gates will be replaced by high k gate dielectrics and metal gates later in the process flow, according to the standard replacement gate (or gate-last) process. This replacement gate process may also be called a gate replacement process. Further details of replacement gate processes are described in "A 45 nm Logic Technology with High-k+ Metal Gate Transistors, Strained Silicon, 9 Cu Interconnect Layers, 193 nm Dry Patterning, and 100% Pb-free Packaging," IEDM Tech. Dig., pp. 247-250, 2007 by K. Mistry, et al. and "Ultralow-EOT (5 Å) Gate-First and Gate-Last High Performance CMOS Achieved by Gate-Electrode Optimization," IEDM Tech. Dig., pp. 663-666, 2009 by L. Ragnarsson, et al. 6306 and 6310 may be polysilicon gate electrodes while 6308 and 6312 may be silicon dioxide dielectric layers.

Step (C) is illustrated with FIG. 63C. The remainder of the gate-last transistor fabrication flow up to just prior to gate replacement may proceed with the formation of source-drain regions 6314, strain enhancement layers to improve mobility (not shown), high temperature anneal to activate source-drain regions 6314, formation of inter-layer dielectric (ILD) 6316, and so forth.

Step (D) is illustrated with FIG. 63D. Hydrogen may be implanted into the wafer creating hydrogen plane 6318 indicated by dotted lines.

Figure 63E:
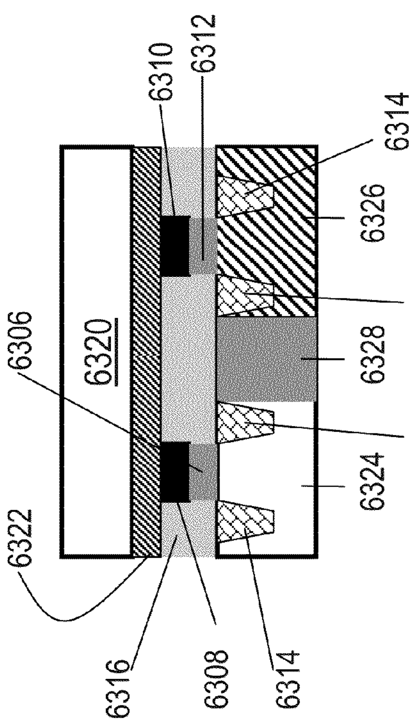

Step (E) is illustrated with FIG. 63E. The wafer after step (D) may be bonded to a temporary carrier wafer 6320 using a temporary bonding adhesive 6322. This temporary carrier wafer 6320 may be constructed of glass. Alternatively, it could be constructed of silicon. The temporary bonding adhesive 6322 may be a polymeric material, such as polyimide DuPont HD3007. A thermal anneal or a sideways mechanical force may be utilized to cleave the wafer at the hydrogen plane 6318. A CMP process is then conducted beginning on the exposed surface of p silicon region 6304. 6324 indicates a p silicon region, 6328 indicates an oxide isolation region and 6326 indicates an n silicon region after this process.

Figure 63F:
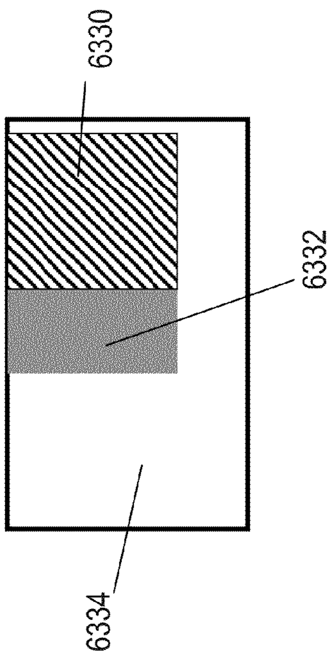

FIG. 63F shows the other portion of the cleaved structure after a CMP process. 6334 indicates a p silicon region, 6330 indicates an n silicon region and 6332 indicates an oxide isolation region. The structure shown in FIG. 63F may be reused to transfer layers using process steps similar to those described with FIG. 63A-E to form structures similar to FIG. 63E. This enables a significant reduction in lithography cost.

Figure 63G:
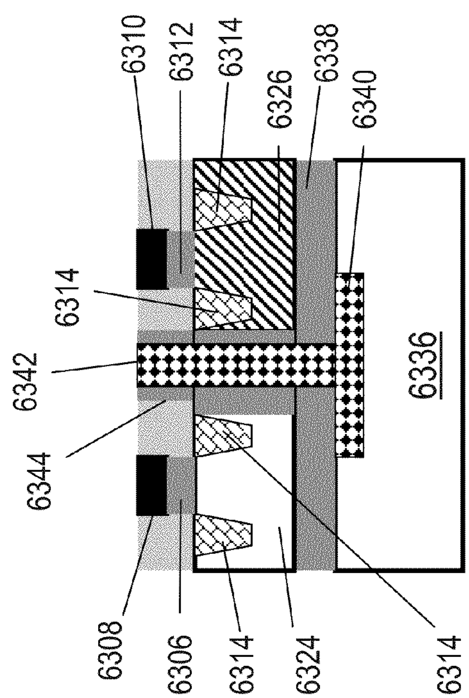

Step (F) is illustrated with FIG. 63G: An oxide layer 6338 may be deposited onto the bottom of the wafer shown in Step (E). The wafer may then be bonded to the top surface of bottom layer of wires and transistors 6336 using oxide-to-oxide bonding. The bottom layer of wires and transistors 6336 could also be called a base wafer. The temporary carrier wafer 6320 may then be removed by shining a laser onto the temporary bonding adhesive 6322 through the temporary carrier wafer 6320 (which could be constructed of glass). Alternatively, a thermal anneal could be used to remove the temporary bonding adhesive 6322. Through-silicon connections 6342 with a non-conducting (e.g. oxide) liner 6344 to the landing pads 6340 in the base wafer may be constructed at a very high density using special alignment methods to be described in FIG. 26A-D and FIG. 27A-F.

Figure 63H:
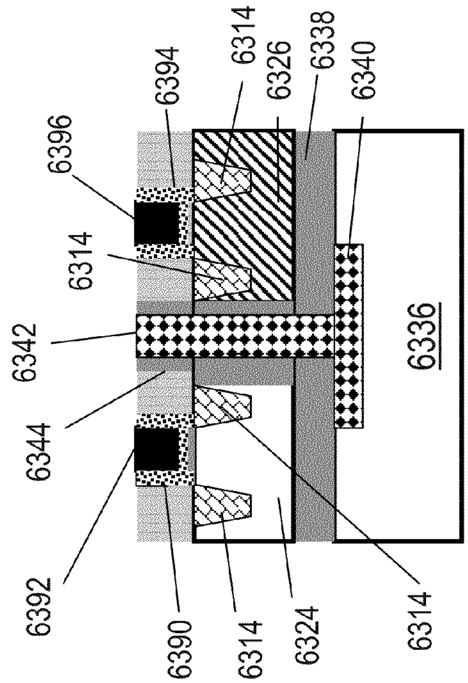

Step (G) is illustrated with FIG. 63H. Dummy gates consisting of gate electrodes 6308 and 6310 and gate dielectrics 6306 and 6312 may be etched away, followed by the construction of a replacement with high k gate dielectrics 6390 and 6394 and metal gates 6392 and 6396. Essentially, partially-formed high performance transistors are layer transferred atop the base wafer (may also be called target wafer) followed by the completion of the transistor processing with a low (sub 400° C.) process. The remainder of the transistor, contact, and wiring layers may then be constructed.

It will be obvious to someone skilled in the art that alternative versions of this flow are possible with various methods to attach temporary carriers and with various versions of the gate-last process flow. One alternative version of this flow is as follows. Multiple layers of transistors may be formed atop each other using layer transfer schemes. Each layer may have its own gate dielectric, gate electrode and source-drain implants. Process steps such as isolation may be shared between these multiple layers of transistors, and these steps could be performed once the multiple layers of transistors (with gate dielectrics, gate electrodes and source-drain implants) are formed atop each other. A shared rapid thermal anneal may be conducted to activate dopants in the multiple layers of transistors. The multilayer transistor stack may then be layer transferred onto a temporary carrier following which transistor layers may be transferred one at a time onto different substrates using multiple layer transfer steps. A replacement gate process may then be carried out once layer transfer steps are complete.

Section 13: A Memory Technology with Shared Lithography Steps

While Section 12 described a logic technology with shared lithography steps, similar techniques could be applied to memory as well. Lithography cost is a serious issue for the memory industry, and the memory industry could benefit significantly from reduction in lithography costs.

Figure 66A:
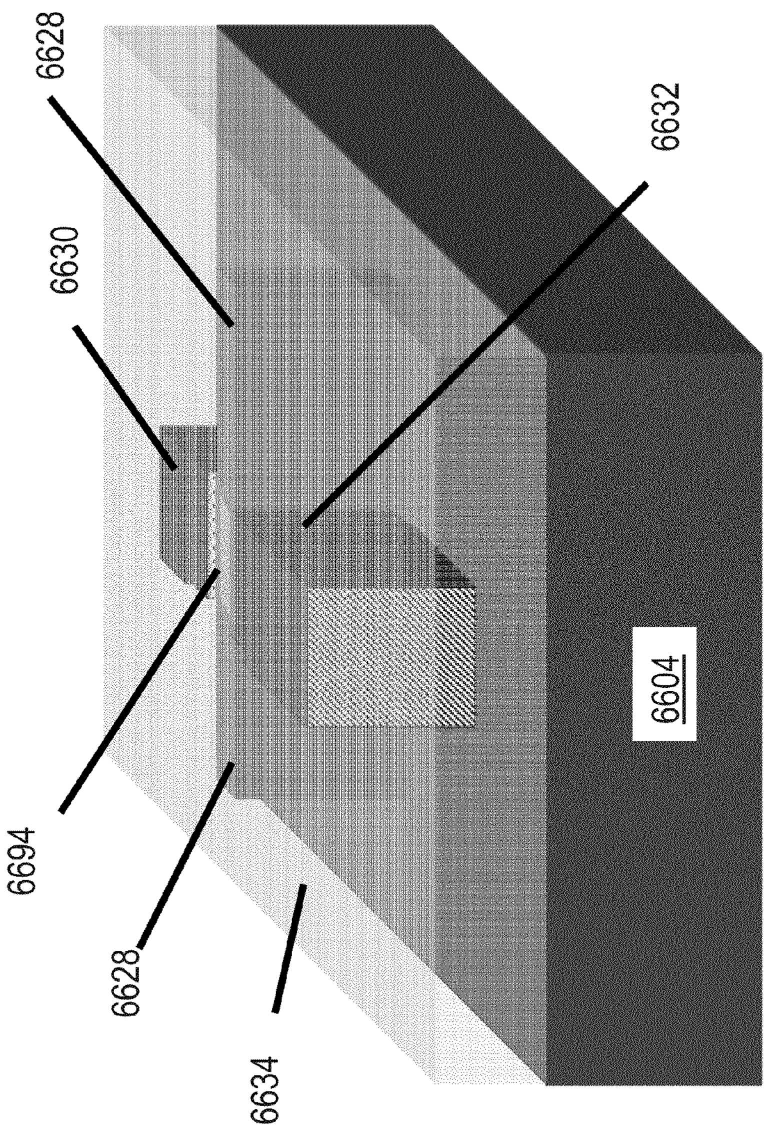
FIG. 66A-B illustrates a technique to construct DRAM with shared lithography steps.
Figure 66B:
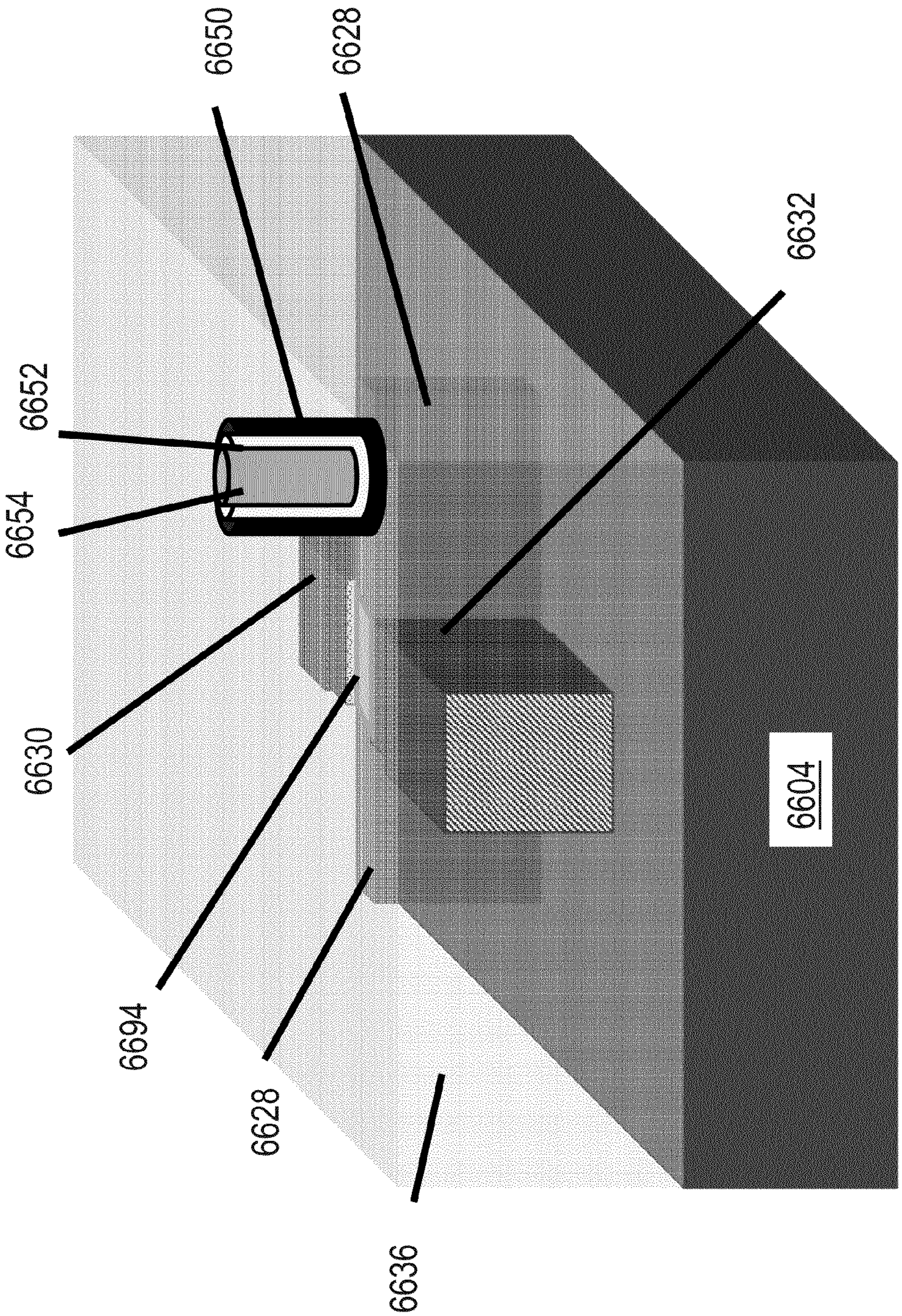

FIG. 66A-B illustrates an embodiment of this invention, where DRAM chips may be constructed with shared lithography steps. When the same reference numbers are used in different drawing figures (among FIG. 66A-B), they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) of the process is illustrated with FIG. 66A. Using procedures similar to those described in FIG. 61A-K, Finfets may be formed on multiple wafers such that lithography steps for defining the Finfet may be shared among multiple wafers. One of the fabricated wafers is shown in FIG. 66A with a Finfet constructed on it. In FIG. 66A, 6604 represents a silicon substrate that may, for example, include peripheral circuits for the DRAM. 6630 represents a gate electrode, 6632 represents a gate dielectric, 6628 represents a source or a drain region (for example, of n+ silicon), 6694 represents the channel region of the Finfet (for example, of p− silicon) and 6634 represents an oxide region.

Step (B) of the process is illustrated with FIG. 66B. A stacked capacitor may be constructed in series with the Finfet shown in FIG. 66A. The stacked capacitor includes an electrode 6650, a dielectric 6652 and another electrode 6654. 6636 is an oxide layer.

Following these steps, the rest of the DRAM fabrication flow can proceed, with contacts and wiring layers being constructed. It will be obvious to one skilled in the art that various process flows and device structures can be used for the DRAM and combined with the inventive concept of sharing lithography steps among multiple wafers.

Figure 67:
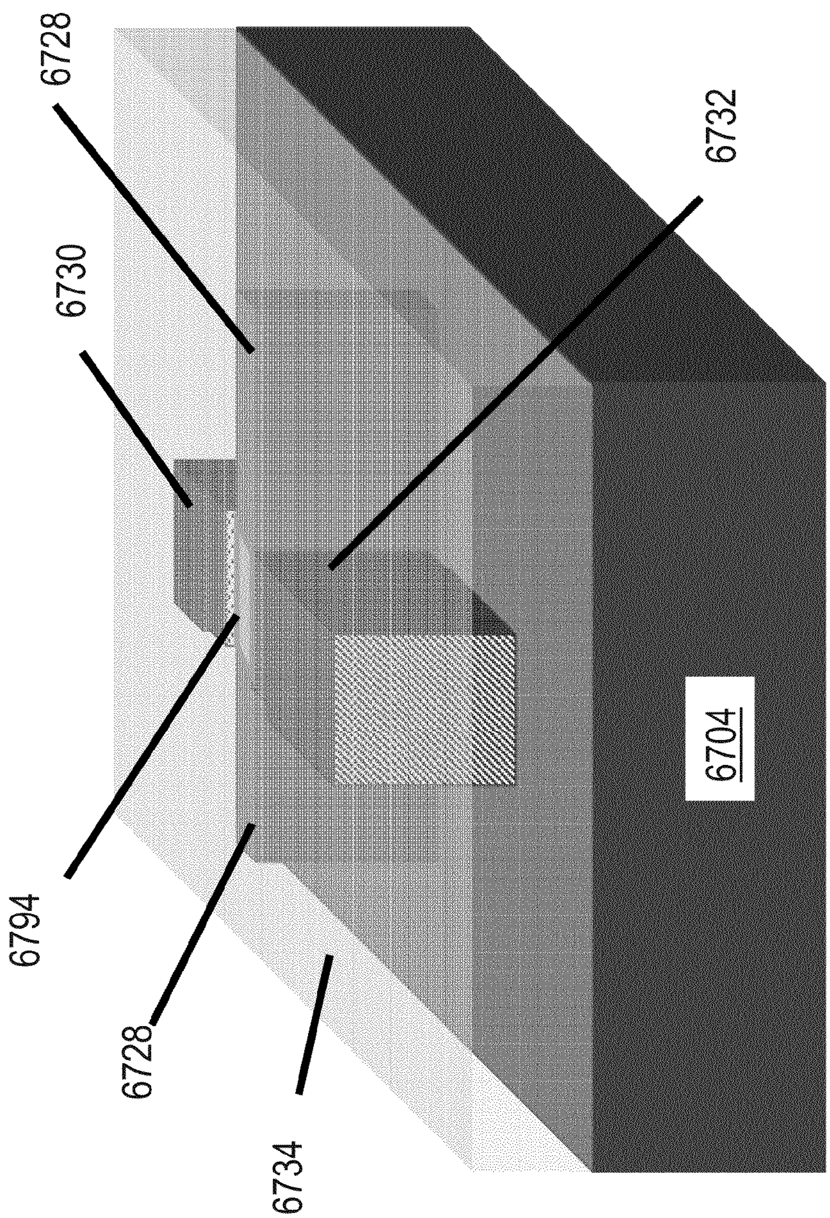
FIG. 67 illustrates a technique to construct flash memory with shared lithography steps.

FIG. 67 shows an embodiment of this invention, where charge-trap flash memory devices may be constructed with shared lithography steps. Procedures similar to those described in FIG. 61A-K may be used such that lithography steps for constructing the device in FIG. 67 are shared among multiple wafers. In FIG. 67, 6704 represents a silicon substrate and may include peripheral circuits for controlling memory elements. 6730 represents a gate electrode, 6732 is a charge trap layer (eg. an oxide-nitride-oxide layer), 6794 is the channel region of the flash memory device (eg. a p− Si region) and 6728 represents a source or drain region of the flash memory device. 6734 is an oxide region. For constructing a commercial flash memory chip, multiple flash memory devices could be arranged together in a NAND flash configuration or a NOR flash configuration. It will be obvious to one skilled in the art that various process flows and device structures can be used for the flash memory and combined with the inventive concept of sharing lithography steps among multiple wafers.

Section 14: Construction of Sub-400° C. Transistors Using Sub-400° C. Activation Anneals As described in FIG. 1, activating dopants in standard CMOS transistors shown in FIG. 1 at less than about 400° C.-450° C. may be a serious challenge. Due to this, forming 3D stacked circuits and chips may be challenging, unless techniques to activate dopants of source-drain regions at less than about 400° C.-450° C. can be obtained. For some compound semiconductors, dopants can be activated at less than about 400° C. An embodiment of this invention involves using such compound semiconductors, such as antimonides (eg. InGaSb), for constructing 3D integrated circuits and chips.

The process flow shown in FIG. 69A-F describes an embodiment of this invention, where techniques may be used that may lower activation temperature for dopants in silicon to less than about 450° C., and potentially even lower than about 400° C. The process flow could include the following steps that occur in sequence from Step (A) to Step (F). When the same reference numbers are used in different drawing figures (among FIG. 69A-F), they are used to indicate analogous, similar or identical structures to enhance the understanding of the present invention by clarifying the relationships between the structures and embodiments presented in the various diagrams—particularly in relating analogous, similar or identical functionality to different physical structures.

Figures 69A, 69B, 69C, 69D:
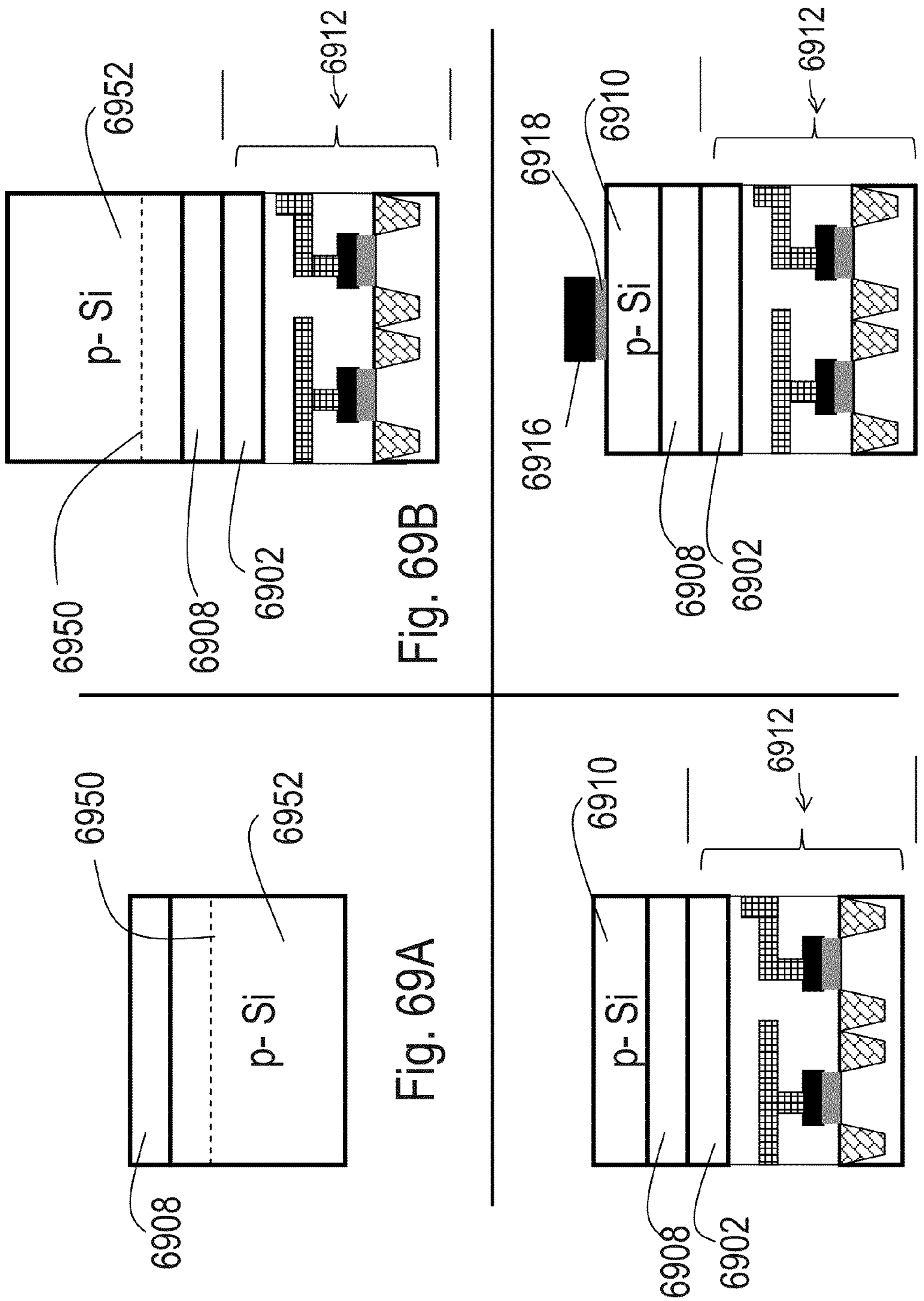
FIG. 69A-F illustrates a technique to construct sub-400° C. 3D stacked transistors by reducing temperatures needed for Source and drain anneals.

Step (A) is illustrated using FIG. 69A. A p− Silicon wafer 6952 with activated dopants may have an oxide layer 6908 deposited atop it. Hydrogen could be implanted into the wafer at a certain depth to form hydrogen plane 6950 indicated by a dotted line. Alternatively, helium could be used.

Step (B) is illustrated using FIG. 69B. A wafer with transistors and wires may have an oxide layer 6902 deposited atop it to form the structure 6912. The structure shown in FIG. 69A could be flipped and bonded to the structure 6912 using oxide-to-oxide bonding of layers 6902 and 6908.

Step (C) is illustrated using FIG. 69C. The structure shown in FIG. 69B could be cleaved at its hydrogen plane 6950 using a mechanical force, thus forming p− layer 6910. Alternatively, an anneal could be used. Following this, a CMP could be conducted to planarize the surface.

Step (D) is illustrated using FIG. 69D. Isolation regions (not shown) between transistors can be formed using a shallow trench isolation (STI) process. Following this, a gate dielectric 6918 and a gate electrode 6916 could be formed using deposition or growth, followed by a patterning and etch.

Figure 69E:
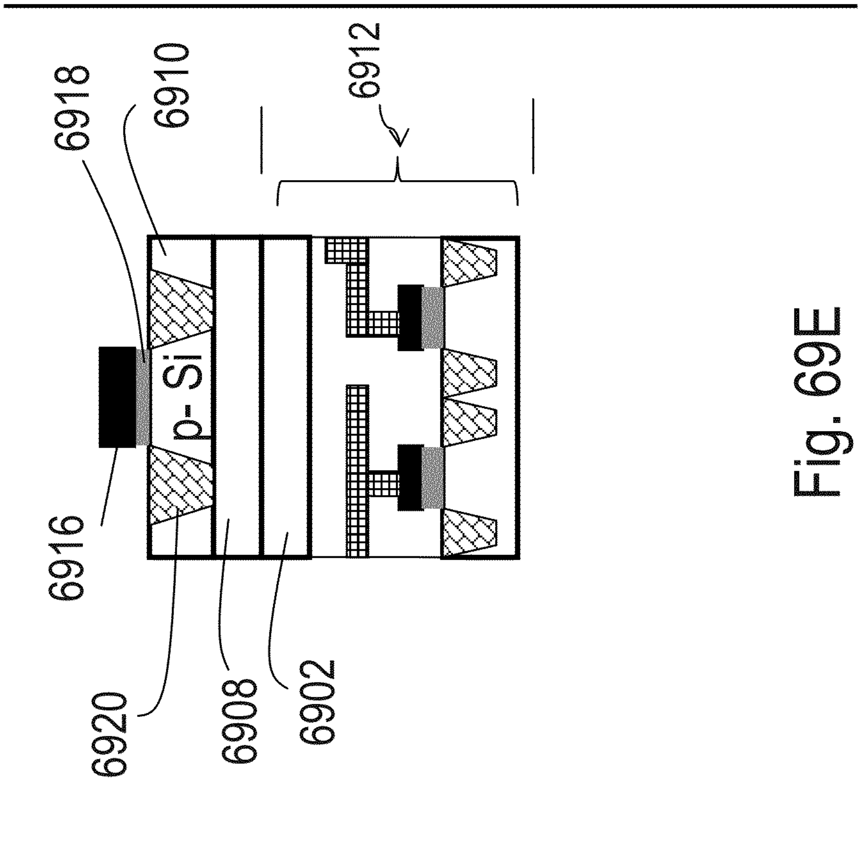

Step (E) is illustrated using FIG. 69E, and involves forming and activating source-drain regions. One or more of the following processes can be used for this step.

(i) A hydrogen plasma treatment can be conducted, following which dopants for source and drain regions 6920 can be implanted. Following the implantation, an activation anneal can be performed using a rapid thermal anneal (RTA). Alternatively, a laser anneal could be used. Alternatively, a spike anneal could be used. Alternatively, a furnace anneal could be used. Hydrogen plasma treatment before source-drain dopant implantation is known to reduce temperatures for source-drain activation to be less than about 450° C. or even less than about 400° C. Further details of this process for forming and activating source-drain regions are described in "Mechanism of Dopant Activation Enhancement in Shallow Junctions by Hydrogen", Proceedings of the Materials Research Society, Spring 2005 by A. Vengurlekar, S. Ashok, Christine E. Kalnas, Win Ye. This embodiment of the invention advantageously uses this low-temperature source-drain formation technique and layer transfer techniques and produces 3D integrated circuits and chips.

(ii) Alternatively, another process can be used for forming activated source-drain regions. Dopants for source and drain regions 6920 can be implanted, following which a hydrogen implantation can be conducted. Alternatively, some other atomic species can be used. An activation anneal can then be conducted using a RTA. Alternatively, a furnace anneal or spike anneal or laser anneal can be used. Hydrogen implantation is known to reduce temperatures required for the activation anneal. Further details of this process are described in U.S. Pat. No. 4,522,657. This embodiment of the invention advantageously uses this low-temperature source-drain formation technique and layer transfer techniques and produces 3D integrated circuits and chips.

While (i) and (ii) described two techniques of using hydrogen to lower anneal temperature requirements, various other methods of incorporating hydrogen to lower anneal temperatures could be used.

(iii) Alternatively, another process can be used for forming activated source-drain regions. The wafer could be heated up when implantation for source and drain regions 6920 is carried out. Due to this, the energetic implanted species is subjected to higher temperatures and can be activated at the same time as it is implanted. Further details of this process can be seen in U.S. Pat. No. 6,111,260. This embodiment of the invention advantageously uses this low-temperature source-drain formation technique and layer transfer techniques and produces 3D integrated circuits and chips.

(iv) Alternatively, another process could be used for forming activated source-drain regions. Dopant segregation techniques (DST) may be utilized to efficiently modulate the source and drain Schottky barrier height for both p and n type junctions. These DSTs may utilized form a dopant segregated Schottky (DSS-Schottky) transistor. Metal or metals, such as platinum and nickel, may be deposited, and a silicide, such as $Ni_{0.9}Pt_{0.1}Si$, may formed by thermal treatment or an optical treatment, such as a laser anneal, following which dopants for source and drain regions 6920 may be implanted, such as arsenic and boron, and the dopant pile-up is initiated by a low temperature post-silicidation activation step, such as a thermal treatment or an optical treatment, such as a laser anneal. An alternate DST is as follows: Metal or metals, such as platinum and nickel, may be deposited, following which dopants for source and drain regions 6920 may be implanted, such as arsenic and boron, followed by dopant segregation induced by the silicidation thermal budget wherein a silicide, such as $Ni_{0.9}Pt_{0.1}Si$, may formed by thermal treatment or an optical treatment, such as a laser anneal. Alternatively, dopants for source and drain regions 6920 may be implanted, such as arsenic and boron, following which metal or metals, such as platinum and nickel, may be deposited, and a silicide, such as $Ni_{0.9}Pt_{0.1}Si$, may formed by thermal treatment or an optical treatment, such as a laser anneal. Further details of these processes for forming dopant segregated source-drain regions are described in "Low Temperature Implementation of Dopant-Segregated Band-edger Metallic S/D junctions in Thin-Body SOI p-MOSFETs", Proceedings IEDM, 2007, pp 147-150, by G. Larrieu, et al.; "A Comparative Study of Two Different Schemes to Dopant Segregation at NiSi/Si and PtSi/Si Interfaces for Schottky Barrier Height Lowering", IEEE Transactions on Electron Devices, vol. 55, no. 1, January 2008, pp. 396-403, by Z. Qiu, et al.; and "High-k/Metal-Gate Fully Depleted SOI CMOS With Single-Silicide Schottky Source/Drain With Sub-30-nm Gate Length", IEEE Electron Device Letters, vol. 31, no. 4, April 2010, pp. 275-277, by M. H. Khater, et al.

This embodiment of the invention advantageously uses this low-temperature source-drain formation technique and layer transfer techniques and produces 3D integrated circuits and chips.

Figure 69F:
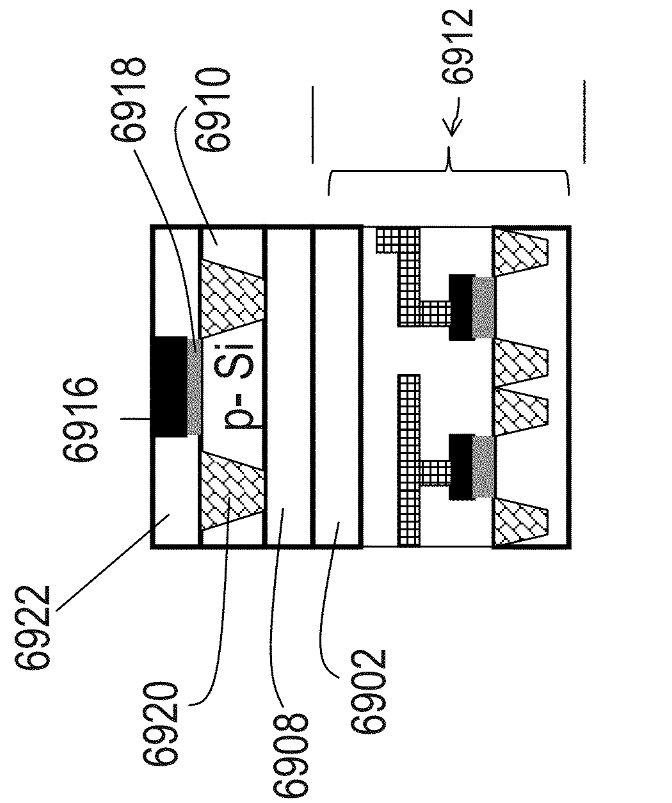

Step (F) is illustrated using FIG. 69F. An oxide layer 6922 may be deposited and polished with CMP. Following this, contacts, multiple levels of metal and other structures can be formed to obtain a 3D integrated circuit or chip. If desired, the original materials for the gate electrode 6916 and gate dielectric 6918 can be removed and replaced with a deposited gate dielectric and deposited gate electrode using a replacement gate process similar to the one described previously.

Persons of ordinary skill in the art will appreciate that the low temperature source-drain formation techniques described in FIG. 69, such as dopant segregation and DSS-Schottky transistors, may also be utilized to form other 3D structures in this document, including, but not limited to, floating body DRAM, such as described in FIGS. 29,30,31, 71, and junction-less transistors, such as described in FIGS. 5,6,7,8,9,60, and RCATs, such as described in FIGS. 10, 12, 13, and CMOS MOSFETS, such as described in FIGS. 25, 47, 49, and resistive memory, such as described in FIGS. 32, 33, 34, 35, and charge trap memory, such as described in FIGS. 36, 37, 38, and floating gate memory, such as described in FIGS. 39, 40, 70, and SRAM, such as described in FIG. 52, and Finfets, such as described in FIG. 61. Thus the invention is to be limited only by the appended claims.

Figures 72A, 72B, 72C:
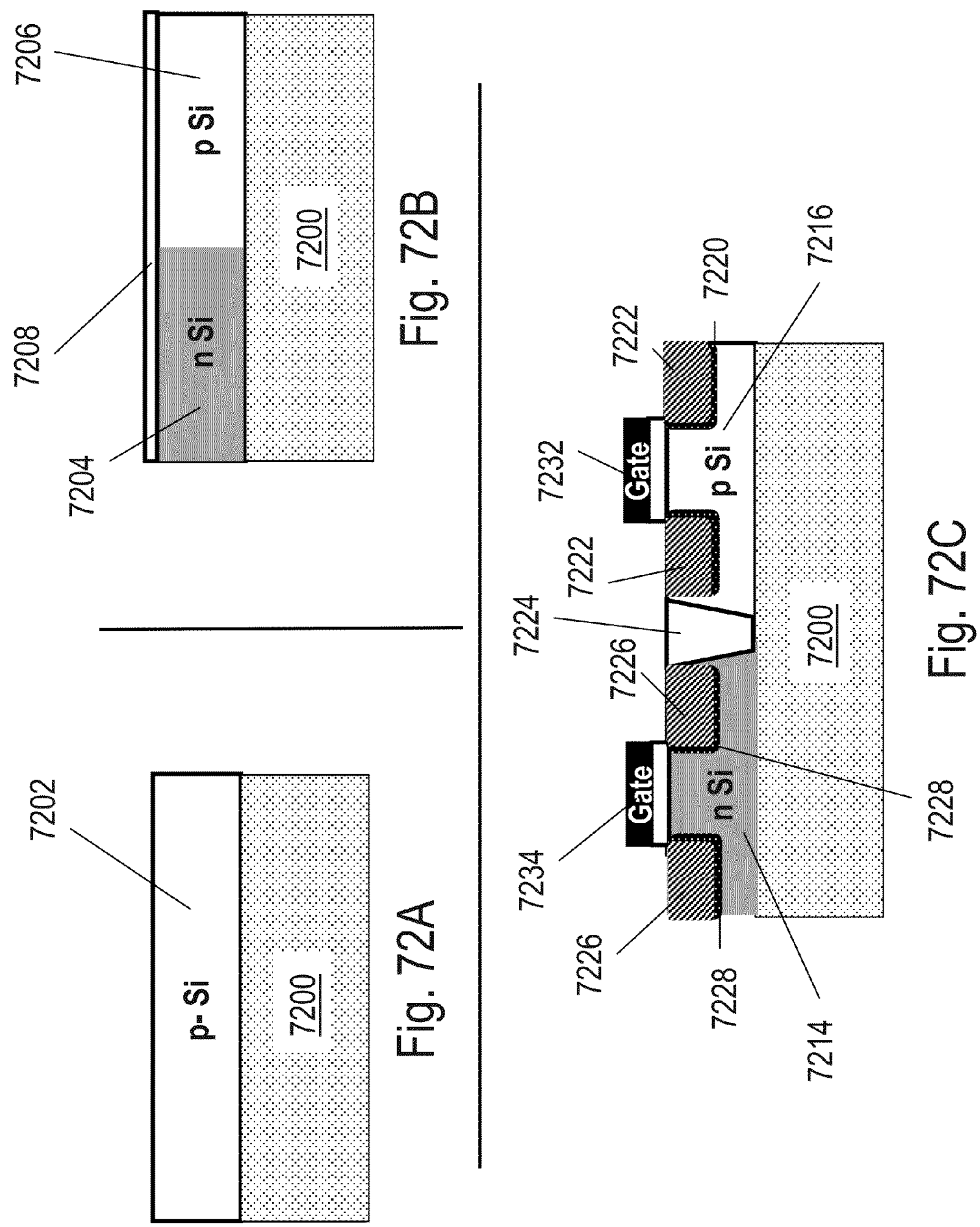
FIG. 72A-C illustrates a technique to construct dopant segregated transistors compatible with 3D stacking.

An alternate method to obtain low temperature 3D compatible CMOS transistors residing in the same device layer of silicon is illustrated in FIG. 72A-C. As illustrated in FIG. 72A, a layer of p− mono-crystalline silicon 7202 may be transferred onto a bottom layer of transistors and wires 7200 utilizing previously described layer transfer techniques. A doped and activated layer may be formed in or on the silicon wafer to create p− mono-crystalline silicon layer 7202 by processes such as, for example, implant and RTA or furnace activation, or epitaxial deposition and activation. As illustrated in FIG. 72C, n-type well regions 7204 and p-type well regions 7206 may be formed by conventional lithographic and ion implantation techniques. An oxide layer 7208 may be grown or deposited prior to or after the lithographic and ion implantation steps. The dopants may be activated with a short wavelength optical anneal, such as a 550 nm laser anneal system manufactured by Applied Materials, that will not heat up the bottom layer of transistors and wires 7200 beyond approximately 400° C., the temperature at which damage to the barrier metals containing the copper wiring of bottom layer of transistors and wires 7200 may occur. At this step in the process flow, there is very little structure pattern in the top layer of silicon, which allows the effective use of the shorter wavelength optical annealing systems, which are prone to pattern sensitivity issues thereby creating uneven heating. As illustrated in FIG. 72C, shallow trench regions 7224 may be formed, and conventional CMOS transistor formation methods with dopant segregation techniques, including those previously described, may be utilized to construct CMOS transistors, including n-silicon regions 7214, P+ silicon regions 7228, silicide regions 7226, PMOS gate stacks 7234, p-silicon regions 7216, N+ silicon regions 7220, silicide regions 7222, and NMOS gate stacks 7232.

Persons of ordinary skill in the art will appreciate that the low temperature 3D compatible CMOS transistor formation method and techniques described in FIG. 72 may also utilize tungsten wiring for the bottom layer of transistors and wires 7200 thereby increasing the temperature tolerance of the optical annealing utilized in FIG. 72B or 72C. Moreover, absorber layers, such as amorphous carbon, reflective layers, such as aluminum, or Brewster angle adjustments to the optical annealing may be utilized to optimize the implant activation and minimize the heating of lower device layers. Further, shallow trench regions 7224 may be formed prior to the optical annealing or ion-implantation steps. Furthermore, channel implants may be performed prior to the optical annealing so that transistor characteristics may be more tightly controlled. Moreover, one or more of the transistor channels may be undoped by layer transferring an undoped layer of mono-crystalline silicon in place of the layer of p– mono-crystalline silicon 7202. Further, the source and drain implants may be performed prior to the optical anneals. Moreover, the methods utilized in FIG. 72 may be applied to create other types of transistors, such as junction-less transistors or recessed channel transistors. Further, the FIG. 72 methods may be applied in conjunction with the hydrogen plasma activation techniques previously described in this document. Thus the invention is to be limited only by the appended claims.

Persons of ordinary skill in the art will appreciate that when multiple layers of doped or undoped single crystal silicon and an insulator, such as, for example, silicon dioxide, are formed as described above (e.g. additional $Si/SiO_2$ layers 3024 and 3026 and first $Si/SiO_2$ layer 3022), that there are many other circuit elements which may be formed, such as, for example, capacitors and inductors, by subsequent processing. Moreover, it will also be appreciated by persons of ordinary skill in the art that the thickness and doping of the single crystal silicon layer wherein the circuit elements, such as, for example, transistors, are formed, may provide a fully depleted device structure, a partially depleted device structure, or a substantially bulk device structure substrate for each layer of a 3D IC or the single layer of a 2D IC.

Figure 73:
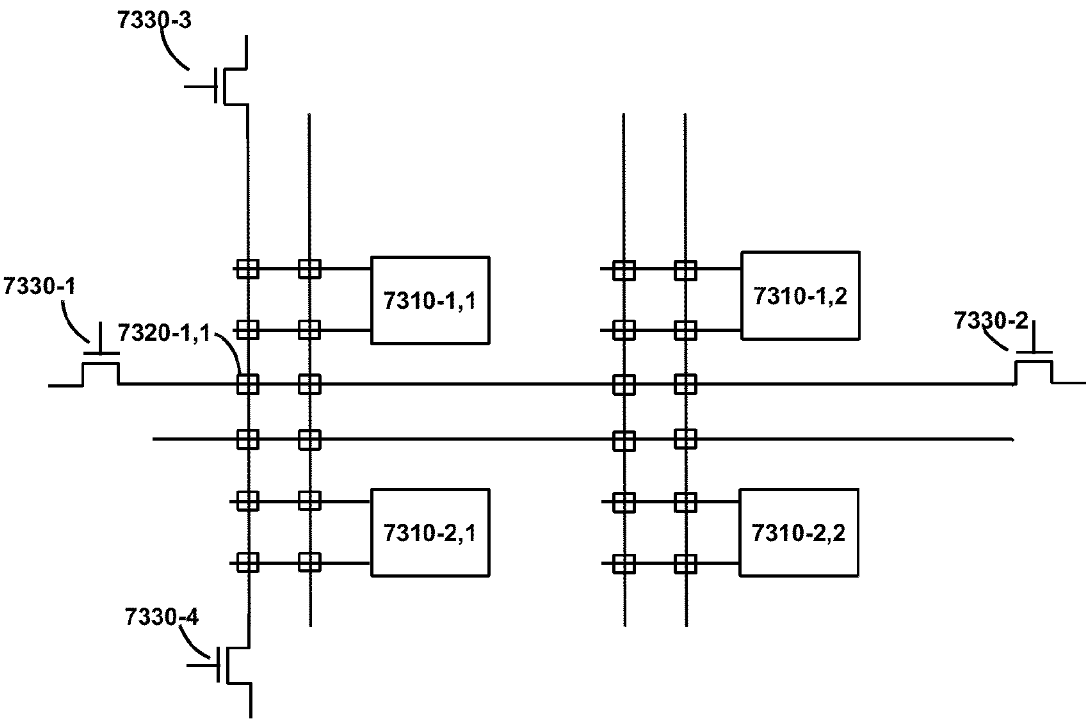
FIG. 73 illustrates a prior art antifuse programming circuit.

FIG. 73 illustrates a circuit diagram illustration of a prior art, where, for example, 7330-1 to 7330-4 are the programming transistors to program Antifuse ("AF") 7320-1,1.

FIG. 74 is a cross-section illustration of a portion of a prior art represented by the circuit diagram of FIG. 73 showing the programming transistor 7330-1 built as part of the silicon substrate.

Figure 75A:
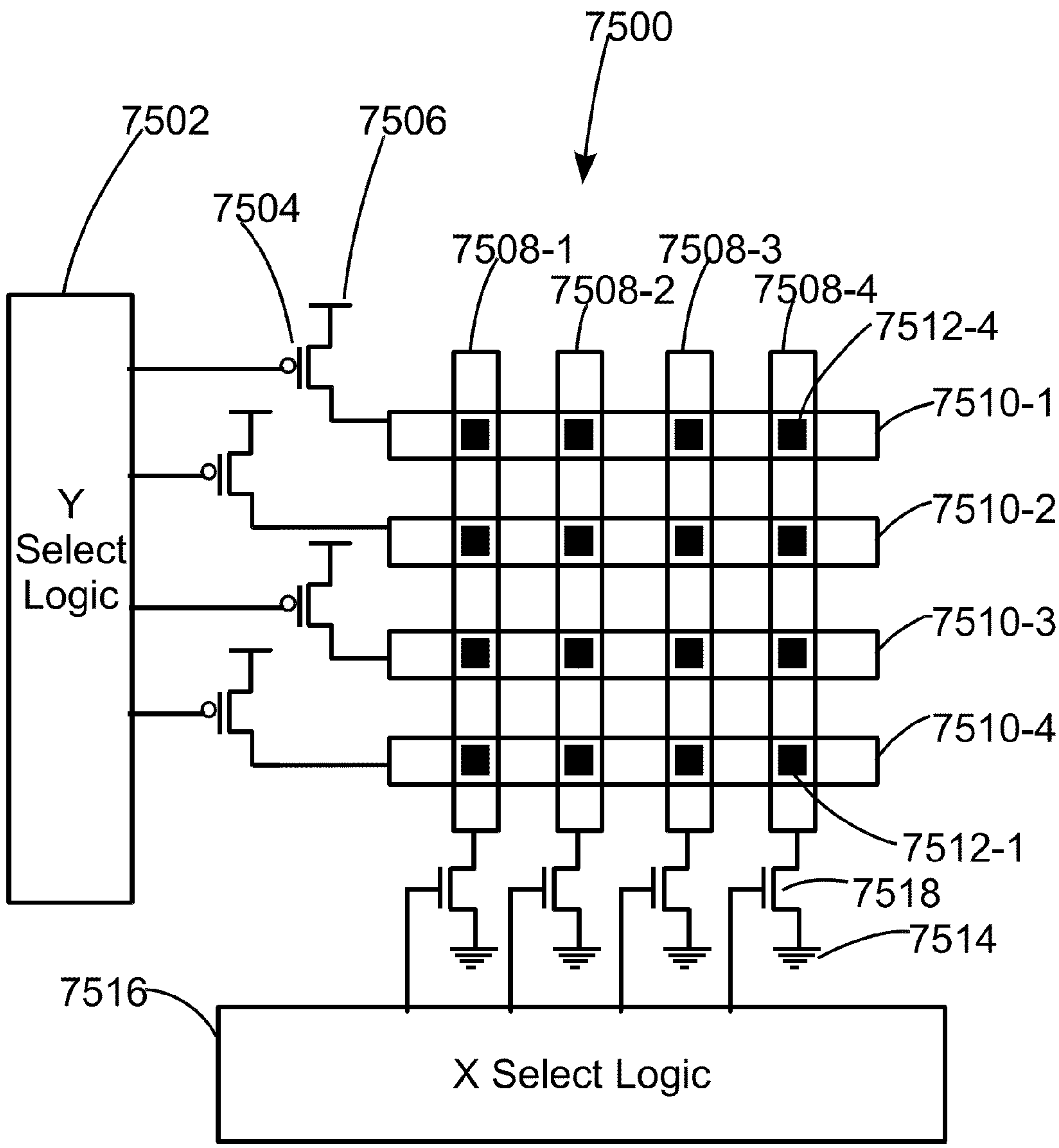
FIG. 75A illustrates a programmable interconnect tile using antifuses.

FIG. 75A is a drawing illustration of the principle of programmable (or configurable) interconnect tile 7500 using Antifuse. Two consecutive metal layers have orthogonal arrays of metal strips, 7510-1, 7510-2, 7510-3, 7510-4 and 7508-1, 7508-2, 7508-3, 7508-4. AFs are present in the dielectric isolation layer between two consecutive metal layers at crossover locations between the perpendicular traces, e.g., 7512-1, 7512-4. Normally the AF starts in its isolating state, and to program it so the two strips 7510-1 and 7508-4 will connect, one needs to apply a relatively high programming voltage 7506 to strip 7510-1 through programming transistor 7504, and ground 7514 to strip 7508-4 through programming transistor 7518. This is done by applying appropriate control pattern to Y decoder 7502 and X decoder 7516, respectively. A typical programmable connectivity array tile will have up to a few tens of metal strips to serve as connectivity for a Logic Block ("LB") described later.

Figure 75B:
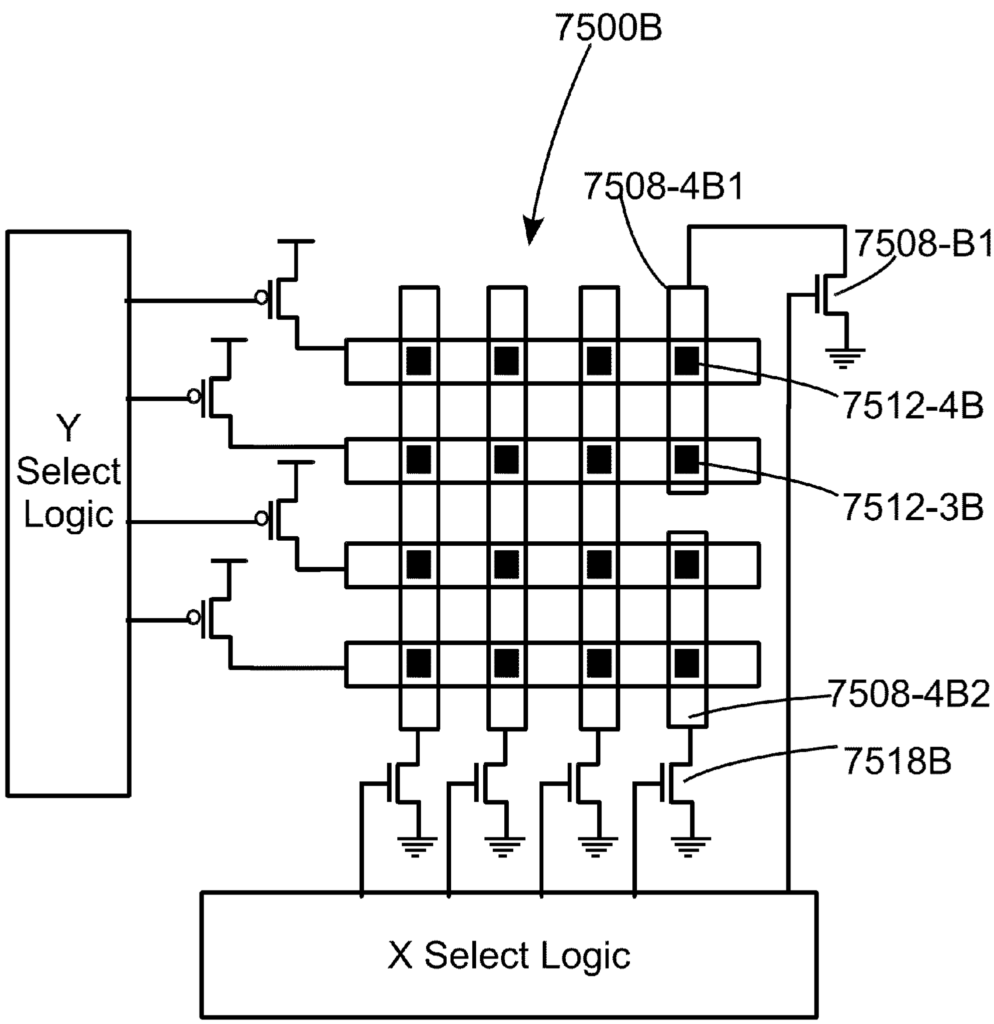
FIG. 75B illustrates a programmable interconnect tile with a segmented routing line.

One should recognize that the regular pattern of FIG. 75A often needs to be modified to accommodate specific needs of the architecture. FIG. 75B describes a routing tile 7500B where one of the full-length strips was partitioned into shorter sections 7508-4B1 and 7508-4B2. This allows, for example, for two distinct electrical signals to use a space assigned to a single track and is often used when LB input and output ("I/O") signals need to connect to the routing fabric. Since Logic Block may have 10-20 (or even more) I/O pins, using a full-length strip wastes a significant number of available tracks. Instead, splitting of strips into multiple section is often used to allow I/O signals to connect to the programmable interconnect using at most two, rather than four, AFs 7512-3B, 7512-4B, and hence trading access to routing tracks with fabric size. Additional penalty is that multiple programming transistors, 7518-B and 7518-B1 in this case instead of just 7518-B, and additional decoder outputs, are needed to accommodate the multiplicity of fractional strips. Another use for fractional strips may be to connect to tracks from another routing hierarchy, e.g., longer tracks, or for bringing other special signals such as local clocks, local resets, etc., into the routing fabric.

Unlike prior art for designing Field Programmable Gate Array ("FPGA"), the current invention suggests constructing the programming transistors and much or all of the programming circuitry at a level above the one where the functional diffusion level circuitry of the FPGA resides, hereafter referred to as an "Attic.". This provides an advantage in that the technology used for the functional FPGA circuitry has very different characteristics from the circuitry used to program the FPGA. Specifically, the functional circuitry typically needs to be done in an aggressive low-voltage technology to achieve speed, power, and density goals of large scale designs. In contrast, the programming circuitry needs high voltages, does not need to be particularly fast because it operates only in preparation of the actual in-circuit functional operation, and does not need to be particularly dense as it needs only on the order of 2N transistors for N*N programmable AFs. Placing the programming circuitry on a different level from the functional circuitry allows for a better design tradeoff than placing them next to each other. A typical example of the cost of placing both types of circuitry next to each other is the large isolation space between each region because of their different operating voltage. This is avoided in the case of placing programming circuitry not in the base (i.e., functional) silicon but rather in the Attic above the functional circuitry.

It is important to note that because the programming circuitry imposes few design constraints except for high voltage, a variety of technologies such as Thin Film Transistors ("TFT"), Vacuum FET, bipolar transistors, and others, can readily provide such programming function in the Attic.

A possible fabrication method for constructing the programming circuitry in an Attic above the functional circuitry on the base silicon is by bonding a programming circuitry wafer on top of functional circuitry wafer using Through Silicon Vias. Other possibilities include layer transfer using ion implantation (typically but not exclusively hydrogen), spraying and subsequent doping of amorphous silicon, carbon nano-structures, and similar. The key that enables the use of such techniques, that often produce less efficient semiconductor devices in the Attic, is the absence of need for high performance and fast switching from programming transistors. The only major requirement is the ability to withstand relatively high voltages, as compared with the functional circuitry.

Another advantage of AF-based FPGA with programming circuitry in an Attic is a simple path to low-cost volume production. One needs simply to remove the Attic and replace the AF layer with a relatively inexpensive custom via or metal mask.

Another advantage of programming circuitry being above the functional circuitry is the relatively low impact of the vertical connectivity on the density of the functional circuitry. By far, the overwhelming number of programming AFs resides in the programmable interconnect and not in the Logic Blocks. Consequently, the vertical connections from the programmable interconnections need to go upward towards the programming transistors in the Attic and do not need to cross downward towards the functional circuitry diffusion area, where dense connectivity between the routing fabric and the LBs occurs, where it would incur routing congestion and density penalty.

Figure 76A:
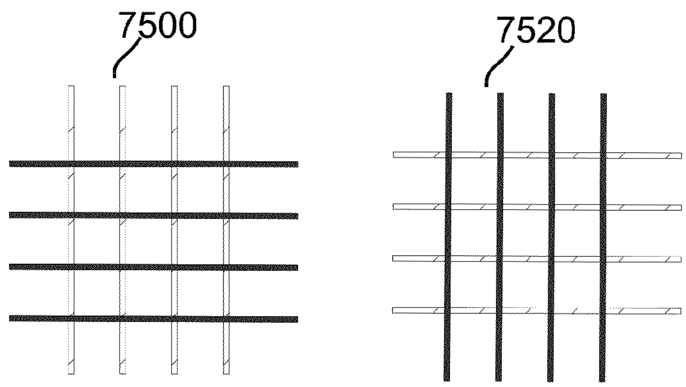
FIG. 76A illustrates two routing tiles.
Figure 76B:
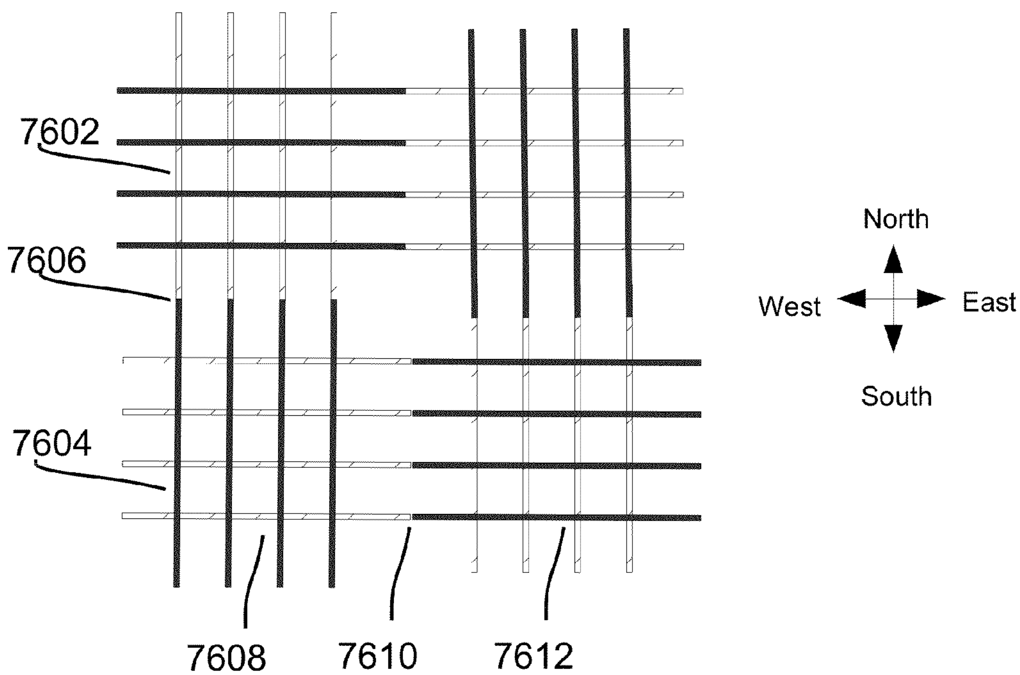
FIG. 76B illustrates an array of four routing tiles.

FIG. 76A is a drawing illustration of a routing tile 7500 similar to that in FIG. 75A, where the horizontal and vertical strips are on different but adjacent metal layers. Tile 7520 is similar to routing tile 7500 but rotated 90 degrees. When larger routing fabric is constructed from individual tiles, we need to control signal propagation between tiles. This can be achieved by stitching the routing fabric from same orientation tiles (as in either 7500 or 7520 with bridges such as 701A or 701VV, described later, optionally connecting adjacent strips) or from alternating orientation tiles, such as illustrated in FIG. 76B. In that case the horizontal and vertical tracks alternate between the two metals such as 7602 and 7604, or 7608 and 7612, with AF present at each overlapping edge such as 7606 and 7610. When a segment needs to be extended its edge AF 7606 (or 7610) is programmed to conduct, whereas by default each segment will span only to the edge of its corresponding tile. Change of signal direction, such as vertical to horizontal (or vice versa) is achieved by programming non-edge AF such as 7512-1 of FIG. 75A.

Logic Blocks are constructed to implement programmable logic functions. There are multiple ways of constructing LBs that can be programmed by AFs. Typically LBs will use low metal layers such as metal 1 and 2 to construct its basic functions, with higher metal layers reserved for the programmable routing fabric.

Figure 77A:
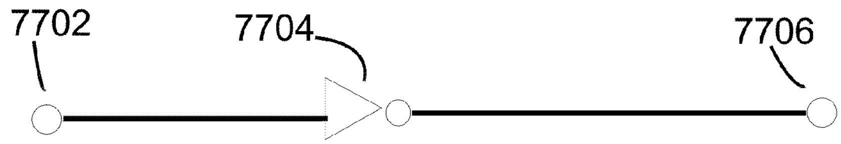
FIG. 77A illustrates an inverter.
Figure 77B:
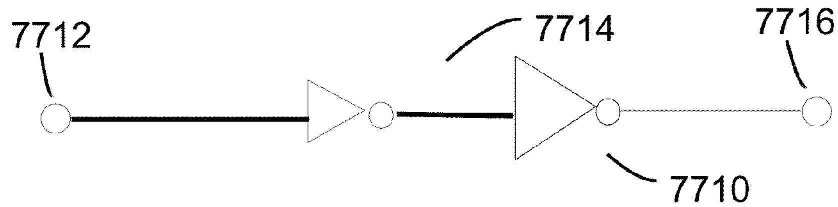
FIG. 77B illustrates a buffer.
Figure 77C:
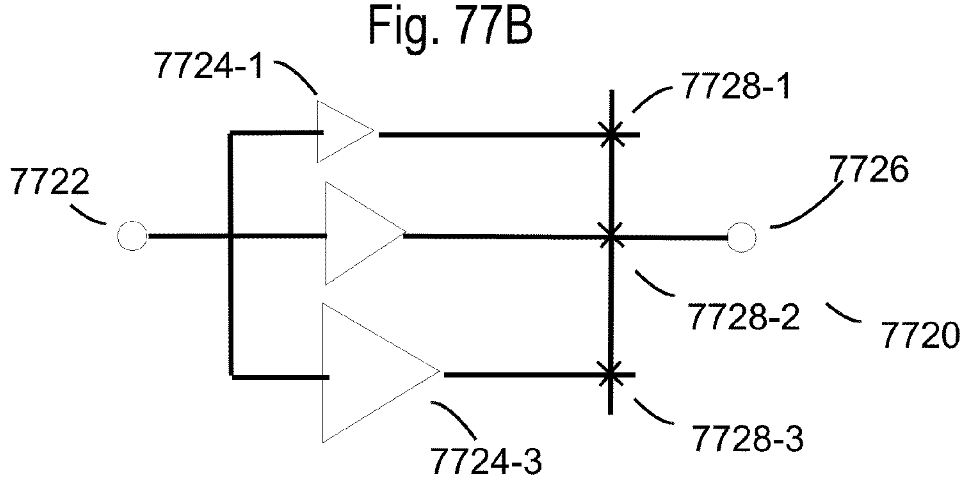
FIG. 77C illustrates a variable drive buffer.

Each logic block needs to be able to drive its outputs onto the programmable routing. FIG. 77A illustrates an inverter 7704 (with input 7702 and output 7706) that can perform this function with logical inversion. FIG. 77B describes two inverters configured as a non-inverting buffer 7714 (with input 7712 and output 7716) made of variable size inverters 7710. Such structures can be used to create a variable-drive buffer 7720 illustrated in FIG. 77C (with input 7722 and output 7726), where programming AFs 7728-1, 7728-2, and 7728-3 will be used to select the varying sized buffers such as 7724-1 or 7724-3 to drive their output with customized strength onto the routing structure. A similar (not illustrated) structure can be implemented for programmable strength inverters.

Figure 77D:
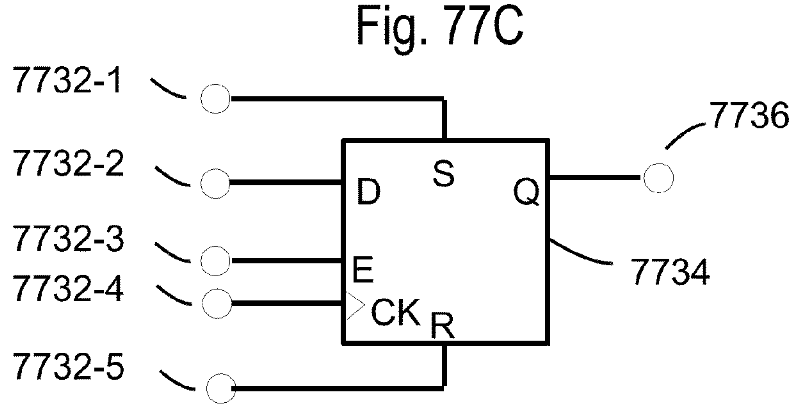
FIG. 77D illustrates a flip flop.

FIG. 77D is a drawing illustration of a flip flop ("FF") 7734 with its input 7732-2, output 7736, and typical control signals 7732-1, 7732-3, 7732-4 and 7732-5. AFs can be used to connect its inputs, outputs, and controls, to LB-internal signals, or to drive them to and from the programmable routing fabric.

Figure 78:
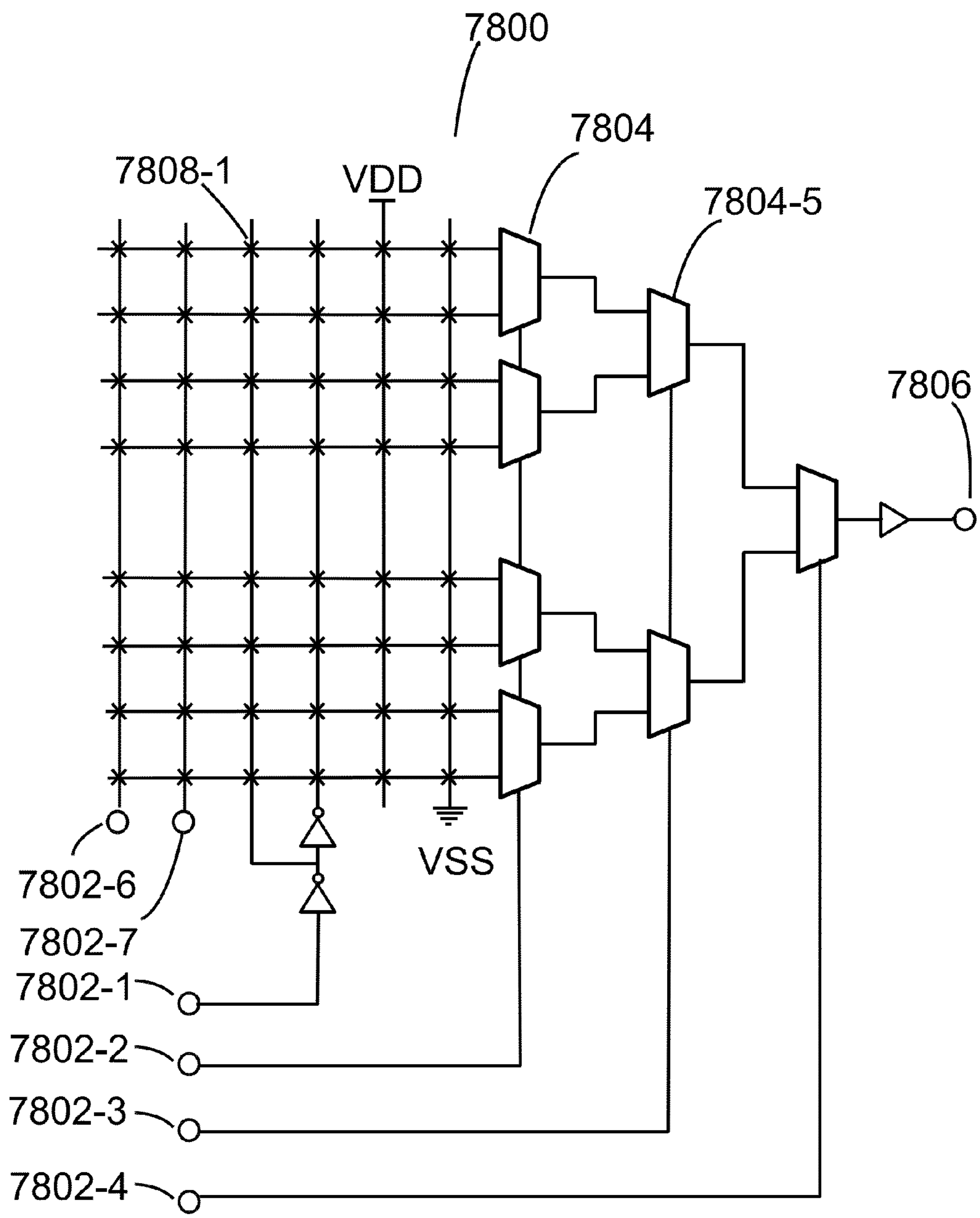
FIG. 78 illustrates a four input look up table logic module.

FIG. 78 is a drawing illustration of one possible implementation of a four input lookup table 7800 ("LUT4") that can implement any combinatorial function of 4 inputs. The basic structure is that of a 3-level 8:1 multiplexer tree 7804 made of 2:1 multiplexers 7804-5 with output 7806 controlled by 3 control lines 7802-2, 7802-3, 7802-4, where each of the 8 inputs to the multiplexer is defined by AFs 7808-1 and can be VSS, VDD, or the fourth input 7802-1 either directly or inverted. The programmable cell of FIG. 78 may comprise additional inputs 7802-6, 7802-7 with additional 8 AFs for each input to allow some functionality in addition to just LUT4. Such function could be a simple select of one of the extra input 7802-6 or 7802-7 or more complex logic comprising the extra inputs.

Figure 78A:
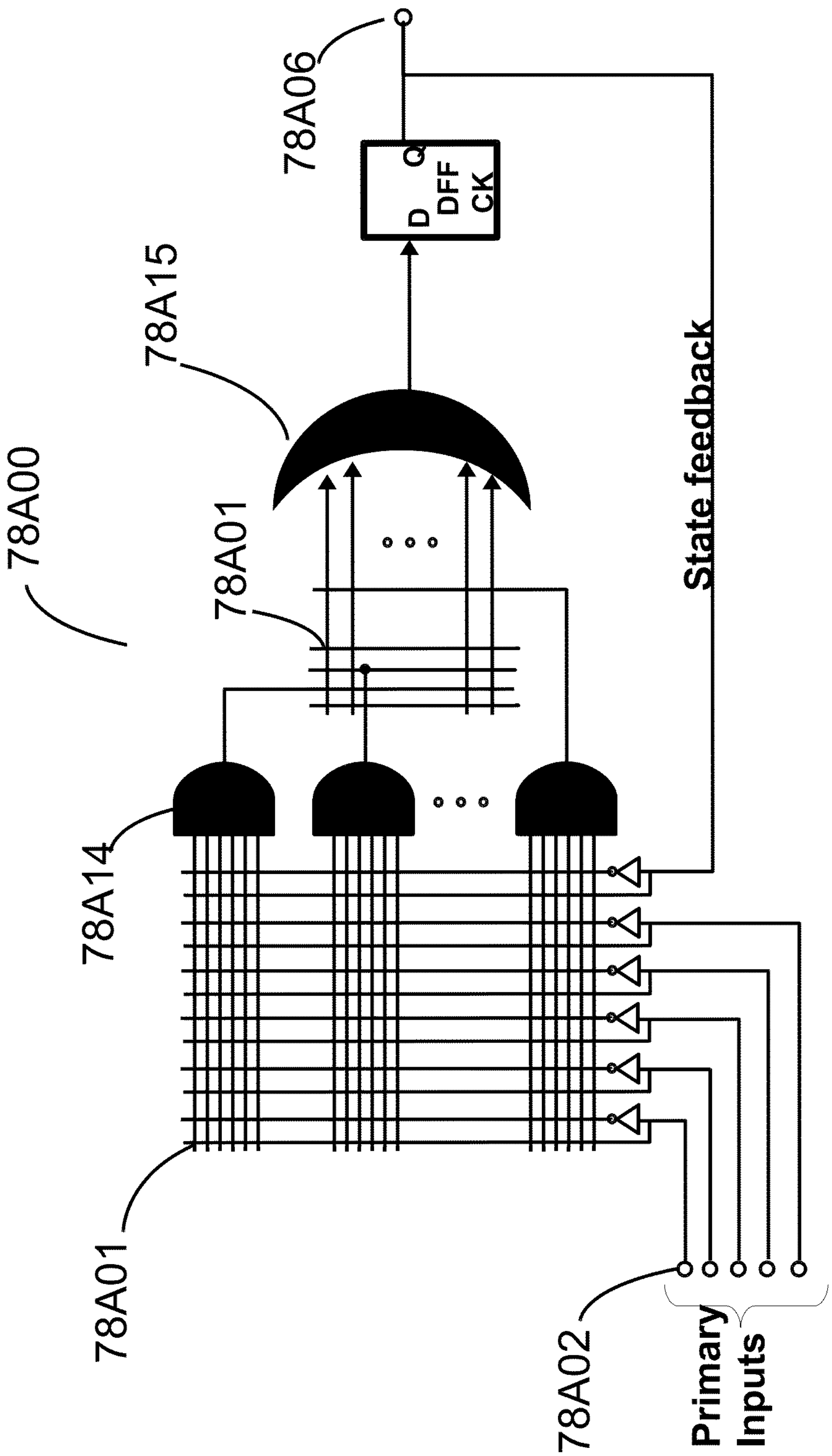
FIG. 78A illustrates a programmable logic array module.

FIG. 78A is a drawing illustration of another common universal programmable logic primitive, the Programmable Logic Array 78A00 ("PLA"). Similar structures are sometimes known as Programmable Logic Device ("PLD") or Programmable Array Logic ("PAL"). It comprises of a number of wide AND gates such as 78A14 that are fed by a matrix of true and inverted primary inputs 78A02 and a number of state variables. The actual combination of signals fed to each AND is determined by programming AFs such as 78A01. The output of some of the AND gates is selected—also by AF—through a wide OR gate 78A15 to drive a state FF with output 78A06 that is also available as an input to 78A14.

Antifuse-programmable logic elements such as described in FIGS. 77A-D, 78, and 7, are just representative of possible implementation of Logic Blocks of an FPGA. There are many possible variations of tying such element together, and connecting their I/O to the programmable routing fabric. The whole chip area can be tiled with such logic blocks logically embedded within programmable fabric 700 as illustrated in FIG. 7. Alternately, a heterogeneous tiling of the chip area is possible with LBs being just one possible element that is used for tiling, other elements being selected from memory blocks, Digital Signal Processing ("DSP") blocks, arithmetic elements, and many others.

Figure 79:
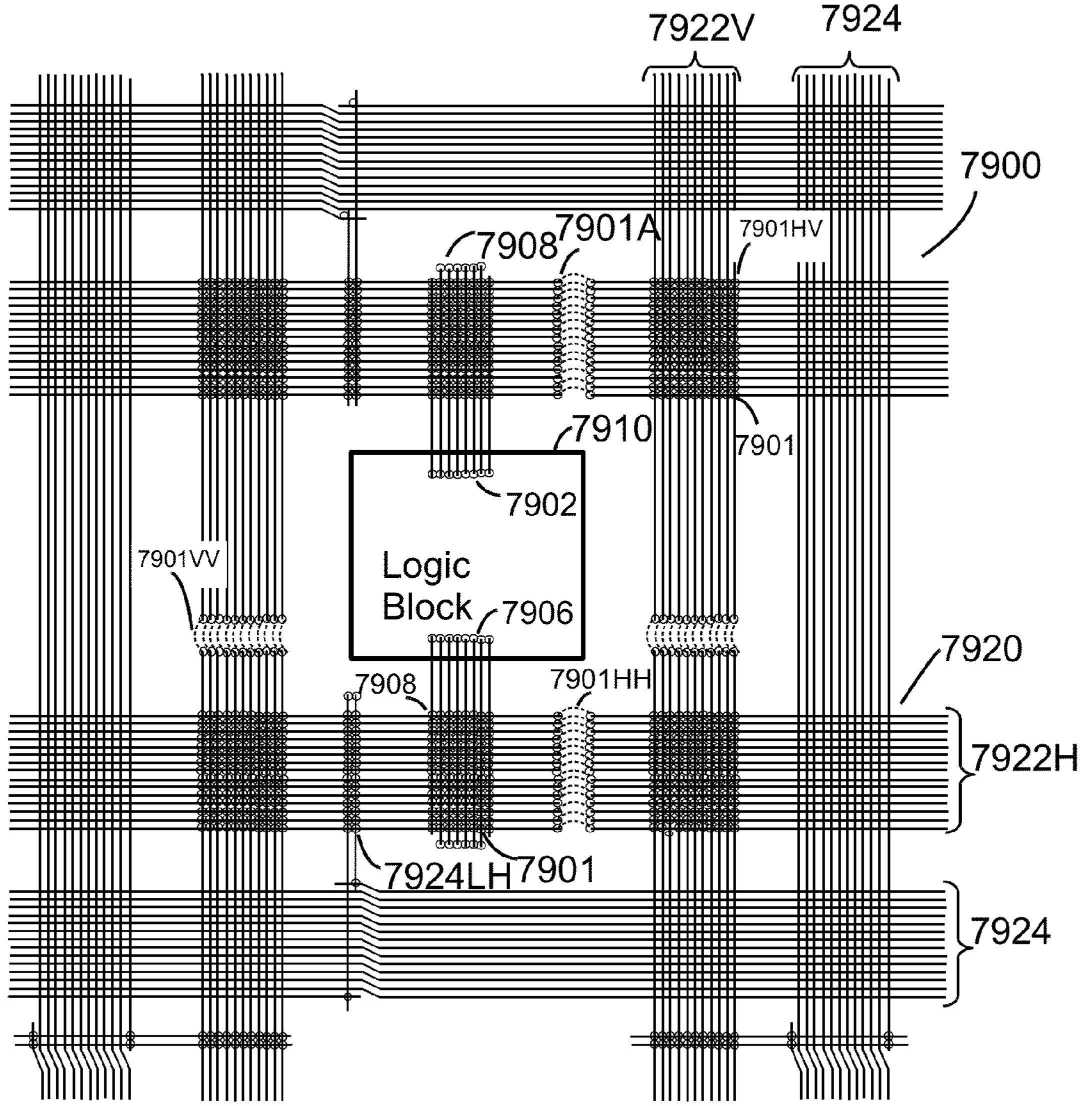
FIG. 79 illustrates an antifuse-based FPGA tile.

FIG. 79 is a drawing illustration of an example Antifuse-based FPGA tiling 7900 as mentioned above. It comprises of LB 7910 embedded in programmable routing fabric 7920. The LB can include any combination of the components described in FIGS. 77A-D and 78-78A, with its inputs and outputs 7902 and 7906. Each one of the inputs and outputs can be connected to short horizontal wires such as 7922H by an AF-based connection matrix 7908 made of individual AFs such as 7901. The short horizontal wires can span multiple tiles through activating AF-based programming bridges 7901HH and 7901A. These programming bridges are constructed either from short strips on adjacent metal layer in the same direction as the main wire and with an AF at each end of the short strip, or through rotating adjacent tiles by 90 degree as illustrated in FIG. 76B and using single AF for bridging. Similarly, short vertical wires 7922V can span multiple tiles through activating AF-based programming bridges 7901 VV. Change of signal direction from horizontal to vertical and vice versa can be achieved through activating AFs 7901 in connection matrices like 7901HV. In addition to short wires the tile also includes horizontal and vertical long wires 7924. These wires span multiple cells and only a fraction of them is accessible to the short wires in a given tile through AF-based connection 7924LH.

The depiction of the AF-based programmable tile above is just one example, and other variations are possible. For example, nothing limits the LB from being rotated 90 degrees with its inputs and outputs connecting to short vertical wires instead of short horizontal wires, or providing access to multiple long wires 7924 in every tile.

Figure 80:
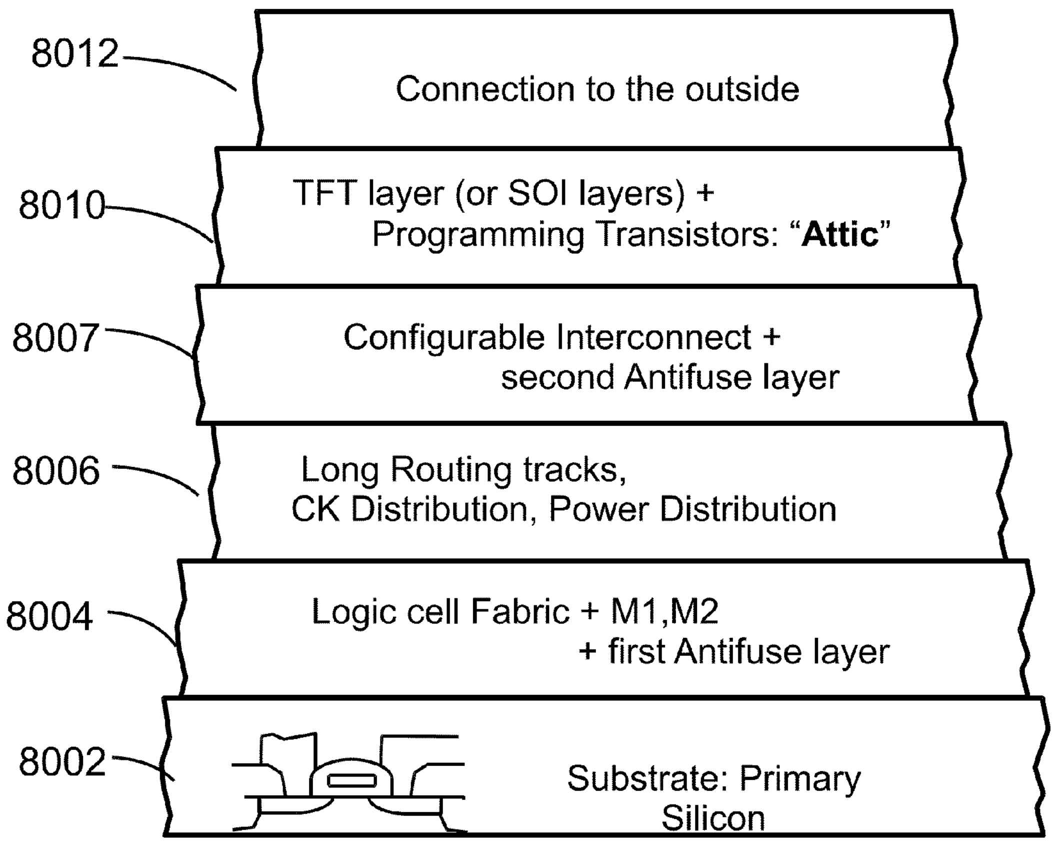
FIG. 80 illustrates a first 3D IC according to the invention.

FIG. 80 is a drawing illustration of alternative implementation of the current invention, with AFs present in two dielectric layers. Here the functional transistors of the Logic Blocks are defined in the base substrate 8002, with low metal layers 8004 (M1 & M2 in this depiction, can be more as needed) providing connectivity for the definition of the LB. AFs are present in select locations between metal layers of low metal layers 8004 to assist in finalizing the function of the LB. AFs in low metal layers 8004 can also serve to configure clocks and other special signals (e.g., reset) present in layer 8006 for connection to the LB and other special functions that do not require high density programmable connectivity to the configurable interconnect fabric 8007. Additional AF use can be to power on used LBs and un-power the unused ones to save on power dissipation of the device.

On top of layer 8006 comes configurable interconnect fabric 8007 with a second Antifuse layer. This connectivity is done similarly to the way depicted in FIG. 79 typically occupying two or four metal layers. Programming of AFs in both layers is done with programming circuitry designed in an Attic TFT layer 8010, or other alternative over the oxide transistors, placed on top of configurable interconnect fabric 8007 similarly to what was described previously. Finally, additional metals layers 8012 are deposited on top of Attic TFT layer 8010 to complete the programming circuitry in Attic TFT layer 8010, as well as provide connections to the outside for the FPGA.

The advantage of this alternative implementation is that two layers of AFs provide increased programmability (and hence flexibility) for FPGA, with the lower AF layer close to the base substrate where LB configuration needs to be done, and the upper AF layer close to the metal layers comprising the configurable interconnect.

U.S. Pat. Nos. 5,374,564 and 6,528,391, describe the process of Layer Transfer whereby a few tens or hundreds nanometer thick layer of mono-crystalline silicon from "donor" wafer is transferred on top of a base wafer using oxide-oxide bonding and ion implantation. Such a process, for example, is routinely used in the industry to fabricate the so-called Silicon-on-Insulator ("SOI") wafers for high performance integrated circuits ("IC"s).

Figure 80A:
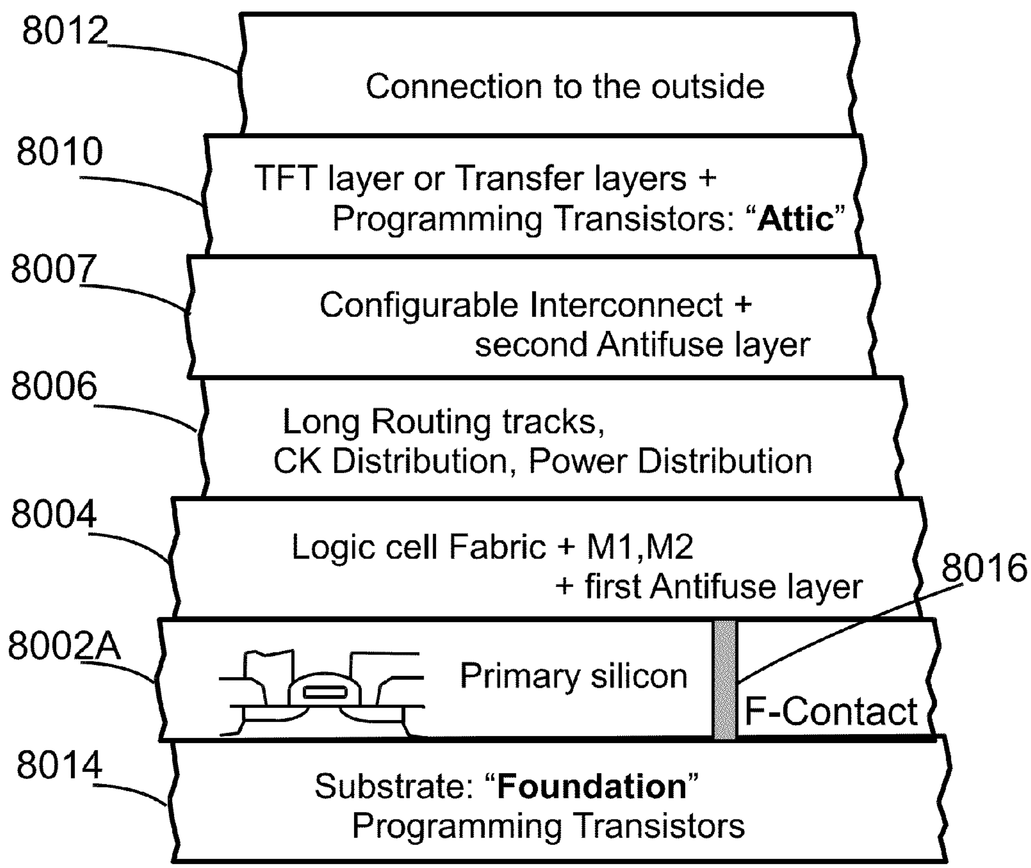
FIG. 80A illustrates a second 3D IC according to the invention.

Yet another alternative implementation of the current invention is illustrated in FIG. 80A. It builds on the structure of FIG. 80, except that what was base substrate 8002 in FIG. 80 is now a primary silicon layer 8002A placed on top of an insulator above base substrate 8014 using the abovementioned Layer Transfer process.

In contrast to the typical SOI process where the base substrate carries no circuitry, the current invention suggest to use base substrate 8014 to provide high voltage programming circuits that will program the lower level low metal layers 8004 of AFs. We will use the term "Foundation" to describe this layer of programming devices, in contrast to the "Attic" layer of programming devices placed on top that has been previously described.

The major obstacle to using circuitry in the Foundation is the high temperature potentially needed for Layer Transfer, and the high temperature needed for processing the primary silicon layer 8002A. High temperatures in excess of 400° C. that are often needed for implant activation or other processing can cause damage to pre-existing copper or aluminum metallization patterns that may have been previously fabricated in Foundation base substrate 8014. U.S. Patent Application Publication 2009/0224364 proposes using tungsten-based metallization to complete the wiring of the relatively simple circuitry in the Foundation. Tungsten has very high melting temperature and can withstand the high temperatures that may be needed for both for Layer Transfer and for processing of primary silicon layer 8002A. Because the Foundation provides mostly the programming circuitry for AFs in low metal layers 8004, its lithography can be less advanced and less expensive than that of the primary silicon layer 8002A and facilitates fabrication of high voltage devices needed to program AFs. Further, the thinness and hence the transparency of the SOI layer facilitates precise alignment of patterning of primary silicon layer 8002A to the underlying patterning of base substrate 8014.

Having two layers of AF-programming devices, Foundation on the bottom and Attic on the top, is an effective way to architect AF-based FPGAs with two layers of AFs. The first AF layer low metal layers 8004 is close to the primary silicon base substrate 8002 that it configures, and its connections 8016 to it and to the Foundation programming devices in base substrate 8014 may be directed downwards. The second layer of AFs in configurable interconnect fabric 8007 has its programming connections directed upward towards Attic TFT layer 8010. This way the AF connections to its programming circuitry minimize routing congestion across layers 8002, 8004, 8006, and 8007.

Figure 81A:
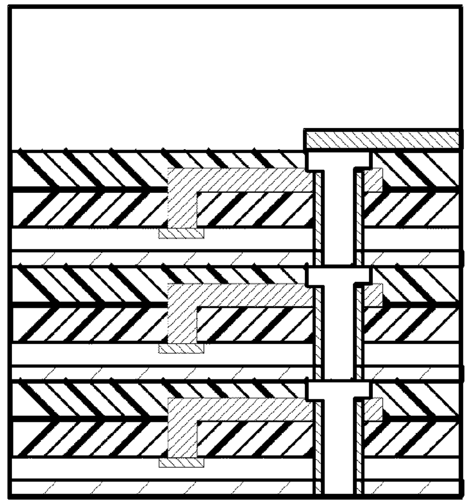
FIG. 81A illustrates a first prior art 3DIC.
Figure 81B:
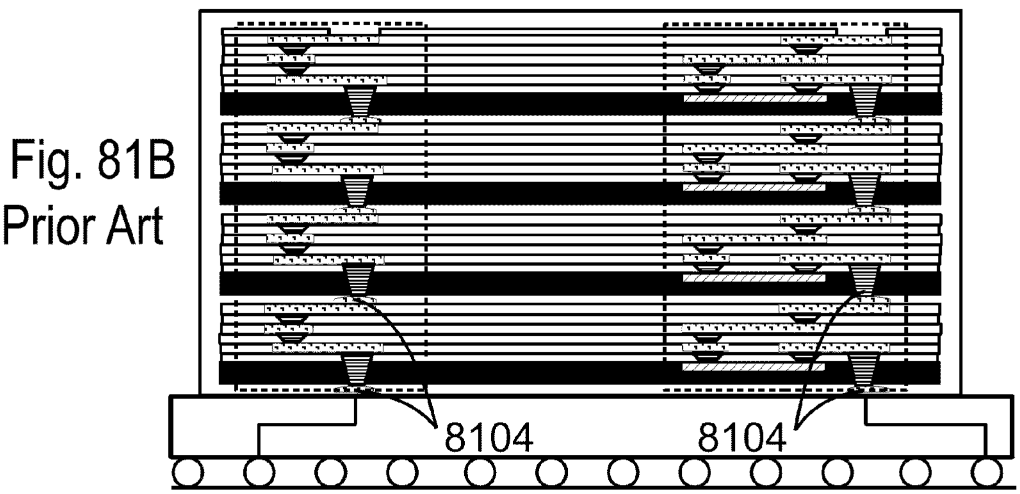
FIG. 81B illustrates a second prior art 3DIC.
Figure 81C:
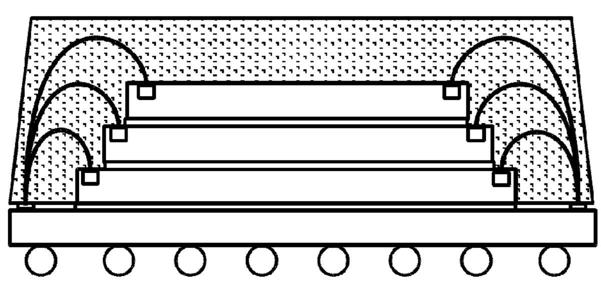
FIG. 81C illustrates a third prior art 3DIC.

FIGS. 81A through 81C illustrates prior art alternative configurations for three-dimensional ("3D") integration of multiple dies constructing IC system and utilizing Through Silicon Via. FIG. 81A illustrates an example in which the Through Silicon Via is continuing vertically through all the dies constructing a global cross-die connection. FIG. 81B provides an illustration of similar sized dies constructing a 3D system. 81B shows that the Through Silicon Via 8104 is at the same relative location in all the dies constructing a standard interface.

FIG. 81C illustrates a 3D system with dies having different sizes. FIG. 81C also illustrates the use of wire bonding from all three dies in connecting the IC system to the outside.

Figure 82A:
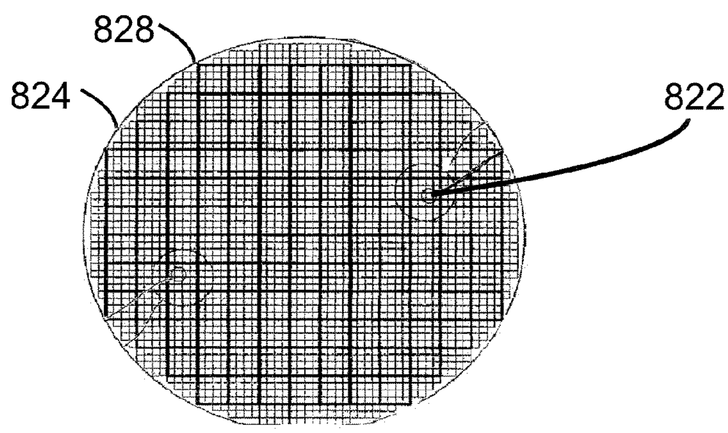
FIG. 82A illustrates a prior art continuous array wafer.
Figure 82B:
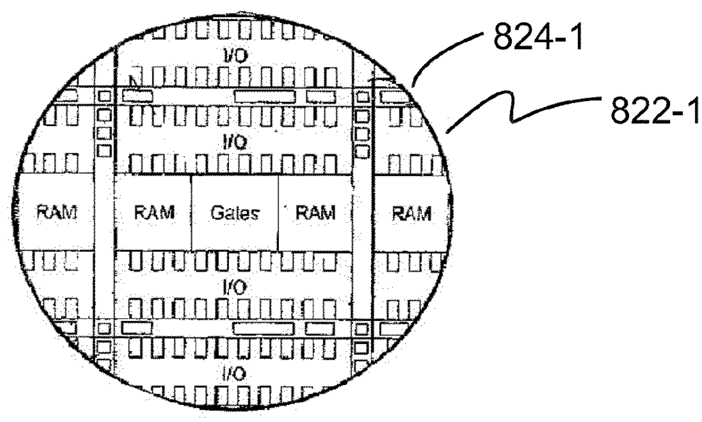
FIG. 82B illustrates a first prior art continuous array wafer tile.
Figure 82C:
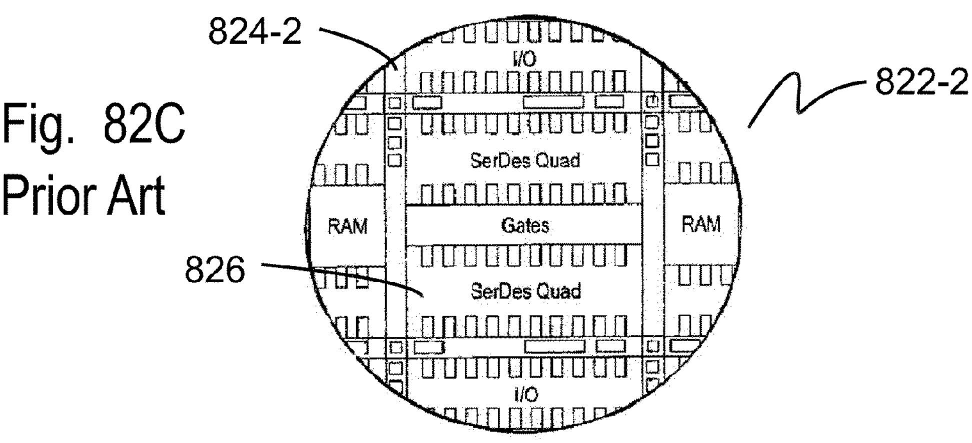
FIG. 82C illustrates a second prior art continuous array wafer tile.

FIG. 82A is a drawing illustration of a continuous array wafer of a prior art U.S. Pat. No. 7,337,425. The bubble 822 shows the repeating tile of the continuous array, 824 are the horizontal and vertical potential dicing lines (or dice lines). The tile 822 could be constructed as in FIG. 82B 822-1 with potential dicing line 824-1 or as in FIG. 82C with SerDes Quad 826 as part of the tile 822-2 and potential dicing lines 824-2.

In general, logic devices need varying amounts of logic, memory, and I/O. The continuous array ("CA") of U.S. Pat. No. 7,105,871 allows flexible definition of the logic device size, yet for any size the ratio between the three components remained fixed, barring minor boundary effect variations. Further, there exist other types of specialized logic that are difficult to implement effectively using standard logic such as DRAM, Flash memory, DSP blocks, processors, analog functions, or specialized I/O functions such as SerDes. The continuous array of prior art does not provide effective solution for these specialized yet not common enough functions that would justify their regular insertion into CA wafer.

Embodiments of the current invention enable a different and more flexible approach. Additionally the prior art proposal for continuous array were primarily oriented toward Gate Array and Structured ASIC where the customization includes some custom masks. In contrast, the current invention proposes an approach which could fit well FPGA type products including options without any custom masks. Instead of adding a broad variety of such blocks into the CA which would make it generally area-inefficient, and instead of using a range of CA types with different block mixes which would lead to a large number of expensive mask sets, the current invention allows using Through Silicon Via to enable a new type of configurable system.

The technology of "Package of integrated circuits and vertical integration" has been described in U.S. Pat. No. 6,322,903 issued to Oleg Siniaguine and Sergey Savastiouk on Nov. 27, 2001. Accordingly, embodiment of the current invention suggests the use of CA tiles, each made of one type, or of very few types, of elements. The target system is then constructed using desired number of tiles of desired type stacked on top of each other and connected with TSVs comprising 3D Configurable System.

Figure 83A:
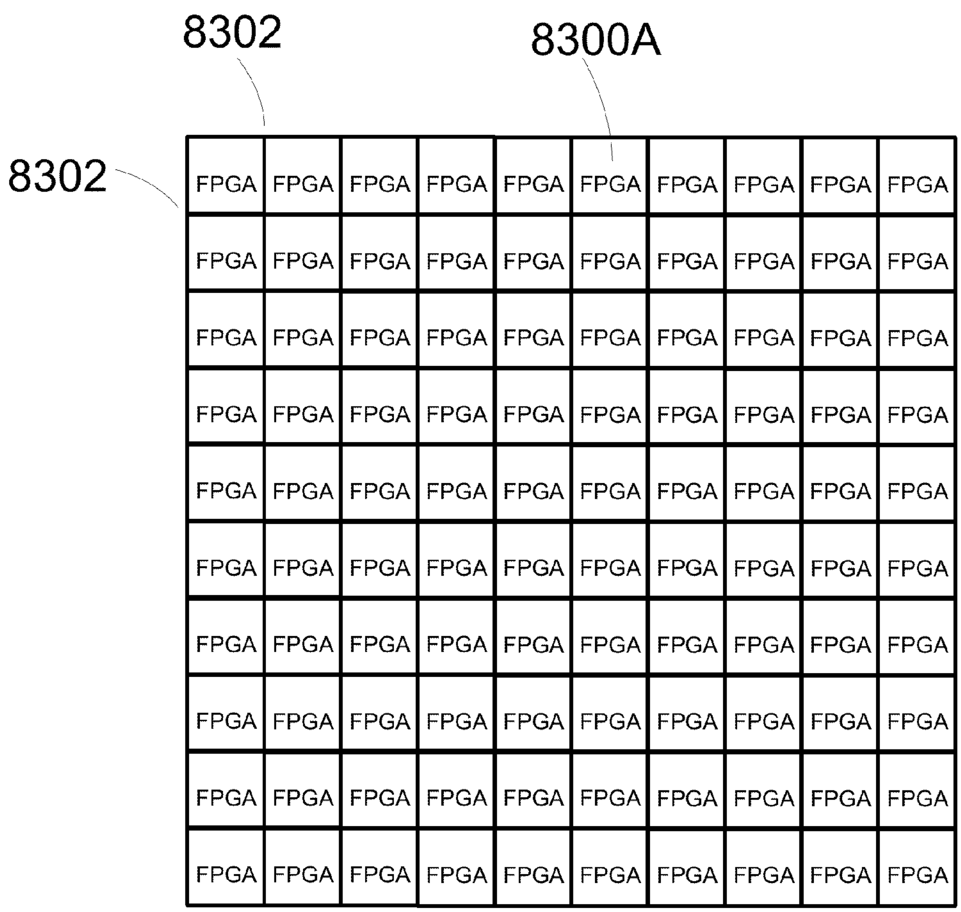
FIG. 83A illustrates a continuous array reticle of FPGA tiles according to the invention.
Figure 83B:
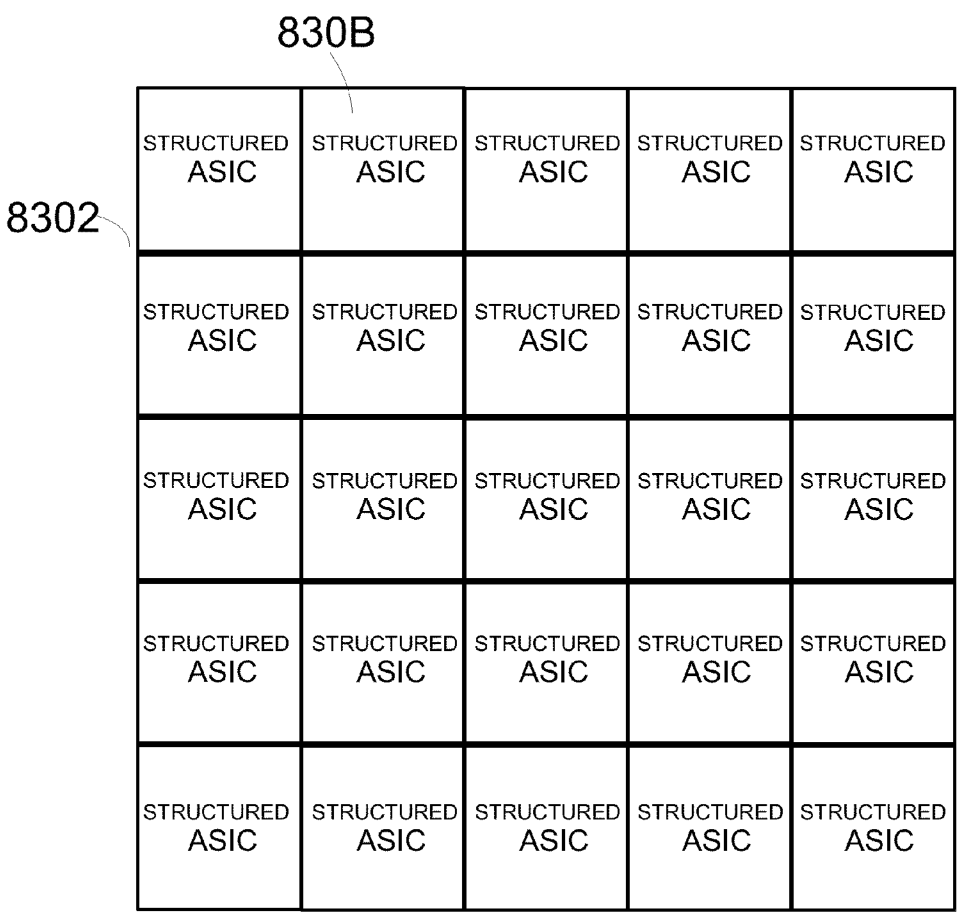
FIG. 83B illustrates a continuous array reticle of structured ASIC tiles according to the invention.
Figure 83C:
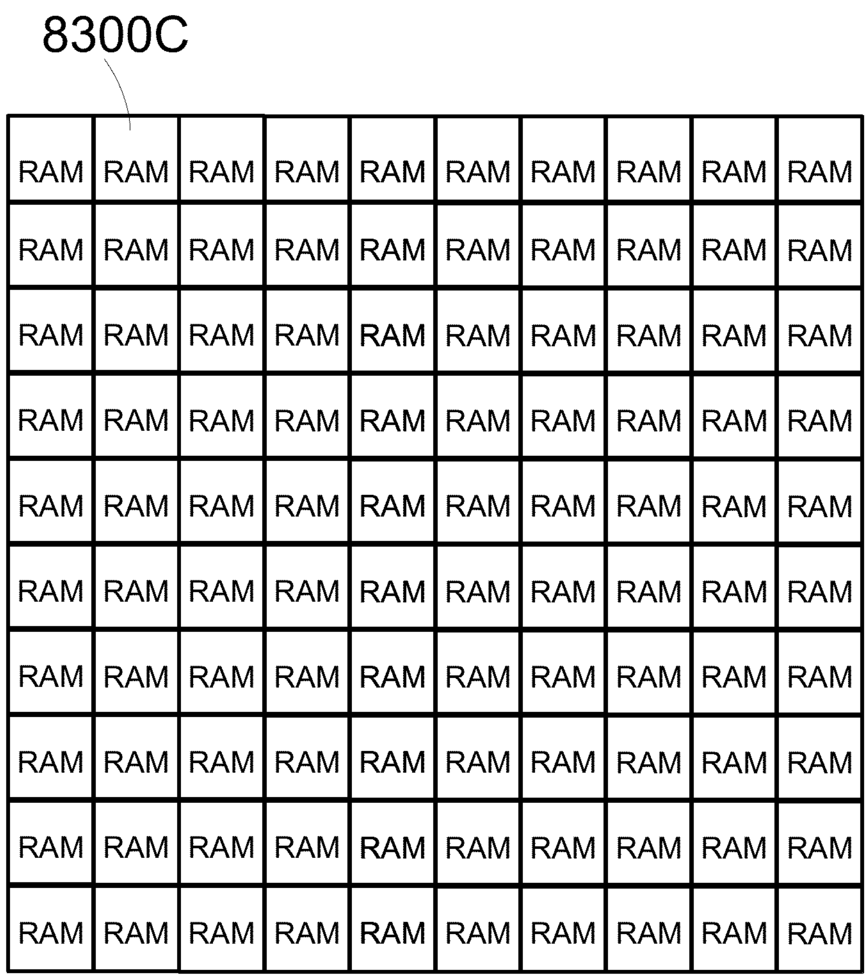
FIG. 83C illustrates a continuous array reticle of RAM tiles according to the invention.
Figure 83D:
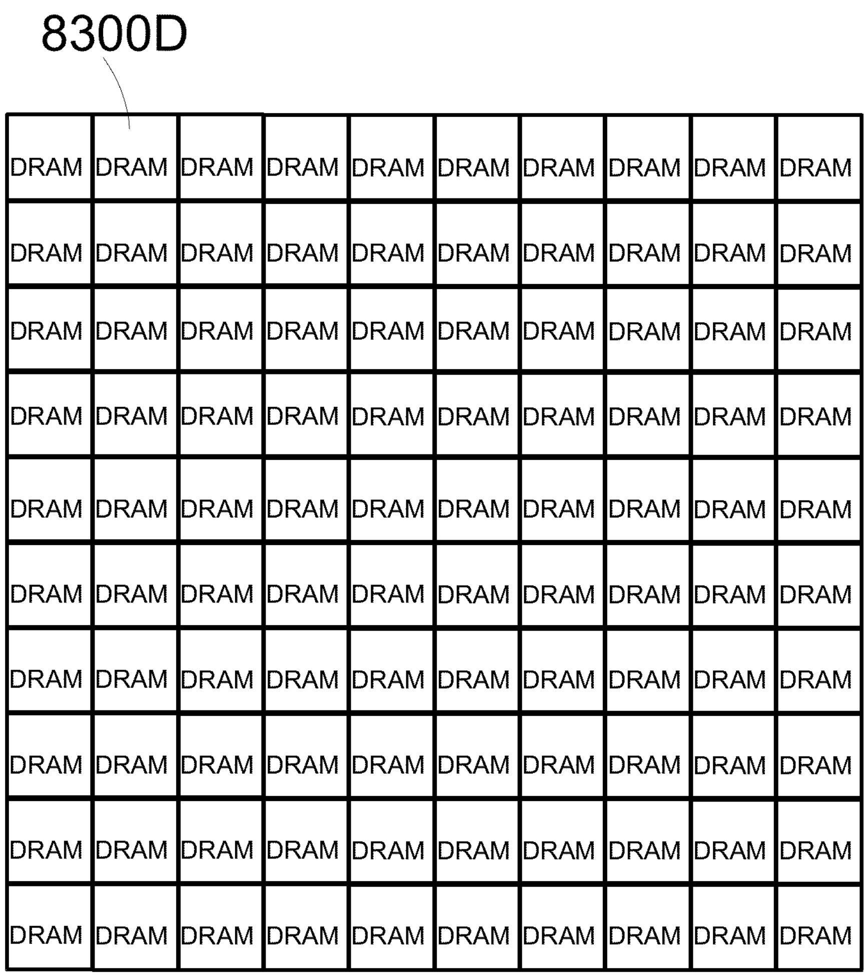
FIG. 83D illustrates a continuous array reticle of DRAM tiles according to the invention.
Figure 83E:
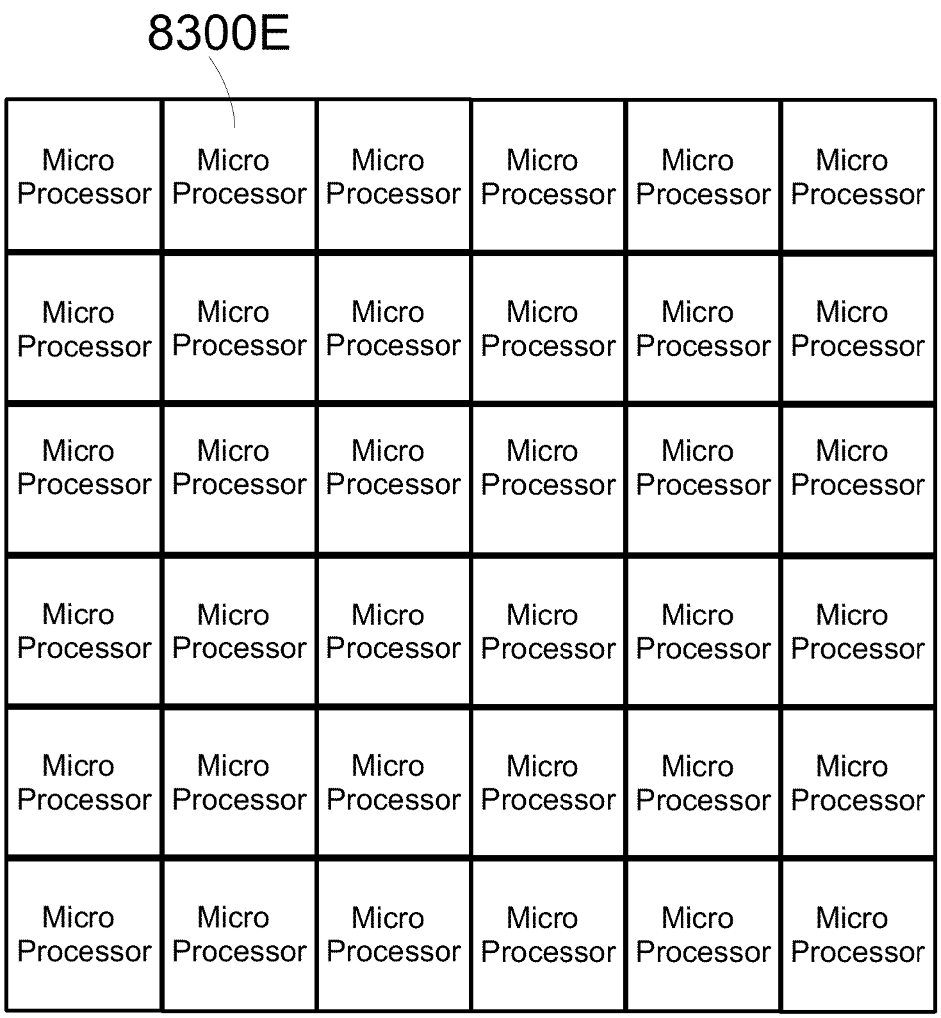
FIG. 83E illustrates a continuous array reticle of microprocessor tiles according to the invention.
Figure 83F:
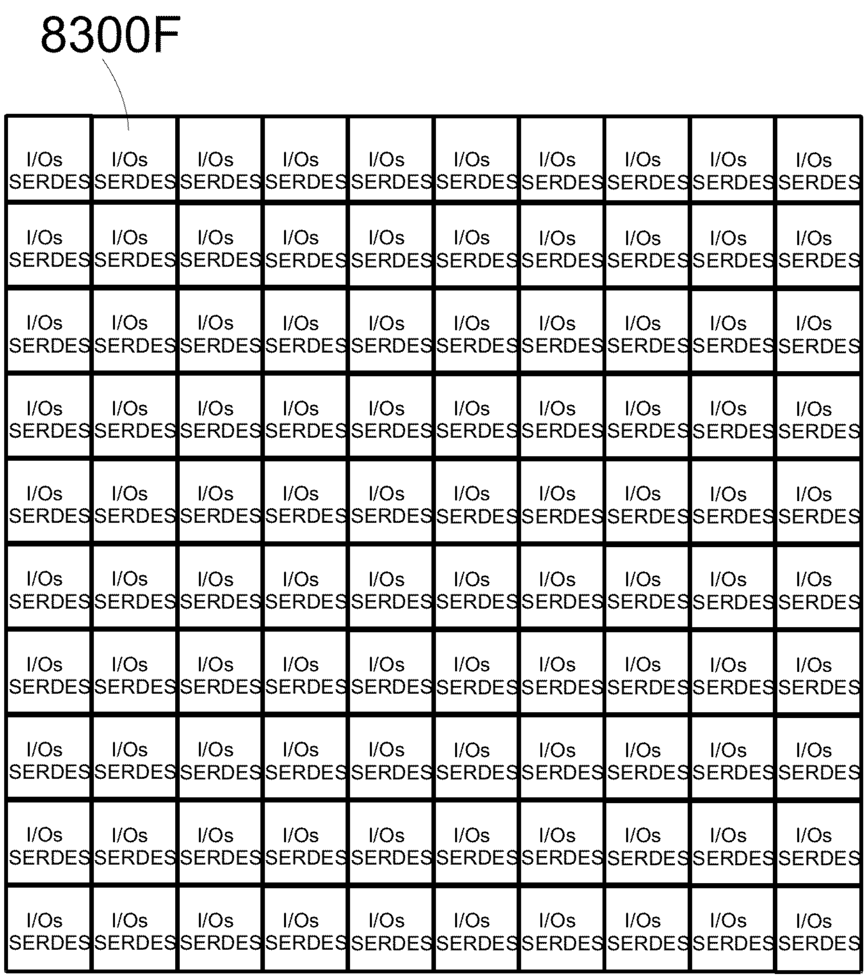
FIG. 83F illustrates a continuous array reticle of I/O SERDES tiles according to the invention.

FIG. 83A is a drawing illustration of one reticle size area of CA wafer, here made of FPGA-type tiles 8300A. Between the tiles there exist potential dicing lines 8302 that allow the wafer to be diced into desired configurable logic die sizes. Similarly, FIG. 83B illustrates CA comprising structured ASIC tiles 8309B that allow the wafer to be diced into desired configurable logic die sizes. FIG. 83C illustrates CA comprising RAM tiles 8300C that allow the wafer to be diced into desired RAM die sizes. FIG. 83D illustrates CA comprising DRAM tiles 8300D that allow the wafer to be diced into desired DRAM die sizes. FIG. 83E illustrates CA comprising microprocessor tiles 8300E that allow the wafer to be diced into desired microprocessor die sizes. FIG. 83F illustrates CA comprising I/O or SerDes tiles 8300F that allow the wafer to be diced into desired I/O die or SERDES die or combination I/O and SERDES die sizes. It should be noted that the edge size of each type of repeating tile may differ, although there may be an advantage to make all tile sizes a multiple of the smallest desirable tile size. For FPGA-type tile 8300A an edge size between 0.5 mm and 1 mm represents a good tradeoff between granularity and area loss due to unused potential dicing lines.

In some types of CA wafers it may be advantageous to have metal lines crossing perpendicularly the potential dicing lines, which will allow connectivity between individual tiles. This may lead to cutting some such lines during wafer dicing. Alternate embodiment may not have metal lines crossing the potential dicing lines and in such case connectivity across uncut dicing lines can be obtained using dedicated mask and custom metal layers accordingly to provide connections between tiles for the desired die sizes.

It should be noted that in general the lithography over the wafer is done by repeatedly projecting what is named reticle over the wafer in a "step-and-repeat" manner. In some cases it might be preferable to consider differently the separation between repeating tile 822 within a reticle image vs. tiles that relate to two projections. For simplicity this description will use the term wafer but in some cases it will apply only to tiles within one reticle.

Figure 84A:
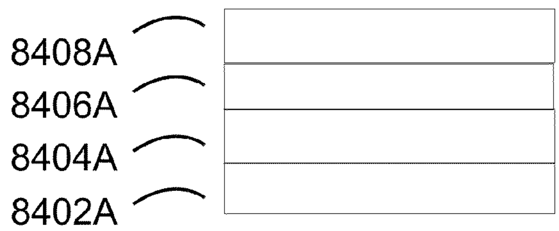
FIG. 84A illustrates a 3D IC of the invention comprising equal sized continuous array tiles.
Figure 84B:
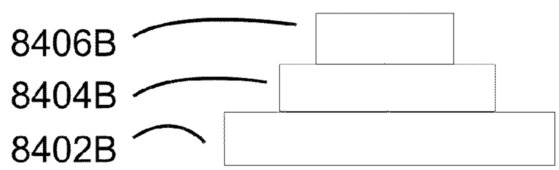
FIG. 84B illustrates a 3D IC of the invention comprising different sized continuous array tiles.
Figure 84C:
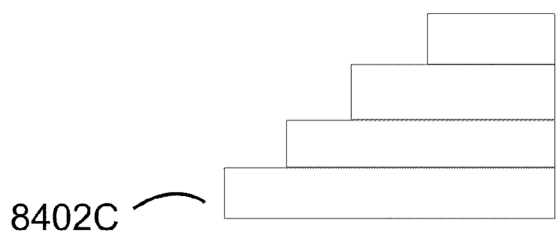
FIG. 84C illustrates a 3D IC of the invention comprising different sized continuous array tiles with a different alignment from FIG. 84B.
Figure 84D:
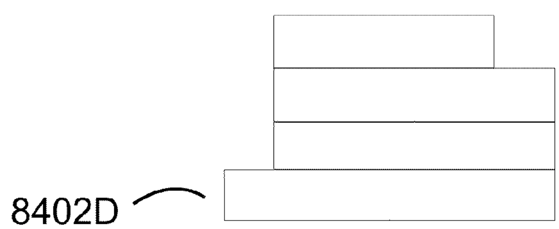
FIG. 84D illustrates a 3D IC of the invention comprising some equal and some different sized continuous array tiles.
Figure 84E:
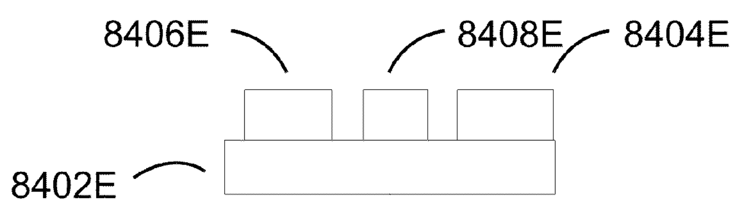
FIG. 84E illustrates a 3D IC of the invention comprising smaller sized continuous array tiles at the same level on a single tile.

FIGS. 84A-E is a drawing illustration of how dies cut from CA wafers such as in FIGS. 83A-F can be assembled into a 3D Configurable System using TSVs. FIG. 84A illustrates the case where all dies 8402A, 8404A, 8406A and 8408A are of the same size. FIGS. 84B and 84C illustrate cases where the upper dies are decreasing in size and have different type of alignment. FIG. 84D illustrates a mixed case where some, but not all, of the stacked dies are of the same size. FIG. 84E illustrates the case where multiple smaller dies are placed at a same level on top of a single die. It should be noted that such architecture allows constructing wide variety of logic devices with variable amounts of specific resources using only small number of mask sets. It should be also noted that the preferred position of high power dissipation tiles like logic is toward the bottom of such 3D stack and closer to external cooling access, while the preferred position of I/O tiles is at the top of the stack where it can directly access the Configurable System I/O pads or bumps.

Person skilled in the art will appreciate that a major benefit of the approaches illustrated by FIGS. 84A-84E occurs when the TSV patterns on top of each die are standardized in shape, with each TSV having either predetermined or programmable function. Once such standardization is achieved an aggressive mix and match approach to building broad range of System on a Chip ("SoC") 3D Configurable Systems with small number of mask sets defining borderless Continuous Array stackable wafers becomes viable. Of particular interest is the case illustrated in 84E that is applicable to SoC or FPGA based on high density homogenous CA wafers, particularly without off-chip I/O. Standard TSV pattern on top of CA sites allows efficient tiling with custom selection of I/O, memory, DSP, and similar blocks and with a wide variety of characteristics and technologies on top of the high-density SoC 3D stack.

Figure 85:
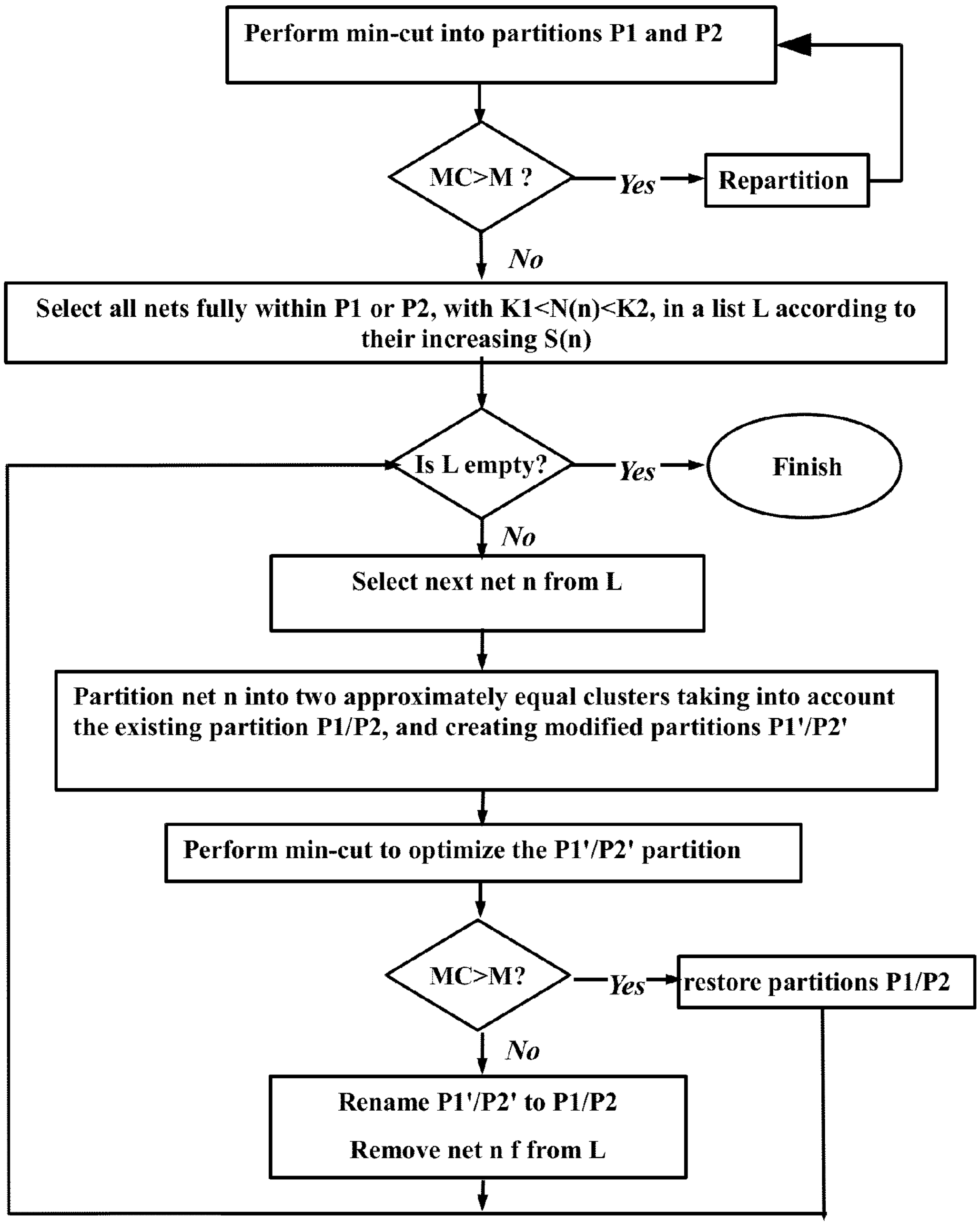
FIG. 85 illustrates a flow chart of a partitioning method according to the invention.

FIG. 85 is a flow chart illustration of a partitioning method to take advantage of the 3D increased concept of proximity. It uses the following notation:

M—Maximum number of TSVs available for a given IC

MC—Number of nets (connections) between two partitions

S(n)—Timing slack of net n

N(n)—The fanout of net n

K1, K2—constants determined by the user min-cut—a known algorithm to split a graph into two partitions each of about equal number of nodes with minimal number of arcs between the partitions.

The key idea behind the flow is to focus first on large-fanout low-slack nets that can take the best advantage of the added three-dimensional proximity. K1 is selected to limit the number of nets processed by the algorithm, while K2 is selected to remove very high fanout nets, such as clocks, from being processed by it, as such nets are limited in number and may be best handled manually. Choice of K1 and K2 should yield MC close to M.

A partition is constructed using min-cut or similar algorithm. Timing slack is calculated for all nets using timing analysis tool. Targeted high fanout nets are selected and ordered in increasing amount of timing slack. The algorithm takes those nets one by one and splits them about evenly across the partitions, readjusting the rest of the partition as needed.

Person skilled in the art will appreciate that a similar process can be extended to more than 2 vertical partitions using multi-way partitioning such as ratio-cut or similar.

Figure 86:
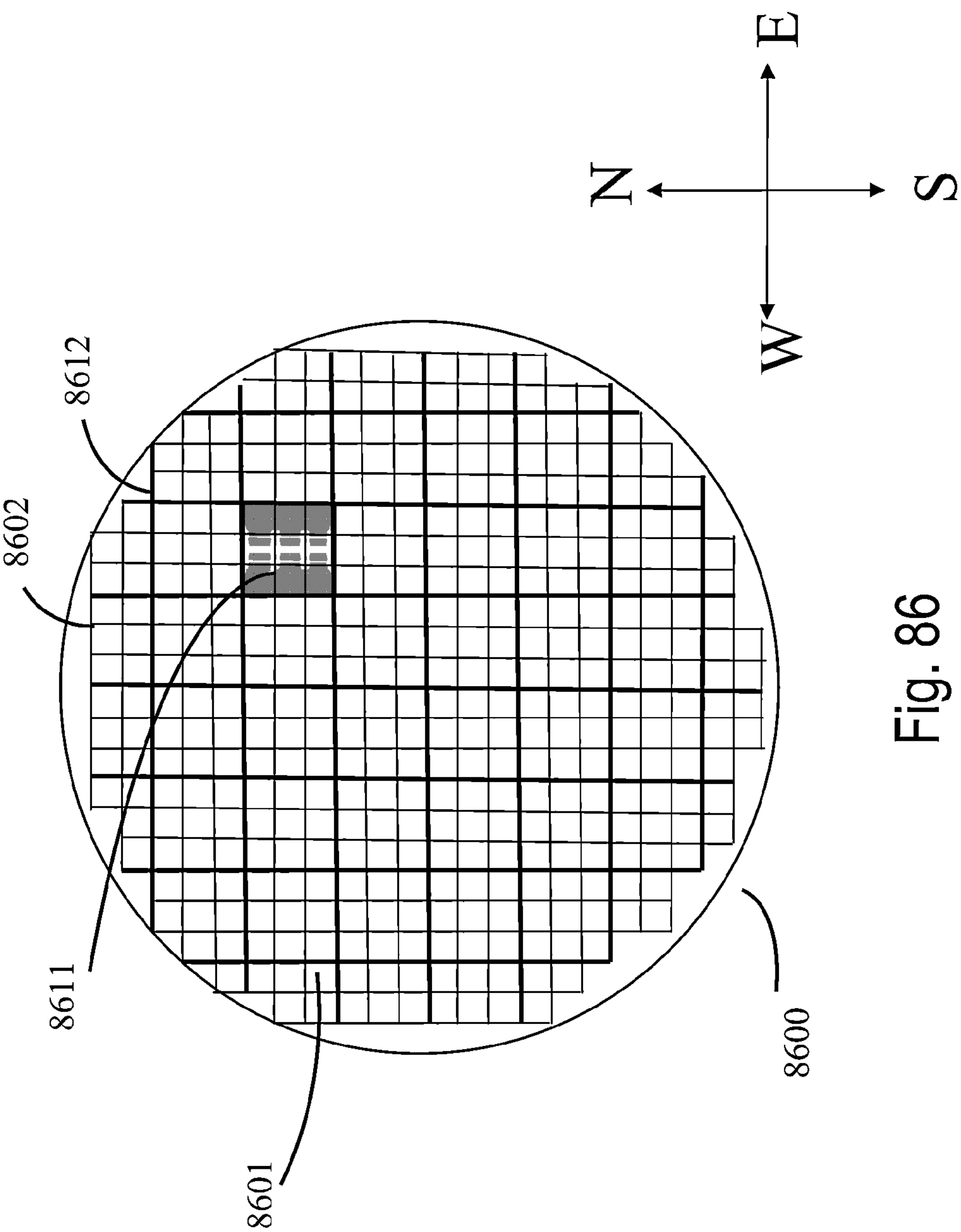
FIG. 86 illustrates a continuous array wafer with different dicing options according to the invention.

There are many manufacturing and performance advantages to the flexible construction and sizing of 3D Configurable System as described above. At the same time it is also helpful if the complete 3D Configurable System behaves as a single system rather than as a collection of individual tiles. In particular it is helpful is such 3D Configurable System can automatically configure itself for self-test and for functional operation in case of FPGA logic and the likes. FIG. 86 illustrates how this can be achieved in CA architecture, where a wafer 8600 carrying a CA of tiles 8601 with potential dicing lines 8602 has targeted 3×3 die size for device 8611 with actual dicing lines 8612.

Figure 87:
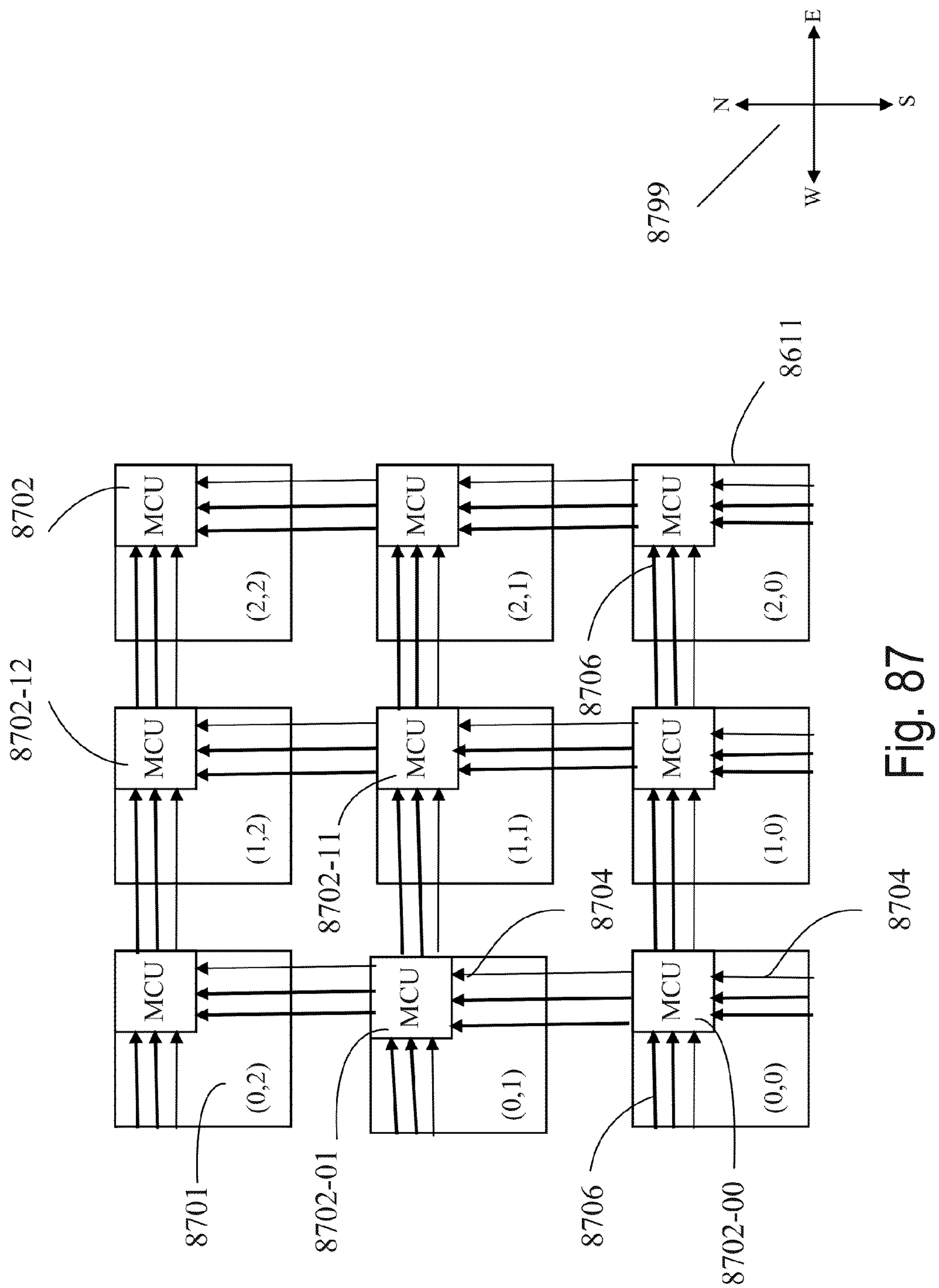
FIG. 87 illustrates a 3×3 array of continuous array tiles according to the invention with a microcontroller testing scheme.

FIG. 87 is a drawing illustration of the 3×3 target device 8611 comprising 9 tiles 8701 such as 8601. Each tile 8701 may include a small microcontroller unit ("MCU") 8702. For ease of description the tiles are indexed in 2 dimensions starting at bottom left corner. The MCU is a fully autonomous controller such as 8051 with program and data memory and input/output lines. The MCU of each tile is used to configure, initialize, and potentially tests and manage, the configurable logic of the tile. Using the compass rose 8799 as a reference in FIG. 87, MCU inputs of each tile are connected to its southern neighbor through fixed connection lines 8704 and its western neighbor through fixed connection lines 8706. Similarly each MCU drives its northern and eastern neighbors. Each MCU is controlled in priority order by its western neighbor and by its southern neighbor. For example, MCU 8702-11 is controlled by MCU 8702-01, while MCU 8702-01 having no western neighbor is controlled by MCU 8702-00 south of it. MCU 8702-00 that senses neither westerly nor southerly neighbors automatically becomes the die master. It should be noted that the directions in the discussion above are representative and the system can be trivially modified to adjust to direction changes.

Figure 88:
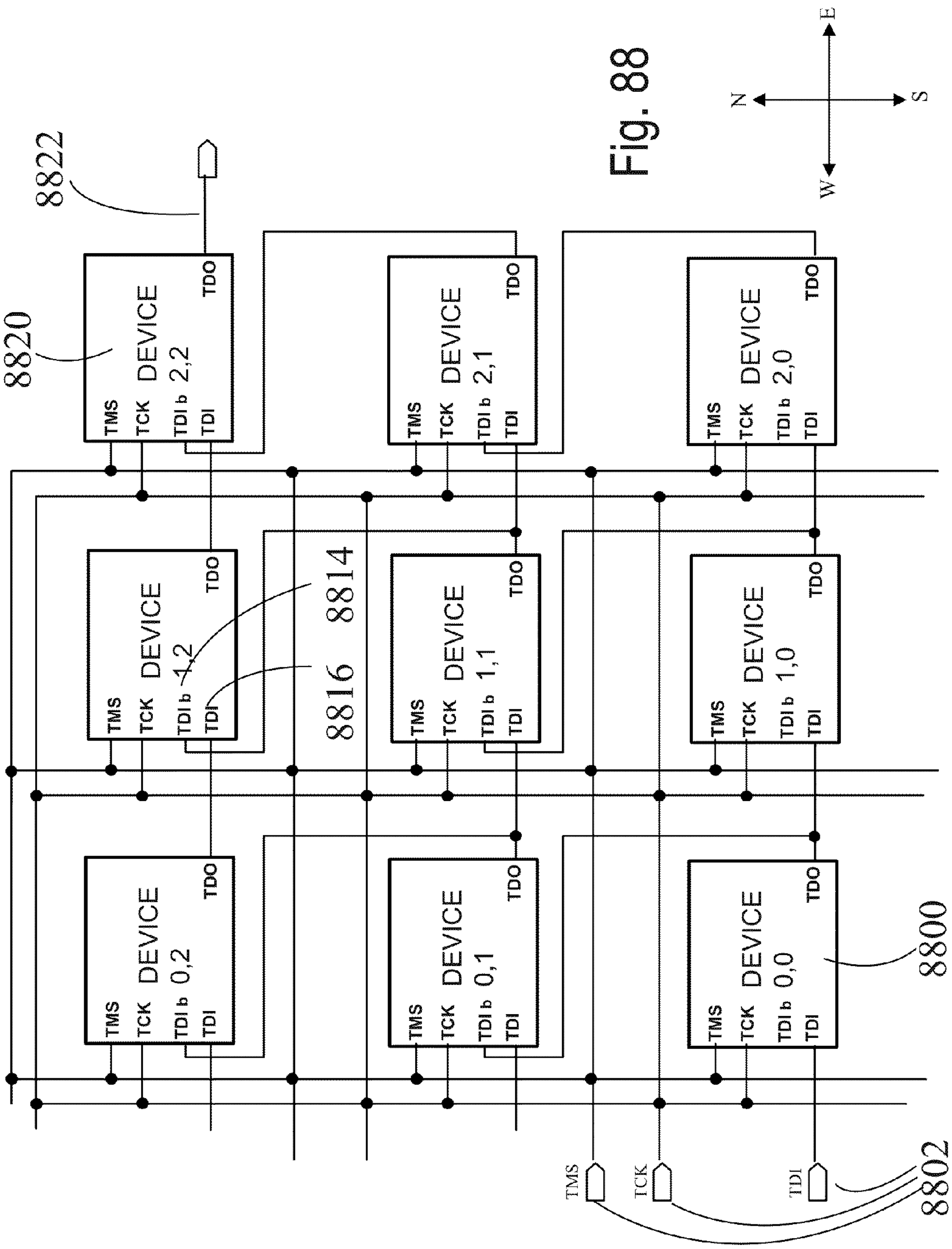
FIG. 88 illustrates a 3×3 array of continuous array tiles according to the invention with a Joint Test Action Group (JTAG) testing scheme.

FIG. 88 is a drawing illustration of a scheme using modified Joint Test Action Group ("JTAG") (also known as IEEE Standard 1149.1) industry standard interface interconnection scheme. Each MCU has two TDI inputs TDI 8816 and TDIb 8814 instead of one, which are priority encoded with 8816 having the higher priority. JTAG inputs TMS and TCK are shared in parallel among the tiles, while JTAG TDO output of each MCU is driving its northern and eastern neighbors. Die level TDI, TMS, and TCK pins 8802 are fed to tile 8800 at lower left, while die level TDO 8822 is output from top right tile 8820. Accordingly, such setup allows the MCUs in any convex rectangular array of tiles to self-configure at power-on and subsequently allow for each MCU to configure, test, and initialize its own tile using uniform connectivity.

The described uniform approach to configuration, test, and initialization is also helpful for designing SoC dies that include programmable FPGA array of one or more tiles as a part of their architecture. The size-independent self-configuring electrical interface allows for easy electrical integration, while the autonomous FPGA self-test and uniform configuration approach make the SoC boot sequence easier to manage.

U.S. Patent Application Publication 2009/0224364 describes methods to create 3D systems made of stacking very thin layers, of thickness of few tens to few hundreds of nanometers, of mono-crystalline silicon with pre-implanted patterning on top of base wafer using low-temperature (below approximately 400 C) technique called layer transfer.

Figure 89:
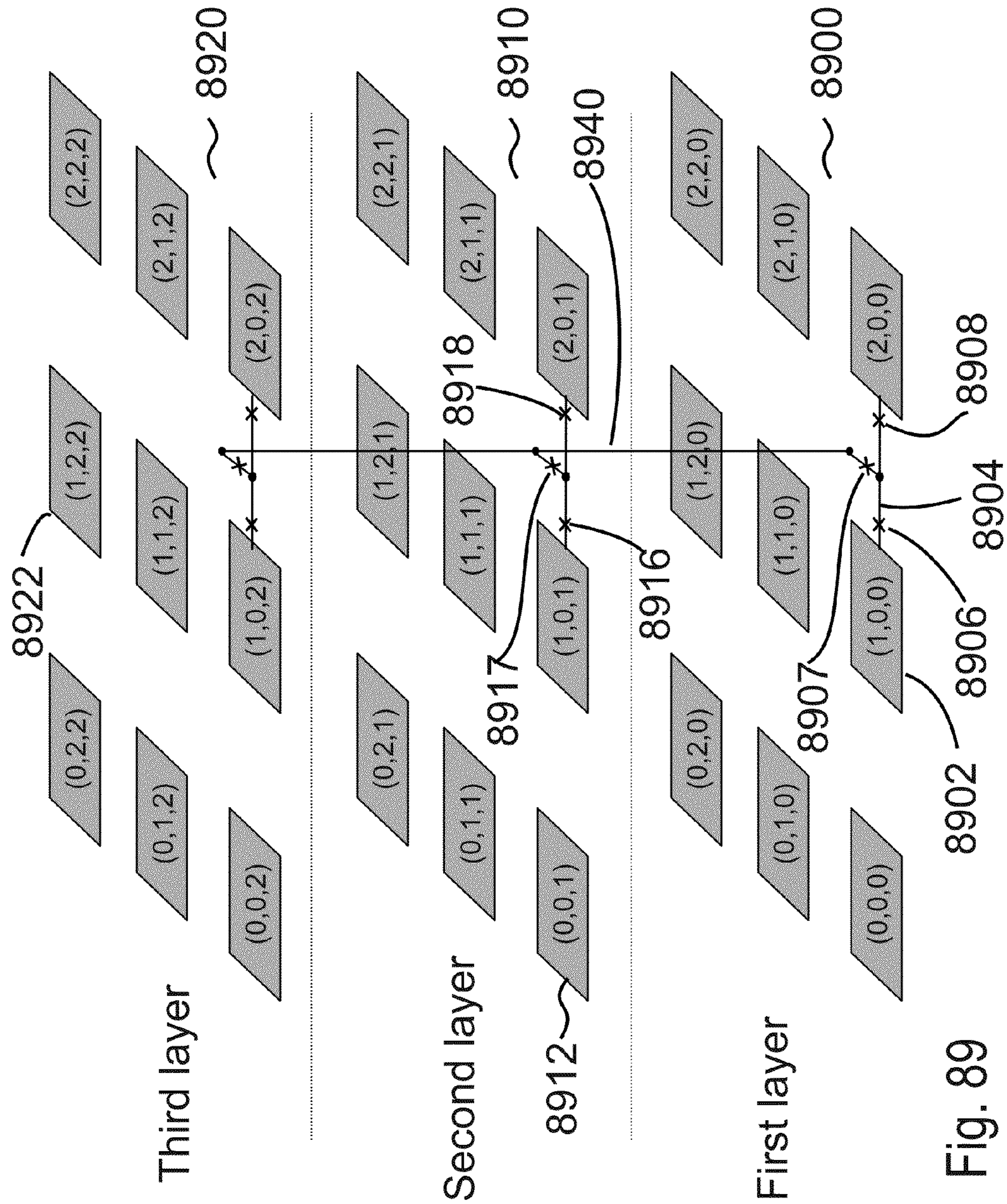
FIG. 89 illustrates a programmable 3D IC with redundancy according to the invention.

An alternative of the invention uses vertical redundancy of configurable logic device such as FPGA to improve the yield of 3DICs. FIG. 89 is a drawing illustration of a programmable 3D IC with redundancy. It comprises of three stacked layers 8900, 8910 and 8920, each having 3×3 array of programmable LBs 8902, 8912, 8922 respectively indexed with three dimensional subscripts. One of the stacked layers is dedicated to redundancy and repair, while the rest of the layers—two in this case—are functional. In this discussion we will use the middle layer 8910 as the repair layer. Each of the LB outputs has a vertical connection such as 8940 that can connect the corresponding outputs at all vertical layers through programmable switches such as 8907 and 8917. The programmable switch can be Antifuse-based, a pass transistor, or an active-device switch.

Functional connection 8904 connects the output of LB (1,0,0) through switches 8906 and 8908 to the input of LB (2,0,0). In case LB (1,0,0) malfunctions, which can be found by testing, the corresponding LB (1,0,1) on the redundancy/repair layer can be programmed to replace it by turning off switches 8906, 8918 and turning on switches 8907, 8917, and 8916 instead. The short vertical distance between the original LB and the repair LB guarantees minimal impact on circuit performance. In a similar way LB (1,0,1) could serve to repair malfunction in LB (1,0,2). It should be noted that the optimal placement for the repair layer is about the center of the stack, to optimize the vertical distance between malfunctioning and repair LBs. It should be also noted that a single repair layer can repair more than two functional layers, with slowly decreasing efficacy of repair as the number of functional layers increases.

In a 3D IC based on layer transfer in U.S. Patent Applications Publications 2006/0275962 and 2007/0077694 we will call the underlying wafer a Receptor wafer, while the layer placed on top of it will come from a Donor wafer. Each such layer can be patterned with advanced fine pitch lithography to the limits permissible by existing manufacturing technology. Yet the alignment precision of such stacked layers is limited. Best layer transfer alignment between wafers is currently on the order of 1 micron, almost two orders of magnitude coarser than the feature size available at each individual layer, which prohibits true high-density vertical system integration.

Figure 90A:
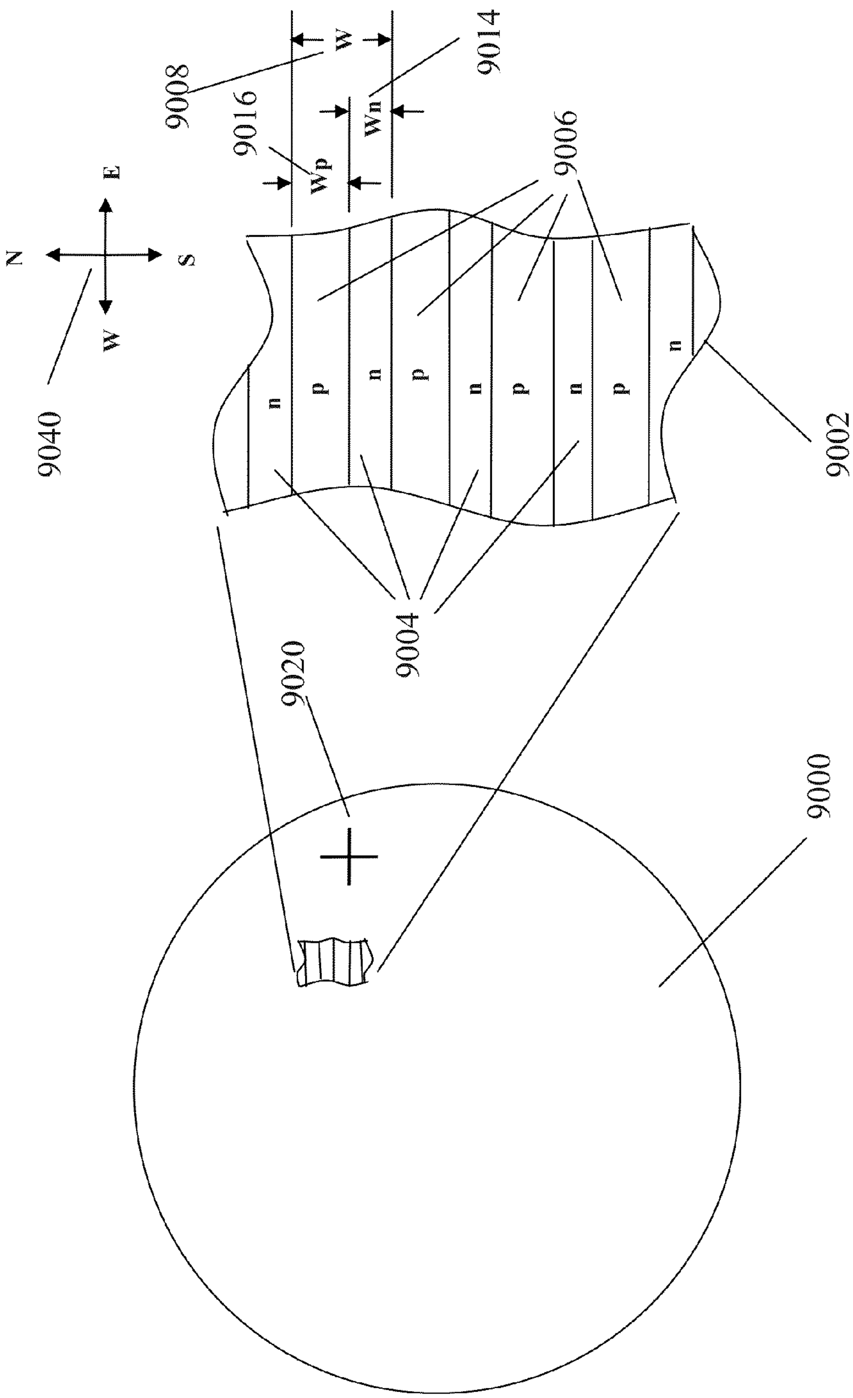
FIG. 90A illustrates a first alignment reduction scheme according to the invention.
Figure 90B:
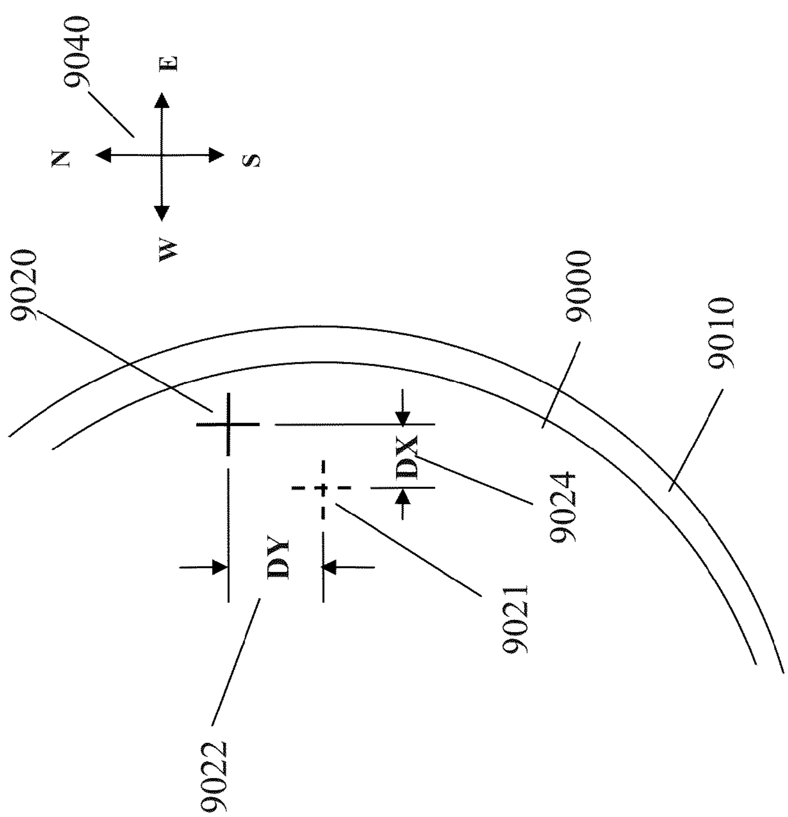
FIG. 90B illustrates donor and receptor wafer alignment in the alignment reduction scheme of FIG. 90A.

FIG. 90A is a drawing illustration that sets the basic elements to show how such large misalignment can be reduced for the purpose of vertical stacking of pre-implanted mono-crystalline silicon layers using layer transfer. Compass rose 9040 is used throughout to assist in describing the invention. Donor wafer 9000 comprises repetitive bands of P devices 9006 and N devices 9004 in the north-south direction as depicted in its magnified region 9002. The width of the P band 9006 is Wp 9016, and that of the N band 9004 is Wn 9014. The overall pattern repeats every step W 9008, which is the sum of Wp, Wn, and possibly an additional isolation band. Alignment mark 9020 is aligned with these patterns on 9000. FIG. 90B is a drawing illustration that demonstrates how such donor wafer 9000 can be placed on top of a Receptor wafer 9010 that has its own alignment mark 9021. In general, wafer alignment for layer transfer can maintain very precise angular alignment between wafers, but the error DY 9022 in north-south direction and DX 9024 in east-west direction are large and typically much larger than the repeating step W 9008. This situation is illustrated in drawing of FIG. 90C. However, because the pattern on the donor wafer repeats in the north-south direction, the effective error in that direction is only Rdy 9025, the remainder of error DY 9022 modulo W 9008. Clearly, Rdy 9025 is equal or smaller than W 9008.

Figure 90C:
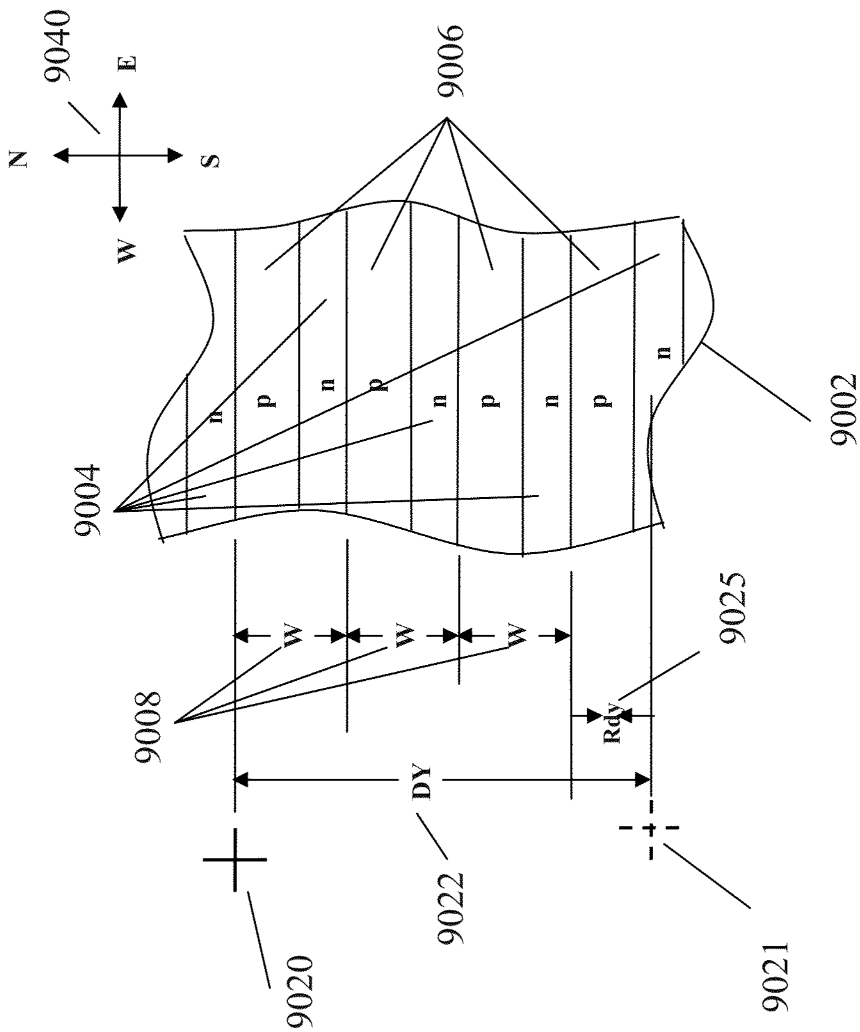
FIG. 90C illustrates alignment with respect to a repeatable structure in the alignment in the alignment reduction scheme of FIG. 90A.
Figure 90D:
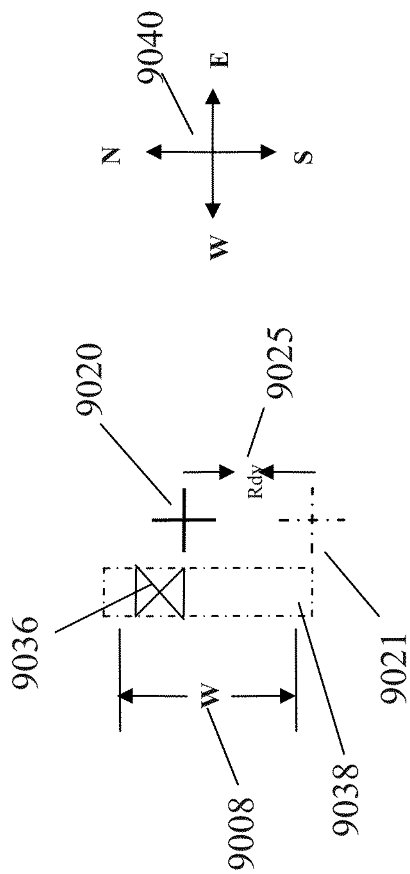
FIG. 90D illustrates an inter-wafer via contact landing area in the alignment reduction scheme of FIG. 90A.

FIG. 90D is a drawing illustration that completes the explanation of this concept. For a feature on the Receptor to have an assured connection with any point in a metal strip 9038 of the Donor, it is sufficient that the Donor strip is of length W in the north-south direction plus the size of an inter-wafer via 9036 (plus any additional overhang as dictated by the layout design rules as needed, plus accommodation for angular wafer alignment error as needed, plus accommodations for wafer bow and warp as needed). Also, because the transferred layer is very thin as noted above, it is transparent and both alignment marks 9020 and 9021 are visible readily allowing calculation of Rdy and the alignment of via 9036 to alignment mark 9020 in east-west direction and to alignment mark 9021 in north-south direction.

Figure 91A:
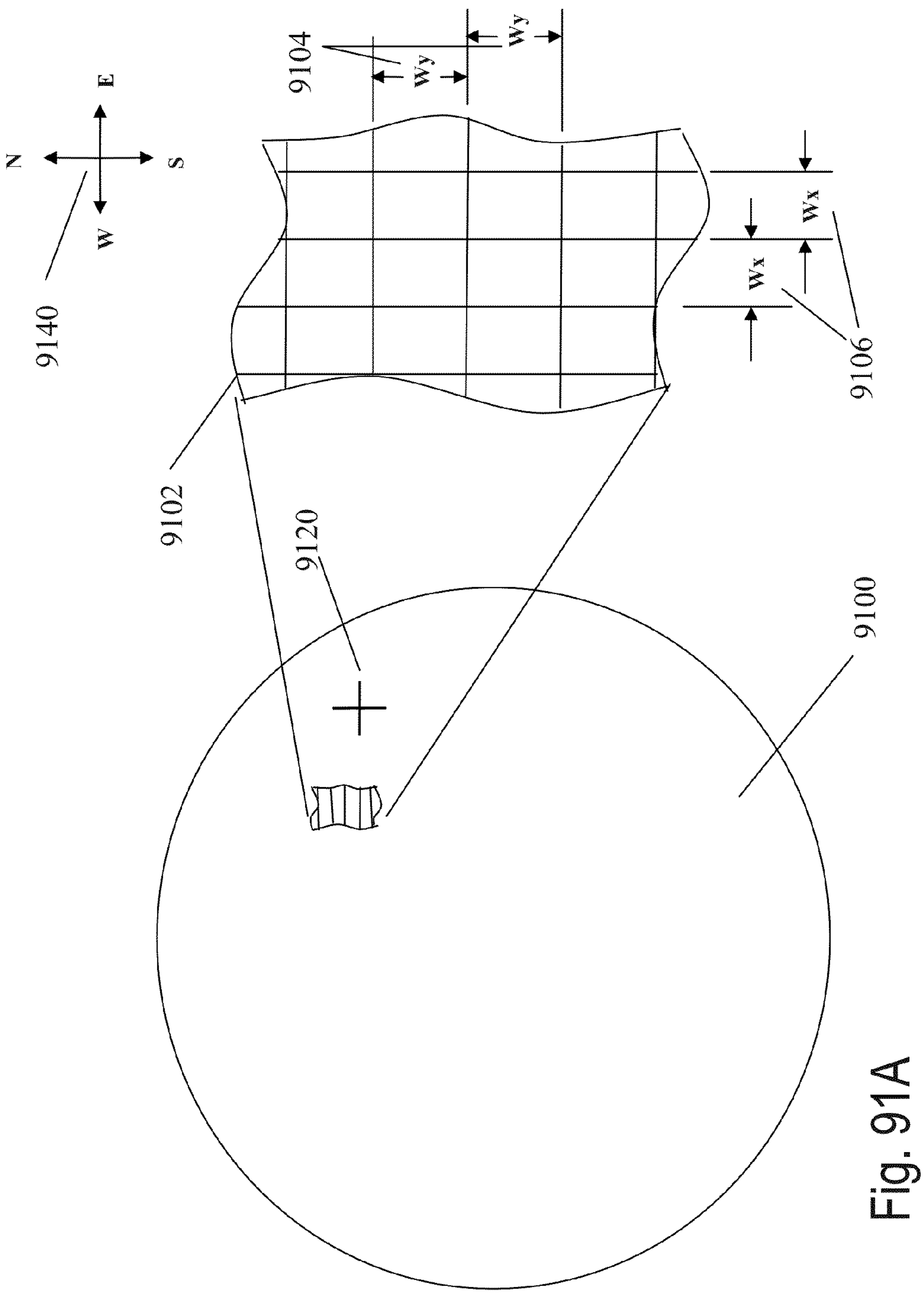
FIG. 91A illustrates a second alignment reduction scheme according to the invention.
Figure 91B:
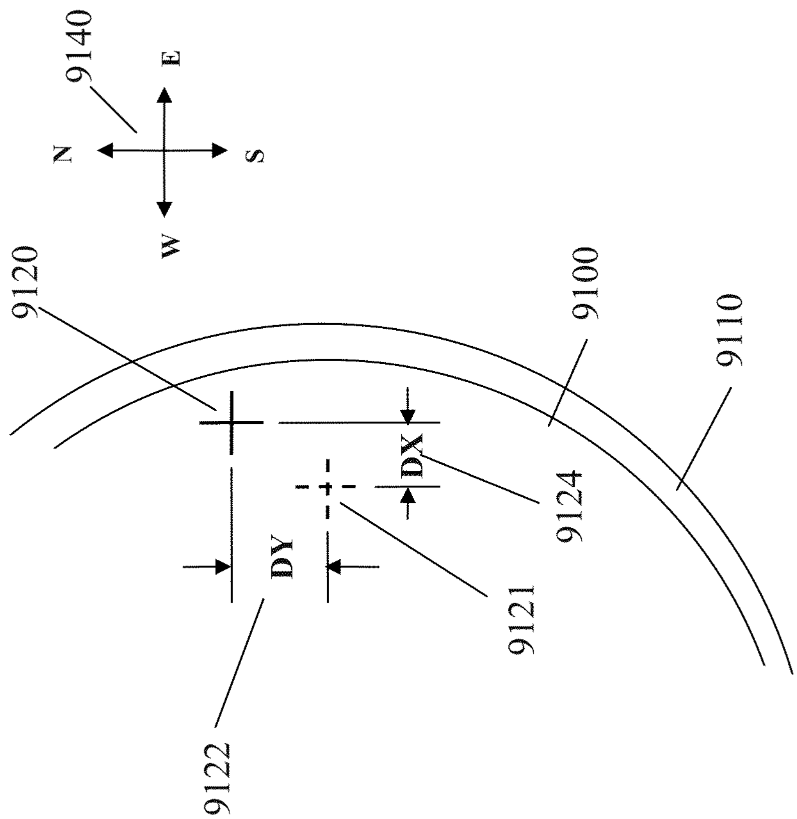
FIG. 91B illustrates donor and receptor wafer alignment in the alignment reduction scheme of FIG. 91A.
Figure 91C:
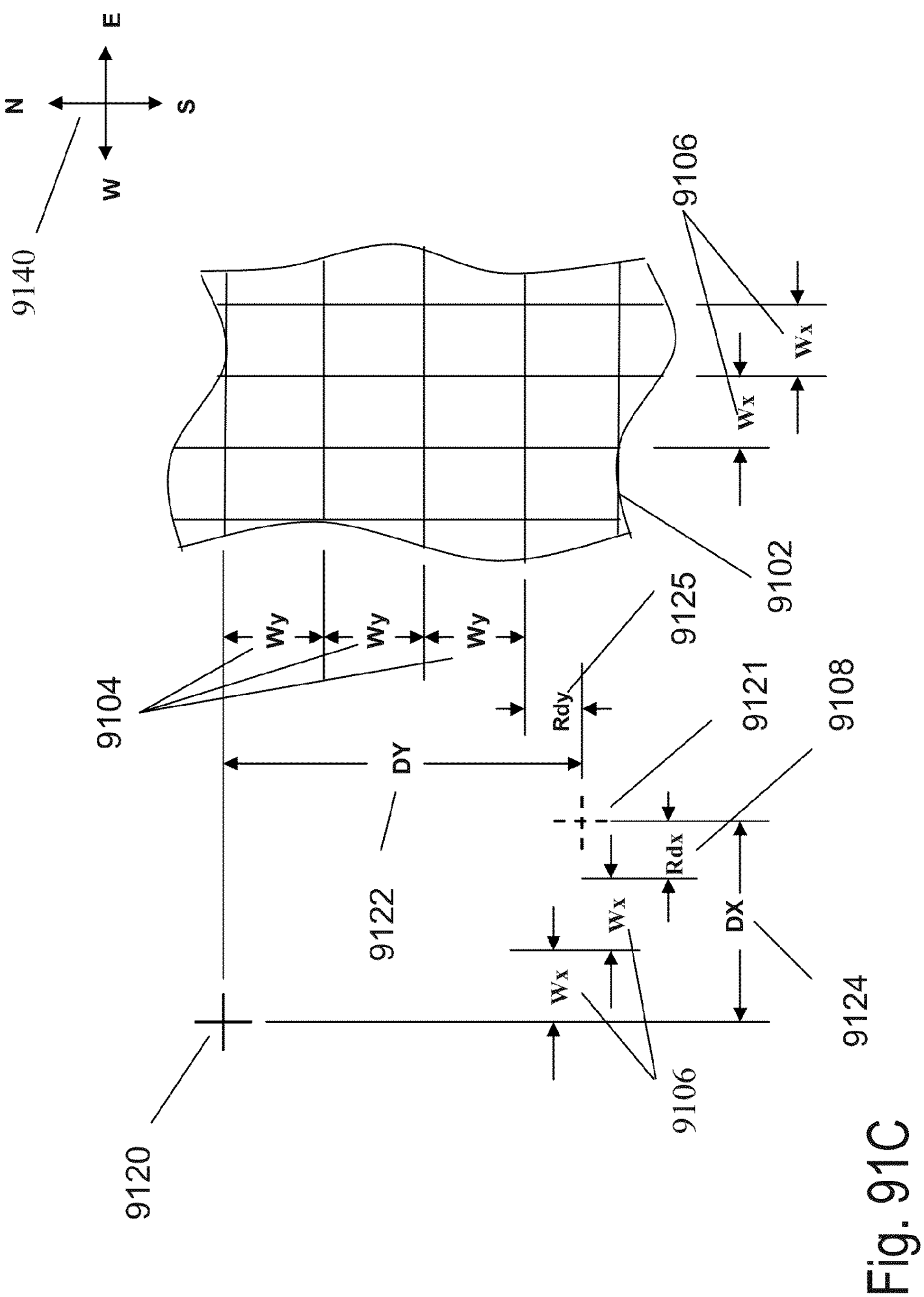
FIG. 91C illustrates alignment with respect to a repeatable structure in the alignment in the alignment reduction scheme of FIG. 91A.
Figure 91D:
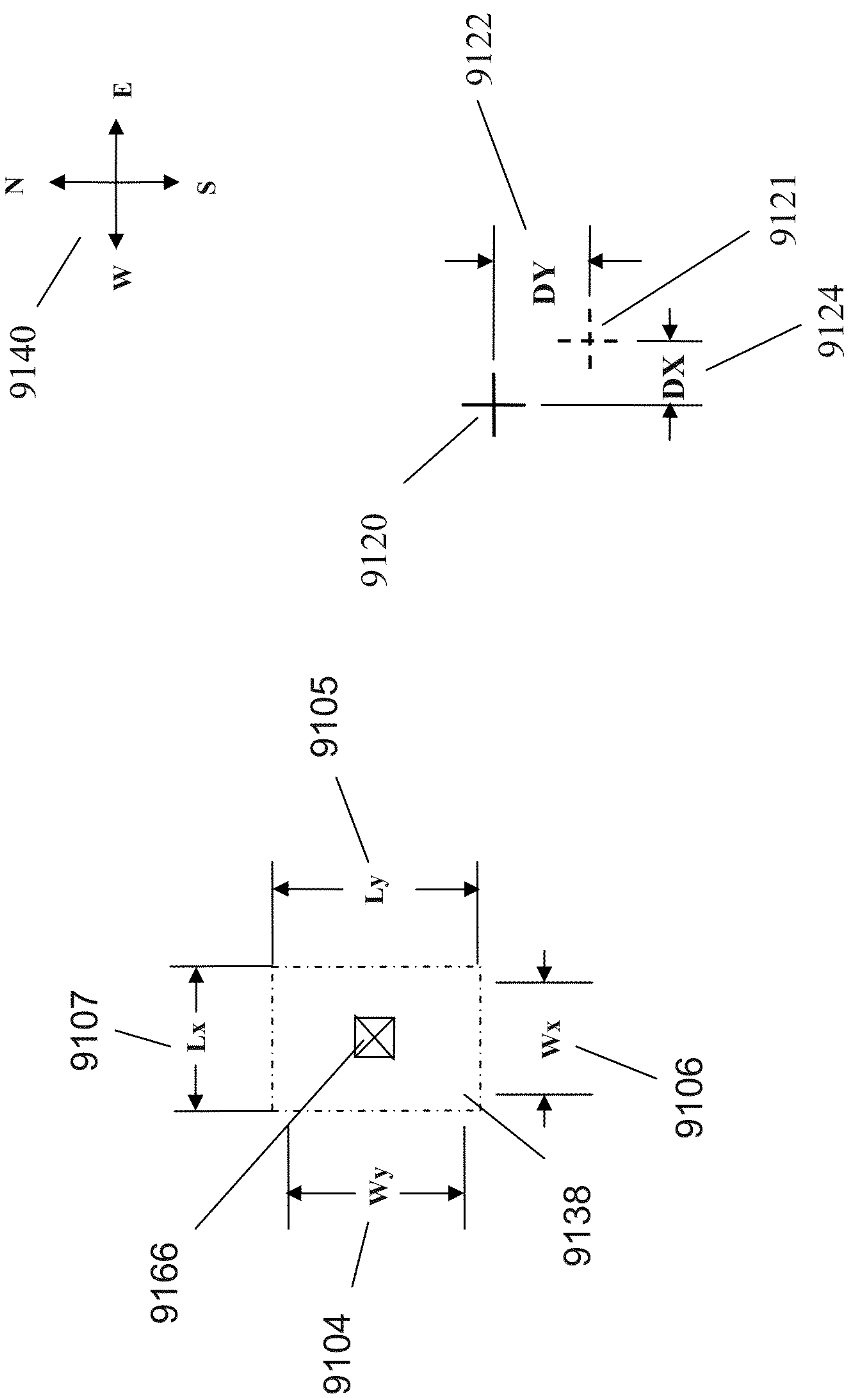
FIG. 91D illustrates an inter-wafer via contact landing area in the alignment reduction scheme of FIG. 91A.

FIG. 91A is a drawing illustration that extends this concept into two dimensions. Compass rose 9140 is used throughput to assist in describing the invention. Donor wafer 9100 has an alignment mark 9120 and the magnification 9102 of its structure shows a uniform repeated pattern of devices in both north-south and east-west directions, with steps Wy 9104 and Wx 9106 respectively. FIG. 91B shows a placement of such donor wafer 9100 onto a Receptor wafer 9110 with its own alignment mark 9121, and with alignment errors DY 9122 and DX 9124 in north-south and east-west respectively. FIG. 91C shows, in a manner analogous to FIG. 90C, shows that the maximum effective misalignments in both north-south and east-west directions are the remainders Rdy 9125 of DY modulo Wy and Rdx 9108 of DX modulo Wx respectively, both much smaller than the original misalignments DY and DX. As before, the transparency of the very thin transferred layer readily allows the calculation of Rdx and Rdy after layer transfer. FIG. 91D, in a manner analogous to FIG. 90D, shows that the minimum landing area 9138 on the Receptor wafer to guarantee connection to any region of the Donor wafer is of size Ly 9105 (Wy plus inter-wafer via 9166 size) by Lx 9107 (Wx plus via 9166 size), plus any overhangs that may be required by layout rules and additional wafer warp, bow, or angular error accommodations as needed. As before, via 9166 is aligned to both marks 9120 and 9121. Landing area 9138 may be much smaller than wafer misalignment errors DY and DX.

Figure 91E:
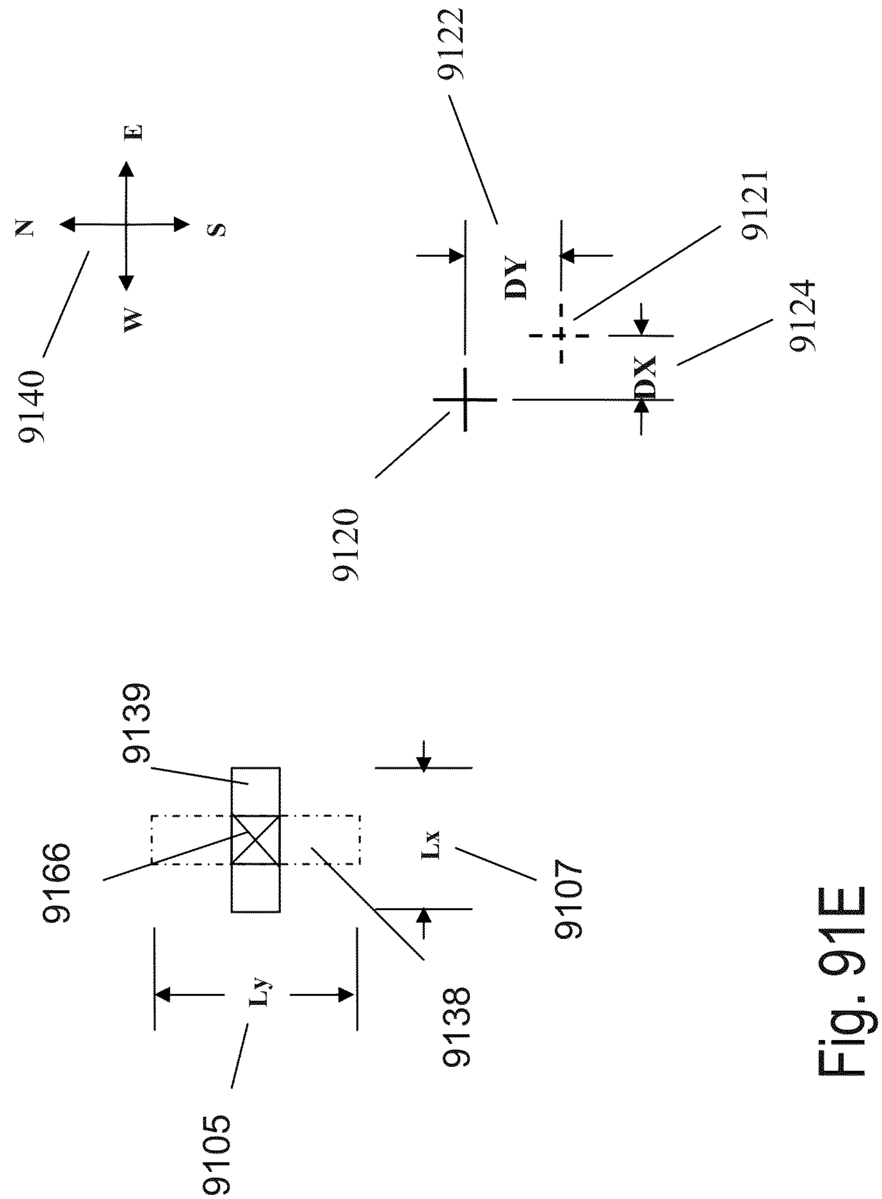
FIG. 91E illustrates a reduction in the size of the inter-wafer via contact landing area of FIG. 91D.

FIG. 91E is a drawing illustration that suggests that the landing area can actually be smaller than Ly times Lx. The Receptor wafer 9110 may have metal strip landing area 9138 of minimum width necessary for fully containing a via 9166 and of length Ly 9105. Similarly, the Donor wafer 9100 may include metal strip 9139 of minimum width necessary for fully containing a via 9166 and of length Lx 9107. This guarantees that irrespective of wafer alignment error the two strips will always cross each other with sufficient overlap to fully place a via in it, aligned to both marks 9120 and 9121 as before.

This concept of small effective alignment error is only valid in the context of fine grain repetitive device structure stretching in both north-south and east-west directions, which will be described in the following sections.

Figure 92A:
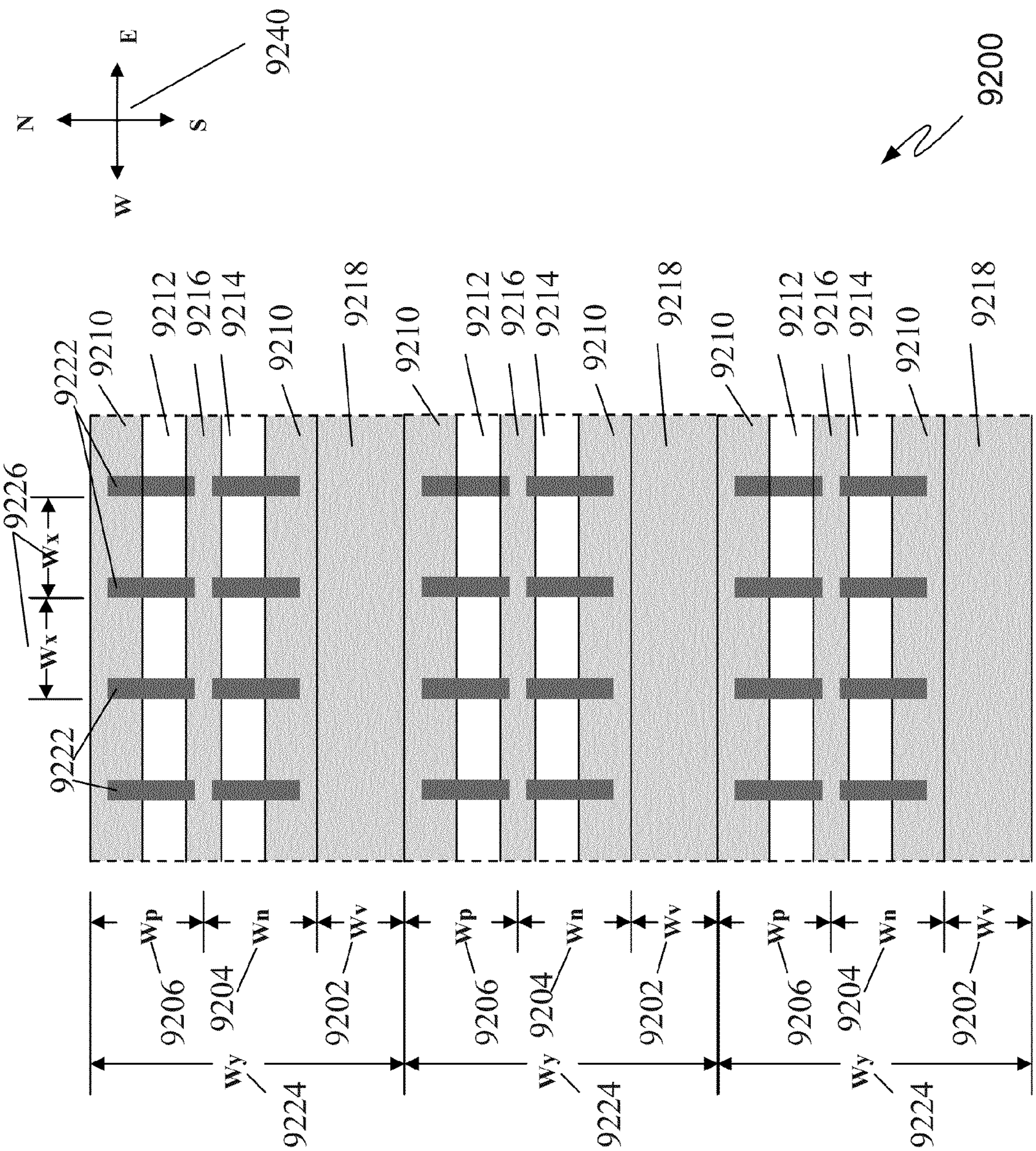

FIG. 92A is a drawing illustration of exemplary repeating transistor structure 9200 (or repeating transistor cell structure) suitable for use as repetitive structures, such as, for example, N band 9004 in FIG. 90C. Compass rose 9240 is used throughput to assist in describing the invention. Repeating transistor structure 9200 comprises continuous east-west strips of isolation regions 9210, 9216 and 9218, active P and N regions 9212 and 9214 respectively, and with repetition step Wy 9224 in north-south direction. Wy 9224 may include Wp 9206, Wn 9204, Wv 9202. A continuous array of gates 9222 may be formed over active regions, with repetition step Wx 9226 in east-west direction.

Such structure is conducive for creation of customized CMOS circuits through metallization. Horizontally adjacent transistors can be electrically isolated by properly biasing the gate between them, such as grounding the NMOS gate and tying the PMOS to Vdd using custom metallization.

Using F to denote feature size of twice lambda, the minimum design rule, we shall estimate the repetition steps in such terrain. In the east-west direction gates 9222 are of F width and spaced perhaps 4 F from each other, giving east-west step Wx 9226 of 5 F. In north-south direction the active regions width can be perhaps 3 F each, with isolation regions 9210, 9216 and 9218 being 3 F, 1 F and 5 F respectively yielding 18 F north-south step Wy 9224.

Figure 92B:
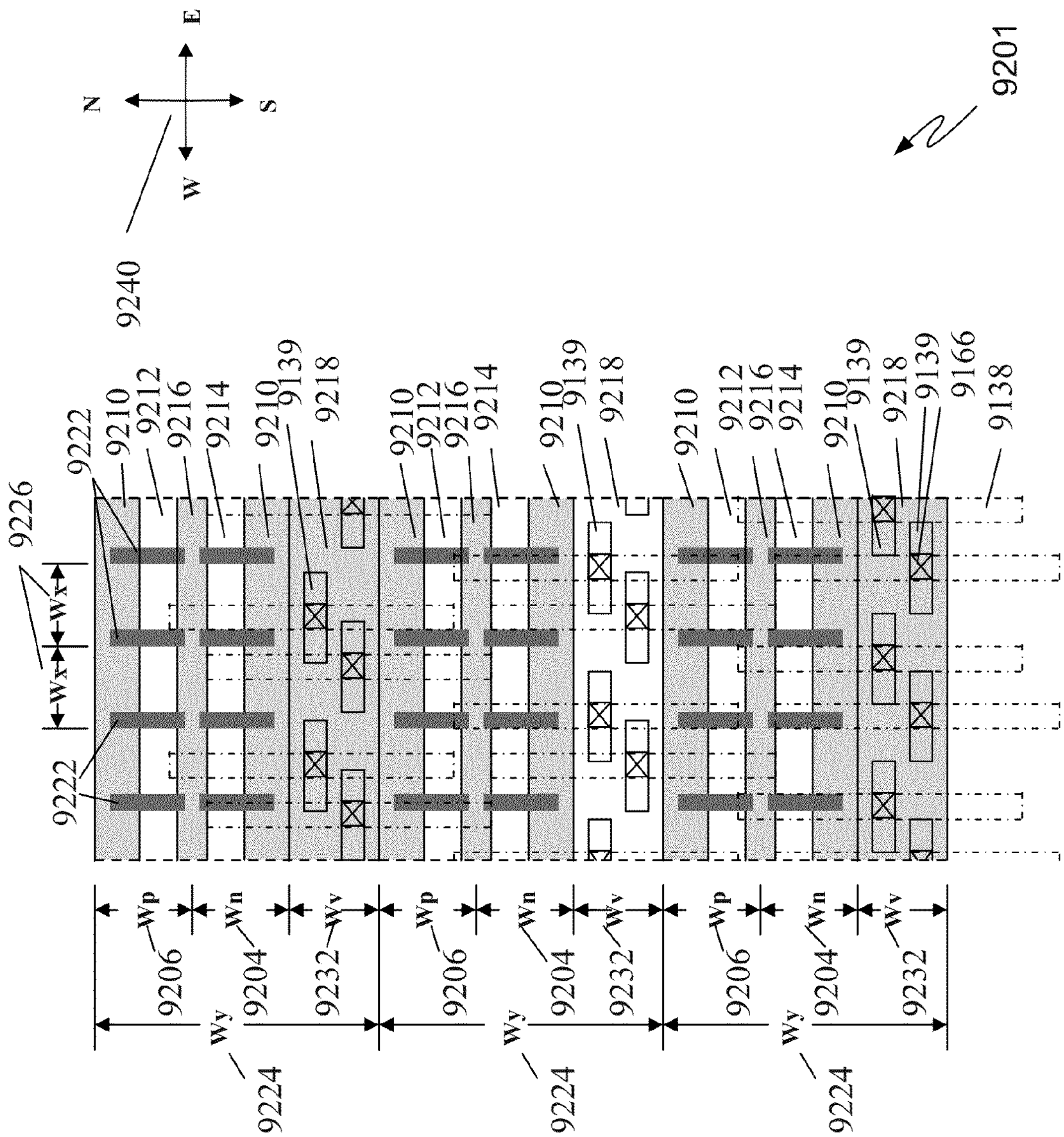

FIG. 92B illustrates an alternative exemplary repeating transistor structure 9201 (or repeating transistor cell structure), where isolation region 9218 in the Donor wafer is enlarged and contains preparation for metal strips 9139 that form one part of the connection between Donor and Receptor wafers. The Receptor wafer contains orthogonal metal strip landing areas 9138 and the final locations for vias 9166, aligned east-west to mark 9121 and north-south to mark 9120, are bound to exist at their intersections, as shown in FIG. 91E. The width Wv 9332 of isolation region 9218 needs to grow to 10 F yielding north-south Wy step of 23 F in this case.

Figure 92C:
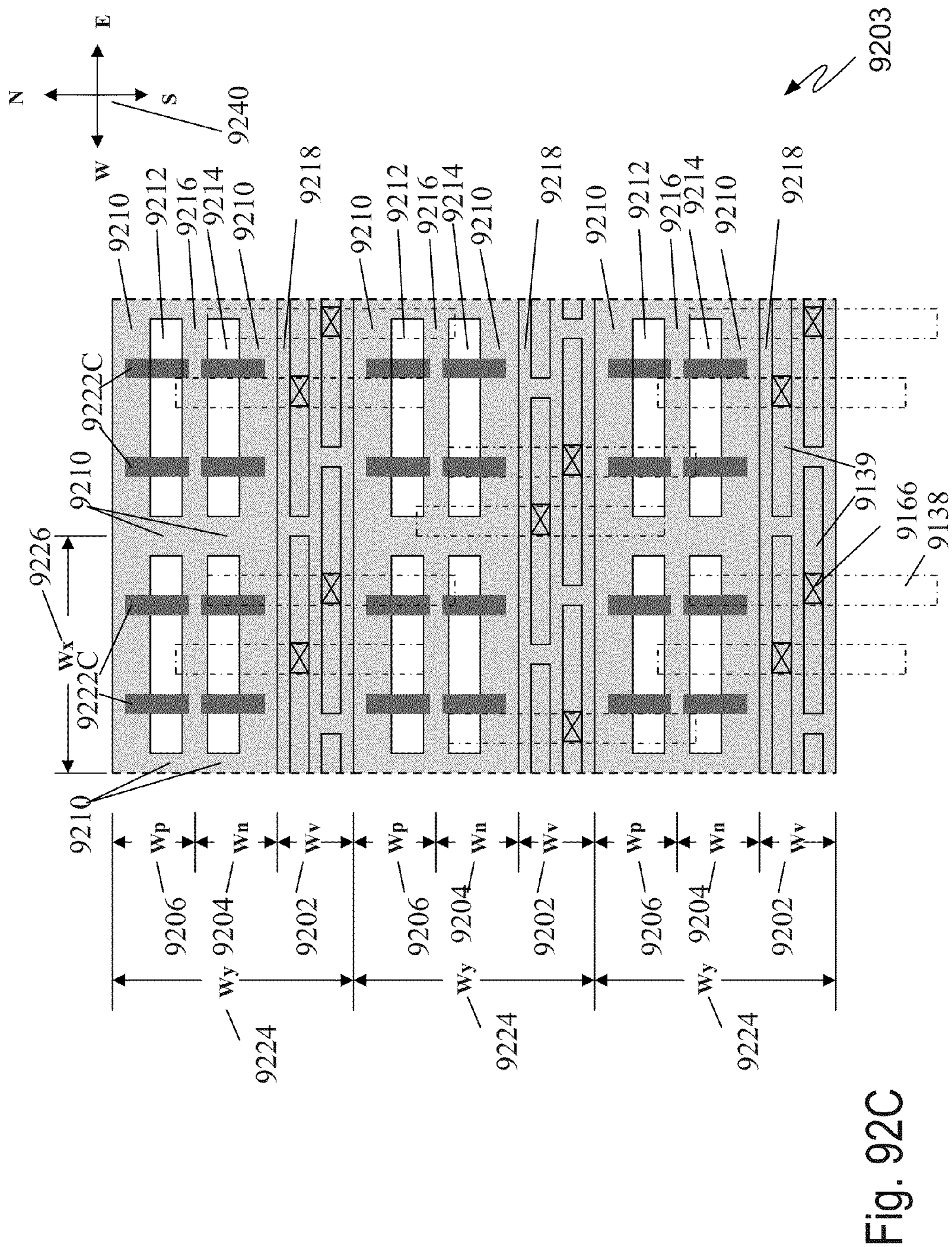

FIG. 92C illustrates an alternative exemplary array of repeating transistor structures 9203 (or repeating transistor cell structure). Here the east-west active regions are broken every two gates by a north-south isolation region, yielding an east-west Wx repeat step 9226 of 14 F. Connection strip 9239 may be longer in length than connection strip 9139. This two dimensional repeating transistor structure is suitable for use in the embodiment of FIG. 91C.

Figure 92D:
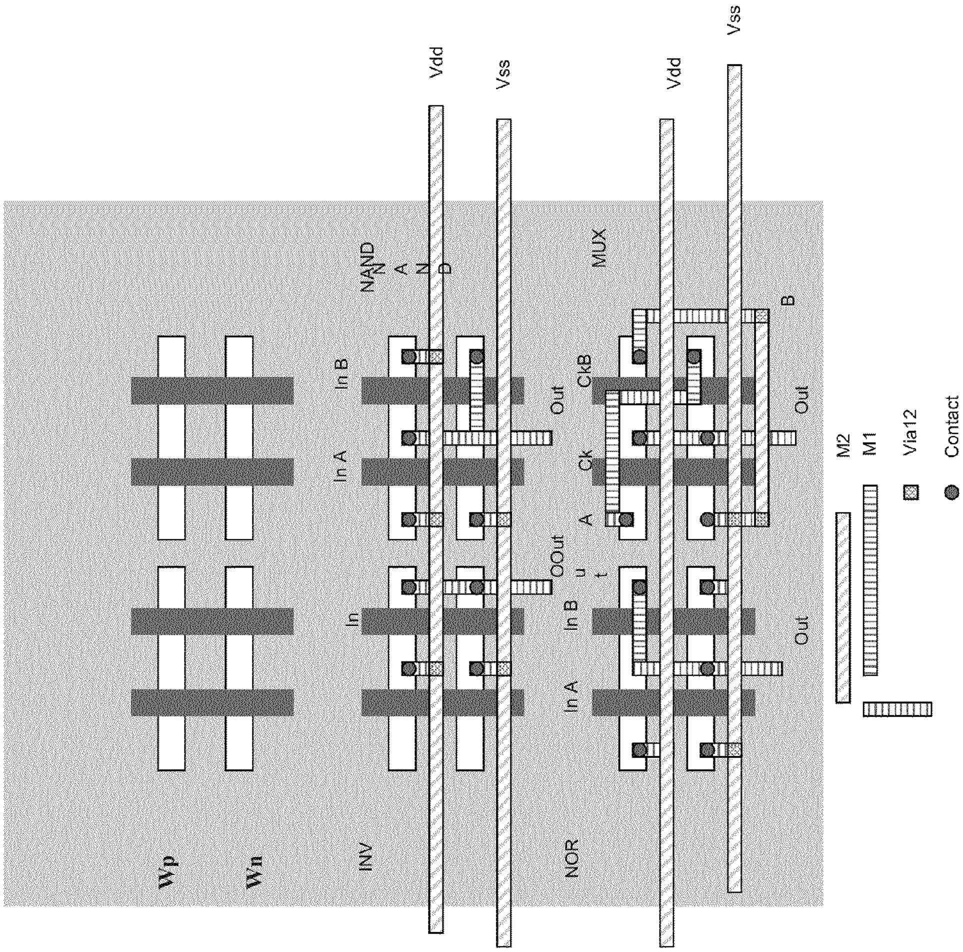

FIG. 92D illustrates a section of a Gate Array terrain with a repeating transistor cell structure. The cell is similar to the one of FIG. 92C wherein the respective gate of the N transistors are connected to the gate of the P transistors. FIG. 92D illustrates an implementation of basic logic cells: Inv, NAND, NOR, MUX It should be noted that in all these alternatives of FIGS. 92A-92D, mostly the same mask set can be used for patterning multiple wafers with the only customization needed for a few metal layers after each layer transfer. Preferably, in some embodiments the masks for the transistor layers and at least some of the metal layers would be identical. What this invention allows is the creation of 3D systems based on the Gate Array (or Transistor Array) concept, where multiple implantation layers creating a sea of repeating transistor cell structures are uniform across wafers and customization after each layer transfer is only done through non-repeating metal interconnect layers. Preferably, the entire reticle sized area comprises repeating transistor cell structures. However in some embodiments some specialized circuitry may be included and a small percentage of the reticle on the order of at most about 20% would be devoted to the specialized circuitry.

Figure 93:
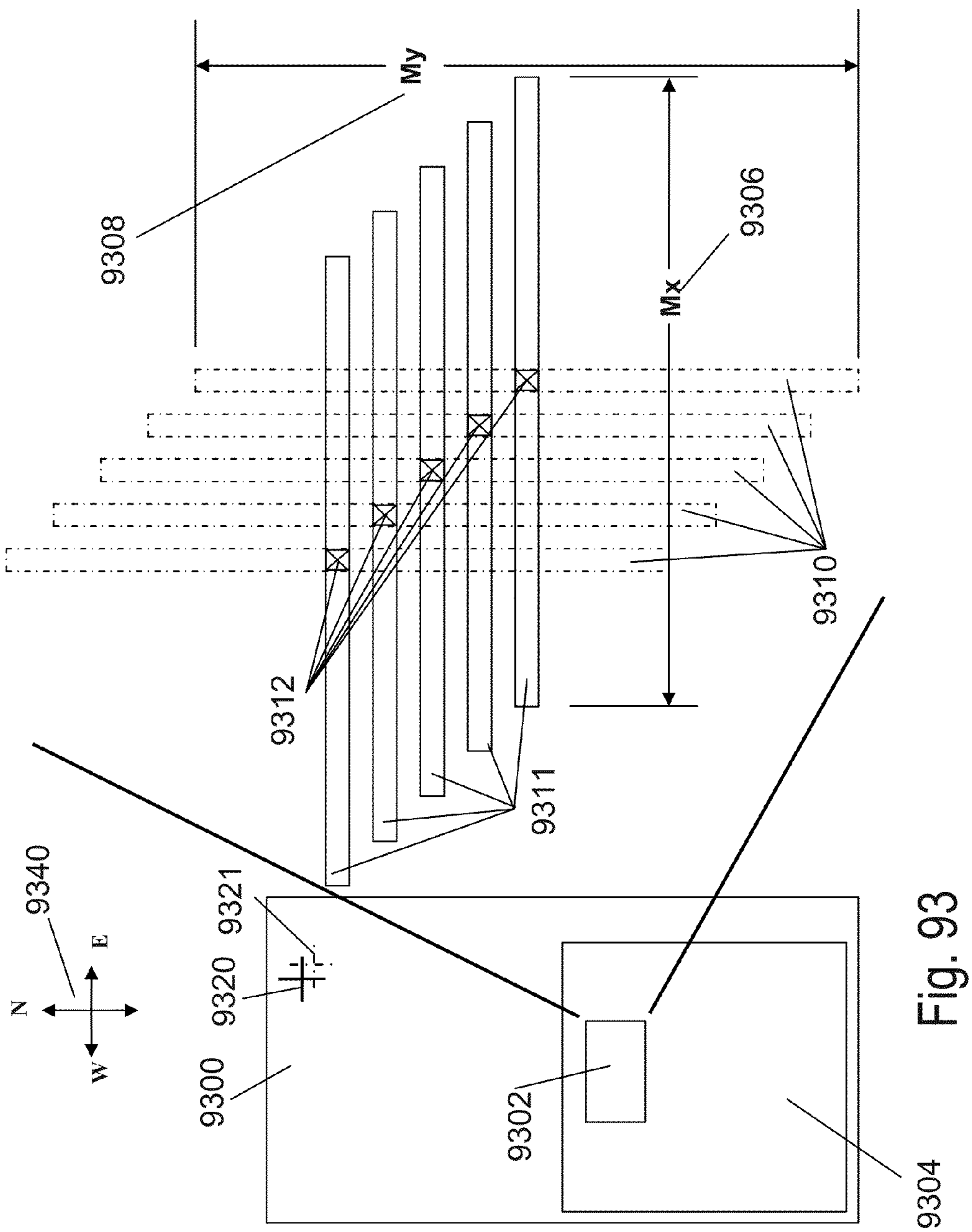

FIG. 93 is a drawing illustration of similar concept of inter-wafer connection applied to large grain non repeating structure 9304 on a donor wafer 9300. Compass rose 9340 is used for orientation, with Donor alignment mark 9320 and Receptor alignment mark 9321. The connectivity structure 9302, which may be inside or outside large grain non repeating structure 9304 boundary, comprises of donor wafer metal strips 9311, aligned to 9320, of length Mx 9306; and of metal strips 9310 on the Receptor wafer, aligned to 9321 and of length My 9308. The lengths Mx and My reflect the worst-case wafer misalignment in east-west and north-south respectively, plus any additional extensions to account for via size and overlap, as well as for wafer warp, bow, and angular wafer misalignment if needed. The inter-wafer vias 9312 will be placed after layer transfer aligned to alignment mark 9320 in north-south direction, and to alignment mark 9321 in east-west direction.

Figure 94A:
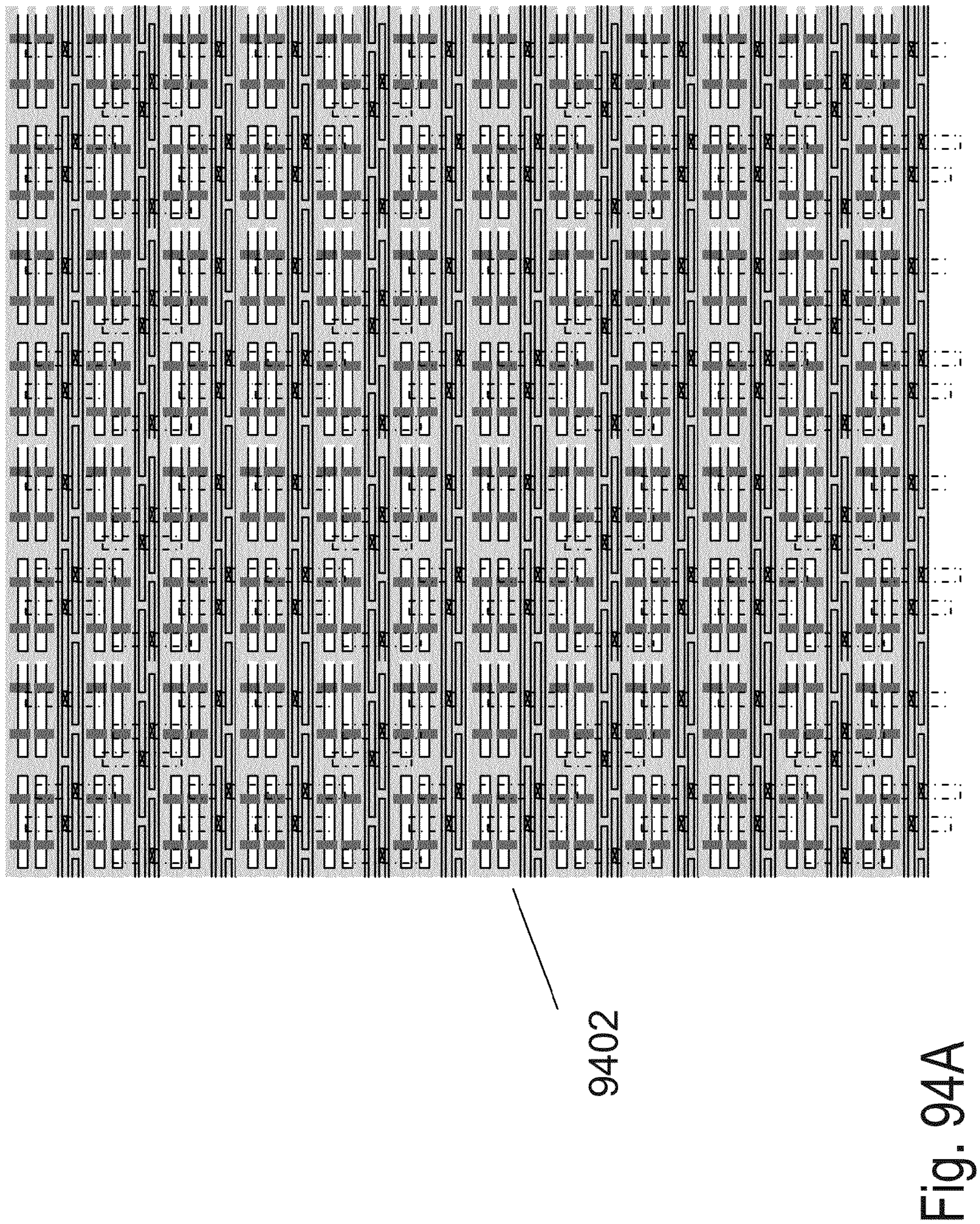
Figure 94B:
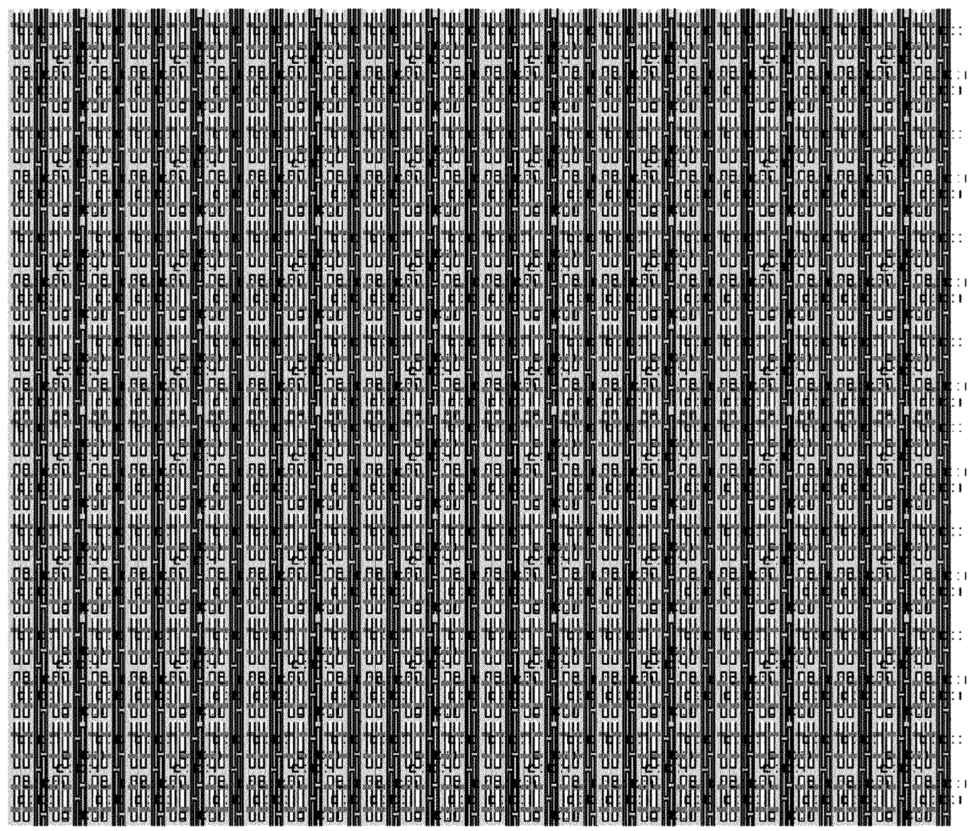
Figure 94C:
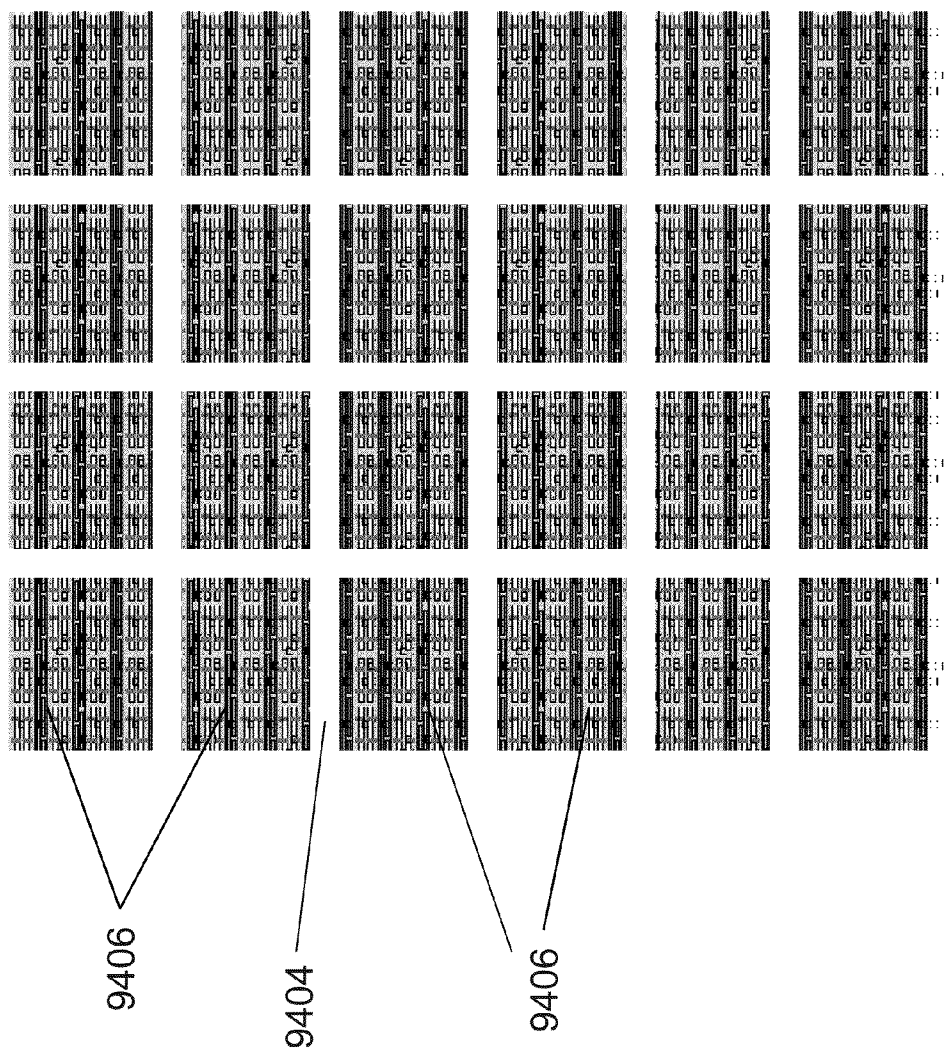

FIG. 94A is a drawing illustration of extending the structure of FIG. 92C to an 8×12 array 9402. This can be extended as in FIG. 94B to fill a full reticle sized area 9403 with the exemplary 8×12 array 9402 pattern of FIG. 94A. Reticle sized area 9403, such as shown by FIG. 94B, may then be repeated across the entire wafer. This is a variation of the Continuous Array as described before in respect to FIG. 83A-F. This alternative embodiment of continuous array as illustrated in FIG. 94B, does not have any potential dicing lines, but rather, may use one or more custom etch steps to define custom dice lines. Accordingly a specific custom device may be diced from the previously generic wafer. The custom dice lines may be created by etching away some of the structures such as transistors of the continuous array as illustrated in FIG. 94C. This custom function etching may have a shape of multiple thin strips 9404 created by a custom mask, such as a dicing line mask, to etch away a portion of the devices. Thus custom forming logic function, blocks, arrays, or devices 9406 (for clarity, not all possible blocks are labeled). A portion of these logic functions, blocks, arrays, or devices 9406 may be interconnected horizontally with metallization and may be connected to circuitry above and below using TSV or utilizing the monolithic 3D variation, including the embodiments in this document. This custom function alternative has some advantages relative to the use of the previously described potential dice lines, such as, the saving of the allocated area for the unused dice lines and the saving of the mask and the processing of the interconnection over the unused dice lines. However, in both variations substantial savings would be achieved relative to the state of the art. The state of art for FPGA vendors, as well as some other products, is that for a product release for a specific process node more than ten variations would be offered by the vendor. These variations use the same logic fabric applied to different devices sizes offering various amount of logic. In many cases, the variation also includes the amount of memories and I/O cells. State of the art IC devices may require more than 30 different masks at a typical total mask set cost of a few million dollars. For a vendor to offer the multiple device option, it would lead to substantial investment in multiple mask sets. The current invention allows the use of a generic continuous array and then a customization process would be applied to construct multiple device sizes out of the same mask set. Therefore, for example, a continuous array as illustrated in FIG. 94B is customized to a specific device size by etching the multiple thin strips 9404 as illustrated in FIG. 94C. This could be done to various types of continuous terrains as illustrated in FIG. 83A-F. Accordingly, wafers may be processed using one generic mask set of more than ten masks and then multiple device offerings may be constructed by few custom function masks which would define specific sizes out of the generic continues array structure. And, accordingly, the wafer may then be diced to a different size for each device offering.

Figure 95A:
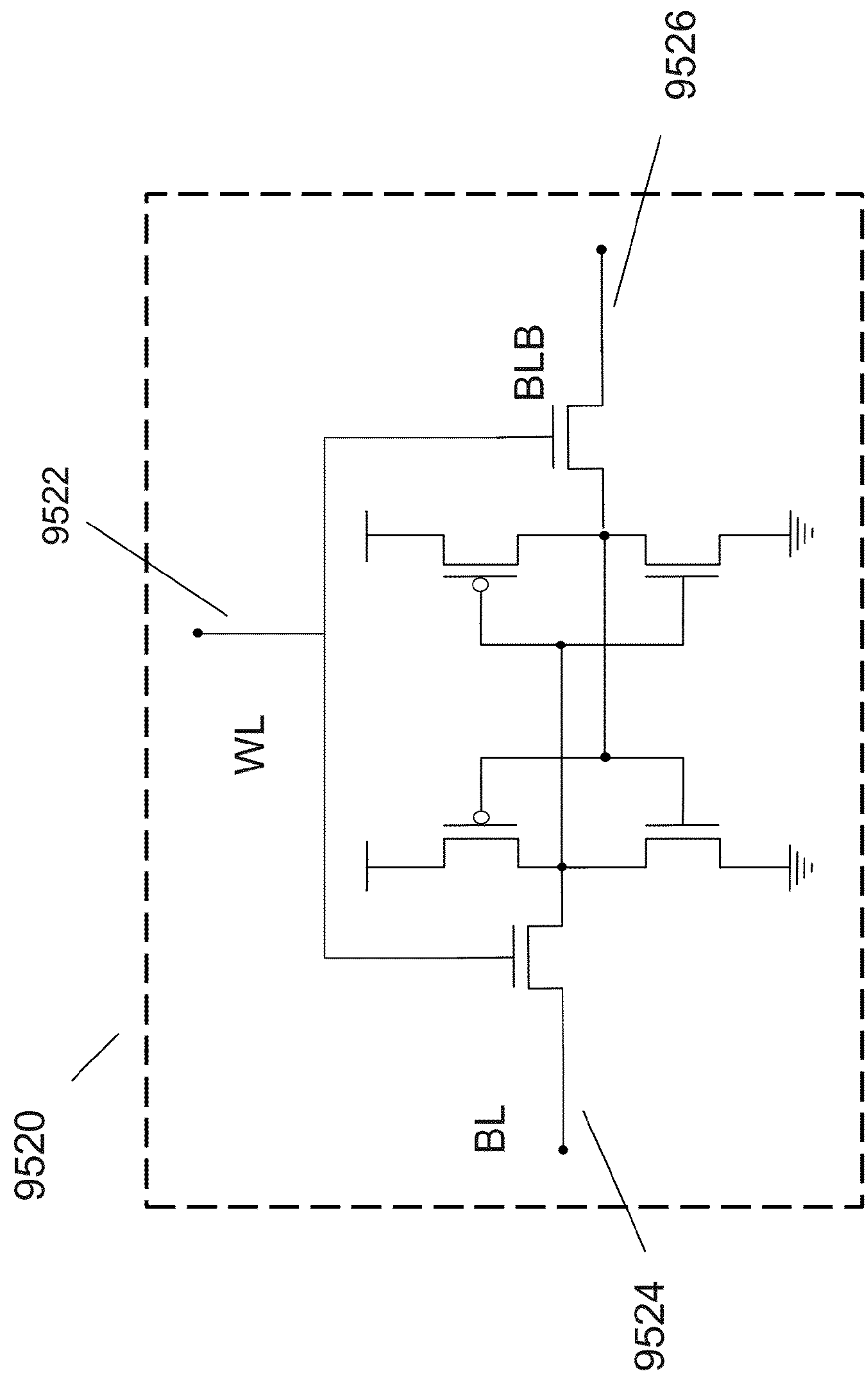
Figure 95B:
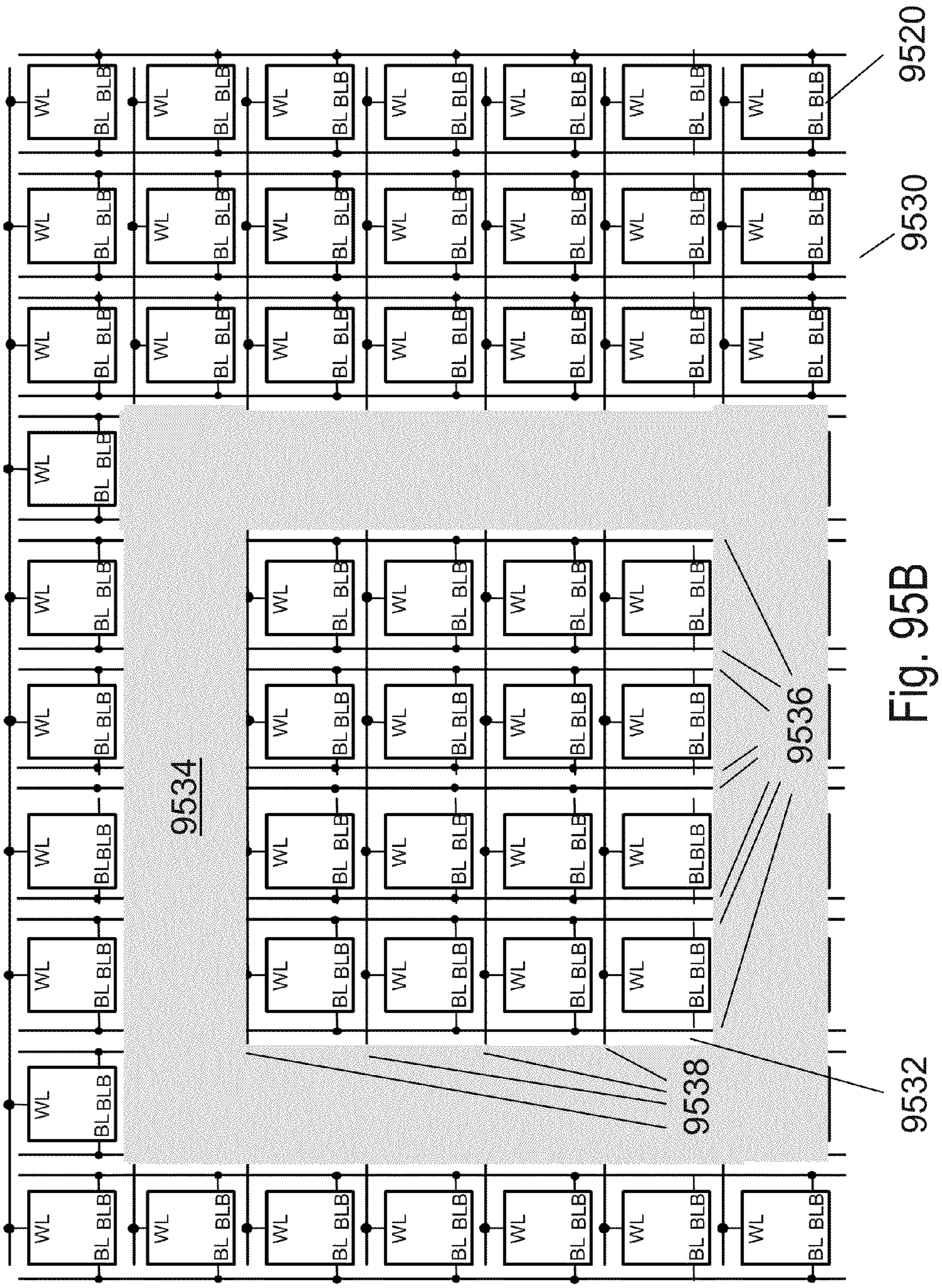
Figure 95C:
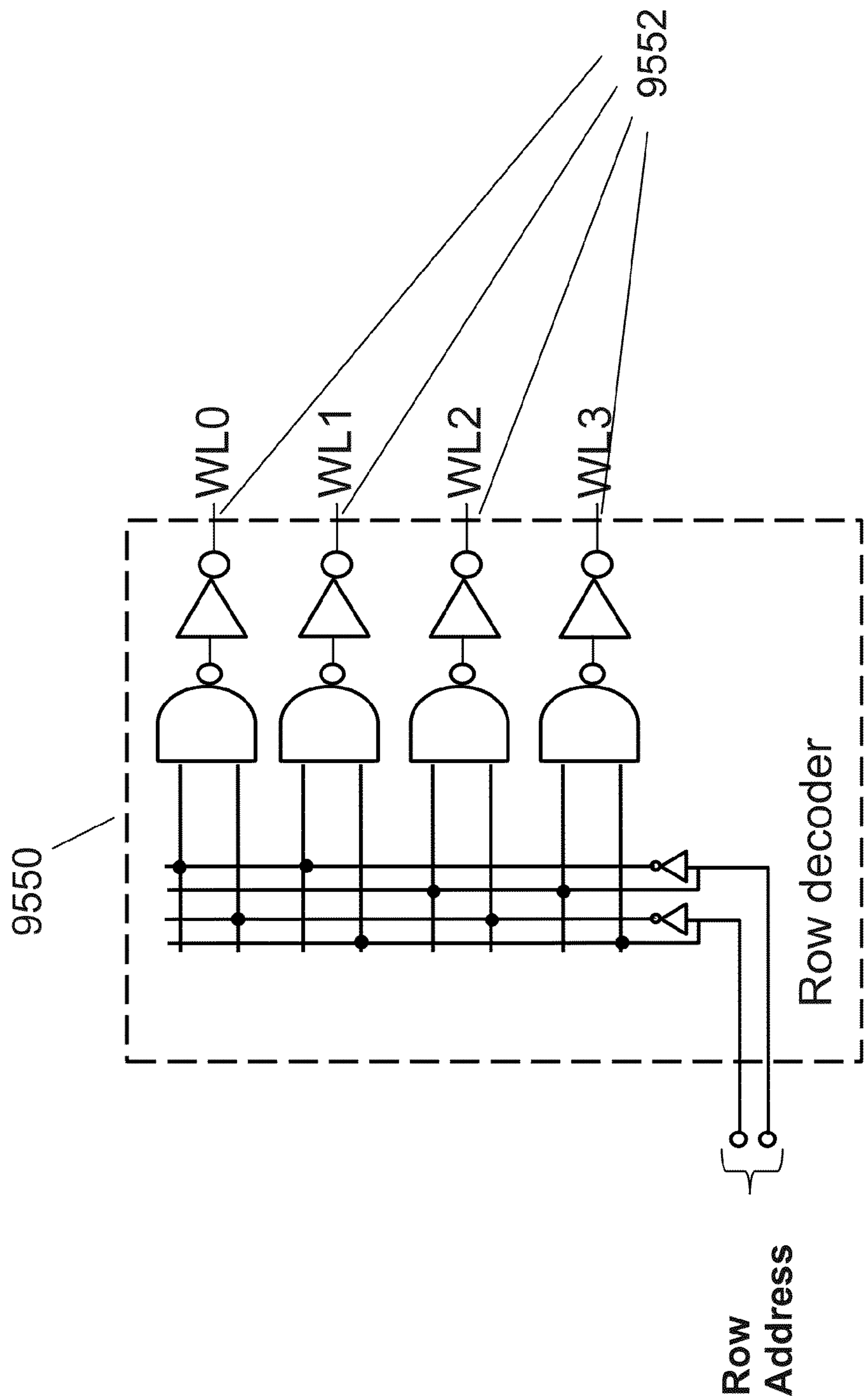
Figure 95D:
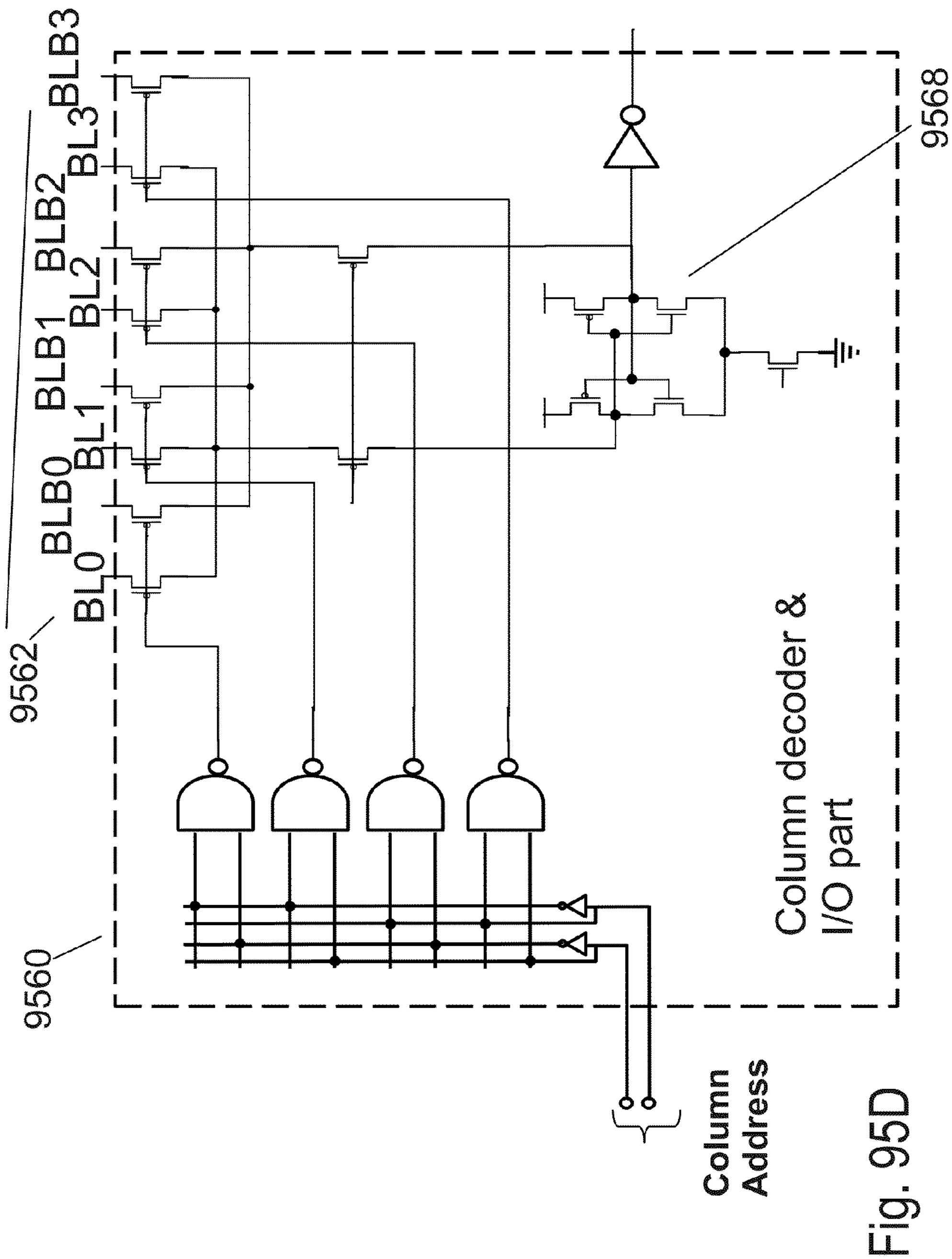

The concept of customizing a Continuous Array can be also applied to logic, memory, I/O and other structures. Memory arrays have non-repetitive elements such as bit and word decoders, or sense amplifiers, which need to be tailored to each memory size. An embodiment of the invention is to tile substantially the entire wafer with a dense pattern of memory cells, and then customize it using selective etching as before, and providing the required non-repetitive structures through an adjacent logic layer below or above the memory layer. FIG. 95A is a drawing illustration of a typical 6-transistor SRAM cell 9520, with its word line 9522, bit line 9524 and bit line inverse 9526. Such a bit cell is typically densely packed and highly optimized for a given process. A dense SRAM array 9530 may be constructed of a plurality of 6-transistor SRAM cell 9520 as illustrated in FIG. 95B. A four by four array 9532 may be defined through custom etching away the cells in channel 9534, leaving bit lines 9536 and word lines 9538 unconnected. These word lines 9538 may be then connected to an adjacent logic layer below or above that may have a word decoder 9550 (depicted in FIG. 95C) that may drive them through outputs 9552. Similarly, the bit lines 9536 may be driven by another decoder such as bit line decoder 9560 (depicted in FIG. 95D) through its outputs 9562. A sense amplifier 9568 is also shown. A critical feature of this approach is that the customized logic, such as word decoder 9550, bit line decoder 9560, and sense amplifier 9568, may be provided from below or above in close vertical proximity to the area where it is needed, thus assuring high performance customized memory blocks.

As illustrated in FIG. 148A, the custom dicing line mask referred to in the FIG. 94C discussion to create multiple thin strips 9404 for etching may be shaped to created chamfered block corners 14802 of custom blocks 14804 to relieve stress. Custom blocks 14804 may include functions, blocks, arrays, or devices of architectures such as logic, FPGA, I/O, or memory.

As illustrated in FIG. 148B, this custom function etching and chamfering may extend thru the BEOL metallization of one device layer of the 3DIC stack as shown in first structure 14850, or extend thru the entire 3DIC stack to the bottom substrate and shown in second structure 14870, or truncate at the isolation of any device layer in the 3D stack as shown in third structure 14860. The cross sectional view of an exemplary 3DIC stack may include second layer BEOL dielectric 14826, second layer interconnect metallization 14824, second layer transistor layer 14822, substrate layer BEOL dielectric 14816, substrate layer interconnect metallization 14814, substrate transistor layer 14812, and substrate 14810.

Passivation of the edge created by the custom function etching may be accomplished as follows. If the custom function etched edge is formed on a layer or strata that is not the topmost one, then it may be passivated or sealed by filling the etched out area with dielectric, such as a Spin-On-Glass (SOG) method, and CMPing flat to continue to the next 3DIC layer transfer. As illustrated in FIG. 148C, the topmost layer custom function etched edge may be passivated with an overlapping layer or layers of material including, for example, oxide, nitride, or polyimide. Oxide may be deposited over custom function etched block edge 14880 and may be lithographically defined and etched to overlap the custom function etched block edge 14880 shown as oxide structure 14884. Silicon nitride may be deposited over wafer and oxide structure 14884, and may be lithographically defined and etched to overlap the custom function etched block edge 14880 and oxide structure 14884, shown as nitride structure 14886.

In such way a single expensive mask set can be used to build many wafers for different memory sizes and finished through another mask set that is used to build many logic wafers that can be customized by few metal layers.

Person skilled in the art will recognize that it is now possible to assemble a true monolithic 3D stack of mono-crystalline silicon layers or strata with high performance devices using advanced lithography that repeatedly reuse same masks, with only few custom metal masks for each device layer. Such person will also appreciate that one can stack in the same way a mix of disparate layers, some carrying transistor array for general logic and other carrying larger scale blocks such as memories, analog elements, Field Programmable Gate Array (FPGA), and I/O. Moreover, such a person would also appreciate that the custom function formation by etching may be accomplished with masking and etching processes such as, for example, a hard-mask and Reactive Ion Etching (RIE), or wet chemical etching, or plasma etching. Furthermore, the passivation or sealing of the custom function etching edge may be stair stepped so to enable improved sidewall coverage of the overlapping layers of passivation material to seal the edge.

Another alternative of the invention for general type of 3D logic IC is presented on FIG. 96A. Here logic is distributed across multiple layers such as 9602, 9612 and 9622. An additional layer of logic ("Repair Layer") 9632 is used to effect repairs as needed in any of logic layers 9602, 9612 or 9622. Repair Layer's essential components include BIST Controller Checker ("BCC") 9634 that has access to I/O boundary scans and to all FF scan chains from logic layers, and uncommitted logic such as Gate Array described above. Such gate array can be customized using custom metal mask. Alternately it can use Direct-Write e-Beam technology such as available from Advantest or Fujitsu to write custom masking patterns in photoresist at each die location to repair the IC directly on the wafer during manufacturing process.

It is important to note that substantially all the sequential cells like, for example, flip flops (FFs), in the logic layers as well as substantially all the primary output boundary scan have certain extra features as illustrated in FIG. 97. Flip flop 9702 shows a possible embodiment and has its output 9704 drive gates in the logic layers, and in parallel it also has vertical stub 9706 raising to the Repair Layer 9632 through as many logic layers as required such as logic layers 9602 and 9612. In addition to any other scan control circuitry that may be necessary, flip flop 9702 also has an additional multiplexer 9714 at its input to allow selective or programmable coupling of replacement circuitry on the Repair Layer to flip flop 9702 D input. One of the multiplexer inputs 9710 can be driven from the Repair Layer, as can multiplexer control 9708. By default, when 9708 is not driven, multiplexer control is set to steer the original logic node 9712 to feed the FF, which is driven from the preceding stages of logic. If a repair circuit is to replace the original logic coupled to original logic node 9712, a programmable element like, for example, a latch, an SRAM bit, an antifuse, a flash memory bit, a fuse, or a metal link defined by the Direct-Write e-Beam repair, is used to control multiplexer control 9708. A similar structure comprising of input multiplexer 9724, inputs 9726 and 9728, and control input 9730 is present in substantively every primary output 9722 boundary scan cell 9720, in addition to its regular boundary scan function, which allows the primary outputs to be driven by the regular input 9726 or replaced by input 9728 from the Repair Layer as needed.

The way the repair works can be now readily understood from FIG. 96A. To maximize the benefit from this repair approach, designs need to be implemented as partial or full scan designs. Scan outputs are available to the BCC on the Repair Layer, and the BCC can drive the scan chains. The uncommitted logic on the Repair Layer can be finalized by processing a high metal or via layer, for example a via between layer 5 and layer 6 ("VIA6"), while the BCC is completed with metallization prior to that via, up to metal 5 in this example. During manufacturing, after the IC has been finalized to metal 5 of the repair layer, the chips on the wafer are powered up through a tester probe, the BIST is executed, and faulty FFs are identified. This information is transmitted by BCC to the external tester, and is driving the repair cycle. In the repair cycle the logic cone that feeds the faulty FF is identified, the net-list for the circuit is analyzed, and the faulty logic cone is replicated on the Repair Layer using Direct-Write e-Beam technology to customize the uncommitted logic through writing VIA6, and the replicated output is fed down to the faulty FF from the Repair Layer replacing the original faulty logic cone. It should be noted that because the physical location of the replicated logic cone can be made to be approximately the same as the original logic cone and just vertically displaced, the impact of the repaired logic on timing should be minimal. In alternate implementation additional features of uncommitted logic such as availability of variable strength buffers, may be used to create repair replica of the faulty logic cone that will be slightly faster to compensate for the extra vertical distance.

People skilled in the art will appreciate that Direct-Write e-Beam customization can be done on any metal or via layer as long as such layer is fabricated after the BCC construction and metallization is completed. They will also appreciate that for this repair technique to work the design can have sections of logic without scan, or without special circuitry for FFs such as described in FIG. 97. Absence of such features in some portion of the design will simply reduce the effectiveness of the repair technique. Alternatively, the BCC can be implemented on one or more of the Logic Layers, or the BCC function can be performed using an external tester through JTAG or some other test interface. This allows full customization of all contact, metal and via layers of the Repair Layer.

FIG. 96B is a drawing illustration of the concept that it may be beneficial to chain FFs on each logic layer separately before feeding the scan chains outputs to the Repair Layer because this may allow testing the layer for integrity before continuing with 3D IC assembly.

It should be noted that the repair flow just described can be used to correct not only static logic malfunctions but also timing malfunctions that may be discovered through the scan or BIST test. Slow logic cones may be replaced with faster implementations constructed from the uncommitted logic on the Repair Layer further improving the yield of such complex systems.

FIG. 96C is a drawing illustration of an alternative implementation of the invention where the ICs on the wafer may be powered and tested through contactless means instead of making physical contact with the wafer, such as with probes, avoiding potential damage to the wafer surface. One of the active layers of the 3D IC may include Radio Frequency ("RF") antenna 96CO2 and RF to Direct Current ("DC") converter 96C04 that powers the power supply unit 96C06. Using this technique the wafer can be powered in a contactless manner to perform self-testing. The results of such self-testing can be communicated with computing devices external to the wafer under test using RF module 96C14.

An alternative embodiment of the invention may use a small photovoltaic cell 96C10 to power the power supply unit instead of RF induction and RF to DC converter.

An alternative approach to increase yield of complex systems through use of 3D structure is to duplicate the same design on two layers vertically stacked on top of each other and use BIST techniques similar to those described in the previous sections to identify and replace malfunctioning logic cones. This should prove particularly effective repairing very large ICs with very low yields at manufacturing stage using one-time, or hard to reverse, repair structures such as antifuses or Direct-Write e-Beam customization. Similar repair approaches can also assist systems that may need a self-healing ability at every power-up sequence through use of memory-based repair structures as described with regard to FIG. 98 below.

FIG. 98 is a drawing illustration of one possible implementation of this concept. Two vertically stacked logic layers 9801 and 9802 implement essentially an identical design. The design (same on each layer) is scan-based and includes BIST Controller/Checker on each layer 9851 and 9852 that can communicate with each other either directly or through an external tester. 9821 is a representative FF on the first layer that has its corresponding flip flop 9822 on layer 2, each fed by its respective identical logic cones 9811 and 9812. The output of flip flop 9821 is coupled to the A input of multiplexer 9831 and the B input of multiplexer 9832 through vertical connection 9806, while the output of flip flop 9822 is coupled to the A input of multiplexer 9832 and the B input of multiplexer 9831 through vertical connection 9805. Each such output multiplexer is respectively controlled from control points 9841 and 9842, and multiplexer outputs drive the respective following logic stages at each layer. Thus, either logic cone 9811 and flip flop 9821 or logic cone 9812 and flip flop 9822 may be either programmably coupleable or selectively coupleable to the following logic stages at each layer.

It should be noted that the multiplexer control points 9841 and 9842 can be implemented using a memory cell, a fuse, an Antifuse, or any other customizable element such as metal link that can be customized by a Direct-Write e-Beam machine. If a memory cell is used, its contents can be stored in a ROM, a flash memory, or in some other non-volatile storage mechanism elsewhere in the 3D IC or in the system in which it is deployed and loaded upon a system power up, a system reset, or on-demand during system maintenance.

Upon power on the BCC initializes all multiplexer controls to select inputs A and runs diagnostic test on the design on each layer. Failing FF are identified at each logic layer using scan and BIST techniques, and as long as there is no pair of corresponding FF that fails, the BCCs can communicate with each other (directly or through an external tester) to determine which working FF to use and program the multiplexer controls 9841 and 9842 accordingly.

It should be noted that if multiplexer controls 9841 and 9842 are reprogrammable as in using memory cells, such test and repair process can potentially occur at every power on instance, or on demand, and the 3D IC can self-repair in-circuit. If the multiplexer controls are one-time programmable, the diagnostic and repair process may need to be performed using external equipment. It should be noted that the techniques for contact-less testing and repair as previously described with regard to FIG. 96C can be applicable in this situation.

An alternative embodiment of this concept can use multiplexer 9714 at the inputs of the FF such as described in FIG. 97. In that case both the Q and the inverted Q of FFs may be used, if present.

Person skilled in the art will appreciate that this repair technique of selecting one of two possible outputs from two essentially similar blocks vertically stacked on top of each other can be applied to other type of blocks in addition to FF described above. Examples of such include, but are not limited to, analog blocks, I/O, memory, and other blocks. In such cases the selection of the working output may lead to specialized multiplexing but it does not change its essential nature.

Such person will also appreciate that once the BIST diagnosis of both layers is complete, a mechanism similar to the one used to define the multiplexer controls can be also used to selectively power off unused sections of a logic layers to save on power dissipation.

Yet another variation on the invention is to use vertical stacking for on the fly repair using redundancy concepts such as Triple (or higher) Modular Redundancy ("TMR"). TMR is a well known concept in the high-reliability industry where three copies of each circuit are manufactured and their outputs are channeled through a majority voting circuitry. Such TMR system will continue to operate correctly as long as no more than a single fault occurs in any TMR block. A major problem in designing TMR ICs is that when the circuitry is triplicated the interconnections become significantly longer slowing down the system speed, and the routing becomes more complex slowing down system design. Another major problem for TMR is that its design process is expensive because of correspondingly large design size, while its market is limited.

Vertical stacking offers a natural solution of replicating the system image on top of each other. FIG. 99 is a drawing illustration of such system with three layers 9901 9902 9903, where combinatorial logic is replicated such as in logic cones 9911-1, 9911-2, and 9911-3, and FFs are replicated such as 9921-1, 9921-2, and 9921-3. One of the layers, 9901 in this depiction, includes a majority voting circuitry 9931 that arbitrates among the local FF output 9951 and the vertically stacked FF outputs 9952 and 9953 to produce a final fault tolerant FF output that needs to be distributed to all logic layers as 9941-1, 9941-2, 9941-3.

Person skilled in the art will appreciate that variations on this configuration are possible such as dedicating a separate layer just to the voting circuitry that will make layers 9901, 9902 and 9903 logically identical; relocating the voting circuitry to the input of the FFs rather than to its output; or extending the redundancy replication to more than 3 instances (and stacked layers).

The abovementioned method for designing TMR addresses both of the mentioned weaknesses. First, there is essentially no additional routing congestion in any layer because of TMR, and the design at each layer can be optimally implemented in a single image rather than in triplicate. Second, any design implemented for non high-reliability market can be converted to TMR design with minimal effort by vertical stacking of three original images and adding a majority voting circuitry either to one of the layers, to all three layers as in FIG. 99, or as a separate layer. A TMR circuit can be shipped from the factory with known errors present (masked by the TMR redundancy), or a Repair Layer can be added to repair any known errors for an even higher degree of reliability.

The exemplary embodiments discussed so far are primarily concerned with yield enhancement and repair in the factory prior to shipping a 3D IC to a customer. Another embodiment of the invention is providing redundancy and self-repair once the 3D IC is deployed in the field. This is a desirable product characteristic because defects may occur in products that tested as operating correctly in the factory. For example, this can occur due to a delayed failure mechanism such as a defective gate dielectric in a transistor that develops into a short circuit between the gate and the underlying transistor source, drain or body. Immediately after fabrication such a transistor may function correctly during factory testing, but with time and applied voltages and temperatures, the defect can develop into a failure which may be detected during subsequent tests in the field. Many other delayed failure mechanisms are known. Regardless of the nature of the delayed defect, if it creates a logic error in the 3D IC then subsequent testing according to the invention may be used to detect and repair it.

FIG. 103 illustrates an exemplary 3D IC generally indicated by 10300 according to the invention. 3D IC 10300 comprises two layers labeled Layer 1 and Layer 2 and separated by a dashed line in the figure. Layer 1 and Layer 2 may be bonded together into a single 3D IC using methods known in the art. The electrical coupling of signals between Layer 1 and Layer 2 may be realized with Through-Silicon Via (TSV) or some other interlayer technology. Layer 1 and Layer 2 may each comprise a single layer of semiconductor devices called a Transistor Layer and its associated interconnections (typically realized in one or more physical Metal Layers) which are called Interconnection Layers. The combination of a Transistor Layer and one or more Interconnection Layers is called a Circuit Layer. Layer 1 and Layer 2 may each comprise one or more Circuit Layers of devices and interconnections as a matter of design choice.

Regardless of the details of their construction, Layer 1 and Layer 2 in 3D IC 10300 perform substantially identical logic functions. In some embodiments, Layer 1 and Layer 2 may each be fabricated using the same masks for all layers to reduce manufacturing costs. In other embodiments there may be small variations on one or more mask layers. For example, there may be an option on one of the mask layers which creates a different logic signal on each layer which tells the control logic blocks on Layer 1 and Layer 2 that they are the controlling Layer 1 and Layer 2 respectively in cases where this is important. Other differences between the layers may be present as a matter of design choice.

Layer 1 comprises Control Logic 10310, representative scan flip flops 10311, 10312 and 10313, and representative combinational logic clouds 10314 and 10315, while Layer 2 comprises Control Logic 10320, representative scan flip flops 10321, 10322 and 10323, and representative logic clouds 10324 and 10325. Control Logic 10310 and scan flip flops 10311, 10312 and 10313 are coupled together to form a scan chain for set scan testing of combinational logic clouds 10314 and 10315 in a manner previously described. Control Logic 10320 and scan flip flops 10321, 10322 and 10323 are also coupled together to form a scan chain for set scan testing of combinational logic clouds 10324 and 10325. Control Logic blocks 10310 and 10320 are coupled together to allow coordination of the testing on both Layers. In some embodiments, Control Logic blocks 10310 and 10320 may be able to test either themselves or each other. If one of them is bad, the other can be used to control testing on both Layer 1 and Layer 2.

Persons of ordinary skill in the art will appreciate that the scan chains in FIG. 103 are representative only, that in a practical design there may be millions of flip flops which may be broken into multiple scan chains, and the inventive principles disclosed herein apply regardless of the size and scale of the design.

As with previously described embodiments, the Layer 1 and Layer 2 scan chains may be used in the factory for a variety of testing purposes. For example, Layer 1 and Layer 2 may each have an associated Repair Layer (not shown in FIG. 103) which was used to correct any defective logic cones or logic blocks which originally occurred on either Layer 1 or Layer 2 during their fabrication processes. Alternatively, a single Repair Layer may be shared by Layer 1 and Layer 2.

FIG. 104 illustrates exemplary scan flip flop 10400 (surrounded by the dashed line in the figure) suitable for use with the invention. Scan flip flop 10400 may be used for the scan flip flop instances 10311, 10312, 10313, 10321, 10322 and 10323 in FIG. 103. Present in FIG. 104 is D-type flip flop 10402 which has a Q output coupled to the Q output of scan flip flop 10400, a D input coupled to the output of multiplexer 10404, and a clock input coupled to the CLK signal. Multiplexer 10404 also has a first data input coupled to the output of multiplexer 10406, a second data input coupled to the SI (Scan Input) input of scan flip flop 10400, and a select input coupled to the SE (Scan Enable) signal. Multiplexer 10406 has a first and second data inputs coupled to the D0 and D1 inputs of scan flip flop 10400 and a select input coupled to the LAYER_SEL signal.

The SE, LAYER_SEL and CLK signals are not shown coupled to input ports on scan flip flop 10400 to avoid over complicating the disclosure—particularly in drawings like FIG. 103 where multiple instances of scan flip flop 10400 appear and explicitly routing them would detract from the concepts being presented. In a practical design, all three of those signals are typically coupled to an appropriate circuit for every instance of scan flip flop 10400.

When asserted, the SE signal places scan flip flop 10400 into scan mode causing multiplexer 10404 to gate the SI input to the D input of D-type flip flop 10402. Since this signal goes to all scan flip flops 10400 in a scan chain, this has the effect of connecting them together as a shift register allowing vectors to be shifted in and test results to be shifted out. When SE is not asserted, multiplexer 10404 selects the output of multiplexer 10406 to present to the D input of D-type flip flop 10402.

The CLK signal is shown as an "internal" signal here since its origin will differ from embodiment to embodiment as a matter of design choice. In practical designs, a clock signal (or some variation of it) is typically routed to every flip flop in its functional domain. In some scan test architectures, CLK will be selected by a third multiplexer (not shown in FIG. 104) from a domain clock used in functional operation and a scan clock for use in scan testing. In such cases, the SCAN_EN signal will typically be coupled to the select input of the third multiplexer so that D-type flip flop 10402 will be correctly clocked in both scan and functional modes of operation. In other scan architectures, the functional domain clock is used as the scan clock during test modes and no additional multiplexer is needed. Persons of ordinary skill in the art will appreciate that many different scan architectures are known and will realize that the particular scan architecture in any given embodiment will be a matter of design choice and in no way limits the invention.

The LAYER_SEL signal determines the data source of scan flip flop 10400 in normal operating mode. As illustrated in FIG. 103, input D1 is coupled to the output of the logic cone of the Layer (either Layer 1 or Layer 2) where scan flip flop 10400 is located, while input D0 is coupled to the output of the corresponding logic cone on the other Layer. The default value for LAYER_SEL is thus logic-1 which selects the output from the same Layer. Each scan flip flop 10400 has its own unique LAYER_SEL signal. This allows a defective logic cone on one Layer to be programmably or selectively replaced by its counterpart on the other Layer. In such cases, the signal coupled to D1 being replaced is called a Faulty Signal while the signal coupled to D0 replacing it is called a Repair Signal.

FIG. 105A illustrates an exemplary 3D IC generally indicated by 10500. Like the embodiment of FIG. 103, 3D IC 10500 comprises two Layers labeled Layer 1 and Layer 2 and separated by a dashed line in the drawing figure. Layer 1 comprises Layer 1 Logic Cone 10510, scan flip flop 10512, and XOR gate 10514, while Layer 2 comprises Layer 2 Logic Cone 10520, scan flip flop 10522, and XOR gate 10524. The scan flip flop 10400 of FIG. 104 may be used for scan flip flops 10512 and 10522, though the SI and other internal connections are not shown in FIG. 105A. The output of Layer 1 Logic Cone 10510 (labeled DATA1 in the drawing figure) is coupled to the D1 input of scan flip flop 10512 on Layer 1 and the D0 input of scan flip flop 10522 on Layer 2. Similarly, the output of Layer 2 Logic Cone 10520 (labeled DATA2 in the drawing figure) is coupled to the D1 input of scan flip flop 10522 on Layer 2 and the D0 input of scan flip flop 10512 on Layer 1. Each of the scan flip flops 10512 and 10522 has its own LAYER_SEL signal (not shown in FIG. 105A) that selects between its D0 and D1 inputs in a manner similar to that illustrated in FIG. 104.

XOR gate 10514 has a first input coupled to DATA1, a second input coupled to DATA2, and an output coupled to signal ERROR1. Similarly, XOR gate 10524 has a first input coupled to DATA2, a second input coupled to DATA1, and an output coupled to signal ERROR2. If the logic values present on the signals on DATA1 and DATA2 are not equal, ERROR1 and ERROR2 will equal logic-1 signifying there is a logic error present. If the signals on DATA1 and DATA2 are equal, ERROR1 and ERROR2 will equal logic-0 signifying there is no logic error present. Persons of ordinary skill in art will appreciate that the underlying assumption here is that only one of the Logic Cones 10510 and 10520 will be bad simultaneously. Since both Layer 1 and Layer 2 have already been factory tested, verified and, in some embodiments, repaired, the statistical likelihood of both logic cones developing a failure in the field is extremely unlikely even without any factory repair, thus validating the assumption.

In 3D IC 10500, the testing may be done in a number of different ways as a matter of design choice. For example, the clock could be stopped occasionally and the status of the ERROR1 and ERROR2 signals monitored in a spot check manner during a system maintenance period. Alternatively, operation can be halted and scan vectors run with a comparison done on every vector. In some embodiments a BIST testing scheme using Linear Feedback Shift Registers to generate pseudo-random vectors for Cyclic Redundancy Checking may be employed. These methods all involve stopping system operation and entering a test mode. Other methods of monitoring possible error conditions in real time will be discussed below.

In order to effect a repair in 3D IC 10500, two determinations are typically made: (1) the location of the logic cone with the error, and (2) which of the two corresponding logic cones is operating correctly at that location. Thus a method of monitoring the ERROR1 and ERROR2 signals and a method of controlling the LAYER_SEL signals of scan flip flops 10512 and 10522 are may be needed, though there are other approaches. In a practical embodiment, a method of reading and writing the state of the LAYER_SEL signal may be needed for factory testing to verify that Layer 1 and Layer 2 are both operating correctly.

Typically, the LAYER_SEL signal for each scan flip flop will be held in a programmable element like, for example, a volatile memory circuit like a latch storing one bit of binary data (not shown in FIG. 105A). In some embodiments, the correct value of each programmable element or latch may be determined at system power up, at a system reset, or on demand as a routine part of system maintenance. Alternatively, the correct value for each programmable element or latch may be determined at an earlier point in time and stored in a non-volatile medium like a flash memory or by programming antifuses internal to 3D IC 10500, or the values may be stored elsewhere in the system in which 3D IC 10500 is deployed. In those embodiments, the data stored in the non-volatile medium may be read from its storage location in some manner and written to the LAYER_SEL latches.

Various methods of monitoring ERROR1 and ERROR2 are possible. For example, a separate shift register chain on each Layer (not shown in FIG. 105A) could be employed to capture the ERROR1 and ERROR2 values, though this would carry a significant area penalty. Alternatively, the ERROR1 and ERROR2 signals could be coupled to scan flip flops 10512 and 10522 respectively (not shown in FIG. 105A), captured in a test mode, and shifted out. This would carry less overhead per scan flip flop, but would still be expensive.

The cost of monitoring the ERROR1 and ERROR2 signals can be reduced further if it is combined with the circuitry necessary to write and read the latches storing the LAYER_SEL information. In some embodiments, for example, the LAYER_SEL latch may be coupled to the corresponding scan flip flop 10400 and have its value read and written through the scan chain. Alternatively, the logic cone, the scan flip flop, the XOR gate, and the LAYER_SEL latch may all be addressed using the same addressing circuitry.

Illustrated in FIG. 105B is circuitry for monitoring ERROR2 and controlling its associated LAYER_SEL latch by addressing in 3D IC 10500. Present in FIG. 105B is 3D IC 10500, a portion of the Layer 2 circuitry discussed in FIG. 105A including scan flip flop 10522 and XOR gate 10524. A substantially identical circuit (not shown in FIG. 105B) will be present on Layer 1 involving scan flip flop 10512 and XOR gate 10514.

Also present in FIG. 105B is LAYER_SEL latch 10570 which is coupled to scan flip flop 10522 through the LAYER_SEL signal. The value of the data stored in latch 10570 determines which logic cone is used by scan flip flop 10522 in normal operation. Latch 10570 is coupled to COL_ADDR line 10574 (the column address line), ROW_ADDR line 10576 (the row address line) and COL_BIT line 10578. These lines may be used to read and write the contents of latch 10570 in a manner similar to any SRAM circuit known in the art. In some embodiments, a complementary COL_BIT line (not shown in FIG. 105B) with inverted binary data may be present. In a logic design, whether implemented in full custom, semi-custom, gate array or ASIC design or some other design methodology, the scan flip flops will not line up neatly in rows and columns the way memory cells do in a memory block. In some embodiments, a tool may be used to assign the scan flip flops into virtual rows and columns for addressing purposes. Then the various virtual row and column lines would be routed like any other signals in the design.

The ERROR2 line 10572 may be read at the same address as latch 10570 using the circuit comprising N-channel transistors 10582, 10584 and 10586 and P channel transistors 10590 and 10592. N-channel transistor 10582 has a gate terminal coupled to ERROR2 line 10572, a source terminal coupled to ground, and a drain terminal coupled to the source of N-channel transistor 10584. N-channel transistor 10584 has a gate terminal coupled to COL_ADDR line 10574, a source terminal coupled to N-channel transistor 10582, and a drain terminal coupled to the source of N-channel transistor 10586. N-channel transistor 10586 has a gate terminal coupled to ROW_ADDR line 10576, a source terminal coupled to the drain N-channel transistor 10584, and a drain terminal coupled to the drain of P-channel transistor 10590 and the gate of P-channel transistor 10592 through line 10588. P-channel transistor 10590 has a gate terminal coupled to ground, a source terminal coupled to the positive power supply, and a drain terminal coupled to line 10588. P-channel transistor 10592 has a gate terminal coupled to line 10588, a source terminal coupled to the positive power supply, and a drain terminal coupled to COL_BIT line 10578.

If the particular ERROR2 line 10572 in FIG. 105B is not addressed (i.e., either COL_ADDR line 10574 equals the ground voltage level (logic-0) or ROW_ADDR line 10576 equals the ground voltage supply voltage level (logic-0)), then the transistor stack comprising the three N-channel transistors 10582, 10584 and 10586 will be non-conductive. The P-channel transistor 10590 functions as a weak pull-up device pulling the voltage level on line 10588 to the positive power supply voltage (logic-1) when the N-channel transistor stack is non-conductive. This causes P-channel transistor 10592 to be non-conductive presenting high impedance to COL_BIT line 10578.

A weak pull-down (not shown in FIG. 105B) is coupled to COL_BIT line 10578. If all the memory cells coupled to COL_BIT line 10578 present high impedance, then the weak pull-down will pull the voltage level to ground (logic-0).

If the particular ERROR2 line 10572 in FIG. 105B is addressed (i.e., both COL_ADDR line 10574 and ROW_ADDR line 10576 are at the positive power supply voltage level (logic-1)), then the transistor stack comprising the three N-channel transistors 10582, 10584 and 10586 will be non-conductive if ERROR2=logic-0 and conductive if ERROR2=logic-1. Thus the logic value of ERROR2 may be propagated through P-channel transistors 10590 and 10592 and onto the COL_BIT line 10578.

An advantage of the addressing scheme of FIG. 105B is that a broadcast ready mode is available by addressing all of the rows and columns simultaneously and monitoring all of the column bit lines 10578. If all the column bit lines 10578 are logic-0, all of the ERROR2 signals are logic-0 meaning there are no bad logic cones present on Layer 2. Since field correctable errors will be relatively rare, this can save a lot of time locating errors relative to a scan flip flop chain approach. If one or more bit lines is logic-1, faulty logic cones will only be present on those columns and the row addresses can be cycled quickly to find their exact addresses. Another advantage of the scheme is that large groups or all of the LAYER_SEL latches can be initialized simultaneously to the default value of logic-1 quickly during a power up or reset condition.

At each location where a faulty logic cone is present, if any, the defect is isolated to a particular layer so that the correctly functioning logic cone may be selected by the corresponding scan flip flop on both Layer 1 and Layer 2. If a large non-volatile memory is present in the 3D IC 10500 or in the external system, then automatic test pattern generated (ATPG) vectors may be used in a manner similar to the factory repair embodiments. In this case, the scan itself is capable of identifying both the location and the correctly functioning layer. Unfortunately, this may lead to a large number of vectors and a correspondingly large amount of available non-volatile memory which may not be available in all embodiments.

Using some form of Built In Self Test (BIST) has the advantage of being self contained inside 3D IC 10500 without needing the storage of large numbers of test vectors. Unfortunately, BIST tests tend to be of the “go” or “no go” variety. They identify the presence of an error, but are not particularly good at diagnosing either the location or the nature of the fault. Fortunately, there are ways to combine the monitoring of the error signals previously described with BIST techniques and appropriate design methodology to quickly determine the correct values of the LAYER_SEL latches.

FIG. 106 illustrates an exemplary portion of the logic design implemented in a 3D IC such as 10300 of FIG. 103 or 10500 of FIG. 105A. The logic design is present on both Layer 1 and Layer 2 with substantially identical gate-level implementations. Preferably, all of the flip flops (not illustrated in FIG. 106) in the design are implemented using scan flip flops similar or identical in function to scan flip flop 10400 of FIG. 104. Preferably, all of the scan flip flops on each Layer have the sort of interconnections with the corresponding scan flip flop on the other Layer as described in conjunction with FIG. 105A. Preferably, each scan flip flop will have an associated error signal generator (e.g., an XOR gate) for detecting the presence of a faulty logic cone, and a LAYER_SEL latch to control which logic cone is fed to the flip flop in normal operating mode as described in conjunction with FIGS. 105A and 105B.

Present in FIG. 106 is an exemplary logic function block (LFB) 10600. Typically LFB 10600 has a plurality of inputs, an exemplary instance being indicated by reference number 10602, and a plurality of outputs, an exemplary instance being indicated by reference number 10604. Preferably LFB 10600 is designed in a hierarchical manner, meaning that it typically has smaller logic function blocks such as 10610 and 10620 instantiated within it. Circuits internal to LFBs 10610 and 10620 are considered to be at a “lower” level of the hierarchy than circuits present in the “top” level of LFB 10600 which are considered to be at a “higher” level in the hierarchy. LFB 10600 is exemplary only. Many other configurations are possible. There may be more (or less) than two LFBs instantiated internal to LFB 10600. There may also be individual logic gates and other circuits instantiated internal to LFB 10600 not shown in FIG. 106 to avoid overcomplicating the disclosure. LFBs 10610 and 10620 may have internally instantiated even smaller blocks forming even lower levels in the hierarchy. Similarly, Logic Function Block 10600 may itself be instantiated in another LFB at an even higher level of the hierarchy of the overall design.

Present in LFB 10600 is Linear Feedback Shift Register (LFSR) 10630 circuit for generating pseudo-random input vectors for LFB 10600 in a manner well known in the art. In FIG. 106 one bit of LFSR 10630 is associated with each of the inputs 10602 of LFB 10600. If an input 10602 couples directly to a flip flop (preferably a scan flip flop similar to 10400) then that scan flip flop may be modified to have the additional LFSR functionality to generate pseudo-random input vectors. If an input 10602 couples directly to combinatorial logic, it will be intercepted in test mode and its value determined and replaced by a corresponding bit in LFSR 10630 during testing. Alternatively, the LFSR 10630 circuit will intercept all input signals during testing regardless of the type of circuitry it connects to internal to LFB 10600.

Thus during a BIST test, all the inputs of LFB 10600 may be exercised with pseudo-random input vectors generated by LFSR 10630. As is known in the art, LFFR 10630 may be a single LFSR or a number of smaller LFSRs as a matter of design choice. LFSR 10630 is preferably implemented using a primitive polynomial to generate a maximum length sequence of pseudo-random vectors. LFSR 10630 needs to be seeded to a known value, so that the sequence of pseudo-random vectors is deterministic. The seeding logic can be inexpensively implemented internal to the LFSR 10630 flip flops and initialized, for example, in response to a reset signal.

Also present in LFB 10600 is Cyclic Redundancy Check (CRC) 10632 circuit for generating a signature of the LFB 10600 outputs generated in response to the pseudo-random input vectors generated by LFSR 10630 in a manner well known in the art. In FIG. 106 one bit of CRC 10632 is associated with each of the outputs 10604 of LFB 10600. If an output 10604 couples directly to a flip flop (preferably a scan flip flop similar to 10400) then that scan flip flop may be modified to have the additional CRC functionality to generate the signature. If an output 10604 couples directly to combinatorial logic, it will be monitored in test mode and its value coupled to a corresponding bit in CRC 10632. Alternatively, all the bits in CRC will passively monitor an output regardless of the source of the signal internal to LFB 10600.

Thus during a BIST test, all the outputs of LFB 10600 may be analyzed to determine the correctness of their responses to the stimuli provided by the pseudo-random input vectors generated by LFSR 10630. As is known in the art, CRC 10632 may be a single CRC or a number of smaller CRCs as a matter of design choice. As known in the art, a CRC circuit is a special case of an LFSR, with additional circuits present to merge the observed data into the pseudo-random pattern sequence generated by the base LFSR. The CRC 10632 is preferably implemented using a primitive polynomial to generate a maximum sequence of pseudo-random patterns. CRC 10632 needs to be seeded to a known value, so that the signature generated by the pseudo-random input vectors is deterministic. The seeding logic can be inexpensively implemented internal to the LFSR 10630 flip flops and initialized, for example, in response to a reset signal. After completion of the test, the value present in the CRC 10632 is compared to the known value of the signature. If all the bits in CRC 10632 match, the signature is valid and the LFB 10600 is deemed to be functioning correctly. If one or more of the bits in CRC 10632 does not match, the signature is invalid and the LFB 10600 is deemed to not be functioning correctly. The value of the expected signature can be inexpensively implemented internal to the CRC 10632 flip flops and compared internally to CRC 10632 in response to an evaluate signal.

As shown in FIG. 106, LFB 10610 comprises LFSR circuit 10612, CRC circuit 10614, and logic function 10616. Since its input/output structure is analogous to that of LFB 10600, it can be tested in a similar manner albeit on a smaller scale. If LFB 10600 is instantiated into a larger block with a similar input/output structure, LFB 10600 may be tested as part of that larger block or tested separately as a matter of design choice. It is not required that all blocks in the hierarchy have this input/output structure if it is deemed unnecessary to test them individually. An example of this is LFB 10620 instantiated inside LFB 10600 which does not have an LFSR circuit on the inputs and a CRC circuit on the outputs and which is tested along with the rest of LFB 10600.

Persons of ordinary skill in the art will appreciate that other BIST test approaches are known in the art and that any of them may be used to determine if LFB 10600 is functional or faulty.

In order to repair a 3D IC like 3D IC 10500 of FIG. 105A using the block BIST approach, the part is put in a test mode and the DATA1 and DATA2 signals are compared at each scan flip flop 10400 on Layer 1 and Layer 2 and the resulting ERROR1 and ERROR2 signals are monitored as described in the embodiments above or possibly using some other method. The location of the faulty logic cone is determined with regards to its location in the logic design hierarchy. For example, if the faulty logic cone were located inside LFB 10610 then the BIST routine for only that block would be run on both Layer 1 and Layer 2. The results of the two tests determine which of the blocks (and by implication which of the logic cones) is functional and which is faulty. Then the LAYER_SEL latches for the corresponding scan flip flops 10400 can be set so that each receives the repair signal from the functional logic cone and ignores the faulty signal. Thus the layer determination can be made for a modest cost in hardware in a shorter period of time without the need for expensive ATPG testing.

FIG. 107 illustrates an alternate embodiment with the ability to perform field repair of individual logic cones. An exemplary 3D IC indicated generally by 10700 comprises two layers labeled Layer 1 and Layer 2 and separated by a dashed line in the drawing figure. Layer 1 and Layer 2 are bonded together to form 3D IC 10700 using methods known in the art and interconnected using TSVs or some other interlayer interconnect technology. Layer 1 comprises Control Logic block 10710, scan flip flops 10711 and 10712, multiplexers 10713 and 10714, and Logic cone 10715. Similarly, Layer 2 comprises Control Logic block 10720, scan flip flops 10721 and 10722, multiplexers 10723 and 10724, and Logic cone 10725.

In Layer 1, scan flip flops 10711 and 10712 are coupled in series with Control Logic block 10710 to form a scan chain. Scan flip flops 10711 and 10712 can be ordinary scan flip flops of a type known in the art. The Q outputs of scan flip flops 10711 and 10712 are coupled to the D1 data inputs of multiplexers 10713 and 10714 respectively. Representative logic cone 10715 has a representative input coupled to the output of multiplexer 10713 and an output coupled to the D input of scan flip flop 10712.

In Layer 2, scan flip flops 10721 and 10722 are coupled in series with Control Logic block 10720 to form a scan chain. Scan flip flops 10721 and 10722 can be ordinary scan flip flops of a type known in the art. The Q outputs of scan flip flops 10721 and 10722 are coupled to the D1 data inputs of multiplexers 10723 and 10724 respectively. Representative logic cone 10725 has a representative input coupled to the output of multiplexer 10723 and an output coupled to the D input of scan flip flop 10722.

The Q output of scan flip flop 10711 is coupled to the D0 input of multiplexer 10723, the Q output of scan flip flop 10721 is coupled to the D0 input of multiplexer 10713, the Q output of scan flip flop 10712 is coupled to the D0 input of multiplexer 10724, and the Q output of scan flip flop 10722 is coupled to the D0 input of multiplexer 10714. Control Logic block 10710 is coupled to Control Logic block 10720 in a manner that allows coordination between testing functions between layers. In some embodiments the Control Logic blocks 10710 and 10720 can test themselves or each other and, if one is faulty, the other can control testing on both layers. These interlayer couplings may be realized by TSVs or by some other interlayer interconnect technology.

The logic functions performed on Layer 1 are substantially identical to the logic functions performed on Layer 2. The embodiment of 3D IC 10700 in FIG. 107 is similar to the embodiment of 3D IC 10300 shown in FIG. 103, with the primary difference being that the multiplexers used to implement the interlayer programmable or selectable cross couplings for logic cone replacement are located immediately after the scan flip flops instead of being immediately before them as in exemplary scan flip flop 10400 of FIG. 104 and in exemplary 3D IC 10300 of FIG. 103.

FIG. 108 illustrates an exemplary 3D IC indicated generally by 10800 which is also constructed using this approach. Exemplary 3D IC 10800 comprises two Layers labeled Layer 1 and Layer 2 and separated by a dashed line in the drawing figure. Layer 1 and Layer 2 are bonded together to form 3D IC 10800 and interconnected using TSVs or some other interlayer interconnect technology. Layer 1 comprises Layer 1 Logic Cone 10810, scan flip flop 10812, multiplexer 10814, and XOR gate 10816. Similarly, Layer 2 comprises Layer 2 Logic Cone 10820, scan flip flop 10822, multiplexer 10824, and XOR gate 10826.

Layer 1 Logic Cone 10810 and Layer 2 Logic Cone 10820 implement substantially identical logic functions. In order to detect a faulty logic cone, the output of the logic cones 10810 and 10820 are captured in scan flip flops 10812 and 10822 respectively in a test mode. The Q outputs of the scan flip flops 10812 and 10822 are labeled Q1 and Q2 respectively in FIGS. 108. Q1 and Q2 are compared using the XOR gates 10816 and 10826 to generate error signals ERROR1 and ERROR2 respectively. Each of the multiplexers 10814 and 10824 has a select input coupled to a layer select latch (not shown in FIG. 108) preferably located in the same layer as the corresponding multiplexer within relatively close proximity to allow selectable or programmable coupling of Q1 and Q2 to either DATA1 or DATA2.

All the methods of evaluating ERROR1 and ERROR2 described in conjunction with the embodiments of FIGS. 105A, 105B and 106 may be employed to evaluate ERROR1 and ERROR2 in FIG. 108. Similarly, once ERROR1 and ERROR2 are evaluated, the correct values may be applied to the layer select latches for the multiplexers 10814 and 10824 to effect a logic cone replacement if necessary. In this embodiment, logic cone replacement also includes replacing the associated scan flip flop.

FIG. 109A illustrates an exemplary embodiment with an even more economical approach to field repair. An exemplary 3D IC generally indicated by 10900 which comprises two Layers labeled Layer 1 and Layer 2 and separated by a dashed line in the drawing figure. Each of Layer 1 and Layer 2 comprises at least one Circuit Layer. Layer 1 and Layer 2 are bonded together using techniques known in the art to form 3D IC 10900 and interconnected with TSVs or other interlayer interconnect technology. Each Layer further comprises an instance of Logic Function Block 10910, each of which in turn comprises an instance of Logic Function Block (LFB) 10920. LFB 10920 comprises LSFR circuits on its inputs (not shown in FIG. 109A) and CRC circuits on its outputs (not shown in FIG. 109A) in a manner analogous to that described with respect to LFB 10600 in FIG. 106.

Each instance of LFB 10920 has a plurality of multiplexers 10922 associated with its inputs and a plurality of multiplexers 10924 associated with its outputs. These multiplexers may be used to programmably or selectively replace the entire instance of LFB 10920 on either Layer 1 or Layer 2 with its counterpart on the other layer.

On power up, system reset, or on demand from control logic located internal to 3D IC 10900 or elsewhere in the system where 3D IC 10900 is deployed, the various blocks in the hierarchy can be tested. Any faulty block at any level of the hierarchy with BIST capability may be programmably and selectively replaced by its corresponding instance on the other Layer. Since this is determined at the block level, this decision can be made locally by the BIST control logic in each block (not shown in FIG. 109A), though some coordination may be required with higher level blocks in the hierarchy with regards to which Layer the plurality of multiplexers 10922 sources the inputs to the functional LFB 10920 in the case of multiple repairs in the same vicinity in the design hierarchy. Since both Layer 1 and Layer 2 preferably leave the factory fully functional, or alternatively nearly fully functional, a simple approach is to designate one of the Layers, for example, Layer 1, as the primary functional layer. Then the BIST controllers of each block can coordinate locally and decide which block should have its inputs and outputs coupled to Layer 1 through the Layer 1 multiplexers 10922 and 10924.

Persons of ordinary skill in the art will appreciate that significant area can be saved by employing this embodiment. For example, since LFBs are evaluated instead of individual logic cones, the interlayer selection multiplexers for each individual flip flop like multiplexer 10406 in FIG. 104 and multiplexer 10814 in FIG. 108 can be removed along with the LAYER_SEL latches 10570 of FIG. 105B since this function is now handled by the pluralities of multiplexers 10922 and 10924 in FIG. 109A, all of which may be controlled one or more control signals in parallel. Similarly, the error signal generators (e.g., XOR gates 10514 and 10524 in FIGS. 105A and 10816 and 10826 in FIG. 108) and any circuitry needed to read them like coupling them to the scan flip flops or the addressing circuitry described in conjunction with FIG. 105B may also be removed, since in this embodiment entire Logic Function Blocks rather than individual Logic Cones are replaced.

Even the scan chains may be removed in some embodiments, though this is a matter of design choice. In embodiments where the scan chains are removed, factory testing and repair would also have to rely on the block BIST circuits. When a bad block is detected, an entire new block would need to be crafted on the Repair Layer with Direct-Write e-Beam. Typically this takes more time than crafting a replacement logic cone due to the greater number of patterns to shape, and the area savings may need to be compared to the test time losses to determine the economically superior decision.

Removing the scan chains also entails a risk in the early debug and prototyping stage of the design, since BIST circuitry is not very good for diagnosing the nature of problems. If there is a problem in the design itself, the absence of scan testing will make it harder to find and fix the problem, and the cost in terms of lost time to market can be very high and hard to quantify. Prudence might suggest leaving the scan chains in for reasons unrelated to the field repair aspects of the invention.

Another advantage to embodiments using the block BIST approach is described in conjunction with FIG. 109B. One disadvantage to some of the earlier embodiments is that the majority of circuitry on both Layer 1 and Layer 2 is active during normal operation. Thus power can be substantially reduced relative to earlier embodiments by operating only one instance of a block on one of the layers whenever possible.

Present in FIG. 109B are 3D IC 10900, Layer 1 and Layer 2, and two instances each of LFBs 10910 and 10920, and pluralities of multiplexers 10922 and 10924 previously discussed. Also present in each Layer in FIG. 109B is a power select multiplexer 10930 associated with that layer's version of LFB 10920. Each power select multiplexer 10930 has an output coupled to the power terminal of its associated LFB 10920, a first select input coupled to the positive power supply (labeled VCC in the figure), and a second input coupled to the ground potential power supply (labeled GND in the figure). Each power select multiplexer 10930 has a select input (not shown in FIG. 109B) coupled to control logic (also not shown in FIG. 109B), typically present in duplicate on Layer 1 and Layer 2 though it may be located elsewhere internal to 3D IC 10900 or possibly elsewhere in the system where 3D IC 10900 is deployed.

Persons of ordinary skill in the art will appreciate that there are many ways to programmably or selectively power down a block inside an integrated circuit known in the art and that the use of power select multiplexer 10930 in the embodiment of FIG. 109B is exemplary only. Any method of powering down LFB 10920 is within the scope of the invention. For example, a power switch could be used for both VCC and GND. Alternatively, the power switch for GND could be omitted and the power supply node allowed to "float" down to ground when VCC is decoupled from LFB 10920. In some embodiments, VCC may be controlled by a transistor, like either a source follower or an emitter follower which is itself controlled by a voltage regulator, and VCC may be removed by disabling or switching off the transistor in some way. Many other alternatives are possible.

In some embodiments, control logic (not shown in FIG. 109B) uses the BIST circuits present in each block to stitch together a single copy of the design (using each block's plurality of input and output multiplexers which function similarly to pluralities of multiplexers 10922 and 10924 associated with LFB 10920) comprised of functional copies of all the LFBs. When this mapping is complete, all of the faulty LFBs and the unused functional LFBs are powered off using their associated power select multiplexers (similar to power select multiplexer 10930). Thus the power consumption can be reduced to the level that a single copy of the design would lead to using standard two dimensional integrated circuit technology.

Alternatively, if a layer, for example, Layer 1 is designated as the primary layer, then the BIST controllers in each block can independently determine which version of the block is to be used. Then the settings of the pluralities of multiplexers 10922 and 10924 are set to couple the used block to Layer 1 and the settings of powers select multiplexers 10930 can be set to power down the unused block. Typically, this should reduce the power consumption by half relative to embodiments where power select multiplexers 10930 or equivalent are not implemented.

There are test techniques known in the art that are a compromise between the detailed diagnostic capabilities of scan testing with the simplicity of BIST testing. In embodiments employing such schemes, each BIST block (smaller than a typical LFB, but typically comprising a few tens to a few hundreds of logic cones) stores a small number of initial states in particular scan flip flops while most of the scan flip flops can use a default value. CAD tools may be used to analyze the design's net-list to identify the necessary scan flip flops to allow efficient testing.

During test mode, the BIST controller shifts in the initial values and then starts the clocking the design. The BIST controller has a signature register which might be a CRC or some other circuit which monitors bits internal to the block being tested. After a predetermined number of clock cycles, the BIST controller stops clocking the design, shifts out the data stored in the scan flip flops while adding their contents to the block signature, and compares the signature to a small number of stored signatures (one for each of the stored initial states.

This approach has the advantage of not needing a large number of stored scan vectors and the "go" or "no go" simplicity of BIST testing. The test block is less fine than identifying a single faulty logic cone, but much coarser than a large Logic Function Block. In general, the finer the test granularity (i.e., the smaller the size of the circuitry being substituted for faulty circuitry) the less chance of a delayed fault showing up in the same test block on both Layer 1 and Layer 2. Once the functional status of the BIST block has been determined, the appropriate values are written to the latches controlling the interlayer multiplexers to replace a faulty BIST block on one if the layers, if necessary. In some embodiments, faulty and unused BIST blocks may be powered down to conserve power.

While discussions of the various exemplary embodiments described so far concern themselves with finding and repairing defective logic cones or logic function blocks in a static test mode, embodiments of the invention can address failures due to noise or timing. For example, in 3D IC 10300 of FIG. 103 and in 3D IC 10700 of FIG. 107 the scan chains can be used to perform at-speed testing in a manner known in the art. One approach involves shifting a vector in through the scan chains, applying two or more at-speed clock pulses, and then shifting out the results through the scan chain. This will catch any logic cones that are functionally correct at low speed testing but are operating too slowly to function in the circuit at full clock speed. While this approach will allow field repair of slow logic cones, it requires the time, intelligence and memory capacity necessary to store, run and evaluate scan vectors.

Another approach is to use block BIST testing at power up, reset, or on-demand to over-clock each block at ever increasing frequencies until one fails, determine which layer version of the block is operating faster, and then substitute the faster block for the slower one at each instance in the design. This has the more modest time, intelligence and memory requirements generally associated with block BIST testing, but it still may lead to placing the 3D IC in a test mode.

FIG. 110 illustrates an embodiment where errors due to slow logic cones can be monitored in real time while the circuit is in normal operating mode. An exemplary 3D IC generally indicated at 11000 comprises two Layers labeled Layer 1 and Layer 2 and separated by a dashed line in the drawing figure. The Layers each comprise one or more Circuit Layers and are bonded together to form 3D IC 11000. They are electrically coupled together using TSVs or some other interlayer interconnect technology.

FIG. 110 focuses on the operation of circuitry coupled to the output of a single Layer 2 Logic Cone 11020, though substantially identical circuitry is also present on Layer 1 (not shown in FIG. 110). Also present in FIG. 110 is scan flip flop 11022 with its D input coupled to the output of Layer 2 Logic Cone 11020 and its Q output coupled to the D1 input of multiplexer 11024 through interlayer line 11012 labeled Q2 in the figure. Multiplexer 11024 has an output DATA2 coupled to a logic cone (not shown in FIG. 110) and a D0 input coupled the Q1 output of the Layer 1 flip flop corresponding to flip flop 11022 (not shown in the figure) through interlayer line 11010.

XOR gate 11026 has a first input coupled to Q1, a second input coupled to Q2, and an output coupled to a first input of AND gate 11046. AND gate 11046 also has a second input coupled to TEST_EN line 11048 and an output coupled to the Set input of RS flip flop 11028. RS flip flop also has a Reset input coupled to Layer 2 Reset line 11030 and an output coupled to a first input of OR gate 11032 and the gate of N-channel transistor 11038. OR gate 11032 also has a second input coupled to Layer 20R-chain Input line 11034 and an output coupled to Layer 20R-chain Output line 11036.

Layer 2 control logic (not shown in FIG. 110) controls the operation of XOR gate 11026, AND gate 11046, RS flip flop 11028, and OR gate 11032. The TEST_EN line 11048 is used to disable the testing process with regards to Q1 and Q2. This is desirable in cases where, for example, a functional error has already been repaired and differences between Q1 and Q2 are routinely expected and would interfere with the background testing process looking for marginal timing errors.

Layer 2 Reset line 11030 is used to reset the internal state of RS flip flop 11028 to logic-0 along with all the other RS flip flops associated with other logic cones on Layer 2. OR gate 11032 is coupled together with all of the other OR-gates associated with other logic cones on Layer 2 to form a large Layer 2 distributed OR function coupled to all of the Layer 2 RS flip flops like 11028 in FIG. 110. If all of the RS flip flops are reset to logic-0, then the output of the distributed OR function will be logic-0. If a difference in logic state occurs between the flip flops generating the Q1 and Q2 signals, XOR gate 11026 will present a logic-1 through AND gate 11046 (if TEST_EN=logic-1) to the Set input of RS flip flop 11028 causing it to change state and present a logic-1 to the first input of OR gate 11032, which in turn will produce a logic-1 at the output of the Layer 2 distributed OR function (not shown in FIG. 110) notifying the control logic (not shown in the figure) that an error has occurred.

The control logic can then use the stack of N-channel transistors 11038, 11040 and 11042 to determine the location of the logic cone producing the error. N-channel transistor 11038 has a gate terminal coupled to the Q output of RS flip flop 11028, a source terminal coupled to ground, and a drain terminal coupled to the source of N-channel transistor 11040. N-channel transistor 11040 has a gate terminal coupled to the row address line ROW_ADDR line, a source terminal coupled to the drain of N-channel transistor 11038, and a drain terminal coupled to the source of N-channel transistor 11042. N-channel transistor 11042 has a gate terminal coupled to the column address line COL_ADDR line, a source terminal coupled to the drain of N-channel transistor 11040, and a drain terminal coupled to the sense line SENSE 11044.

The row and column addresses are virtual addresses, since in a logic design the locations of the flip flops will not be neatly arranged in rows and columns. In some embodiments a Computer Aided Design (CAD) tool is used to modify the net-list to correctly address each logic cone and then the ROW_ADDR and COL_ADDR signals are routed like any other signal in the design.

This produces an efficient way for the control logic to cycle through the virtual address space. If COL_ADDR=ROW_ADDR=logic-1 and the state of RS flip flop is logic-1, then the transistor stack will pull SENSE=logic-0. Thus a logic-1 will only occur at a virtual address location where the RS flip flop has captured an error. Once an error has been detected, RS flip flop 11028 can be reset to logic-0 with the Layer 2 Reset line 11030 where it will be able to detect another error in the future.

The control logic can be designed to handle an error in any of a number of ways. For example, errors can be logged and if a logic error occurs repeatedly for the same logic cone location, then a test mode can be entered to determine if a repair is necessary at that location. This is a good approach to handle intermittent errors resulting from marginal logic cones that only occasionally fail, for example, due to noise, and may test as functional in normal testing. Alternatively, action can be taken upon receipt of the first error notification as a matter of design choice.

As discussed earlier in conjunction with FIG. 99, using Triple Modular Redundancy at the logic cone level can also function as an effective field repair method, though it really creates a high level of redundancy that masks rather than repairs errors due to delayed failure mechanisms or marginally slow logic cones. If factory repair is used to make sure all the equivalent logic cones on each layer test functional before the 3D IC is shipped from the factory, the level of redundancy is even higher. The cost of having three layers versus having two layers, with or without a repair layer must be factored into determining the best embodiment for any application.

An alternative TMR approach is shown in exemplary 3D IC 11100 in FIG. 111. Present in FIG. 111 are substantially identical Layers labeled Layer 1, Layer 2 and Layer 3 separated by dashed lines in the figure. Layer 1, Layer 2 and Layer 3 may each comprise one or more circuit layers and are bonded together to form 3D IC 11100 using techniques known in the art. Layer 1 comprises Layer 1 Logic Cone 11110, flip flop 11114, and majority-of-three (MAJ3) gate 11116. Layer 2 comprises Layer 2 Logic Cone 11120, flip flop 11124, and MAJ3 gate 11126. Layer 3 comprises Layer 3 Logic Cone 11130, flip flop 11134, and MAJ3 gate 11136.

The logic cones 11110, 11120 and 11130 all perform a substantially identical logic function. The flip flops 11114, 11124 and 11134 are preferably scan flip flops. If a Repair Layer is present (not shown in FIG. 111), then the flip flop 9702 of FIG. 97 may be used to implement repair of a defective logic cone before 3D IC 11100 is shipped from the factory. The MAJ3 gates 11116, 11126 and 11136 compare the outputs from the three flip flops 11114, 11124 and 11134 and output a logic value consistent with the majority of the inputs: specifically if two or three of the three inputs equal logic-0 then the MAJ3 gate will output logic-0 and if two or three of the three inputs equal logic-1 then the MAJ3 gate will output logic-1. Thus if one of the three logic cones or one of the three flip flops is defective, the correct logic value will be present at the output of all three MAJ3 gates.

One advantage of the embodiment of FIG. 111 is that Layer 1, Layer 2 or Layer 3 can all be fabricated using all or nearly all of the same masks. Another advantage is that MAJ3 gates 11116, 11126 and 11136 also effectively function as a Single Event Upset (SEU) filter for high reliability or radiation tolerant applications as described in Rezgui cited above.

Another TMR approach is shown in exemplary 3D IC 11200 in FIG. 112. In this embodiment, the MAJ3 gates are placed between the logic cones and their respective flip flops. Present in FIG. 112 are substantially identical Layers labeled Layer 1, Layer 2 and Layer 3 separated by dashed lines in the figure. Layer 1, Layer 2 and Layer 3 may each comprise one or more circuit layers and are bonded together to form 3D IC 11200 using techniques known in the art. Layer 1 comprises Layer 1 Logic Cone 11210, flip flop 11214, and majority-of-three (MAJ3) gate 11212. Layer 2 comprises Layer 2 Logic Cone 11220, flip flop 11224, and MAJ3 gate 11222. Layer 3 comprises Layer 3 Logic Cone 11230, flip flop 11234, and MAJ3 gate 11232.

The logic cones 11210, 11220 and 11230 all perform a substantially identical logic function. The flip flops 11214, 11224 and 11234 are preferably scan flip flops. If a Repair Layer is present (not shown in FIG. 112), then the flip flop 9702 of FIG. 97 may be used to implement repair of a defective logic cone before 3D IC 11200 is shipped from the factory. The MAJ3 gates 11212, 11222 and 11232 compare the outputs from the three logic cones 11210, 11220 and 11230 and output a logic value consistent with the majority of the inputs. Thus if one of the three logic cones is defective, the correct logic value will be present at the output of all three MAJ3 gates.

One advantage of the embodiment of FIG. 112 is that Layer 1, Layer 2 or Layer 3 can all be fabricated using all or nearly all of the same masks. Another advantage is that MAJ3 gates 11212, 11222 and 11232 also effectively function as a Single Event Transient (SET) filter for high reliability or radiation tolerant applications as described in Rezgui cited above.

Another TMR embodiment is shown in exemplary 3D IC 11300 in FIG. 113. In this embodiment, the MAJ3 gates are placed between the logic cones and their respective flip flops. Present in FIG. 113 are substantially identical Layers labeled Layer 1, Layer 2 and Layer 3 separated by dashed lines in the figure. Layer 1, Layer 2 and Layer 3 may each comprise one or more circuit layers and are bonded together to form 3D IC 11300 using techniques known in the art. Layer 1 comprises Layer 1 Logic Cone 11310, flip flop 11314, and majority-of-three (MAJ3) gates 11312 and 11316. Layer 2 comprises Layer 2 Logic Cone 11320, flip flop 11324, and MAJ3 gates 11322 and 11326. Layer 3 comprises Layer 3 Logic Cone 11330, flip flop 11334, and MAJ3 gates 11332 and 11336.

The logic cones 11310, 11320 and 11330 all perform a substantially identical logic function. The flip flops 11314, 11324 and 11334 are preferably scan flip flops. If a Repair Layer is present (not shown in FIG. 113), then the flip flop 9702 of FIG. 97 may be used to implement repair of a defective logic cone before 3D IC 11300 is shipped from the factory. The MAJ3 gates 11312, 11322 and 11332 compare the outputs from the three logic cones 11310, 11320 and 11330 and output a logic value consistent with the majority of the inputs. Similarly, the MAJ3 gates 11316, 11326 and 11336 compare the outputs from the three flip flops 11314, 11324 and 11334 and output a logic value consistent with the majority of the inputs. Thus if one of the three logic cones or one of the three flip flops is defective, the correct logic value will be present at the output of all six of the MAJ3 gates.

One advantage of the embodiment of FIG. 113 is that Layer 1, Layer 2 or Layer 3 can all be fabricated using all or nearly all of the same masks. Another advantage is that MAJ3 gates 11112, 11122 and 11132 also effectively function as a Single Event Transient (SET) filter while MAJ3 gates 11116, 11126 and 11136 also effectively function as a Single Event Upset (SEU) filter for high reliability or radiation tolerant applications as described in Rezgui cited above.

Embodiments of the invention can be applied to a large variety of commercial as well as high reliability, aerospace and military applications. The ability to fix defects in the factory with Repair Layers combined with the ability to automatically fix delayed defects (by masking them with three layer TMR embodiments or replacing faulty circuits with two layer replacement embodiments) allows the creation of much larger and more complex three dimensional systems than is possible with conventional two dimensional integrated circuit (IC) technology. These various aspects of the invention can be traded off against the cost requirements of the target application.

In order to reduce the cost of a 3D IC according to the invention, it is desirable to use the same set of masks to manufacture each Layer. This can be done by creating an identical structure of vias in an appropriate pattern on each layer and then offsetting it by a desired amount when aligning Layer 1 and Layer 2.

FIG. 114A illustrates a via pattern 11400 which is constructed on Layer 1 of 3DICs like 10300, 10500, 10600, 10700, 10800, 10900 and 11000 previously discussed. At a minimum the metal overlap pad at each via location 11402, 11404, 11406 and 11408 may be present on the top and bottom metal layers of Layer 1. Via pattern 11400 occurs in proximity to each repair or replacement multiplexer on Layer 1 where via metal overlap pads 11402 and 11404 (labeled L1/D0 for Layer 1 input D0 in the figure) are coupled to the D0 multiplexer input at that location, and via metal overlap pads 11406 and 11408 (labeled L1/D1 for Layer 1 input D1 in the figure) are coupled to the D1 multiplexer input.

Similarly, FIG. 114B illustrates a substantially identical via pattern 11410 which is constructed on Layer 2 of 3DICs like 10300, 10500, 10600, 10700, 10800, 10900 and 11000 previously discussed. At a minimum the metal overlap pad at each via location 11412, 11414, 11416 and 11418 may be present on the top and bottom metal layers of Layer 2. Via pattern 11410 occurs in proximity to each repair or replacement multiplexer on Layer 2 where via metal overlap pads 11412 and 11414 (labeled L2/D0 for Layer 2 input D0 in the figure) are coupled to the D0 multiplexer input at that location, and via metal overlap pads 11416 and 11418 (labeled L2/D1 for Layer 2 input D1 in the figure) are coupled to the D1 multiplexer input.

FIG. 114C illustrates a top view where via patterns 11400 and 11410 are aligned offset by one interlayer interconnection pitch. The interlayer interconnects may be TSVs or some other interlayer interconnect technology. Present in FIG. 114C are via metal overlap pads 11402, 11404, 11406, 11408, 11412, 11414, 11416 and 11418 previously discussed. In FIG. 114C Layer 2 is offset by one interlayer connection pitch to the right relative to Layer 1. This causes via metal overlap pads 11404 and 11418 to physically overlap with each other. Similarly, this causes via metal overlap pads 11406 and 11412 to physically overlap with each other. If Through Silicon Vias or other interlayer vertical coupling points are placed at these two overlap locations (using a single mask) then multiplexer input D1 of Layer 2 is coupled to multiplexer input D0 of Layer 1 and multiplexer input D0 of Layer 2 is coupled to multiplexer input D1 of Layer 1. This is precisely the interlayer connection topology necessary to realize the selective repair or replacement of logic cones and functional blocks in, for example, the embodiments of FIGS. 105A and 107.

FIG. 114D illustrates a side view of a structure employing the technique described in conjunction with FIGS. 114A, 114B and 114C. Present in FIG. 114D is an exemplary 3D IC generally indicated by 11420 comprising two instances of Layer 11430 stacked together with the top instance labeled Layer 2 and the bottom instance labeled Layer 1 in the figure. Each instance of Layer 11420 comprises an exemplary transistor 11431, an exemplary contact 11432, exemplary metal 1 11433, exemplary via 1 11434, exemplary metal 2 11435, exemplary via 2 11436, and exemplary metal 3 11437. The dashed oval labeled 11400 indicates the part of the Layer 1 corresponding to via pattern 11400 in FIGS. 114A and 114C. Similarly, the dashed oval labeled 11410 indicates the part of the Layer 2 corresponding to via pattern 11410 in FIGS. 114B and 114C. An interlayer via such as TSV 11440 in this example is shown coupling the signal D1 of Layer 2 to the signal D0 of Layer 1. A second interlayer via (not shown since it is out of the plane of FIG. 114D) couples the signal D01 of Layer 2 to the signal D1 of Layer 1. As can be seen in FIG. 114D, while Layer 1 is identical to Layer 2, Layer 2 is offset by one interlayer via pitch allowing the TSVs to correctly align to each layer while only requiring a single interlayer via mask to make the correct interlayer connections.

As previously discussed, in some embodiments of the invention it is desirable for the control logic on each Layer of a 3D IC to know which layer it is. It is also desirable to use all of the same masks for each of the Layers. In an embodiment using the one interlayer via pitch offset between layers to correctly couple the functional and repair connections, we can place a different via pattern in proximity to the control logic to exploit the interlayer offset and uniquely identify each of the layers to its control logic.

FIG. 115A illustrates a via pattern 11500 which is constructed on Layer 1 of 3DICs like 10300, 10500, 10600, 10700, 10800, 10900 and 11000 previously discussed. At a minimum the metal overlap pad at each via location 11502, 11504, and 11506 may be present on the top and bottom metal layers of Layer 1. Via pattern 11500 occurs in proximity to control logic on Layer 1. Via metal overlap pad 11502 is coupled to ground (labeled L1/G in the figure for Layer 1 Ground). Via metal overlap pad 11504 is coupled to a signal named ID (labeled L1/ID in the figure for Layer 1 ID). Via metal overlap pad 11506 is coupled to the power supply voltage (labeled L1/V in the figure for Layer 1 VCC).

FIG. 115B illustrates a via pattern 11510 which is constructed on Layer 2 of 3DICs like 10300, 10500, 10600, 10700, 10800, 10900 and 11000 previously discussed. At a minimum the metal overlap pad at each via location 11512, 11514, and 11516 may be present on the top and bottom metal layers of Layer 2. Via pattern 11510 occurs in proximity to control logic on Layer 2. Via metal overlap pad 11512 is coupled to ground (labeled L2/G in the figure for Layer 2 Ground). Via metal overlap pad 11514 is coupled to a signal named ID (labeled L2/ID in the figure for Layer 2 ID). Via metal overlap pad 11516 is coupled to the power supply voltage (labeled L2/V in the figure for Layer 2 VCC).

FIG. 115C illustrates a top view where via patterns 11500 and 11510 are aligned offset by one interlayer interconnection pitch. The interlayer interconnects may be TSVs or some other interlayer interconnect technology. Present in FIG. 114C are via metal overlap pads 11502, 11504, 11506, 11512, 11514, and 11416 previously discussed. In FIG. 114C Layer 2 is offset by one interlayer connection pitch to the right relative to Layer 1. This causes via metal overlap pads 11504 and 11512 to physically overlap with each other. Similarly, this causes via metal overlap pads 11506 and 11514 to physically overlap with each other. If Through Silicon Vias or other interlayer vertical coupling points are placed at these two overlap locations (using a single mask) then the Layer 1 ID signal is coupled to ground and the Layer 2 ID signal is coupled to VCC. This allows the control logic in Layer 1 and Layer 2 to uniquely know their vertical position in the stack.

Persons of ordinary skill in the art will appreciate that the metal connections between Layer 1 and Layer 2 will typically be much larger comprising larger pads and numerous TSVs or other interlayer interconnections. This makes alignment of the power supply nodes easy and ensures that L1/V and L2/V will both be at the positive power supply potential and that L1/G and L2/G will both be at ground potential.

Several embodiments of the invention utilize Triple Modular Redundancy distributed over three Layers. In such embodiments it is desirable to use the same masks for all three Layers.

FIG. 116A illustrates a via metal overlap pattern 11600 comprising a 3×3 array of TSVs (or other interlayer coupling technology). The TMR interlayer connections occur in the proximity of a majority-of-three (MAJ3) gate typically fanning in or out from either a flip flop or functional block. Thus at each location on each of the three layers we have the function f(X0, X1, X2)=MAJ3(X0, X1, X2) being implemented where X0, X1 and X2 are the three inputs to the MAJ3 gate. For purposes of this discussion the X0 input is always coupled to the version of the signal generated on the same layer as the MAJ3 gate and the X1 and X2 inputs come from the other two layers.

In via metal overlap pattern 11600, via metal overlap pads 11602, 11612 and 11616 are coupled to the X0 input of the MAJ3 gate on that layer, via metal overlap pads 11604, 11608 and 11618 are coupled to the X1 input of the MAJ3 gate on that layer, and via metal overlap pads 11606, 11610 and 11614 are coupled to the X2 input of the MAJ3 gate on that layer.

FIG. 116B illustrates an exemplary 3D IC generally indicated by 11620 having three Layers labeled Layer 1, Layer 2 and Layer 3 from bottom to top. Each layer comprises an instance of via metal overlap pattern 11600 in the proximity of each MAJ3 gate used to implement a TMR related interlayer coupling. Layer 2 is offset one interlayer via pitch to the right relative to Layer 1 while Layer 3 is offset one interlayer via pitch to the right relative to Layer 2. The illustration in FIG. 116B is an abstraction. While it correctly shows the two interlayer via pitch offsets in the horizontal direction, a person of ordinary skill in the art will realize that each row of via metal overlap pads in each instance of via metal overlap pattern 11600 is horizontally aligned with the same row in the other instances.

Thus there are three locations where a via metal overlap pad is aligned on all three layers. FIG. 116B shows three interlayer vias 11630, 11640 and 11650 placed in those locations coupling Layer 1 to Layer 2 and three more interlayer vias 11632, 11642 and 11652 placed in those locations coupling Layer 2 to Layer 3. The same interlayer via mask may be used for both interlayer via fabrication steps.

Thus the interlayer vias 11630 and 11632 are vertically aligned and couple together the Layer 1 X2 MAJ3 gate input, the Layer 2 X0 MAJ3 gate input, and the Layer 3 X1 MAJ3 gate input. Similarly, the interlayer vias 11640 and 11642 are vertically aligned and couple together the Layer 1 X1 MAJ3 gate input, the Layer 2 X2 MAJ3 gate input, and the Layer 3 X0 MAJ3 gate input. Finally, the interlayer vias 11650 and 11652 are vertically aligned and couple together the Layer 1 X0 MAJ3 gate input, the Layer 2 X1 MAJ3 gate input, and the Layer 3 X2 MAJ3 gate input. Since the X0 input of the MAJ3 gate in each layer is driven from that layer, we can see that each driver is coupled to a different MAJ3 gate input on each layer assuring that no drivers are shorted together and the each MAJ3 gate on each layer receives inputs from each of the three drivers on the three Layers.

Yet another variation on the invention is to use the concepts of repair and redundancy layers to implement extremely large designs that extend beyond the size of a single reticle, up to and inclusive of a full wafer. This concept of Wafer Scale Integration ("WSI") was attempted in the past by companies such as Trilogy Systems and was abandoned because of extremely low yield. The ability of the current invention to effect multiple repairs by using a repair layer, or of masking multiple faults by using redundancy layers, makes WSI with very high yield a viable option.

One embodiment of the invention improves WSI by using the Continuous Array (CA) concept described above. In the case of WSI, however, the CA may extend beyond a single reticle and may potentially span the whole wafer. A custom mask may be used to etch away unused parts of the wafer.

Particular care must be taken when a design such as WSI crosses reticle boundaries. Alignment of features across a reticle boundary may be worse than the alignment of features within the reticle, and WSI designs must accommodate this potential misalignment. One way of addressing this is to use wider than minimum metal lines, with larger than minimum pitches, to cross the reticle boundary, while using a full lithography resolution within the reticle.

Another embodiment of the invention uses custom reticles for location on the wafer, creating a partial of full custom design across the wafer. As in the previous case, wider lines and coarser line pitches may be used for reticle boundary crossing.

In all WSI embodiments yield-enhancement is achieved through fault masking techniques such as TMR, or through repair layers, as illustrated in FIG. 96 through FIG. 116. At one extreme of granularity, a WSI repair layer on an individual flip flop level is illustrated in FIG. 98, which would provide a close to 100% yield even at a relatively high fault density. At the other end of granularity would be a block level repair scheme, with large granularity blocks at one layer effecting repair by replacing faulty blocks on the other layer. Connection techniques, such as illustrated in FIG. 93, may be used to connect the peripheral input/output signals of a large-granularity block across vertical device layers.

In another variation on the WSI invention one can selectively replace blocks on one layer with blocks on the other layer to provide speed improvement rather than to effect logical repair.

In another variation on the WSI invention one can use vertical stacking techniques as illustrated in FIGS. 84A-84E to flexibly provide variable amounts of specialized functions, and I/O in particular, to WSI designs.

FIG. 117A is a drawing illustration of prior art of reticle design. A reticle image 11700, which is the largest area that can be conveniently exposed on the wafer for patterning, can be made up of a multiplicity of identical integrated circuits (IC) such as 11701. In other cases (not shown) it can be made up of a multiplicity of non-identical ICs. Between the ICs are the dicing lanes 11703, all fitting within the reticle boundary 11705.

FIG. 117B is a drawing illustration how such reticle image can be used to pattern the surface of wafer 11710 (partially shown), where the reticle image 11700 is repeatedly tiling the wafer surface which may use a step-and-repeat process.

FIG. 118A is a drawing illustration of this process as applied to WSI design. In the general case there may be multiple types of reticles such as CA style reticle 11820 and ASIC style reticle 11810. In this situation the reticle may include a multiplicity of connecting lines 11814 that are perpendicular to the reticle edges and touch the reticle boundary 11812. FIG. 118B is a drawing illustration where a large section of the wafer 11852 may have a combination of such reticle images, both ASIC style 11856 and CA style 11854, projected on adjacent sites of the wafer 11852. The inter-reticle boundary 11858 is in this case spanned by the connecting lines 11814. Because the alignment across reticles is typically lower than the resolution within the reticle, the width and pitch of these inter-reticle wires may need to be increased to accommodate the inter-reticle alignment errors.

The array of reticles comprising a WSI design may extend as necessary across the wafer, up to and inclusive of the whole wafer. In the case where the WSI is smaller than the full wafer, multiple WSI designs may be placed on a single wafer.

Another use of this invention is in bringing to market, in a cost-effective manner, semiconductor devices in the early stage of introducing a new lithography process to the market, when the process yield is low. Currently, low yield poses major cost and availability challenges during the new lithography process introduction stage. Using any or all three-dimensional repair or fault tolerance techniques described in this invention and illustrated in FIGS. 96 through 116 would allow an inexpensive way to provide functional parts during that stage. Once the lithography process matures, its fault density drops, and its yield increases, the repair layers can be inexpensively stripped off as part of device cost reduction, permanently steering signal propagation only within the base layer through programming or through tying-off the repair control logic. Another possibility would be to continue offering the original device as a higher-priced fault-tolerant option, while offering the stripped version without fault-tolerance at a lower price point.

Despite best simulation and verification efforts, many designs end up containing design bugs even after implementation and manufacturing as semiconductor devices. As design complexity, size, and speed grow, debugging modern devices after manufacturing, the so-called "post-silicon debugging," becomes more difficult and more expensive. A major cause for this difficulty lies in the need to access a large number of signals over many clock cycles, on top of the fact that some design errors may manifest themselves only when the design is run at-speed. U.S. Pat. No. 7,296,201 describes how to overcome this difficulty by incorporating debugging elements into design itself, providing the ability to control and trace logic circuits, to assist in their debugging. DAFCA of Framingham, Mass. offers technology based on this principle.

FIG. 119 illustrates prior art of Design for Debug Infrastructure ("DFDI)" as described in M. Abramovici, "In-system Silicon Validation and Debug", IEEE Design and Test of Computers 25(3), 2008. 11902 is a signal wrapper that allows controlling what gets propagated to a target object. 11904 is a multiplexer implementing this function. 11910 is an illustration of such DFDI using said signal wrappers 11912, in conjunction with CapStim 11914—capture/stimulus module—and PTE, a Programmable Trigger Engine 11916, make together a debug module that fully observes and controls signals of target validation module 11918. Yet this ability to debug comes at cost—the addition of DFDI to the design increases the size of the design while still being limited to the number of signals it can store and monitor.

The current invention of 3D devices, including monolithic 3D devices, offers new ways for cost-effective post-silicon debugging. One possibility is to use an uncommitted repair layer 9632 such as illustrated in FIG. 96A and construct a dedicated DFDI to assist in debugging the functional logic layers 9602, 9612 and 9622 at-speed. FIG. 120 is a drawing illustration of such implementation, noting that signal wrapper 11902 is functionally equivalent to multiplexer 9714 of FIG. 97, which is already present in front of every flip flop of layers or strata 12002, 12012, and 12022. The construction of such debug module 12036 on the uncommitted logic layer 12032 can be accomplished using Direct-Write e-Beam technology such as available from Advantest or Fujitsu to write custom masking patterns in photo-resist. The only difference is that the new repair layer, the uncommitted logic layer 12032, now also includes register files needed to implement PTE and CaptStim and should be designed to work with the existing BIST controller/checker 12034. Using e-Beam is a cost effective option for this purpose as there is a need for only a small number of so-instrumented devices. Existing faults in the functional levels may also need to be repaired using the same e-beam technique. Alternatively, only fully functional devices can be selected for instrumentation with DFDI. After the design is debugged, the repair layer is used for regular device repair for yield enhancement as originally intended.

Designing customized DFDI is in itself an expensive endeavor. FIG. 121 is a drawing illustration of a variation on this invention. It uses functional logic layers or strata such as 12102, 12112 and 12122 with flip flops manufactured on a regular grid 12134. In such case a standardized DFDI layer 12132 that includes sophisticated debug module 12136 can be designed and used to replace the ad-hoc DFDI layer, made from the uncommitted logic layer 12032, which has the ability to efficiently observe and control all, or a very large number, of the flip flops on the functional logic layers. This standard DFDI can be placed on one or more early wafers just for the purpose of post-silicon debugging on multiple designs. This will make the design of a mask set for this DFDI layer cost-effective, spreading it across multiple projects. After the debugging is accomplished, this standard DFDI layer may be replaced by a regular repair layer 9632.

Another variation on this invention uses logic layers or strata that do not include flip flops manufactured on a regular grid but still uses standardized DFDI 12232 as described above. In this case a relatively inexpensive custom metal interconnect masks can be designed just to create an interposer 12234 to translate the irregular flip flop pattern on logic layers 12202, 12212 and 12222 to the regular interconnect of standardized DFDI layer. Similarly to the previous cases, once the post-silicon debugging is completed, the interposer and the standardized DFDI are replaced by a regular repair layer 9632.

Another variation on the DFDI invention illustrated in FIGS. 121 and 122 is to replace the DFDI layer or strata with a flexible and powerful standard BIST layer or strata. In contrast to a DFDI layer, the BIST layer will be potentially placed on every wafer throughout the design lifetime. While such BIST layer incurs additional manufacturing cost, it saves on using very expensive testers and probe cards. The mask cost and design cost of such BIST layer can be amortized over multiple designs as in the case of DFDI, and designs with irregularly placed flip flops can take advantage of it using inexpensive interposer layers as illustrated in FIG. 122.

A person of ordinary skills in the art will recognize that the DFDI invention such as illustrated in FIGS. 121 and 122 can be replicated on a more than one stratum of a 3D semiconductor device to accommodate a broad range of design complexity.

Another serious problem with designing semiconductor devices as the lithography minimum feature size scales down is signal re-buffering using repeaters. With the increased resistivity of metal traces in the deep sub-micron regime, signals need to be re-buffered at rapidly decreasing intervals to maintain circuit performance and immunity to circuit noise. This phenomenon has been described at length in "Prashant Saxena et al., Repeater Scaling and Its Impact on CAD, IEEE Transactions On Computer-Aided Design of Integrated Circuits and Systems, Vol. 23, No. 4, April 2004." The current invention offers a new way to minimize the routing impact of such re-buffering. Long distance signals are frequently routed on high metal layers to give them special treatment like wire size or isolation from crosstalk. When signals present on high metal layers need re-buffering, an embodiment of the invention is to use the active layer or strata above to insert repeaters, rather than drop the signal all the way to the diffusion layer of its current layer or strata. This approach reduces the routing blockages created by the large number of vias created when signals repeatedly need to move between high metal layers and the diffusion below, and suggests to selectively replace them with fewer vias to the active layer above.

Manufacturing wafers with advanced lithography and multiple metal layers is expensive. Manufacturing three-dimensional devices, including monolithic 3D devices, where multiple advanced lithography layers or strata each with multiple metal layers are stacked on top of each other is even more expensive. The vertical stacking process offers new degree of freedom that can be leveraged with appropriate Computer Aided Design ("CAD") tools to lower the manufacturing cost.

Most designs are made of blocks, but the characteristics of these block is frequently not uniform. Consequently, certain blocks may require fewer routing resources, while other blocks may require very dense routing resources. In two dimensional devices the block with the highest routing density demands dictates the number of metal layers for the whole device, even if some device regions may not need them. Three dimensional devices offer a new possibility of partitioning designs into multiple layers or strata based on the routing demands of the blocks assigned to each layer or strata.

Another variation on this invention is to partition designs into blocks that may require a particular advanced process technology for reasons of density or speed, and blocks that have less demanding requirements for reasons of speed, area, voltage, power, or other technology parameters. Such partitioning may be carried into two or more partitions and consequently different process technologies or nodes may be used on different vertical layers or strata to provide optimized fit to the design's logic and cost demands. This is particularly important in mobile, mass-produced devices, where both cost and optimized power consumption are of paramount importance.

Synthesis CAD tools currently used in the industry for two-dimensional devices include a single target library. For three-dimensional designs these synthesis tools or design automation tools may need to be enhanced to support two or more target libraries to be able to support synthesis for disparate technology characteristics of vertical layers or strata. Such disparate layers or strata will allow better cost or power optimization of three-dimensional designs.

FIG. 123 is a flowchart illustration for an algorithm partitioning a design into two target technologies, each to be placed on a separate layer or strata, when the synthesis tool or design automation tool does not support multiple target technologies. One technology, APL (Advanced Process Library), may be faster than the other, RPL (Relaxed Process Library), with concomitant higher power, higher manufacturing cost, or other differentiating design attributes. The two target technologies may be two different process nodes, wherein one process node, such as the APL, may be more advanced in technology than the other process node, such as the RPL. The RPL process node may employ much lower cost, for example, by at least 20%, lithography tools and have lower manufacturing costs than the APL. The APL may have more aggressive design rules than the RPL.

The partitioning starts with synthesis into APL with a target performance. Once complete, timing analysis may be done on the design and paths may be sorted by timing slack. The total estimated chip area A(t) may be computed and reasonable margins may be added as usual in anticipation of routing congestion and buffer insertion. The number of vertical layers S may be selected and the overall footprint A(t)/S may be computed.

In the first phase components belonging to paths estimated to require APL, based on timing slack below selected threshold Th, may be set aside (tagged APL). The area of these component may be computed to be A(apl). If A(apl) represents a fraction of total area A(t) greater than (S−1)/S then the process terminates and no partitioning into APL and RPL is possible—the whole design needs to be in the APL.

If the fraction of the design that requires APL is smaller than (S−1)/S then it is possible to have at least one layer of RPL. The partitioning process now starts from the largest slack path and towards lower slack paths. It tentatively tags all components of those paths that are not tagged APL with RPL, while accumulating the area of the marked components as A(rpl). When A(rpl) exceeds the area of a complete layer, A(t)/S, the components tentatively marked RPL may be permanently tagged RPL and the process continues after resetting A(rpl) to zero. If all paths are revisited and the components tentatively tagged RPL do not make for an area of a complete layer or strata, their tagging may be reversed back to APL and the process is terminated. The reason is that we want to err on the side of caution and a layer or strata should be an APL layer if it contains a mix of APL and RPL components.

The process as described assumes the availability of equivalent components in both APL and RPL technology. Ordinary persons skilled in the art will recognize that variations on this process can be done to accommodate non-equivalent technology libraries through remapping of the RPL-tagged components in a subsequent synthesis pass to an RPL target library, while marking all the APL-tagged components as untouchable. Similarly, different area requirements between APL and RPL can be accommodated through scaling and de-rating factors at the decision making points of the flow. Moreover, the term layer, when used in the context of layers of mono-crystalline silicon and associated transistors, interconnect, and other associated device structures in a 3D device, such as, for example, uncommitted repair layer 9632, may also be referred to as stratum or strata.

The partitioning process described above can be re-applied to the resulting partitions to produce multi-way partitioning and further optimize the design to minimize cost and power while meeting performance objectives.

Embodiments of the invention can be applied to a large variety of commercial as well as high reliability, aerospace and military applications. The ability to fix defects in the factory with Repair Layers combined with the ability to automatically fix delayed defects (by masking them with three layer TMR embodiments or replacing faulty circuits with two layer replacement embodiments) allows the creation of much larger and more complex three dimensional systems than is possible with conventional two dimensional integrated circuit (IC) technology. These various aspects of the invention can be traded off against the cost requirements of the target application.

For example, a 3D IC targeted an inexpensive consumer products where cost is dominant consideration might do factory repair to maximize yield in the factory but not include any field repair circuitry to minimize costs in products with short useful lifetimes. A 3D IC aimed at higher end consumer or lower end business products might use factory repair combined with two layer field replacement. A 3D IC targeted at enterprise class computing devices which balance cost and reliability might skip doing factory repair and use TMR for both acceptable yields as well as field repair. A 3D IC targeted at high reliability, military, aerospace, space or radiation tolerant applications might do factory repair to ensure that all three instances of every circuit are fully functional and use TMR for field repair as well as SET and SEU filtering. Battery operated devices for the military market might add circuitry to allow the device to operate only one of the three TMR layers to save battery life and include a radiation detection circuit which automatically switches into TMR mode when needed if the operating environment changes. Many other combinations and tradeoffs are possible within the scope of the invention.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile and/or mobile low power electronic devices or systems such as mobile phones, smart phone, tablet computers, cameras and the like. For example, incorporating the 3D IC semiconductor devices according to some embodiments of the invention within these mobile electronic devices or systems could provide superior mobile units that could operate much more efficiently and for a much longer time than with prior art technology.

3D ICs according to some embodiments of the invention could also enable electronic and semiconductor devices with much a higher performance due to the shorter interconnect as well as semiconductor devices with far more complexity via multiple levels of logic and providing the ability to repair or use redundancy. The achievable complexity of the semiconductor devices according to some embodiments of the invention could far exceed what was practical with the prior art technology. These advantages could lead to more powerful computer systems and improved systems that have embedded computers.

Some embodiments of the invention may also enable the design of state of the art electronic systems at a greatly reduced non-recurring engineering (NRE) cost by the use of high density 3D FPGAs or various forms of 3D array base ICs with reduced custom masks as been described previously. These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduce NRE using generic masks for layers of logic and other generic mask for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. In fact there are many ways to mix the many innovative elements to form 3D IC to support the need of an end system and to provide it with competitive edge. Such end system could be electronic based products or other type of systems that include some level of embedded electronics, such as, for example, cars, remote controlled vehicles, etc.

It is worth noting that many of the principles of the invention are also applicable to conventional two dimensional integrated circuits (2DICs). For example, an analogous of the two layer field repair embodiments could be built on a single layer with both versions of the duplicate circuitry on a single 2D IC employing the same cross connections between the duplicate versions. A programmable technology like, for example, fuses, antifuses, flash memory storage, etc., could be used to effect both factory repair and field repair. Similarly, an analogous version of some of the TMR embodiments are unique topologies in 2DICs as well as in 3DICs which would also improve the yield or reliability of 2D IC systems if implemented on a single layer.

FIG. 124 illustrates a 3D integrated circuit. Two mono-crystalline silicon layers, 12404 and 12416 are shown. Silicon layer 12416 could be thinned down from its original thickness, and its thickness could be in the range of approximately 1 um to approximately 50 um. Silicon layer 12404 may include transistors which could have gate electrode region 12414, gate dielectric region 12412, and shallow trench isolation (STI) regions 12410. Silicon layer 12416 may include transistors which could have gate electrode region 12434, gate dielectric region 12432, and shallow trench isolation (STI) regions 12430. A through-silicon via (TSV) 12418 could be present and may have a surrounding dielectric region 12420. Wiring layers for silicon layer 12404 are indicated as 12408 and wiring dielectric is indicated as 12406. Wiring layers for silicon layer 12416 are indicated as 12438 and wiring dielectric is indicated as 12436. The heat removal apparatus, which could include a heat spreader and a heat sink, is indicated as 12402. The heat removal problem for the 3D integrated circuit shown in FIG. 124 is immediately apparent. The silicon layer 12416 is far away from the heat removal apparatus 12402, and it is difficult to transfer heat between silicon layer 12416 and heat removal apparatus 12402. Furthermore, wiring dielectric regions 12406 do not conduct heat well, and this increases the thermal resistance between silicon layer 12416 and heat removal apparatus 12402.

FIG. 125 illustrates a 3D integrated circuit that could be constructed, for example, using techniques described in U.S. patent application Ser. No. 12/900,379 and U.S. patent application Ser. No. 12/904,119. Two mono-crystalline silicon layers, 12504 and 12516 are shown. Silicon layer 12516 could be thinned down from its original thickness, and its thickness could be in the range of approximately 3 nm to approximately 1 um. Silicon layer 12504 may include transistors which could have gate electrode region 12514, gate dielectric region 12512, and shallow trench isolation (STI) regions 12510. Silicon layer 12516 may include transistors which could have gate electrode region 12534, gate dielectric region 12532, and shallow trench isolation (STI) regions 12522. It can be observed that the STI regions 12522 can go right through to the bottom of silicon layer 12516 and provide good electrical isolation. This, however, can cause challenges for heat removal from the STI surrounded transistors since STI regions 12522 are typically insulators that do not conduct heat well. Therefore, the heat spreading capabilities of silicon layer 12516 with STI regions 12522 are low. A through-layer via (TLV) 12518 could be present and may include its dielectric region 12520. Wiring layers for silicon layer 12504 are indicated as 12508 and wiring dielectric is indicated as 12506. Wiring layers for silicon layer 12516 are indicated as 12538 and wiring dielectric is indicated as 12536. The heat removal apparatus, which could include a heat spreader and a heat sink, is indicated as 12502. The heat removal problem for the 3D integrated circuit shown in FIG. 125 is immediately apparent. The silicon layer 12516 is far away from the heat removal apparatus 12502, and it is difficult to transfer heat between silicon layer 12516 and heat removal apparatus 12502. Furthermore, wiring dielectric regions 12506 do not conduct heat well, and this increases the thermal resistance between silicon layer 12516 and heat removal apparatus 12502. The heat removal challenge is further exacerbated by the poor heat spreading properties of silicon layer 12516 with STI regions 12522.

FIG. 126 and FIG. 127 illustrate how the power or ground distribution network of a 3D integrated circuit could assist heat removal. FIG. 126 illustrates an exemplary power distribution network or structure of the 3D integrated circuit. The 3D integrated circuit, could, for example, be constructed with two silicon layers 12604 and 12616. The heat removal apparatus 12602 could include a heat spreader and a heat sink. The power distribution network or structure could consist of a global power grid 12610 that takes the supply voltage (denoted as VDD) from power pads and transfers it to local power grids 12608 and 12606, which then transfer the supply voltage to logic cells or gates such as 12614 and 12615. Vias 12618 and 12612, such as the previously described TSV or TLV, could be used to transfer the supply voltage from the global power grid 12610 to local power grids 12608 and 12606. The 3D integrated circuit could have a similar distribution networks, such as for ground and other supply voltages, as well. Typically, many contacts are made between the supply and ground distribution networks and silicon layer 12604. Due to this, there could exist a low thermal resistance between the power/ground distribution network and the heat removal apparatus 12602. Since power/ground distribution networks are typically constructed of conductive metals and could have low effective electrical resistance, they could have a low thermal resistance as well. Each logic cell or gate on the 3D integrated circuit (such as, for example 12614) is typically connected to VDD and ground, and therefore could have contacts to the power and ground distribution network. These contacts could help transfer heat efficiently (i.e. with low thermal resistance) from each logic cell or gate on the 3D integrated circuit (such as, for example 12614) to the heat removal apparatus 12602 through the power/ground distribution network and the silicon layer 12604.

FIG. 127 illustrates an exemplary NAND gate 12720 or logic cell and shows how all portions of this logic cell or gate could be located with low thermal resistance to the VDD or ground (GND) contacts. The NAND gate 12720 could consist of two pMOS transistors 12702 and two nMOS transistors 12704. The layout of the NAND gate 12720 is indicated in 12722. Various regions of the layout include metal regions 12706, poly regions 12708, n type silicon regions 12710, p type silicon regions 12712, contact regions 12714, and oxide regions 12724. pMOS transistors in the layout are indicated as 12716 and nMOS transistors in the layout are indicated as 12718. It can be observed that all parts of the exemplary NAND gate 12720 could have low thermal resistance to VDD or GND contacts since they are physically very close to them. Thus, all transistors in the NAND gate 12720 can be maintained at desirable temperatures if the VDD or ground contacts are maintained at desirable temperatures.

While the previous paragraph described how an existing power distribution network or structure can transfer heat efficiently from logic cells or gates in 3D-ICs to their heat sink, many techniques to enhance this heat transfer capability will be described hereafter in this patent application. These embodiments of the invention can provide several benefits, including lower thermal resistance and the ability to cool higher power 3D-ICs. These techniques are valid for different implementations of 3D-ICs, including monolithic 3D-ICs and TSV-based 3D-ICs.

FIG. 128 describes an embodiment of the invention, where the concept of thermal contacts is described. Two mono-crystalline silicon layers, 12804 and 12816 may have transistors. Silicon layer 12816 could be thinned down from its original thickness, and its thickness could be in the range of approximately 3 nm to approximately 1 um. Mono-crystalline silicon layer 12804 could have STI regions 12810, gate dielectric regions 12812, gate electrode regions 12814 and several other regions required for transistors (not shown). Mono-crystalline silicon layer 12816 could have STI regions 12830, gate dielectric regions 12832, gate electrode regions 12834 and several other regions required for transistors (not shown). Heat removal apparatus 12802 may include, for example, heat spreaders and heat sinks. In the example shown in FIG. 128, mono-crystalline silicon layer 12804 is closer to the heat removal apparatus 12802 than other mono-crystalline silicon layers such as 12816. Dielectric regions 12806 and 12846 could be used to insulate wiring regions such as 12822 and 12842 respectively. Through-layer vias for power delivery 12818 and their associated dielectric regions 12820 are shown. A thermal contact 12824 can be used that connects the local power distribution network or structure, which may include wiring layers 12842 used for transistors in the silicon layer 12804, to the silicon layer 12804. Thermal junction region 12826 can be either a doped or undoped region of silicon, and further details of thermal junction region 12826 will be given in FIG. 129. The thermal contact such as 12824 can be preferably placed close to the corresponding through-layer via for power delivery 12818; this helps transfer heat efficiently from the through-layer via for power delivery 12818 to thermal junction region 12826 and silicon layer 12804 and ultimately to the heat removal apparatus 12802. For example, the thermal contact 12824 could be located within approximately 2 um distance of the through-layer via for power delivery 12818 in the X-Y plane (the through-layer via direction is considered the Z plane in FIG. 128). While the thermal contact such as 12824 is described above as being between the power distribution network or structure and the silicon layer closest to the heat removal apparatus, it could also be between the ground distribution network and the silicon layer closest to the heat sink. Furthermore, more than one thermal contact 12824 can be placed close to the through-layer via for power delivery 12818. These thermal contacts can improve heat transfer from transistors located in higher layers of silicon such as 12816 to the heat removal apparatus 12802. While mono-crystalline silicon has been mentioned as the transistor material in this paragraph, other options are possible including, for example, poly-crystalline silicon, mono-crystalline germanium, mono-crystalline III-V semiconductors, graphene, and various other semiconductor materials with which devices, such as transistors, may be constructed within.

FIG. 129 describes an embodiment of the invention, where various implementations of thermal junctions and associated thermal contacts are illustrated. P-wells in CMOS integrated circuits are typically biased to ground and N-wells are typically biased to the supply voltage VDD. Thermal contacts and junctions may be formed differently. A thermal contact 12904 between the power (VDD) distribution network and a P-well 12902 can be implemented as shown in N+ in P-well thermal junction and contact example 12908, where an n+ doped region thermal junction 12906 is formed in the P-well region at the base of the thermal contact 12904. The n+ doped region thermal junction 12906 ensures a reverse biased p-n junction can be formed in N+ in P-well thermal junction and contact example 12908 and makes the thermal contact viable (i.e. not highly conductive) from an electrical perspective. The thermal contact 12904 could be formed of a conductive material such as copper, aluminum or some other material. A thermal contact 12914 between the ground (GND) distribution network and a P-well 12912 can be implemented as shown in P+ in P-well thermal junction and contact example 12918, where a p+ doped region thermal junction 12916 may be formed in the P-well region at the base of the thermal contact 12914. The p+ doped region thermal junction 12916 makes the thermal contact viable (i.e. not highly conductive) from an electrical perspective. The p+ doped region thermal junction 12916 and the P-well 12912 would typically be biased at ground potential. A thermal contact 12924 between the power (VDD) distribution network and an N-well 12922 can be implemented as shown in N+ in N-well thermal junction and contact example 12928, where an n+ doped region thermal junction 12926 may be formed in the N-well region at the base of the thermal contact 12924. The n+ doped region thermal junction 12926 makes the thermal contact viable (i.e. not highly conductive) from an electrical perspective. Both the n+ doped region thermal junction 12926 and the N-well 12922 would typically be biased at VDD potential. A thermal contact 12934 between the ground (GND) distribution network and an N-well 12932 can be implemented as shown in P+ in N-well thermal junction and contact example 12938, where a p+ doped region thermal junction 12936 may be formed in the N-well region at the base of the thermal contact 12934. The p+ doped region thermal junction 12936 makes the thermal contact viable (i.e. not highly conductive) from an electrical perspective due to the reverse biased p-n junction formed in P+ in N-well thermal junction and contact example 12938. Note that the thermal contacts are designed to conduct negligible electricity, and the current flowing through them is several orders of magnitude lower than the current flowing through a transistor when it is switching. Therefore, the thermal contacts can be considered to be designed to conduct heat and conduct negligible (or no) electricity.

FIG. 130 describes an embodiment of the invention, where an additional type of thermal contact structure is illustrated. The embodiment shown in FIG. 130 could also function as a decoupling capacitor to mitigate power supply noise. It could consist of a thermal contact 13004, an electrode 13010, a dielectric 13006 and P-well 13002. The dielectric 13006 may be electrically insulating, and could be optimized to have high thermal conductivity. Dielectric 13006 could be formed of materials, such as, for example, hafnium oxide, silicon dioxide, other high k dielectrics, carbon, carbon based material, or various other dielectric materials with electrical conductivity below about 1 nano-amp per square micron.

A thermal connection may be defined as the combination of a thermal contact and a thermal junction. The thermal connections illustrated in FIG. 129, FIG. 130 and other figures in this patent application may be designed into a chip to remove heat (conduct heat), and may be designed to not conduct electricity. Essentially, a semiconductor device comprising power distribution wires is described wherein some of said wires have a thermal connection designed to conduct heat to the semiconductor layer but the wires do not substantially conduct electricity through the thermal connection to the semiconductor layer.

Thermal contacts similar to those illustrated in FIG. 129 and FIG. 130 can be used in the white spaces of a design, i.e. locations of a design where logic gates or other useful functionality are not present. These thermal contacts connect white-space silicon regions to power and/or ground distribution networks. Thermal resistance to the heat removal apparatus can be reduced with this approach. Connections between silicon regions and power/ground distribution networks can be used for various device layers in the 3D stack, and need not be restricted to the device layer closest to the heat removal apparatus. A Schottky contact or diode may also be utilized for a thermal contact and thermal junction.

FIG. 131 illustrates an embodiment of this invention, which can provide enhanced heat removal from 3D-ICs by integrating heat spreader layers or regions in stacked device layers. Two mono-crystalline silicon layers, 13104 and 13116 are shown. Silicon layer 13116 could be thinned from its original thickness, and its thickness could be in the range of approximately 3 nm to approximately 1 um. Silicon layer 13104 may include gate electrode region 13114, gate dielectric region 13112, and shallow trench isolation (STI) regions 13110. Silicon layer 13116 may include gate electrode region 13134, gate dielectric region 13132, and shallow trench isolation (STI) regions 13122. A through-layer via (TLV) 13118 could be present and may have a dielectric region 13120. Wiring layers for silicon layer 13104 are indicated as 13108 and wiring dielectric is indicated as 13106. Wiring layers for silicon layer 13116 are indicated as 13138 and wiring dielectric is indicated as 13136. The heat removal apparatus, which could include a heat spreader and a heat sink, is indicated as 13102. It can be observed that the STI regions 13122 can go right through to the bottom of silicon layer 13116 and provide good electrical isolation. This, however, can cause challenges for heat removal from the STI surrounded transistors since STI regions 13122 are typically insulators that do not conduct heat well. The buried oxide layer 13124 typically does not conduct heat well either. To tackle heat removal issues with the structure shown in FIG. 131, a heat spreader 13126 can be integrated into the 3D stack by methods, such as, deposition of a heat spreader layer and subsequent etching into regions. The heat spreader 13126 material may include, for example, copper, aluminum, graphene, diamond, carbon or any other material with a high thermal conductivity (defined as greater than 100 W/m-K). While the heat spreader concept for 3D-ICs is described with an architecture similar to FIG. 125, similar heat spreader concepts could be used for architectures similar to FIG. 124, and also for other 3D IC architectures.

FIG. 132 illustrates an embodiment of the invention, which can provide enhanced heat removal from 3D-ICs by using thermally conductive shallow trench isolation (STI) regions in stacked device layers. Two mono-crystalline silicon layers, 13204 and 13216 are shown. Silicon layer 13216 could be thin, and its thickness could be in the range of approximately 3 nm to approximately 1 um. Silicon layer 13204 may include transistors which could have gate electrode region 13214, gate dielectric region 13212, and shallow trench isolation (STI) regions 13210. Silicon layer 13216 may include transistors which could have gate electrode region 13234, gate dielectric region 13232, and shallow trench isolation (STI) regions 13222. A through-layer via (TLV) 13218 could be present and may have a dielectric region 13220. Dielectric region 13220 may include a shallow trench isolation region. Wiring layers for silicon layer 13204 are indicated as 13208 and wiring dielectric is indicated as 13206. Wiring layers for silicon layer 13216 are indicated as 13238 and wiring dielectric is indicated as 13236. The heat removal apparatus, which could include a heat spreader and a heat sink, is indicated as 13202. It can be observed that the STI regions 13222 can go right through to the bottom of silicon layer 13216 and provide good electrical isolation. This, however, can cause challenges for heat removal from the STI surrounded transistors since STI regions 13222 are typically filled with insulators such as silicon dioxide that do not conduct heat well. To tackle possible heat removal issues with the structure shown in FIG. 132, the STI regions 13222 in stacked silicon layers such as 13216 could be formed substantially of thermally conductive dielectrics including, for example, diamond, carbon, or other dielectrics that have a thermal conductivity higher than silicon dioxide. Essentially, these materials could have thermal conductivity higher than 0.6 W/m-K. This can provide enhanced heat spreading in stacked device layers. Essentially, thermally conductive STI dielectric regions could be used in the vicinity of the transistors in stacked 3D device layers and may also be utilized as the dielectric that surrounds TLV 13218, such as dielectric region 13220.

FIG. 133 illustrates an embodiment of the invention, which can provide enhanced heat removal from 3D-ICs using thermally conductive pre-metal dielectric regions in stacked device layers. Two mono-crystalline silicon layers, 13304 and 13316 are shown. Silicon layer 13316 could be thin, and its thickness could be in the range of approximately 3 nm to approximately 1 um. Silicon layer 13304 may include transistors which could have gate electrode region 13314, gate dielectric region 13312, and shallow trench isolation (STI) regions 13310. Silicon layer 13316 may include transistors which could have gate electrode region 13334, gate dielectric region 13332, and shallow trench isolation (STI) regions 13322. A through-layer via (TLV) 13318 could be present and may have a dielectric region 13320, which may include an STI region. Wiring layers for silicon layer 13304 are indicated as 13308 and wiring dielectric is indicated as 13306. Wiring layers for silicon layer 13316 are indicated as 13338 and wiring dielectric is indicated as 13336. The heat removal apparatus, which could include a heat spreader and a heat sink, is indicated as 13302. It can be observed that the STI regions 13322 can go right through to the bottom of silicon layer 13316 and provide good electrical isolation. This, however, can cause challenges for heat removal from the STI surrounded transistors since STI regions 13322 are typically filled with insulators such as silicon dioxide that do not conduct heat well. To tackle this issue, the inter-layer dielectrics (ILD) 13324 for contact region 13326 could be constructed substantially with a thermally conductive material, such as, for example, insulating carbon, diamond, diamond like carbon (DLC), and various other materials that provide better thermal conductivity than silicon dioxide. Essentially, these materials could have thermal conductivity higher than about 0.6 W/m-K. Essentially, thermally conductive pre-metal dielectric regions could be used around some of the transistors in stacked 3D device layers.

FIG. 134 describes an embodiment of the invention, which can provide enhanced heat removal from 3D-ICs using thermally conductive etch stop layers or regions for the first metal level of stacked device layers. Two mono-crystalline silicon layers, 13404 and 13416 are shown. Silicon layer 13416 could be thin, and its thickness could be in the range of approximately 3 nm to approximately 1 um. Silicon layer 13404 may include transistors which could have gate electrode region 13414, gate dielectric region 13412, and shallow trench isolation (STI) regions 13410. Silicon layer 13416 may include transistors which could have gate electrode region 13434, gate dielectric region 13432, and shallow trench isolation (STI) regions 13422. A through-layer via (TLV) 13418 could be present and may include dielectric region 13420. Wiring layers for silicon layer 13404 are indicated as 13408 and wiring dielectric is indicated as 13406. Wiring layers for silicon layer 13416 are indicated as first metal layer 13428 and other metal layers 13438 and wiring dielectric is indicated as 13436. The heat removal apparatus, which could include a heat spreader and a heat sink, is indicated as 13402. It can be observed that the STI regions 13422 can go right through to the bottom of silicon layer 13416 and provide good electrical isolation. This, however, can cause challenges for heat removal from the STI surrounded transistors since STI regions 13422 are typically filled with insulators such as silicon dioxide that do not conduct heat well. To tackle this issue, etch stop layer 13424 for the first metal layer 13428 of stacked device layers can be substantially constructed out of a thermally conductive but electrically isolative material. Examples of such thermally conductive materials could include insulating carbon, diamond, diamond like carbon (DLC), and various other materials that provide better thermal conductivity than silicon dioxide and silicon nitride. Essentially, these materials could have thermal conductivity higher than about 0.6 W/m-K. Essentially, thermally conductive etch-stop layer dielectric regions could be used for the first metal layer above transistors in stacked 3D device layers.

FIG. 135A-B describes an embodiment of the invention, which can provide enhanced heat removal from 3D-ICs using thermally conductive layers or regions as part of pre-metal dielectrics for stacked device layers. Two mono-crystalline silicon layers, 13504 and 13516, are shown and may have transistors. Silicon layer 13516 could be thin, and its thickness could be in the range of approximately 3 nm to approximately 1 um. Silicon layer 13504 could have gate electrode region 13514, gate dielectric region 13512 and shallow trench isolation (STI) regions 13510. Silicon layer 13516 could have gate electrode region 13534, gate dielectric region 13532 and shallow trench isolation (STI) regions 13522. A through-layer via (TLV) 13518 could be present and may include its dielectric region 13520. Wiring layers for silicon layer 13504 are indicated as 13508 and wiring dielectric is indicated as 13506. The heat removal apparatus, which could include a heat spreader and a heat sink, is indicated as 13502. It can be observed that the STI regions 13522 can go right through to the bottom of silicon layer 13516 and provide good electrical isolation. This, however, can cause challenges for heat removal from the STI surrounded transistors since STI regions 13522 are typically filled with insulators such as silicon dioxide that do not conduct heat well. To tackle this issue, a technique is described in FIG. 135A-B. FIG. 135A illustrates the formation of openings for making contacts to transistors. A hard mask 13524 layer or region is typically used during the lithography step for contact formation and this hard mask 13524 is utilized to define regions 13526 of the pre-metal dielectric 13530 that are etched away. FIG. 135B shows the contact 13528 formed after metal is filled into the contact opening 13526 shown in FIG. 135A, and after a chemical mechanical polish (CMP) process. The hard mask 13524 used for the process shown in FIG. 135A-B can be chosen to be a thermally conductive material such as, for example, carbon or other material with higher thermal conductivity than silicon nitride, and can be left behind after the process step shown in FIG. 135B. Essentially, these materials for hard mask 13524 could have a thermal conductivity higher than about 0.6 W/m-K. Further steps for forming the 3D-IC (such as forming additional metal layers) can then be performed.

FIG. 136 shows the layout of a 4 input NAND gate, where the output OUT is a function of inputs A, B, C and D. Various sections of the 4 input NAND gate could include metal 1 regions 13606, gate regions 13608, N-type silicon regions 13610, P-type silicon regions 13612, contact regions 13614, and oxide isolation regions 13616. If the NAND gate is used in 3D IC stacked device layers, some regions of the NAND gate (such as 13618) are far away from VDD and GND contacts, these regions could have high thermal resistance to VDD and GND contacts, and could heat up to undesired temperatures. This is because the regions of the NAND gate that are far away from VDD and GND contacts cannot effectively use the low-thermal resistance power delivery network to transfer heat to the heat removal apparatus.

FIG. 137 illustrates an embodiment of the invention wherein the layout of the 3D stackable 4 input NAND gate can be modified so that all parts of the gate are at desirable, such as sub-100° C., temperatures during chip operation. Inputs to the gate are denoted as A, B, C and D, and the output is denoted as OUT. Various sections of the 4 input NAND gate could include the metal 1 regions 13706, gate regions 13708, N-type silicon regions 13710, P-type silicon regions 13712, contact regions 13714, and oxide isolation regions 13716. An additional thermal contact 13720 (whose implementation can be similar to those described in FIG. 129 and FIG. 130) can be added to the layout shown in FIG. 136 to keep the temperature of region 13718 under desirable limits (by reducing the thermal resistance from region 13718 to the GND distribution network). Several other techniques can also be used to make the layout shown in FIG. 137 more desirable from a thermal perspective.

FIG. 138 shows the layout of a transmission gate with inputs A and A'. Various sections of the transmission gate could include metal 1 regions 13806, gate regions 13808, N-type silicon regions 13810, P-type silicon regions 13812, contact regions 13814, and oxide isolation regions 13816. If the transmission gate is used in 3D IC stacked device layers, many regions of the transmission gate could heat up to undesired temperatures since there are no VDD and GND contacts. So, there could be high thermal resistance to VDD and GND distribution networks. Thus, the transmission gate cannot effectively use the low-thermal resistance power delivery network to transfer heat to the heat removal apparatus.

FIG. 139 illustrates an embodiment of the invention wherein the layout of the 3D stackable transmission gate can be modified so that all parts of the gate are at desirable, such as sub-100° C., temperatures during chip operation. Inputs to the gate are denoted as A and A'. Various sections of the transmission gate could include metal 1 regions 13906, gate regions 13908, N-type silicon regions 13910, P-type silicon regions 13912, contact regions 13914, and oxide isolation regions 13916. Additional thermal contacts, such as, for example 13920 and 13922 (whose implementation can be similar to those described in FIG. 129 and FIG. 130) can be added to the layout shown in FIG. 138 to keep the temperature of the transmission gate under desirable limits (by reducing the thermal resistance to the VDD and GND distribution networks). Several other techniques can also be used to make the layout shown in FIG. 139 more desirable from a thermal perspective.

The thermal path techniques illustrated with FIG. 137 and FIG. 139 are not restricted to logic cells such as transmission gates and NAND gates, and can be applied to a number of cells such as, for example, SRAMs, CAMs, multiplexers and many others. Furthermore, the techniques illustrated with FIG. 137 and FIG. 139 can be applied and adapted to various techniques of constructing 3D integrated circuits and chips, including those described in pending U.S. patent application Ser. Nos. 12/900,379 and 12/904,119. Furthermore, techniques illustrated with FIG. 137 and FIG. 139 (and other similar techniques) need not be applied to all such gates on the chip, but could be applied to a portion of gates of that type, such as, for example, gates with higher activity factor, lower threshold voltage or higher drive current.

When a chip is typically designed, a cell library consisting of various logic cells such as NAND gates, NOR gates and other gates is created, and the chip design flow proceeds using this cell library. It will be clear to one skilled in the art that one can create a cell library where each cell's layout can be optimized from a thermal perspective and based on heat removal criteria such as maximum allowable transistor channel temperature (i.e. where each cell's layout can be optimized such that substantially all portions of the cell have low thermal resistance to the VDD and GND contacts, and such, to the power bus and the ground bus.).

Recessed channel transistors form a transistor family that can be stacked in 3D. FIG. 145 illustrates a Recessed Channel Transistor when constructed in a 3D stacked layer using procedures outlined in U.S. patent application Ser. Nos. 12/900,379 and 12/804,119. In FIG. 145, 14502 could indicate a bottom layer of transistors and wires, 14504 could indicate an oxide layer, 14506 could indicate oxide regions, 14508 could indicate a gate dielectric, 14510 could indicate n+ silicon regions, 14512 could indicate a gate electrode and 14514 could indicate a region of p− silicon. Essentially, since the recessed channel transistor is surrounded on all sides by thermally insulating oxide layers 14504 and 14506, heat removal is a serious issue. Furthermore, to contact the p− silicon region 14514, a p+ region is needed to obtain low contact resistance, which is not easy to construct at temperatures lower than approximately 400° C.

Figure 140A:
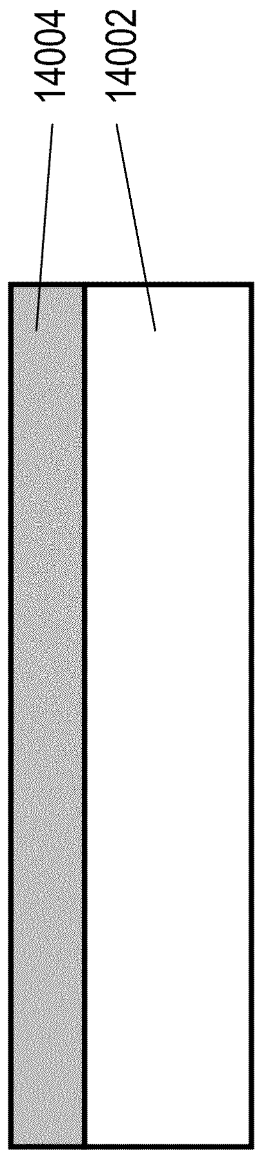
Figure 140B:
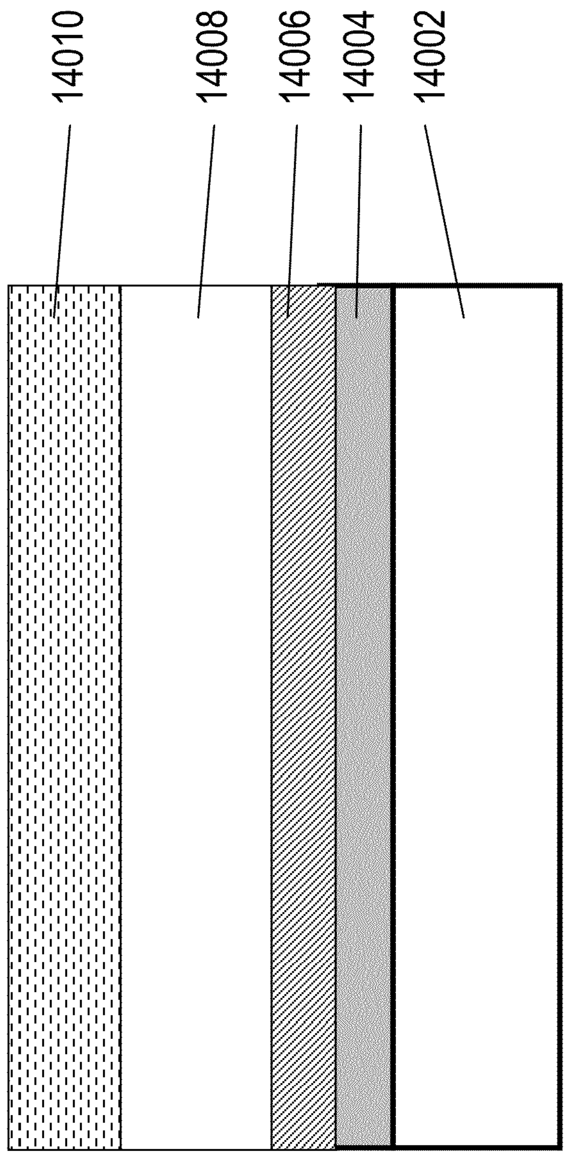
Figure 140C:
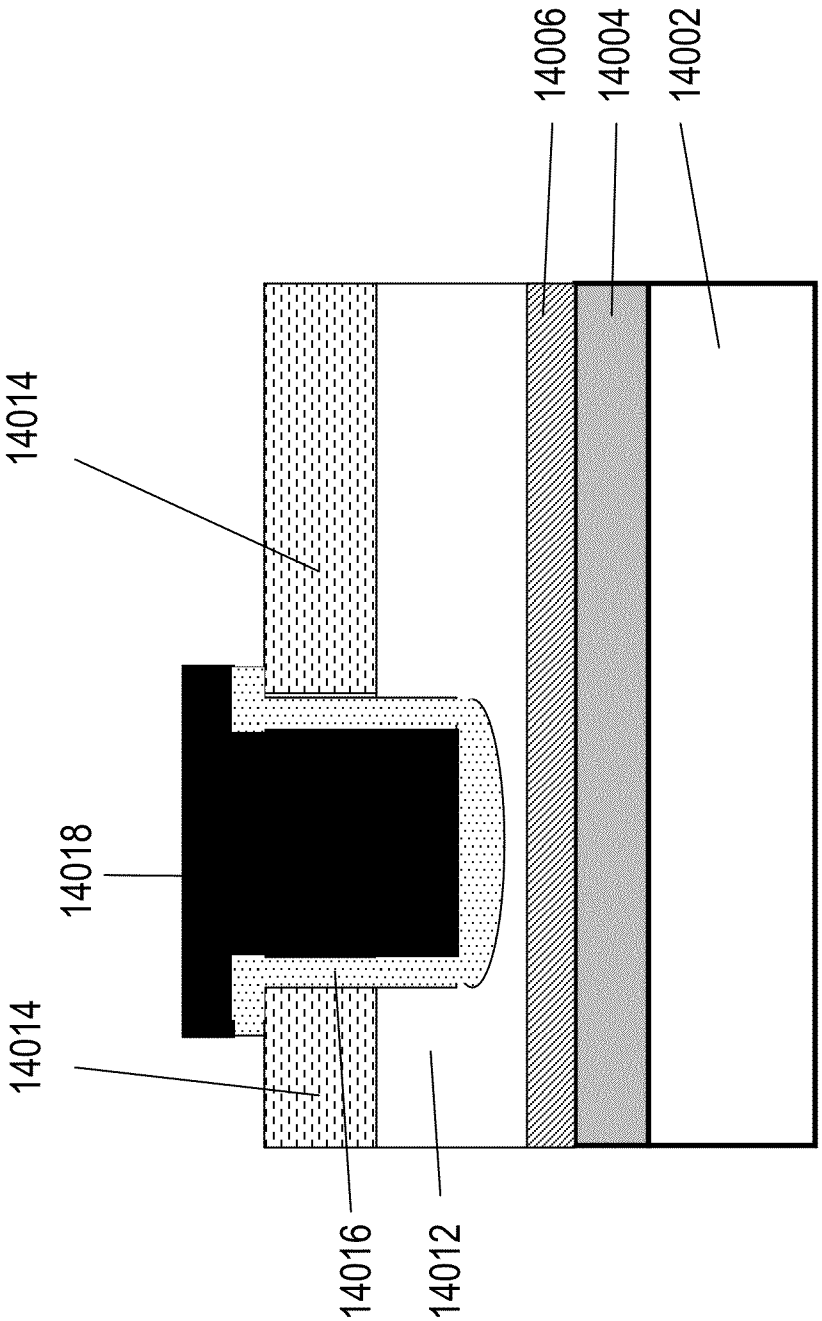
Figure 140D:
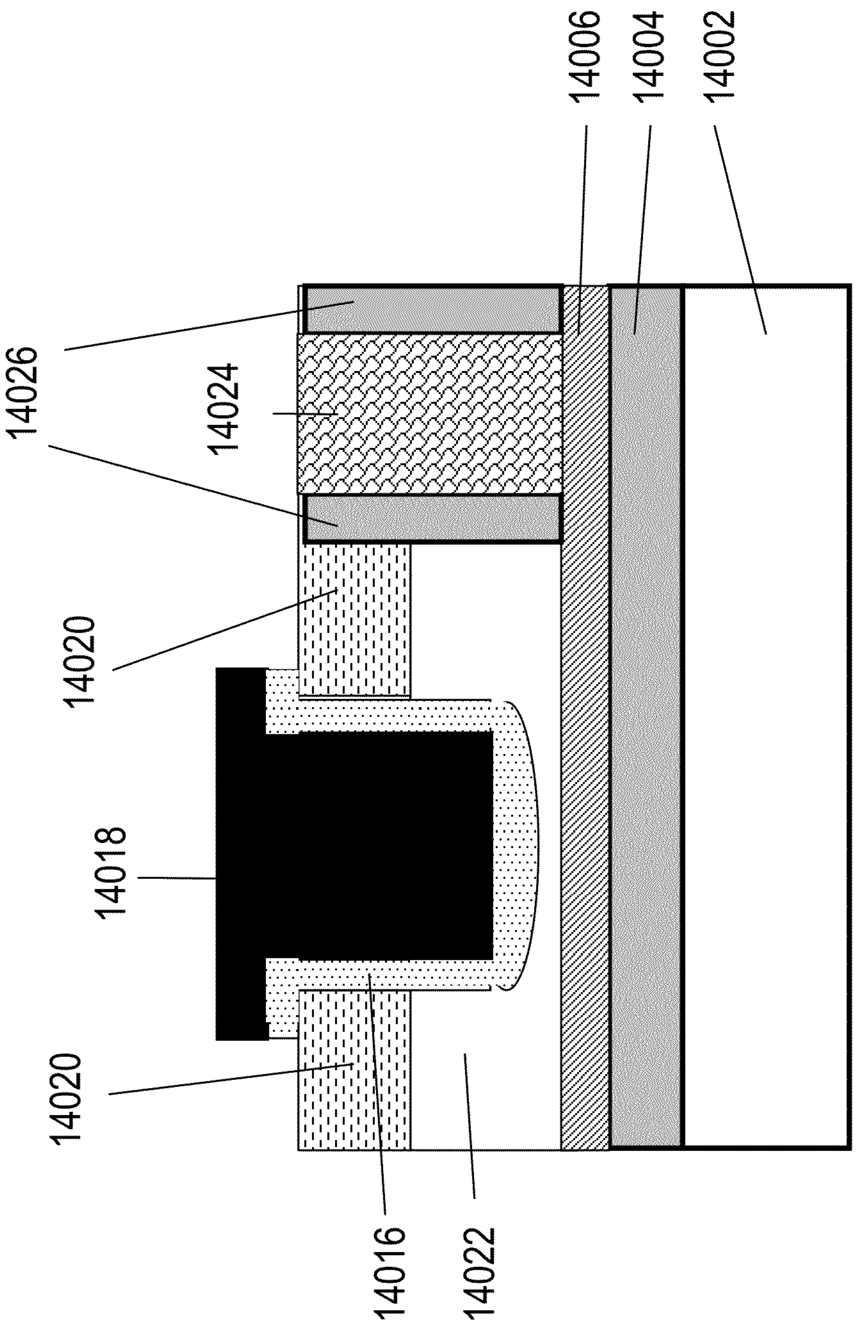

FIG. 140A-D illustrates an embodiment of the invention where thermal contacts can be constructed to a recessed channel transistor. Note that numbers used in FIG. 140A-D are inter-related. For example, if a certain number is used in FIG. 140A, it has the same meaning if present in FIG. 140B. The process flow begins in FIG. 140A with a bottom layer of transistors and copper interconnects 14002 being constructed with a silicon dioxide layer 14004 atop it. Using layer transfer approaches similar to those described in U.S. patent application Ser. Nos. 12/800,379 and 12/904,119, an activated layer of p+ silicon 14006, an activated layer of p− silicon 14008 and an activated layer of n+ silicon 14010 can be transferred atop the structure shown in FIG. 140A to form the structure shown in FIG. 140B. FIG. 140C shows the next step in the process flow. After forming isolation regions (not shown in FIG. 140C for simplicity), gate dielectric regions 14016 and gate electrode regions 14018 could be formed using procedures similar to those described in U.S. patent application Ser. Nos. 12/800,379 and 12/904,119. 14012 could indicate a region of p− silicon and 14014 could indicate a region of n+ silicon. FIG. 140C thus shows a RCAT (recessed channel transistor) formed with a p+ silicon region atop copper interconnect regions where the copper interconnect regions are not exposed to temperatures higher than approximately 400° C. FIG. 140D shows the next step of the process where thermal contacts could be made to the p+ silicon region 14006. In FIG. 140D, 14022 could indicate a region of p− silicon, 14020 could indicate a region of n+ silicon, 14024 could indicate a via constructed of a metal or metal silicide or a combination of the two and 14026 could indicate oxide regions. Via 14024 can connect p+ region 14006 to the ground (GND) distribution network. This is because the nMOSFET could have its body region connected to GND potential and operate correctly or as desired, and the heat produced in the device layer can be removed through the low-thermal resistance GND distribution network to the heat removal apparatus.

FIG. 141 illustrates an embodiment of the invention, which illustrates the application of thermal contacts to remove heat from a pMOSFET device layer that is stacked above a bottom layer of transistors and wires 14102. In FIG. 141, 14104 represents a buried oxide region, 14106 represents an n+ region of mono-crystalline silicon, 14114 represents an n− region of mono-crystalline silicon, 14110 represents a p+ region of mono-crystalline silicon, 14108 represents the gate dielectric and 14112 represents the gate electrode. The structure shown in FIG. 141 can be constructed using methods similar to those described in pending U.S. patent application Ser. No. 12/900,379, U.S. patent application Ser. No. 12/904,119 and FIG. 140A-D. The thermal contact 14118 could be constructed of any metal, metal silicide or a combination of these two types of materials. It can connect n+ region 14106 to the power (VDD) distribution network. This is because the pMOSFET could have its body region connected to the supply voltage (VDD) potential and operate correctly or as desired, and the heat produced in the device layer can be removed through the low-thermal resistance VDD distribution network to the heat removal apparatus. Regions 14116 represent isolation regions.

FIG. 142 illustrates an embodiment of the invention that describes the application of thermal contacts to remove heat from a CMOS device layer that could be stacked atop a bottom layer of transistors and wires 14202. In FIGS. 142, 14204, 14224 and 14230 could represent regions of an insulator, such as silicon dioxide, 14206 and 14236 could represent regions of p+ silicon, 14208 and 14212 could represent regions of p− silicon, 14210 could represent regions of n+ silicon, 14214 could represent regions of n+ silicon, 14216 could represent regions of n− silicon, 14220 could represent regions of p+ silicon, 14218 could represent a gate dielectric region for a pMOS transistor, 14222 could represent a gate electrode region for a pMOS transistor, 14234 could represent a gate dielectric region for a nMOS transistor and 14228 could represent a gate electrode region for a nMOS transistor. A nMOS transistor could therefore be formed of regions 14234, 14228, 14210, 14208 and 14206. A pMOS transistor could therefore be formed of regions 14214, 14216, 14218, 14220 and 14222. This stacked CMOS device layer could be formed with procedures similar to those described in pending U.S. patent application Ser. Nos. 12/900,379, 12/904,119 and FIG. 140 A-D. The thermal contact 14226 connected between n+ silicon region 14214 and the power (VDD) distribution network helps remove heat from the pMOS transistor. This is because the pMOSFET could have its body region connected to the supply voltage (VDD) potential and operate correctly or as desired, and the heat produced in the device layer can be removed through the low-thermal resistance VDD distribution network to the heat removal apparatus as previously described. The thermal contact 14232 connected between p+ silicon region 14206 and the ground (GND) distribution network helps remove heat from the nMOS transistor. This is because the nMOSFET could have its body region connected to GND potential and operate correctly or as desired, and the heat produced in the device layer can be removed through the low-thermal resistance GND distribution network to the heat removal apparatus as previously described.

FIG. 143 illustrates an embodiment of the invention that describes a technique that could reduce heat-up of transistors fabricated on silicon-on-insulator (SOI) substrates. SOI substrates have a buried oxide (BOX) between the silicon transistor regions and the heat sink. This BOX region has a high thermal resistance, and makes heat transfer from transistor regions to the heat sink difficult. In FIGS. 143, 14336, 14348 and 14356 could represent regions of an insulator, such as silicon dioxide, 14346 could represent regions of n+ silicon, 14340 could represent regions of p− silicon, 14352 could represent a gate dielectric region for a nMOS transistor, 14354 could represent a gate electrode region for a nMOS transistor, 14344 could represent copper wiring regions and 14304 could represent a highly doped silicon region. One of the key difficulties of silicon-on-insulator (SOI) substrates is the low heat transfer from transistor regions to the heat removal apparatus 14302 through the buried oxide layer 14336 that has low thermal conductivity. The ground contact 14362 of the nMOS transistor shown in FIG. 143 can be connected to the ground distribution network 14364 which in turn can be connected with a low thermal resistance connection 14350 to highly doped silicon region 14304 and thus to heat removal apparatus 14302. This enables low thermal conductivity between the transistor shown in FIG. 143 and the heat removal apparatus 14302. While FIG. 143 described how heat could be transferred between an MOS transistor and the heat removal apparatus, similar approaches can also be used for pMOS transistors.

FIG. 144 illustrates an embodiment of the invention that describes a technique that could reduce heat-up of transistors fabricated on silicon-on-insulator (SOI) substrates. In FIG. 144, 14436, 14448 and 14456 could represent regions of an insulator, such as silicon dioxide, 14446 could represent regions of n+ silicon, 14440 could represent regions of p− silicon, 14452 could represent a gate dielectric region for a nMOS transistor, 14454 could represent a gate electrode region for a nMOS transistor, 14444 could represent copper wiring regions and 14404 could represent a doped silicon region. One of the key difficulties of silicon-on-insulator (SOI) substrates is the low heat transfer from transistor regions to the heat removal apparatus 14402 through the buried oxide layer 14436 that has low thermal conductivity. The ground contact 14462 of the nMOS transistor shown in FIG. 144 can be connected to the ground distribution network 14464 which in turn can be connected with a low thermal resistance connection 14450 to doped silicon region 14404 through an implanted and activated region 14410. The implanted and activated region 14410 could be such that thermal contacts similar to those in FIG. 129 can be formed. This could enable low thermal conductivity between the transistor shown in FIG. 144 and the heat removal apparatus 14402. While FIG. 144 described how heat could be transferred between a nMOS transistor and the heat removal apparatus, similar approaches can also be used for pMOS transistors.

FIG. 146 illustrates an embodiment of this invention that could have heat spreading regions located on the sides of 3D-ICs. The 3D integrated circuit shown in FIG. 146 could be potentially constructed using techniques described in U.S. patent application Ser. Nos. 12/900,379 and 12/904,119. Two mono-crystalline silicon layers, 14604 and 14616 are shown. Silicon layer 14616 could be thinned down from its original thickness, and its thickness could be in the range of approximately 3 nm to approximately 1 um. Silicon layer 14604 may include transistors which could have gate electrode region 14614, gate dielectric region 14612, and shallow trench isolation (STI) regions 14610. Silicon layer 14616 may include transistors which could have gate electrode region 14634, gate dielectric region 14632, and shallow trench isolation (STI) regions 14622. It can be observed that the STI regions 14622 can go right through to the bottom of silicon layer 14616 and provide good electrical isolation. A through-layer via (TLV) 14618 could be present and may include its dielectric region 14620. Wiring layers for silicon layer 14604 are indicated as 14608 and wiring dielectric is indicated as 14606. Wiring layers for silicon layer 14616 are indicated as 14638 and wiring dielectric is indicated as 14636. The heat removal apparatus, which could include a heat spreader and a heat sink, is indicated as 14602. Thermally conductive material 14640 could be present at the sides of the 3D-IC shown in FIG. 146. Thus, a thermally conductive heat spreading region could be located on the sidewalls of a 3D-IC. The thermally conductive material 14640 could be a dielectric such as, for example, insulating carbon, diamond, diamond like carbon (DLC), and various other materials that provide better thermal conductivity than silicon dioxide. Essentially, these materials could have thermal conductivity higher than about 0.6 W/m-K. One possible scheme that could be used for forming these regions could involve depositing and planarizing the thermally conductive material 14640 at locations on or close to the dicing regions, such as potential dicing scribe lines, of a 3D-IC after an etch process. The wafer could then be diced. Although this embodiment of the invention is described with FIG. 146, one could combine the concept of having thermally conductive material regions on the sidewalls of 3D-ICs with ideas shown in other figures of this patent application, such as, for example, the concept of having lateral heat spreaders shown in FIG. 131.

While concepts in this patent application have been described with respect to 3D-ICs with two stacked device layers, those of ordinary skill in the art will appreciate that it can be valid for 3D-ICs with more than two stacked device layers.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile electronic devices and mobile systems such as mobile phones, smart phone, cameras and the like. For example, incorporating the 3D IC semiconductor devices according to some embodiments of the invention within these mobile electronic devices and mobile systems could provide superior mobile units that could operate much more efficiently and for a much longer time than with prior art technology. The 3D IC techniques and the methods to build devices according to various embodiments of the invention could empower the mobile smart system to win in the market place, as they provide unique advantages for aspects that are very important for 'smart' mobile devices, such as, low size and volume, low power, versatile technologies and feature integration, low cost, self-repair, high memory density, high performance. These advantages would not be achieved without the use of some embodiment of the invention.

3D ICs according to some embodiments of the invention could also enable electronic and semiconductor devices with much a higher performance due to the shorter interconnect as well as semiconductor devices with far more complexity via multiple levels of logic and providing the ability to repair or use redundancy. The achievable complexity of the semiconductor devices according to some embodiments of the invention could far exceed what was practical with the prior art technology. These advantages could lead to more powerful computer systems and improved systems that have embedded computers.

Some embodiments of the invention may also enable the design of state of the art electronic systems at a greatly reduced non-recurring engineering (NRE) cost by the use of high density 3D FPGAs or various forms of 3D array base ICs with reduced custom masks as been described previously.

These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduced NRE using generic masks for layers of logic and other generic mask for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. In fact there are many ways to mix the many innovative elements to form 3D IC to support the need of an end system, including using multiple devices wherein more than one device incorporates elements of the invention. An end system could benefits from memory device utilizing the invention 3D memory together with high performance 3D FPGA together with high density 3D logic and so forth. Using devices that use one or multiple elements of the invention would allow for better performance and or lower power and other advantages resulting from the inventions to provide the end system with a competitive edge. Such end system could be electronic based products or other type of systems that include some level of embedded electronics, such as, for example, cars, remote controlled vehicles, etc.

It will also be appreciated by persons of ordinary skill in the art that the invention is not limited to what has been particularly shown and described hereinabove. Rather, the scope of the invention includes both combinations and sub-combinations of the various features described hereinabove as well as modifications and variations which would occur to such skilled persons upon reading the foregoing description. Thus the invention is to be limited only by the appended claims.

What is claimed is:

1. A method for formation of a semiconductor device, the method comprising:

providing a first mono-crystalline layer comprising first transistors and first alignment marks;

providing an interconnection layer comprising aluminum or copper on top of said first mono-crystalline layer; and then forming a second mono-crystalline layer on top of said interconnection layer by using a layer transfer step, and then processing second transistors on said second mono-crystalline layer comprising a step of forming a gate dielectric, wherein at least one of said second transistors is a p-type transistor and at least one of said second transistors is an n-type transistor.

2. A method according to claim 1, wherein said device is part of a low power mobile system.

3. A method according to claim 1, comprising:

replacing a signal generated by said first transistors by a signal generated by said second transistor, or replacing a signal generated by said second transistors by a signal generated by said first transistors.

4. A method according to claim 1, wherein at least one of said second transistors is one of:

(i) a recessed-channel transistor (RCAT);

(ii) a junction-less transistor;

(iii) a replacement-gate transistor;

(iv) a trench MOSFET transistor;

(v) a double gate transistor;

(vi) a Finfet type transistor; or (vii) a Dopant Segregated Schottky (DSS-Schottky) transistor.

5. A method according to claim 1, comprising a step of annealing after said layer transfer step.

6. A method according to claim 1, wherein said second mono-crystalline layer comprises a second alignment mark, wherein the method further comprises a lithography step comprising an alignment, and wherein the alignment is based on said first alignment mark and said second alignment mark.

7. A method according to claim 1, comprising a follow on step of etching some of said second transistors.

8. A method according to claim 1, comprising an etch step for the formation of an etch stop indicator, wherein said etch step is prior to said layer transfer.

9. A method according to claim 1, comprising a step of partitioning a logic design to a first portion to be constructed using said first transistors and a second portion to be constructed by said second transistors, wherein said step of partitioning includes using manufacturing process nodes as a partition criteria, wherein a first manufacturing process node utilized to form said first transistors is substantially different that a second manufacturing process node utilized to form said second transistors.

10. A method according to claim 1, comprising implementing a logic design on said device, wherein said step of implementing comprises a synthesis step utilizing at least two libraries, wherein one of said libraries utilizes a substantially different manufacturing process node than the other.

11. A method according to claim 1, wherein a memory array comprises said second transistors, and wherein said memory array is a floating body DRAM array.

12. A method according to claim 1, wherein said layer transfer step utilizes a carrier wafer.

13. A method according to claim 1, wherein said second transistors are horizontally oriented.

* * * * *